US010706993B2

(12) United States Patent
Shimoichi et al.

(10) Patent No.: US 10,706,993 B2
(45) Date of Patent: Jul. 7, 2020

(54) CHIP PARTS

(71) Applicant: ROHM CO., LTD., Kyoto (JP)

(72) Inventors: Takuma Shimoichi, Kyoto (JP); Yasuhiro Kondo, Kyoto (JP); Keishi Watanabe, Kyoto (JP); Takamichi Torii, Kyoto (JP); Katsuya Matsuura, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 15/703,954

(22) Filed: Sep. 13, 2017

(65) Prior Publication Data

US 2018/0005732 A1 Jan. 4, 2018

Related U.S. Application Data

(62) Division of application No. 14/713,684, filed on May 15, 2015, now Pat. No. 9,773,588.

(30) Foreign Application Priority Data

May 16, 2014 (JP) ................................ 2014-102813
May 23, 2014 (JP) ................................ 2014-107495
(Continued)

(51) Int. Cl.
*H01F 27/28* (2006.01)
*H01C 1/01* (2006.01)
(Continued)

(52) U.S. Cl.
CPC ................ *H01C 1/01* (2013.01); *H01C 1/02* (2013.01); *H01C 1/14* (2013.01); *H01C 1/142* (2013.01);
(Continued)

(58) Field of Classification Search
CPC ............... H01F 27/292; H01F 27/2804; H01F 17/0006; H01F 2017/0026
(Continued)

(56) References Cited

U.S. PATENT DOCUMENTS 4,785,345 A * 11/1988 Rawls ................ H01F 27/2804 257/531
6,091,081 A 7/2000 Matsubara et al.
(Continued)

FOREIGN PATENT DOCUMENTS

JP S59121854 A 7/1984
JP 06120036 A * 4/1994 ............ H01L 24/73
(Continued)

*Primary Examiner* — Tszfung J Chan
(74) *Attorney, Agent, or Firm* — Rabin & Berdo, P.C.

(57) ABSTRACT

A chip part is provided that includes a substrate in which an element region and an electrode region are set, an insulating film (a first insulating film and a second insulating film) which is formed on the substrate and which selectively includes an internal concave/convex structure in the electrode region on a surface, a first connection electrode and a second connection electrode which include, at a bottom portion, an anchor portion entering the concave portion of the internal concave/convex structure and which include an external concave/convex structure on a surface on the opposite side and a circuit element which is disposed in the element region and which is electrically connected to the first connection electrode and the second connection electrode.

21 Claims, 426 Drawing Sheets

(30) Foreign Application Priority Data

| | | |
|---|---|---|
| May 23, 2014 | (JP) | 2014-107496 |
| May 23, 2014 | (JP) | 2014-107497 |
| May 30, 2014 | (JP) | 2014-113427 |
| May 30, 2014 | (JP) | 2014-113428 |
| Sep. 30, 2014 | (JP) | 2014-201700 |
| Sep. 30, 2014 | (JP) | 2014-201701 |
| May 12, 2015 | (JP) | 2015-097645 |

(51) Int. Cl.

| | |
|---|---|
| ***H01F 27/29*** | (2006.01) |
| ***H01G 4/30*** | (2006.01) |
| ***H01G 4/228*** | (2006.01) |
| ***H01F 17/00*** | (2006.01) |
| ***H01C 1/02*** | (2006.01) |
| ***H05K 1/02*** | (2006.01) |
| ***H01C 17/26*** | (2006.01) |
| ***H05K 1/16*** | (2006.01) |
| ***H01C 1/142*** | (2006.01) |
| ***H01C 7/00*** | (2006.01) |
| ***H01L 23/522*** | (2006.01) |
| ***H01C 13/02*** | (2006.01) |
| ***H01L 49/02*** | (2006.01) |
| ***H01G 4/33*** | (2006.01) |
| ***H01C 1/14*** | (2006.01) |

(52) U.S. Cl.

CPC ............ *H01C 7/006* (2013.01); *H01C 13/02* (2013.01); *H01C 17/267* (2013.01); *H01F 17/0006* (2013.01); *H01F 27/2804* (2013.01); *H01F 27/292* (2013.01); *H01G 4/228* (2013.01); *H01G 4/30* (2013.01); *H01G 4/33* (2013.01); *H01L 23/5228* (2013.01); *H01L 28/20* (2013.01); *H05K 1/0293* (2013.01); *H05K 1/167* (2013.01); *H01F 2017/0026* (2013.01); *H05K 1/162* (2013.01); *H05K 1/165* (2013.01)

(58) Field of Classification Search

USPC ................................ 336/200, 232; 257/531

See application file for complete search history.

(56) References Cited

U.S. PATENT DOCUMENTS

| | | | | | |
|---|---|---|---|---|---|
| 6,162,723 | A | 12/2000 | Tanaka | | |
| 6,198,374 | B1 * | 3/2001 | Abel | H01F 17/0013 | 336/200 |
| 6,294,976 | B1 * | 9/2001 | Imada | H01F 17/0013 | 336/200 |
| 6,362,713 | B1 * | 3/2002 | Masuda | H01F 17/045 | 336/192 |
| 6,872,617 | B2 | 3/2005 | Sashida | | |
| 8,053,354 | B2 | 11/2011 | Lehr et al. | | |
| 2004/0041278 | A1 | 3/2004 | Akhtman et al. | | |
| 2004/0056749 | A1 * | 3/2004 | Kahlmann | H01L 27/08 | 336/200 |
| 2005/0275497 | A1 * | 12/2005 | Ramadan | H01F 5/003 | 336/200 |
| 2007/0040163 | A1 * | 2/2007 | Okuzawa | H01F 27/292 | 257/31 |
| 2007/0296533 | A1 * | 12/2007 | Springett | H01F 27/22 | 336/200 |
| 2010/0026368 | A1 * | 2/2010 | Tang | H01L 23/48 | 327/361 |
| 2011/0148549 | A1 * | 6/2011 | Kanschat | H01F 19/00 | 333/24 R |
| 2011/0175193 | A1 | 7/2011 | Nakagawa | | |
| 2011/0279100 | A1 * | 11/2011 | Ikriannikov | H02M 7/003 | 323/271 |
| 2012/0068301 | A1 * | 3/2012 | Sin | H01L 23/645 | 257/531 |
| 2013/0265132 | A1 * | 10/2013 | Huang | H01F 27/2804 | 336/192 |
| 2015/0022938 | A1 | 1/2015 | Okada et al. | | |

FOREIGN PATENT DOCUMENTS

| | | | | |
|---|---|---|---|---|
| JP | H07249501 | A | 9/1995 | |
| JP | H09-199365 | A1 | 7/1997 | |
| JP | 2001-076912 | A | 3/2001 | |
| JP | 2002323474 | A | 11/2002 | |
| JP | 2003158002 | A | 5/2003 | |
| JP | 2006-347782 | A | 12/2006 | |
| JP | 2010-080774 | A | 4/2010 | |
| JP | 2013-0168633 | A | 4/2010 | |
| WO | WO-2012093133 | A1 * | 7/2012 | H01F 41/041 |
| WO | 2014069363 | A1 | 5/2014 | |

* cited by examiner

| | Specific resistance ρ of substrate (Ω・cm) | Capacitance component C (pF) |
|---|---|---|
| Evaluation element 1 | $1.0\times10^{-3}$ | 3 |
| Evaluation element 2 | $1.5\times10^{-2}$ | 3 |
| Evaluation element 3 | $1.0\times10^{-1}$ | 3 |
| Evaluation element 4 | 1.0 | 3 |
| Evaluation element 5 | $3.0\times10$ | 3 |
| Evaluation element 6 | $1.0\times10^{3}$ | 3 |

93

CHIP PARTS

CROSS-REFERENCE TO RELATED APPLICATION

This application is a division of application Ser. No. 14/713,684, filed on May 15, 2015 (allowed on May 30, 2017). Further, this application claims the benefit of priority of Japanese Patent Application No. 2014-102813 filed on May 16, 2014 in the Japan Patent Office, Japanese Patent Application No. 2014-107495 filed on May 23, 2014 in the Japan Patent Office, Japanese Patent Application No. 2014-107496 filed on May 23, 2014 in the Japan Patent Office, Japanese Patent Application No. 2014-107497 filed on May 23, 2014 in the Japan Patent Office, Japanese Patent Application No. 2014-113427 filed on May 30, 2014 in the Japan Patent Office, Japanese Patent Application No. 2014-113428 filed on May 30, 2014 in the Japan Patent Office, Japanese Patent Application No. 2014-201700 filed on Sep. 30, 2014 in the Japan Patent Office, Japanese Patent Application No. 2014-201701 filed on Sep. 30, 2014 in the Japan Patent Office and Japanese Patent Application No. 2015-097645 filed on May 12, 2015 in the Japan Patent Office. The disclosures of these prior U.S. and foreign applications are incorporated herein by reference.

BACKGROUND OF THE INVENTION

1. Field of the Invention

The present invention relates to chip parts.

2. Description of the Related Art

Japanese Patent Application Publication No. 2001-76912 discloses a chip resistor that includes an insulating substrate and an electrode formed on one surface of the insulating substrate. The chip resistor is mounted on a mounting substrate by soldering with the one surface of the insulating substrate directed downward.

SUMMARY OF THE INVENTION

The inventor of preferred embodiments of the present invention described and claimed in the present application conducted an extensive study and research regarding chip parts, such as the one described above, and in doing so, discovered and first recognized new unique challenges and previously unrecognized possibilities for improvements as described in greater detail below.

In order to prevent the peeling of an electrode in a chip resistor, the adhesion strength of the electrode to a substrate is preferably maximized. This is also a common problem not only to a chip resistor but also to chip parts such as a chip capacitor, a chip diode, and a chip fuse.

Since the surface of the electrode is flat, when a chip part is mounted on a mounting substrate, the chip part is held to a mounter device while being inclined, and thus the electrode may not be recognized. Consequently, the front and rear of the chip part may be erroneously recognized.

An object of the present invention is to provide a chip part that can enhance the adhesion strength of an electrode to a substrate and that can satisfactorily distinguish the front from the rear.

In order to overcome the previously unrecognized and unsolved challenges described above, a chip part according to the present invention includes: a substrate in which an element region and an electrode region are set; an insulating film which is formed on the substrate and which selectively includes an internal concave/convex structure in the electrode region on a surface; an electrode which includes, at a bottom portion, an anchor portion that enters a concave portion of the internal concave/convex structure and which includes an external concave/convex structure in a surface on an opposite side; and a circuit element which is disposed in the element region and which is electrically connected to the electrode.

In this arrangement, since a bonding area of the electrode and the insulating film is increased by the anchor portion, it is possible to enhance the adhesion strength of the electrode to the substrate (the insulating film).

Since the external concave/convex structure is formed in the surface of the electrode, when the chip part is mounted on the mounting substrate, even if the chip part is held to a mounter device while being inclined, it is possible to reflect light from a light source in all directions. Hence, since it is possible to satisfactorily detect the electrode with a part recognizing camera, it is possible to enhance an electrode recognition rate in the mounter device. Consequently, it is possible to reduce the erroneous recognition of the front and rear of the chip part, and thus it is possible to stably mount the chip part.

The external concave/convex structure may include a concave portion in a position opposite the concave portion of the internal concave/convex structure.

The amount of recess of the concave portion in the external concave/convex structure may be less than that of the concave portion in the internal concave/convex structure.

The chip part may further include a wiring film in contact with the circuit element, and the anchor portion may be formed with an extending portion of the wiring film.

In this arrangement, in the same step of the wiring film, the anchor portion can be formed, and thus it is possible to prevent the number of steps from being increased due to the formation of the anchor portion.

The anchor portion may include an intermediate concave/convex structure in a surface thereof.

The anchor portion may integrally include an embedding portion which fills the concave portion in the internal concave/convex structure and a surface layer portion which is disposed along a surface of the insulating film to cover the internal concave/convex structure, and the intermediate concave/convex structure may be formed in a surface of the surface layer portion.

In this arrangement, since the concave portion in the internal concave/convex structure is filled with the embedding portion, and no interface of a different metal is present in the concave portion, it is possible to enhance the strength of the anchor portion itself within the concave portion.

The anchor portion may be formed along a recess and a projection in the internal concave/convex structure.

The electrode may include an external connection portion which is formed on the anchor portion and which is formed of a material different from the anchor portion.

The anchor portion may be formed of an Al—Cu alloy, and the external connection portion may be formed with a Ni—Pd—Au laminated structure.

The insulating film may include a first insulating film and a second insulating film, the chip part may further include: a first wiring film disposed between the first insulating film and the second insulating film; and a second wiring film formed on the second insulating film, the circuit element may be a resistor element which includes a resistor body formed with the first wiring film and the wiring film forming the anchor portion may include at least a pair of resistor wiring films which are formed with the second wiring film and which are connected to the resistor body via the second insulating film.

The concave portion in the internal concave/convex structure may penetrate the second insulating film and may be formed part-way along a direction of thickness of the first insulating film.

In this arrangement, since the bonding area of the electrode to the film on the substrate is further increased by the depth of the through hole, it is possible to further enhance the adhesion strength of the electrode to the substrate (the insulating film).

The insulating film may include a first insulating film and a second insulating film, the chip part may further include: a first wiring film disposed between the first insulating film and the second insulating film; and a second wiring film formed on the second insulating film, the circuit element may be a capacitor which includes a lower electrode formed with the first wiring film, a dielectric film formed with the second insulating film, and an upper electrode formed with the second wiring film and the wiring film forming the anchor portion may include a lower wiring film which is formed with the second wiring film and which is connected to the lower electrode via the second insulating film.

The concave portion in the internal concave/convex structure entered by the lower wiring film may penetrate the second insulating film and may be formed part-way along a direction of thickness of the first insulating film.

In this arrangement, since the bonding area of the electrode to the film on the substrate is further increased by the depth of the through hole of the second insulating film, it is possible to further enhance the adhesion strength of the electrode to the substrate (the insulating film).

The insulating film may further include a third insulating film formed on the second wiring film, the chip part may further include a third wiring film formed on the third insulating film and the wiring film forming the anchor portion may include an upper wiring film which is formed with the third wiring film and which is connected to the upper electrode via the third insulating film.

The concave portion in the internal concave/convex structure entered by the upper wiring film may penetrate the third insulating film and the second insulating film and may be formed part-way along a direction of thickness of the first insulating film.

In this arrangement, since the bonding area of the electrode to the film on the substrate is further increased by the depth of the through hole of the second and third insulating films, it is possible to further enhance the adhesion strength of the electrode to the substrate (the insulating film).

The chip part may further include: a pn bonding portion formed on the substrate; and a first wiring film which is formed on the insulating film and which includes a p-side film and an n-side film connected to the pn bonding portion via the insulating film, the circuit element is a diode which includes the pn bonding portion and the wiring film forming the anchor portion includes at least a pair of films formed with the p-side film and the n-side film.

The concave portions in the external concave/convex structure may be regularly arrayed in plan view.

The concave portions in the external concave/convex structure may be arrayed, in plan view, in a matrix.

The concave portions in the external concave/convex structure may be arrayed, in plan view, in a staggered shape.

The external concave/convex structure may be formed substantially over the entire region of a surface of the electrode.

The external concave/convex structure may be formed along the peripheral edge of the electrode, and the electrode may include, in a region surrounded by the external concave/convex structure, a flat portion formed with a smooth surface.

In this arrangement, when an electrical test is performed on the circuit element, the flat portion is selected as a contact target of the probe, and thus it is possible to satisfactorily prevent the probe from being damaged at the time of contact with the electrode.

The electrode may include the flat portion formed with a smooth surface along the peripheral edge of the electrode, and the external concave/convex structure may be formed in a region surrounded by the flat portion.

In this arrangement, when an electrical test is performed on the circuit element, the flat portion is selected as a contact target of the probe, and thus it is possible to satisfactorily prevent the probe from being damaged at the time of contact with the electrode.

A circuit assembly of the present invention includes the chip part of the present invention and a mounting substrate having a land solder-bonded to the electrode.

An electronic device of the present invention includes the circuit assembly of the present invention and a housing holding the circuit assembly.

A method of manufacturing a chip part according to one aspect of the present invention includes: a step of forming an insulating film on a substrate in which an element region and an electrode region are set; a step of forming a circuit element in the element region; a step of selectively forming an internal concave/convex structure in the electrode region on the surface of the insulating film; and a step of depositing an electrode material on the insulating film to have, at a bottom portion, an anchor portion entering the concave portion of the internal concave/convex structure and to form an electrode having an external concave/convex structure on the surface on the opposite side.

In this method, it is possible to manufacture the chip part according to the present invention.

A method of manufacturing a chip part according to another aspect of the present invention includes: a step of forming a first insulating film on a substrate in which an element region and an electrode region are set; a step of forming, on the first insulating film, a first wiring film used in a part of a circuit element of the element region such that the first wiring film is spread to the element region and the electrode region; a step of selectively removing the part of the first wiring film on the electrode region; a step of forming, after the removal step, a second insulating film covering the first wiring film such that the first wiring film is spread to the element region and the electrode region; a step of selectively forming a through hole in the second insulating film and cutting away a surface portion of the first insulating film by etching via the through hole to form an internal concave/convex structure formed with a plurality of concave portions communicating with the first insulating film and the second insulating film; and a step of depositing an electrode material on the second insulating film to have, at a bottom portion, an anchor portion entering the concave portion of the internal concave/convex structure and to form an electrode having an external concave/convex structure on the surface on the opposite side.

In this method, it is also possible to manufacture the chip part according to the present invention.

The second insulating film may be formed of a material having an etching selection ratio for the first insulating film.

The first insulating film may be formed of $SiO_2$, and the second insulating film may be formed of SiN.

The step of forming the internal concave/convex structure may further include a step of forming, in the second insulating film, a second through hole which exposes the first wiring film serving as a part of the circuit element, and the step of forming the electrode may include a step of forming the second wiring film on the second insulating film to form an anchor portion entering the concave portion of the internal concave/convex structure and a via contact embedded in the second through hole.

The step of forming the electrode may include a step of forming the second wiring film by a sputtering method and thereafter growing, from the anchor portion, the plating of a material different from the anchor portion to form an external connection portion.

The step of forming the circuit element may include a step of forming a part of the first wiring film as a resistor body to form a resistor element.

The step of forming the circuit element may include a step of forming a part of the first wiring film as a lower electrode, forming a part of the second insulating film as a dielectric film, and forming a part of the second wiring film as an upper electrode to form a capacitor.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 60H is a cross-sectional view showing the step subsequent to FIG. 60G.

FIG. 60I is a cross-sectional view showing the step subsequent to FIG. 60H.

FIG. 60J is a cross-sectional view showing the step subsequent to FIG. 60I.

FIG. 60K is a cross-sectional view showing the step subsequent to FIG. 60J.

FIG. 60L is a cross-sectional view showing the step subsequent to FIG. 60K.

FIG. 61A is a partially enlarged cross-sectional view showing the details of the manufacturing step of a coil.

FIG. 61B is a partially enlarged cross-sectional view showing the step subsequent to FIG. 61A.

FIG. 61C is a partially enlarged cross-sectional view showing the step subsequent to FIG. 61B.

FIG. 61D is a partially enlarged cross-sectional view showing the step subsequent to FIG. 61C.

FIG. 61E is a partially enlarged cross-sectional view showing the step subsequent to FIG. 61D.

FIG. 62A is an enlarged cross-sectional view showing the details of the manufacturing step of a concave portion of a first electrode.

FIG. 62B is a partially enlarged cross-sectional view showing the step subsequent to FIG. 62A.

Figure 62A:
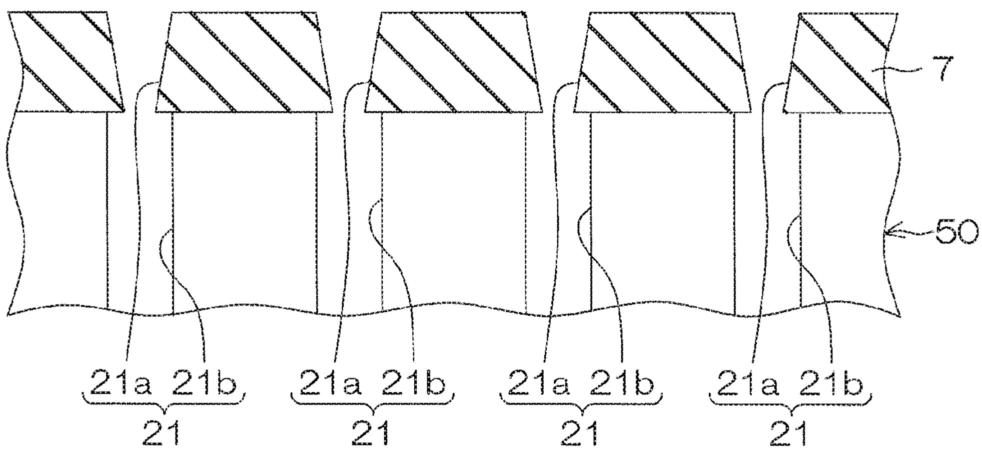
Figure 62B:
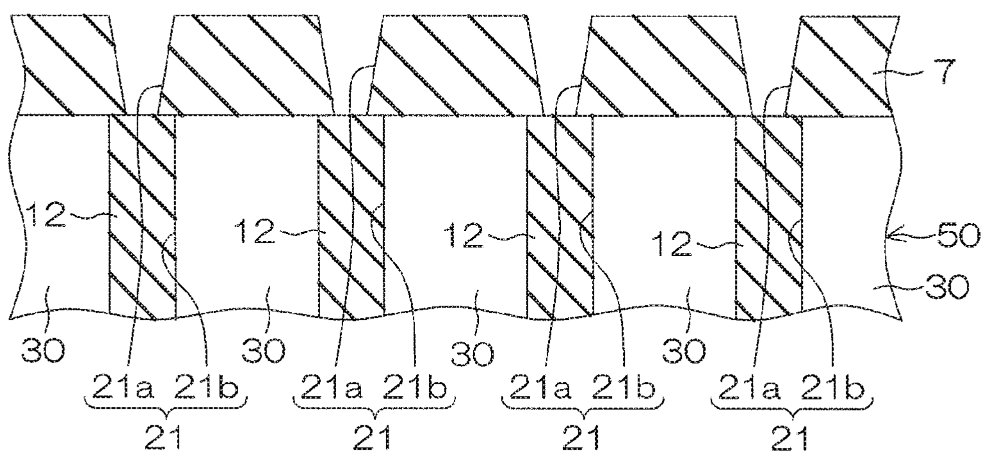
Figure 62C:
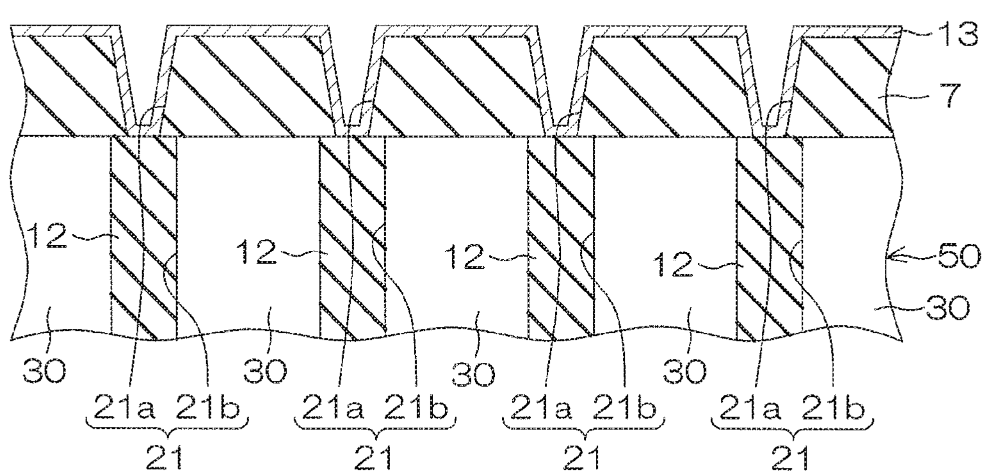

FIG. 62C is a partially enlarged cross-sectional view showing the step subsequent to FIG. 62B.

Figure 62D:
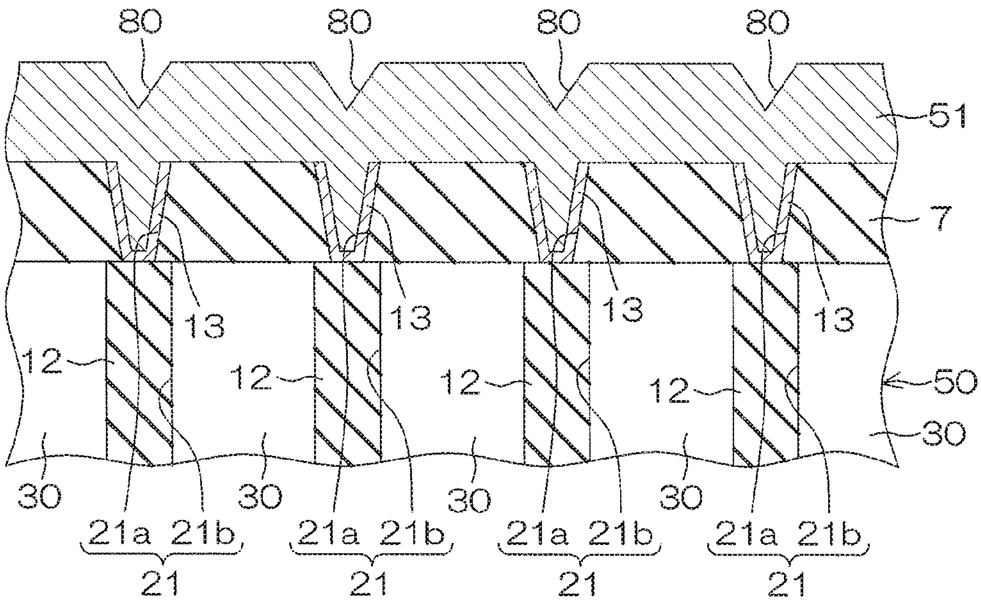

FIG. 62D is a partially enlarged cross-sectional view showing the step subsequent to FIG. 62C.

Figure 62E:
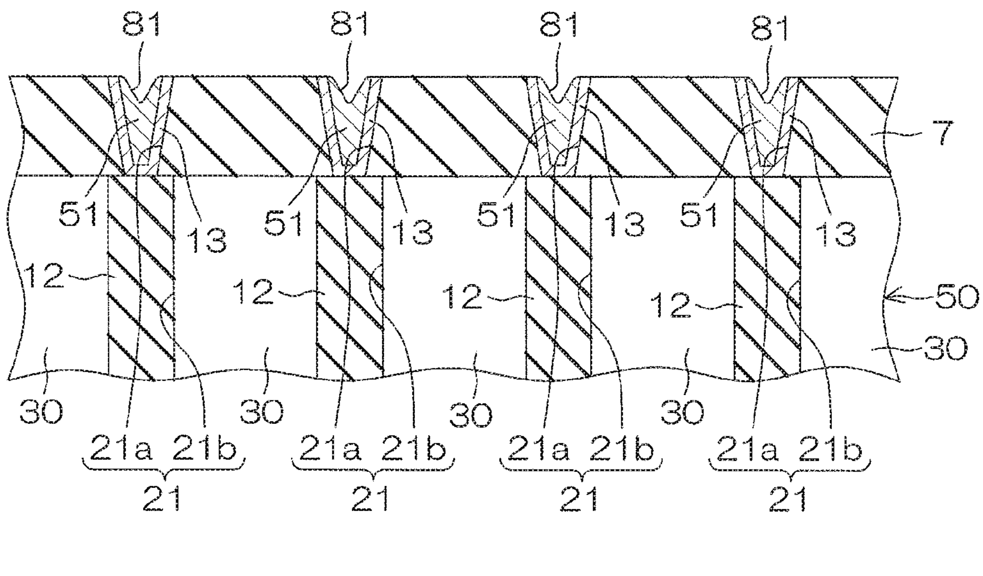

FIG. 62E is a partially enlarged cross-sectional view showing the step subsequent to FIG. 62D.

Figure 62F:
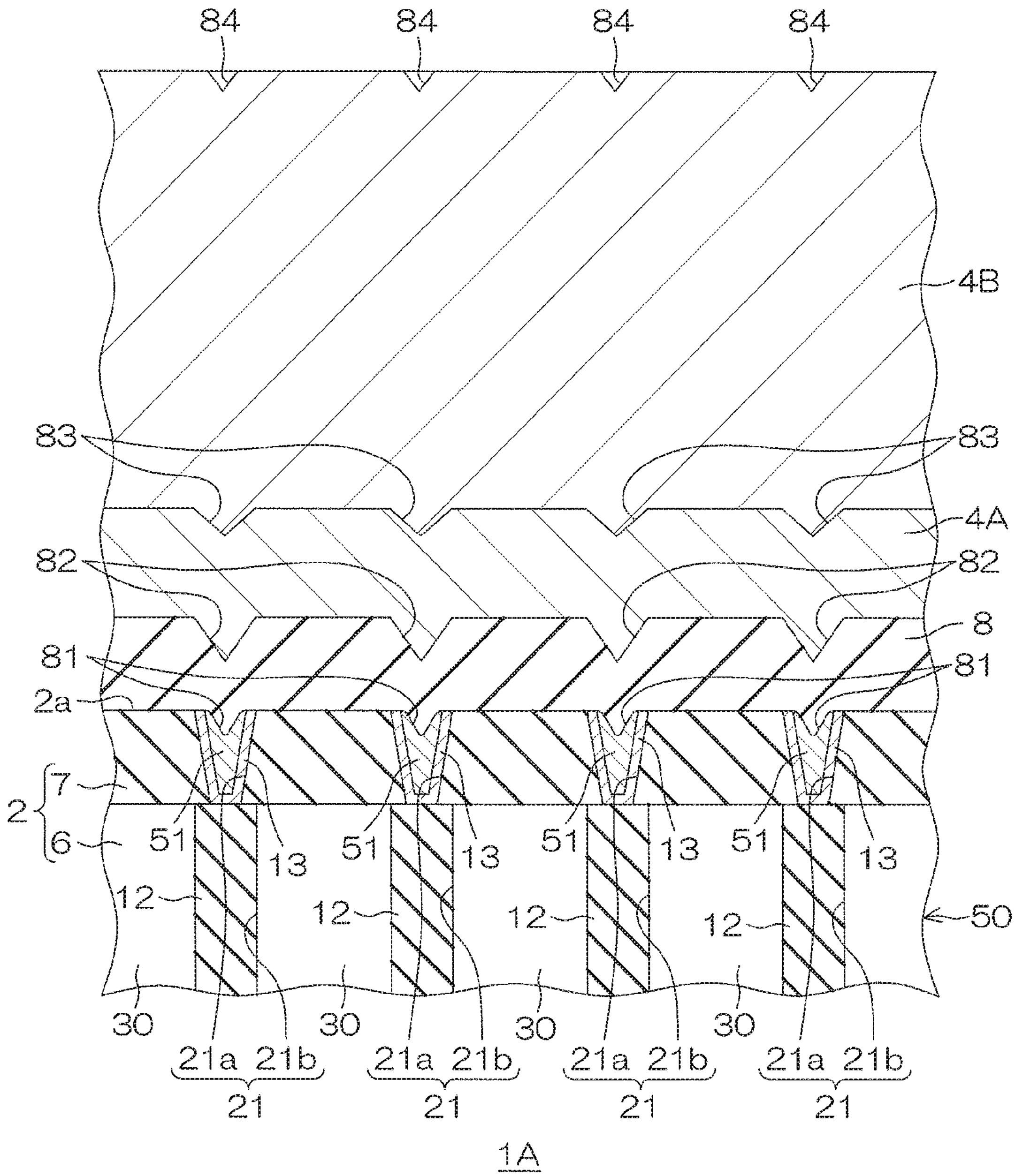

FIG. 62F is a partially enlarged cross-sectional view showing the step subsequent to FIG. 62E.

Figure 63:
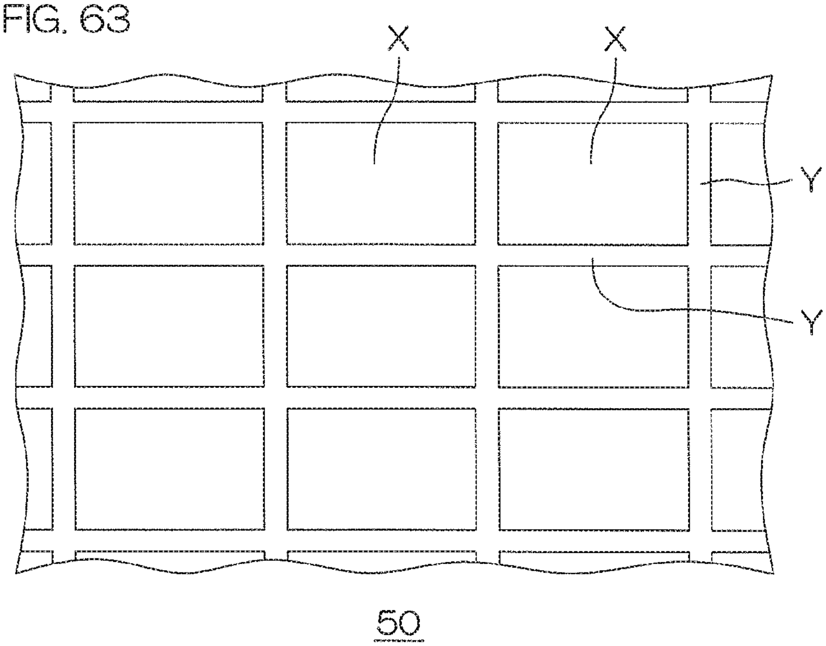

FIG. 63 is a plan view of an original substrate that is an original of a substrate main body of the chip inductor, and shows an enlarged view of a region.

Figure 64A:
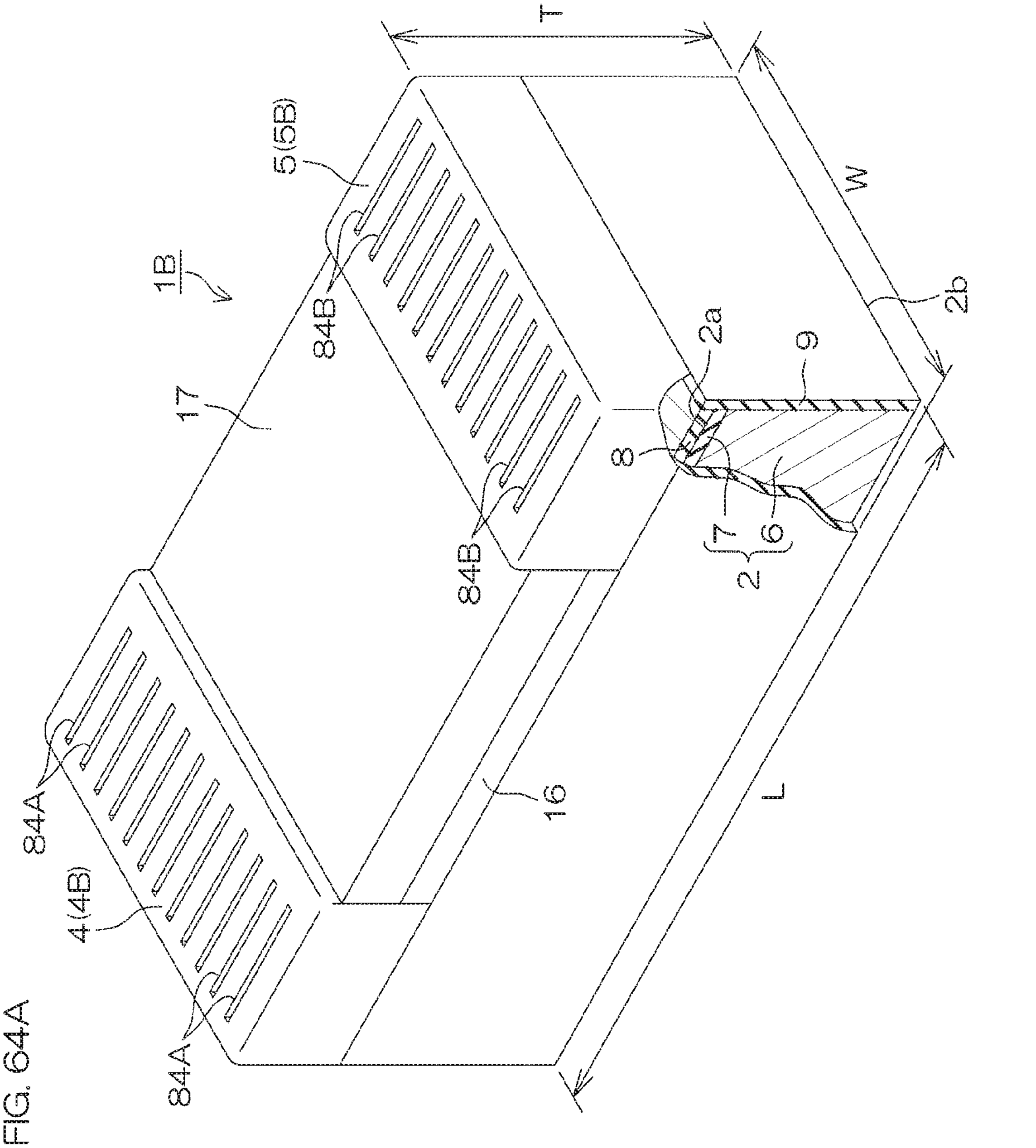

FIG. 64A is a partially cut perspective view of a chip inductor according to the third preferred embodiment of the second invention.

Figure 64B:
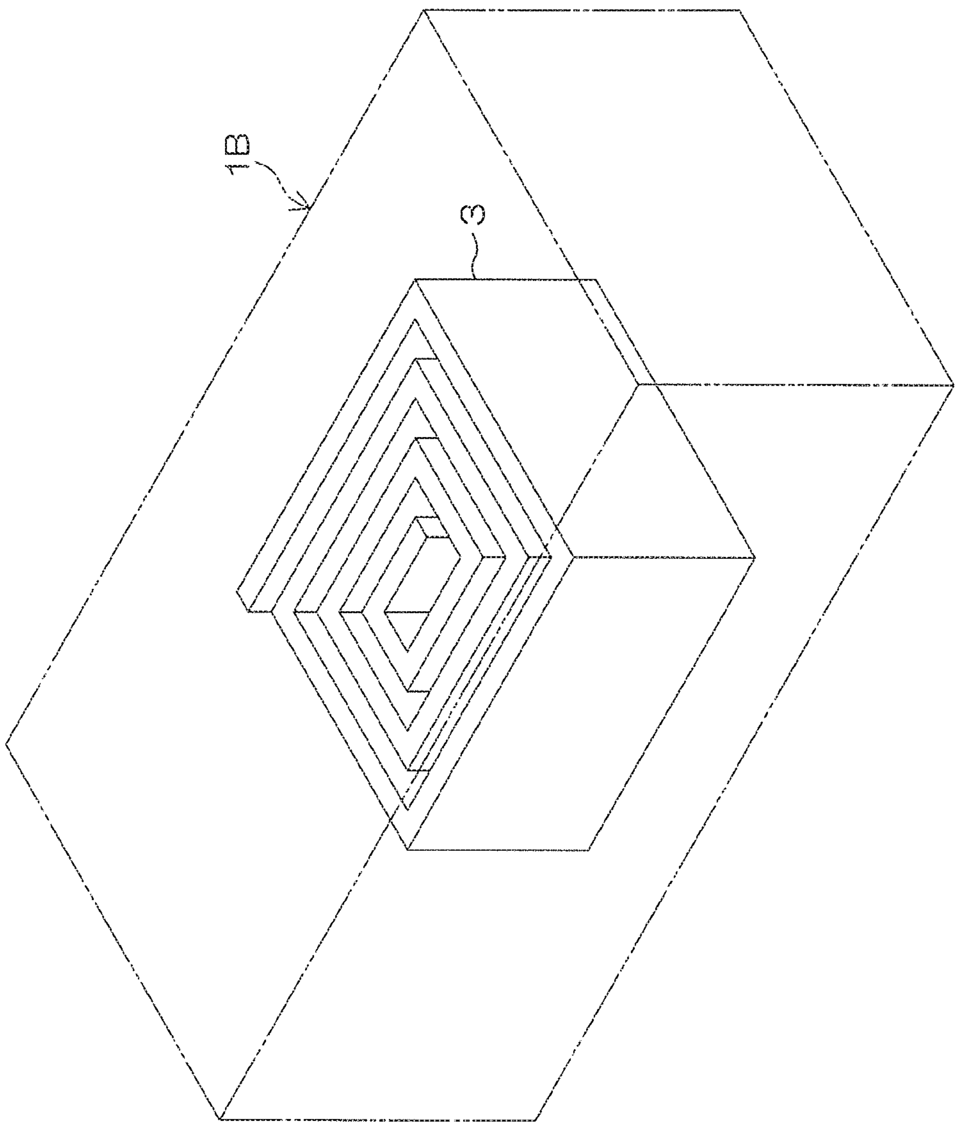

FIG. 64B is a perspective view showing a coil formed within the chip inductor.

Figure 65A:
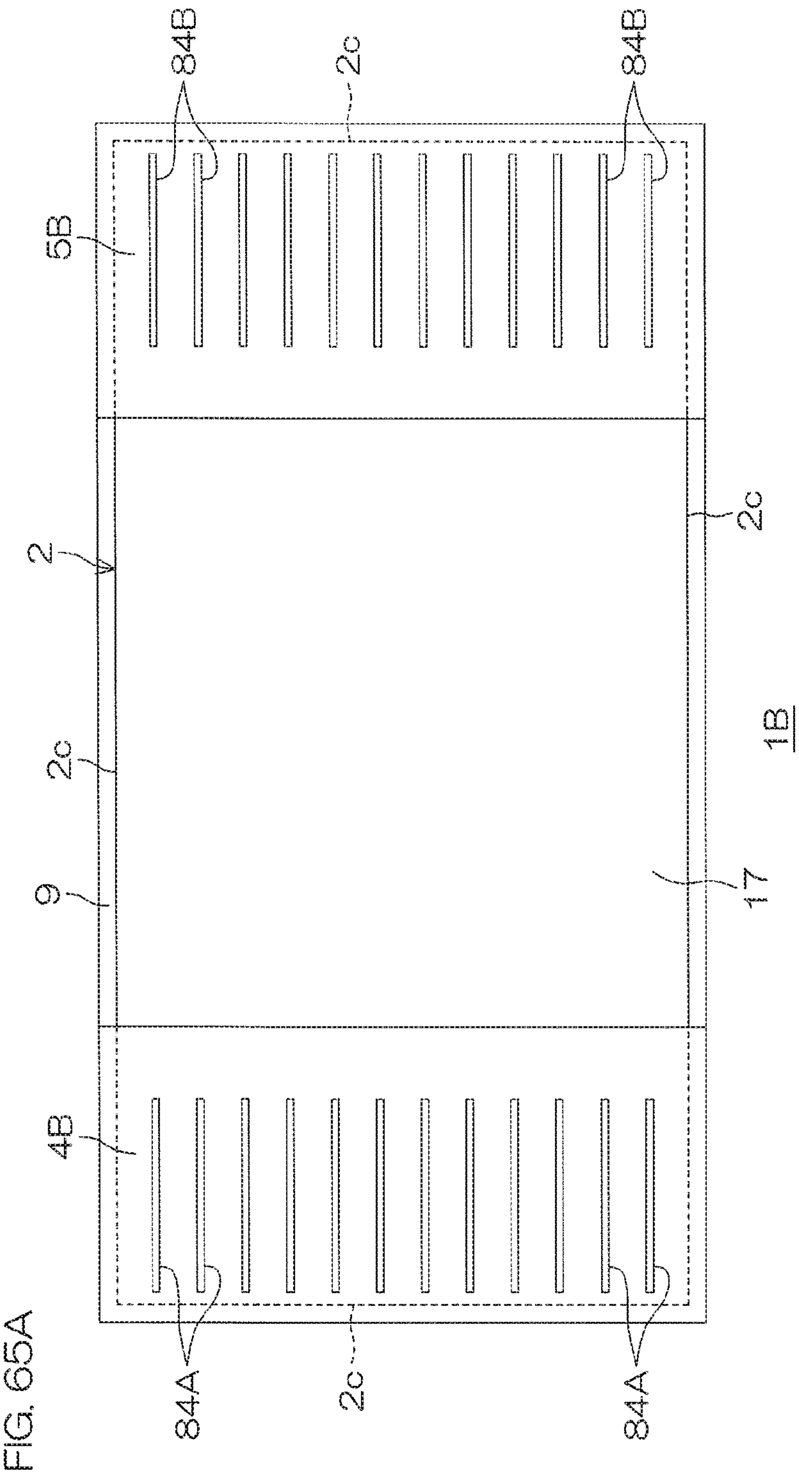

FIG. 65A is a plan view showing the appearance of the chip inductor when seen from the side of the electrode.

Figure 65B:
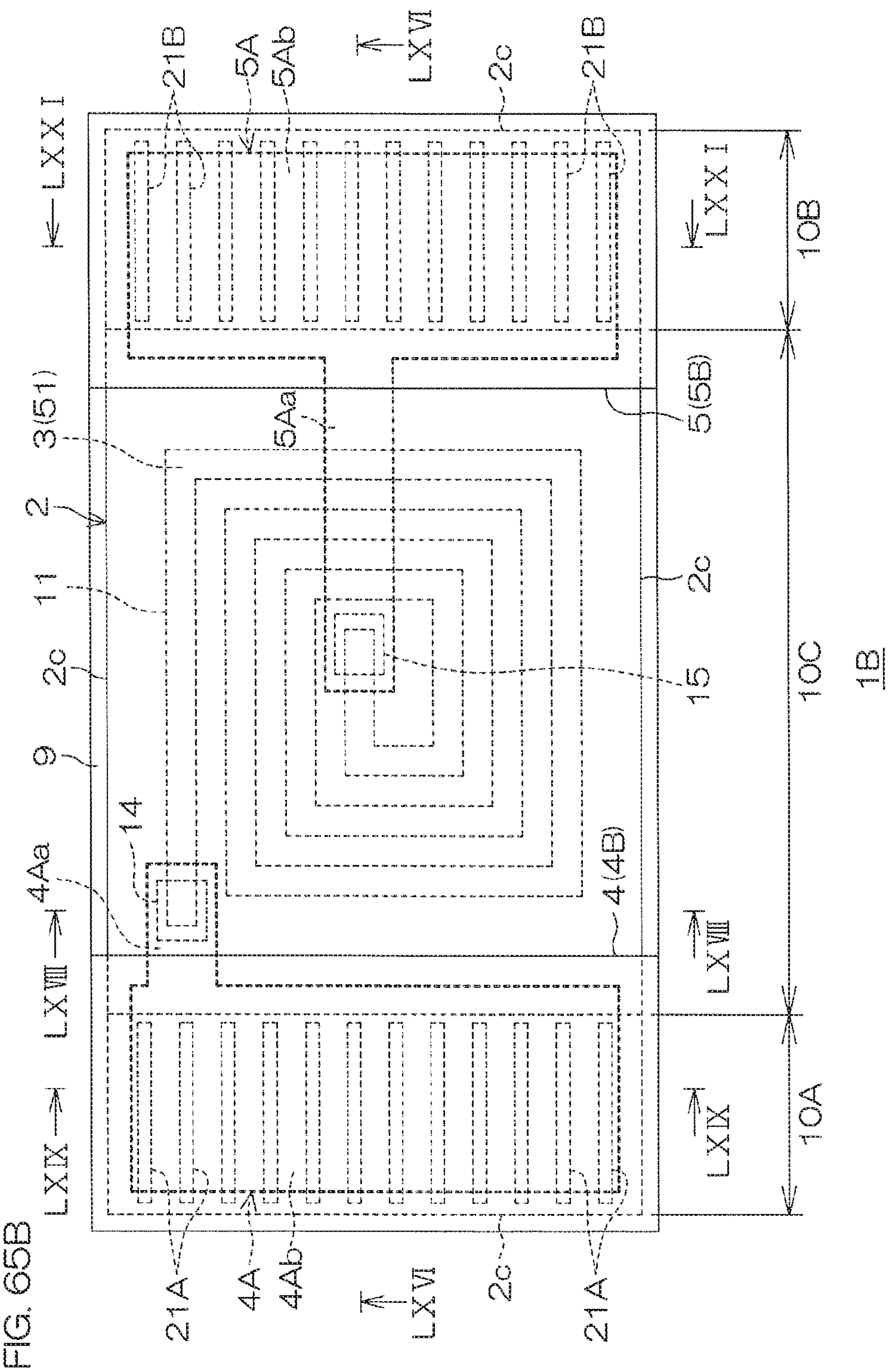

FIG. 65B is a plan view showing the internal structure of the chip inductor.

Figure 66:
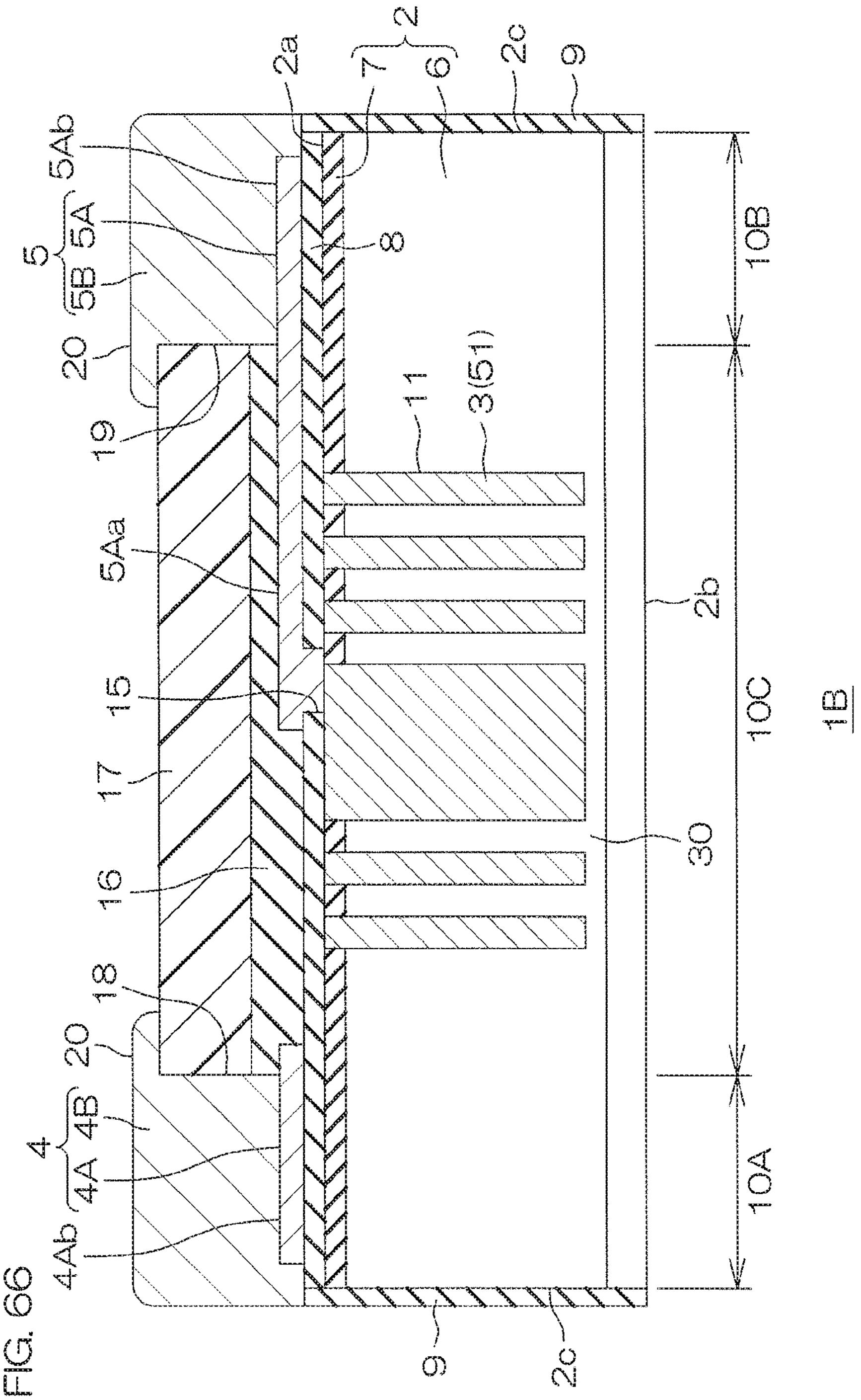

FIG. 66 is a cross-sectional view taken along line LXVI-LXVI in FIG. 65B.

Figure 67:
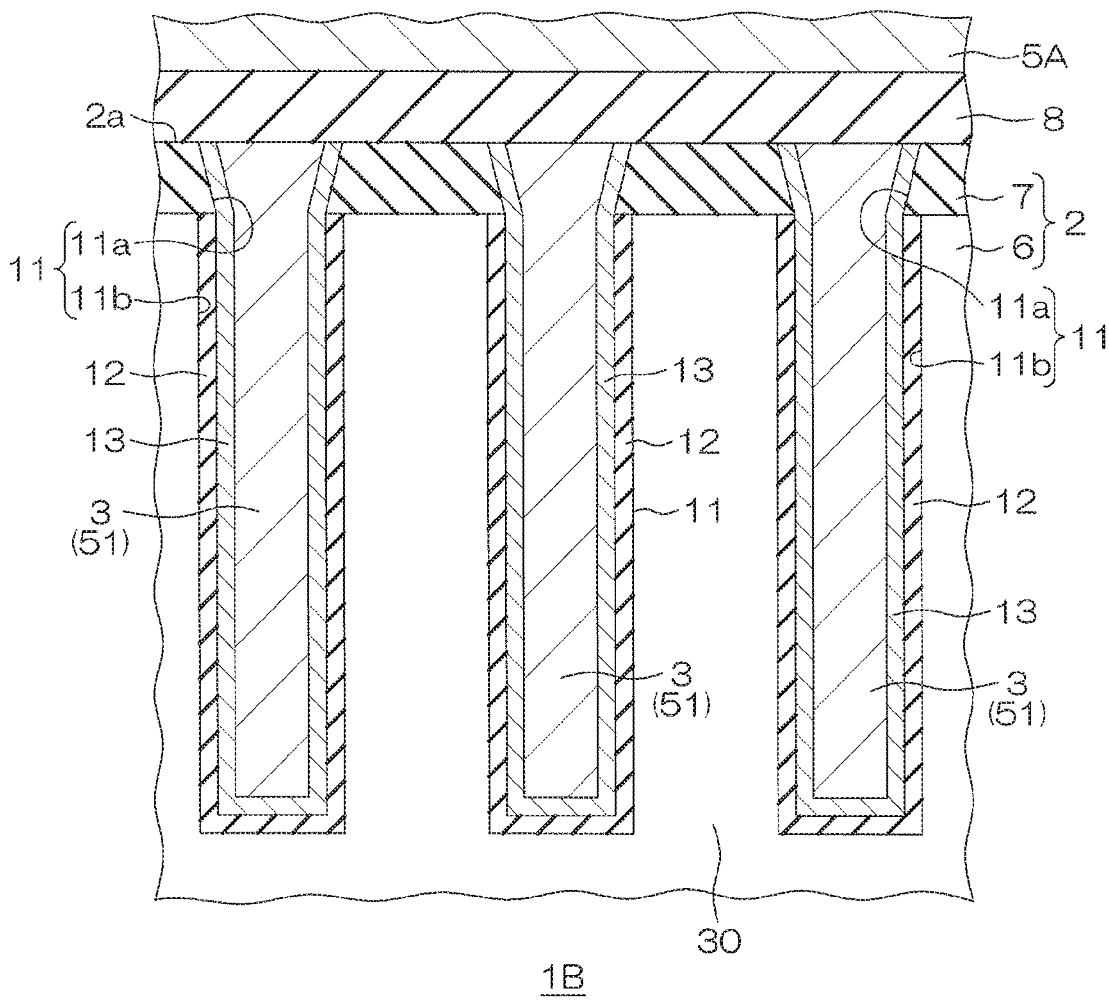

FIG. 67 is a partially enlarged cross-sectional view of FIG. 66.

Figure 68:
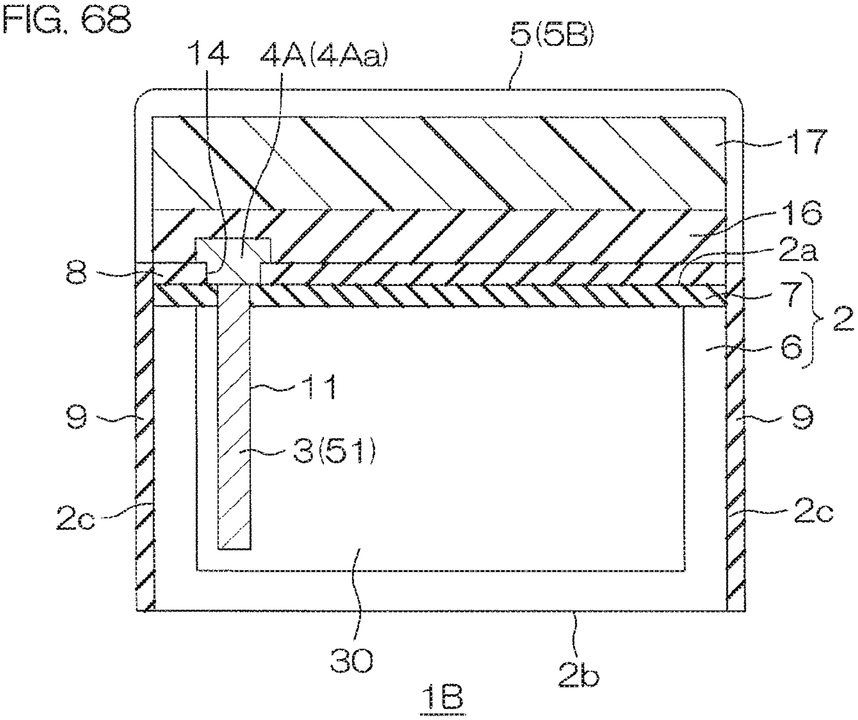

FIG. 68 is a cross-sectional view taken along line LXVIII-LXVIII in FIG. 65B.

Figure 69:
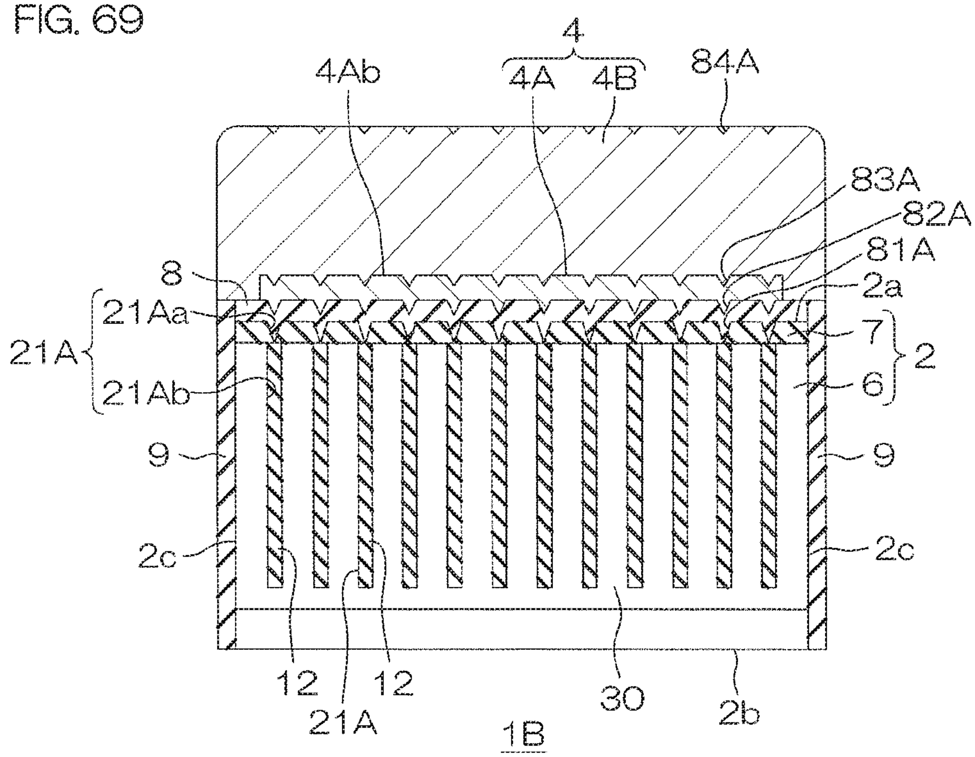

FIG. 69 is a cross-sectional view taken along line LXIX-LXIX in FIG. 65B.

Figure 70:
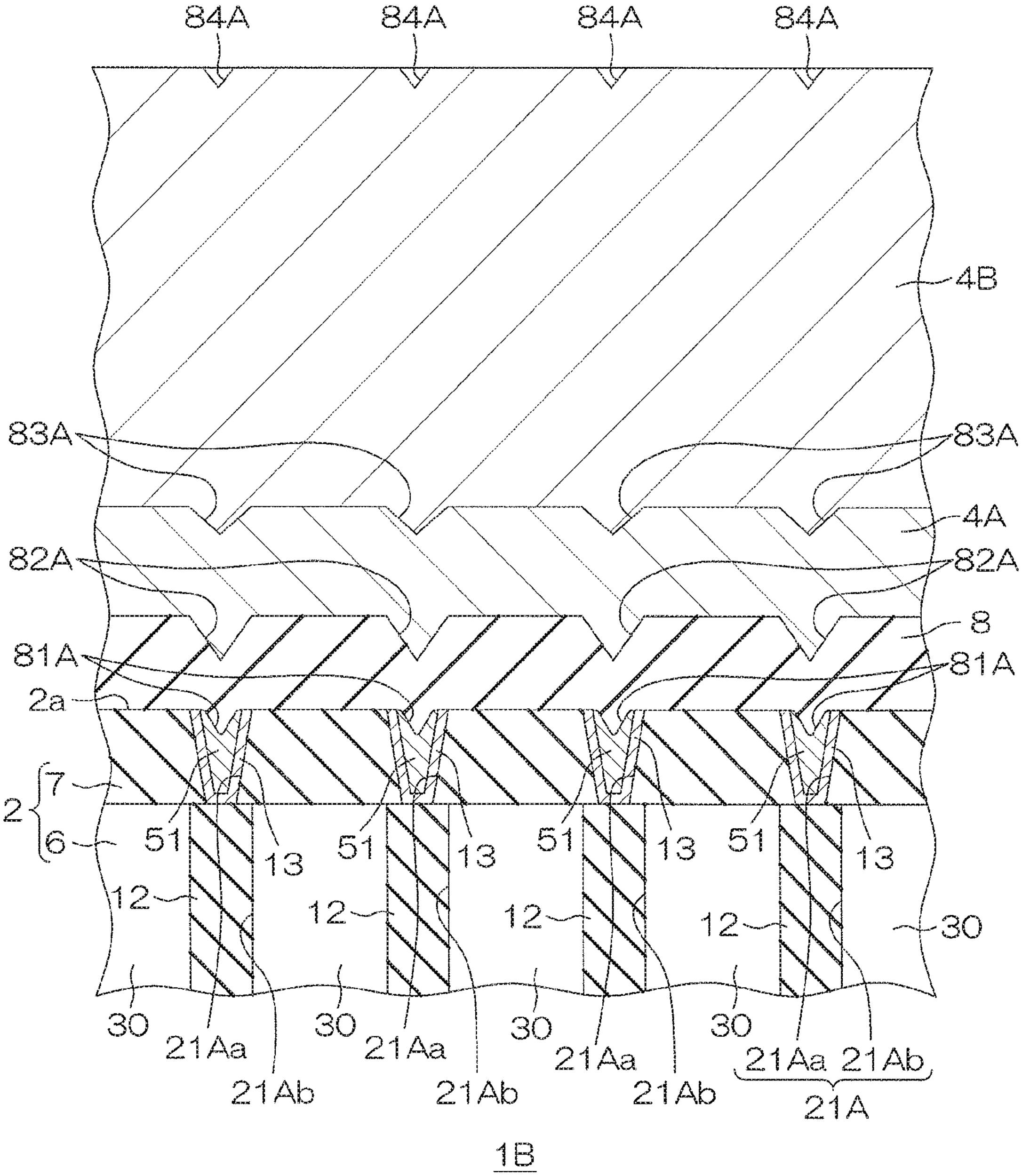

FIG. 70 is a partially enlarged cross-sectional view of FIG. 69.

Figure 71:
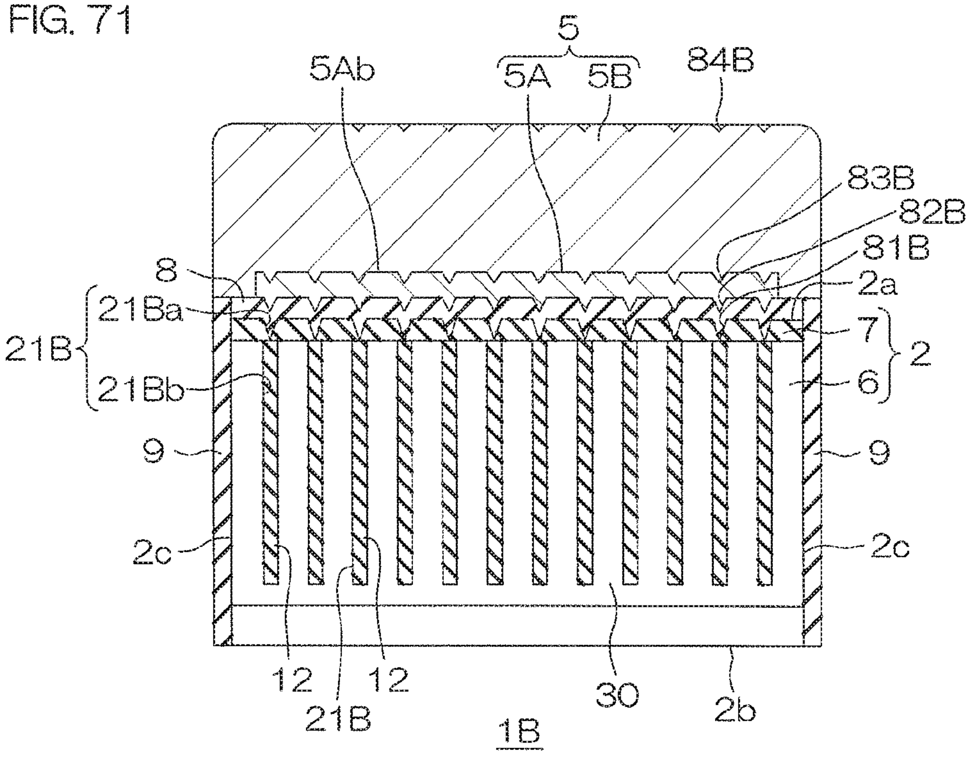

FIG. 71 is a cross-sectional view taken along line LXXI-LXXI in FIG. 65B.

Figure 72:
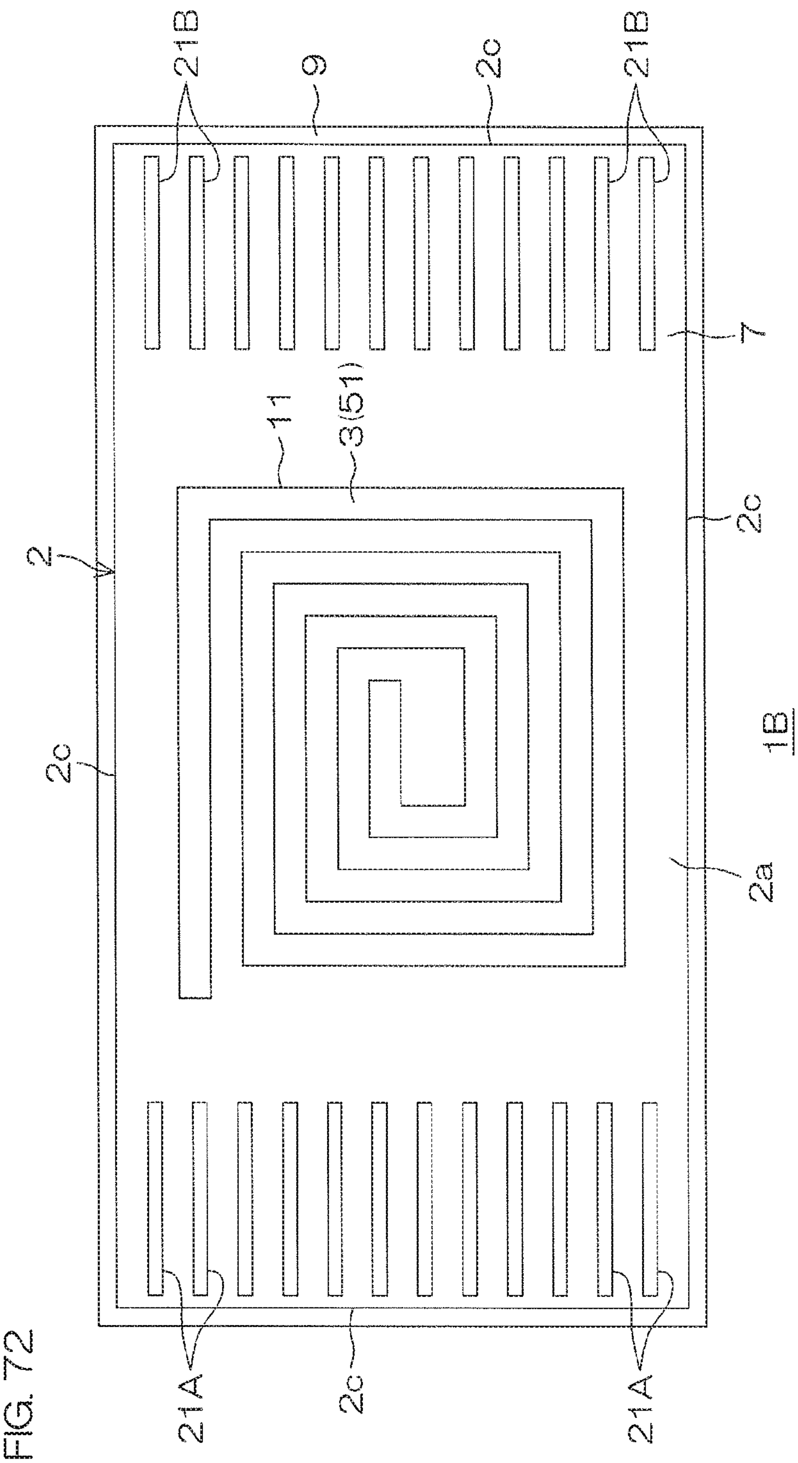

FIG. 72 is a plan view showing a structure of the surface of a substrate by removing an arrangement formed on the surface of the substrate.

Figure 73:
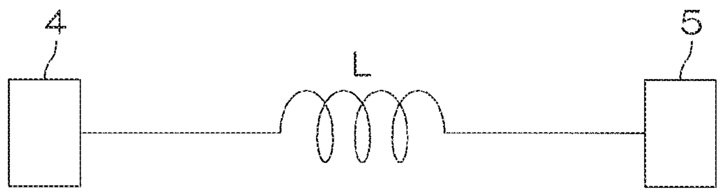

FIG. 73 is an electrical circuit diagram showing an electrical structure within the chip inductor.

Figure 74:
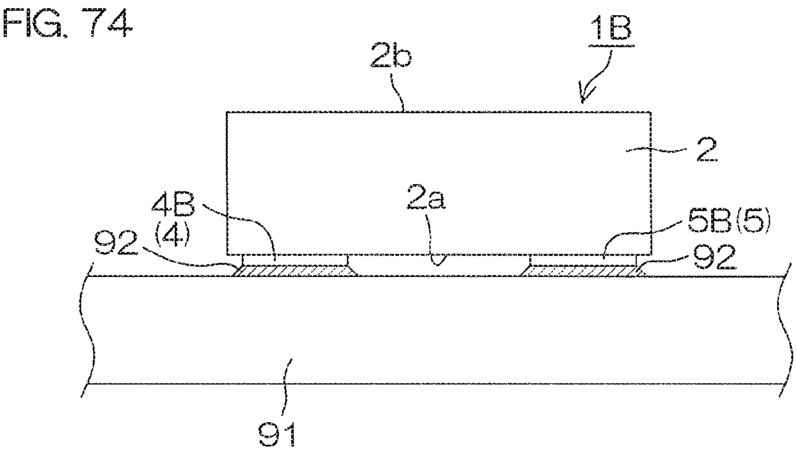

FIG. 74 is a cross-sectional view showing the arrangement of a circuit assembly in which the chip inductor is flip-chip connected on the mounting substrate.

Figure 52:
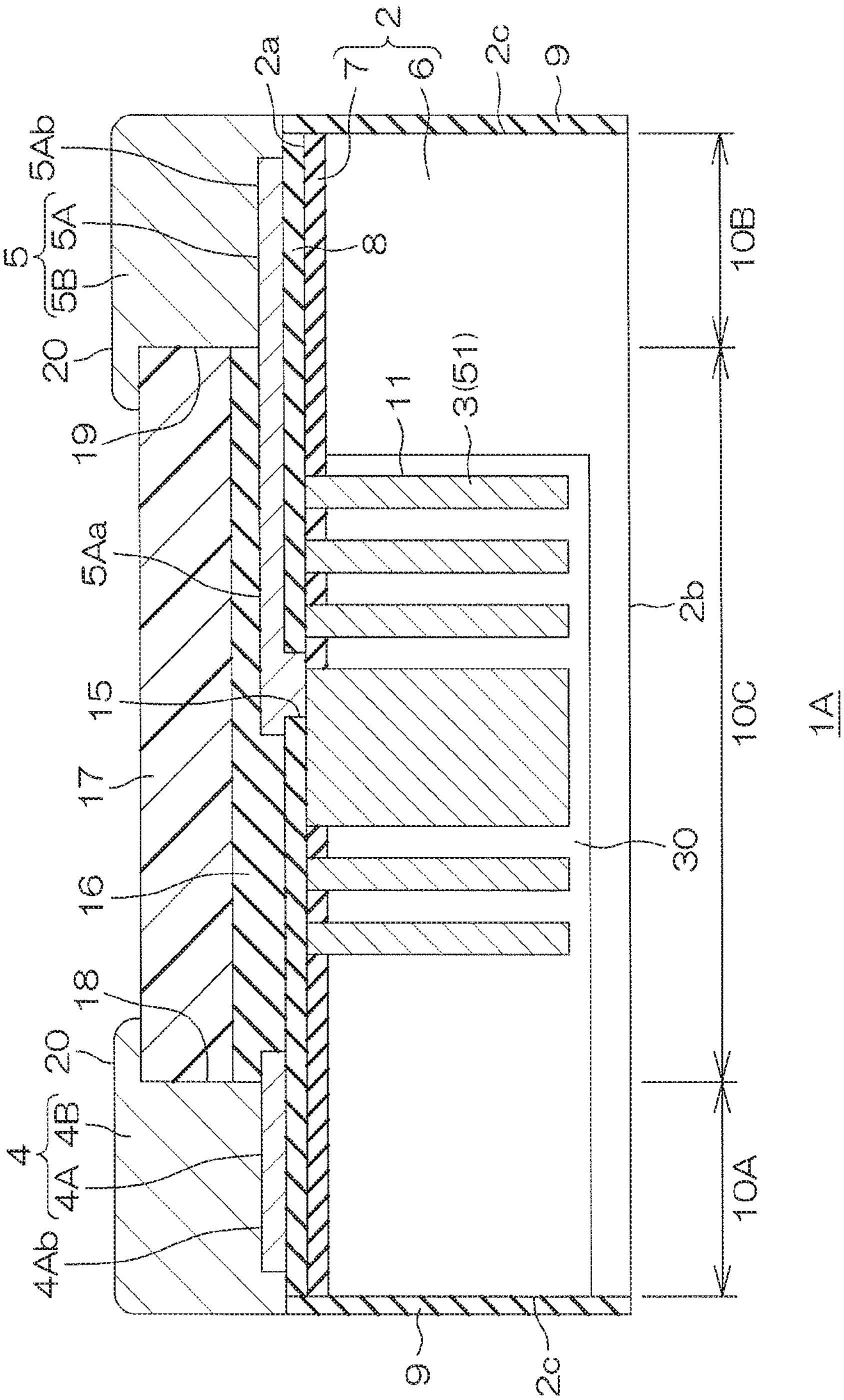
FIG. 52 is a cross-sectional view taken along line LII-LII in FIG. 51B.
Figure 75A:
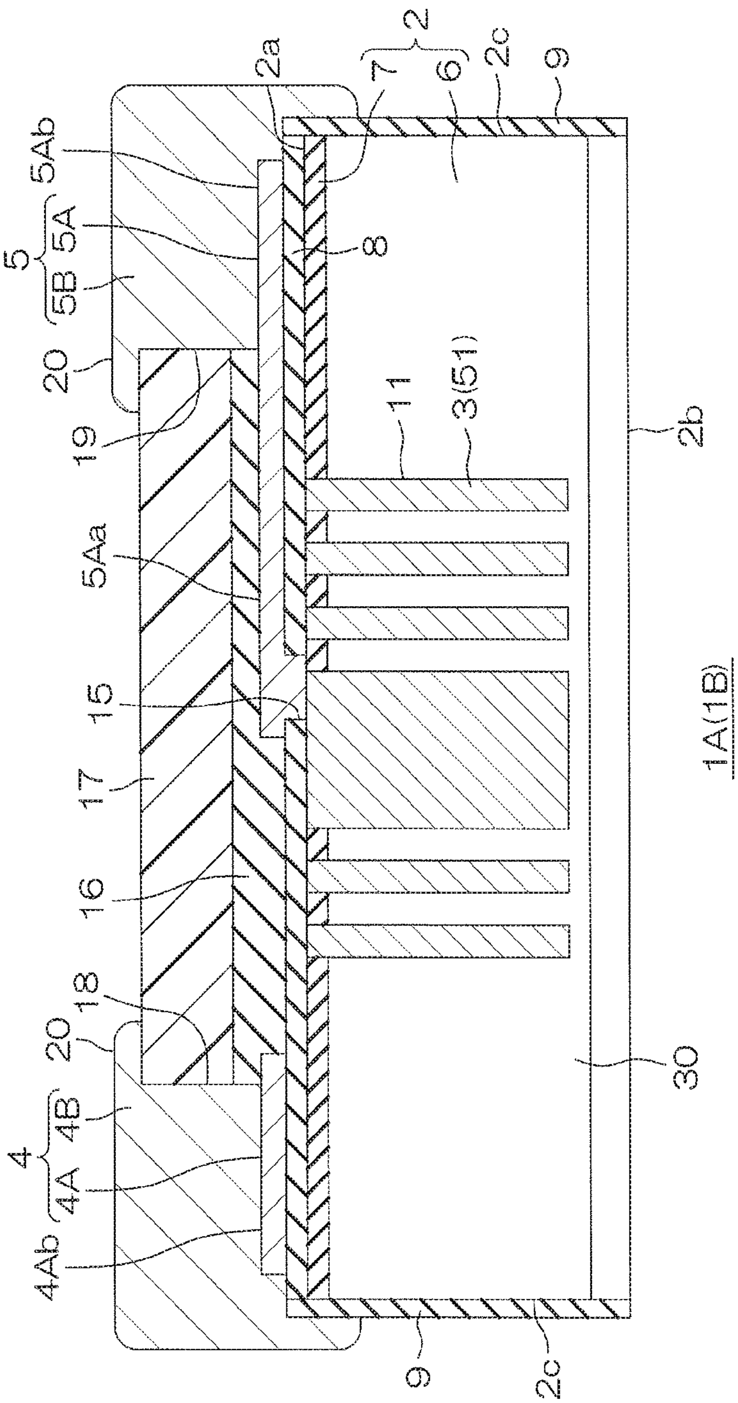

FIG. 75A is a cross-sectional view showing a modification example of the external connection electrode for the chip inductor of the second preferred embodiment and the third preferred embodiment of the second invention, and shows a cut surface corresponding to FIG. 52 (FIG. 66).

Figure 55:
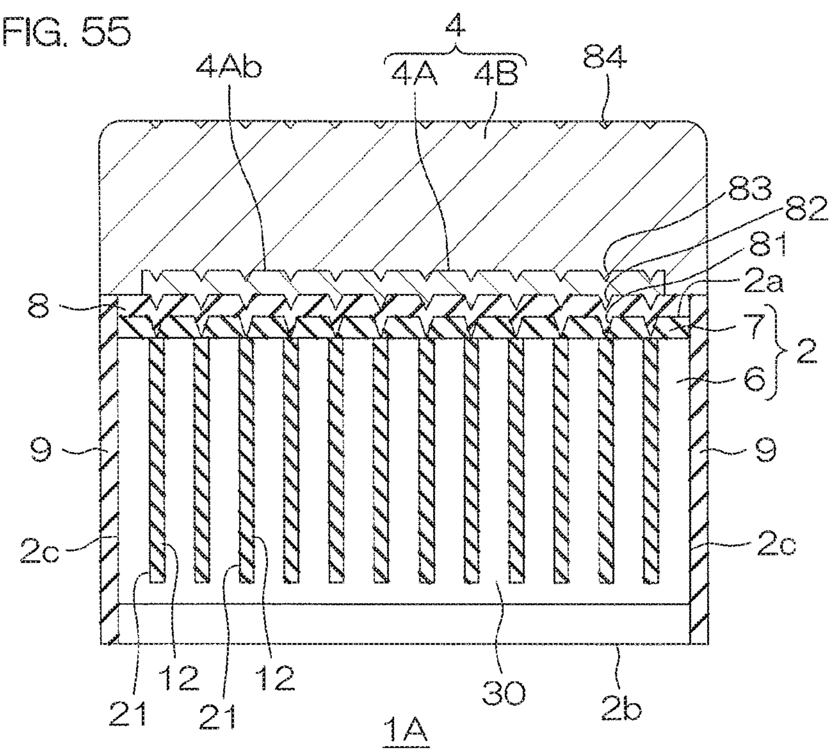
FIG. 55 is a cross-sectional view taken along line LV-LV in FIG. 51B.
Figure 75B:
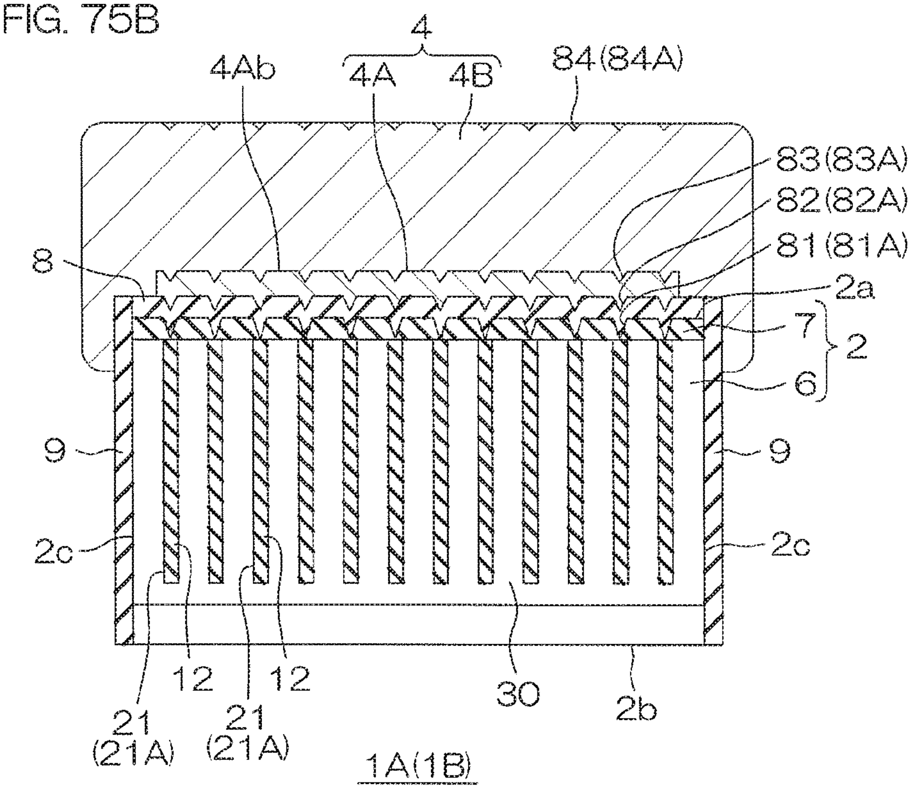

FIG. 75B is a cross-sectional view showing the modification example of the external connection electrode for the chip inductor of the second preferred embodiment and the third preferred embodiment of the second invention, and shows a cut surface corresponding to FIG. 55 (FIG. 69).

Figure 76A:
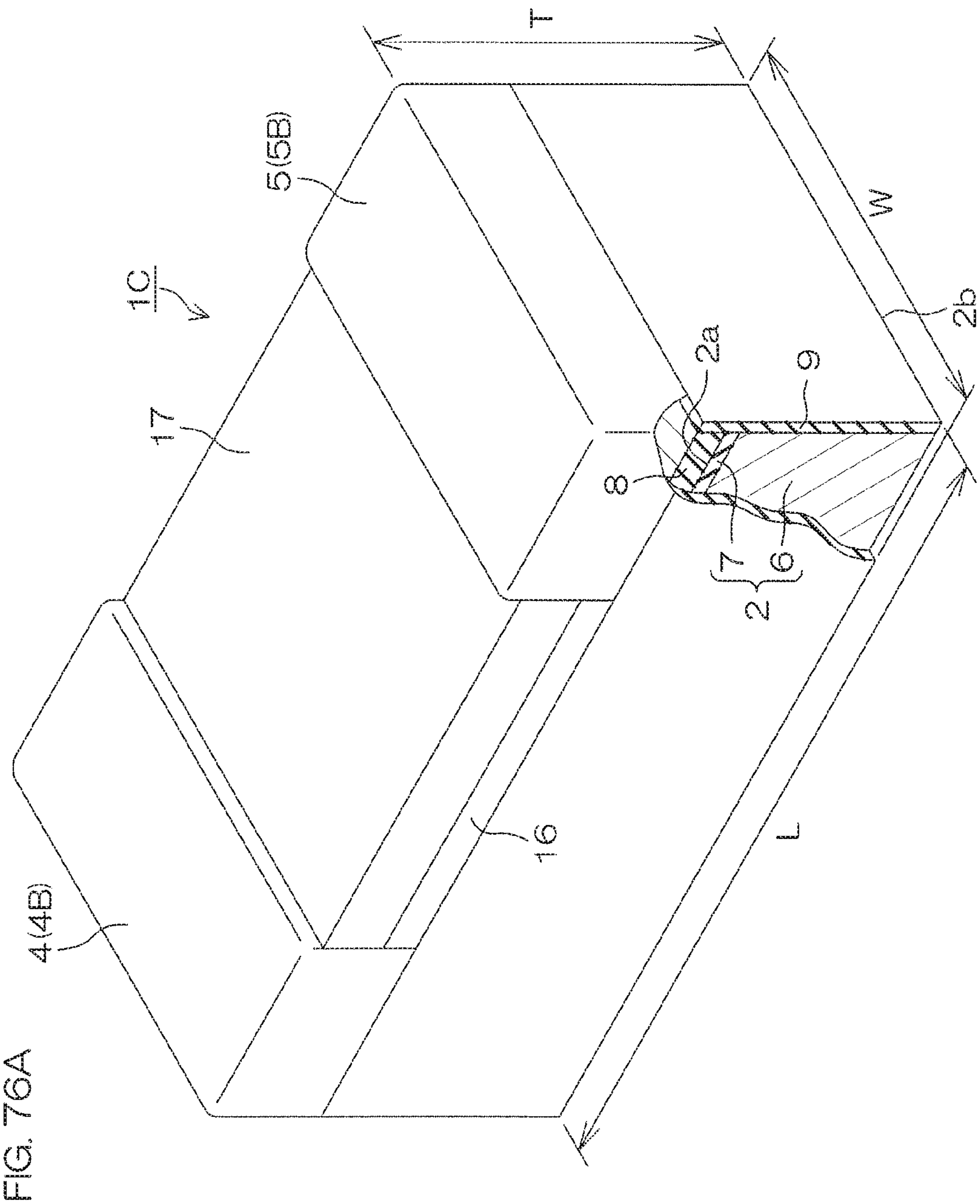

FIG. 76A is a partially cut perspective view of a chip inductor according to a fourth preferred embodiment of the second invention.

Figure 76B:
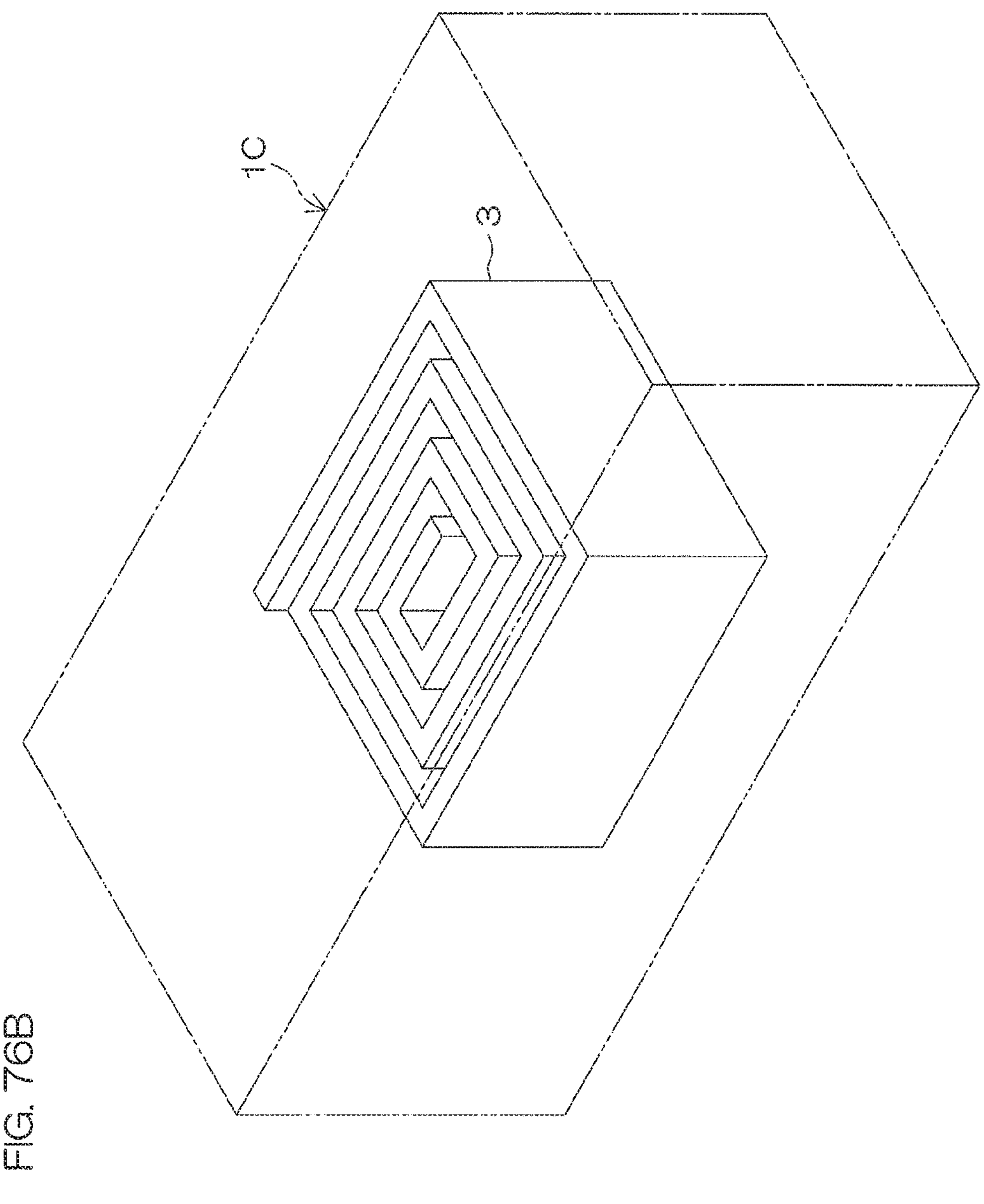

FIG. 76B is a perspective view showing a coil formed within the chip inductor.

Figure 77:
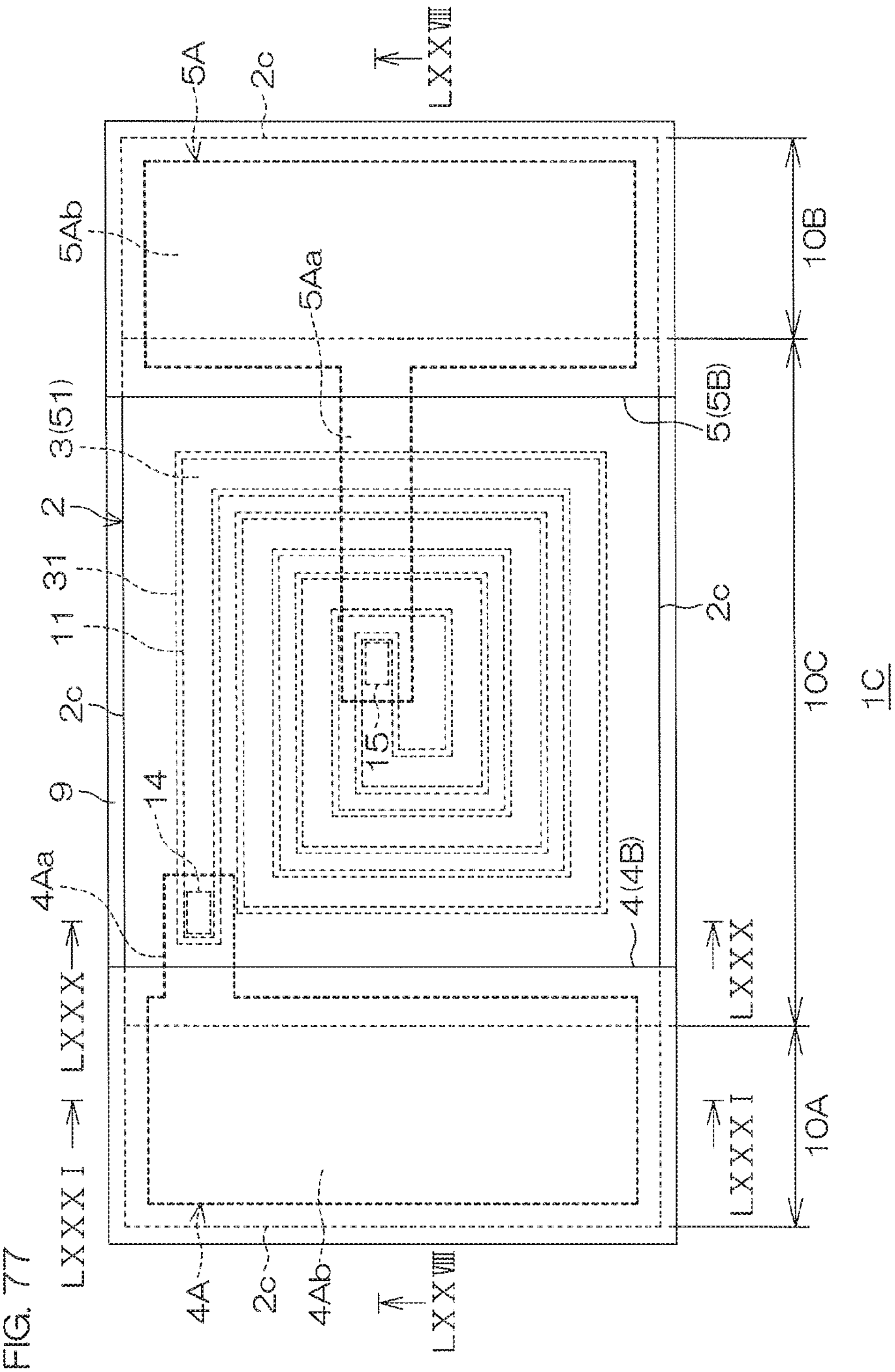

FIG. 77 is a plan view of the chip inductor.

Figure 78:
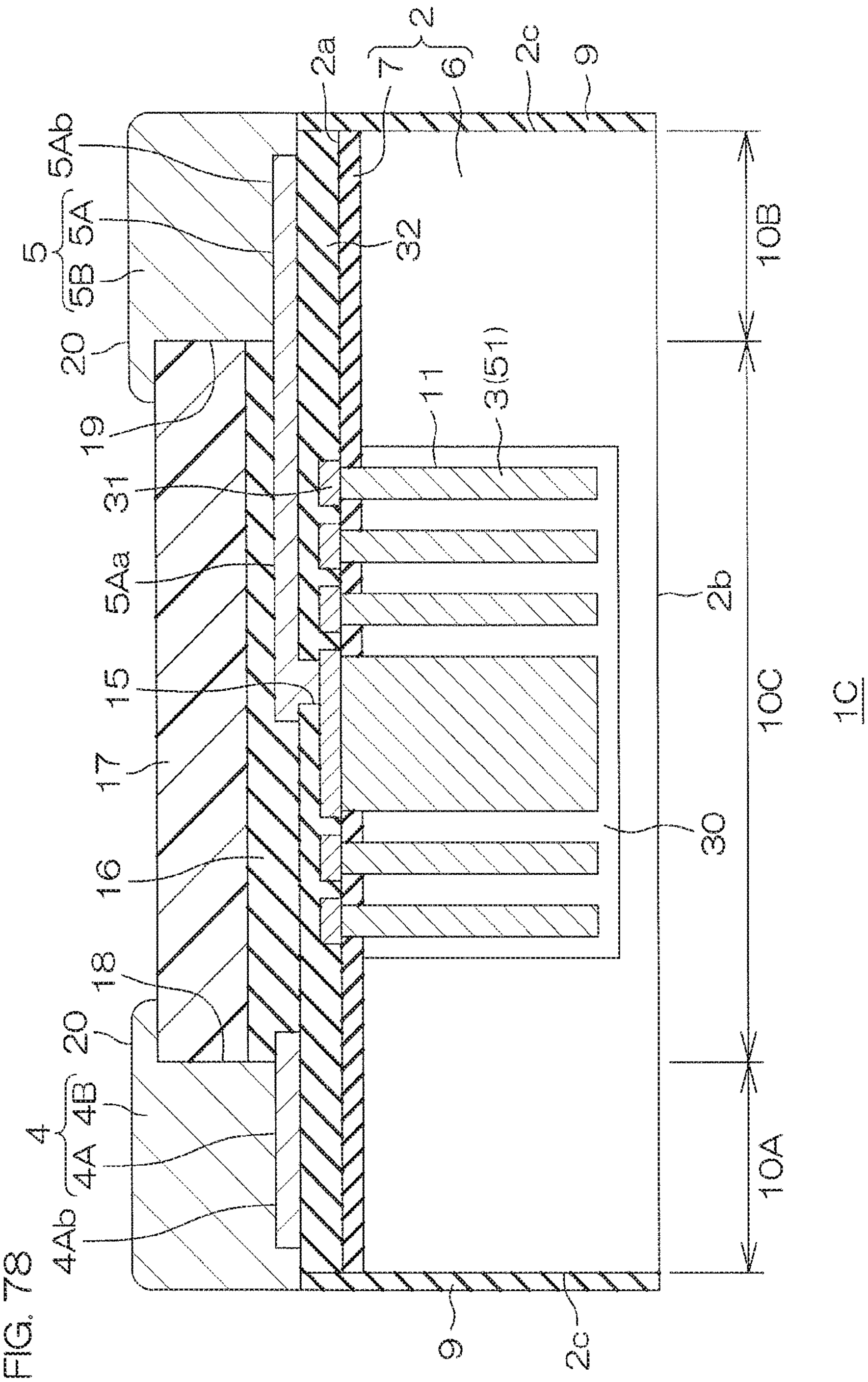

FIG. 78 is a cross-sectional view taken along line LXXVIII-LXXVIII in FIG. 77.

Figure 79:
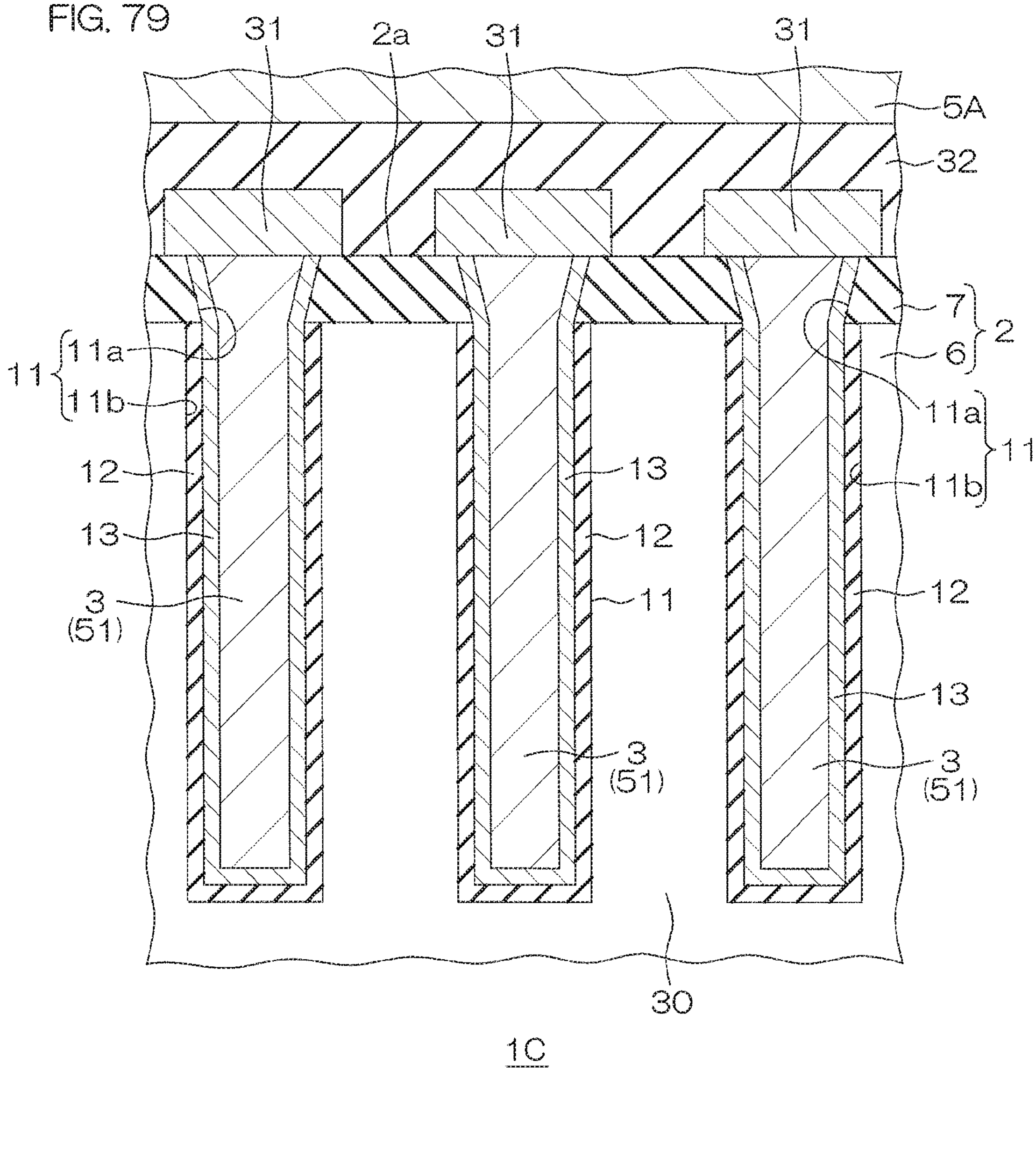

FIG. 79 is a partially enlarged cross-sectional view of FIG. 78.

Figure 80:
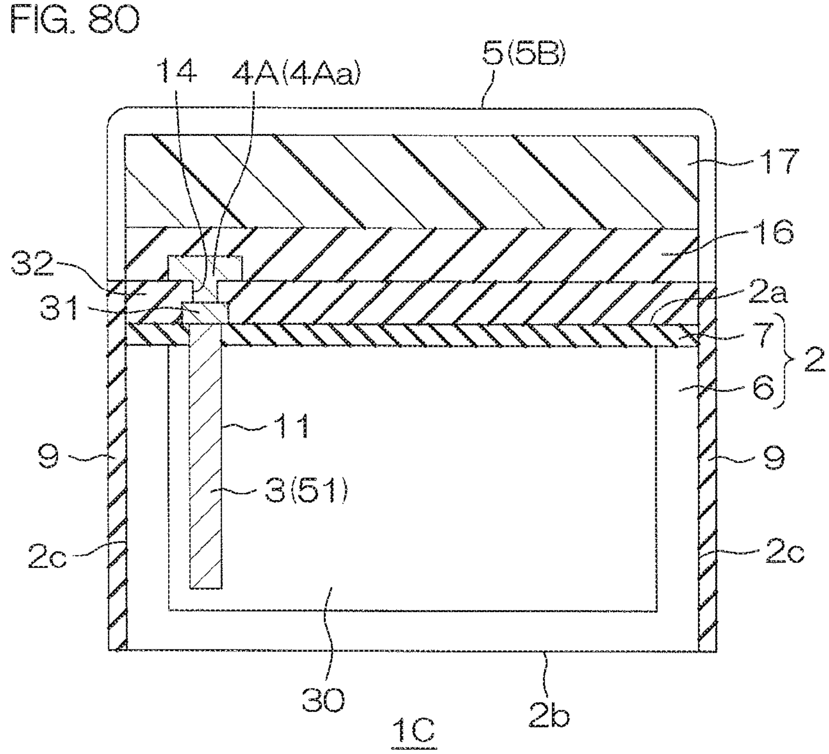

FIG. 80 is a cross-sectional view taken along line LXXX-LXXX in FIG. 77.

Figure 81:
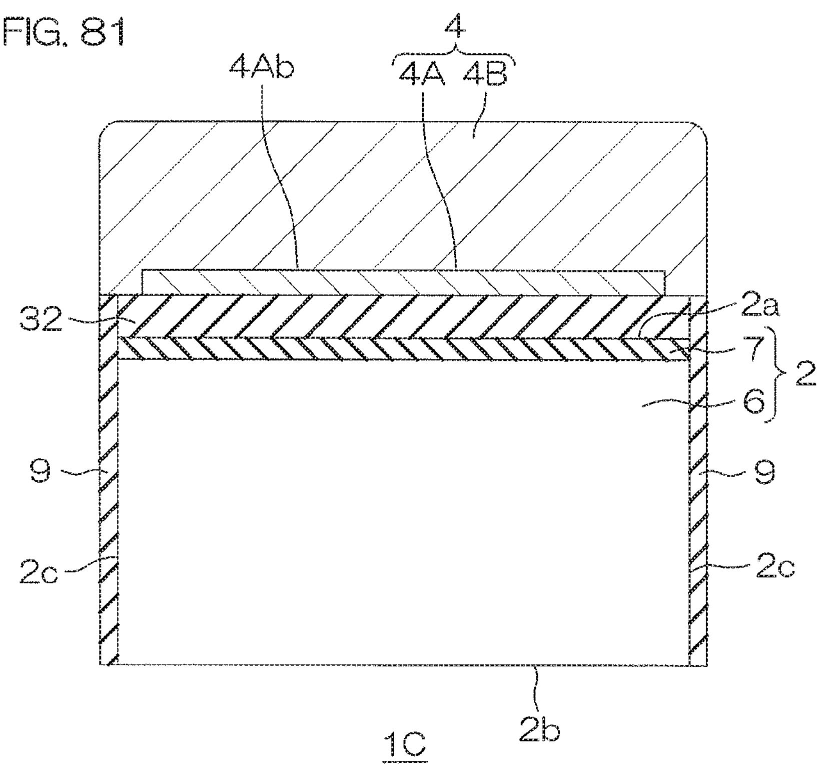

FIG. 81 is a cross-sectional view taken along line LXXXI-LXXXI in FIG. 77.

Figure 82:
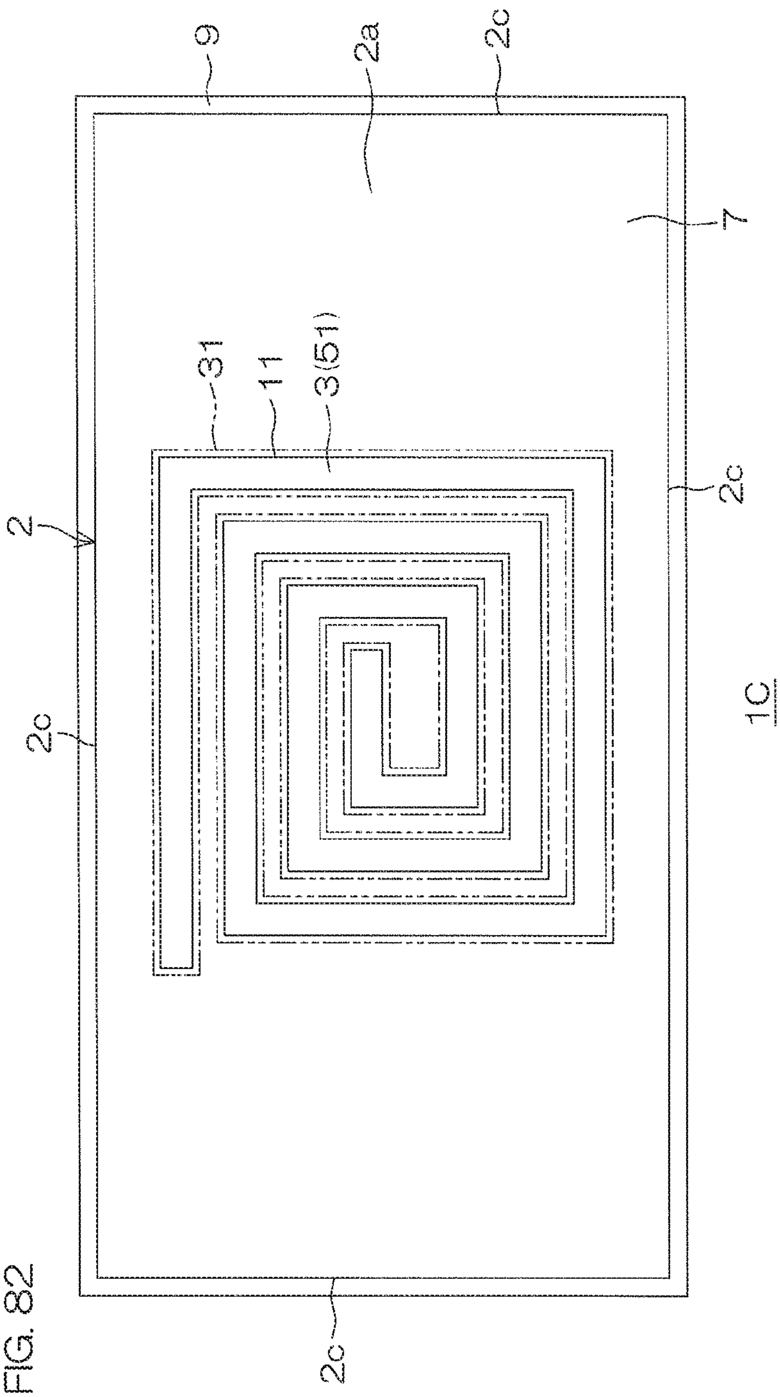

FIG. 82 is a plan view showing a structure of the surface of a substrate by removing an arrangement formed on the surface of the substrate.

Figure 83:
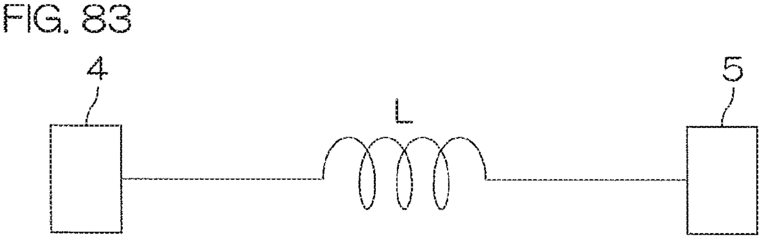

FIG. 83 is an electrical circuit diagram showing an electrical structure within the chip inductor.

Figure 84:
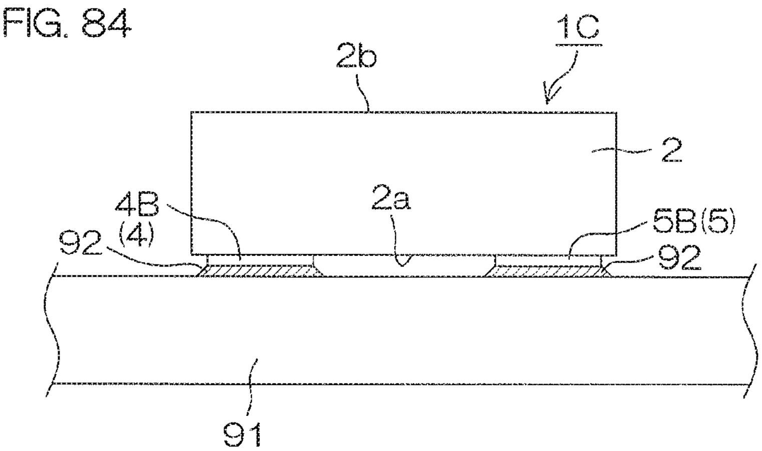

FIG. 84 is a cross-sectional view showing the arrangement of a circuit assembly in which the chip inductor is flip-chip connected on the mounting substrate.

Figure 85A:
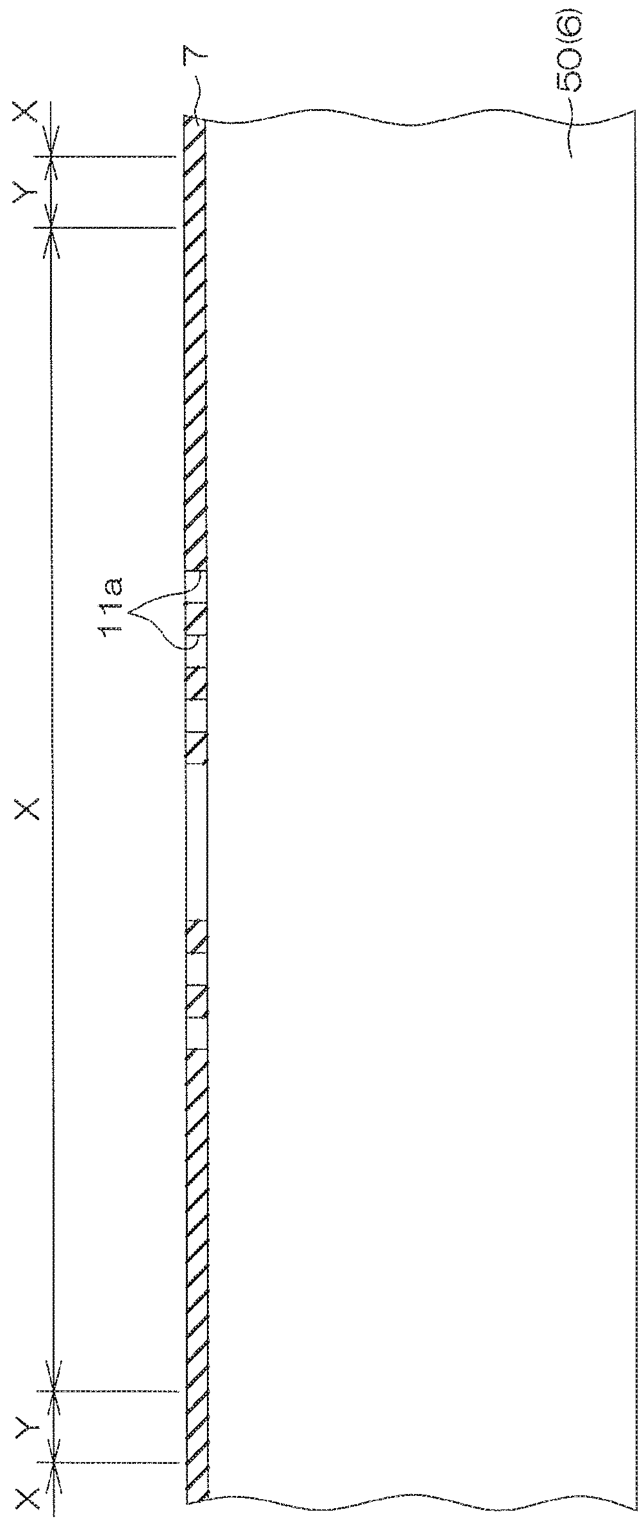

FIG. 85A is a cross-sectional view for illustrating an example of the manufacturing step of the chip inductor.

Figure 85B:
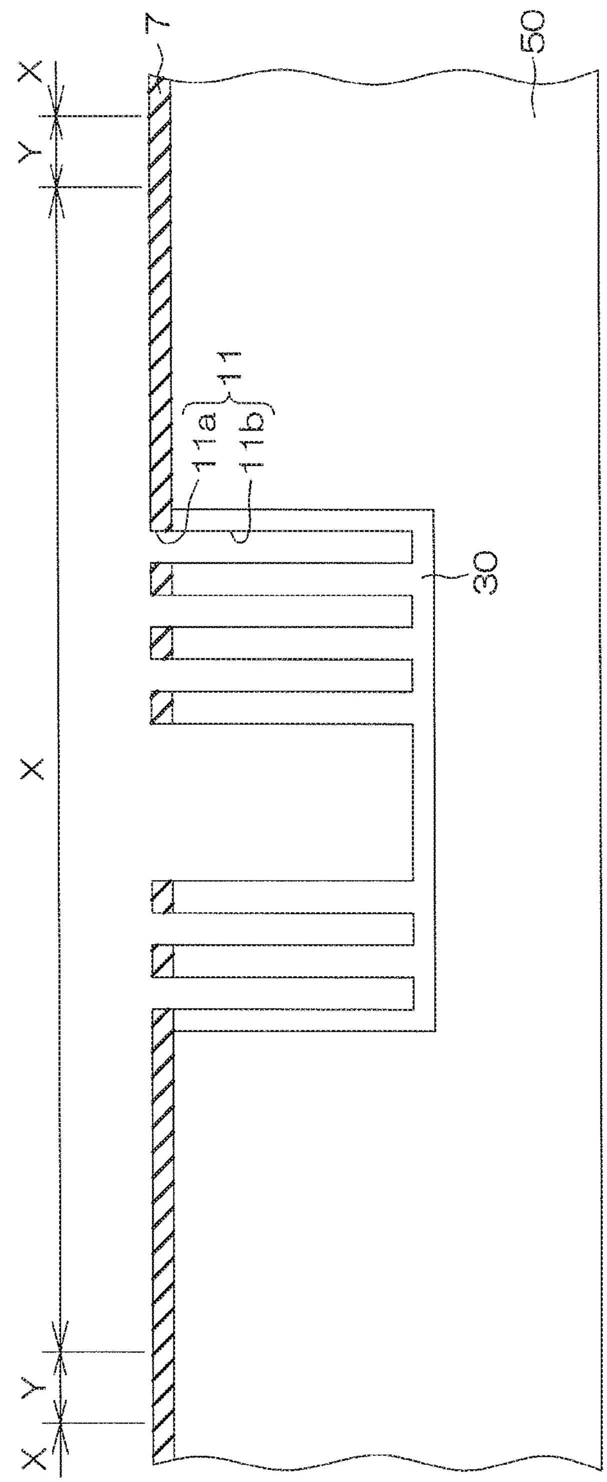

FIG. 85B is a cross-sectional view showing the step subsequent to FIG. 85A.

Figure 85C:
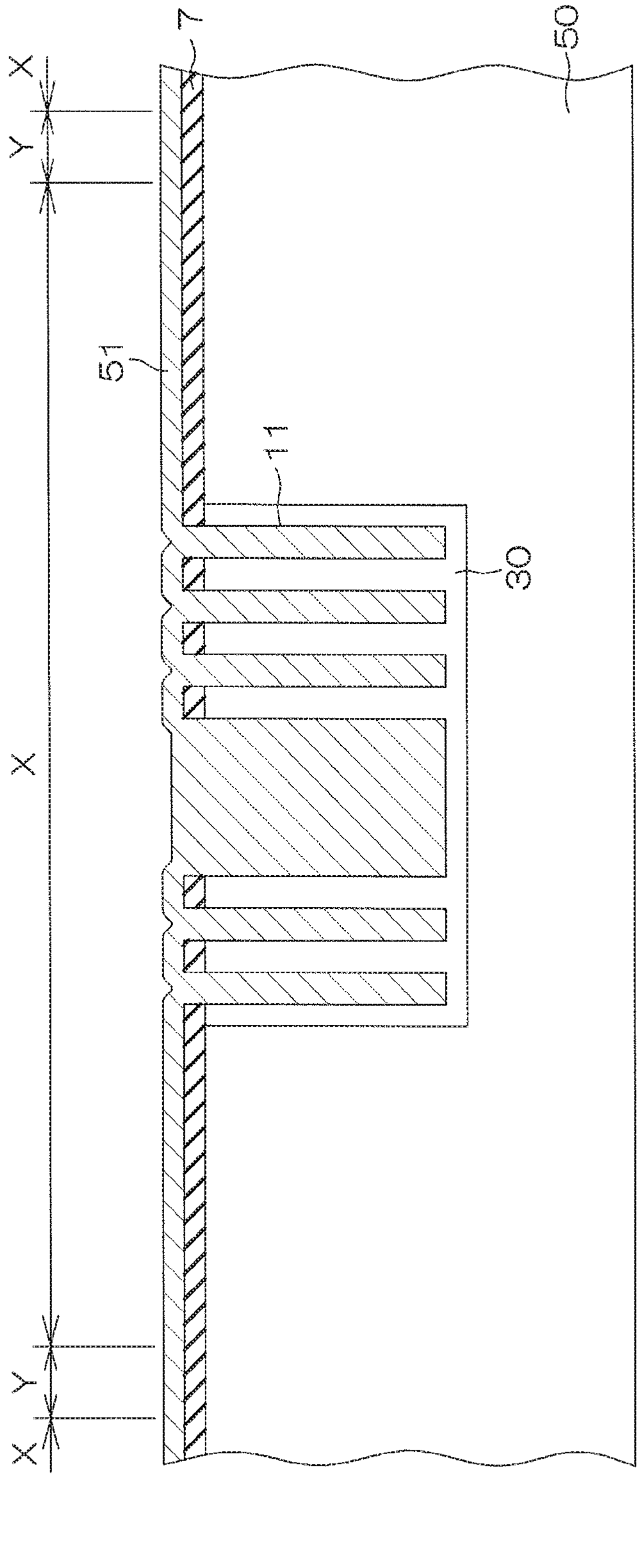

FIG. 85C is a cross-sectional view showing the step subsequent to FIG. 85B.

Figure 85D:
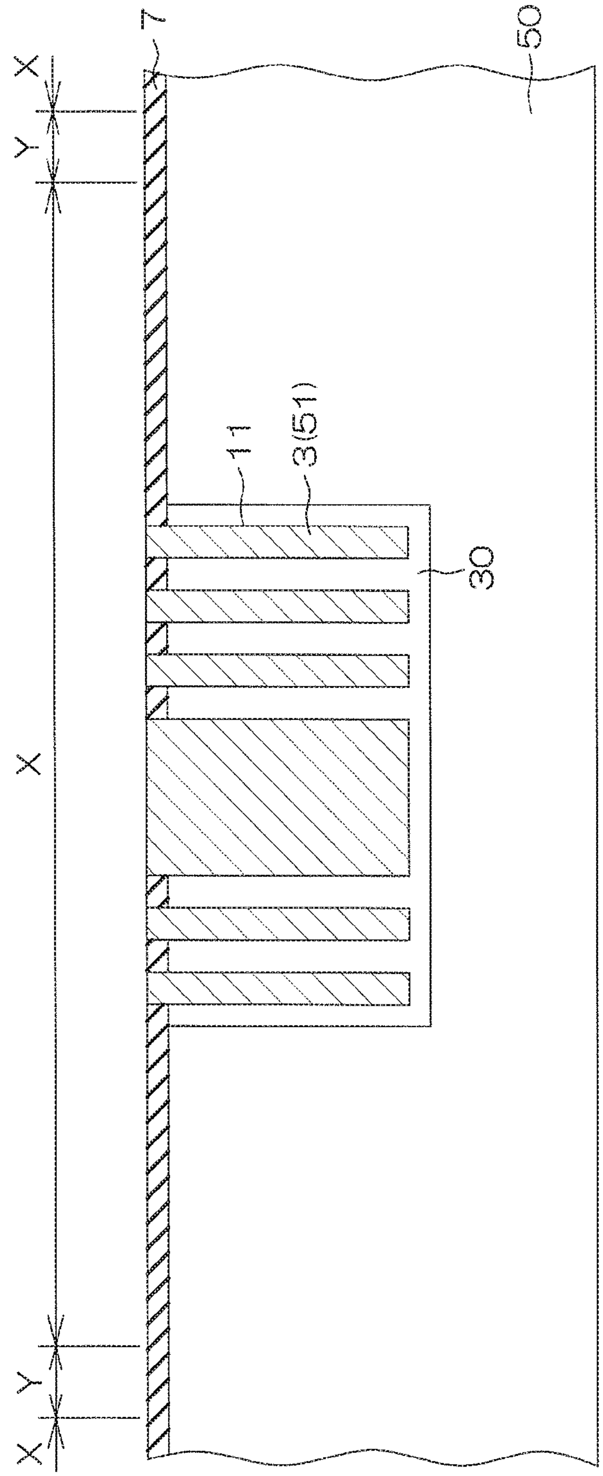

FIG. 85D is a cross-sectional view showing the step subsequent to FIG. 85C.

Figure 85E:
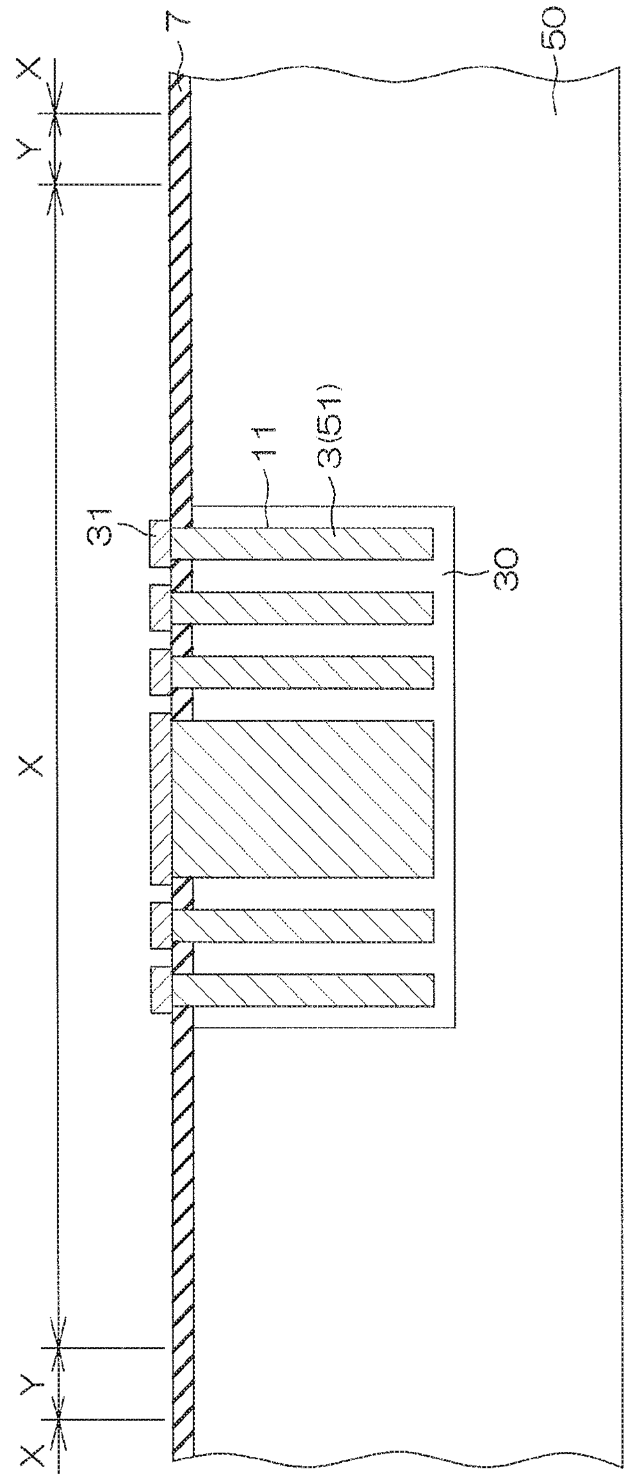

FIG. 85E is a cross-sectional view showing the step subsequent to FIG. 85D.

Figure 85F:
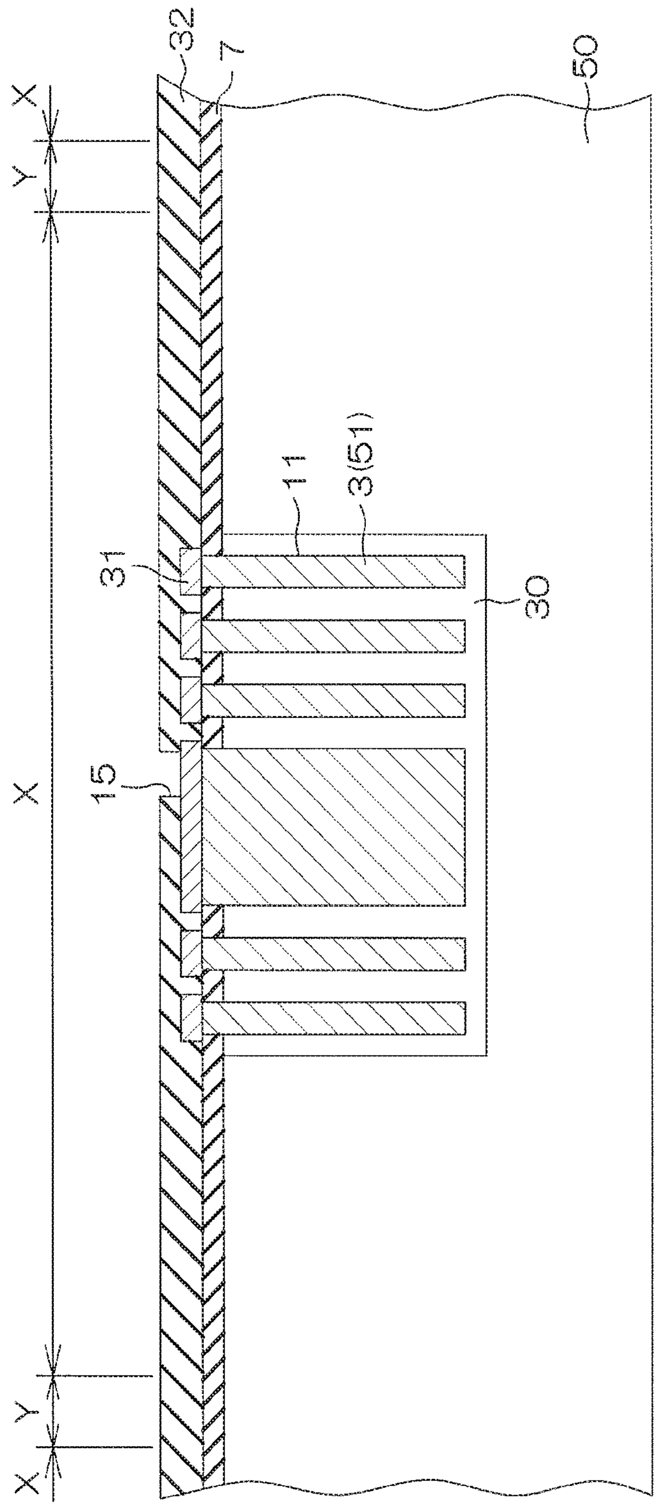

FIG. 85F is a cross-sectional view showing the step subsequent to FIG. 85E.

Figure 85G:
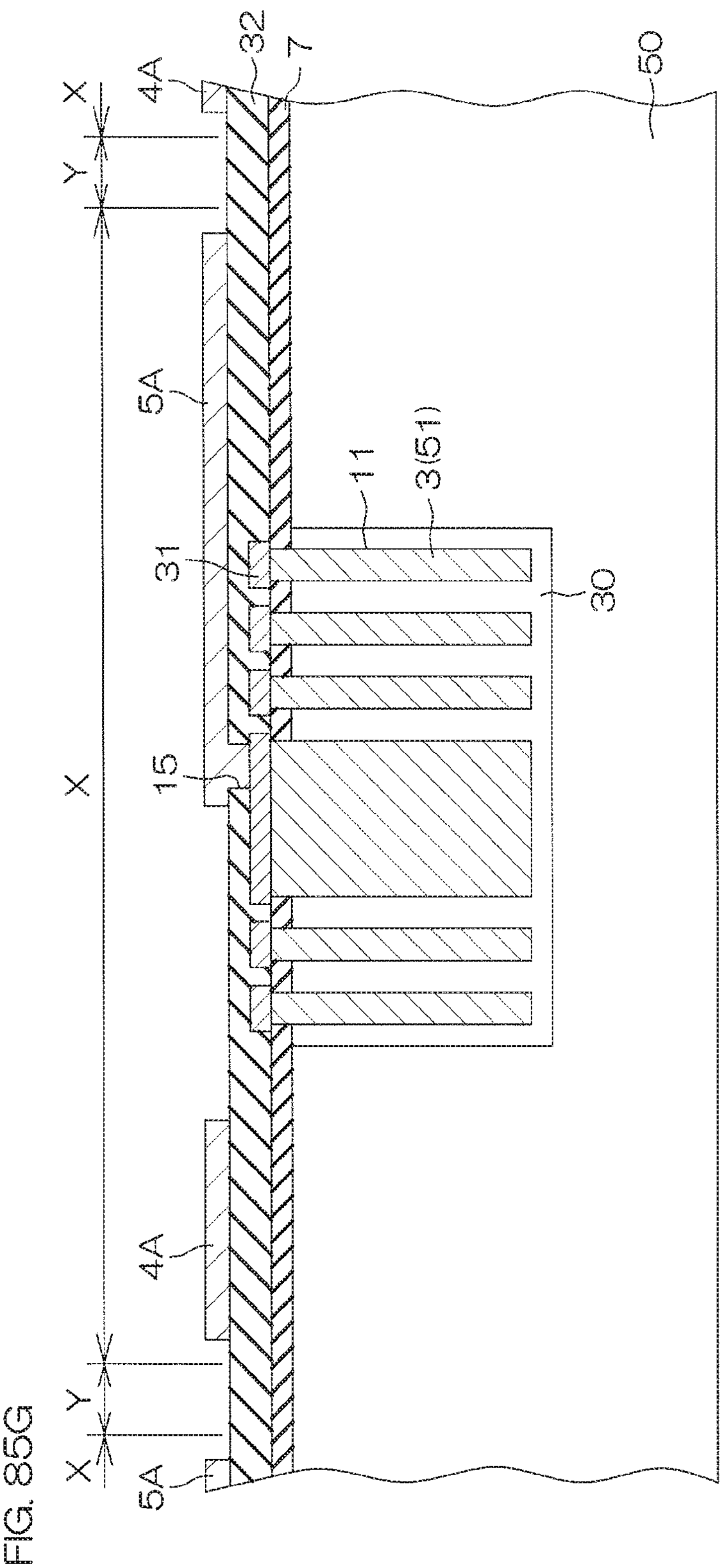

FIG. 85G is a cross-sectional view showing the step subsequent to FIG. 85F.

Figure 85H:
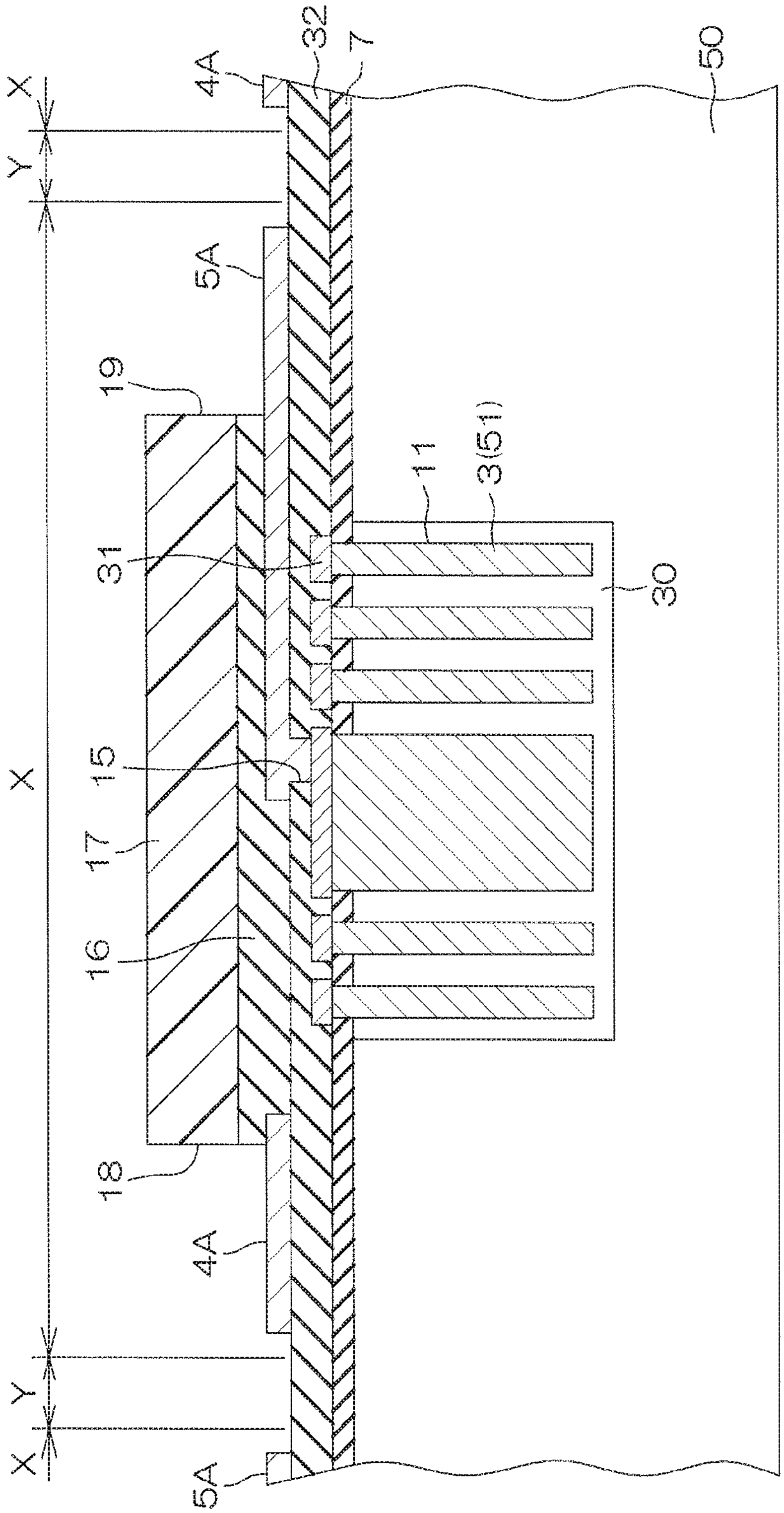
Figure 85:
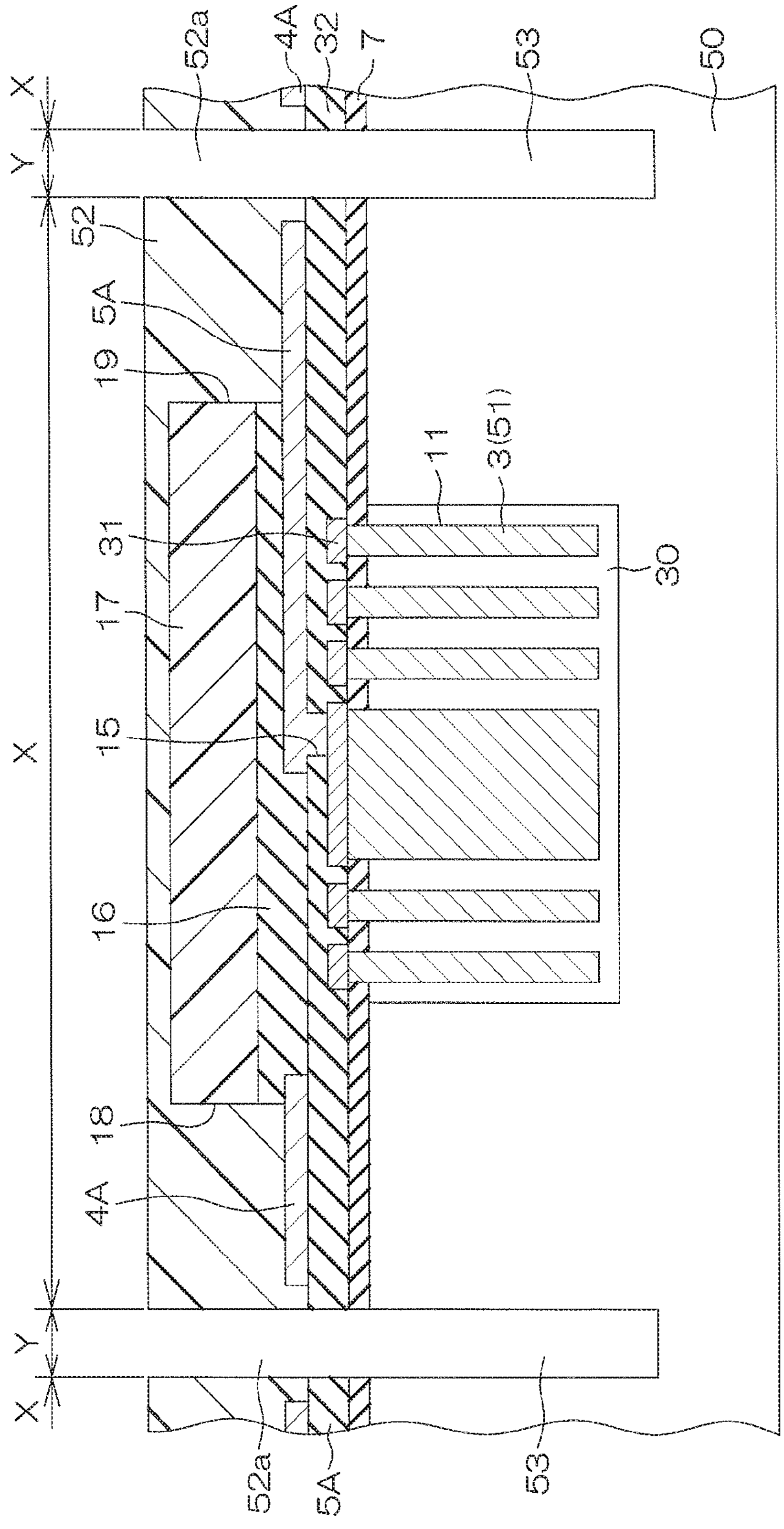

FIG. 85H is a cross-sectional view showing the step subsequent to FIG. 85G.

FIG. 85I is a cross-sectional view showing the step subsequent to FIG. 85H.

Figure 85J:
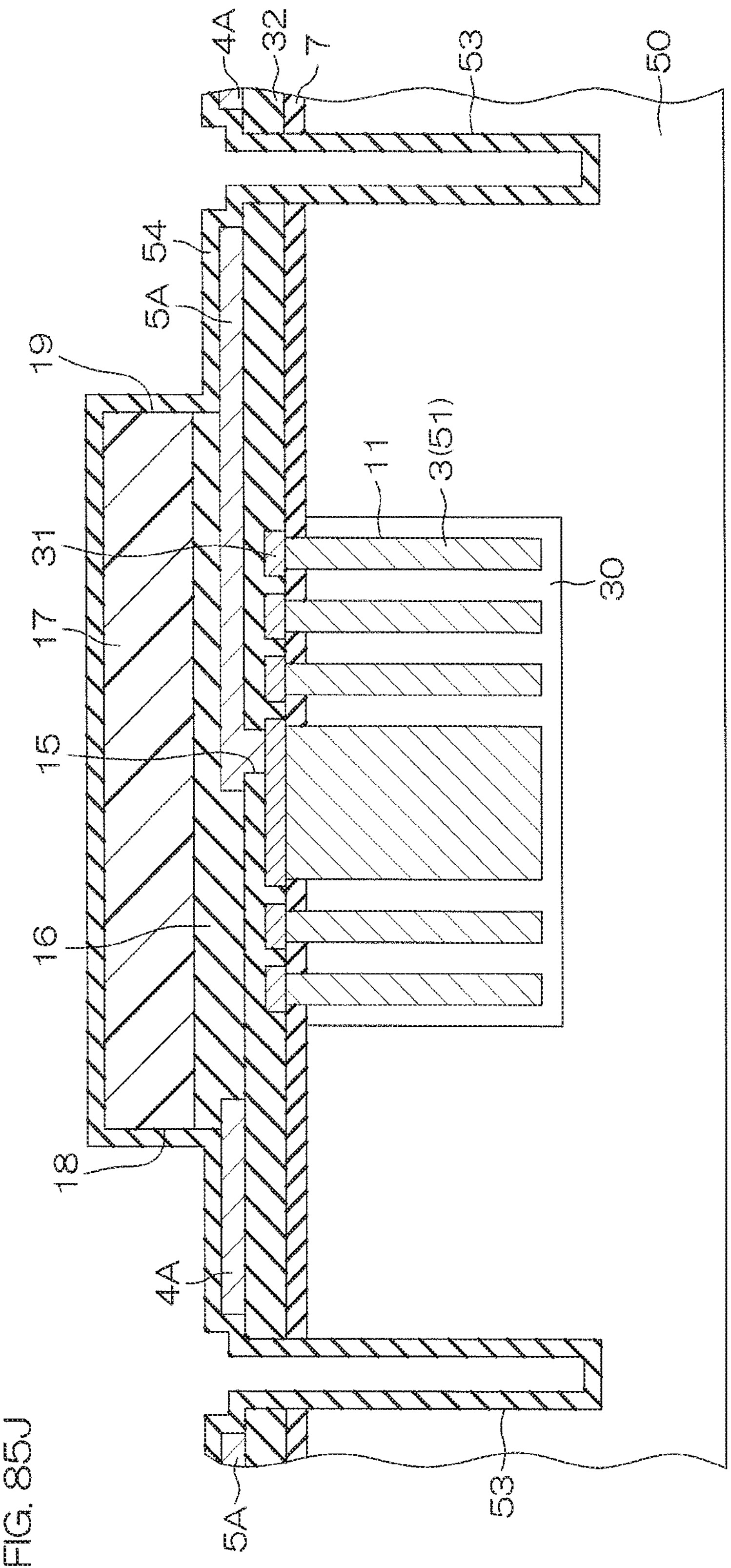

FIG. 85J is a cross-sectional view showing the step subsequent to FIG. 85I.

Figure 85K:
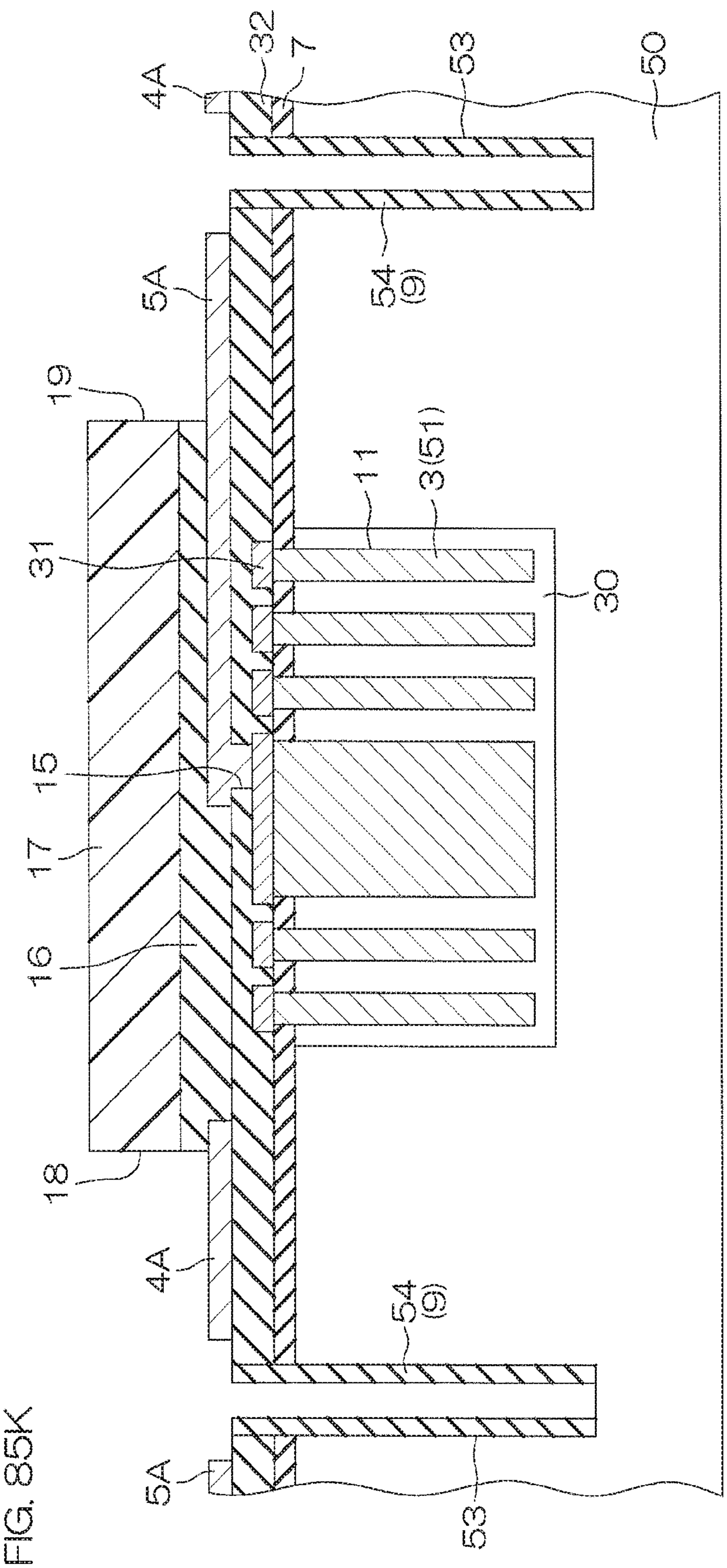

FIG. 85K is a cross-sectional view showing the step subsequent to FIG. 85J.

Figure 85L:
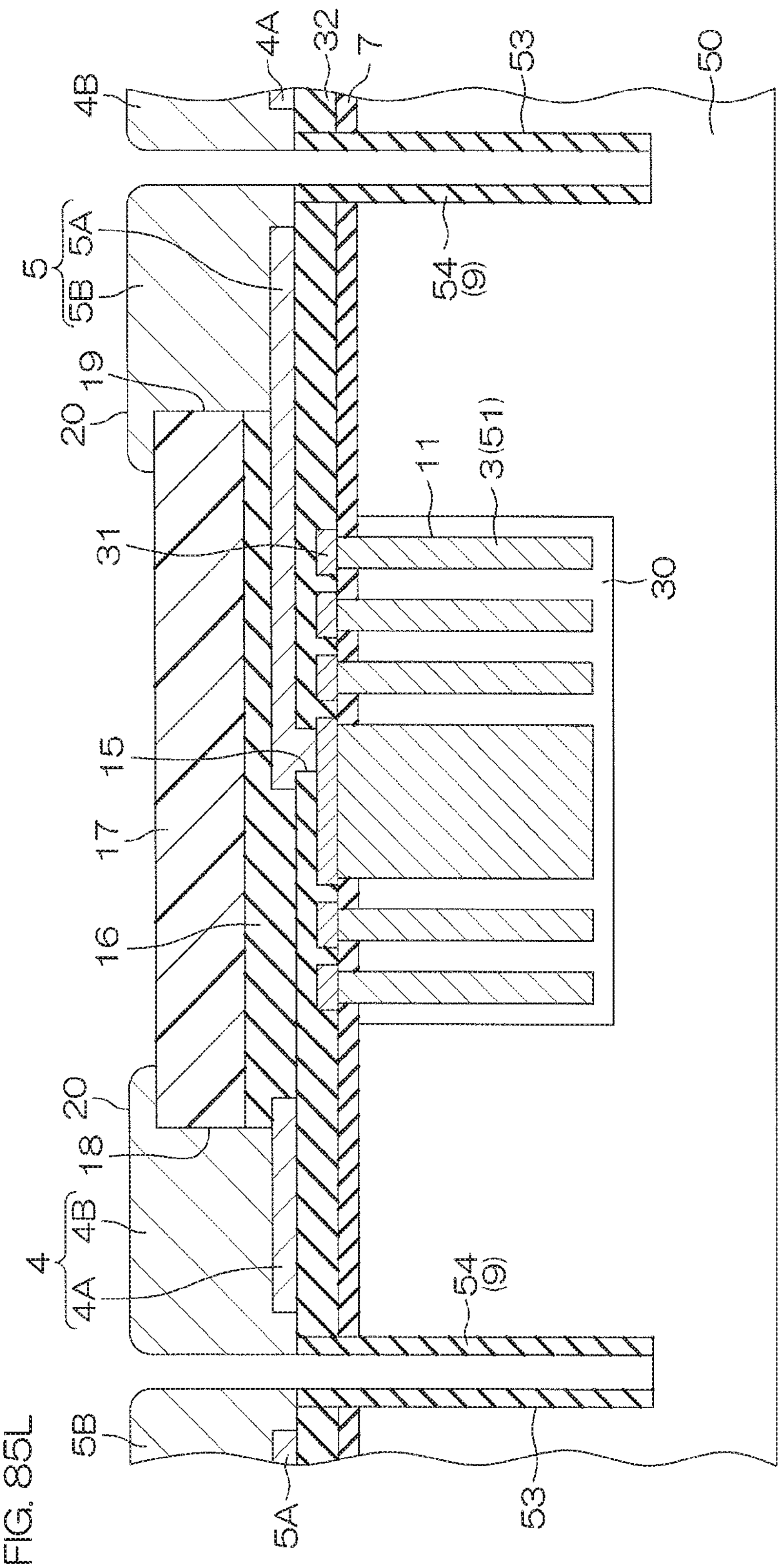

FIG. 85L is a cross-sectional view showing the step subsequent to FIG. 85K.

Figure 85M:
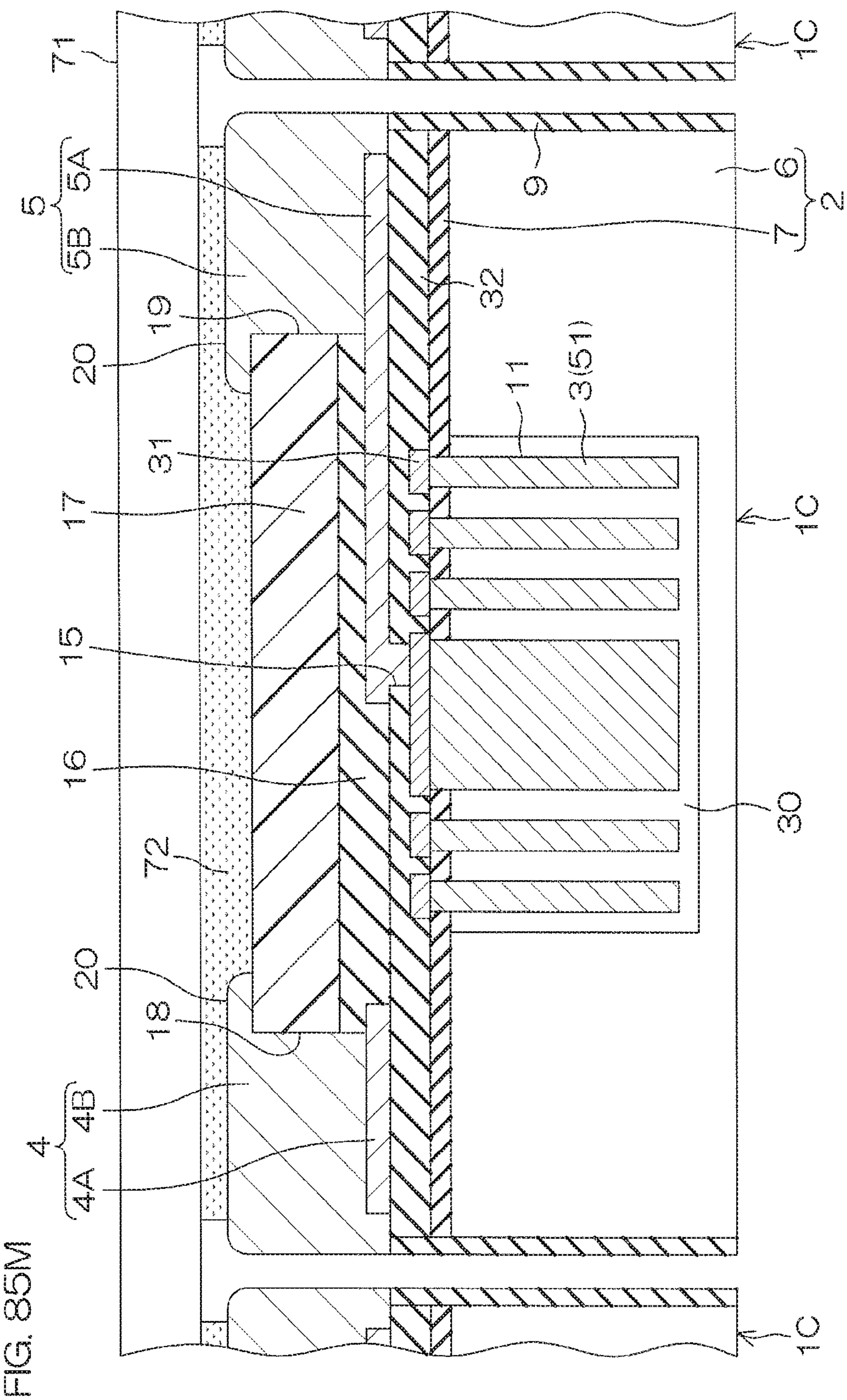

FIG. 85M is a cross-sectional view showing the step subsequent to FIG. 85L.

Figure 86A:
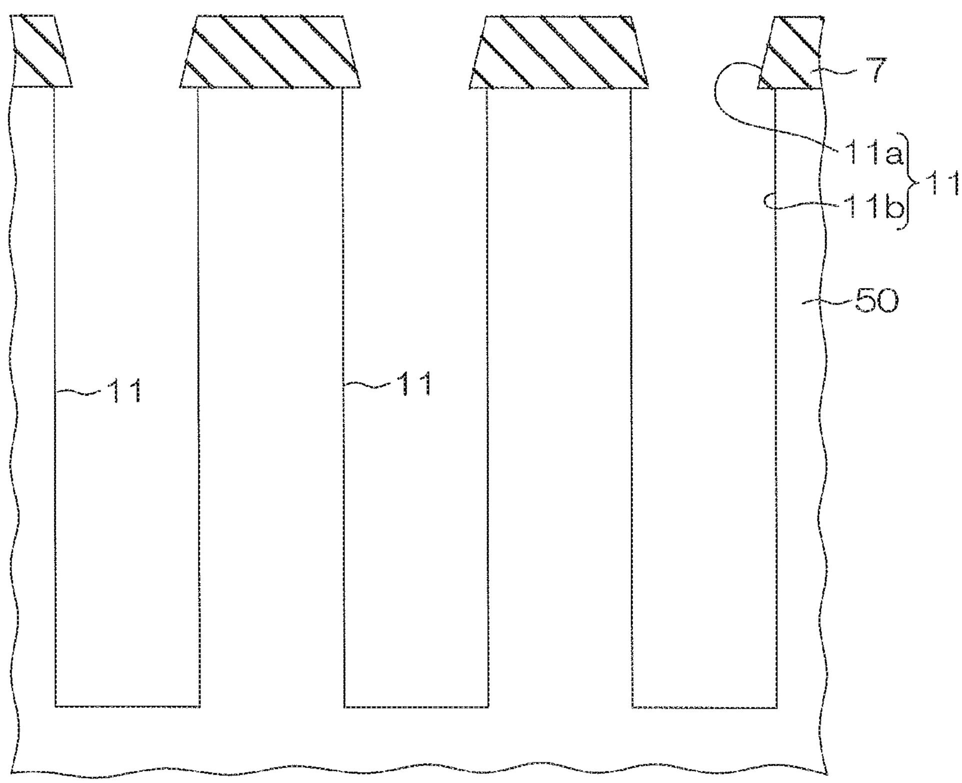

FIG. 86A is a partially enlarged cross-sectional view showing the details of the manufacturing step of a coil.

Figure 86B:
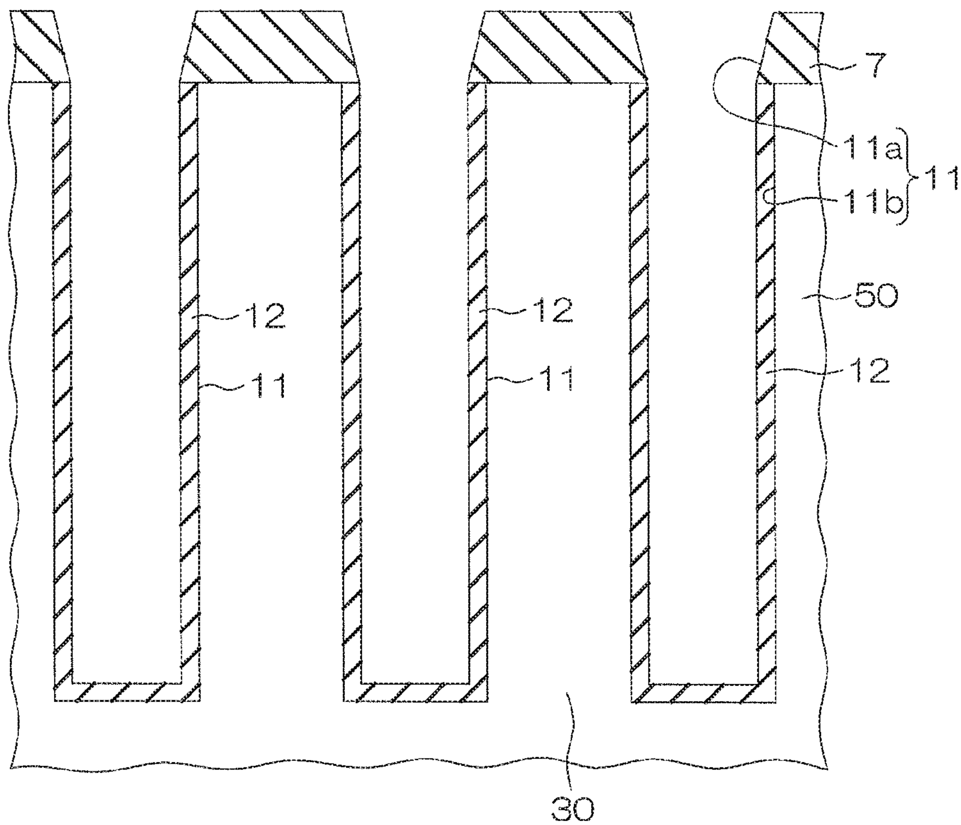

FIG. 86B is a partially enlarged cross-sectional view showing the step subsequent to FIG. 86A.

Figure 86C:
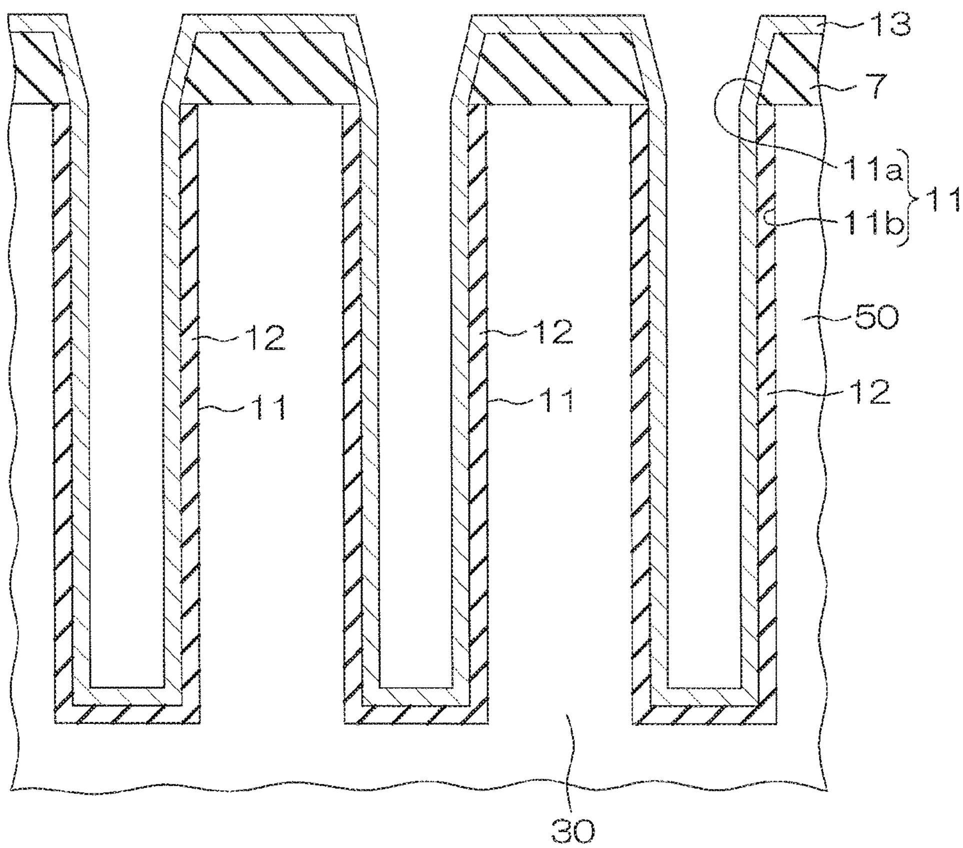

FIG. 86C is a partially enlarged cross-sectional view showing the step subsequent to FIG. 86B.

Figure 86D:
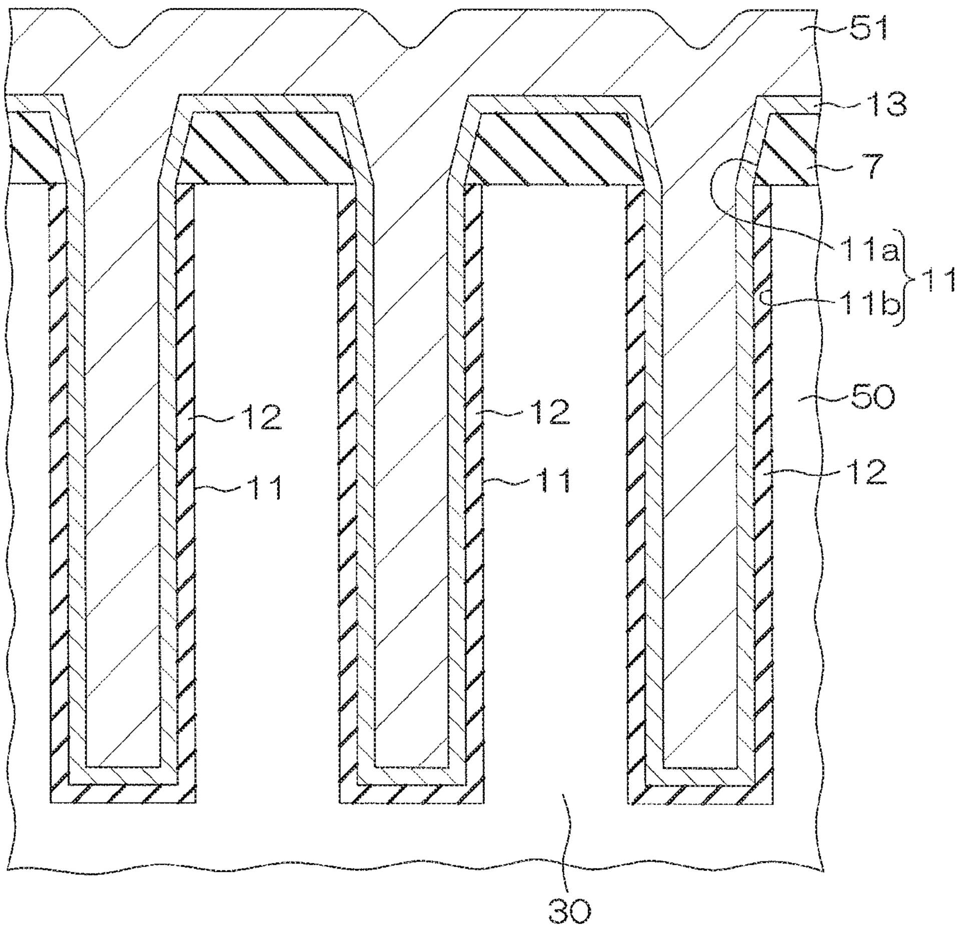

FIG. 86D is a partially enlarged cross-sectional view showing the step subsequent to FIG. 86C.

Figure 86E:
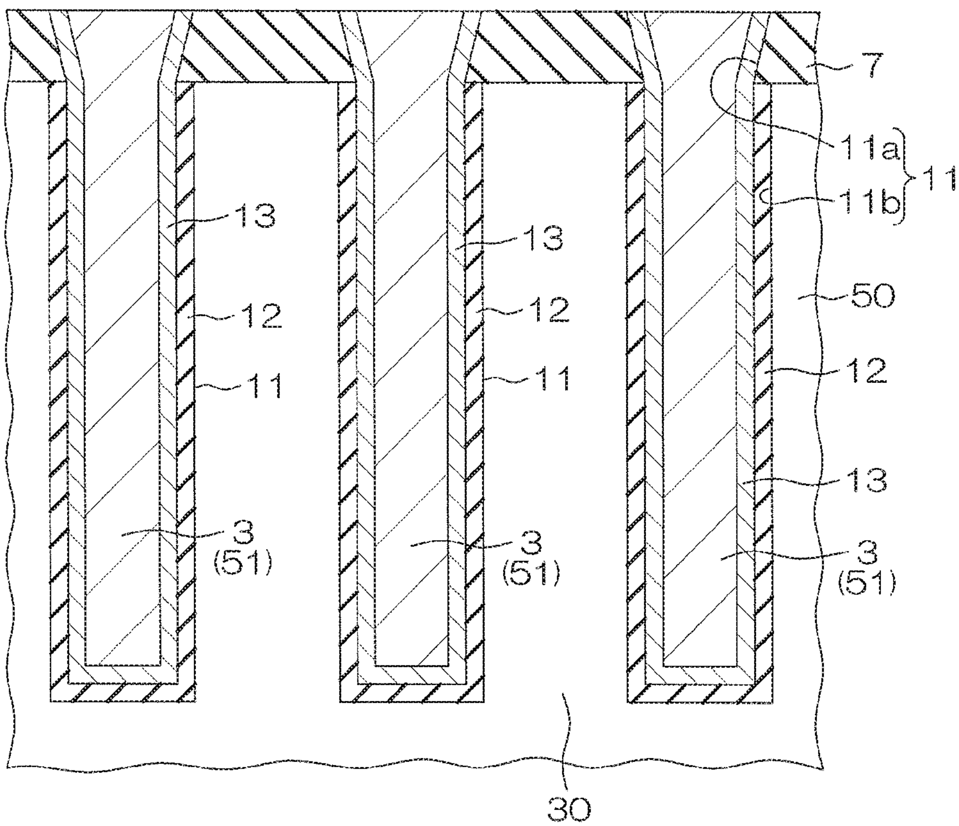

FIG. 86E is a partially enlarged cross-sectional view showing the step subsequent to FIG. 86D.

Figure 86F:
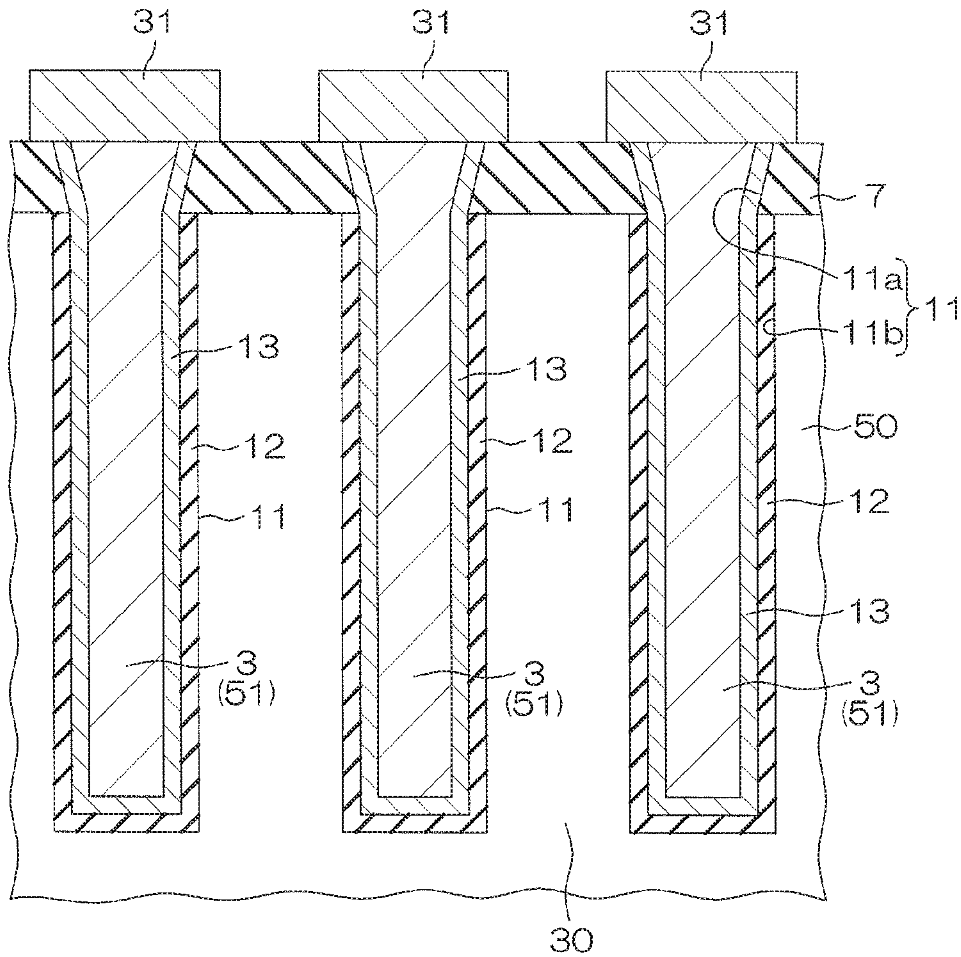

FIG. 86F is a partially enlarged cross-sectional view showing the step subsequent to FIG. 86E.

Figure 87:
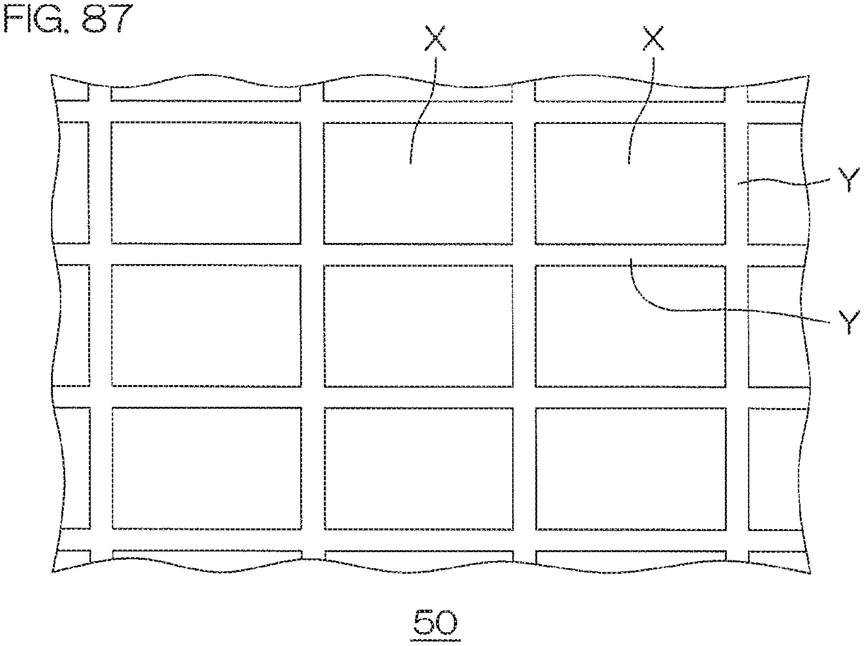

FIG. 87 is a plan view of an original substrate that is an original of a substrate main body of the chip inductor, and shows an enlarged view of a partial region.

Figure 88A:
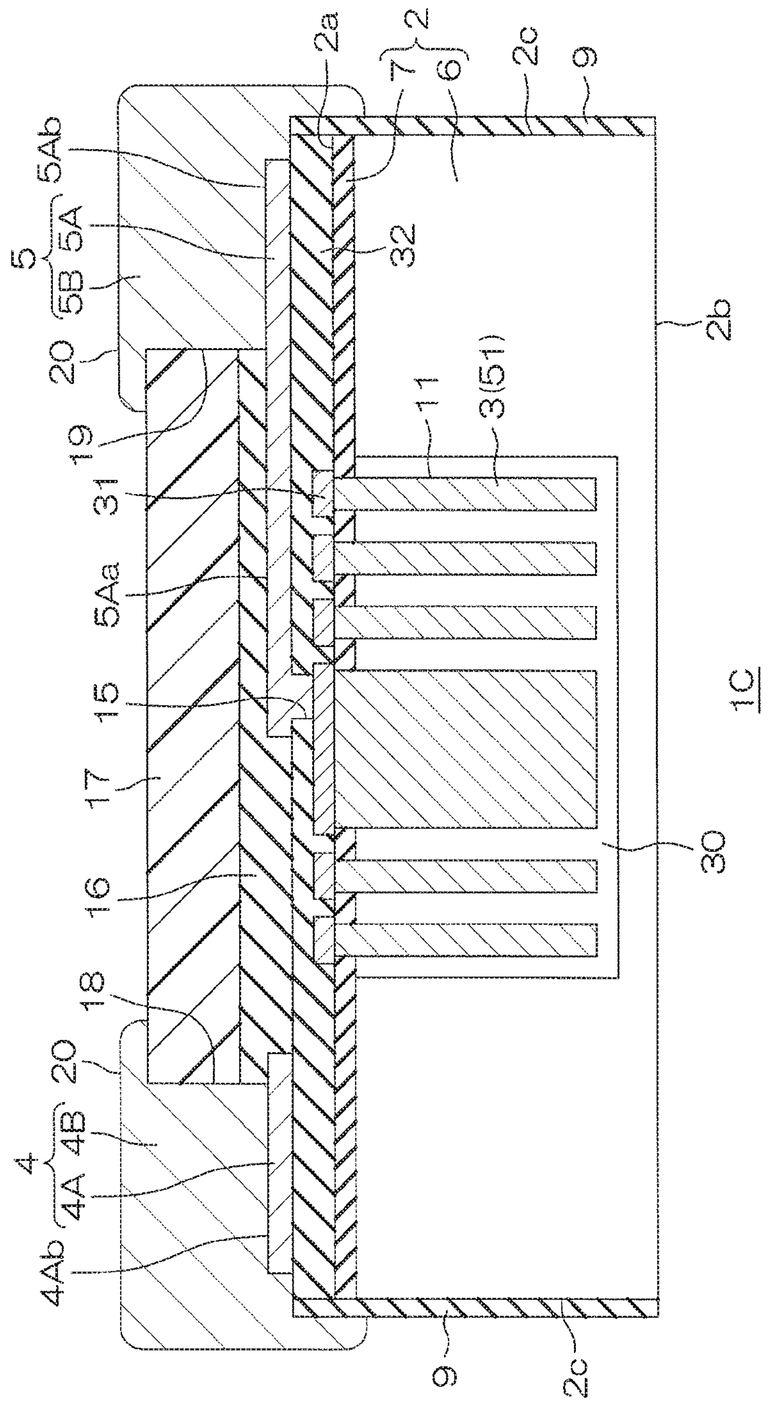

FIG. 88A is a cross-sectional view showing a modification example of an external connection electrode, and shows a cut surface corresponding to FIG. 78.

Figure 88B:
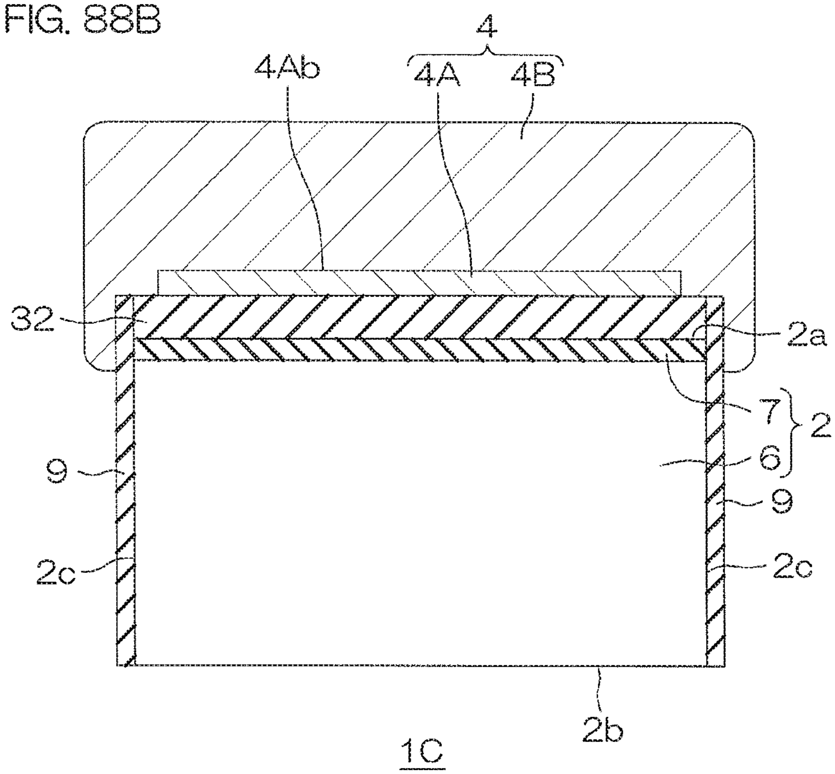

FIG. 88B is a cross-sectional view showing the modification example of the external connection electrode, and shows a cut surface corresponding to FIG. 81.

Figure 89:
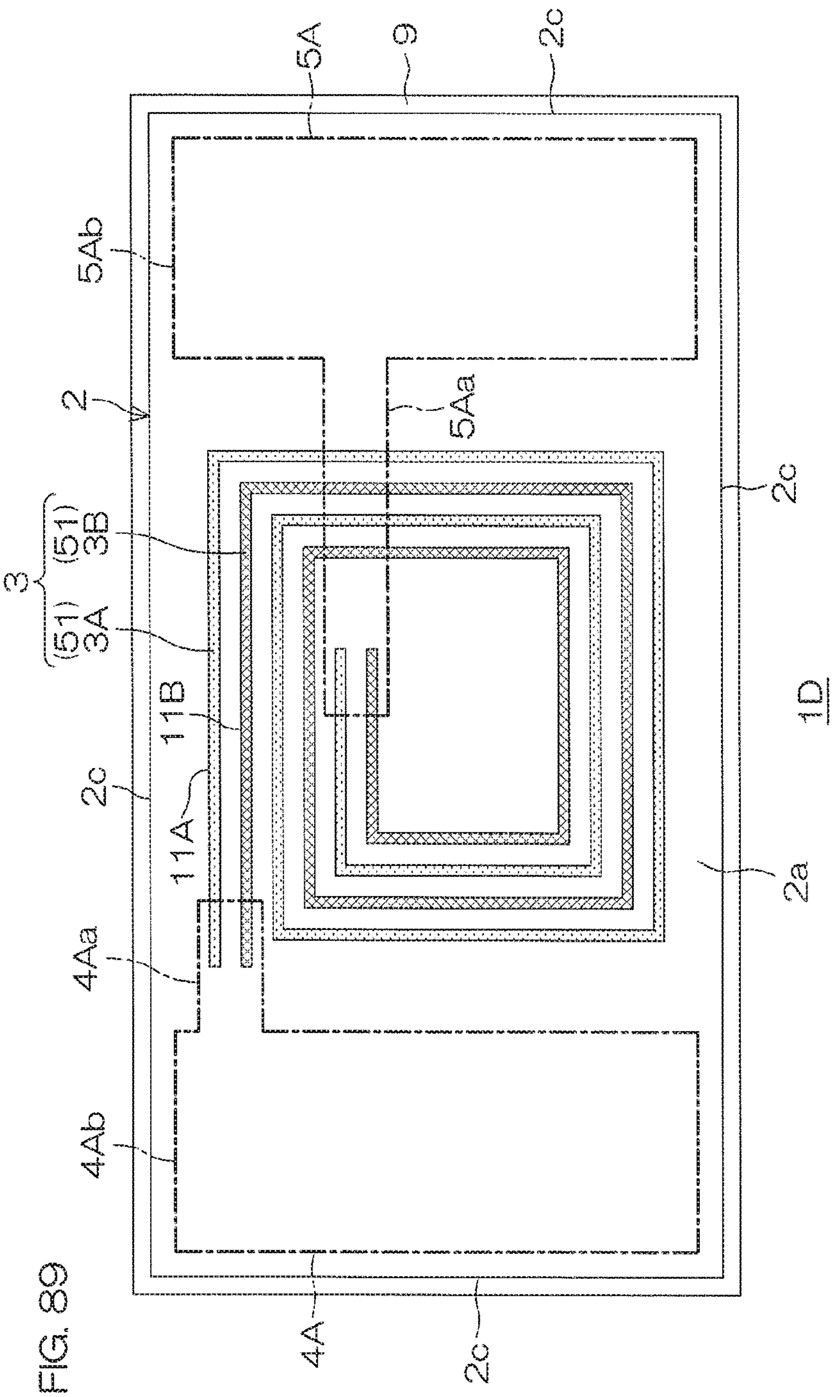

FIG. 89 is a plan view showing a modification example of the coil.

Figure 90:
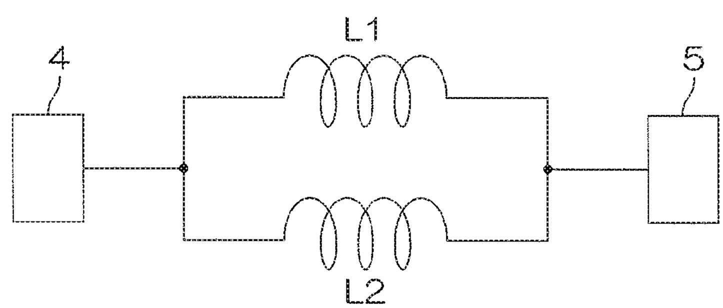

FIG. 90 is an electrical circuit diagram showing an electrical structure within the chip inductor of FIG. 89.

Figure 91:
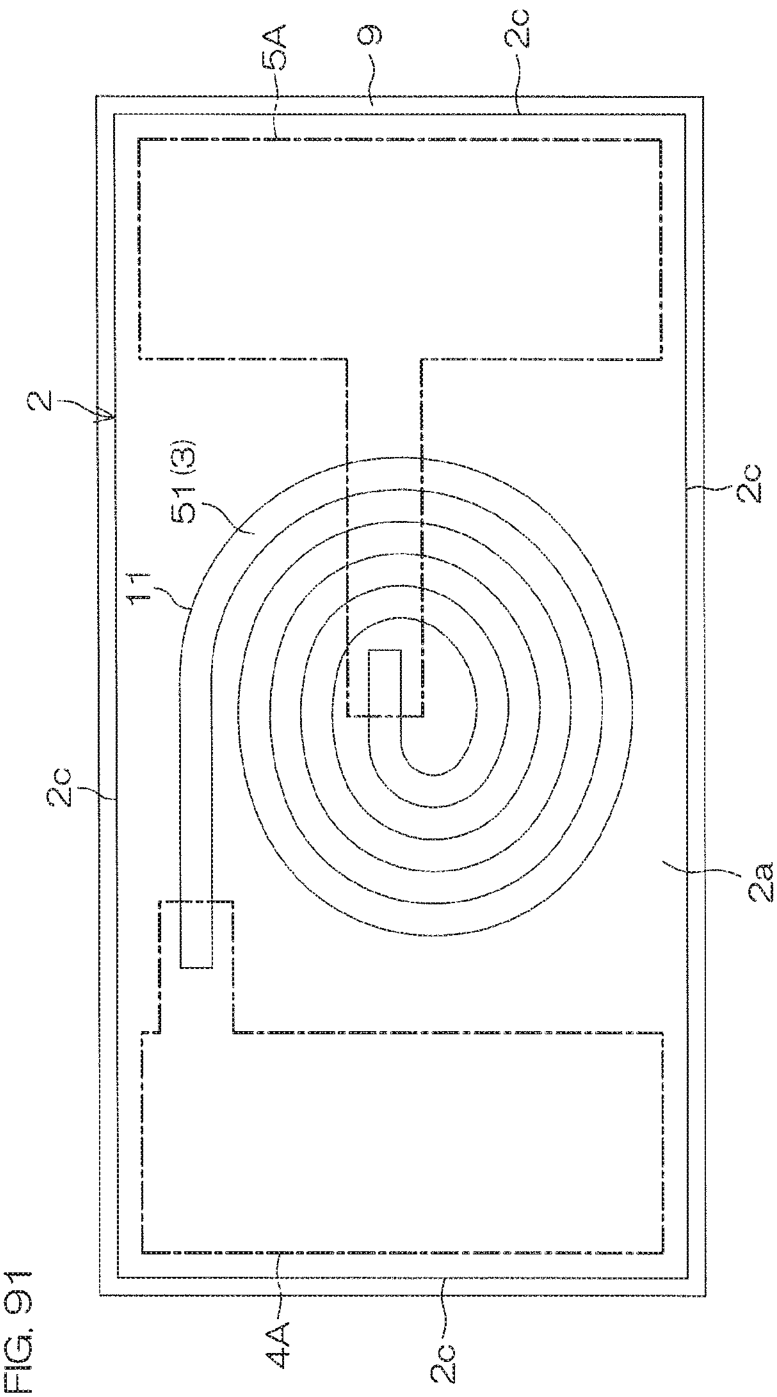

FIG. 91 is a plan view showing another modification example of the coil.

Figure 92:
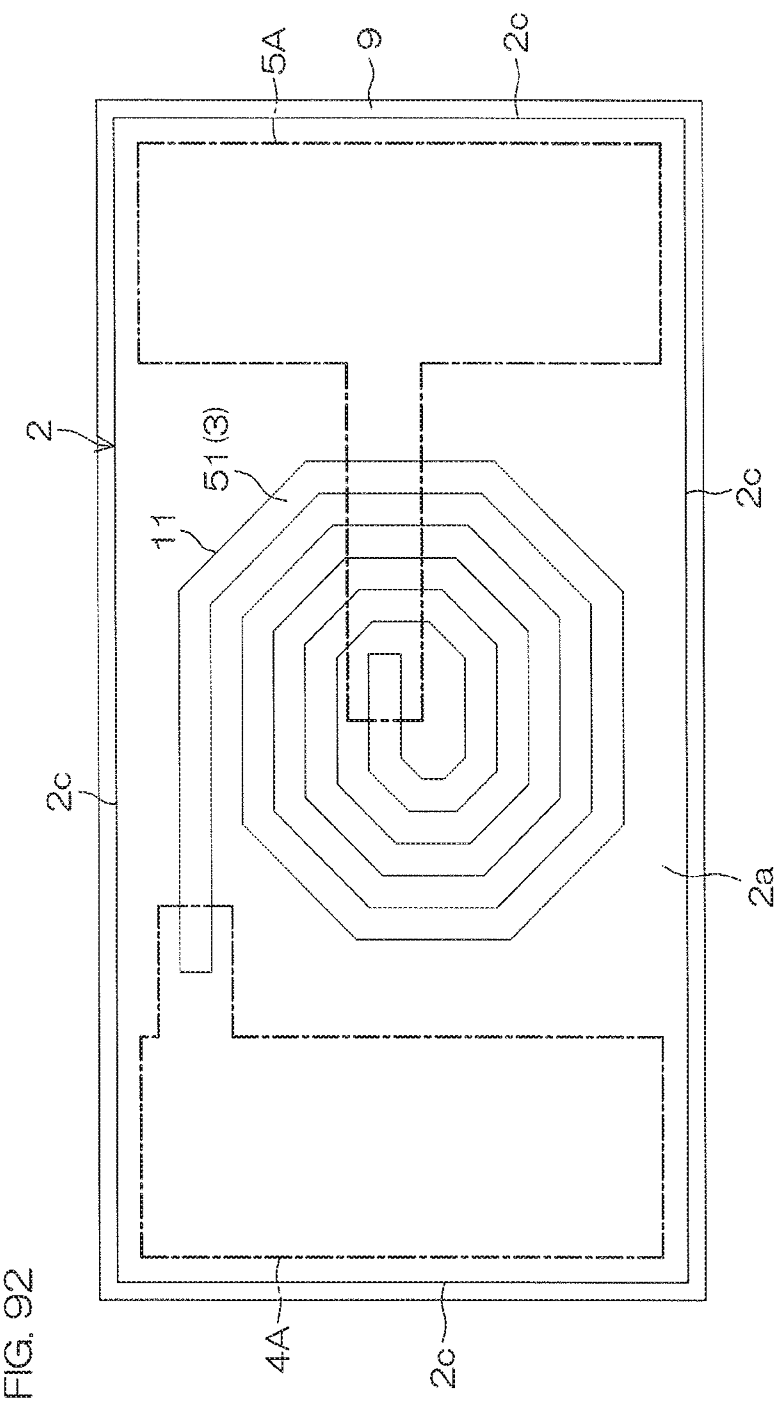

FIG. 92 is a plan view showing yet another modification example of the coil.

Figure 93A:
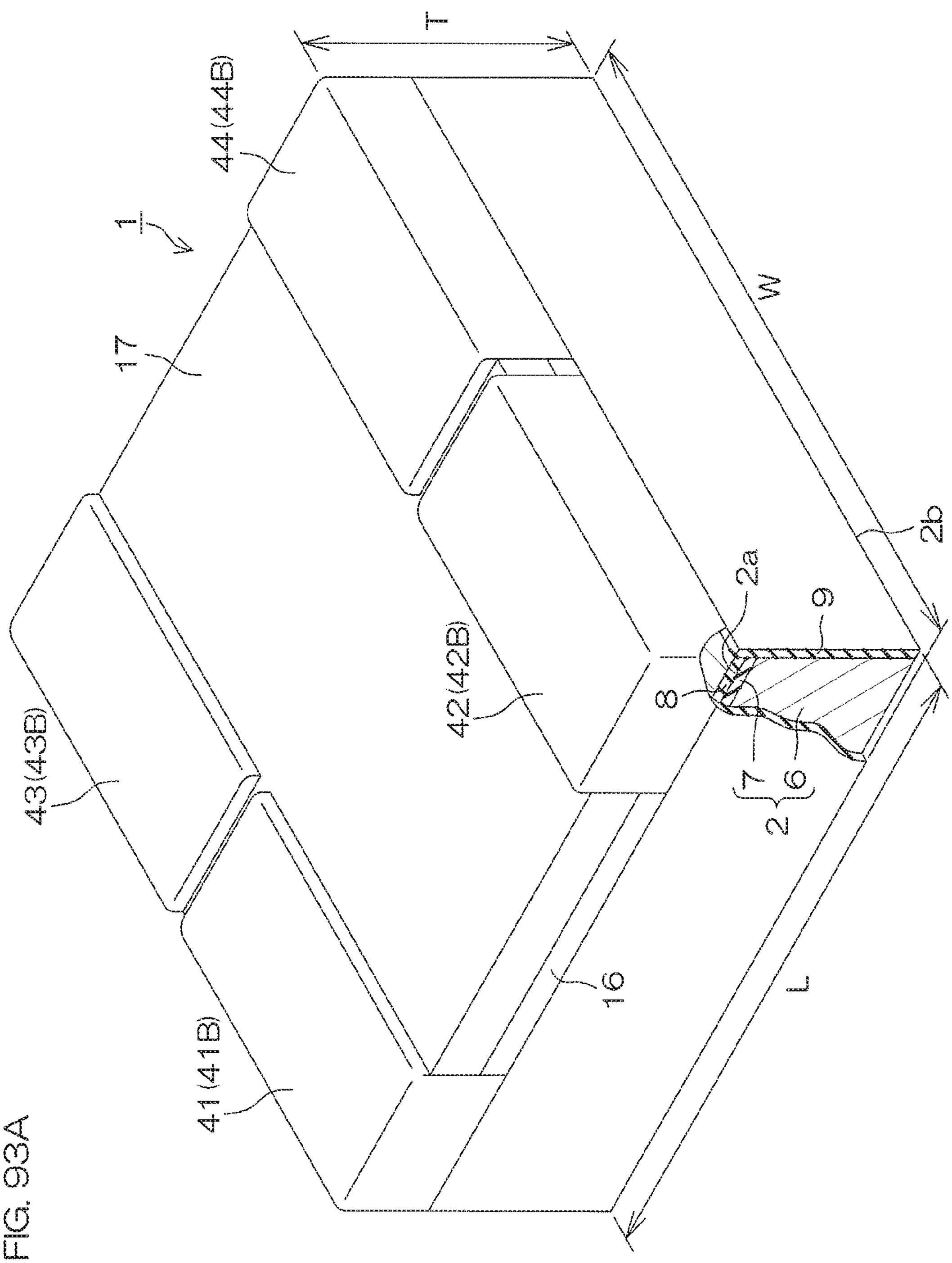

FIG. 93A is a partially cut perspective view of a chip transformer according to a first preferred embodiment of a fourth invention.

Figure 93B:
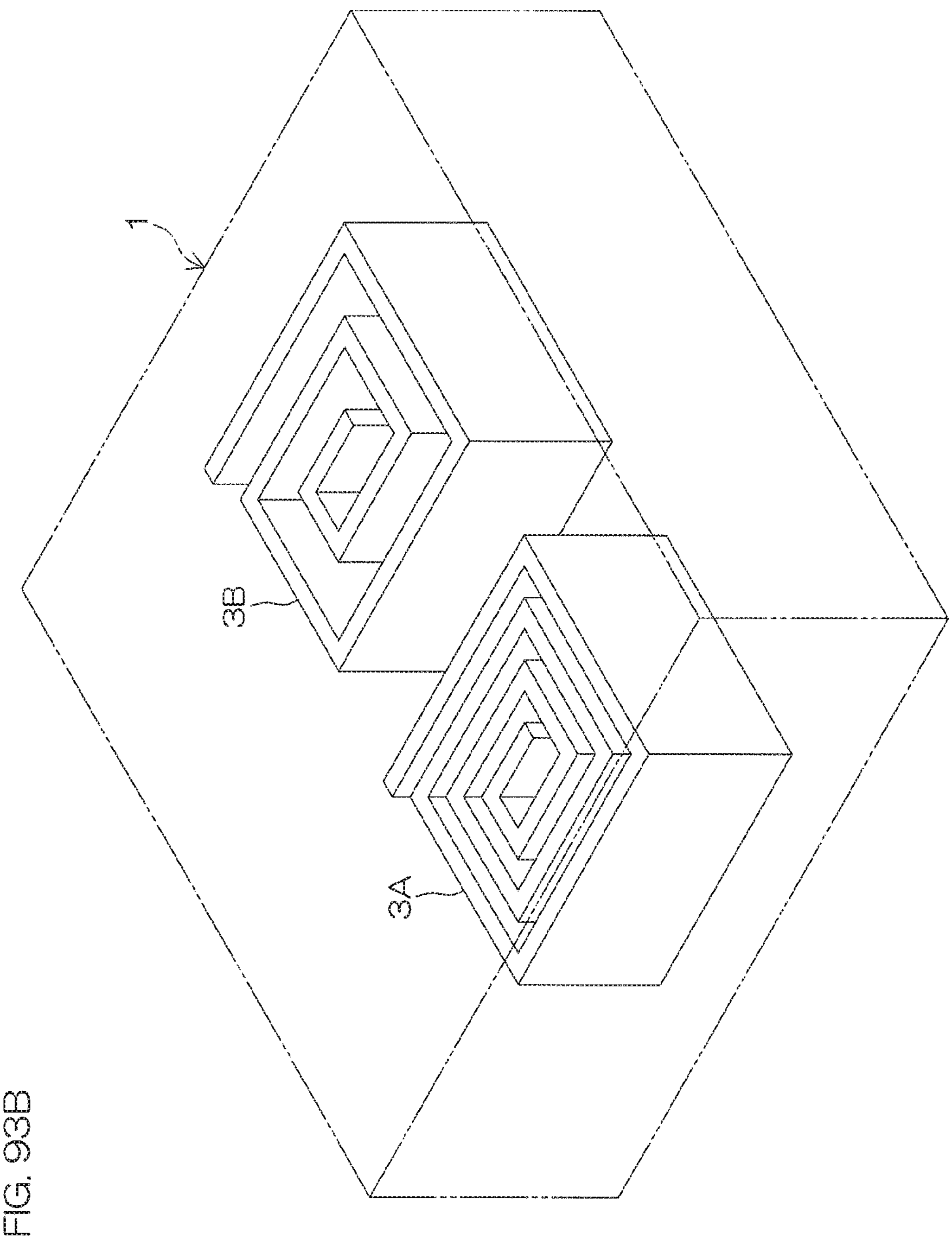

FIG. 93B is a perspective view showing a primary coil and a secondary coil formed within the chip transformer.

Figure 94:
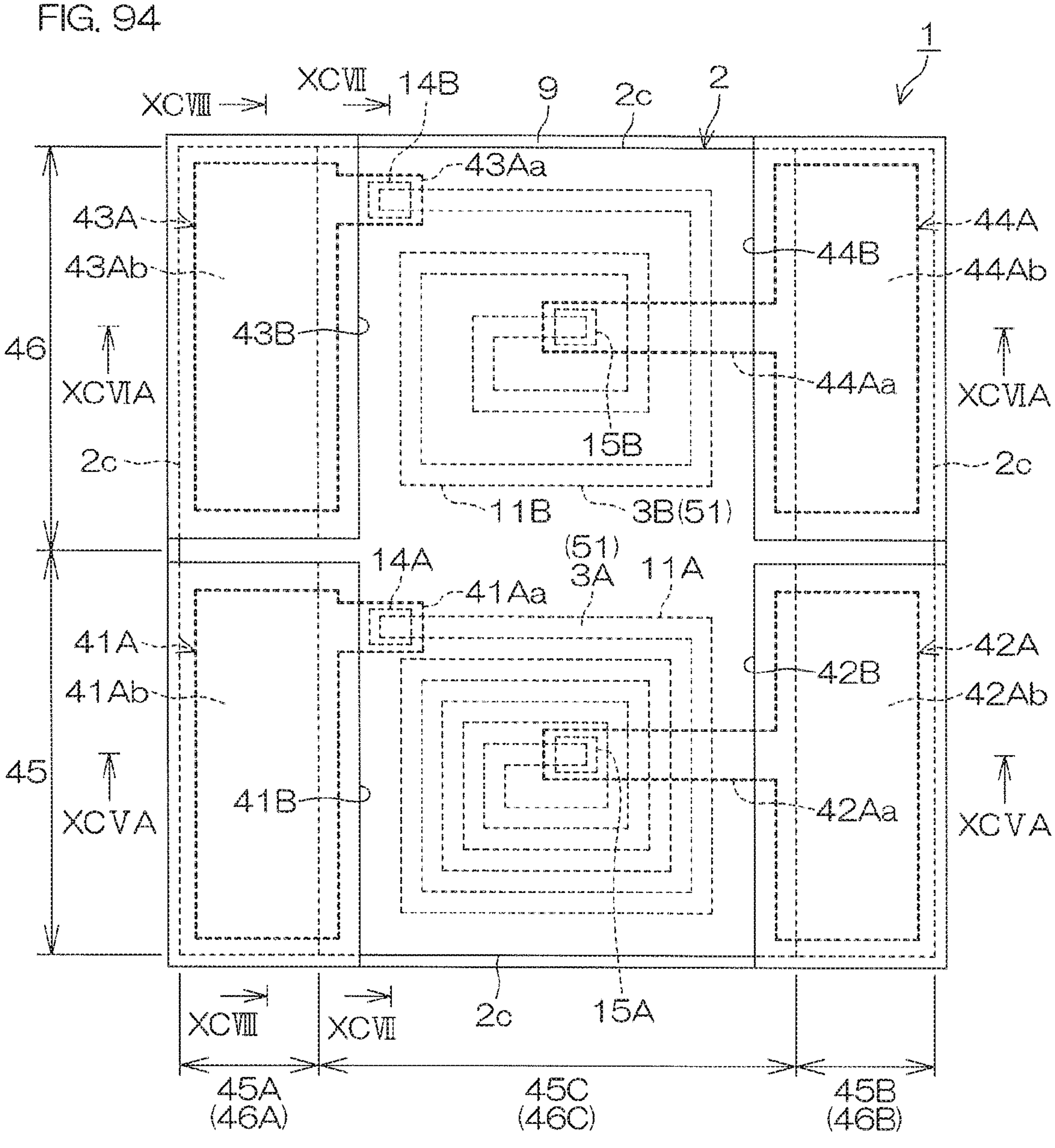

FIG. 94 is a plan view of the chip transformer.

Figure 95A:
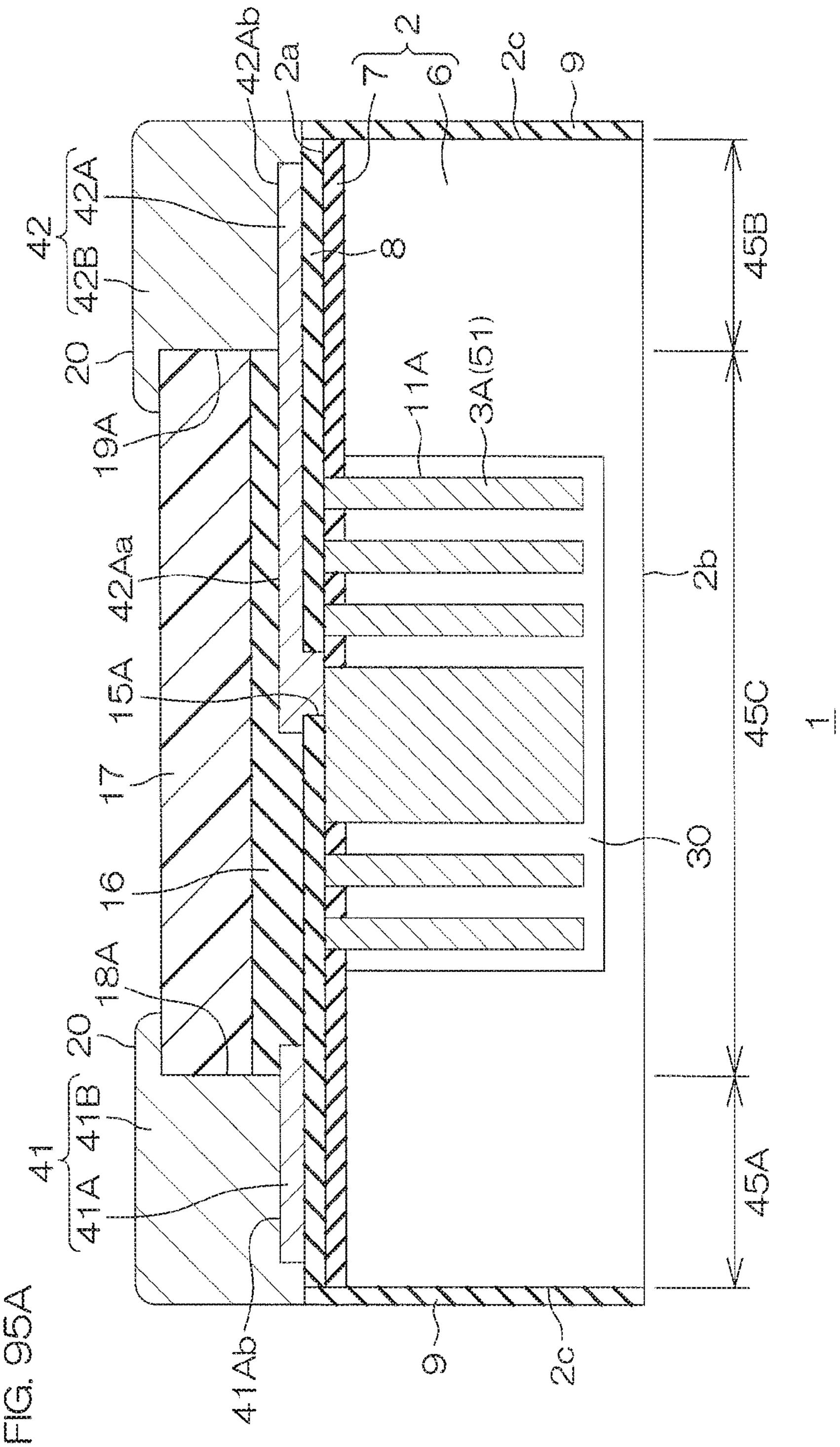

FIG. 95A is a cross-sectional view taken along line XCVA-XCVA in FIG. 94.

Figure 95B:
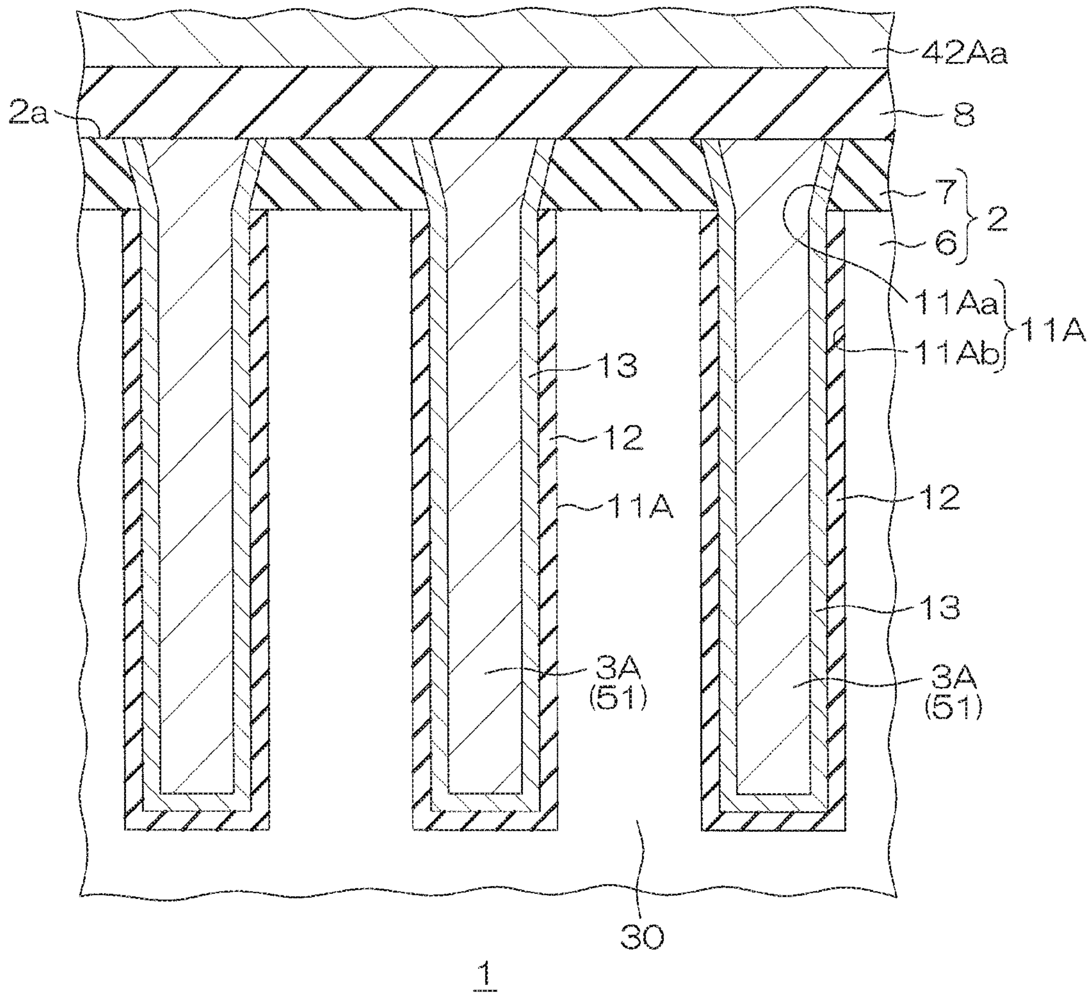

FIG. 95B is a partially enlarged cross-sectional view of FIG. 95A.

Figure 96A:
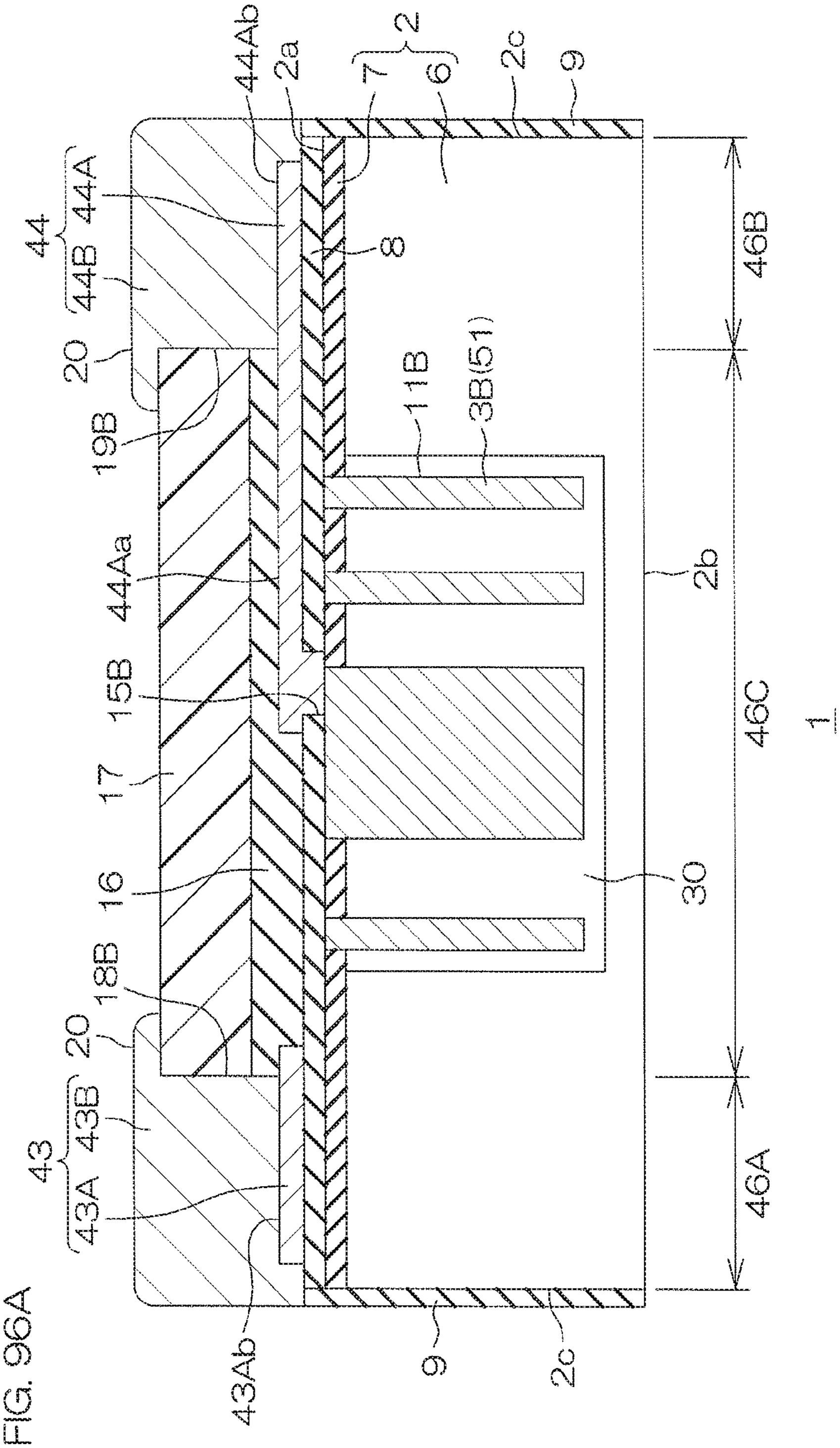

FIG. 96A is a cross-sectional view taken along line XCVIA-XCVIA in FIG. 94.

Figure 96B:
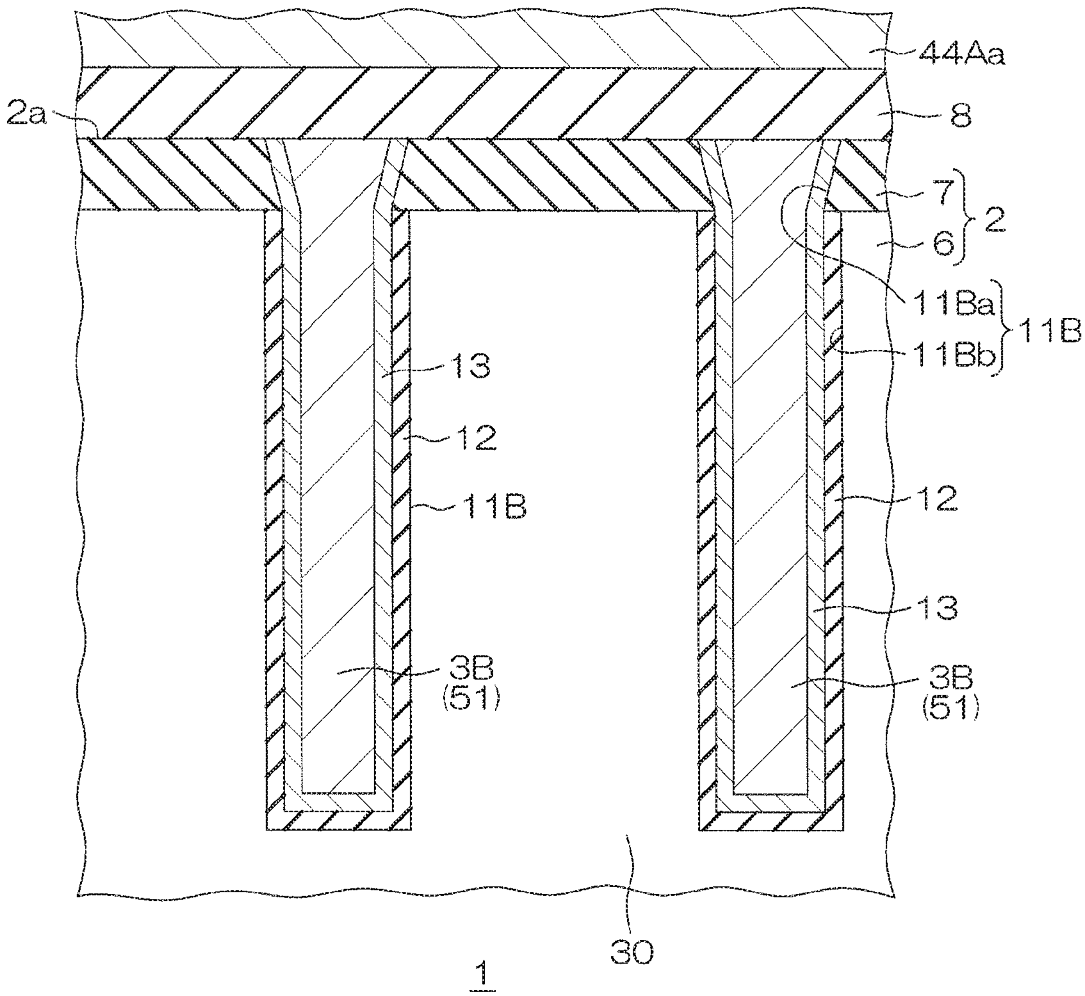

FIG. 96B is a partially enlarged cross-sectional view of FIG. 96A.

Figure 97:
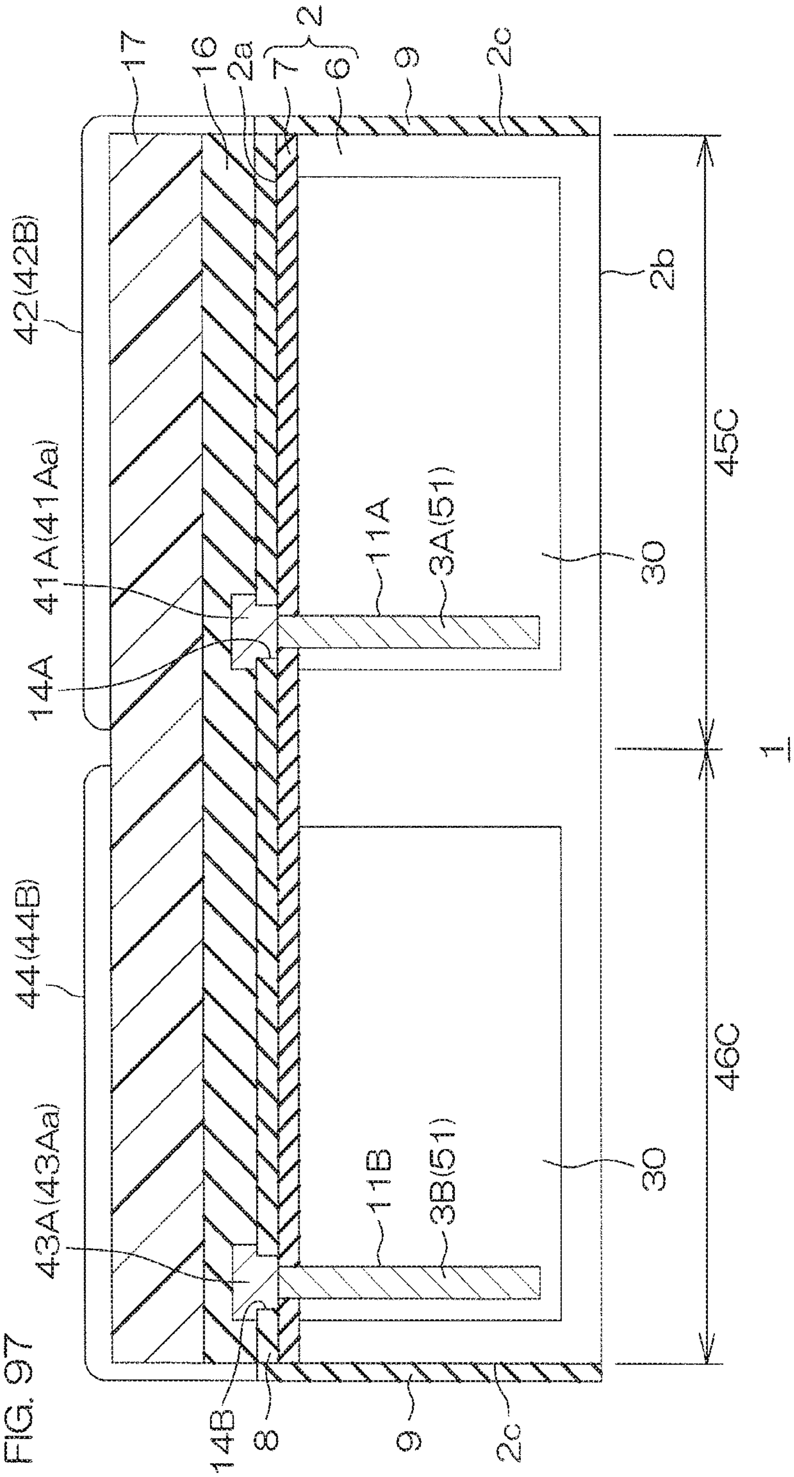

FIG. 97 is a cross-sectional view taken along line XCVII-XCVII in FIG. 94.

Figure 98:
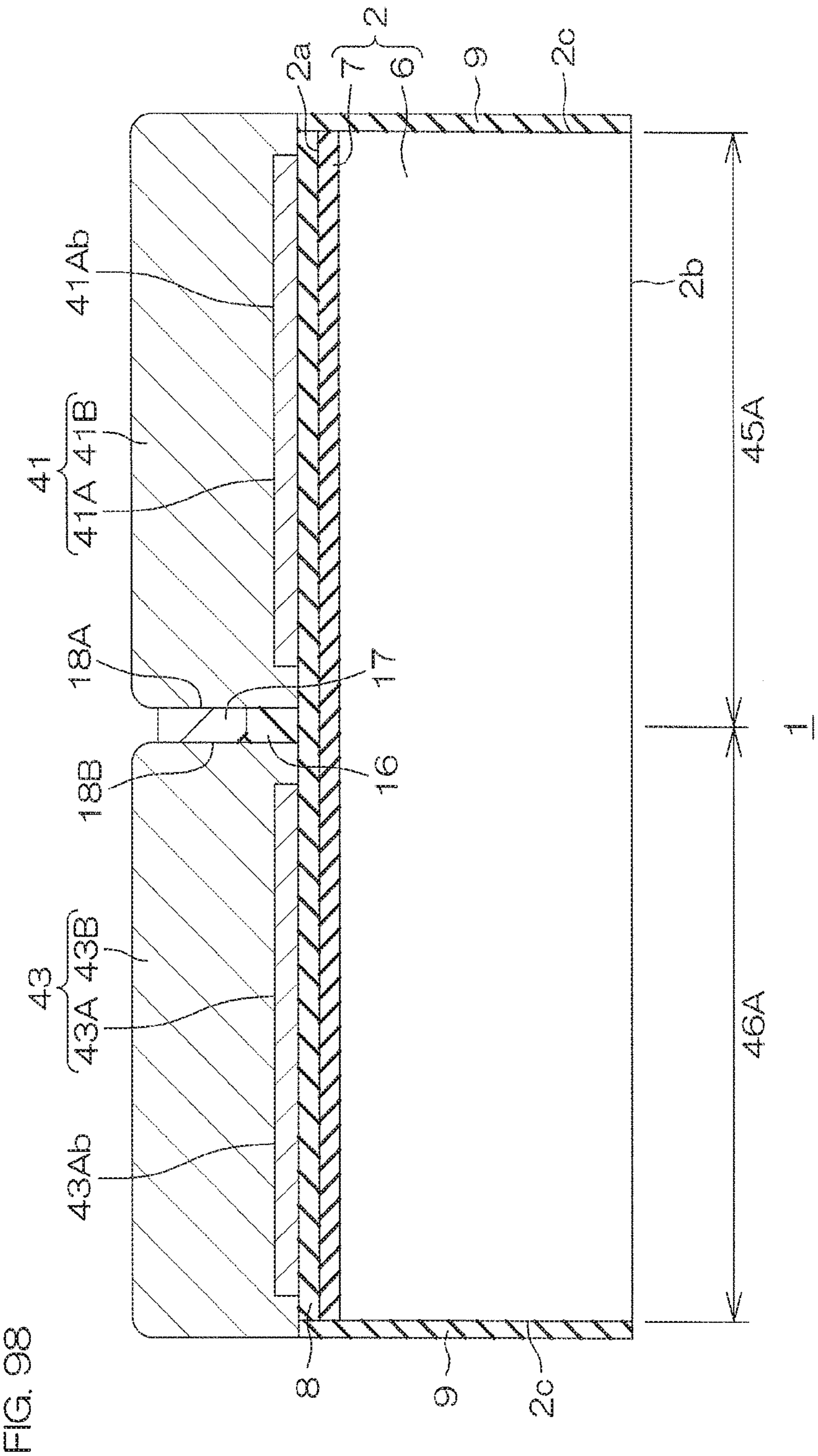

FIG. 98 is a cross-sectional view taken along line XCVIII-XCVIII in FIG. 94.

Figure 99:
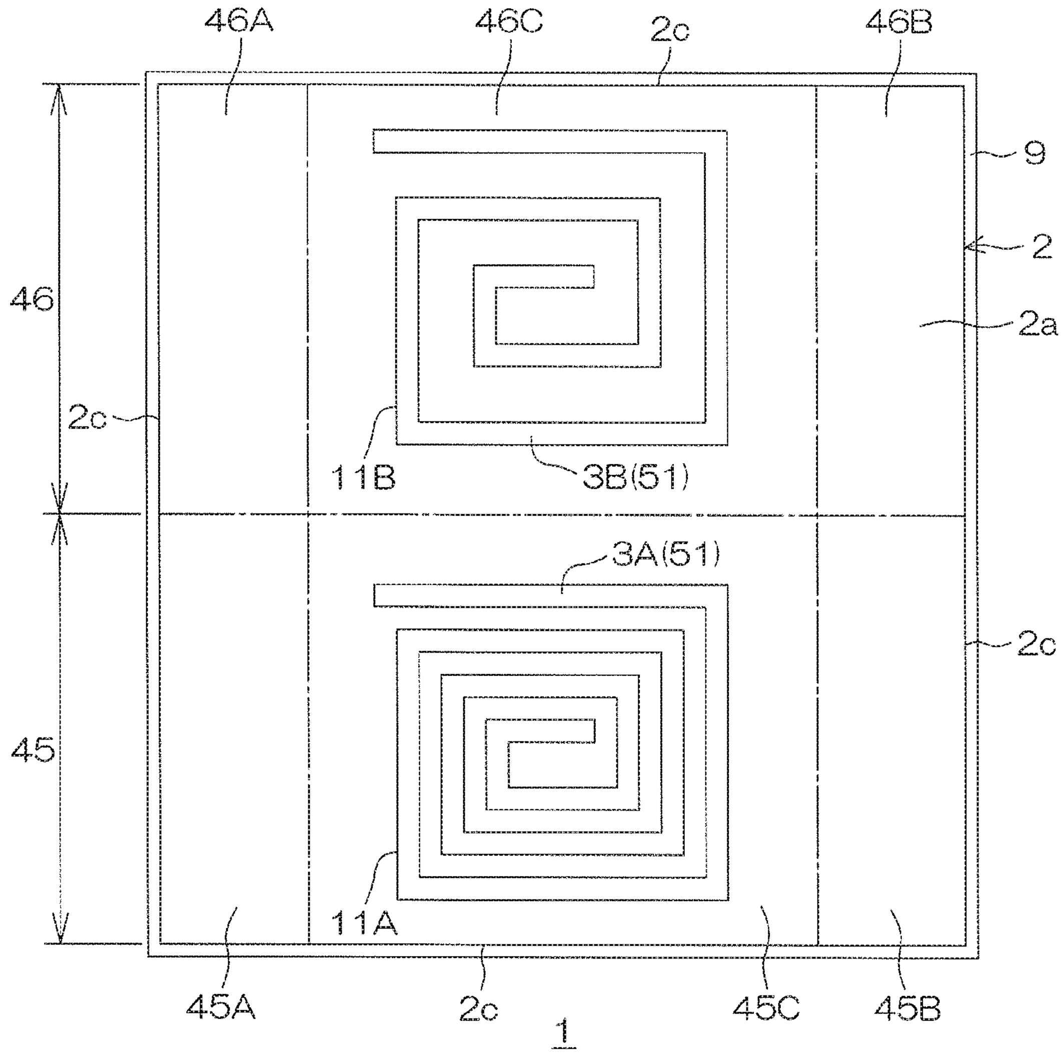

FIG. 99 is a plan view showing a structure of the surface of a substrate by removing a structure formed on the surface of the substrate.

Figure 100:
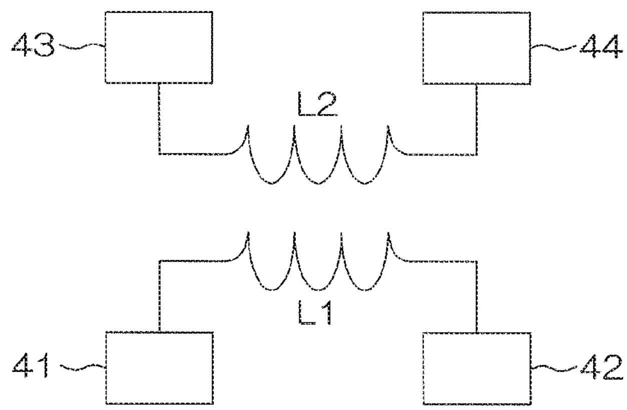

FIG. 100 is an electrical circuit diagram showing an electrical structure within the chip transformer.

Figure 101:
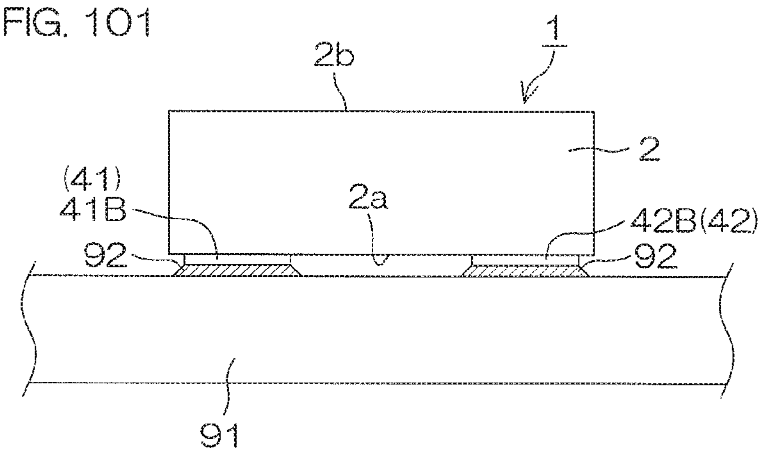

FIG. 101 is a cross-sectional view showing the arrangement of a circuit assembly in which the chip transformer is flip-chip connected on the mounting substrate.

Figure 102A:
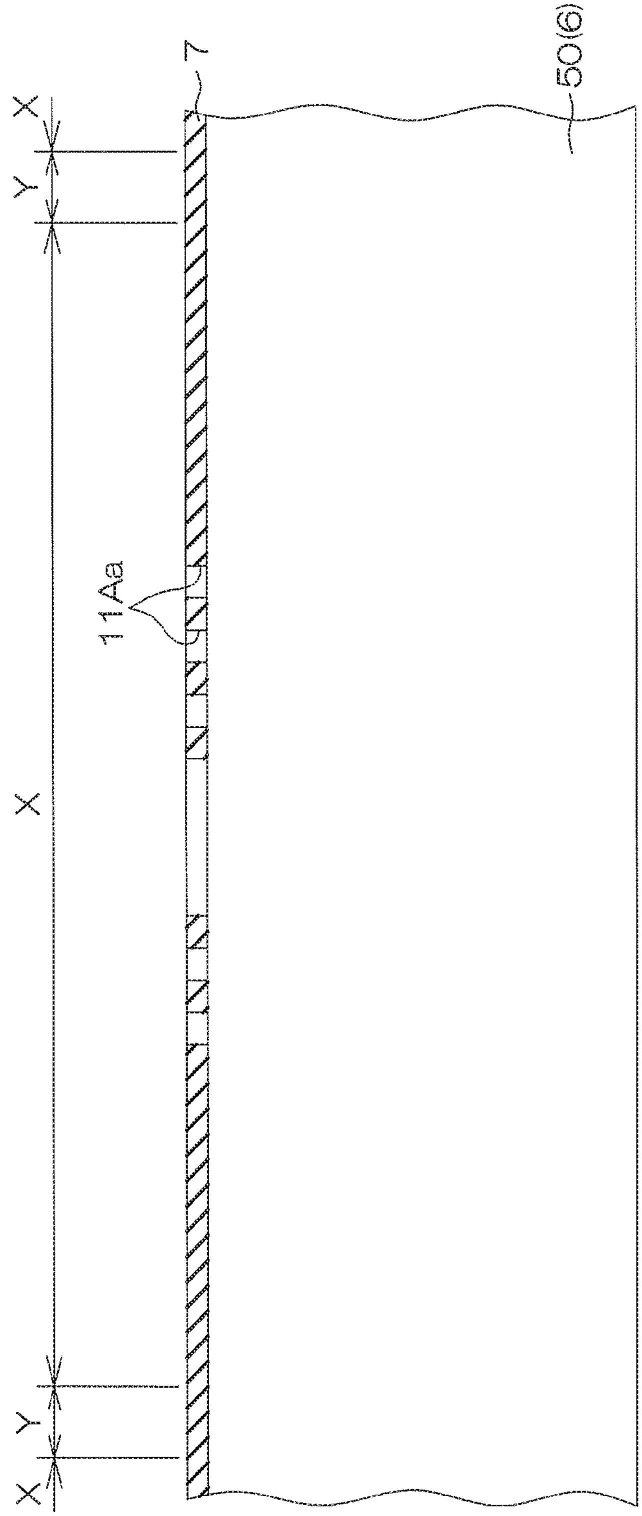

FIG. 102A is a cross-sectional view for illustrating an example of the manufacturing step of the chip transformer, and is a cut surface corresponding to FIG. 95A.

Figure 102B:
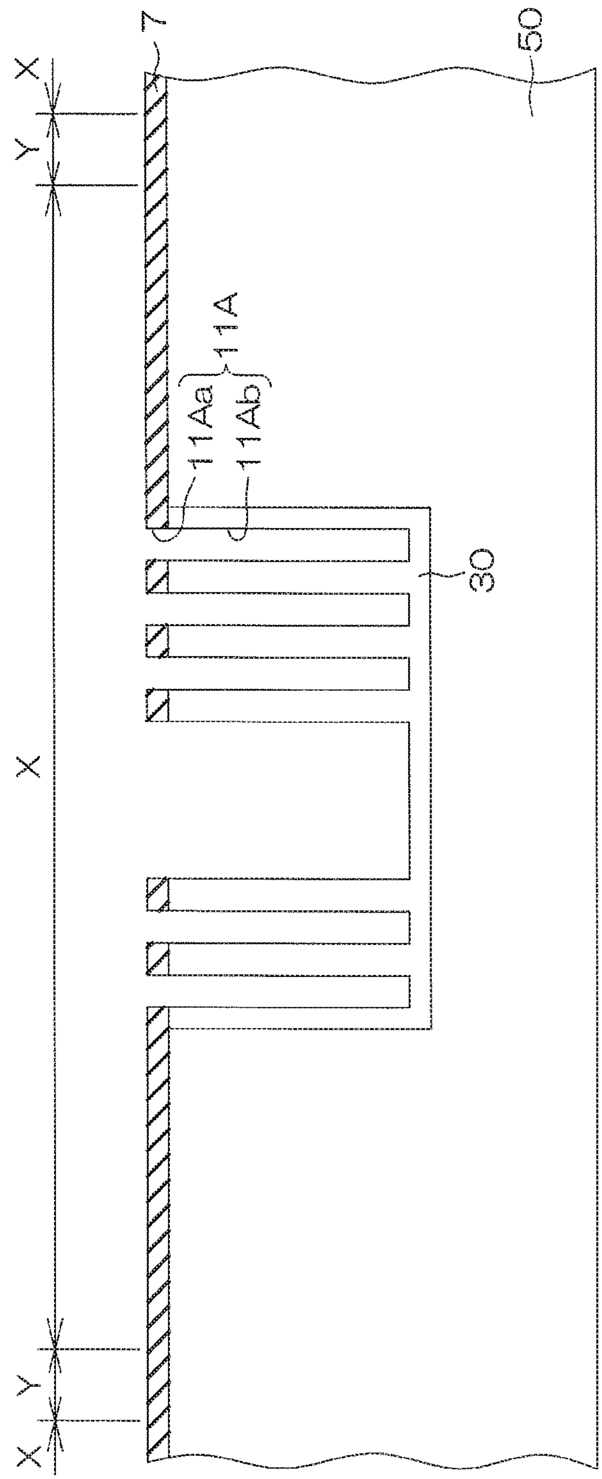

FIG. 102B is a cross-sectional view showing the step subsequent to FIG. 102A.

Figure 102C:
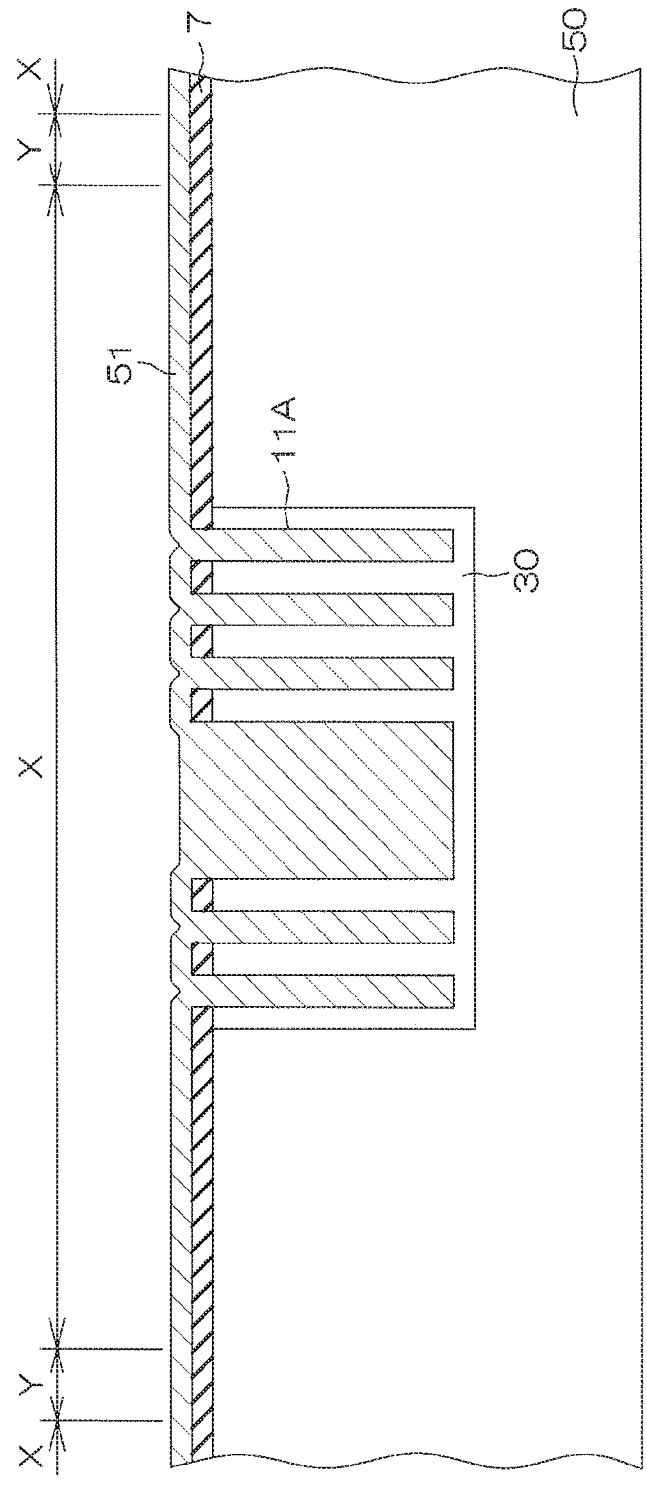

FIG. 102C is a cross-sectional view showing the step subsequent to FIG. 102B.

Figure 102D:
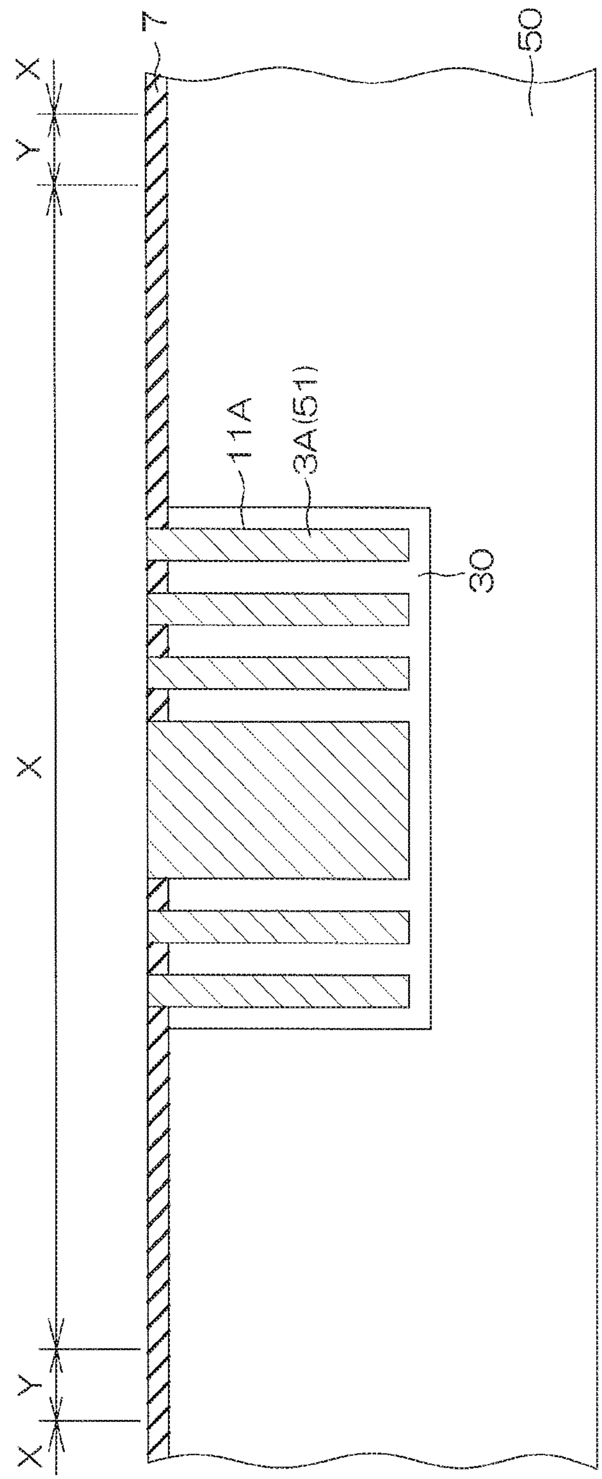

FIG. 102D is a cross-sectional view showing the step subsequent to FIG. 102C.

Figure 102E:
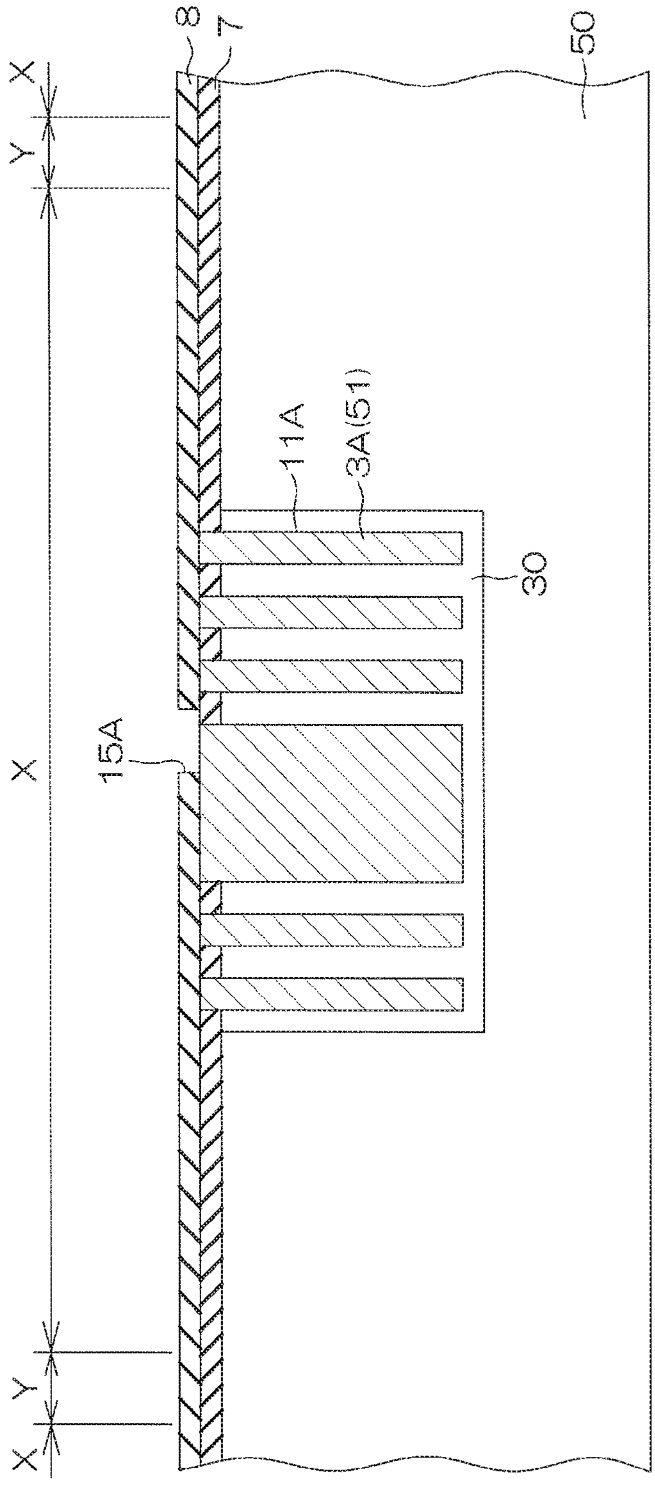

FIG. 102E is a cross-sectional view showing the step subsequent to FIG. 102D.

Figure 102F:
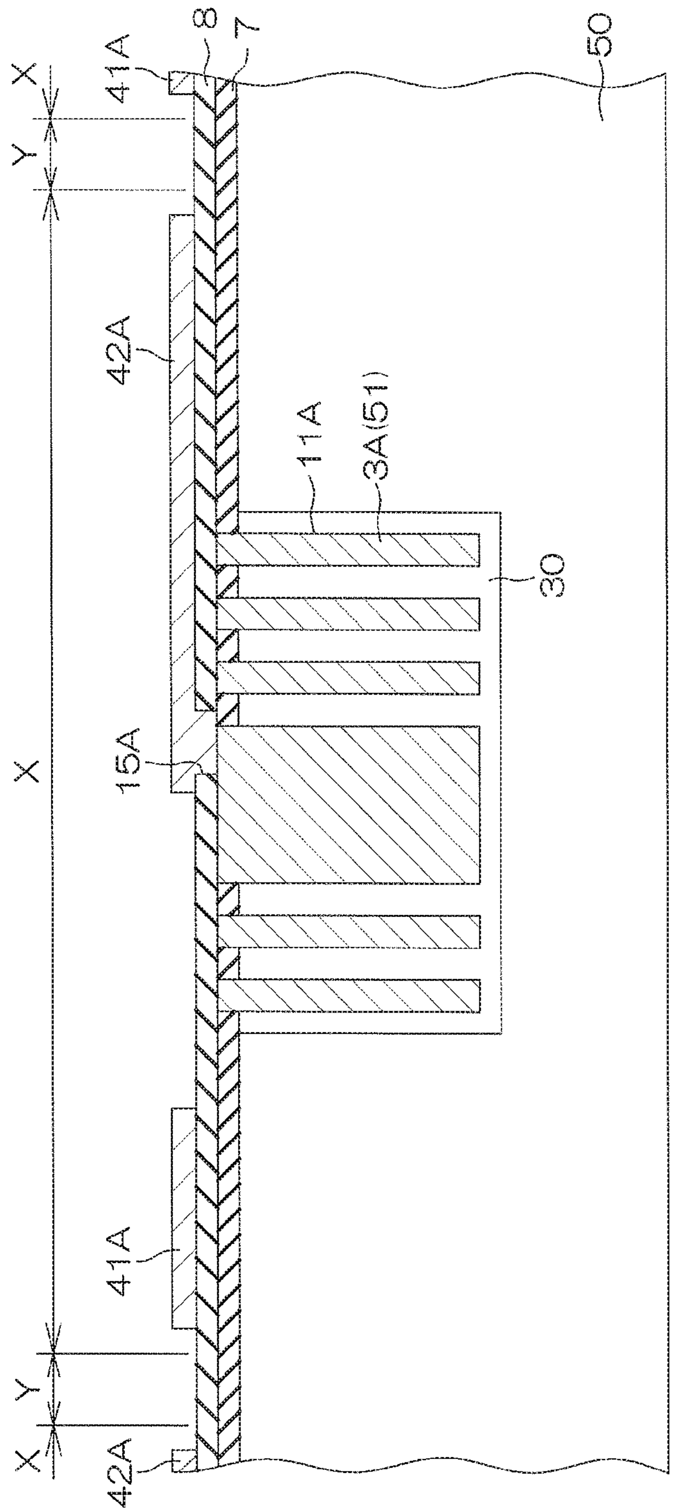

FIG. 102F is a cross-sectional view showing the step subsequent to FIG. 102E.

Figure 102G:
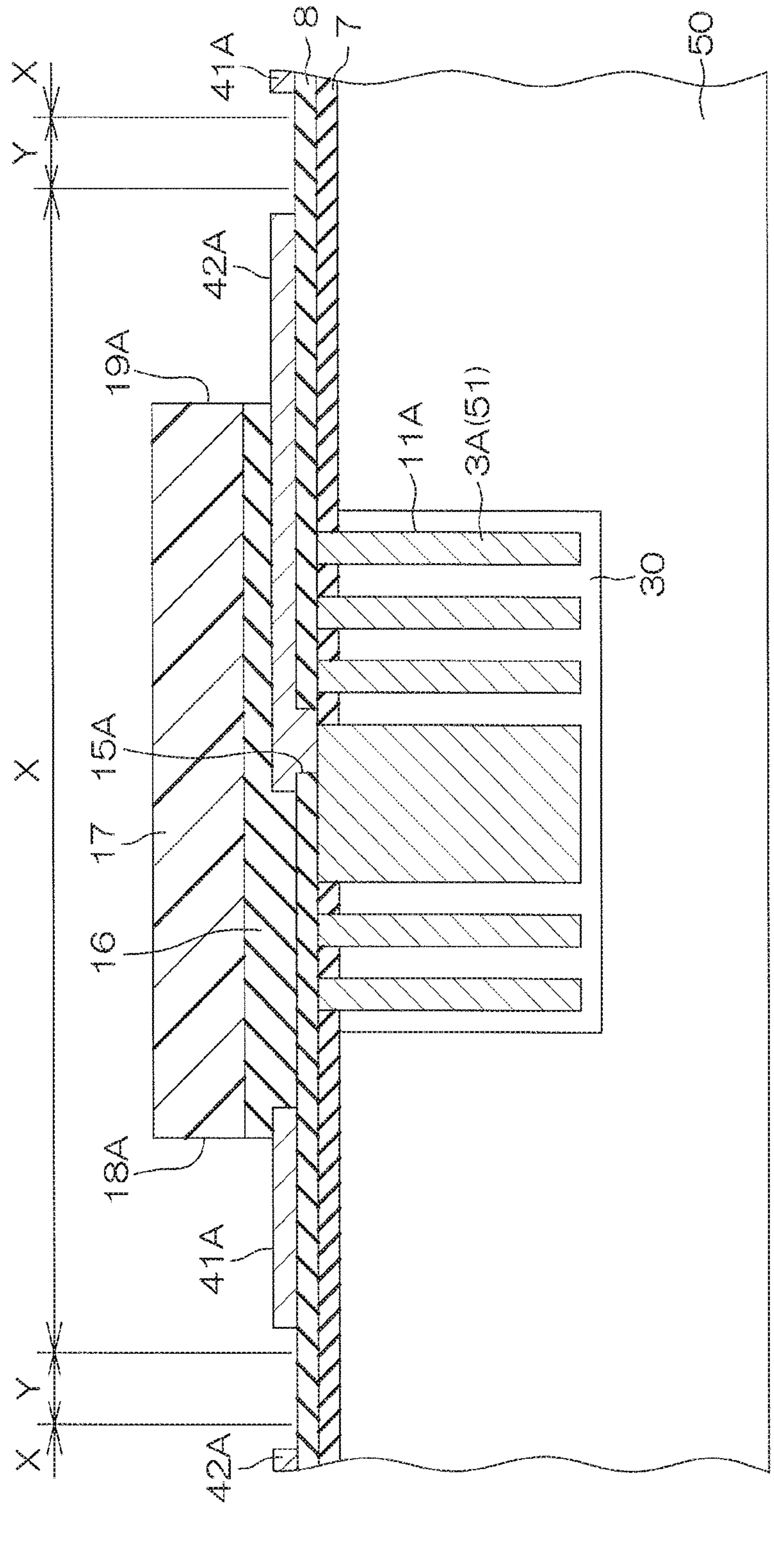

FIG. 102G is a cross-sectional view showing the step subsequent to FIG. 102F.

Figure 102H:
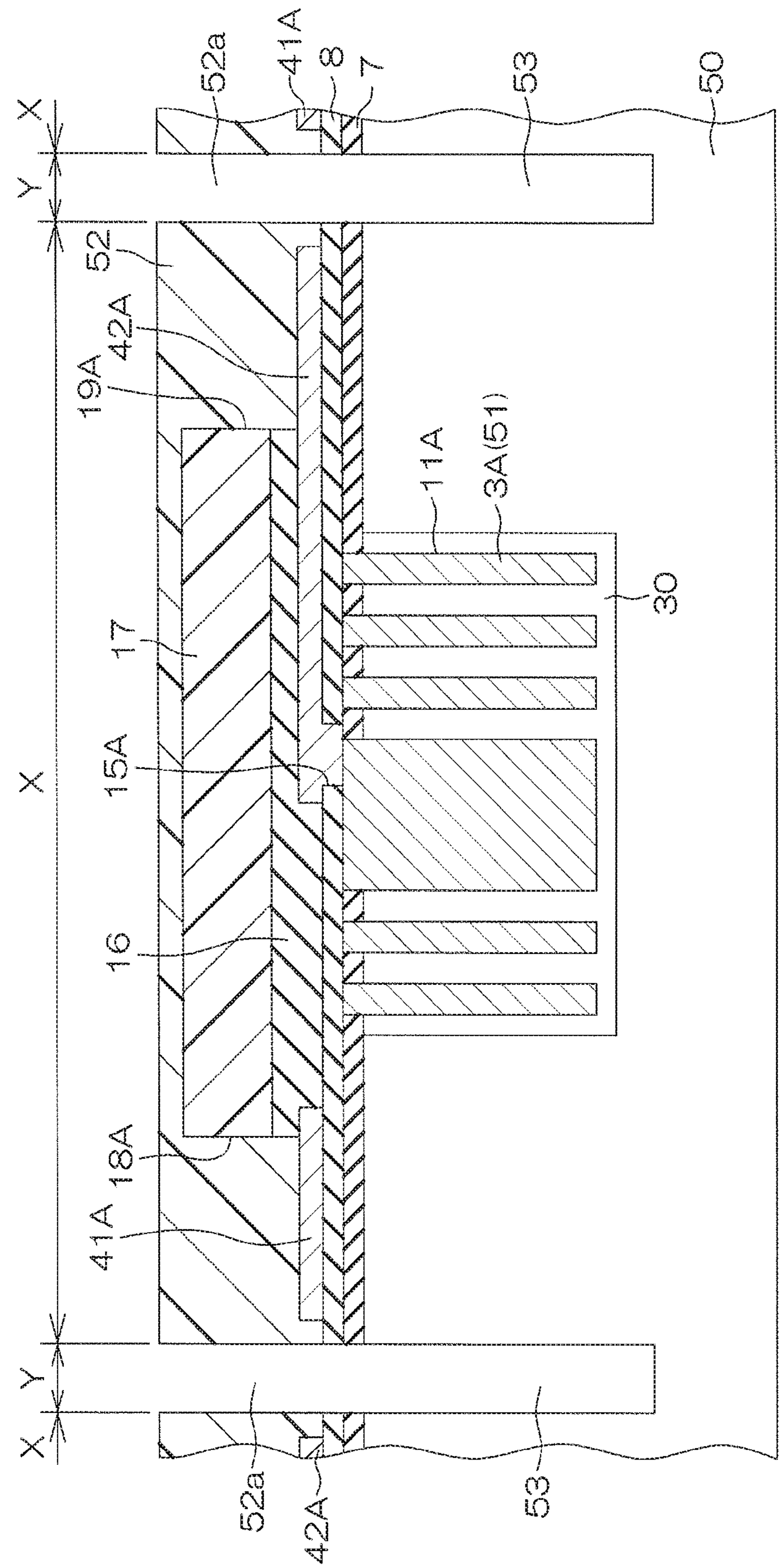
Figure 102:
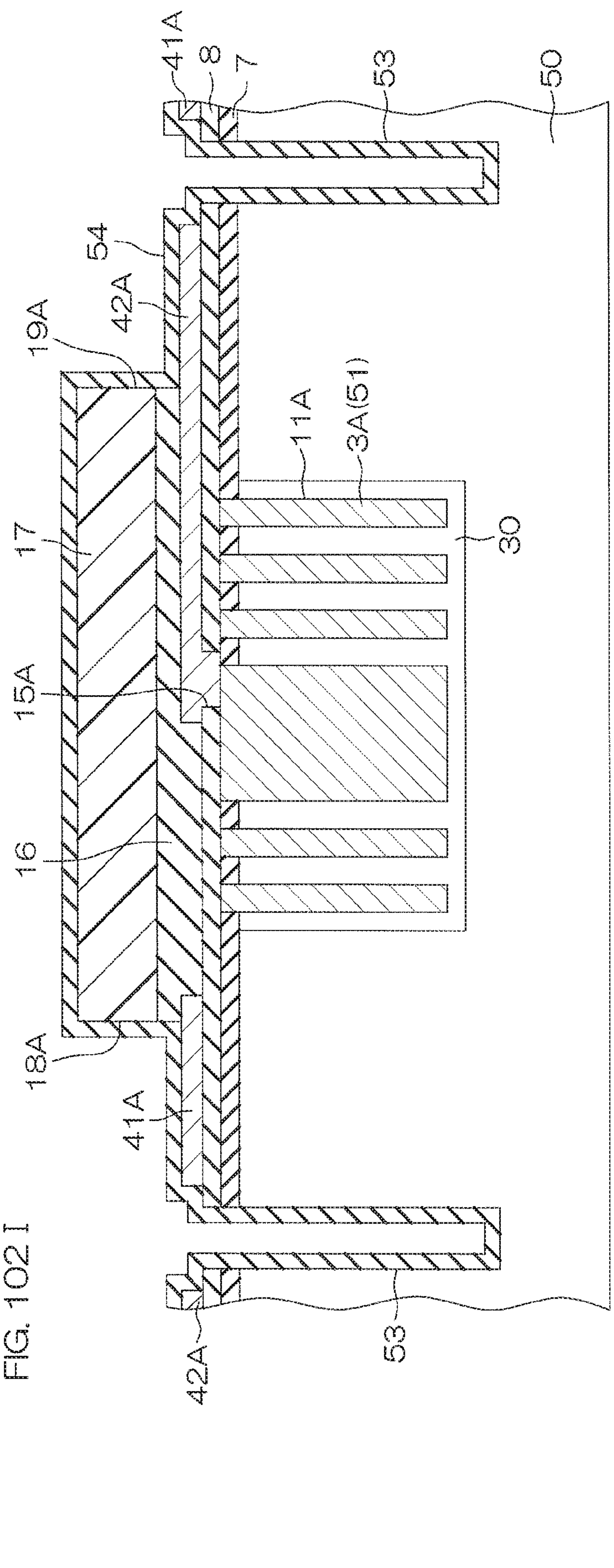

FIG. 102H is a cross-sectional view showing the step subsequent to FIG. 102G.

FIG. 102I is a cross-sectional view showing the step subsequent to FIG. 102H.

Figure 102J:
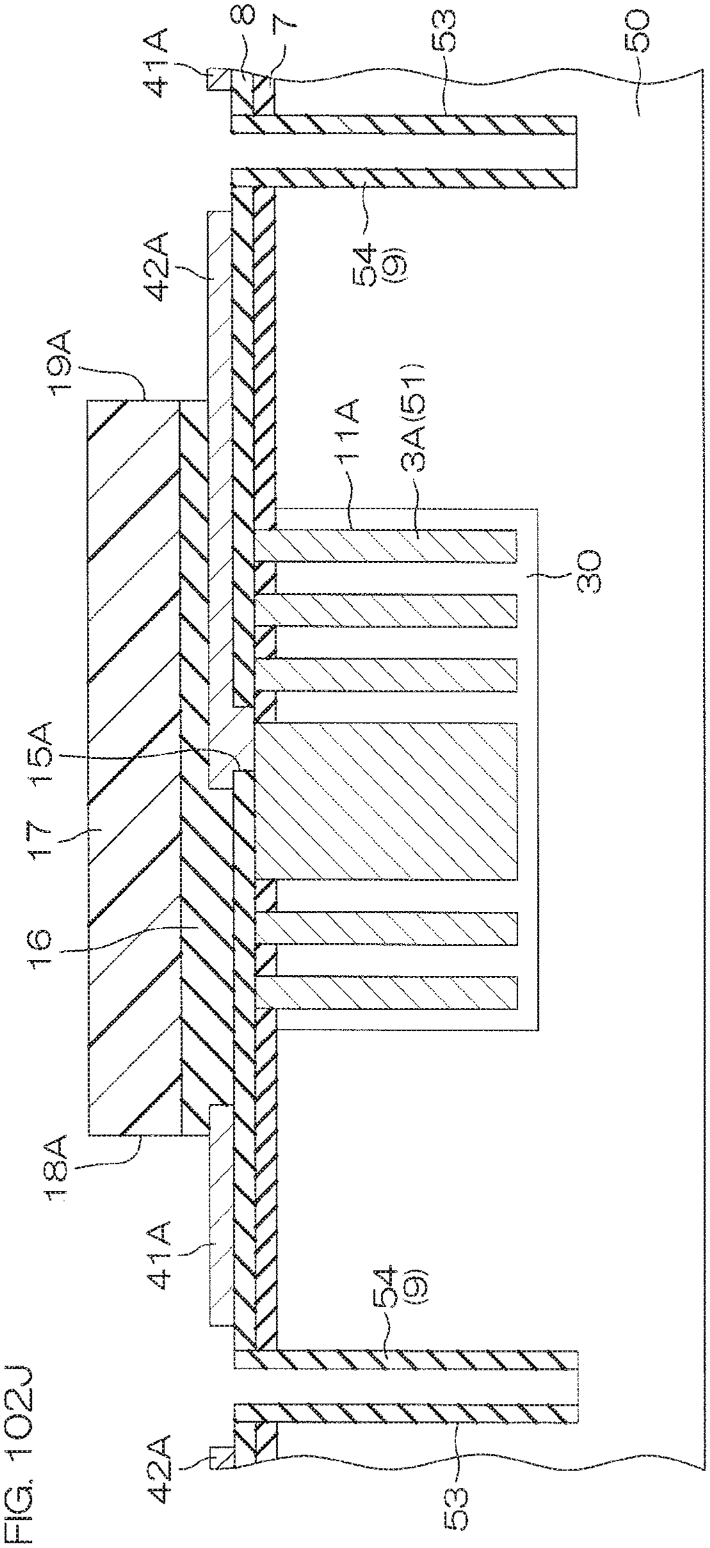

FIG. 102J is a cross-sectional view showing the step subsequent to FIG. 102I.

Figure 102K:
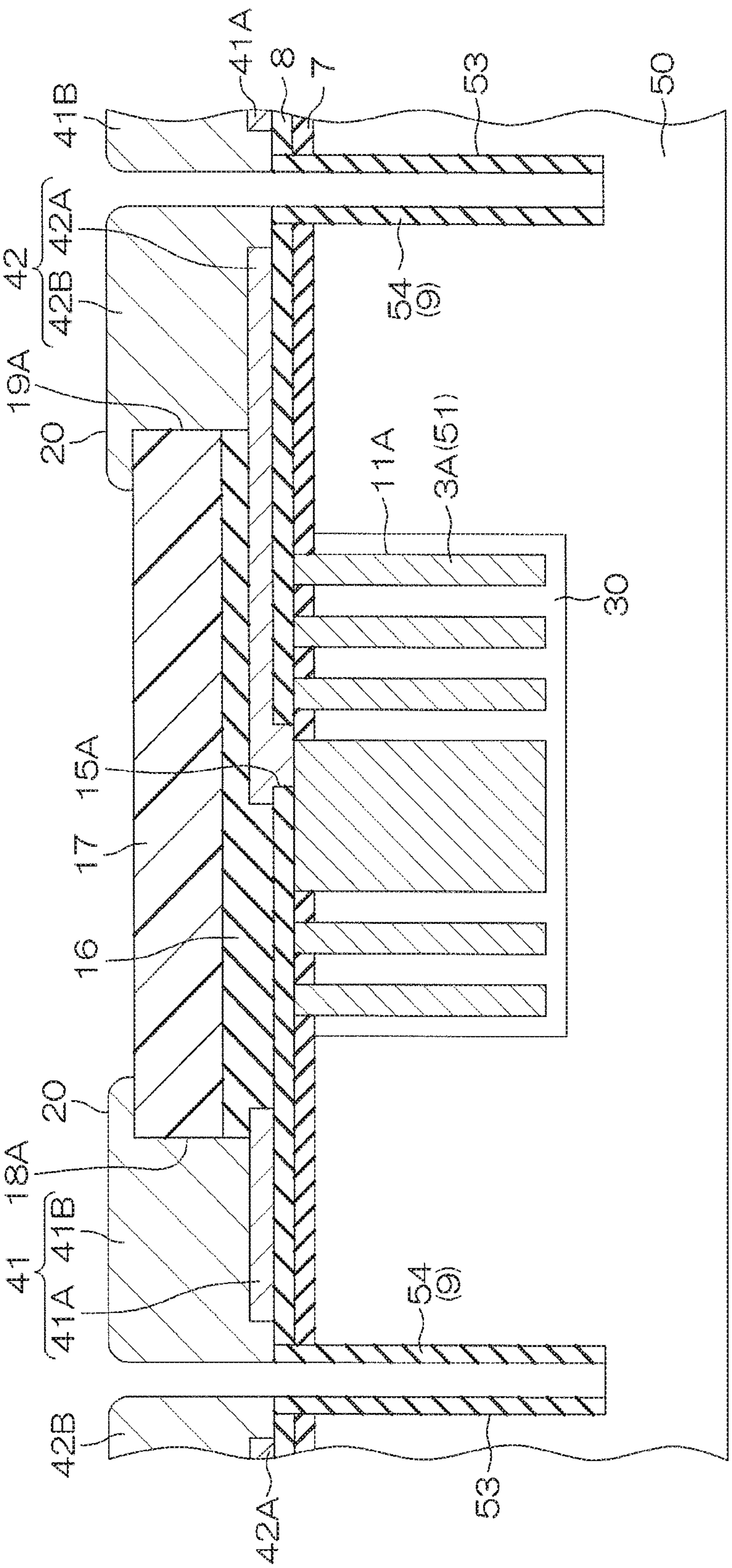

FIG. 102K is a cross-sectional view showing the step subsequent to FIG. 102J.

Figure 102L:
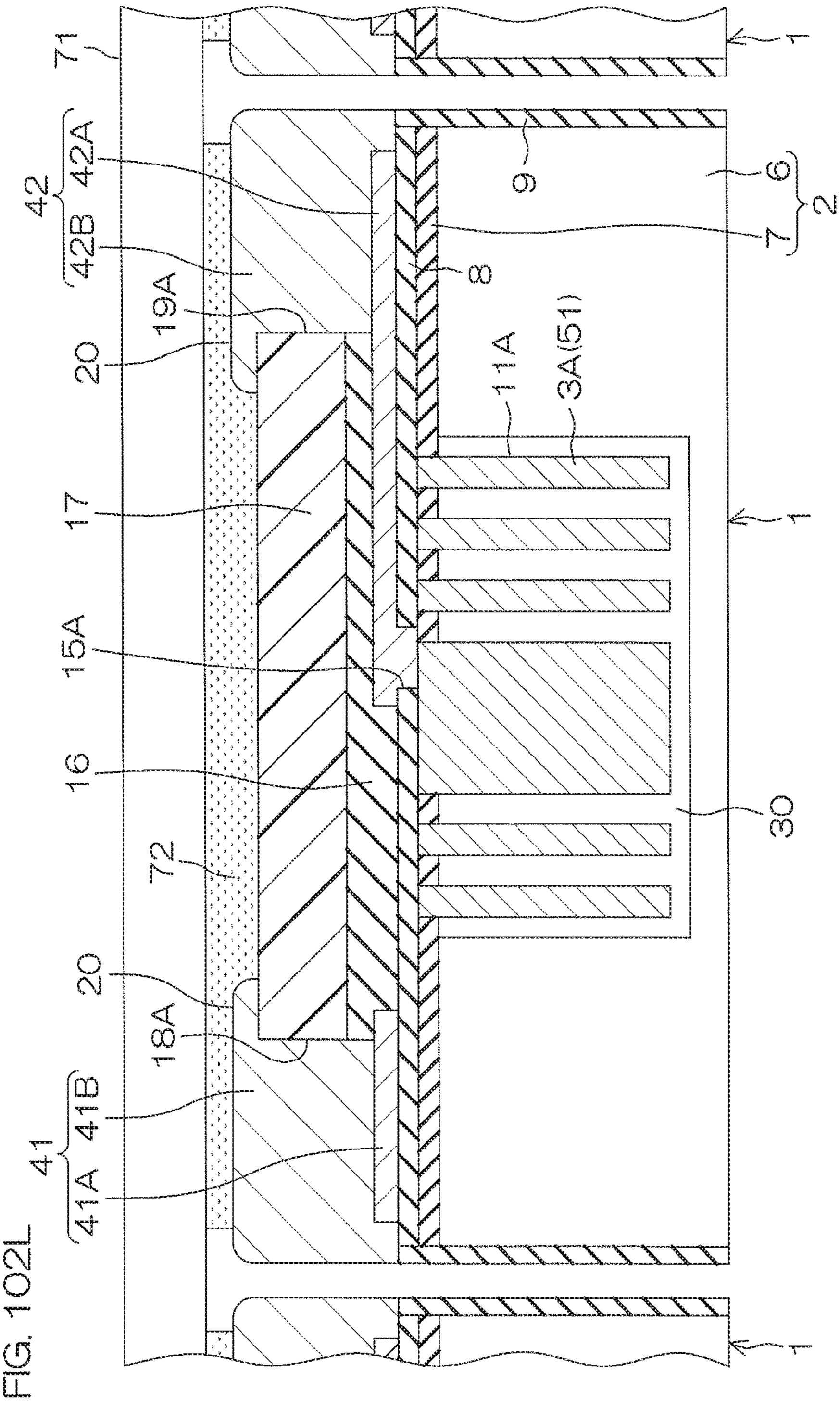

FIG. 102L is a cross-sectional view showing the step subsequent to FIG. 102K.

Figure 103A:
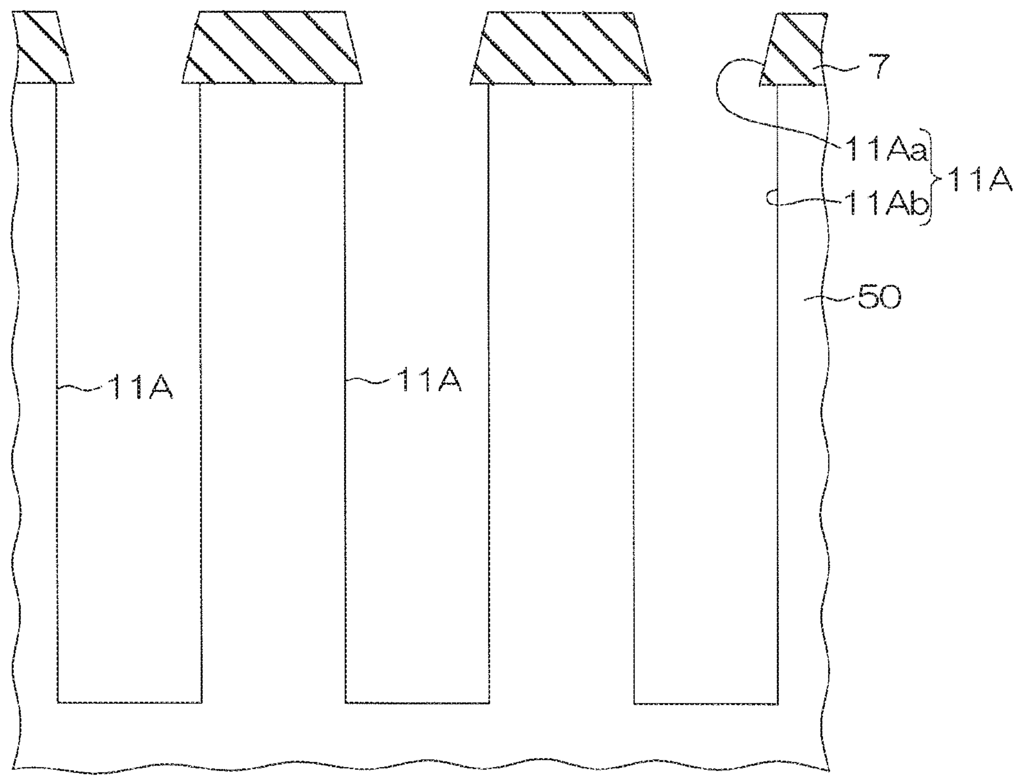

FIG. 103A is a partially enlarged cross-sectional view showing the details of the manufacturing step of a coil.

Figure 103B:
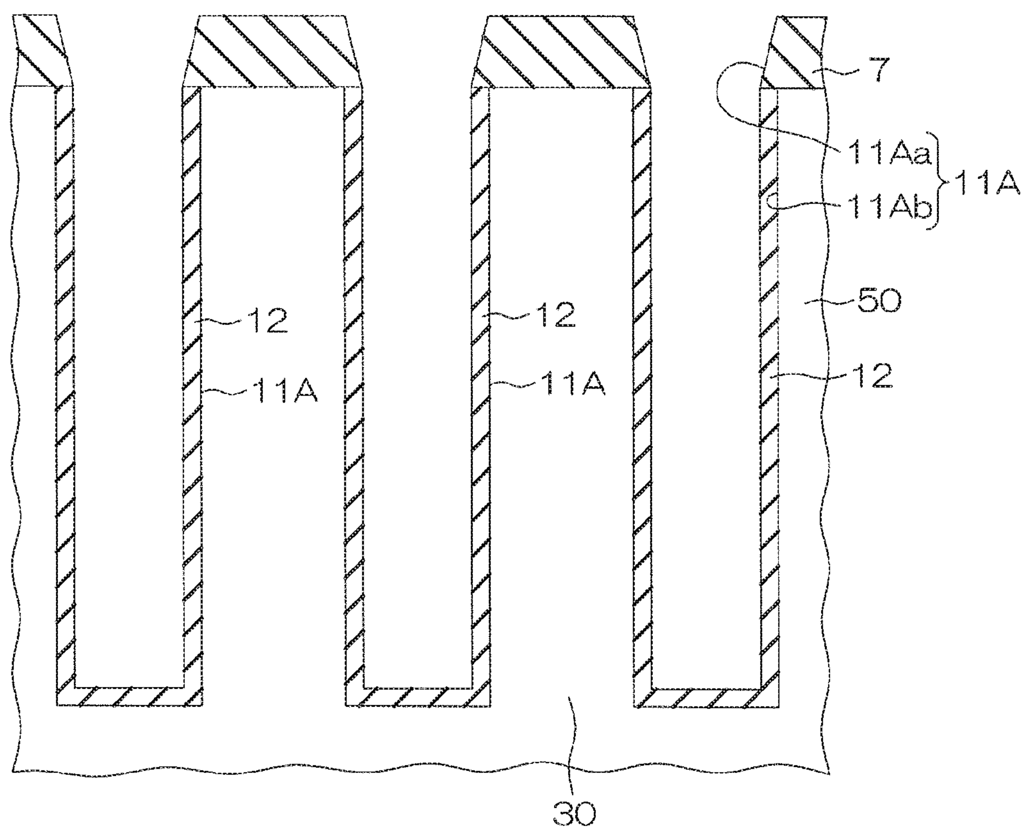

FIG. 103B is a partially enlarged cross-sectional view showing the step subsequent to FIG. 103A.

Figure 103C:
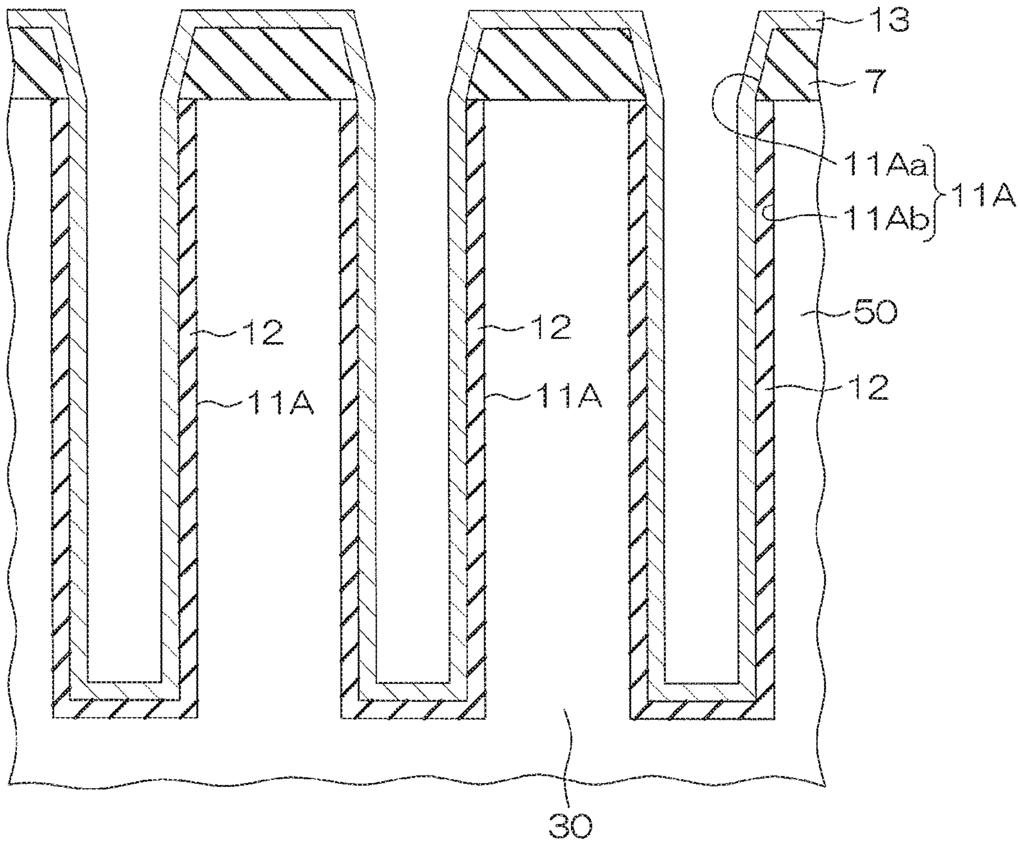

FIG. 103C is a partially enlarged cross-sectional view showing the step subsequent to FIG. 103B.

Figure 103D:
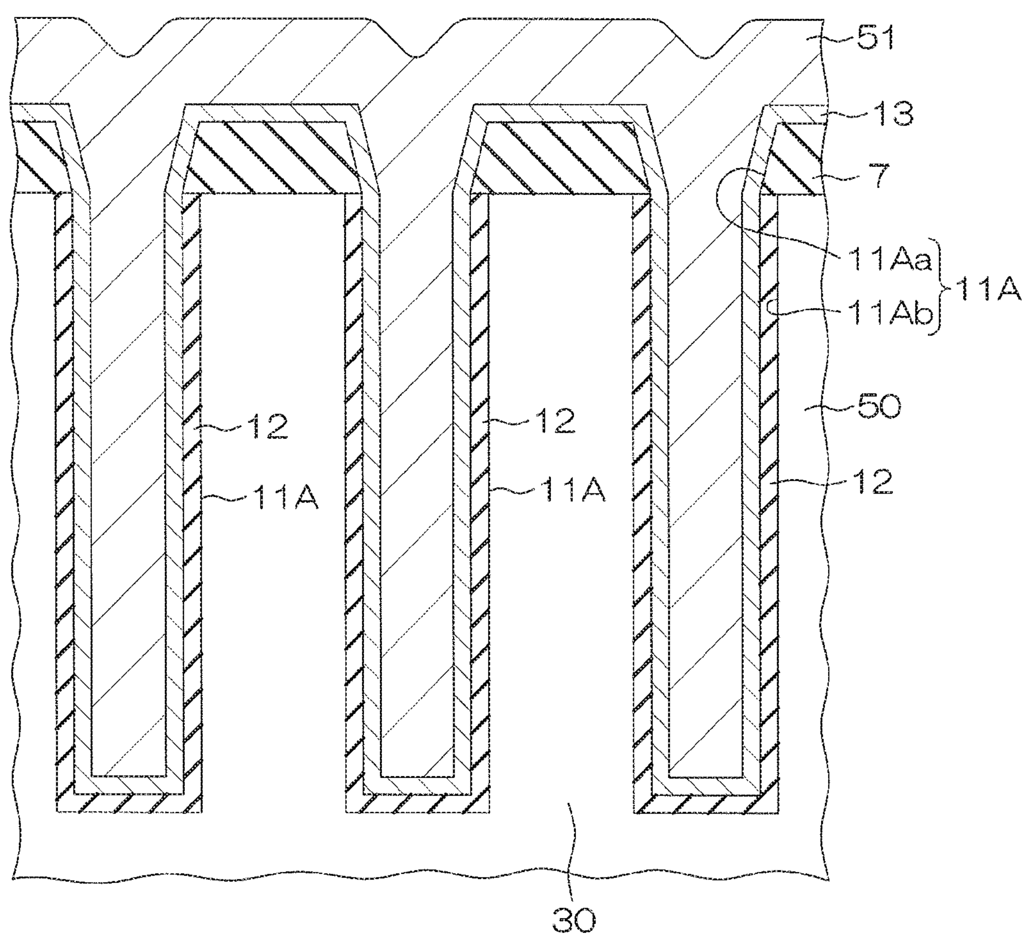

FIG. 103D is a partially enlarged cross-sectional view showing the step subsequent to FIG. 103C.

Figure 103E:
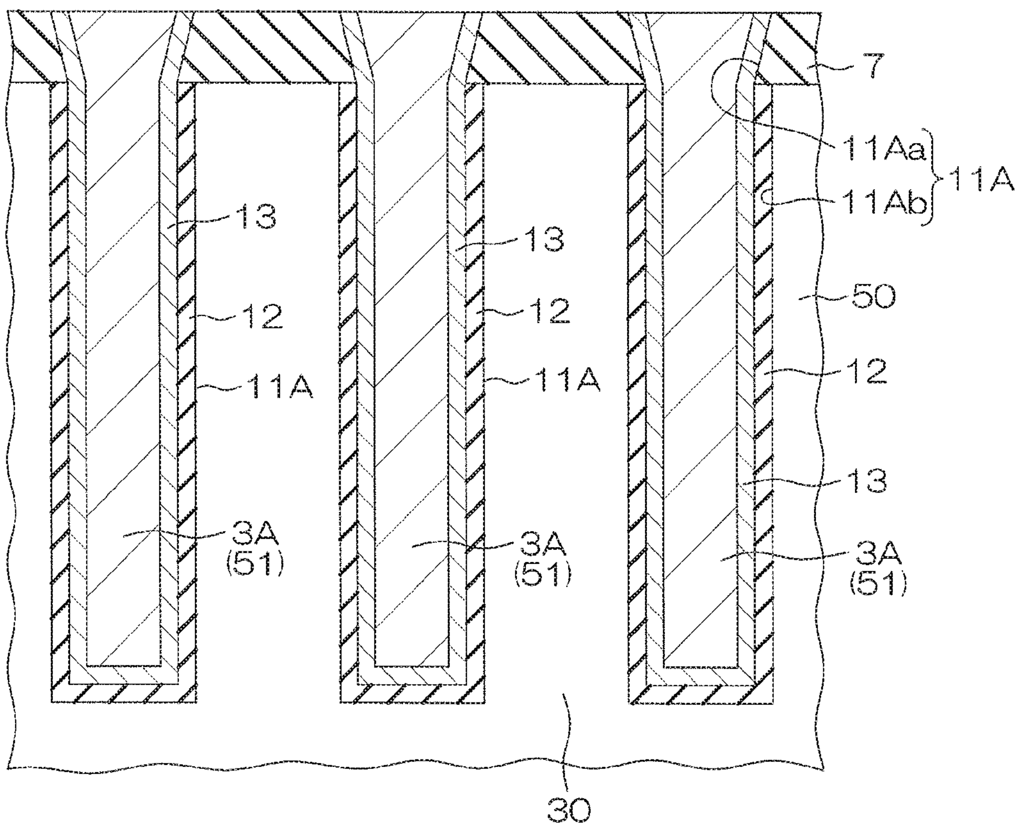

FIG. 103E is a partially enlarged cross-sectional view showing the step subsequent to FIG. 103D.

Figure 104A:
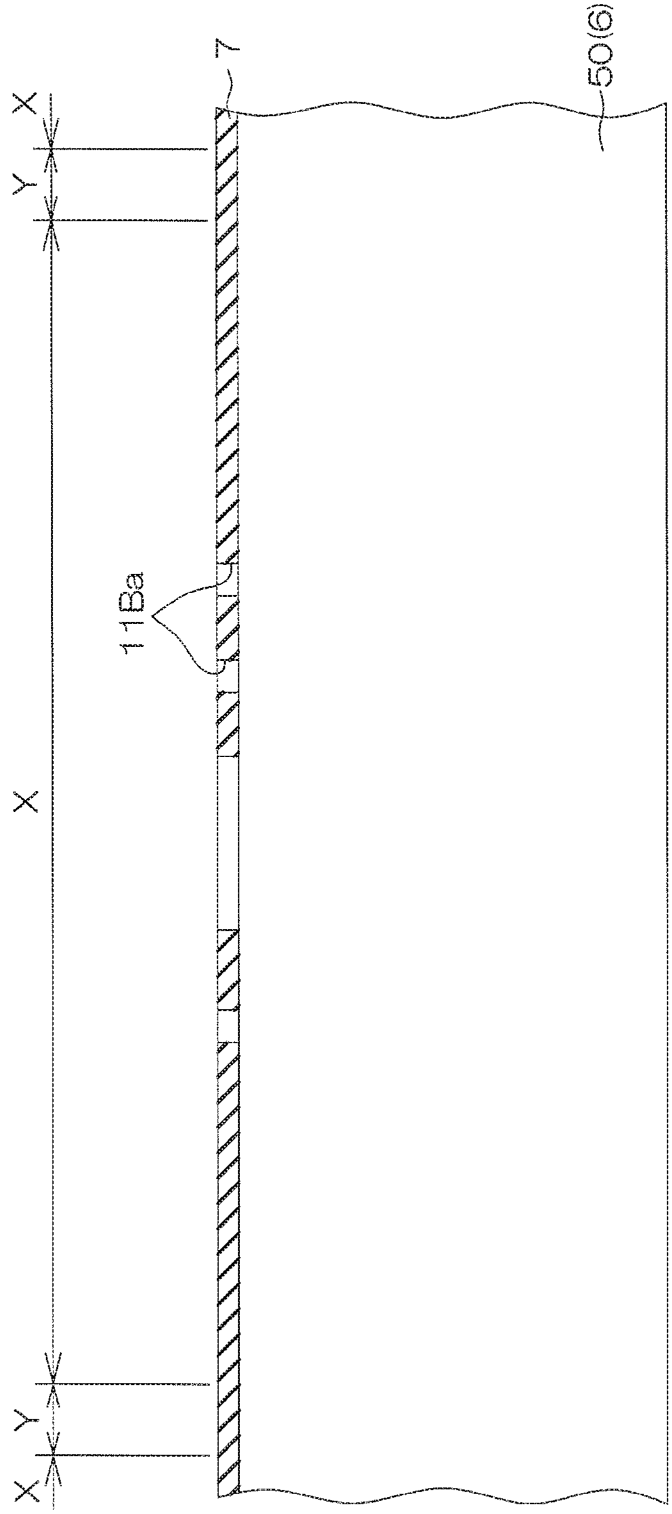

FIG. 104A is a cross-sectional view for illustrating an example of the manufacturing step of the chip transformer, and is a cut surface corresponding to FIG. 96A.

Figure 104B:
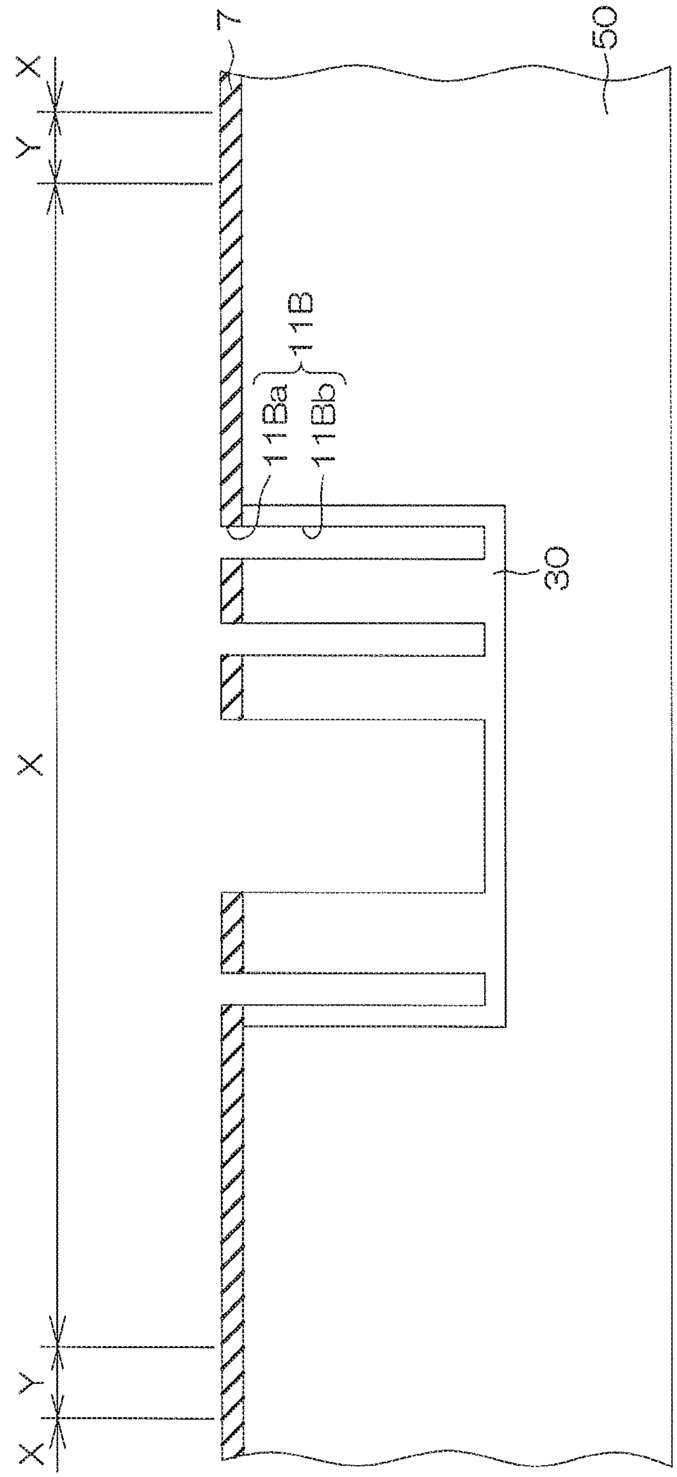

FIG. 104B is a cross-sectional view showing the step subsequent to FIG. 104A.

Figure 104C:
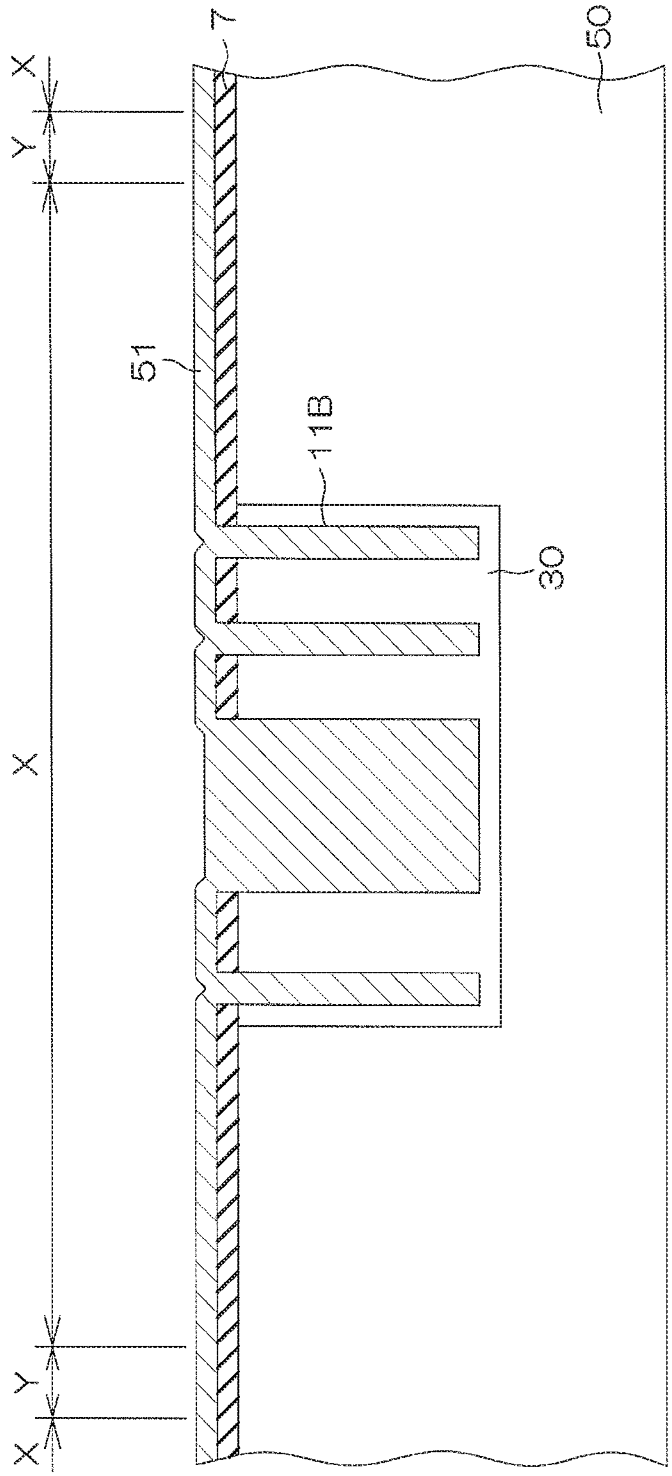

FIG. 104C is a cross-sectional view showing the step subsequent to FIG. 104B.

Figure 104D:
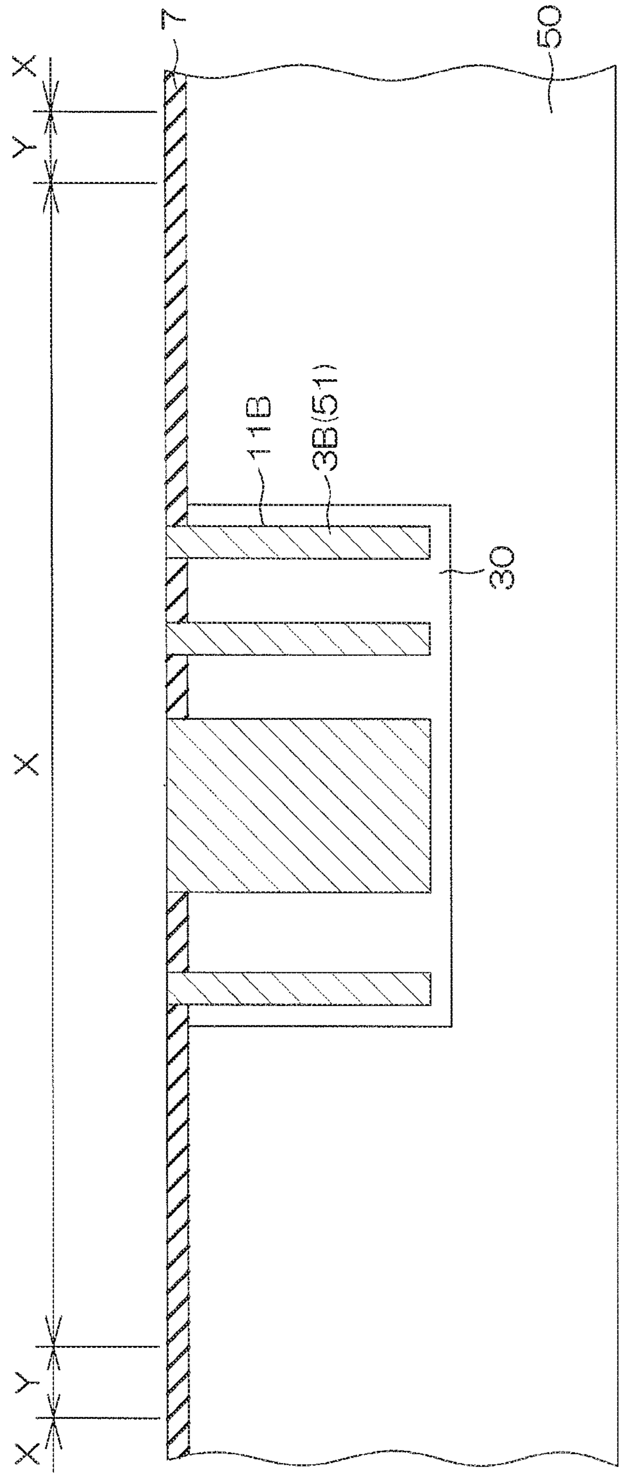

FIG. 104D is a cross-sectional view showing the step subsequent to FIG. 104C.

Figure 104E:
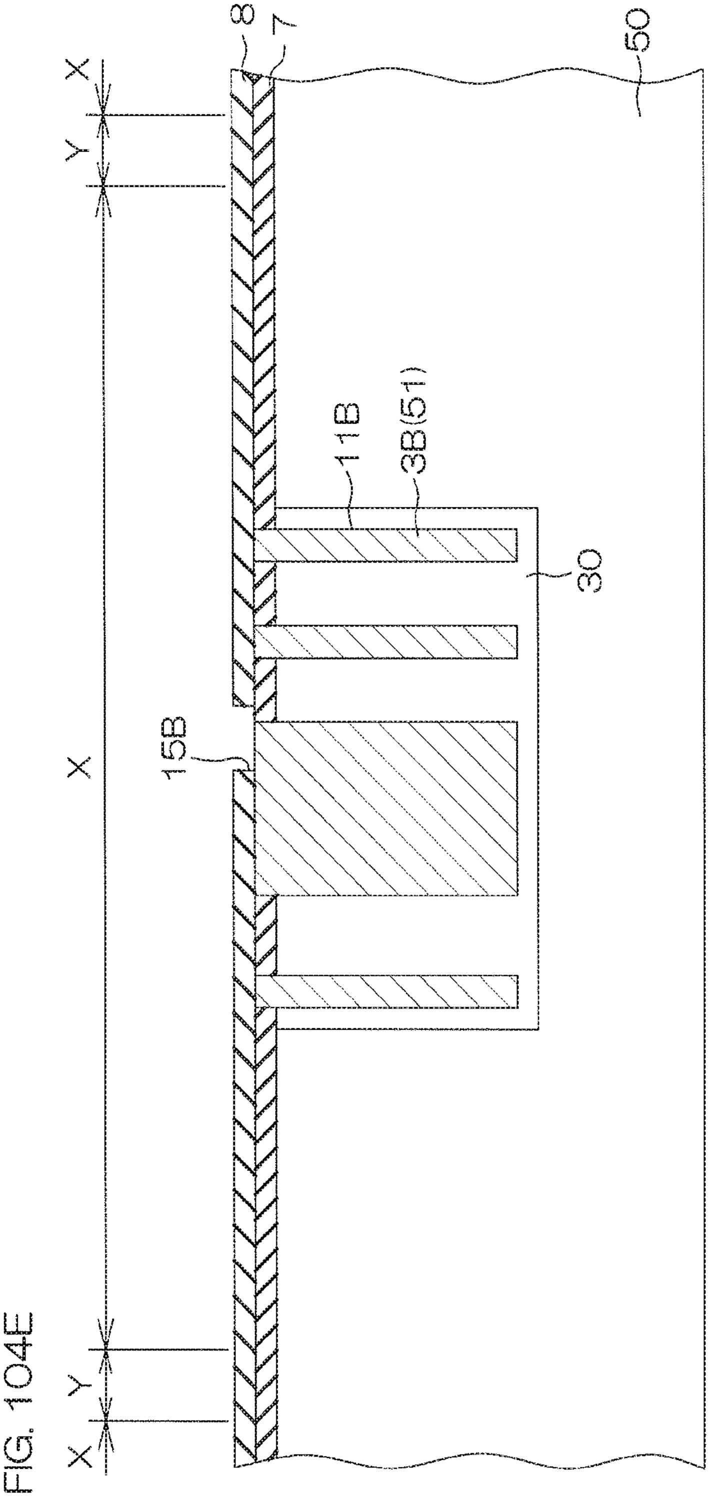

FIG. 104E is a cross-sectional view showing the step subsequent to FIG. 104D.

Figure 104F:
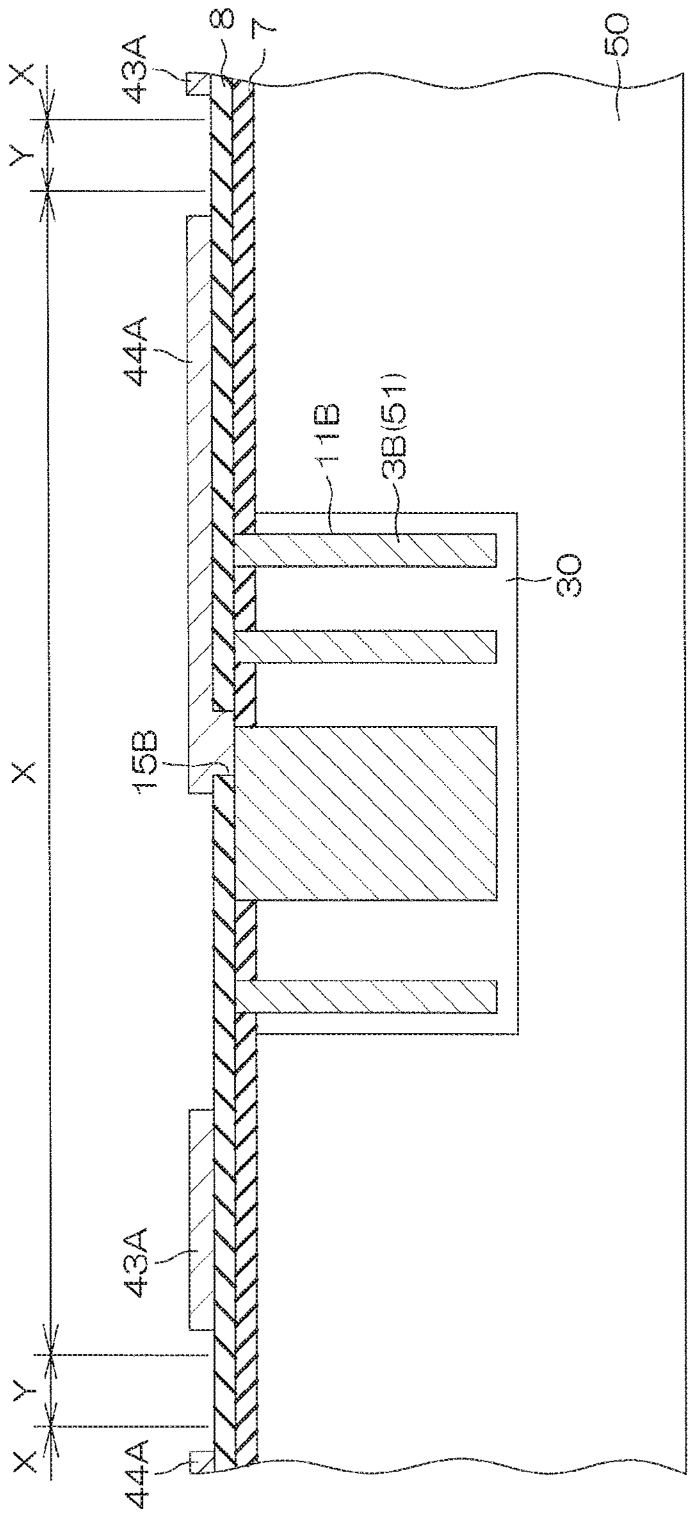

FIG. 104F is a cross-sectional view showing the step subsequent to FIG. 104E.

Figure 104G:
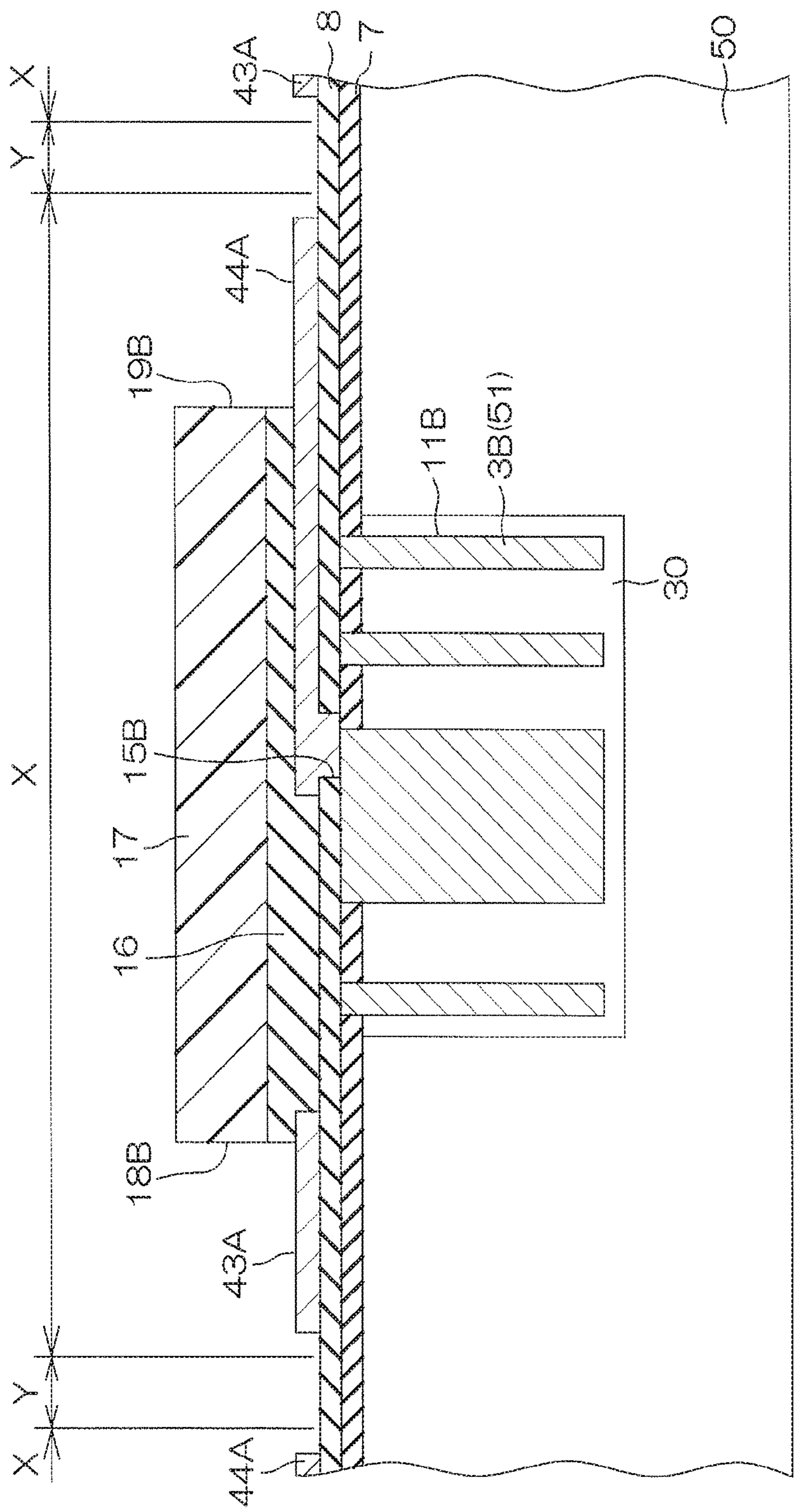

FIG. 104G is a cross-sectional view showing the step subsequent to FIG. 104F.

Figure 104H:
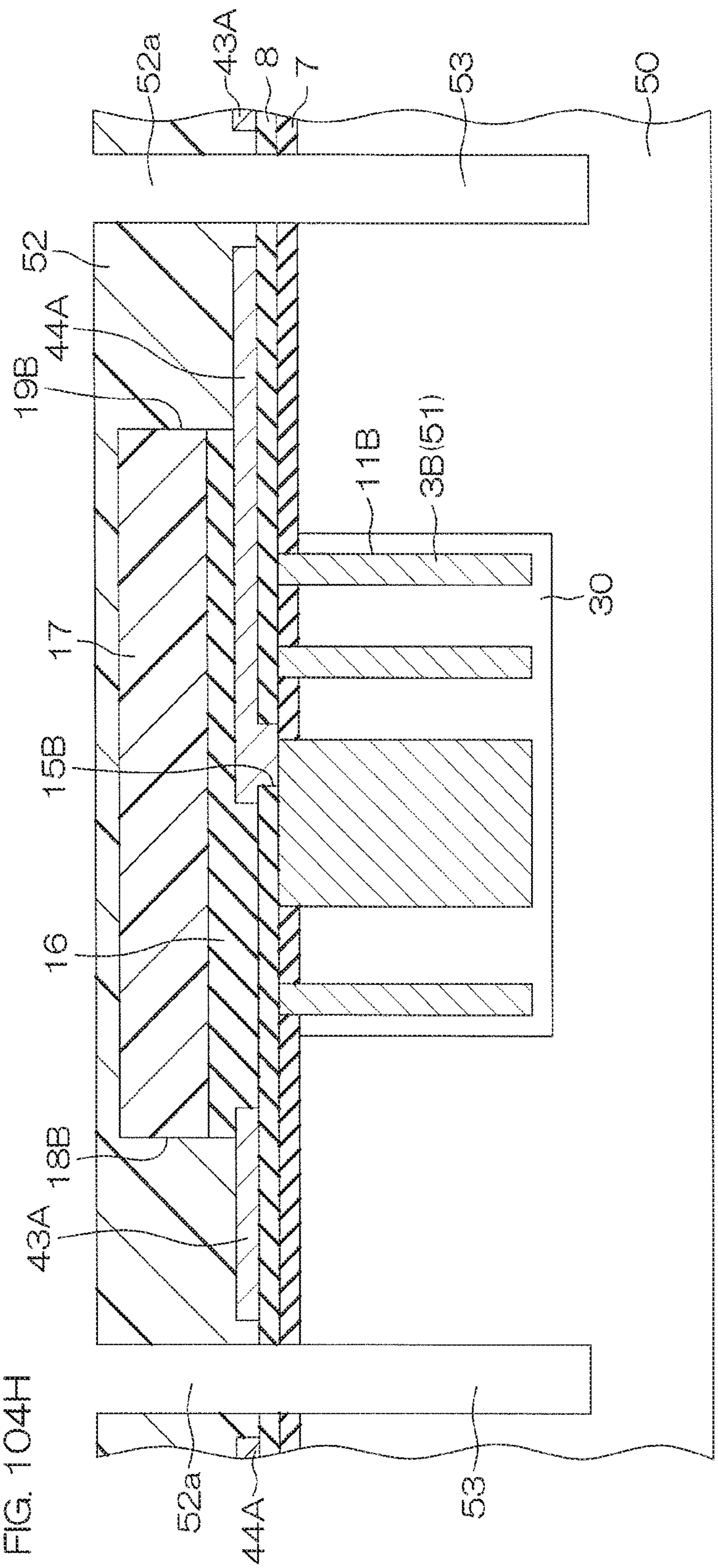
Figure 104:
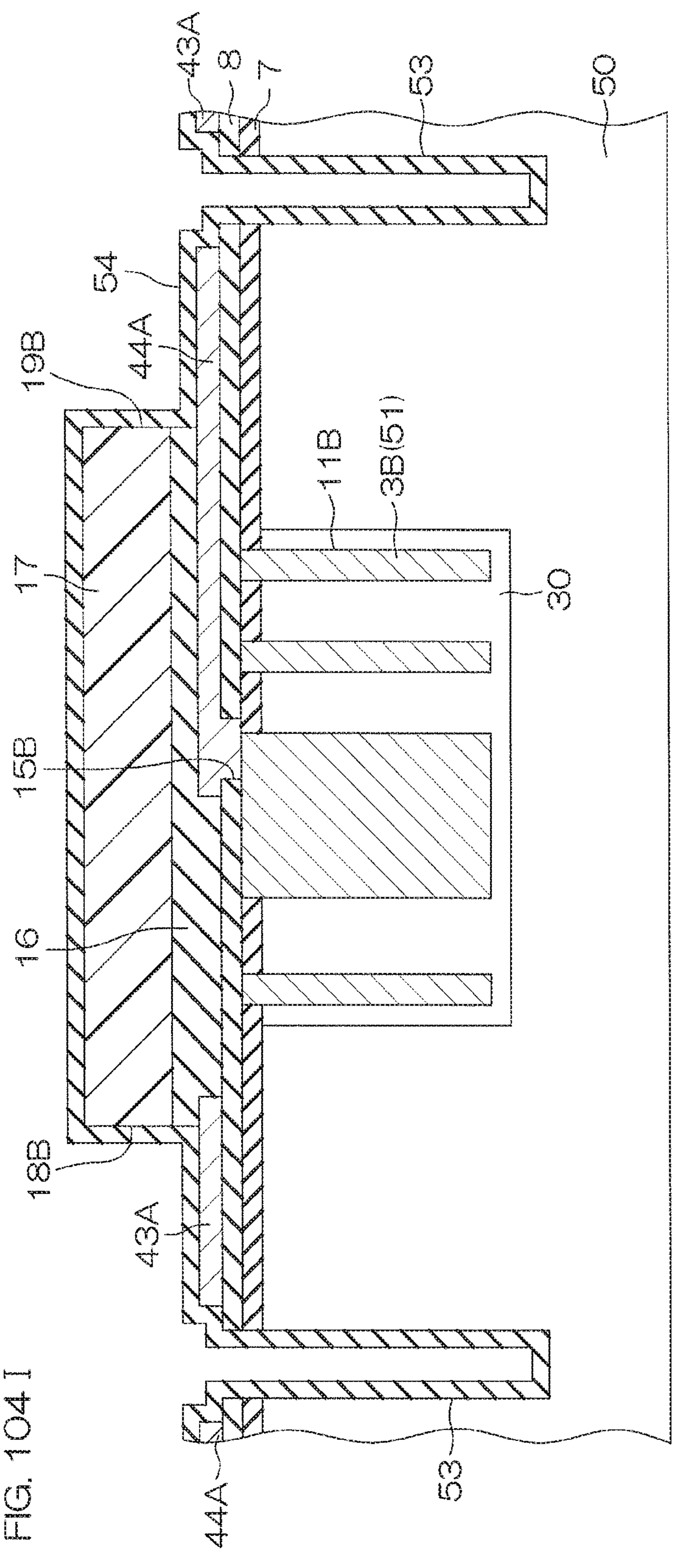

FIG. 104H is a cross-sectional view showing the step subsequent to FIG. 104G.

FIG. 104I is a cross-sectional view showing the step subsequent to FIG. 104H.

Figure 104J:
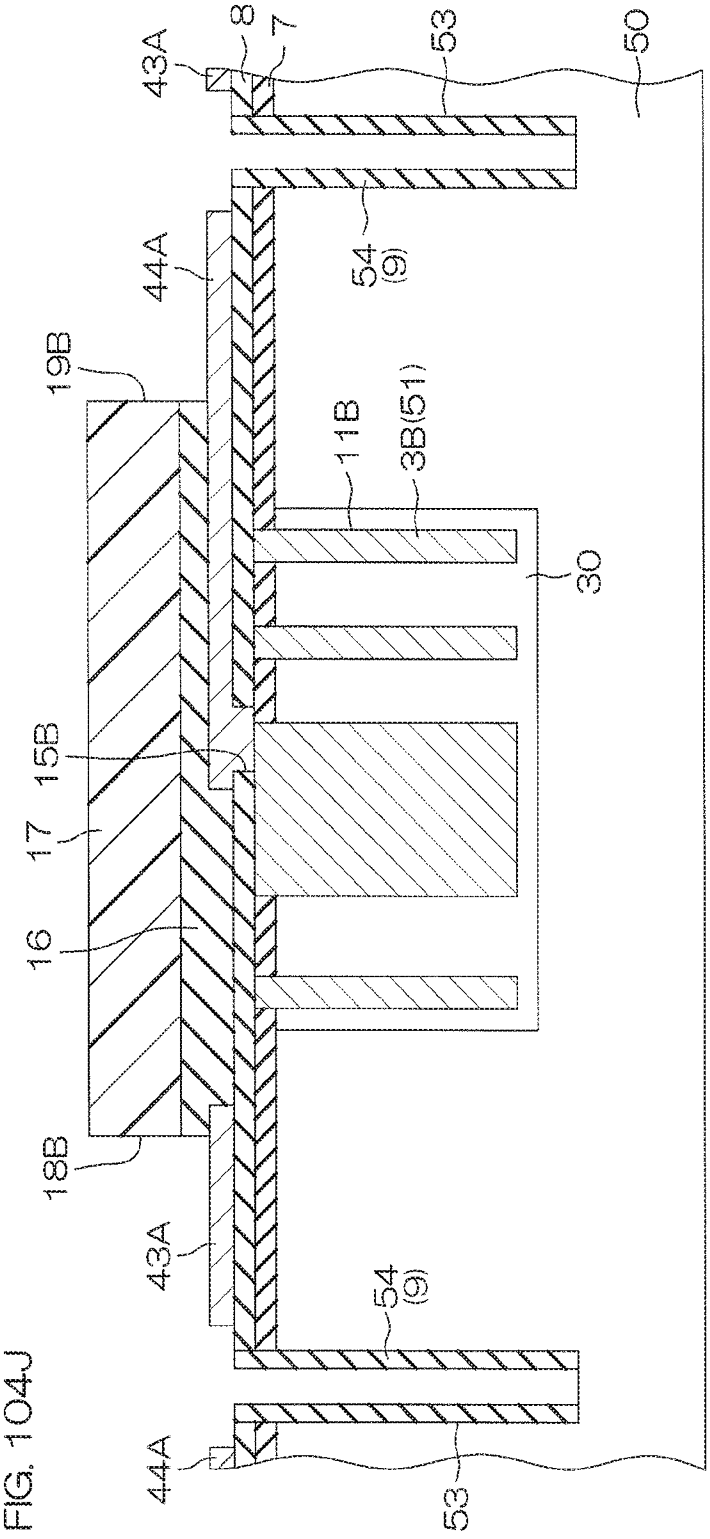

FIG. 104J is a cross-sectional view showing the step subsequent to FIG. 104I.

Figure 104K:
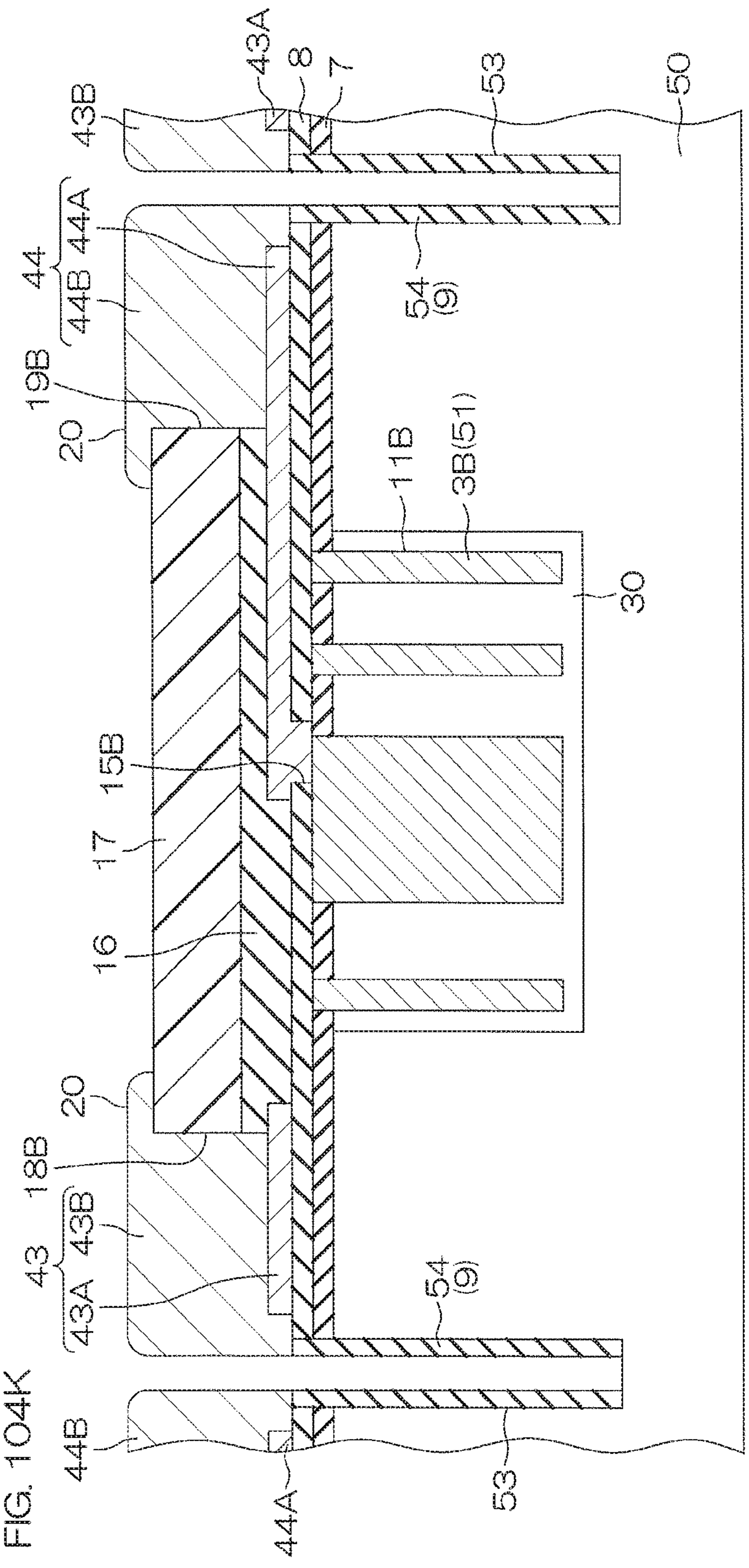

FIG. 104K is a cross-sectional view showing the step subsequent to FIG. 104J.

Figure 104L:
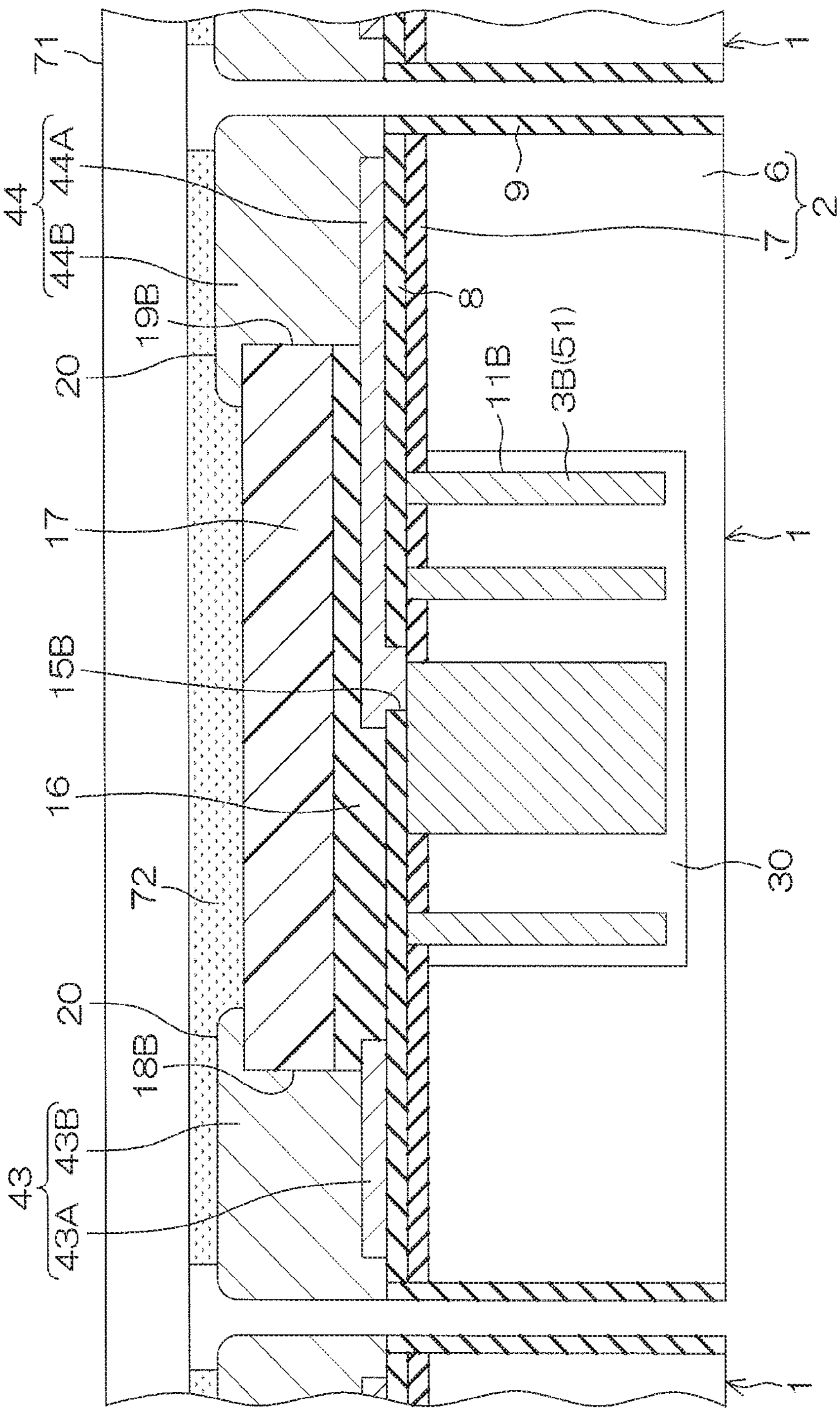

FIG. 104L is a cross-sectional view showing the step subsequent to FIG. 104K.

Figure 105:
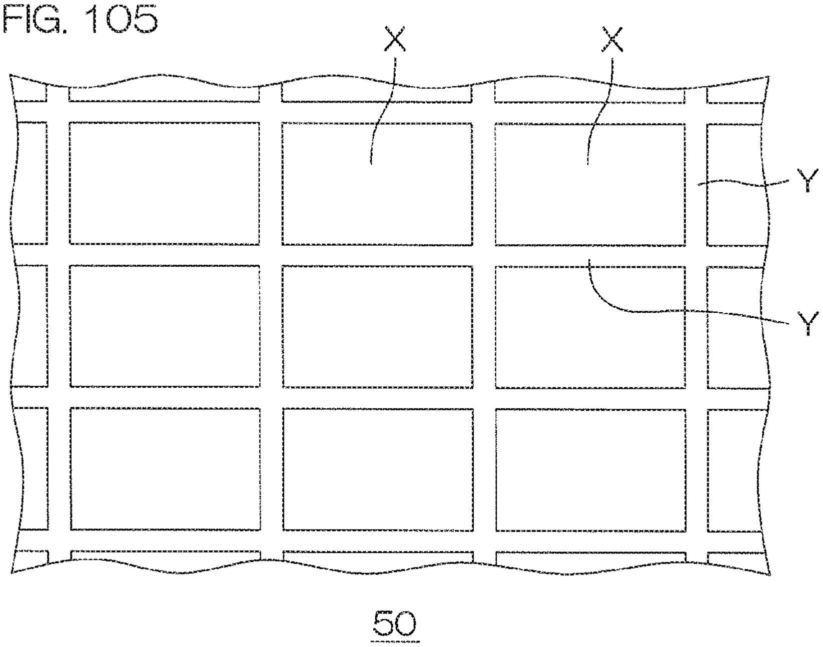

FIG. 105 is a plan view of an original substrate that is an original of a substrate main body of the chip transformer, and shows an enlarged view of a partial region.

Figure 106A:
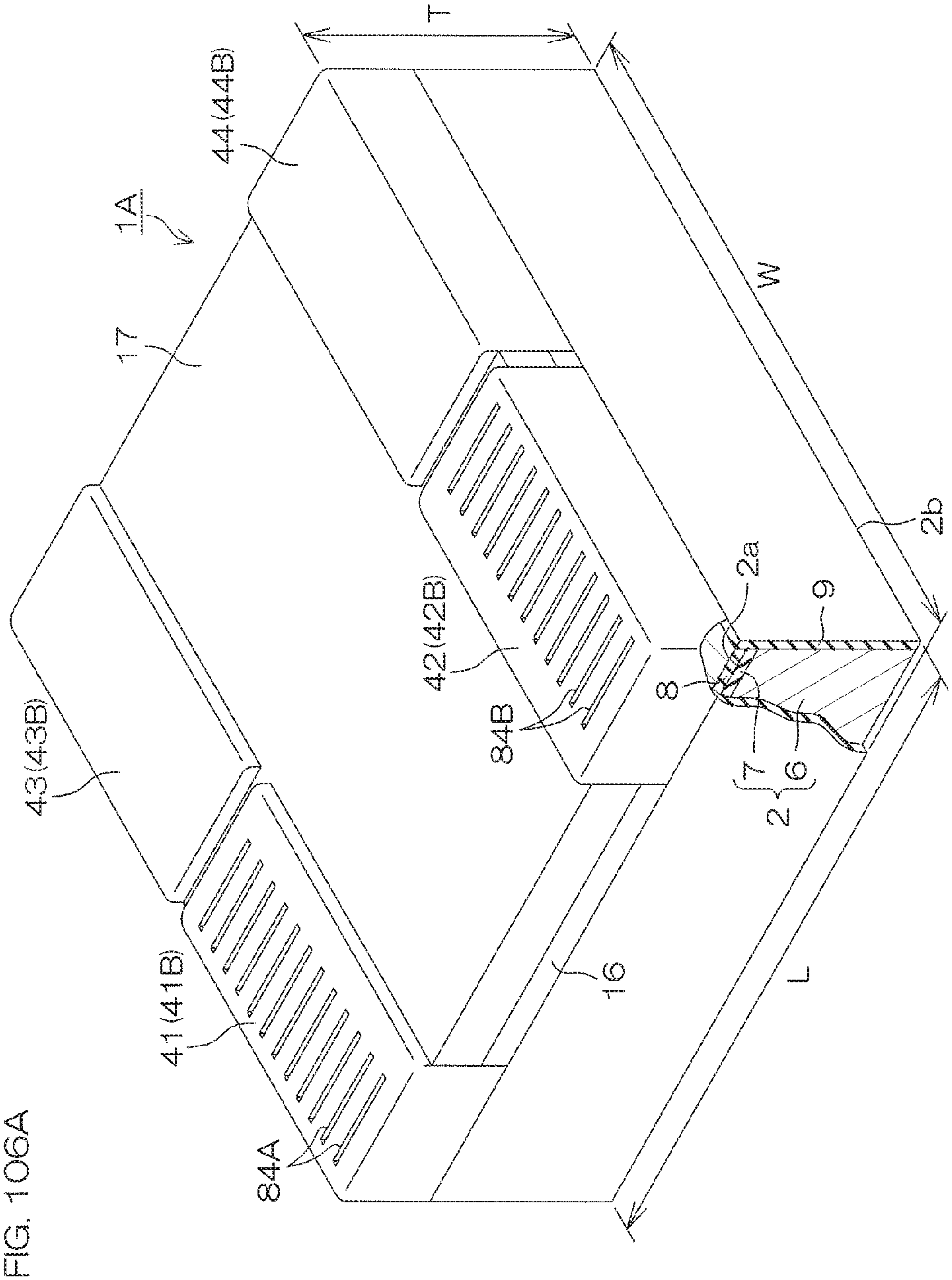

FIG. 106A is a partially cut perspective view of a chip transformer according to a second preferred embodiment of the fourth invention.

Figure 106B:
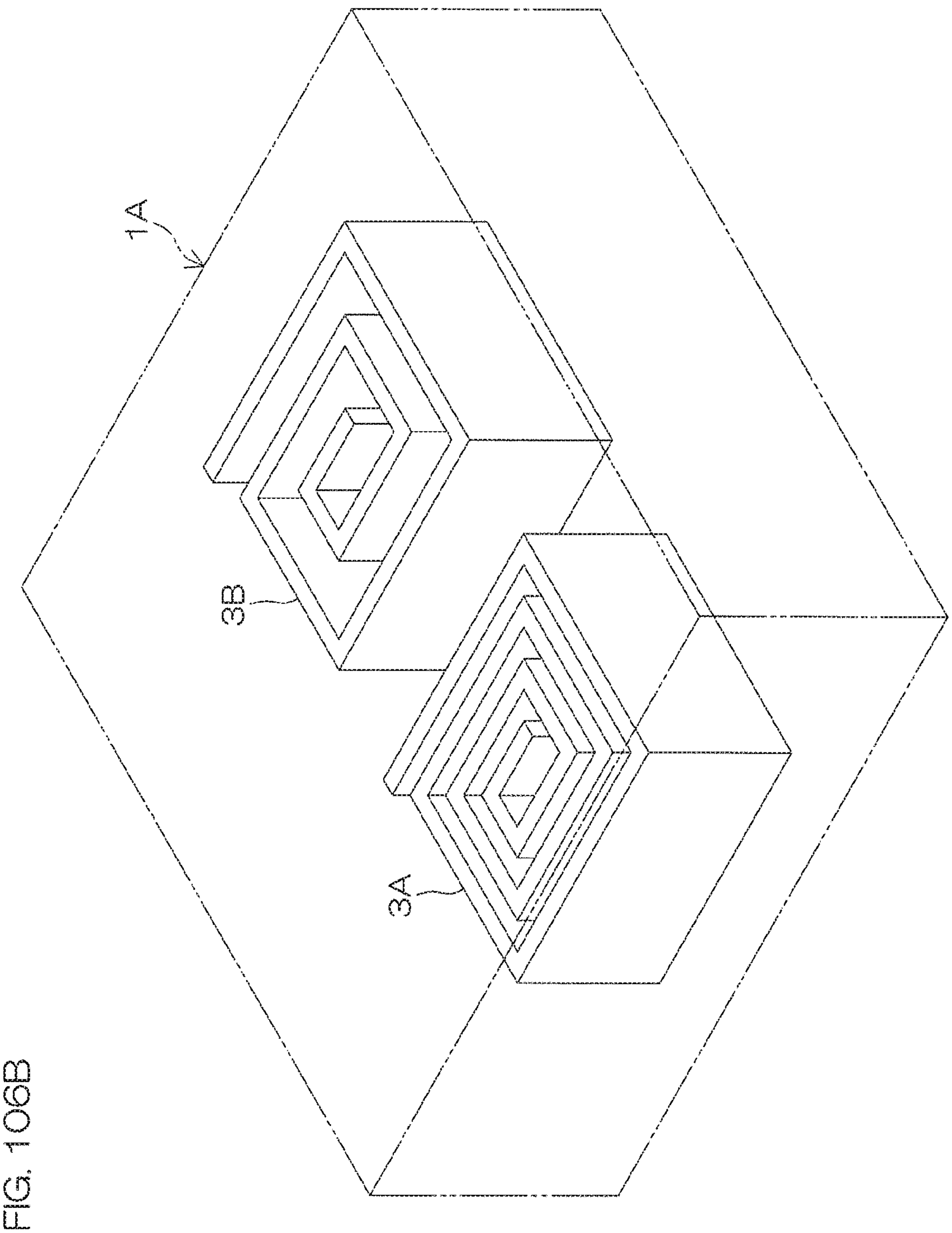

FIG. 106B is a perspective view showing a primary coil and a secondary coil formed within the chip transformer.

Figure 107A:
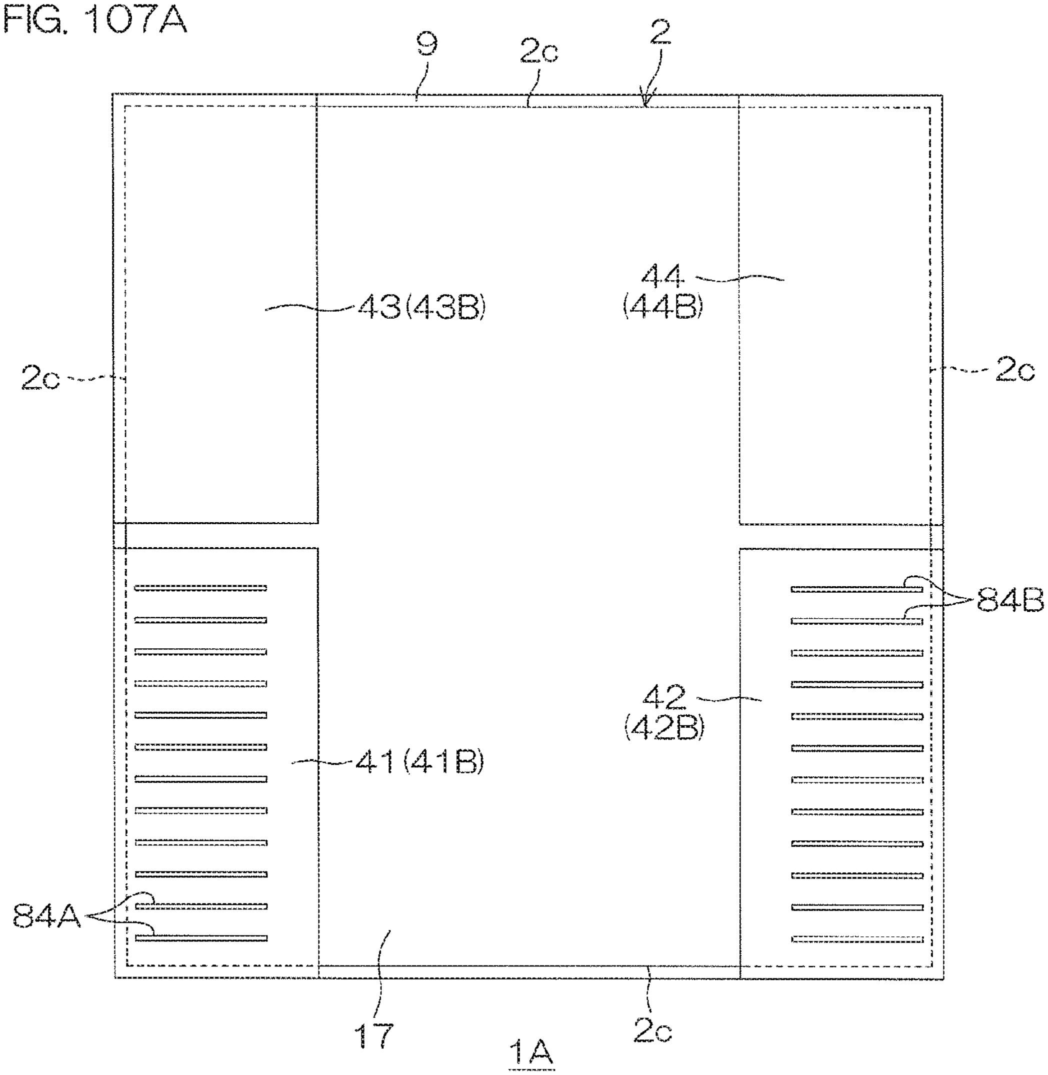

FIG. 107A is a plan view showing the appearance of the chip transformer when seen from the side of the electrode.

Figure 107B:
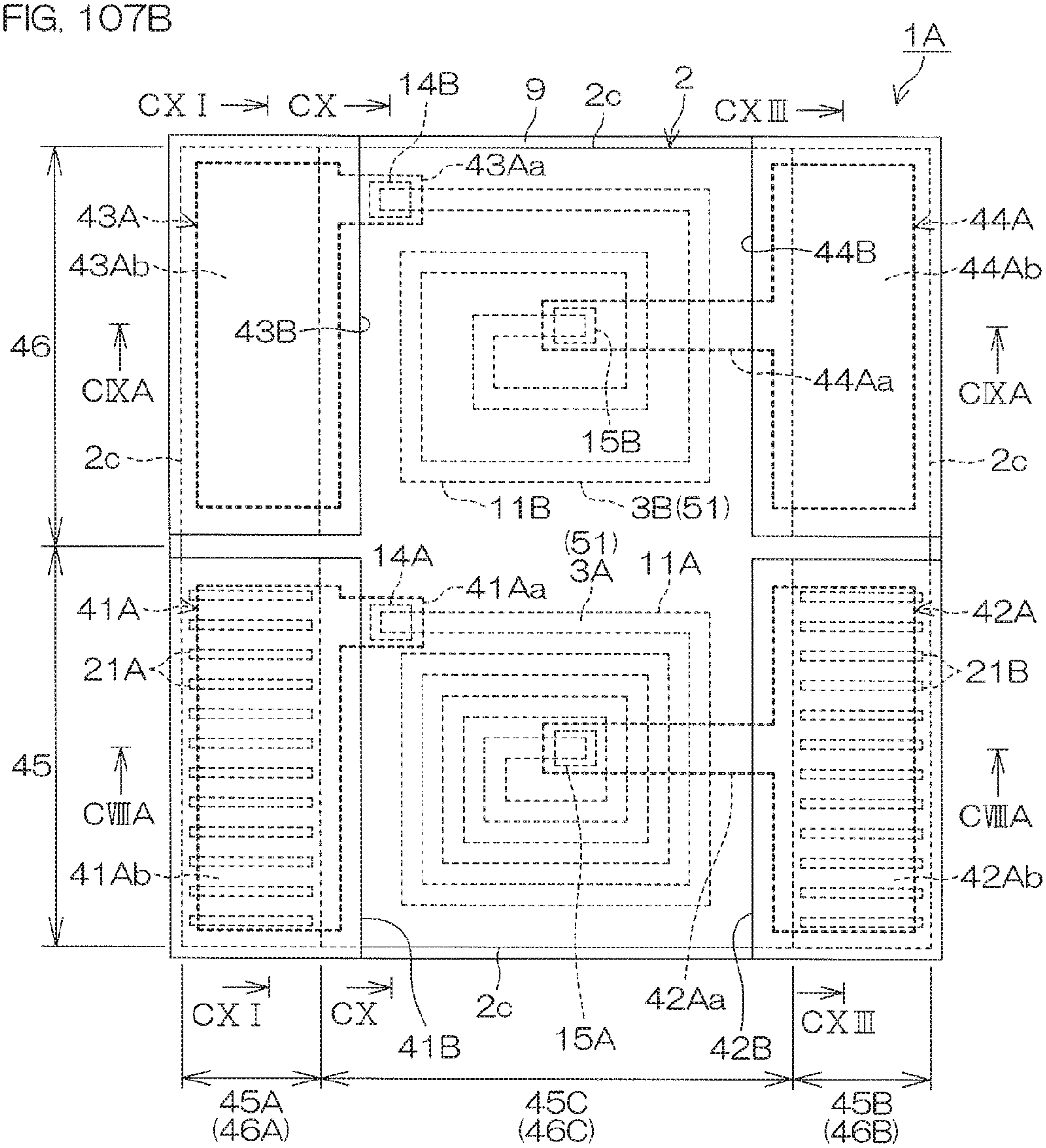

FIG. 107B is a plan view showing the internal structure of the chip transformer.

Figure 108A:
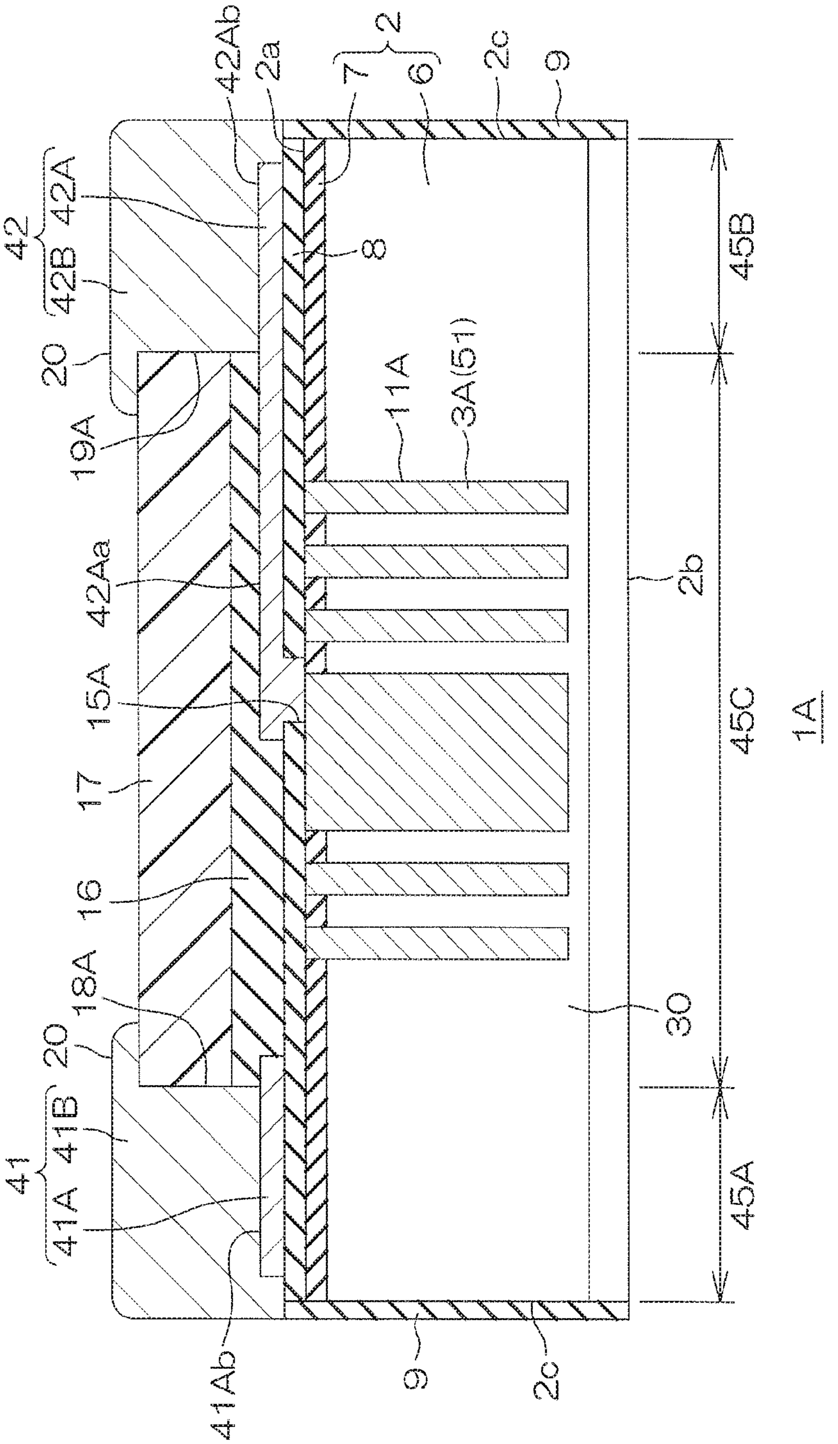

FIG. 108A is a cross-sectional view taken along line CVIIIA-CVIIIA in FIG. 107B.

Figure 108B:
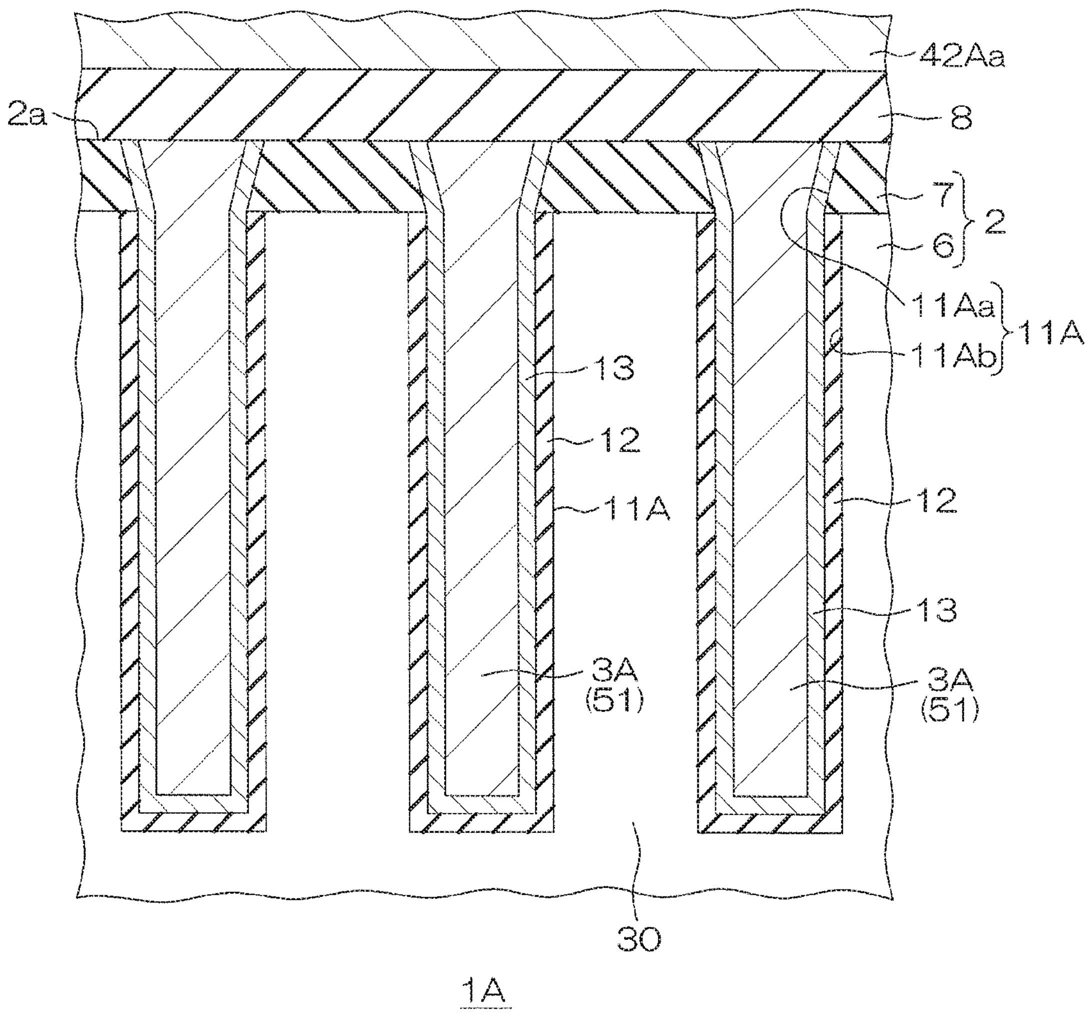

FIG. 108B is a partially enlarged cross-sectional view of FIG. 108A.

Figure 109A:
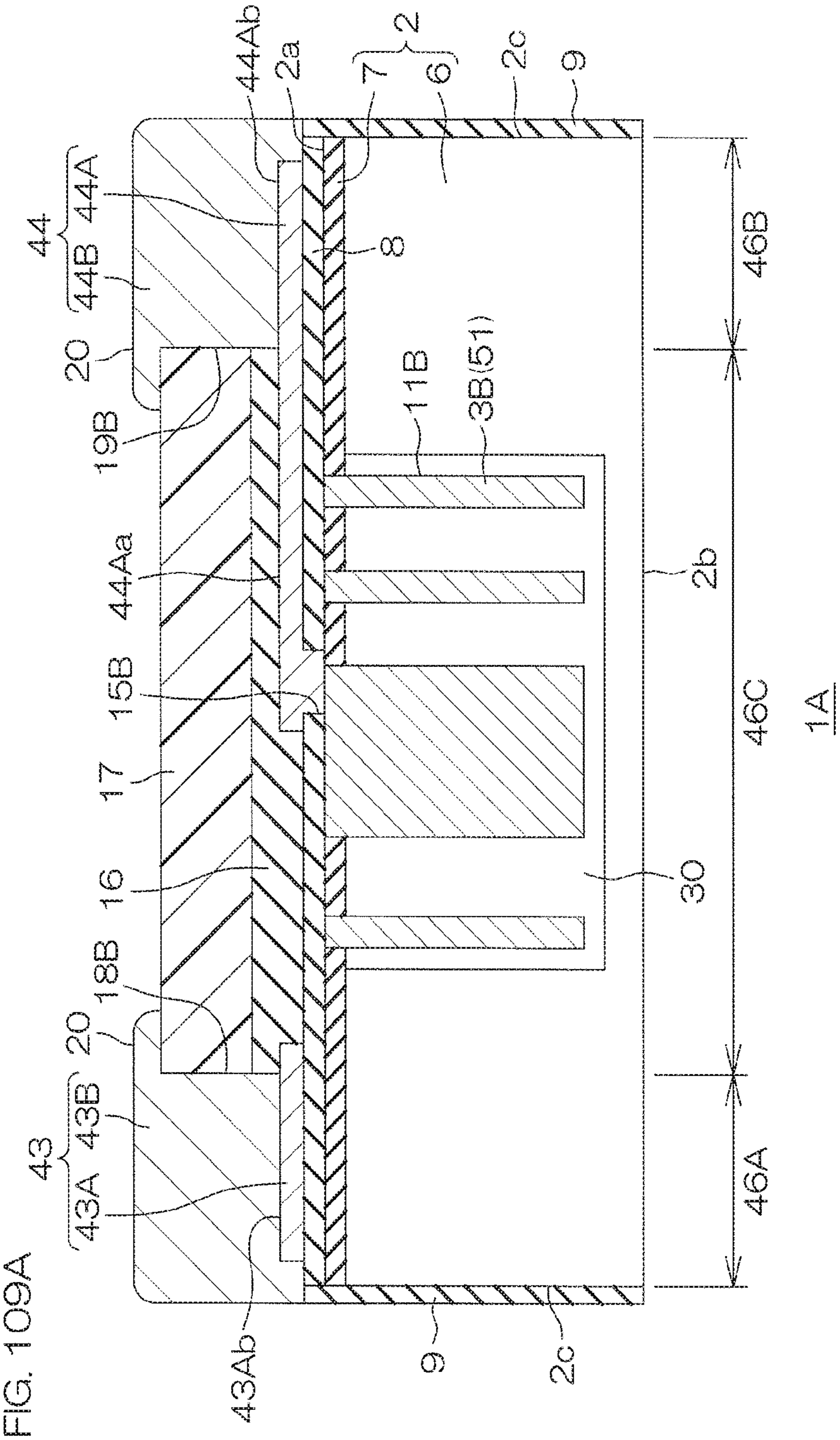

FIG. 109A is a cross-sectional view taken along line CIXA-CIXA in FIG. 107B.

Figure 109B:
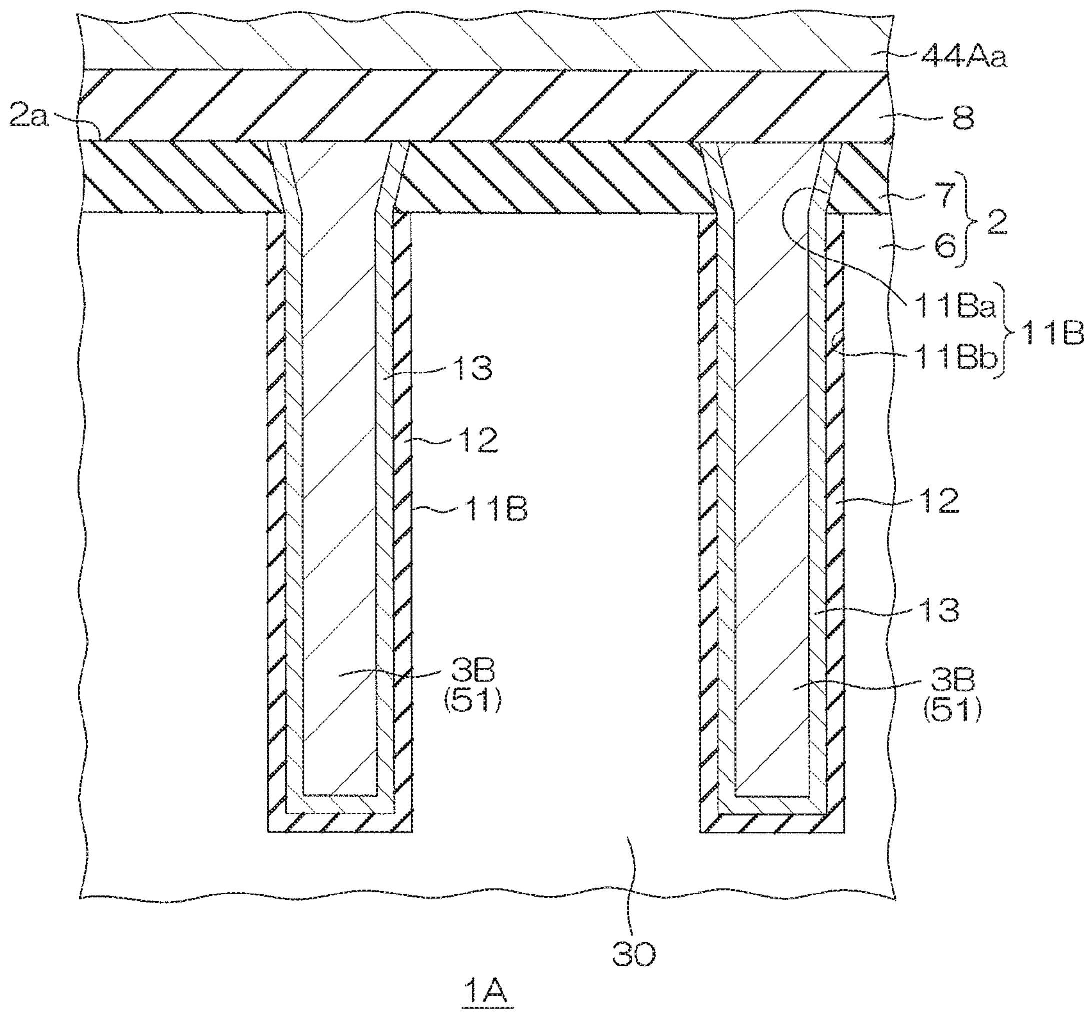

FIG. 109B is a partially enlarged cross-sectional view of FIG. 109A.

Figure 110:
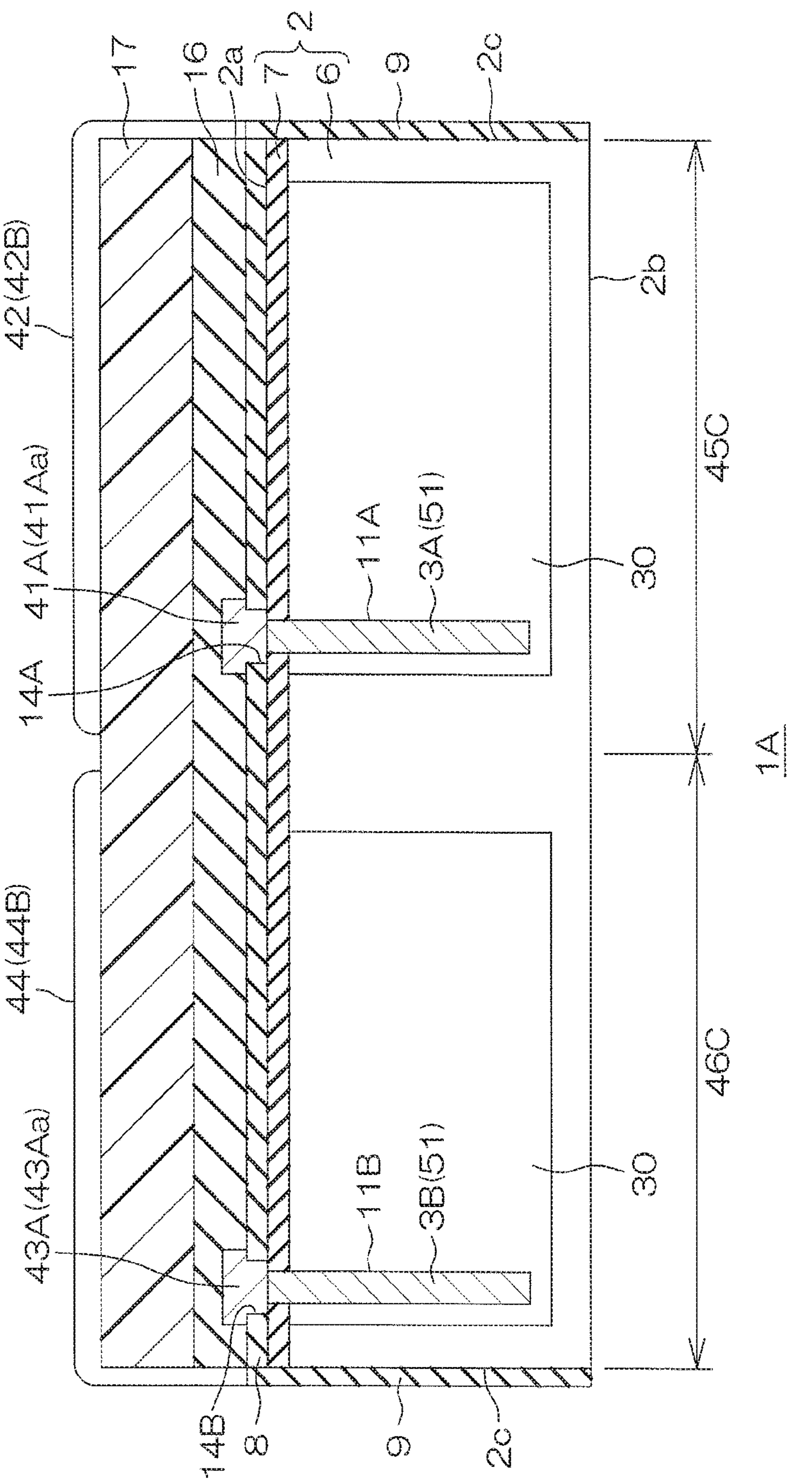

FIG. 110 is a cross-sectional view taken along line CX-CX in FIG. 107B.

Figure 111:
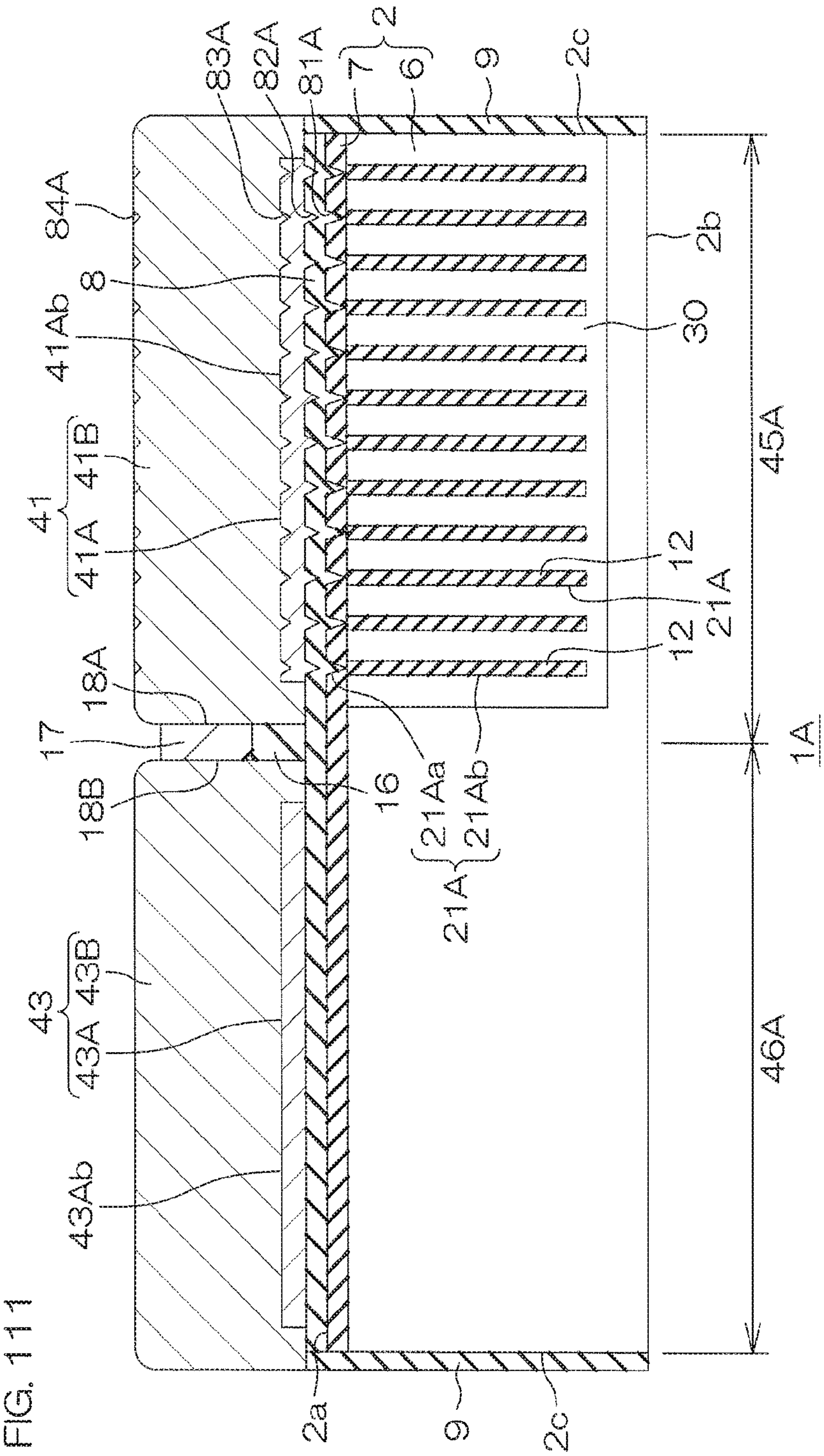

FIG. 111 is a cross-sectional view taken along line CXI-CXI in FIG. 107B.

Figure 112:
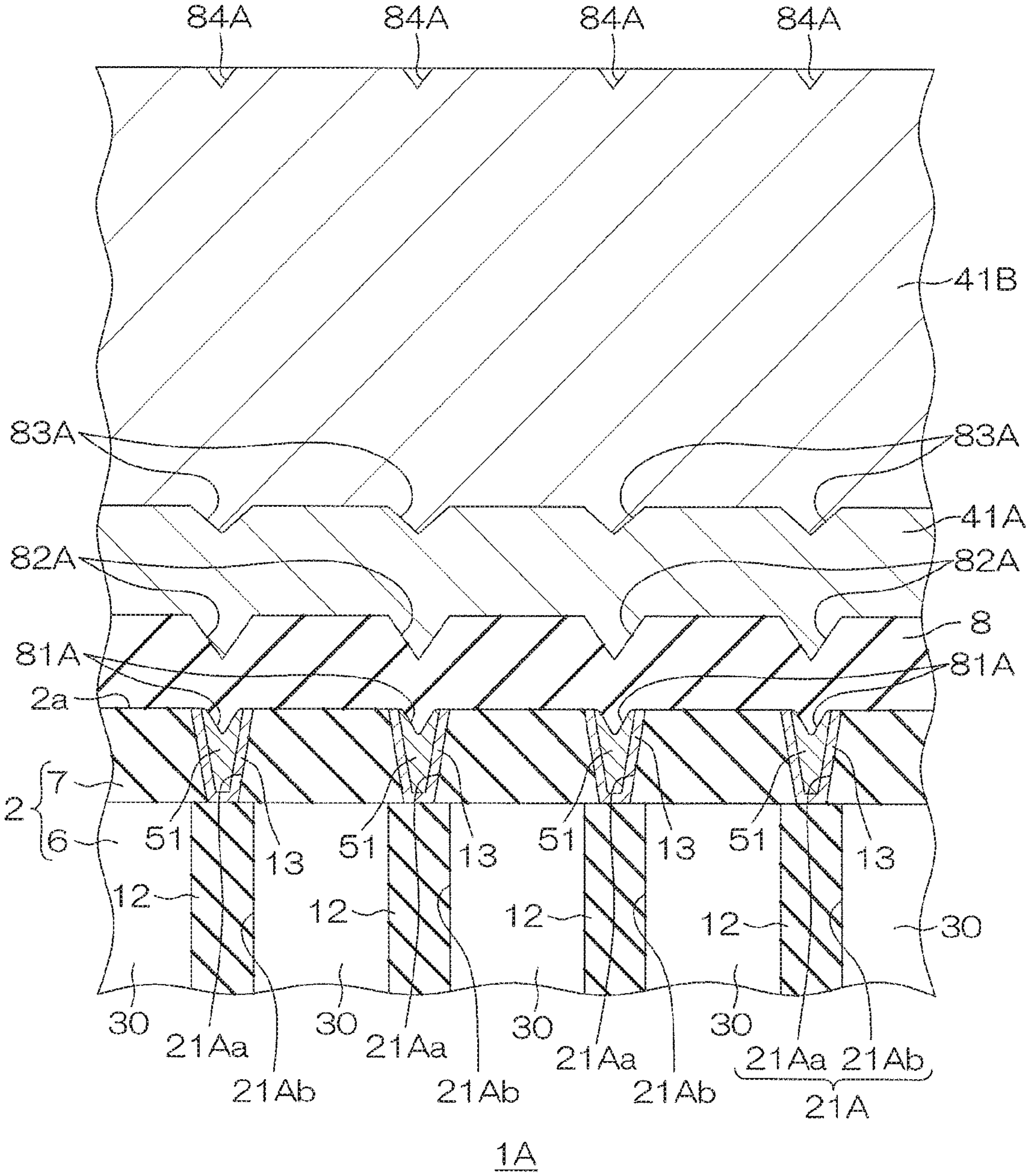

FIG. 112 is a partially enlarged cross-sectional view of FIG. 111.

Figure 113:
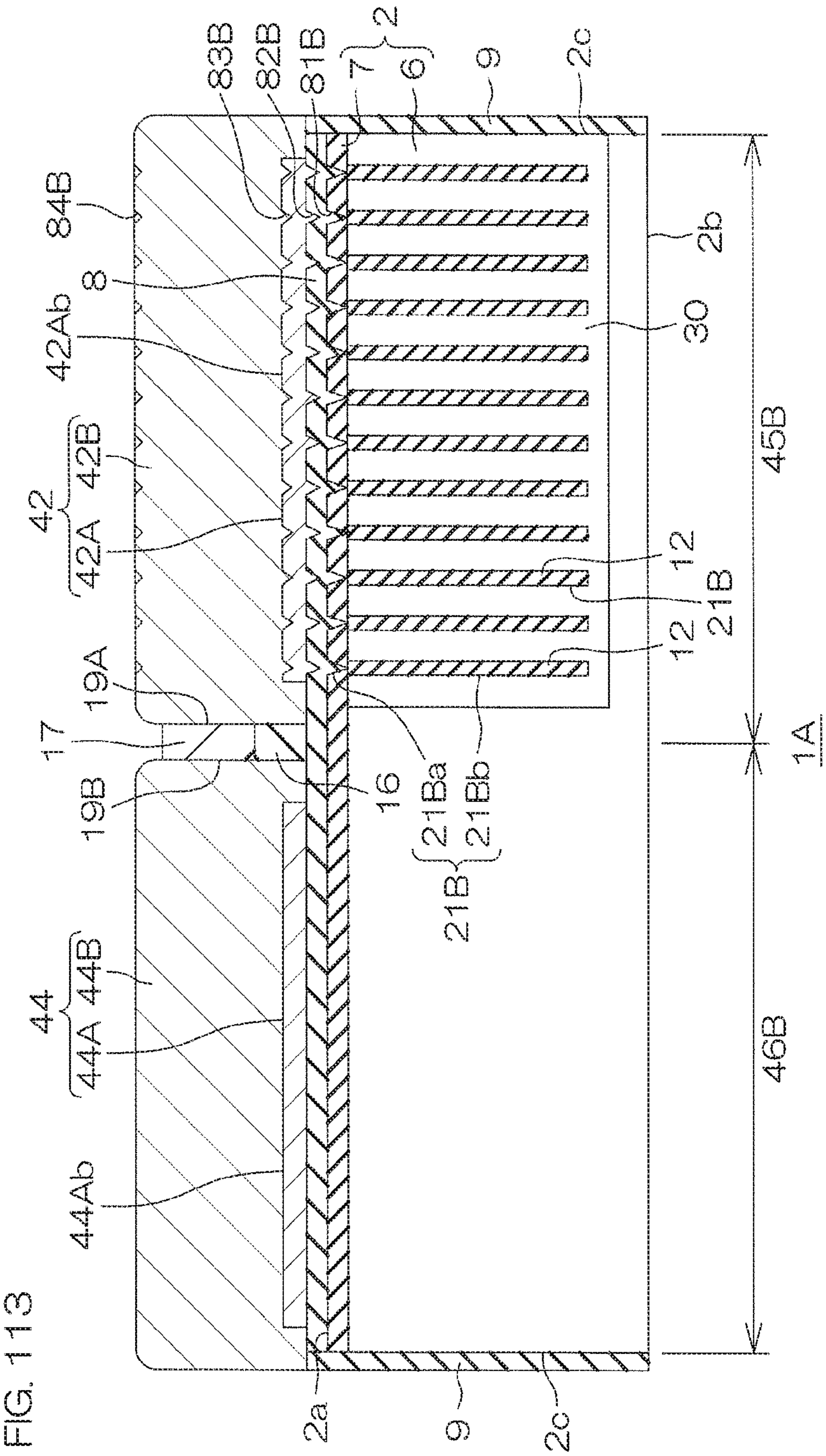

FIG. 113 is a cross-sectional view taken along line CXIII-CXIII in FIG. 107B.

Figure 114:
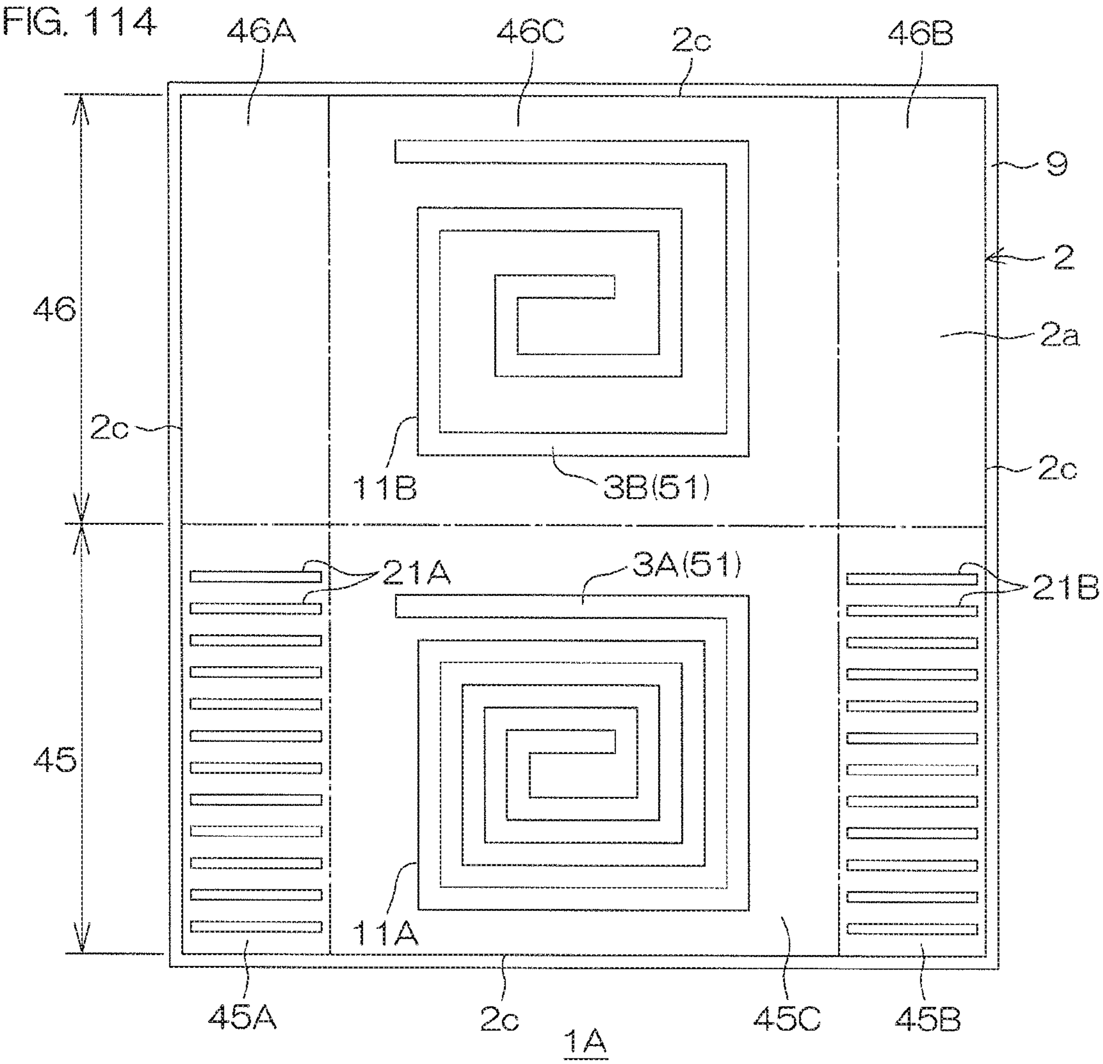

FIG. 114 is a plan view showing a structure of the surface of a substrate by removing an arrangement formed on the surface of the substrate.

Figure 115:
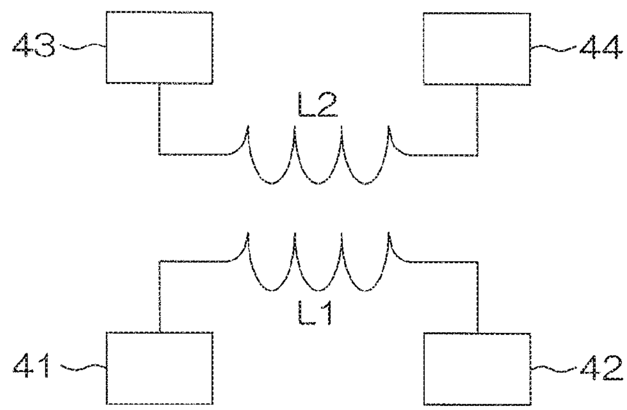

FIG. 115 is an electrical circuit diagram showing an electrical structure within the chip transformer.

Figure 116:
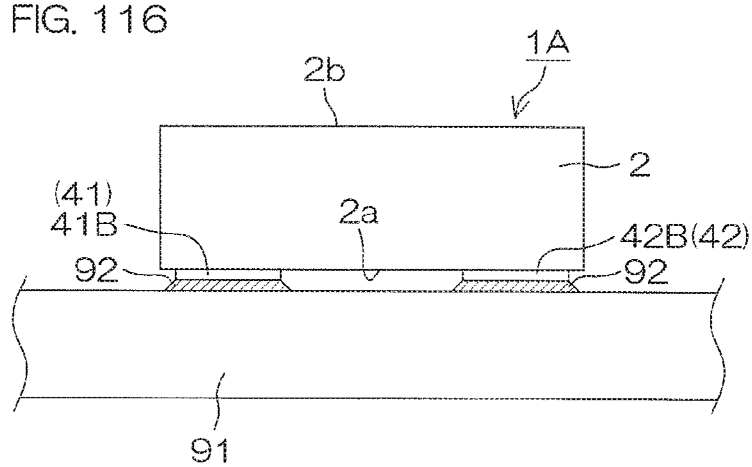

FIG. 116 is a cross-sectional view showing the structure of a circuit assembly in which the chip transformer is flip-chip connected on the mounting substrate.

Figure 117A:
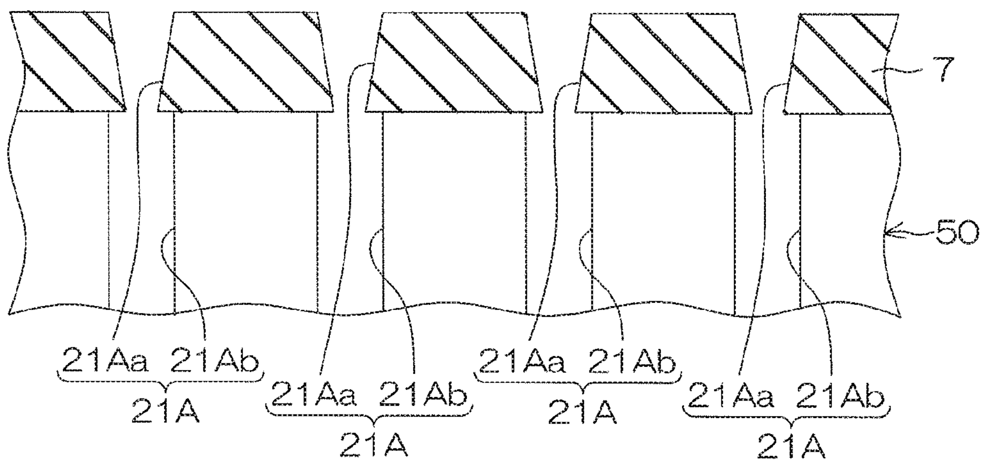

FIG. 117A is an enlarged cross-sectional view showing the details of the manufacturing step of a first concave portion.

Figure 117B:
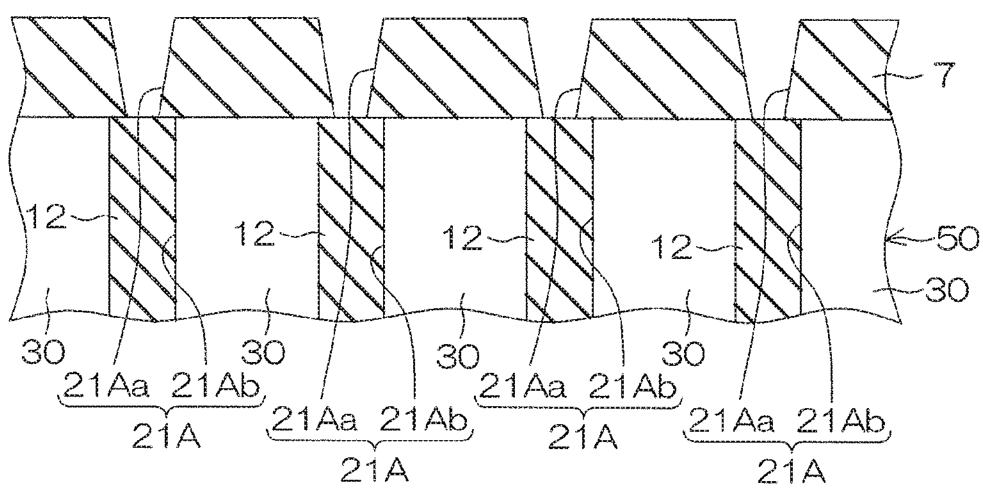

FIG. 117B is a cross-sectional view showing the step subsequent to FIG. 117A.

Figure 117C:
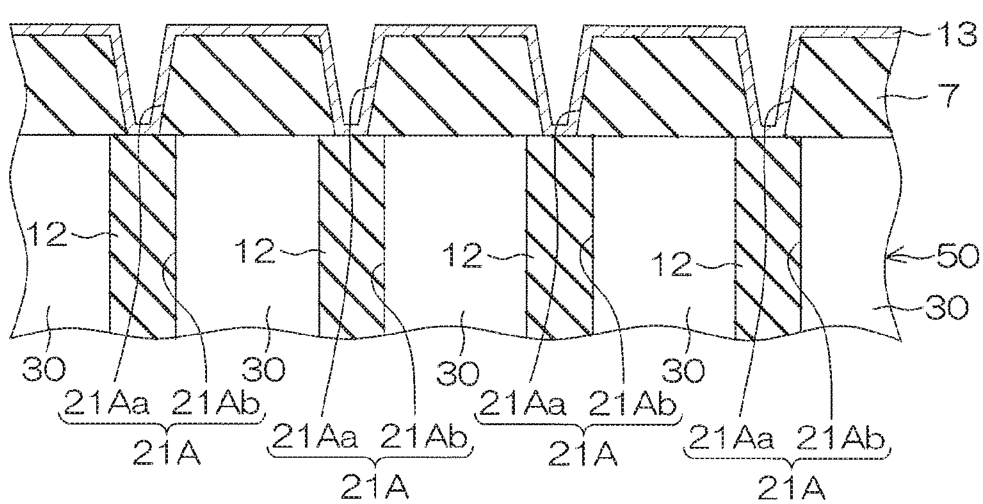

FIG. 117C is a cross-sectional view showing the step subsequent to FIG. 117B.

Figure 117D:
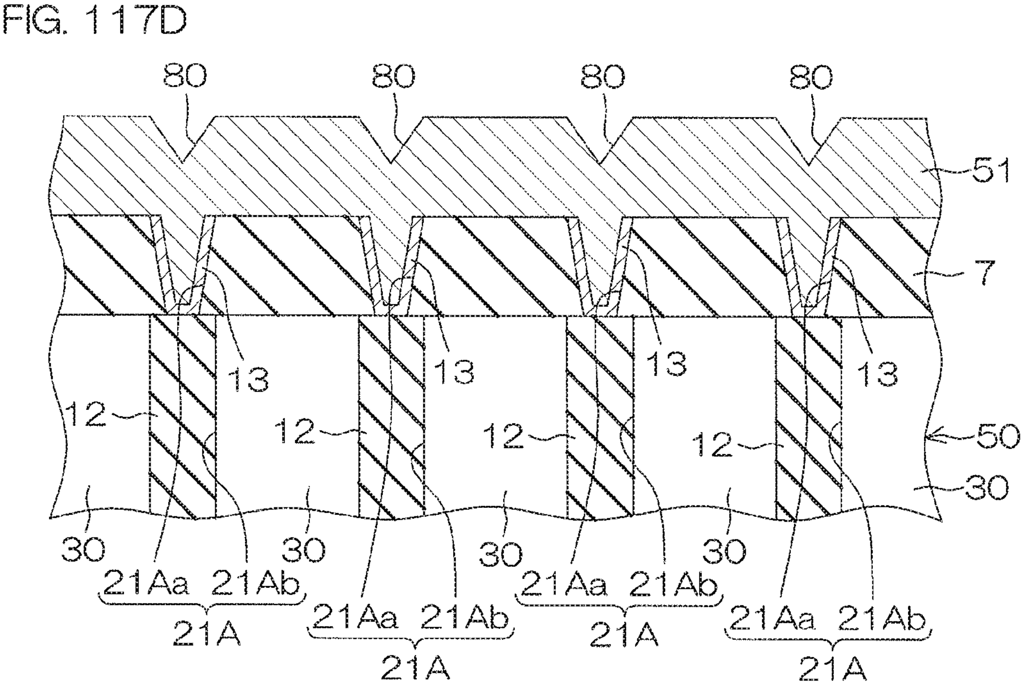

FIG. 117D is a cross-sectional view showing the step subsequent to FIG. 117C.

Figure 117E:
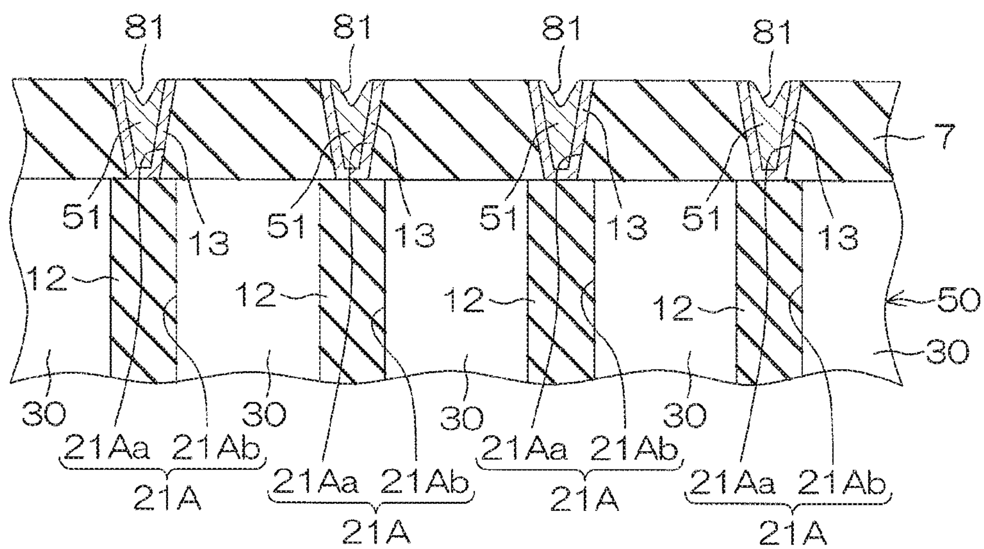

FIG. 117E is a cross-sectional view showing the step subsequent to FIG. 117D.

Figure 117F:
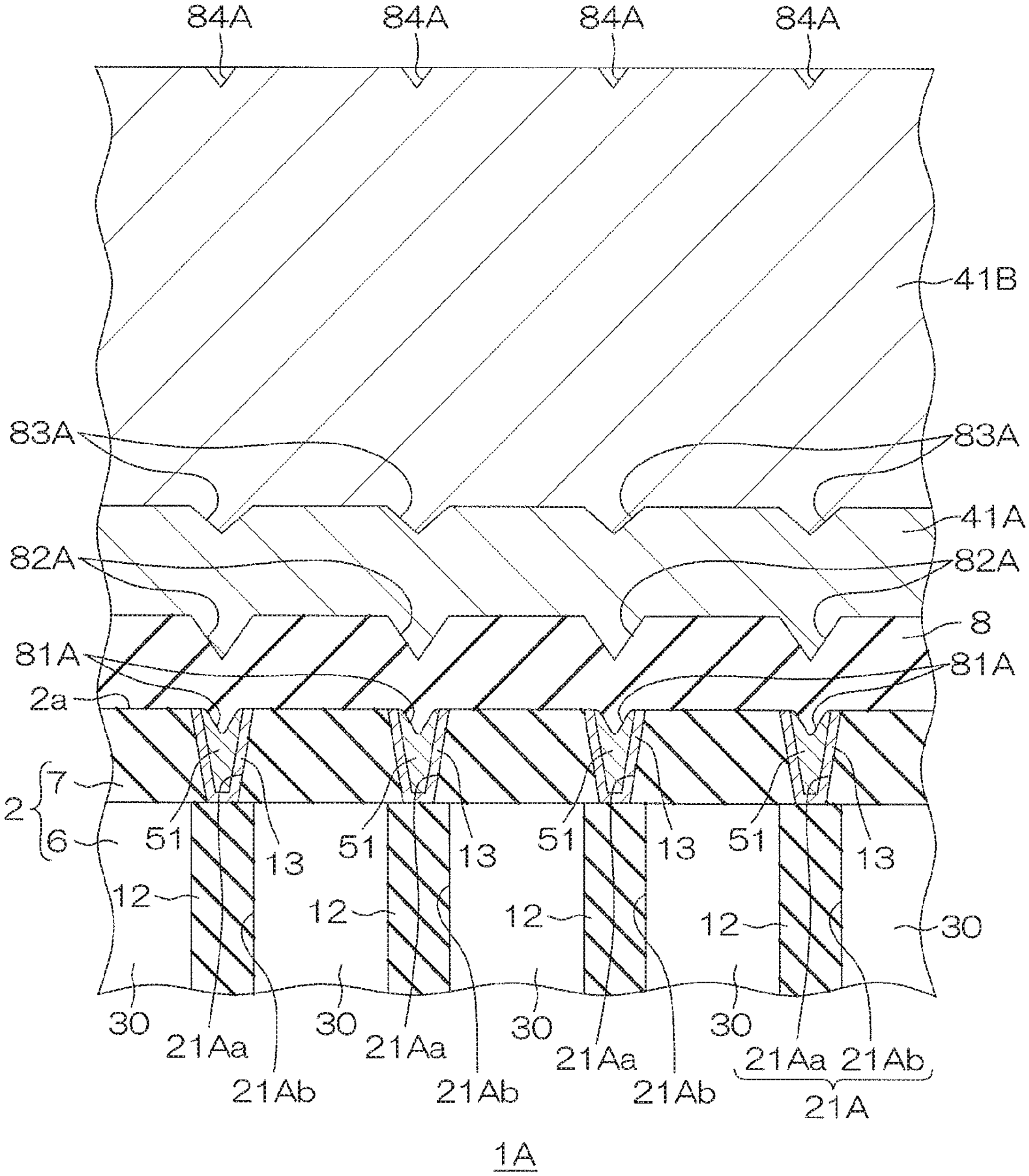

FIG. 117F is a cross-sectional view showing the step subsequent to FIG. 117E.

Figure 118:
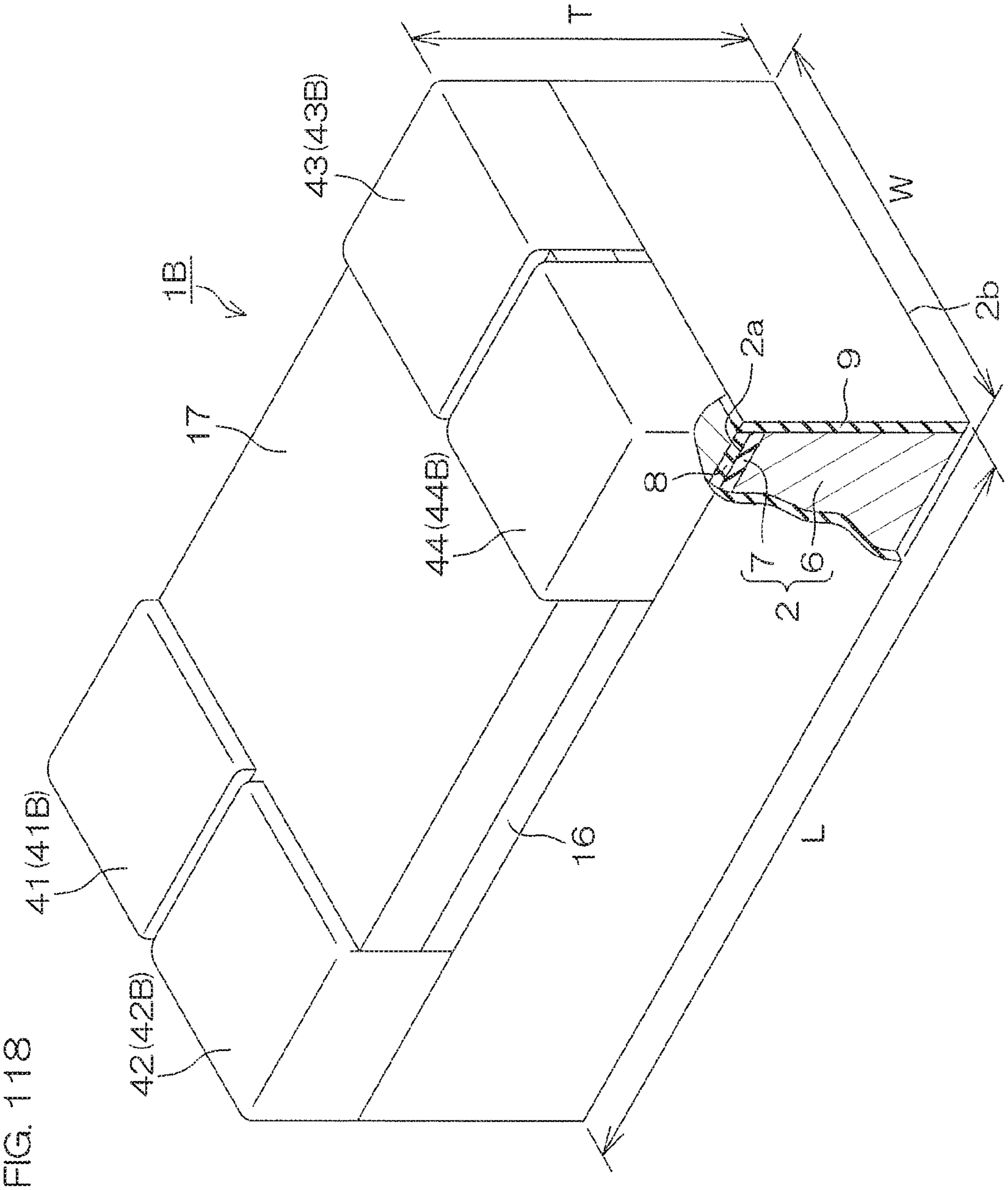

FIG. 118 is a partially cut perspective view of a chip transformer according to a third preferred embodiment of the fourth invention.

Figure 119:
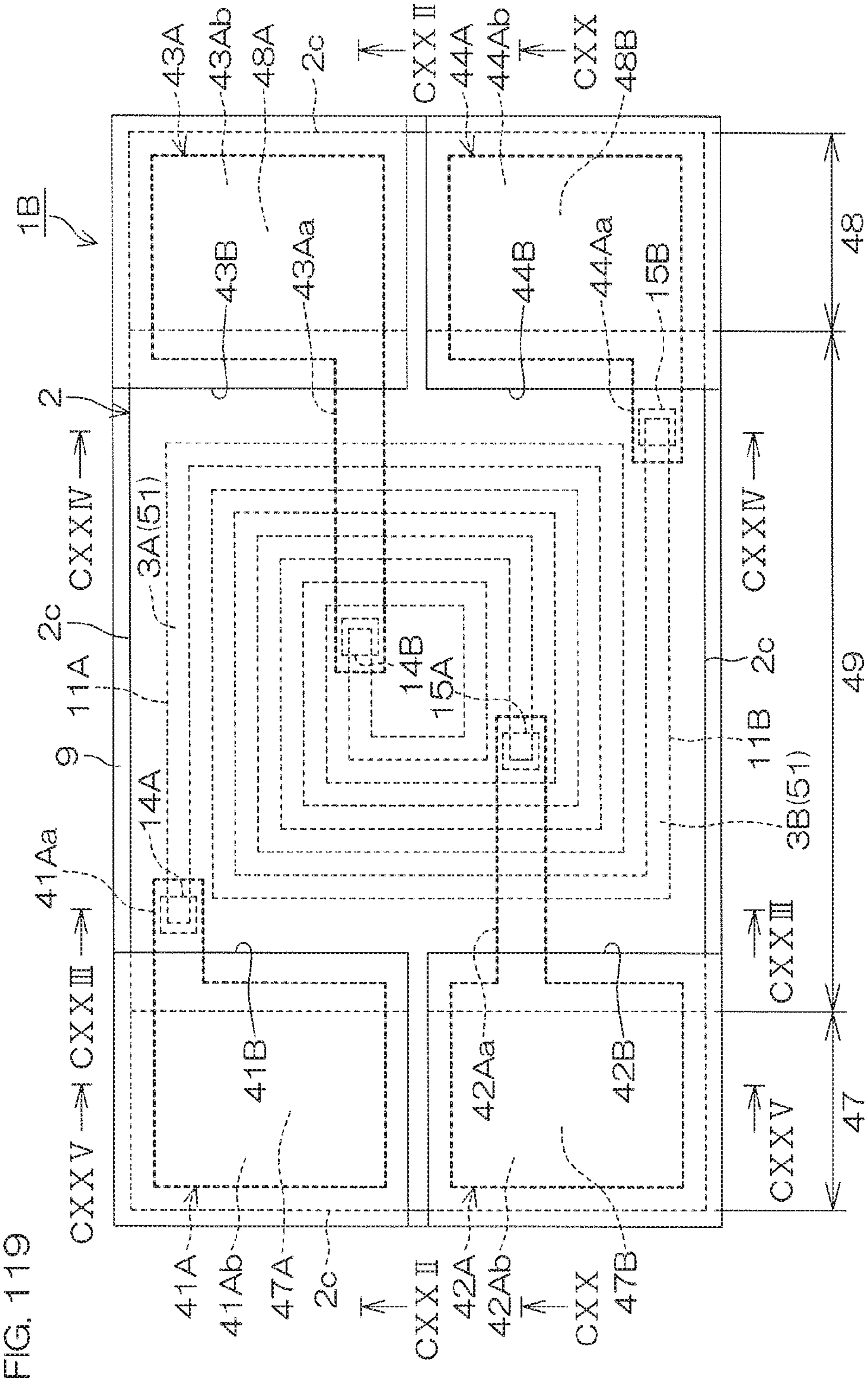

FIG. 119 is a plan view of a chip transformer.

Figure 120:
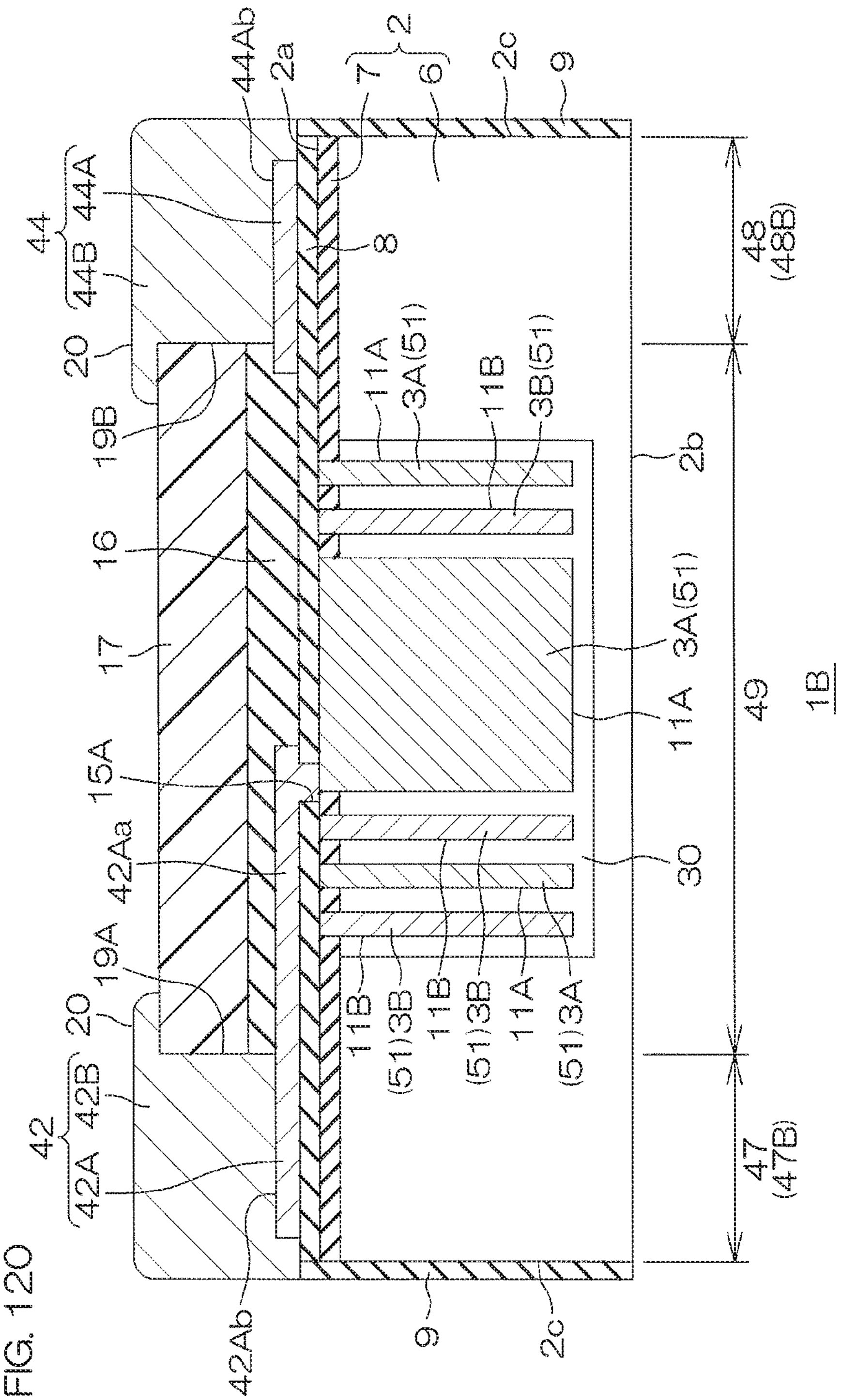

FIG. 120 is a cross-sectional view taken along line CXX-CXX in FIG. 119.

Figure 121:
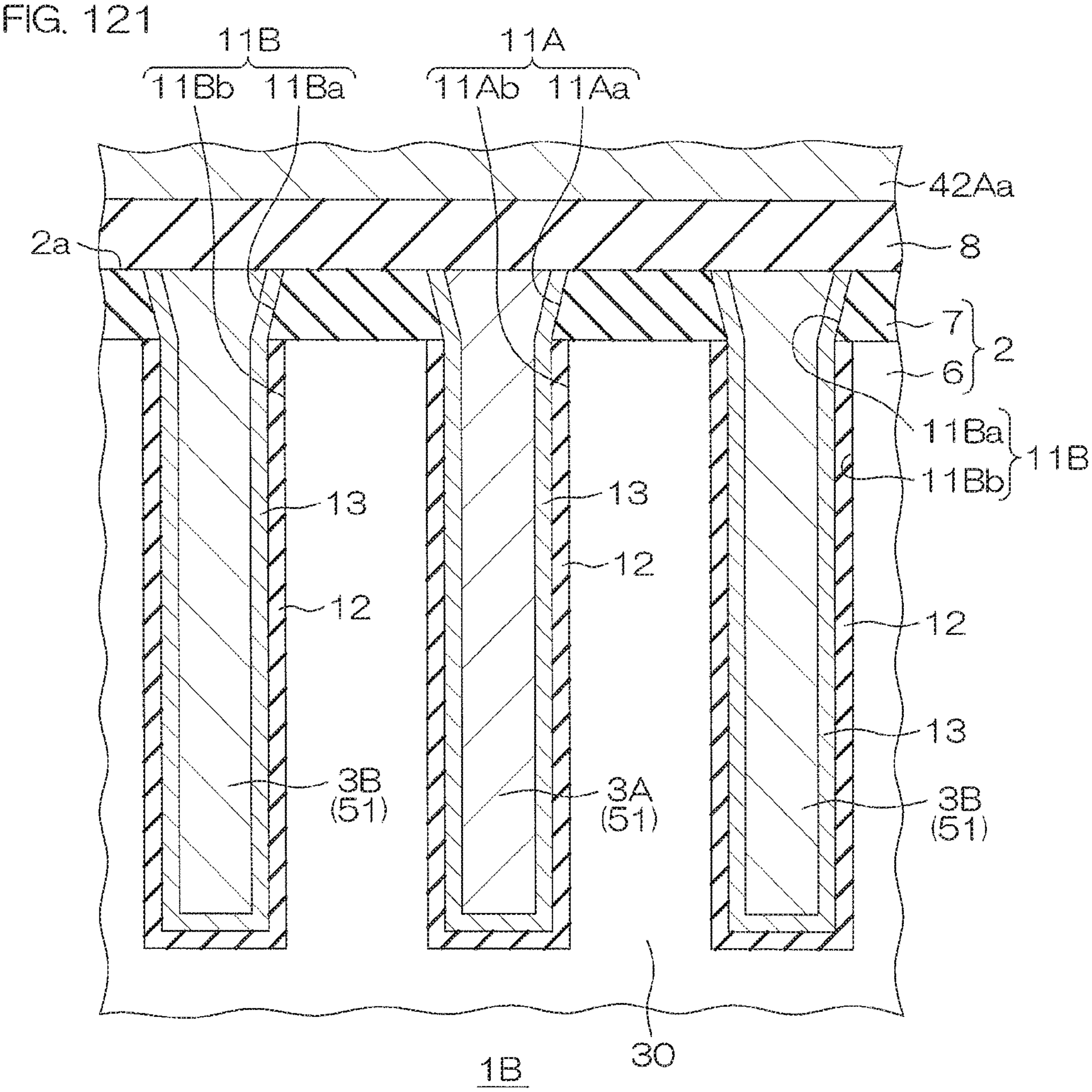

FIG. 121 is a partially enlarged cross-sectional view of FIG. 120.

Figure 122:
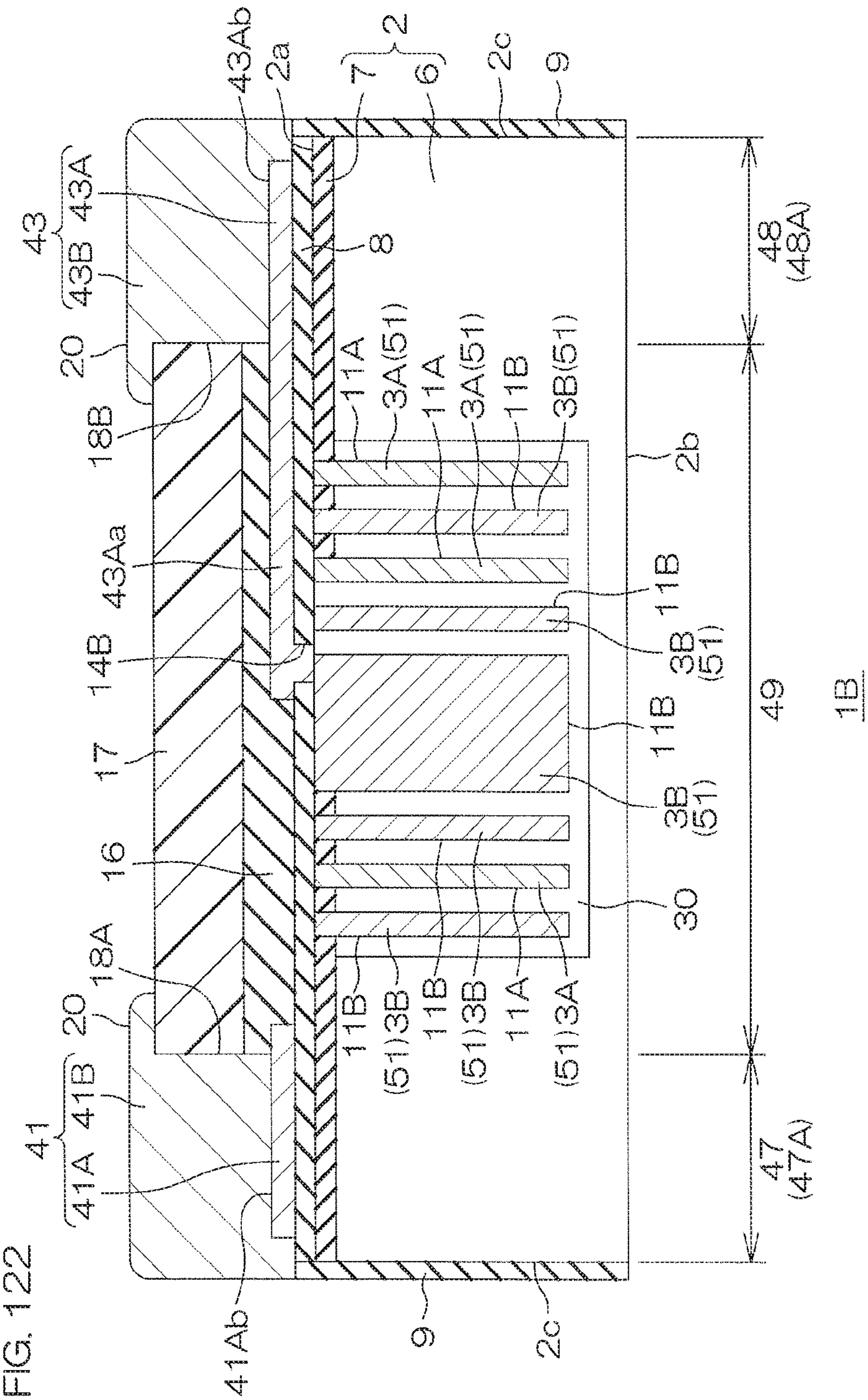

FIG. 122 is a cross-sectional view taken along line CXXII-CXXII in FIG. 119.

Figure 123:
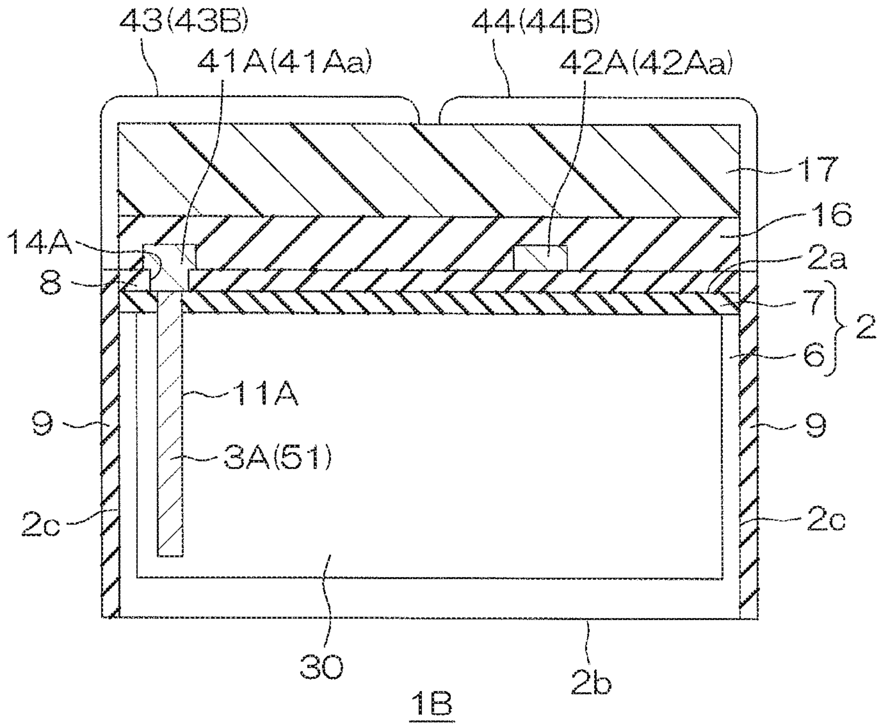

FIG. 123 is a cross-sectional view taken along line CXXIII-CXXIII in FIG. 119.

Figure 124:
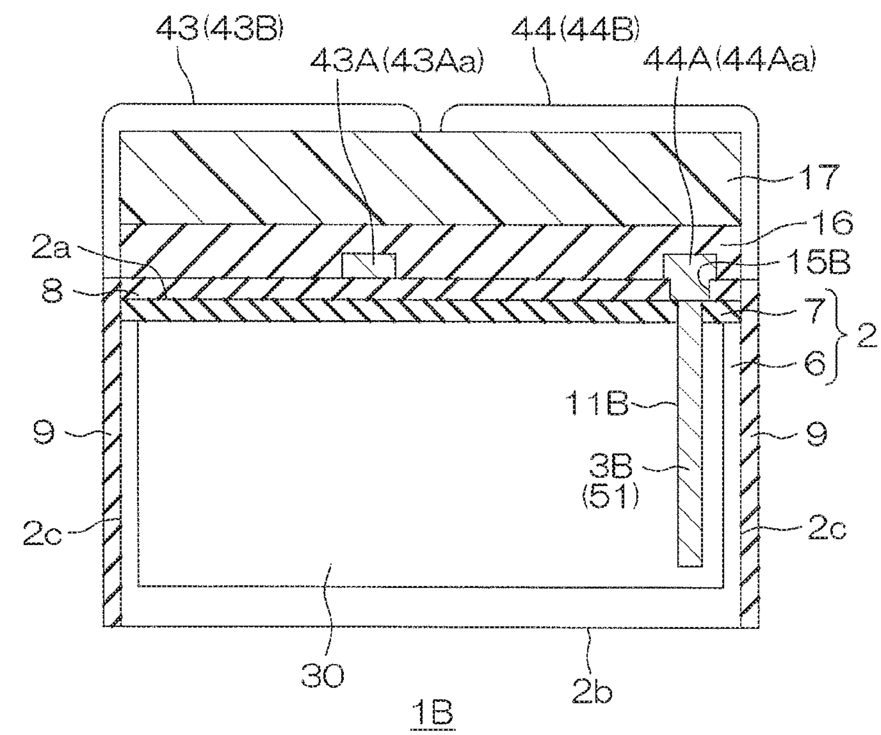

FIG. 124 is a cross-sectional view taken along line CXXIV-CXXIV in FIG. 119.

Figure 125:
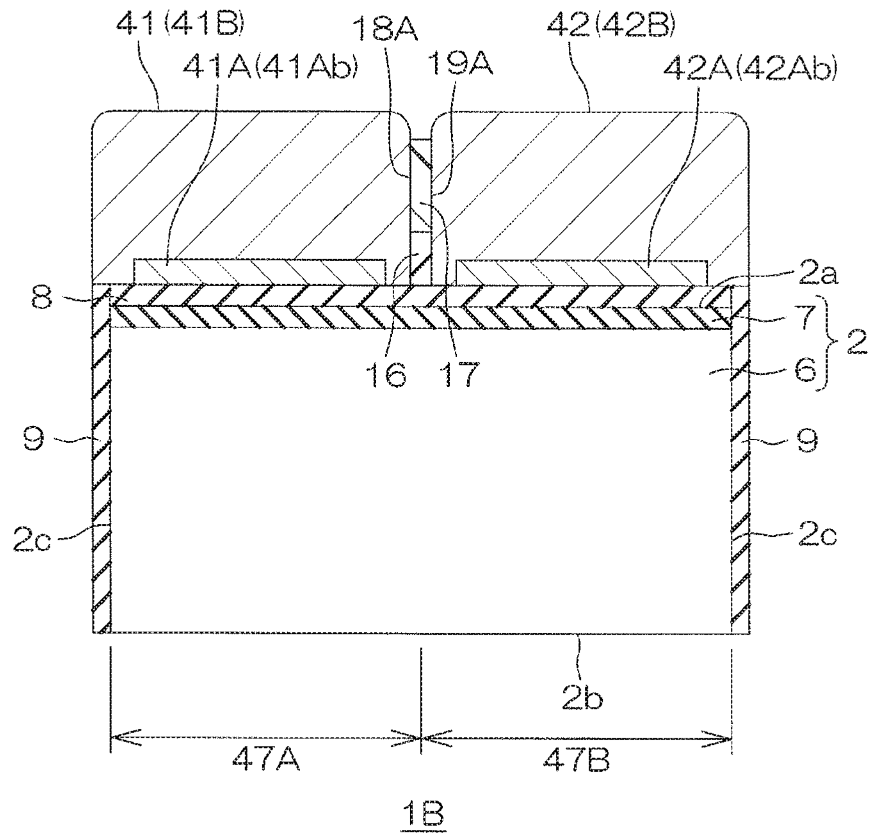

FIG. 125 is a cross-sectional view taken along line CXXV-CXXV in FIG. 119.

Figure 126:
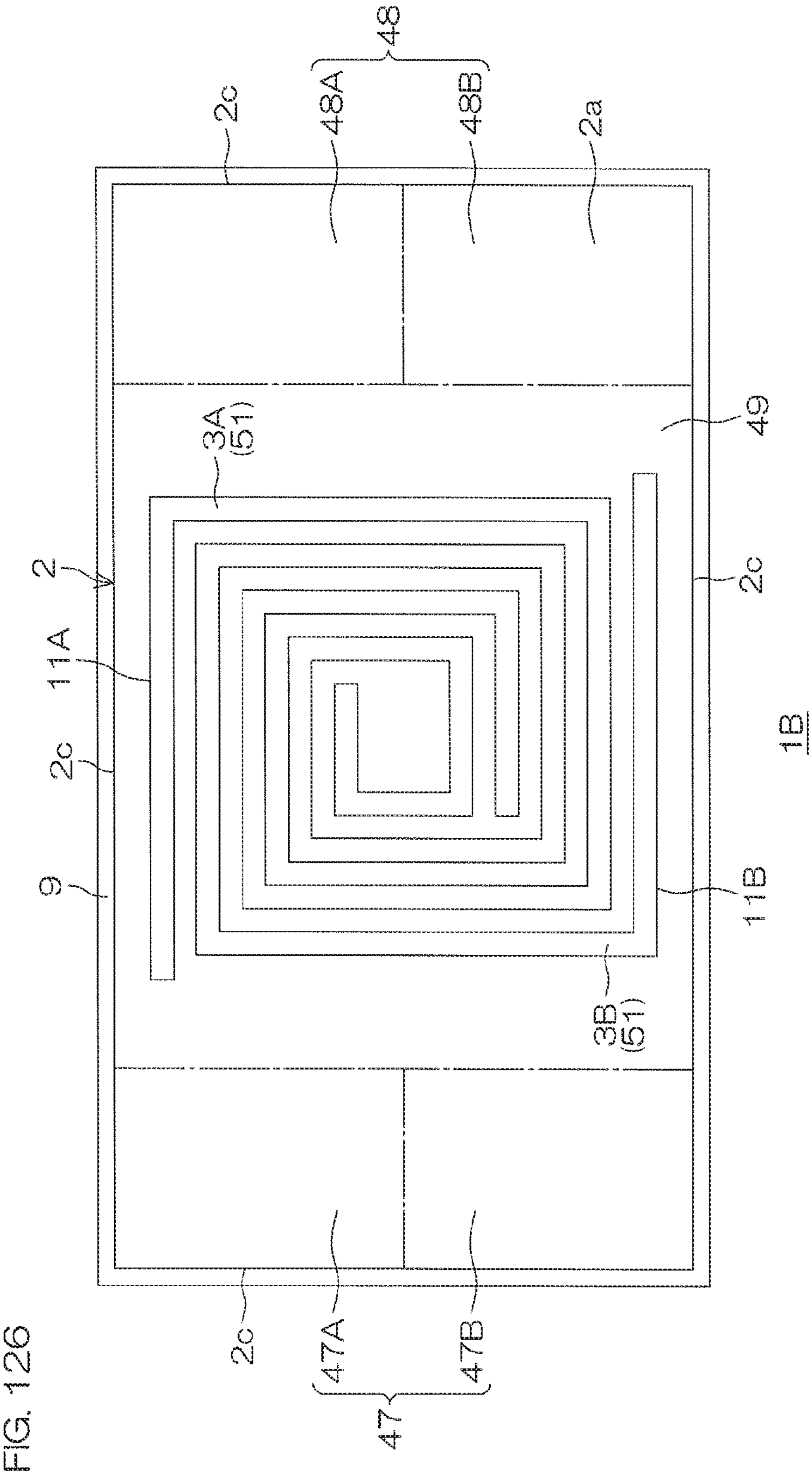

FIG. 126 is a plan view showing a structure of the surface of a substrate by removing an arrangement formed on the surface of the substrate.

Figure 127:
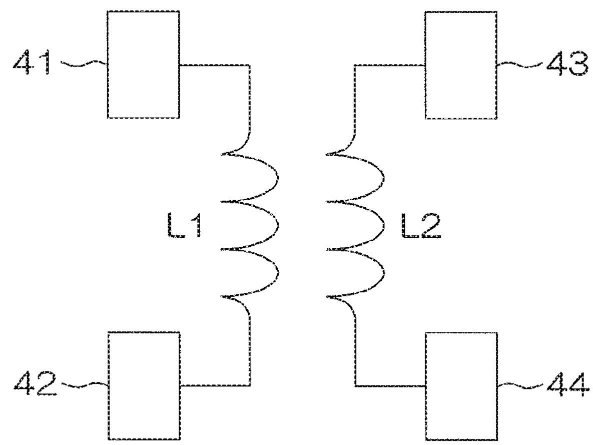

FIG. 127 is an electrical circuit diagram showing an electrical structure within the chip transformer.

Figure 128:
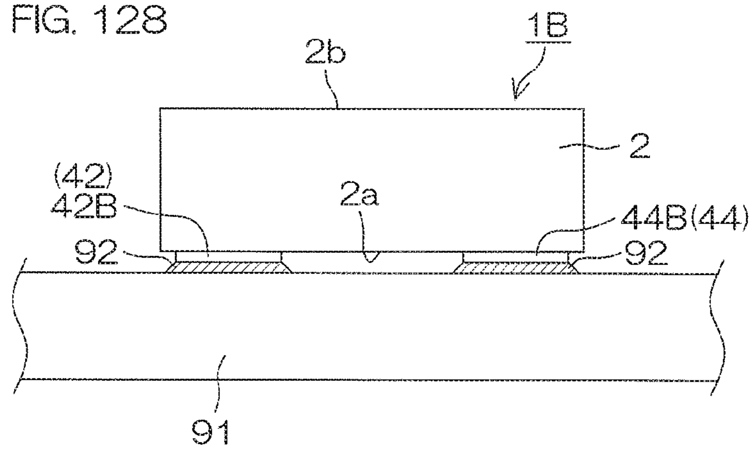

FIG. 128 is a cross-sectional view showing the structure of a circuit assembly in which the chip transformer is flip-chip connected on the mounting substrate.

Figure 129A:
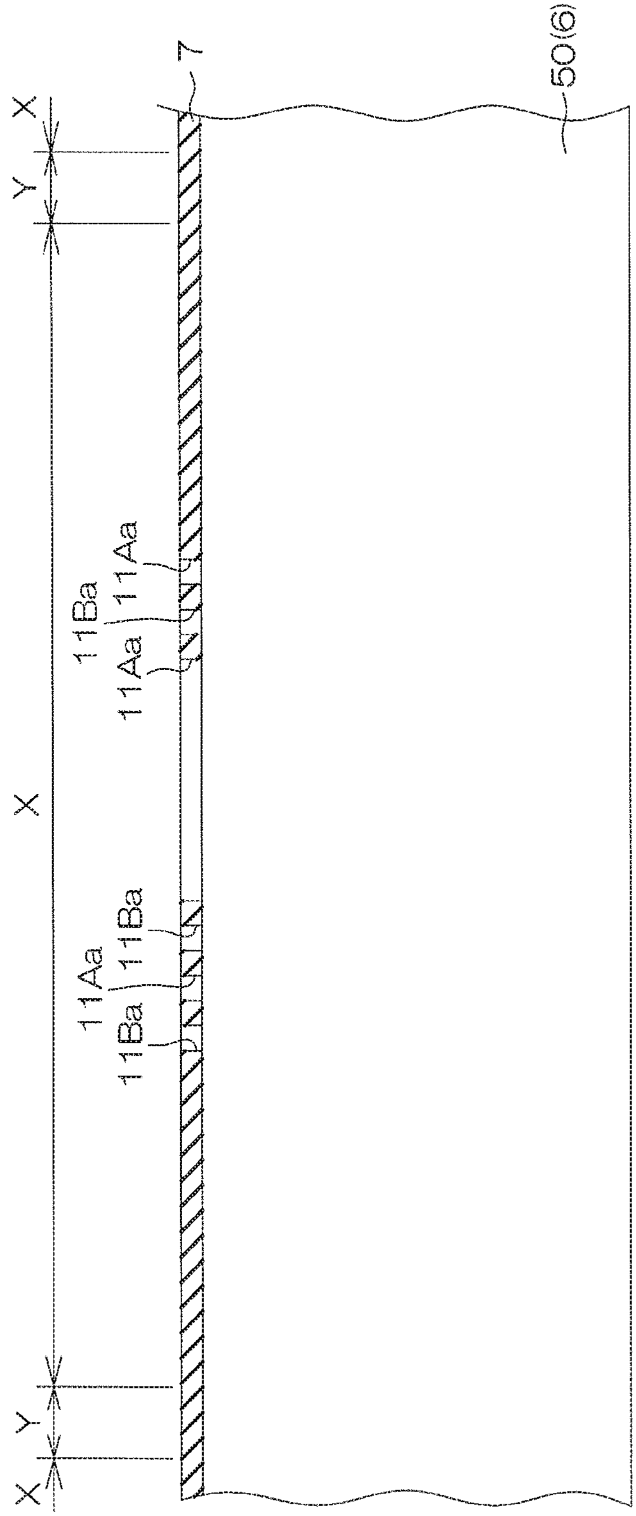

FIG. 129A is a cross-sectional view for illustrating an example of the manufacturing step of the chip transformer, and is a cut surface corresponding to FIG. 120.

Figure 129B:
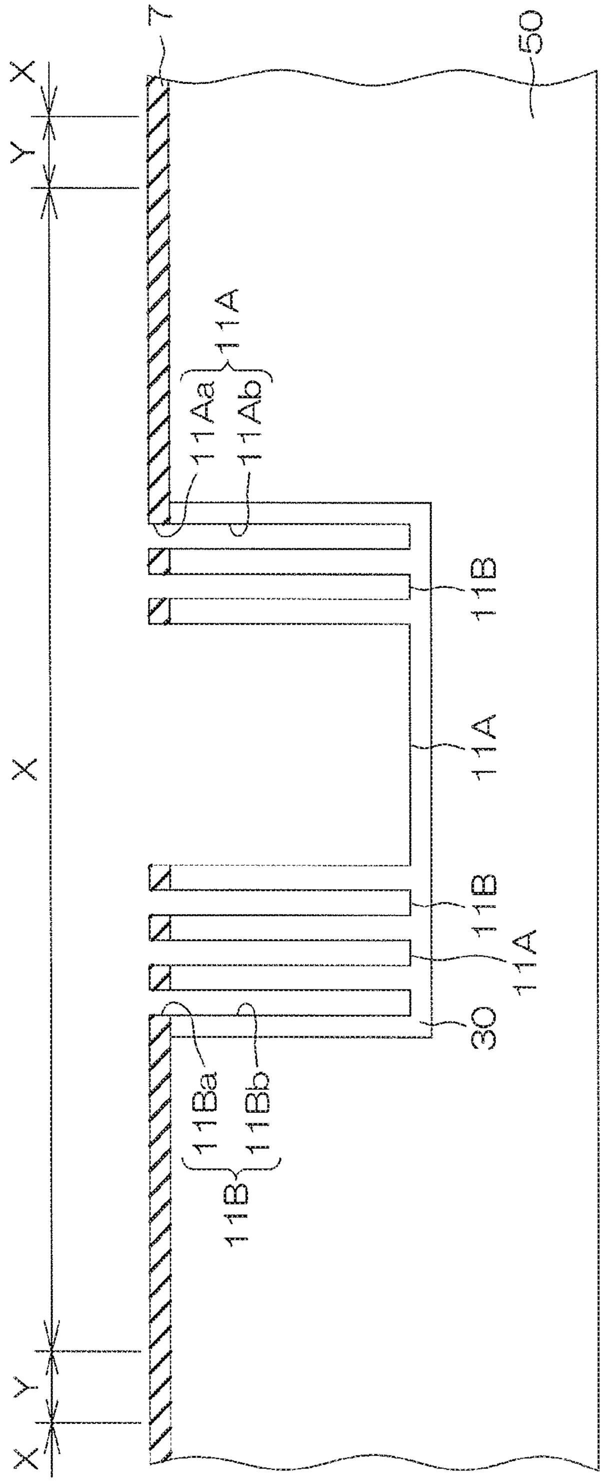

FIG. 129B is a cross-sectional view showing the step subsequent to FIG. 129A.

Figure 129C:
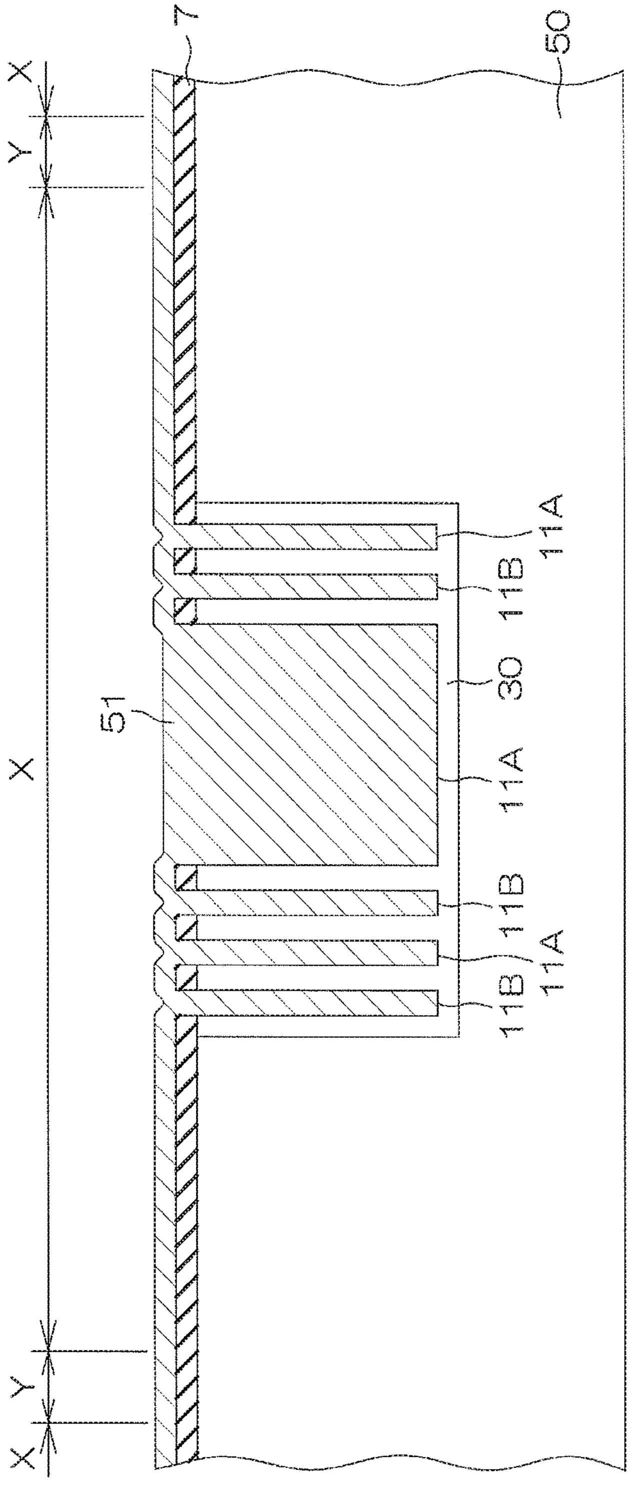

FIG. 129C is a cross-sectional view showing the step subsequent to FIG. 129B.

Figure 129D:
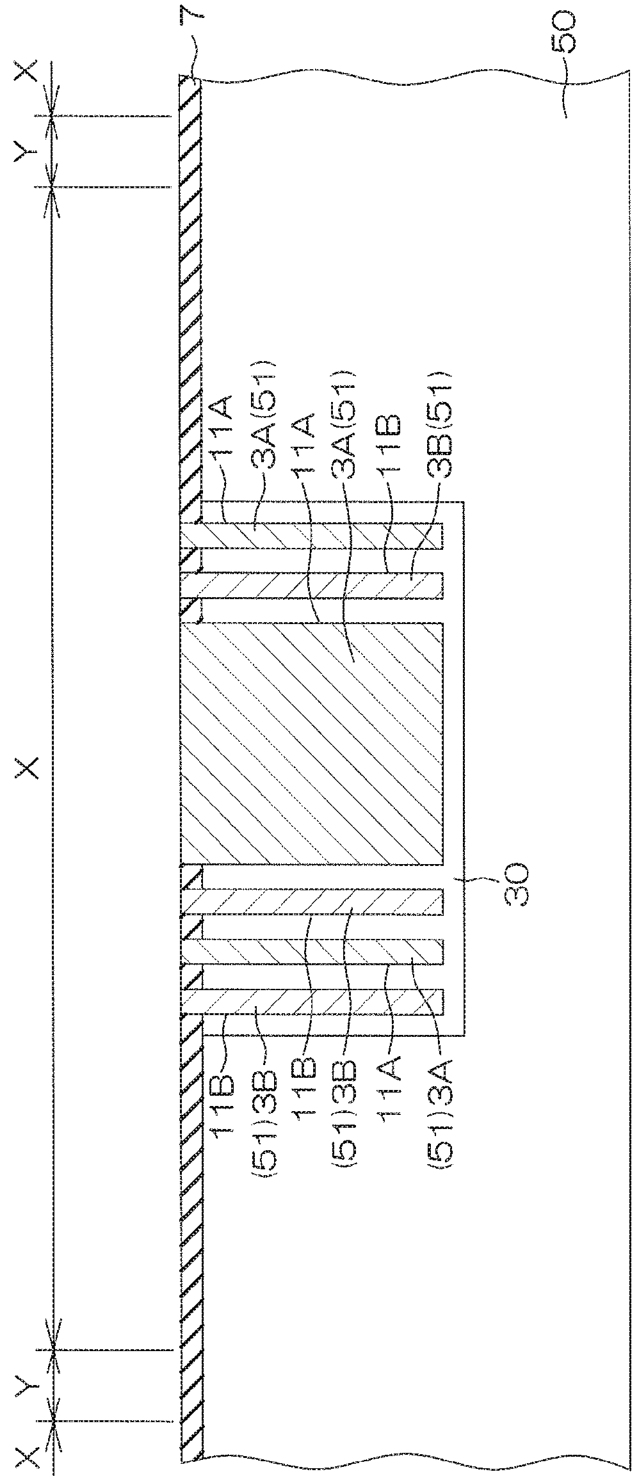

FIG. 129D is a cross-sectional view showing the step subsequent to FIG. 129C.

Figure 129E:
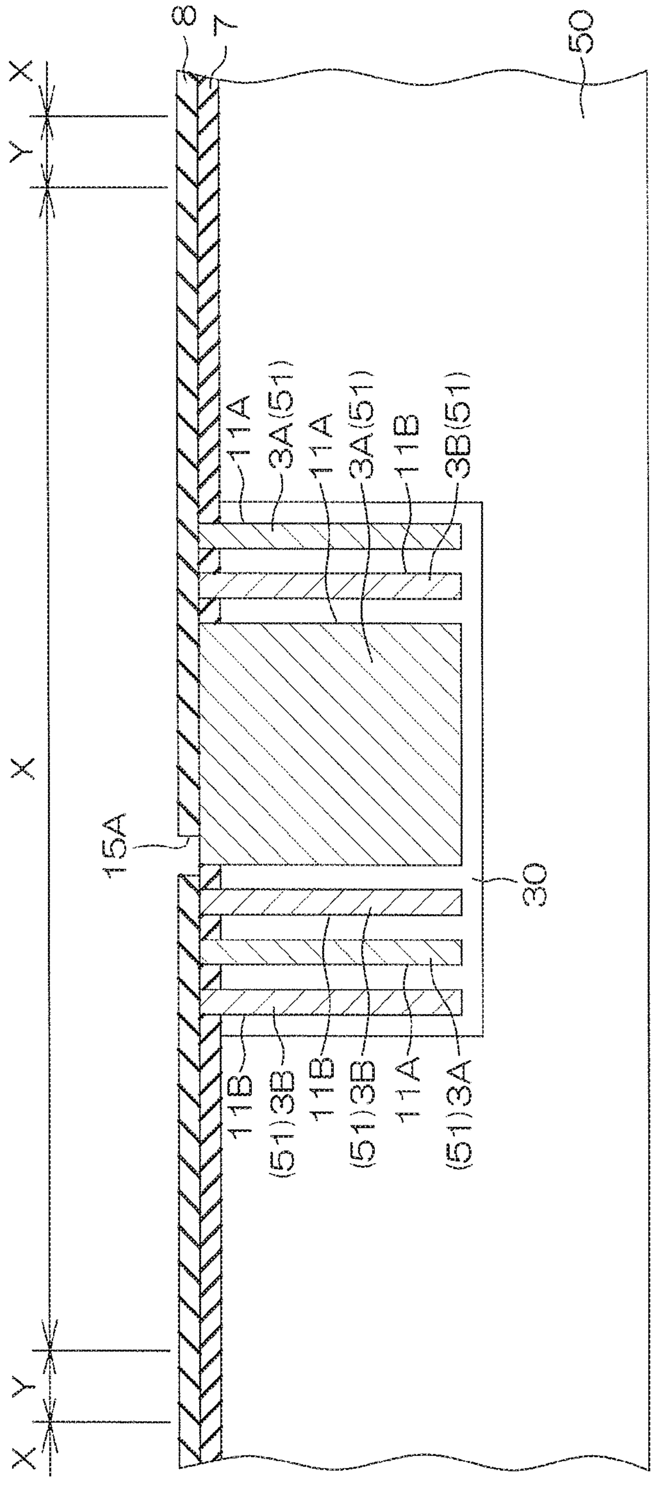

FIG. 129E is a cross-sectional view showing the step subsequent to FIG. 129D.

Figure 129F:
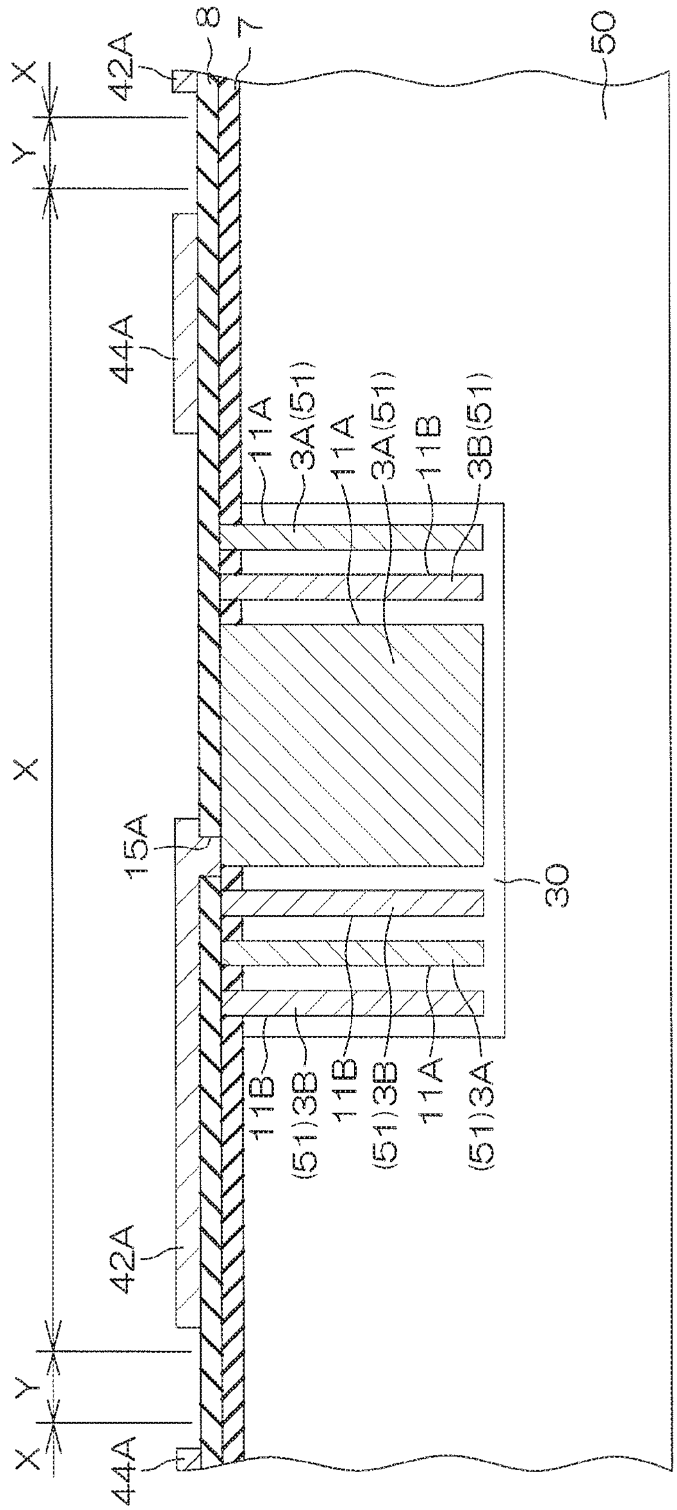

FIG. 129F is a cross-sectional view showing the step subsequent to FIG. 129E.

Figure 129G:
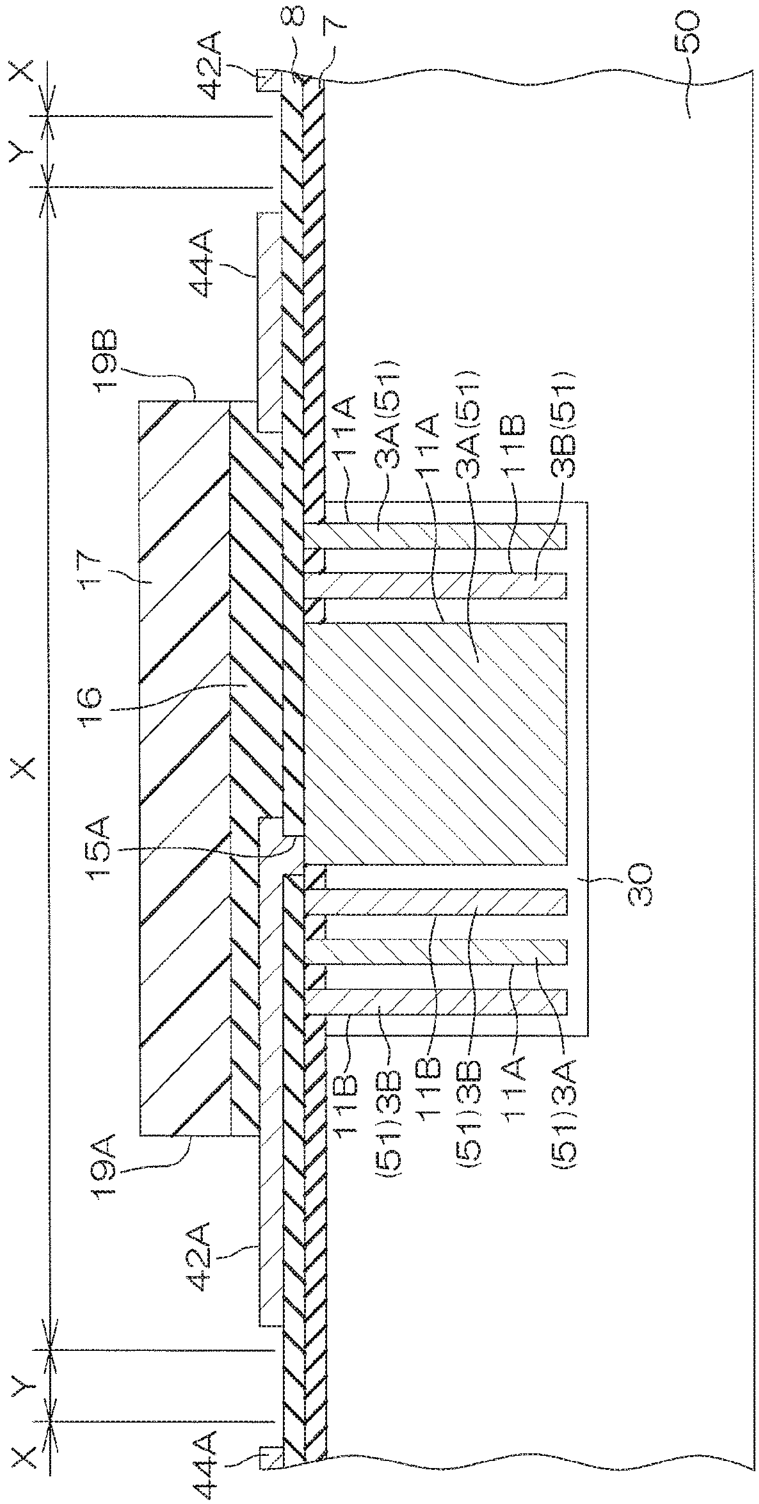

FIG. 129G is a cross-sectional view showing the step subsequent to FIG. 129F.

Figure 129H:
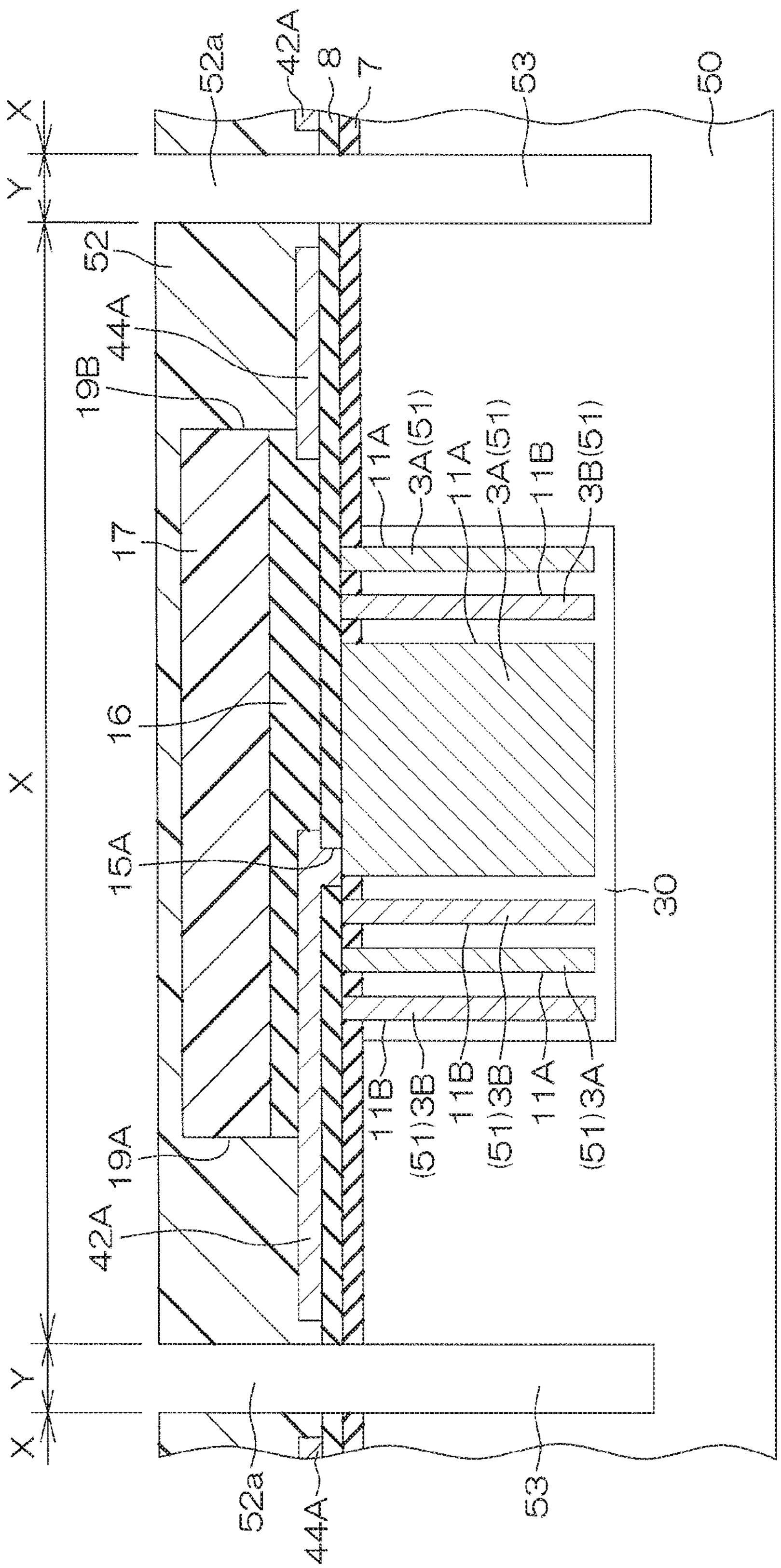
Figure 129:
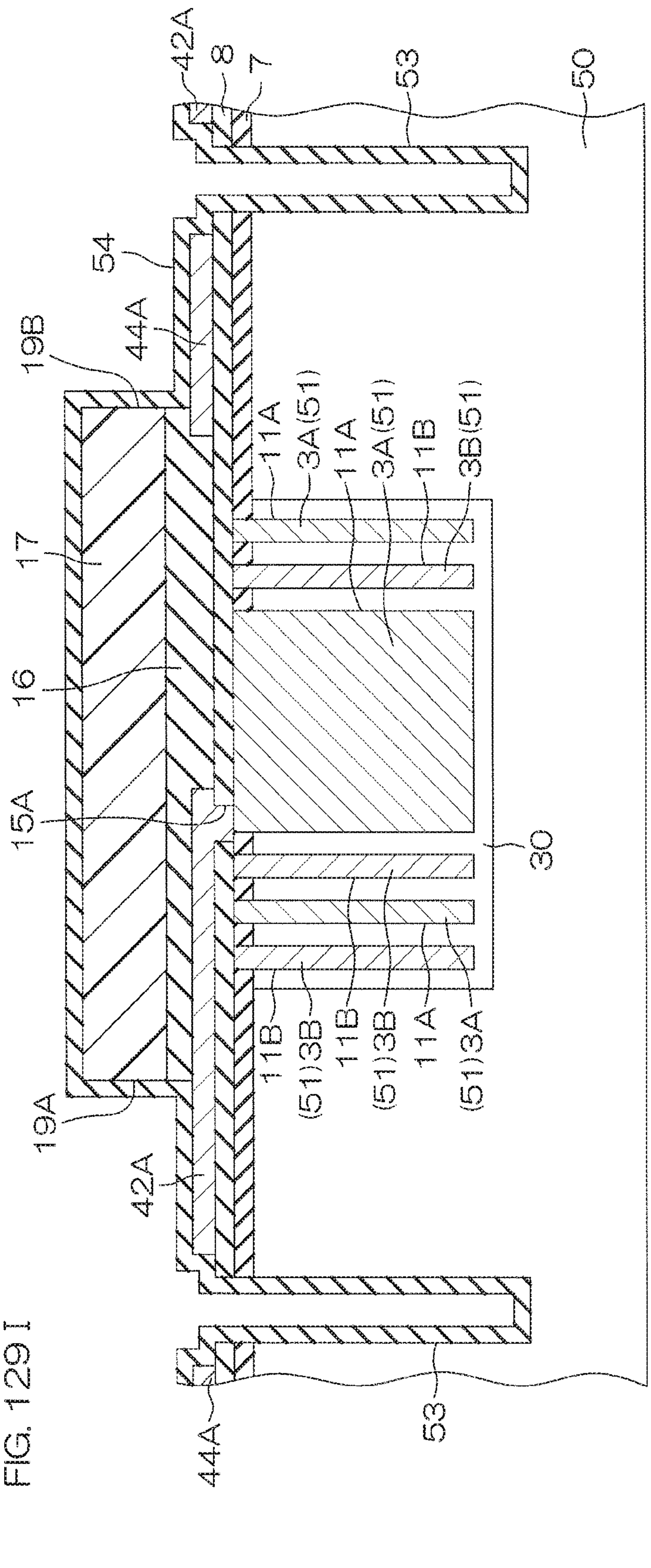

FIG. 129H is a cross-sectional view showing the step subsequent to FIG. 129G.

FIG. 129I is a cross-sectional view showing the step subsequent to FIG. 129H.

Figure 129J:
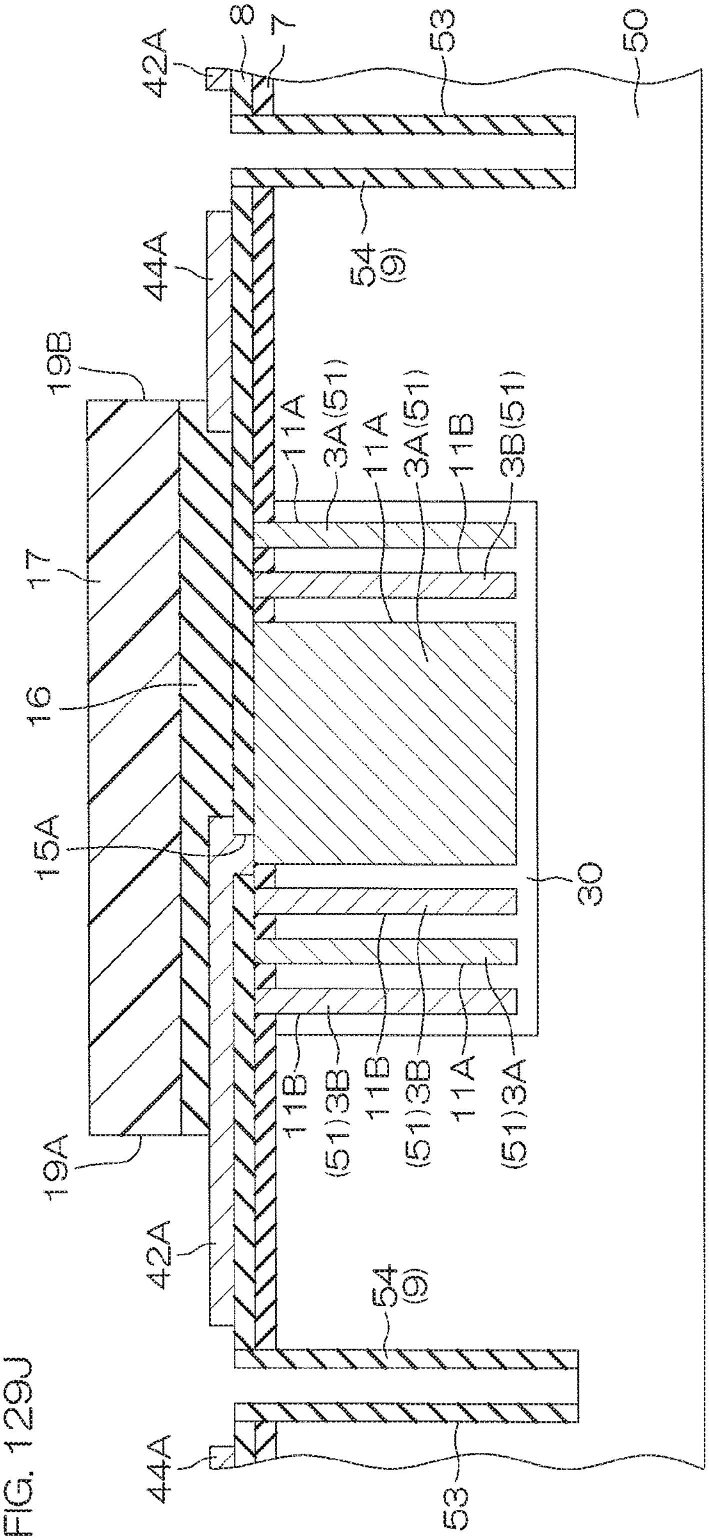

FIG. 129J is a cross-sectional view showing the step subsequent to FIG. 129I.

Figure 129K:
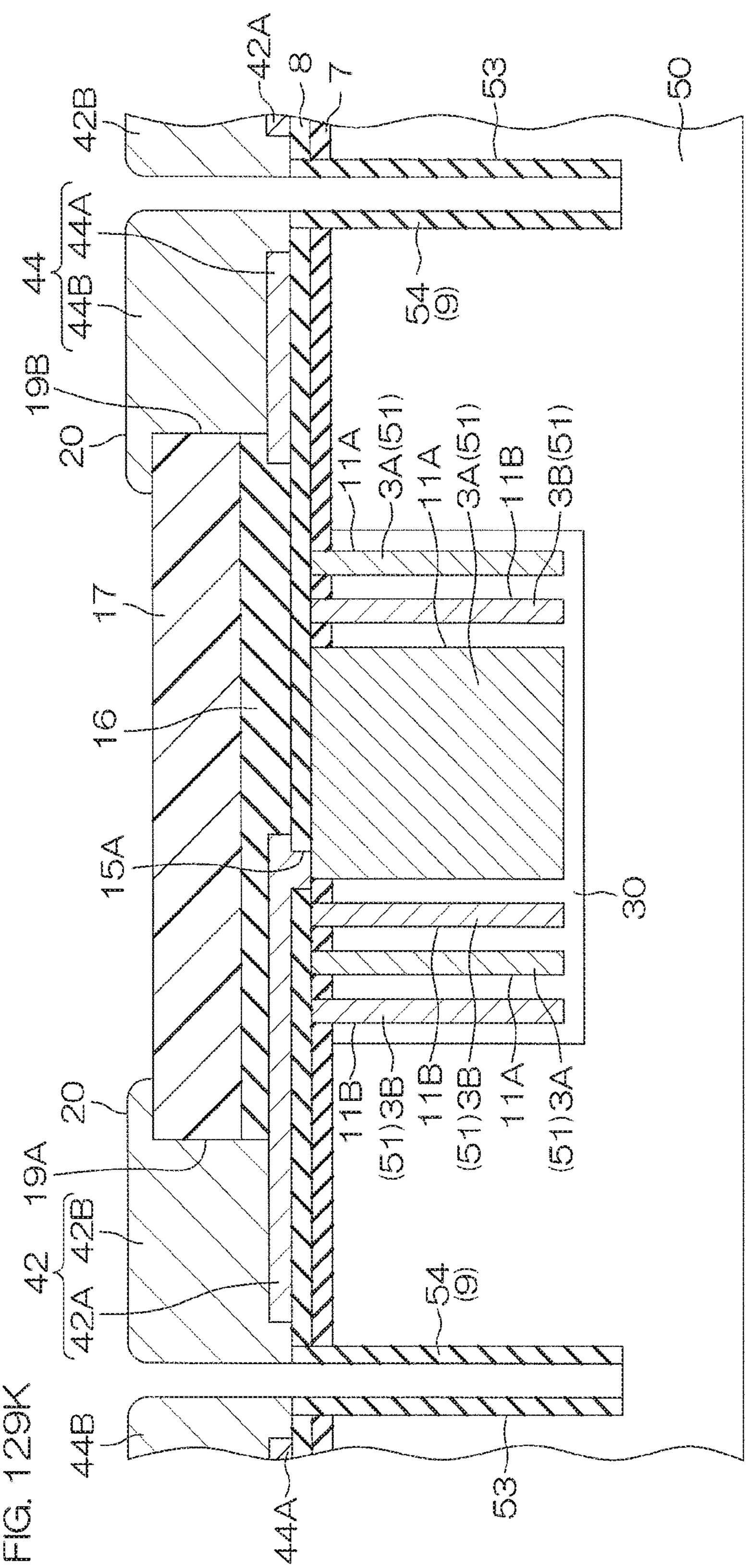

FIG. 129K is a cross-sectional view showing the step subsequent to FIG. 129J.

Figure 129L:
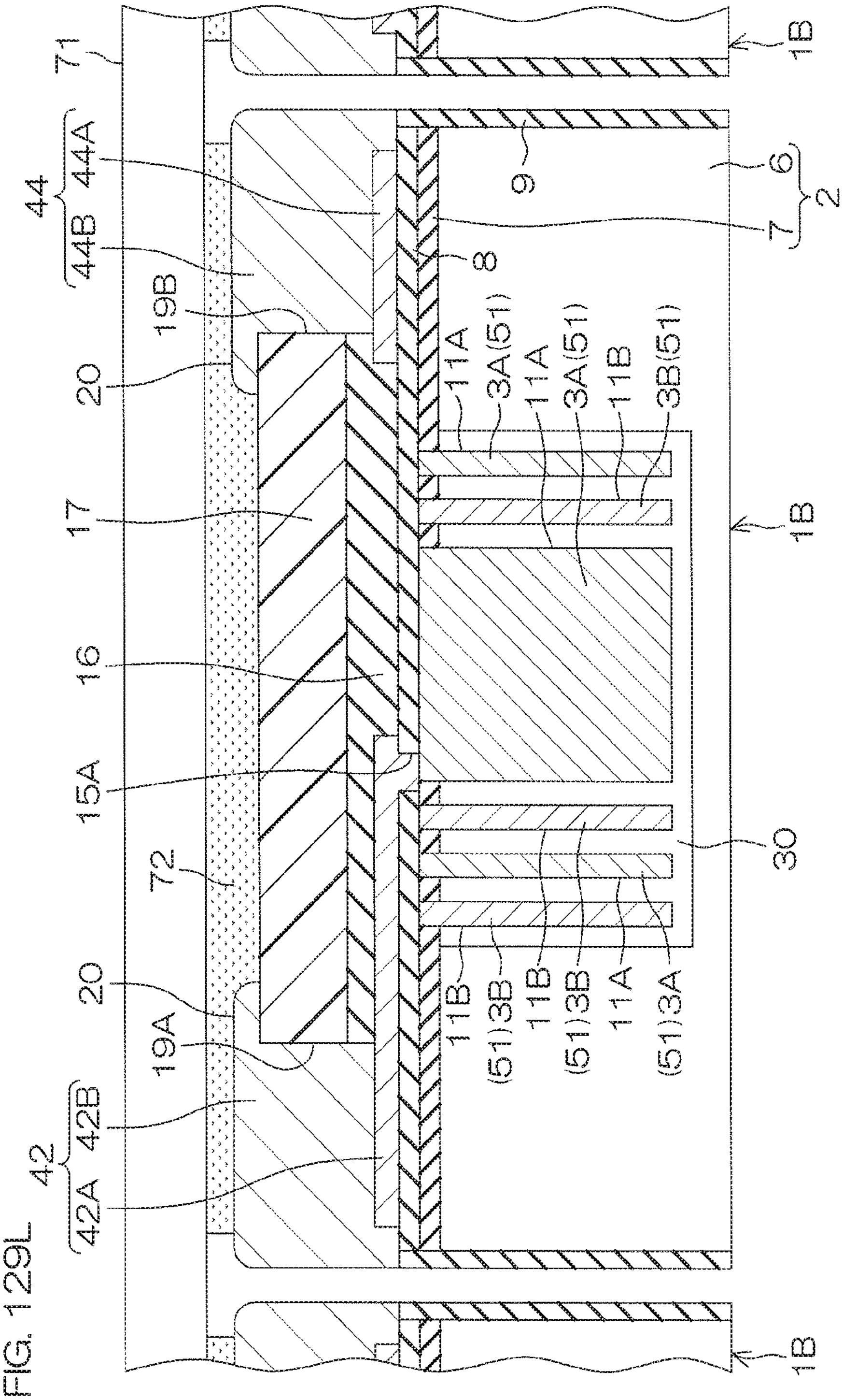

FIG. 129L is a cross-sectional view showing the step subsequent to FIG. 129K.

Figure 130A:
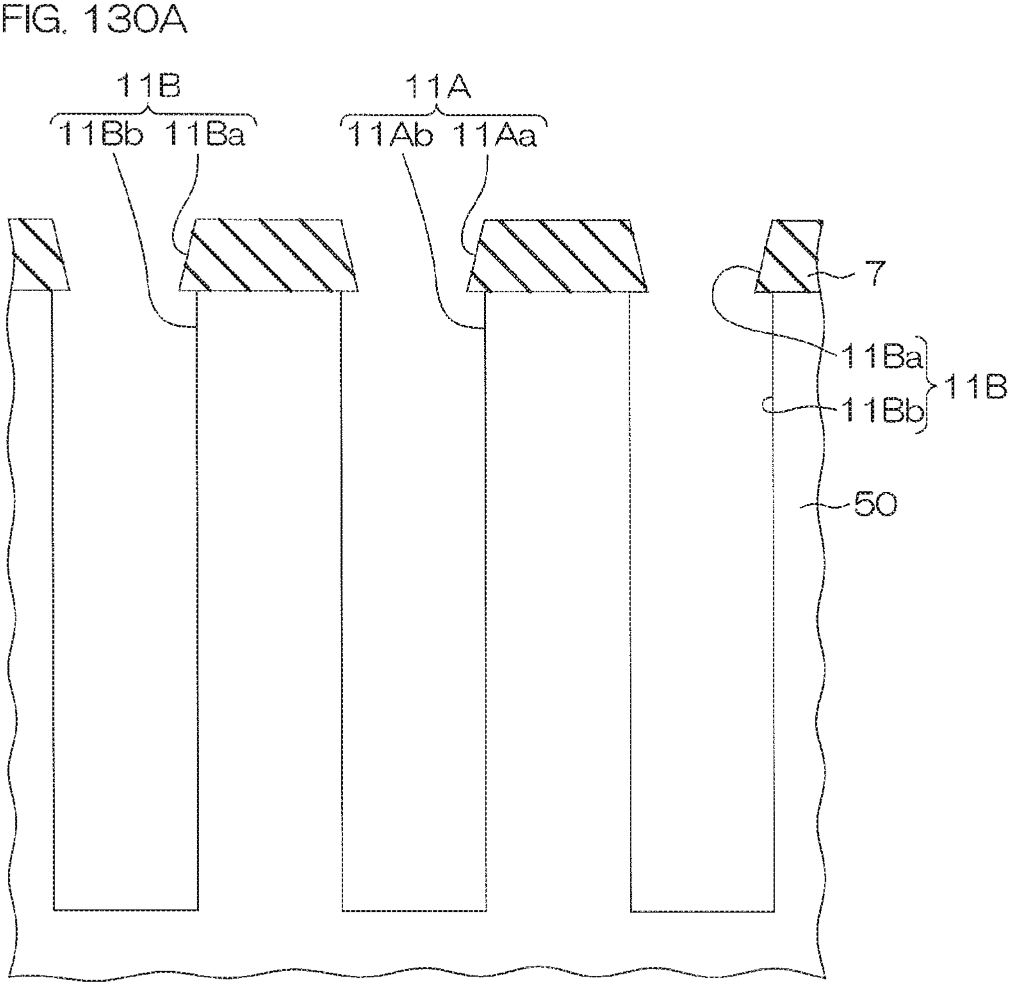

FIG. 130A is a partially enlarged cross-sectional view showing the details of the manufacturing step of a coil.

Figure 130B:
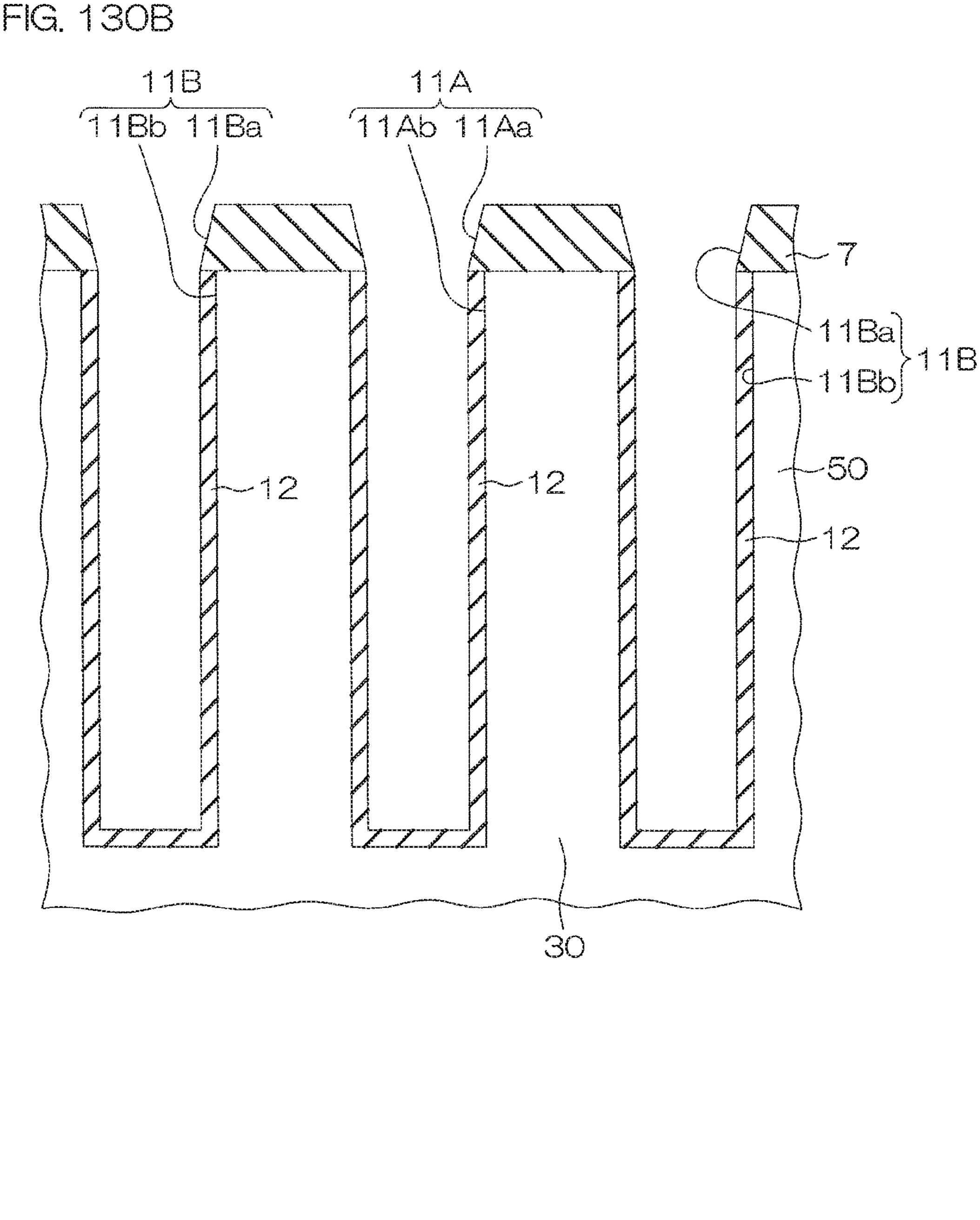

FIG. 130B is a partially enlarged cross-sectional view showing the step subsequent to FIG. 130A.

Figure 130C:
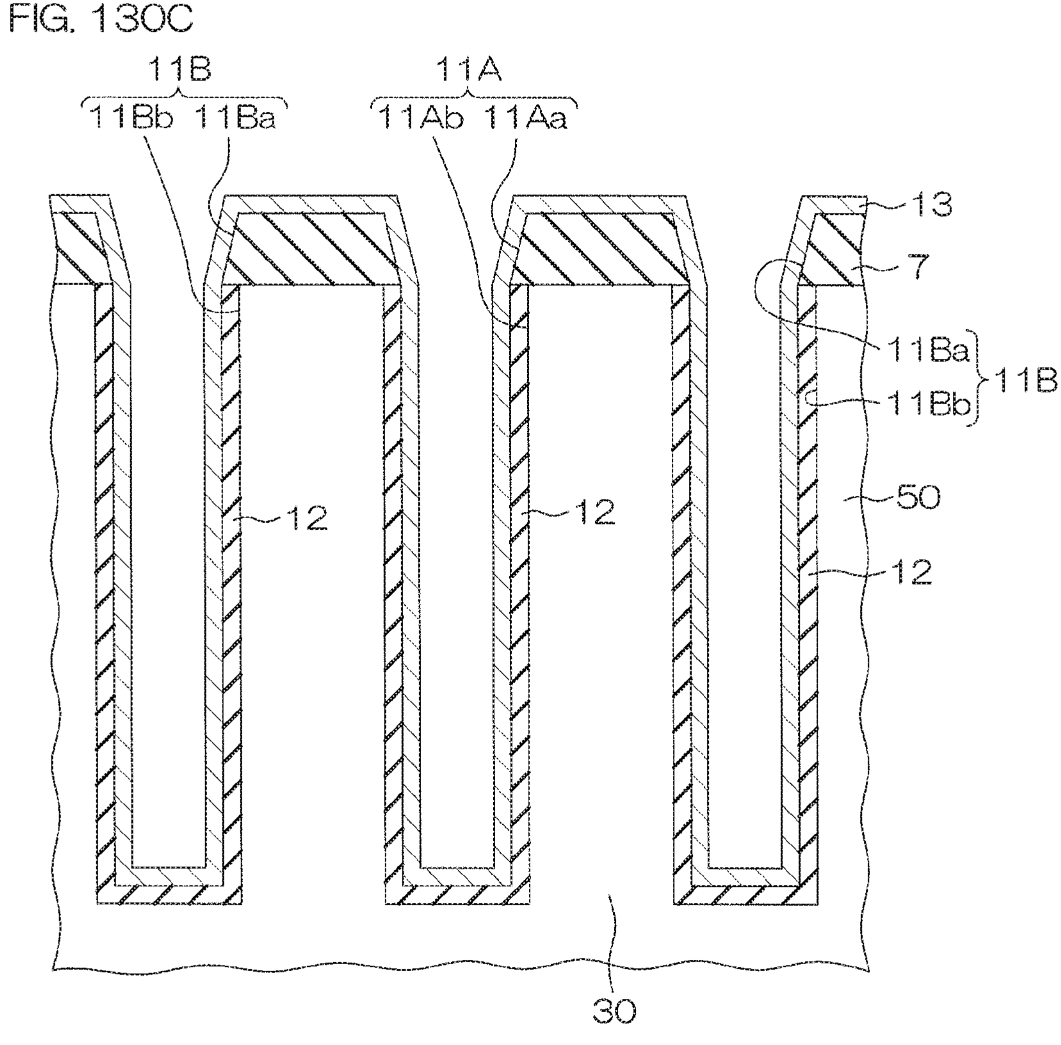

FIG. 130C is a partially enlarged cross-sectional view showing the step subsequent to FIG. 130B.

Figure 130D:
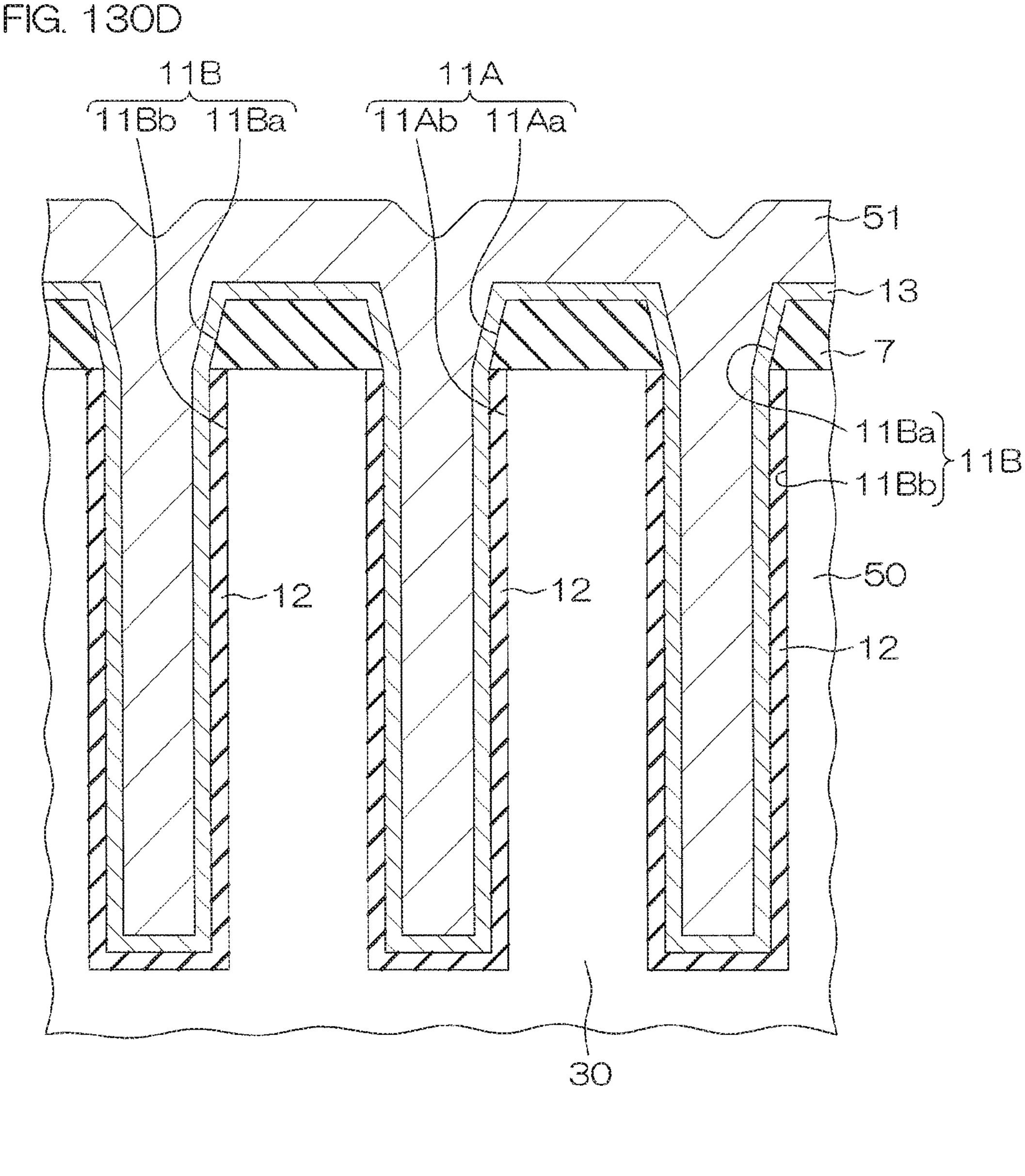

FIG. 130D is a partially enlarged cross-sectional view showing the step subsequent to FIG. 130C.

Figure 130E:
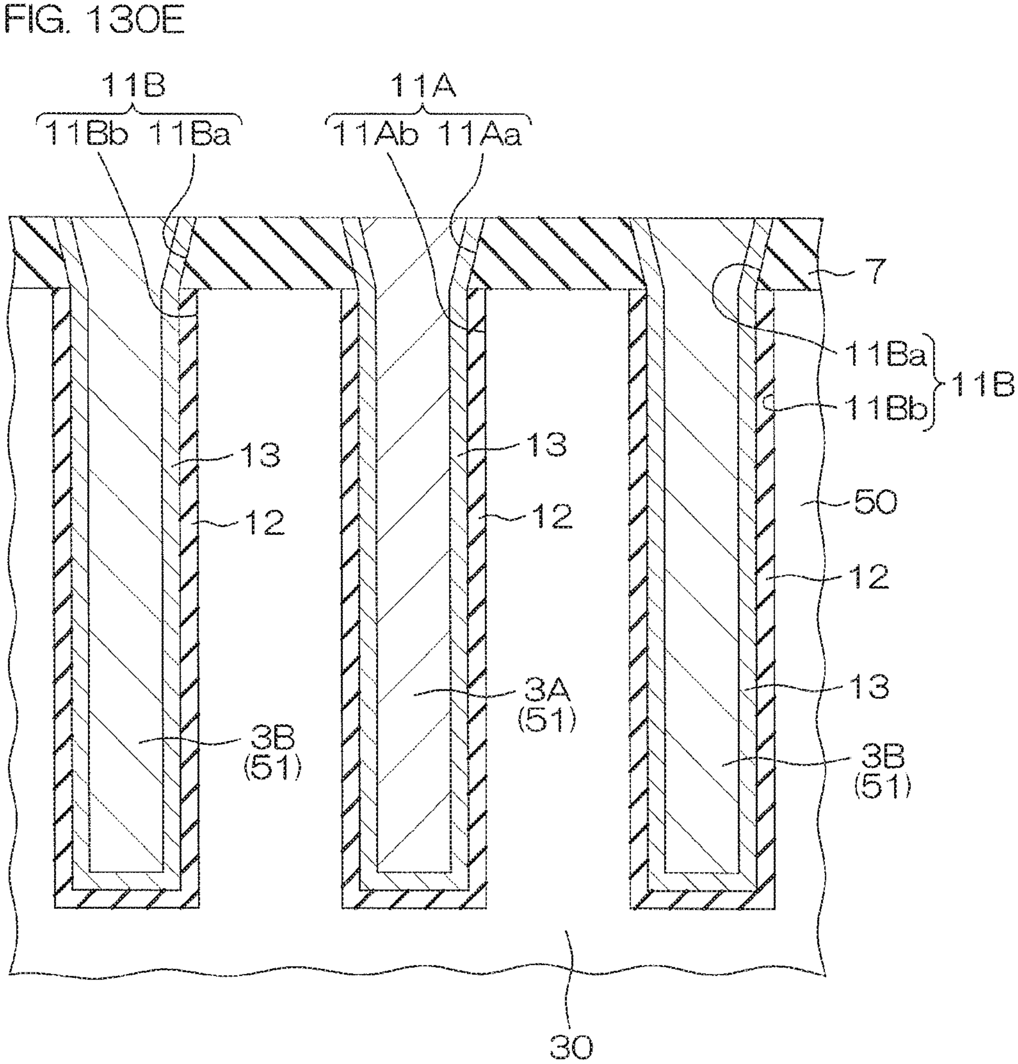

FIG. 130E is a partially enlarged cross-sectional view showing the step subsequent to FIG. 130D.

Figure 131:
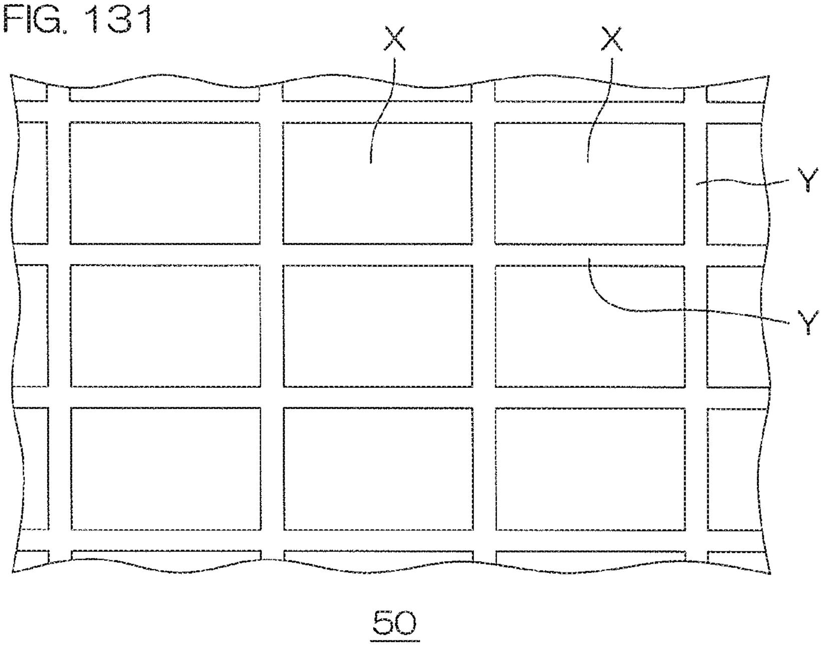

FIG. 131 is a plan view of an original substrate that is an original of a substrate main body of the chip transformer, and shows an enlarged view of a partial region.

Figure 132:
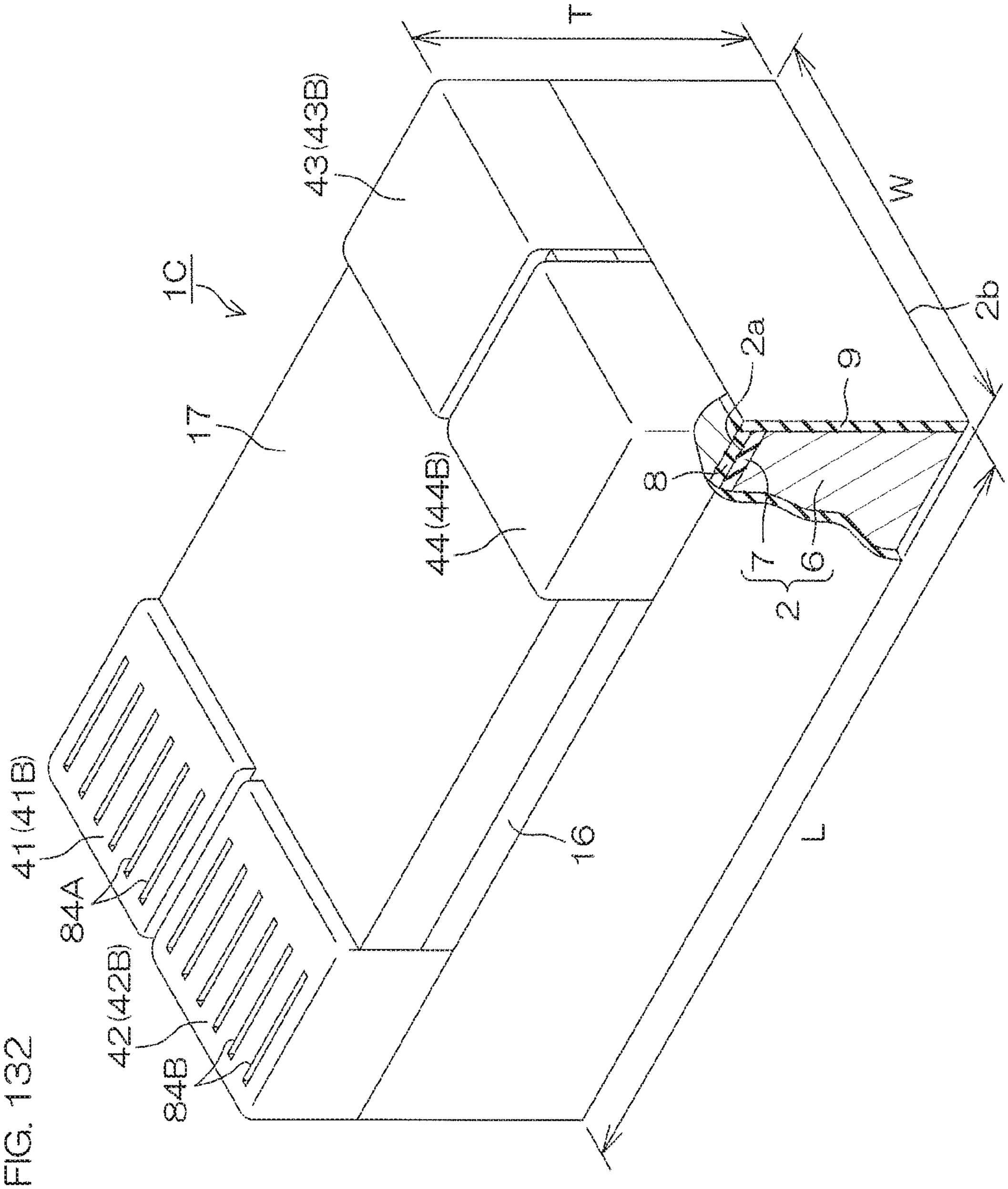

FIG. 132 is a partially cut perspective view of a chip transformer according to a fourth preferred embodiment of the fourth invention.

Figure 133A:
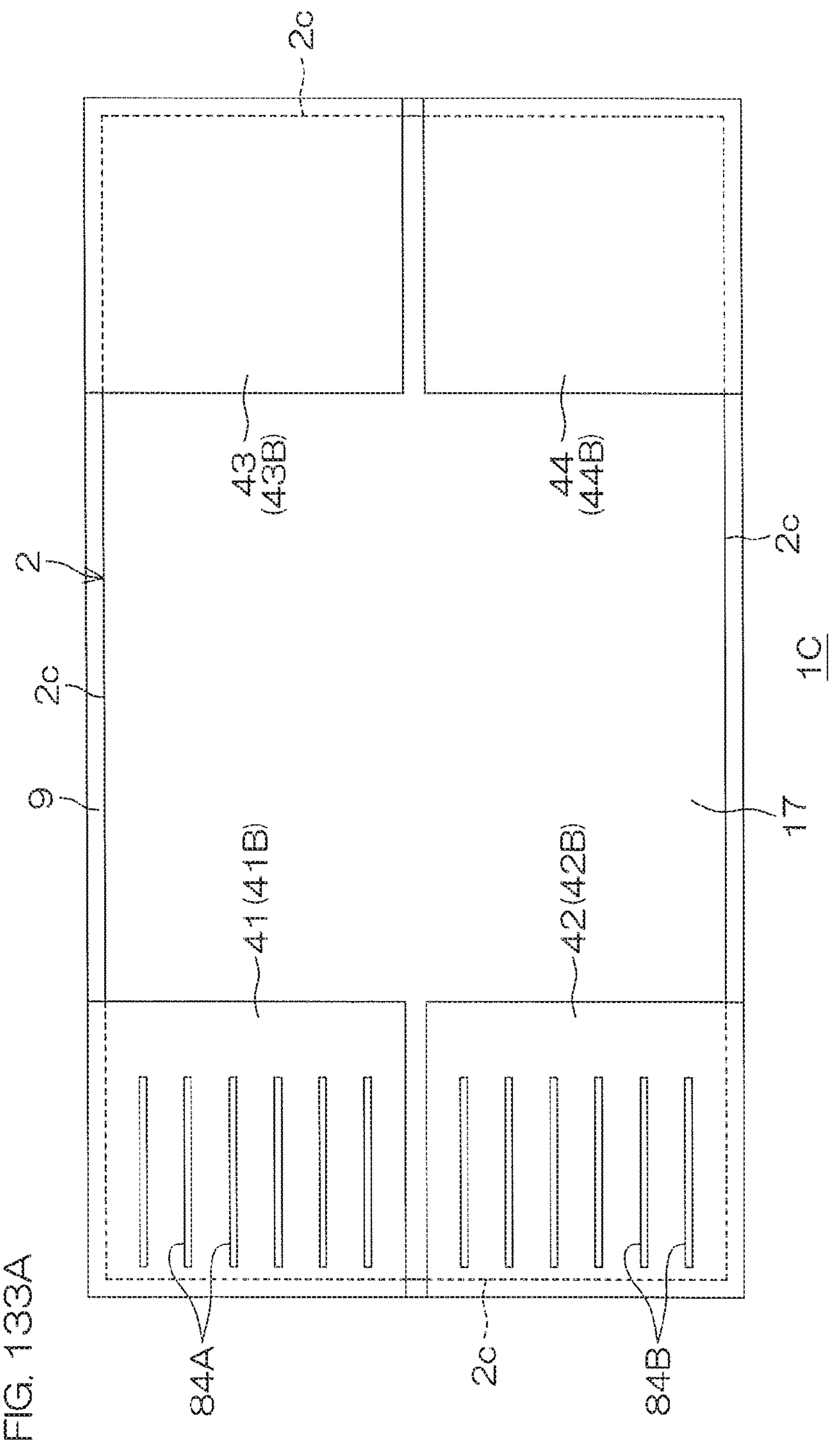

FIG. 133A is a plan view showing the appearance of the chip transformer when seen from the side of the electrode.

Figure 133B:
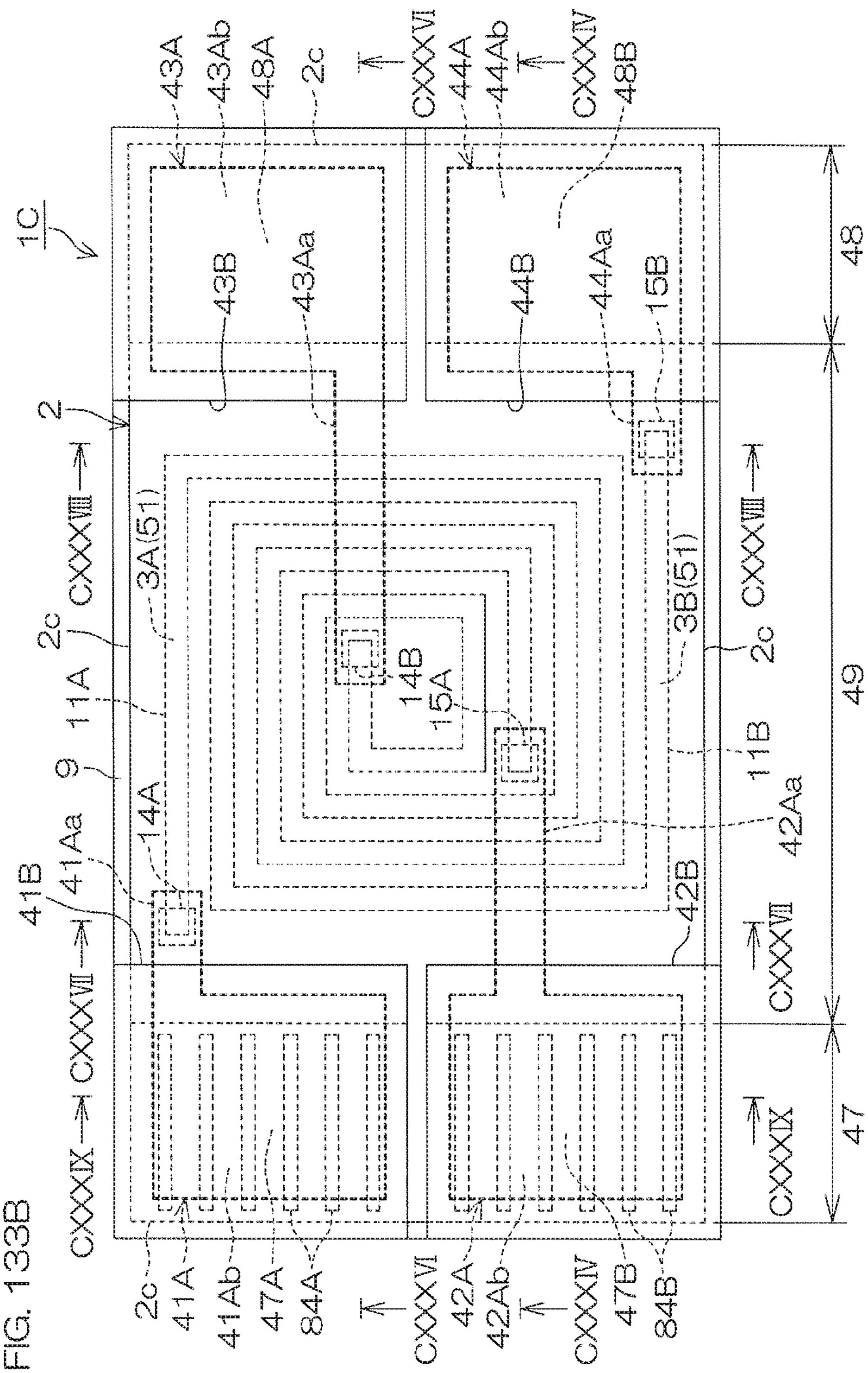

FIG. 133B is a plan view showing the internal structure of the chip transformer.

Figure 134:
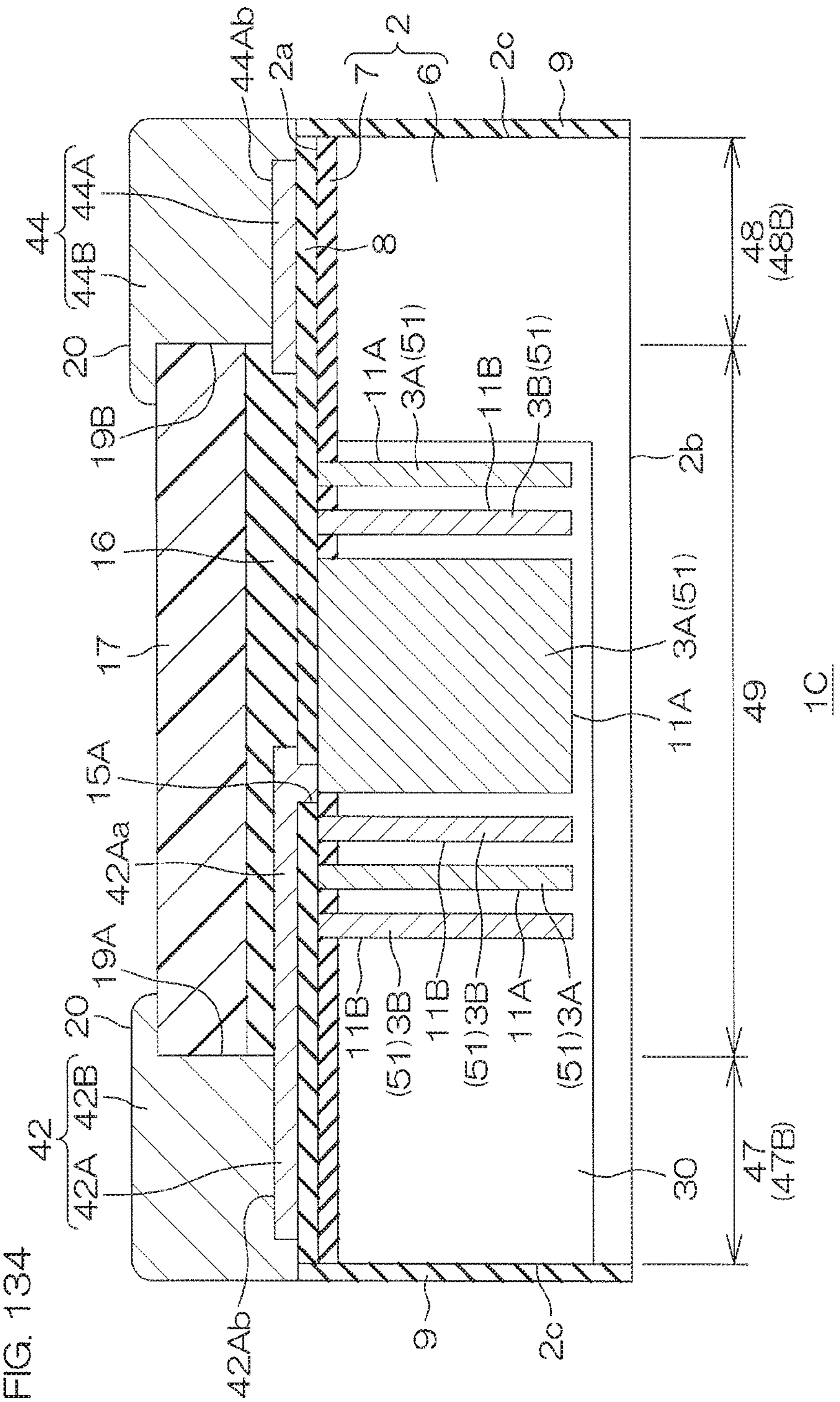

FIG. 134 is a cross-sectional view taken along line CXXXIV-CXXXIV in FIG. 133B.

Figure 135:
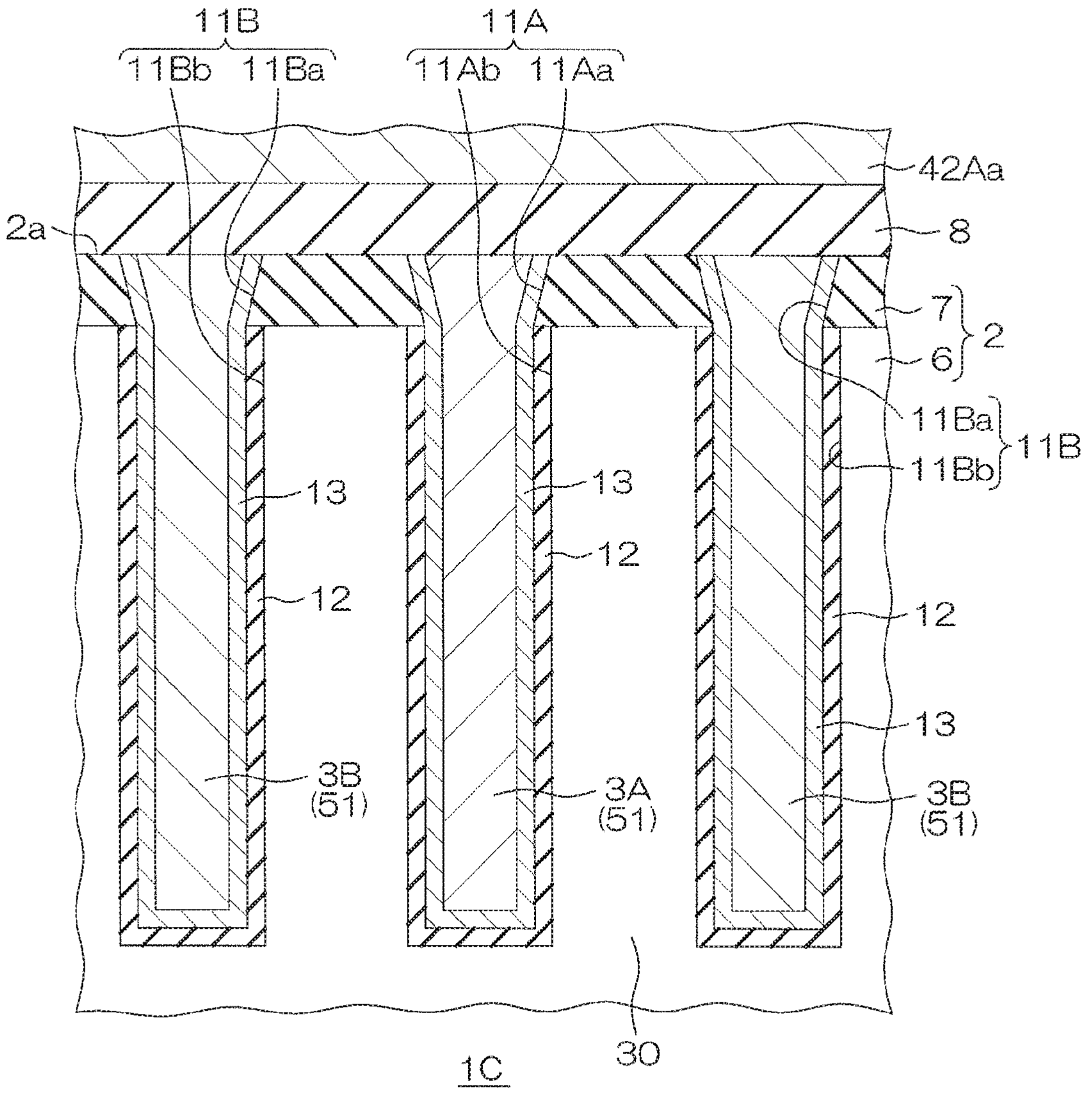

FIG. 135 is a partially enlarged cross-sectional view of FIG. 134.

Figure 136:
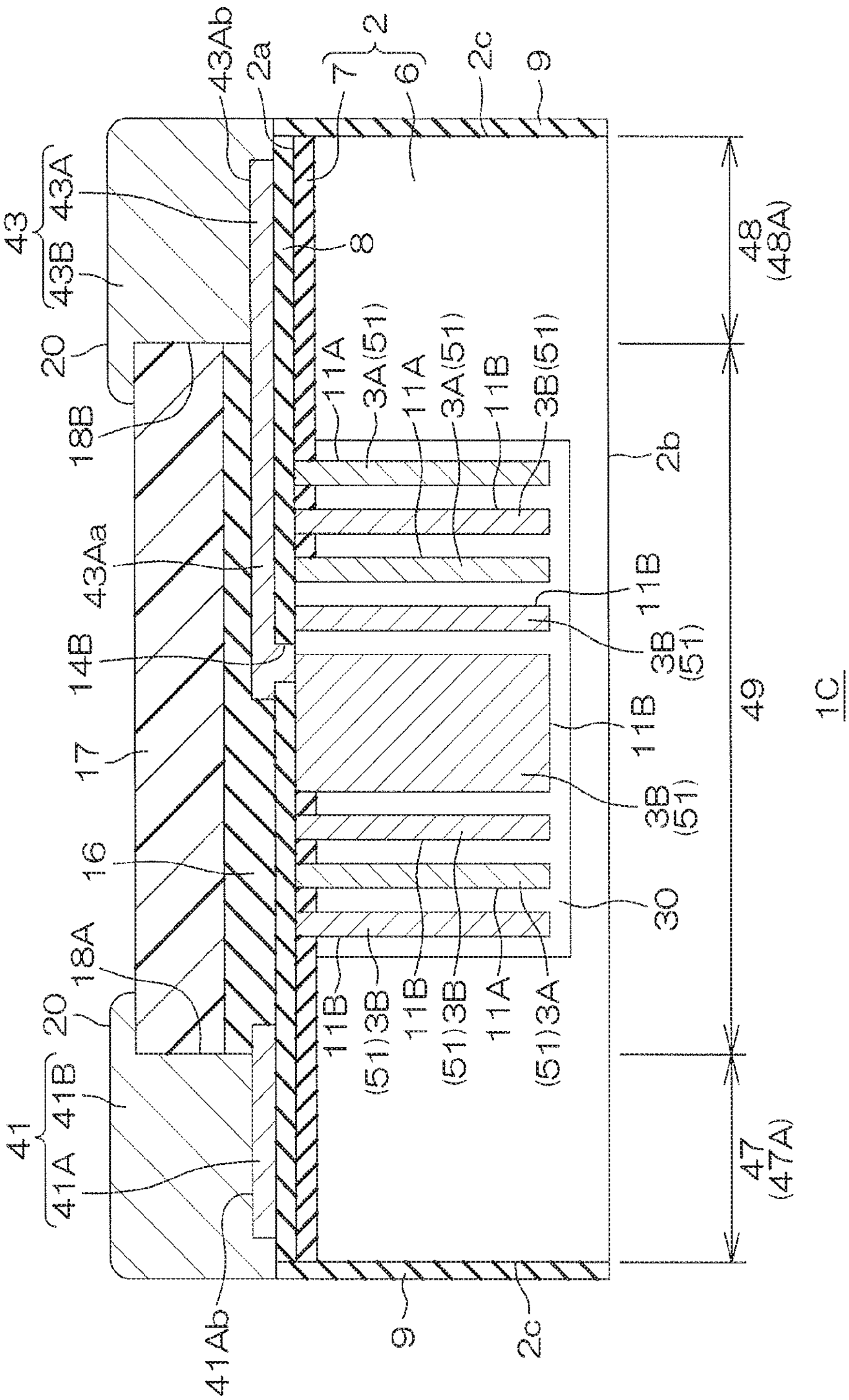

FIG. 136 is a cross-sectional view taken along line CXXXVI-CXXXVI in FIG. 133B.

Figure 137:
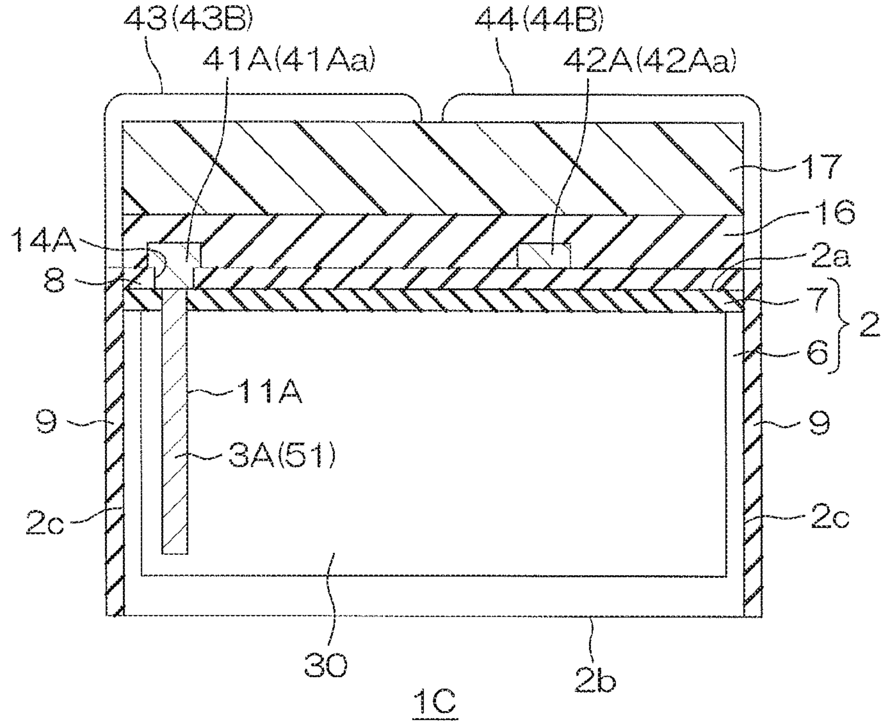

FIG. 137 is a cross-sectional view taken along line CXXXVII-CXXXVII in FIG. 133B.

Figure 138:
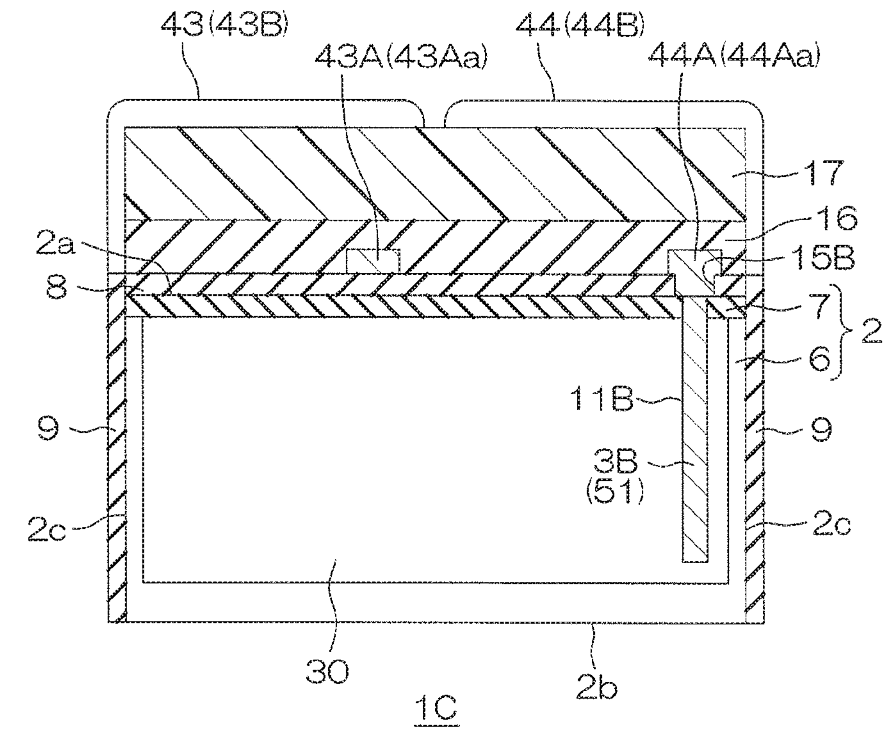

FIG. 138 is a cross-sectional view taken along line CXXXVIII-CXXXVIII in FIG. 133B.

Figure 139:
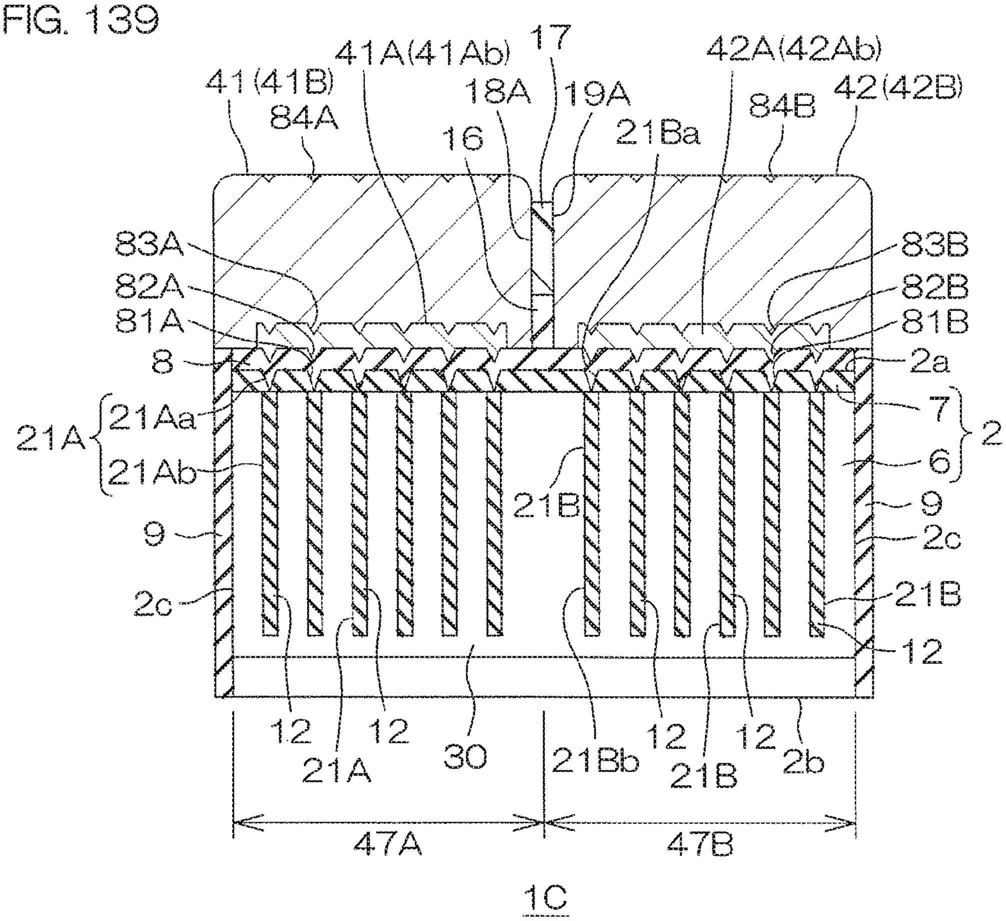

FIG. 139 is a cross-sectional view taken along line CXXXIX-CXXXIX in FIG. 133B.

Figure 140:
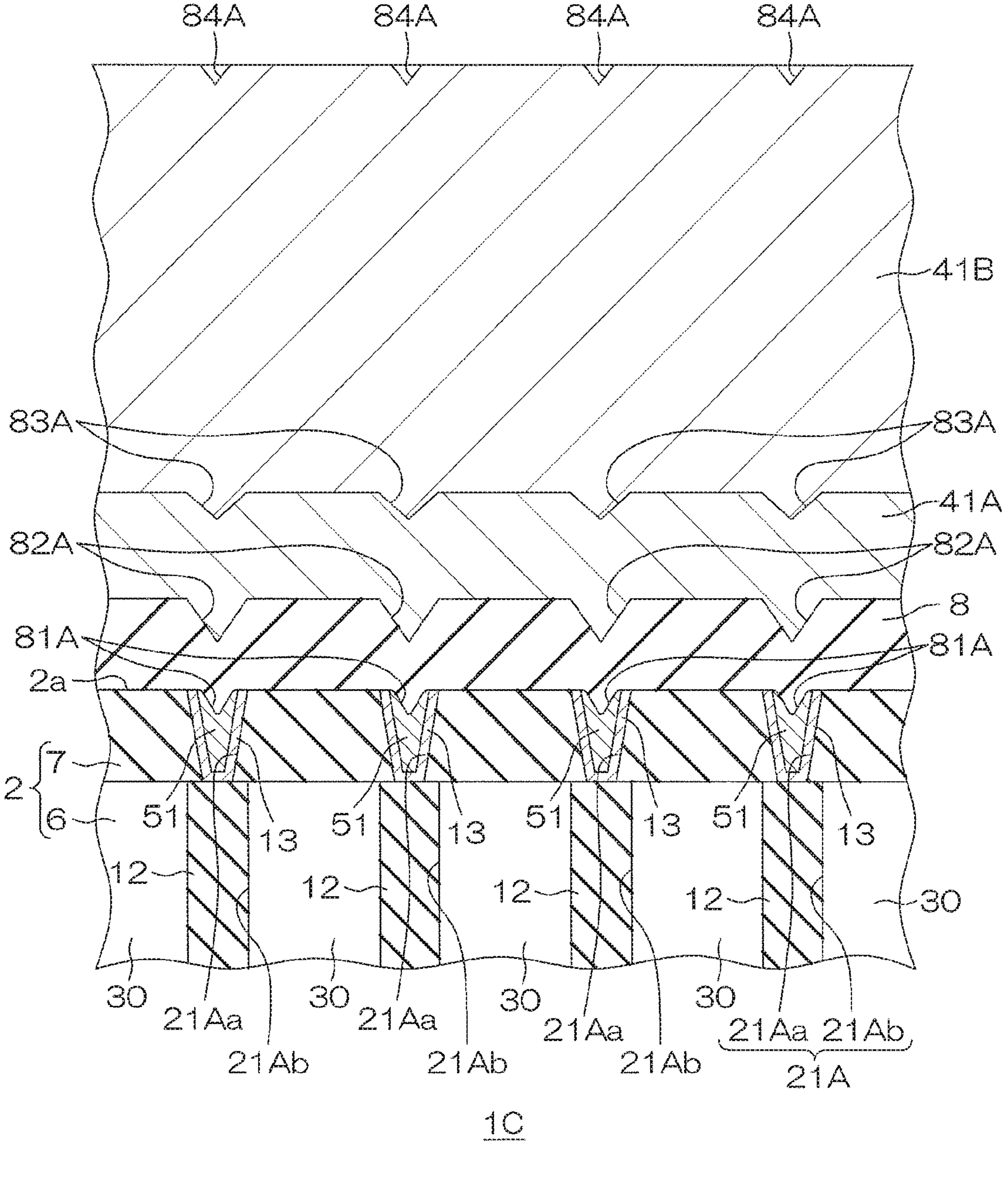

FIG. 140 is a partially enlarged cross-sectional view of FIG. 139.

Figure 141:
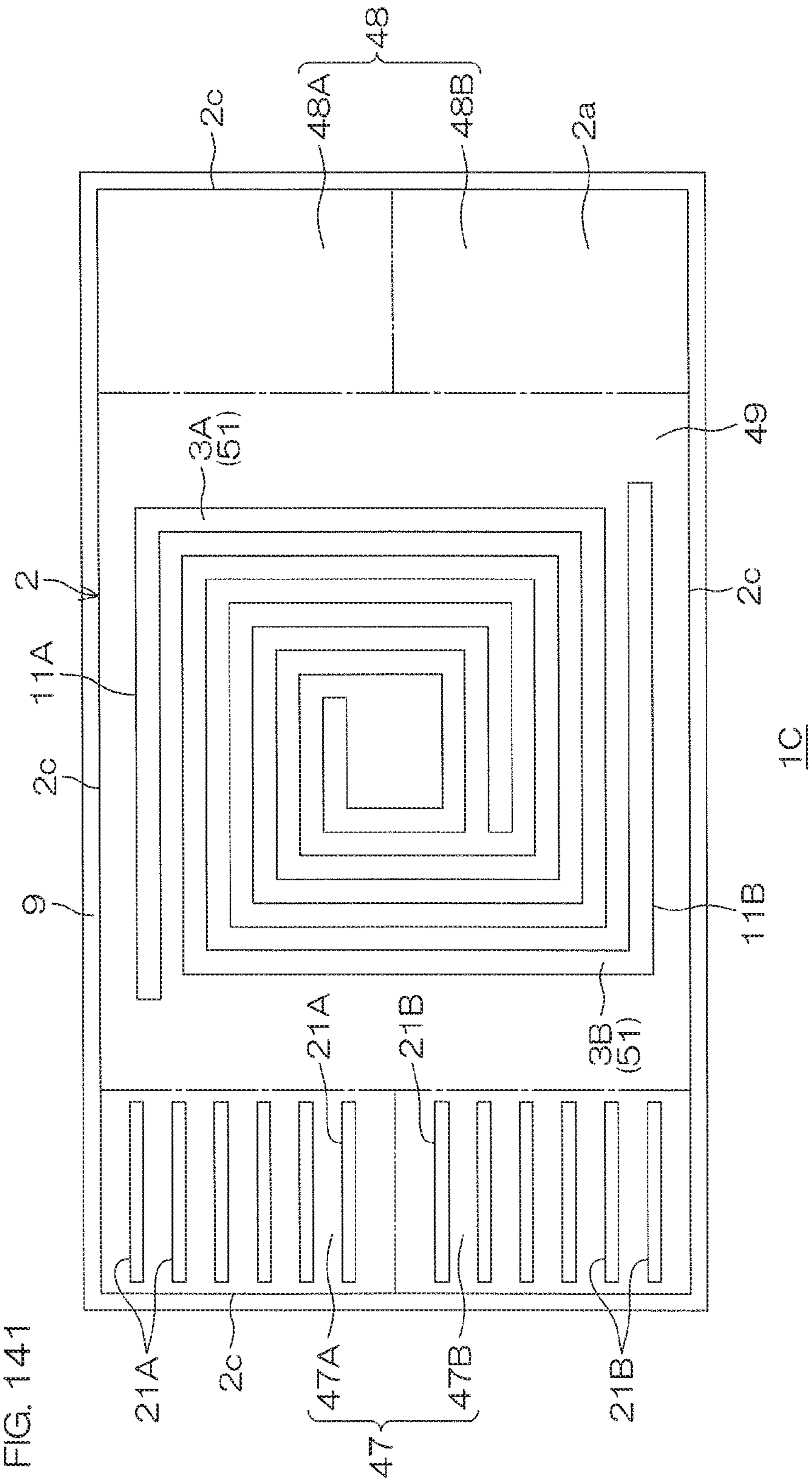

FIG. 141 is a plan view showing a structure of the surface of a substrate by removing an arrangement formed on the surface of the substrate.

Figure 142:
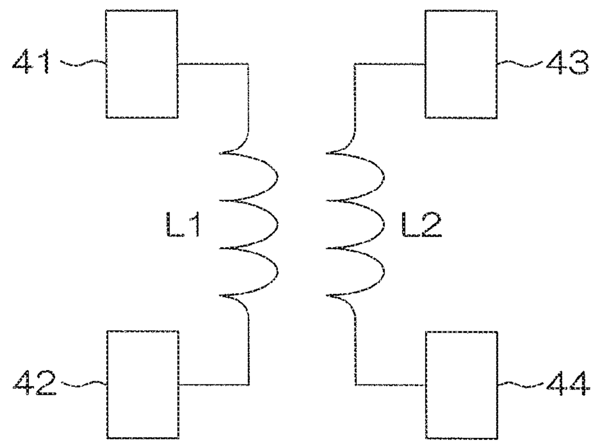

FIG. 142 is an electrical circuit diagram showing an electrical structure within the chip transformer.

Figure 143:
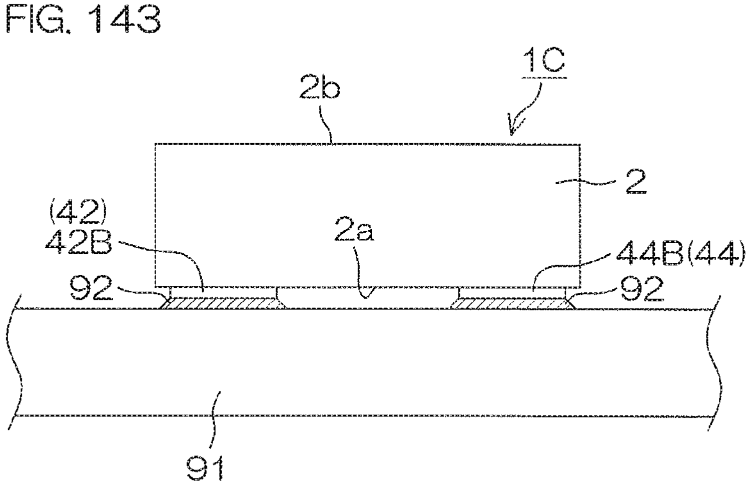

FIG. 143 is a cross-sectional view showing the arrangement of a circuit assembly in which the chip transformer is flip-chip connected on the mounting substrate.

Figure 144A:
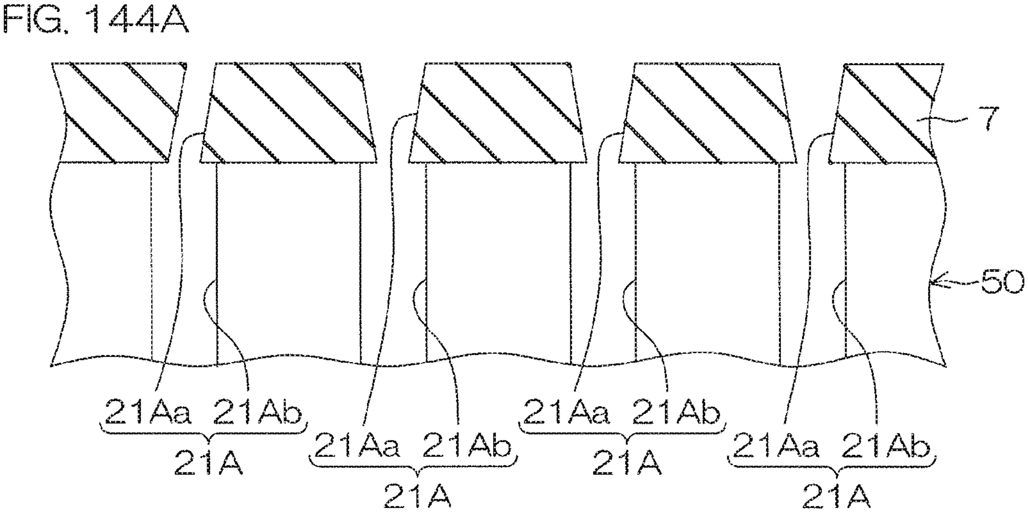

FIG. 144A is an enlarged cross-sectional view showing the details of the manufacturing step of the first concave portion.

Figure 144B:
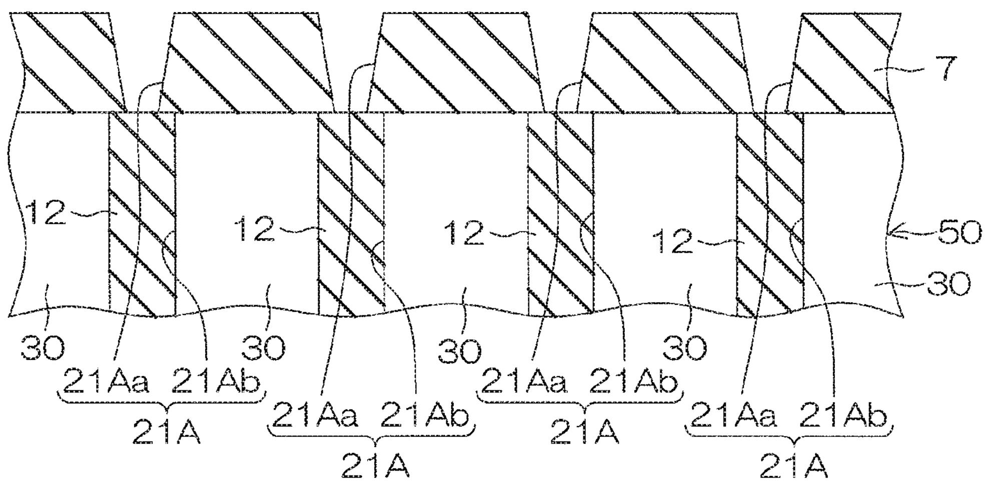

FIG. 144B is a cross-sectional view showing the step subsequent to FIG. 144A.

Figure 144C:
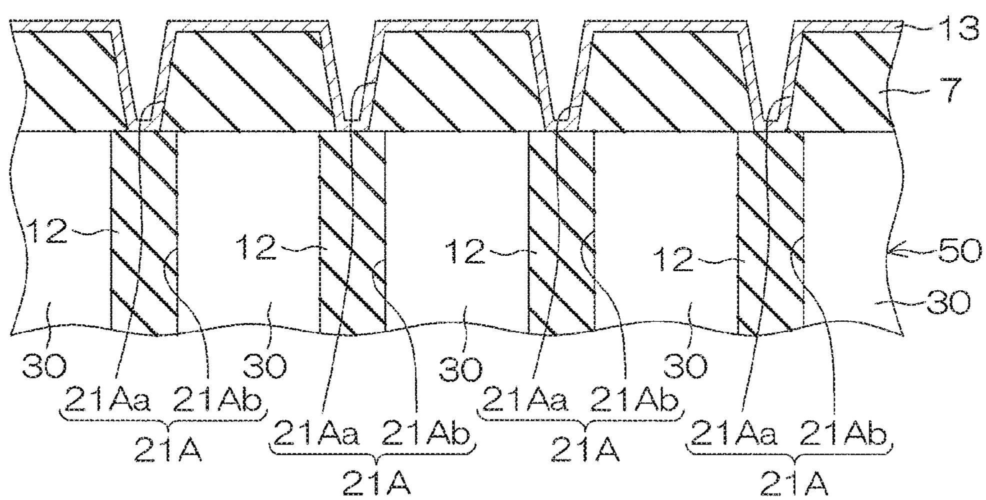

FIG. 144C is a cross-sectional view showing the step subsequent to FIG. 144B.

Figure 144D:
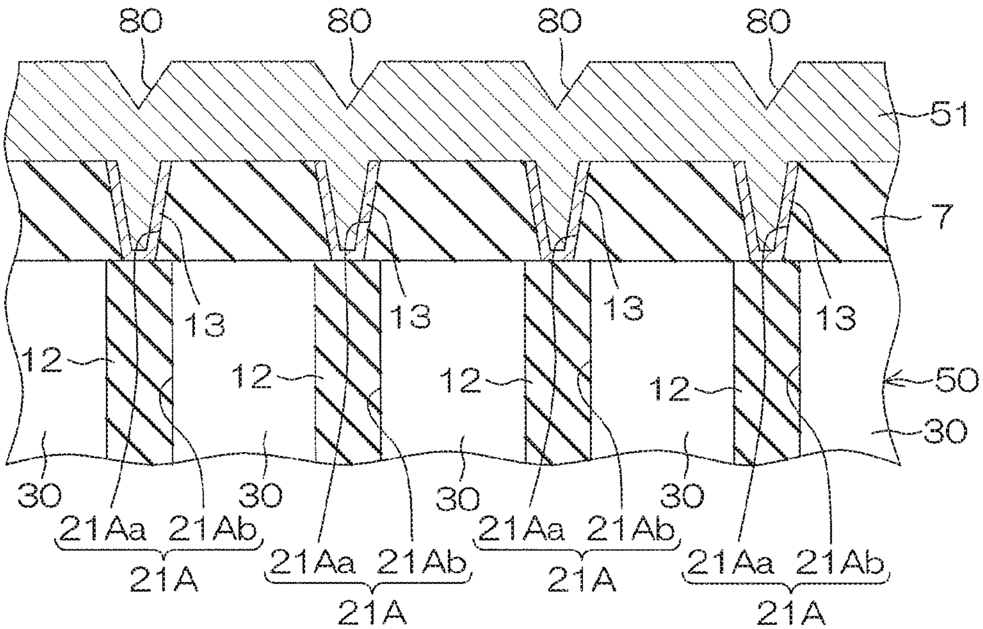

FIG. 144D is a cross-sectional view showing the step subsequent to FIG. 144C.

Figure 144E:
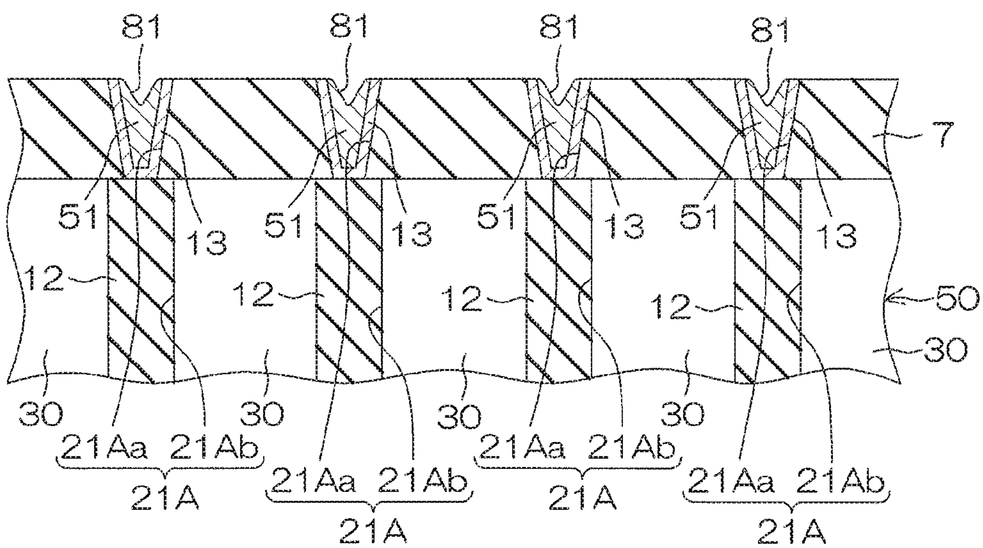

FIG. 144E is a cross-sectional view showing the step subsequent to FIG. 144D.

Figure 144F:
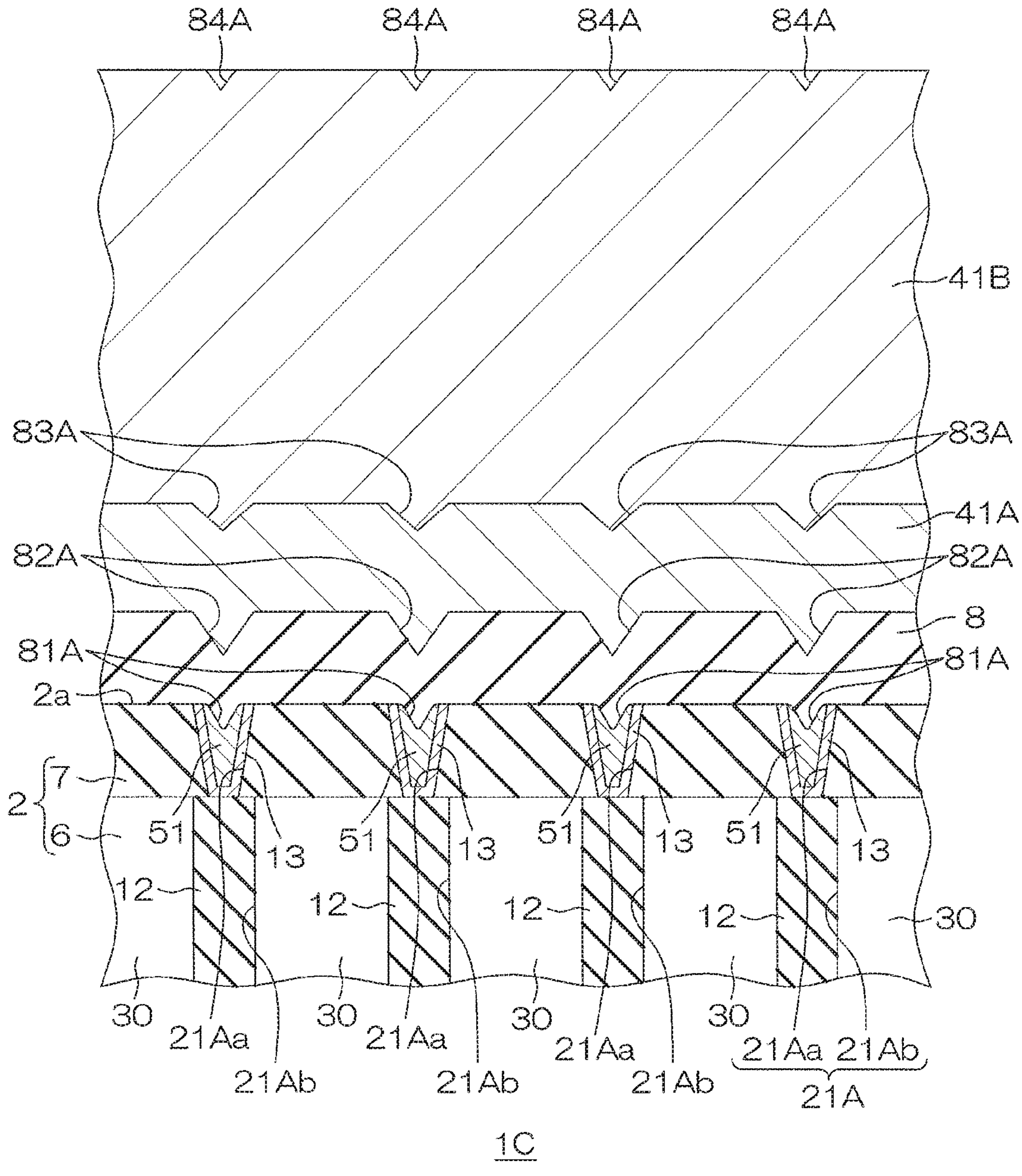

FIG. 144F is a cross-sectional view showing the step subsequent to FIG. 144E.

Figure 145:
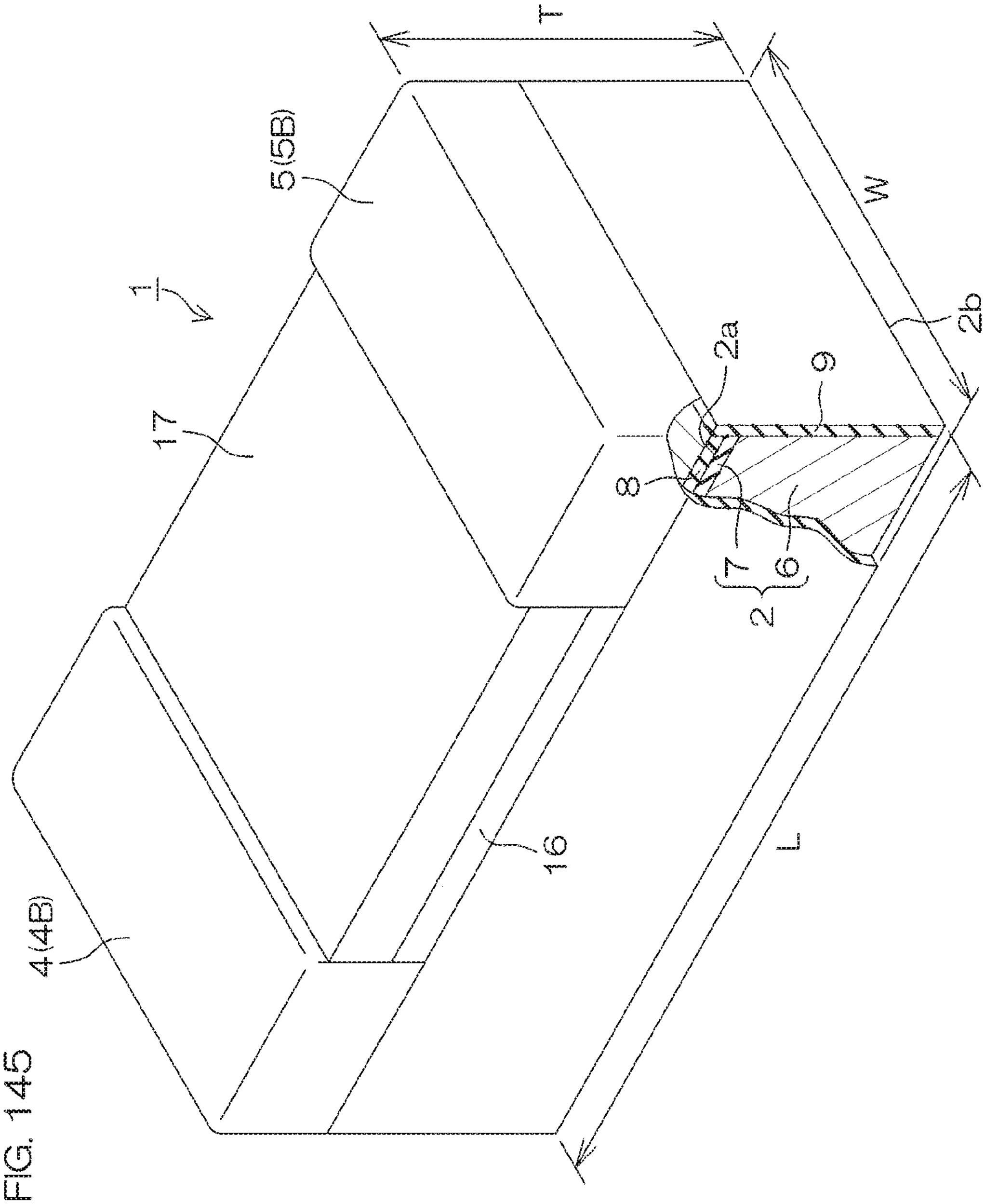

FIG. 145 is a partially cut perspective view of a chip capacitor according to a preferred embodiment of a fifth invention.

Figure 146:
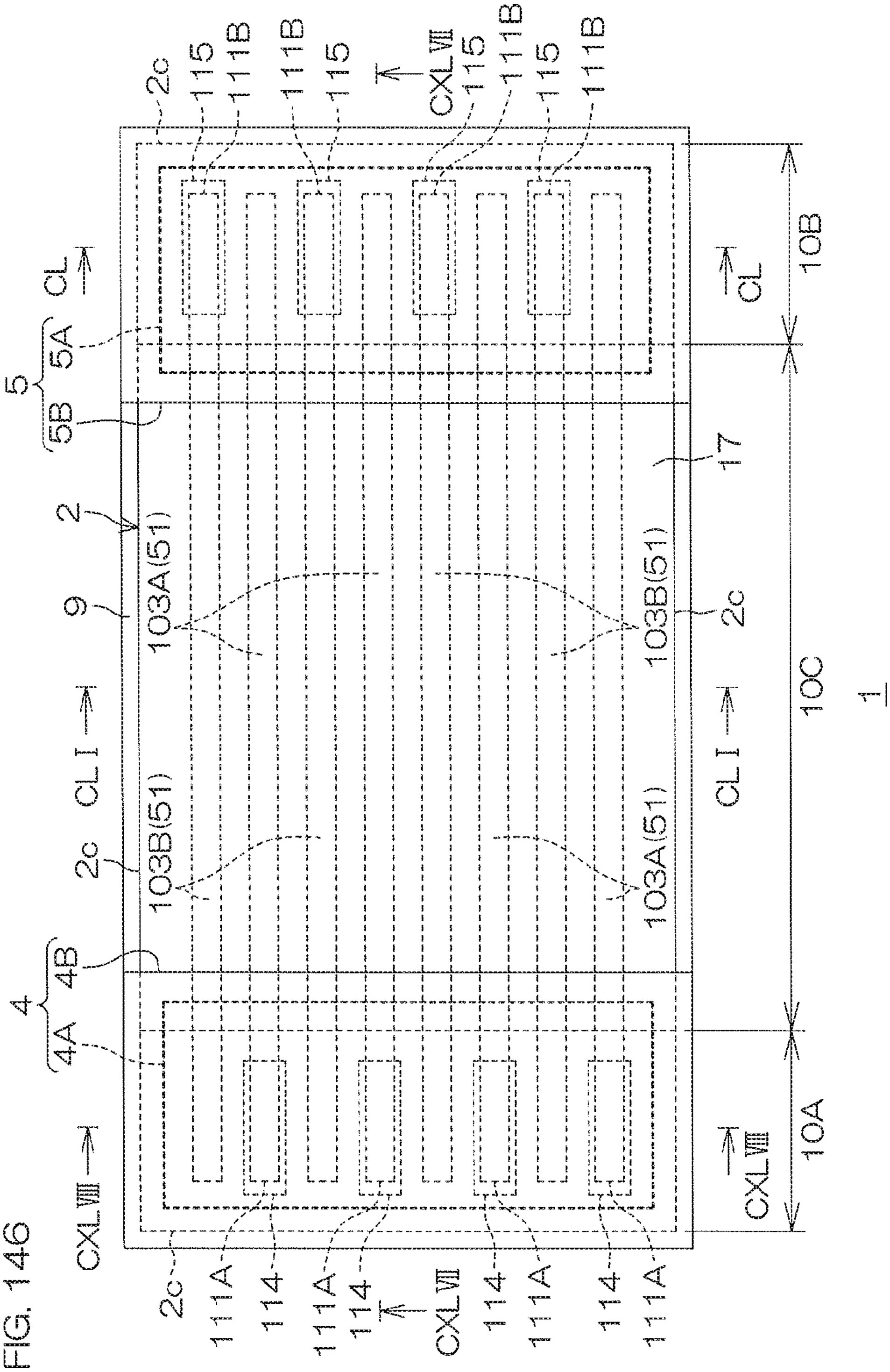

FIG. 146 is a plan view of the chip capacitor.

Figure 147:
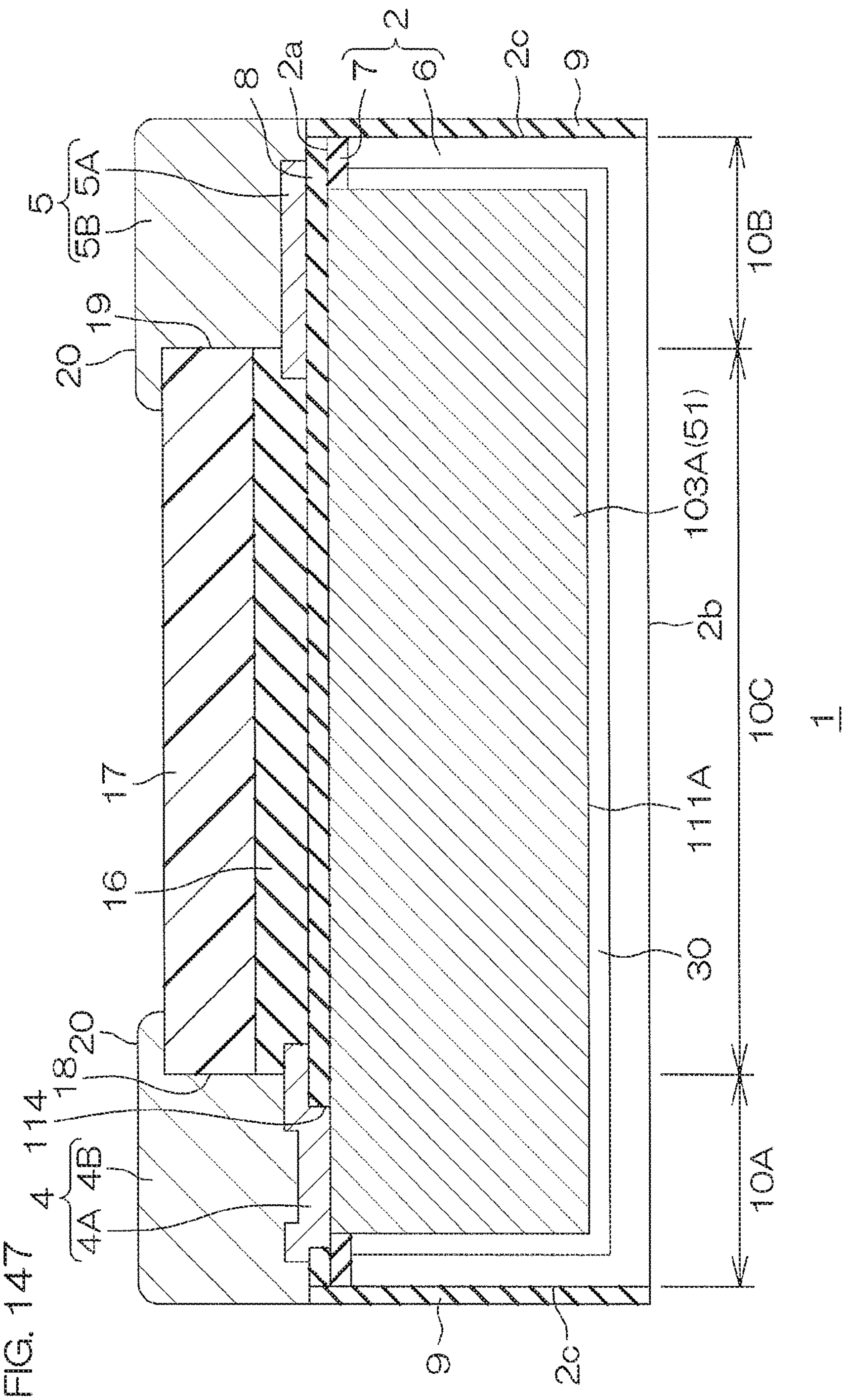

FIG. 147 is a cross-sectional view taken along line CXLVII-CXLVII in FIG. 146.

Figure 148:
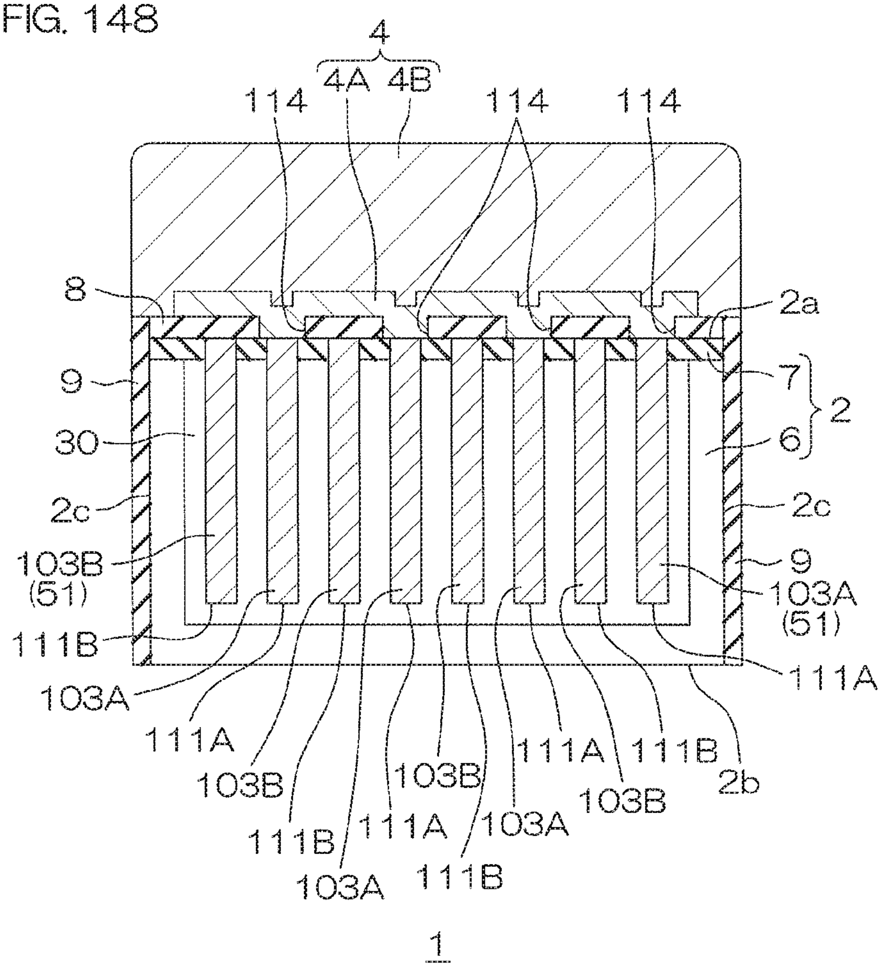

FIG. 148 is a cross-sectional view taken along line CXLVIII-CXLVIII in FIG. 146.

Figure 149:
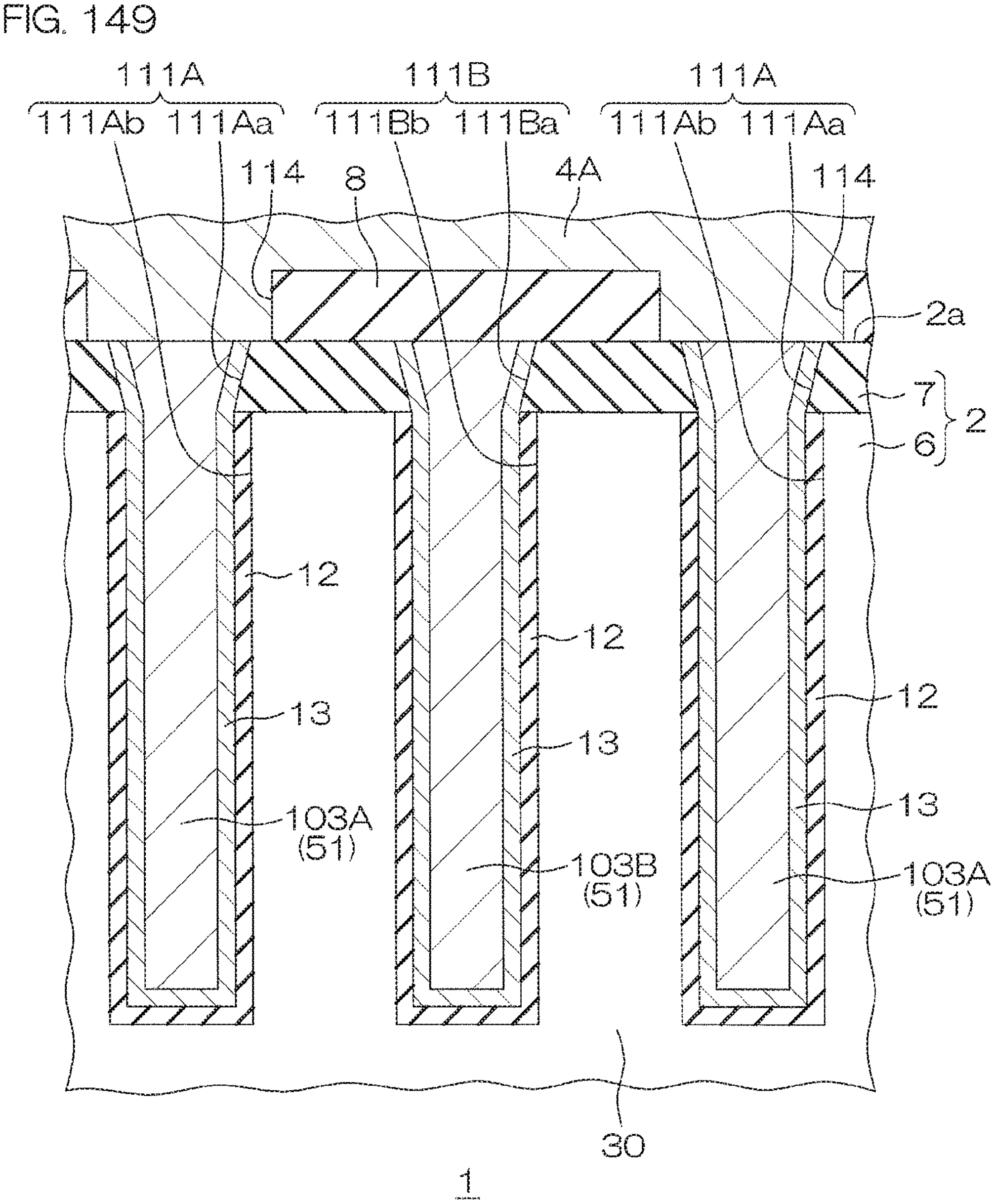

FIG. 149 is a partially enlarged cross-sectional view of FIG. 148.

Figure 150:
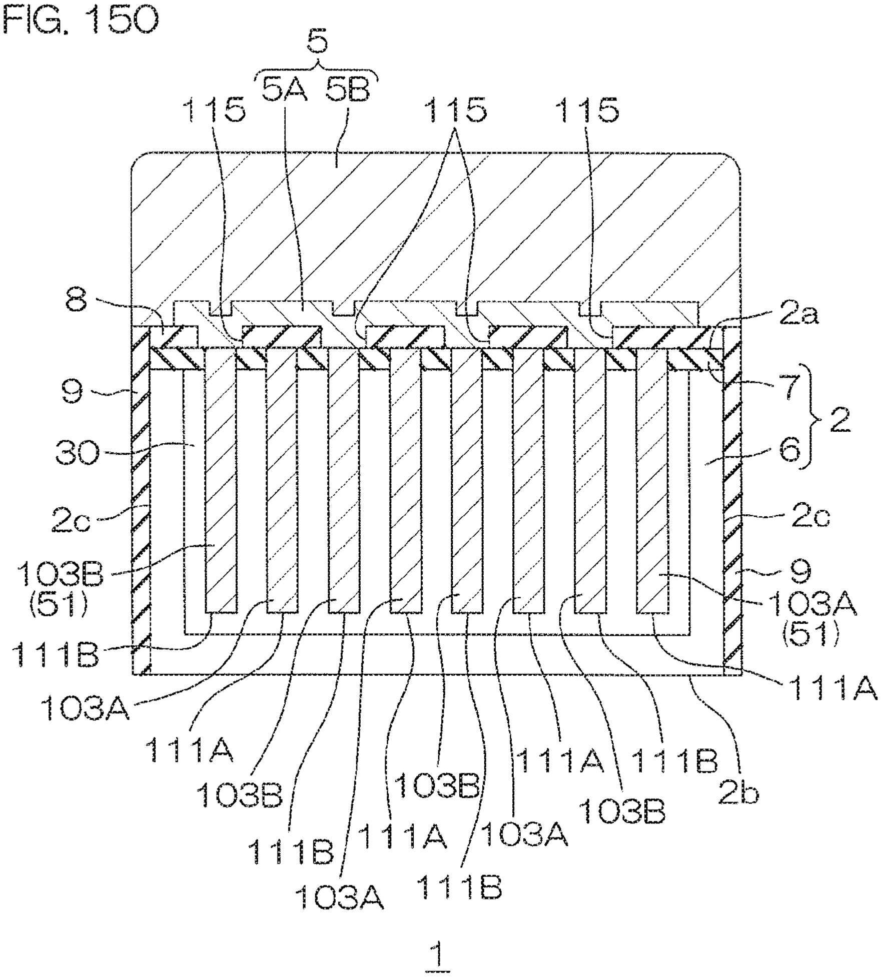

FIG. 150 is a cross-sectional view taken along line CL-CL in FIG. 146.

Figure 151:
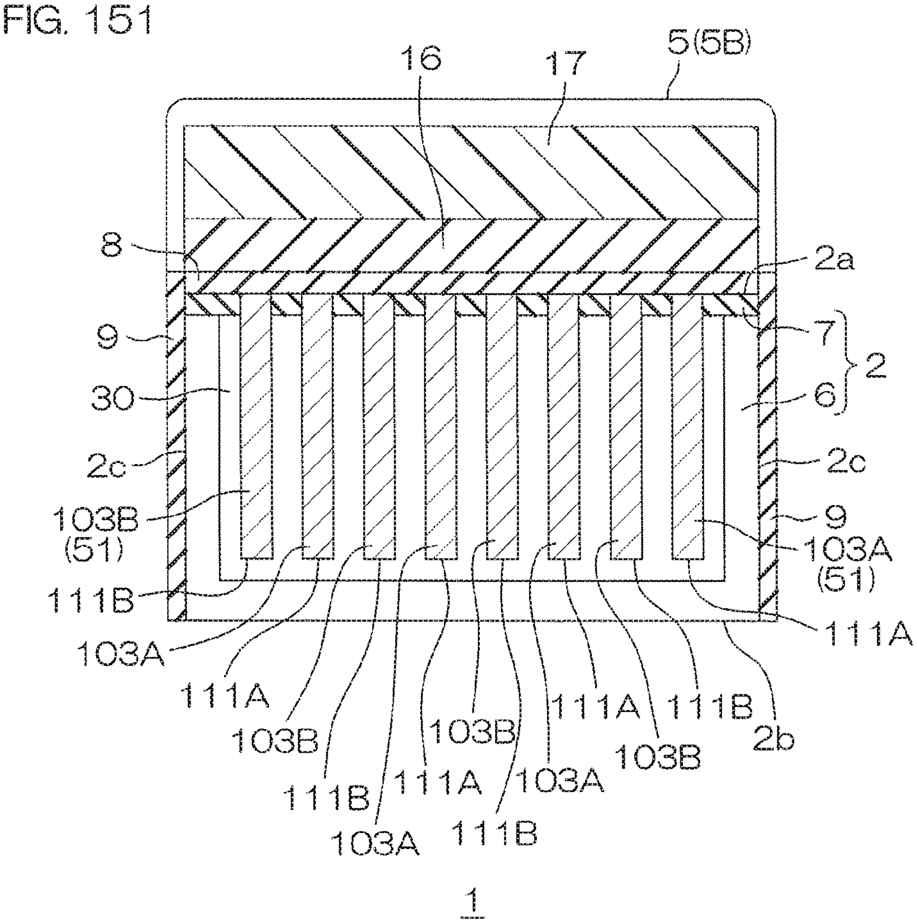

FIG. 151 is a cross-sectional view taken along line CLI-CLI in FIG. 146.

Figure 152:
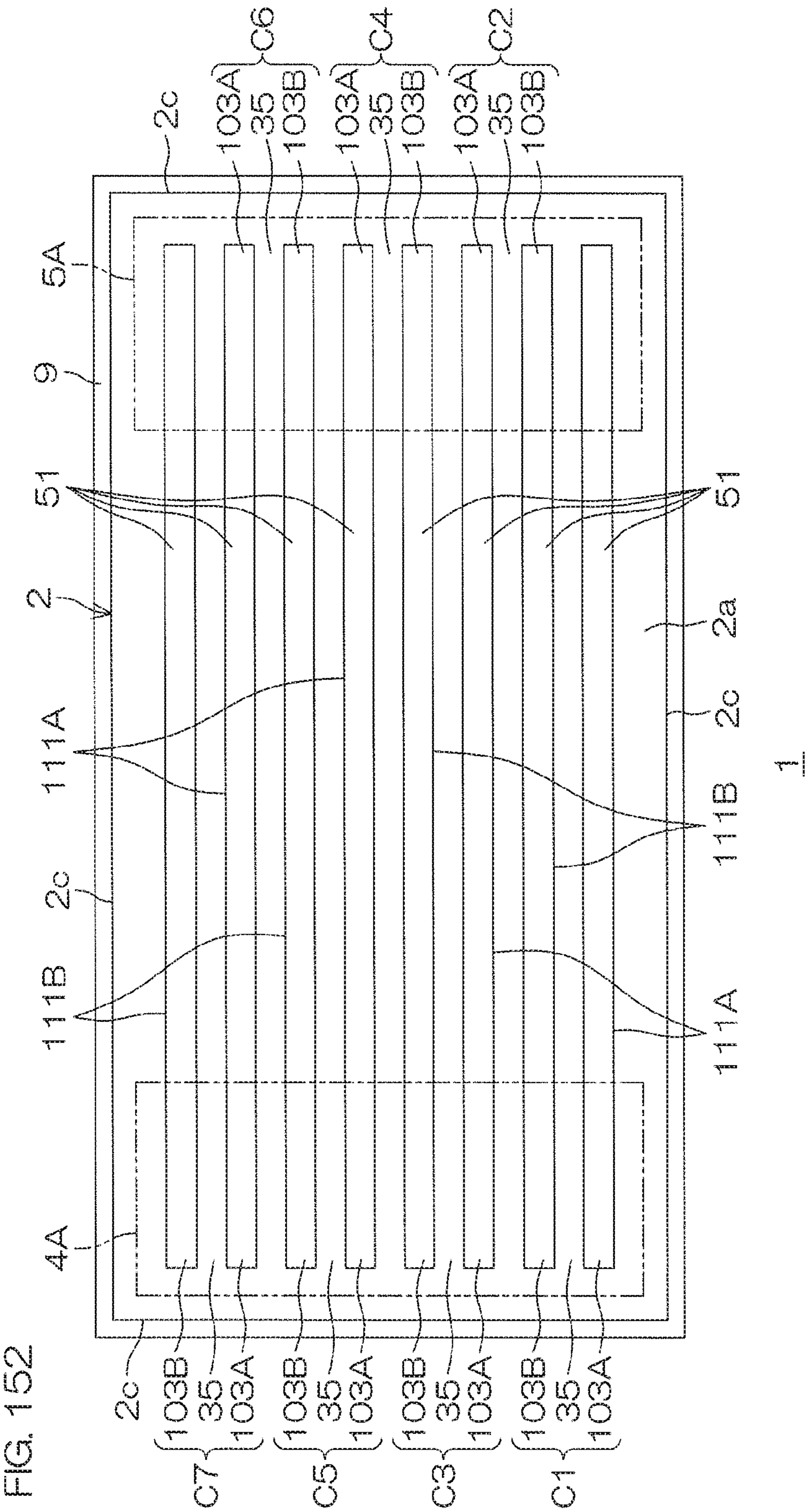

FIG. 152 is a plan view showing a structure of the surface of a substrate by removing an arrangement formed on the surface of the substrate.

Figure 153:
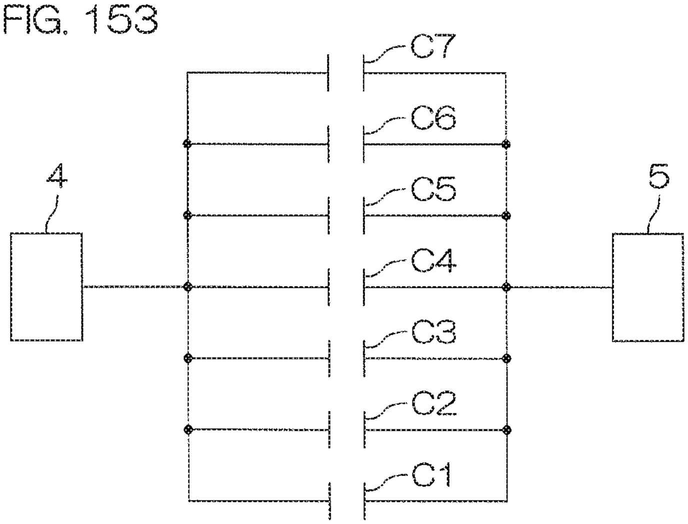

FIG. 153 is an electrical circuit diagram showing an electrical structure within the chip capacitor.

Figure 154:
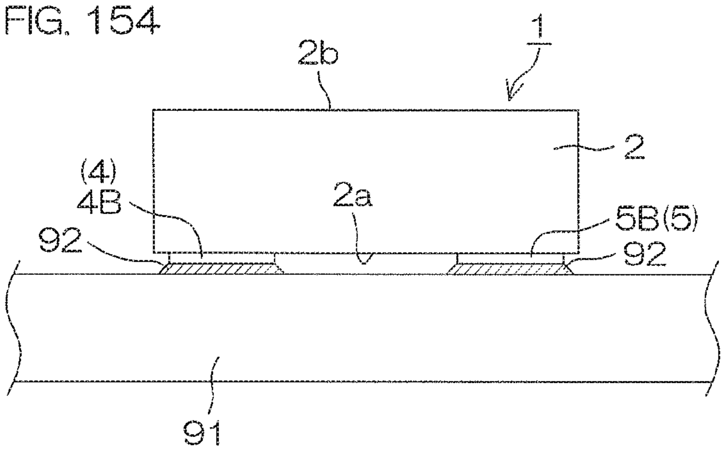

FIG. 154 is a cross-sectional view showing the structure of a circuit assembly in which the chip capacitor is flip-chip connected on the mounting substrate.

Figure 155A:
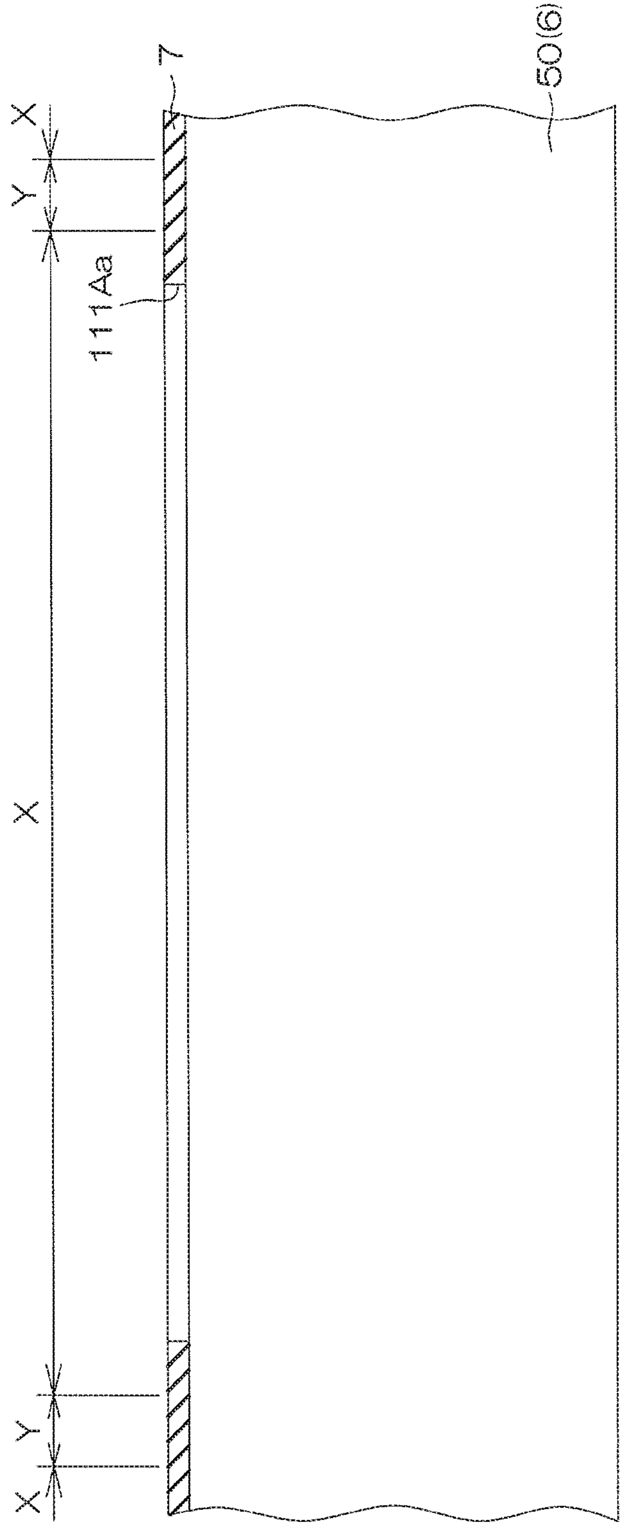

FIG. 155A is a cross-sectional view for illustrating an example of the manufacturing step of the chip capacitor, and is a cut surface corresponding to FIG. 147.

Figure 155B:
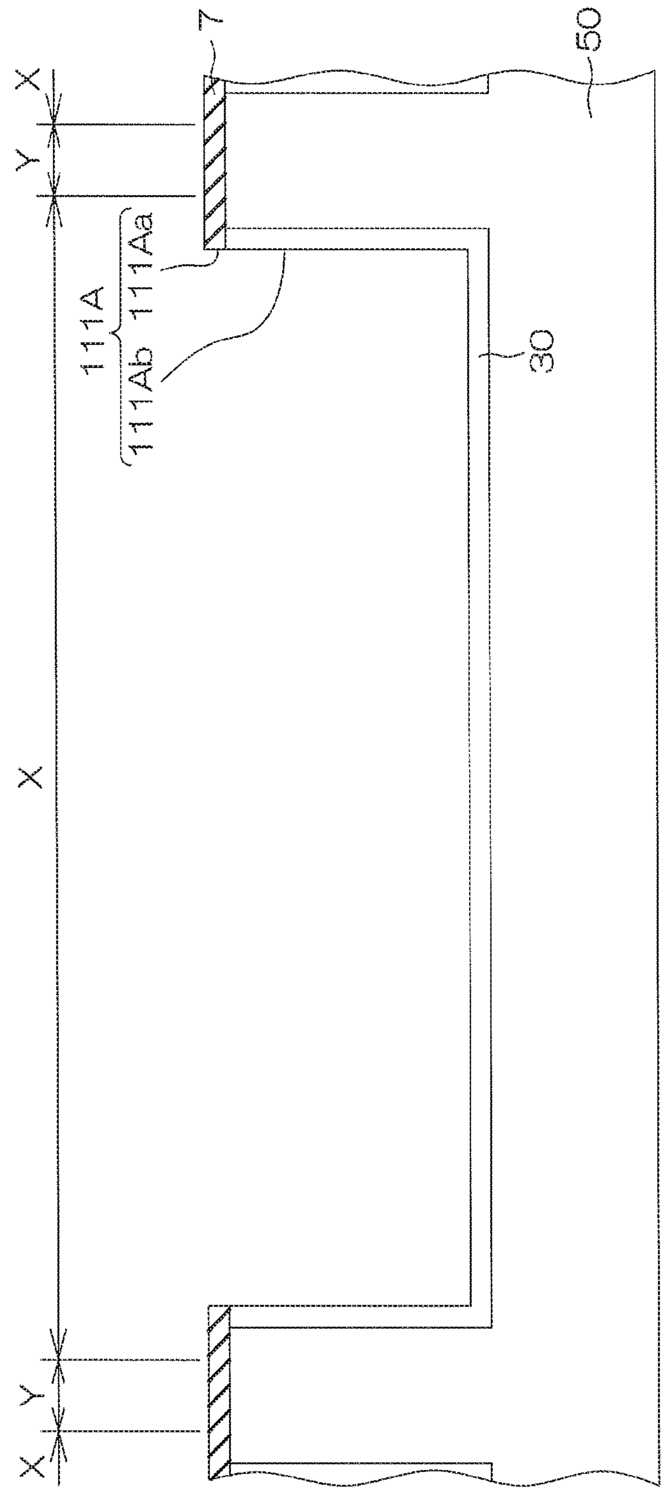

FIG. 155B is a cross-sectional view showing the step subsequent to FIG. 155A.

Figure 155C:
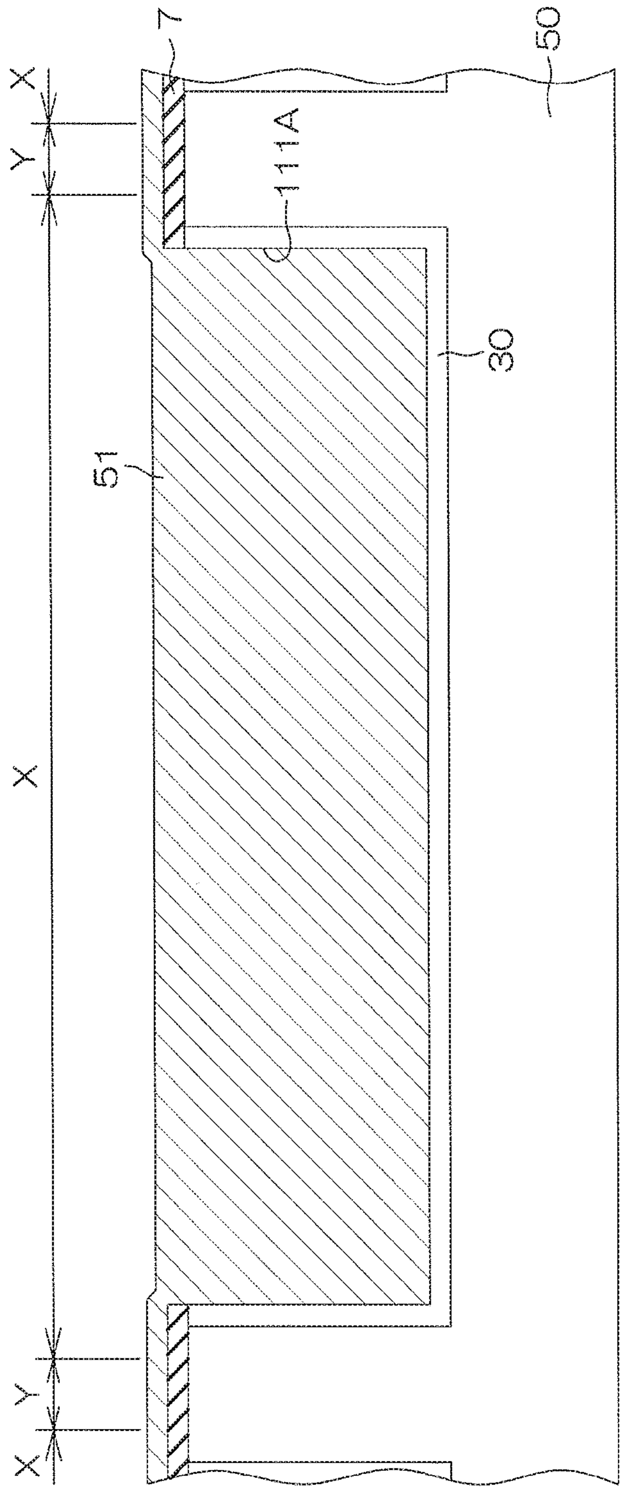

FIG. 155C is a cross-sectional view showing the step subsequent to FIG. 155B.

Figure 155D:
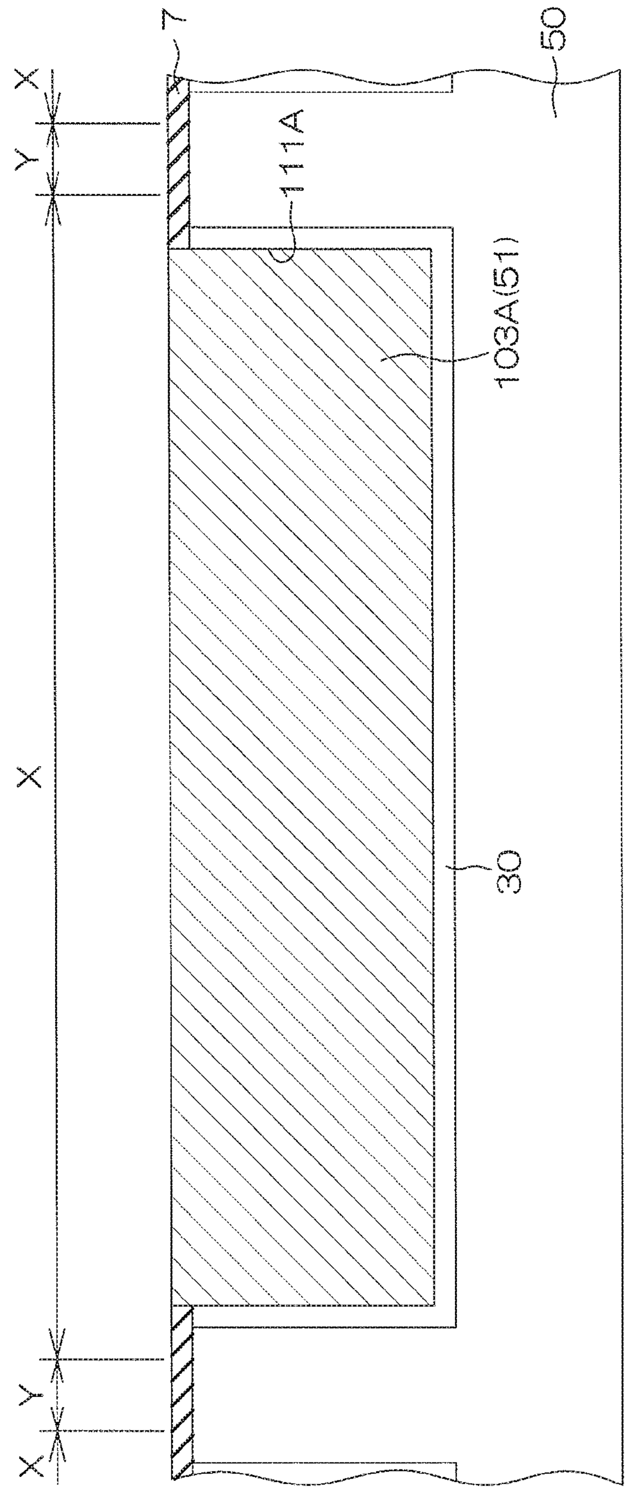

FIG. 155D is a cross-sectional view showing the step subsequent to FIG. 155C.

Figure 155E:
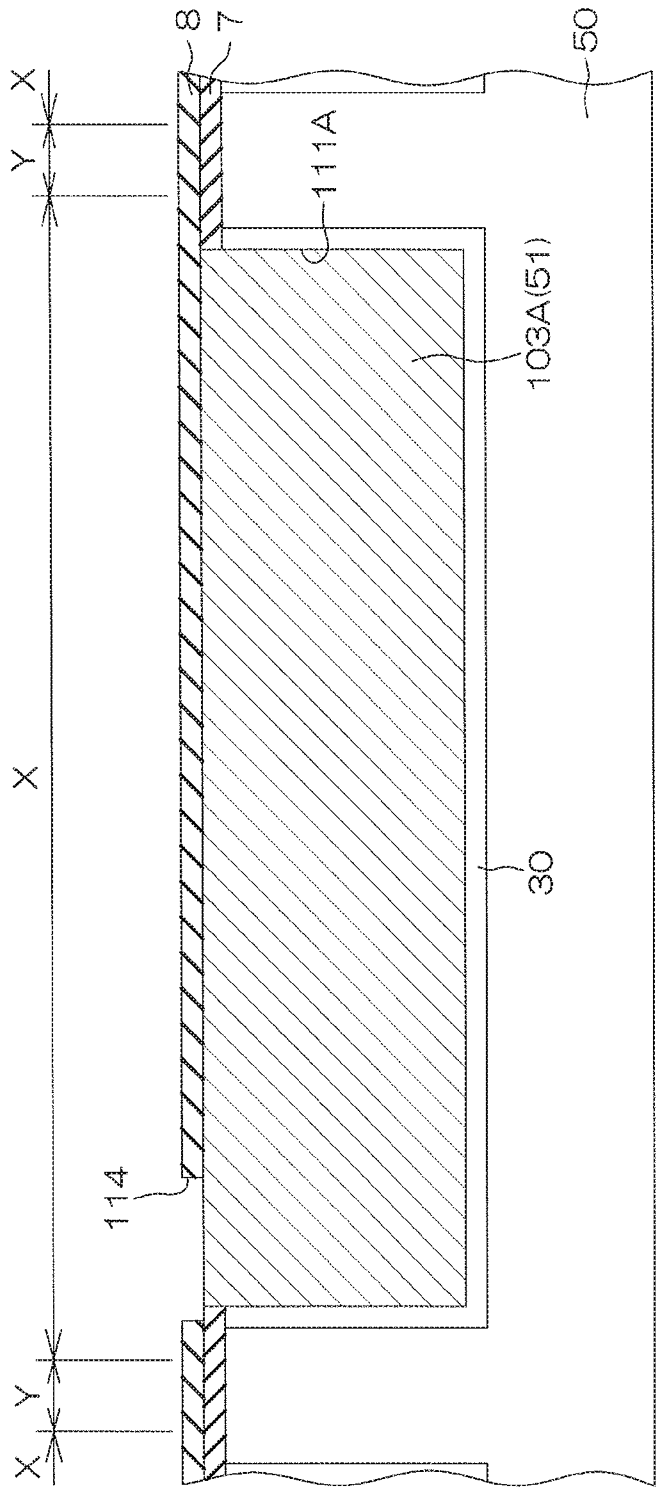

FIG. 155E is a cross-sectional view showing the step subsequent to FIG. 155D.

Figure 155F:
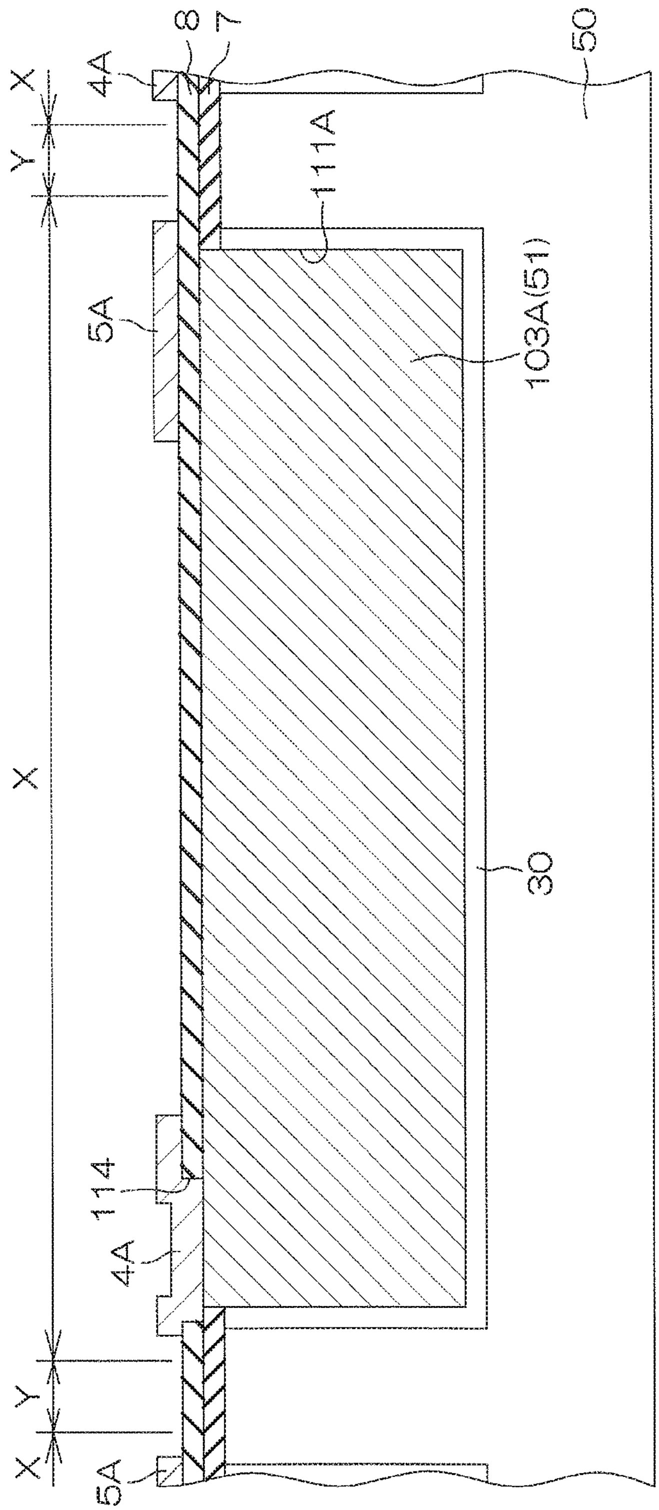

FIG. 155F is a cross-sectional view showing the step subsequent to FIG. 155E.

Figure 155G:
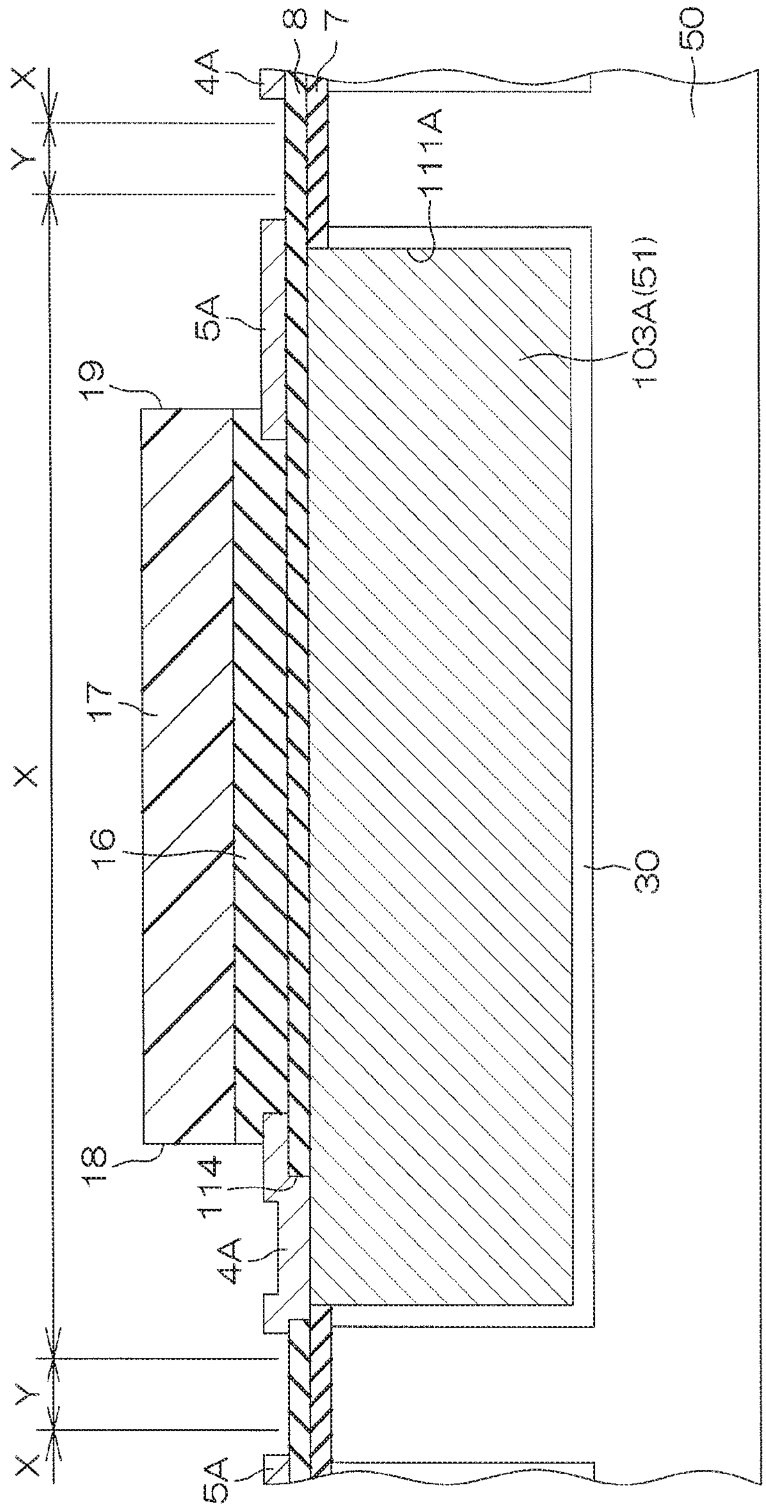

FIG. 155G is a cross-sectional view showing the step subsequent to FIG. 155F.

Figure 155H:
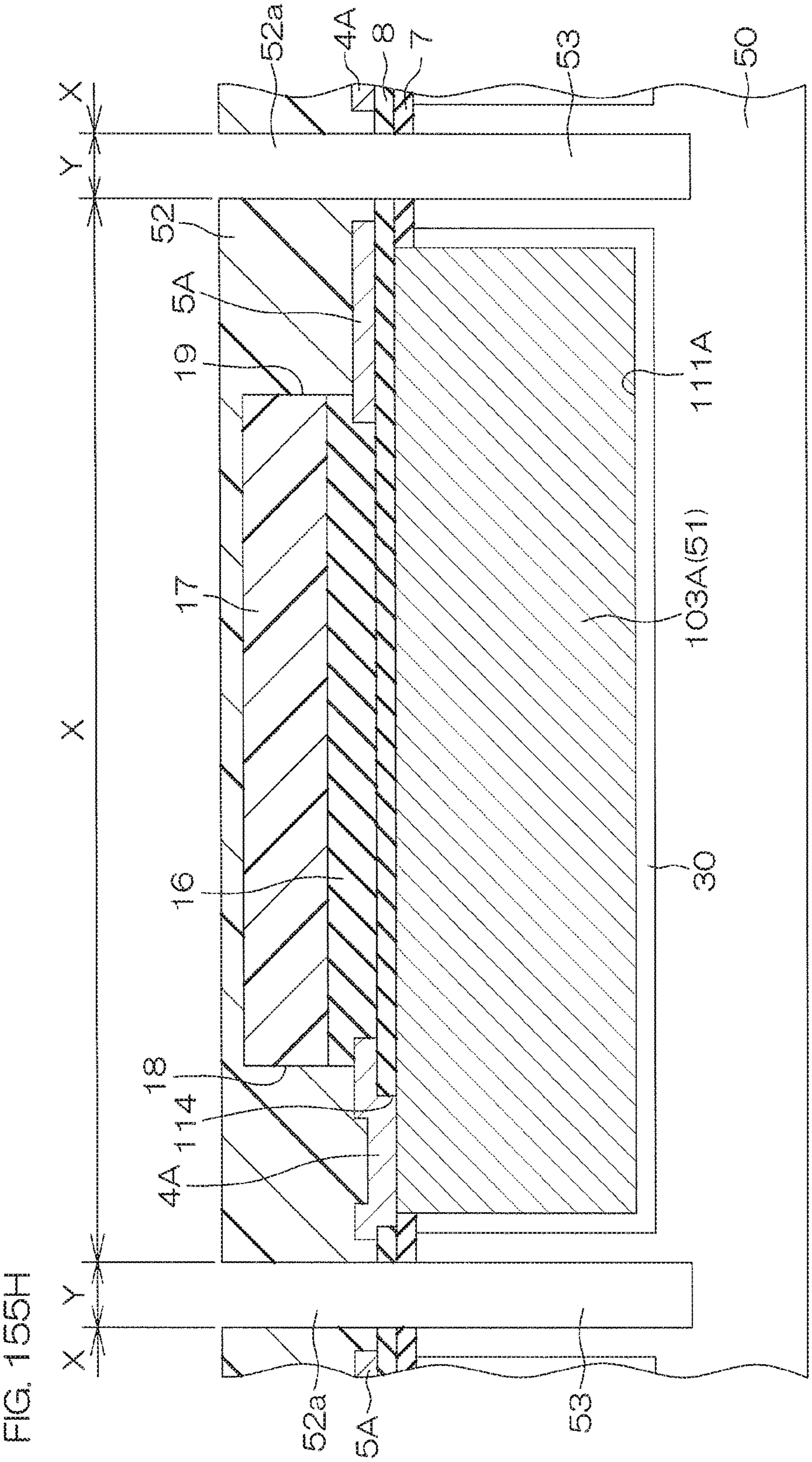
Figure 155:
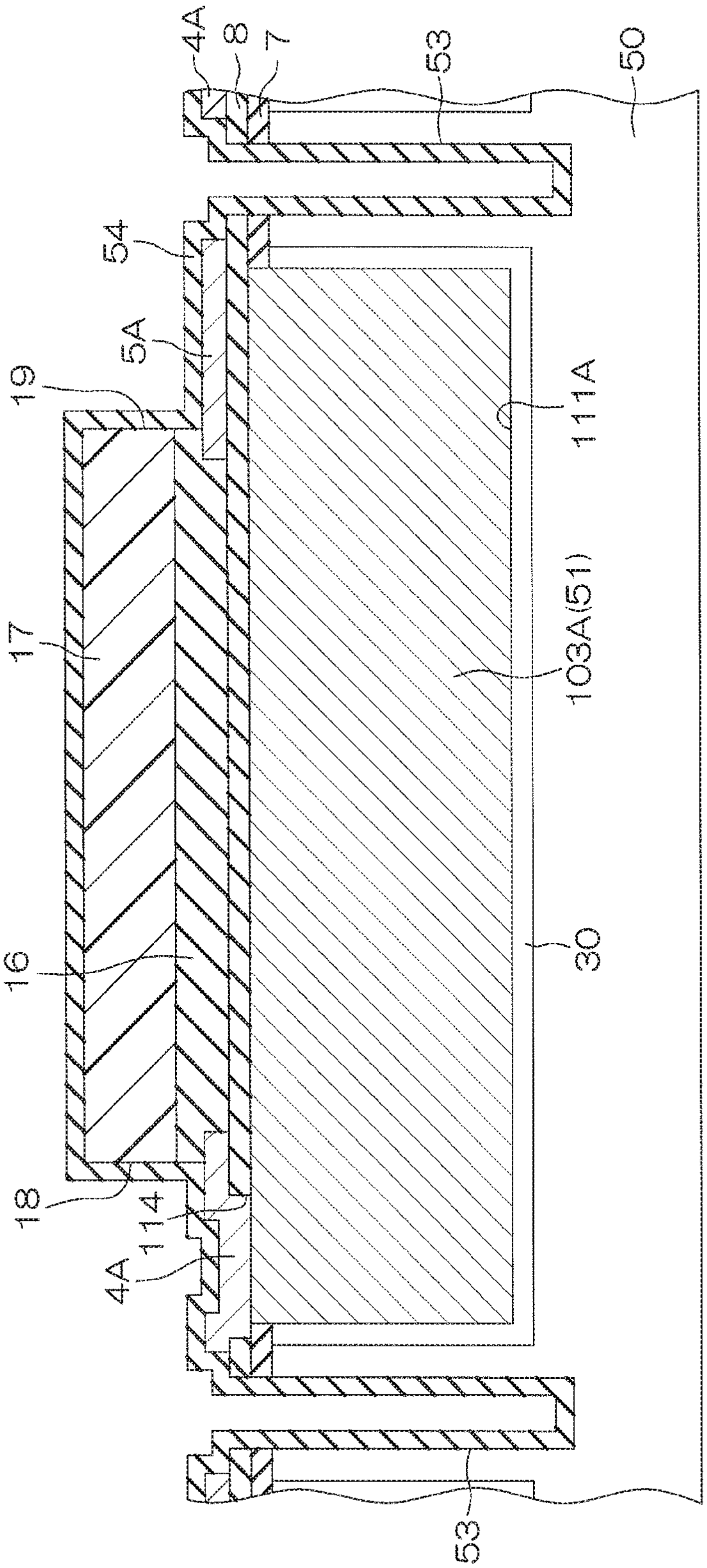

FIG. 155H is a cross-sectional view showing the step subsequent to FIG. 155G.

FIG. 155I is a cross-sectional view showing the step subsequent to FIG. 155H.

Figure 155J:
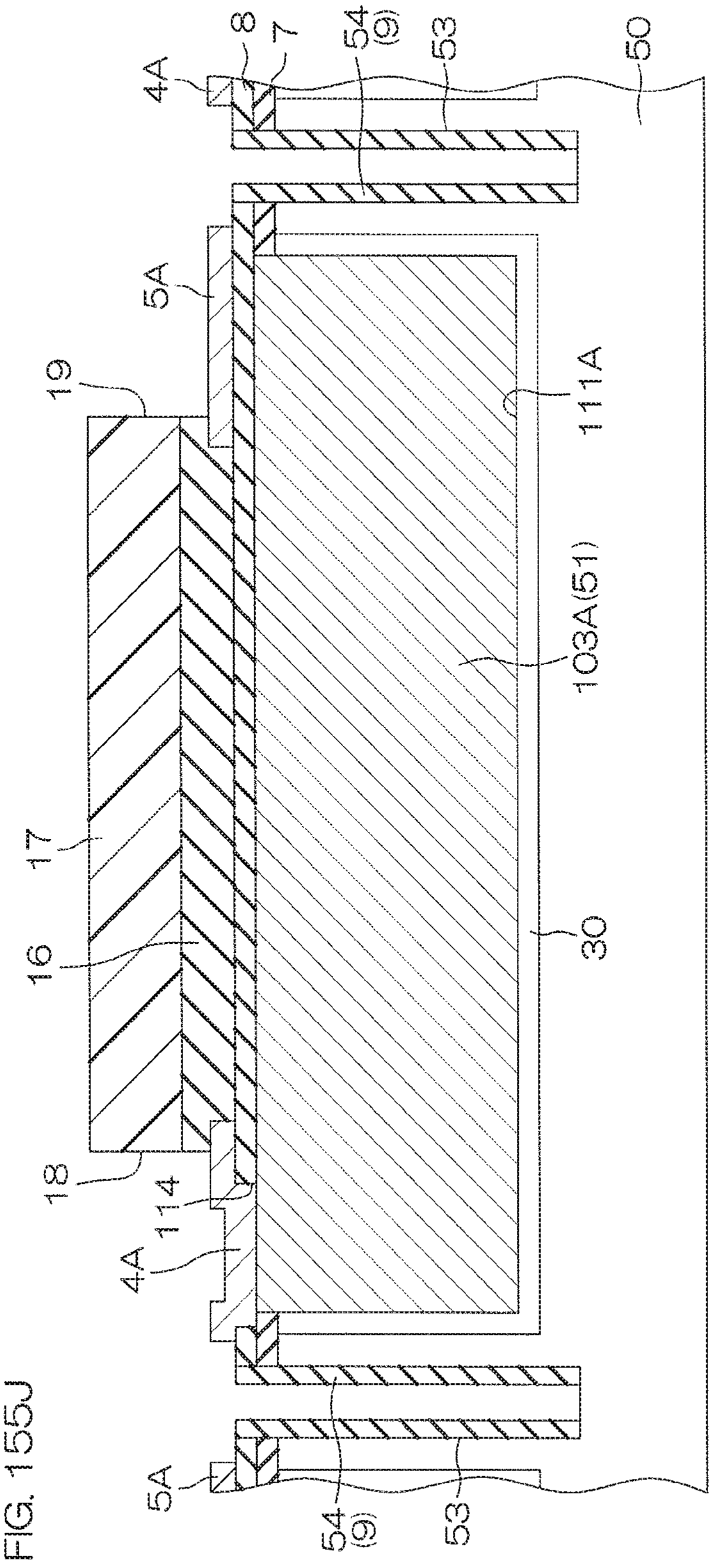

FIG. 155J is a cross-sectional view showing the step subsequent to FIG. 155I.

Figure 155K:
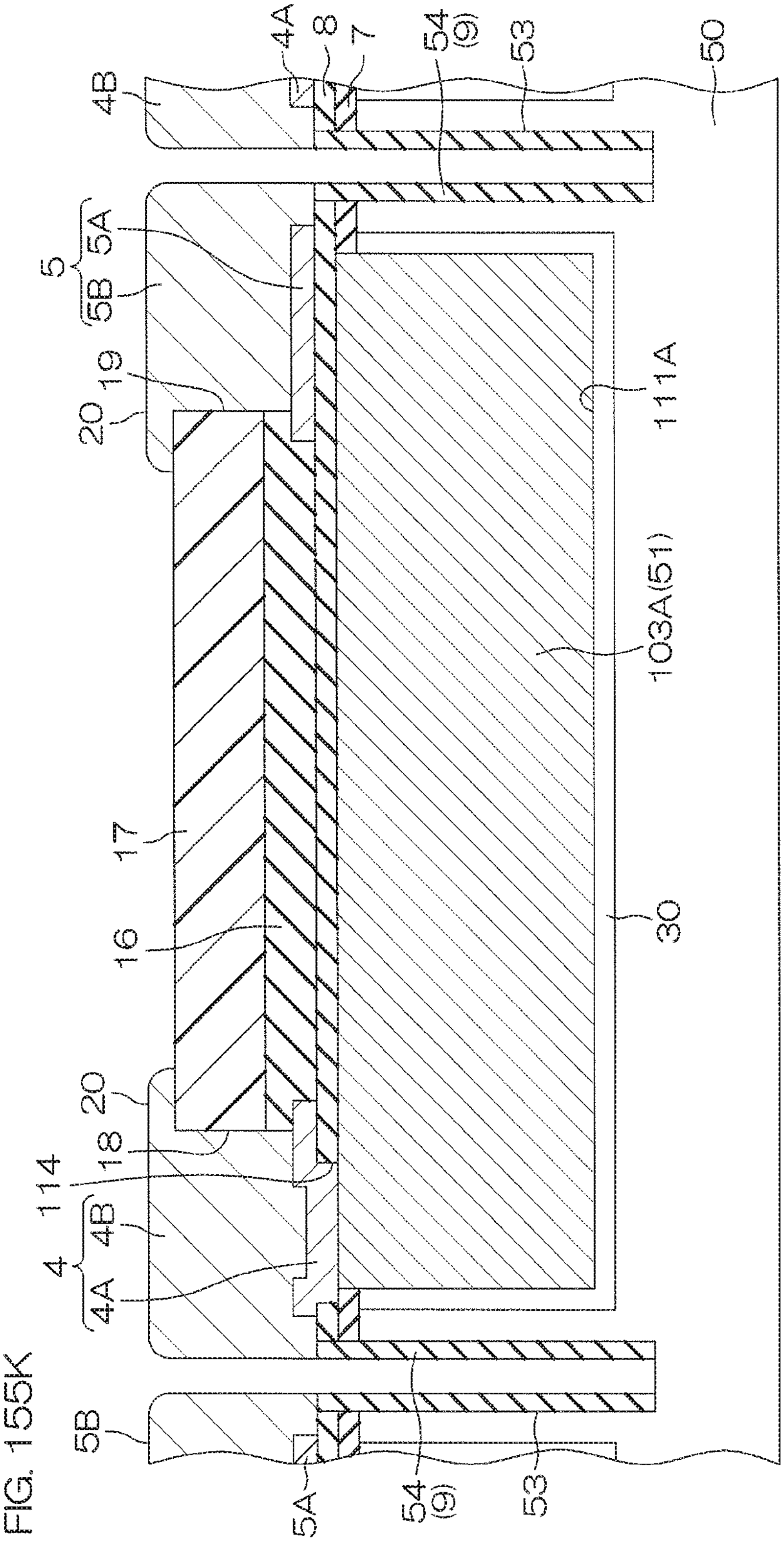

FIG. 155K is a cross-sectional view showing the step subsequent to FIG. 155J.

Figure 155L:
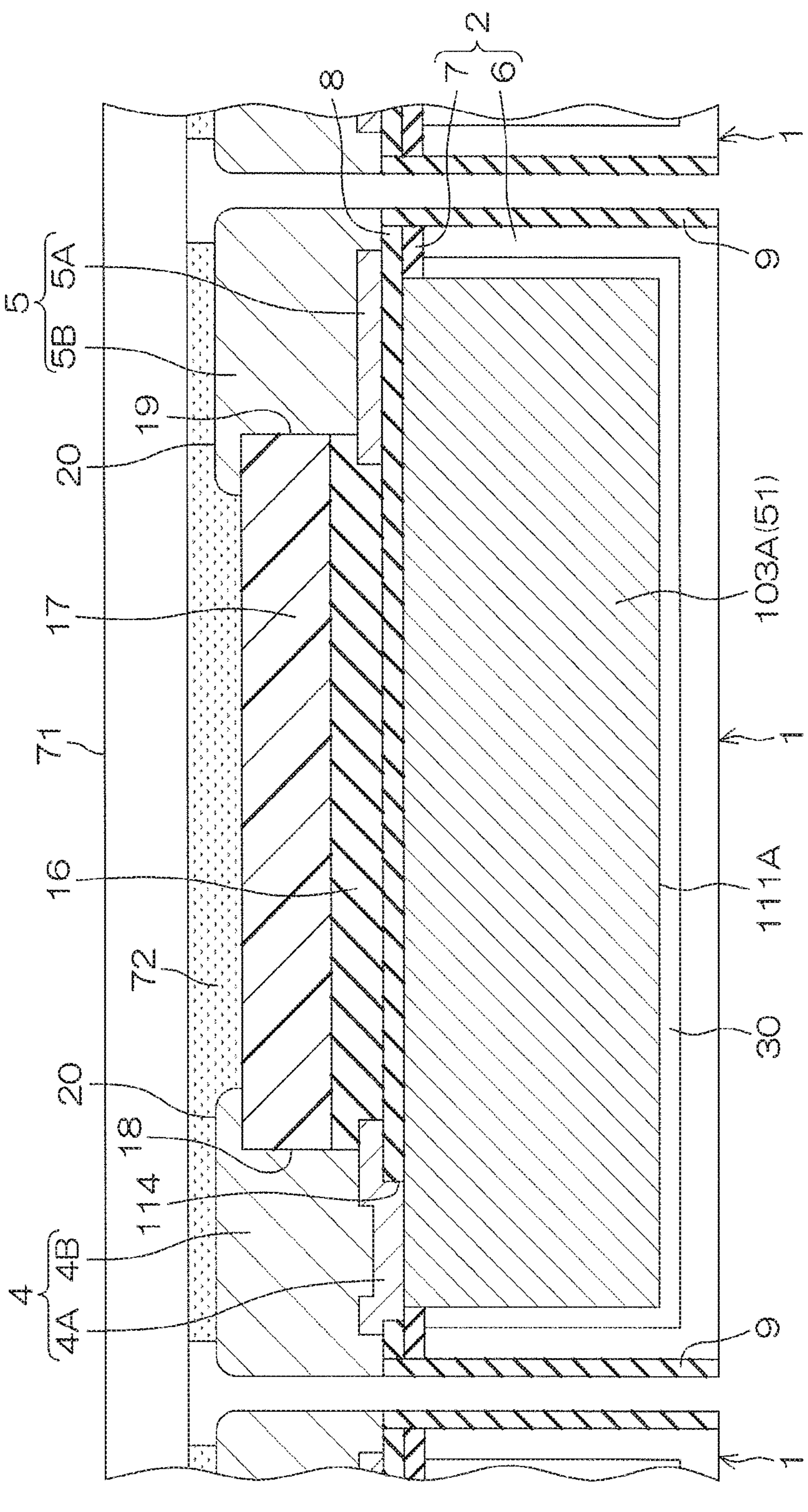

FIG. 155L is a cross-sectional view showing the step subsequent to FIG. 155K.

Figure 156A:
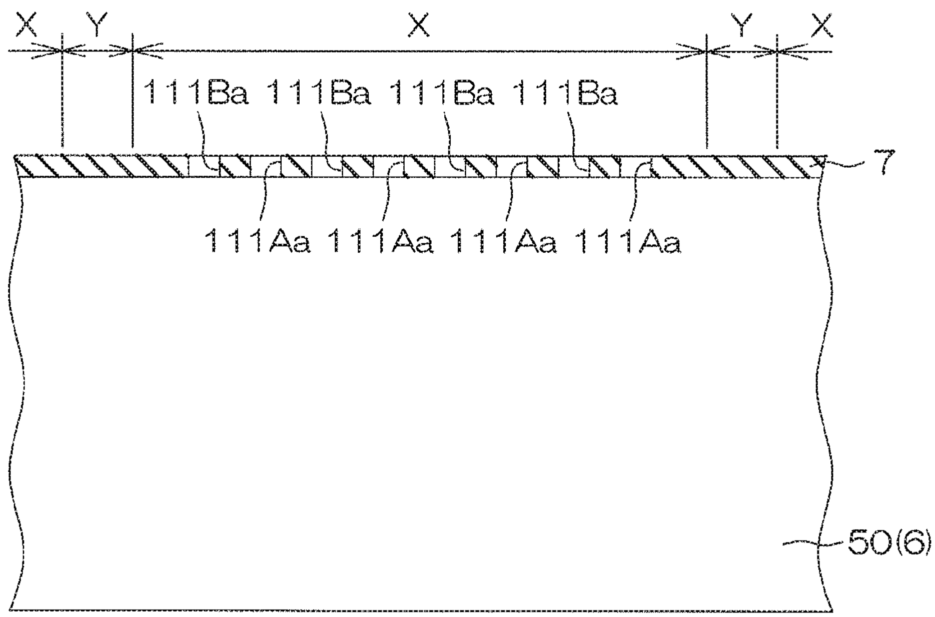

FIG. 156A is a cross-sectional view for illustrating an example of the manufacturing step of the chip capacitor, and is a cross-sectional view corresponding to FIG. 148.

Figure 156B:
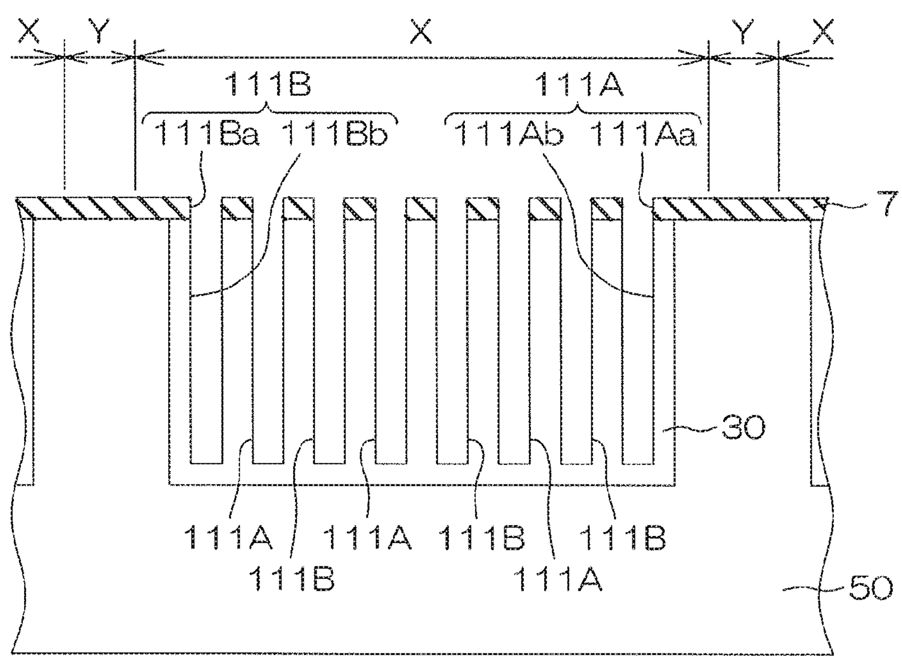

FIG. 156B is a cross-sectional view showing the step subsequent to FIG. 156A.

Figure 156C:
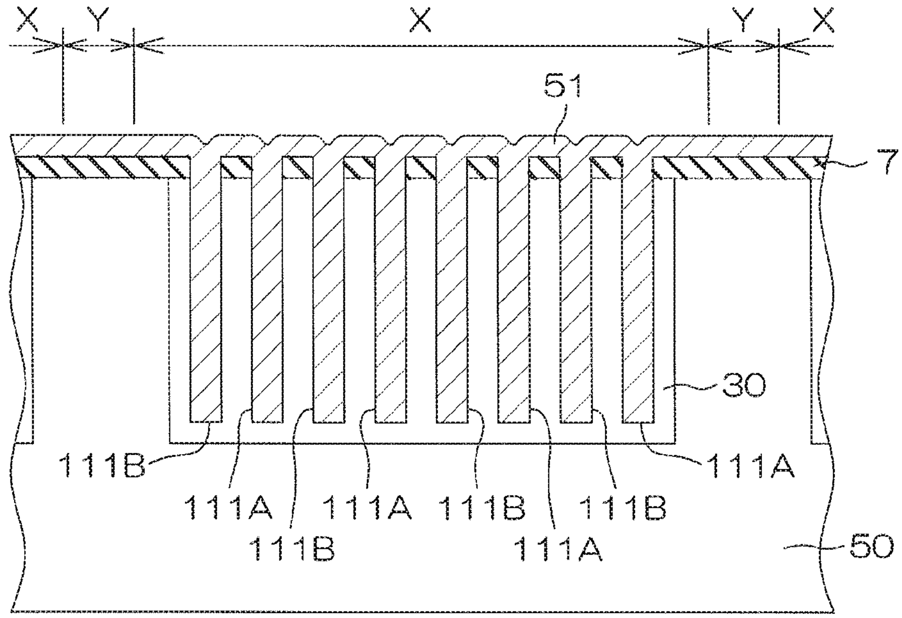

FIG. 156C is a cross-sectional view showing the step subsequent to FIG. 156B.

Figure 156D:
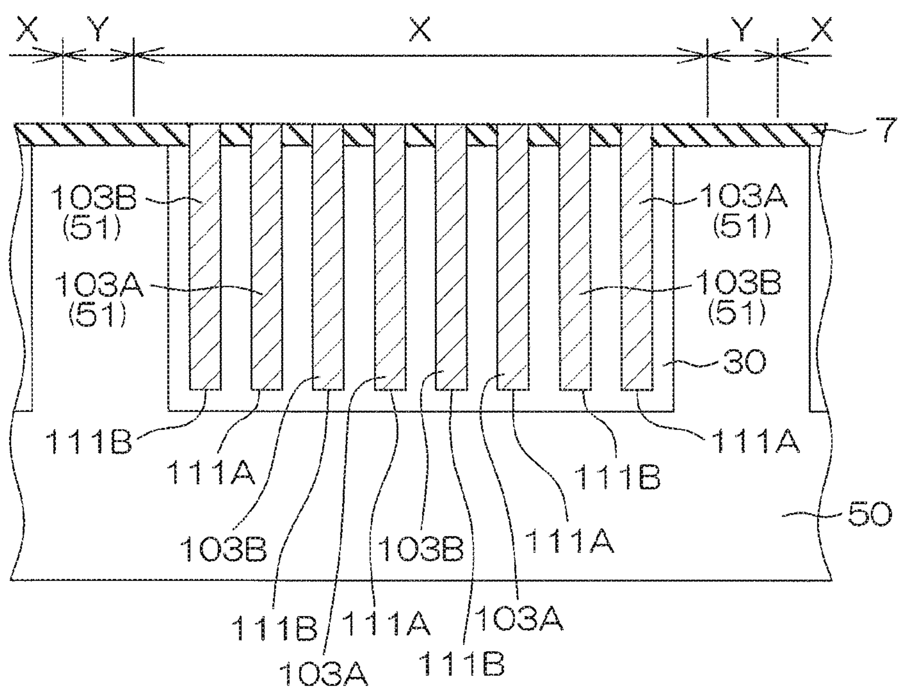

FIG. 156D is a cross-sectional view showing the step subsequent to FIG. 156C.

Figure 156E:
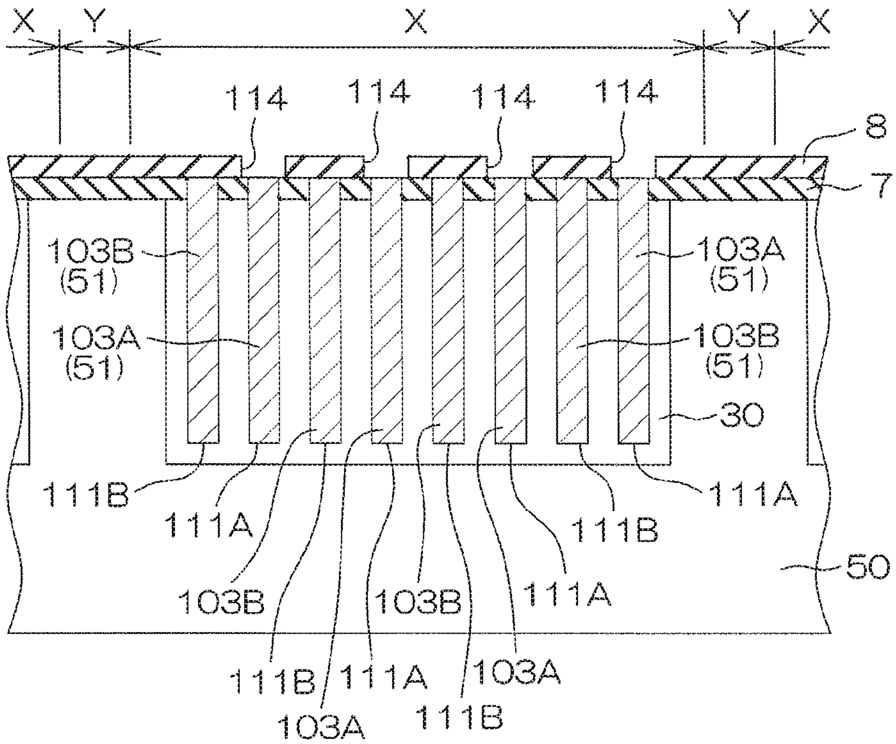

FIG. 156E is a cross-sectional view showing the step subsequent to FIG. 156D.

Figure 156F:
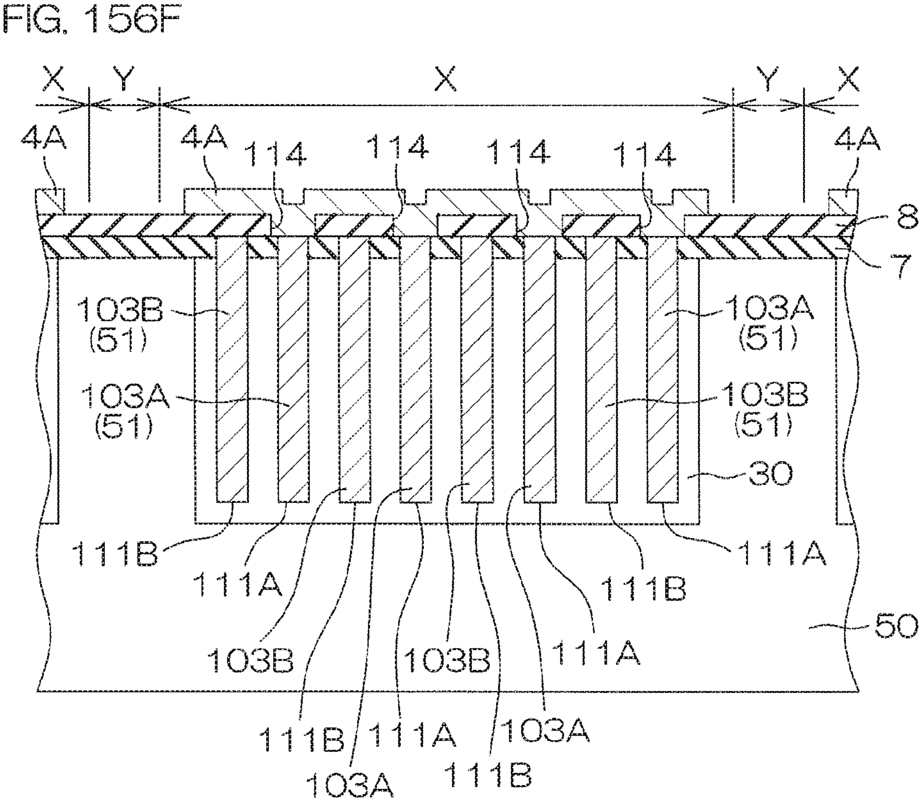

FIG. 156F is a cross-sectional view showing the step subsequent to FIG. 156E.

Figure 156G:
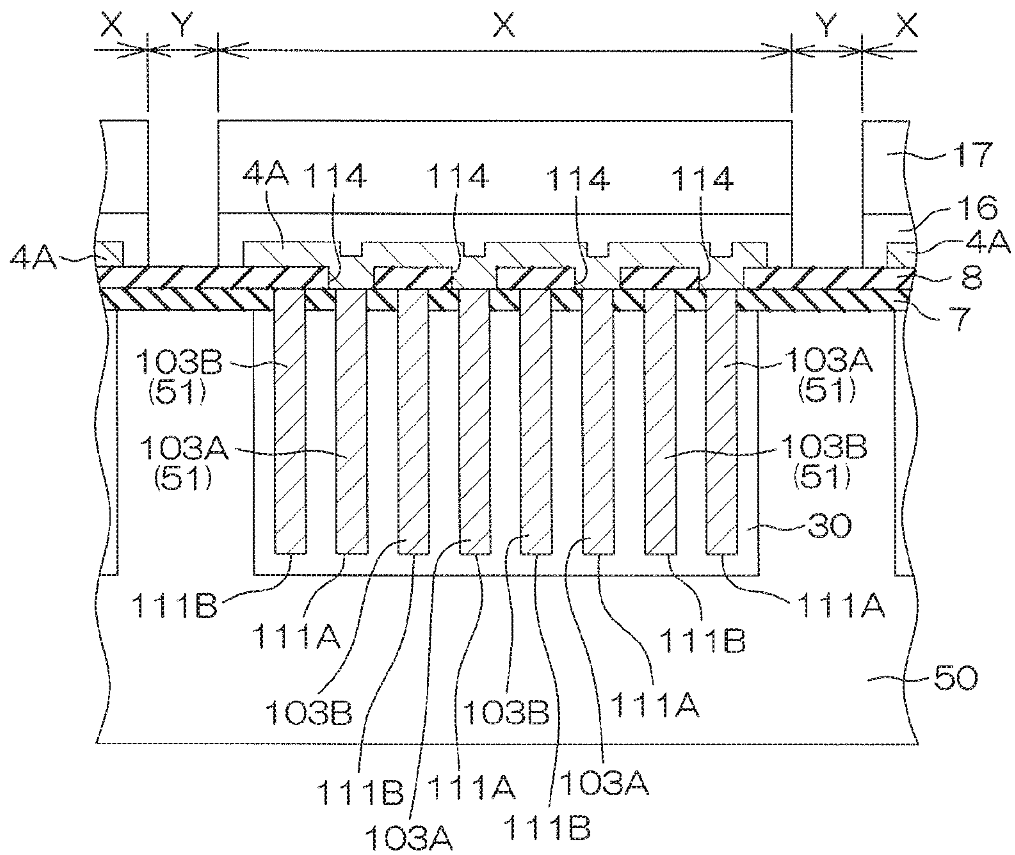

FIG. 156G is a cross-sectional view showing the step subsequent to FIG. 156F.

Figure 156H:
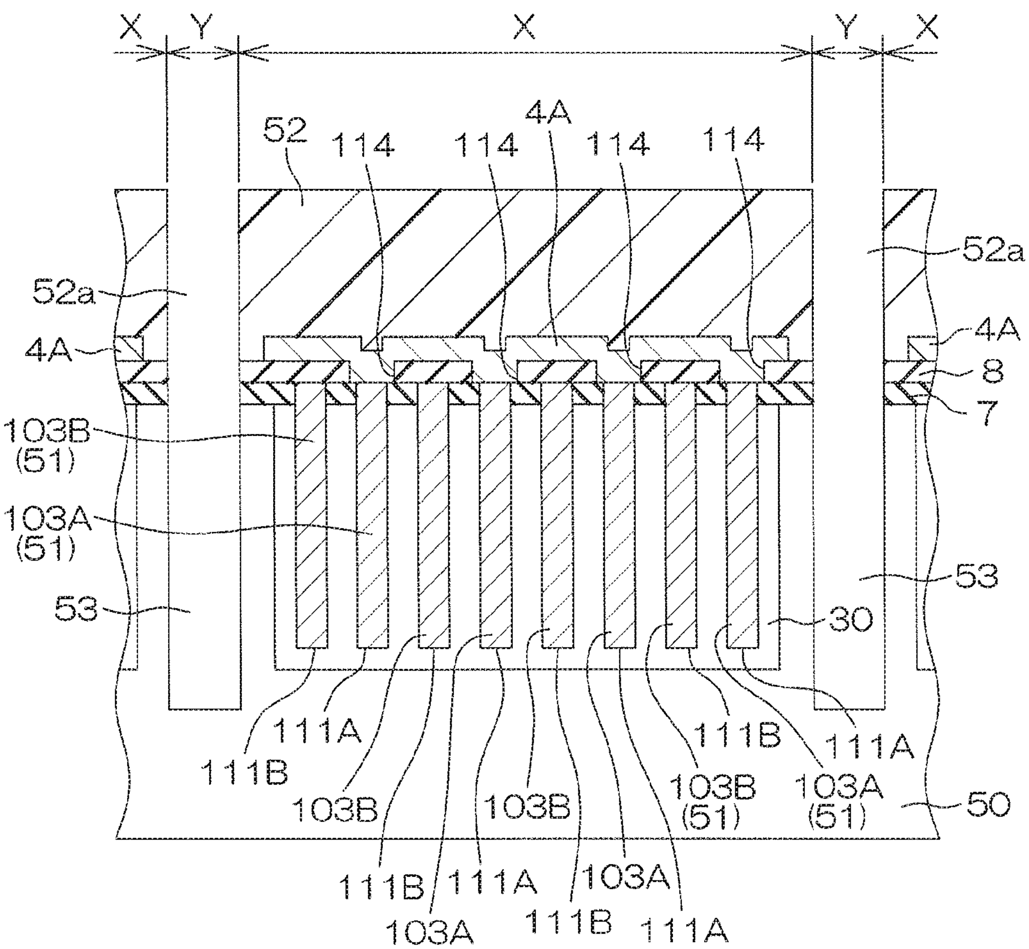
Figure 156:
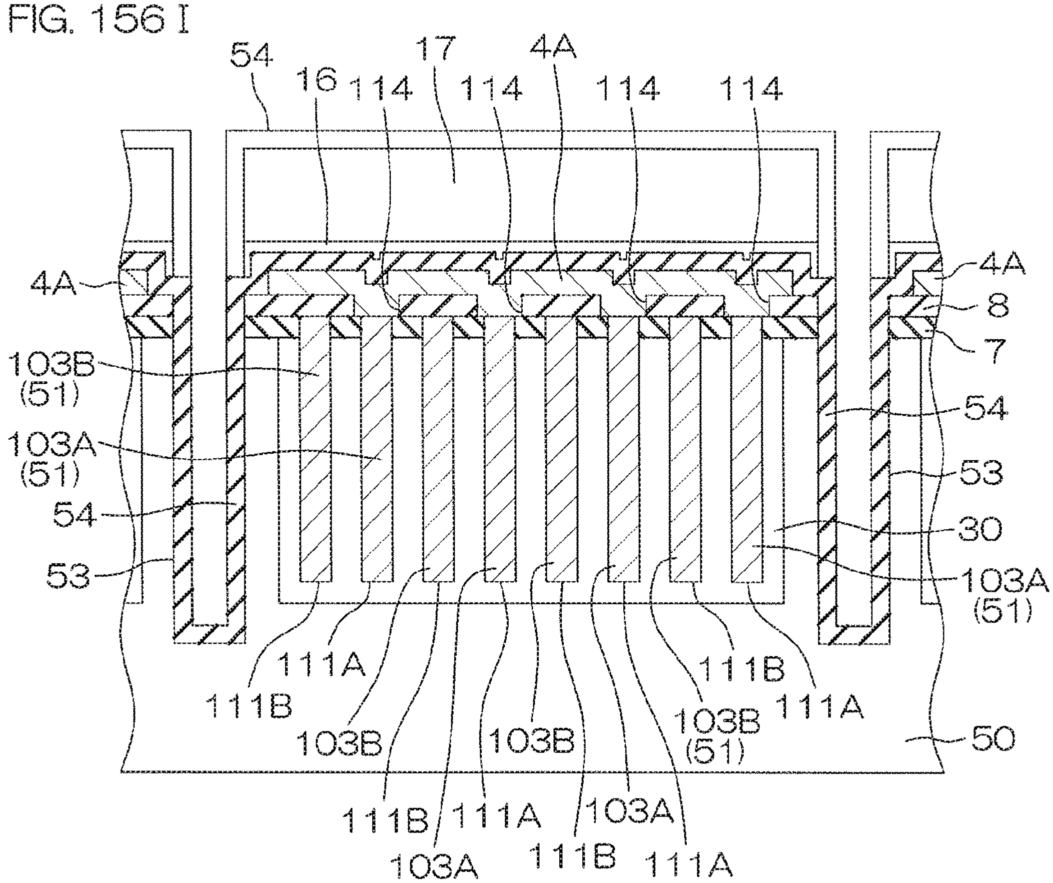

FIG. 156H is a cross-sectional view showing the step subsequent to FIG. 156G.

FIG. 156I is a cross-sectional view showing the step subsequent to FIG. 156H.

FIG. 156I is a cross-sectional view showing the step subsequent to FIG. 156I.

Figure 156J:
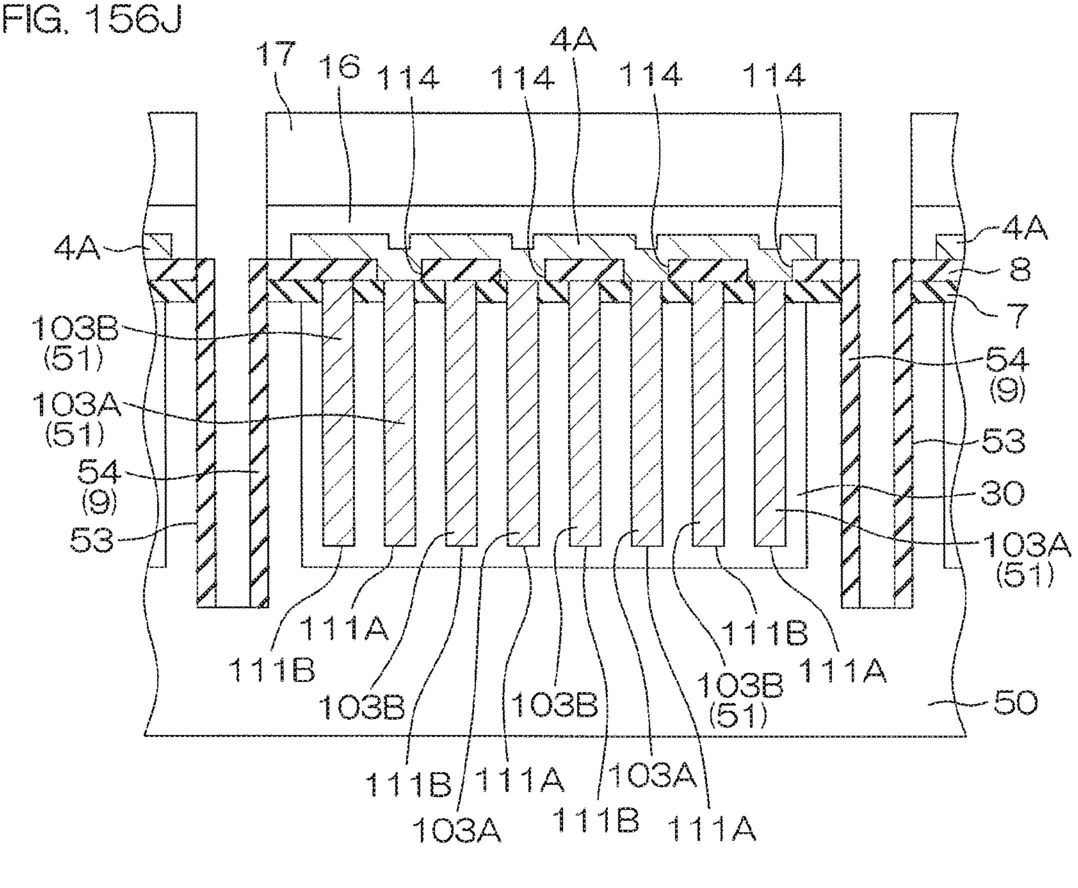
Figure 156K:
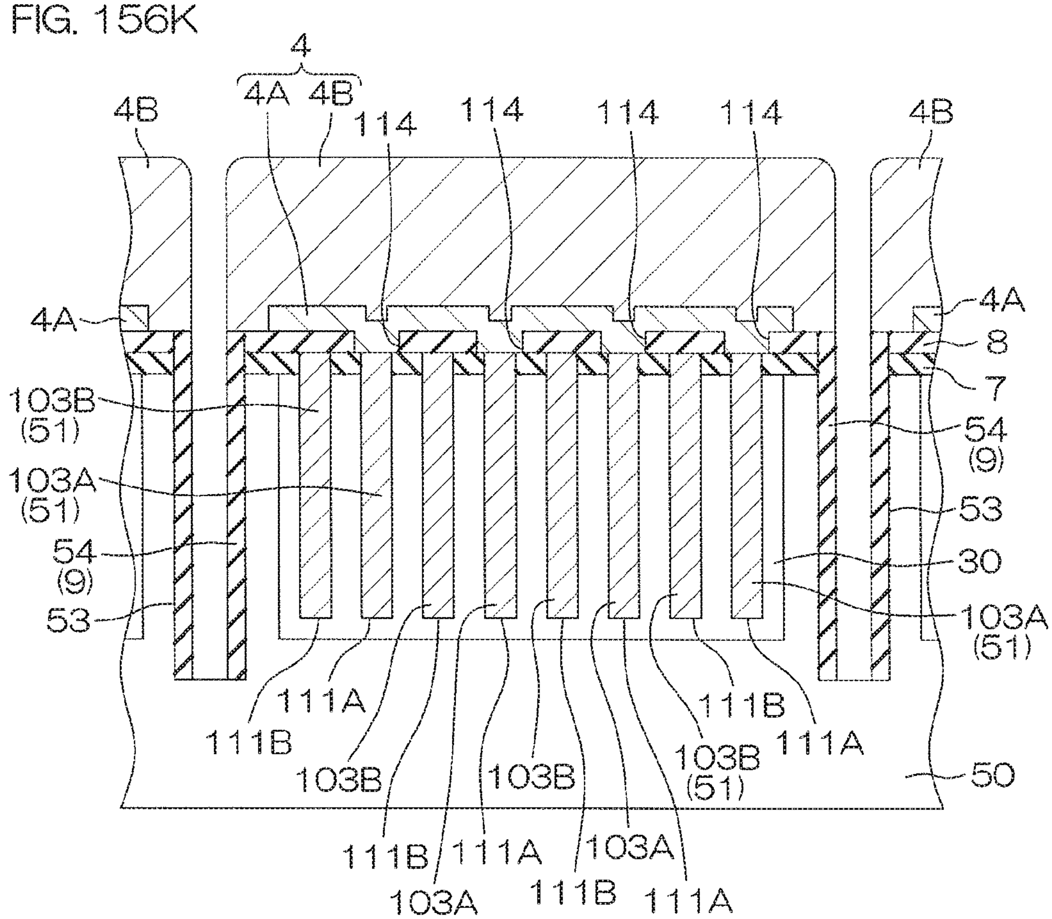

FIG. 156K is a cross-sectional view showing the step subsequent to FIG. 156J.

Figure 156L:
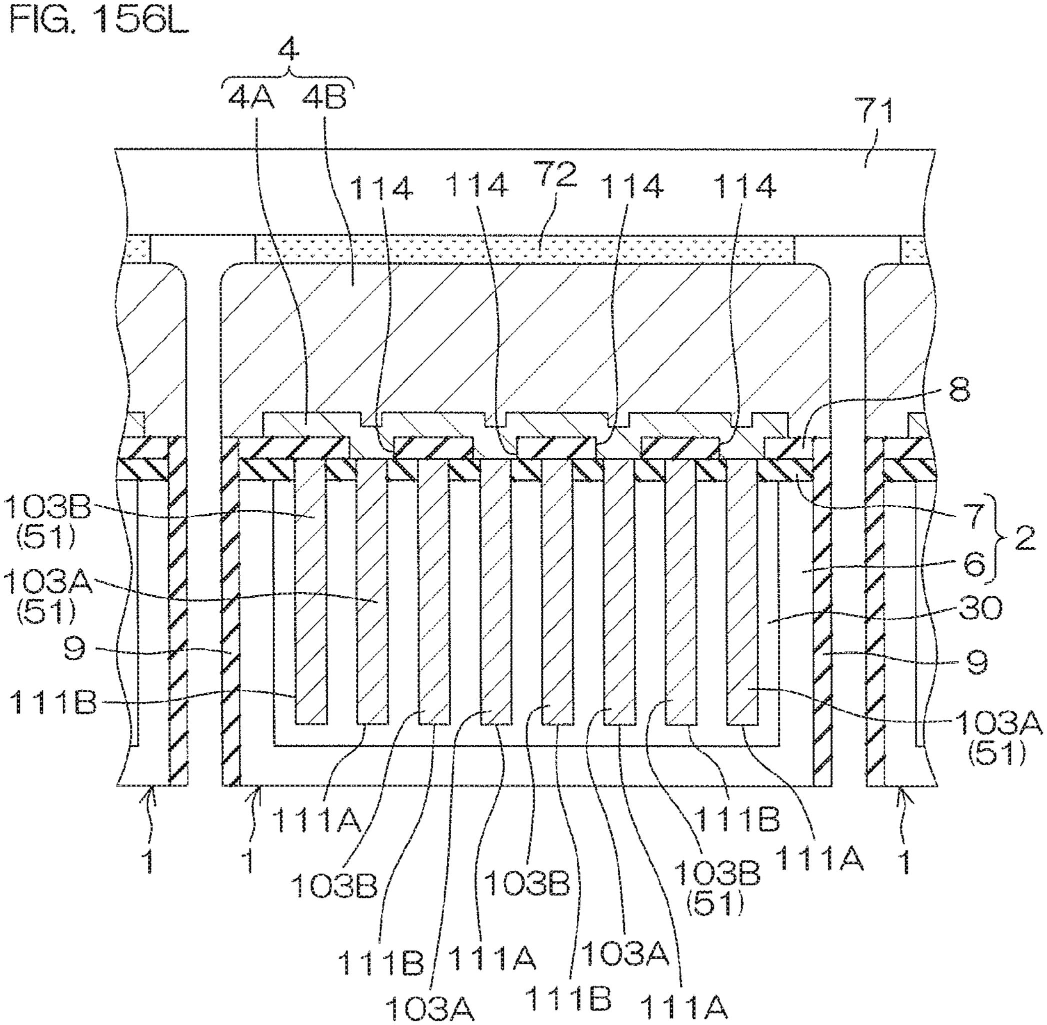

FIG. 156L is a cross-sectional view showing the step subsequent to FIG. 156K.

Figure 157A:
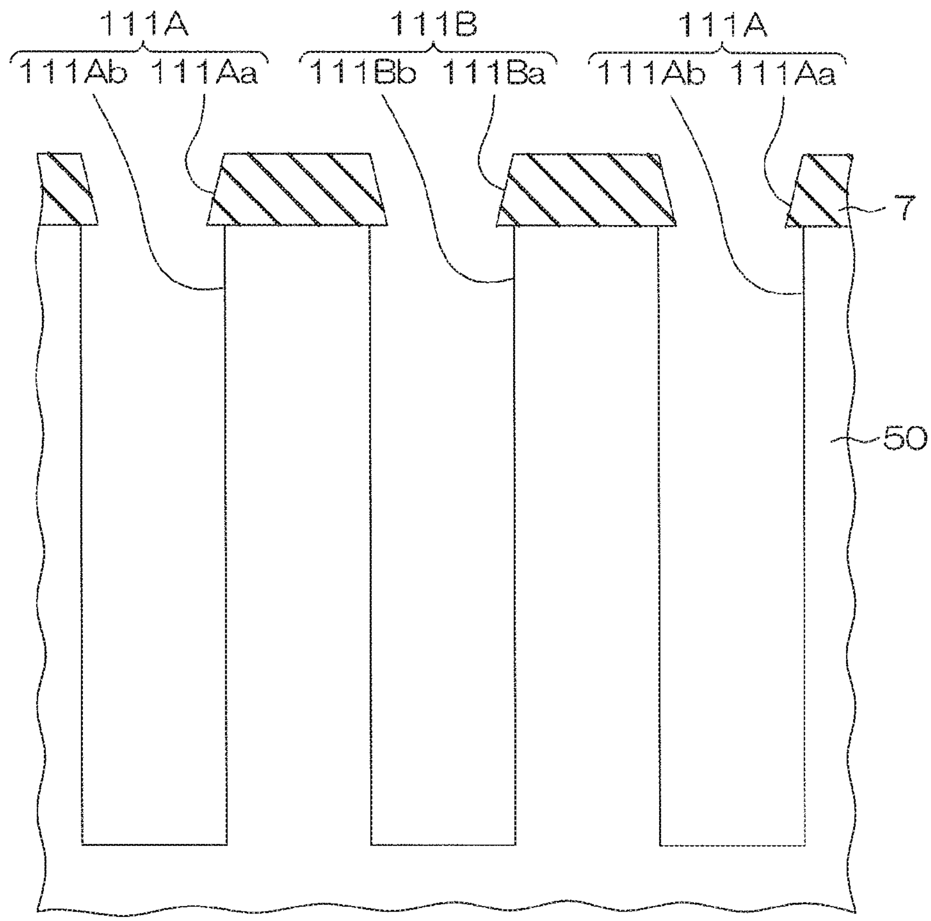

FIG. 157A is a partially enlarged cross-sectional view showing the details of the manufacturing step of a first internal electrode and a second internal electrode.

Figure 157B:
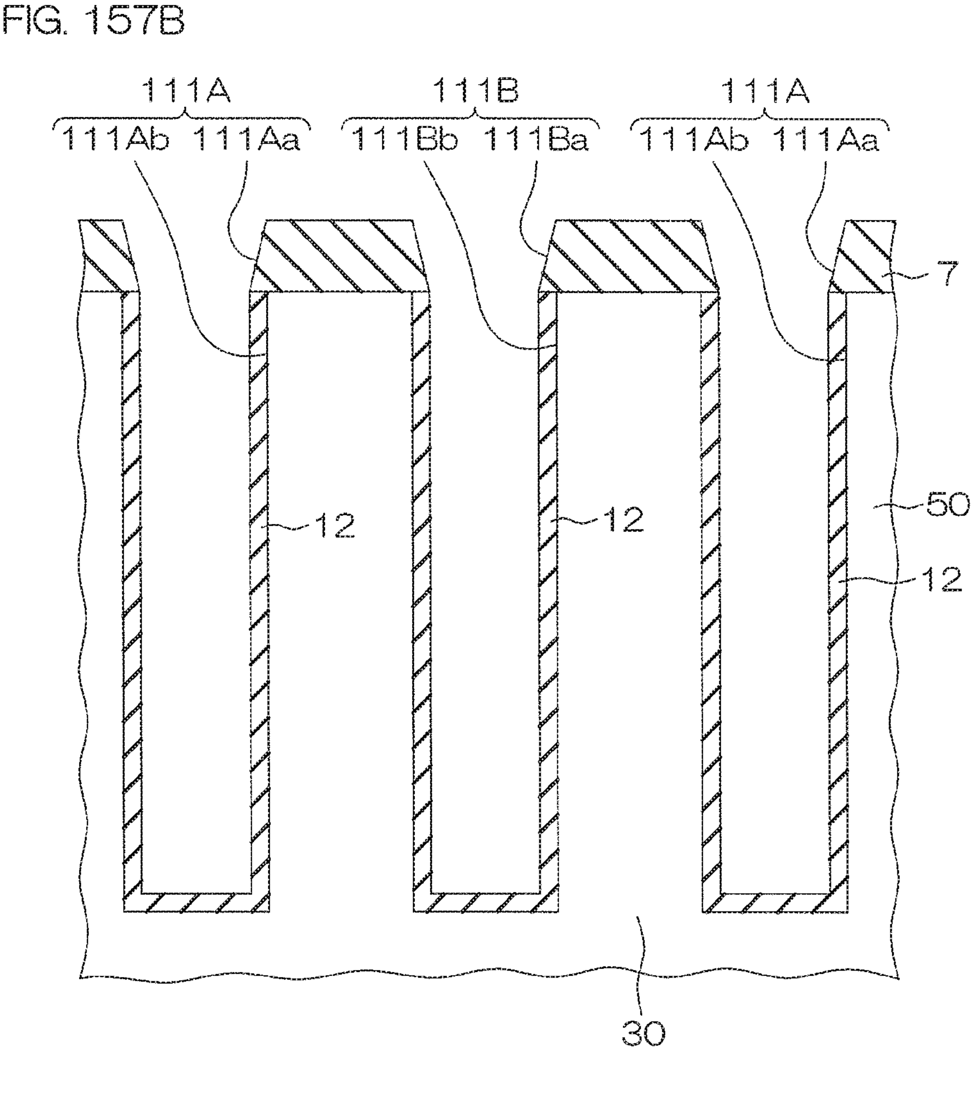

FIG. 157B is a partially enlarged cross-sectional view showing the step subsequent to FIG. 157A.

Figure 157C:
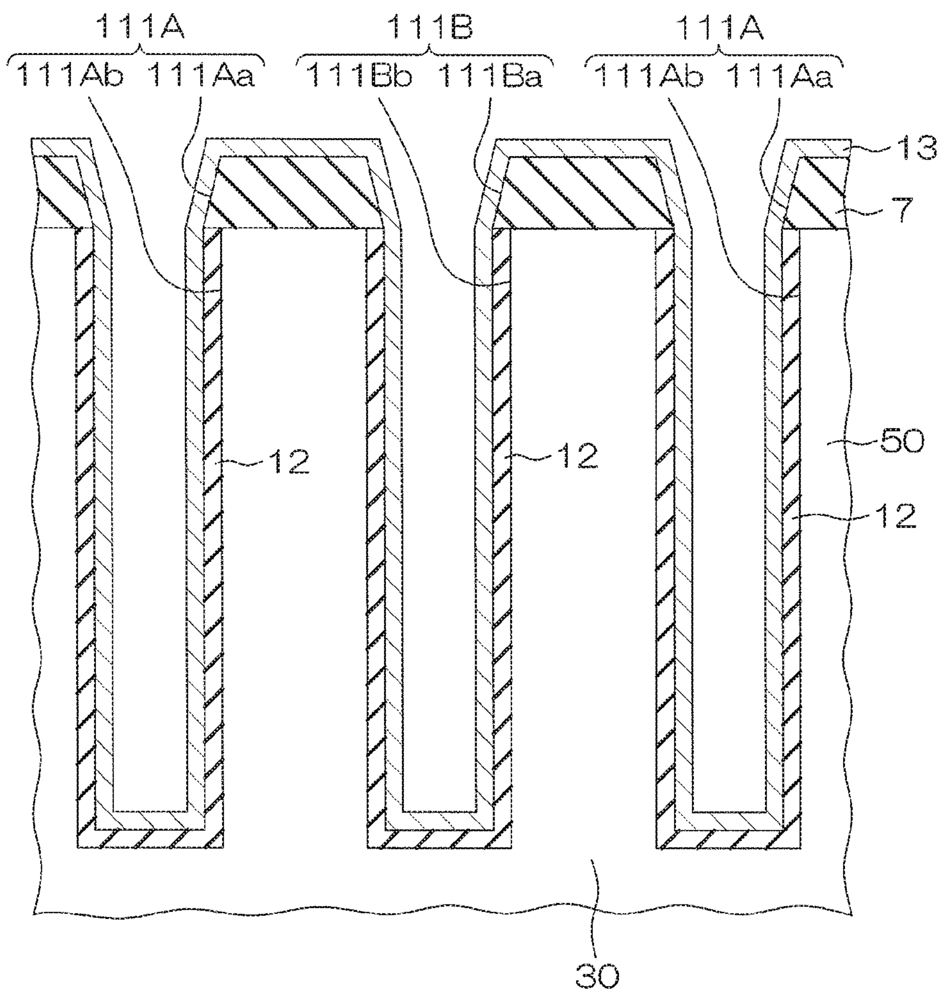

FIG. 157C is a partially enlarged cross-sectional view showing the step subsequent to FIG. 157B.

Figure 157D:
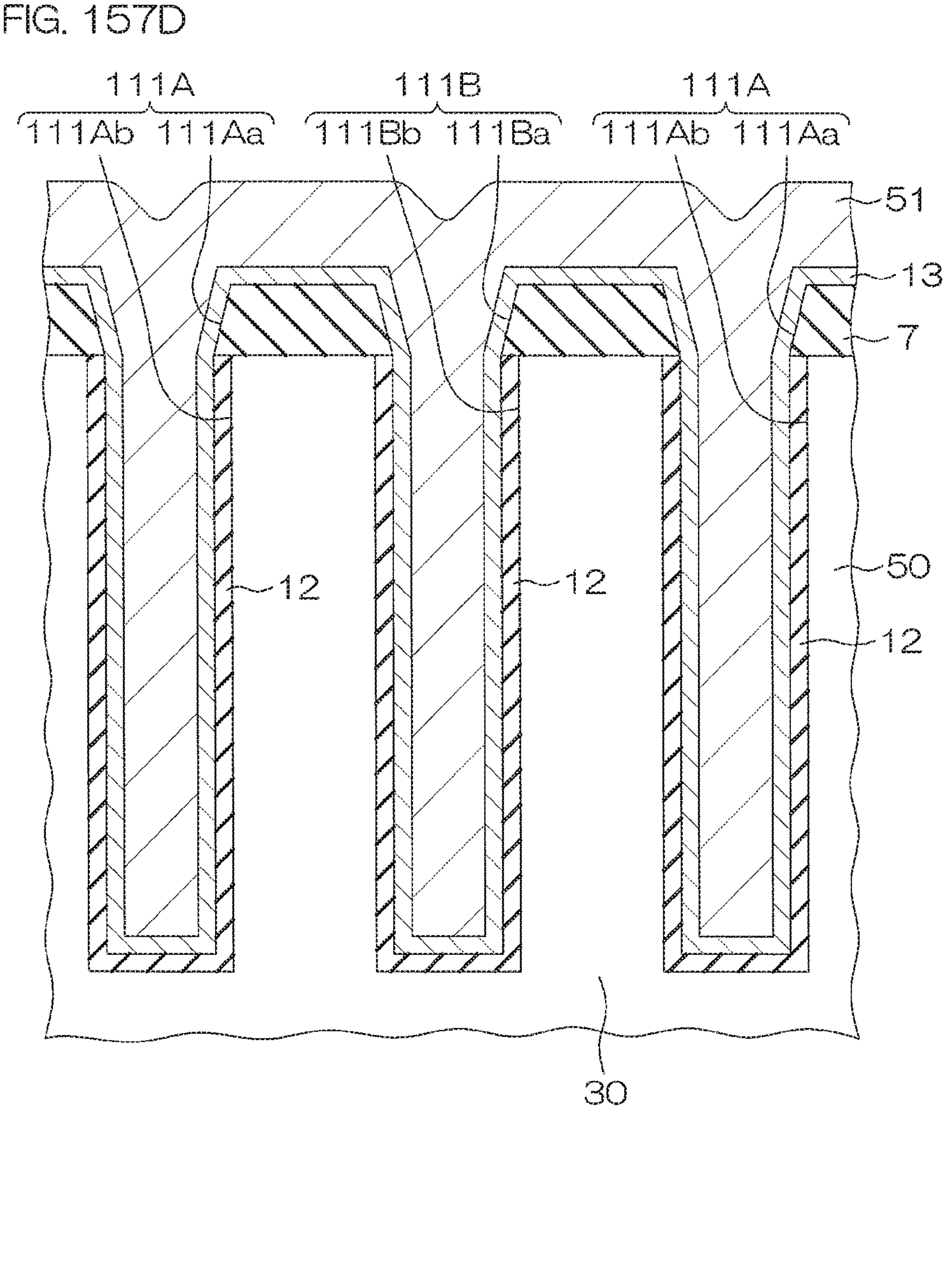

FIG. 157D is a partially enlarged cross-sectional view showing the step subsequent to FIG. 157C.

Figure 157E:
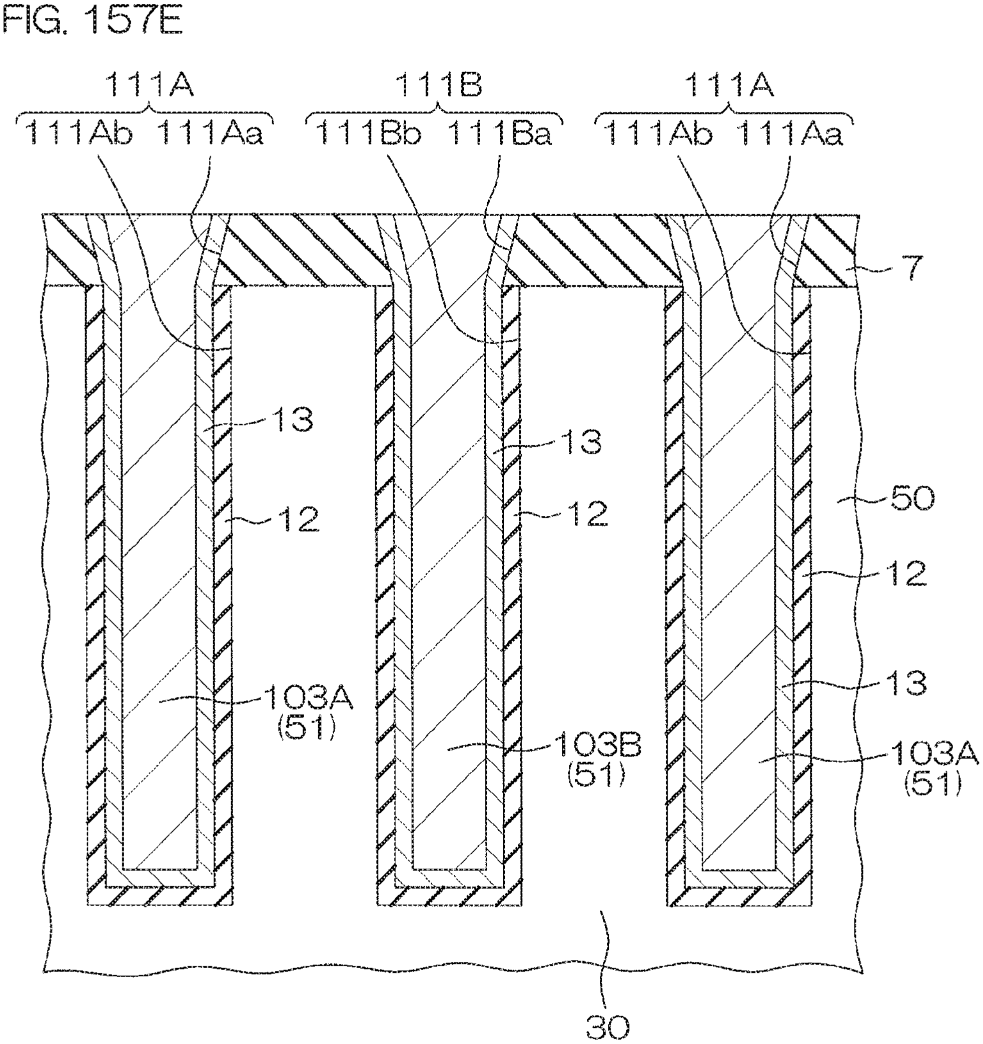

FIG. 157E is a partially enlarged cross-sectional view showing the step subsequent to FIG. 157D.

Figure 158:
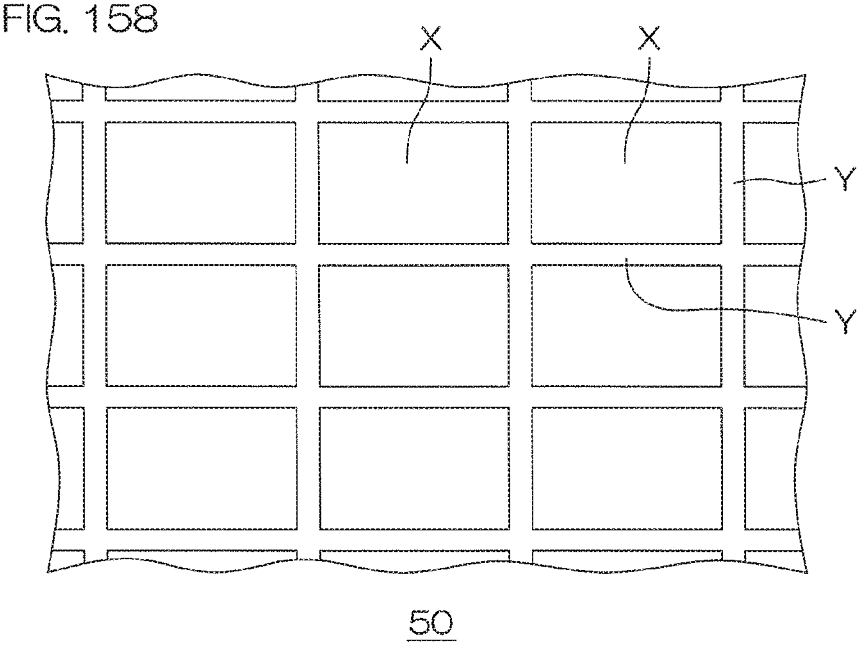

FIG. 158 is a plan view of an original substrate that is an original of a substrate main body of the chip capacitor, and shows an enlarged view of a partial region.

Figure 159A:
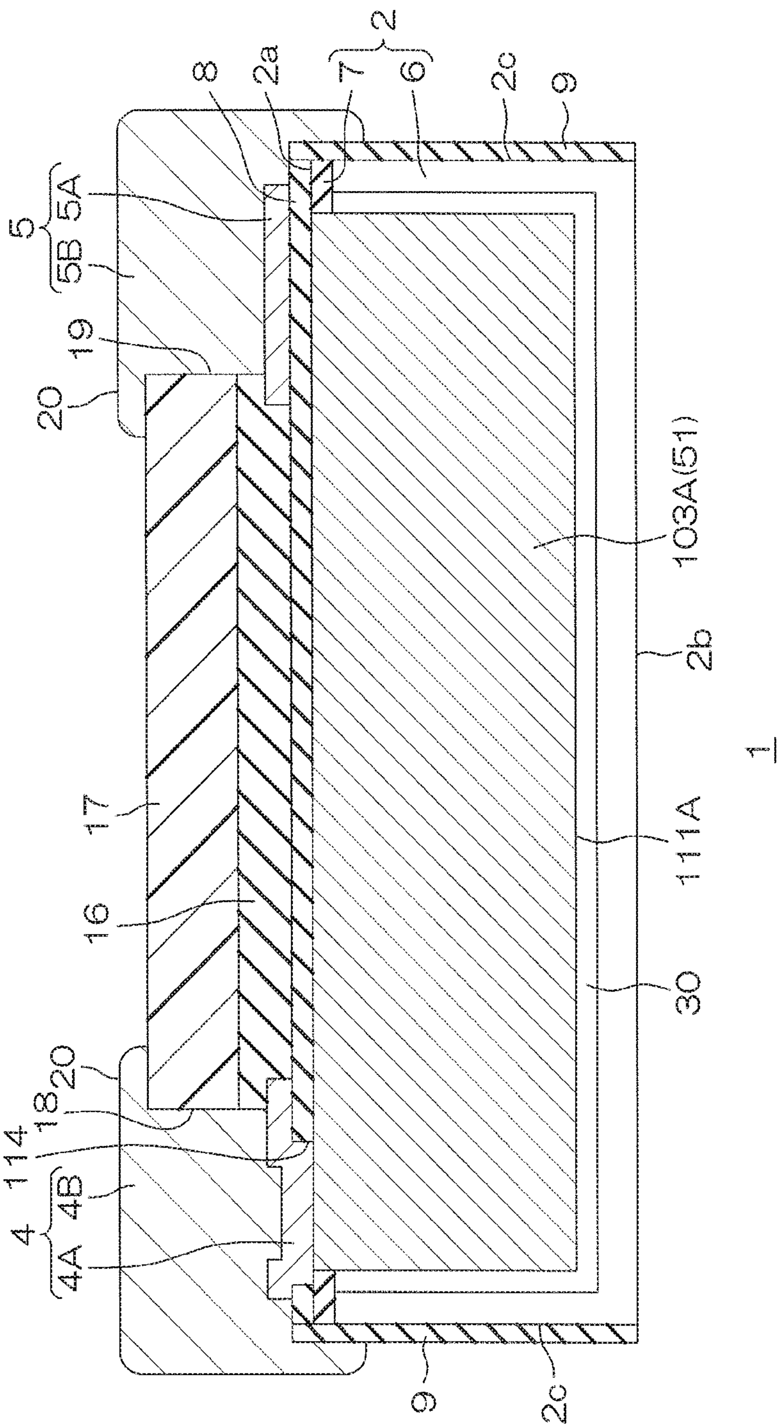

FIG. 159A is a cross-sectional view showing a modification example of an external connection electrode, and shows a cut surface corresponding to FIG. 147.

Figure 159B:
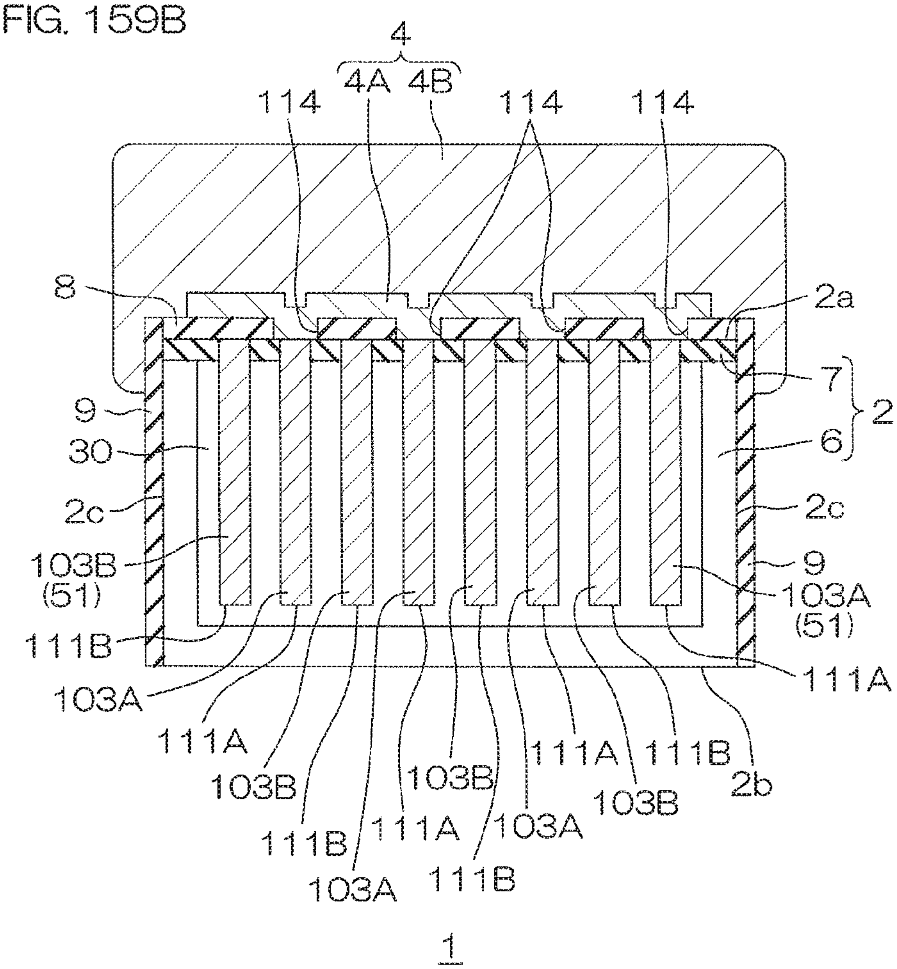

FIG. 159B is a cross-sectional view showing the modification example of the external connection electrode, and shows a cut surface corresponding to FIG. 148.

Figure 160A:
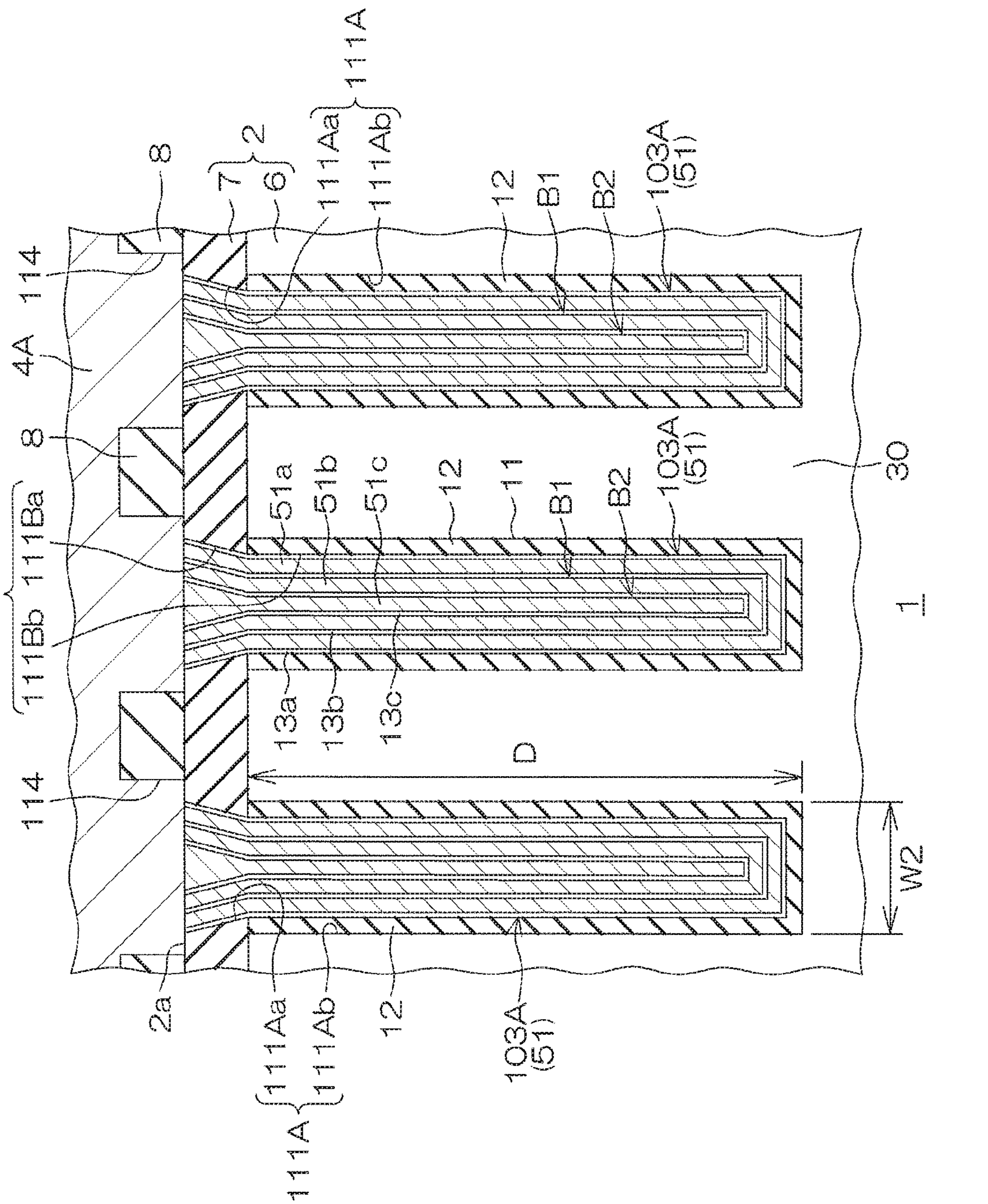

FIG. 160A is a diagram showing a modification example of a conductive member embedded within an internal electrode formation trench, and is a partially enlarged cross-sectional view corresponding to FIG. 148.

Figure 160B:
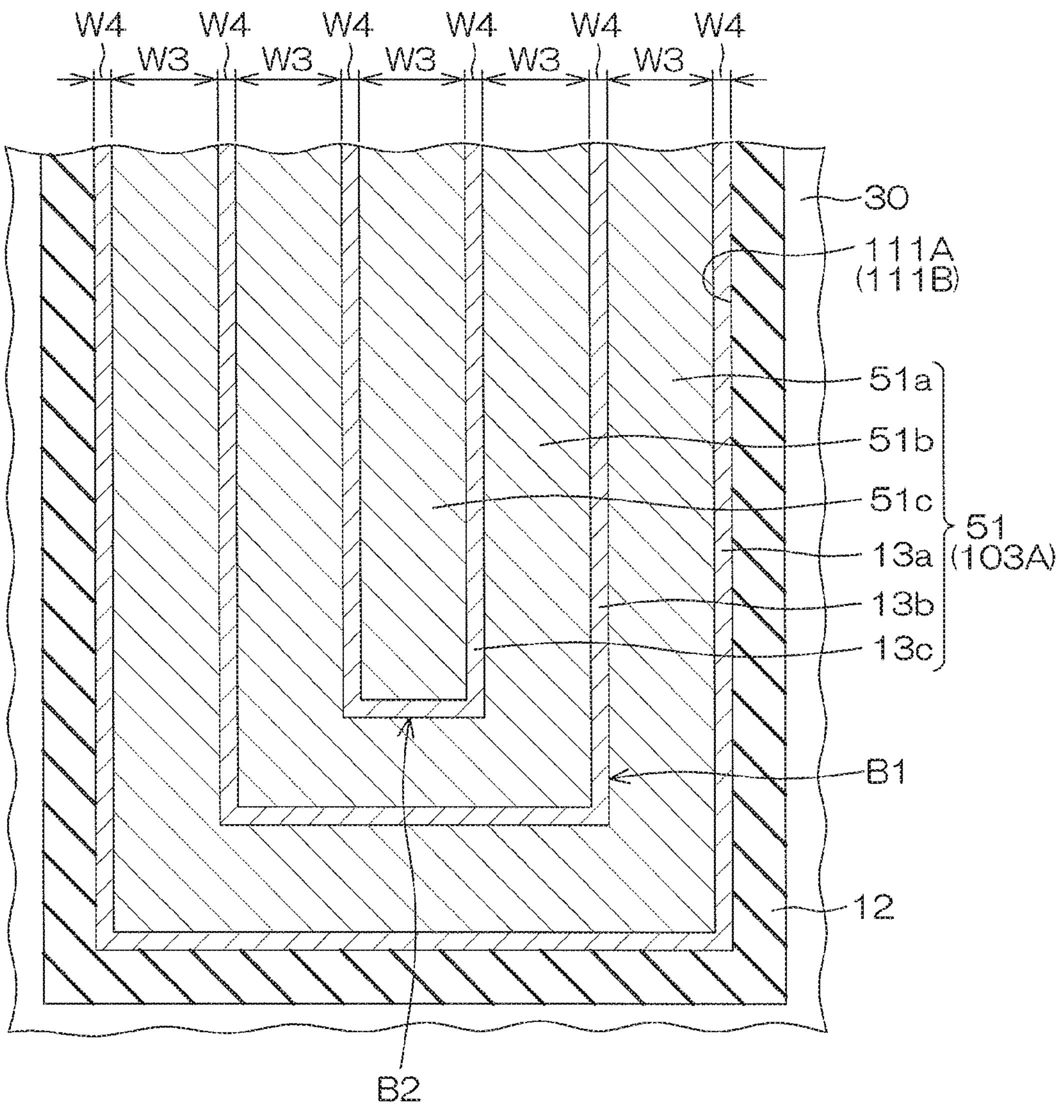

FIG. 160B is a partially enlarged cross-sectional view of FIG. 160A.

Figure 161:
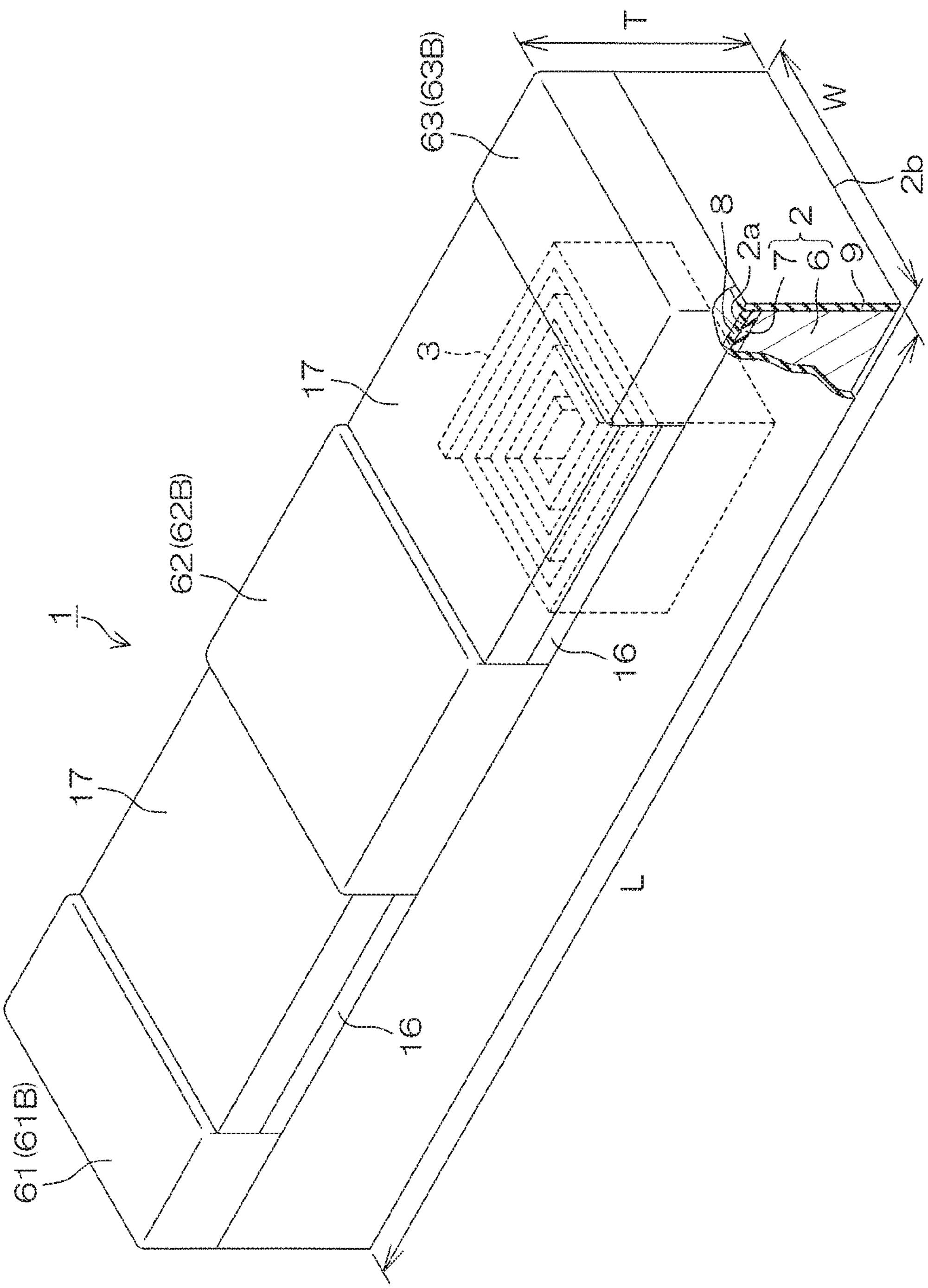

FIG. 161 is a partially cut perspective view of an LC composite element chip according to a first preferred embodiment of a sixth invention.

Figure 162:
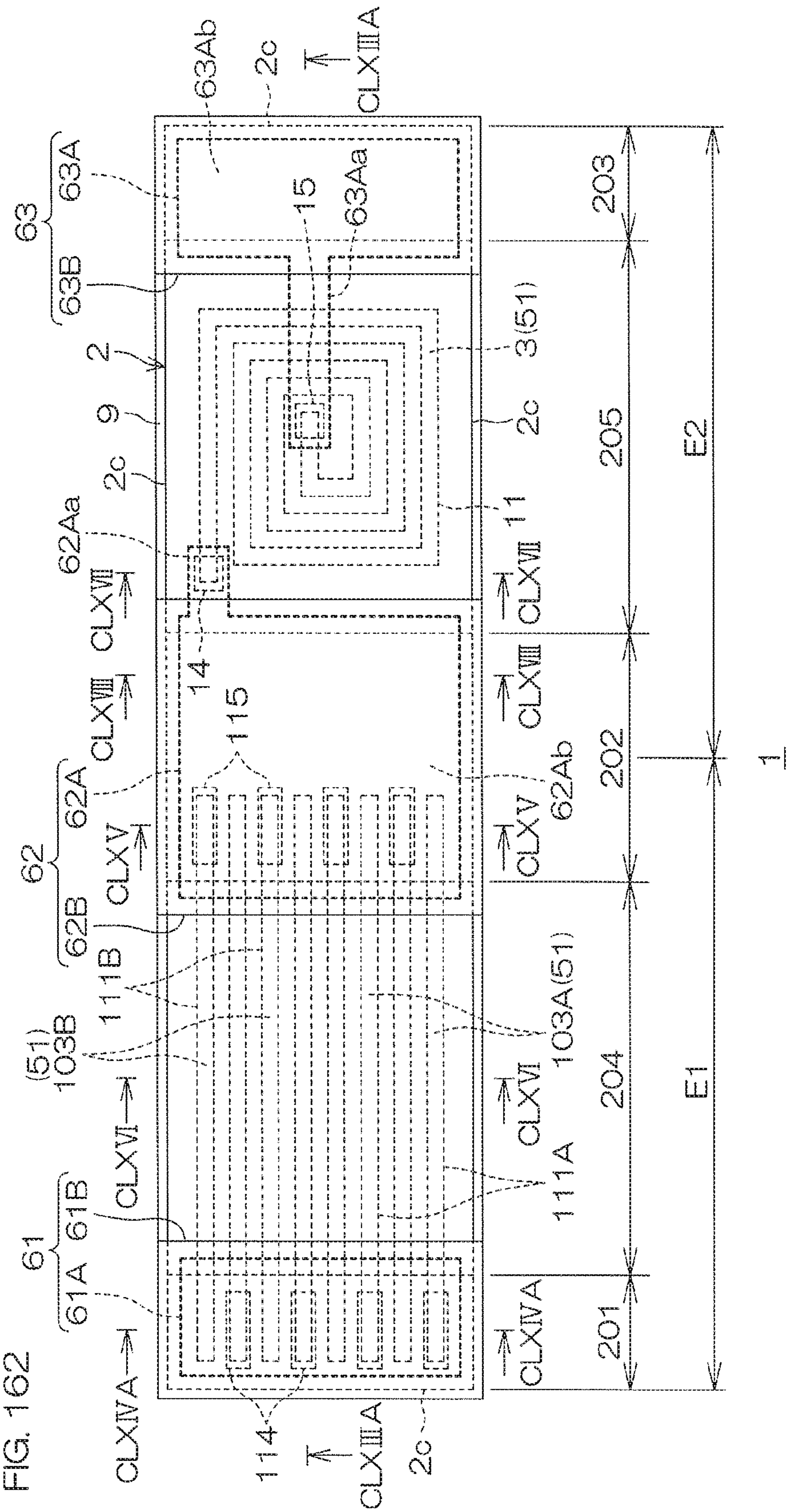

FIG. 162 is a plan view of the LC composite element chip.

Figure 163A:
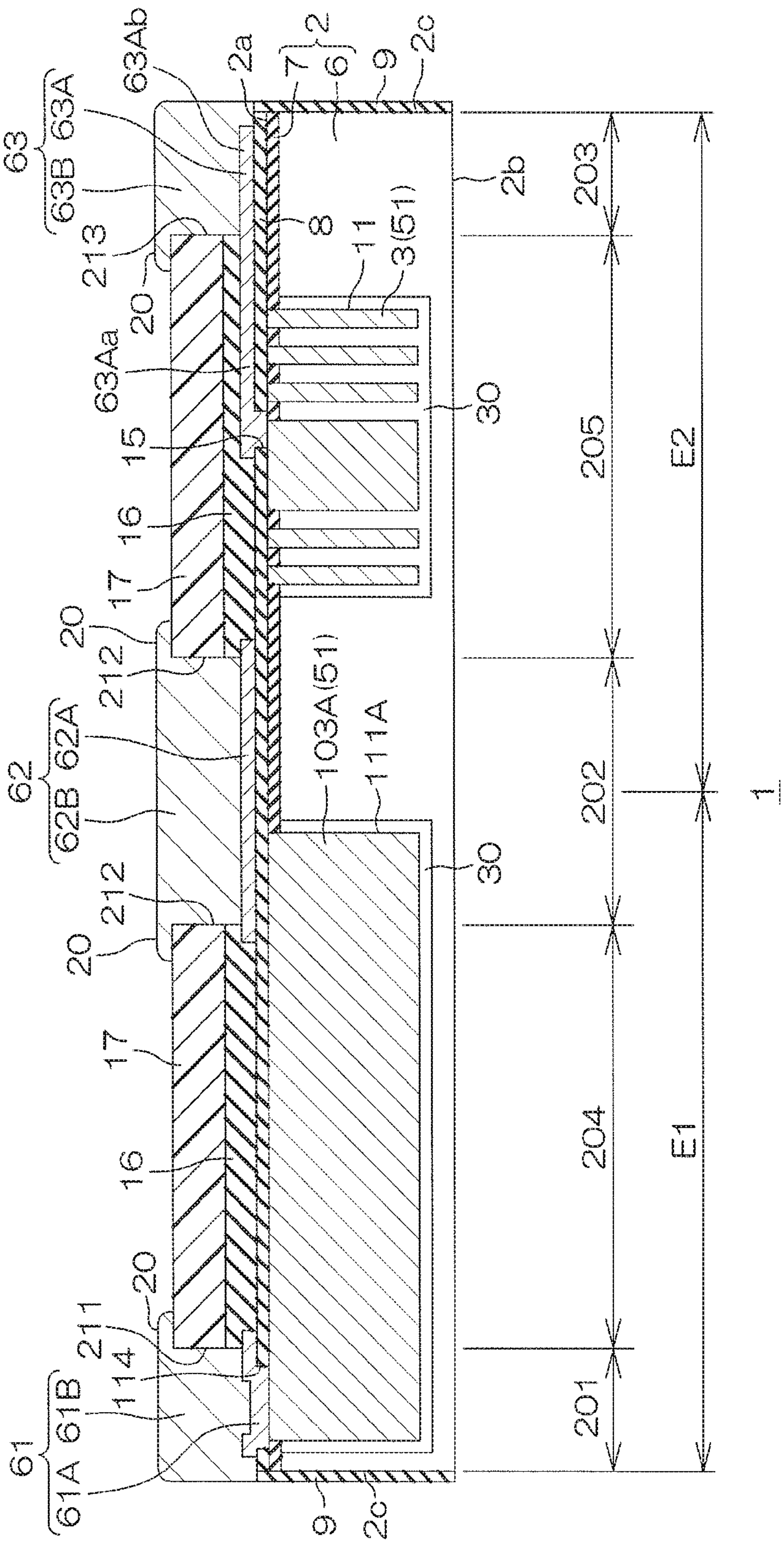

FIG. 163A is a cross-sectional view taken along line CLXIIIA-CLXIIIA in FIG. 162.

Figure 163B:
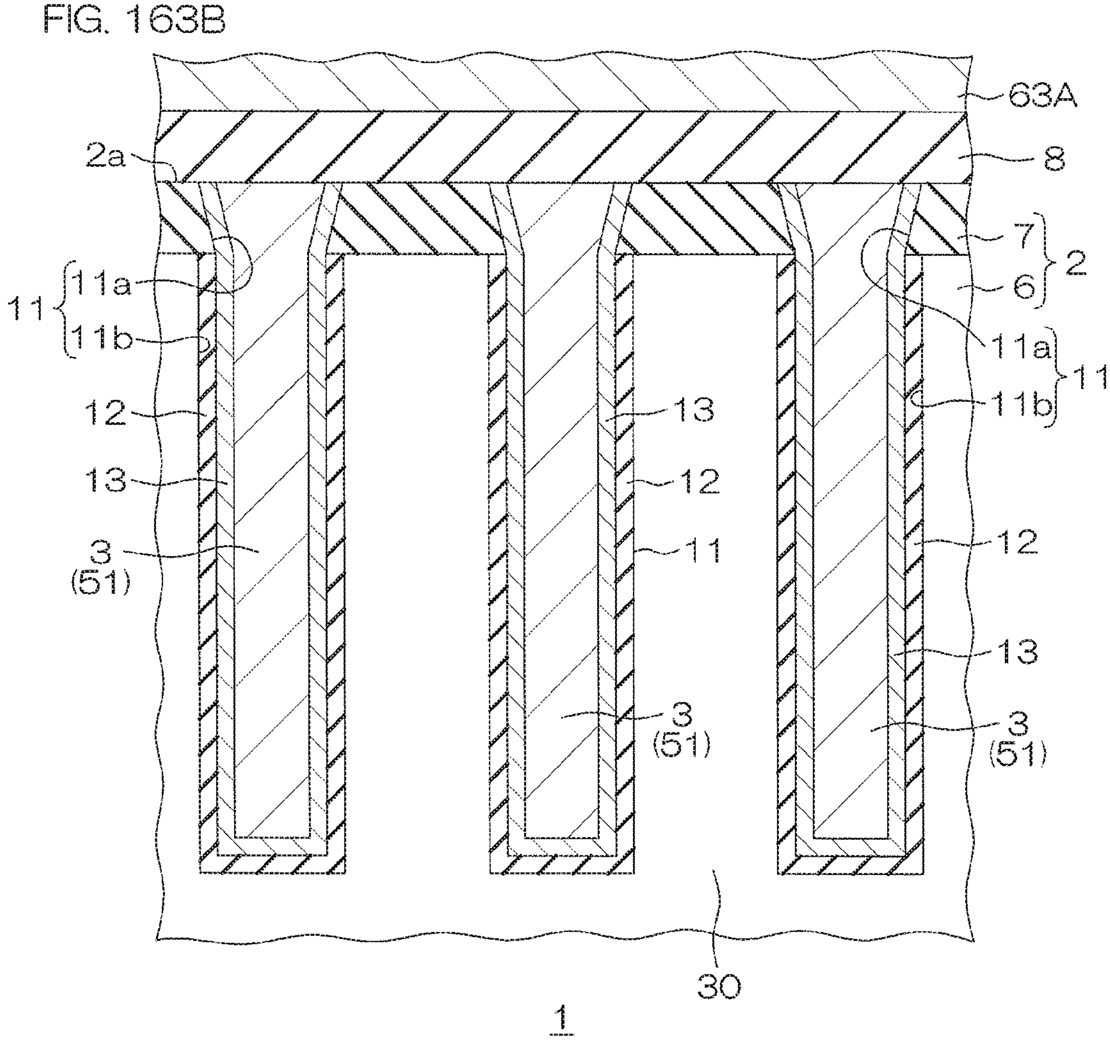

FIG. 163B is a partially enlarged cross-sectional view of FIG. 163A.

Figure 164A:
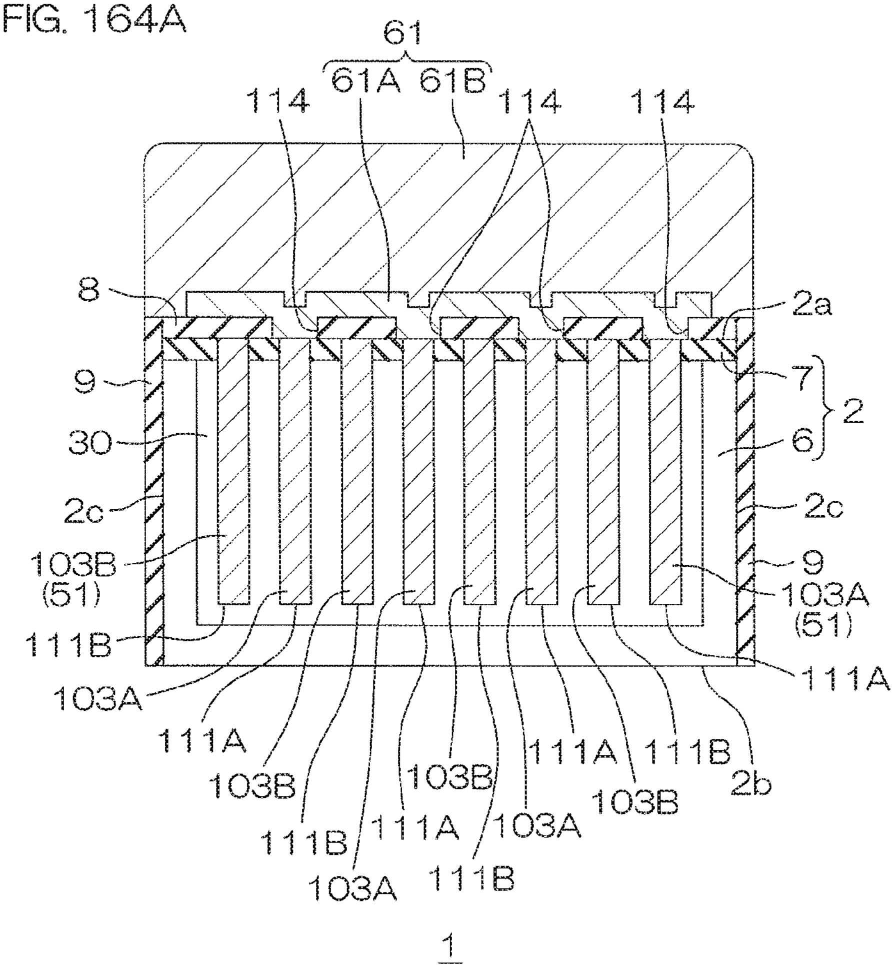

FIG. 164A is a cross-sectional view taken along line CLXIVA-CLXIVA in FIG. 162.

Figure 164B:
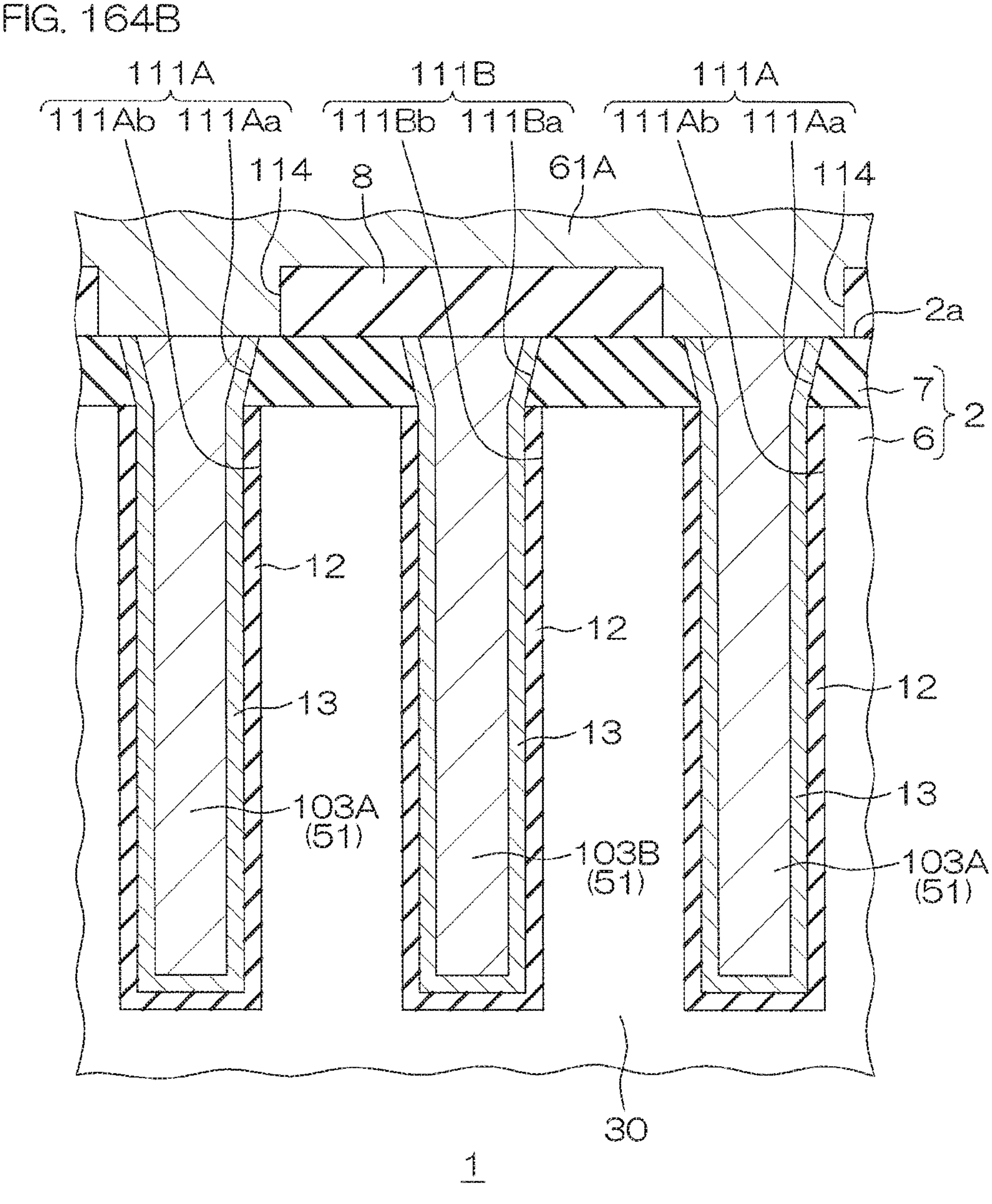

FIG. 164B is a partially enlarged cross-sectional view of FIG. 164A.

Figure 165:
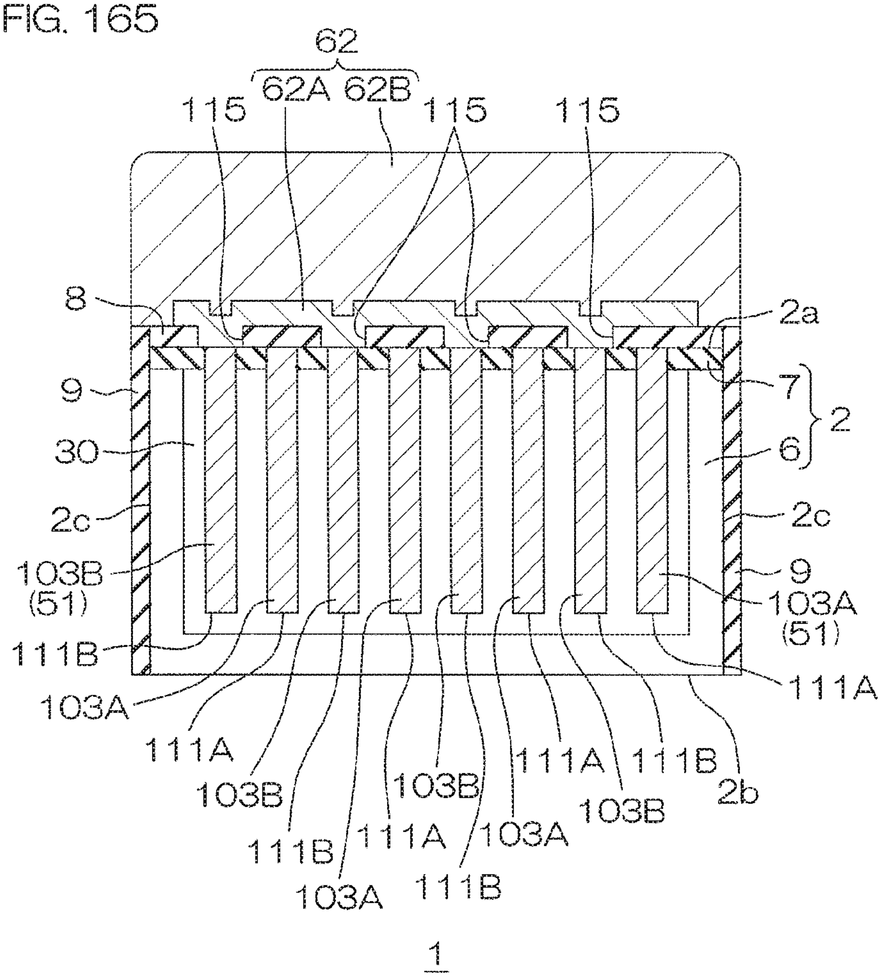

FIG. 165 is a cross-sectional view taken along line CLXV-CLXV in FIG. 162.

Figure 166:
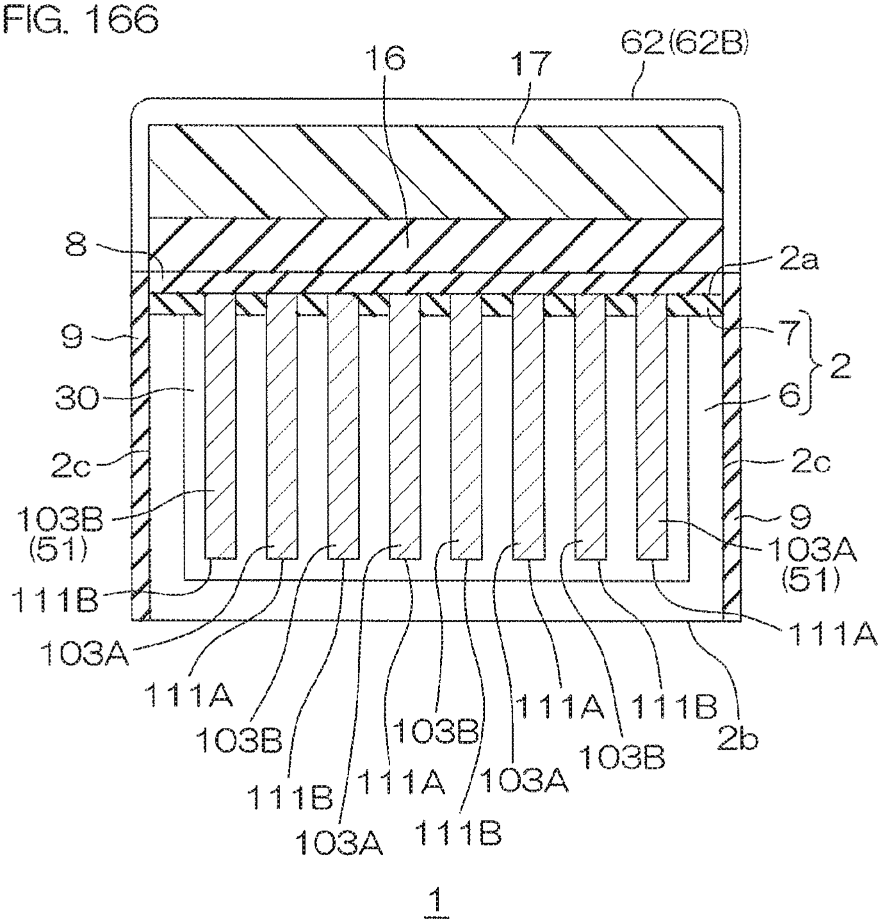

FIG. 166 is a cross-sectional view taken along line CLXVI-CLXVI in FIG. 162.

Figure 167:
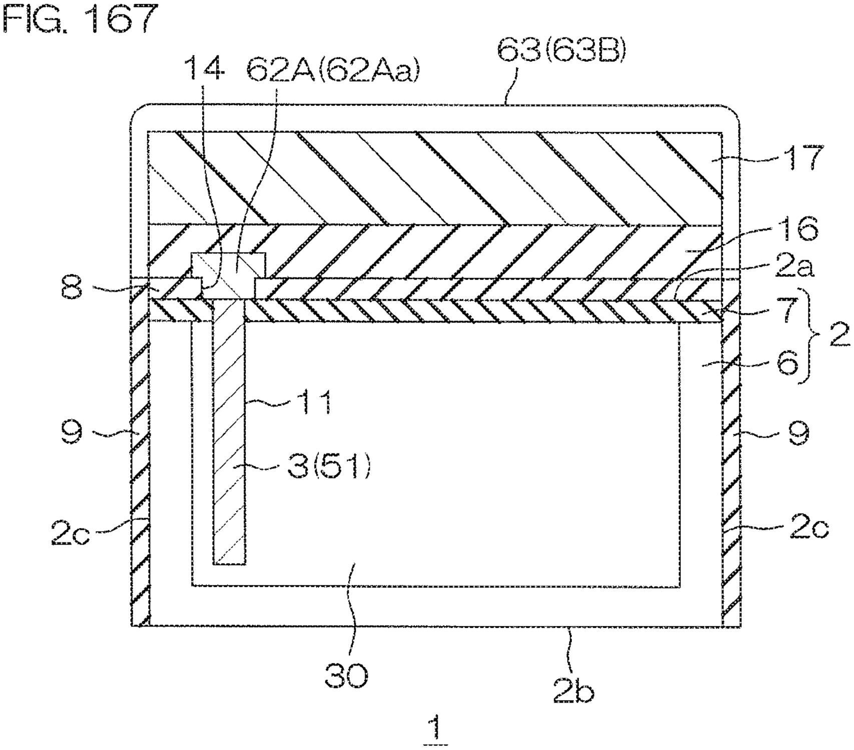

FIG. 167 is a cross-sectional view taken along line CLXVII-CLXVII in FIG. 162.

Figure 168:
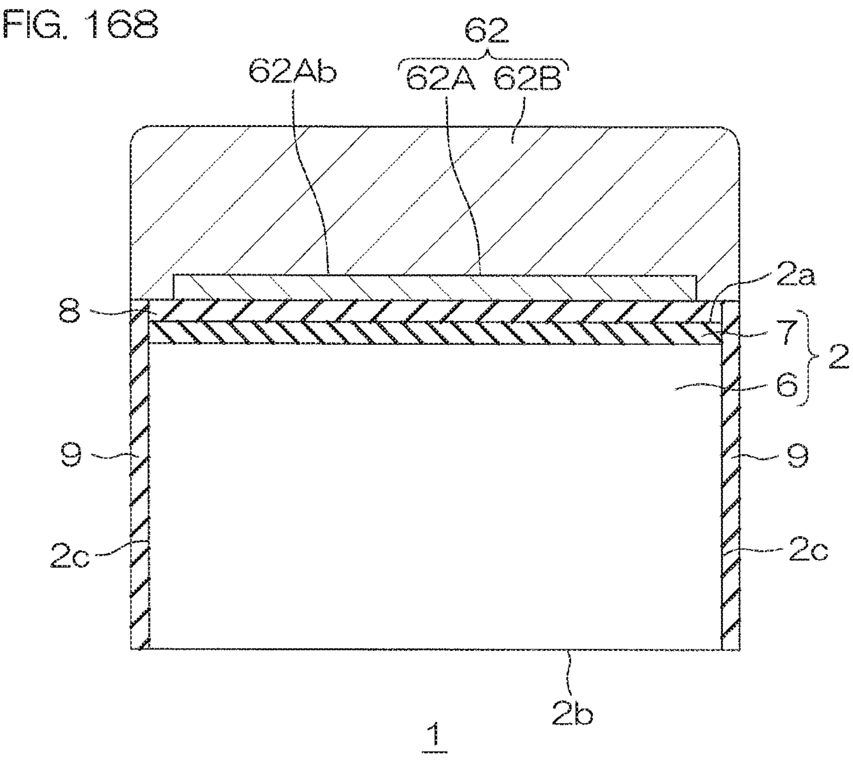

FIG. 168 is a cross-sectional view taken along line CLXVIII-CLXVIII in FIG. 162.

Figure 169:
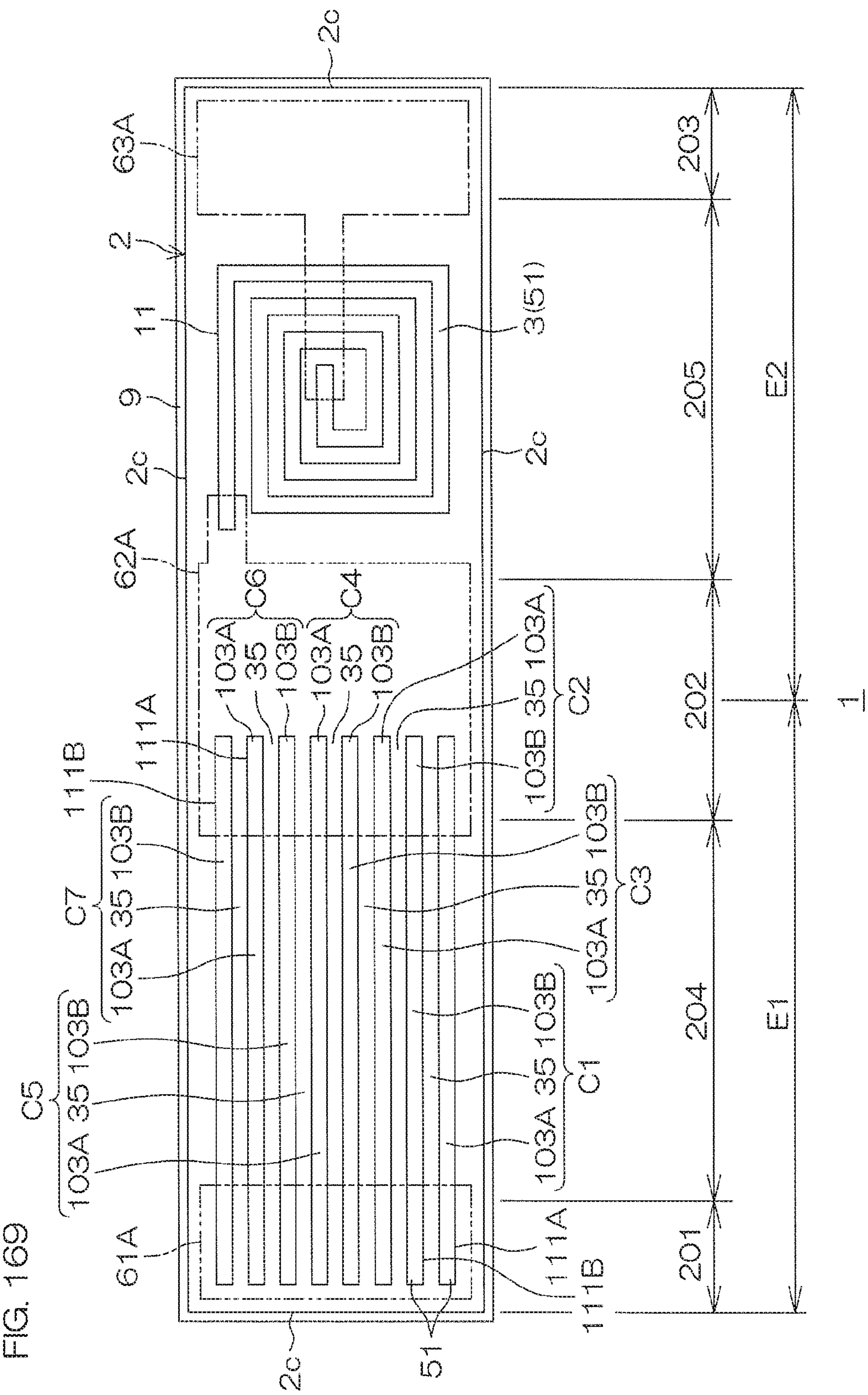

FIG. 169 is a plan view showing a structure of the surface of a substrate by removing an arrangement formed on the surface of the substrate.

Figure 170:
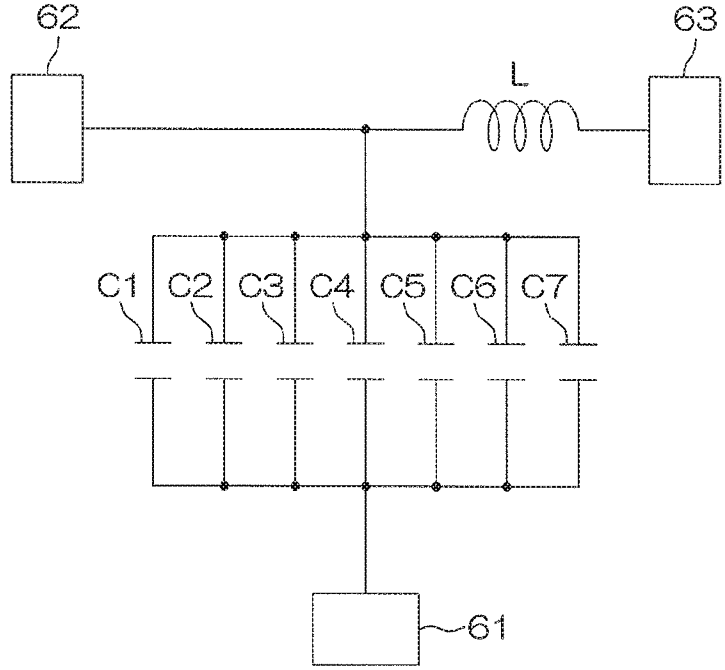

FIG. 170 is an electrical circuit diagram showing an electrical structure within the LC composite element chip.

Figure 171:
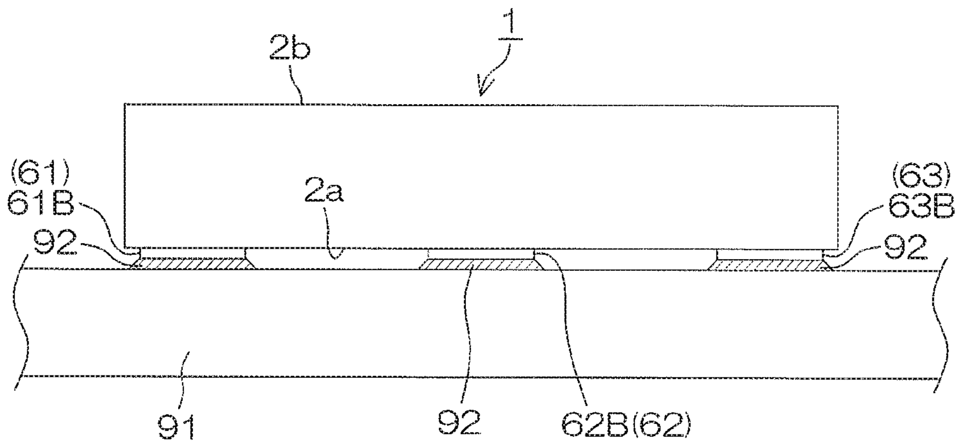

FIG. 171 is a cross-sectional view showing the arrangement of a circuit assembly in which the LC composite element chip is flip-chip connected on the mounting substrate.

Figure 172A:
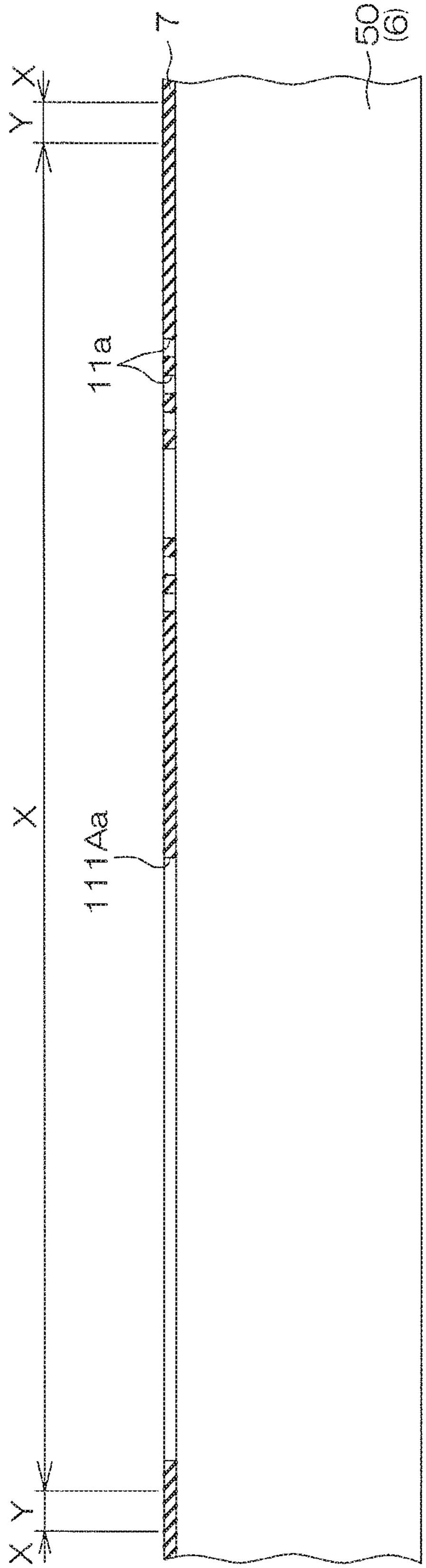

FIG. 172A is a cross-sectional view for illustrating an example of the manufacturing step of the LC composite element chip, and is a cross-sectional view corresponding to FIG. 163A.

Figure 172B:
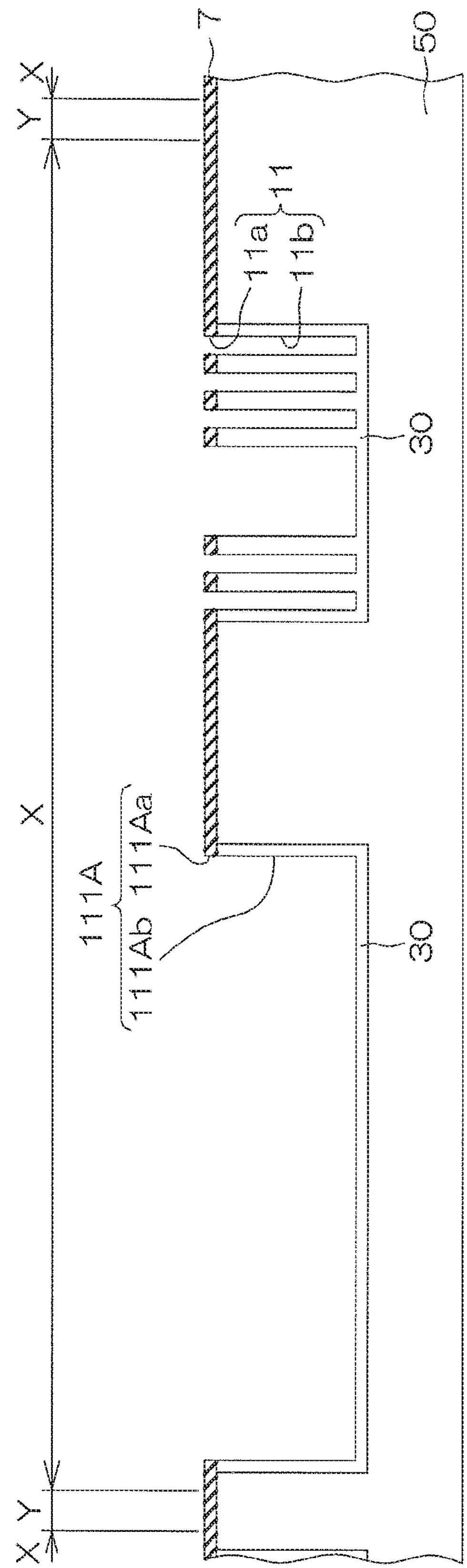

FIG. 172B is a cross-sectional view showing the step subsequent to FIG. 172A.

Figure 172C:
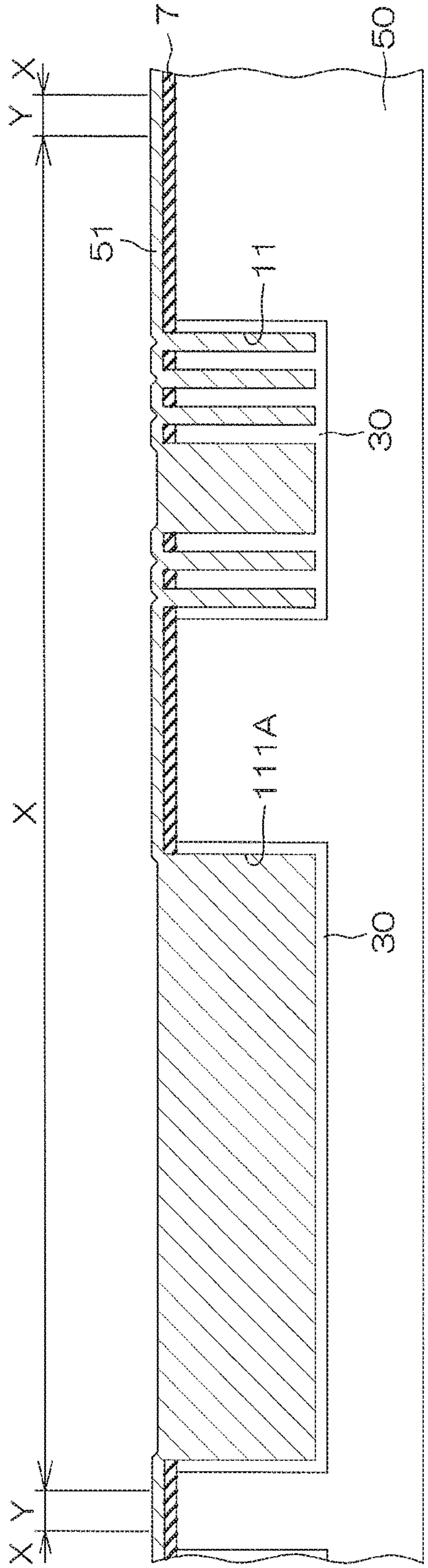

FIG. 172C is a cross-sectional view showing the step subsequent to FIG. 172B.

Figure 172D:
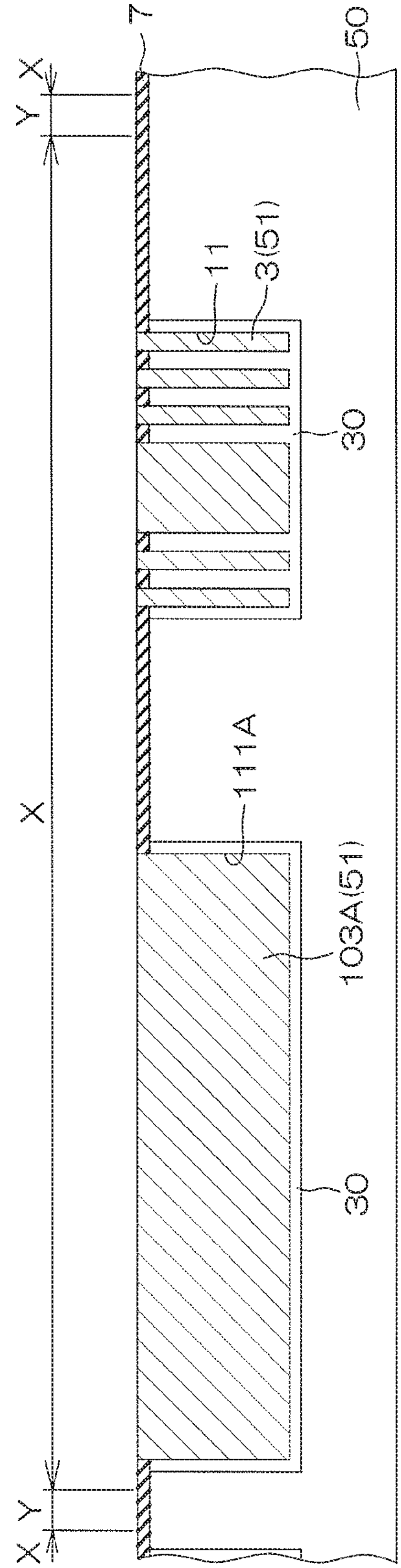

FIG. 172D is a cross-sectional view showing the step subsequent to FIG. 172C.

Figure 172E:
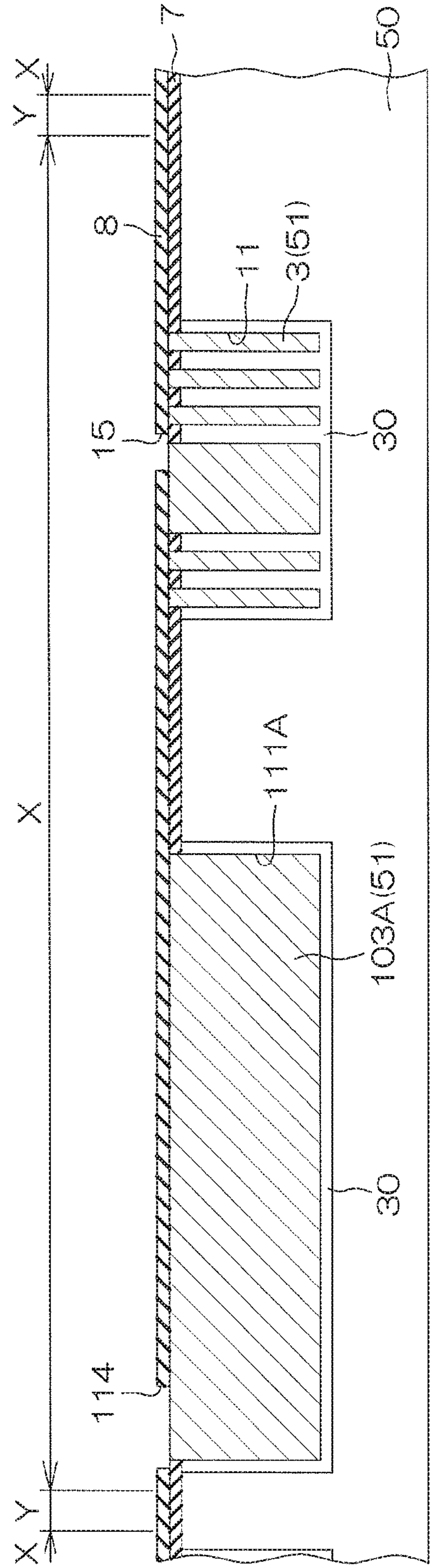

FIG. 172E is a cross-sectional view showing the step subsequent to FIG. 172D.

Figure 172F:
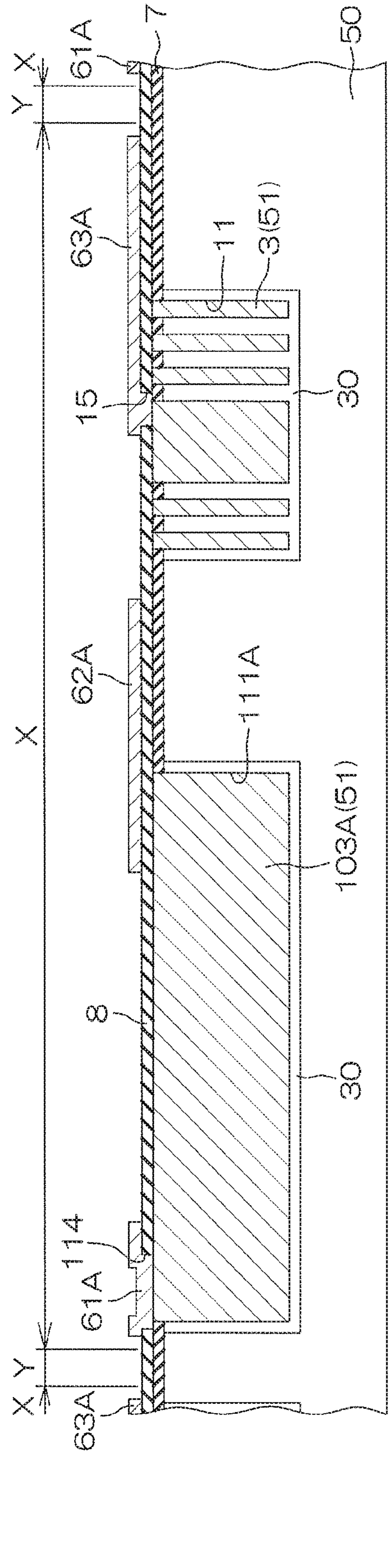

FIG. 172F is a cross-sectional view showing the step subsequent to FIG. 172E.

Figure 172G:
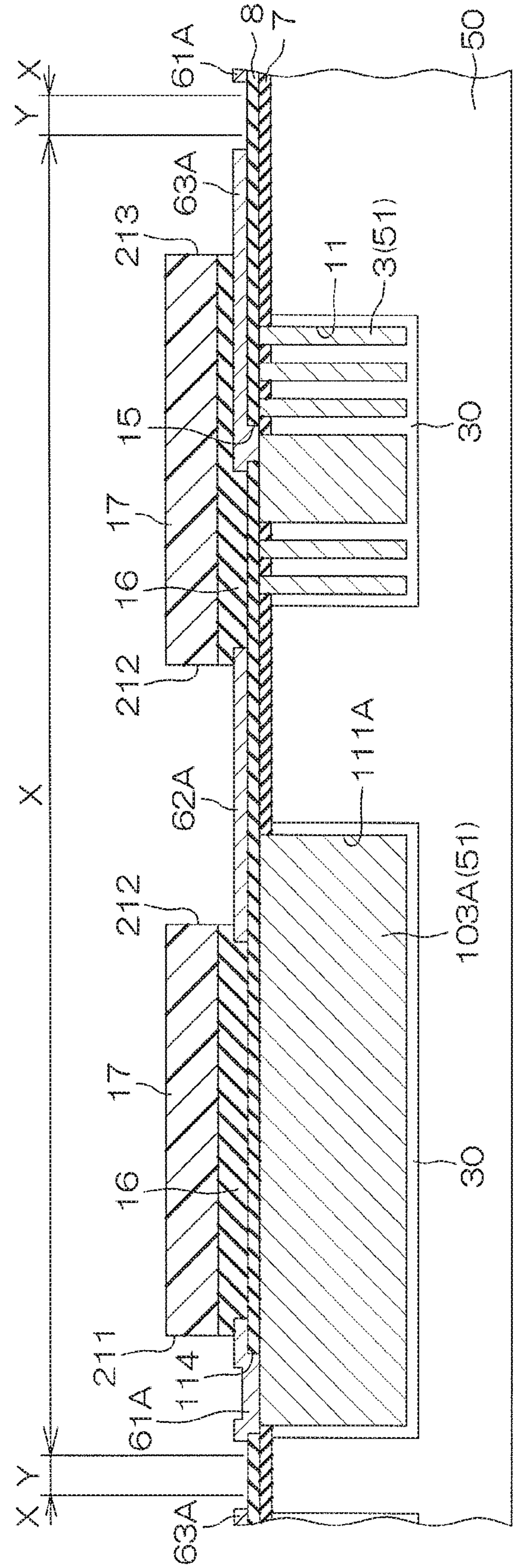

FIG. 172G is a cross-sectional view showing the step subsequent to FIG. 172F.

Figure 172H:
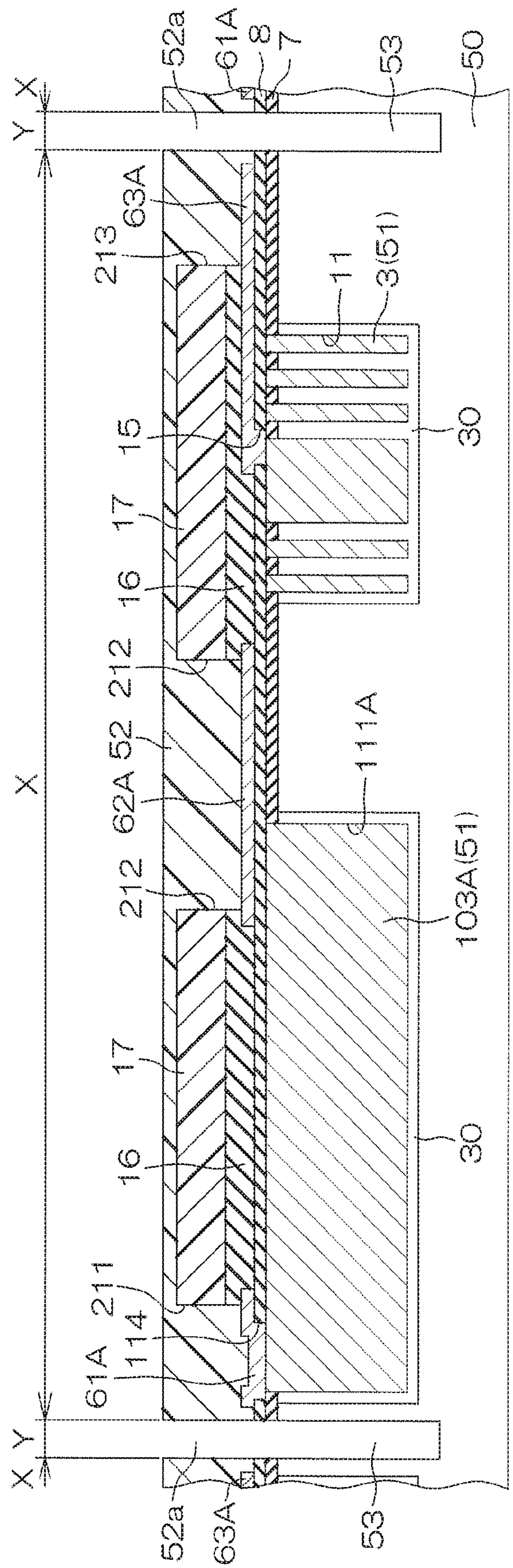
Figure 172:
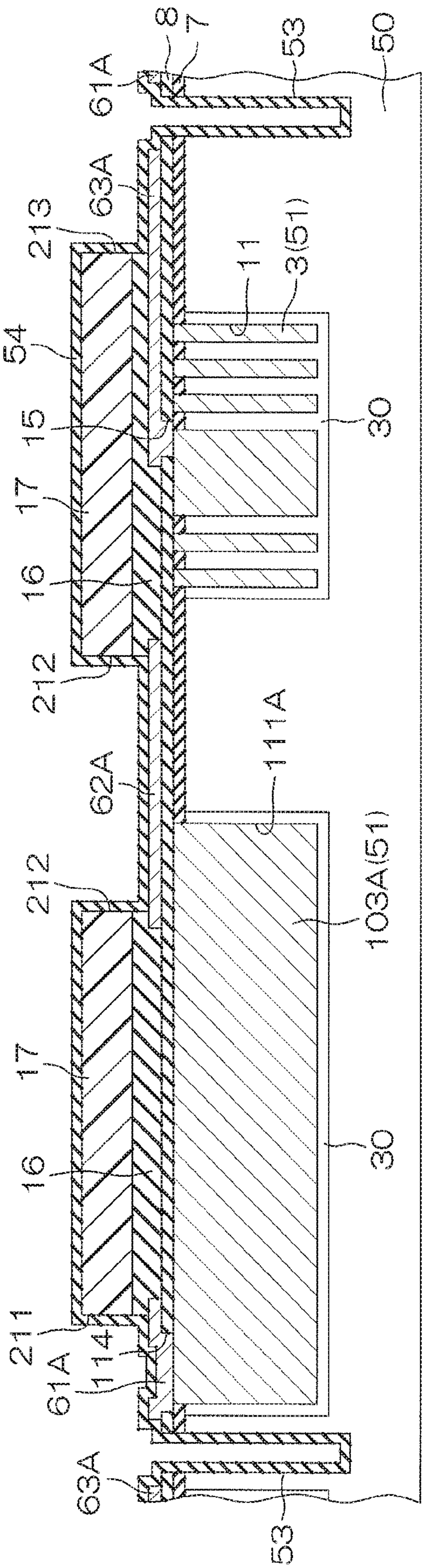

FIG. 172H is a cross-sectional view showing the step subsequent to FIG. 172G.

FIG. 172I is a cross-sectional view showing the step subsequent to FIG. 172H.

Figure 172J:
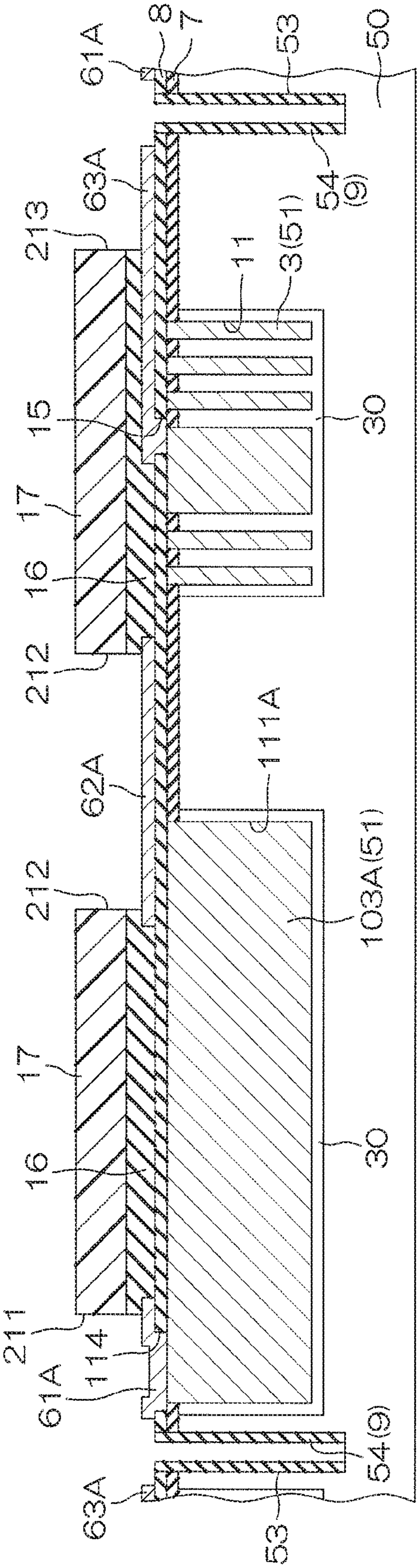

FIG. 172J is a cross-sectional view showing the step subsequent to FIG. 172I.

Figure 172K:
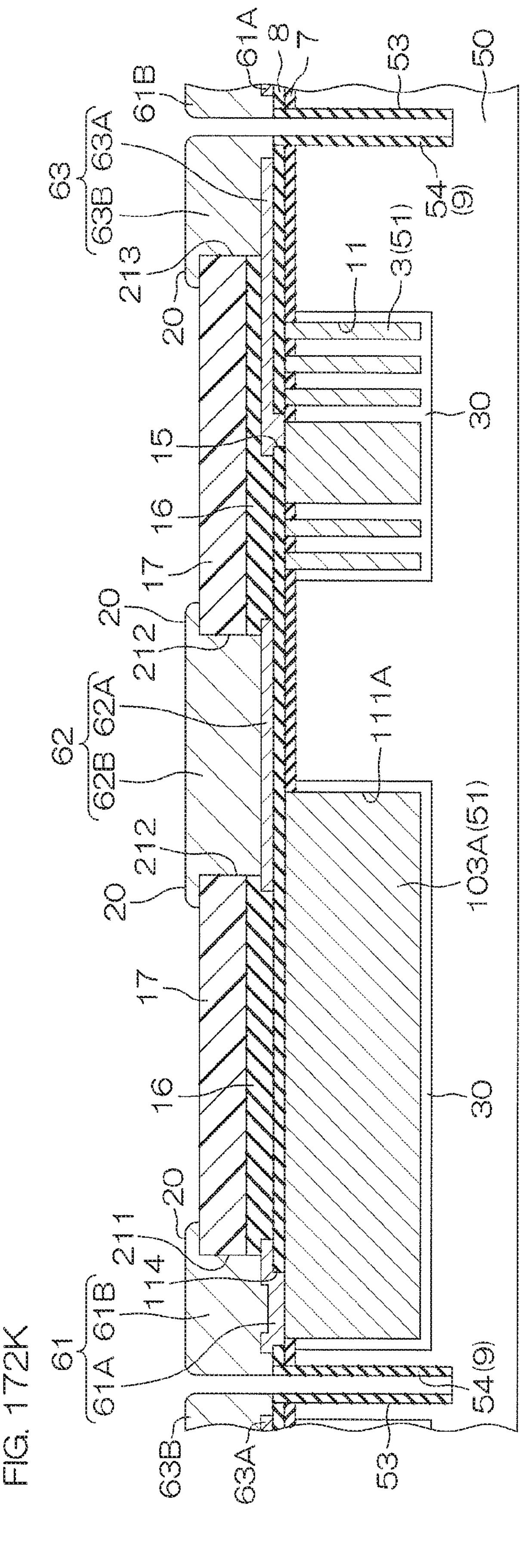

FIG. 172K is a cross-sectional view showing the step subsequent to FIG. 172J.

Figure 172L:
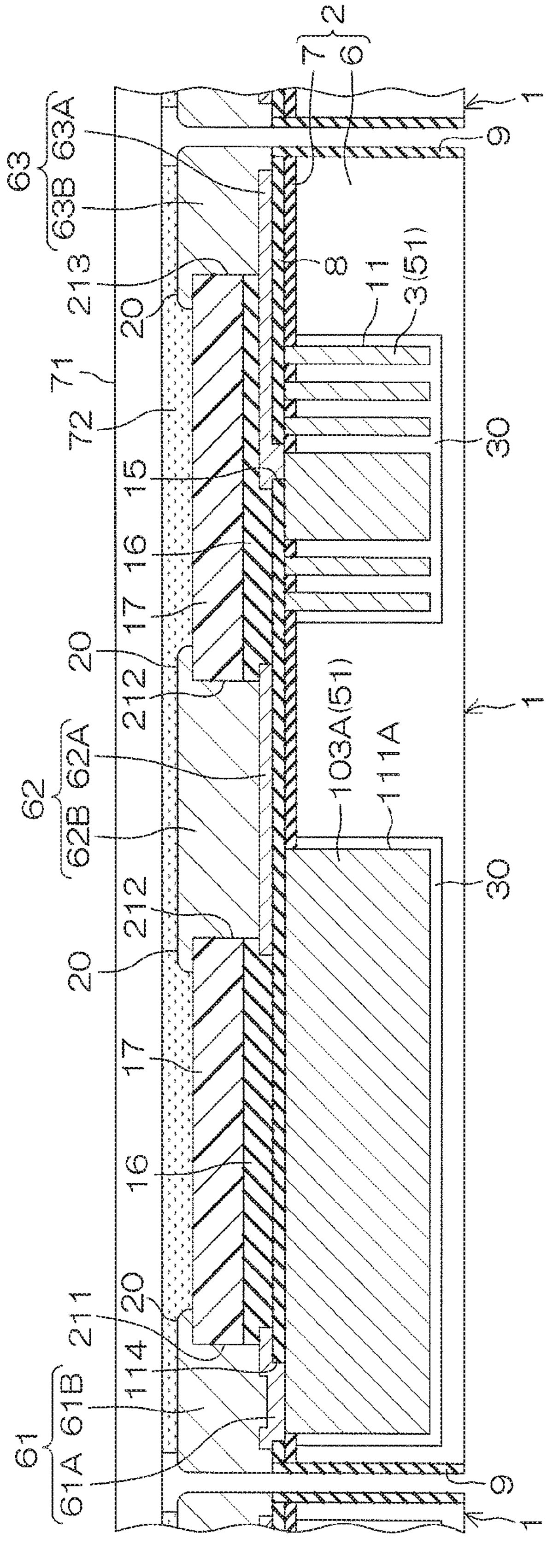

FIG. 172L is a cross-sectional view showing the step subsequent to FIG. 172K.

Figure 173A:
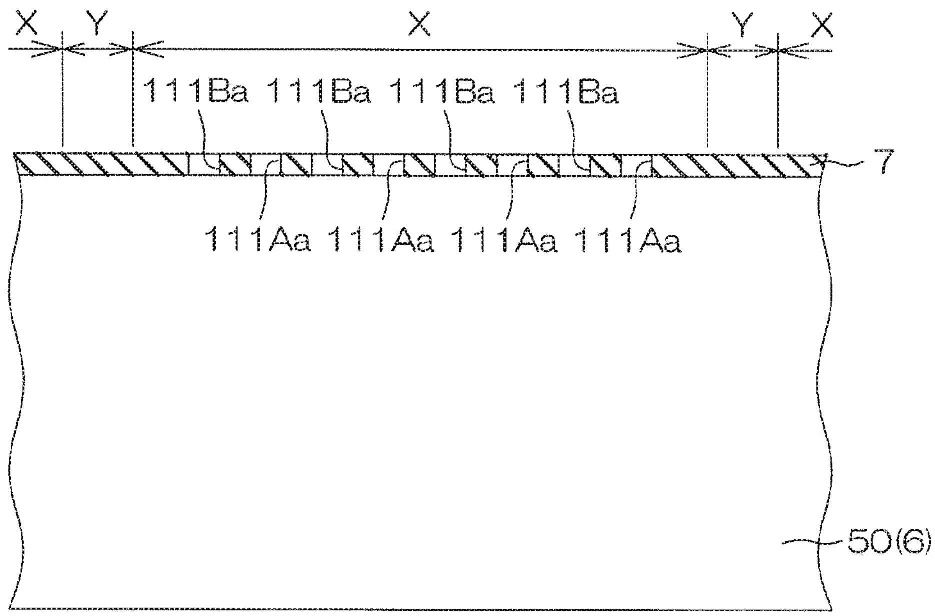

FIG. 173A is a cross-sectional view for illustrating an example of the manufacturing step of the LC composite element chip, and is a cross-sectional view corresponding to FIG. 164A.

Figure 173B:
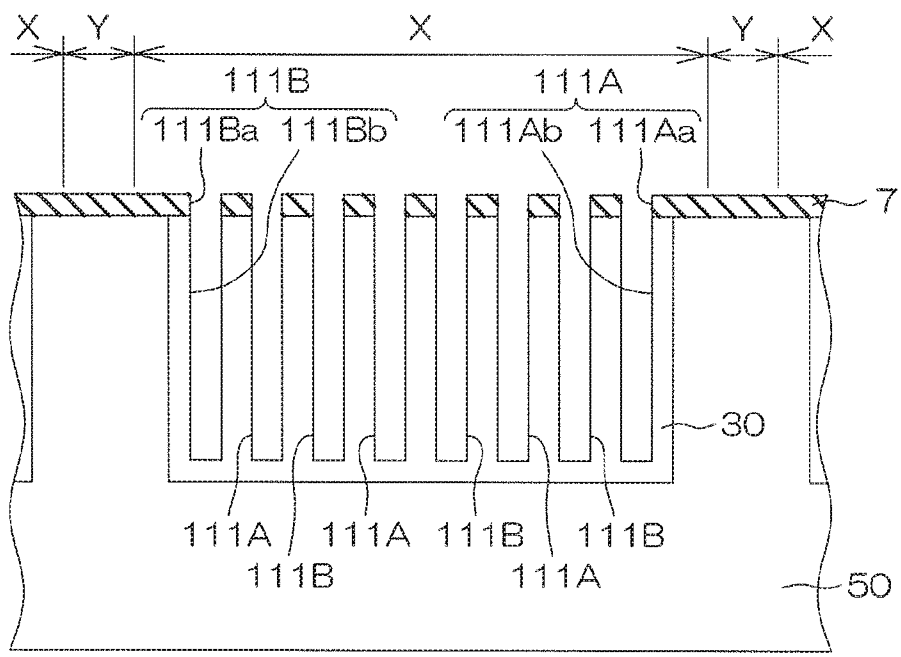

FIG. 173B is a cross-sectional view showing the step subsequent to FIG. 173A.

Figure 173C:
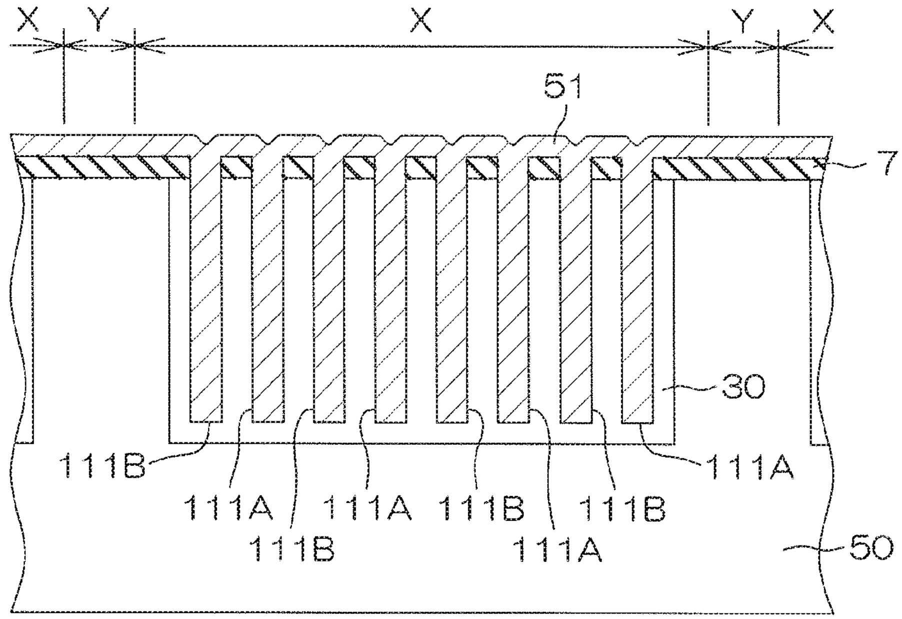

FIG. 173C is a cross-sectional view showing the step subsequent to FIG. 173B.

Figure 173D:
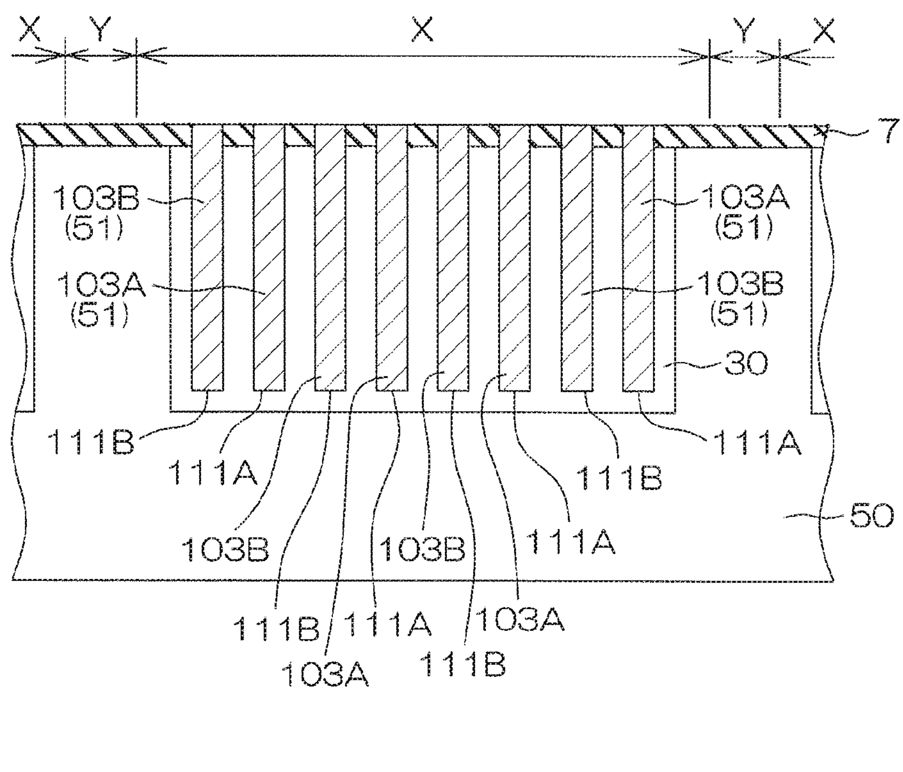

FIG. 173D is a cross-sectional view showing the step subsequent to FIG. 173C.

Figure 173E:
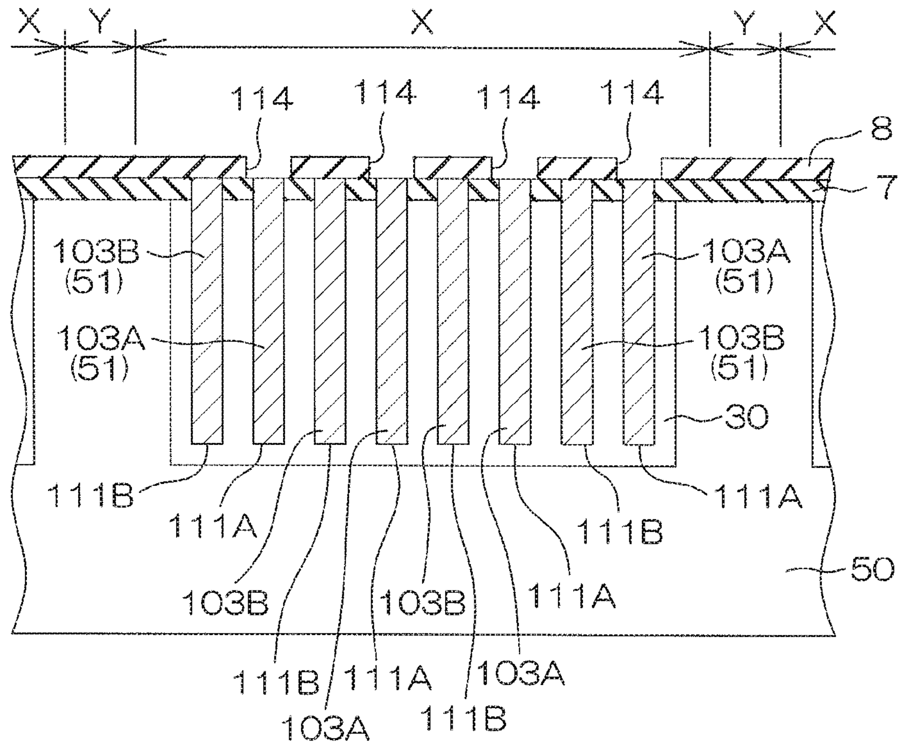

FIG. 173E is a cross-sectional view showing the step subsequent to FIG. 173D.

Figure 173F:
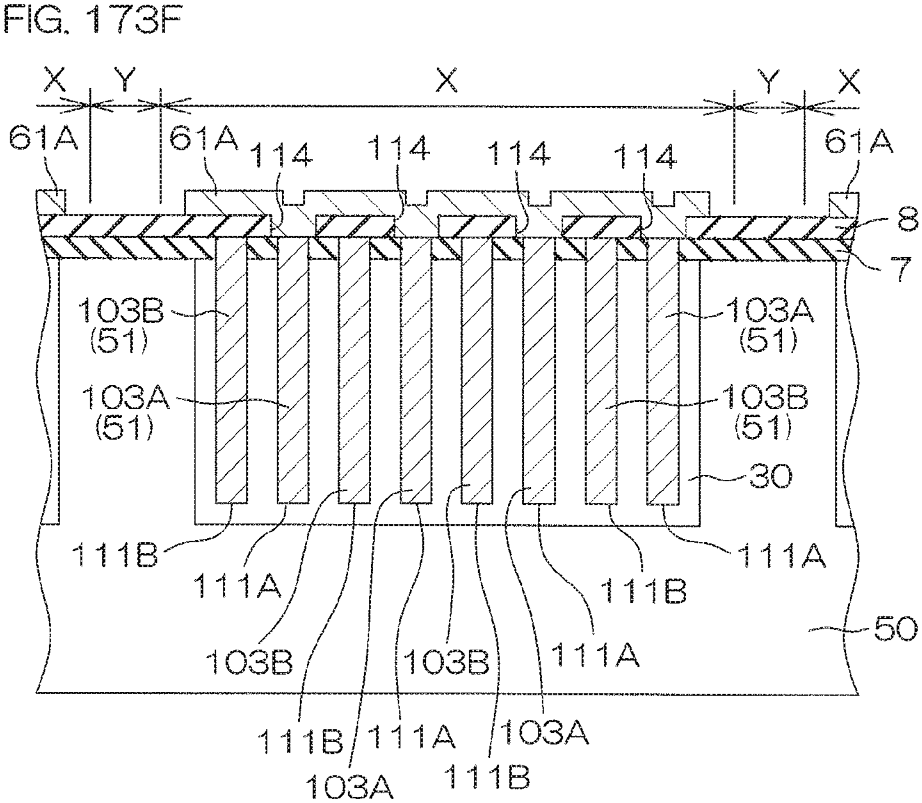

FIG. 173F is a cross-sectional view showing the step subsequent to FIG. 173E.

Figure 173G:
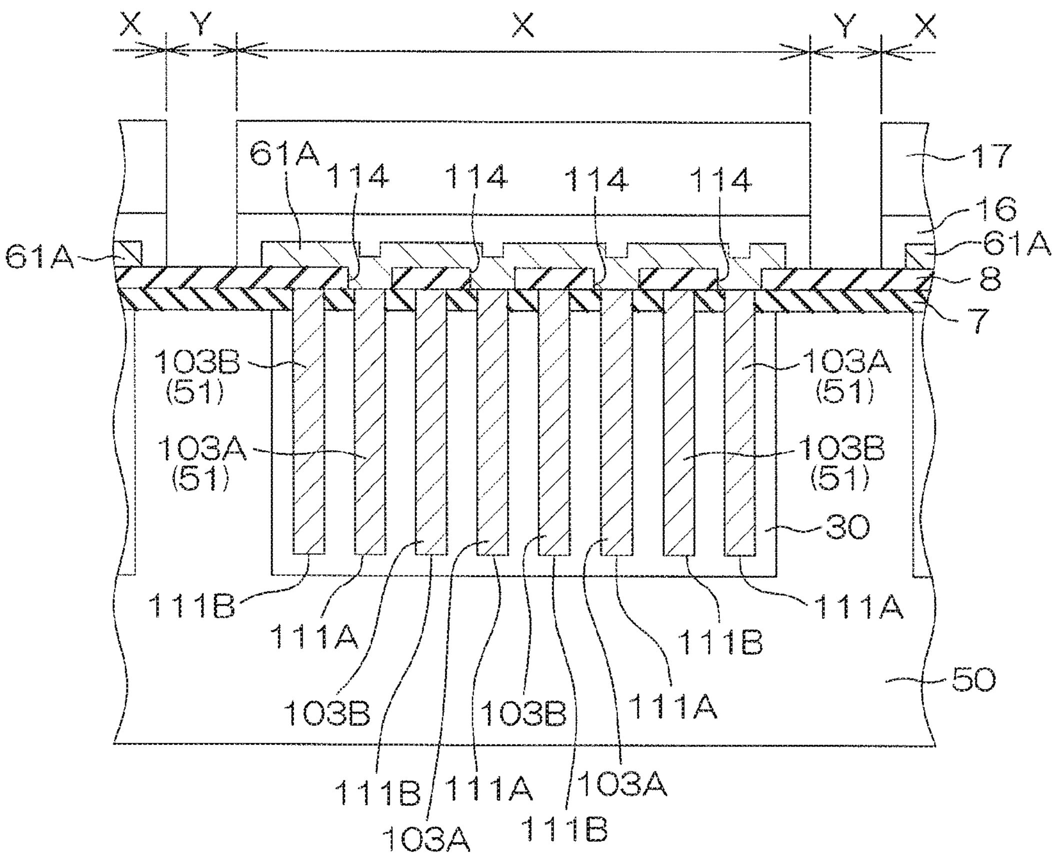

FIG. 173G is a cross-sectional view showing the step subsequent to FIG. 173F.

Figure 173H:
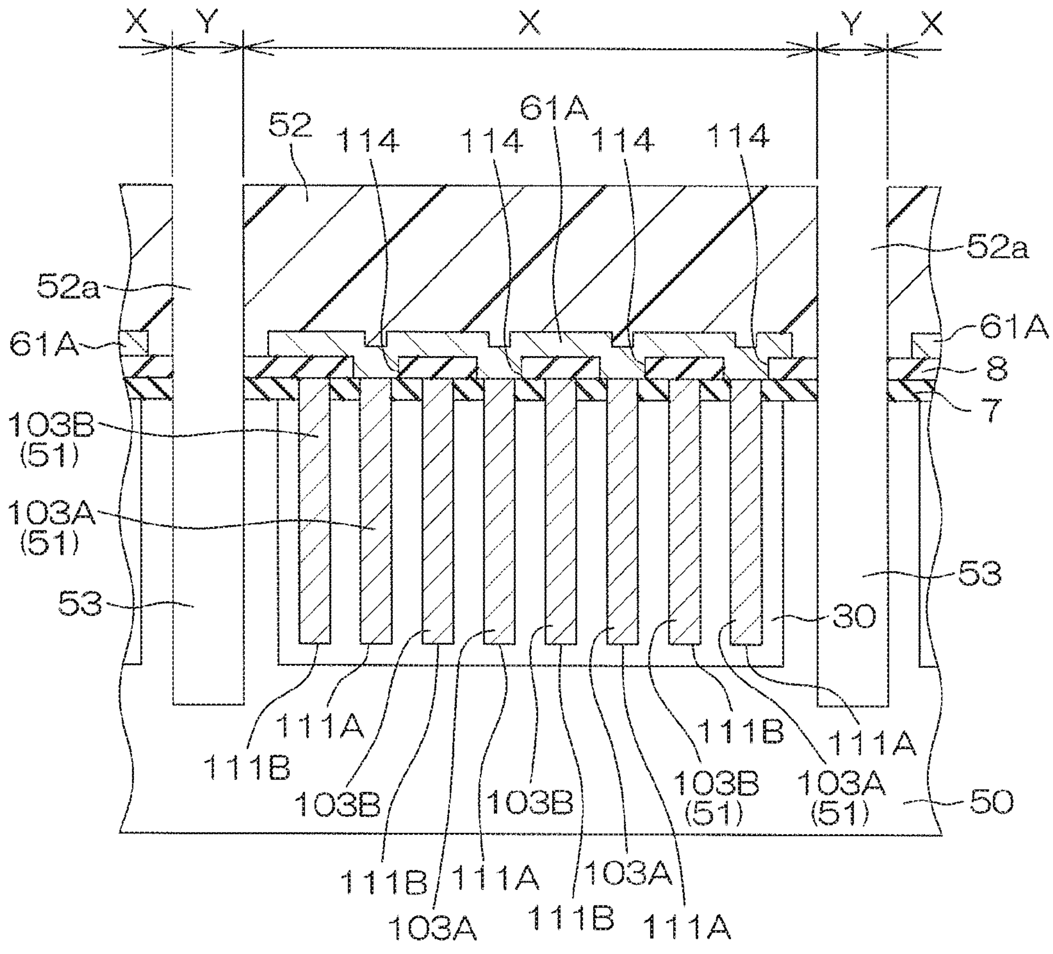
Figure 173:
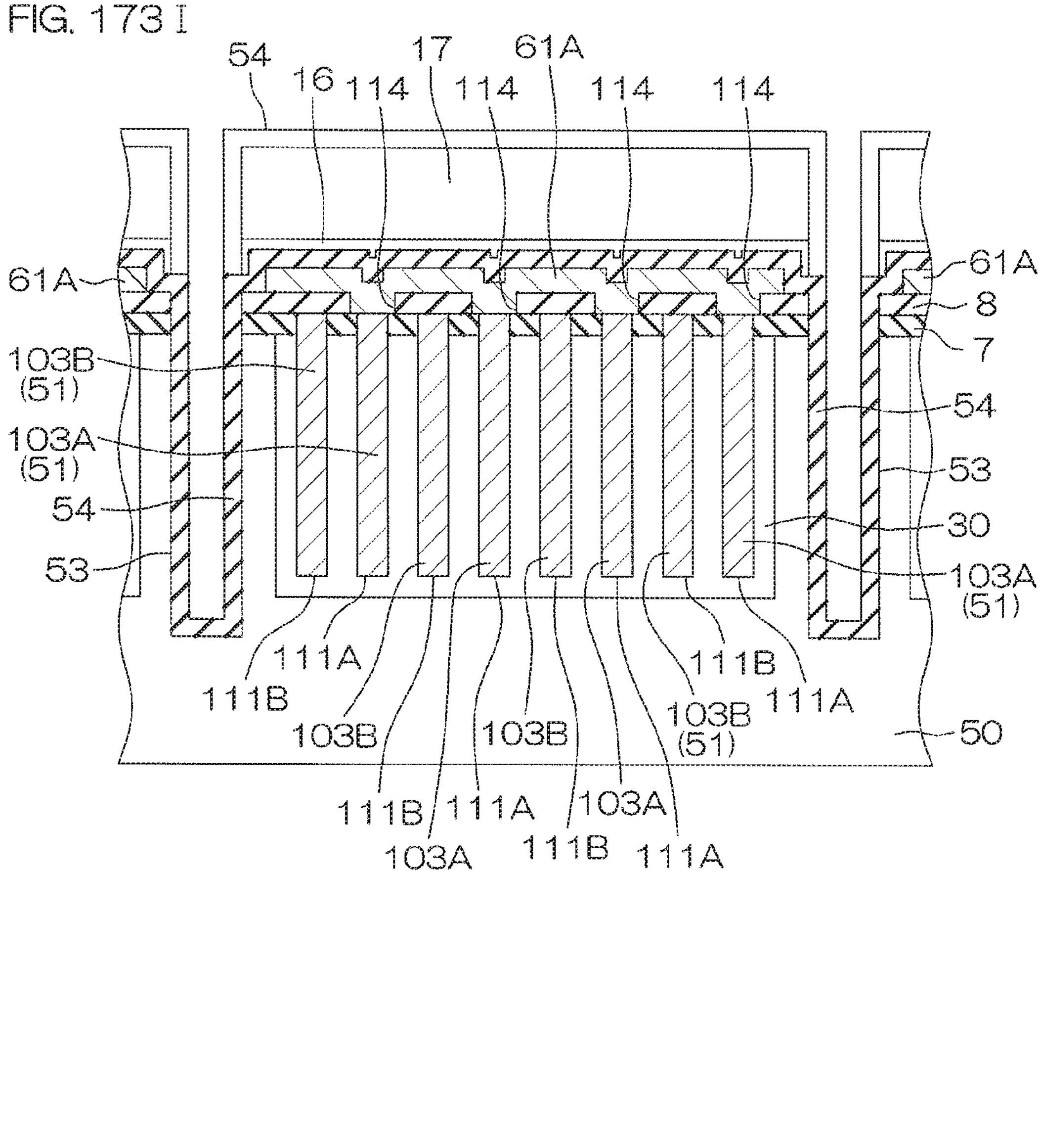

FIG. 173H is a cross-sectional view showing the step subsequent to FIG. 173G.

FIG. 173I is a cross-sectional view showing the step subsequent to FIG. 173H.

FIG. 173I is a cross-sectional view showing the step subsequent to FIG. 173I.

Figure 173J:
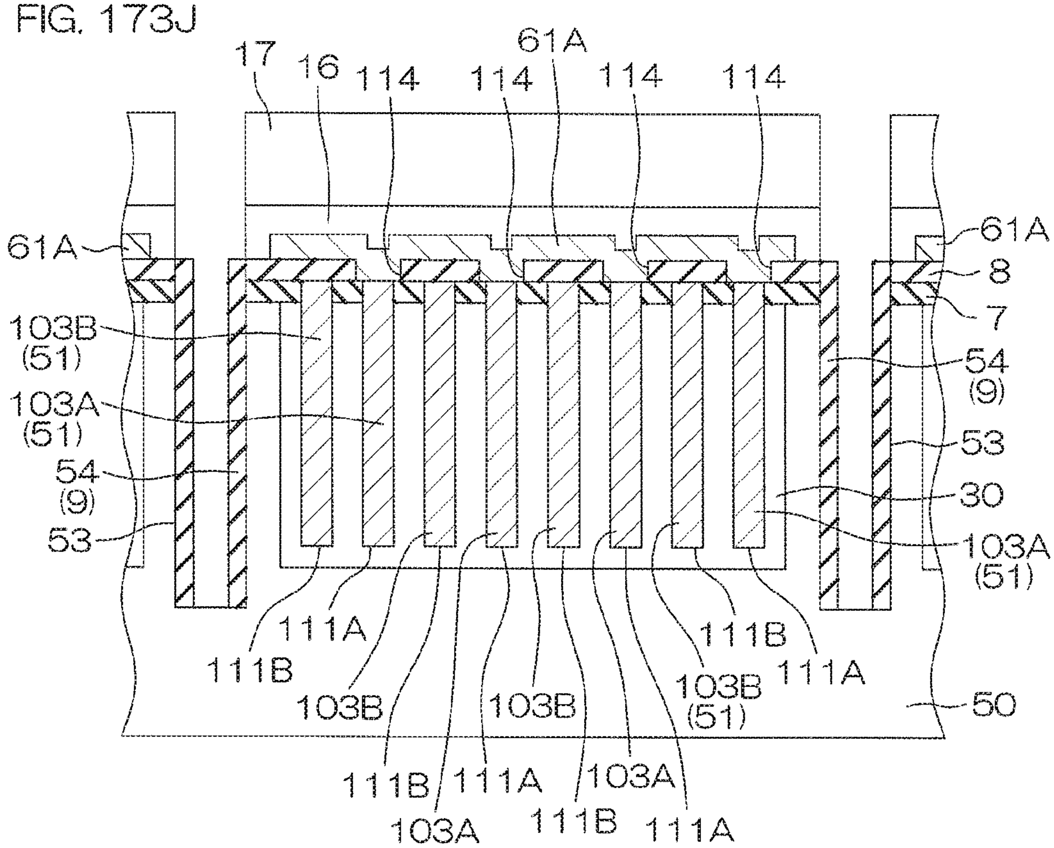
Figure 173K:
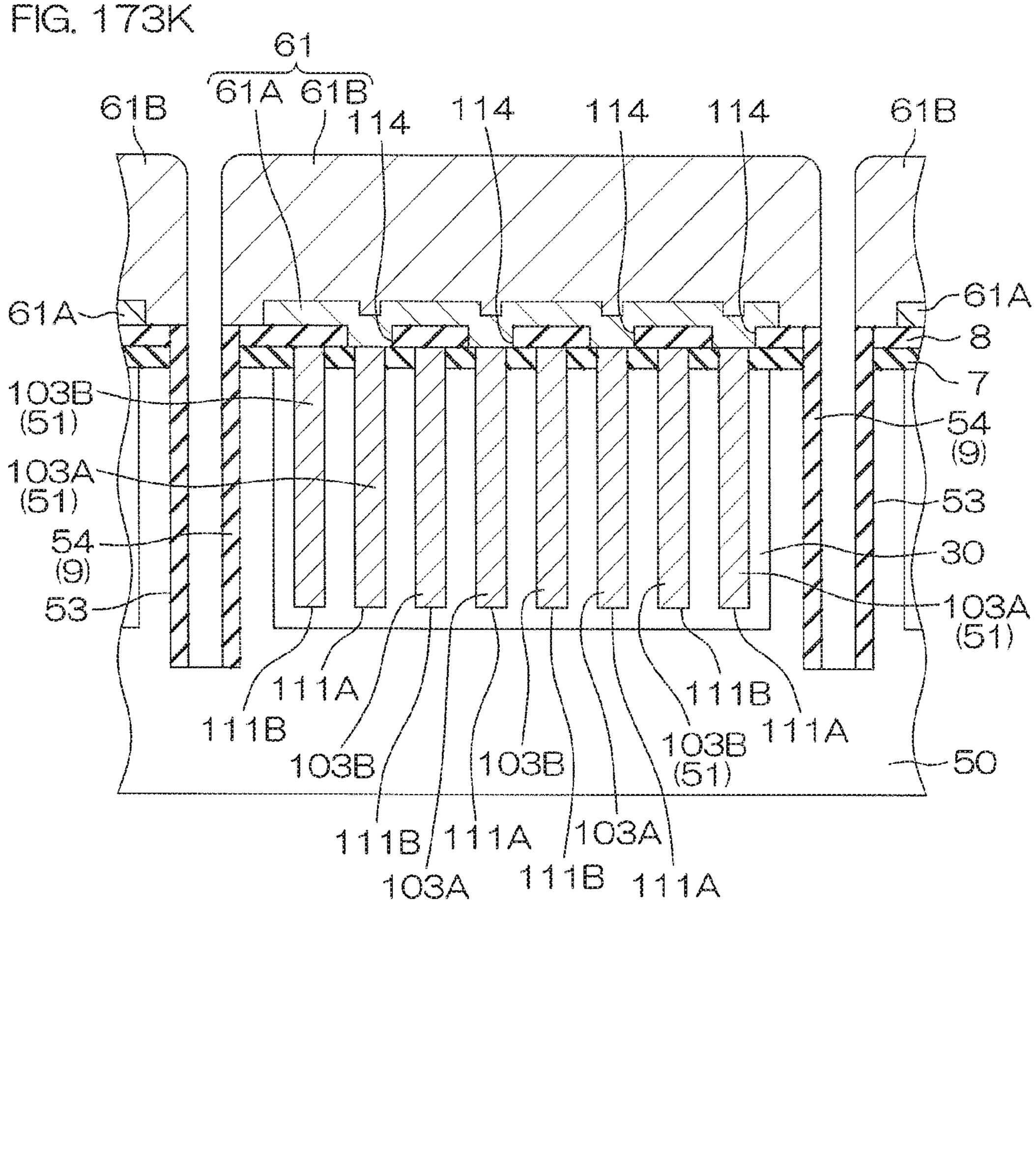

FIG. 173K is a cross-sectional view showing the step subsequent to FIG. 173J.

Figure 173L:
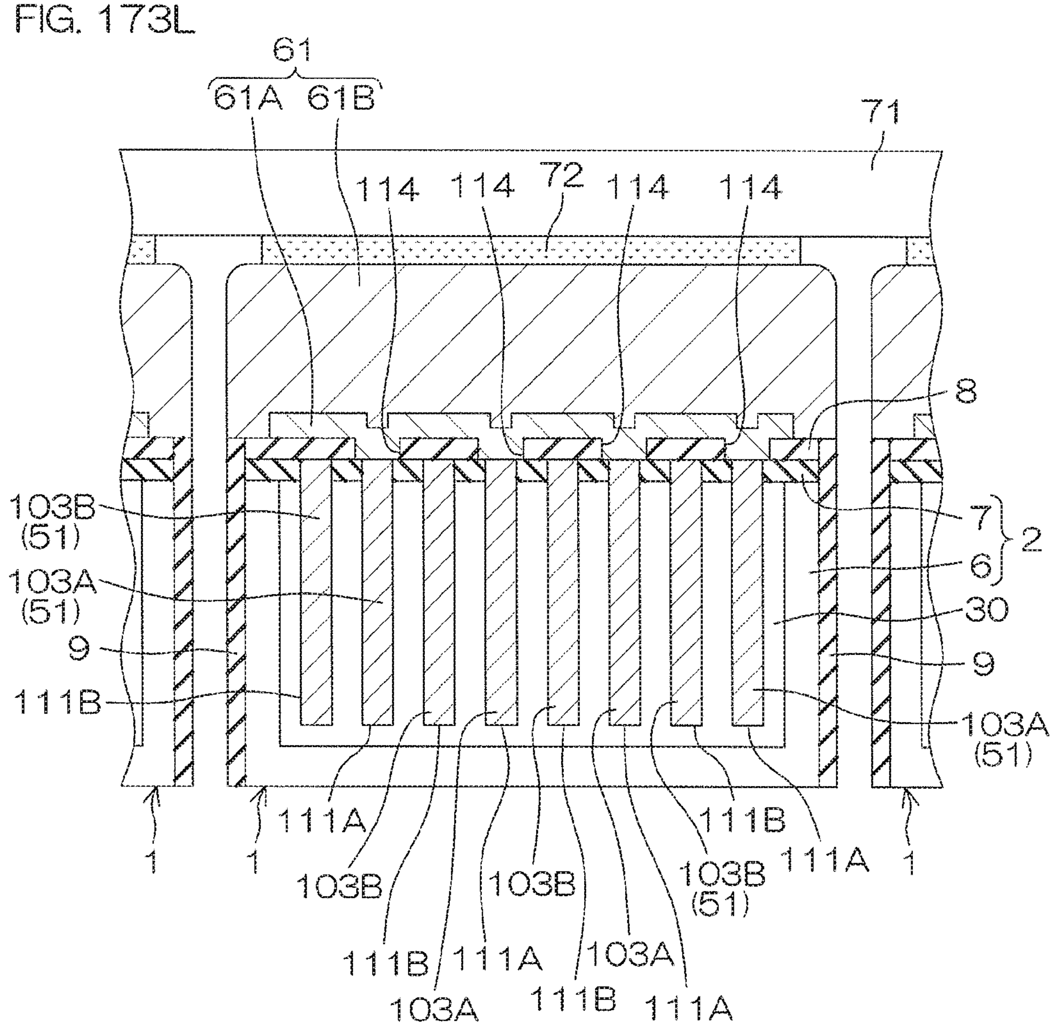

FIG. 173L is a cross-sectional view showing the step subsequent to FIG. 173K.

Figure 174A:
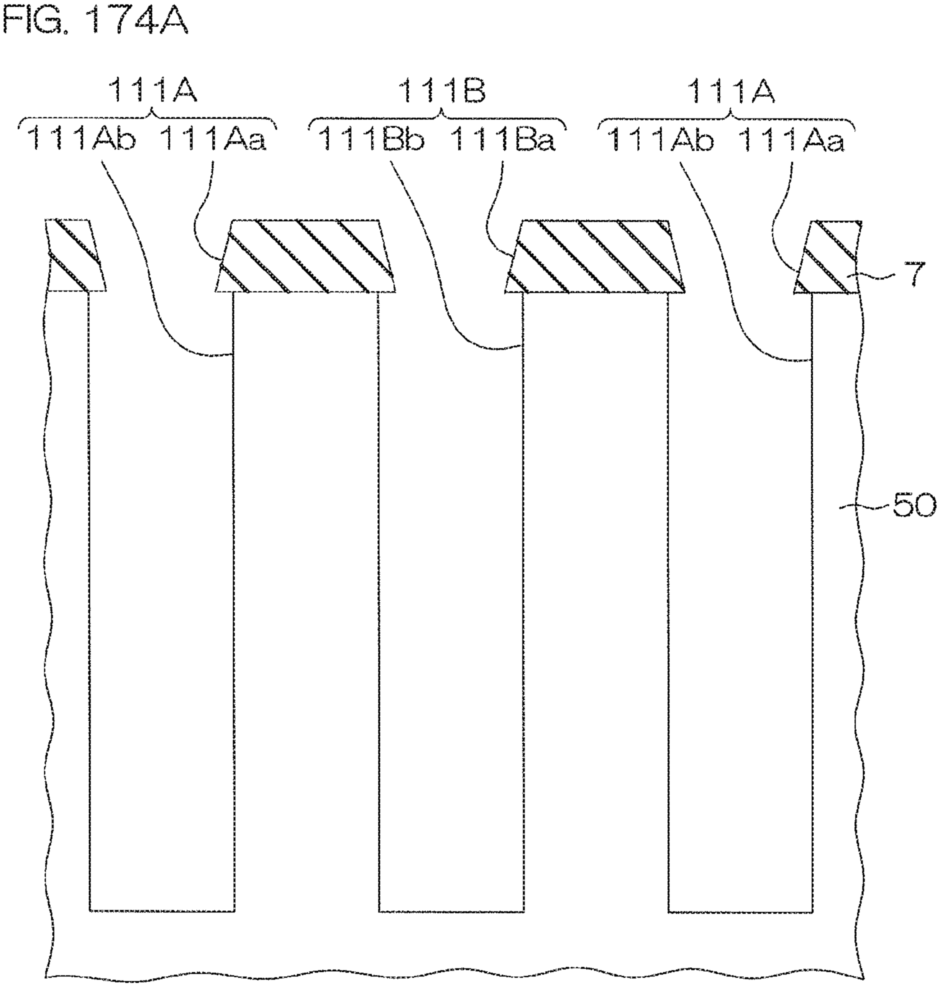

FIG. 174A is a partially enlarged cross-sectional view showing the details of the manufacturing step of the first internal electrode and the second internal electrode, and is a cross-sectional view corresponding to FIG. 164B.

Figure 174B:
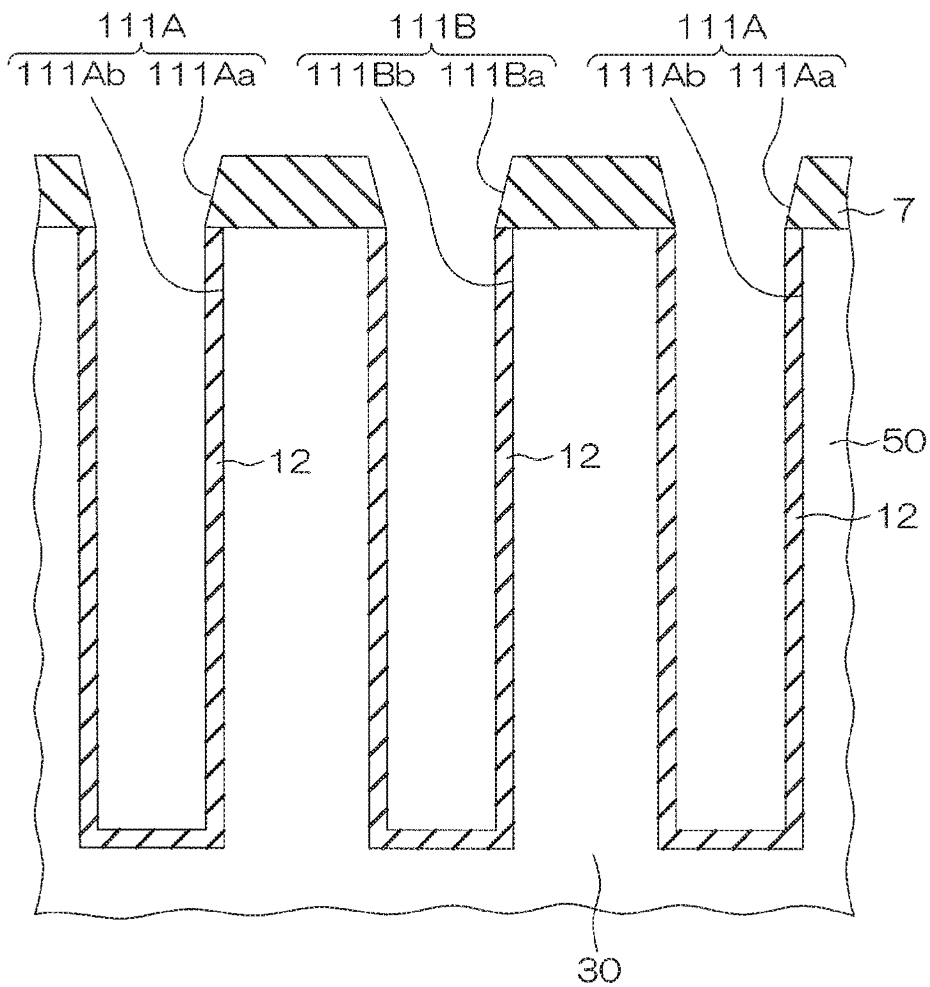

FIG. 174B is a partially enlarged cross-sectional view showing the step subsequent to FIG. 174A.

Figure 174C:
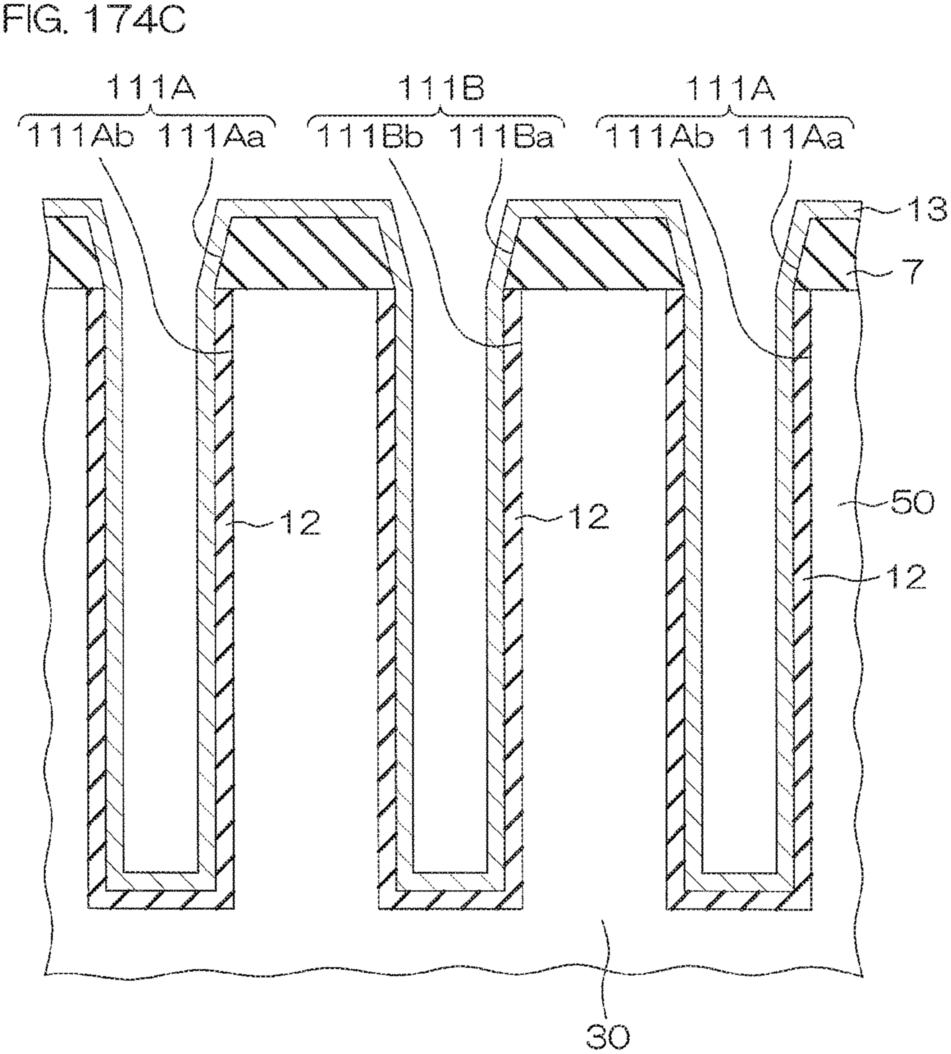

FIG. 174C is a partially enlarged cross-sectional view showing the step subsequent to FIG. 174B.

Figure 174D:
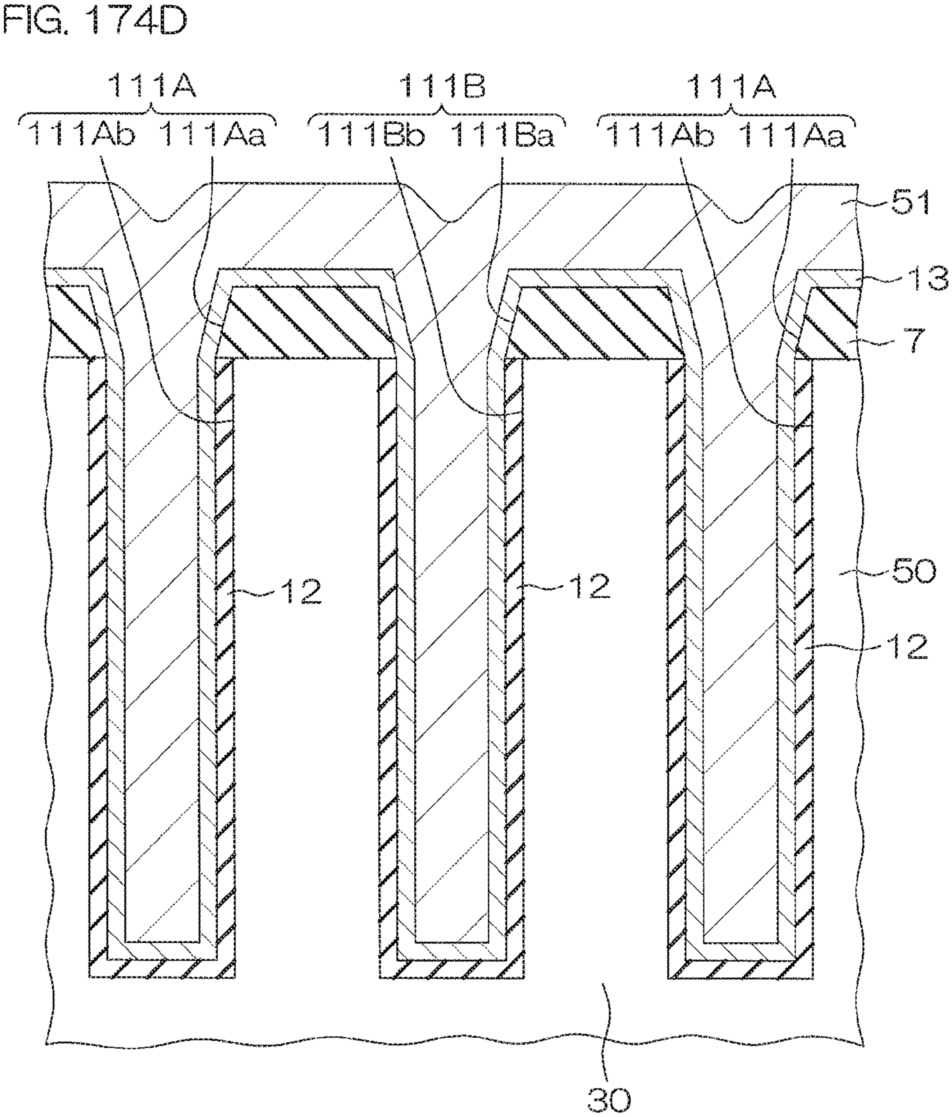

FIG. 174D is a partially enlarged cross-sectional view showing the step subsequent to FIG. 174C.

Figure 174E:
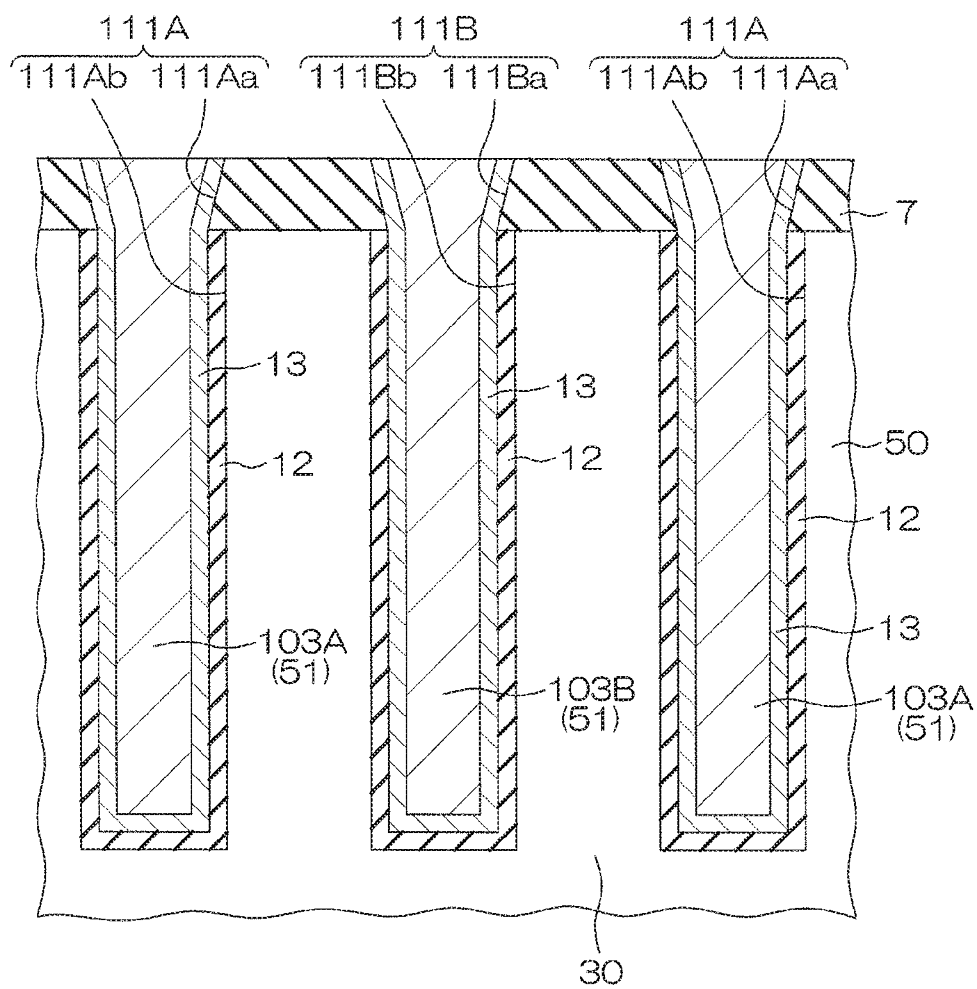

FIG. 174E is a partially enlarged cross-sectional view showing the step subsequent to FIG. 174D.

Figure 175:
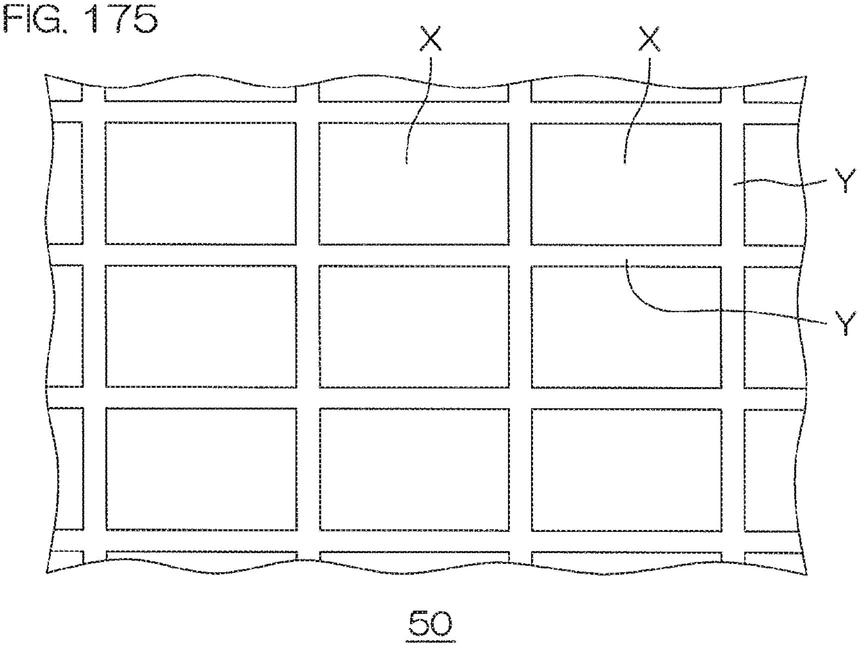

FIG. 175 is a plan view of an original substrate that is an original of a substrate main body of the LC composite element chip, and shows an enlarged view of a partial region.

Figure 176A:
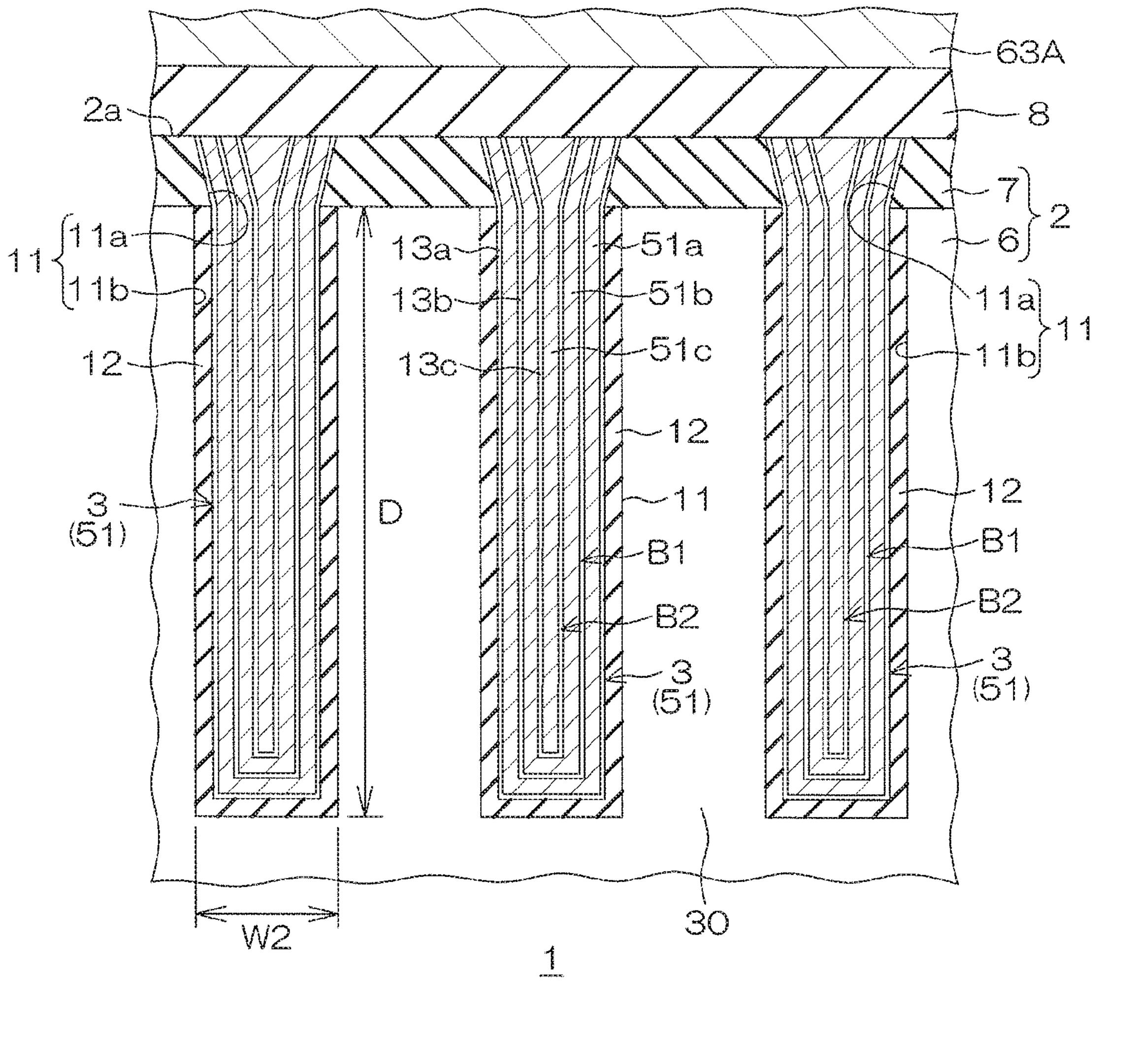

FIG. 176A is a diagram showing a modification example of a conductive member embedded within a coil formation trench, and is a partially enlarged cross-sectional view corresponding to FIG. 163A.

Figure 176B:
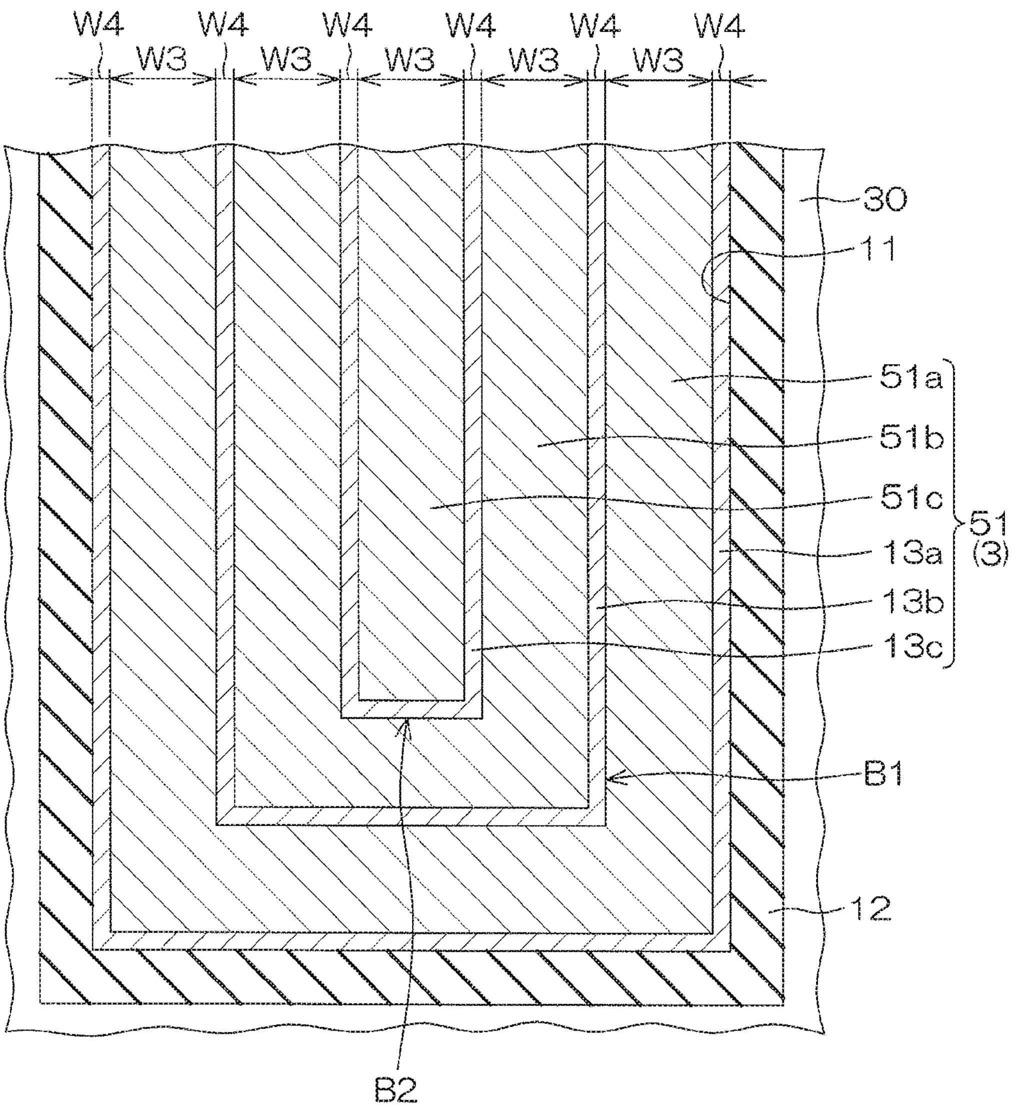

FIG. 176B is a partially enlarged cross-sectional view of FIG. 176A.

Figure 177A:
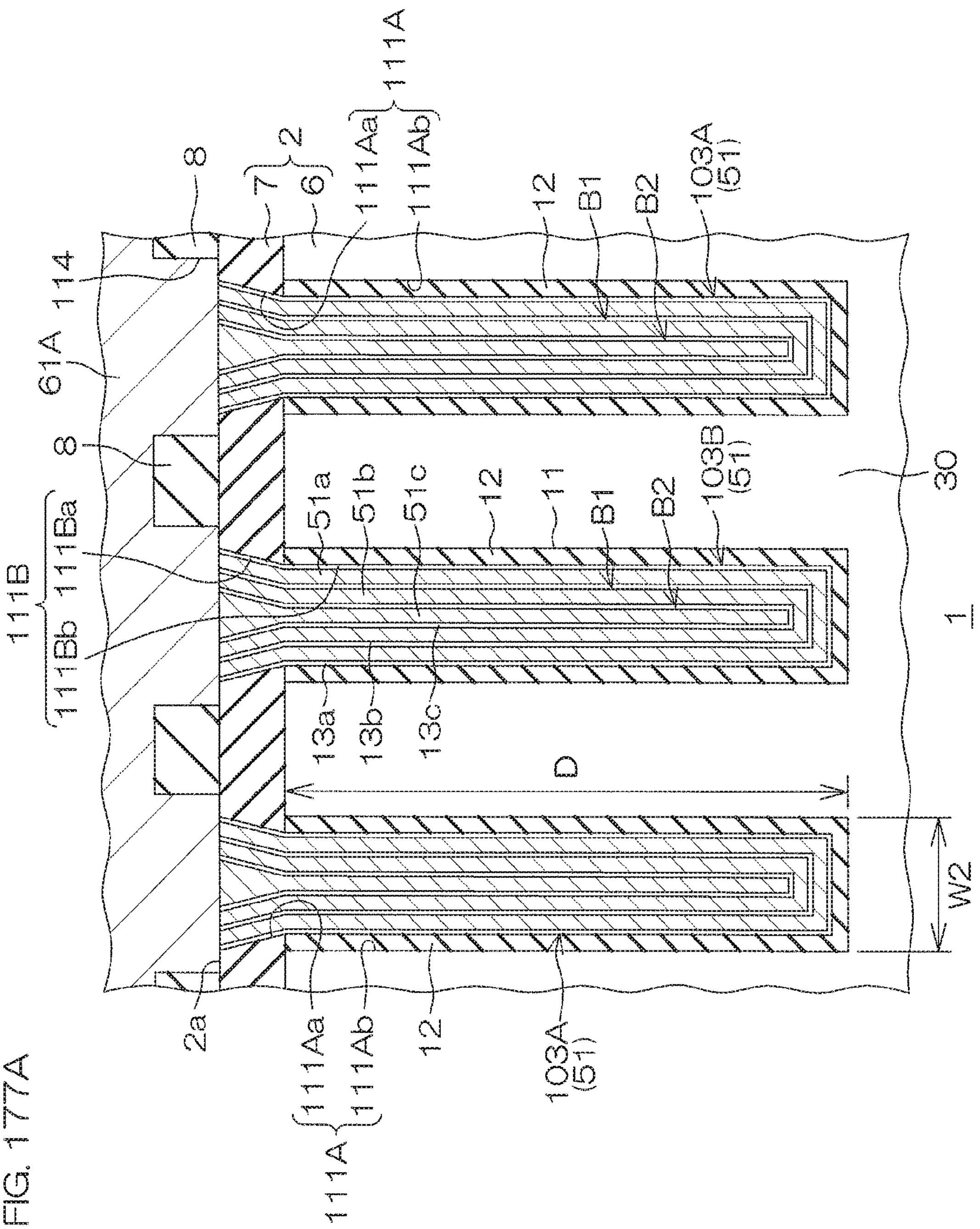

FIG. 177A is a diagram showing a modification example of a conductive member embedded within each of internal electrode formation trenches, and is a partially enlarged cross-sectional view corresponding to FIG. 164A.

Figure 177B:
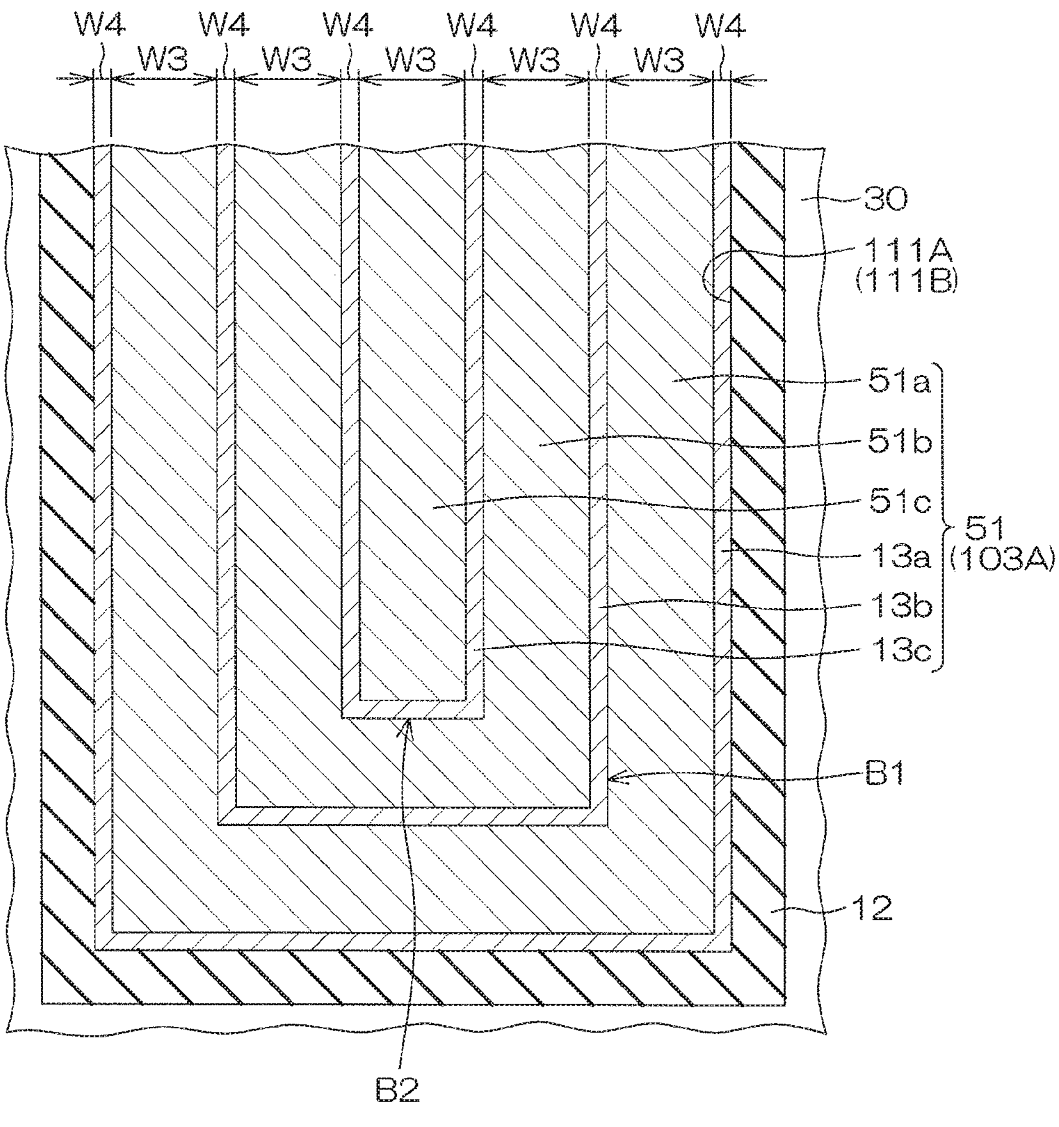

FIG. 177B is a partially enlarged cross-sectional view of FIG. 177A.

Figure 178:
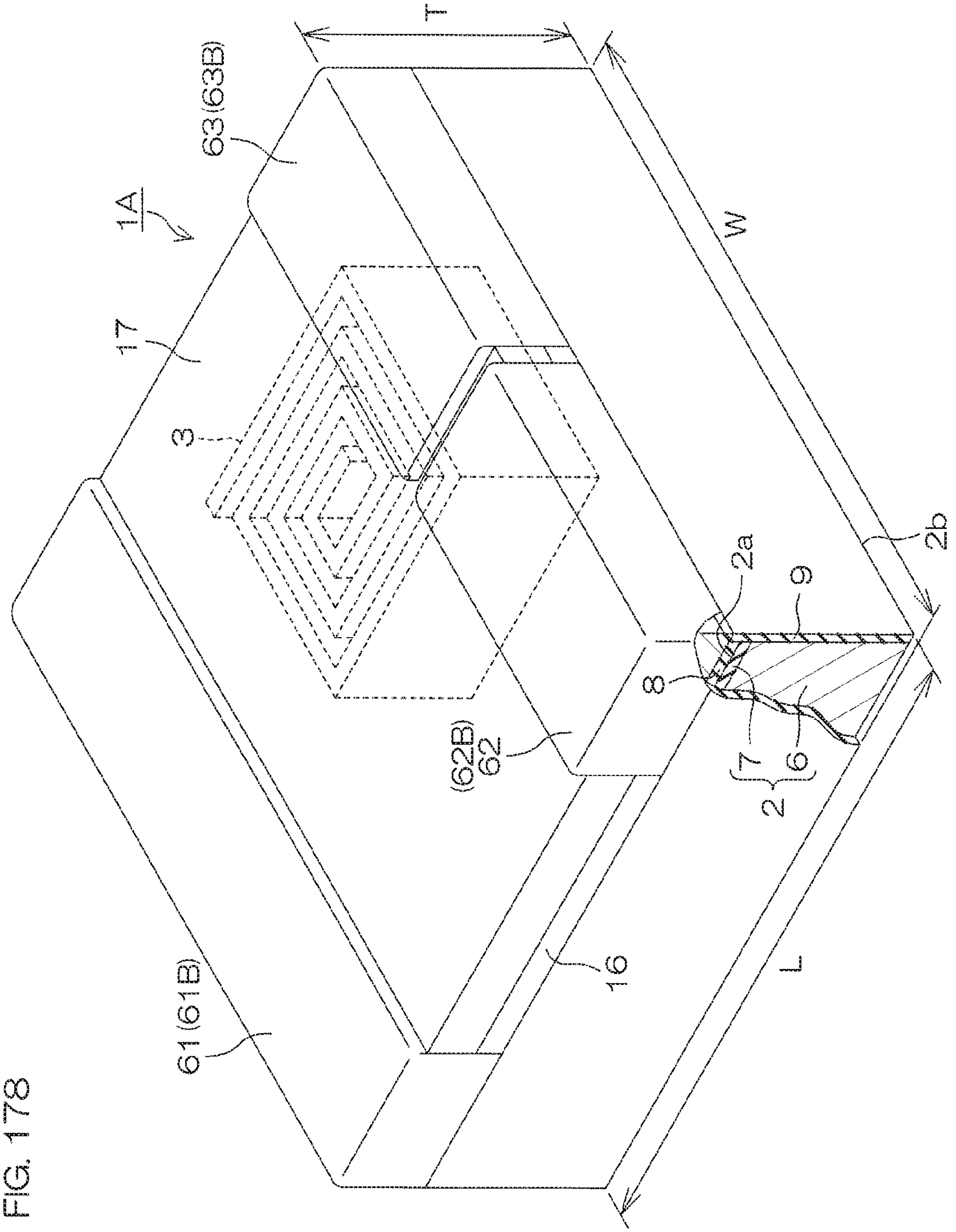

FIG. 178 is a partially cut perspective view of an LC composite element chip according to a second preferred embodiment of the sixth invention.

Figure 179:
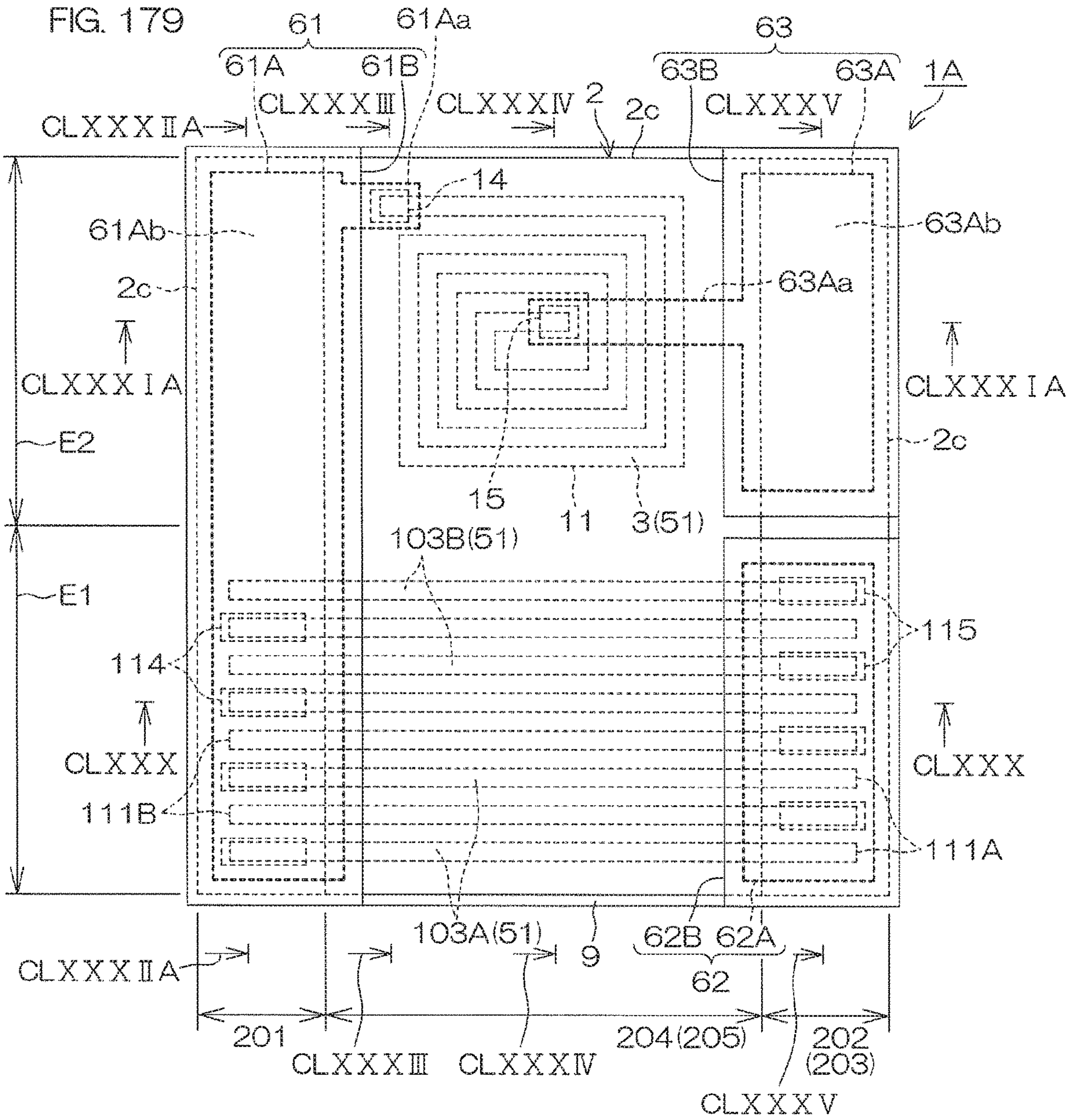

FIG. 179 is a plan view of the LC composite element chip.

Figure 180:
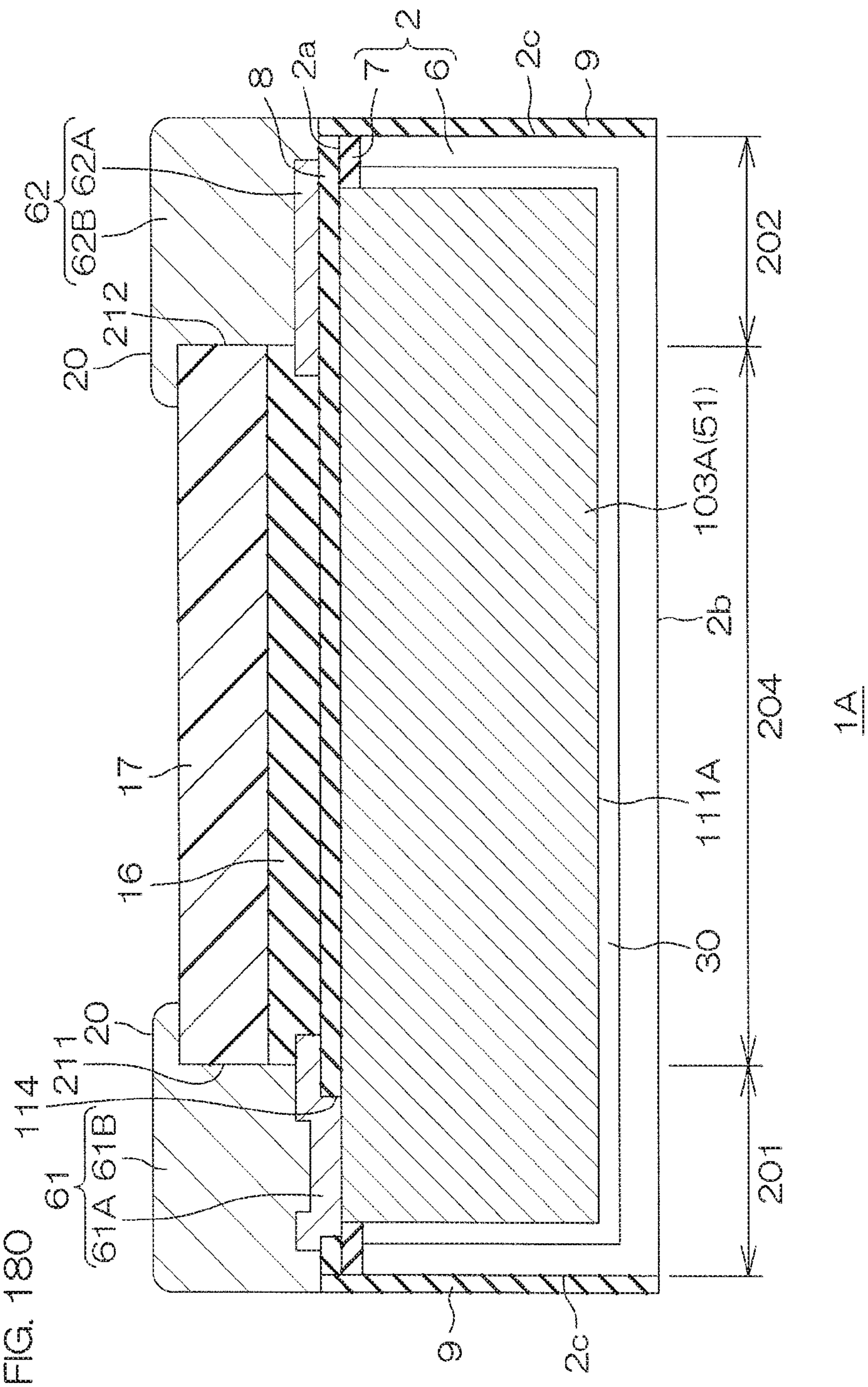

FIG. 180 is a cross-sectional view taken along line CLXXX-CLXXX in FIG. 179.

Figure 181A:
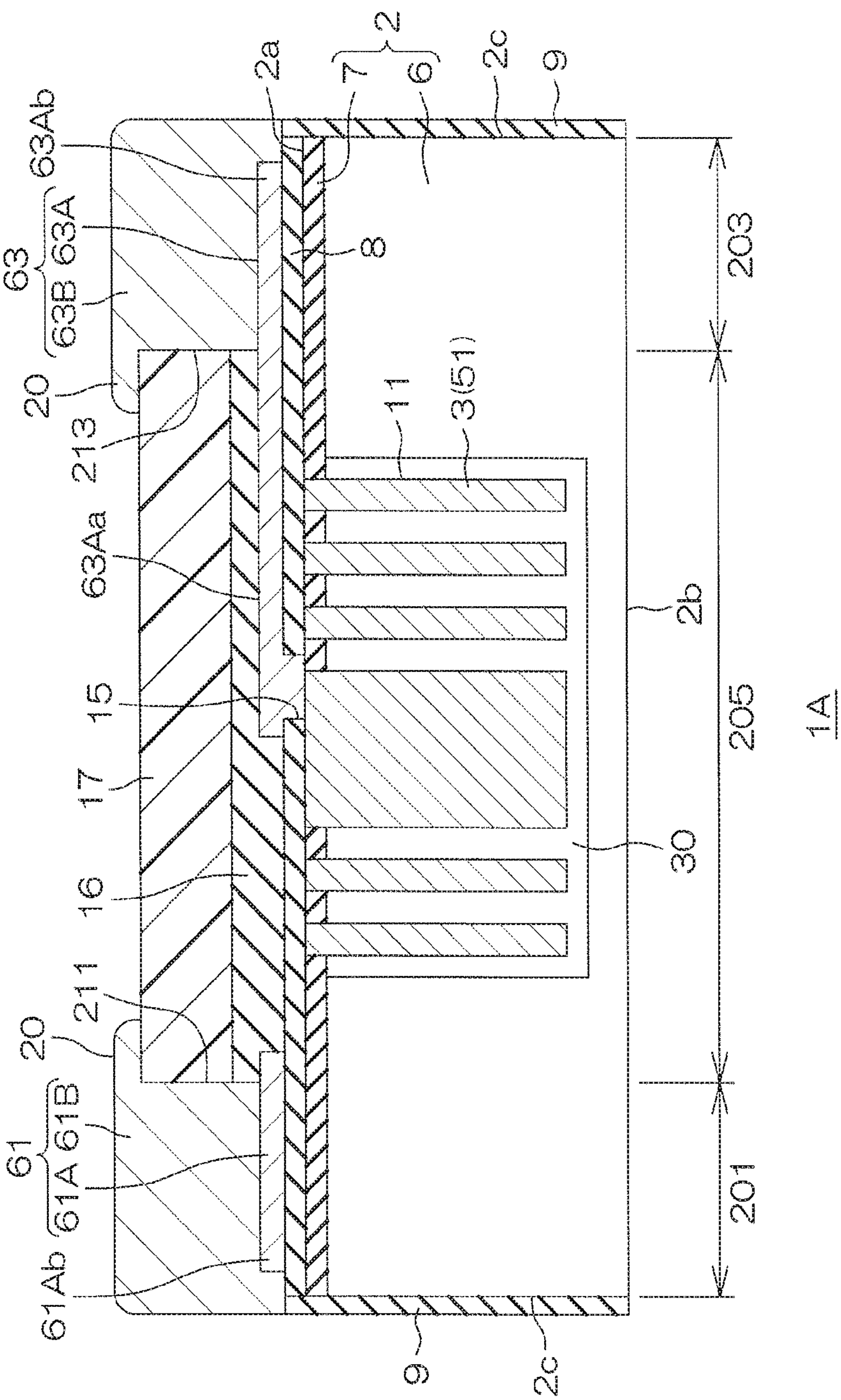

FIG. 181A is a cross-sectional view taken along line CLXXXIA-CLXXXIA in FIG. 179.

Figure 181B:
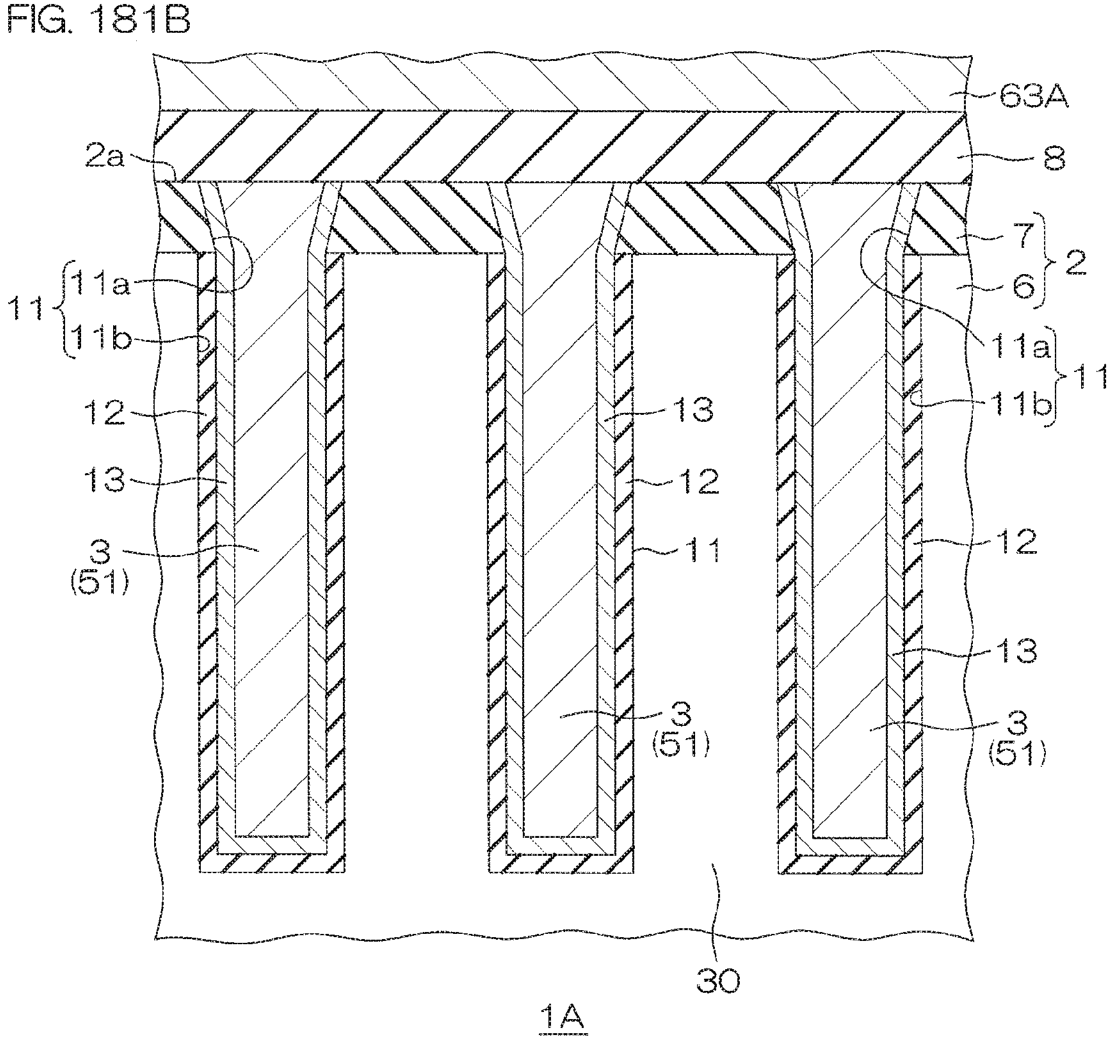

FIG. 181B is a partially enlarged cross-sectional view of FIG. 181A.

Figure 182A:
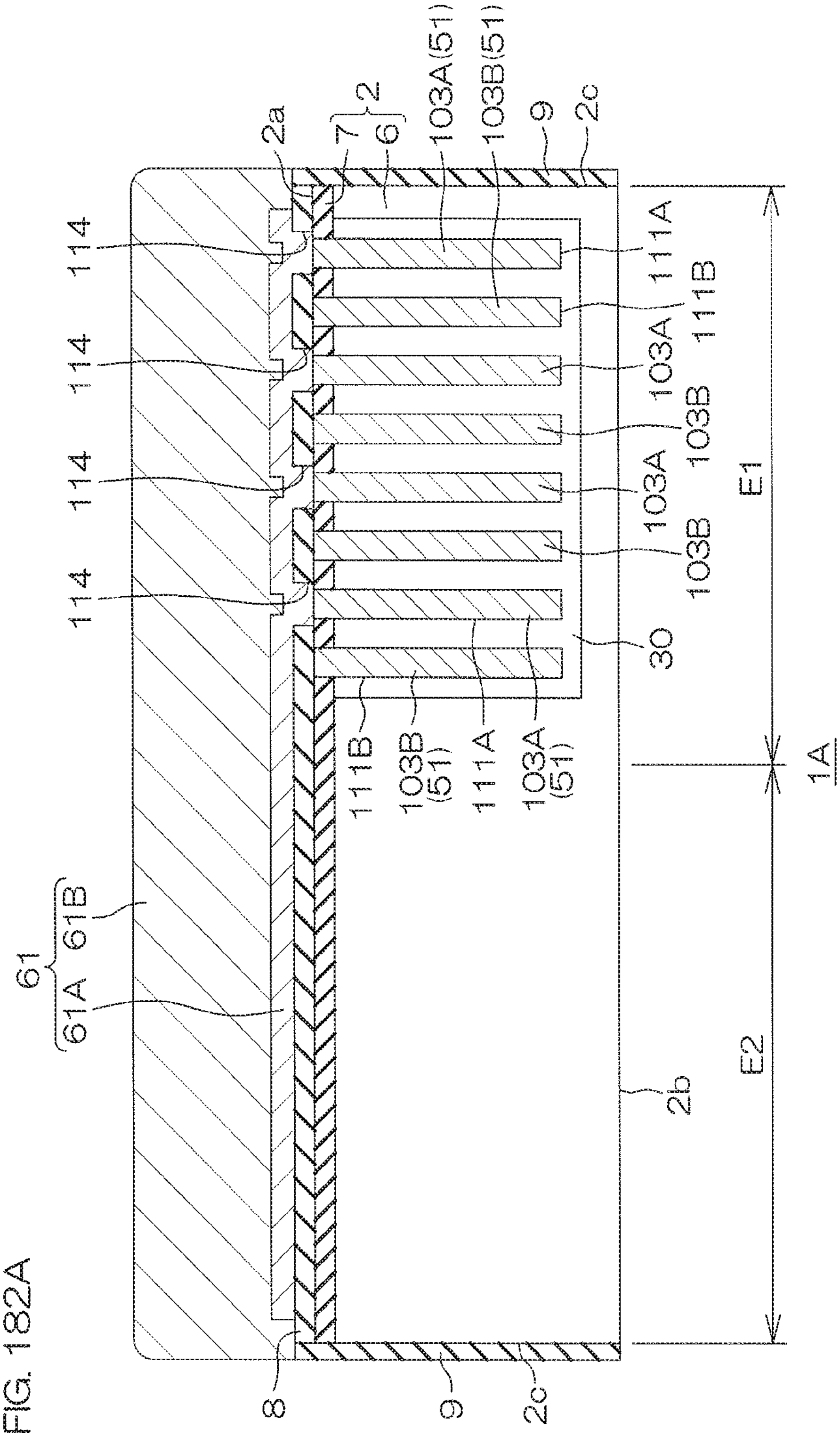

FIG. 182A is a cross-sectional view taken along line CLXXXIIA-CLXXXIIA in FIG. 179.

Figure 182B:
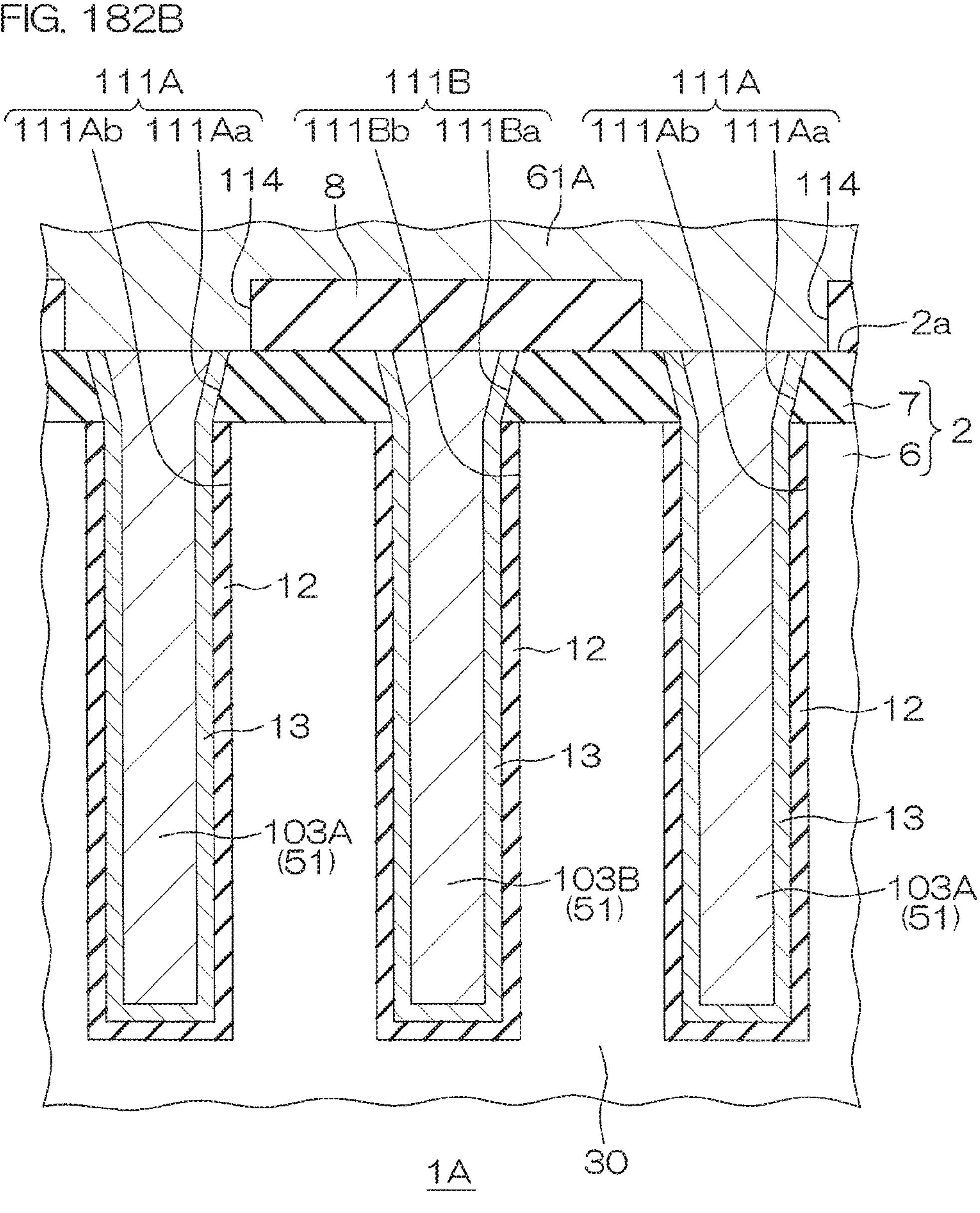

FIG. 182B is a partially enlarged cross-sectional view of FIG. 182A.

Figure 183:
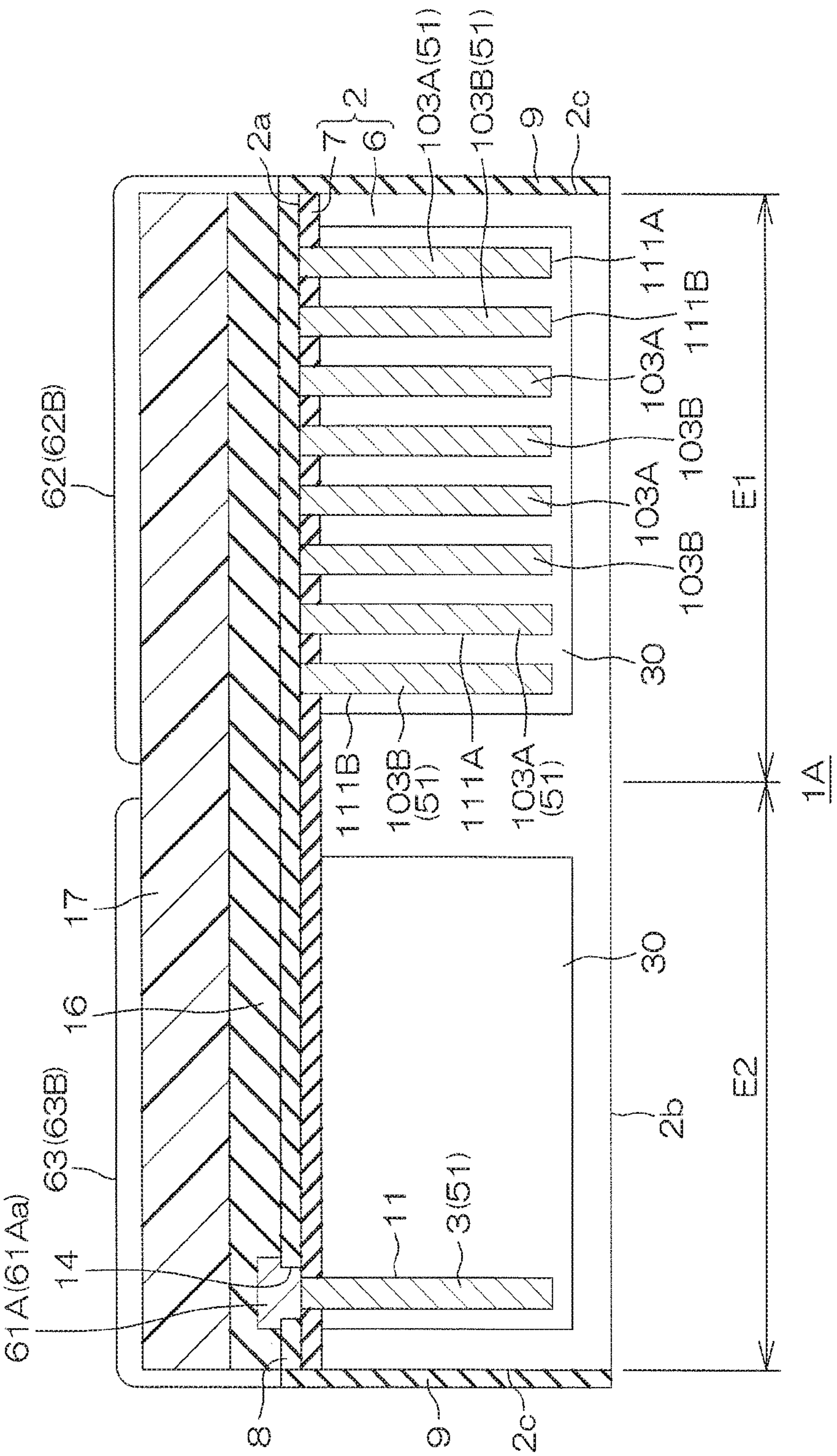

FIG. 183 is a cross-sectional view taken along line CLXXXIII-CLXXXIII in FIG. 179.

Figure 184:
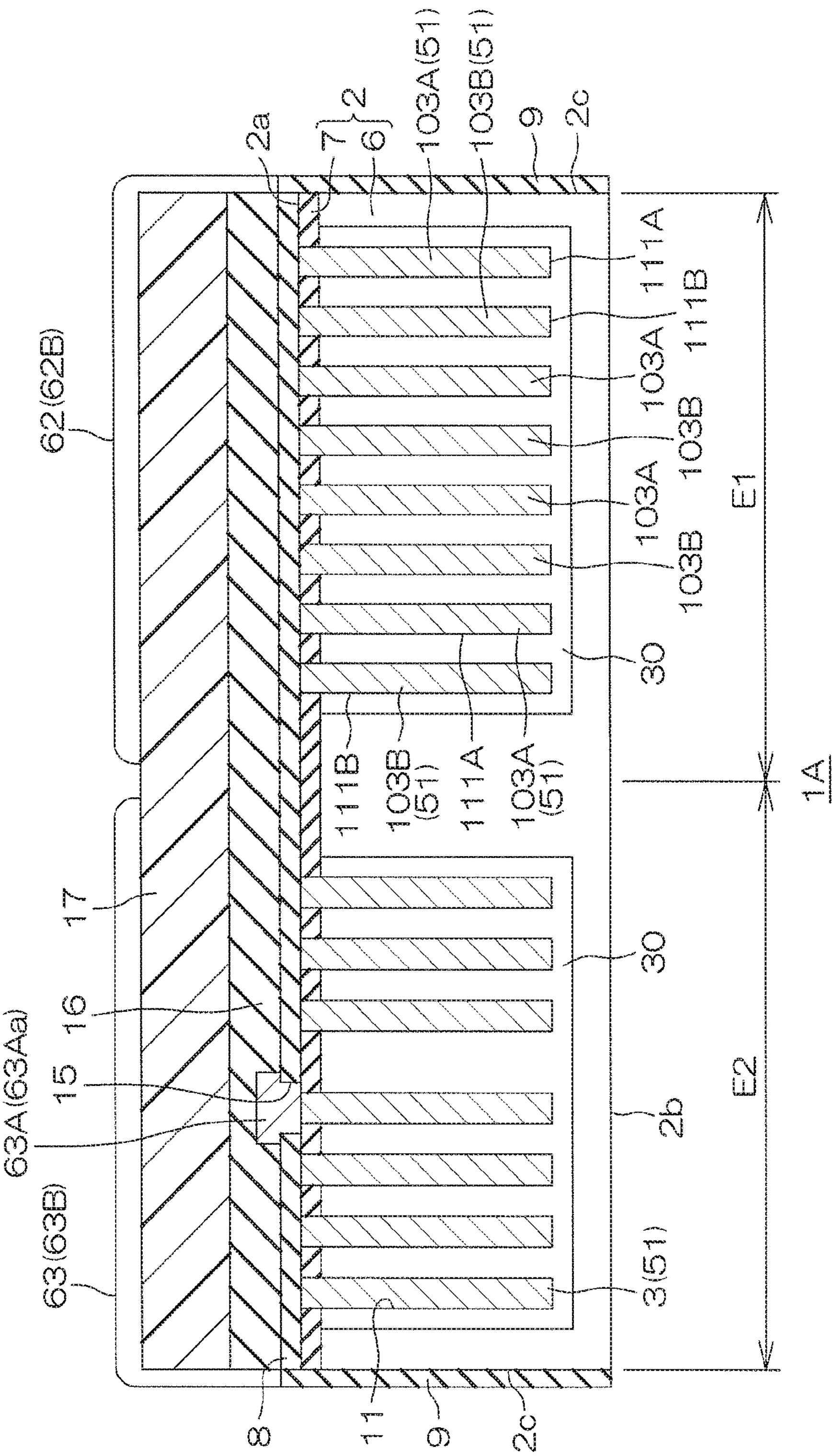

FIG. 184 is a cross-sectional view taken along line CLXXXIV-CLXXXIV in FIG. 179.

Figure 185:
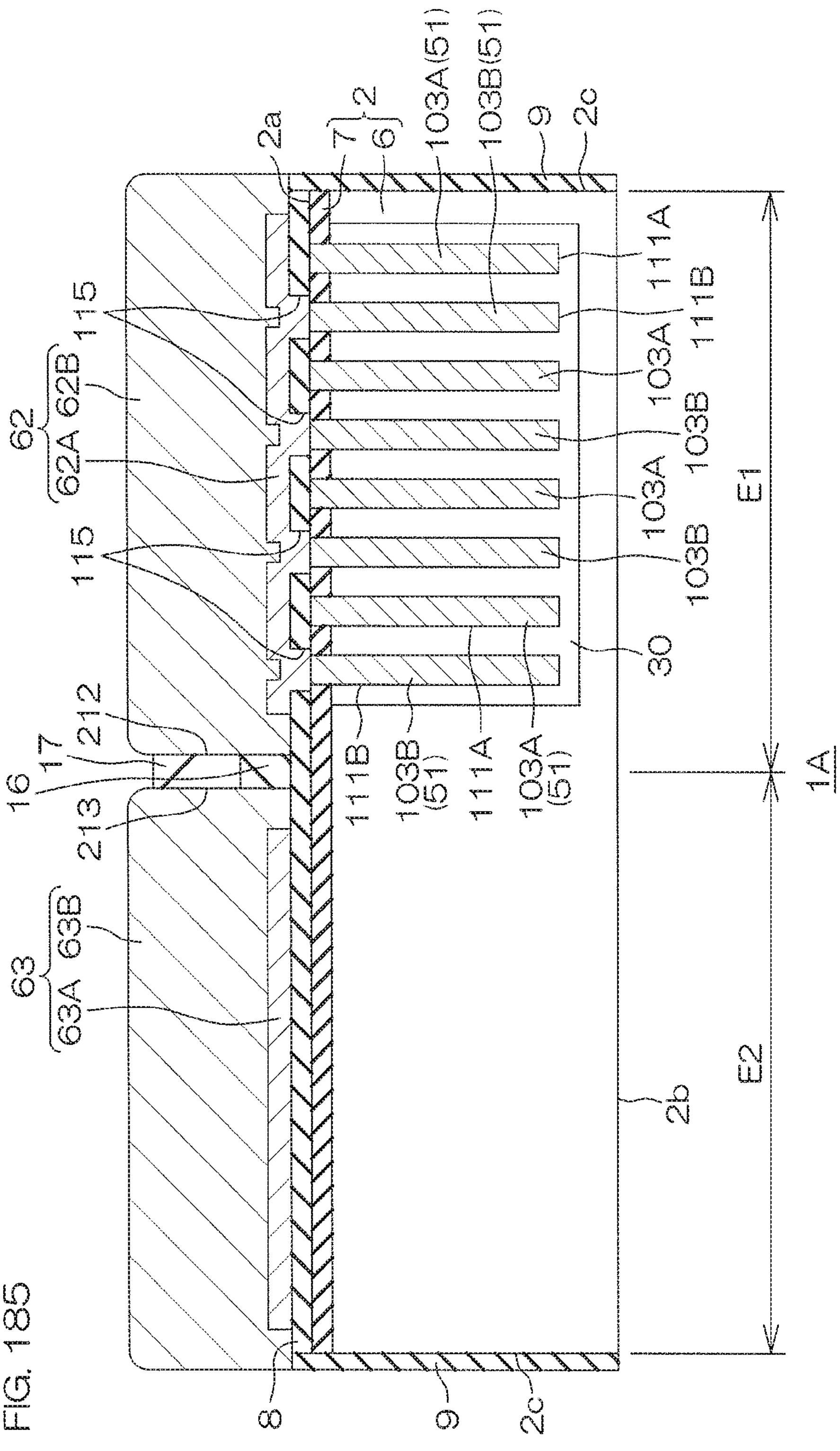

FIG. 185 is a cross-sectional view taken along line CLXXXV-CLXXXV in FIG. 179.

Figure 186:
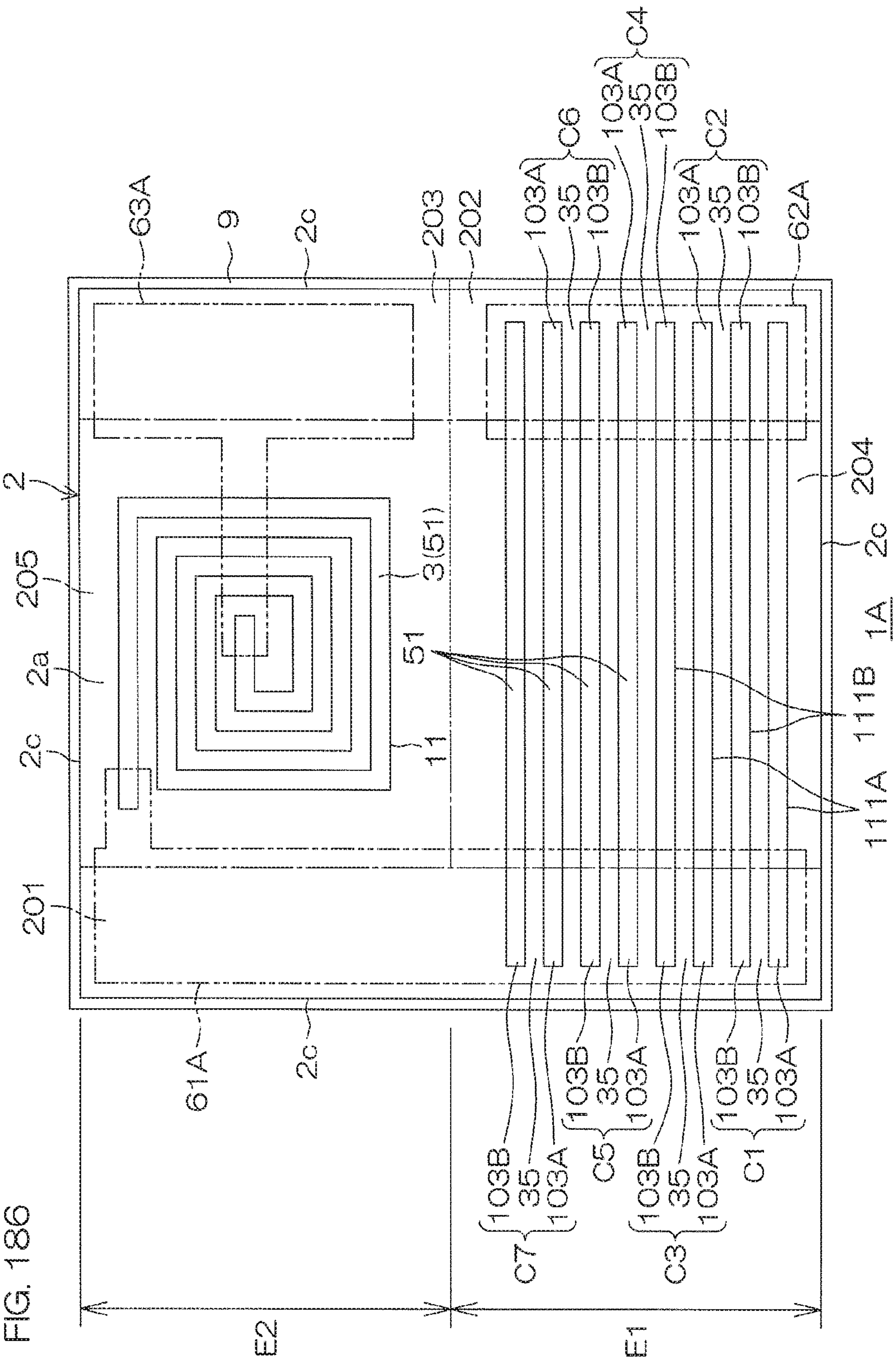

FIG. 186 is a plan view showing a structure of the surface of a substrate by removing an arrangement formed on the surface of the substrate.

Figure 187:
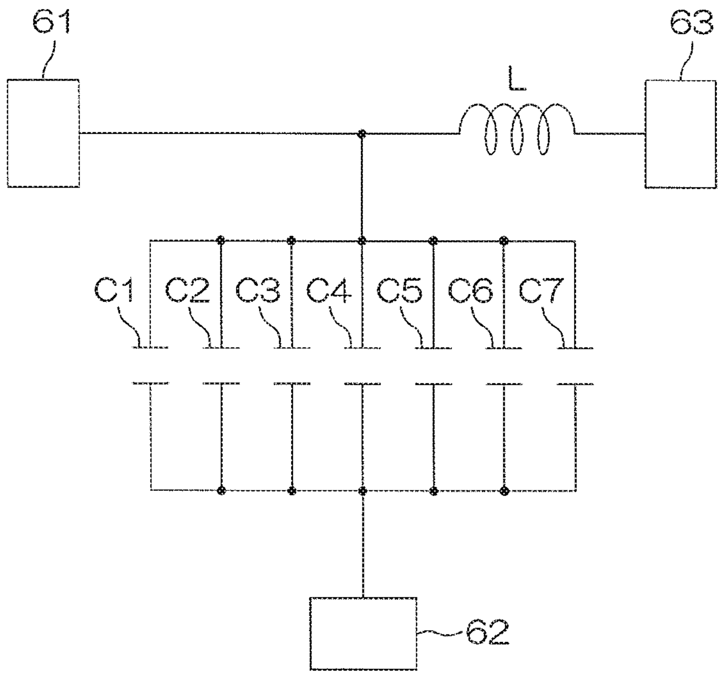

FIG. 187 is an electrical circuit diagram showing an electrical structure within the LC composite element chip.

Figure 188:
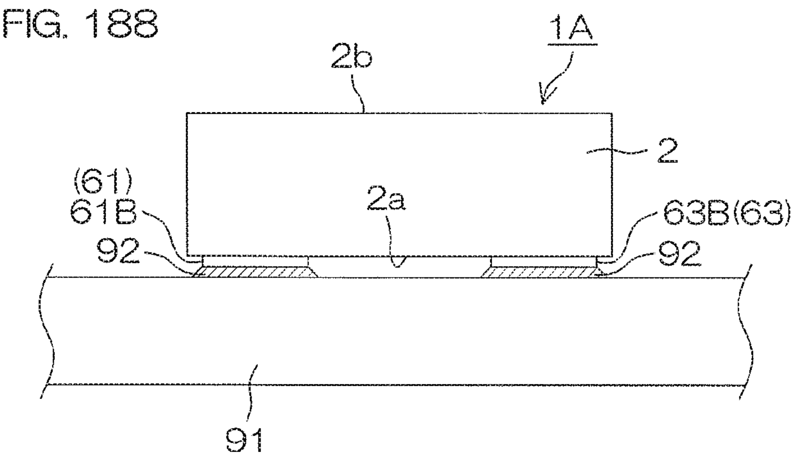

FIG. 188 is a cross-sectional view showing the structure of a circuit assembly in which the LC composite element chip is flip-chip connected on the mounting substrate.

Figure 189A:
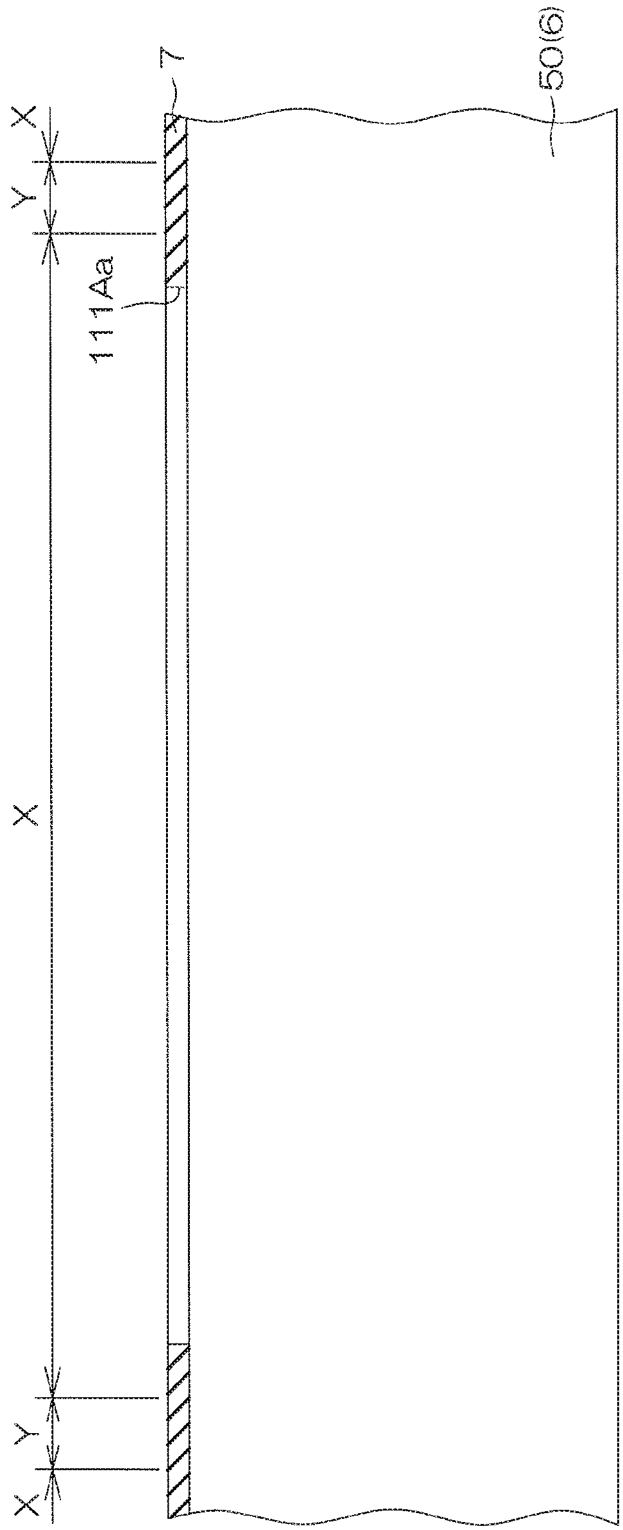

FIG. 189A is a cross-sectional view for illustrating an example of the manufacturing step of the LC composite element chip, and is a cross-sectional view corresponding to FIG. 180.

Figure 189B:
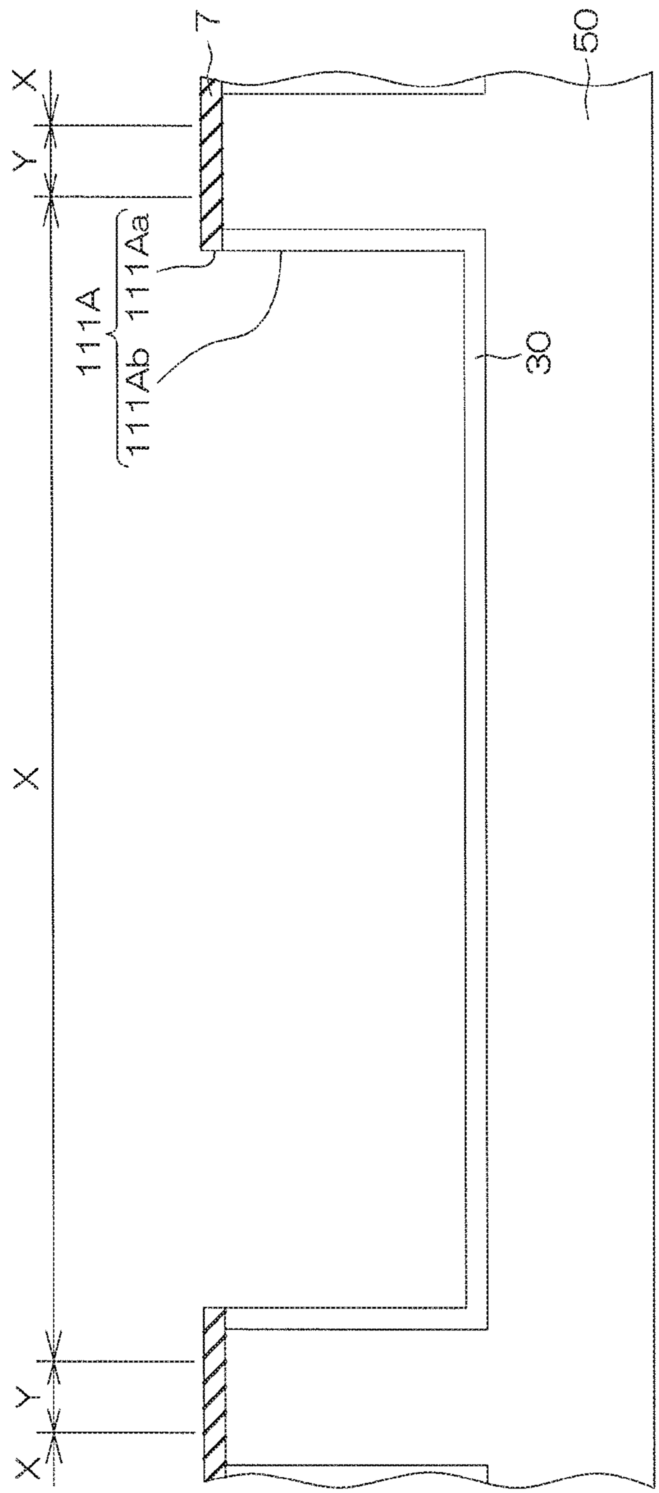

FIG. 189B is a cross-sectional view showing the step subsequent to FIG. 189A.

Figure 189C:
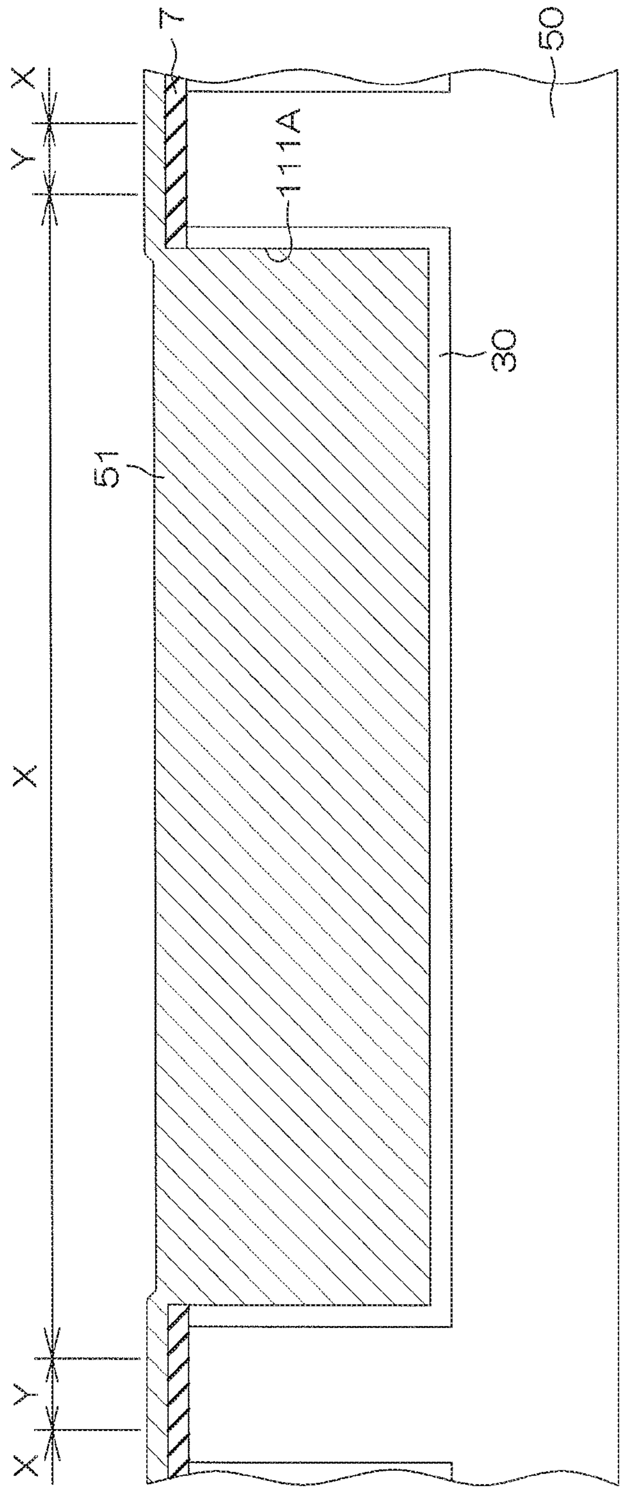

FIG. 189C is a cross-sectional view showing the step subsequent to FIG. 189B.

Figure 189D:
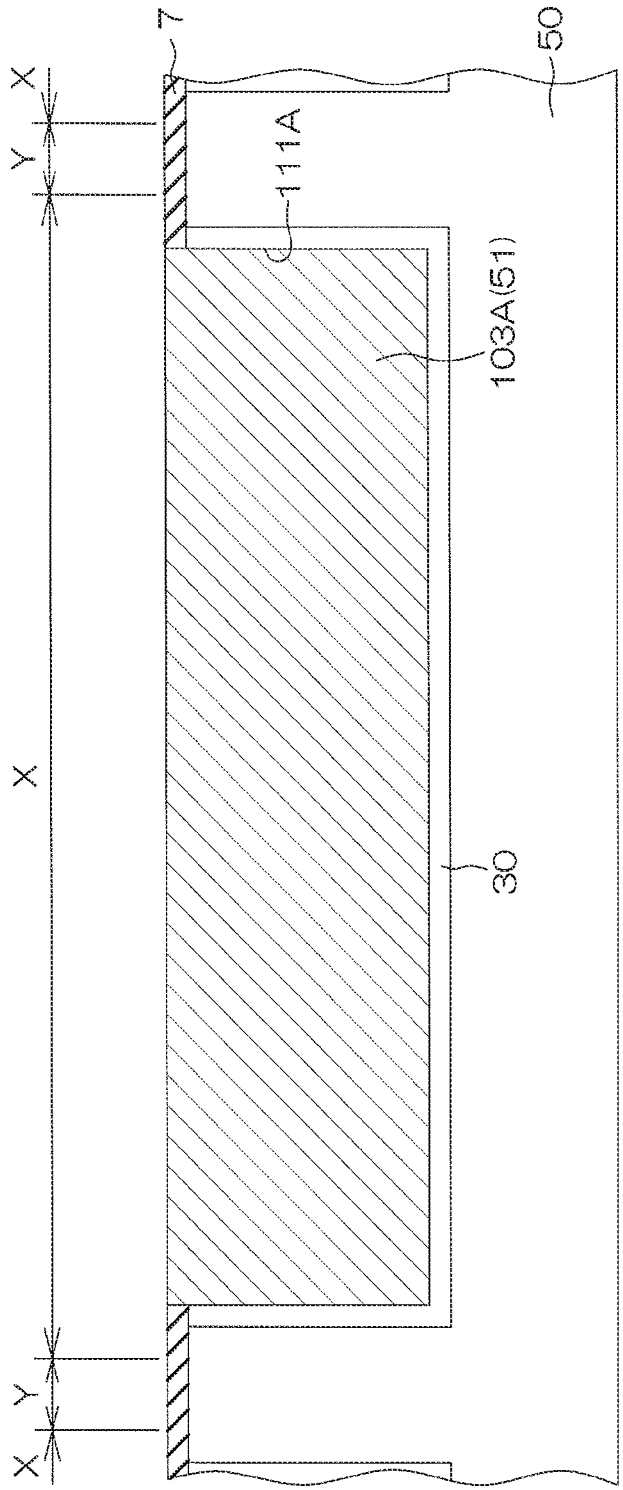

FIG. 189D is a cross-sectional view showing the step subsequent to FIG. 189C.

Figure 189E:
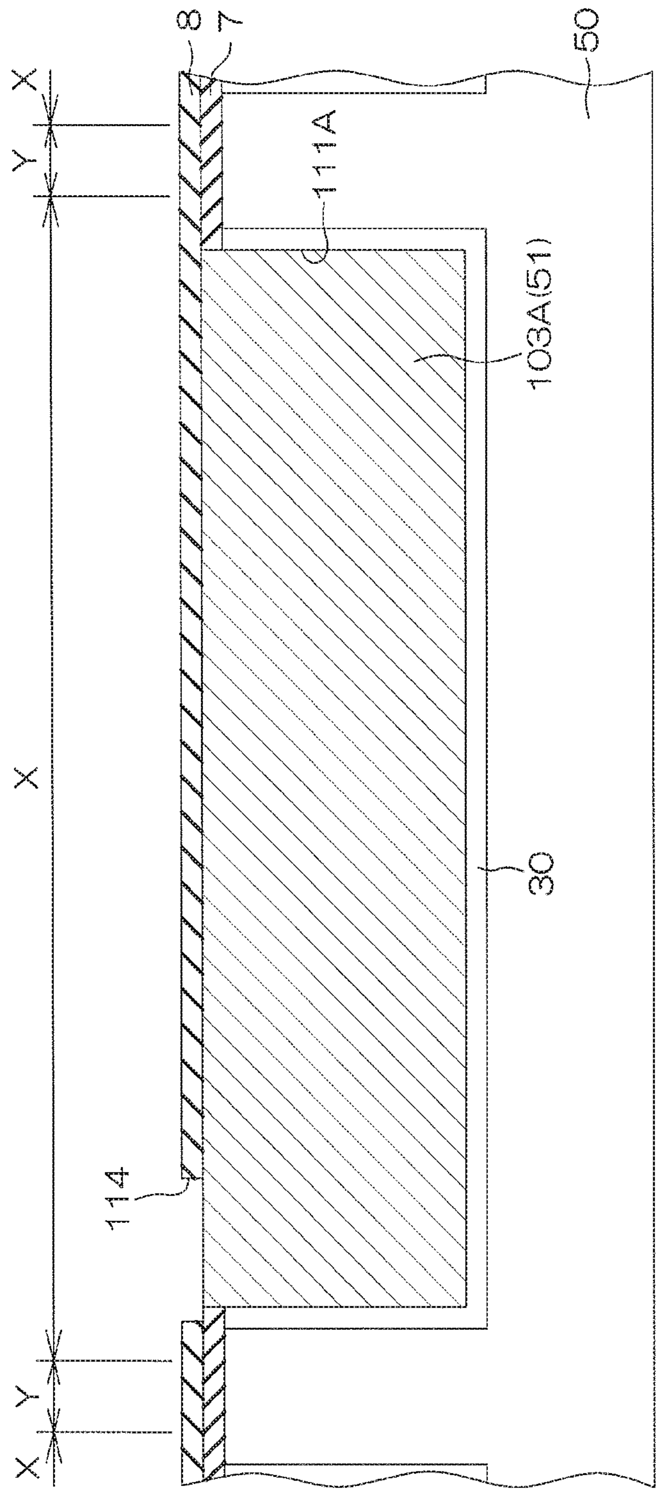

FIG. 189E is a cross-sectional view showing the step subsequent to FIG. 189D.

Figure 189F:
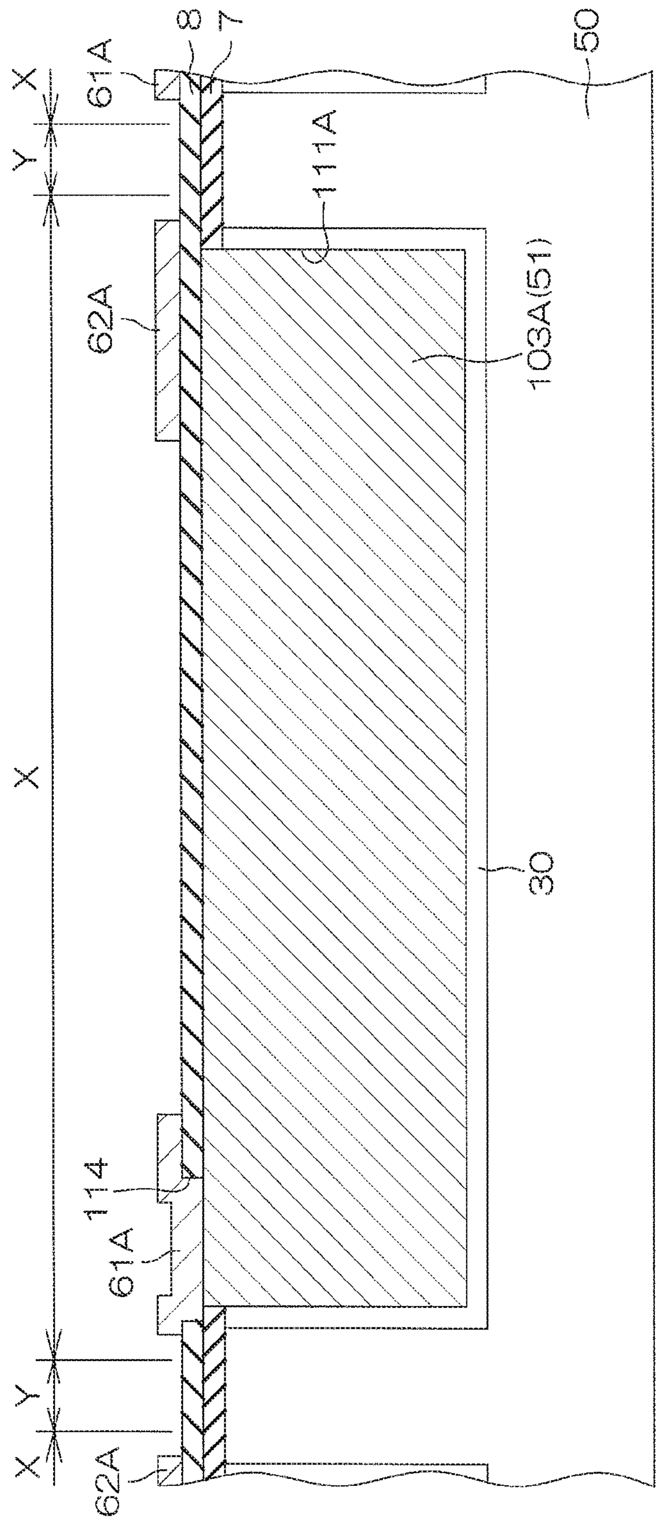

FIG. 189F is a cross-sectional view showing the step subsequent to FIG. 189E.

Figure 189G:
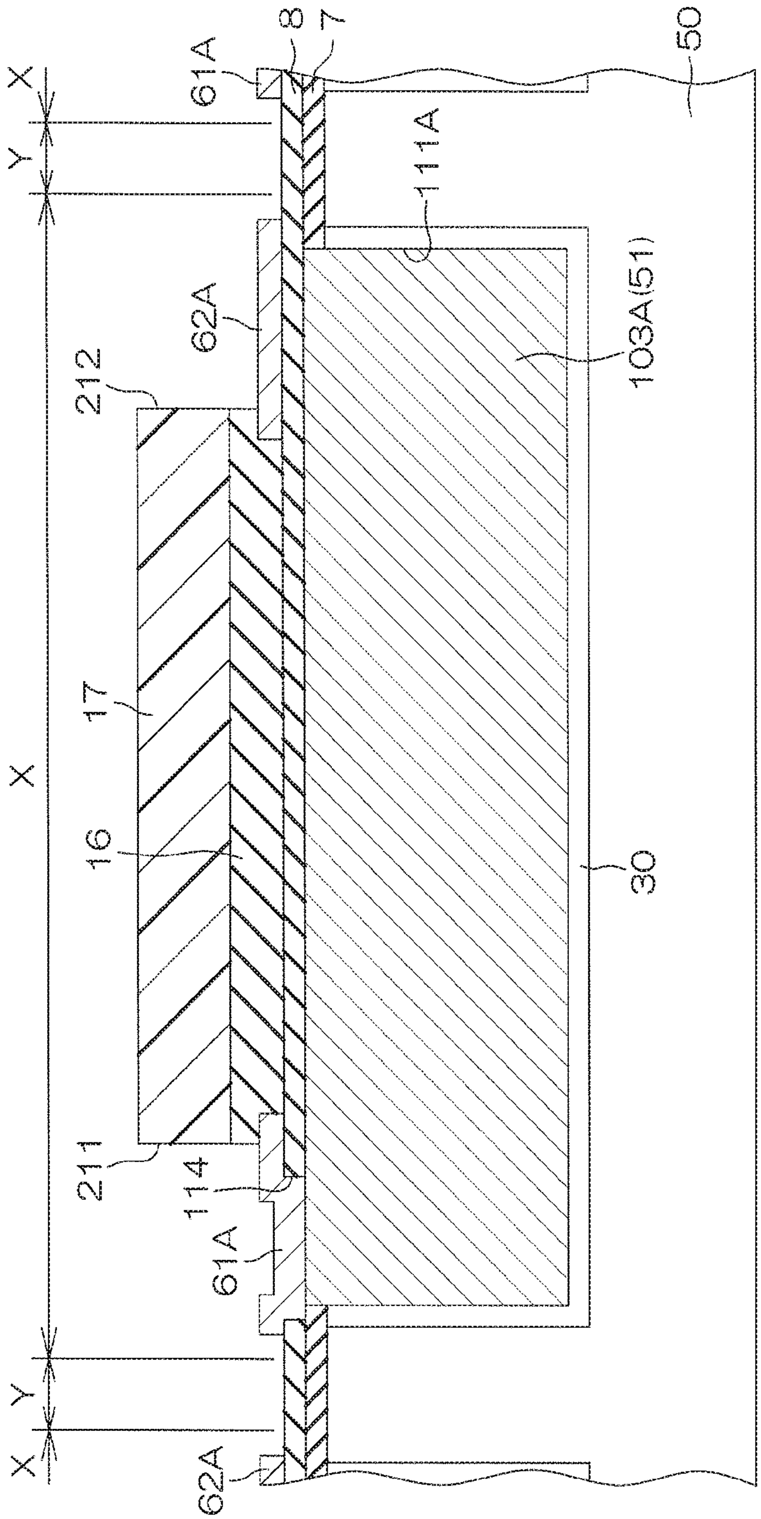

FIG. 189G is a cross-sectional view showing the step subsequent to FIG. 189F.

Figure 189H:
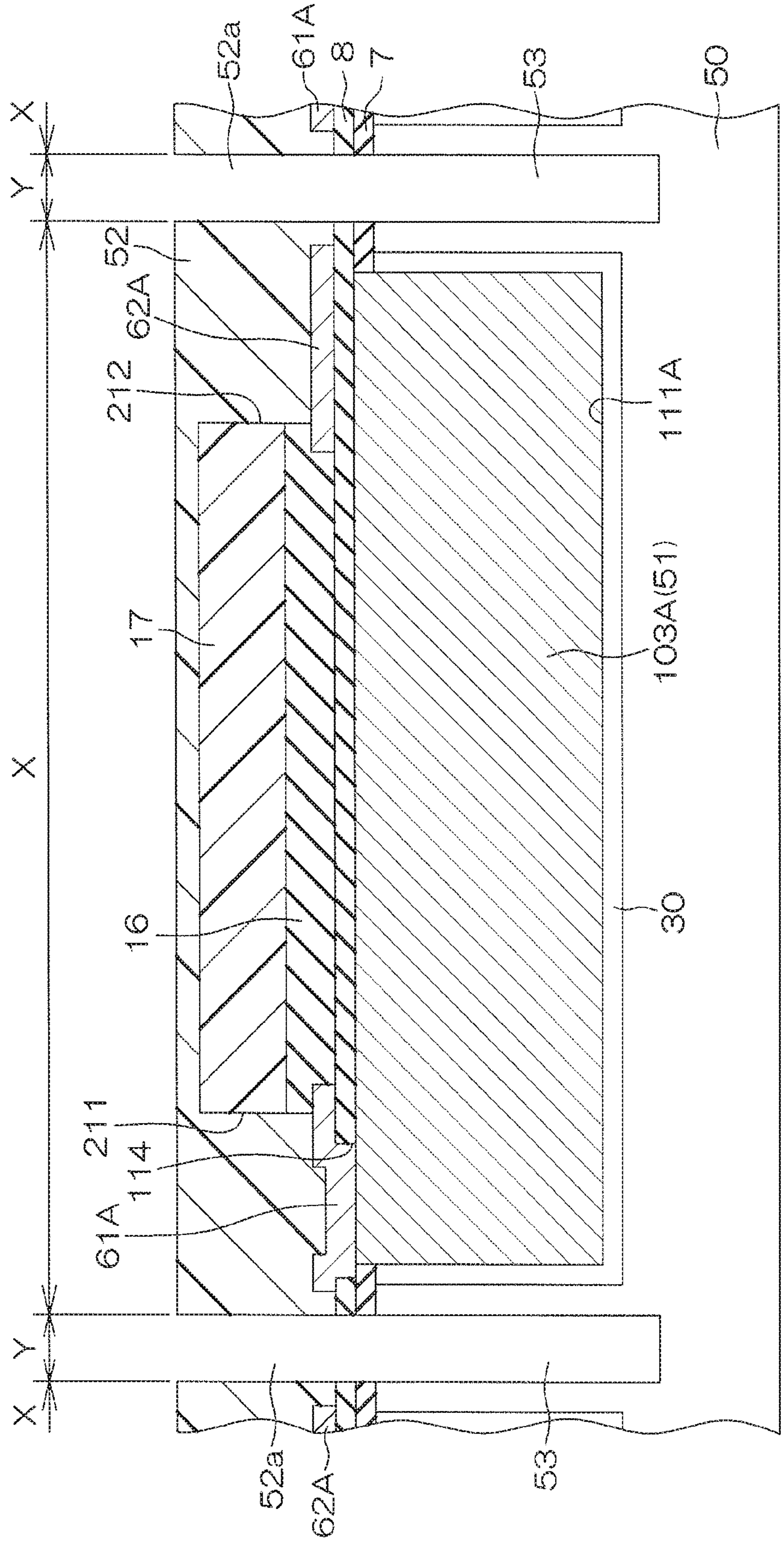

FIG. 189H is a cross-sectional view showing the step subsequent to FIG. 189G.

Figure 189I:
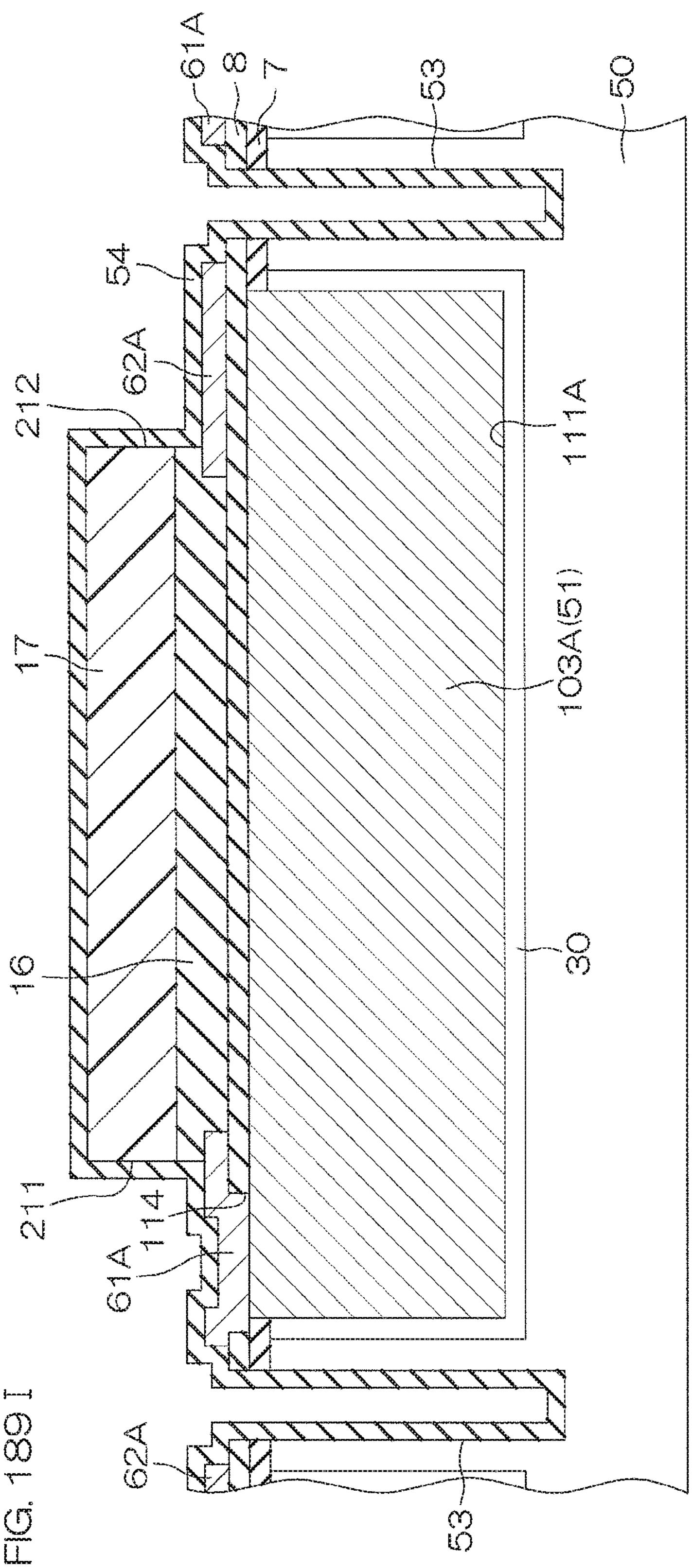

FIG. 189I is a cross-sectional view showing the step subsequent to FIG. 189H.

Figure 189J:
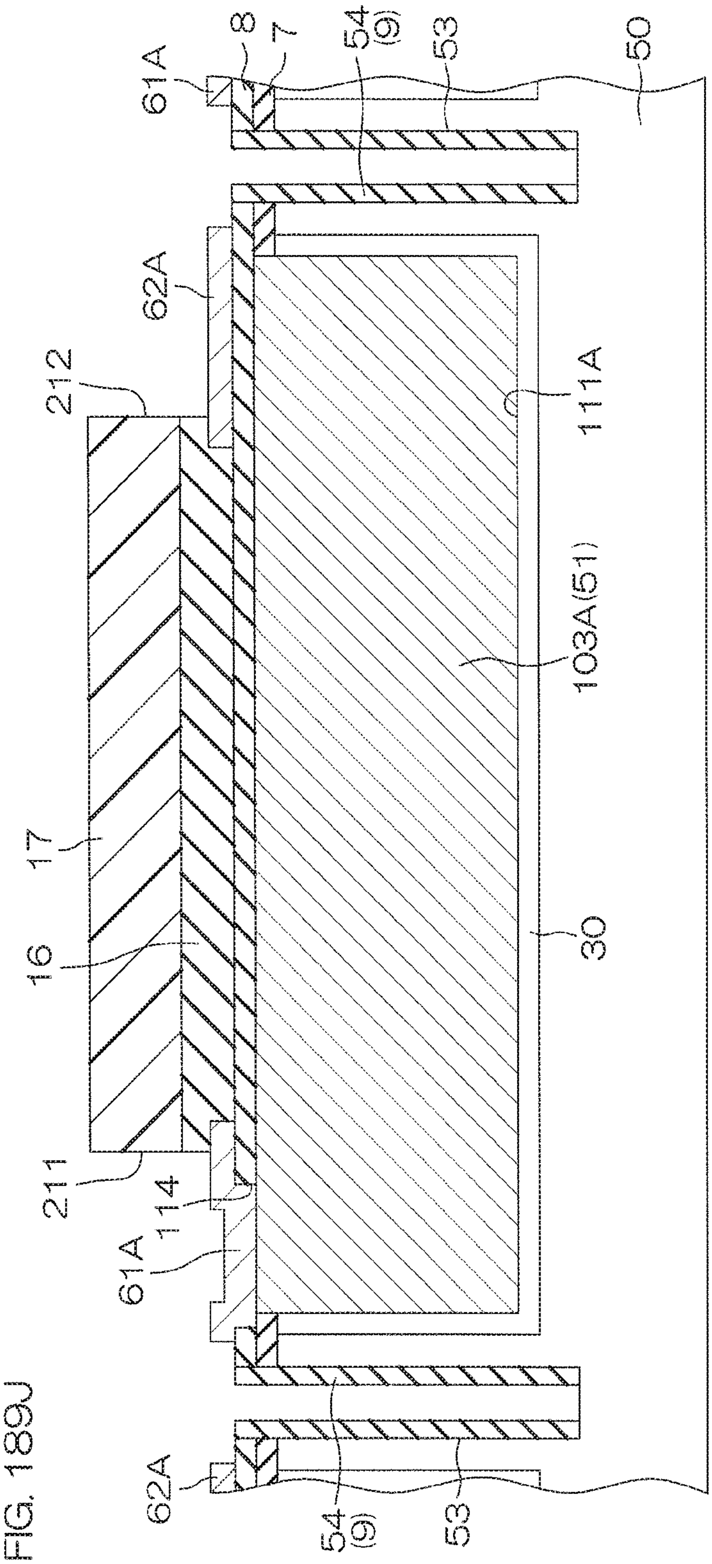

FIG. 189J is a cross-sectional view showing the step subsequent to FIG. 189I.

Figure 189K:
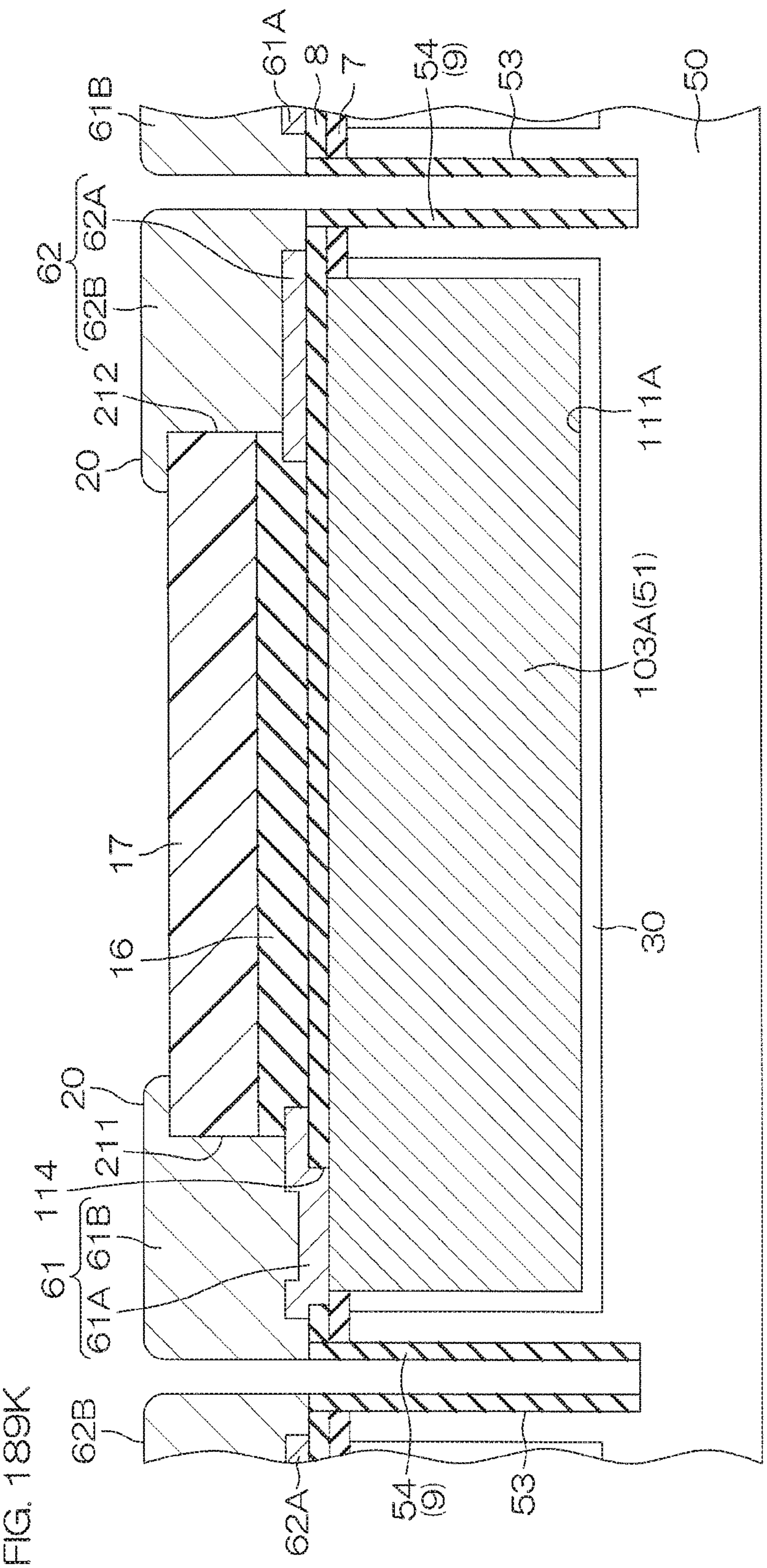

FIG. 189K is a cross-sectional view showing the step subsequent to FIG. 189J.

Figure 189L:
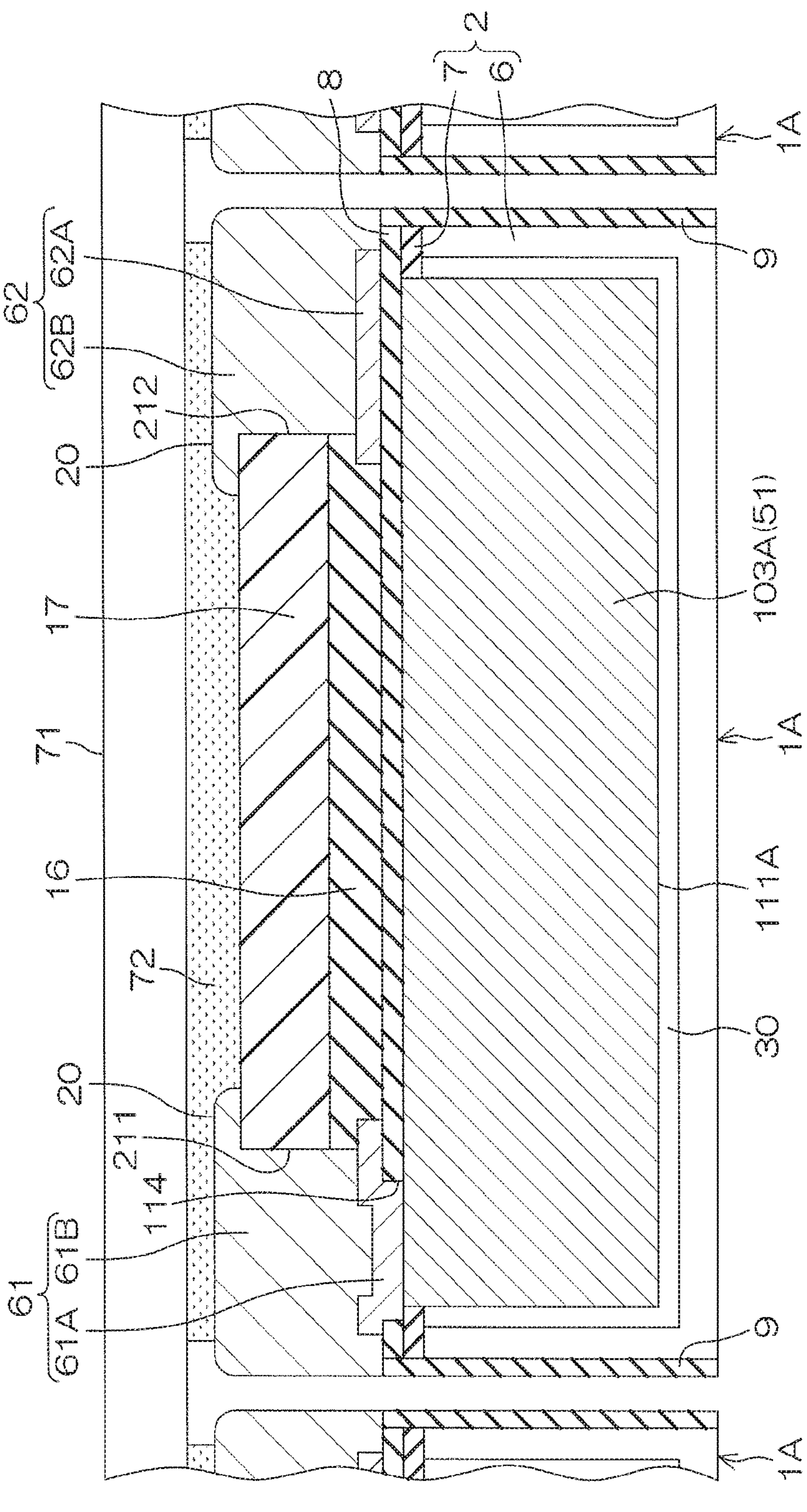

FIG. 189L is a cross-sectional view showing the step subsequent to FIG. 189K.

Figure 190A:
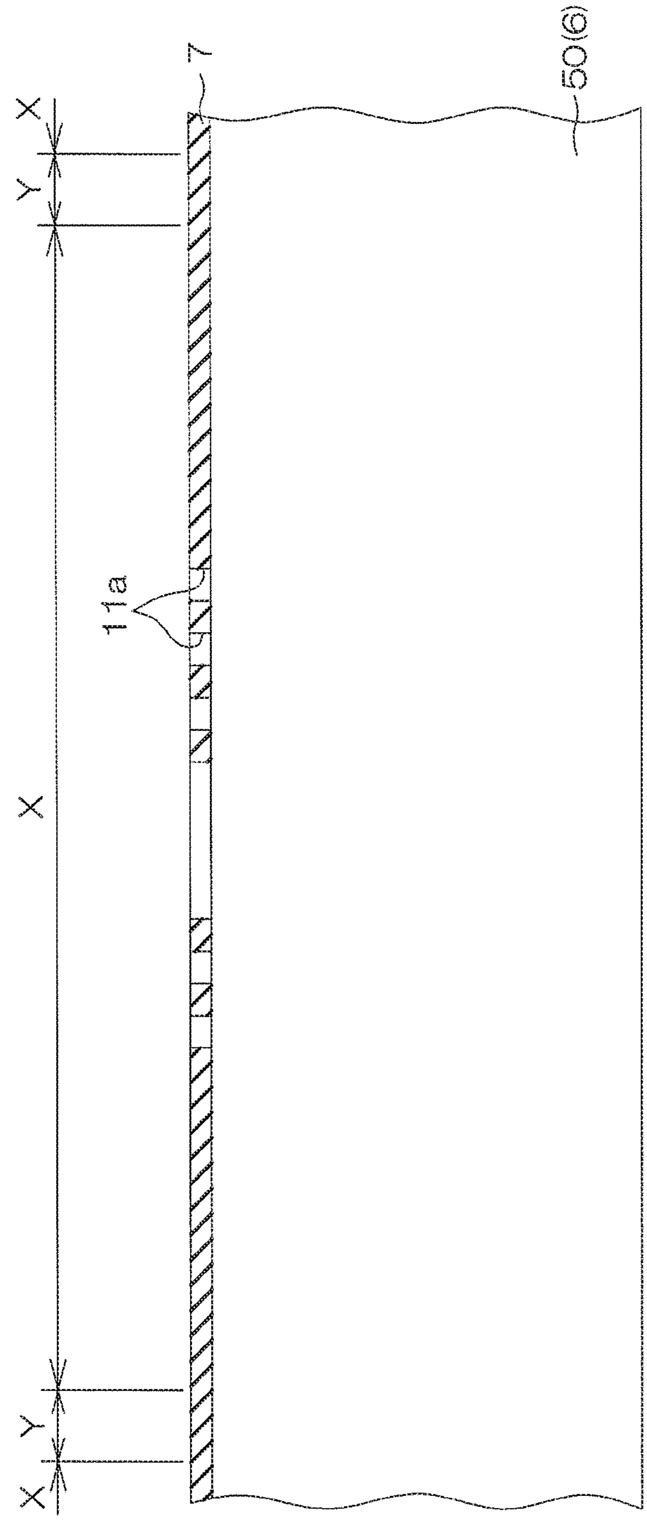

FIG. 190A is a cross-sectional view for illustrating an example of the manufacturing step of the LC composite element chip, and is a cross-sectional view corresponding to FIG. 181A.

Figure 190B:
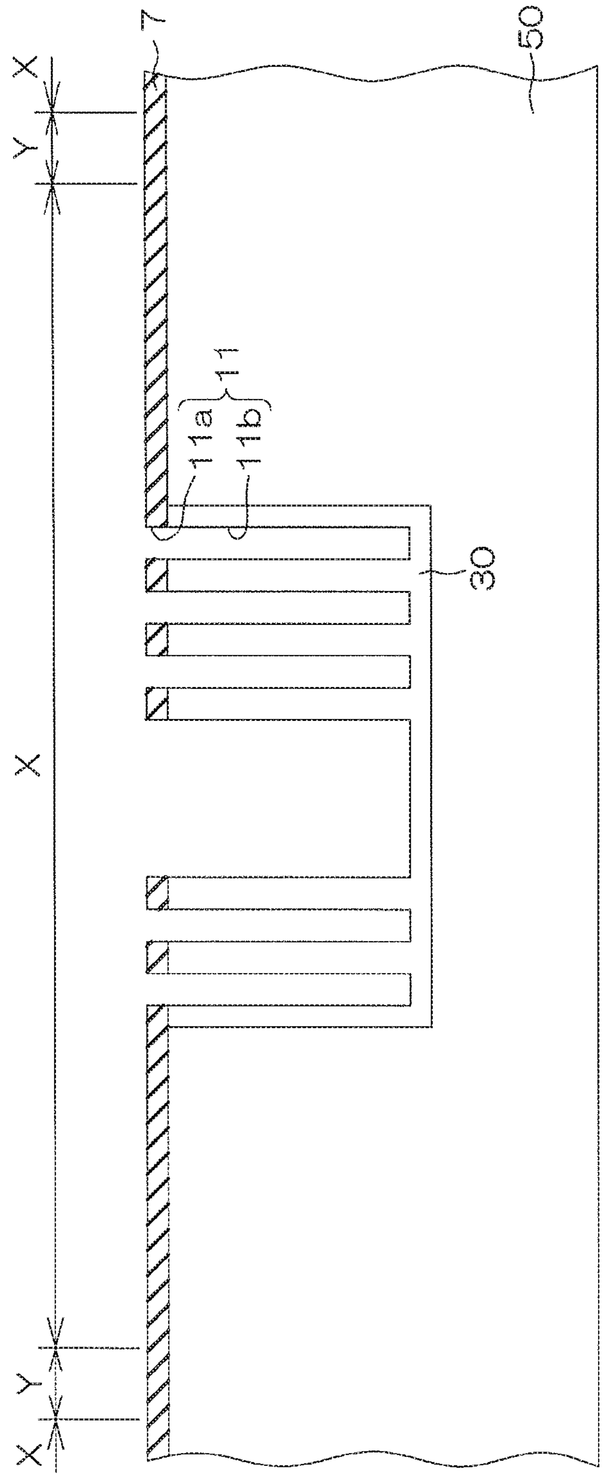

FIG. 190B is a cross-sectional view showing the step subsequent to FIG. 190A.

Figure 190C:
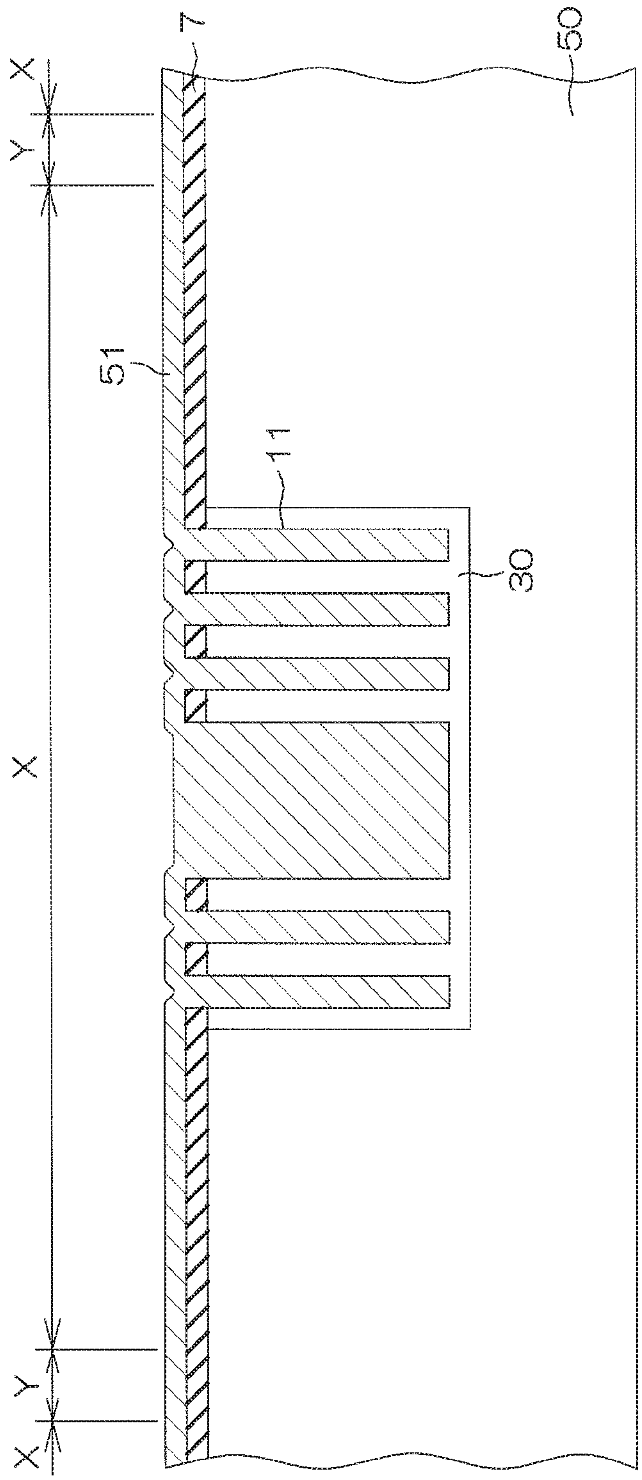

FIG. 190C is a cross-sectional view showing the step subsequent to FIG. 190B.

Figure 190D:
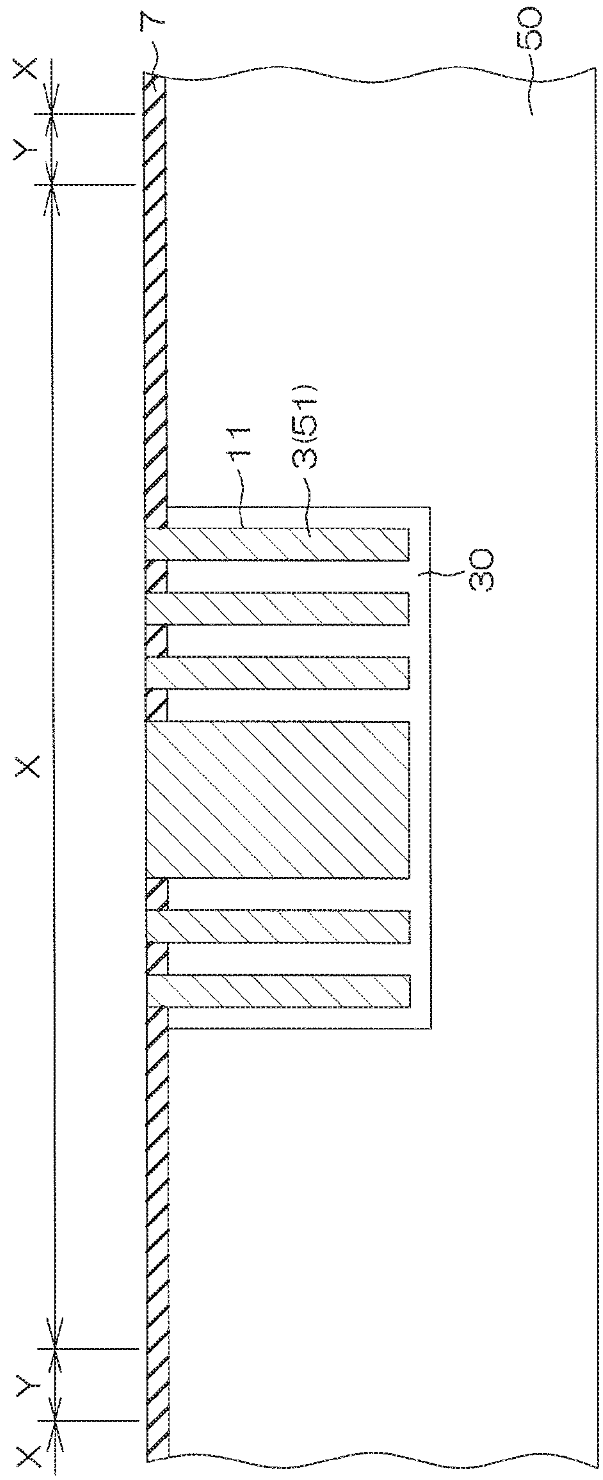

FIG. 190D is a cross-sectional view showing the step subsequent to FIG. 190C.

Figure 190E:
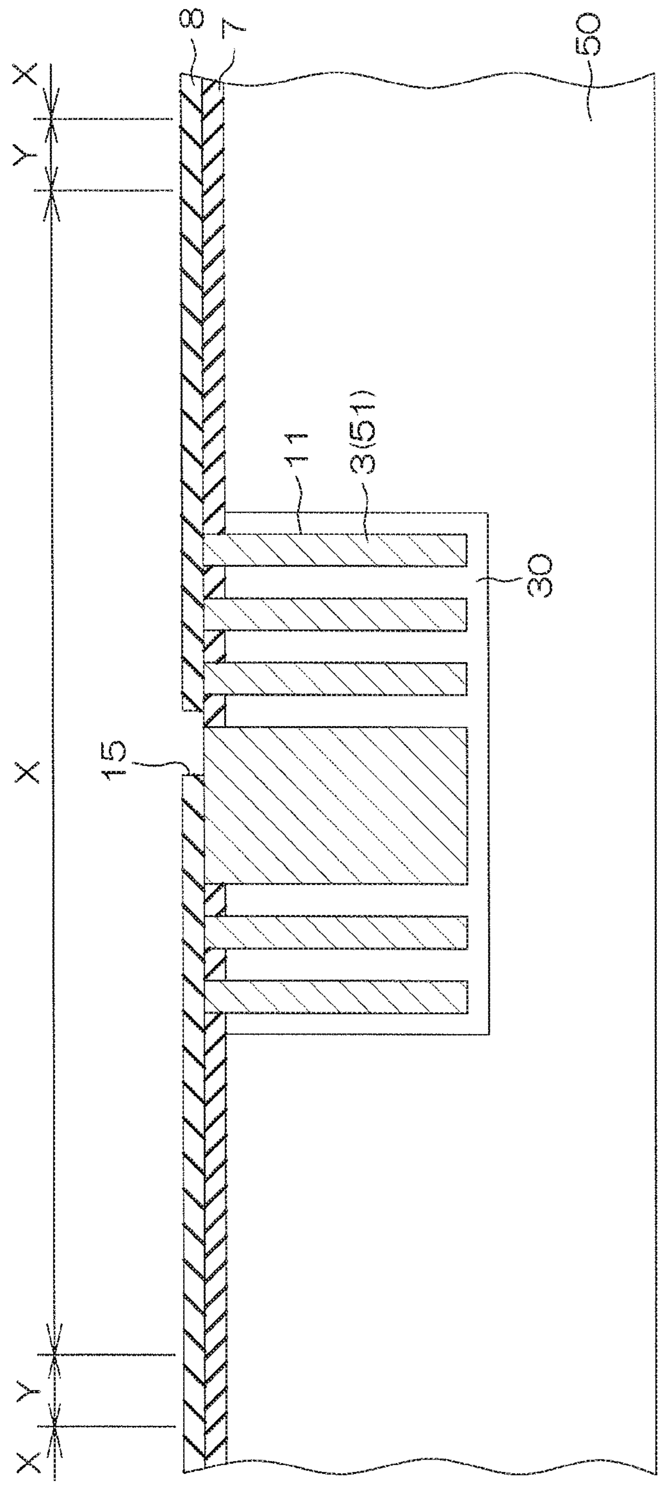

FIG. 190E is a cross-sectional view showing the step subsequent to FIG. 190D.

Figure 190F:
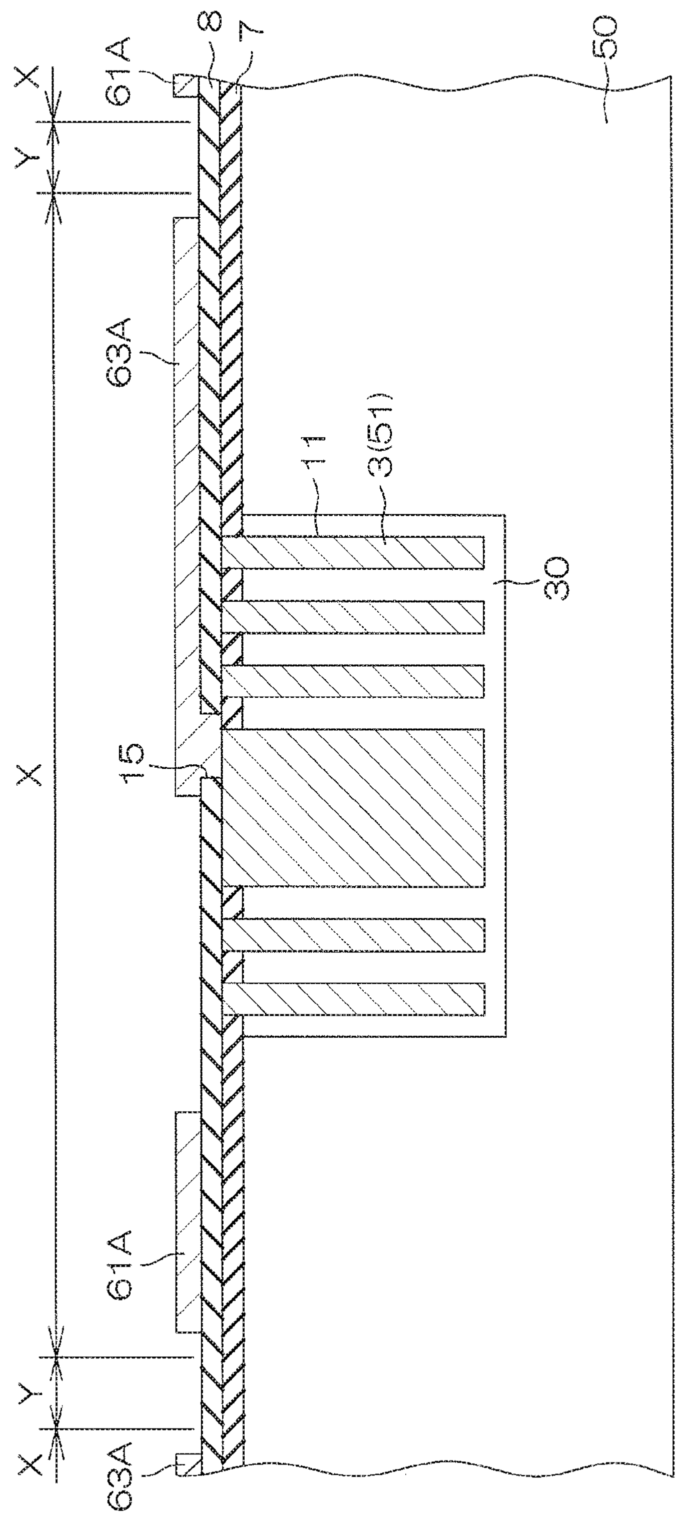

FIG. 190F is a cross-sectional view showing the step subsequent to FIG. 190E.

Figure 190G:
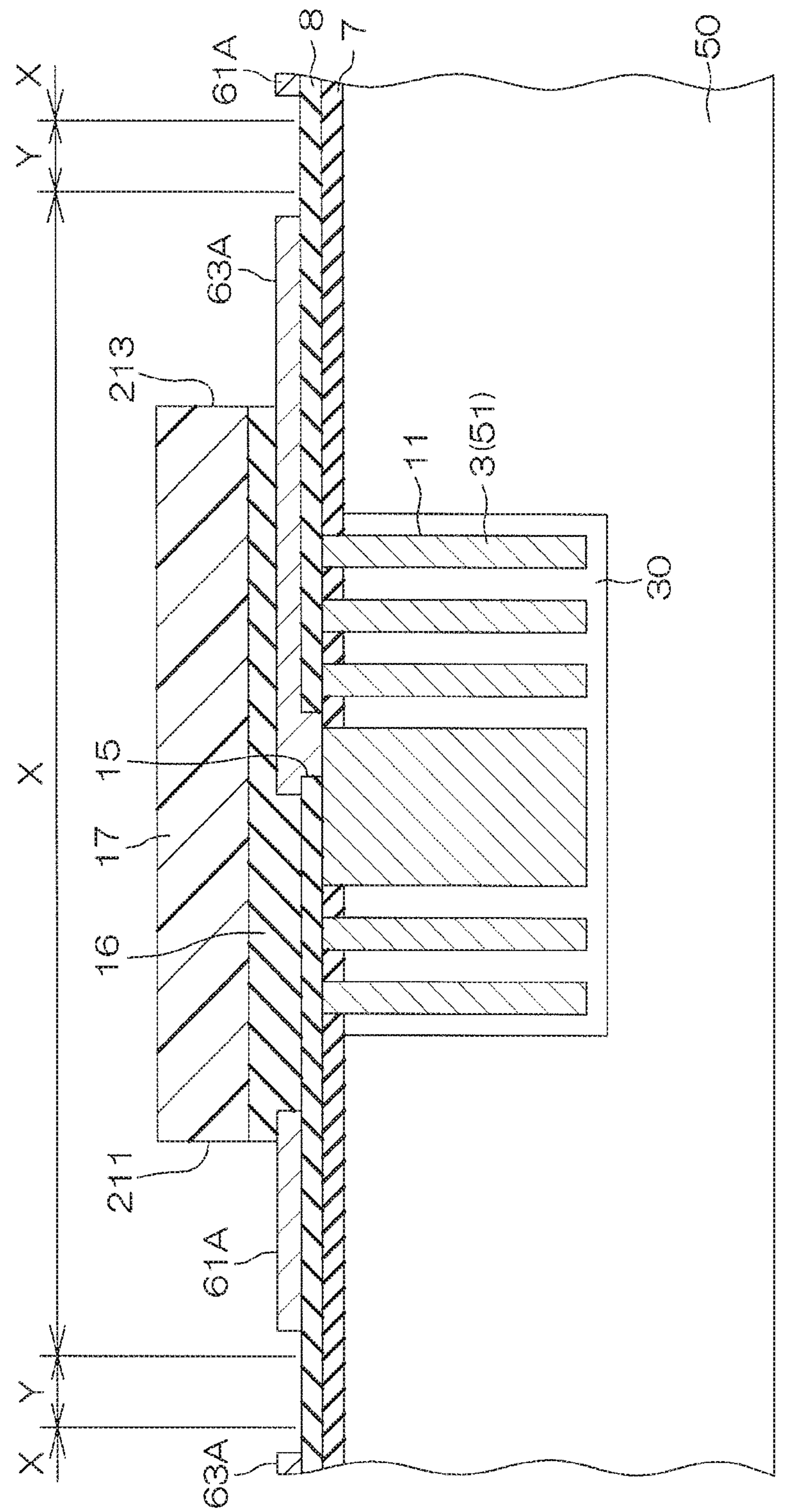

FIG. 190G is a cross-sectional view showing the step subsequent to FIG. 190F.

Figure 190H:
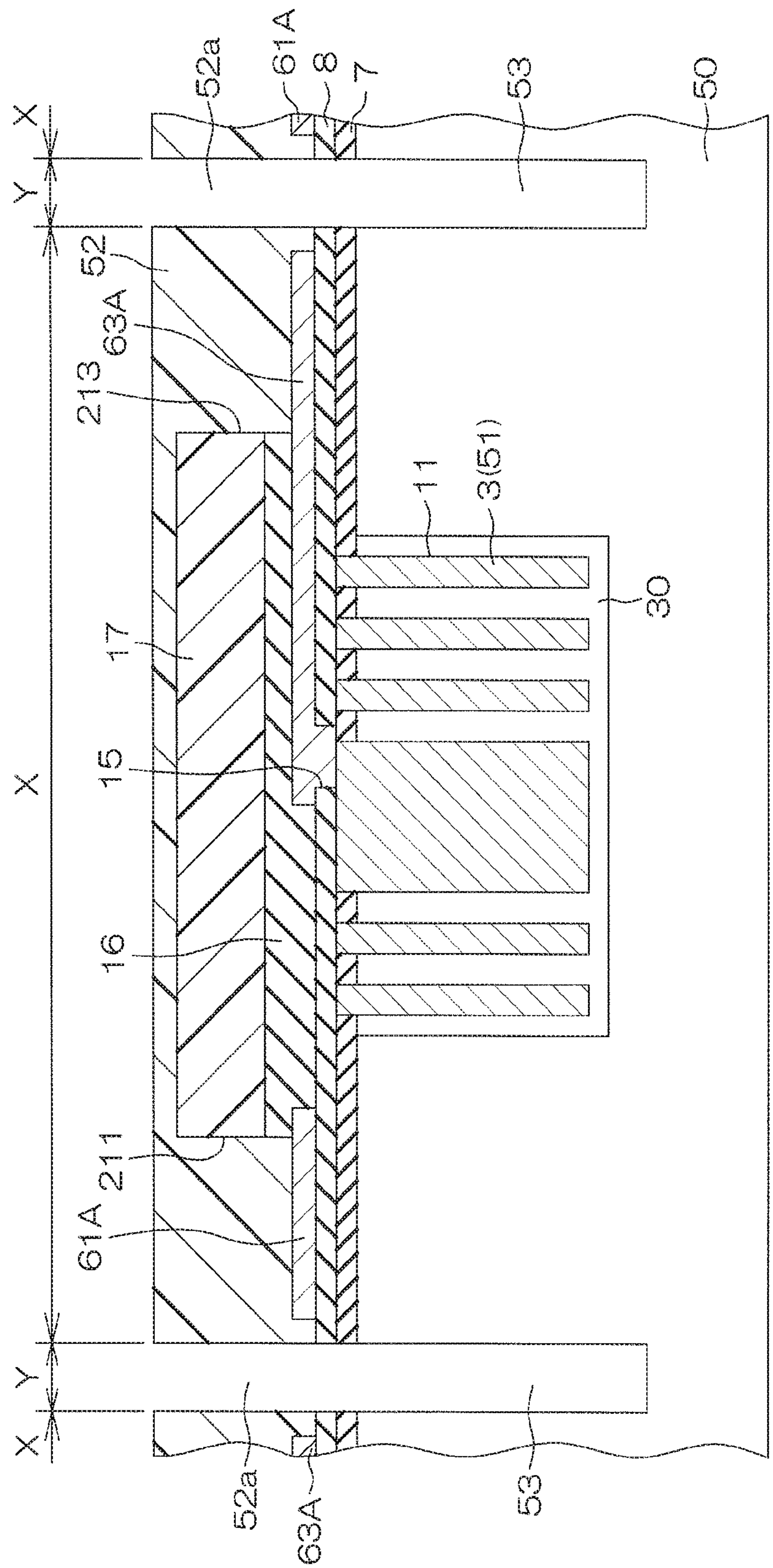
Figure 190:
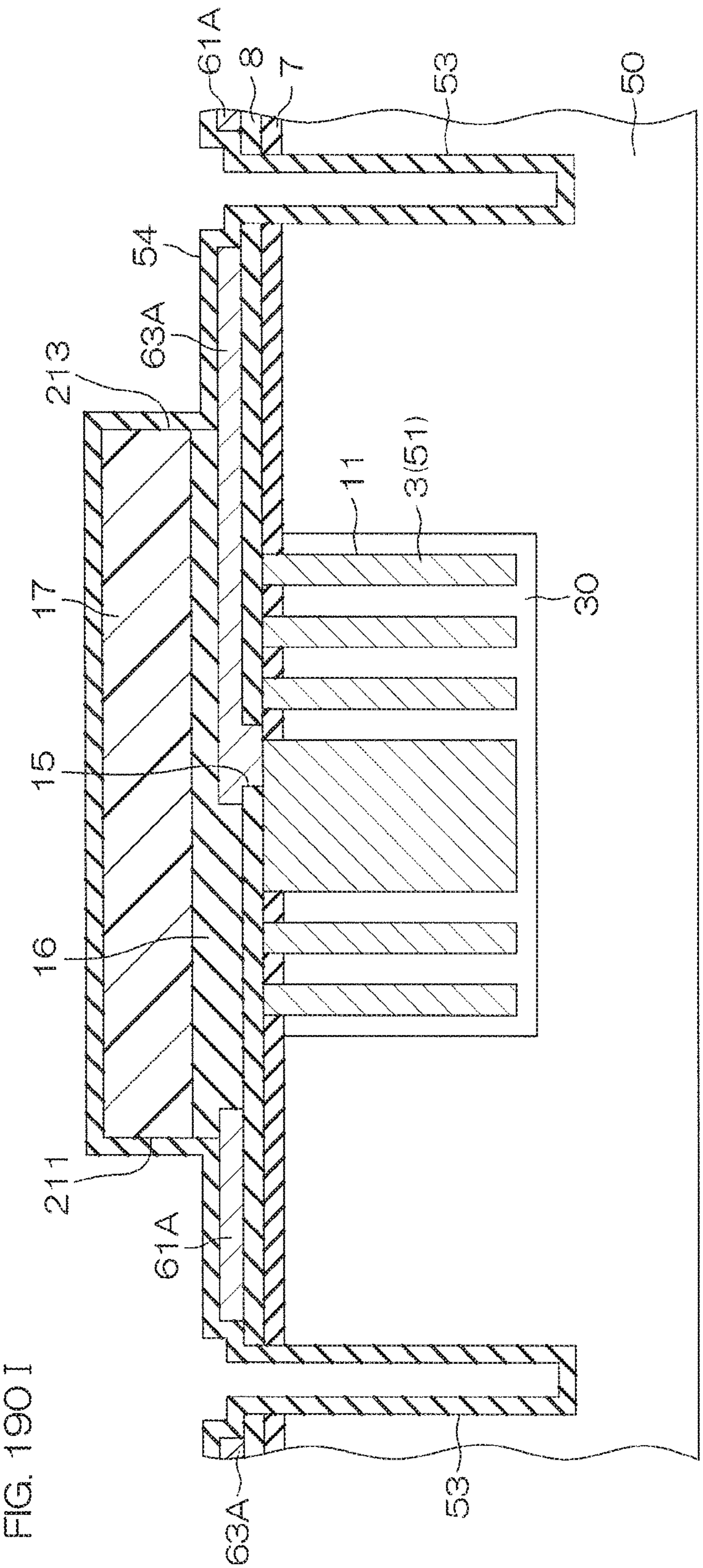

FIG. 190H is a cross-sectional view showing the step subsequent to FIG. 190G.

FIG. 190I is a cross-sectional view showing the step subsequent to FIG. 190H.

Figure 190J:
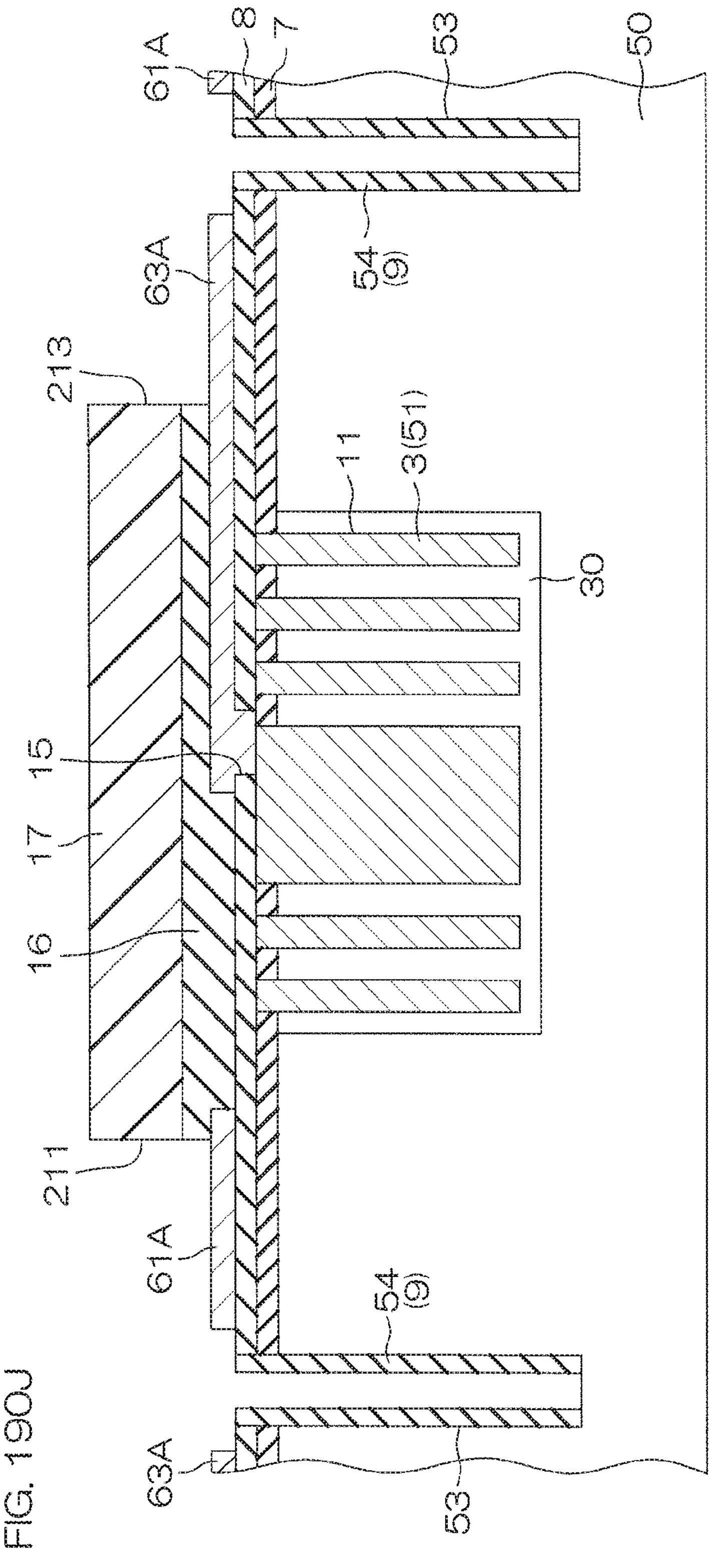

FIG. 190J is a cross-sectional view showing the step subsequent to FIG. 190I.

Figure 190K:
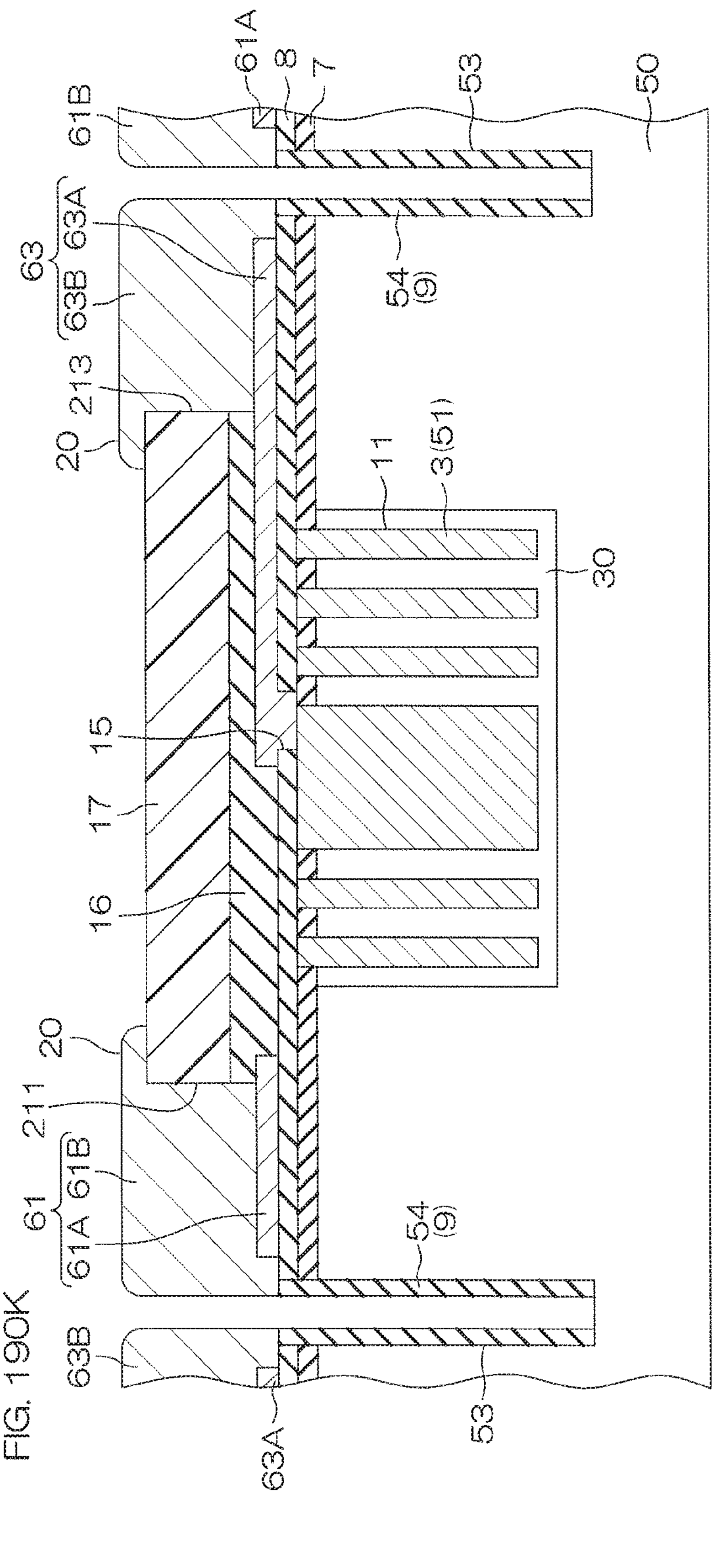

FIG. 190K is a cross-sectional view showing the step subsequent to FIG. 190J.

Figure 190L:
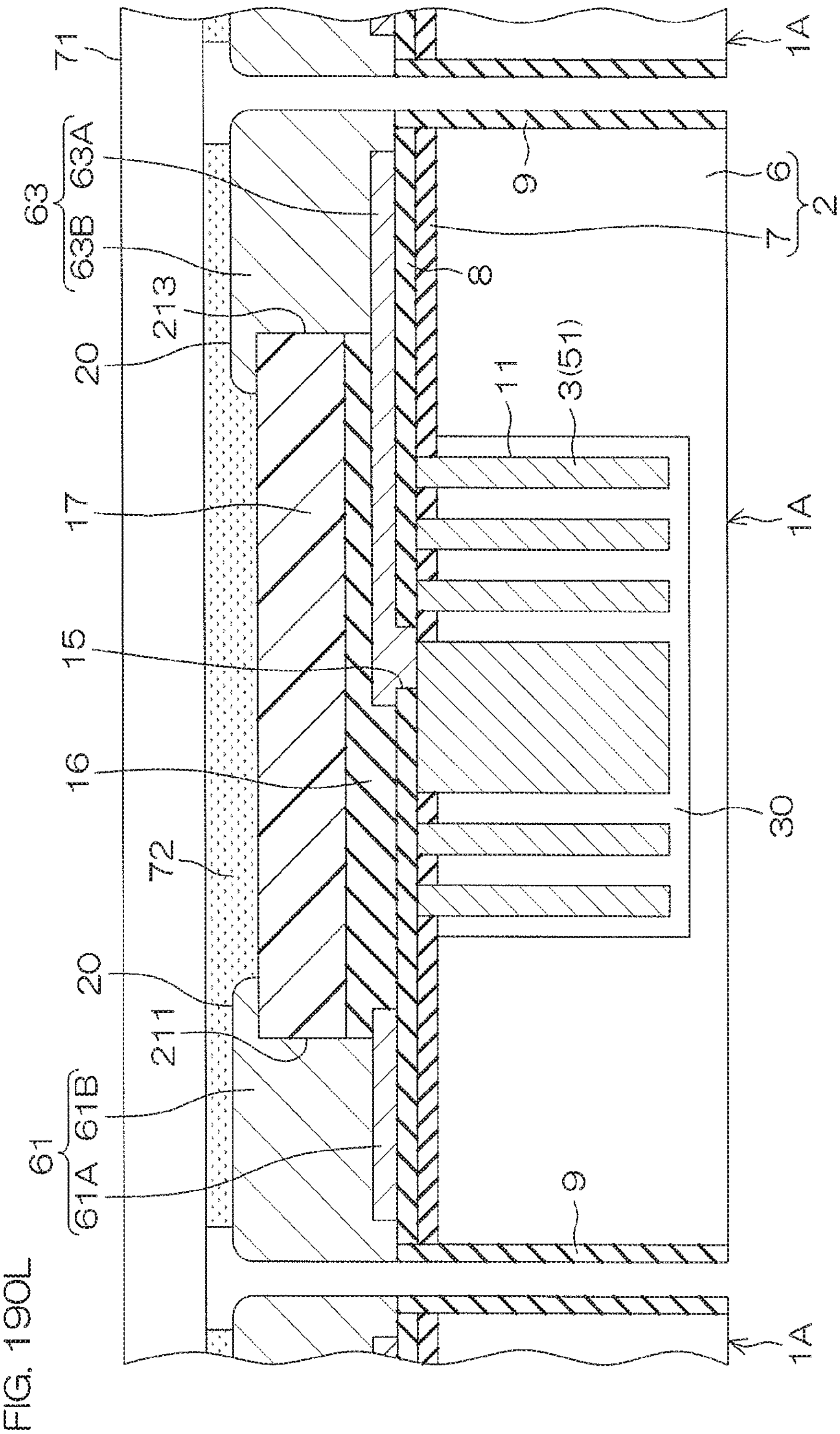

FIG. 190L is a cross-sectional view showing the step subsequent to FIG. 190K.

Figure 191A:
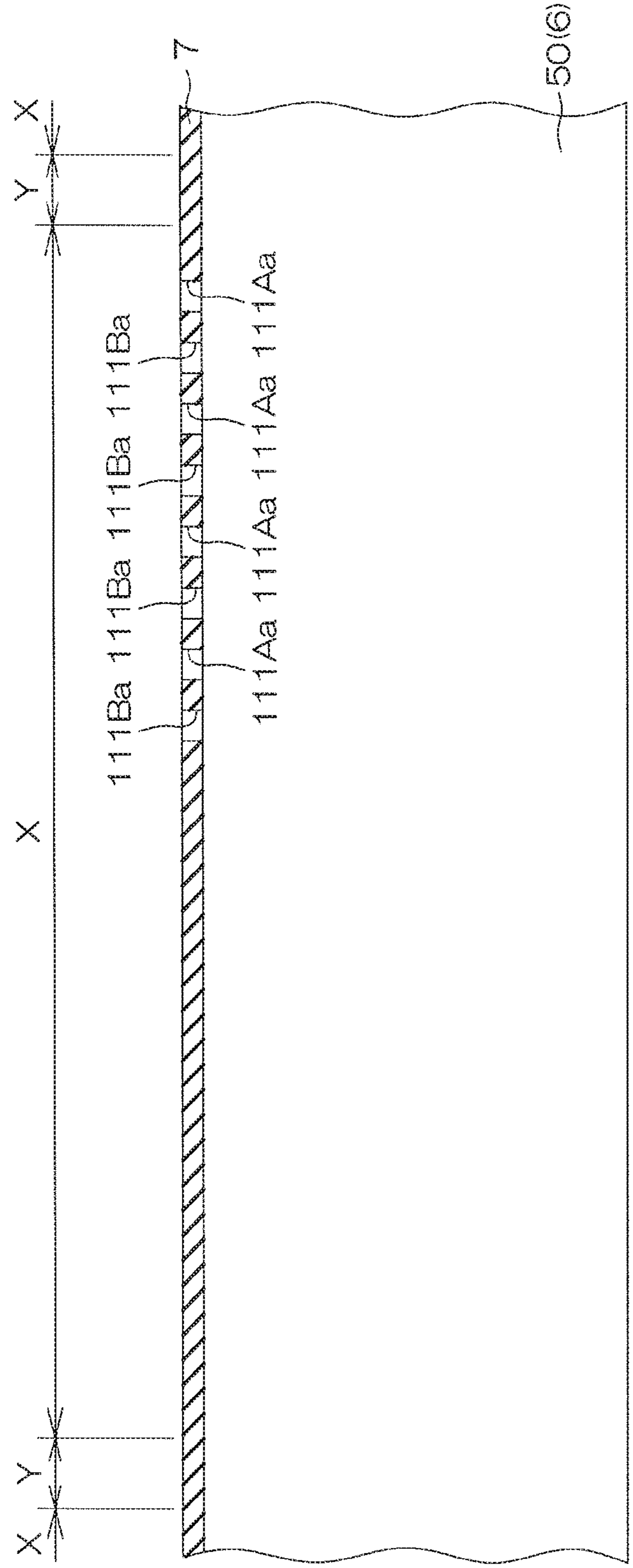

FIG. 191A is a cross-sectional view for illustrating an example of the manufacturing step of the LC composite element chip, and is a cross-sectional view corresponding to FIG. 182A.

Figure 191B:
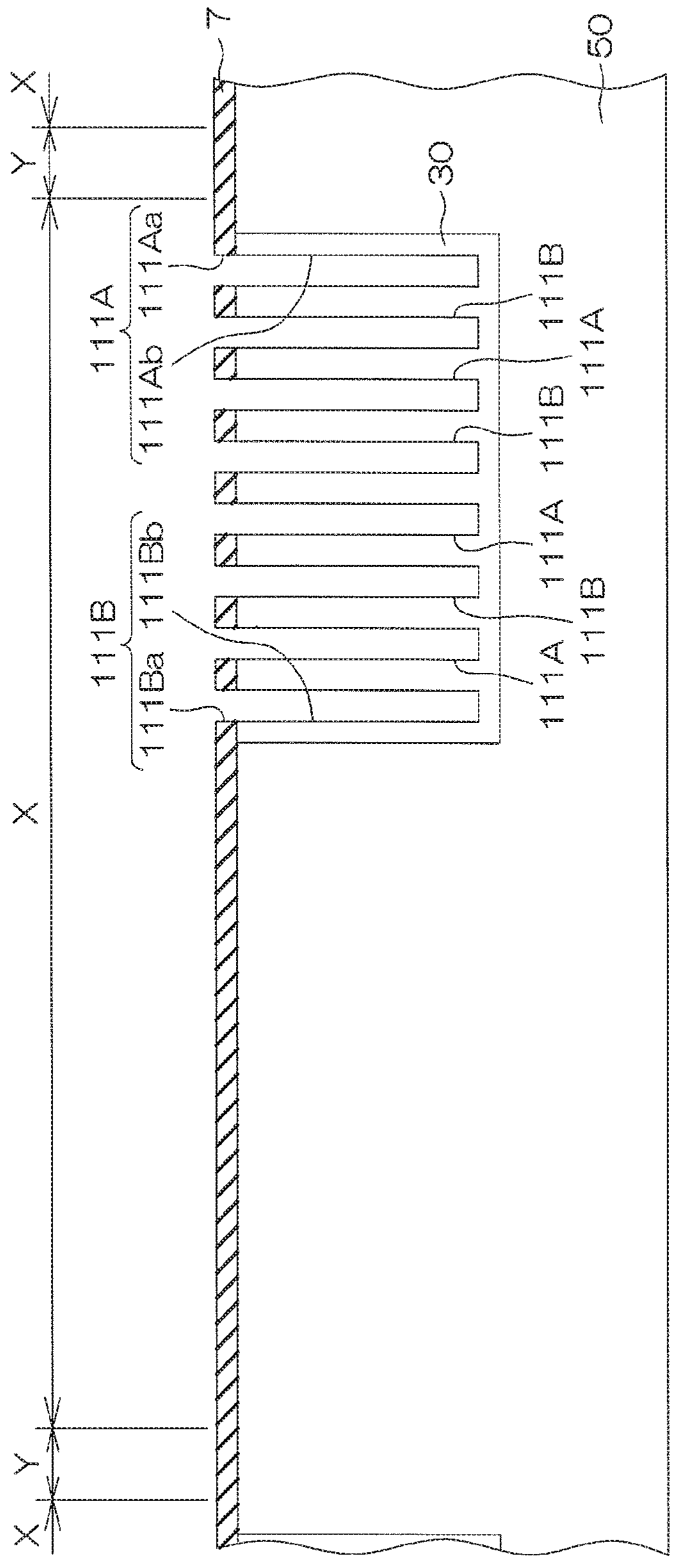

FIG. 191B is a cross-sectional view showing the step subsequent to FIG. 191A.

Figure 191C:
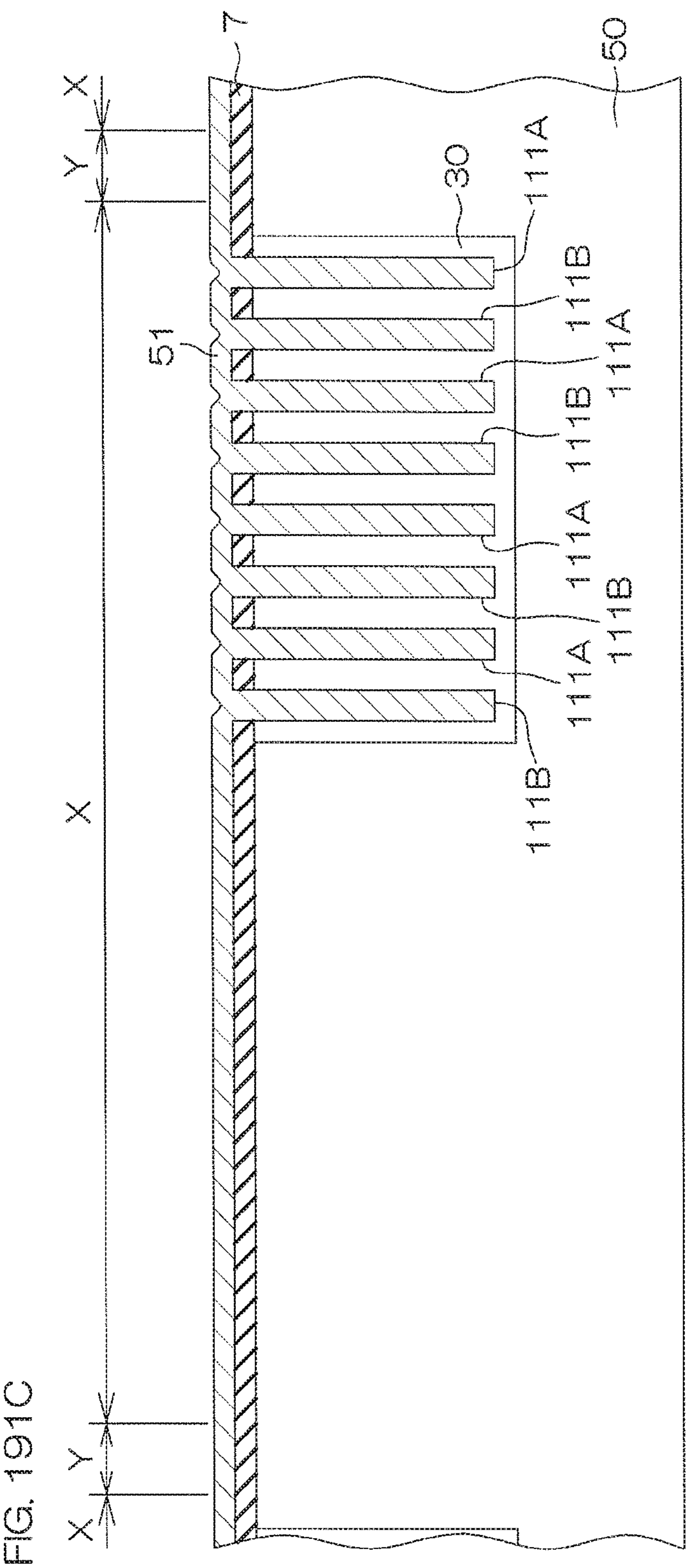

FIG. 191C is a cross-sectional view showing the step subsequent to FIG. 191B.

Figure 191D:
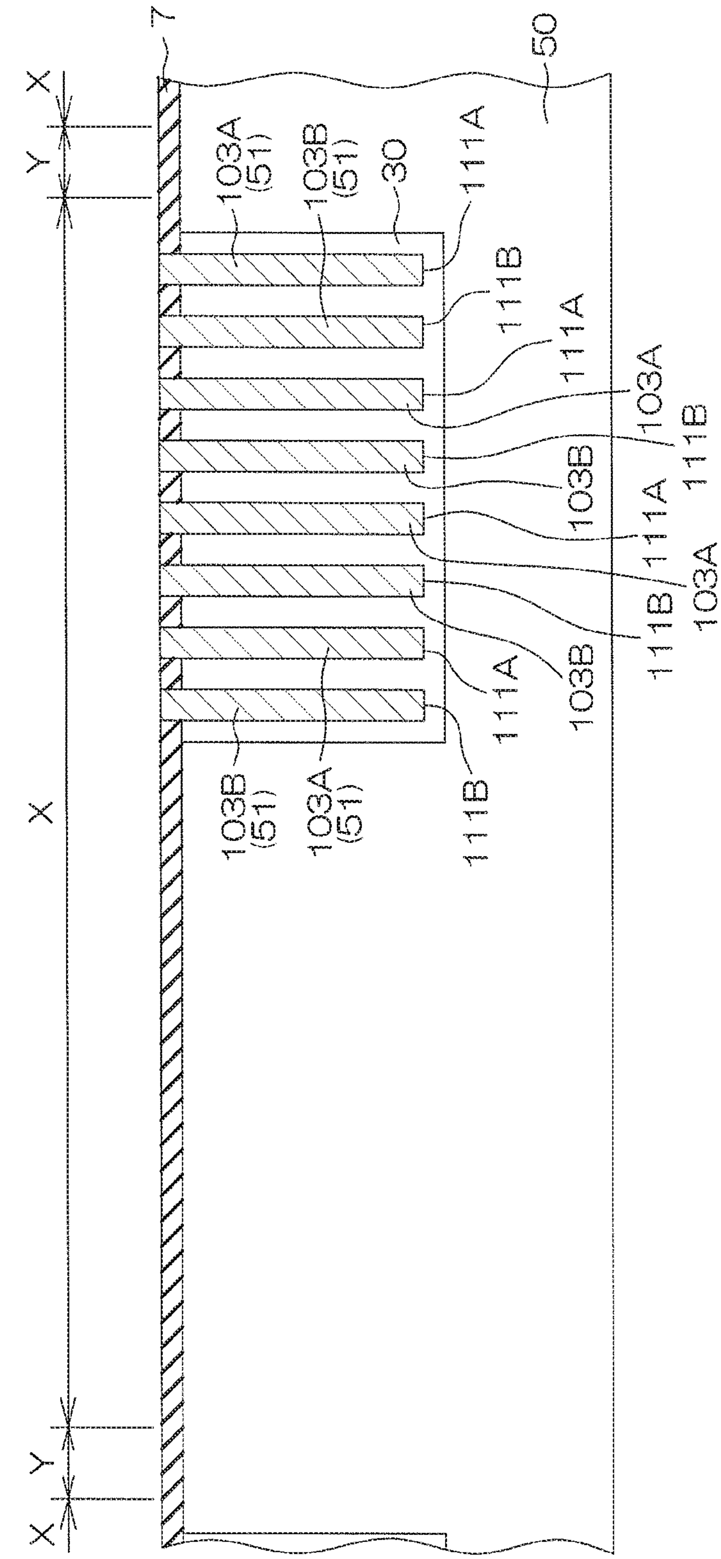

FIG. 191D is a cross-sectional view showing the step subsequent to FIG. 191C.

Figure 191E:
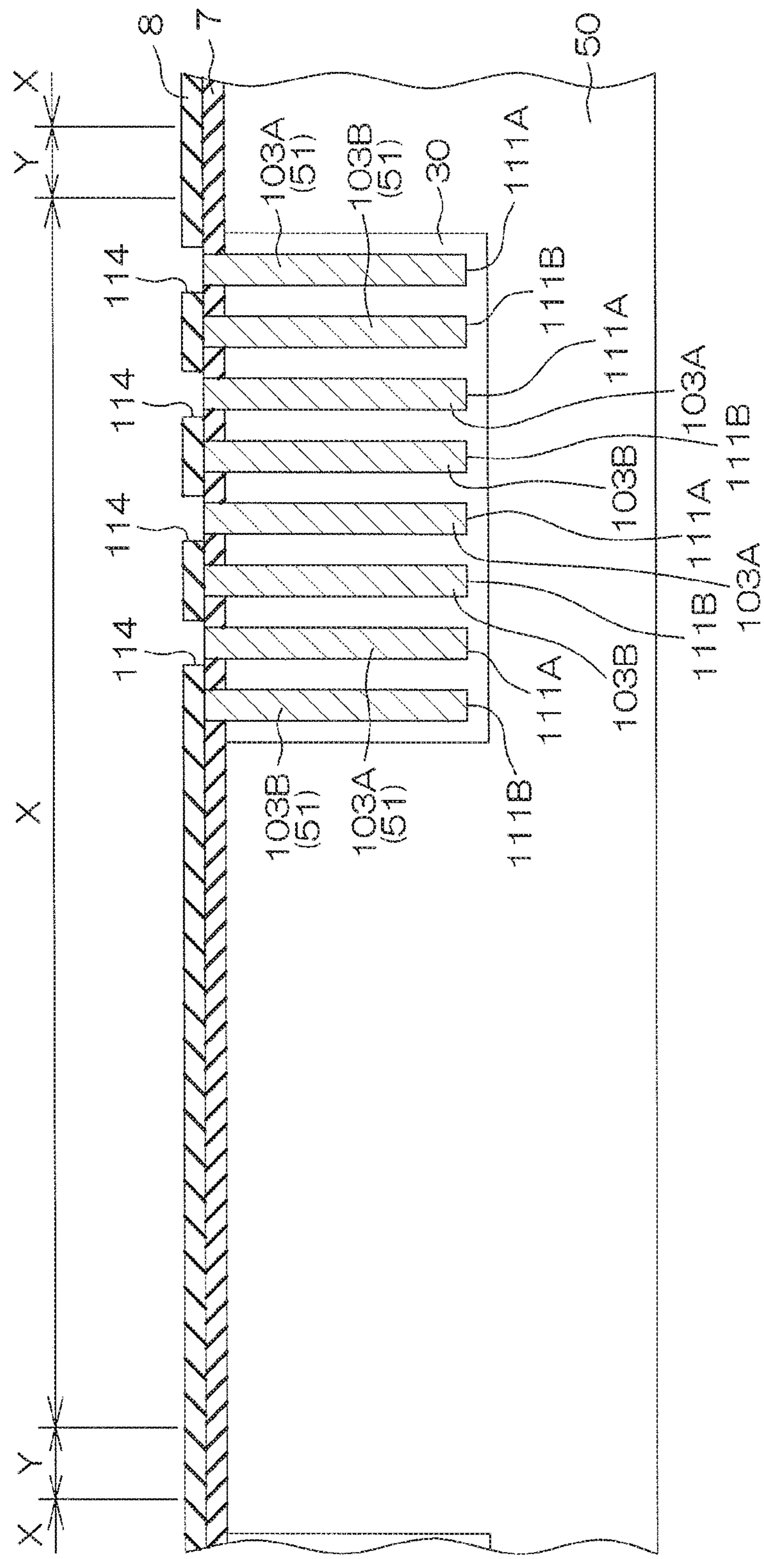

FIG. 191E is a cross-sectional view showing the step subsequent to FIG. 191D.

Figure 191F:
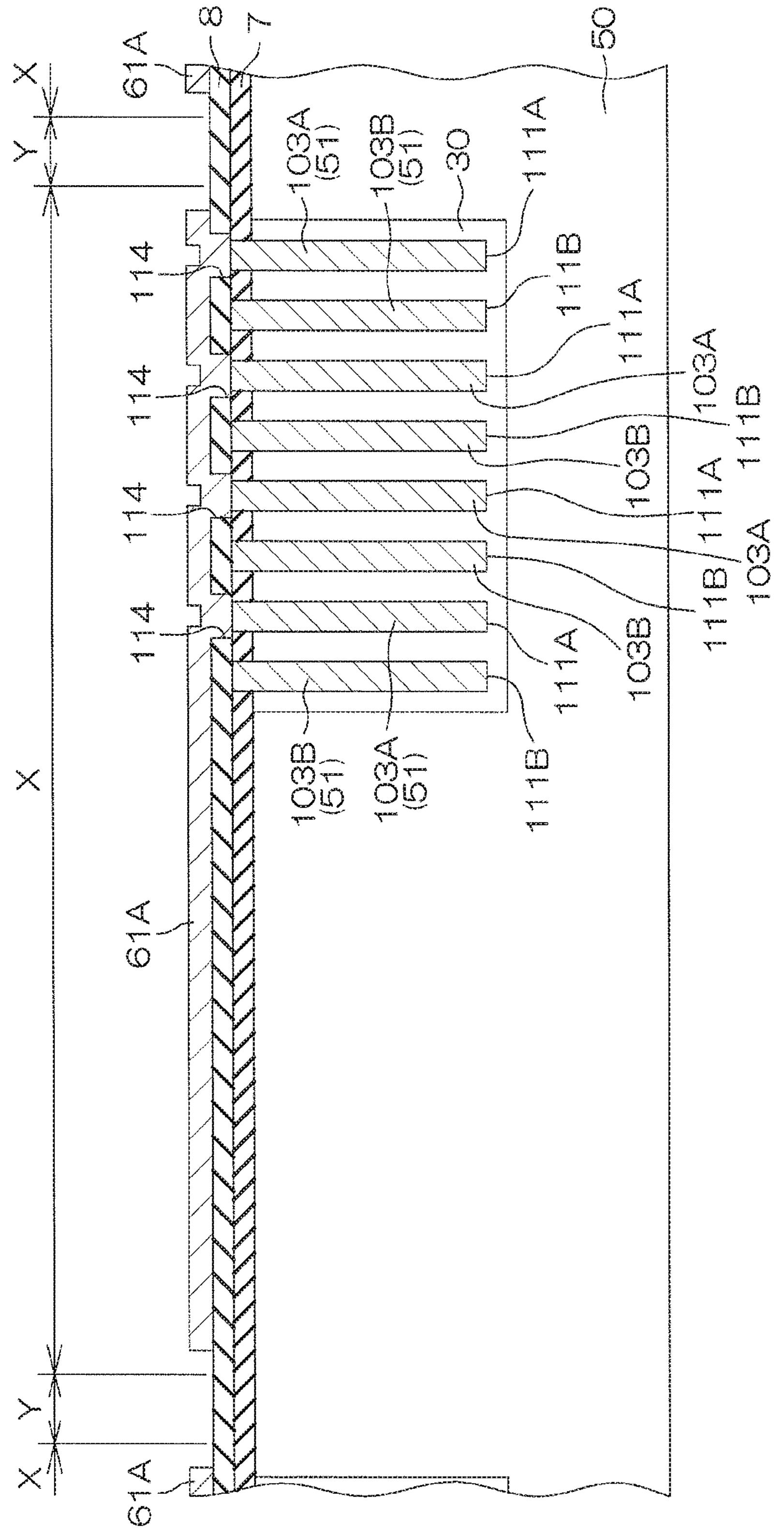

FIG. 191F is a cross-sectional view showing the step subsequent to FIG. 191E.

Figure 191G:
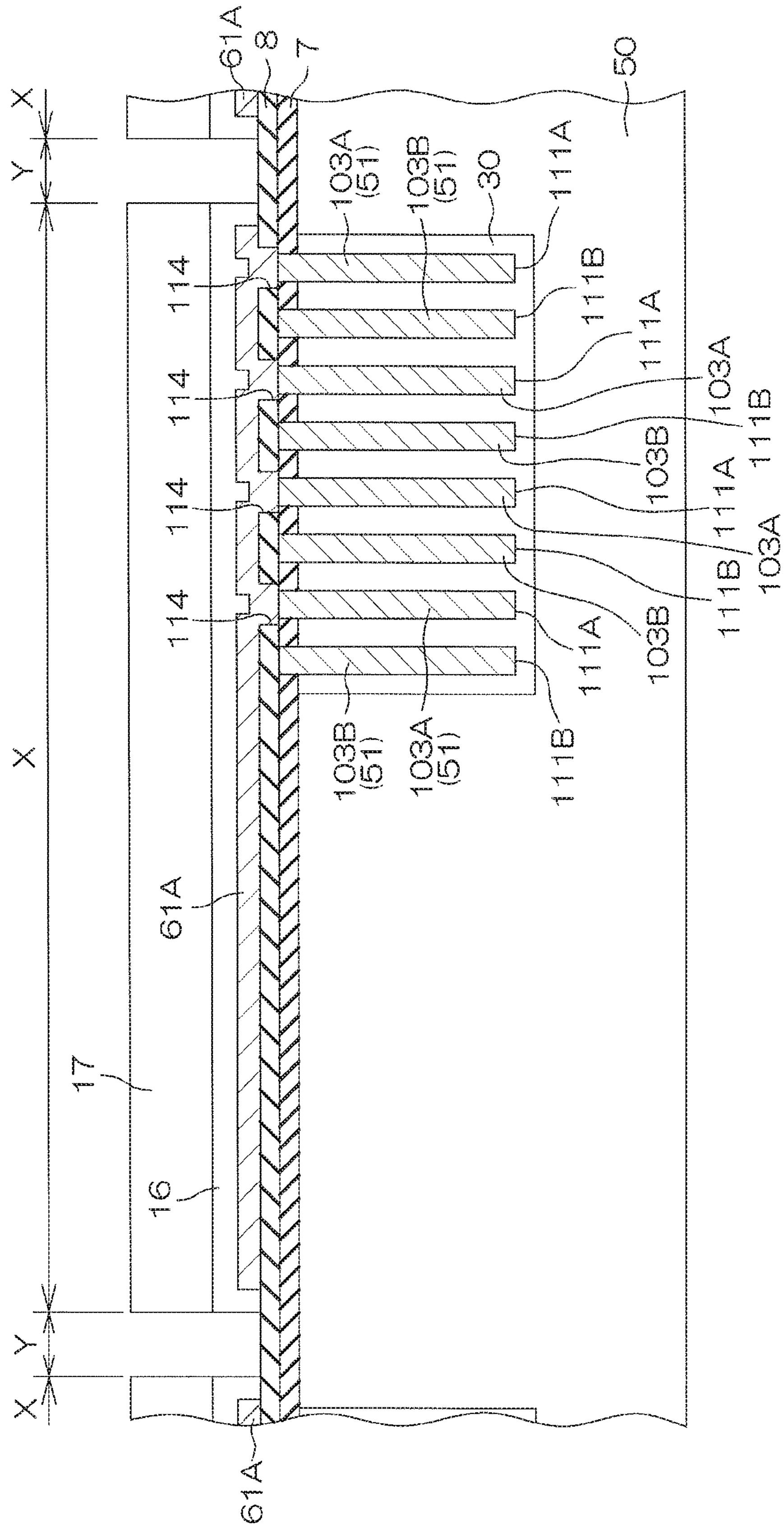

FIG. 191G is a cross-sectional view showing the step subsequent to FIG. 191F.

Figure 191H:
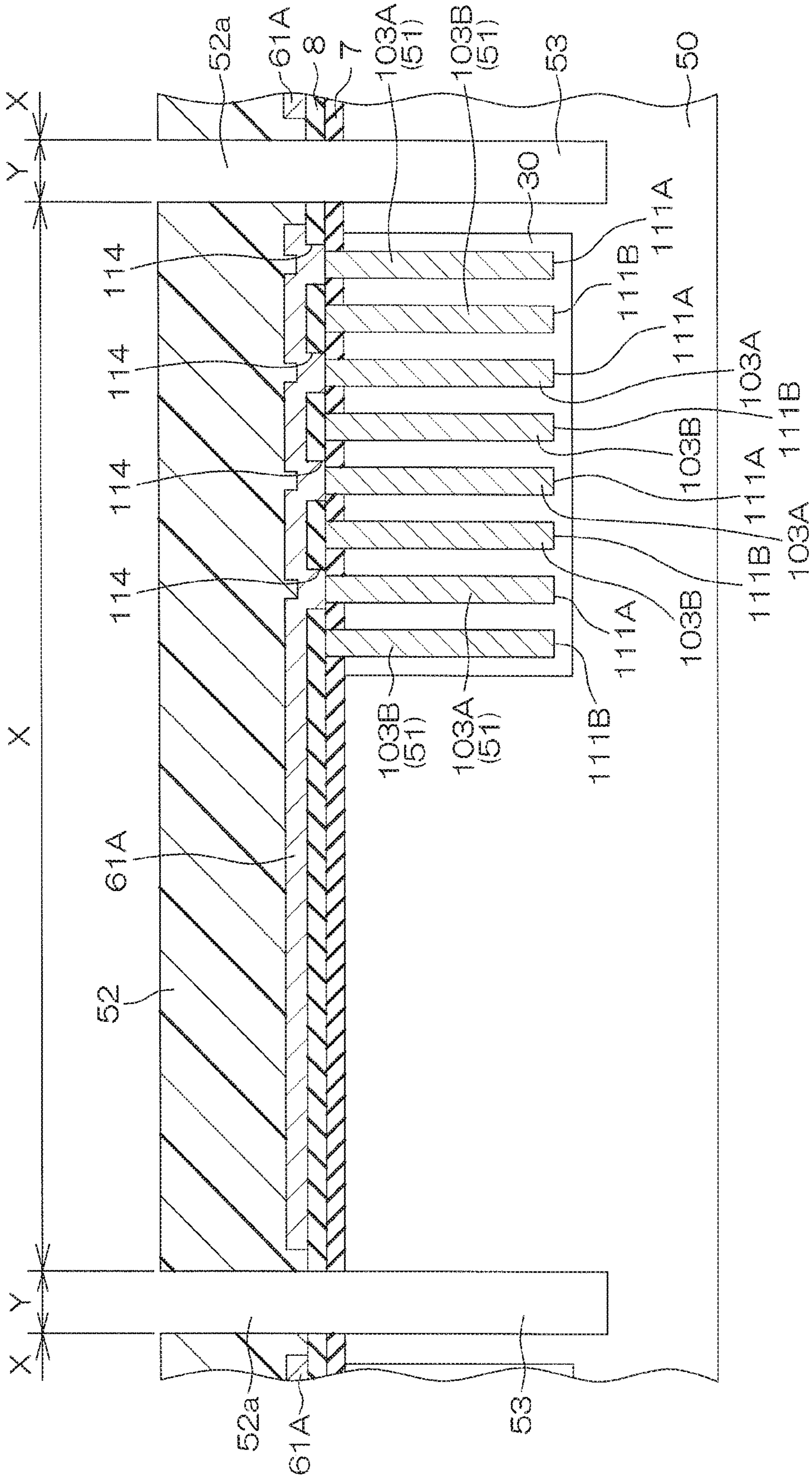
Figure 191:
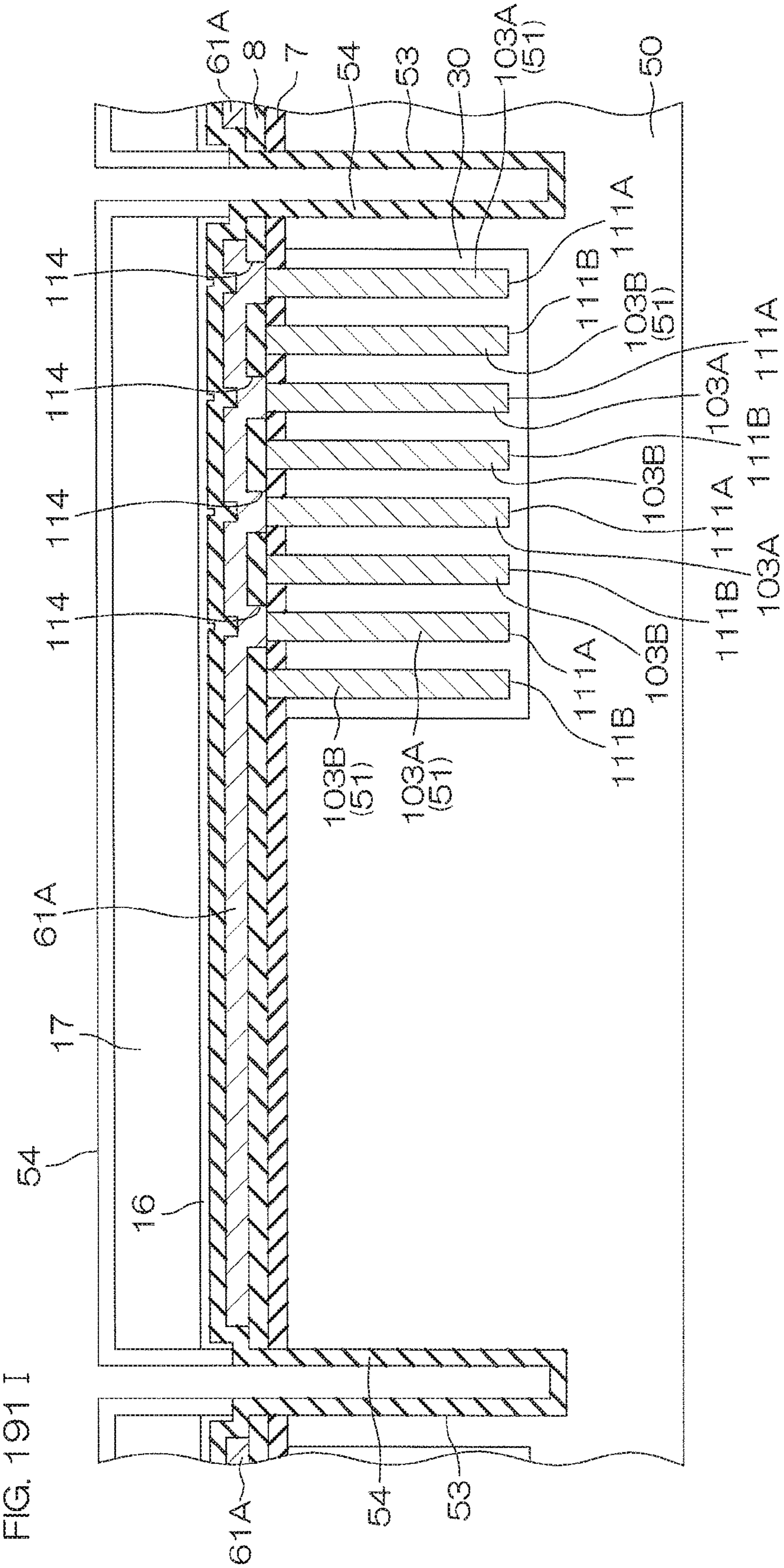

FIG. 191H is a cross-sectional view showing the step subsequent to FIG. 191G.

FIG. 191I is a cross-sectional view showing the step subsequent to FIG. 191H.

Figure 191J:
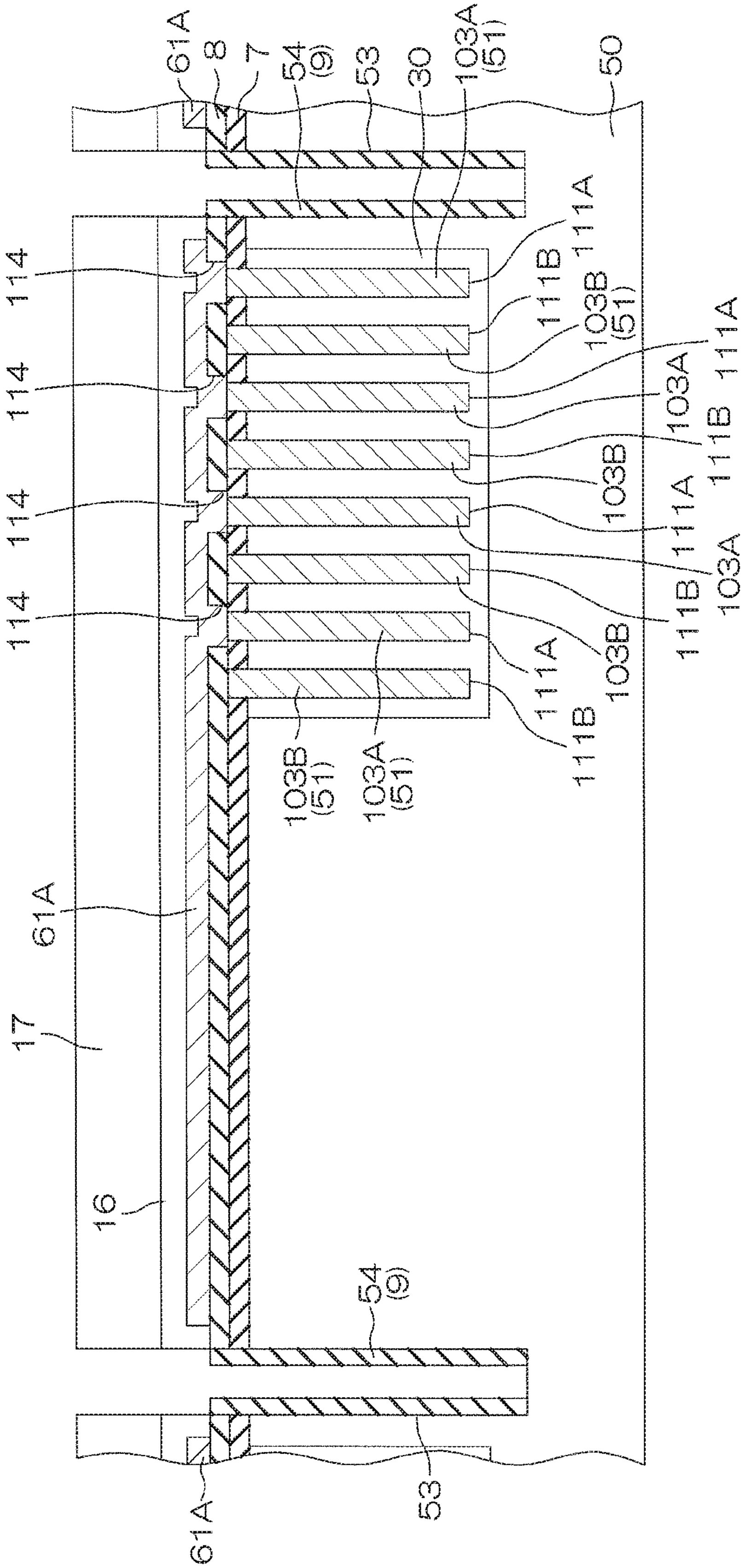

FIG. 191J is a cross-sectional view showing the step subsequent to FIG. 191I.

Figure 191K:
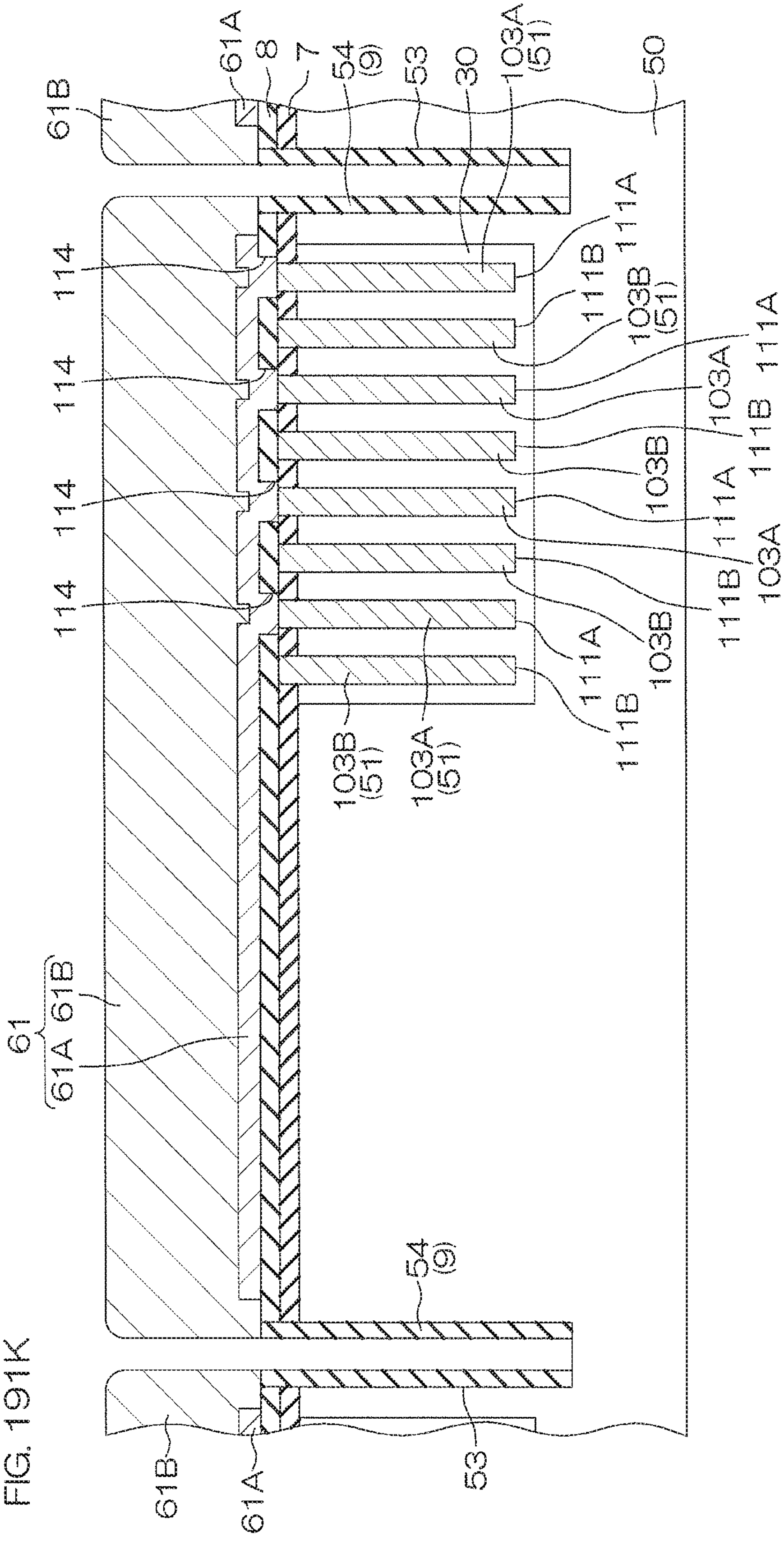

FIG. 191K is a cross-sectional view showing the step subsequent to FIG. 191J.

Figure 191L:
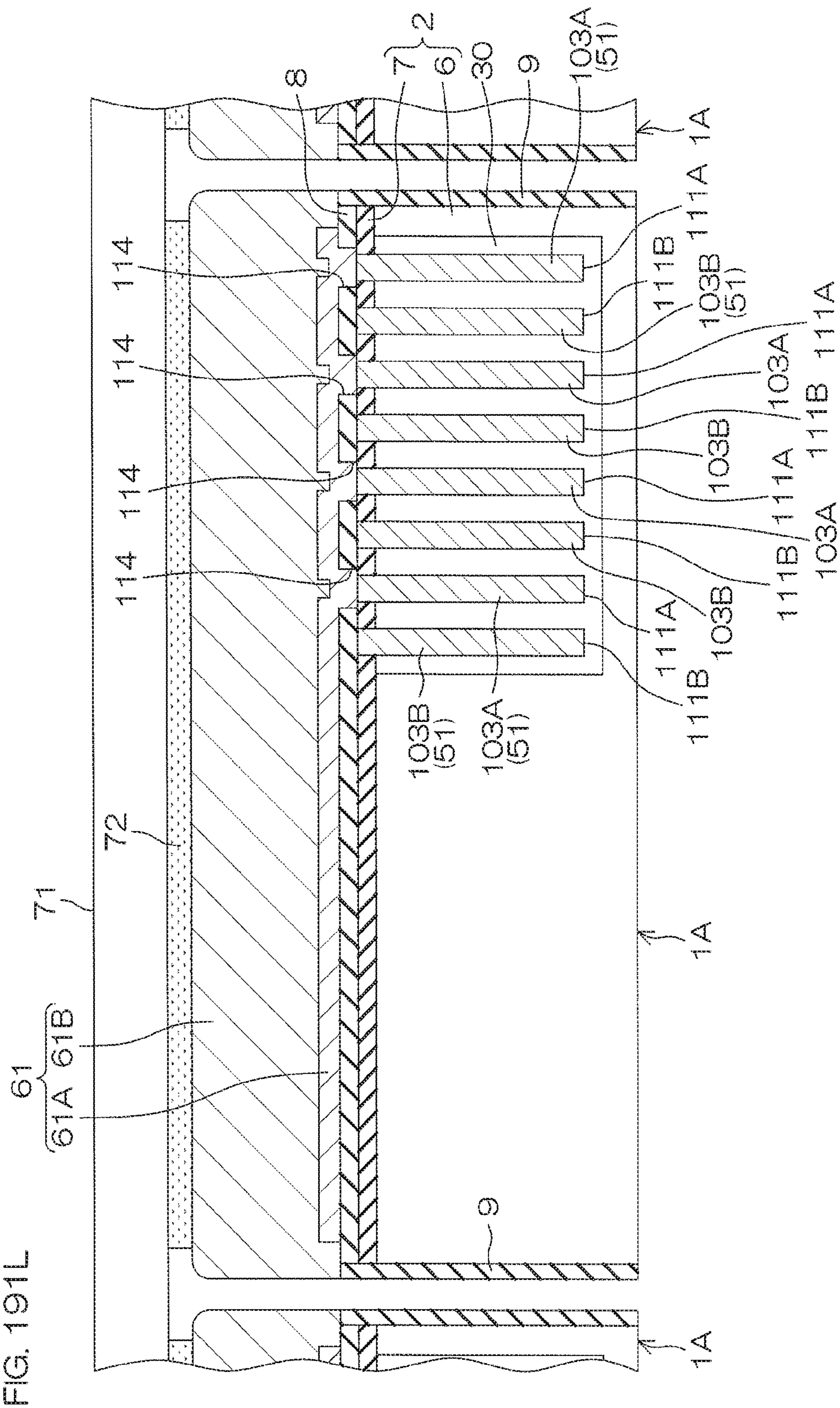

FIG. 191L is a cross-sectional view showing the step subsequent to FIG. 191K.

Figure 192A:
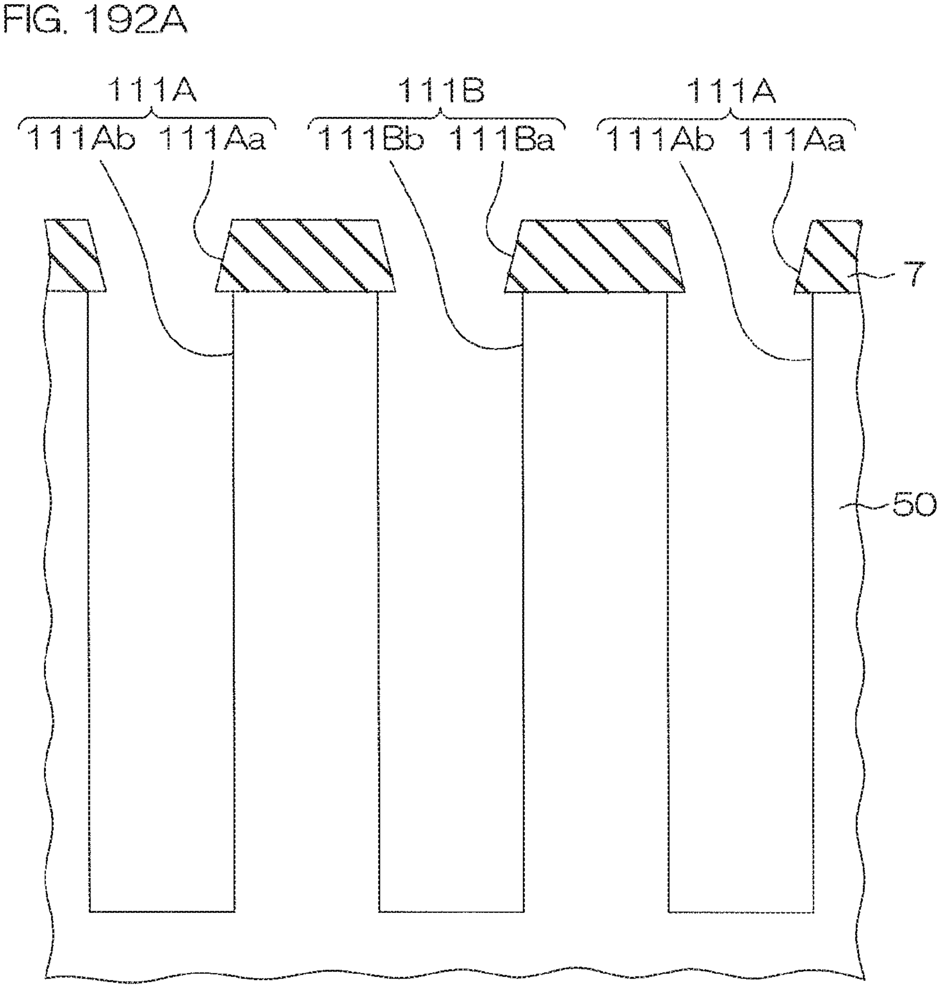

FIG. 192A is a partially enlarged cross-sectional view showing the details of the manufacturing step of the first internal electrode and the second internal electrode, and is a cross-sectional view corresponding to FIG. 182B.

Figure 192B:
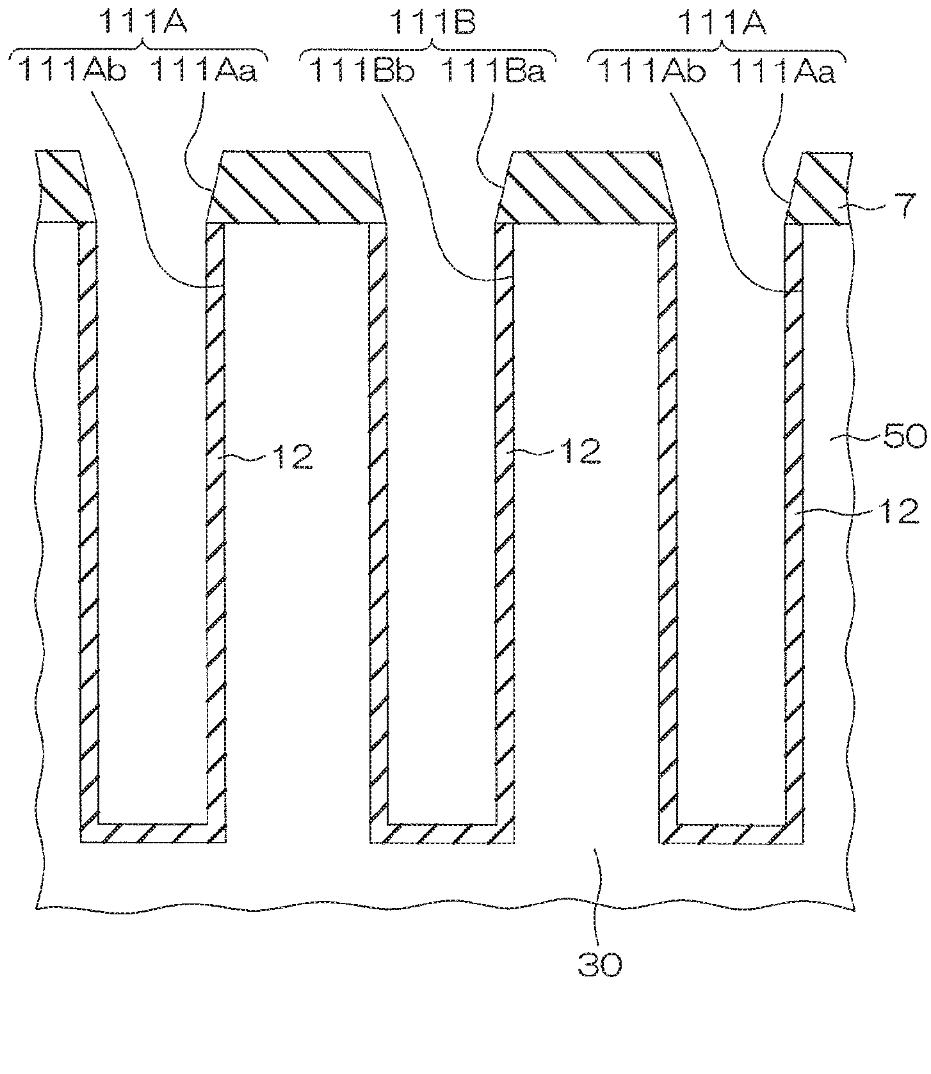

FIG. 192B is a partially enlarged cross-sectional view showing the step subsequent to FIG. 192A.

Figure 192C:
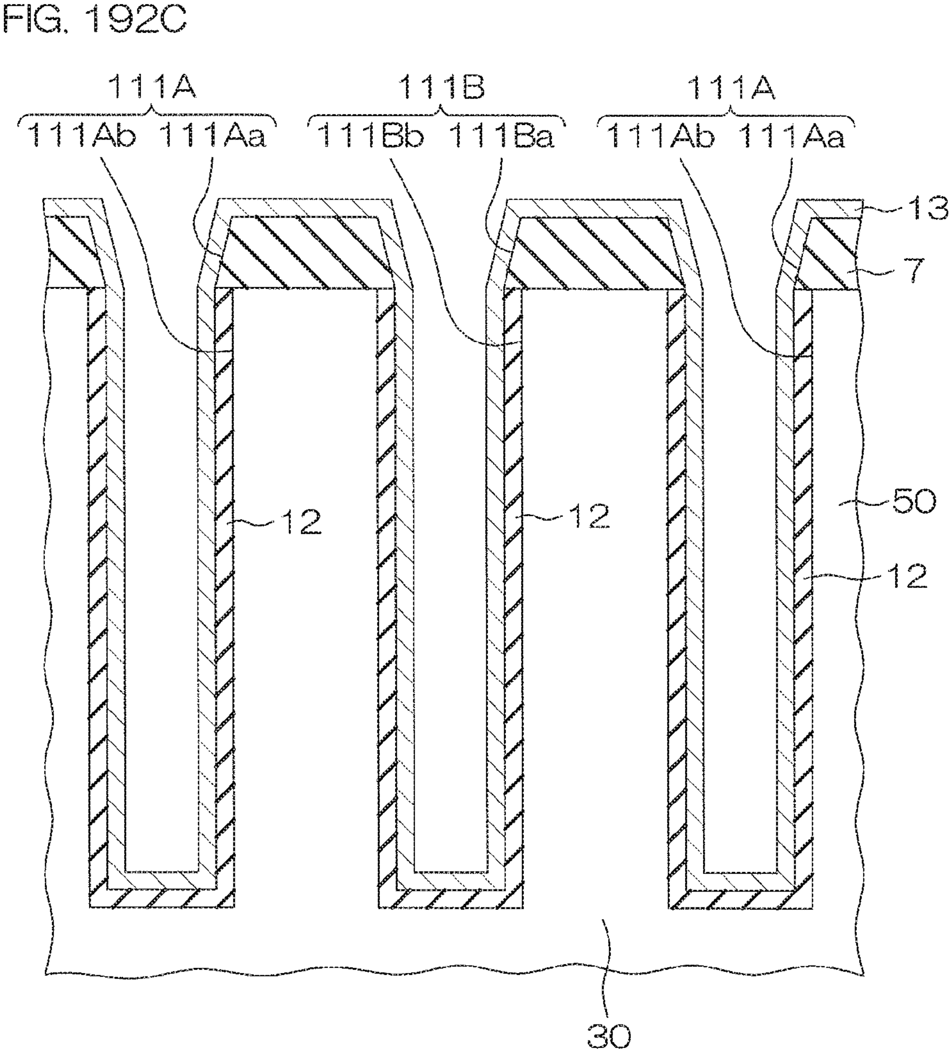

FIG. 192C is a partially enlarged cross-sectional view showing the step subsequent to FIG. 192B.

Figure 192D:
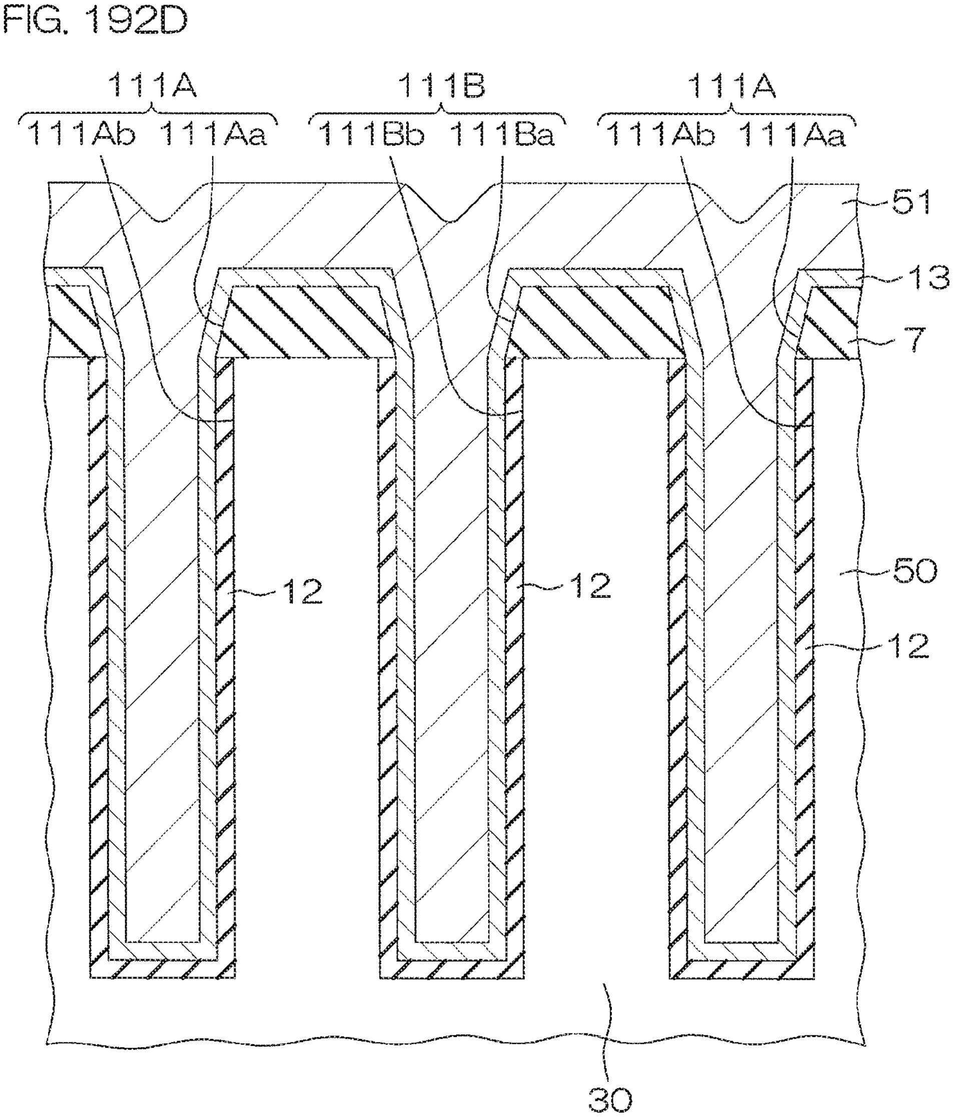

FIG. 192D is a partially enlarged cross-sectional view showing the step subsequent to FIG. 192C.

Figure 192E:
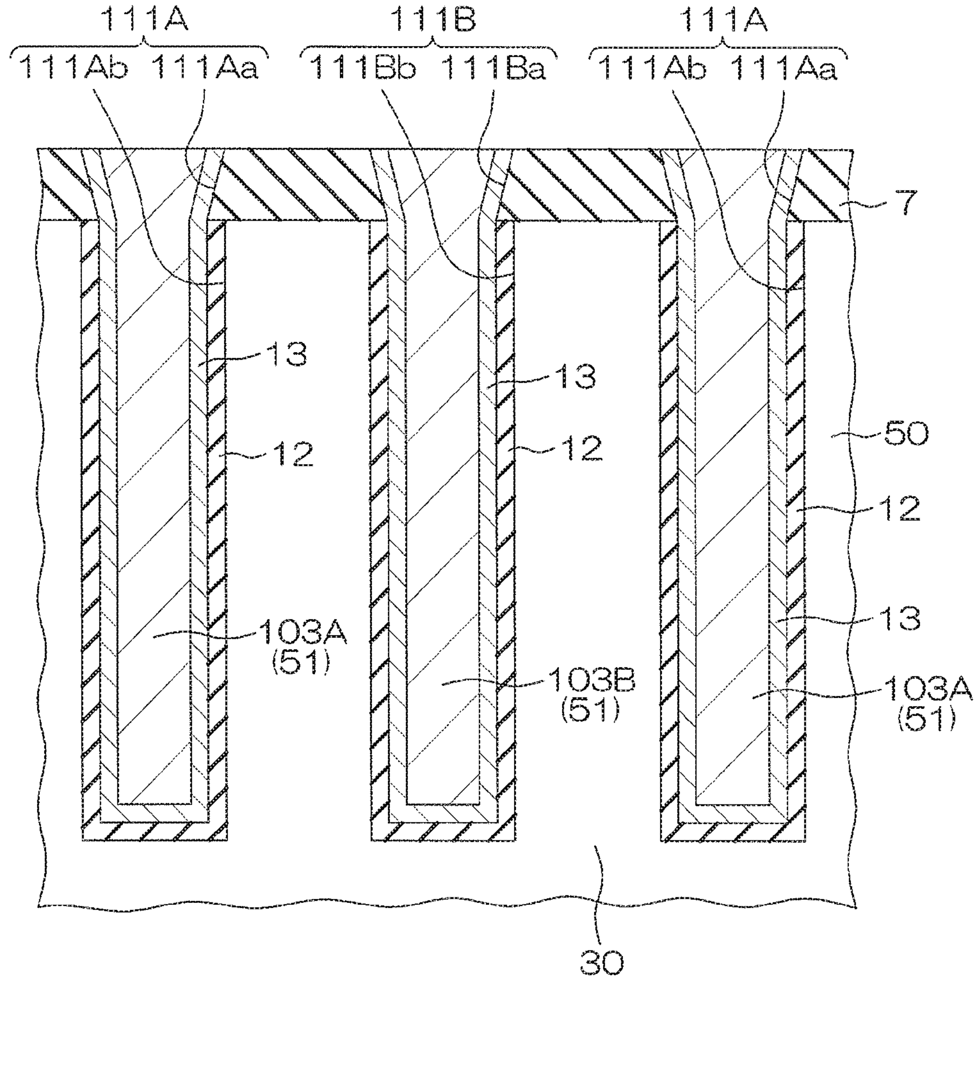

FIG. 192E is a partially enlarged cross-sectional view showing the step subsequent to FIG. 192D.

Figure 193A:
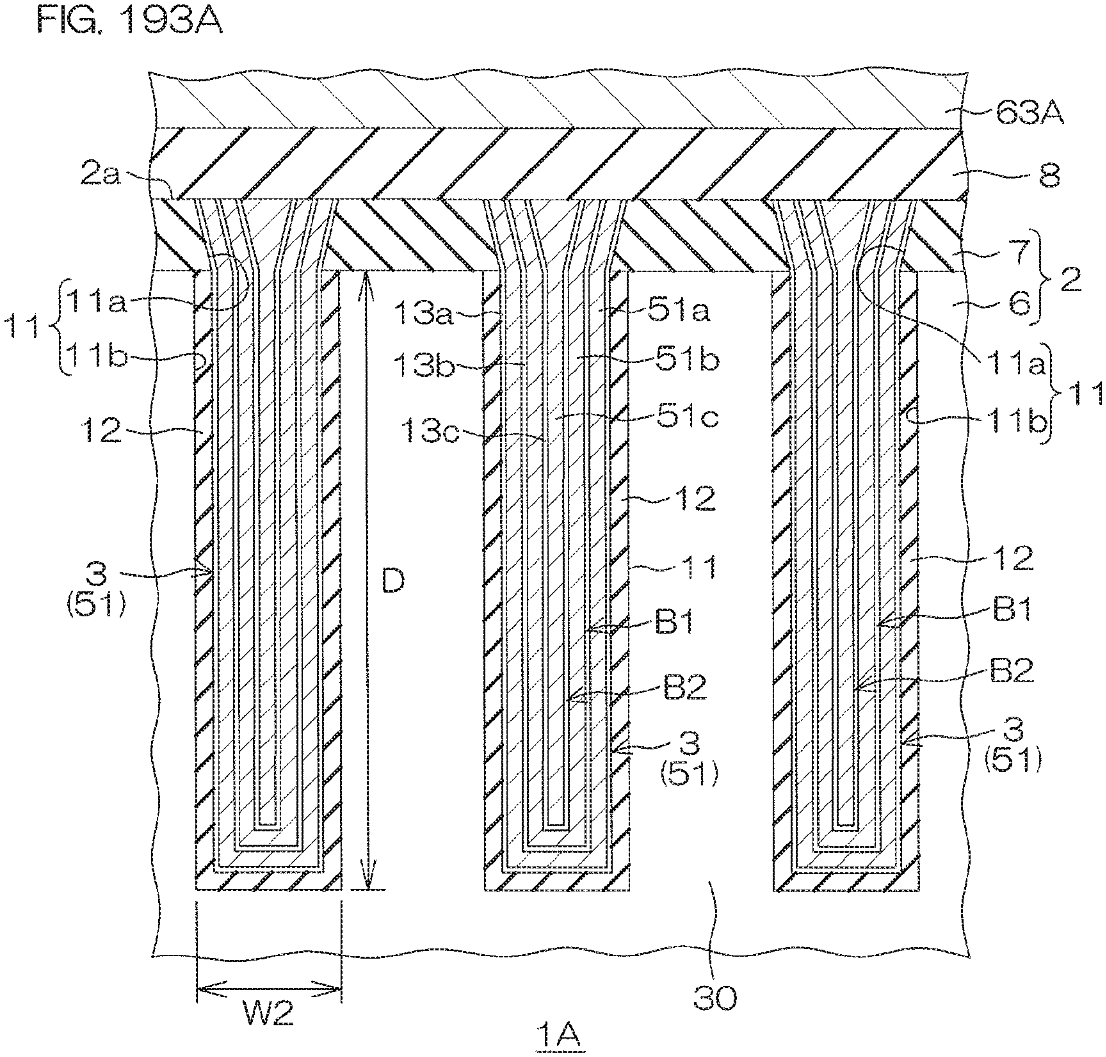

FIG. 193A is a diagram showing a modification example of a conductive member embedded within a coil formation trench, and is a partially enlarged cross-sectional view corresponding to FIG. 181A.

Figure 193B:
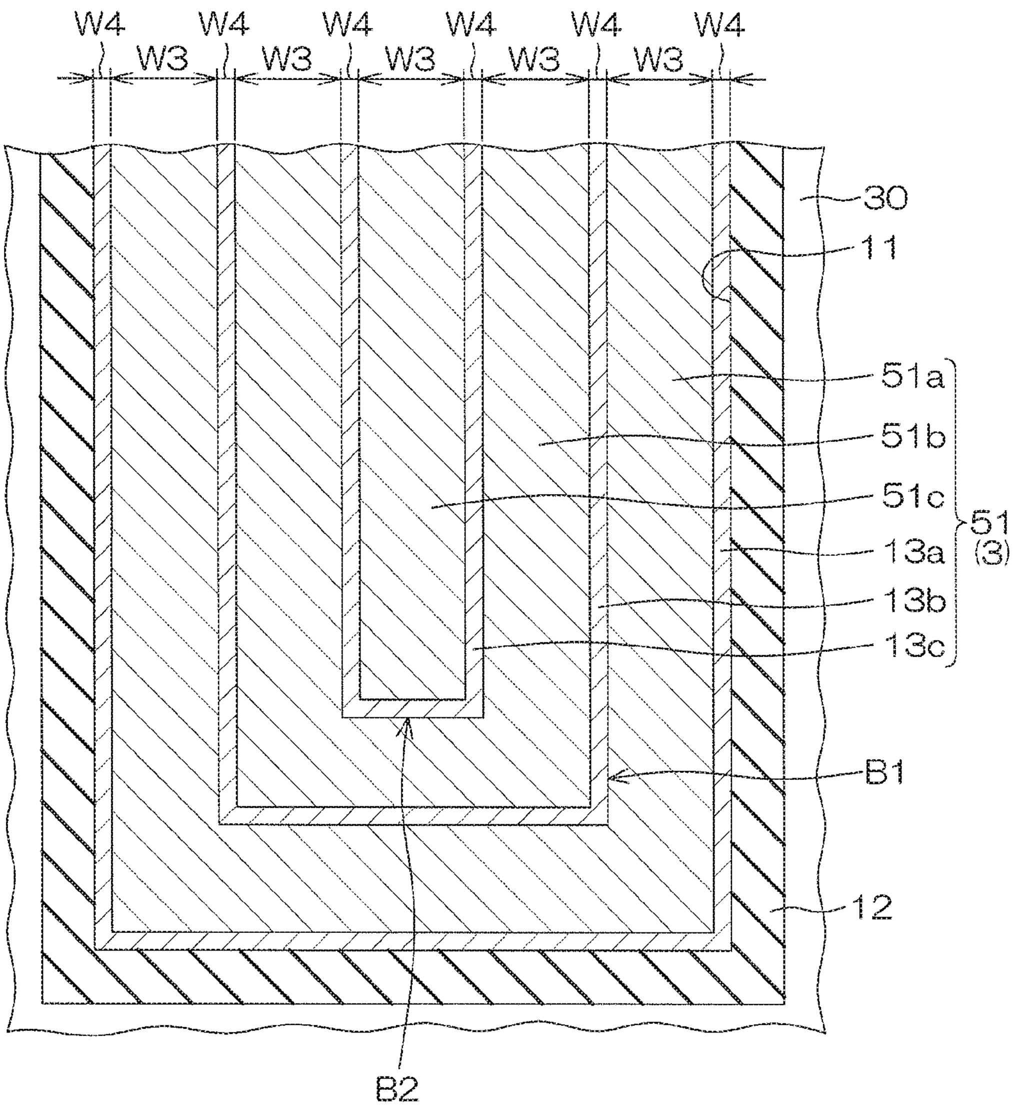

FIG. 193B is a partially enlarged cross-sectional view of FIG. 193A.

Figure 194A:
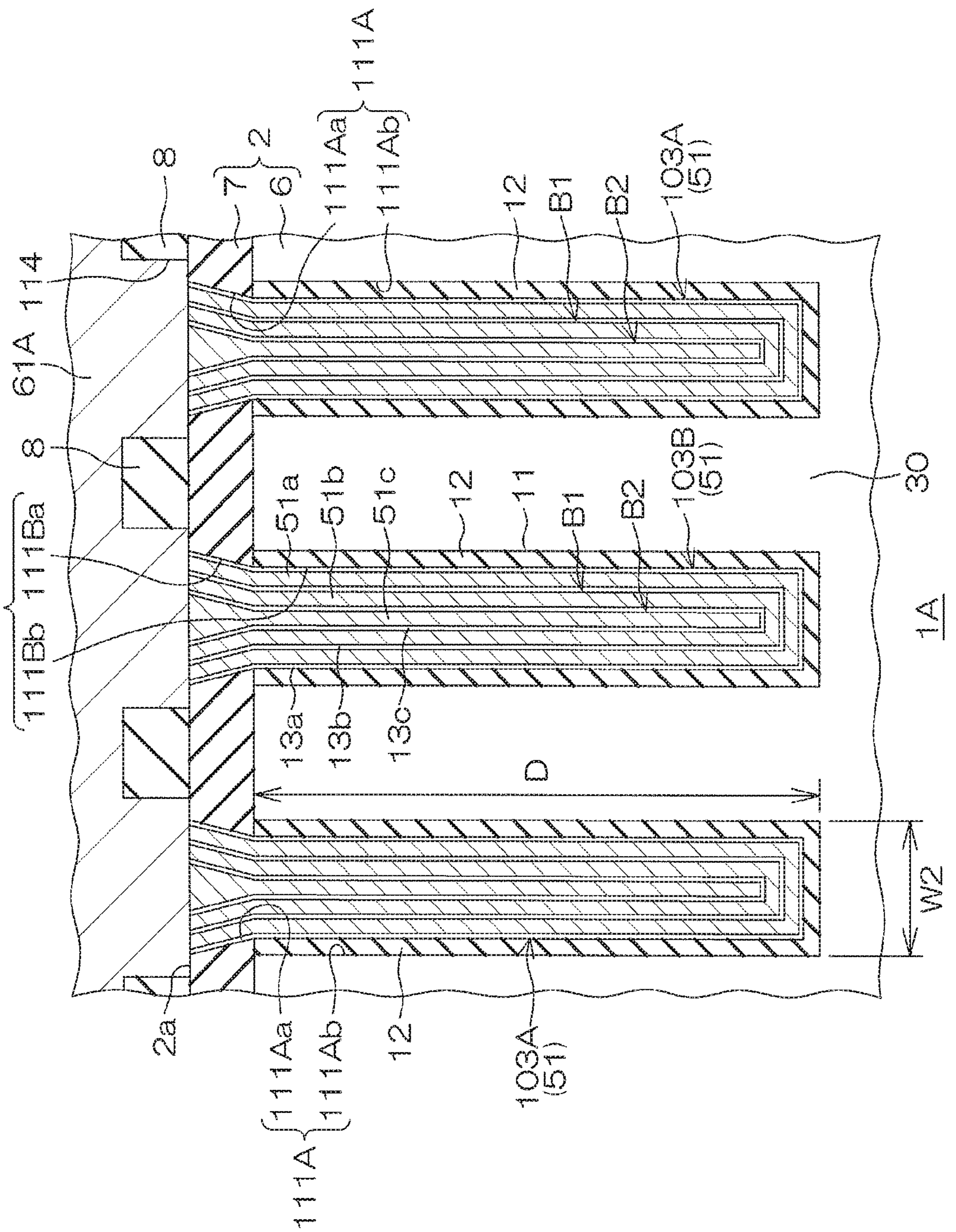

FIG. 194A is a diagram showing a modification example of a conductive member embedded within each of internal electrode formation trenches, and is a partially enlarged cross-sectional view corresponding to FIG. 182A.

Figure 194B:
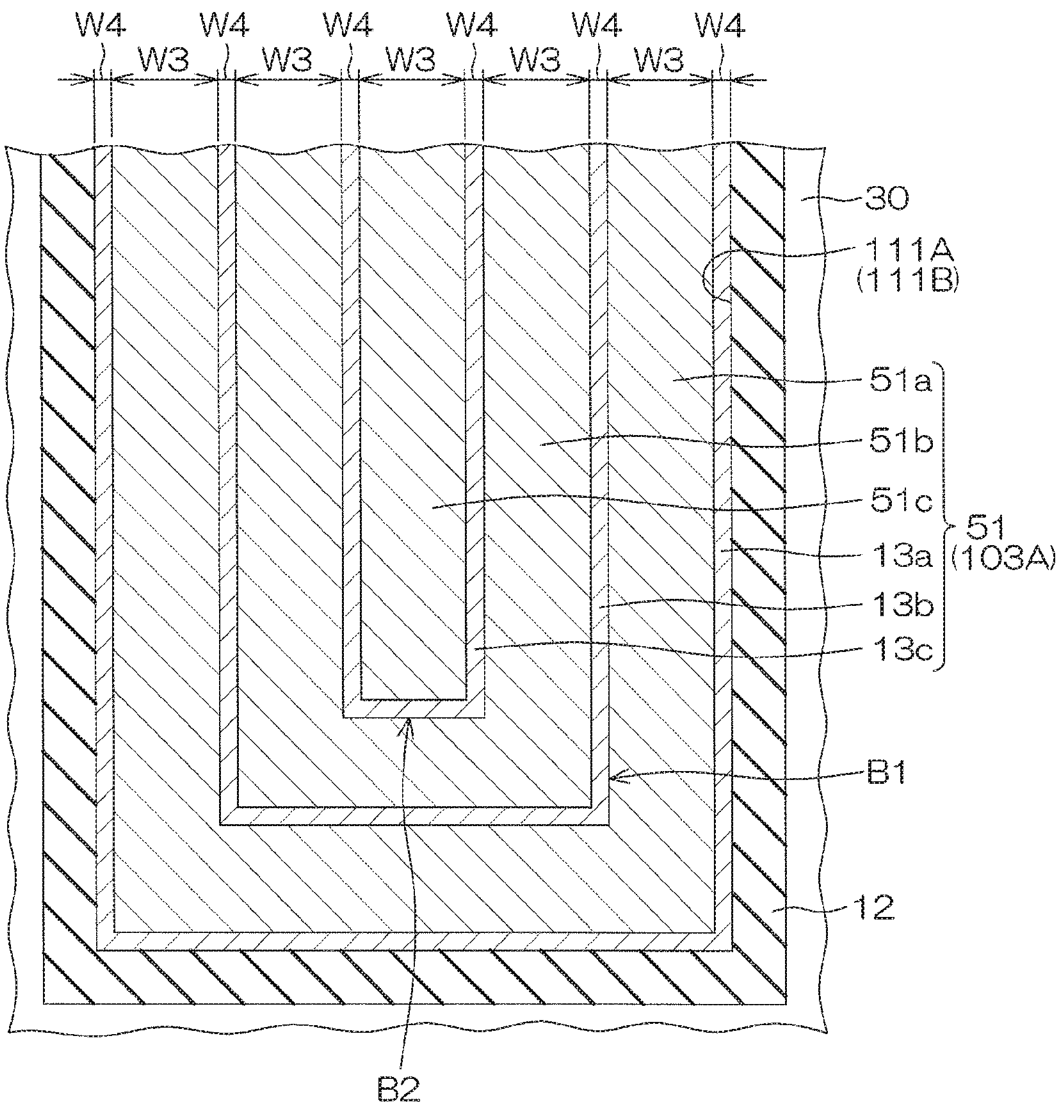

FIG. 194B is a partially enlarged cross-sectional view of FIG. 194A.

Figure 195:
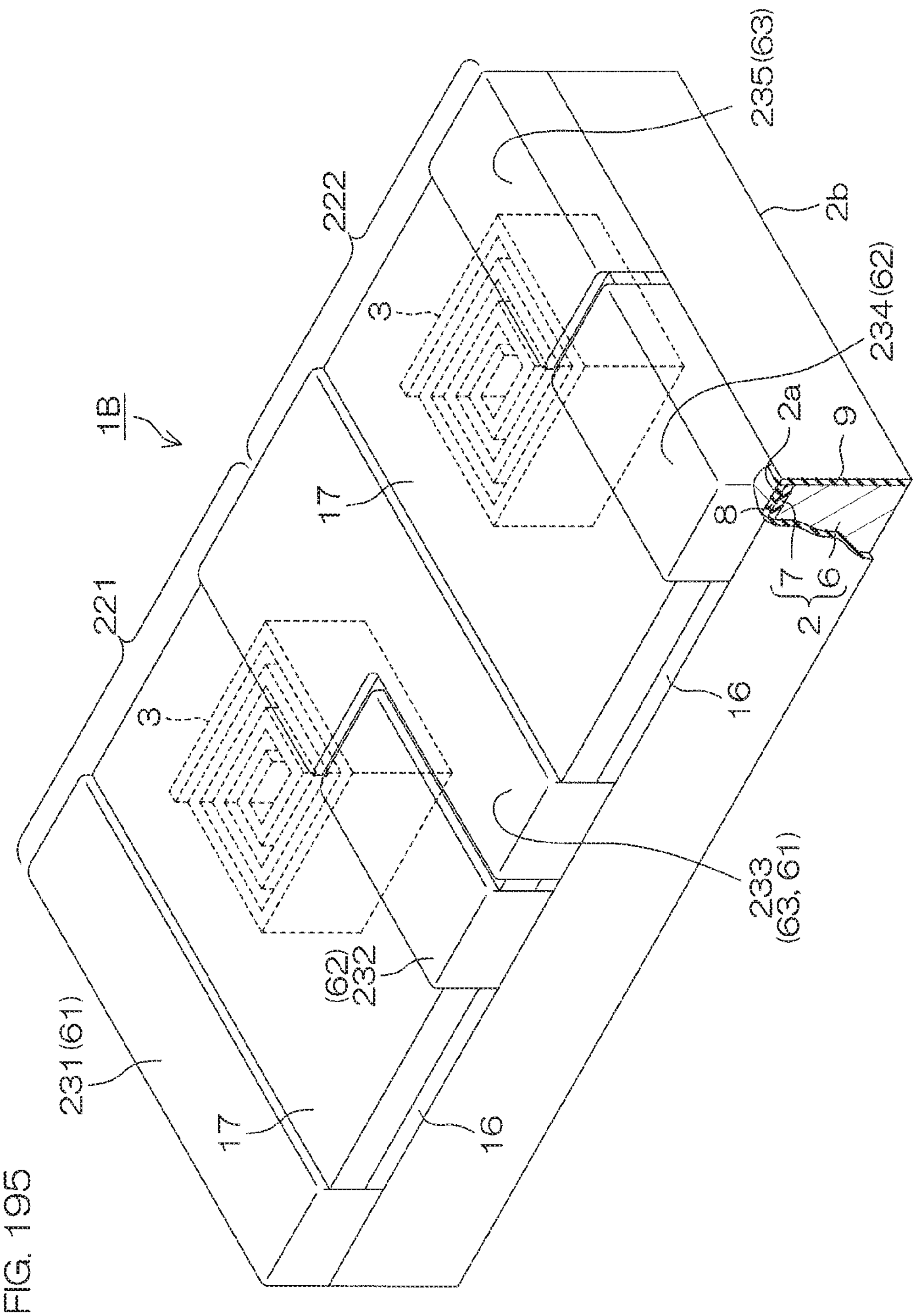

FIG. 195 is a partially cut perspective view of an LC composite element chip according to a third preferred embodiment of the sixth invention.

Figure 196:
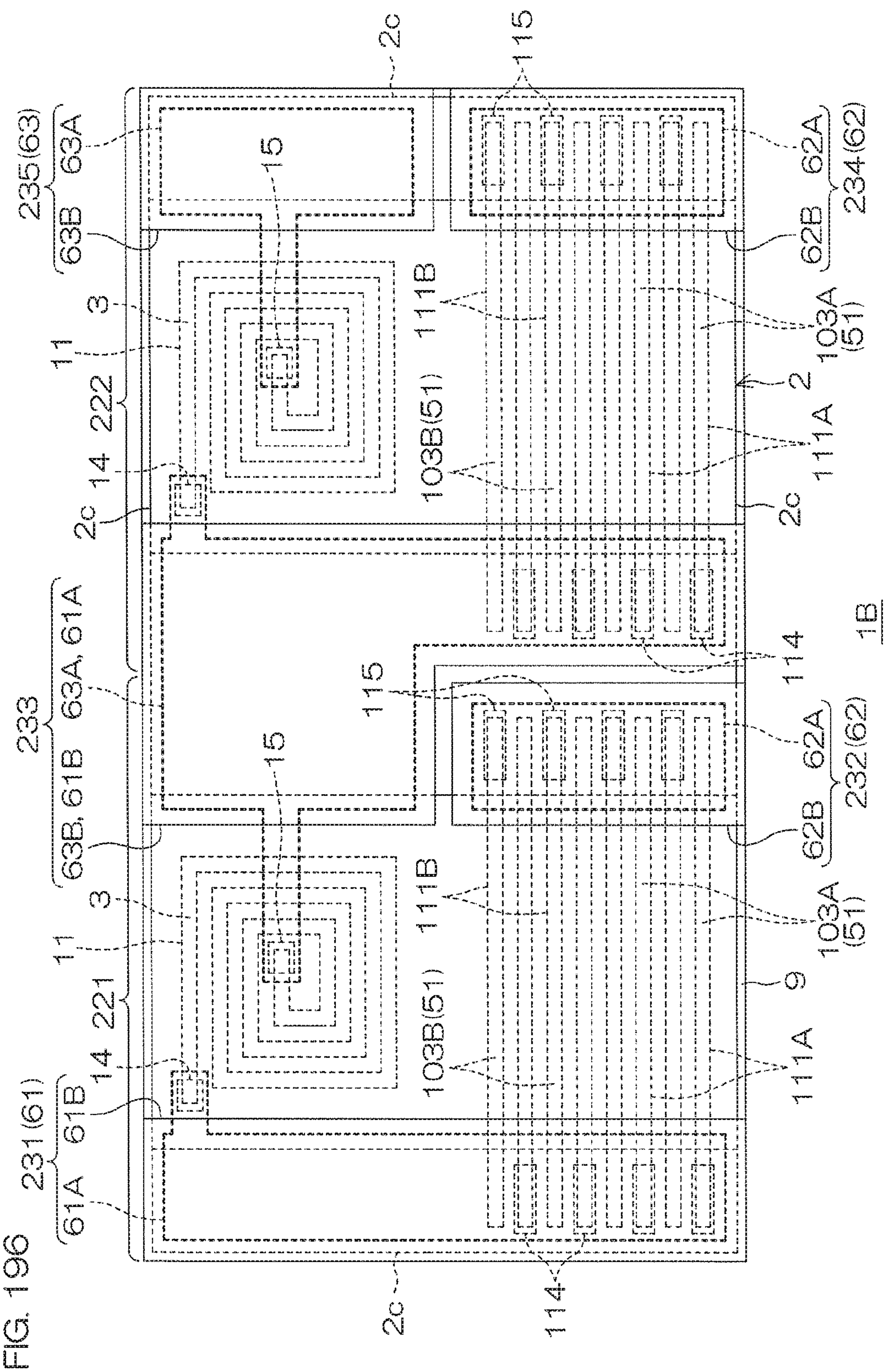

FIG. 196 is a plan view of the LC composite element chip.

Figure 197:
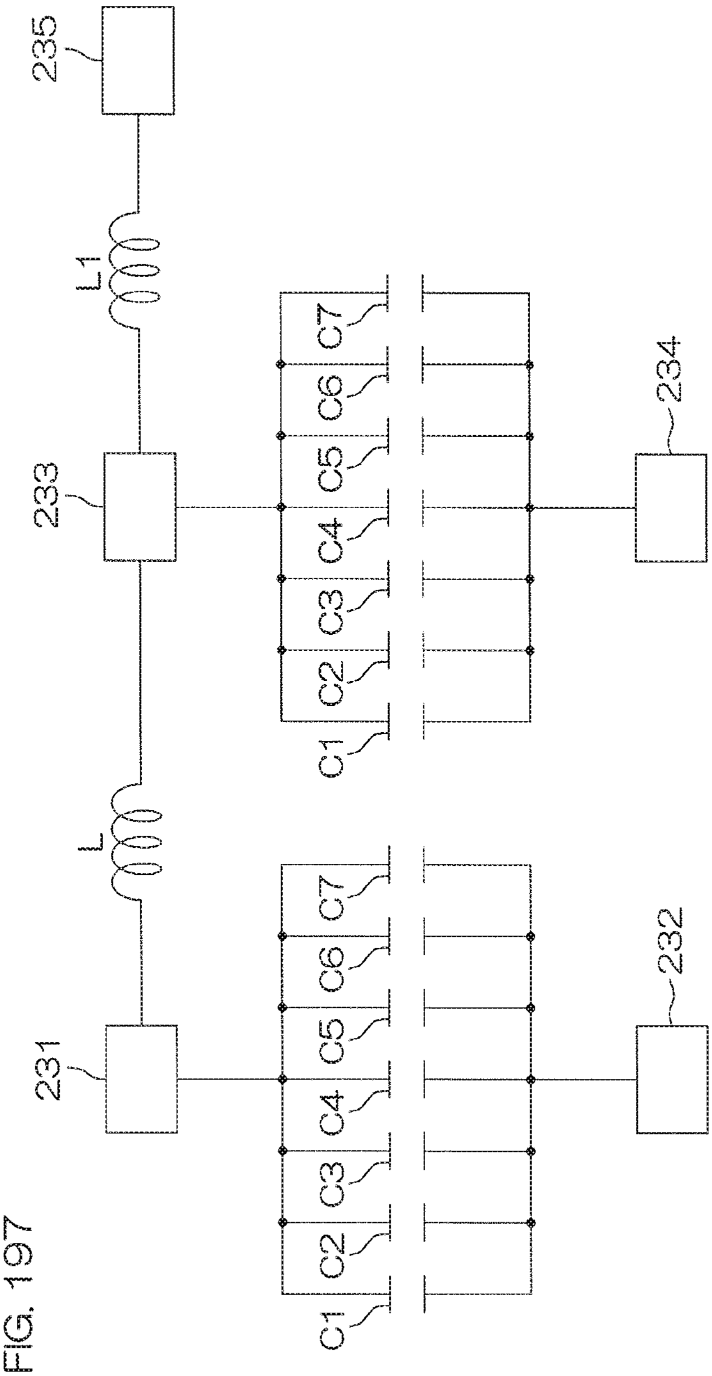

FIG. 197 is an electrical circuit diagram showing an electrical structure within the LC composite element chip.

Figure 198:
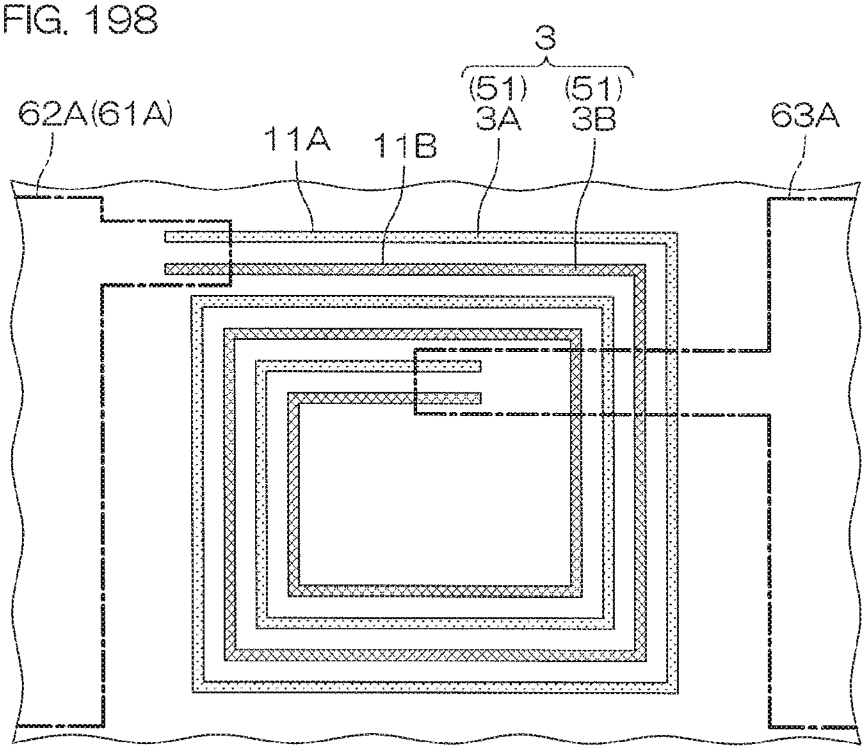

FIG. 198 is a plan view showing a modification example of the coil.

Figure 48A:
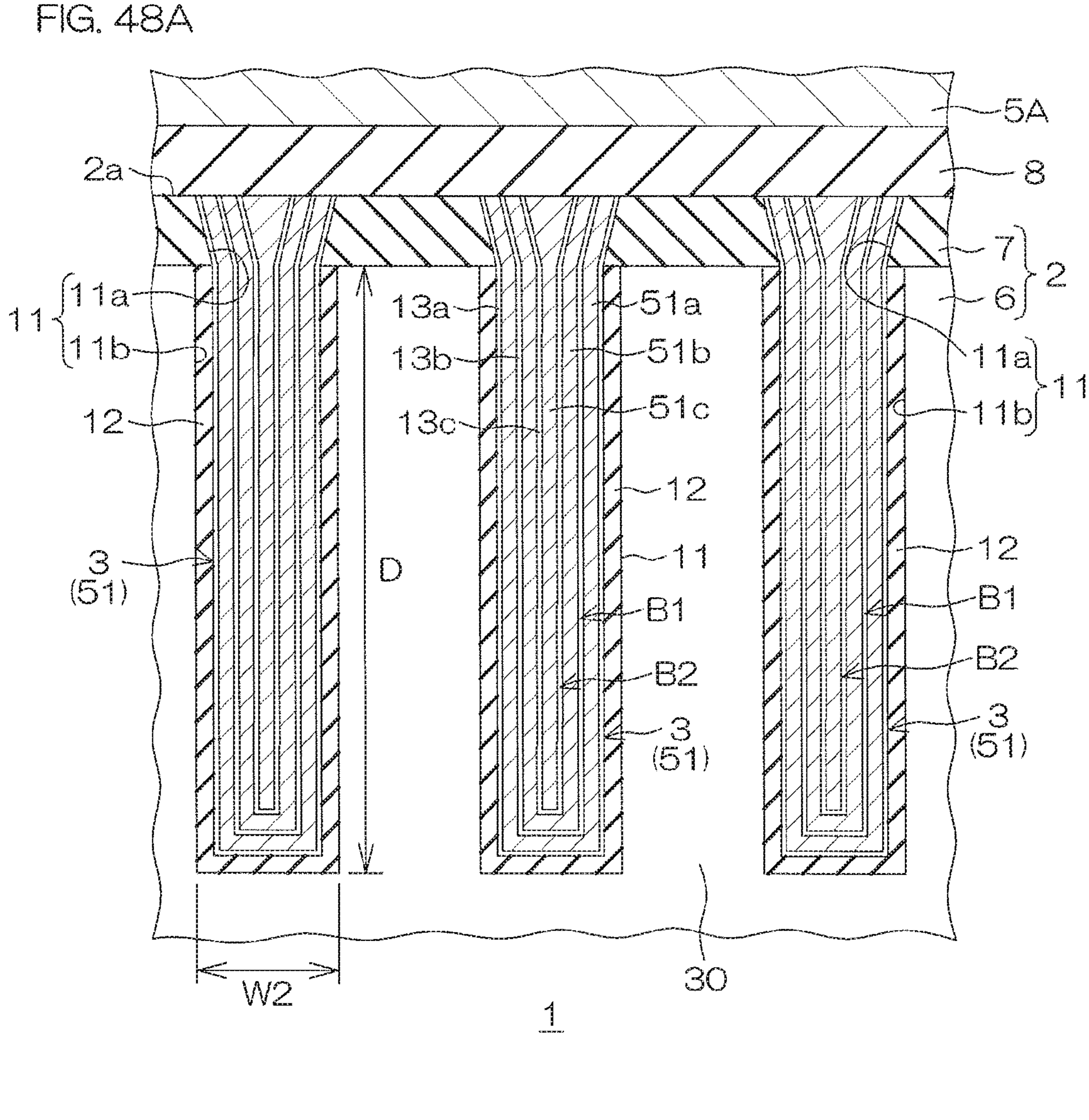
FIG. 48A is a diagram showing a modification example of a conductive member embedded within a coil formation trench, and is a partially enlarged cross-sectional view corresponding to FIG. 36.
Figure 199:
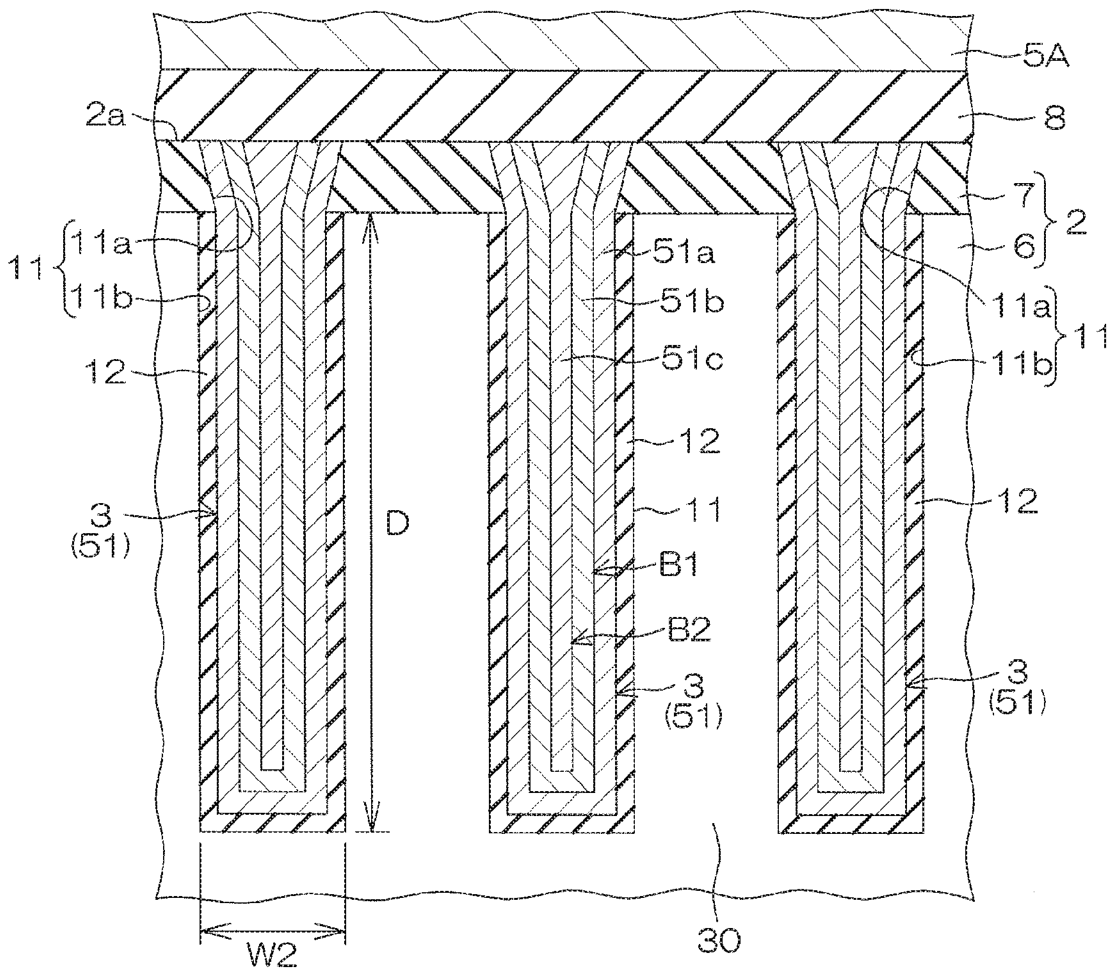

FIG. 199 is a partially enlarged cross-sectional view showing an arrangement when a seed layer cannot be visually recognized in the conductive member shown in FIG. 48A.

Figure 200:
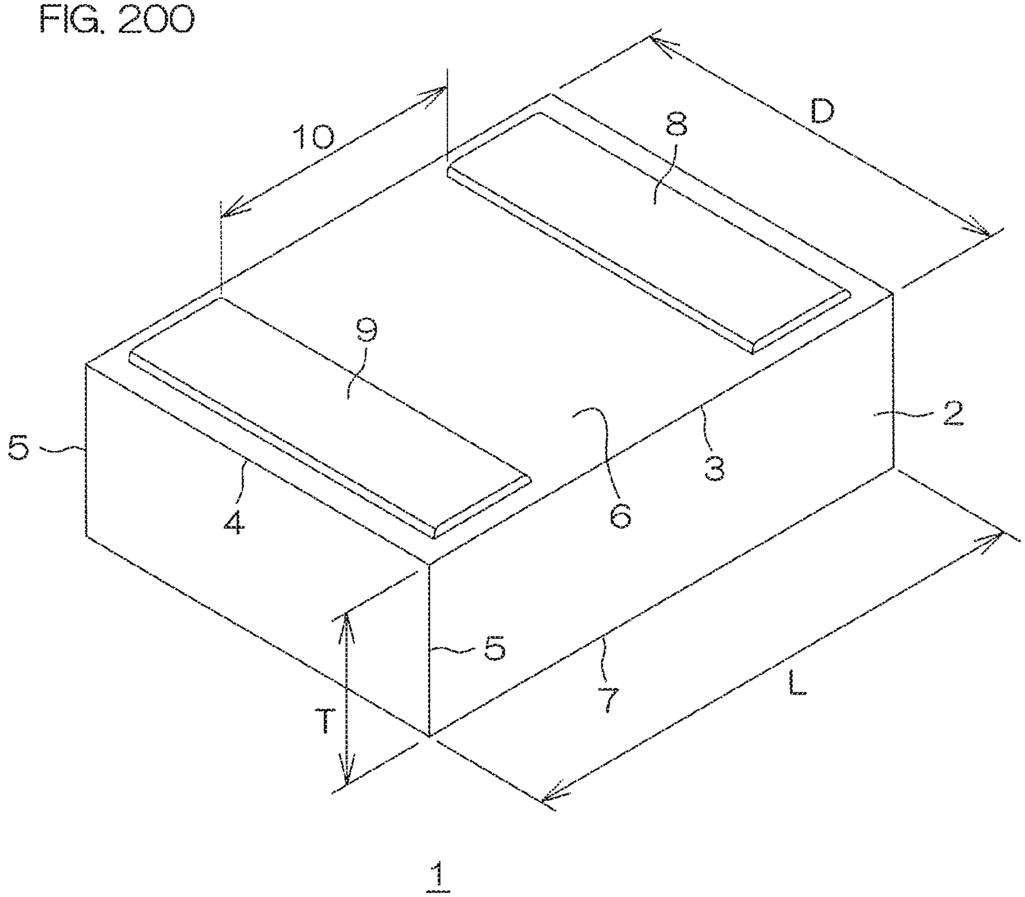

FIG. 200 is a schematic perspective view of a chip capacitor according to a preferred embodiment of an eighth invention.

Figure 201:
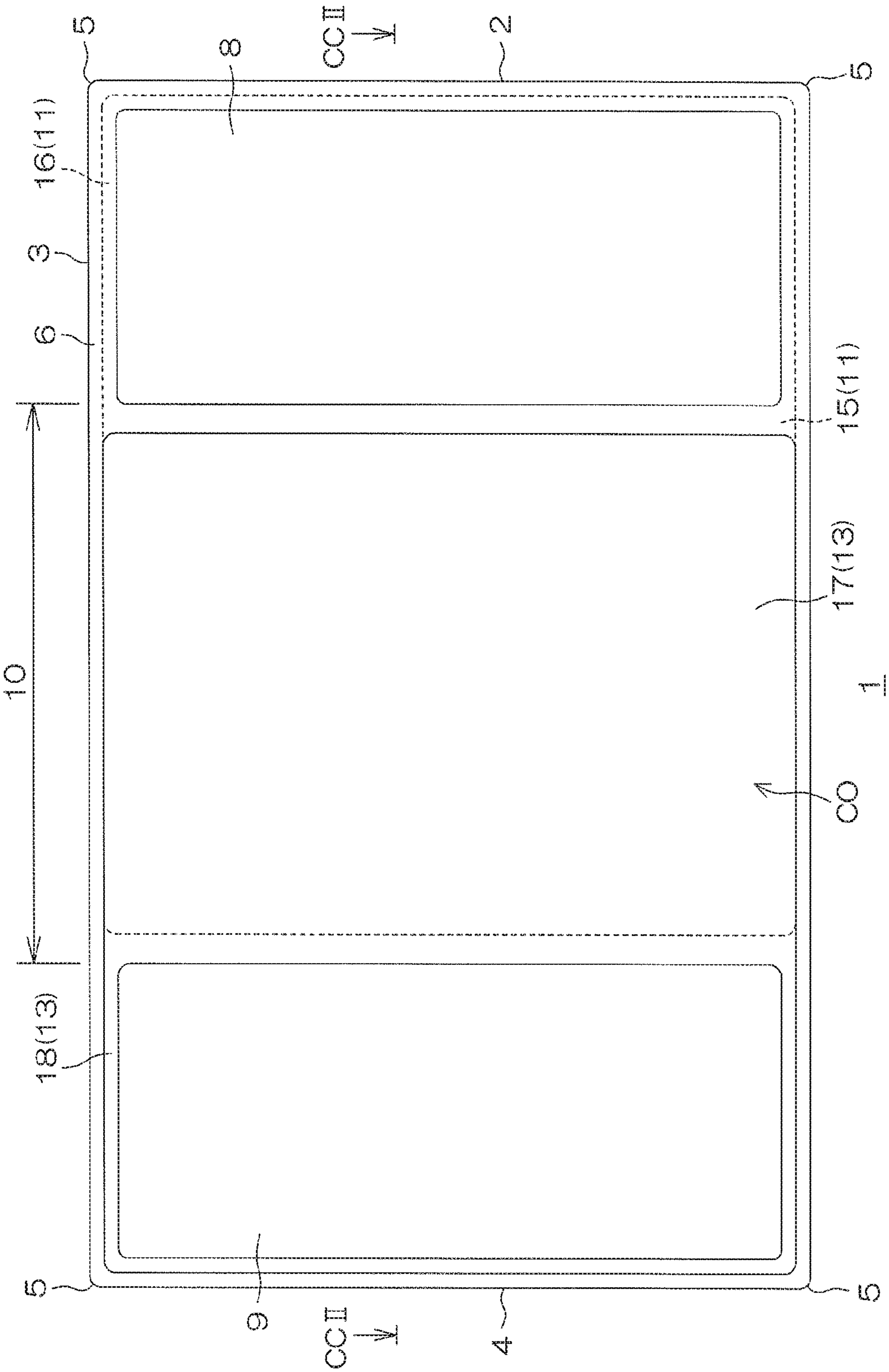

FIG. 201 is a schematic plan view of the chip capacitor shown in FIG. 200.

Figure 202:
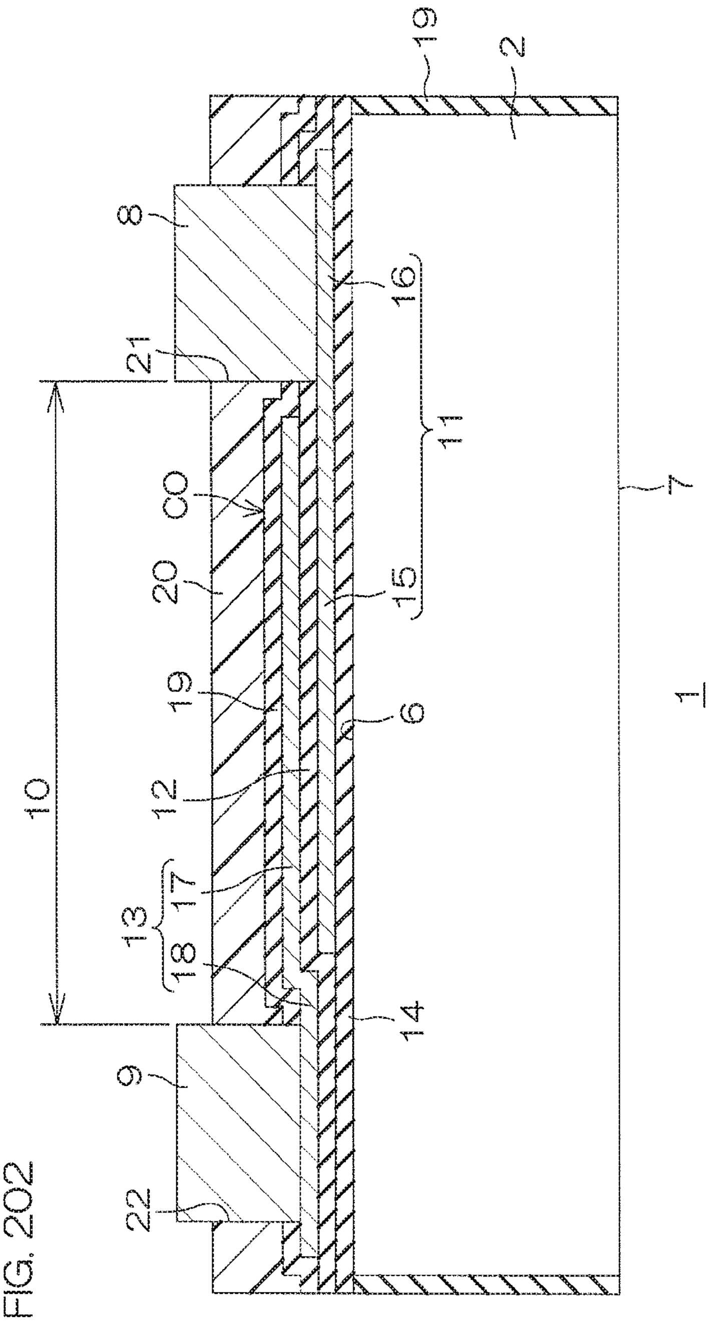

FIG. 202 is a cross-sectional view taken along line CCII-CCII in FIG. 201.

Figures 203, 204:
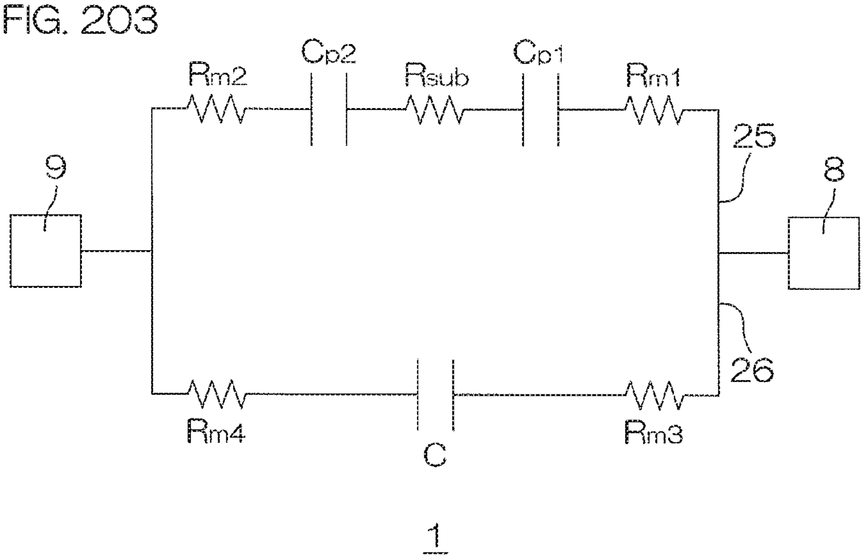

FIG. 203 is an equivalent circuit diagram of the chip capacitor shown in FIG. 200.

FIG. 204 is a table showing the specifications of an evaluation element of the chip capacitor shown in FIG. 200.

Figure 205:
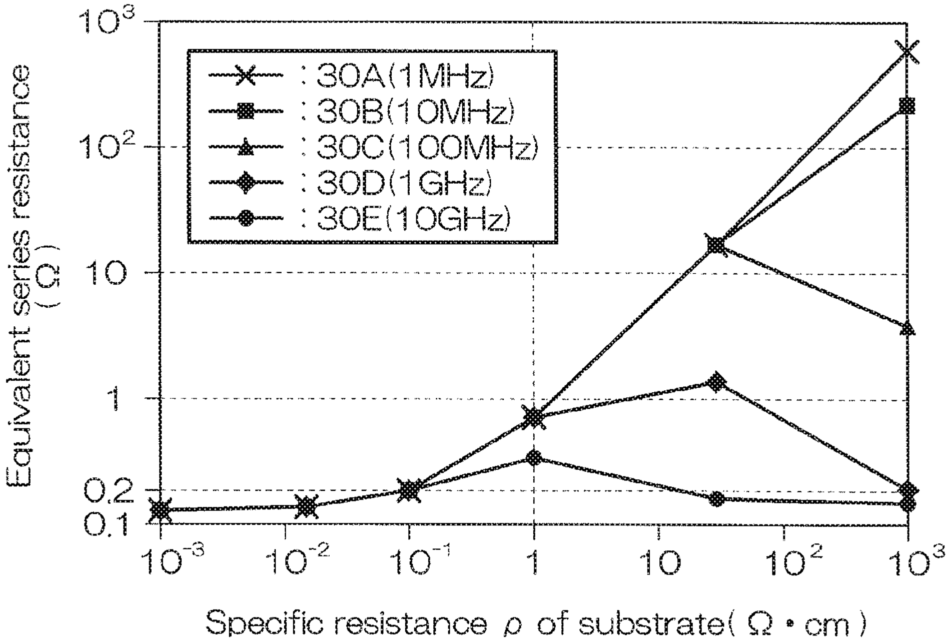

FIG. 205 is a graph showing the frequency characteristics of the evaluation element shown in FIG. 204, and is a graph showing the resistivity versus equivalent series resistance of the substrate.

Figure 206:
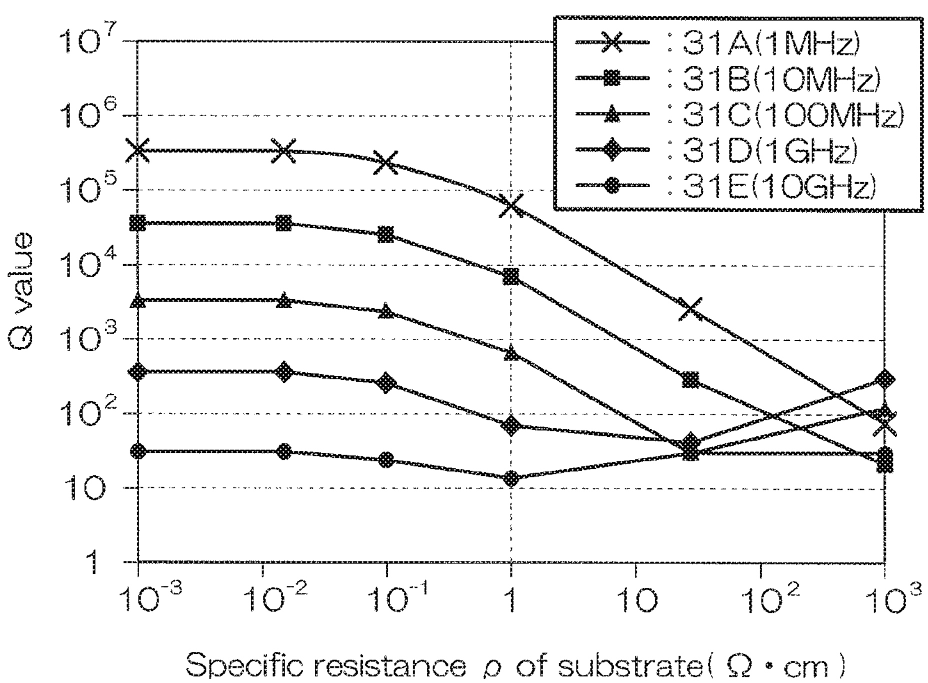

FIG. 206 is a graph showing the frequency characteristics of the evaluation element shown in FIG. 204, and is a graph showing the resistivity versus Q value (Quality Factor) of the substrate.

Figure 207A:
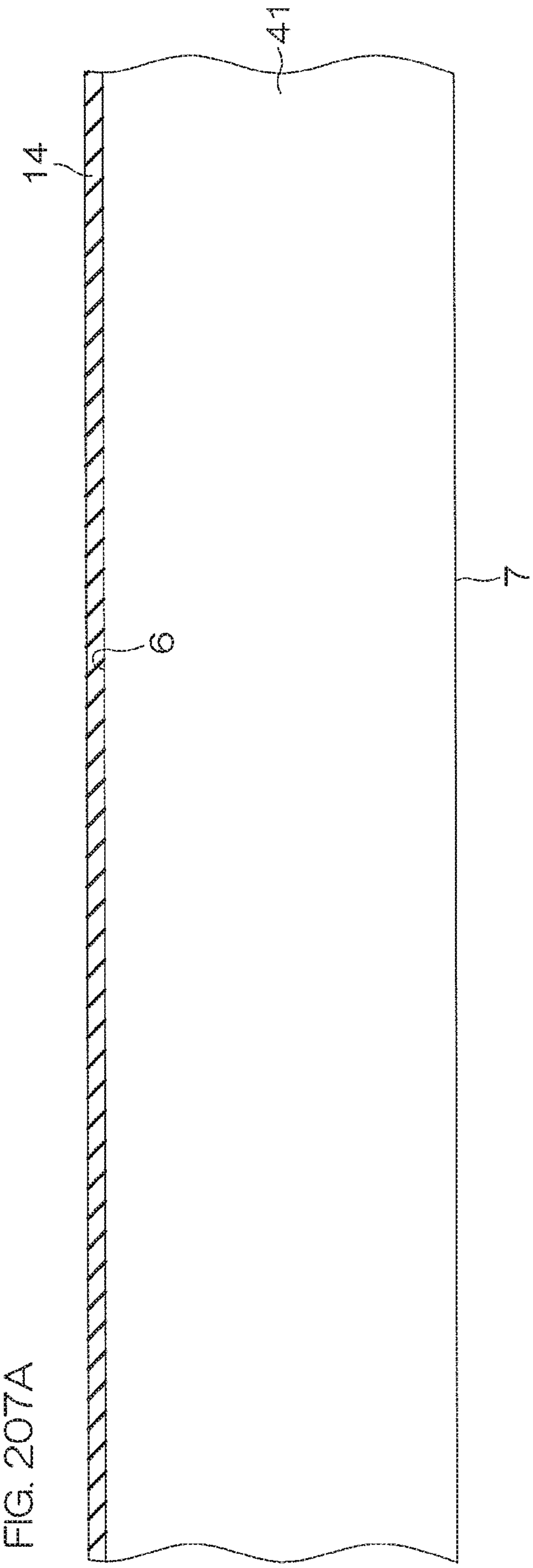

FIG. 207A is a cross-sectional view for illustrating an example of the manufacturing step of the chip capacitor shown in FIG. 200.

Figure 207B:
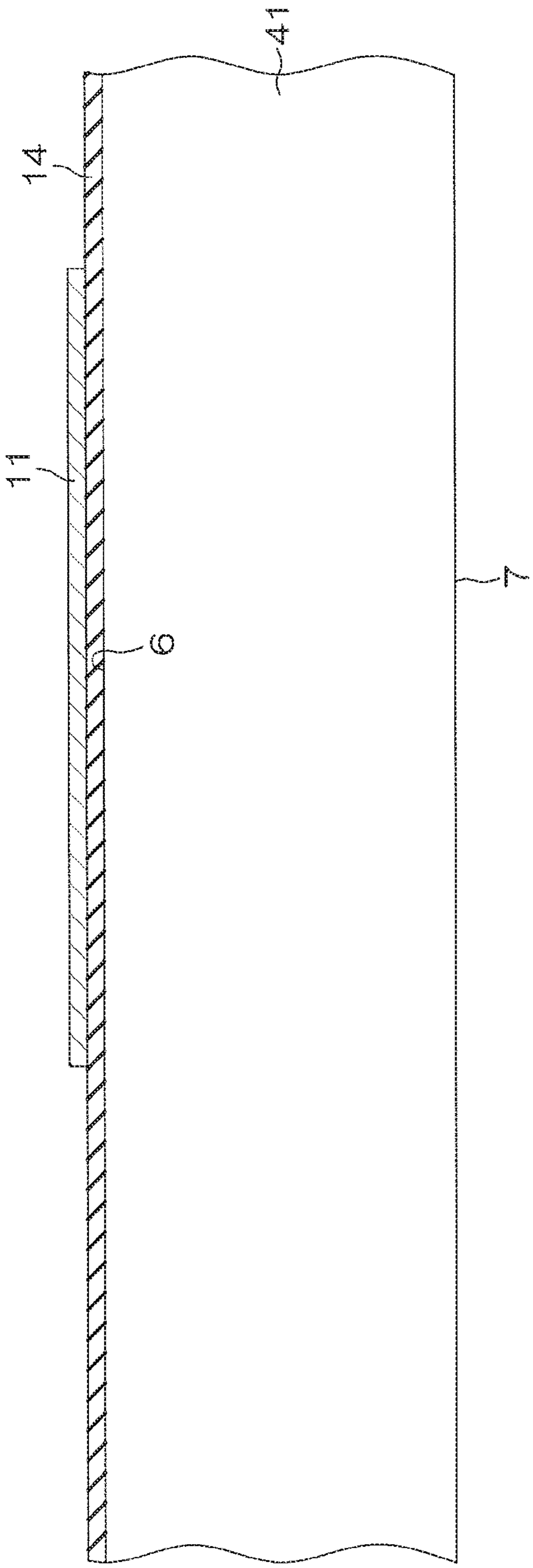

FIG. 207B is a cross-sectional view showing the step subsequent to FIG. 207A.

Figure 207C:
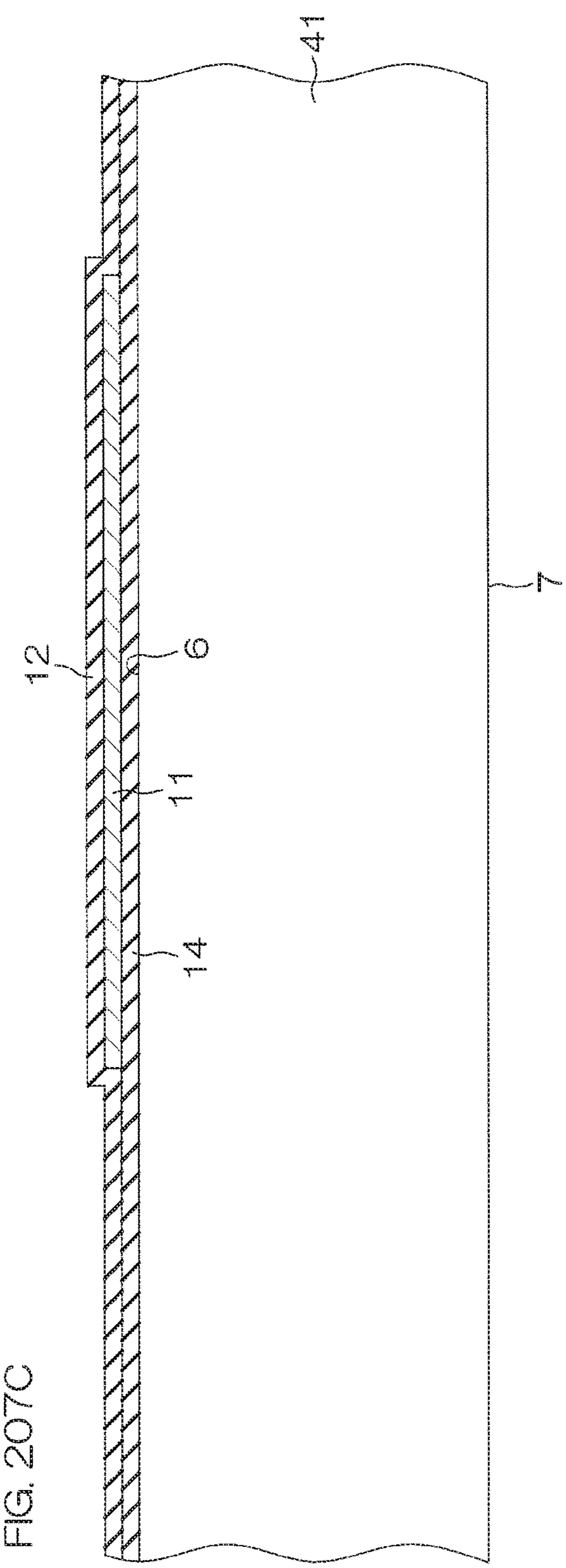

FIG. 207C is a cross-sectional view showing the step subsequent to FIG. 207B.

Figure 207D:
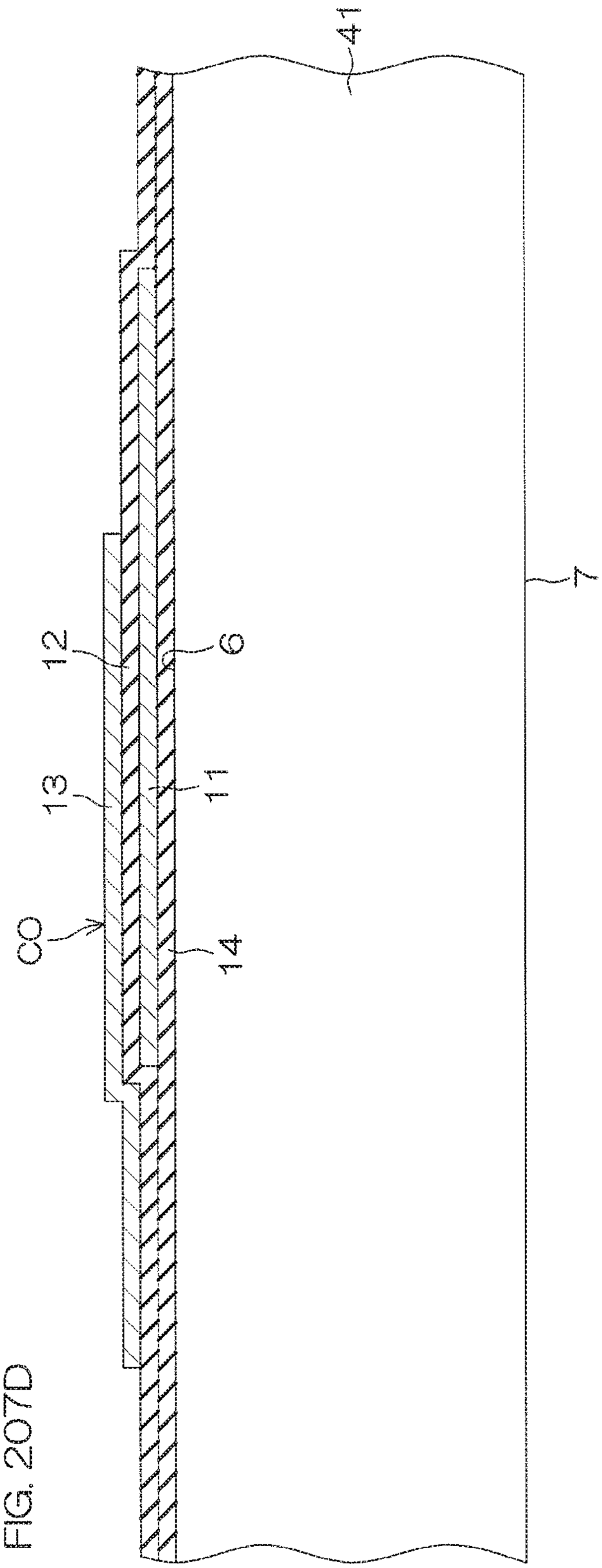

FIG. 207D is a cross-sectional view showing the step subsequent to FIG. 207C.

Figure 207E:
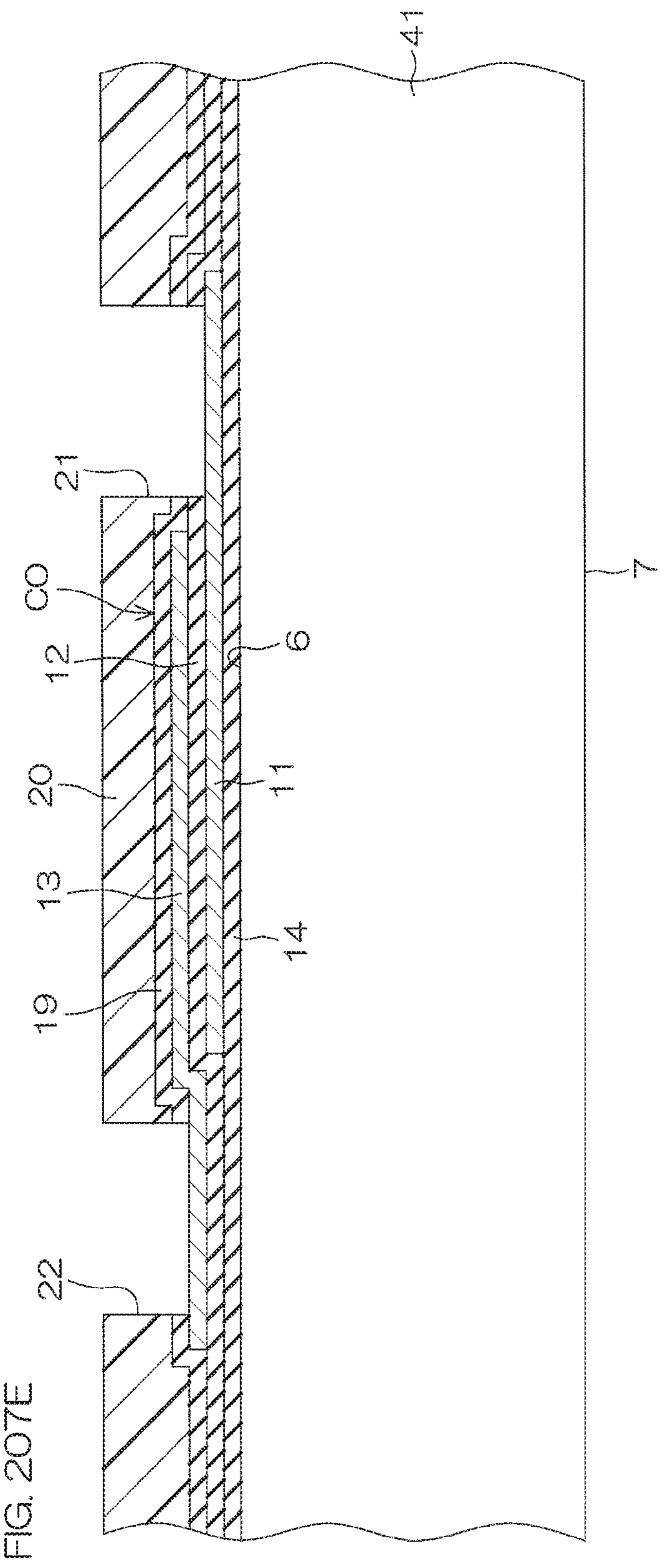

FIG. 207E is a cross-sectional view showing the step subsequent to FIG. 207D.

Figure 207F:
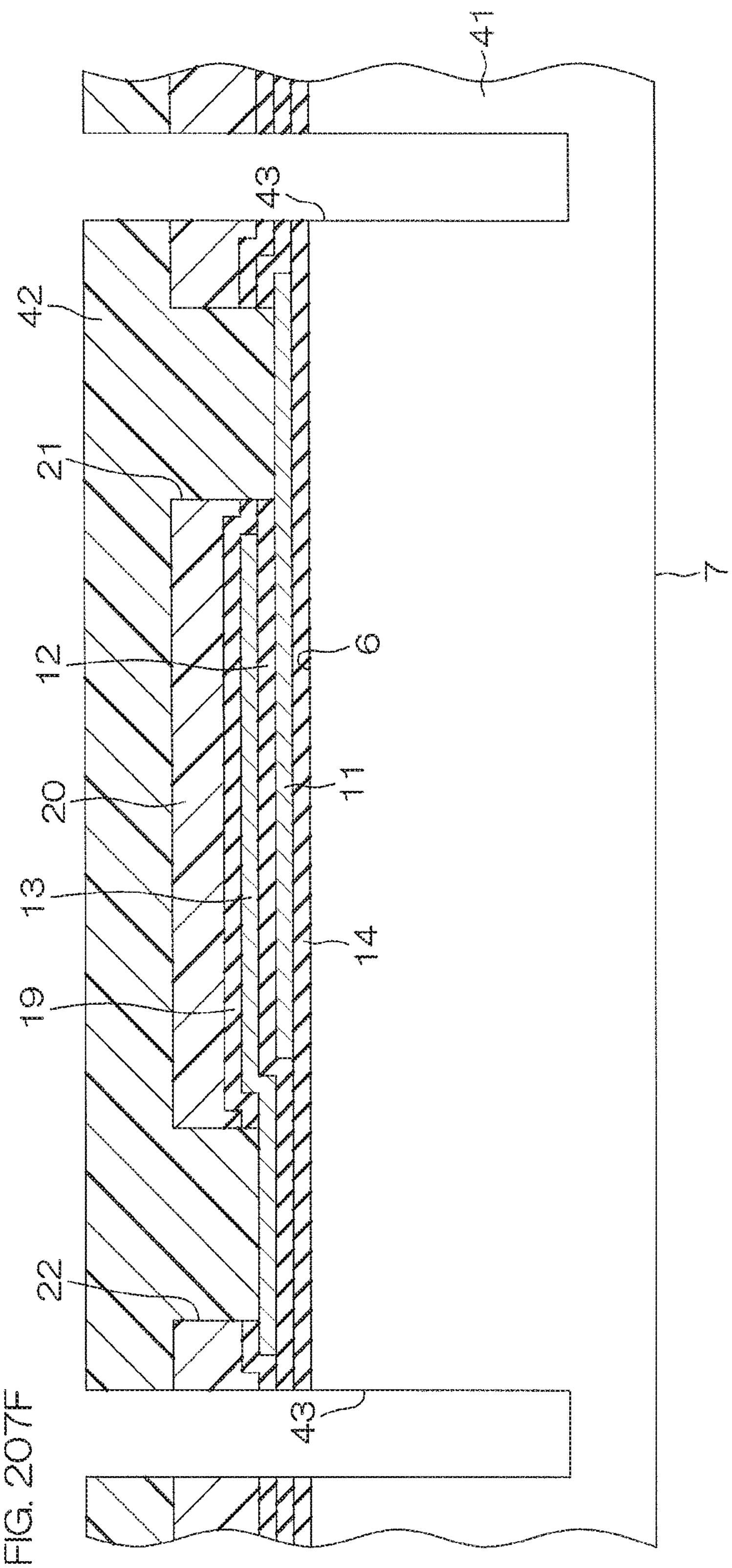

FIG. 207F is a cross-sectional view showing the step subsequent to FIG. 207E.

Figure 207G:
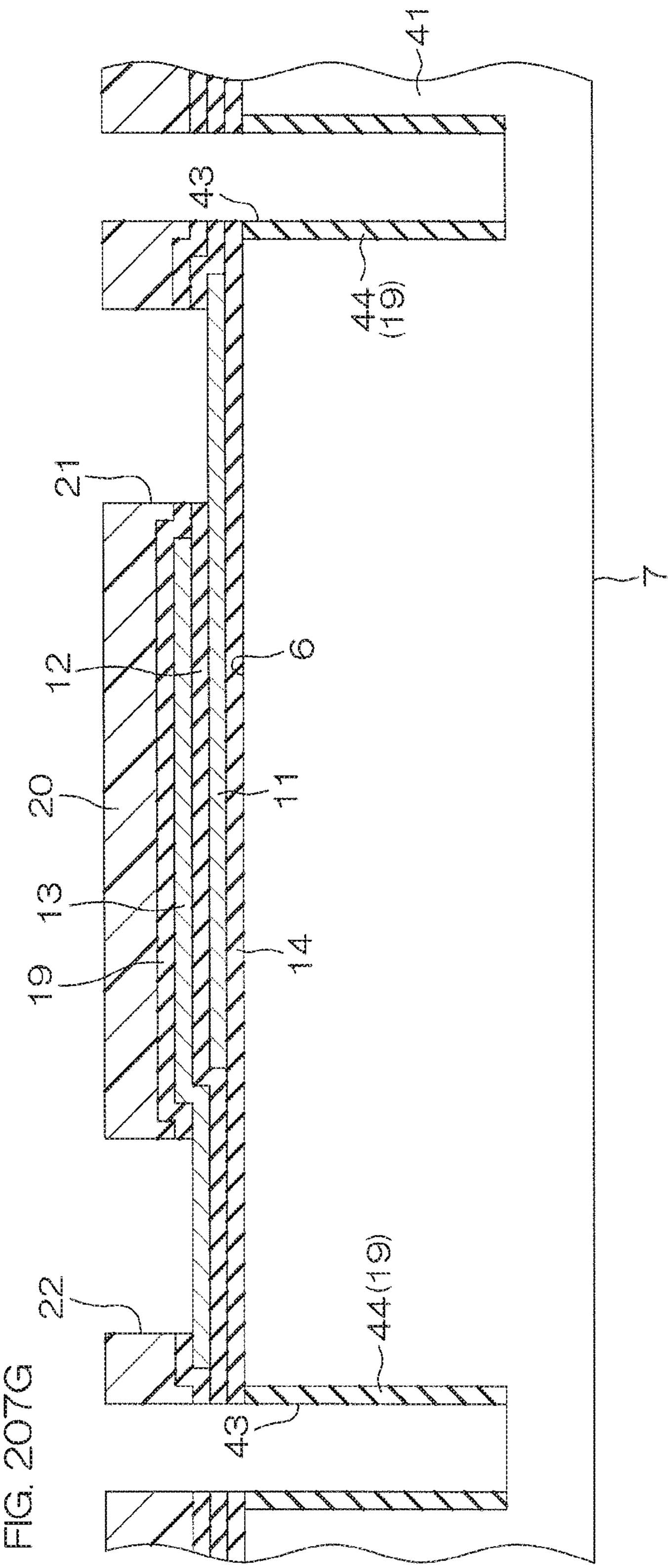

FIG. 207G is a cross-sectional view showing the step subsequent to FIG. 207F.

Figure 207H:
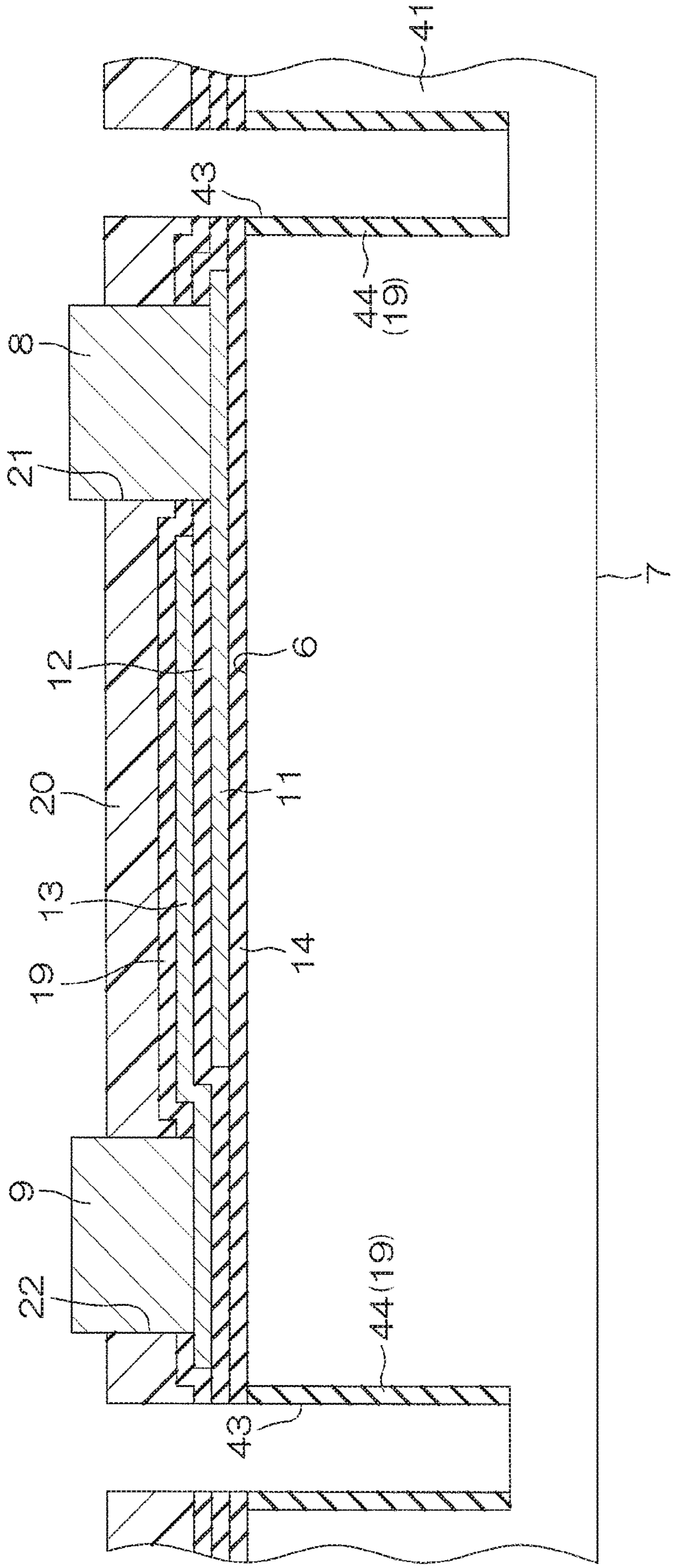
Figure 207:
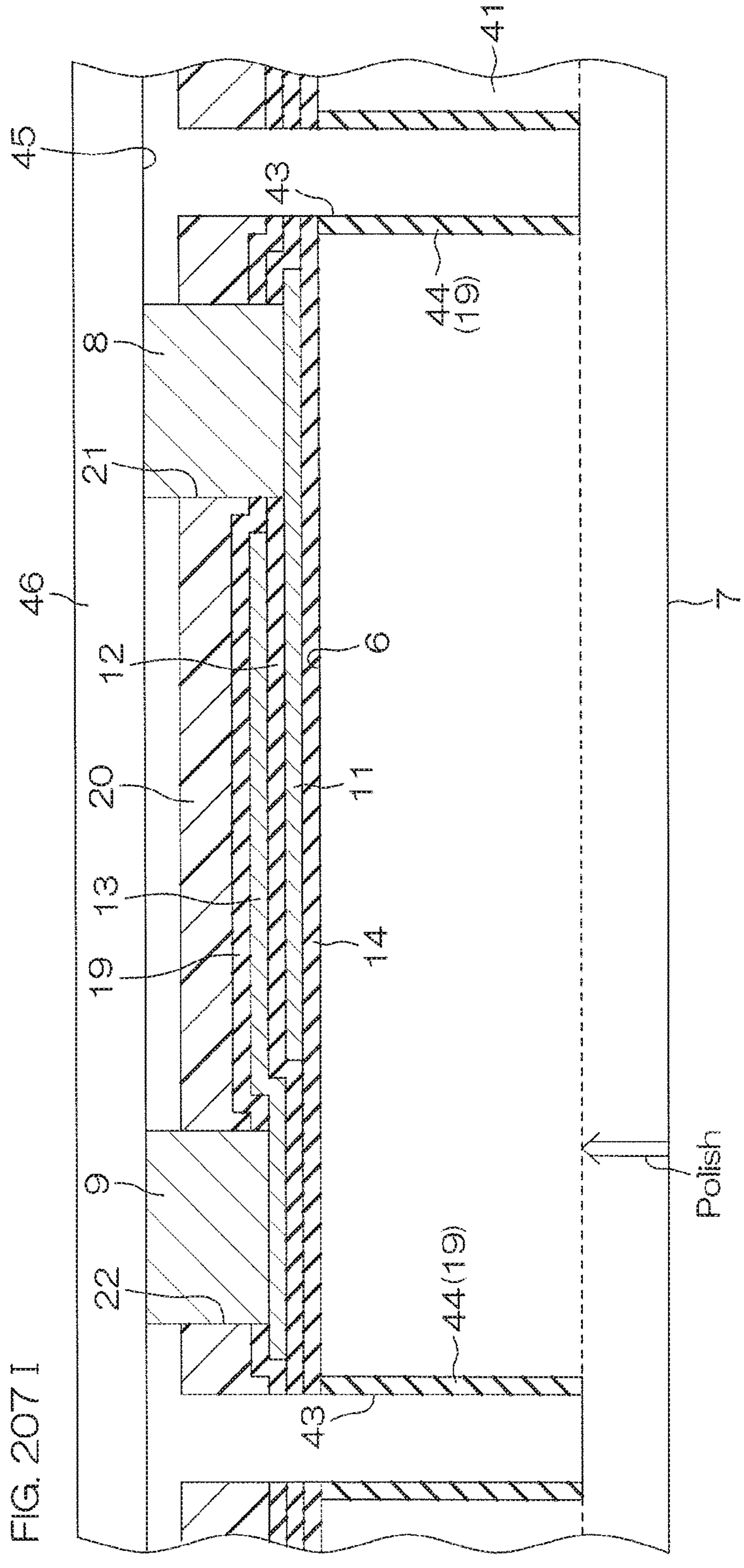

FIG. 207H is a cross-sectional view showing the step subsequent to FIG. 207G.

FIG. 207I is a cross-sectional view showing the step subsequent to FIG. 207H.

Figure 208:
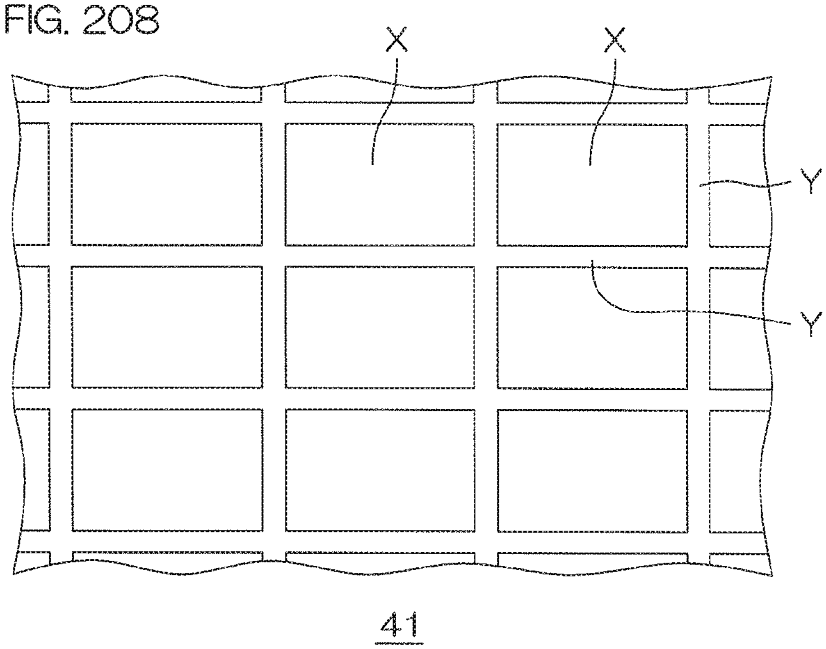

FIG. 208 is a schematic plan view of part of a base substrate where an insulating film is formed on the surface.

Figure 209A:
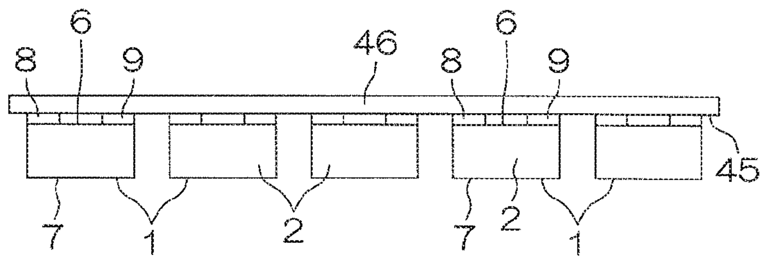

FIG. 209A is a cross-sectional view schematically showing the recovery step of the chip capacitor after the step of FIG. 207I.

Figure 209B:
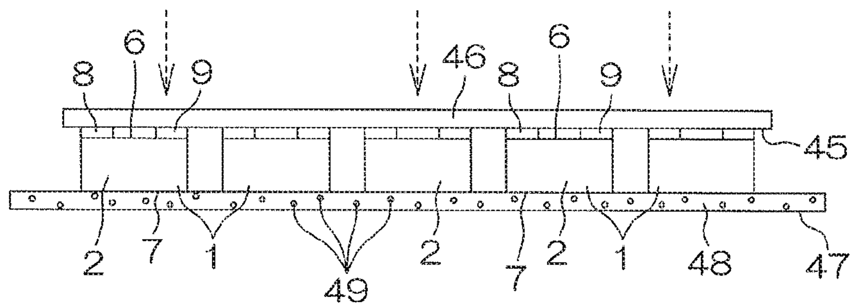

FIG. 209B is a cross-sectional view showing the step subsequent to FIG. 209A.

Figure 209C:
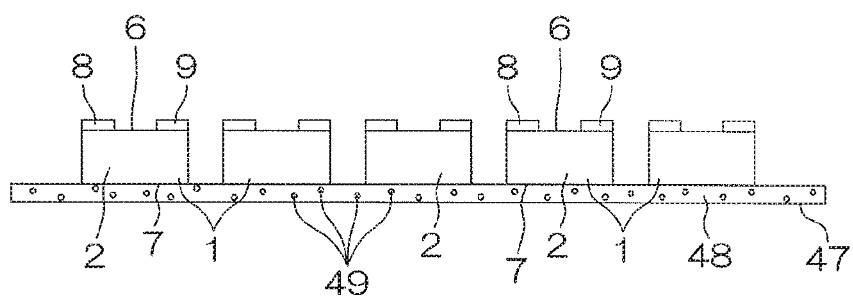

FIG. 209C is a cross-sectional view showing the step subsequent to FIG. 209B.

Figure 209D:
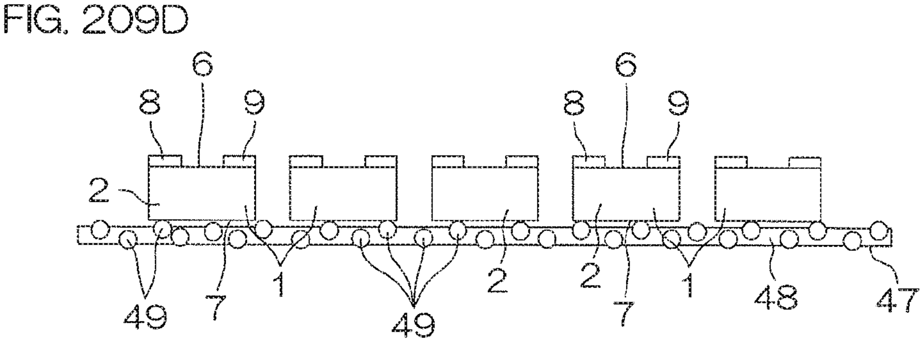

FIG. 209D is a cross-sectional view showing the step subsequent to FIG. 209C.

Figure 210A:
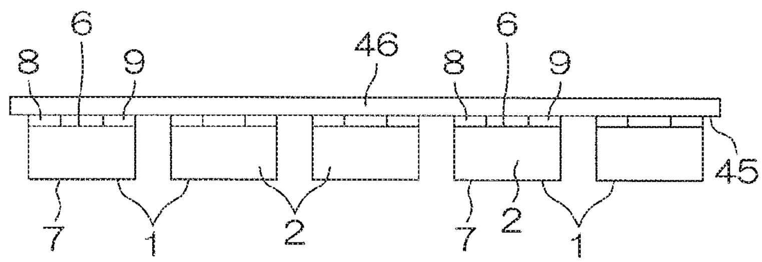

FIG. 210A is a cross-sectional view schematically showing another example of the recovery step of the chip capacitor after the step of FIG. 207I.

Figure 210B:
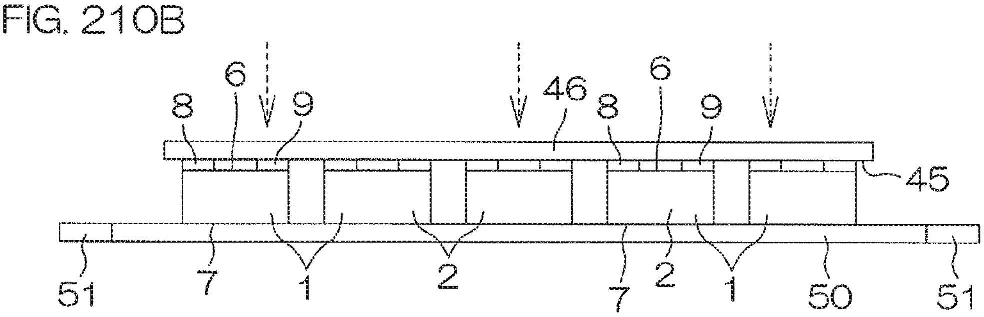

FIG. 210B is a cross-sectional view showing the step subsequent to FIG. 210A.

Figure 210C:
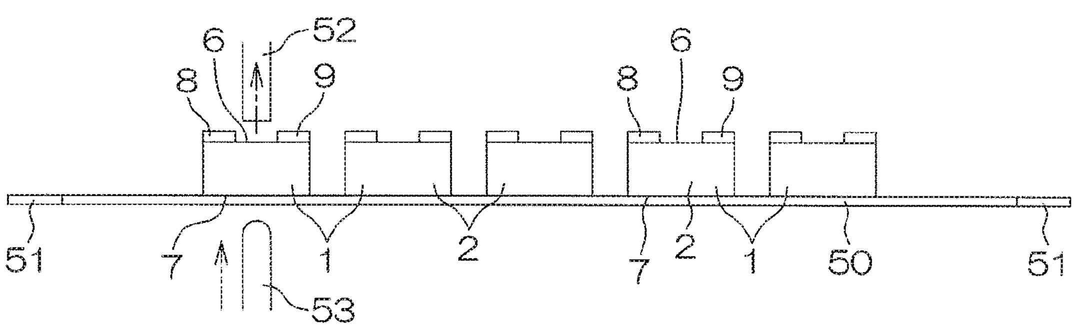

FIG. 210C is a cross-sectional view showing the step subsequent to FIG. 210B.

Figure 211:
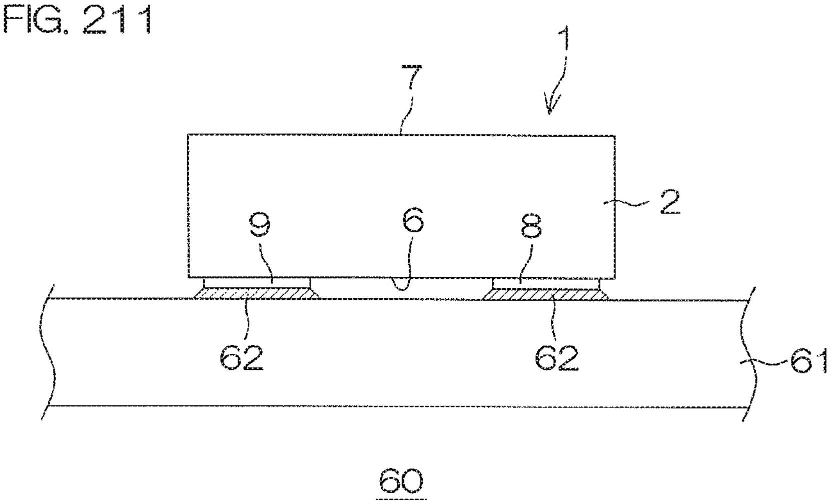

FIG. 211 is a cross-sectional view showing the arrangement of a circuit assembly in which the chip capacitor shown in FIG. 200 is flip-chip connected on the mounting substrate.

Figure 212:
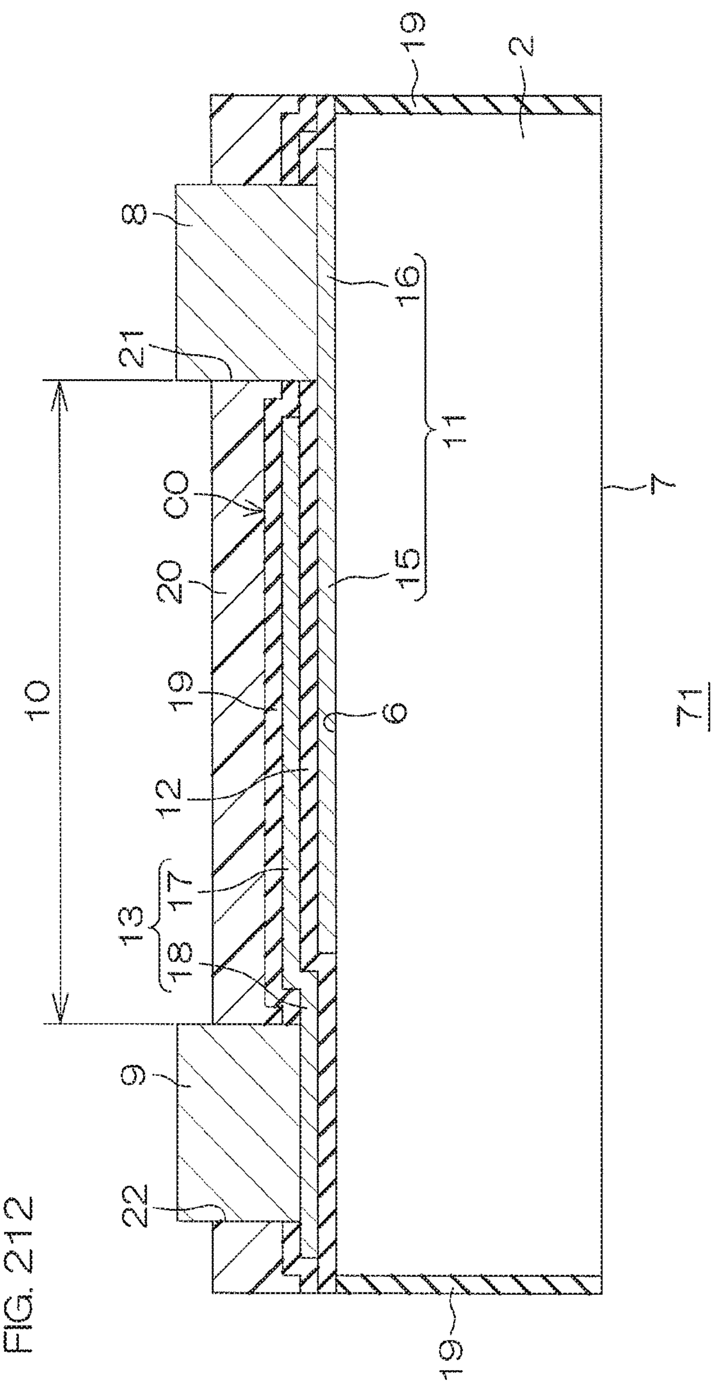

FIG. 212 is a schematic cross-sectional view of a chip capacitor according to a first modification example.

Figure 213:
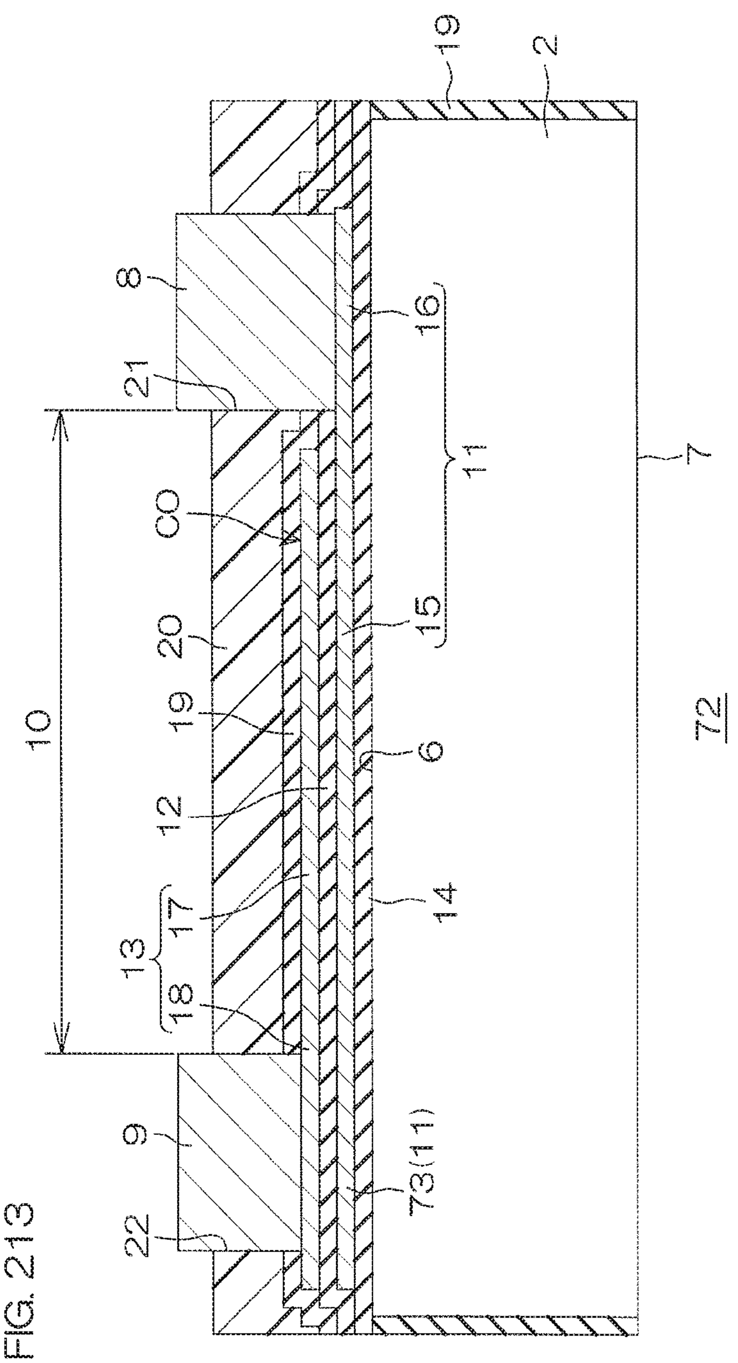

FIG. 213 is a schematic cross-sectional view of a chip capacitor according to a second modification example.

Figure 214:
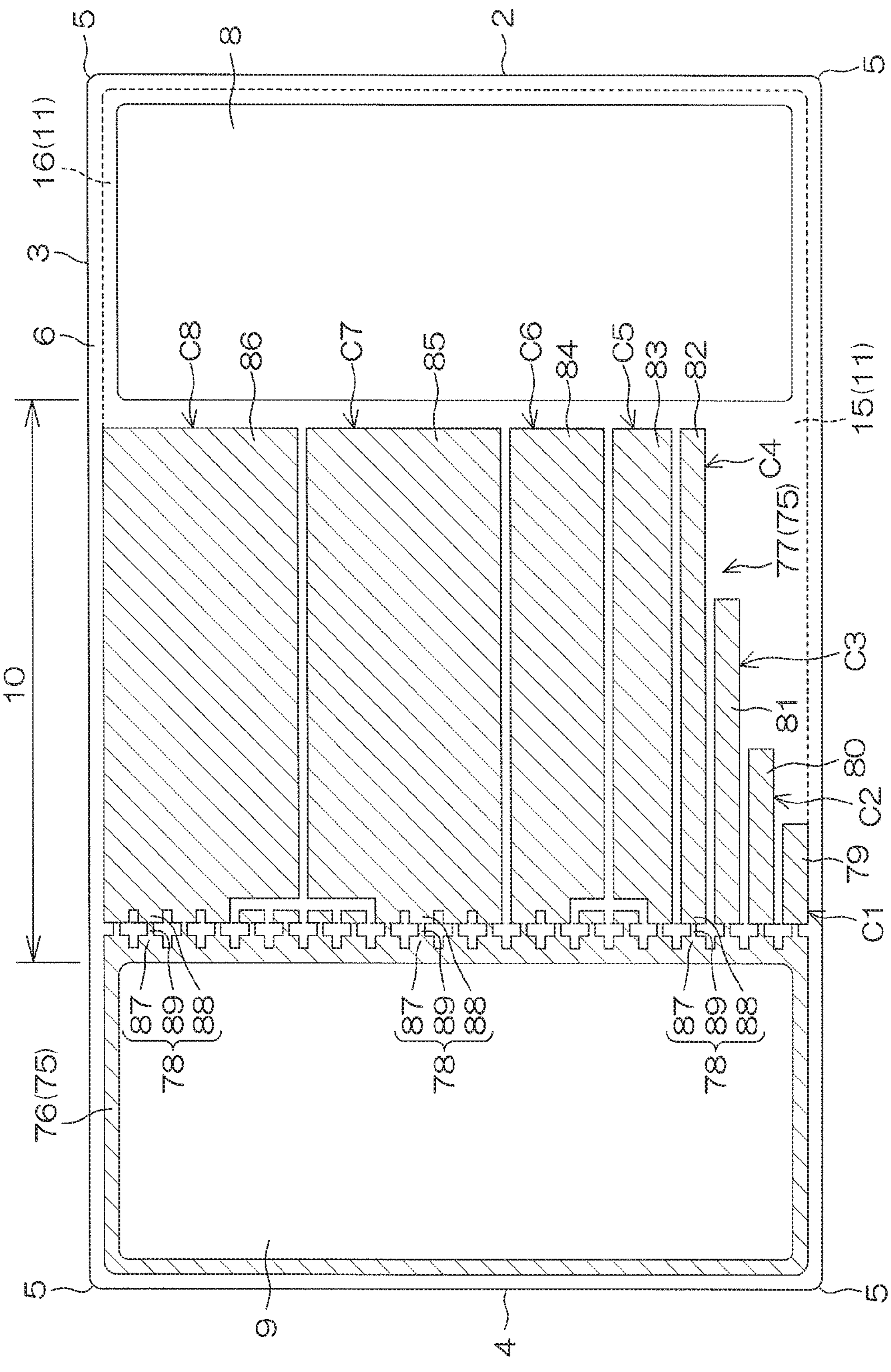

FIG. 214 is a schematic plan view of a chip capacitor according to a third modification example.

Figure 215:
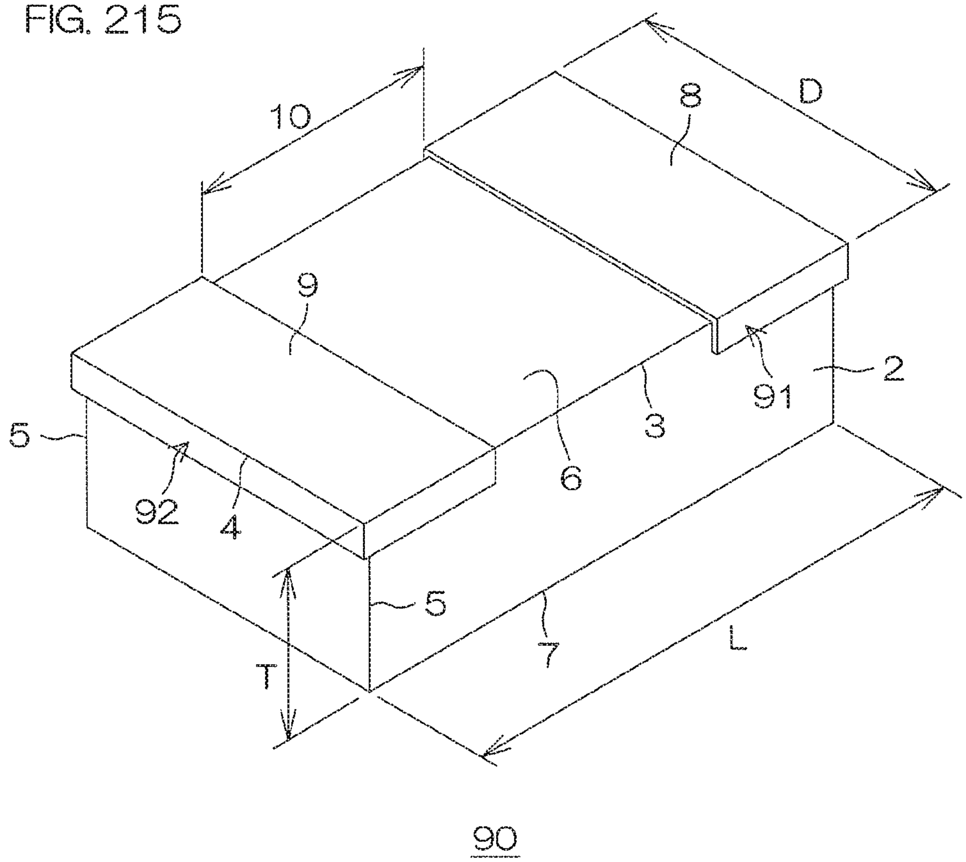

FIG. 215 is a schematic perspective view of a chip capacitor according to a fourth modification example.

Figure 216:
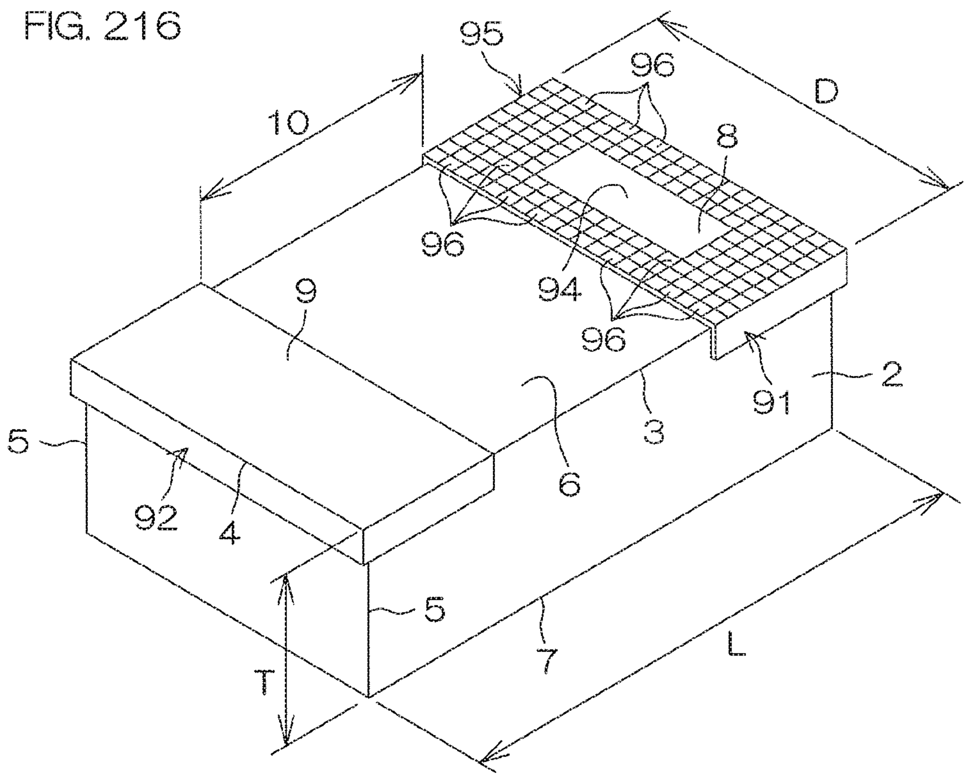

FIG. 216 is a schematic perspective view of a chip capacitor according to a fifth modification example.

DETAILED DESCRIPTION OF THE PREFERRED EMBODIMENTS

Preferred embodiments of first to eighth inventions will be described in detail below with reference to accompanying drawings.

[1] First Invention

Figure 1:
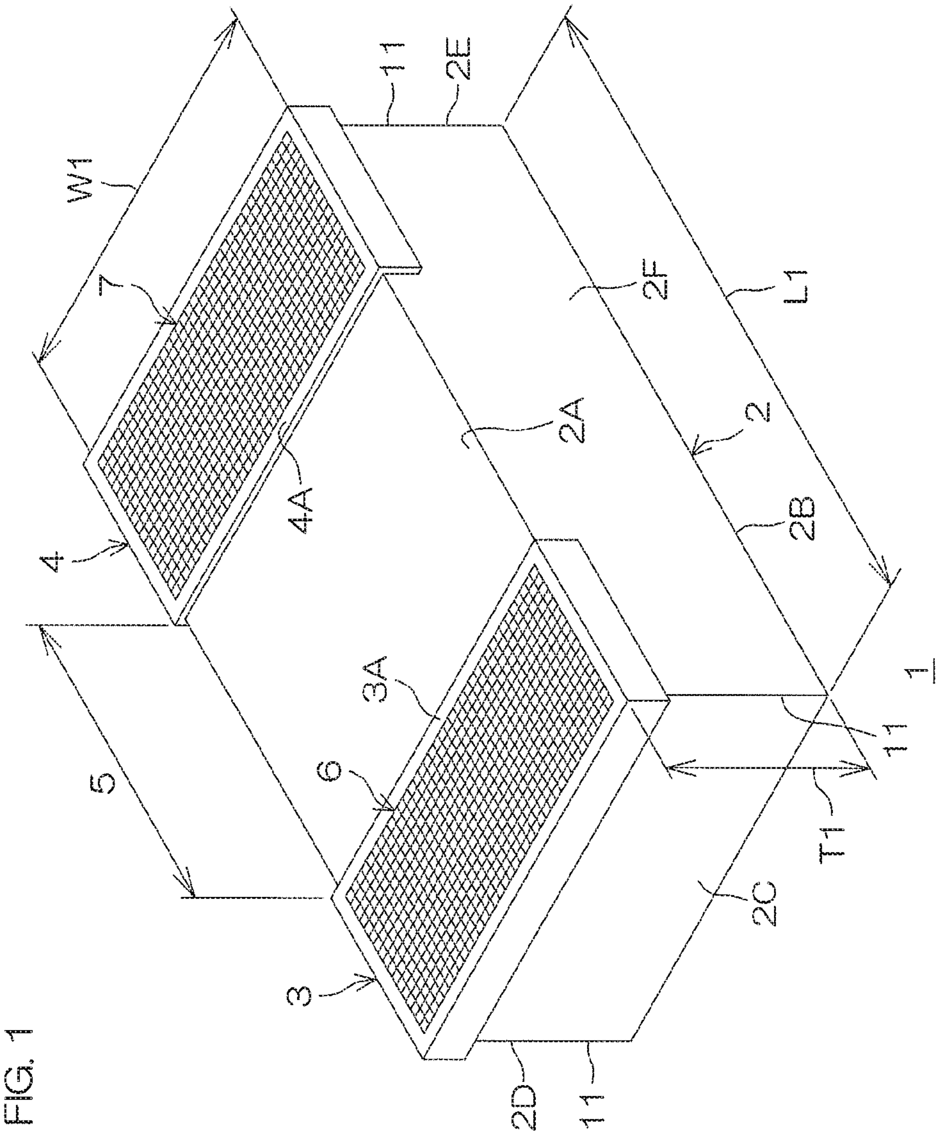
FIG. 1 is a schematic perspective view of a chip resistor according to a first preferred embodiment of a first invention.

FIG. 1 is a schematic perspective view of a chip resistor 1 according to the first preferred embodiment of the first invention.

The chip resistor 1 is a minute chip part. The chip resistor 1 is formed in the shape of a rectangular parallelepiped. The planar shape of the chip resistor 1 may be either rectangular or square. For example, the chip resistor 1 may be a rectangle (0103 chip) with its long and short sides perpendicular to each other respectively having 0.6 mm or less and 0.3 mm or less or may be a rectangle (0402 chip) with the long and short sides respectively having 0.4 mm or less and 0.2 mm or less. In the preferred embodiment, the chip resistor 1 is formed with a 03015 size having a length L1 of about 0.3 mm, a width W1 of about 0.15 mm and a thickness T1 of about 0.1 mm.

The chip resistor 1 mainly includes a substrate 2 that forms the main body of the chip resistor 1, a first connection electrode 3 and a second connection electrode 4 serving as external connection electrodes and an element region 5.

The substrate 2 is formed substantially in the shape of a rectangular parallelepiped (chip shape). In the substrate 2, one surface forming the upper surface in FIG. 1 is an element formation surface 2A. The element formation surface 2A is a surface where circuit elements are formed in the substrate 2. The surface on the opposite side to the element formation surface 2A in the direction of thickness of the substrate 2 is a rear surface 2B. The element formation surface 2A and the rear surface 2B have substantially the same dimensions and the same shapes and are parallel to each other. As the material of the substrate 2, a semiconductor substrate such as a silicon substrate may be used, a glass substrate may be used or a resin film may be used.

The substrate 2 has, as the surfaces other than the element formation surface 2A and the rear surface 2B, a plurality of side surfaces (a side surface 2C, a side surface 2D, a side surface 2E and a side surface 2F). The side surfaces extend and intersect (specifically, are perpendicular to) the element formation surface 2A and the rear surface 2B, and connect the element formation surface 2A and the rear surface 2B. In the preferred embodiment, the four side surfaces of the substrate 2 are formed as the side surface 2C, the side surface 2D, the side surface 2E, and the side surface 2F sequentially clockwise from the side surface including one short side of the substrate 2.

The first connection electrode 3 and the second connection electrode 4 are disposed at both end portions of the substrate 2 in the longitudinal direction on the element formation surface 2A of the substrate 2. The first connection electrode 3 and the second connection electrode 4 are exposed to the uppermost surface of the chip resistor 1, and are formed so as to cover the corner portions of the substrate 2 on the front surface side and to cross the boundaries between the element formation surface 2A and the side surfaces 2C to 2F from the element formation surface 2A. Specifically, the first connection electrode 3 and the second connection electrode integrally cover, at each of the end portions of the substrate 2, the three side surfaces in the element formation surface 2A and the end portions. Hence, each of corner portions 11 where the side surfaces intersect each other at both end portions of the substrate 2 in the longitudinal direction is individually covered with the first connection electrode 3 or the second connection electrode 4.

The first connection electrode 3 and the second connection electrode 4 are formed in the shape of a quadrangle in plan view when seen in a direction normal to the element formation surface 2A. More specifically, the substrate 2 is formed in the shape of a rectangle having a short side along the longitudinal direction of the substrate 2 and a long side along the lateral direction of the substrate.

Furthermore, in the main surfaces 3A and 4A of the first connection electrode 3 and the second connection electrode 4, external concave/convex structures 6 and 7 are formed, respectively. The main surfaces 3A and 4A are, when the chip resistor 1 is mounted on a mounting substrate (for example, a mounting substrate 54, which will be described later), surfaces opposite the mounting substrate. In the preferred embodiment, the external concave/convex structures 6 and 7 are formed substantially over the entire region of the main surfaces 3A and 4A, and regions where they are not formed are only the peripheral portions of the first connection electrode 3 and the second connection electrode 4.

The element region 5 is formed, in the element formation surface 2A of the substrate 2, between the first connection electrode 3 and the second connection electrode 4. In the element region 5, circuit elements are formed.

Figure 2:
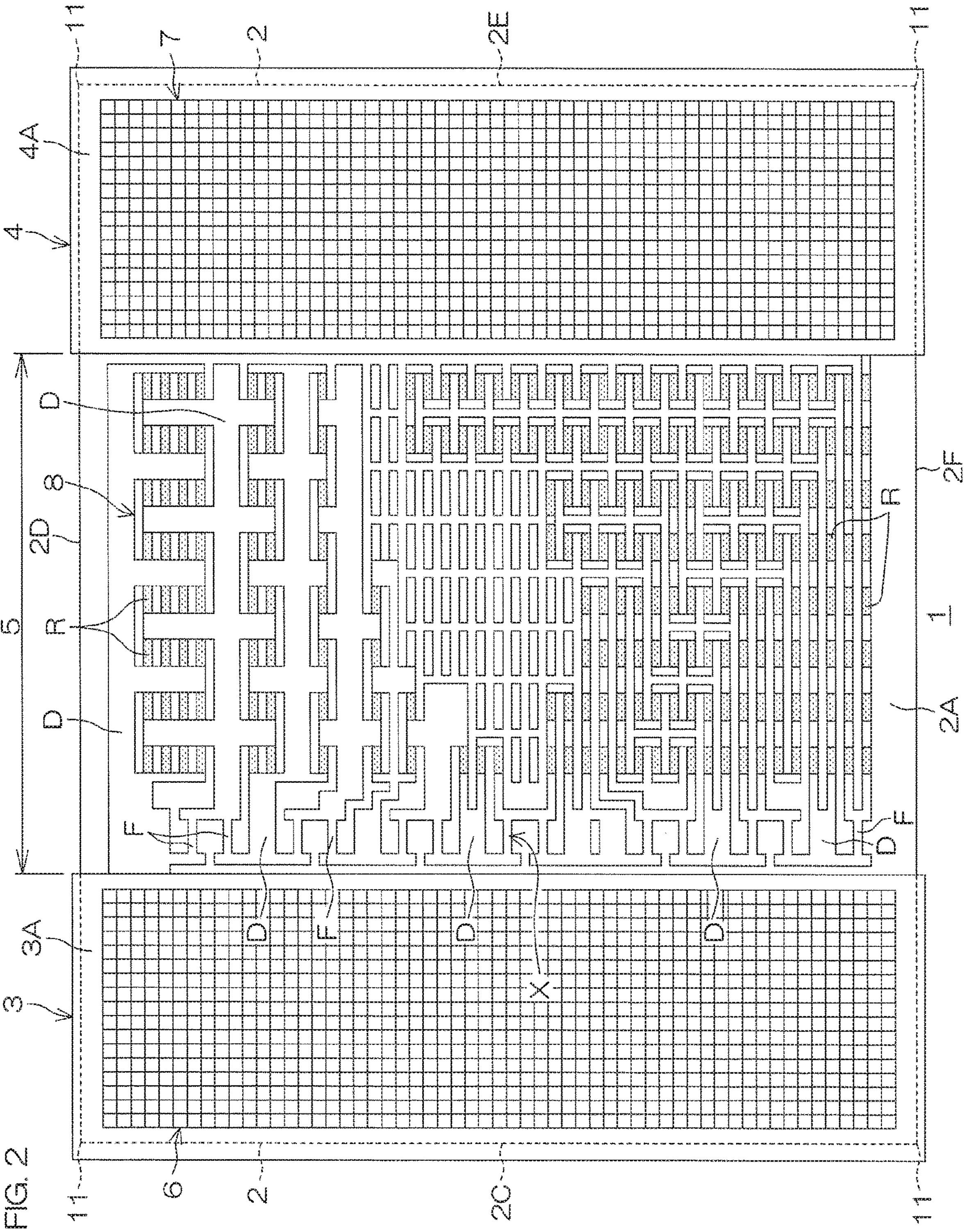
FIG. 2 is a schematic plan view of the chip resistor shown in FIG. 1.

FIG. 2 is a schematic plan view of the chip resistor 1 of FIG. 1. FIG. 2 mainly shows a positioning relationship between the first connection electrode 3, the second connection electrode 4 and the circuit element (resistor portion 8) and the planar arrangement of the resistor portion 8.

In the element region 5 of the chip resistor 1, as an example of the circuit element of the first invention, the resistor portion 8 is formed. The resistor portion 8 is formed with a resistor network where a plurality of (unit) resistor bodies R having equal resistance values are disposed in a matrix on the element formation surface 2A. The resistor body R is formed of TiN (titanium nitride), TiON (titanium oxide nitride), or TiSiON. The resistor portion 8 is, in the region on the substrate 2, connected between the first connection electrode 3 and the second connection electrode 4.

More specifically, the resistor portion 8 has a total of 352 resistor bodies R that are formed with 8 resistor bodies R arrayed along the row direction (the longitudinal direction of the substrate 2) and 44 resistor bodies R arrayed along the column direction (the width direction of the substrate 2. These resistor bodies R are a plurality of element components that form the resistor network of the resistor portion 8.

Among a large number of resistor bodies R described above, every predetermined number from 1 to 64 pieces, the resistor bodies R are connected collectively and electrically, and thus a plurality of types of resistor circuits are formed. The plurality of types of resistor circuits formed are connected with a conductor film D (wiring film formed with a conductor) into a predetermined aspect. Furthermore, on the element formation surface 2A of the substrate 2, a plurality of fuses F are provided which can be cut (blown) so that the resistor circuits are electrically incorporated into the resistor portion 8 or are electrically separated from the resistor portion 8. The plurality of fuses F and the conductor films D are arrayed along the inner side of the first connection electrode 3 such that the positioning region is formed in the shape of a straight line. More specifically, the plurality of fuses F and the conductor films D are disposed so as to be adjacent, and the direction of the alignment is formed in the shape of a straight line. The plurality of fuses F are connected such that a plurality of types of resistor circuits (a plurality of resistor bodies R per resistor circuit) can be cut (separated) from the first connection electrode 3.

Figure 3:
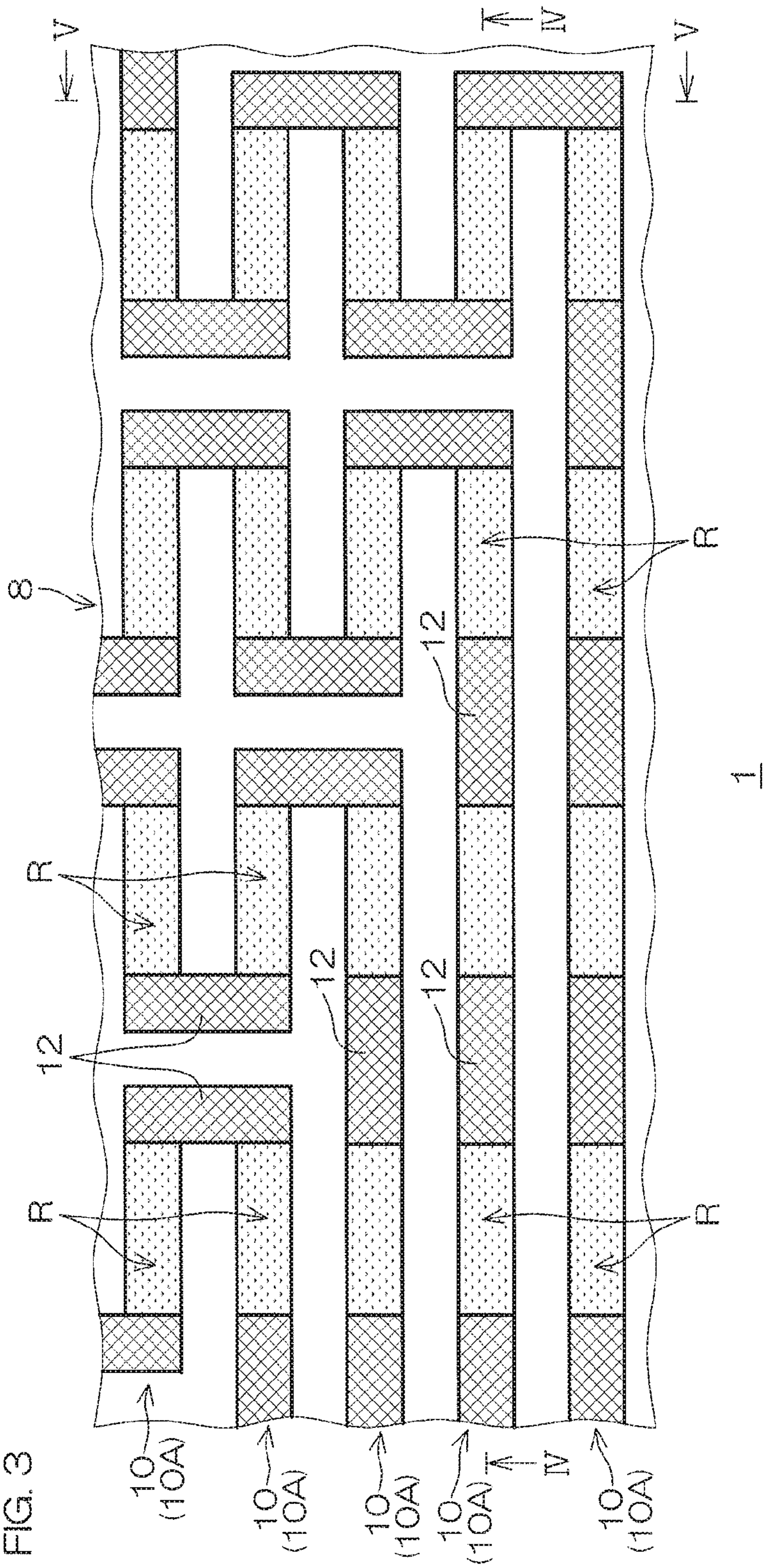
FIG. 3 is a partially enlarged view of the resistor portion of FIG. 2.
Figure 4:
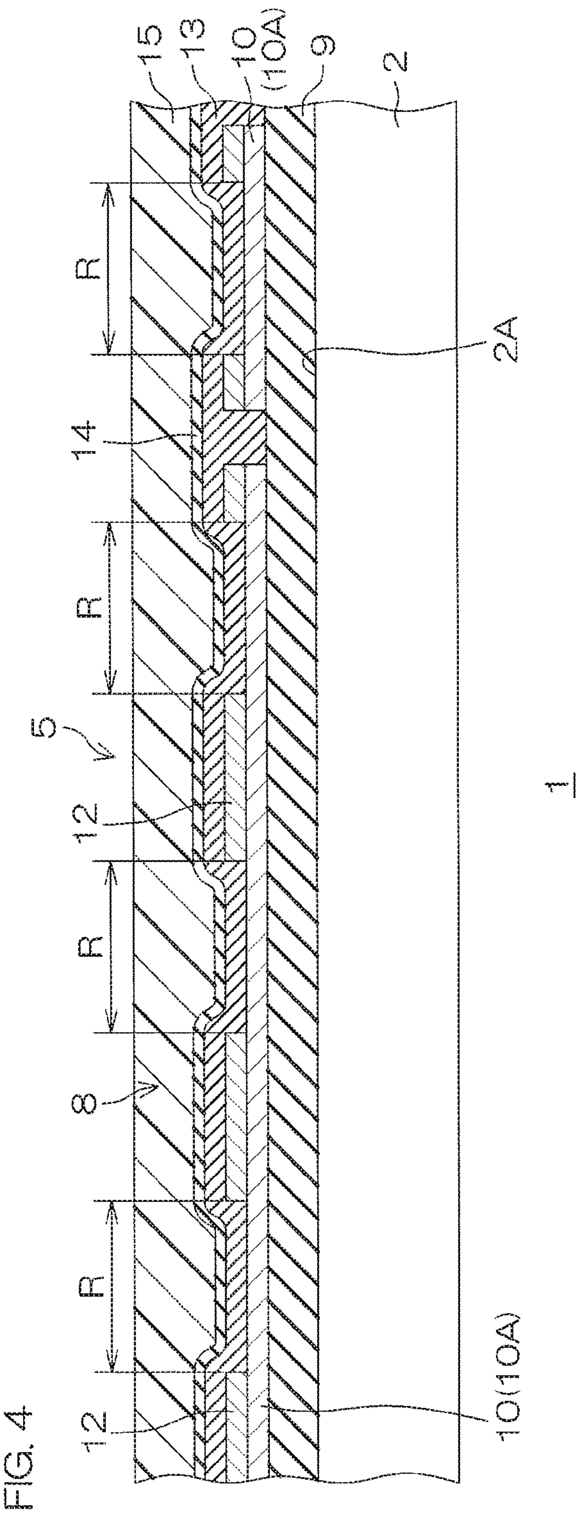
FIG. 4 is a cross-sectional view of the resistor portion taken along line IV-IV in FIG. 3.
Figure 5:
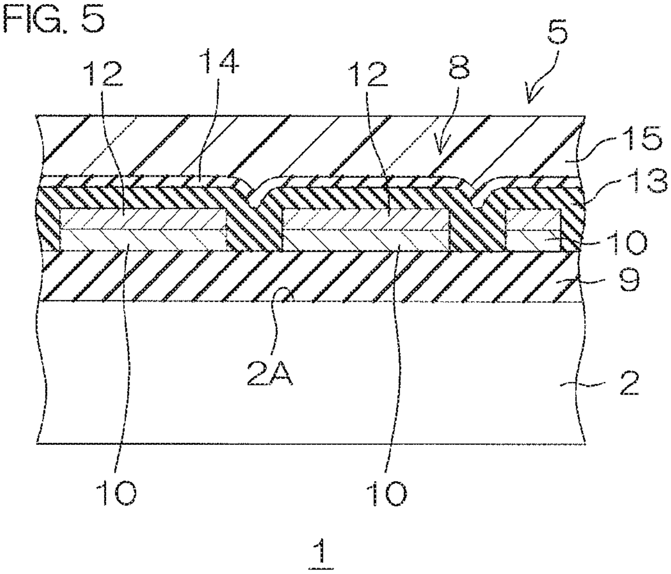
FIG. 5 is a cross-sectional view of the resistor portion taken along line V-V in FIG. 3.

FIG. 3 is a partially enlarged view of the resistor portion 8 of FIG. 2. FIG. 4 is a cross-sectional view of the resistor portion 8 taken along line IV-IV in FIG. 3. FIG. 5 is a cross-sectional view of the resistor portion 8 taken along line V-V in FIG. 3.

The chip resistor 1 includes a first insulating film 9, a resistor body film 10, a first wiring film 12, a second insulating film 13, a passivation film 14, and a resin film 15 formed on the element formation surface 2A of the substrate 2.

The first insulating film 9 is formed of, for example, an insulating material such as $SiO_2$ (silicon oxide). The thickness of the first insulating film 9 is, for example, 1.5 to 3.0 μm. The first insulating film 9 covers the entire region of the element formation surface 2A of the substrate 2. Although in the preferred embodiment, an example where the first insulating film 9 is formed with a single layer will be described, the insulating film may be formed with a plurality of layers.

The resistor body film 10 is formed on the first insulating film 9. The resistor body film 10 is formed of TiN, TiON, or TiSiON. The thickness of the resistor body film 10 is, for example, about 2000 angstroms. The resistor body film 10 forms a plurality of resistor body films (hereinafter referred to as "resistor body film lines 10A") that extend parallel in a straight line between the first connection electrode 3 and the second connection electrode 4. As shown in FIG. 3, the resistor body film line 10A may be cut at a predetermined position in a line direction.

On the resistor body film line 10A, the first wiring film 12 is formed. The first wiring film 12 is formed of Al (aluminum) or an alloy (Al—Cu alloy) of Al and Cu (copper). The thickness of the first wiring film 12 is about 8000 angstroms. The first wiring films 12 are laminated at a fixed interval R in the line direction on the resistor body film line 10A, and are in contact with the resistor body film line 10A.

The second insulating film 13 is formed on the first insulating film 9 so as to cover the first wiring film 12. The second insulating film 13 is formed of, for example, an insulating material such as SiN (silicon nitride). The thickness of the second insulating film 13 is, for example, 0.2 to 0.7 μm.

The passivation film 14 is formed on the second insulating film 13. The passivation film 14 is formed of, for example, an insulating material such as SiN (silicon nitride). The thickness of the passivation film 14 is, for example, 0.7 to 1.6 μm.

The resin film 15 is formed on the passivation film 14. The resin film 15 is formed of, for example, polyimide. The thickness of the resin film 15 is, for example, 3 to 10 μm.

Figure 6A:
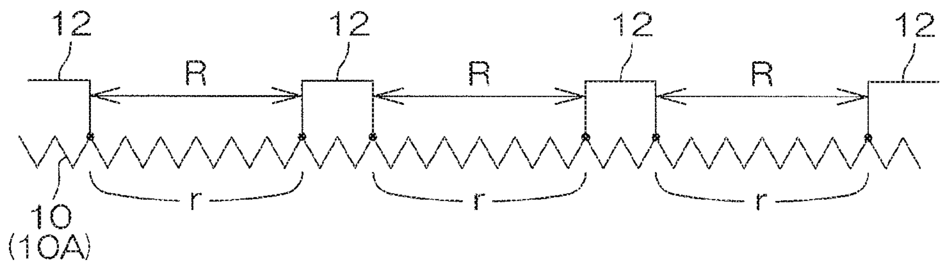
FIG. 6A is a circuit diagram showing the electrical characteristics of a resistor body film line and a first wiring film.
Figure 6B:
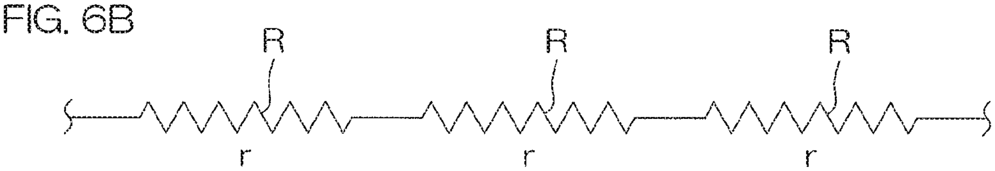
FIG. 6B is a circuit diagram showing the electrical characteristics of the resistor body film line and the first wiring film.
Figure 7:
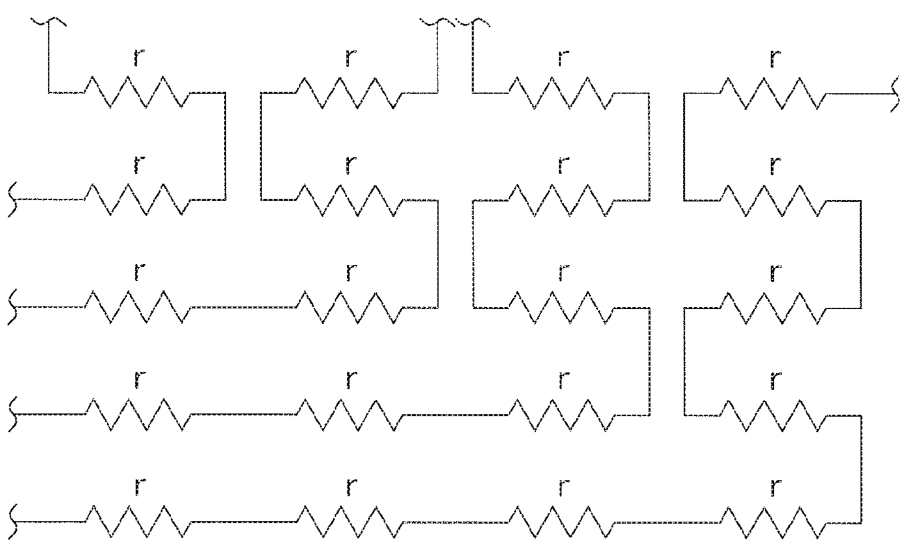
FIG. 7 is a circuit diagram showing the electrical characteristics of the resistor body film line and the first wiring film.

FIG. 6A is a circuit diagram showing the electrical characteristics of the resistor body film line 10A and the first wiring film 12. FIG. 6B is a circuit diagram showing the electrical characteristics of the resistor body film line 10A and the first wiring film 12. FIG. 7 is a circuit diagram showing the electrical characteristics of the resistor body film line 10A and the first wiring film 12.

As shown in FIG. 6A, the region having the fixed interval R in the resistor body film line 10A individually forms one resistor body R having a predetermined resistance value r. On the other hand, in the region where the first wiring film 12 is laminated in the resistor body film line 10A, the first wiring film 12 electrically connects the resistor bodies R adjacent to each other, and thus the resistor body film line 10A is short-circuited by the first wiring film 12. Hence, the resistor circuit that is formed with the resistor bodies R of the resistance value r shown in FIG. 6B and connected in series is formed.

Since the adjacent resistor body film lines 10A are connected with the resistor body film 10 and the first wiring film 12, the resistor network of the resistor portions 8 shown in FIG. 3 forms the resistor circuit shown in FIG. 7 (formed with the unit resistors of the resistor bodies R described above). As described above, the resistor body film 10 and the first wiring film 12 form the resistor bodies R and the resistor circuit (that is, the resistor portion 8). The resistor bodies R include the resistor body film lines 10A (resistor body films 10) and a plurality of first wiring films 12 that are laminated on the resistor body film line 10A at the fixed interval R in the line direction, and a part of the resistor body film line 10A in the fixed interval R where the first wiring film 12 is not laminated forms one resistor body R. The parts of the resistor body film line 10A forming the resistor bodies R are all equal in shape and size. Hence, a large number of resistor bodies R arrayed in the matrix on the substrate 2 have equal resistance values.

The first wiring films 12 laminated on the resistor body film line 10A form the resistor bodies R and also function as the conductor films D that connect a plurality of resistor bodies R to form the resistor circuit (see FIG. 2).

Figure 8:
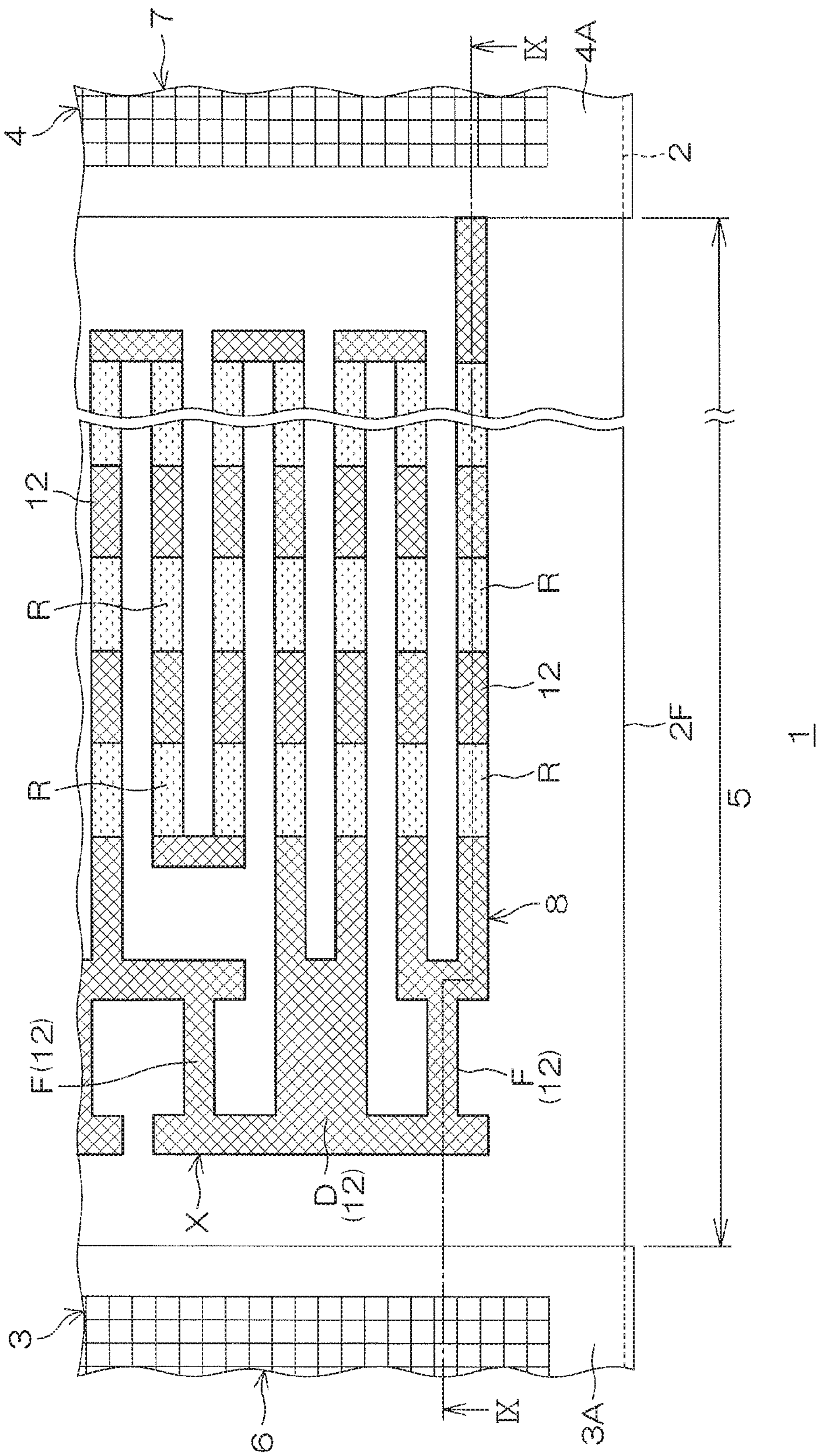
FIG. 8 is a partially enlarged view of the chip resistor of FIG. 2.
Figure 9:
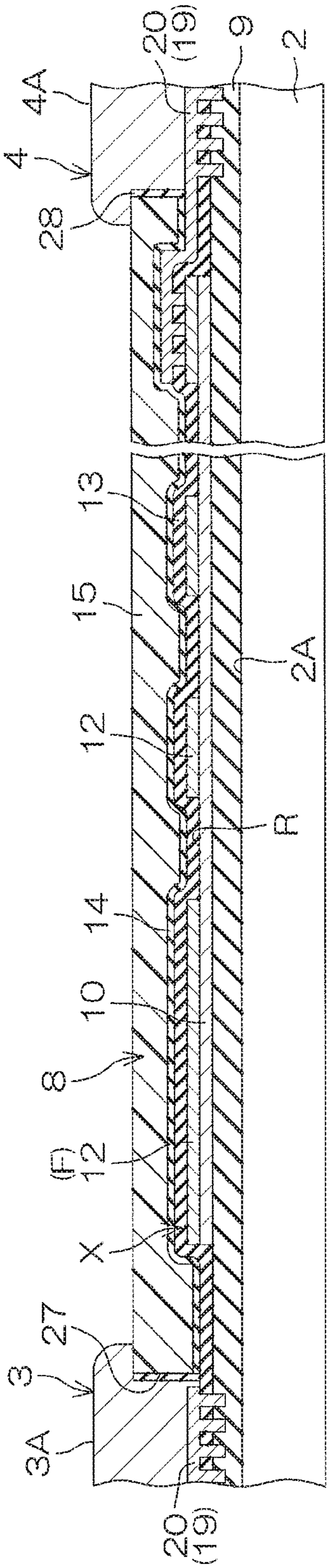
FIG. 9 is a cross-sectional view of the chip resistor taken along line IX-IX in FIG. 8.

FIG. 8 is a partially enlarged view of the chip resistor 1 of FIG. 2. FIG. 9 is a cross-sectional view of the chip resistor 1 taken along line IX-IX in FIG. 8. It should be noted that FIG. 9 does not show the external concave/convex structure 6 of the first connection electrode 3 and the external concave/convex structure 7 of the second connection electrode 4.

The fuse F and the conductor film D described above are also formed with the first wiring film 12 laminated on the resistor body film 10 forming the resistor bodies R. In other words, in the same layer as the first wiring film 12 laminated on the resistor body film line 10A forming the resistor bodies R, the fuse F and the conductor film D are formed of Al, which is the same metal material as the first wiring film 12, or an Al—Cu alloy. Since as described above, the first wiring film 12 forms the resistor circuit, the first wiring film 12 is also used as the conductor film D that electrically connects the plurality of resistor bodies R.

In other words, in the same layer laminated on the resistor body film 10, the wiring film for forming the resistor bodies R, the fuses F, and the conductor films D are formed, as the first wiring film 12, of the same metal material (Al or an Al—Cu alloy). The fuse F differs (is distinguished) from the first wiring film 12 in that the fuse F is formed to be thin so as to be easily cut and that other circuit elements are not disposed around the fuse F.

The region of the first wiring film 12 where the fuses F are disposed is referred to as a trimming region X (see FIGS. 2 and 8). The trimming region X is a region in the shape of a straight line along the inner side of the first connection electrode 3, and in the trimming region X, not only the fuses F but also the conductor films D are disposed. The resistor body film 10 is also formed below the first wiring film 12 in the trimming region X (see FIG. 9). The fuse F is a wiring (separated from the surrounding) in which as compared with the parts of the first wiring film 12 other than the trimming region X, the wiring-to-wiring distance is large.

The fuses F may indicate not only the part of the first wiring film 12 but also a combination (fuse element) of the part of the resistor bodies R (the resistor body film 10) and the part of the first wiring film 12.

Although only the case where the same layer as the conductor film D is used for the fuse F is described, another conductor film may be further laminated on the conductor film D to lower the resistance value of the entire conductor film D. Even in this case, the fusing property of the fuse F is not degraded as long as a conductor film is not laminated on the fuse F.

Figure 10:
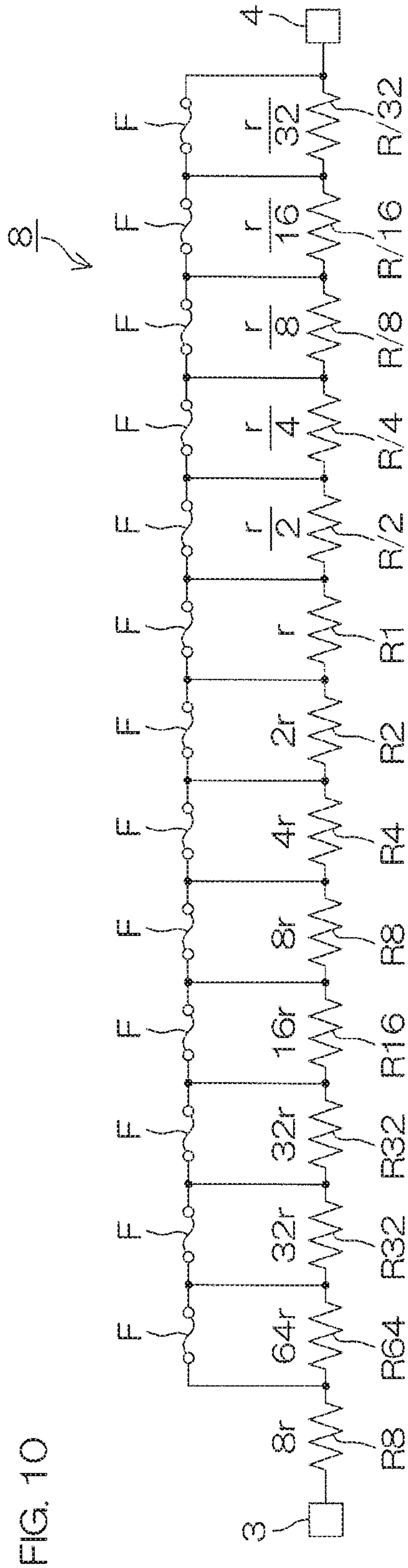
FIG. 10 is an example of a circuit diagram arranged with the resistor body film line and the first wiring film.

FIG. 10 is an example of a circuit diagram arranged with the resistor body film line 10A and the first wiring film 12.

In FIG. 10, the resistor portion 8 is formed by connecting a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16, and a resistor circuit R/32, in series, in this order. Each of the reference resistor circuit R8 and the resistor circuits R64 to R2 is formed by connecting, in series, the same number of resistor bodies R as the number at the end of itself (in the case of R64, the number is "64"). The resistor circuit R1 is formed with one resistor body R. Each of the resistor circuits R/2 to R/32 is formed by connecting, in parallel, the same number of resistor bodies R as the number at the end of itself (in the case of R/32, the number is "32"). The meaning of the number at the end of the resistor circuit is the same as in FIGS. 11 and 12, which will be described later.

One fuse F is provided for each of the resistor circuits R64 to R/32 other than the reference resistor circuit R8, and those fuses F are connected in parallel to those resistor circuits. The fuses F are mutually connected in series either directly or through the conductor film D (see FIG. 8).

As shown in FIG. 10, in a state where no fuses F are blown, the resistor portion 8 forms the resistor circuit of the reference resistor circuit R8 formed with 8 resistor bodies R provided between the first connection electrode 3 and the second connection electrode 4 and connected in series. For example, when it is assumed that the resistance value r of one resistor body R is r=8Ω, the chip resistor 1 to which the first connection electrode 3 and the second connection electrode 4 are connected is formed by the resistor circuit (reference resistor circuit R8) of 8r=64Ω.

In a state where no fuses F are blown, a plurality of types of resistor circuits other than the reference resistor circuit R8 are short-circuited. Specifically, although the 13 resistor circuits R 64 to R/32 of 12 types are connected in series to the reference resistor circuit R8, since the resistor circuits are short-circuited by the fuses F connected in parallel, the resistor circuits are not incorporated into the resistor portion 8 in terms of electricity.

In the chip resistor 1 according to the preferred embodiment, the fuses F are selectively blown by, for example, laser light according to the required resistance value. In this way, the resistor circuits in which the fuses F connected in parallel are blown are incorporated into the resistor portion 8. Hence, the entire resistance value of the resistor portion 8 can be set at a resistance value that is obtained by connecting in series and incorporating the resistor circuits corresponding to the blown fuses F.

In particular, a plurality of types of resistor circuits include a plurality of types of serial resistor circuits in which the resistor bodies R having equal resistance values are connected while the number of resistor bodies R is being increased geometrically with a geometric ratio of 2 such that 1 piece, 2 pieces, 4 pieces, 8 pieces, 16 pieces, 32 pieces . . . are connected in series and a plurality of types of parallel resistor circuits in which the resistor bodies R having equal resistance values are connected while the number of resistor bodies R is being increased geometrically with a geometric ratio of 2 such that 2 pieces, 4 pieces, 8 pieces, 16 pieces . . . are connected in parallel. Hence, the fuses F (including the fuse element described above) are selectively blown, and thus the resistance value of the entire resistor portion 8 is finely and digitally adjusted to be an arbitrary resistance value, with the result that the resistor portion of a desired value can be produced in the chip resistor 1.

Figure 11:
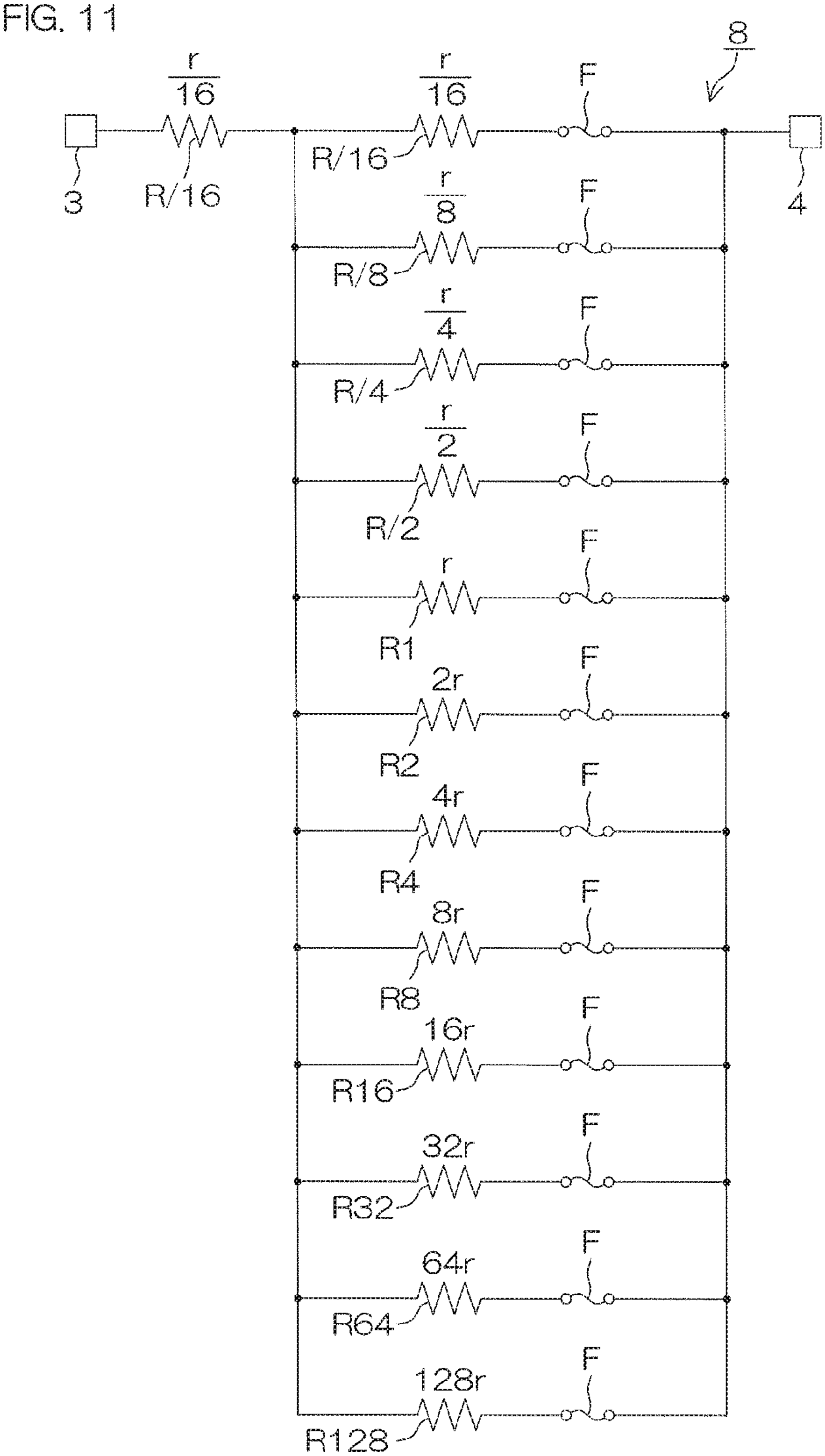
FIG. 11 is another example of the circuit diagram arranged with the resistor body film line and the first wiring film.

FIG. 11 is another example of the circuit diagram arranged with the resistor body film line 10A and the first wiring film 12.

Instead of forming the resistor portion 8 by connecting, in series, the reference resistor circuit R8 and the resistor circuits R64 to R/32 as shown in FIG. 10, as shown in FIG. 11, the resistor portion 8 may be formed. Specifically, between the first connection electrode 3 and the second connection electrode 4, the resistor portion 8 may be formed with a serial connection circuit of a reference resistor circuit R/16 and a parallel connection circuit of 12 types of resistor circuits R/16, R/8, R/4, R/2, R1, R2, R4, R8, R16, R32, R64, and R128.

In this case, the fuse F is connected in series to each of the 12 types of resistor circuits other than the reference resistor circuit R/16. In a state where no fuses F are blown, the resistor circuits are electrically incorporated into the resistor portion 8. The fuses F are selectively blown by, for example, laser light according to the required resistance value, and thus the resistor circuits (the resistor circuits to which the fuses F are connected in series) corresponding to the blown fuses F are electrically separated from the resistor portion 8, with the result that the resistance value of the entire chip resistor 1 can be adjusted.

Figure 12:
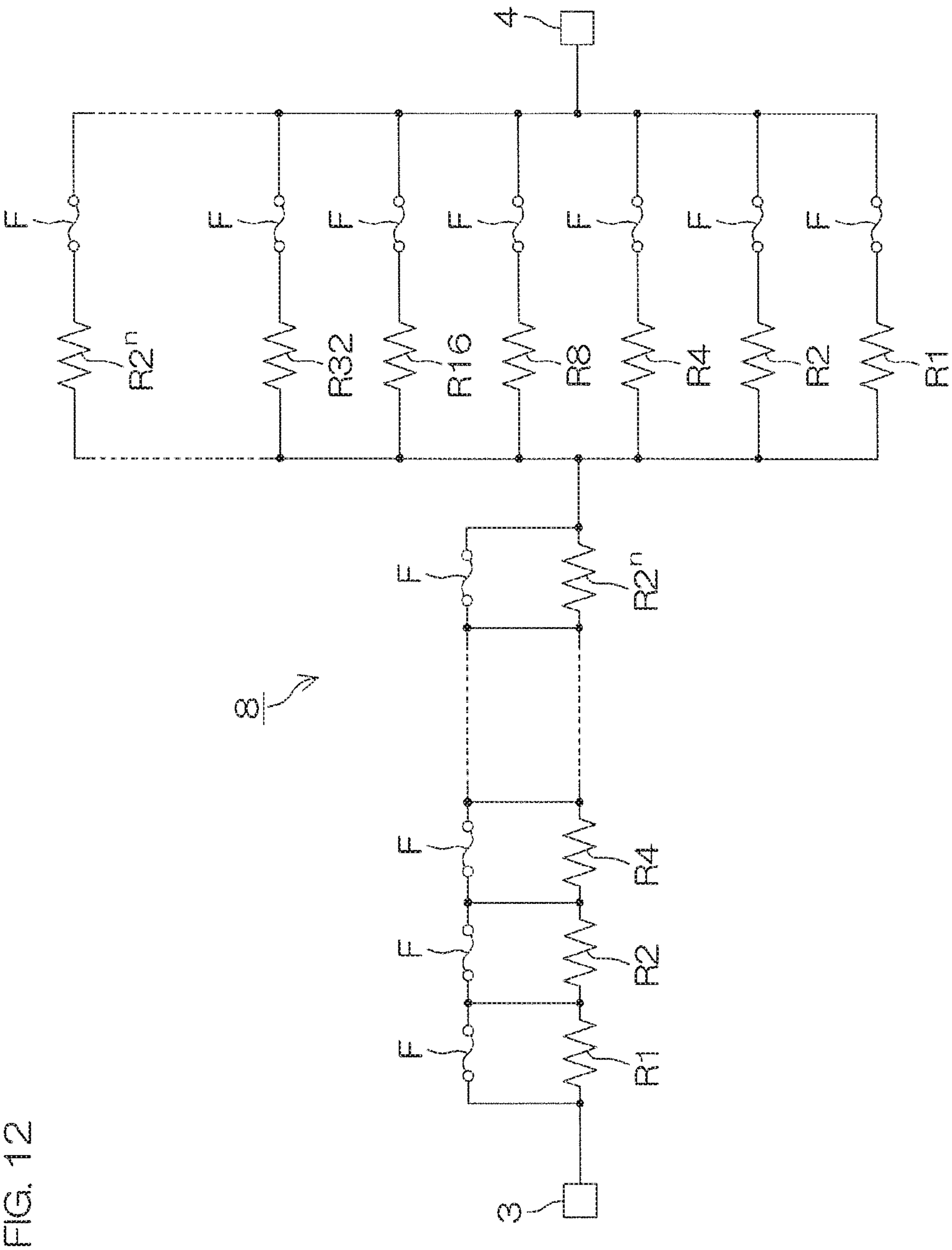
FIG. 12 is yet another example of the circuit diagram arranged with the resistor body film line and the first wiring film.

FIG. 12 is yet another example of the circuit diagram arranged with the resistor body film line 10A and the first wiring film 12.

The feature of the resistor portion 8 shown in FIG. 12 is a circuit arrangement in which a serial connection of a plurality of types of resistor circuits and a parallel connection of a plurality of types of resistor circuits are connected in series. In the plurality of types of resistor circuits connected in series, as in the form described previously, the fuse F is connected in parallel to each of the resistor circuits, and all the types of the plurality of resistor circuits connected in series are short-circuited by the fuses F. Hence, when the fuse F is blown, the resistor circuit short-circuited by the blown fuse F is electrically incorporated into the resistor portion 8.

On the other hand, the fuse F is connected in series to each of the plurality of types of resistor circuits connected in parallel. Hence, the fuse F is blown, and thus it is possible to electrically separate the resistor circuit to which the blown fuse F is connected in series from the parallel connection of the resistor circuits.

In the arrangement described above, for example, small resistors of 1 kΩ or less are produced on the side of the parallel connection, and the resistor circuits of 1 kΩ or more are produced on the side of the serial connection, and thus the resistor circuits in a wide range from small resistors of a few ohms to large resistors of a few mega ohms can be produced with a resistor network formed with the same basic design. That is, in the chip resistor 1, one or a plurality of fuses F are selectively cut, and thus it is possible to easily and quickly cope with a plurality of types of resistor values. In other words, a plurality of resistor bodies R having different resistance values are combined, and thus it is possible to realize the chip resistors 1 of various resistance values with the common design.

As described above, in the chip resistor 1, the state of the connection of a plurality of resistor bodies R (resistor circuit) can be changed in the trimming region X.

The cross-sectional structure (in particular, the structure of an electrode region 16) of the chip resistor 1 will then be described in further detail with reference to FIGS. 13 and 14.

Figure 13:
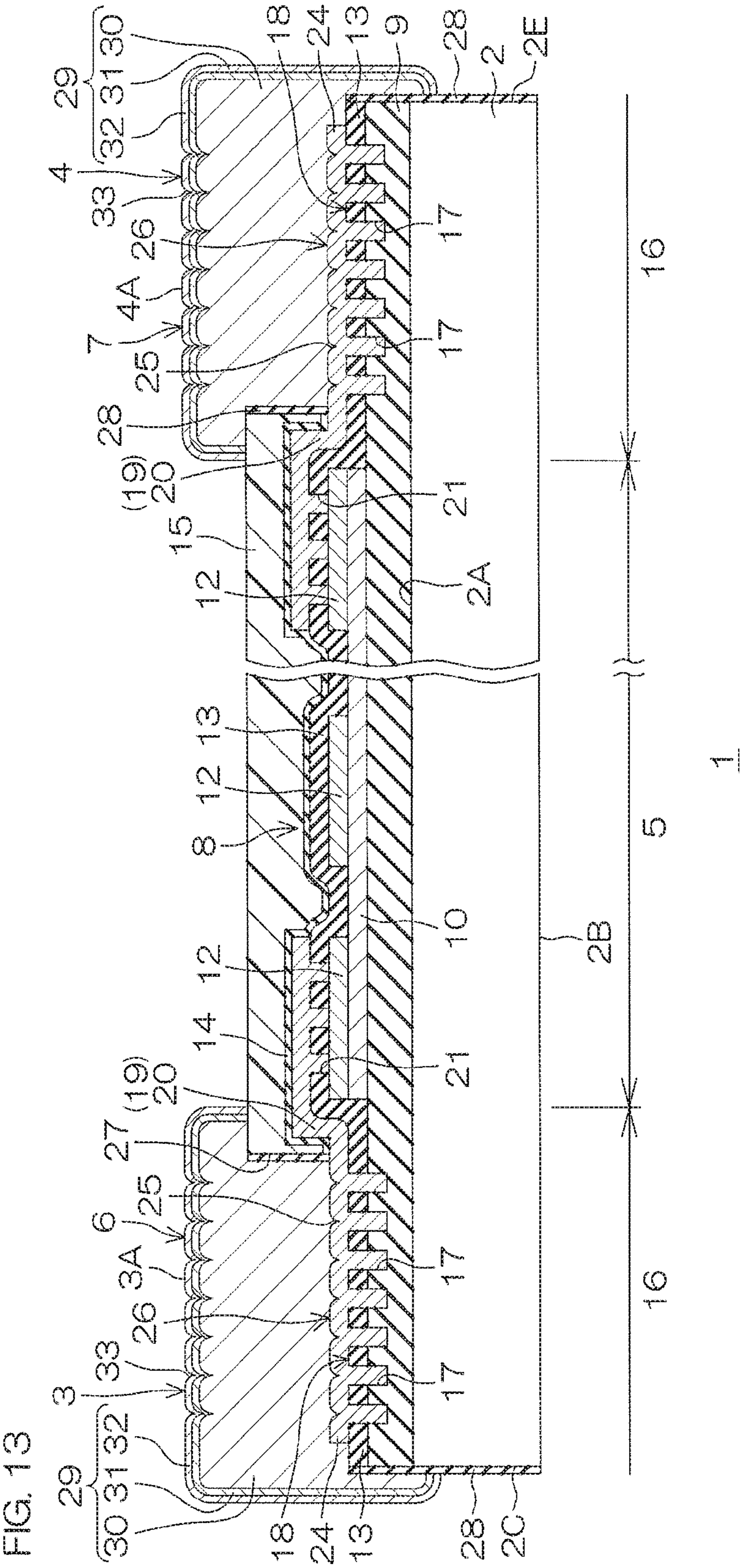
FIG. 13 is a schematic cross-sectional view of the chip resistor of FIG. 1.

FIG. 13 is a schematic cross-sectional view of the chip resistor 1 of FIG. 1. FIG. 14 is a partially enlarged view of the chip resistor 1 of FIG. 13. FIG. 13 fragmentally shows the cross-sectional structure of the characteristic part of the chip resistor 1, and it should be noted that FIG. 13 does not show a cross section taken along a specific line of the chip resistor 1.

In the chip resistor 1, in the electrode region 16 immediately below the first connection electrode 3 and the second connection electrode 4, a plurality of concave portions 17 are formed that pass through the second insulating film 13 and that extend halfway along the direction of thickness of the first insulating film 9. In other words, one concave portion 17 is defined by continuously forming the concave portion of the first insulating film 9 and the through hole of the second insulating film 13. In the preferred embodiment, the plurality of concave portions 17 are arranged in a matrix in plan view when seen in a direction normal to the element formation surface 2A. In this way, in each electrode region 16, an internal concave/convex structure 18 formed by the aggregation of a plurality of concave portions 17 is formed. Each of the concave portions 17 is formed in the shape of a square having a planar size of 4 μm×4 μm, and is disposed at an interval of 4 μm from the adjacent concave portion 17. The depth of each of the concave portions 17 is, for example, 0.5 to 1.5 μm (preferably, about 0.8 μm). The concave portion 17 does not need to be formed in the shape of a square, and may be formed in the shape of, for example, a rectangle, a triangle, a circle, an ellipse, a polygon or the like.

On the second insulating film 13, a second wiring film 19 is formed. The second wiring film 19 is formed of Al (aluminum) or an alloy (Al—Cu alloy) of Al and Cu (copper). The thickness of the second wiring film 19 is about 8000 angstroms. In the preferred embodiment, the second wiring film 19 includes a resistor wiring film 20 that electrically connects the first connection electrode 3 and the resistor body films 10 and that electrically connects the second connection electrode 4 and the resistor body films 10.

The resistor wiring film 20 is formed so as to extend from the element region 5 through the boundary between the element region 5 and the electrode region 16 to the electrode region 16.

In the element region 5, the resistor wiring film 20 is connected as a via through a through hole 21 formed in the second insulating film 13 to the first wiring film 12. By the connection, an electrical connection between the resistor wiring film 20 and the resistor body film 10 is achieved.

On the other hand, in the electrode region 16, the resistor wiring film 20 is extended into the concave portion 17 of the internal concave/convex structure 18. More specifically, as shown in FIG. 14, the resistor wiring film 20 integrally includes an embedding portion 22 that is completely embedded in the concave portion 17 (that is, that completely fills the concave portion 17) and a surface layer portion 23 that covers the internal concave/convex structure 18 along the surface of the second insulating film 13. In other words, the resistor wiring film 20 includes, as parts of the first connection electrode 3 and the second connection electrode 4, an anchor portion 24 that is embedded in the direction of thickness of an insulating film (in the preferred embodiment, the first insulating film 9 and the second insulating film 13) and that is fixed.

In the surface of the anchor portion 24, an intermediate concave/convex structure 26 formed with a plurality of concave portions 25 is formed. The concave portions 25 are disposed in positions opposite the concave portions 17 of the internal concave/convex structure 18 in a one-to-one manner. In other words, the plurality of concave portions 25 are also disposed in a matrix in plan view, and are disposed immediately above the concave portions 17. In the preferred embodiment, the plurality of concave portions 25 are formed in the surface portion of the surface layer portion 23 of the anchor portion 24, and its bottom portion is located in a position higher than the surface of the second insulating film 13.

The passivation film 14 and the resin film 15 are formed on the second wiring film 19. The passivation film 14 selectively covers the part on the element region 5 of the second wiring film 19. In the electrode region 16, the second wiring film 19 (the anchor portion 24) is exposed.

As with the passivation film 14, the resin film 15 is selectively formed on the element region 5 such that the anchor portion 24 is exposed. The end surface of the resin film 15 and the end surface of the passivation film 14 form an end surface 27 that is continuously flat. The anchor portion 24 is exposed to a region between the end surface 27, and the side surfaces 2C and 2E of the substrate 2 in a state where the anchor portion 24 is drawn from the passivation film 14 and the resin film 15. The anchor portion 24 is disposed in a position displaced inwardly of the substrate 2 with respect to the side surfaces 2C to 2F of the substrate 2, and a constant clearance 36 (for example, 3 to 6 μm) is provided between the end surface of the anchor portion 24 and the side surfaces 2C to 2F.

Furthermore, the chip resistor 1 includes a passivation film 28 that is formed on the end surface 27 of the resin film 15 and the side surfaces 2C to 2F of the substrate 2. The passivation film 28 is formed of, for example, an insulating material such as SiN (silicon nitride). The thickness of the passivation film 28 is, for example, 0.2 to 1.5 μm.

Each of the first connection electrode 3 and the second connection electrode 4 includes not only the anchor portion 24 but also an external connection portion 29. The external connection portion 29 is formed so as to cover the end portion of the resin film 15 and the side surfaces 2C to 2F of the substrate 2. In the side surfaces 2C to 2F, the passivation film 28 prevents the external connection portion 29 and the substrate 2 from being short-circuited.

The external connection portion 29 includes a Ni layer 30, a Pd layer 31, and an Au layer 32 from the side of the substrate 2 in this order. The external connection portion 29 includes a laminated structure formed with the Ni layer 30, the Pd layer 31, and the Au layer 32 not only in a region on the element formation surface 2A but also in a region on the side surfaces 2C to 2F. In the external connection portion 29, the Ni layer 30 covers a large proportion thereof, and the Pd layer 31 and the Au layer 32 are formed so as to be much thinner than the Ni layer 30.

As described above, since in the external connection portion 29, the surface of the Ni layer 30 is covered by the Au layer 32, the Ni layer 30 can be prevented from being oxidized. Even if the Au layer 32 is thinned, and thus a through hole (pin hole) is formed in the Au layer 32, since the Pd layer 31 inserted between the Ni layer 30 and the Au layer 32 blocks the through hole, it is possible to prevent the Ni layer 30 from being exposed through the through hole to the outside and oxidized.

In the surface of the external connection portion 29, external concave/convex structures 6 and 7 formed with a plurality of concave portions 33 are formed. The concave portions 33 are disposed in positions opposite the concave portions 17 of the internal concave/convex structure 18 in a one-to-one manner. In other words, the plurality of concave portions 33 are also arrayed in a matrix in plan view, and are disposed immediately above the concave portions 17. When as in the preferred embodiment, the electrode (the external connection portion 29) is formed with a plurality of metal layers, the plurality of concave portions 33 are not selectively formed only on the metal layer (in the preferred embodiment, the Au layer 32) of the uppermost surface. The concave portions 33 are formed by stacking, in a plurality of stages, the concave portions of substantially the same shape from the surface of the metal layer (in the preferred embodiment, the Ni layer 30) of the lowermost layer.

Figure 14:
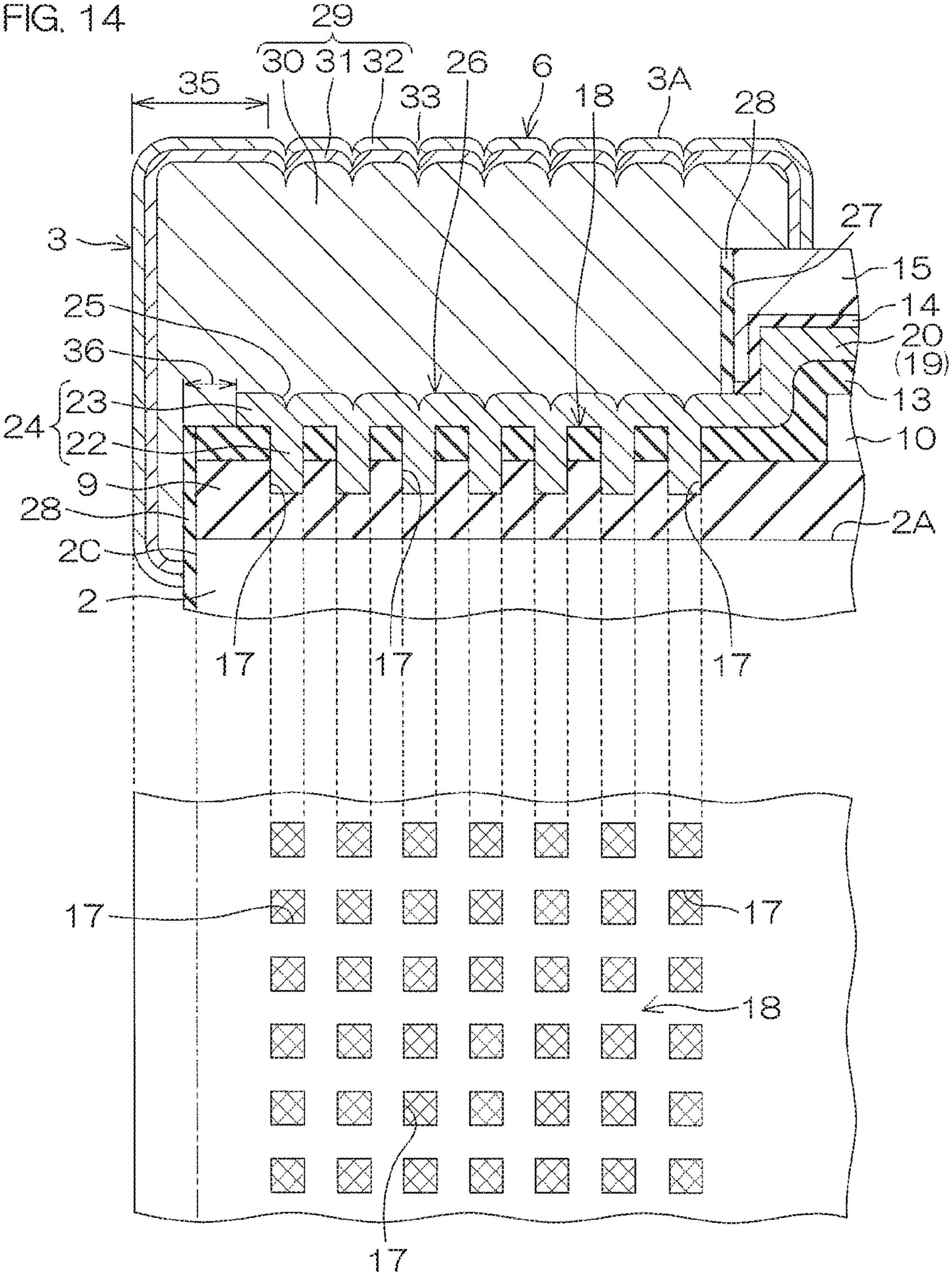
FIG. 14 is a partially enlarged view of the chip resistor of FIG. 13.

In the external connection portion 29, between the external concave/convex structures 6 and 7, and the peripheral edge of the external connection portion 29 (the peripheral edge of the electrode), a constant clearance 35 is provided (see FIG. 14). As described later, the external concave/convex structures 6 and 7 are not formed in such a concave/convex shape by etching processing on the uppermost surface, but is formed in a concave/concave shape by using the shapes of the internal concave/convex structure 18 and the intermediate concave/convex structure 26 previously formed (see FIG. 15L). The anchor portion 24 having the intermediate concave/convex structure 26 has a clearance 36 between itself and the side surfaces 2C to 2F of the substrate 2 in terms of preventing contact with the substrate 2. Hence, in the external connection portion 29, the clearance 35 (peripheral portion) whose surface is flat is formed in a region on the clearance 36 where at least a concave/convex shape is not formed. Since the concave portions are decreased in size as the concave/convex shape is received from the internal concave/convex structure 18, the amount of recess of the concave portions 33 in the external concave/convex structures 6 and 7 is less than the amount of recess of the internal concave/convex structure 18.

FIGS. 15A to 15M are diagrams showing part of a manufacturing step of the chip resistor 1 of FIG. 13.

Figure 15A:
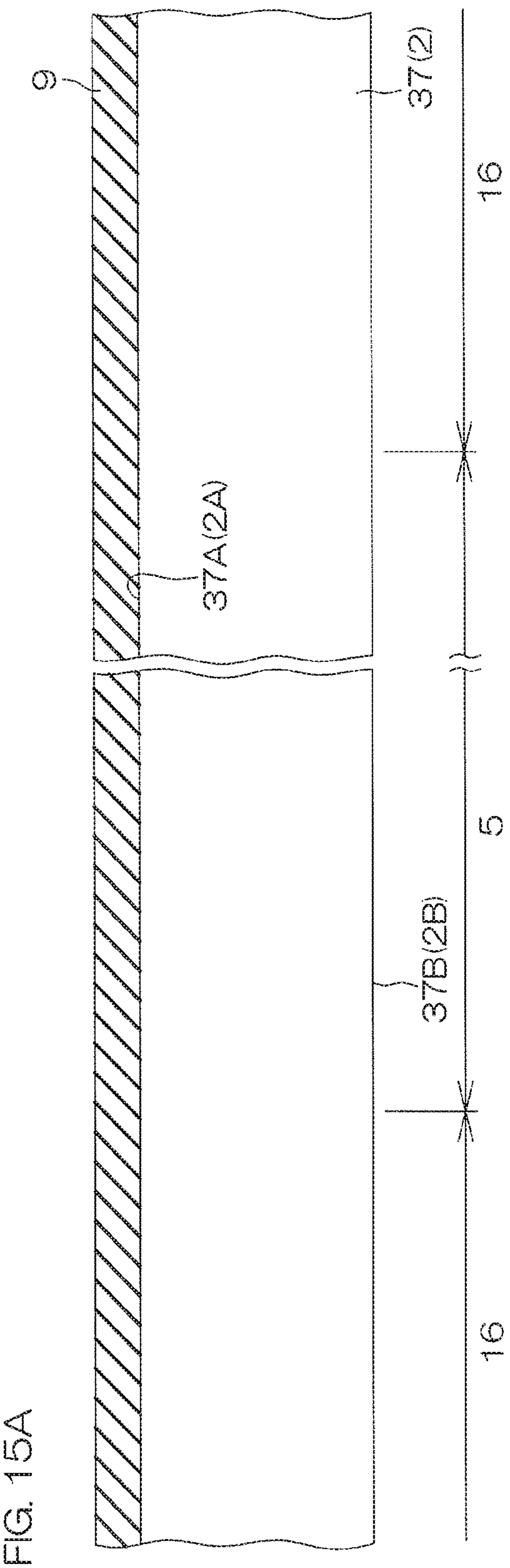
FIG. 15A is a diagram showing part of a manufacturing step of the chip resistor of FIG. 13.

As shown in FIG. 15A, a substrate 37 that is an original of the substrate 2 is first prepared. In this case, the surface 37A of the substrate 37 is the element formation surface 2A of the substrate 2, and the rear surface 37B of the substrate 37 is the rear surface 2B of the substrate 2. Then, the surface 37A of the substrate 37 is thermally oxidized, and thus the first insulating film 9 formed of $SiO_2$ and the like is formed on the surface 37A.

Figure 15B:
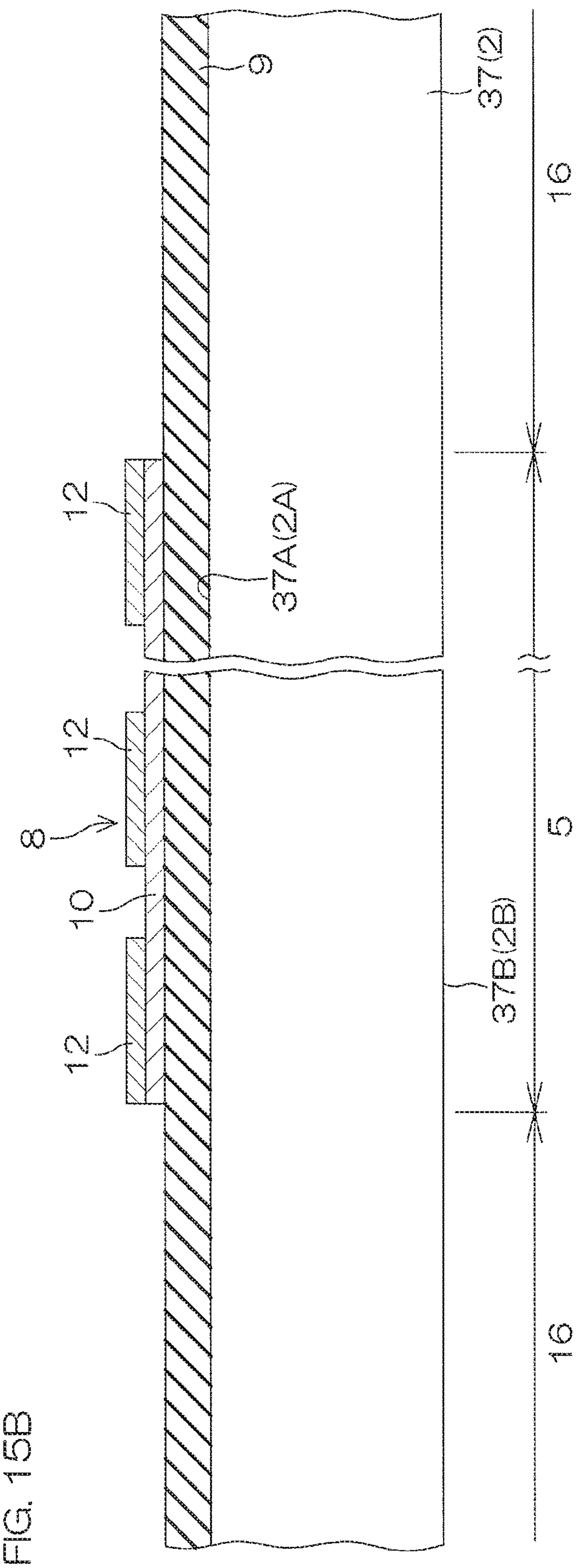
FIG. 15B is a diagram showing the step subsequent to FIG. 15A.

Then, as shown in FIG. 15B, on the first insulating film 9, the resistor portion 8 (the resistor bodies R and the first wiring films 12 connected to the resistor bodies R) is formed. Specifically, by sputtering, on the first insulating film 9, the resistor body film 10 of TiN, TiON, or TiSiON is first formed on the entire surface, and furthermore, on the resistor body film 10, the first wiring film 12 of aluminum (Al) is laminated so as to make contact with the resistor body film 10. Thereafter, a photolithography process is used, and for example, by dry etching such as RIE (Reactive Ion Etching), the resistor body film 10 and the first wiring film 12 are selectively removed to perform patterning. Here, the resistor body film 10 and the first wiring film 12 on the electrode region 16 are completely removed. In this way, it is possible to obtain the following arrangement: as shown in FIG. 3, in plan view, the resistor body film lines 10A in which the resistor body film 10 is laminated and which has a constant width are arrayed at a fixed interval in the column direction.

Here, a region where the resistor body film line 10A and the first wiring film 12 are partially cut is also formed, and in the trimming region X described previously, the fuses F and the conductor films D are formed (see FIG. 2). Then, for example, by wet etching, the first wiring film 12 laminated on the resistor body film line 10A is selectively removed. Consequently, it is possible to obtain the resistor portion 8 in which on the resistor body film line 10A, the first wiring films 12 are laminated at a fixed interval R. Here, the resistance value of the entire resistor portion 8 may be measured so that whether or not the resistor body film 10 and the first wiring film 12 are formed to have target dimensions is checked.

Figure 15C:
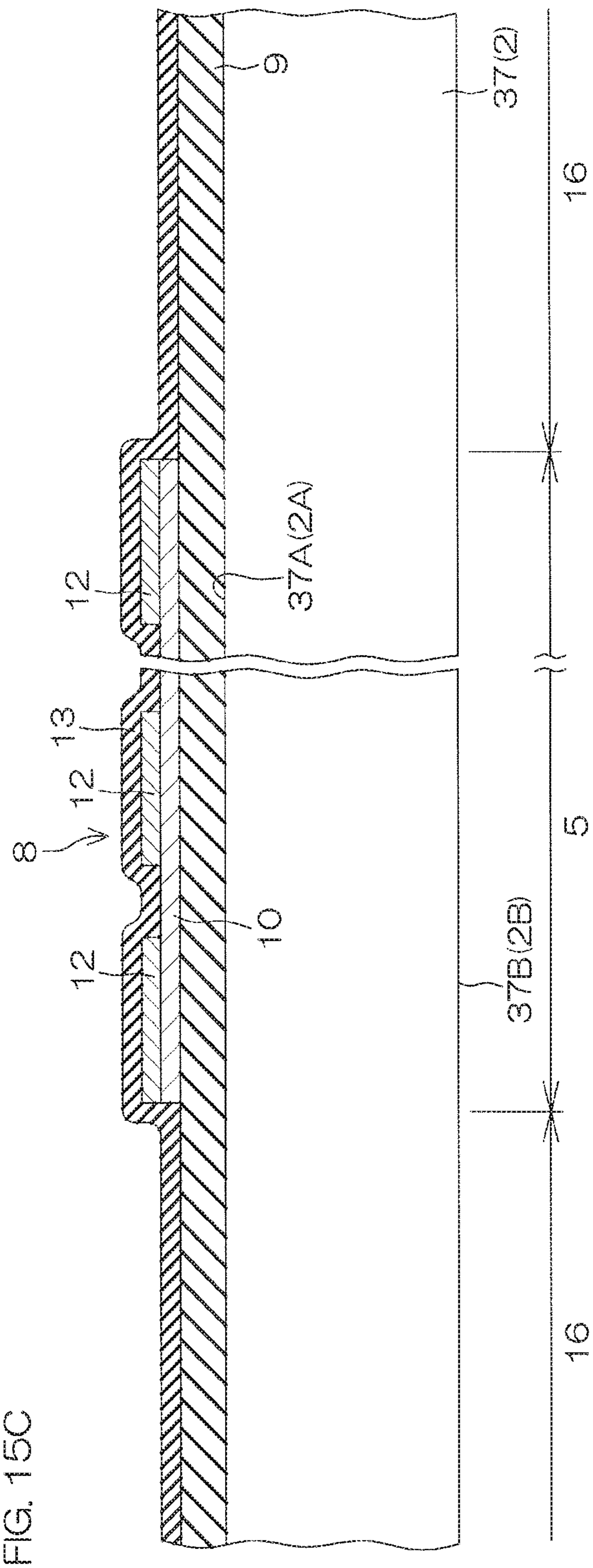
FIG. 15C is a diagram showing the step subsequent to FIG. 15B.

Then, as shown in FIG. 15C, by a CVD (Chemical Vapor Deposition) method, the second insulating film 13 formed of SiN is formed over the entire region of the surface 37A of the substrate 37. The second insulating film 13 covers all of the first insulating film 9 and the resistor portion 8 (the resistor body film 10 and the first wiring film 12) on the first insulating film 9, and is in contact with them. Hence, the second insulating film 13 also covers the first wiring film 12 in the trimming region X (see FIG. 2) described previously.

Figure 15D:
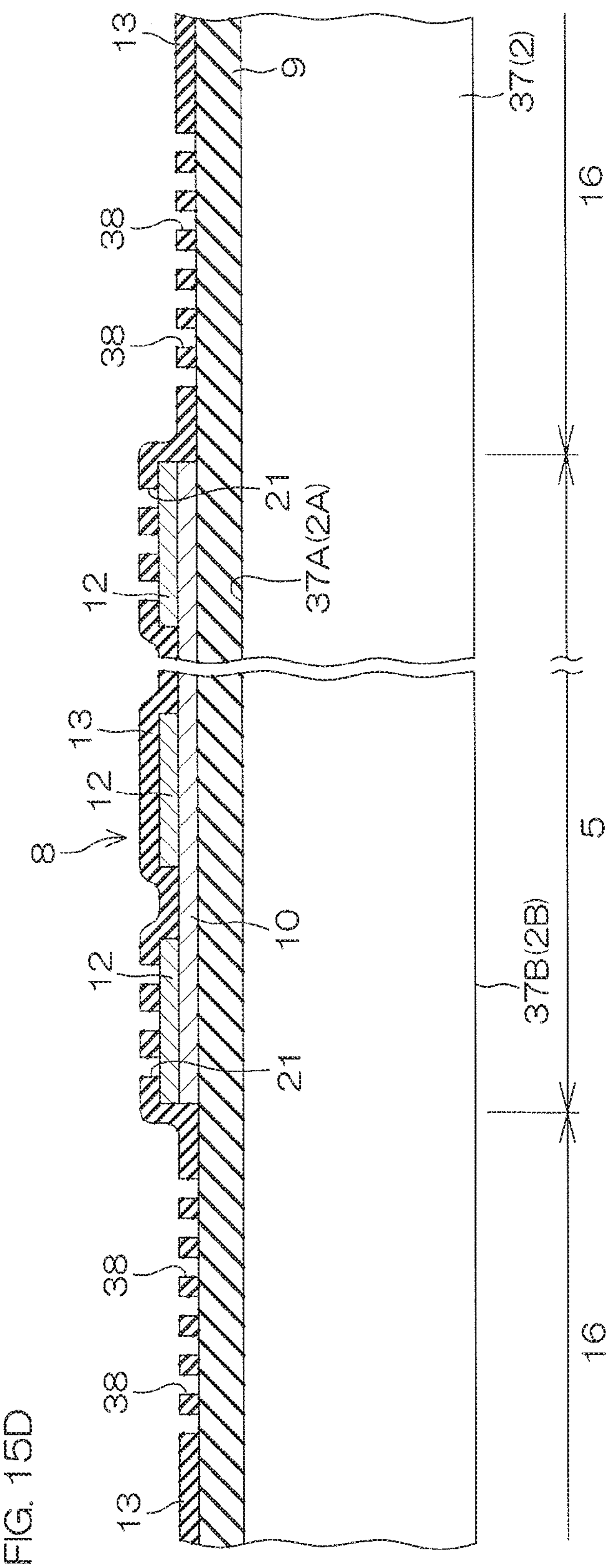
FIG. 15D is a diagram showing the step subsequent to FIG. 15C.

Then, as shown in FIG. 15D, a photolithography process is used, and for example, by dry etching such as RIE (Reactive Ion Etching), the second insulating film 13 is selectively removed to perform patterning. In this way, through holes 38 are formed in the electrode region 16, and simultaneously, the through holes 21 are formed in the element region 5.

Figure 15E:
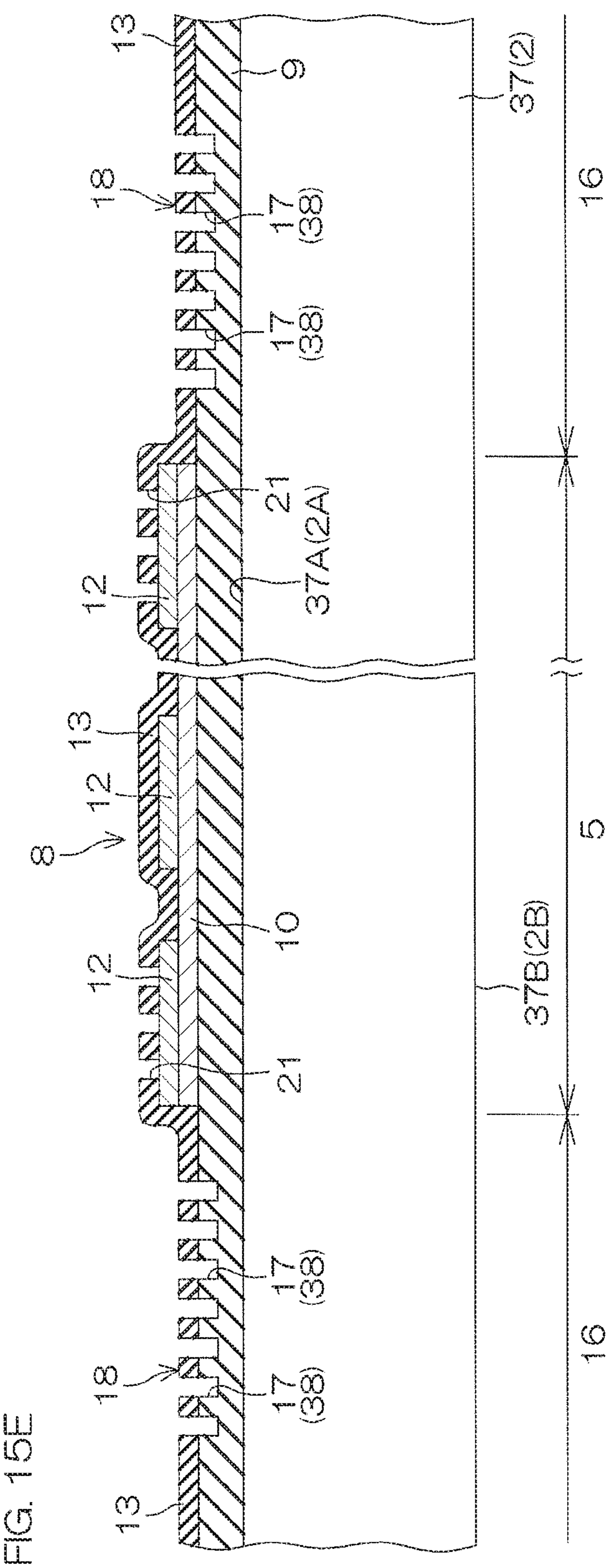
FIG. 15E is a diagram showing the step subsequent to FIG. 15D.

Then, as shown in FIG. 15E, an etching gas for $SiO_2$ is supplied, and thus the first insulating film 9 below the through holes 38 is selectively removed (cut away). In this way, it is possible to obtain the internal concave/convex structure 18 formed with a plurality of concave portions 17.

Figure 15F:
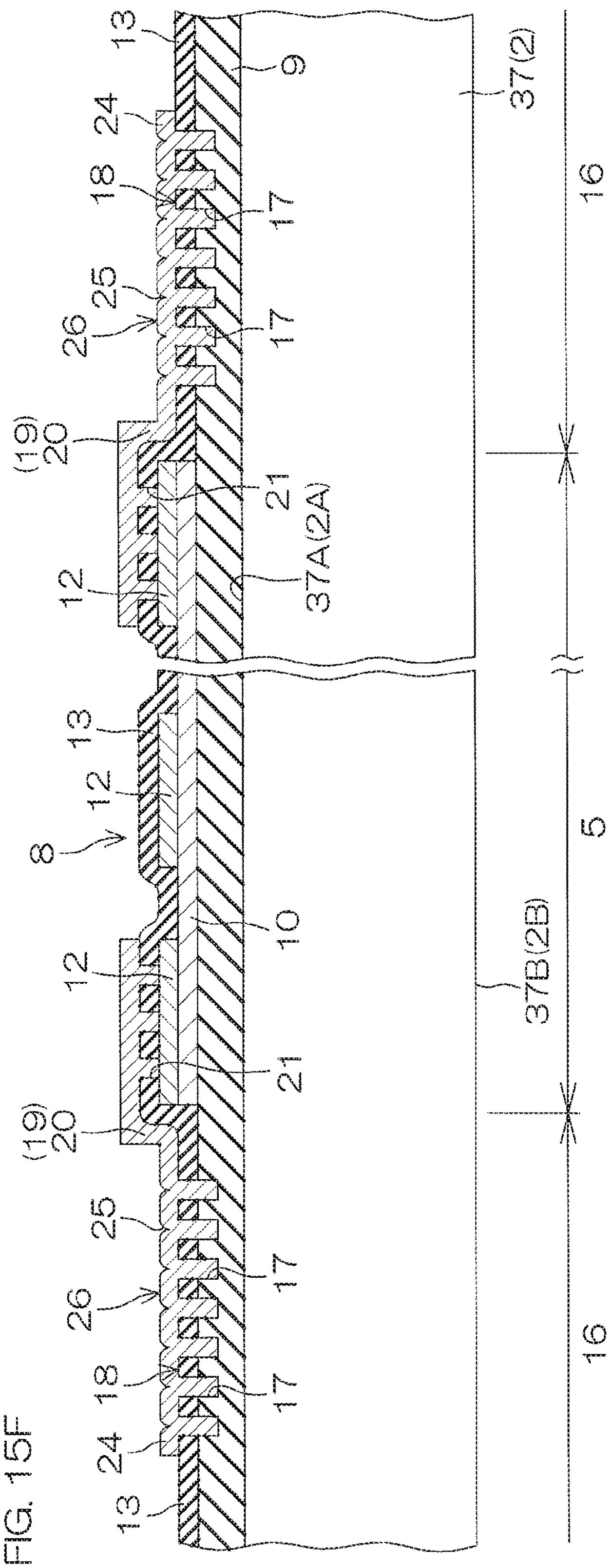
FIG. 15F is a diagram showing the step subsequent to FIG. 15E.

Then, as shown in FIG. 15F, the resistor wiring film 20 (the anchor portion 24) is formed on the second insulating film 13. Specifically, by sputtering, on the second insulating film 13, the second wiring film 19 of aluminum (Al) is first laminated, and thereafter a photolithography process is used, and for example, by dry etching such as RIE (Reactive Ion Etching), the second wiring film 19 is selectively removed to perform patterning. In this way, it is possible to obtain the resistor wiring film 20 (the anchor portion 24). Here, on the surface of the anchor portion 24 on the internal concave/convex structure 18, the intermediate concave/convex structure 26 formed with a plurality of concave portions 25 are formed by continuation of the concave/convex shape of the internal concave/convex structure 18 (the concave/convex shape where the positions opposite the concave portions 17 are recessed). In order for the embedding portion 22 and the surface layer portion 23 (see FIG. 14) to be formed, the second wiring film 19 is preferably formed to have a relatively large thickness such that the concave portions 17 are completely refilled in aluminum.

Figure 15G:
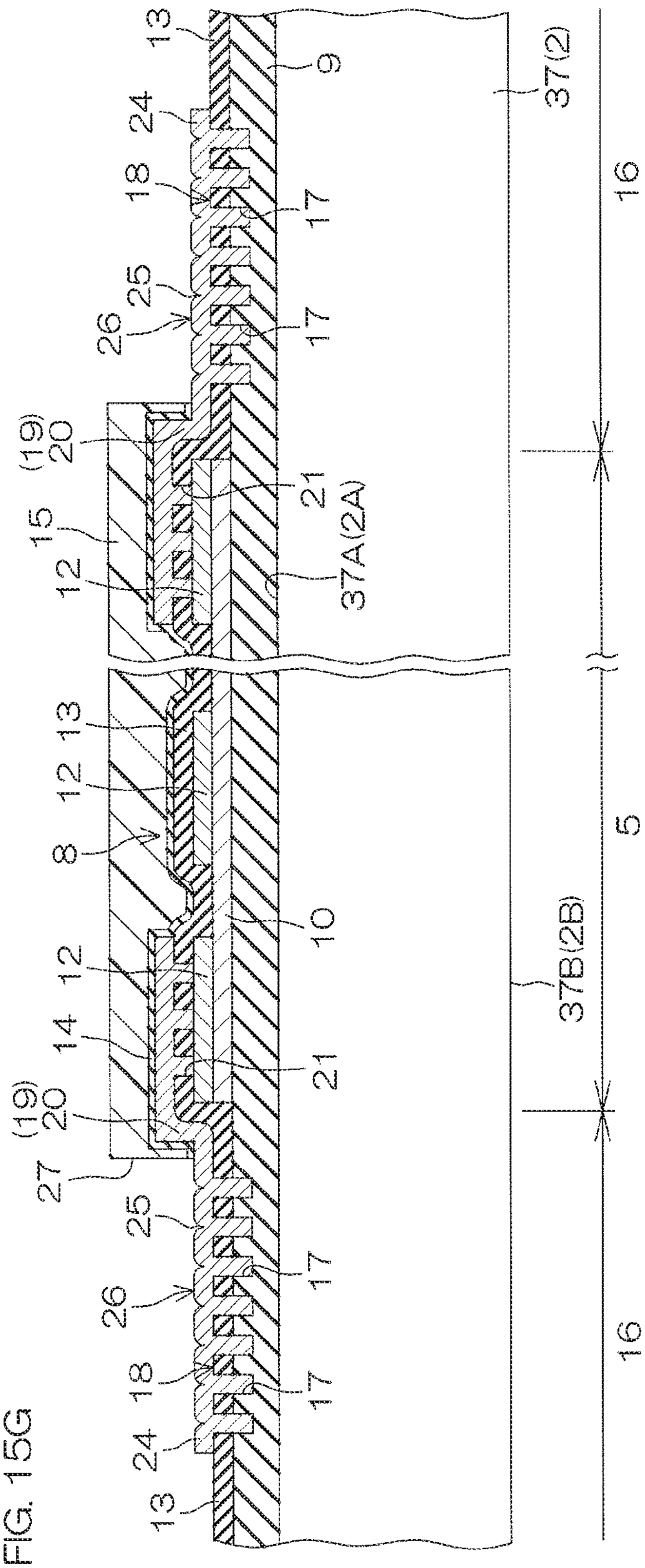
FIG. 15G is a diagram showing the step subsequent to FIG. 15F.

Then, as shown in FIG. 15G, by a CVD (Chemical Vapor Deposition) method, the passivation film 14 formed of SiN is formed over the entire region of the surface 37A of the substrate 37. Then, a liquid of a light-sensitive resin formed of polyimide is sprayed on the substrate 37 from above the passivation film 14 to form the resin film 15 of the light-sensitive resin. The surface of the resin film 15 on the surface 37A is flat along the surface 37A. Then, heat treatment (curing) is performed on the resin film 15. In this way, the thickness of the resin film 15 is thermally contracted, and the resin film 15 is cured, with the result that the film quality is stabilized. Then, the resin film 15 and the passivation film 14 are patterned, and thus parts on the electrode region 16 of these films 14 and 15 are selectively removed, and the end surface 27 of the resin film 15 is formed.

Figure 15H:
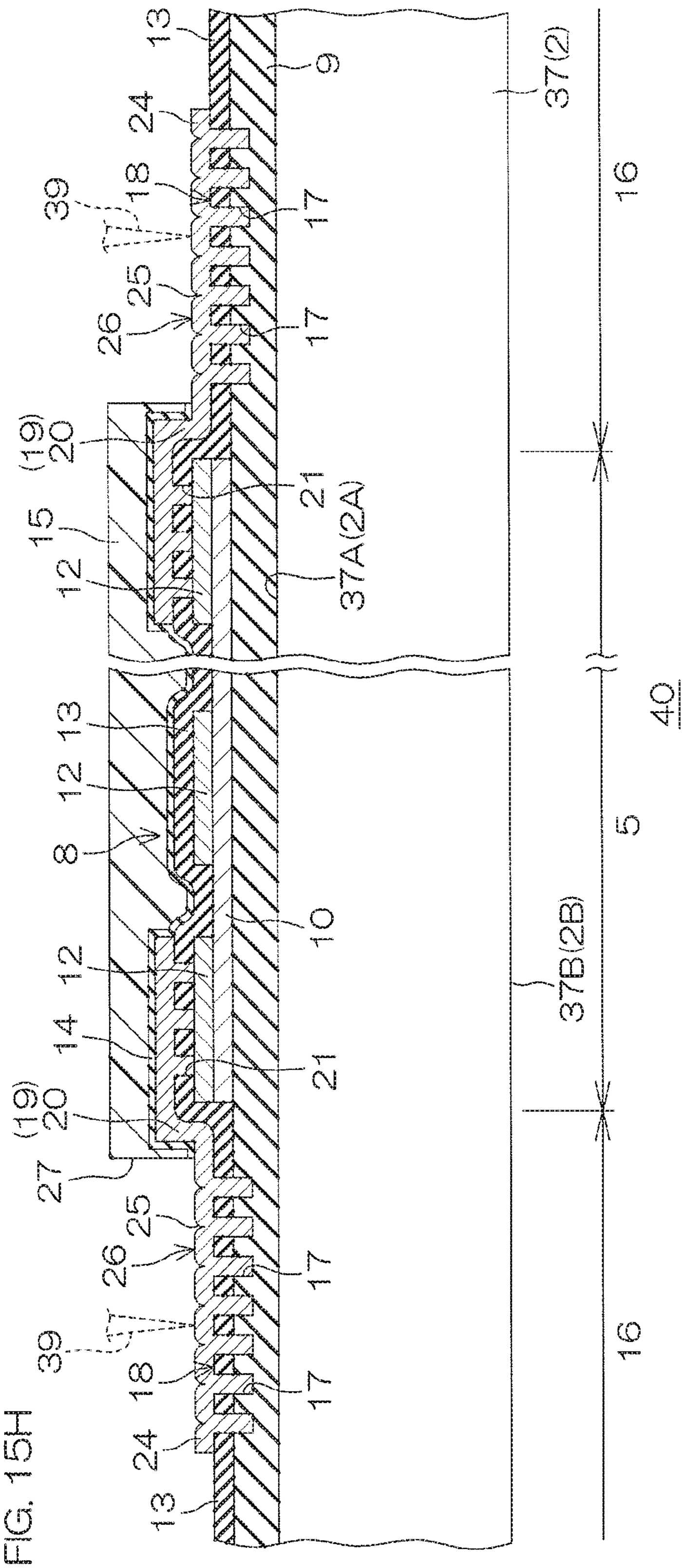
FIG. 15H is a diagram showing the step subsequent to FIG. 15G.

Then, as shown in FIG. 15H, the probes 39 of a resistance measuring apparatus (not shown) are brought into contact with the anchor portion 24 to detect the resistance value of the entire resistor portion 8. Then, laser light (not shown) is applied to an arbitrary fuse F (see FIG. 2) beyond the second insulating film 13, and thus the first wiring film 12 in the trimming region X described previously is trimmed with the laser light, with the result that the fuse F is blown. In this way, the fuse F is blown (trimmed) such that the necessary resistance value is obtained, and thus the resistance value of the entire semi-finished product 40 (in other words, the chip resistor 1) can be adjusted as described above.

Here, the second insulating film 13 serves as a cover film that covers the resistor portion 8, and thus it is possible to prevent a short circuit by the adherence of the resistor portion 8 with broken pieces or the like produced by the blowing. Moreover, since the second insulating film 13 covers the fuse F (the resistor body film 10), the energy of the laser light is stored in the fuse F, and thus the fuse F can be reliably blown.

Figure 15I:
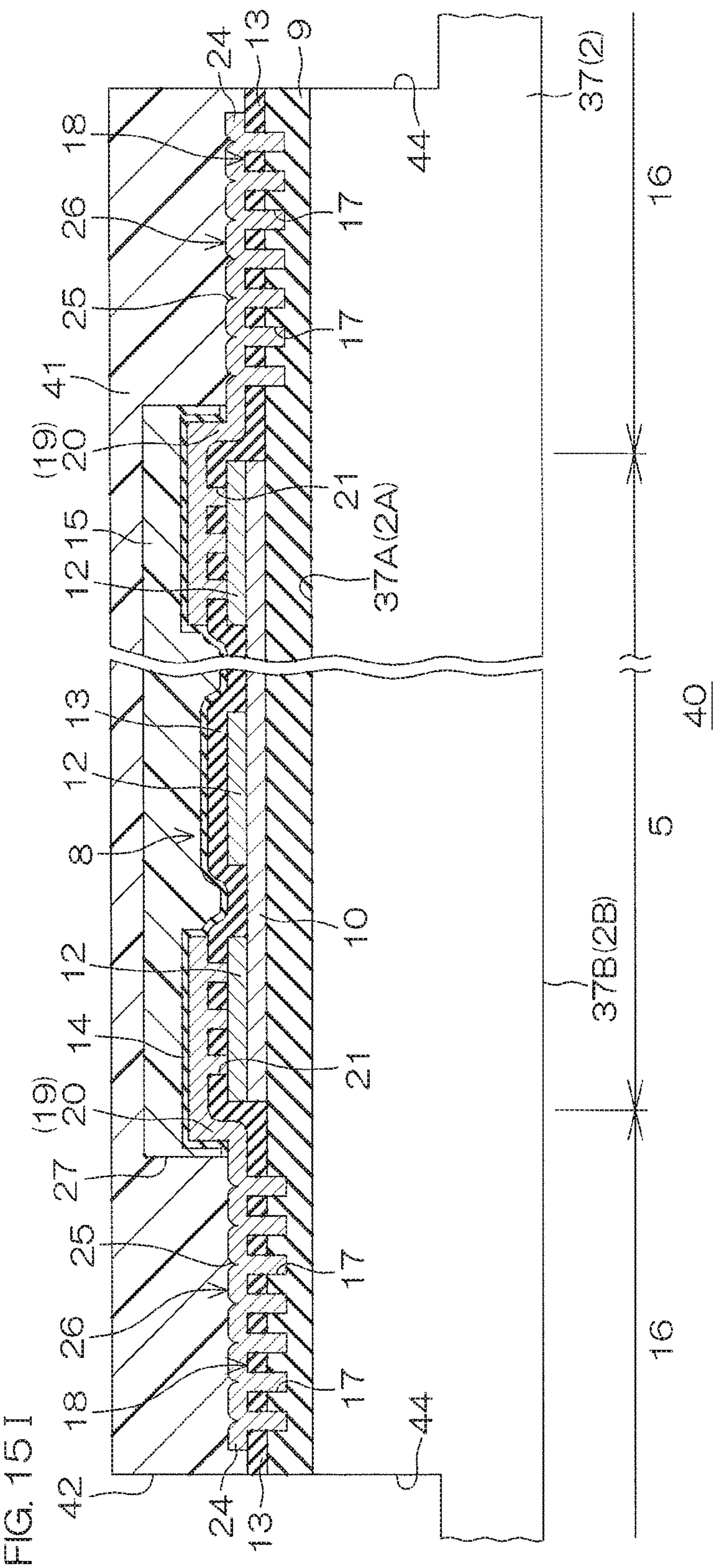
FIG. 15I is a diagram showing the step subsequent to FIG. 15H.

Then, as shown in FIG. 15I, a resist pattern 41 is formed over the entire region of the surface 37A of the substrate 37. In the resist pattern 41, an opening 42 is formed.

Figure 16:
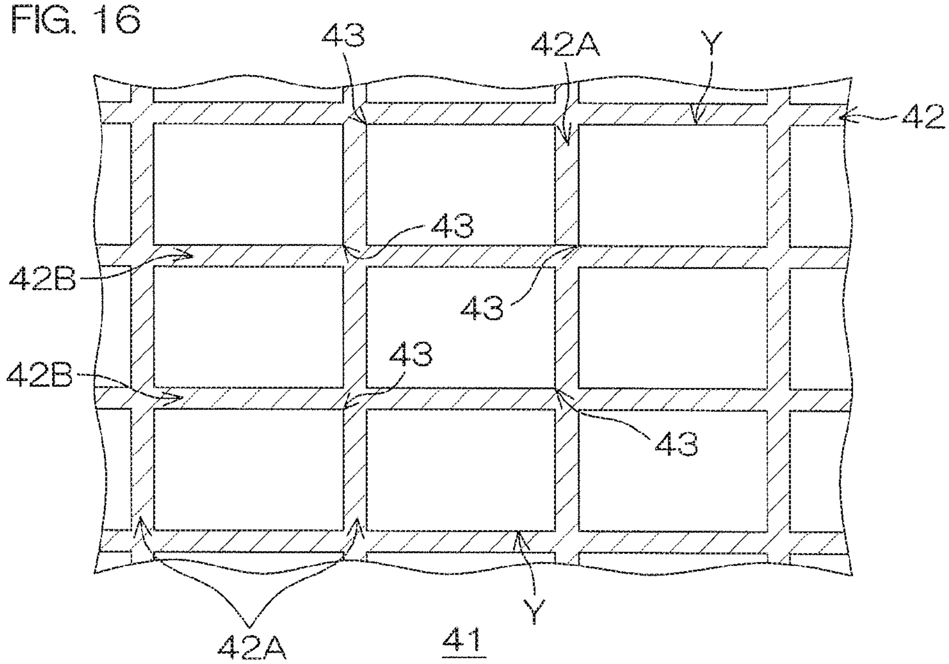
FIG. 16 is a schematic plan view of a resist pattern used to form a groove in the step of FIG. 15I.

FIG. 16 is a schematic plan view of the resist pattern 41 used to form a groove 44 in the step of FIG. 15I.

With reference to FIG. 16, when a large number of chip resistors 1 (chip part region Y) are disposed in a matrix, in plan view, the opening 42 of the resist pattern 41 coincides with a region (a hatched part of FIG. 16) between the outlines of adjacent chip resistors 1. Hence, the overall shape of the opening 42 is the shape of a lattice that has a plurality of rectilinear portions 42A and rectilinear portions 42B perpendicular to each other.

In the resist pattern 41, the rectilinear portions 42A and the rectilinear portions 42B perpendicular to each other in the opening 42 are connected while the state where they are perpendicular to each other is being maintained (without being curved). Hence, an intersection portion 43 between the rectilinear portion 42A and the rectilinear portion 42B is pointed so as to form an angle of about 90° in plan view.

With reference to FIG. 15I, by plasma etching using the resist pattern 41 as a mask, the substrate 37 is selectively removed. In this way, the material of the substrate 37 is removed in a position a distance apart from the second wiring film 19 in the boundary region between the adjacent resistor portions 8. Consequently, in plan view, in the position coinciding with the opening 42 of the resist pattern 41, the groove 44 that has a predetermined depth extending from the surface 37A of the substrate 37 halfway through the thickness of the substrate 37 is formed. In the preferred embodiment, in the substrate 37 having a thickness of about 725 μm, the depth of the groove 44 is about 100 μm, the width of the groove 44 is about 20 μm and is constant over the entire region in the direction of the depth.

In plan view, the overall shape of the groove 44 in the substrate 37 is formed in the shape of a lattice coinciding with the opening 42 of the resist pattern 41. Each of the semi-finished products 40 is located in the chip part region Y surrounded by the groove 44, and these semi-finished products 40 are disposed orderly in a matrix. The groove 44 is formed as described above, and thus the substrate 37 is separated into the substrates 2 for a plurality of chip part regions Y. After the formation of the groove 44, the resist pattern 41 is removed.

Figure 15J:
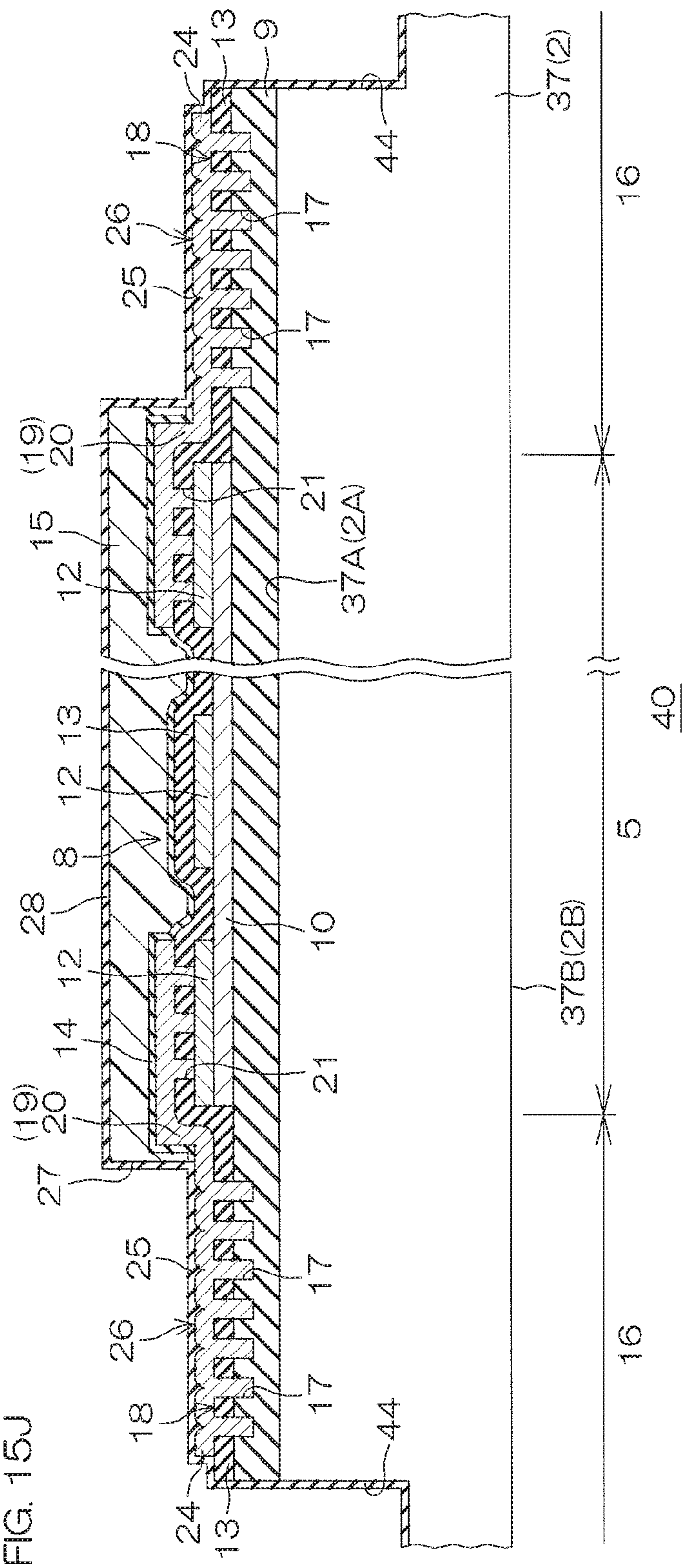
FIG. 15J is a diagram showing the step subsequent to FIG. 15I.

Then, as shown in FIG. 15J, by a CVD method, the passivation film 28 formed of SiN is formed over the entire region of the surface 37A of the substrate 37. Here, the passivation film 28 is also formed over the entire region of the inner peripheral surface of the groove 44.

Figure 15K:
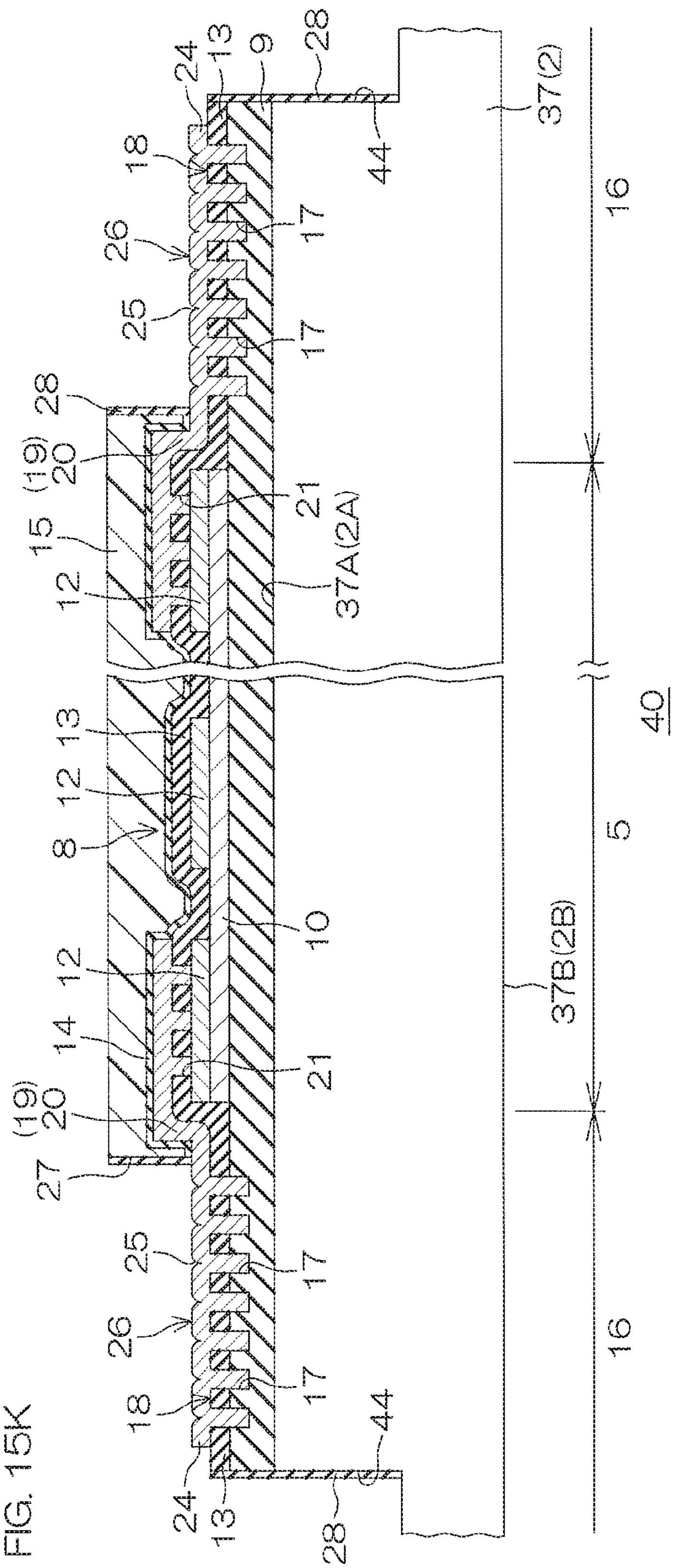
FIG. 15K is a diagram showing the step subsequent to FIG. 15J.

Then, as shown in FIG. 15K, the passivation film 28 is selectively etched. Specifically, the part of the passivation film 28 parallel to the surface 37A is selectively etched. In this way, the part of the passivation film 28 on the electrode region 16 is selectively removed, and thus the anchor portion 24 is exposed.

Figure 15L:
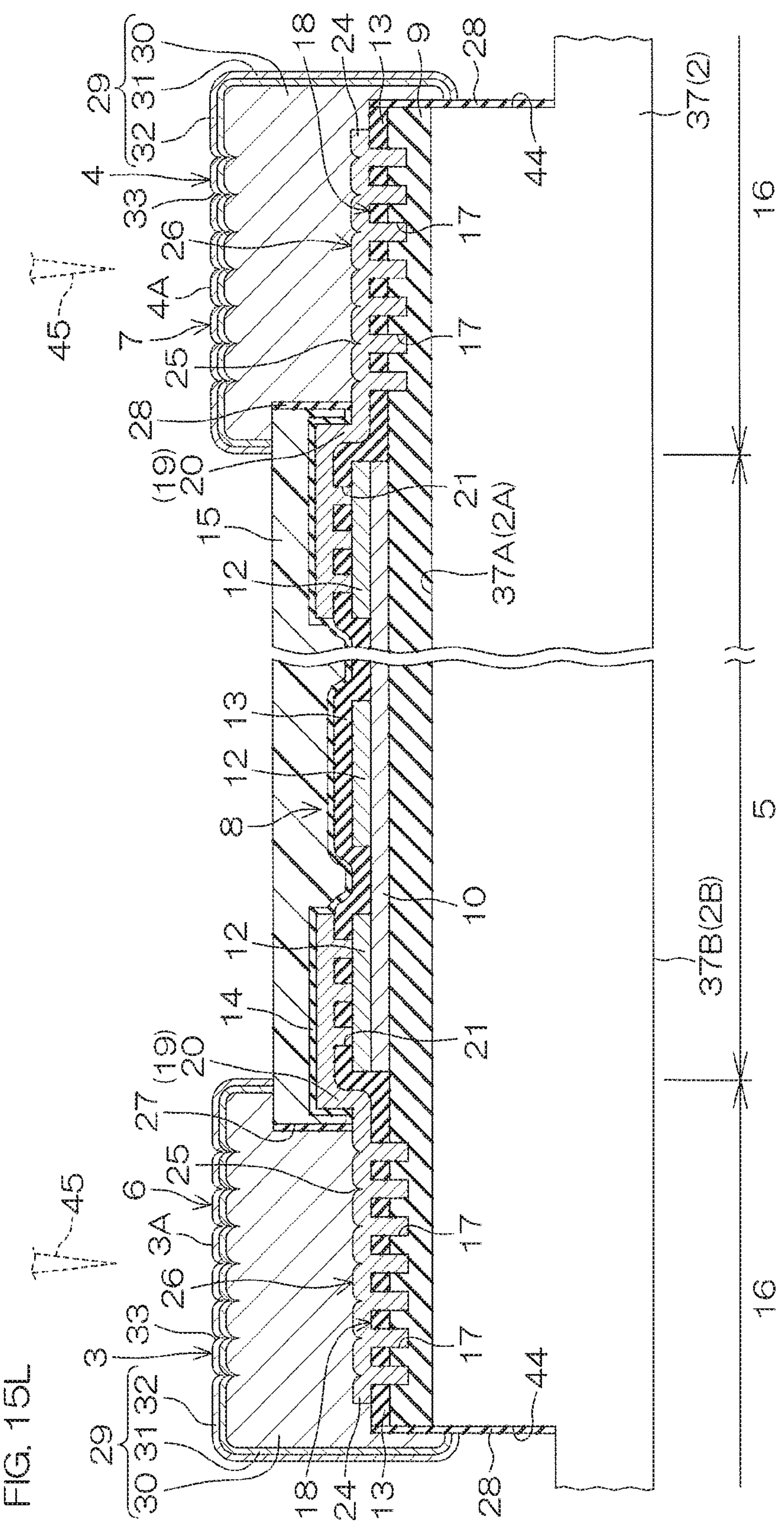
FIG. 15L is a diagram showing the step subsequent to FIG. 15K.

Then, by electroless plating, Ni, Pd, and Au are sequentially grown from the anchor portion 24 by plating. The plating is continued until each plating film is grown in the lateral direction along the surface 37A to cover the passivation film 28 on the side surface of the groove 44. In this way, as shown in FIG. 15L, the external connection portion 29 formed with a Ni/Pd/Au laminated film is formed.

Figure 17:
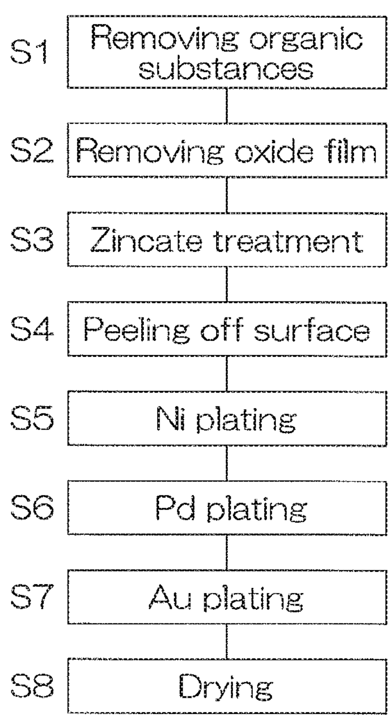
FIG. 17 is a diagram for illustrating the manufacturing step of an external connection portion.

FIG. 17 is a diagram for illustrating the manufacturing step of the external connection portion 29.

Specifically, with reference to FIG. 17, the surface of the anchor portion 24 is first purified, and thus organic substances (including smut such as a stain of carbon and greasy dirt) are removed (degreased) (step S1). Then, the oxide film on the surface is removed (step S2). Then, zincate treatment is performed on the surface, and thus Al on the surface (of the second wiring film 19) is replaced by Zn (step S3). Then, Zn on the surface is peeled off with nitric acid etc., and in the anchor portion 24, new Al is exposed (step S4).

Then, the anchor portion 24 is immersed in a plating solution, and thus Ni plating is performed on the surface of the new Al in the anchor portion 24. In this way, Ni in the plating solution is chemically reduced and deposited, and thus the Ni layer 30 is formed on the surface (step S5).

Then, the Ni layer 30 is immersed in another plating solution, and thus Pd plating is performed on the surface of the Ni layer 30. In this way, Pd in the plating solution is chemically reduced and deposited, and thus the Pd layer 31 is formed on the surface of the Ni layer 30 (step S6).

Then, the Pd layer 31 is immersed in another plating solution, and thus Au plating is performed on the surface of the Pd layer 31. In this way, Au in the plating solution is chemically reduced and deposited, and thus the Au layer 32 is formed on the surface of the Pd layer 31 (step S7). In this way, the first connection electrode 3 and the second connection electrode 4 are formed, and when the formed first connection electrode 3 and the formed second connection electrode 4 are dried (step S8), the manufacturing step of the first connection electrode 3 and the second connection electrode 4 is completed. Between the successive steps, a step of washing the semi-finished product 40 with water is performed as necessary. The zincate treatment may be performed at a plurality of times.

FIG. 15L shows a state where in each semi-finished product 40, the first connection electrode 3 and the second connection electrode 4 have already been formed.

As described above, the first connection electrode 3 and the second connection electrode 4 (the external connection portion 29) are formed on the anchor portion 24 having the intermediate concave/convex structure 26. Hence, in the main surfaces 3A and 4A of the first connection electrode 3 and the second connection electrode 4, the external concave/convex structures 6 and 7 formed with a plurality of concave portions 33 are formed by continuation of the concave/convex shape (the concave/convex shape where the positions opposite the concave portions 25 are recessed) of the intermediate concave/convex structure 26.

Since the first connection electrode 3 and the second connection electrode 4 (the external connection portion 29) are formed by electroless plating, Ni, Pd, and Al serving as electrode materials can be satisfactorily grown on the passivation film 28 by plating. As compared with a case where the first connection electrode 3 and the second connection electrode 4 are formed by electrolytic plating, the number of steps (for example, a lithography step and a resist mask peeling step necessary in electrolytic plating) in the step of forming the first connection electrode 3 and the second connection electrode 4 is reduced, with the result that it is possible to enhance the productivity of the chip resistor 1. Furthermore, since in electroless plating, the resist mask necessary in electrolytic plating is not needed, the position of the formation of the first connection electrode 3 and the second connection electrode 4 is prevented from being displaced by the displacement of the position of the resist mask, and thus the formation position accuracy of the first connection electrode 3 and the second connection electrode 4 is enhanced, with the result that it is possible to enhance the yield.

In this method, the anchor portion 24 is exposed from the end surface 27 of the resin film 15, and there is no obstruction of the plating growth in a region from the anchor portion 24 to the groove 44. In other words, since the resistor portion 8 is covered by the resin film 15, the region where the resistor portion 8 is formed is not grown by plating. Hence, it is possible to perform plating growth rectilinearly from the anchor portion 24 to the groove 44. Consequently, it is possible to reduce the time necessary to form the electrode.

The first connection electrode 3 and the second connection electrode 4 are formed as described above, and then a conduction test is performed between the first connection electrode 3 and the second connection electrode 4. In the conduction test between the first connection electrode 3 and the second connection electrode 4, for example, by the same method as described previously with reference to FIG. 15, the probes 45 of the resistance measuring apparatus (not shown) are brought into contact with the first connection electrode 3 and the second connection electrode 4, and the resistance value of the entire resistor portion 8 is detected. Then, after the conduction test is performed between the first connection electrode 3 and the second connection electrode 4, the substrate 37 is ground from the rear surface 37B.

Figure 15M:
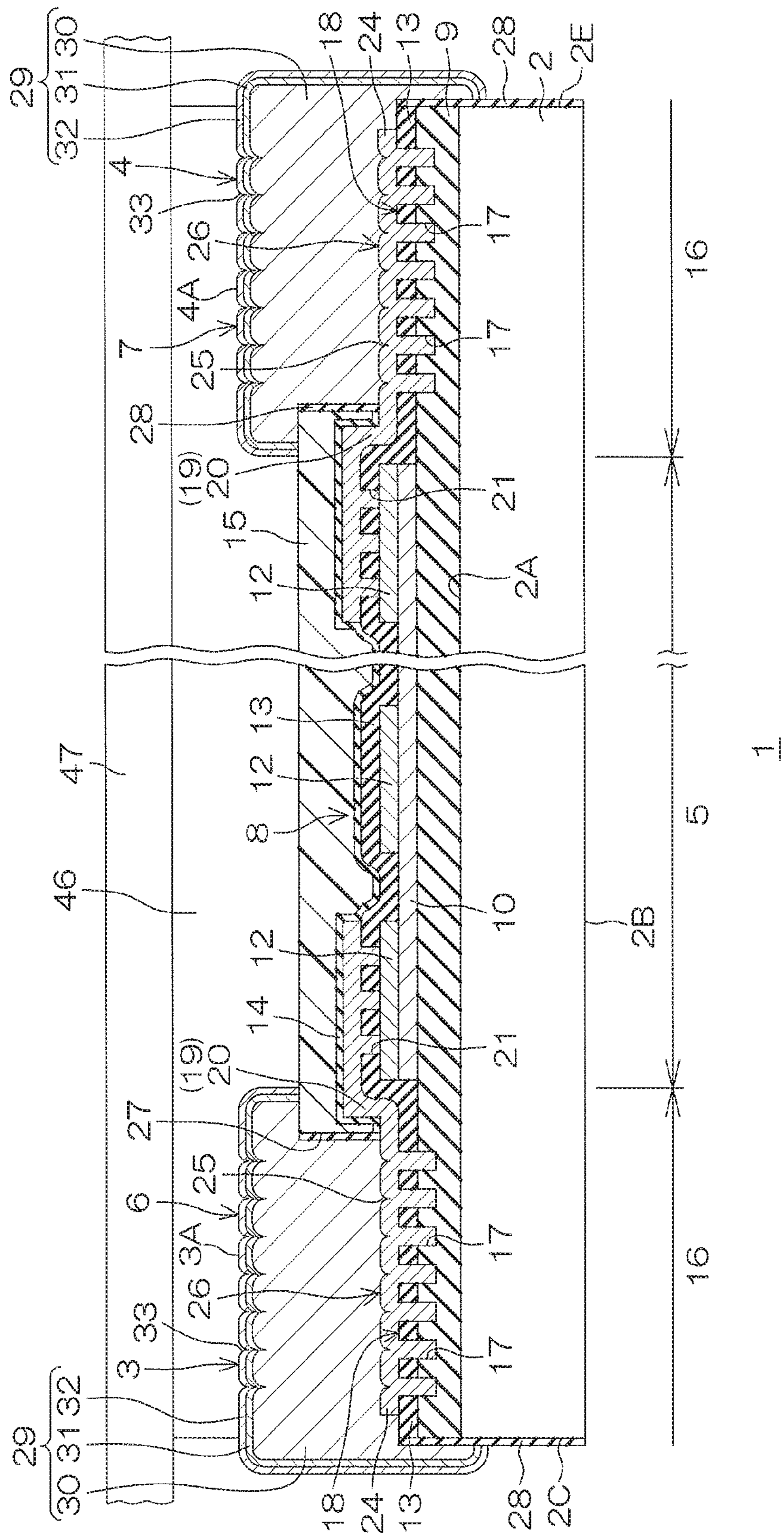
FIG. 15M is a diagram showing the step subsequent to FIG. 15L.

Specifically, after the formation of the groove 44, as shown in FIG. 15M, a supporting tape 47 that is formed of PET (polyethylene terephthalate), that is formed in the shape of a thin plate and that has an adhesive surface 46 is adhered, in the adhesive surface 46, to the side (that is, the surface 37A) of the first connection electrode 3 and the second connection electrode 4. In this way, each semi-finished product 40 is supported by the supporting tape 47. Here, as the supporting tape 47, for example, a laminated tape can be used.

With each semi-finished product 40 supported by the supporting tape 47, the substrate 37 is grounded from the side of the rear surface 37B. When by the grinding, the substrate 37 is thinned so as to reach the bottom surface of the groove 44, since there is nothing that couples the adjacent semi-finished products 40, the substrate 37 is separated with the groove 44 being a boundary and the semi-finished products 40 are individually separated, with the result that the finished product of the chip resistor 1 is formed. In other words, the substrate 37 is cut in the groove 44, and thus the chip resistors 1 are individually cut out. By etching the substrate 37 from the side of the rear surface 37B to the bottom surface of the groove 44, the chip resistors 1 may be cut out.

As described above, the groove 44 is formed, and then the substrate 37 is ground from the side of the rear surface 37B, and thus it is possible to separate, all at once, a plurality of chip part regions Y formed in the substrate 37 into individual chip resistors 1 (it is possible to obtain pieces of the chip resistors 1 at a time). Hence, by reducing the time necessary to manufacture the chip resistors 1, it is possible to enhance the productivity of the chip resistor 1.

By polishing or etching the rear surface 2B of the substrate 2 in the finished chip resistor 1 into a mirror surface, the rear surface 2B may be cleaned.

The recovery step of the chip resistor 1 will be described in detail below with reference to FIGS. 18A to 18D.

FIGS. 18A to 18D are diagrams for illustrating the recovery step of the chip resistor 1 after the step of FIG. 15M.

Figure 18A:
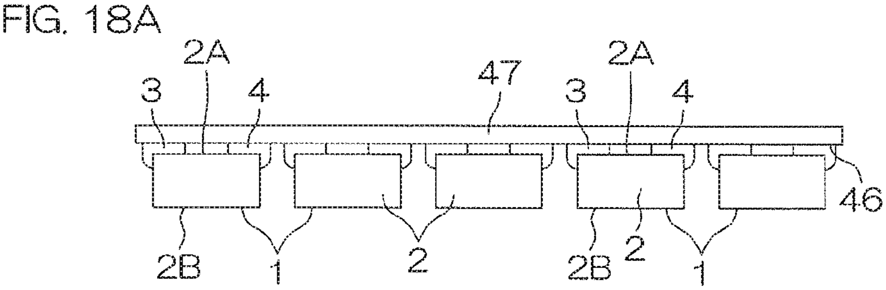
FIG. 18A is a diagram for illustrating the recovery step of the chip resistor after the step of FIG. 15M.
Figure 18B:
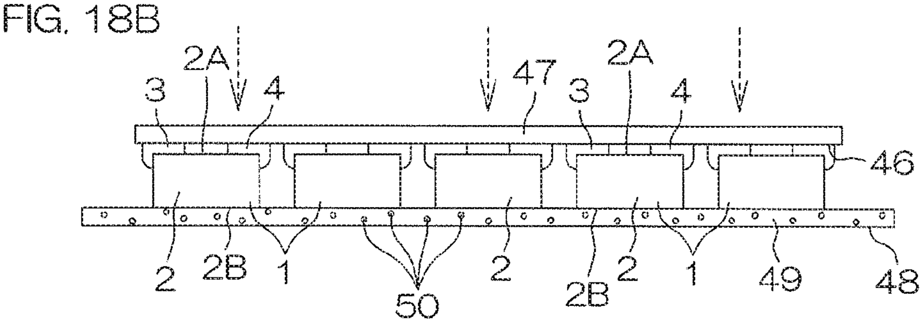
FIG. 18B is a diagram showing the step subsequent to FIG. 18A.

FIG. 18A shows a state where a plurality of chip resistors 1 separated into pieces still stick to the supporting tape 47. In this state, as shown in FIG. 18B, a thermally foaming sheet 48 is adhered to the rear surface 2B of the substrate 2 of each chip resistor 1. The thermally foaming sheet 48 includes a sheet main body 49 in the shape of a sheet and a large number of foaming particles 50 kneaded into the sheet main body 49.

Figure 18C:
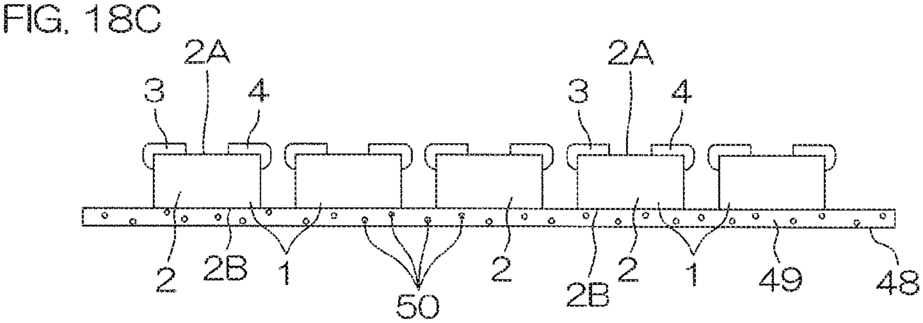
FIG. 18C is a diagram showing the step subsequent to FIG. 18B.

The adhesive force of the sheet main body 49 is greater than that of the adhesive surface 46 of the supporting tape 47. Hence, after the thermally foaming sheet 48 is adhered to the rear surface 2B of the substrate 2 of each chip resistor 1, as shown in FIG. 18C, the supporting tape 47 is peeled off from each chip resistor 1, and the chip resistor 1 is transferred onto the thermally foaming sheet 48. Here, since the adhesive property of the adhesive surface 46 is lowered by the application of ultraviolet rays to the supporting tape 47 (see dotted arrows in FIG. 18B), the supporting tape 47 is easily peeled off from each chip resistor 1.

Figure 18D:
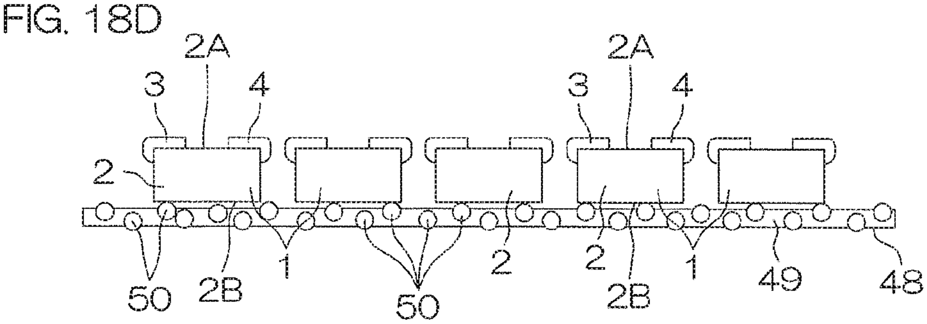
FIG. 18D is a diagram showing the step subsequent to FIG. 18C.

Then, the thermally foaming sheet 48 is heated. In this way, as shown in FIG. 18D, in the thermally foaming sheet 48, the foaming particles 50 within the sheet main body 49 are foamed and are expanded out of the surface of the sheet main body 49. Consequently, the contact area between the thermally foaming sheet 48 and the rear surface 2B of the substrate 2 of each chip resistor 1 is decreased, and thus all the chip resistors 1 are naturally peeled off from the thermally foaming sheet 48 (falling off). The chip resistors 1 recovered in this way are stored in a storage space formed by an embossed carrier tape (not shown). In this case, as compared with a case where the chip resistors 1 are peeled off from the supporting tape 47 or the thermally foaming sheet 48 one by one, it is possible to reduce the processing time. As a matter of course, with a plurality of chip resistors 1 sticking to the supporting tape 47 (see FIG. 18A), without use of the thermally foaming sheet 48, the chip resistors 1 may be directly peeled off from the supporting tape 47 by a predetermined number of pieces. Thereafter, the embossed carrier tape storing the chip resistors 1 stored in an automatic mounting machine 60, is sucked by a suction nozzle 61 included in the automatic mounting machine 60 and is individually recovered (see FIGS. 20 and 21). On the chip resistor 1 recovered in this way, a front/rear judgement step using a part recognizing camera 62 is performed.

Figure 19A:
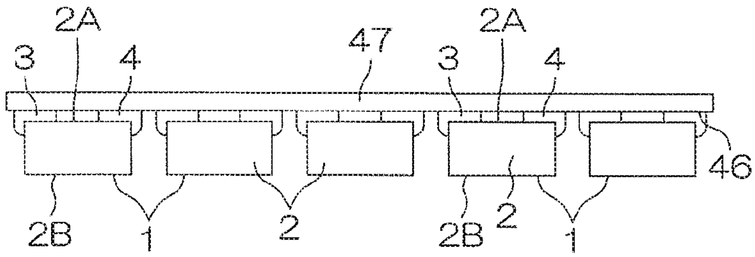
FIG. 19A is a diagram for illustrating the recovery step (modification example) of the chip resistor after the step of FIG. 15M.
Figure 19B:
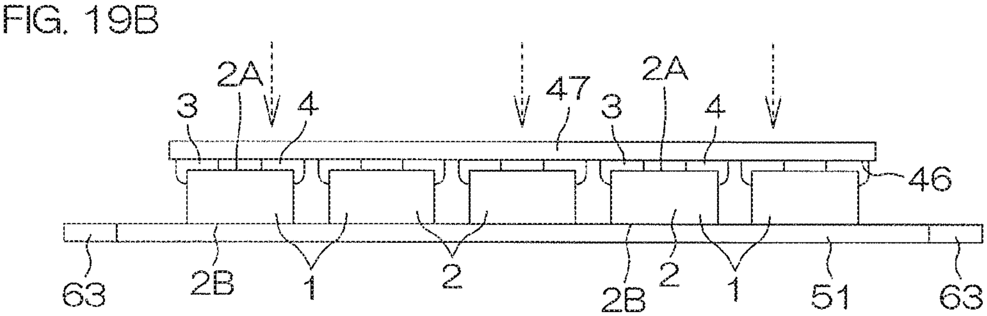
FIG. 19B is a diagram showing the step subsequent to FIG. 19A.
Figure 19C:
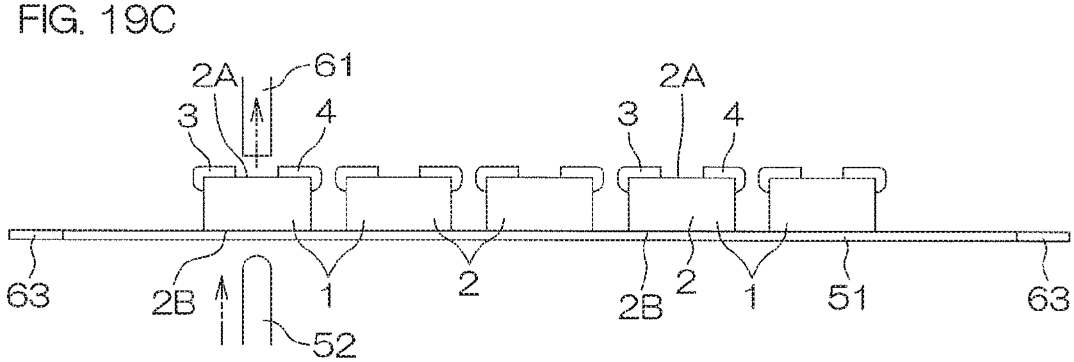
FIG. 19C is a diagram showing the step subsequent to FIG. 19B.

The recovery step of each chip resistor 1 can be performed with another method shown in FIGS. 19A to 19C.

FIGS. 19A to 19C are diagrams showing the recovery step (modification example) of the chip resistor 1 after the step of FIG. 15M.

As with FIG. 18A, FIG. 19A shows a state where a plurality of chip resistors 1 separated into pieces still stick to the supporting tape 47. In this state, as shown in FIG. 19B, a transfer tape 51 is adhered to the rear surface 2B of the substrate 2 of each chip resistor 1. The transfer tape 51 has an adhesive force greater than that of the adhesive surface 46 of the supporting tape 47. Hence, as shown in FIG. 19C, after the transfer tape 51 is adhered to each chip resistor 1, the supporting tape 47 is peeled off from each chip resistor 1. Here, as described previously, ultraviolet rays (see dotted arrows in FIG. 19B) may be applied to the supporting tape 47 so that the adhesive property of the adhesive surface 46 is lowered.

Frames 63 installed in the automatic mounting machine 60 are adhered to both ends of the transfer tape 51. The frames 63 on both sides can be moved either in a direction in which they approach each other or in a direction in which they are separated. After the supporting tape 47 is peeled off from each chip resistor 1, the frames 63 on both sides are moved in the direction in which they are separated, and thus the transfer tape 51 is extended so as to become thin. In this way, the adhesive force of the transfer tape 51 is lowered, and thus each chip resistor 1 is easily peeled off from the transfer tape 51. When in this state, the suction nozzle 61 of the automatic mounting machine 60 is directed to the side of the element formation surface 2A of the chip resistor 1, the chip resistor 1 is peeled off from the transfer tape 51 by the adhesive force produced by the automatic mounting machine 60 (the suction nozzle 61) and is sucked by the suction nozzle 61. Here, the chip resistor 1 is pushed up by a projection 52 shown in FIG. 19C from the side opposite to the suction nozzle 61 through the transfer tape 51 to the side of the suction nozzle 61, and thus the chip resistor 1 can be smoothly peeled off from the transfer tape 51. On the chip resistor 1 recovered in this way, the front/rear judgement step using the part recognizing camera 62 is performed.

Figure 20:
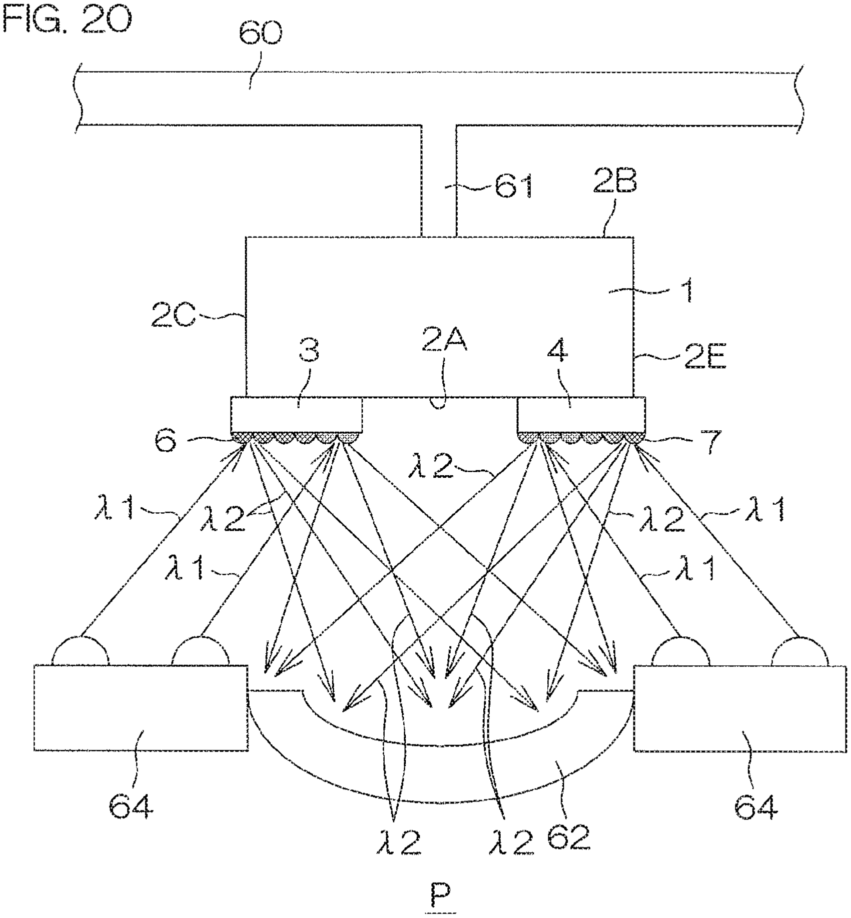
FIG. 20 is a diagram for illustrating a front/rear judgement step of the chip resistor according to the first invention.
Figure 21:
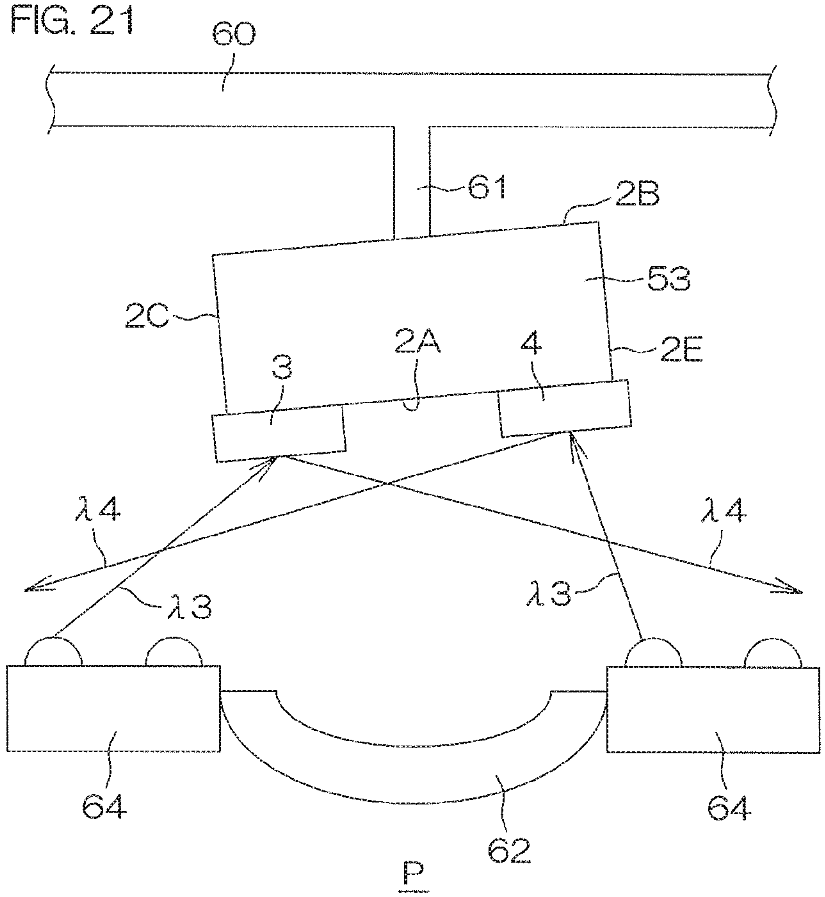
FIG. 21 is a diagram for illustrating a front/rear judgement step of a chip resistor according to a reference example.

FIG. 20 is a diagram for illustrating the front/rear judgement step of the chip resistor 1 according to the first invention. FIG. 21 is a diagram for illustrating the front/rear judgement step of a chip resistor 53 according to a reference example.

FIGS. 20 and 21 respectively show a state where the chip resistor 1 of the first invention is sucked by the suction nozzle 61 and a state where the chip resistor 53 according to the reference example is sucked by the suction nozzle 61. Here, the chip resistor 53 according to the reference example refers to a chip part in which the external concave/convex structures 6 and 7 are not formed in the surfaces of the first connection electrode 3 and the second connection electrode 4.

As shown in FIG. 20, while the chip resistor 1 is being sucked by the suction nozzle 61, the chip resistor 1 is conveyed by the automatic mounting machine 60 to a part detection position P where the front and rear of the chip resistor 1 are determined by the part recognizing camera 62. Here, the suction nozzle 61 sucks an approximate center part of the rear surface 2B in the longitudinal direction. Since as described previously, the first connection electrode 3 and the second connection electrode 4 are provided only on the side of the element formation surface 2A of the chip resistor 1, in the chip resistor 1, the rear surface 2B is a flat surface without the electrodes (recesses and projections). Hence, when the suction nozzle 61 is moved while sucked to the chip resistor 1, the suction nozzle 61 can be sucked to the flat rear surface 2B. In other words, with the flat rear surface 2B, it is possible to increase a margin of the part which can be sucked by the suction nozzle 61. In this way, the suction nozzle 61 is reliably sucked to the chip resistor 1, and the chip resistor 1 can be reliably transported to the part detection position P by the part recognizing camera 62 and onto the mounting substrate 54 without falling off from the suction nozzle 61 halfway through.

As shown in FIG. 20, when the chip resistor 1 reaches the part detection position P, a light source 64 (for example, a light application machine including a plurality of LEDs) installed around the part recognizing camera 62 applies light to the element formation surface 2A of the chip resistor 1 in an oblique direction. The part recognizing camera 62 detects the reflection light reflected by the element formation surface 2A, thereby distinguishes between light and dark of a region where the first connection electrode 3 and the second connection electrode 4 are formed from a region where they are not formed and determines the front and rear of the chip resistor 1.

The chip resistor 1 is not always sucked by the suction nozzle 61 in a horizontal position, and may be sucked by the suction nozzle 61 in an oblique position.

Here, as shown in FIG. 21, in the chip resistor 53 according to the reference example, when in an oblique position, light is applied from the light source 64 to the element formation surface 2A (see incident light λ3 in FIG. 21), the light is reflected off (total reflection: see incident light λ4 in FIG. 21) the first connection electrode 3 and the second connection electrode 4 toward the outside of the region where the part recognizing camera 62 is disposed, with the result that the light may not be detected by the part recognizing camera 62. In this case, according to the image information by the part recognizing camera 62, part or the whole of the first connection electrode 3 and the second connection electrode 4 in the chip resistor 53 appears dark. Hence, the automatic mounting machine 60 erroneously recognizes the region where the first connection electrode 3 and the second connection electrode 4 are formed as the region where they are not formed to stop the conveyance of the chip resistor 53 to the mounting substrate 54. Hence, in the chip resistor 53 according to the reference example, the occurrence of such erroneous recognition prevents the chip part from being smoothly mounted.

By contrast, in the chip resistor 1 of the first invention, as shown in FIG. 20, in the main surfaces 3A and 4A of the first connection electrode 3 and the second connection electrode 4 formed on the uppermost surface of the chip resistor 1, the external concave/convex structures 6 and 7 are respectively formed. Hence, even when the chip resistor 1 is sucked in an oblique position, light (see incident light λ1 in FIG. 20) applied from the light source 64 to the element formation surface 2A is diffusely reflected by the external concave/convex structures 6 and 7 (see incident light λ2 in FIG. 20). Hence, even when the chip resistor 1 is sucked in an oblique position as shown in FIG. 21, the incident light λ1 from the light source 64 can be reflected in all directions. Hence, even when the part recognizing camera 62 is disposed with respect to the part detection position P, the first connection electrode 3 and the second connection electrode 4 (the chip resistor 1) can be satisfactorily detected with the part recognizing camera 62. Since in this way, the automatic mounting machine 60 can reduce the erroneous recognition (enhance an electrode recognition rate) due to the specifications of the chip resistor 1, the chip resistor 1 can be stably mounted on the mounting substrate 54.

Moreover, since it suffices to perform the processing in which the external concave/convex structures 6 and 7 are formed in the first connection electrode 3 and the second connection electrode 4 of the chip resistor 1, it can be applied to chip parts of different specifications. Hence, it is not necessary to change the conditions (specifications) of the light source 64 disposed around the part recognizing camera 62 depending on the specifications of the chip part.

In the chip resistor 1, since the bonding area of the first connection electrode 3, and the second connection electrode 4 and the insulating films (the first insulating film 9 and the second insulating film 13) is increased by the anchor portion 24, it is possible to enhance the adhesion strength of the electrode to the substrate 2 (insulating film). For example, the present inventors have verified that as compared with a conventional chip resistor which had no anchor portion 24, the shear strength was enhanced by about 15%. In particular, in the preferred embodiment, as shown in FIG. 14, the concave portions 17 of the internal concave/convex structure 18 are filled with the embedding portion 22, and the interface (for example, the interface between the anchor portion 24 and the external connection portion 29) between different types of metals are not present in the concave portions 17. In other words, since the interface between different types of metals in which its bonding force is lower than metal bonding in a metal crystal is not present, it is possible to enhance the strength of the anchor portion 24 itself within the concave portion 17.

The anchor portion 24 is formed with a wiring film (in the preferred embodiment, the second wiring film 19) that is normally used in a chip part, and can be formed in the same step as in the wiring film. Hence, it is possible to prevent the number of steps from being increased due to the formation of the anchor portion 24.

Figure 22:
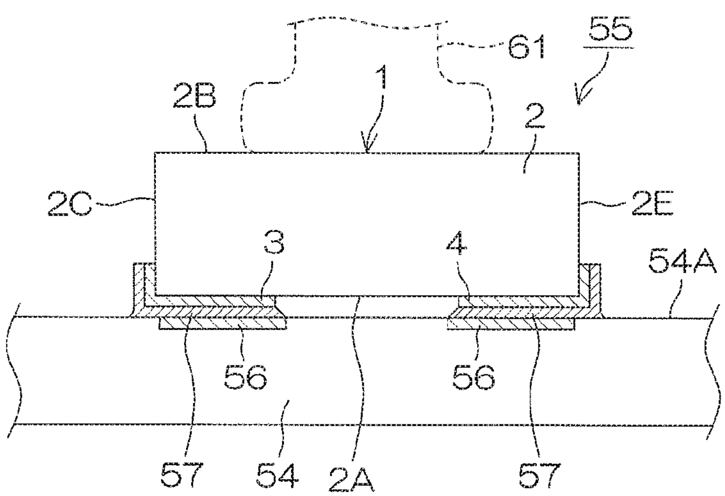
FIG. 22 is a diagram showing a circuit assembly in a state where the chip resistor is mounted on a mounting substrate.
Figure 23:
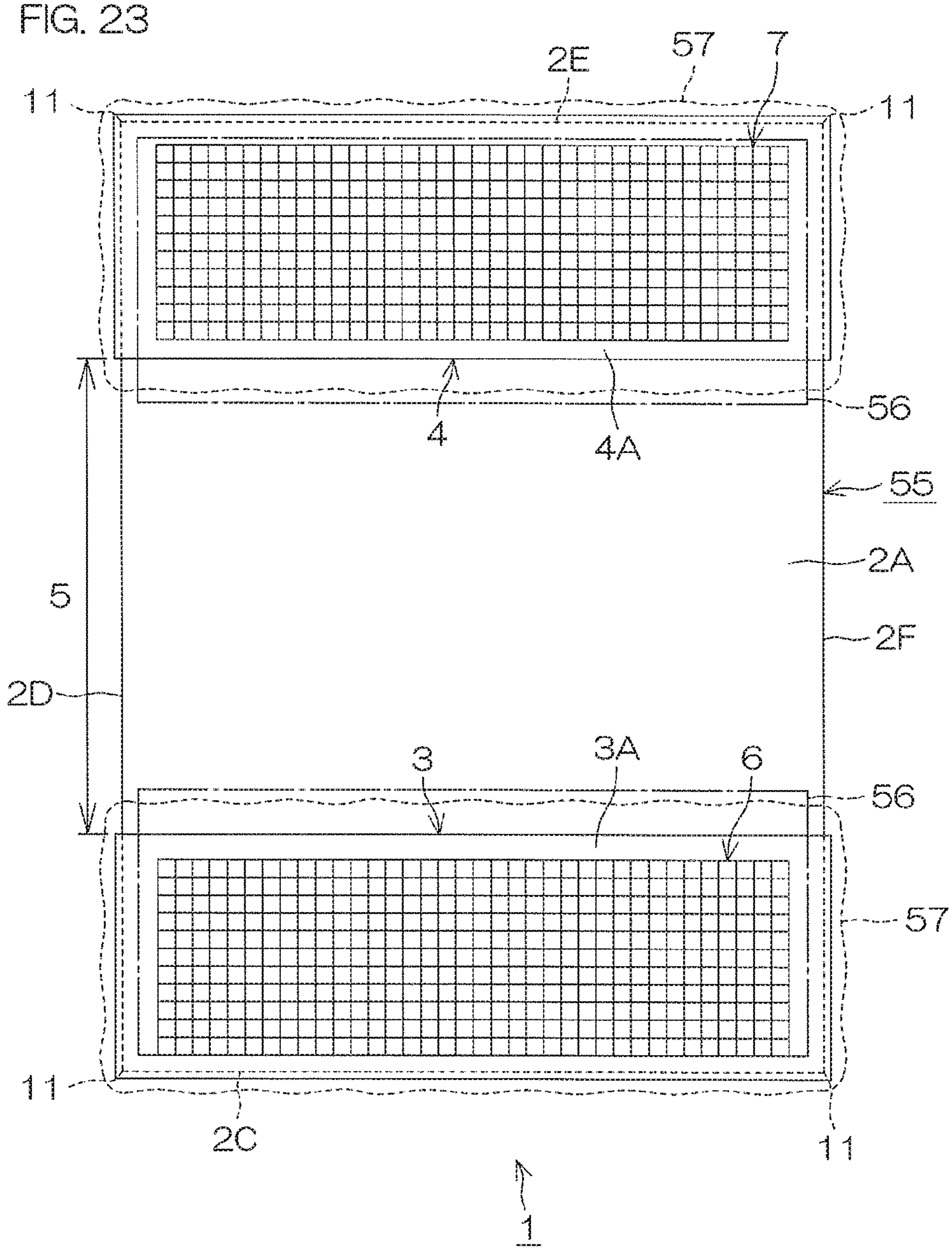
FIG. 23 is a diagram of the chip resistor mounted on the mounting substrate when seen from the side of an element formation surface.

The chip resistor 1 that undergoes the steps described above is thereafter mounted on the mounting substrate 54 shown in FIGS. 22 and 23.

FIG. 22 is a diagram showing a circuit assembly 55 in a state where the chip resistor 1 is mounted on the mounting substrate 54. FIG. 23 is a diagram of the chip resistor 1 mounted on the mounting substrate 54 when seen from the side of the element formation surface 2A.

As shown in FIG. 22, the chip resistor 1 is mounted on the mounting substrate 54. The chip resistor 1 and the mounting substrate 54 in this state form the circuit assembly 55. The upper surface of the mounting substrate 54 in FIG. 22 is a mounting surface 54A. In the mounting surface 54A, a pair (two) of lands 56 that are connected to the internal circuit (not shown) of the mounting substrate 54 are formed. Each land 56 is formed of, for example, Cu. On the surface of each land 56, a solder 57 is provided so as to protrude from the surface.

After the front/rear judgement step, the automatic mounting machine 60 moves the suction nozzle 61 to the mounting substrate 54 while sucking the chip resistor 1. Here, the element formation surface 2A of the chip resistor 1 and the mounting surface 54A of the mounting substrate 54 are opposite each other. In this state, the suction nozzle 61 is moved to be pressed onto the mounting substrate 54, in the chip resistor 1, the first connection electrode 3 is brought into contact with the solder 57 on one of the lands 56 and the second connection electrode 4 is brought into contact with the solder 57 on the other land 56. Then, when the solder 57 is heated, the solder 57 is melted. Thereafter, when the solder 57 is cooled to be solidified, the first connection electrode 3 and the one land 56 are bonded to each other via the solder 57, and the second connection electrode 4 and the other land 56 are bonded to each other via the solder 57. In other words, the two lands 56 are individually solder-bonded to the corresponding electrodes in the first connection electrode 3 and the second connection electrode 4. In this way, the mounting (the flip-chip connection) of the chip resistor 1 to the mounting substrate 54 is completed, and the circuit assembly 55 is finished. Here, on the upper most surfaces of the first connection electrode 3 and the second connection electrode 4 functioning as the external connection electrodes of the chip resistor 1, the Au layer 32 (gold plating) is formed. Hence, when the chip resistor 1 is mounted on the mounting substrate 54, it is possible to achieve excellent solder wettability and high reliability.

In the finished circuit assembly 55, the element formation surface 2A of the chip resistor 1 and the mounting surface 54A of the mounting substrate 54 are opposite each other with a gap therebetween and are extended parallel to each other (also see FIG. 23). The dimension of the gap corresponds to the total of the thickness of a part protruding from the element formation surface 2A in the first connection electrode 3 or the second connection electrode 4 and the thickness of the solder 57.

As shown in FIG. 22, in cross section, for example, the first connection electrode 3 and the second connection electrode 4 are formed in the shape of the letter L by integrally forming the surface part on the element formation surface 2A and the side surface parts on the side surfaces 2C and 2E. Hence, as shown in FIG. 23, when the circuit assembly 55 (to be exact, the part where the chip resistor 1 and the mounting substrate 54 are bonded) is seen in a direction normal to the mounting surface 54A (the element formation surface 2A) (the direction orthogonal to these surfaces), the solder 57 bonding the first connection electrode 3 and the one land 56 is sucked not only to the surface part of the first connection electrode 3 but also to the side surface parts. Likewise, the solder 57 bonding the second connection electrode 4 and the other land 56 is sucked not only to the surface part of the second connection electrode 4 but also to the side surface parts.

As described above, in the chip resistor 1, the first connection electrode 3 is formed so as to integrally cover the three side surfaces 2C, 2D, and 2F of the substrate 2, and the second connection electrode 4 is formed so as to integrally cover the three side surfaces 2E, 2D, and 2F of the substrate 2. In other words, since the electrodes are formed not only on the element formation surface 2A but also on the side surfaces 2C to 2F of the substrate 2, the adhesion area when the chip resistor 1 is soldered to the mounting substrate 54 can be increased. Consequently, since the amount of adsorption of the solder 57 to the first connection electrode 3 and the second connection electrode 4 can be increased, the adhesion strength can be enhanced.

As shown in FIG. 23, the solder 57 is adsorbed so as to extend from the element formation surface 2A to the side surfaces 2C to 2F of the substrate 2. Hence, in the mounted state, the first connection electrode 3 is held with the three side surfaces 2C, 2D, and 2F by the solder 57, and the second connection electrode 4 is held with the three side surfaces 2E, 2D, and 2F by the solder 57, with the result that all the side surfaces 2C to 2F of the rectangular chip resistor 1 can be fixed by the solder 57. In this way, it is possible to stabilize the mounting shape of the chip resistor 1.

Figure 24:
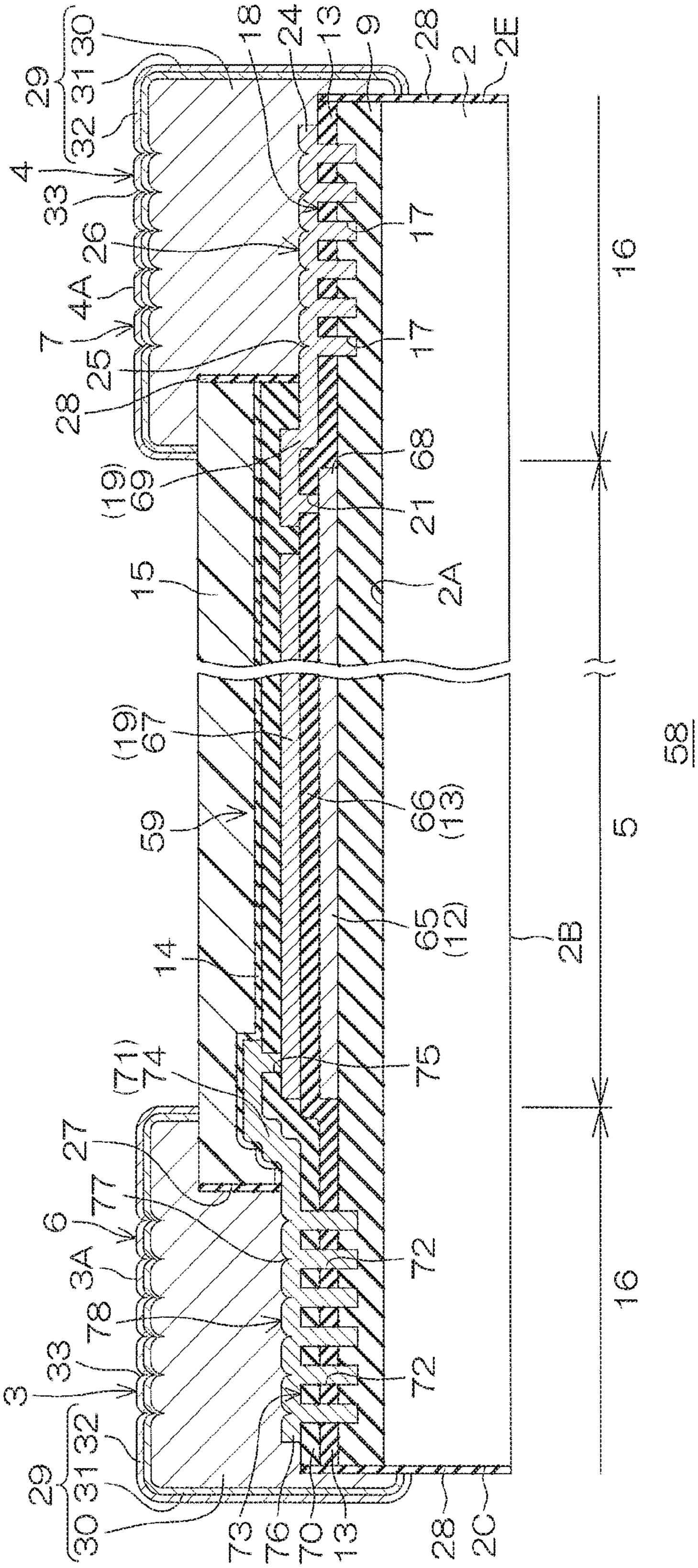
FIG. 24 is a schematic cross-sectional view of a chip capacitor according to a second preferred embodiment of the first invention.

FIG. 24 is a schematic cross-sectional view of a chip capacitor 58 according to a second preferred embodiment of the first invention. In FIG. 24, the elements corresponding to those in FIG. 13 described previously are provided with the same reference symbols.

In the chip capacitor 58, as an example of the circuit element of the first invention, a capacitor 59 is formed in the element region 5. The capacitor 59 includes a lower electrode 65 formed with the first wiring film 12, a dielectric film 66 formed with the second insulating film 13 and an upper electrode 67 formed with the second wiring film 19. The lower electrode 65 and the upper electrode 67 are opposite each other via the dielectric film 66, and thus the capacitor 59 is formed.

The lower electrode 65 includes a contact portion 68 that is drawn from a region opposite the upper electrode 67 to the side of the second connection electrode 4. The second wiring film 19 (lower wiring film 69) forming the anchor portion 24 of the second connection electrode 4 is connected via the through holes 21 to the contact portion 68.

As with the lower wiring film 69, the upper electrode 67 is formed on the second insulating film 13. In other words, in the preferred embodiment, in a region on the second insulating film 13, the upper electrode 67 and the lower wiring film 69 are disposed at an interval left therebetween.

The chip capacitor 58 further includes a third insulating film 70 and a third wiring film 71 between the second insulating film 13 and the passivation film 14.

The third insulating film 70 is formed of, for example, an insulating material such as $SiO_2$ (silicon oxide). The thickness of the third insulating film 70 is, for example, 0.15 to 1.5 μm. Although the third insulating film 70 is formed substantially over the entire region on the second insulating film 13 so as to cover the second insulating film 19, the anchor portion 24 of the second connection electrode 4 is selectively exposed. Hence, the end surface of the third insulating film 70 coincides with the end surface 27 of the resin film 15 on the side of the second connection electrode 4.

In the chip capacitor 58, in the electrode region 16 immediately below the first connection electrode 3, a plurality of concave portions 72 are formed that pass through the third insulating film 70 and the second insulating film 13 and that extends halfway along the direction of the thickness of the first insulating film 9. In other words, one concave portion 72 is defined by continuously forming the concave portion of the first insulating film 9 and the through holes of the second insulating film 13 and the third insulating film 70. In the preferred embodiment, as with the plurality of concave portions 17, the plurality of concave portions 72 are arrayed in a matrix in plan view when seen in a direction normal to the element formation surface 2A. In this way, in the electrode region 16 of the first connection electrode 3, an internal concave/convex structure 73 formed by the aggregation of a plurality of concave portions 72 is formed. The depth of the plurality of concave portions 72 is greater than that of the plurality of concave portions 17 due to the depth of the third insulating film 70. On the other hand, in the first preferred embodiment of the first invention described previously, a plurality of concave portions 17 having the same depth is formed in the electrode region 16 of the first connection electrode 3 and the second connection electrode 4.

The third wiring film 71 is formed of Al (aluminum) or an alloy (Al—Cu alloy) of Al and Cu (copper). The thickness of the third wiring film 71 is about 8000 angstroms. In the preferred embodiment, the third wiring film 71 includes an upper wiring film 74 that electrically connects the first connection electrode 3 and the upper electrode 67.

The upper wiring film 74 is formed so as to extend from the element region 5 through the boundary between the element region 5 and the electrode region 16 of the first connection electrode 3 to the electrode region 16.

In the element region 5, the upper wiring film 74 is connected as a via through a through hole 75 formed in the third insulating film 70 to the upper electrode 67.

On the other hand, in the electrode region 16 of the first connection electrode 3, the upper wiring film 74 is extended into the concave portion 72 of the internal concave/convex structure 73. In other words, the upper wiring film 74 includes, as parts of the first connection electrode 3, an anchor portion 76 that is embedded in the direction of thickness of an insulating film (in the preferred embodiment, the first insulating film 9, the second insulating film 13, and the third insulating film 70) and that is fixed. Since the depth of a plurality of concave portions 72>the depth of a plurality of concave portions 17, in the chip capacitor 58, for the amount of embedding of the anchor portion in the insulating film (corresponding to the amount of embedding of the portion 22 in FIG. 14), the side of the first connection electrode 3 (the upper electrode 67)>the side of the second connection electrode 4 (the lower electrode 65) holds true.

In the surface of the anchor portion 76, as in the anchor portion 24, an intermediate concave/convex structure 78 formed with a plurality of concave portions 77 receiving the concave/convex shape of the internal concave/convex structure 73 is formed. The internal concave/convex structure 73 and the intermediate concave/convex structure 78 described above are present, and thus in the main surface 3A of the first connection electrode 3, the external concave/convex structure 6 is formed.

In the chip capacitor 58, the anchor portions 24 and 76 and the external concave/convex structures 6 and 7 are formed, and thus it is possible to realize the same actions and effects as the chip resistor 1.

Figure 25:
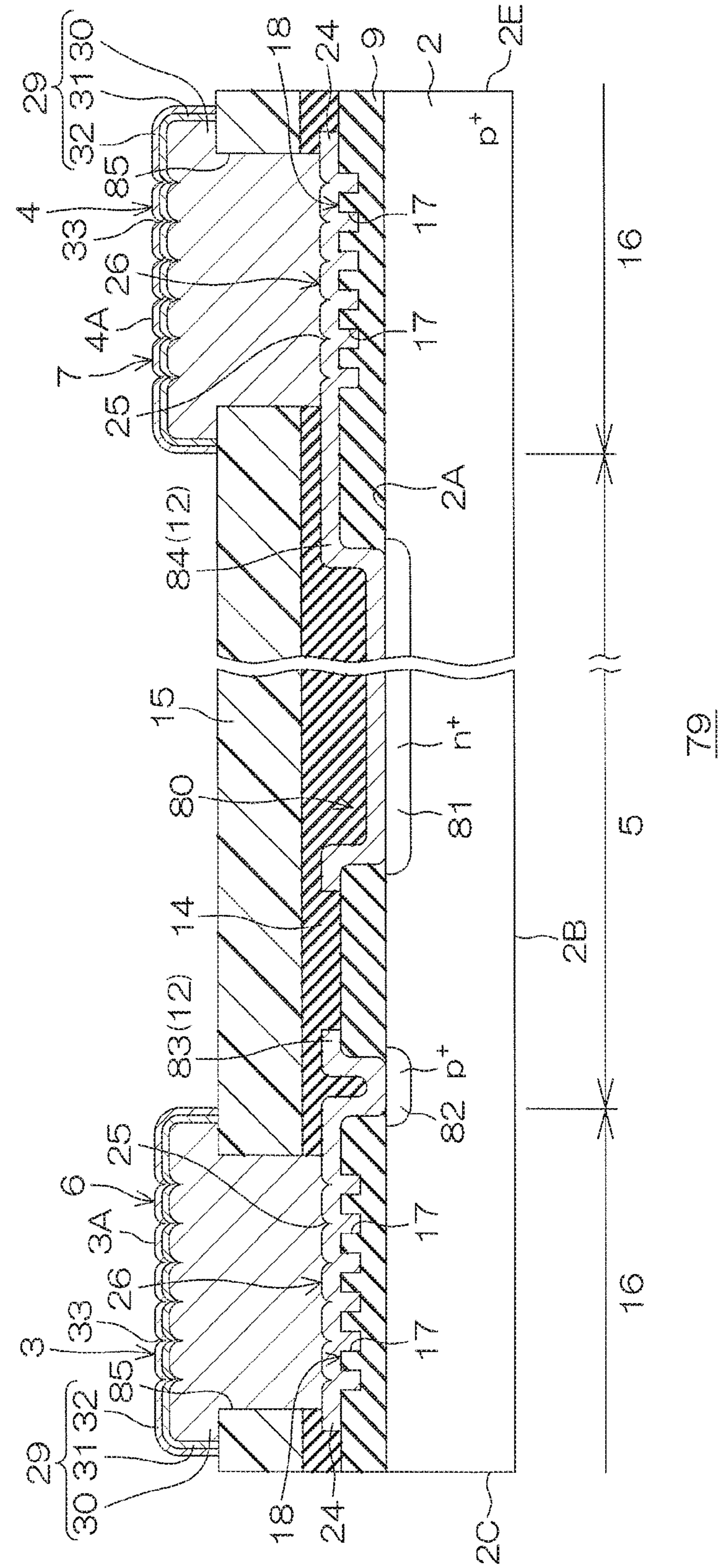
FIG. 25 is a schematic cross-sectional view of a chip diode according to a third preferred embodiment of the first invention.

FIG. 25 is a schematic cross-sectional view of a chip diode 79 according to a third preferred embodiment of the first invention. In FIG. 25, the elements corresponding to those in FIG. 13 described previously are provided with the same reference symbols.

In the chip diode 79, as an example of the circuit element of the first invention, a diode 80 is formed in the element region 5. The diode 80 is formed with a pn bonding portion of a $p^+$ type substrate 2 and an $n^+$ type region 81 formed on the surface portion of the substrate 2. In the surface portion of the substrate 2, a $p^+$ type region 82 is formed while being separated at an interval from the $n^+$ type region 81.

The chip diode 79 includes, as an example of the p-side film of the first invention formed with the first wiring film 12, an anode wiring film 83, and includes, as an example of the n-side film of the first invention, a cathode wiring film 84.

The anode wiring film 83 is connected via the first insulating film 9 to the $p^+$ type region 82, and the end portion on the side opposite thereto forms the anchor portion 24 in the electrode region 16 of the first connection electrode 3. Likewise the cathode wiring film 84 is connected via the first insulating film 9 to the $n^+$ type region 81, and the end portion on the side opposite thereto forms the anchor portion 24 in the electrode region 16 of the second connection electrode 4.

In the chip diode 79, the passivation film 14 and the resin film 15 are formed substantially over the entire region of the element formation surface 2A, and in each electrode region 16, an opening 85 that exposes part of the anchor portion 24 is included therein. The external connection portion 29 embedded in the opening 85 is formed so as to cover the peripheral portion of the opening 85. In other words, in the surface of the resin film 15, the first connection electrode 3 and the second connection electrode 4 are disposed in a position displaced inwardly with respect to the end surface (the end surface of the chip) of the resin film 15, and a constant clearance is provided between the end surface of the resin film 15 and the peripheral edge of the first connection electrode 3 and the second connection electrode 4.

In the chip diode 79, the anchor portion 24 and the external concave/convex structures 6 and 7 are formed, and thus it is possible to realize the same actions and effects as the chip resistor 1.

Although the example of the chip part according to the preferred embodiment of the first invention (the chip resistor 1, the chip capacitor 58, and the chip diode 79) is described above, the first invention can be carried out with other preferred embodiments.

For example, the first invention can be applied to other chip parts such as a chip inductor, a chip fuse, a bidirectional Zener diode chip. When the first invention is applied to a chip resistor, a chip capacitor and a chip diode, the arrangement of the element region 5 is not limited to the arrangement described above. For example, unlike the arrangement described above, the resistor portion formed in the element region 5 may be formed such that the resistance value cannot be adjusted by the blowing of the fuses F.

Figure 26:
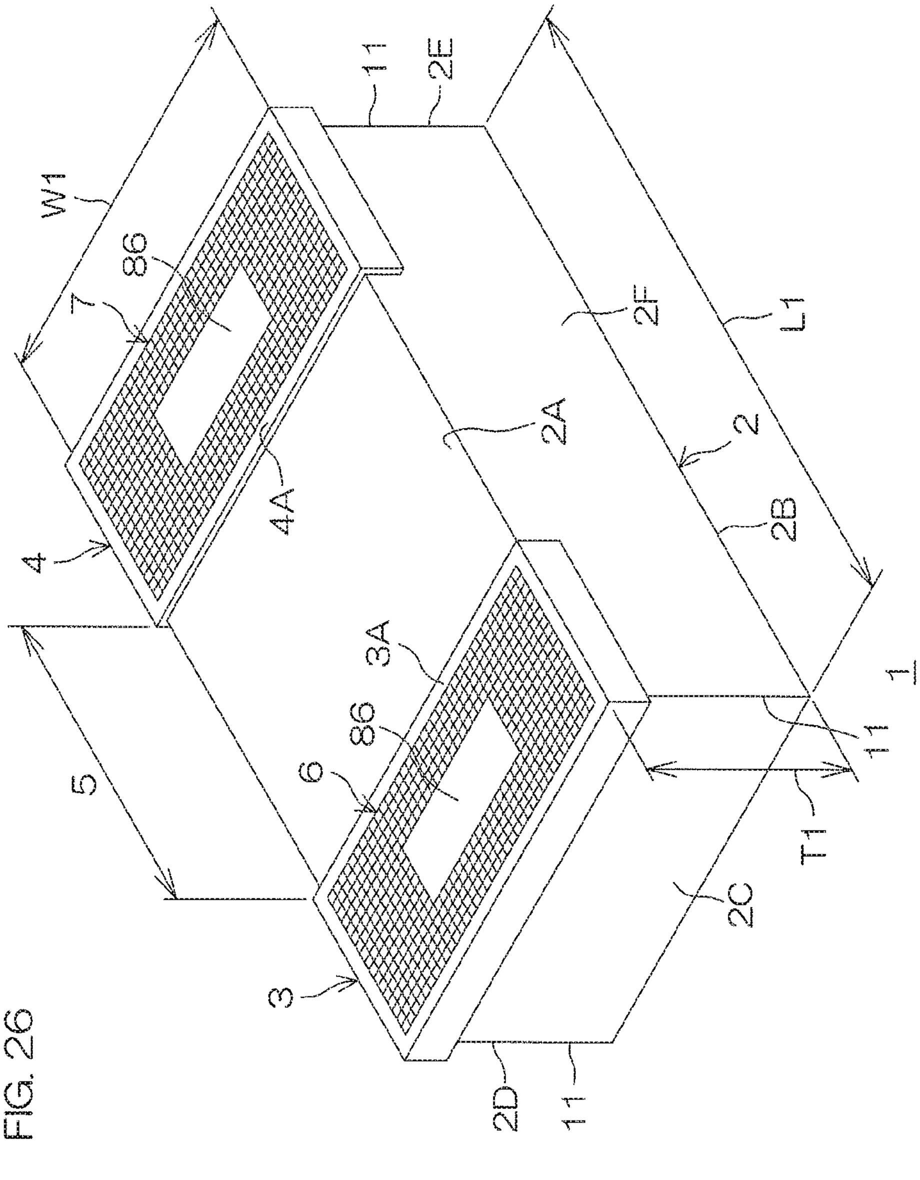
FIG. 26 is a diagram showing a modification example of an external concave/convex structure.

For example, as shown in FIG. 26, the external concave/convex structures 6 and 7 may be formed along the peripheral edge of the first connection electrode 3 and the second connection electrode 4 such that a flat portion 86 is formed in the center portion of the first connection electrode 3 and the second connection electrode 4. The flat portion 86 is formed with a smooth surface in which the external concave/convex structures 6 and 7 are not formed. When the flat portion 86 is formed, for example, in the step of FIG. 15L, the flat portion 86 is selected as a contact target of the probes 45, and thus it is possible to satisfactorily prevent the probes 45 from being damaged at the time of contact with the first connection electrode 3 and the second connection electrode 4.

Figure 27:
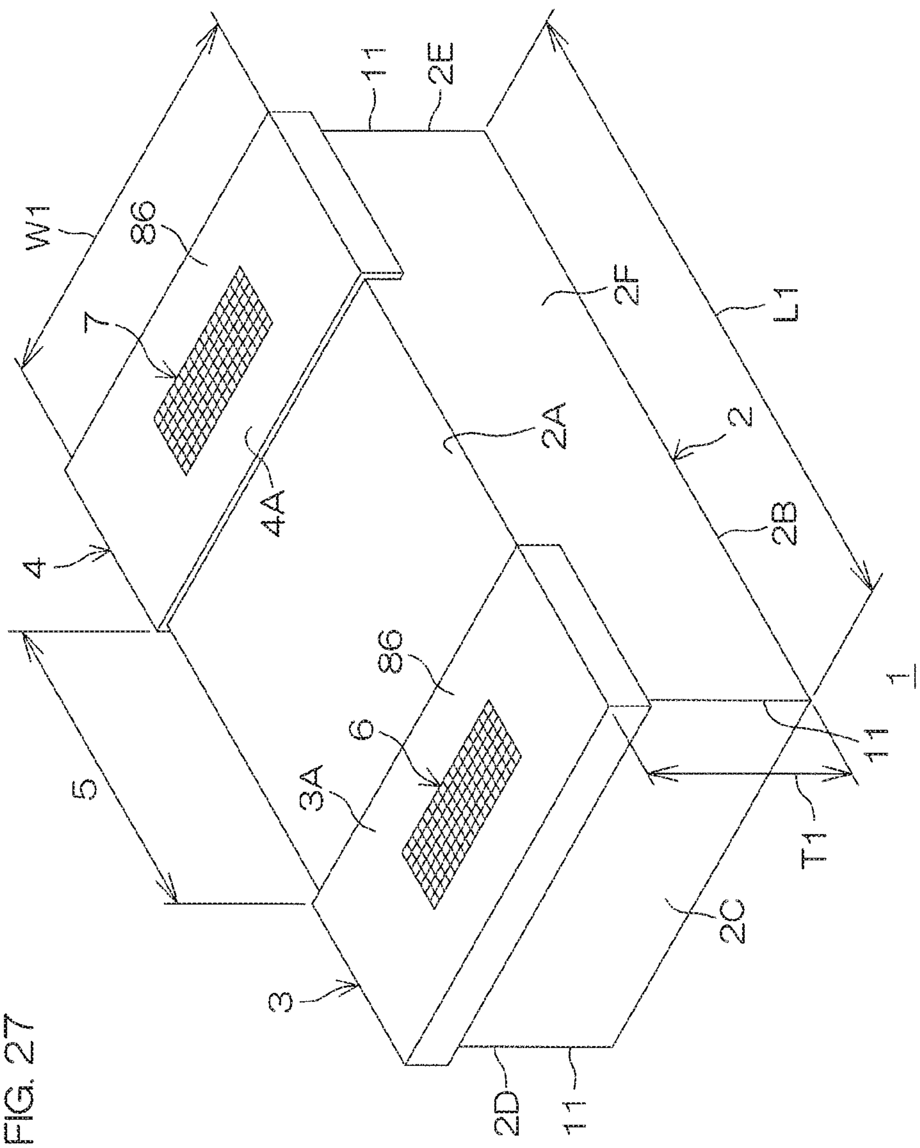
FIG. 27 is a diagram showing another modification example of the external concave/convex structure.

As shown in FIG. 27, the flat portion 86 described above may be formed along the peripheral edge of the first connection electrode 3 and the second connection electrode 4 or can be applied with other various patterns. In the case of FIG. 27, in the center portion of the first connection electrode 3 and the second connection electrode 4, the external concave/convex structures 6 and 7 surrounded by the flat portion 86 are formed. Furthermore, a plurality of flat portions 86 may be formed in one electrode.

Figure 28:
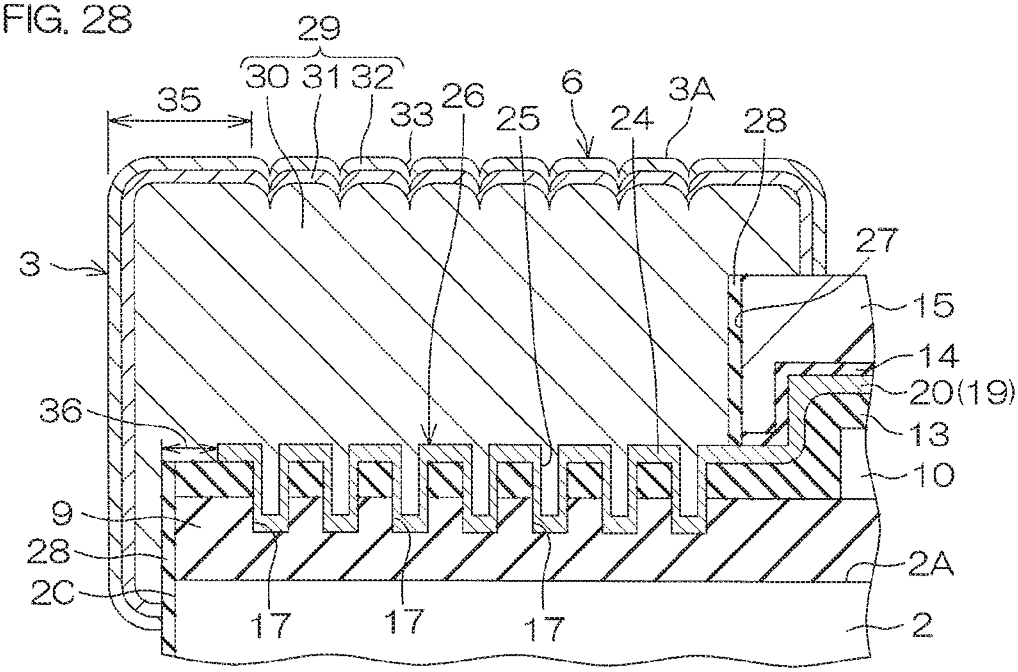
FIG. 28 is a diagram showing a modification example of an anchor portion.

The anchor portion 24 does not need to completely fill the concave portions 17 of the internal concave/convex structure 18, and as shown in FIG. 28, may be formed along the recesses and projections of the internal concave/convex structure 18. In this case, in the concave portions 17, the external connection portion 29 may be embedded in the space within the anchor portion 24. For example, unlike the preferred embodiment described previously, the anchor portion 24 can be formed by forming the second wiring film 19 so as to have a relatively small thickness such that the concave portions 17 are prevented from being completely refilled in the second wiring film 19. This arrangement can be applied to the anchor portion 76.

Figure 29:
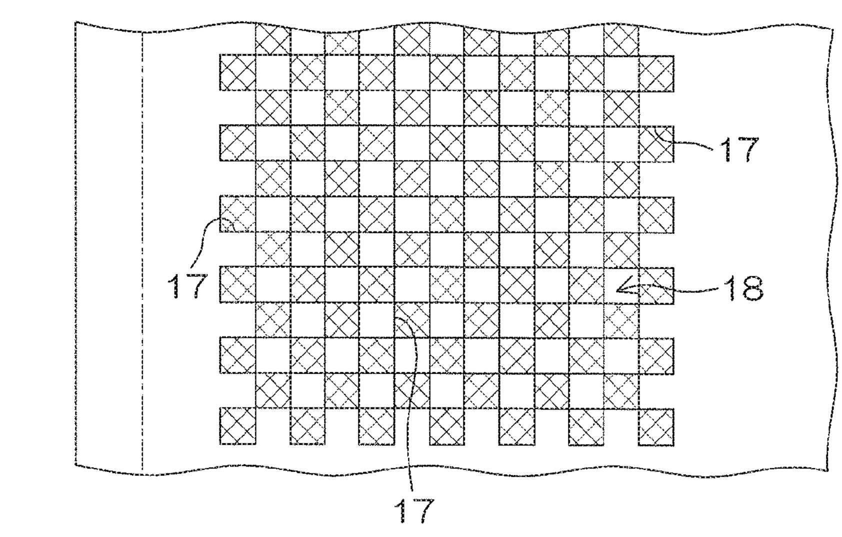
FIG. 29 is a diagram showing a modification example of an internal concave/convex structure.

As a regular pattern, the alignment pattern of a plurality of concave portions 17 may be a staggered pattern as shown in FIG. 29 or may be an irregular pattern.

Figure 30:
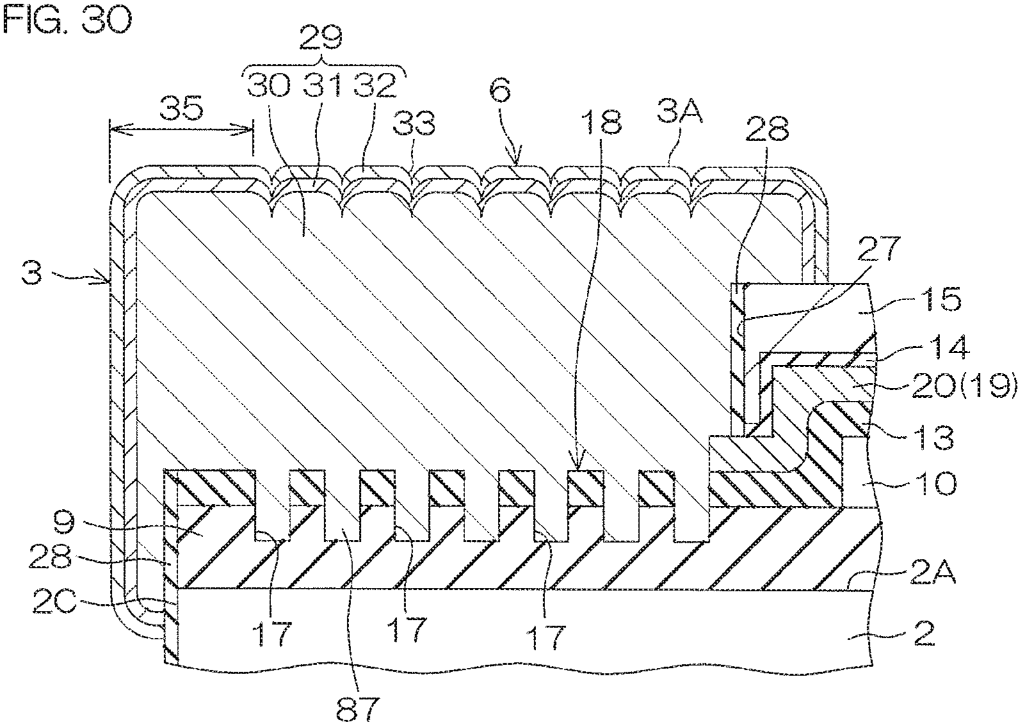
FIG. 30 is a diagram showing another modification example of the anchor portion.

The anchor portion does not need to be formed with a wiring film, and as shown in FIG. 30, the external connection portion 29 may integrally include an anchor portion 87.

Various design changes can be made in the scope indicated by the scope of claims.

Figure 31:
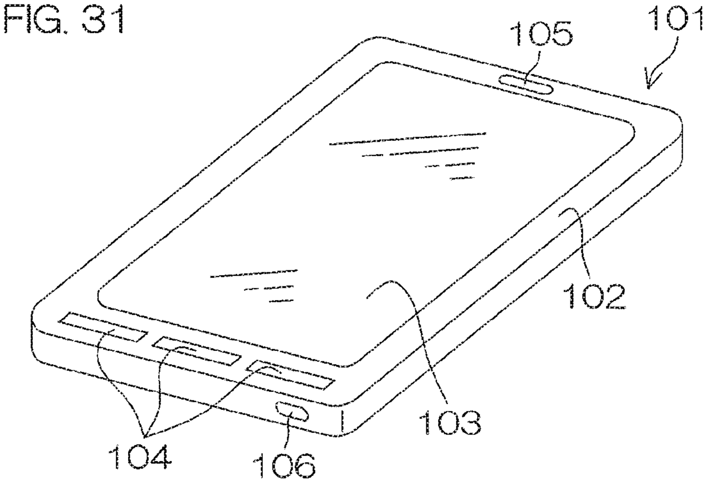
FIG. 31 is an external view of a smartphone according to a preferred embodiment of the first invention.

FIG. 31 is an external view of a smartphone 101 according to a preferred embodiment of the first invention.

In the smartphone 101, electronic parts are stored within a housing 102 in the shape of a flat rectangular parallelepiped.

In the housing 102, a pair of rectangular main surfaces are provided on the front side and the rear side, and the pair of main surfaces are coupled by four side surfaces. The display surface of a display panel 103 formed with a liquid crystal panel, an organic EL or the like is exposed to one of the main surfaces of the housing 102. The display surface of the display panel 103 forms a touch panel, and provides an input interface for a user.

The display panel 103 is formed in the shape of a rectangle that covers a large proportion of the one main surface of the housing 102. Operation buttons 104 are disposed along one short side of the display panel 103. In the preferred embodiment, a plurality of (three) operation buttons 104 are arrayed along the short side of the display panel 103. The user operates the operation buttons 104 and the touch panel to operate smartphone 101 and thereby can call and perform the necessary function.

In the vicinity of the other short side of the display panel 103, a speaker 105 is disposed. The speaker 105 provides an earpiece for a telephone function, and is also used as an acoustic unit for reproducing music data and the like. On the other hand, near the operation buttons 104, a microphone 106 is disposed on one side surface of the housing 102. The microphone 106 provides a mouthpiece for the telephone function, and can also be used as a recording microphone.

Figure 32:
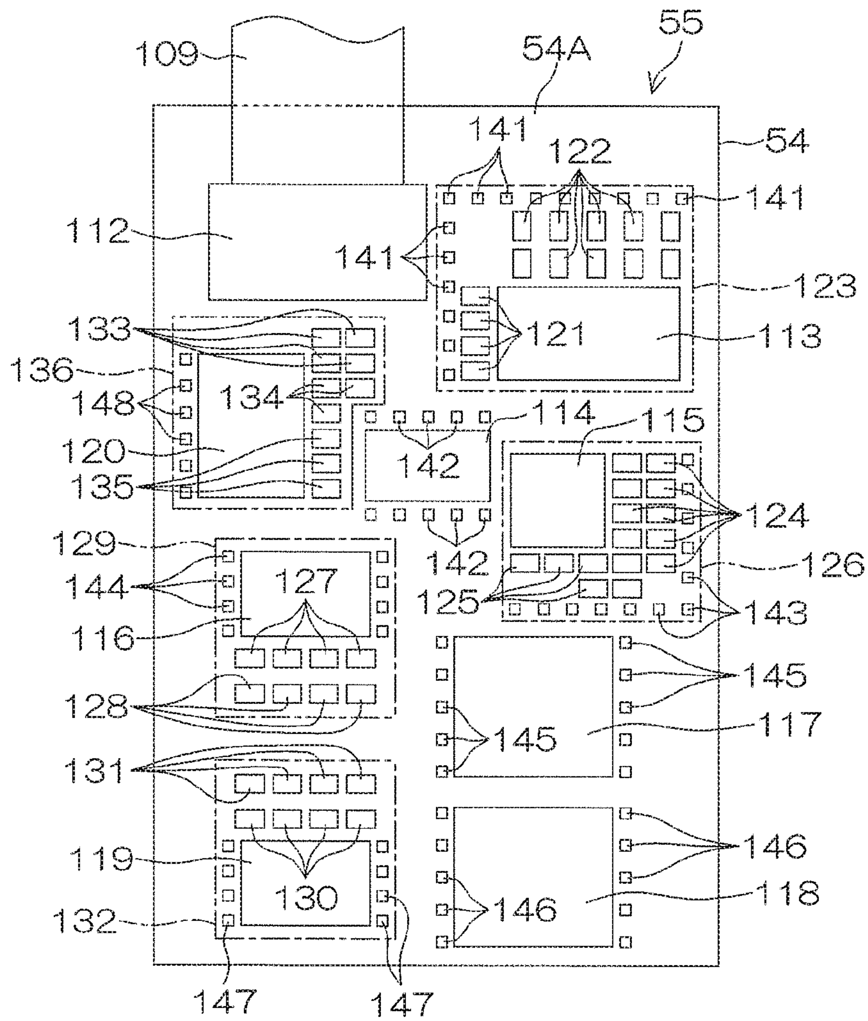
FIG. 32 is a diagram for illustrating the internal structure of the smartphone of FIG. 31.

FIG. 32 is a diagram for illustrating the internal structure of the smartphone 101 of FIG. 31.

The circuit assembly 55 includes the mounting substrate 54 and circuit parts mounted on the mounting surface 54A of the mounting substrate 54. A plurality of circuit parts include a plurality of integrated circuit elements (IC) 112 to 120 and a plurality of chip parts. The plurality of ICs include a transmission processing IC 112, a one-segment TV receiving IC 113, a GPS receiving IC 114, an FM tuner IC 115, a power supply IC 116, a flash memory 117, a microcomputer 118, a power supply IC 119 and a baseband IC 120.

The plurality of chip parts include chip inductors 121, 125, and 135, chip resistors 122, 124, and 133, chip capacitors 127, 130, and 134, chip diodes 128 and 131 and bidirectional Zener diode chips 141 to 148. These chip parts correspond to the chip parts described in the preferred embodiment described previously, and are mounted by, for example, flip-chip bonding to the mounting surface 54A of the mounting substrate 54.

The bidirectional Zener diode chips 141 to 148 are provided to perform absorbing positive and negative surges, etc., in signal input lines to the one-segment TV receiving IC 113, the GPS receiving IC 114, the FM tuner IC 115, the power supply IC 116, the flash memory 117, the microcomputer 118, the power supply IC 119 and the baseband IC 120.

The transmission processing IC 112 incorporates an electronic circuit for generating a display control signal for the display panel 103 and receiving an input signal from the touch panel on the surface of the display panel 103. For connection to the display panel 103, a flexible wiring 609 is connected to the transmission processing IC 112.

The one-segment TV receiving IC 113 incorporates an electronic circuit of a receiver for receiving radio waves of the one-segment broadcast (digital terrestrial TV broadcasting having a portable device as a reception target). In the vicinity of the one-segment TV receiving IC 113, a plurality of chip inductors 121, a plurality of chip resistors 122, and a plurality of bidirectional Zener diode chips 141 are disposed. The one-segment TV receiving IC 113, the chip inductor 121, the chip resistor 122, and the bidirectional Zener diode chip 141 form a one-segment broadcast receiving circuit 123. The chip inductor 121 and the chip resistor 122 respectively have an inductance and a resistance adjusted accurately, and provide a highly accurate circuit constant to the one-segment broadcast receiving circuit 123.

The GPS receiving IC 114 incorporates an electronic circuit that receives radio waves from the GPS satellites to output positional information to the smartphone 101. In the vicinity of GPS receiving IC 114, a plurality of bidirectional Zener diode chips 142 are disposed.

The FM tuner IC 115 forms an FM broadcast receiving circuit 126 together with a plurality of chip resistors 124, a plurality of chip inductors 125, and a plurality of bidirectional Zener diode chips 143 mounted on the mounting substrate 54 in the vicinity thereof. The chip resistor 124 and the chip inductor 125 respectively have a resistance value and an inductance adjusted accurately, and provide a highly accurate circuit constant to the FM broadcast receiving circuit 126.

In the vicinity of the power supply IC 116, a plurality of chip capacitors 127, a plurality of chip diodes 128, and a plurality of bidirectional Zener diode chips 144 are mounted on the mounting surface 54A of the mounting substrate 54. The power supply IC 116 forms a power supply circuit 129 together with the chip capacitor 127, the chip diode 128, and the bidirectional Zener diode chip 144.

The flash memory 117 is a storage device for recording an operating system program, data generated within the smartphone 101, data and programs acquired by a communication function from the outside and the like. In the vicinity of the flash memory 117, a plurality of bidirectional Zener diode chips 145 are disposed.

The microcomputer 118 is a computation processing circuit that incorporates a CPU, a ROM, and a RAM and that performs various types of computation processing to realize a plurality of functions in the smartphone 101. More specifically, image processing and computation processing for various types of application programs are realized by the function of the microcomputer 118. In the vicinity of the microcomputer 118, a plurality of bidirectional Zener diode chips 146 are disposed.

Near the power supply IC 119, a plurality of chip capacitors 130, a plurality of chip diodes 131, and a plurality of bidirectional Zener diode chips 147 are mounted on the mounting surface 54A of the mounting substrate 54. The power supply IC 119 forms a power supply circuit 132 together with the chip capacitor 130, the chip diode 131, and the bidirectional Zener diode chip 147.

Near the baseband IC 120, a plurality of chip resistors 133, a plurality of chip capacitors 134, a plurality of chip inductors 135, and a plurality of bidirectional Zener diode chips 148 are mounted on the mounting surface 54A of the mounting substrate 54. The baseband IC 120 forms a baseband communication circuit 136 together with the chip resistor 133, the chip capacitor 134, the chip inductor 135, and a plurality of bidirectional Zener diode chips 148. The baseband communication circuit 136 provides a communication function for telephone communication and data communication.

In the arrangement described above, power appropriately adjusted by the power supply circuits 129 and 132 is supplied to the transmission processing IC 112, the GPS receiving IC 114, the one-segment broadcast receiving circuit 123, the FM broadcast receiving circuit 126, the baseband communication circuit 136, the flash memory 117, and the microcomputer 118. The microcomputer 118 performs computation processing in response to an input signal input via the transmission processing IC 112, and outputs a display control signal from the transmission processing IC 112 to the display panel 103 to make the display panel 103 produce various types of display.

When an instruction to receive the one-segment broadcast is provided by the operation of the touch panel or the operation buttons 104, the one-segment broadcast is received by the function of the one-segment broadcast receiving circuit 123. Then, computation processing for outputting an image received to the display panel 103 and converting sound received into acoustic sound from the speaker 105 is performed by the microcomputer 118.

When the positional information of the smartphone 101 is needed, the microcomputer 118 acquires the positional information output by the GPS receiving IC 114, and performs computation processing using the positional information.

Furthermore, when an instruction to receive FM broadcast is input by the operation of the touch panel or the operation buttons 104, the microcomputer 118 starts up the FM broadcast receiving circuit 126, and performs computation processing for outputting the received sound from the speaker 105.

The flash memory 117 is used to store data acquired by communication, to compute the microcomputer 118, and to store data produced by an input from the touch panel. As necessary, the microcomputer 118 writes data into the flash memory 117 and reads data from the flash memory 117.

The function of telephone communication or data communication is realized by the baseband communication circuit 136. The microcomputer 118 controls the baseband communication circuit 136 to perform processing for receiving and transmitting sound or data.

[2] Second Invention and Third Invention

An object of the second invention is to provide a chip inductor in which the Q (Quality Factor) value of a coil is high and a circuit assembly that includes it.

Another object of the second invention is to provide a method of manufacturing a chip inductor in which the Q value of a coil is high.

The second invention has the following features.

A1. A chip inductor including: a substrate that has an element formation surface; a coil formation trench that is formed in the substrate by digging down from the element formation surface and that is formed in the shape of a spiral in plan view when seen in a normal direction perpendicular to the element formation surface; and a coil that is formed with a conductive member embedded within the coil formation trench.

Since in this arrangement, it is possible to increase the cross-sectional area of the coil (cross-sectional area perpendicular to a direction in which the coil is extended in the spiral direction), it is possible to decrease the internal resistance of the coil. In this way, it is possible to increase the Q value of the coil, with the result that it is possible to provide a high performance chip inductor.

Since the coil formation trench is formed in the substrate, the conductive member is embedded within the coil formation trench and thus the coil can be formed, it is easy to manufacture the coil. In this way, it is possible to provide a chip inductor that is easily manufactured.

A2. The chip inductor described in "A1" further including: a first electrode which is disposed on the element formation surface and to which one end portion of the coil is electrically connected; and a second electrode which is disposed on the element formation surface and to which the other end portion of the coil is electrically connected.

A3. The chip inductor described in "A2," where the element formation surface is rectangular in plan view, the first electrode is disposed on an end portion of the element formation surface, the second electrode is disposed on the other end portion of the element formation surface, and the coil formation trench is formed in a region between the first electrode and the second electrode in the element formation surface.

A4. The chip inductor described in "A2" or "A3" further including: a first insulating film which is formed on the element formation surface so as to cover the coil and which includes, in regions corresponding to the one end portion and the other end portion of the coil, a first contact hole and a second contact hole, respectively, where the first electrode and the second electrode are formed on the first insulating film, the first electrode is connected via the first contact hole to the one end portion of the coil and the second electrode is connected via the second contact hole to the other end portion of the coil.

A5. The chip inductor described in "A2" or "A3" further including: a spiral wiring which is formed on the element formation surface so as to be along the coil and to make contact with the coil; and a first insulating film which is formed on the element formation surface so as to cover the spiral wiring and which includes, in regions corresponding to one end portion and the other end portion of the spiral wiring, a first contact hole and a second contact hole, respectively, where the first electrode and the second electrode are formed on the first insulating film, the first electrode is connected via the first contact hole to the one end portion of the spiral wiring and the second electrode is connected via the second contact hole to the other end portion of the spiral wiring.

In this arrangement, even when an area is produced where the conductive member is unsatisfactorily embedded within the coil formation trench, it is possible to compensate for the area with the spiral wiring. In this way, even when the conductive member is unsatisfactorily embedded within the coil formation trench, and thus a break is produced halfway along the coil, the break can be connected by the spiral wiring.

A6. The chip inductor described in any one of "A2" to "A5" further including: a plurality of first electrode-side trenches which are formed, in the region corresponding to the first electrode in the element formation surface, in the substrate by digging down from the element formation surface; and a plurality of second electrode-side trenches which are formed, in the region corresponding to the second electrode in the element formation surface, in the substrate by digging down from the element formation surface, where a surrounding wall of each of the first electrode-side trenches in the substrate is formed on an insulator portion having insulation, and a surrounding wall of each of the second electrode-side trenches in the substrate is formed on an insulator portion having insulation.

In this arrangement, at least a part of a part opposite the first electrode and a part opposite the second electrode in the substrate can be formed with the insulator portion having insulation. In this way, a parasitic capacitance formed between the substrate and the first electrode and a parasitic capacitance formed between the substrate and the second electrode can be reduced as compared with a case where a main body substrate (semiconductor substrate) having no insulator portion is used.

A7. The chip inductor described in "A6," where the plurality of first electrode-side trenches are formed, in plan view, in a shape of a rectangle which is long in one direction, and are disposed at an interval in a direction perpendicular to the one direction, the plurality of second electrode-side trenches are formed, in plan view, in a shape of a rectangle which is long in one direction, and are disposed at an interval in a direction perpendicular to the one direction, an entire region of a wall between the first electrode-side trenches adjacent in the substrate is formed as an insulator portion and an entire region of a wall between the second electrode-side trenches adjacent in the substrate is formed as an insulator portion. In this arrangement, it is possible to more effectively reduce the parasitic capacitance formed between the substrate and the first electrode and the parasitic capacitance formed between the substrate and the second electrode.

A8. The chip inductor described in "A6" or "A7," where a second insulating film is formed on an inner surface of each of the first electrode-side trenches and on an inner surface of each of the second electrode-side trenches. In this arrangement, it is possible to more effectively reduce the parasitic capacitance formed between the substrate and the first electrode and the parasitic capacitance formed between the substrate and the second electrode.

A9. The chip inductor described in "A8," where a substantially entire region within each of the first electrode-side trenches and a substantially entire region within each of the second electrode-side trenches are filled by the second insulating film. In this arrangement, it is possible to more effectively reduce the parasitic capacitance formed between the substrate and the first electrode and the parasitic capacitance formed between the substrate and the second electrode.

A10. The chip inductor described in any one of "A6" to "A9," where the plurality of first electrode-side trenches and the plurality of second electrode-side trenches are formed in the same step as the coil formation trench. In this arrangement, it is possible to manufacture the first and second electrode-side trenches in the same step as the coil formation trench, and thus it is possible to reduce the number of manufacturing steps.

A11. The chip inductor described in any one of "A2" to "A10," where the coil formation trench is formed with a plurality of parallel trenches disposed at an interval from and parallel to each other, the coil is formed with a plurality of parallel coils embedded in the parallel trenches, one end portion of the plurality of parallel coils is connected to the first electrode and the other end portion of the plurality of parallel coils is connected to the second electrode.

In this arrangement, though as compared with a case where the coil is formed with one coil, the number of windings is reduced, a plurality of parallel coils are connected in parallel and thus the inductance is reduced, since the internal resistance of the entire coil is also reduced, it is possible to obtain a satisfactory Q value.

A12. The chip inductor described in any one of "A1" to "A11," where the coil formation trench is formed, in plan view, in a shape of a polygonal spiral.

A13. The chip inductor described in any one of "A1" to "A11," where the coil formation trench is formed, in plan view, in a shape of a circular spiral.

A14. The chip inductor described in any one of "A1" to "A13," where a depth of the coil formation trench is 10 μm or more. In this arrangement, it is possible to increase the cross-sectional area of the coil, and thus it is possible to decrease the internal resistance of the coil. In this way, it is possible to increase the Q value of the coil.

A15. The chip inductor described in any one of "A1" to "A13," where a depth of the coil formation trench is 10 μm or more and 82 μm or less.

A16. The chip inductor described in any one of "A1" to "A15," where a width of the coil formation trench is 1 μm or more and 3 μm or less.

A17. A circuit assembly including: a mounting substrate; and the chip inductor described in any one of "A1" to "A16" mounted in the mounting substrate. In this arrangement, it is possible to provide a circuit assembly using a chip inductor having a high Q value.

A18. The circuit assembly described in "A17," where the chip inductor is connected to the mounting substrate by wireless bonding. In this arrangement, it is possible to decrease the occupied space of the chip inductor on the mounting substrate, and thus it is possible to contribute to the high-density mounting of electronic parts.

A19. A method of manufacturing a chip inductor, the method including: a first step of forming, on a substrate having an element formation surface, by digging down from the element formation surface, a coil formation trench that is formed in the shape of a spiral in plan view when seen in a normal direction perpendicular to the element formation surface; and a second step of embedding a conductive member within the coil formation trench to form a coil within the coil formation trench.

With this manufacturing method, it is possible to form the coil within the coil formation trench formed in the substrate. Hence, it is possible to provide a chip inductor having the same effects as described in "A1."

A20. The method of manufacturing a chip inductor described in "A19," the method further including: a third step of forming an insulating layer on the element formation surface so as to coat the coil; a fourth step of forming, in the insulating layer, a first contact hole which exposes one end portion of the coil and simultaneously forming a second contact hole which exposes the other end portion of the coil; and a fifth step of forming, on the insulating film, the first electrode in contact with the one end portion of the coil via the first contact hole and the second electrode in contact with the other end portion of the coil via the second contact hole.

With this manufacturing method, it is possible to form, on the insulating film formed on the element formation surface, the first electrode to which the one end portion of the coil is connected and the second electrode to which the other end portion of the coil is connected.

An object of the third invention is to provide a chip inductor in which the Q (Quality Factor) value of the coil is high and in which it is easy to determine the polarity direction and a circuit assembly that includes it.

Another object of the third invention is to provide a method of manufacturing a chip inductor in which the Q value of the coil is high and in which it is easy to determine the polarity direction.

The third invention has the following features.

B1. A chip inductor including: a substrate that has an element formation surface; a coil formation trench that is formed in the substrate by digging down from the element formation surface and that is formed in the shape of a spiral in plan view when seen in a normal direction perpendicular to the element formation surface; a coil that is formed with a conductive member embedded within the coil formation trench; a first electrode which is disposed on the element formation surface of the substrate and to which one end portion of the coil is electrically connected; and a second electrode which is disposed on the element formation surface of the substrate and to which the other end portion of the coil is electrically connected, where in only the surface of any one of the first electrode and the second electrode, a plurality of concave portions are formed.

Since in this arrangement, it is possible to increase the cross-sectional area of the coil (cross-sectional area perpendicular to a direction in which the coil is extended in the spiral direction), it is possible to decrease the internal resistance of the coil. In this way, it is possible to increase the Q value of the coil, with the result that it is possible to provide a high performance chip inductor.

Since the coil formation trench is formed in the substrate, the conductive member is embedded within the coil formation trench and thus the coil can be formed, it is easy to manufacture the coil. In this way, it is possible to provide a chip inductor that is easily manufactured.

When image inspection is performed on the chip inductor, light from a light source is applied to the surfaces of the first electrode and the second electrode, and images of the surfaces are imaged with a camera. In this arrangement, in only the surface of any one of the first electrode and the second electrode, a plurality of concave portions are formed. The light incident on the surface of the electrode where the concave portions are formed is diffusely reflected off the concave portions. By contrast, the light incident on the surface of the electrode where the concave portions are not formed is unlikely to be diffusely reflected off the concave portions. Hence, a large difference is produced between image information (for example, brightness information) on the first electrode and image information on the second electrode obtained with the camera. In this way, based on the image information obtained with the camera, it is possible to clearly identify the first electrode and the second electrode. In other words, in this arrangement, at the time of the image inspection, it is possible to determine the polarity direction of the chip inductor without forming a mark indicating the polarity direction on the outer surface of the substrate.

B2. The chip inductor described in “B1,” where the element formation surface is rectangular in plan view, the first electrode is disposed on an end portion of the element formation surface, the second electrode is disposed on the other end portion of the element formation surface and the coil formation trench is formed in a region between the first electrode and the second electrode in the element formation surface.

B3. The chip inductor described in “B1” or “B2,” where in the element formation surface of the substrate, in plan view, a first underlying concave portion is formed in the same position as a position in which the concave portion is formed.

In this arrangement, with the first underlying concave portion formed in the element formation surface of the substrate, it is possible to form the concave portion in the surface of any one of the first electrode and the second electrode formed on the element formation surface. In other words, the first underlying concave portion is previously formed in the element formation surface of the substrate, and thus without addition of a step of separately forming the concave portion in the surface of any one of the first electrode and the second electrode, it is possible to form the concave portion in the surface of any one of the first electrode and the second electrode.

B4. The chip inductor described in “B3” further including: an insulating film formed between the first electrode and the second electrode in the element formation surface, where in the surface of the insulating film, in plan view, a second underlying concave portion is formed in the same position as the position in which the first underlying concave portion is formed.

In this arrangement, with the first underlying concave portion formed in the element formation surface of the substrate, it is possible to form the second underlying concave portion in the surface of the insulating film formed on the element formation surface. Then, with the second underlying concave portion formed in the surface of the insulating film, it is possible to form the concave portion in the surface of any one of the first electrode and the second electrode formed on the insulating film.

B5. The chip inductor described in “B4,” where the insulating film is formed on the element formation surface so as to cover the coil and includes, in regions corresponding to the one end portion and the other end portion of the coil, a first contact hole and a second contact hole formed respectively, the first electrode and the second electrode are formed on the insulating film, the first electrode is connected via the first contact hole to the one end portion of the coil and the second electrode is connected via the second contact hole to the other end portion of the coil.

B6. The chip inductor described in any one of “B3” to “B5,” where each of the plurality of concave portions is formed, in plan view, in the shape of a straight line extending in one direction, the concave portions are disposed at an interval in a direction perpendicular to the one direction and include a plurality of concave portion formation trenches that are formed, in plan view, in the same positions as the positions in which the concave portions are formed in the substrate by digging down from the element formation surface and conductive members embedded within the concave portion formation trenches and the first underlying concave portion is formed in the surface of the conductive member within each of the concave portion formation trenches.

In this arrangement, a plurality of concave portion formation trenches are formed in the substrate, the conductive members are embedded within the concave portion formation trenches and thus the first underlying concave portions can be formed.

B7. The chip inductor described in “B6,” where the plurality of concave portion formation trenches are formed in the same step as the coil formation trench. In this arrangement, it is possible to manufacture the concave portion formation trenches in the same step as the coil formation trench, and thus it is possible to reduce the number of manufacturing steps.

B8. The chip inductor described in any one of “B1” to “B7,” where the coil formation trench is formed with a plurality of parallel trenches disposed at an interval from and parallel to each other, the coil is formed with a plurality of parallel coils embedded in the plurality of parallel trenches, one end portion of the plurality of parallel coils is connected to the first electrode and the other end portion of the plurality of parallel coils is connected to the second electrode.

In this arrangement, though as compared with a case where the coil is formed with one coil, the number of windings is reduced, a plurality of parallel coils are connected in parallel and thus the inductance is reduced, since the internal resistance of the entire coil is also reduced, it is possible to obtain a satisfactory Q value.

B9. The chip inductor described in any one of “B1” to “B8,” where the coil formation trench is formed, in plan view, in a shape of a polygonal spiral.

B10. The chip inductor described in any one of “B1” to “B8,” where the coil formation trench is formed, in plan view, in a shape of a circular spiral.

B11. The chip inductor described in any one of “B1” to “B10,” where a depth of the coil formation trench is 10 μm or more. In this arrangement, it is possible to increase the cross-sectional area of the coil, and thus it is possible to decrease the internal resistance of the coil. In this way, it is possible to increase the Q value of the coil.

B12. The chip inductor described in any one of “B1” to “B10,” where a depth of the coil formation trench is 10 μm or more and 80 μm or less.

B13. The chip inductor described in any one of “B1” to “B12,” where a width of the coil formation trench is 1 μm or more and 3 μm or less.

B14. A circuit assembly including: a mounting substrate; and the chip inductor described in any one of “B1” to “B13,” mounted in the mounting substrate. In this arrangement, it is possible to provide a circuit assembly using a chip inductor in which the Q value is high and in which it is easy to determine the polarity direction.

B15. The circuit assembly described in "B14," where the chip inductor is connected to the mounting substrate by wireless bonding. In this arrangement, it is possible to decrease the occupied space of the chip inductor on the mounting substrate, and thus it is possible to contribute to the high-density mounting of electronic parts.

B16. A method of manufacturing a chip inductor, the method including: a first step of preparing a substrate having an element formation surface including a first electrode formation region, a second electrode formation region and a coil formation region; a second step of forming, in the coil formation region, a coil formation trench in the shape of a spiral in plan view when seen in a normal direction perpendicular to the element formation surface by digging down from the element formation surface in the substrate and simultaneously forming a plurality of concave formation trenches in any one of the first electrode formation region and the second electrode formation region; a third step of depositing a conductive member on the element formation surface, thereafter the conductive member is smoothed and thus the conductive member is embedded in inner surfaces of the coil formation trench and each of the concave formation trenches and simultaneously forming a first underlying concave portion on the surface of the conductive member within each of the concave formation trenches; a fourth step of forming an insulating film on the element formation surface to form a second underlying concave portion in a position of the first underlying concave portion in the surface of the insulating film; a fifth step of forming a first electrode and a second electrode in positions corresponding to the first electrode formation region and the second electrode formation region on the insulating film respectively, to form a concave portion in a position of the second underlying concave portion in the surface of one of the electrodes.

In the manufacturing method in the invention, it is possible to form the concave portion in the surface of any one of the first electrode and the second electrode. Hence, it is possible to provide a chip inductor having the same effects as those described in "B1" described previously.

B17. The method of manufacturing a chip inductor described in "B16," the method further including: a step of forming, between the second step and the third step, an insulating film on the inner surfaces of the coil formation trench and each of the concave formation trenches and thereafter forming a barrier metal film on the insulating film.

Preferred embodiments of the second invention and preferred embodiments of the third invention will be described in detail with reference to FIGS. 33A to 92. The symbols in FIGS. 33A to 92 are not related to the symbols in FIGS. 1 to 32 used in the description of the first invention.

Figure 33A:
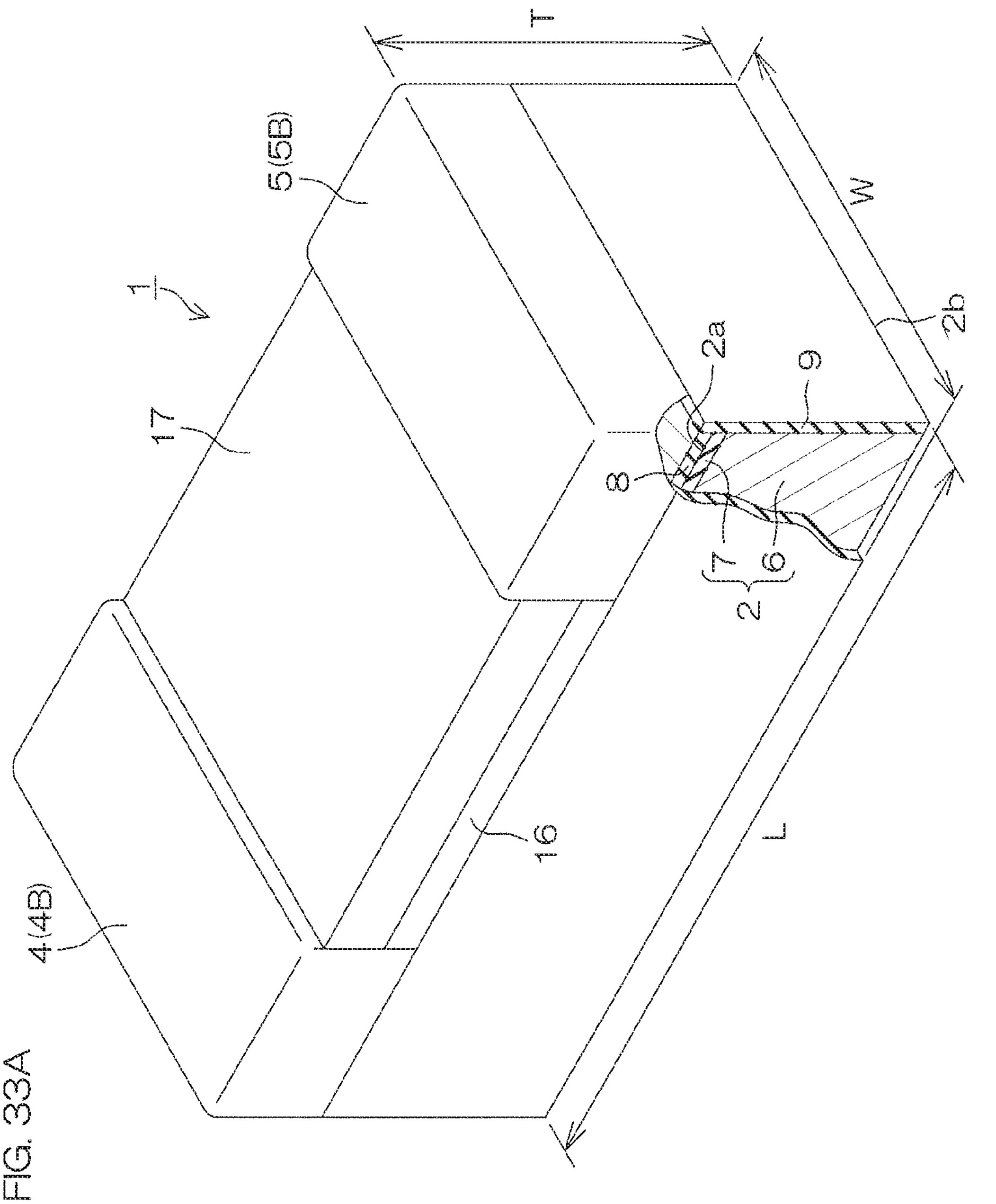
FIG. 33A is a partially cut perspective view of the chip inductor according to the first preferred embodiment of a second invention.
Figure 33B:
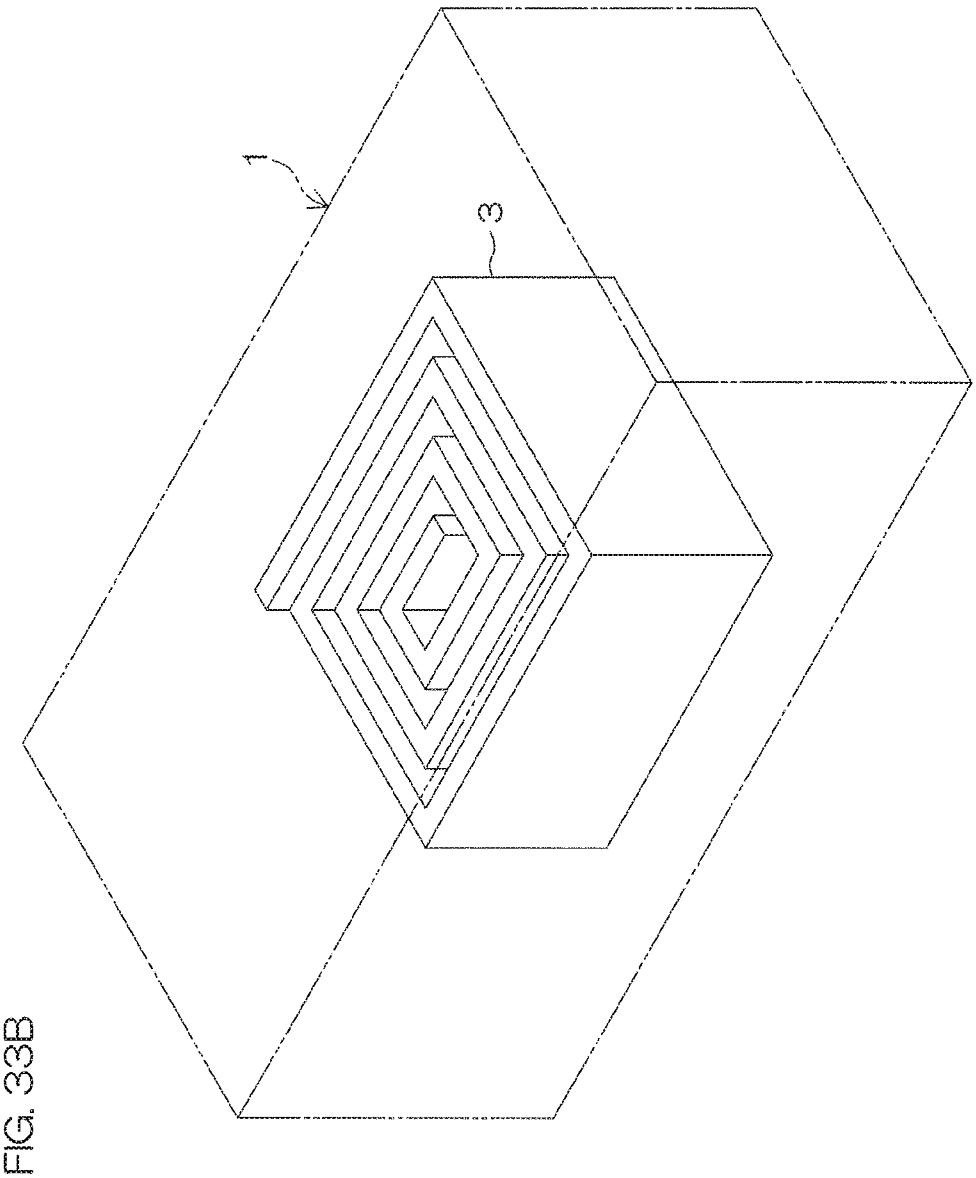
FIG. 33B is a perspective view showing a coil formed within the chip inductor.

FIG. 33A is a partially cut perspective view of the chip inductor according to the first preferred embodiment of the second invention. FIG. 33B is a perspective view showing a coil formed within the chip inductor.

The chip inductor 1 is a minute chip part and is formed in the shape of a rectangular parallelepiped. The planar shape of the chip inductor 1 may be rectangular, the length L in the longitudinal direction may be about 0.4 mm and the length W in the lateral direction may be about 0.2 mm. The thickness T of the entire chip inductor 1 may be about 0.15 mm.

The chip inductor 1 includes a substrate 2, a coil 3 that is formed within the substrate 2, a first electrode 4 that is connected to one end portion of the coil 3 and a second electrode 5 that is connected to the other end portion of the coil 3.

Figure 34:
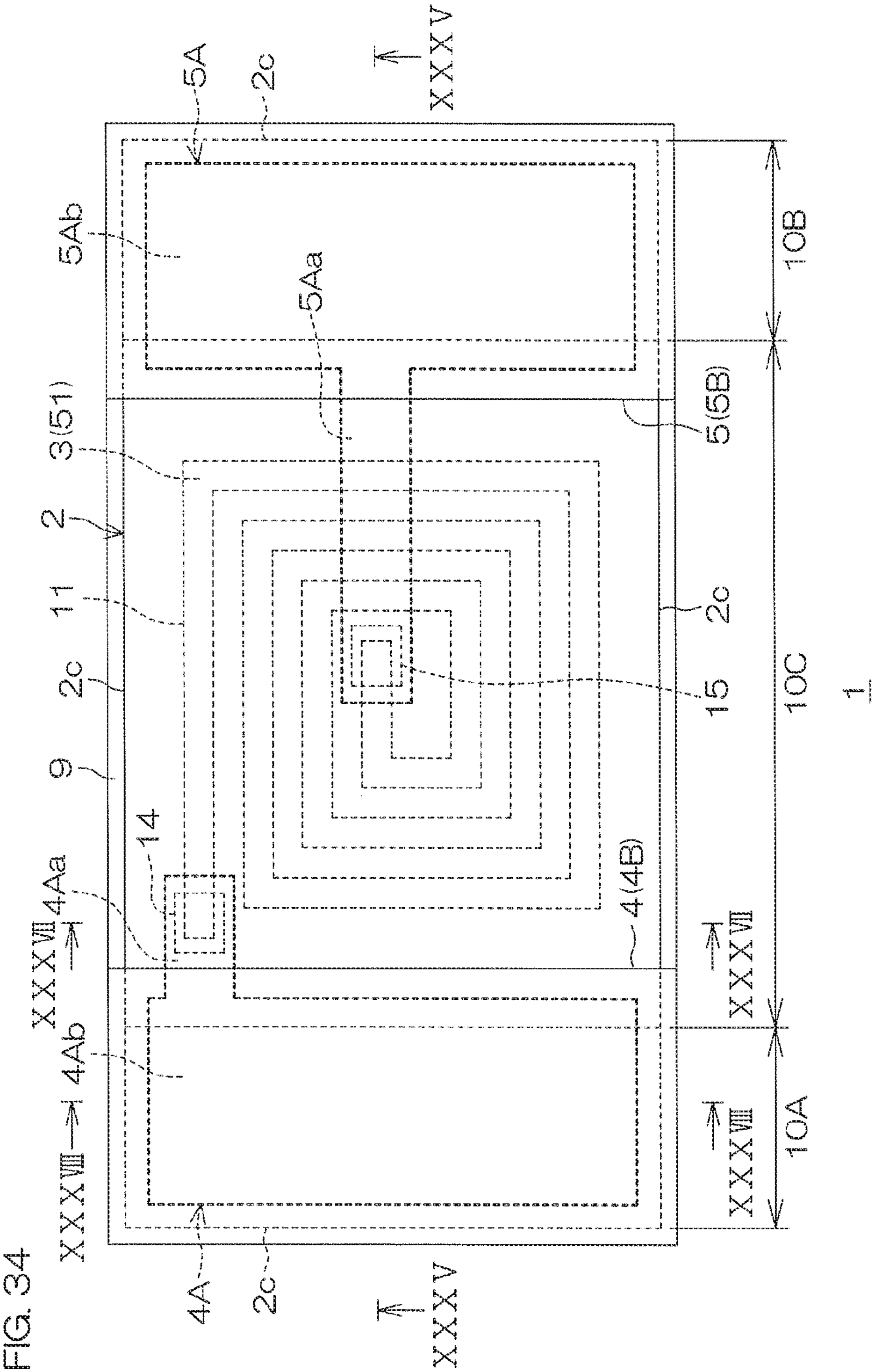
FIG. 34 is a plan view of the chip inductor.
Figure 35:
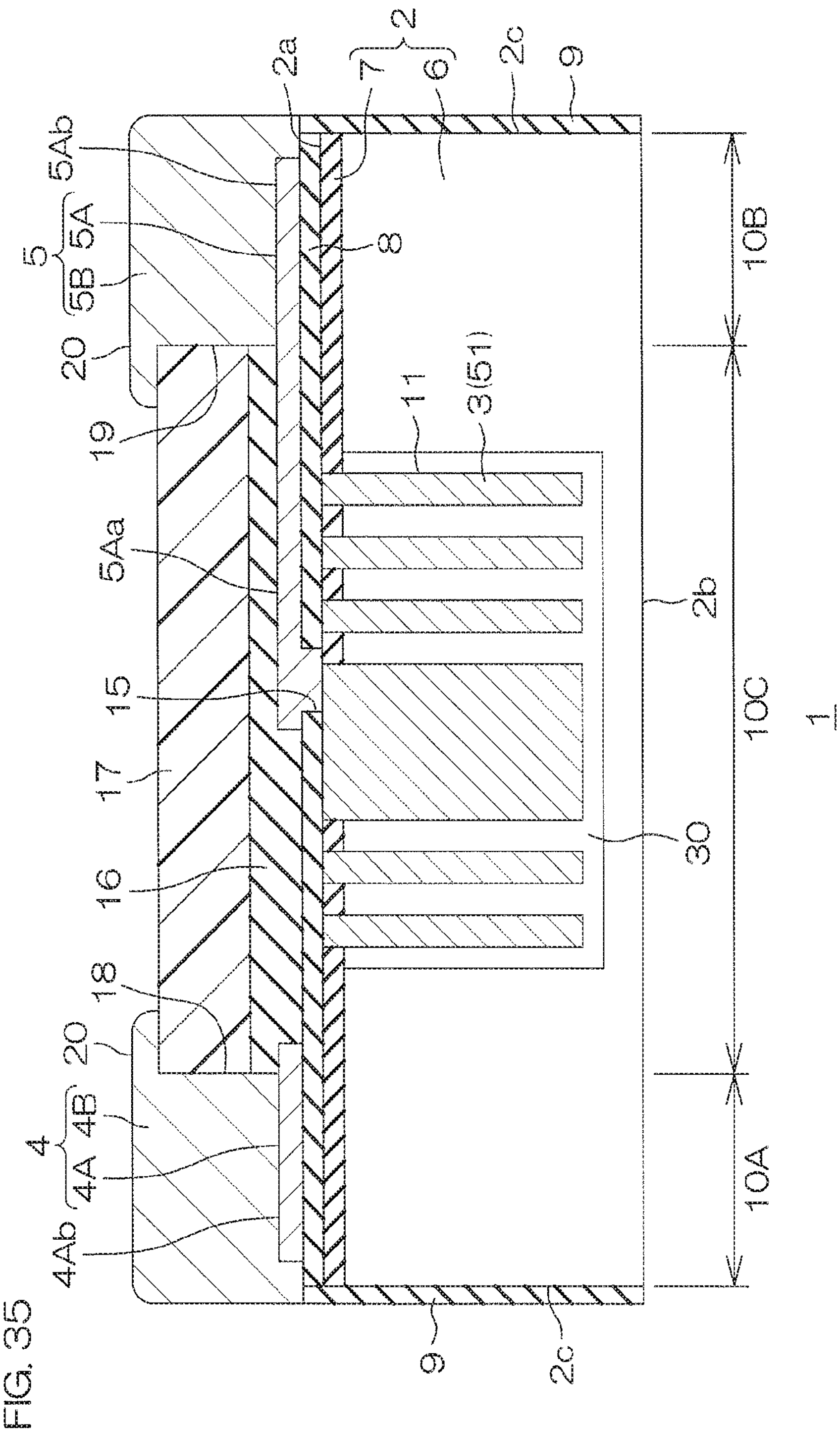
FIG. 35 is a cross-sectional view taken along line XXXV-XXXV in FIG. 34.
Figure 36:
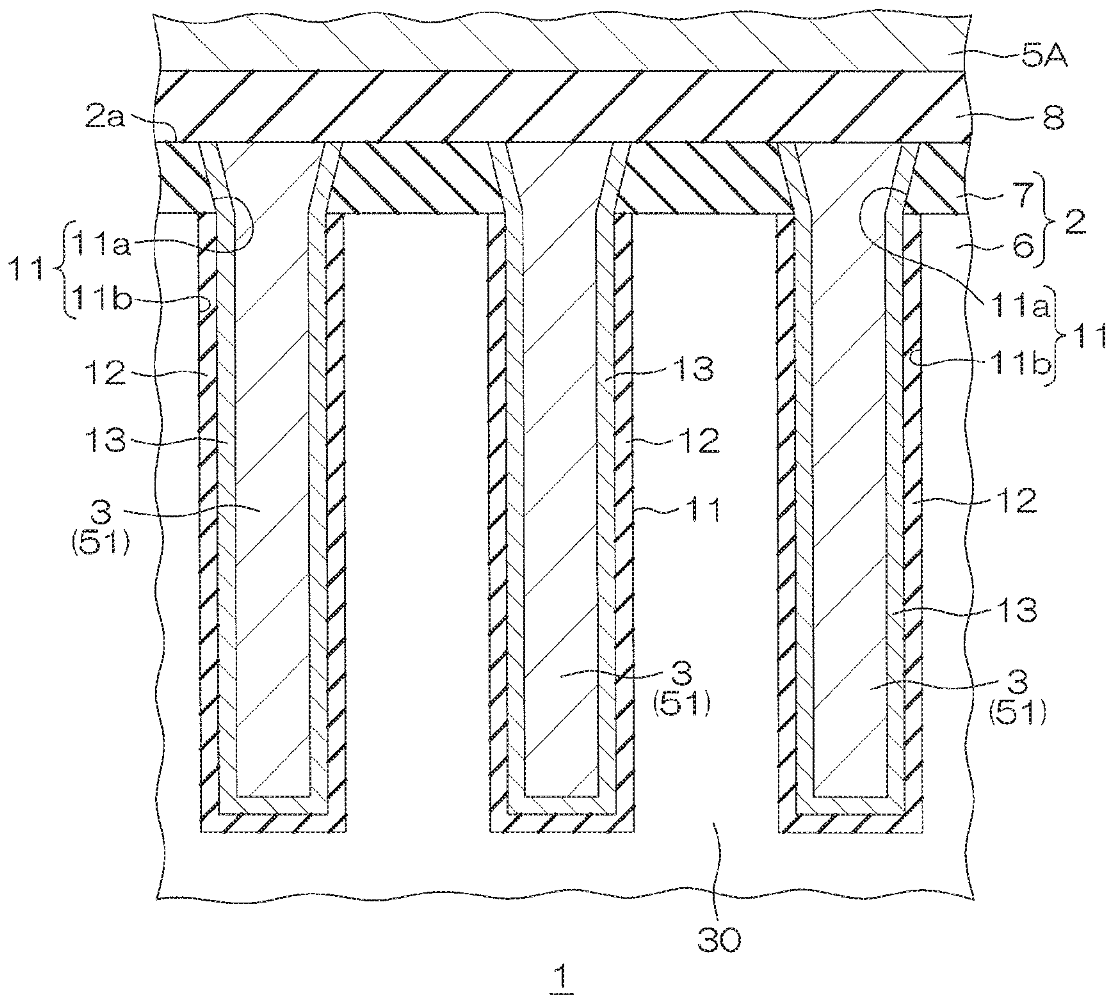
FIG. 36 is a partially enlarged cross-sectional view of FIG. 35.
Figure 37:
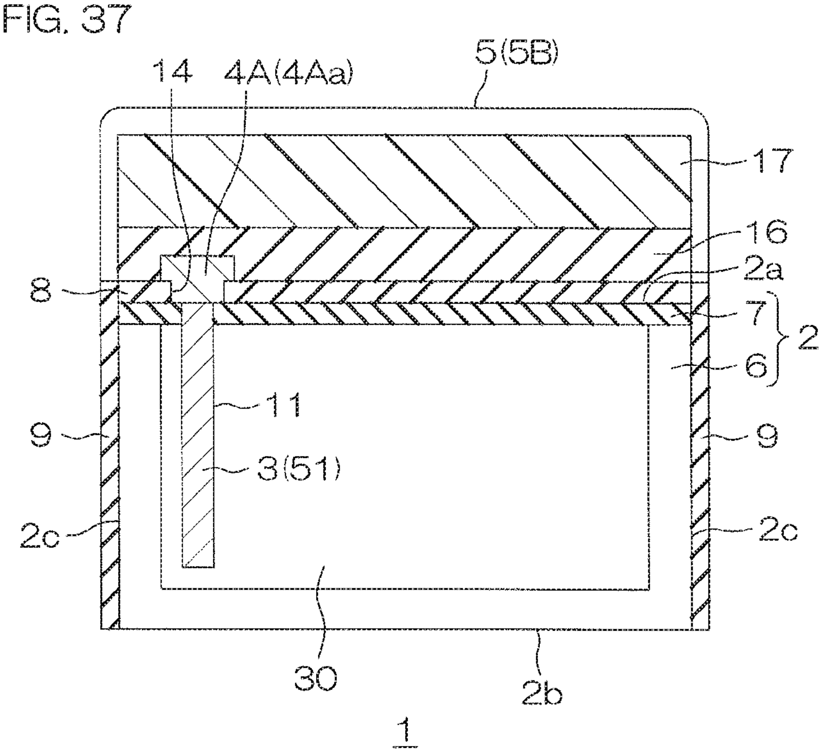
FIG. 37 is a cross-sectional view taken along line XXXVII-XXXVII in FIG. 34.
Figure 38:
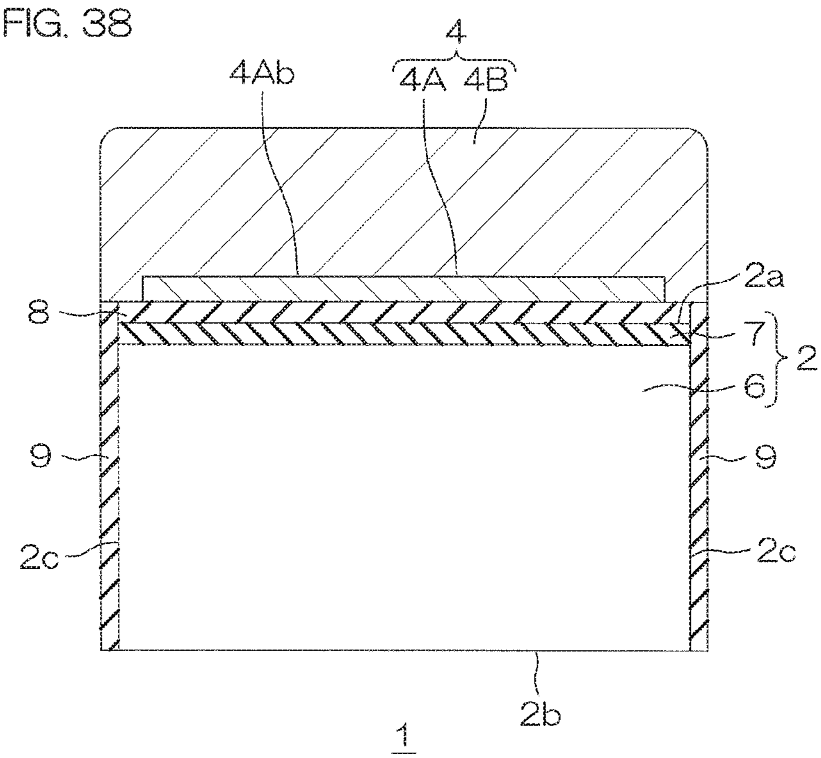
FIG. 38 is a cross-sectional view taken along line XXXVIII-XXXVIII in FIG. 34.
Figure 39:
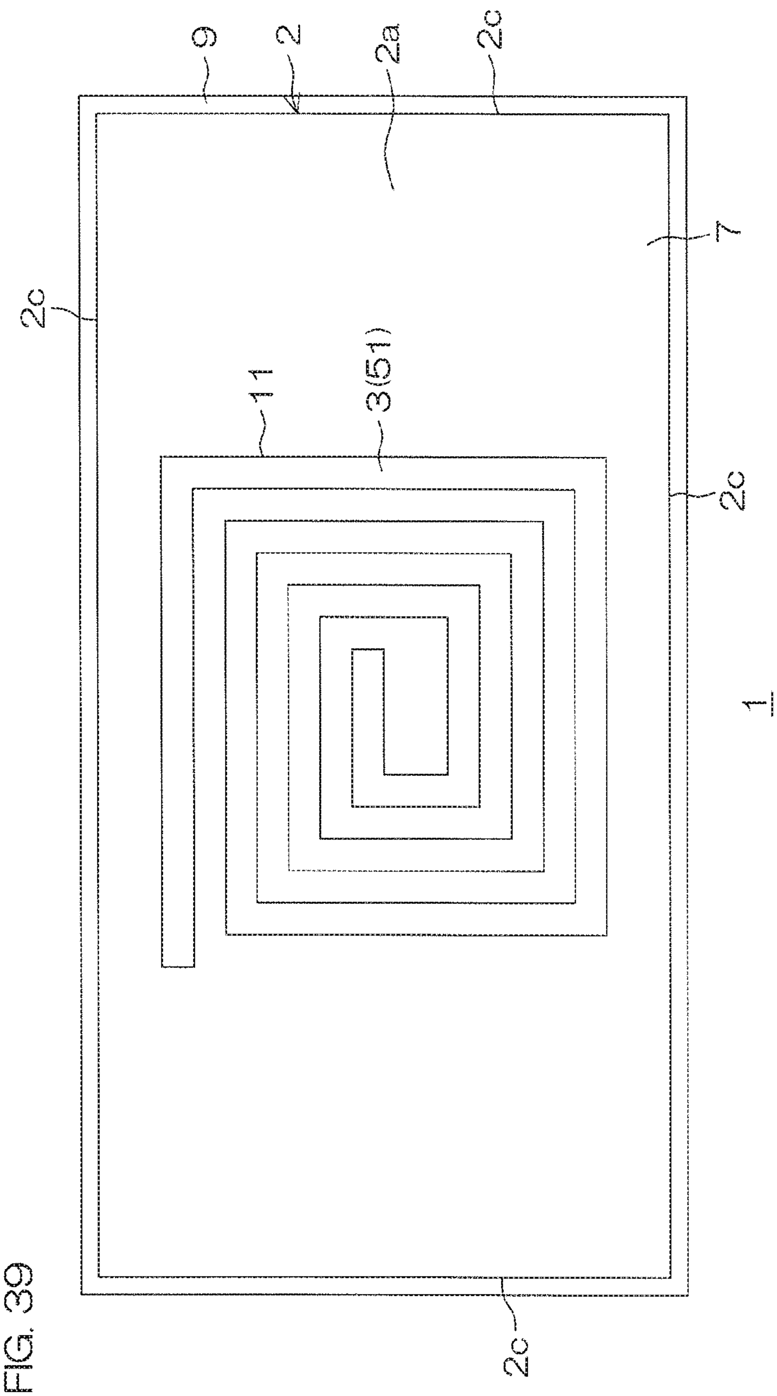
FIG. 39 is a plan view showing a structure of the surface of a substrate by removing an arrangement formed on the surface of the substrate.

FIG. 34 is a plan view of the chip inductor, FIG. 35 is a cross-sectional view taken along line XXXV-XXXV in FIG. 34, FIG. 36 is a partially enlarged cross-sectional view of FIG. 35, FIG. 37 is a cross-sectional view taken along line XXXVII-XXXVII in FIG. 34, FIG. 38 is a cross-sectional view taken along line XXXVIII-XXXVIII in FIG. 34 and FIG. 39 is a plan view showing a structure of the surface of the substrate by removing an arrangement formed on the surface of the substrate.

The substrate 2 is formed in the shape of a rectangular parallelepiped, and includes a pair of main surfaces 2_a_ and 2_b_ and four side surfaces 2_c_. One (the main surface 2_a_ on the upper surface side in FIG. 33A) of the pair of main surfaces 2_a_ and 2_b_ is an element formation surface. In the following description, the main surface 2_a_ is referred to as an "element formation surface 2_a_," and the main surface 2_b_ on the side opposite to the element formation surface 2_a_ is referred to as a "rear surface 2_b_." In the preferred embodiment, the substrate 2 is formed with a substrate main body 6 and an insulating film 7 formed on the surface thereof, and the surface of the insulating film 7 on the side opposite to the side of the substrate main body 6 is the element formation surface 2_a_. In the preferred embodiment (the same is true in the other preferred embodiments of the second invention), the substrate main body 6 is formed with a silicon substrate, and the insulating film 7 is formed with a thermal oxide film ($SiO_2$). The element formation surface 2_a_ is formed in the shape of a rectangle in plan view when seen in a normal direction perpendicular to the element formation surface 2_a_. The surface (element formation surface 2_a_) of the substrate 2 is covered by an insulating film 8. The four side surfaces 2_c_ of the substrate 2 and the outer peripheral surface of the insulating film 8 are covered by a passivation film 9 such as a nitride film.

With reference to FIG. 34, in the element formation surface 2_a_, a first electrode formation region 10A for the formation of the first electrode 4 is provided at one end portion thereof, and a second electrode formation region 10B for the formation of the second electrode 5 is provided at the other end portion. These regions 10A and 10B are rectangular in plan view. In the element formation surface 2_a_ between the first electrode formation region 10A and the second electrode formation region 10B, a coil formation region 10C is provided. In the preferred embodiment, the coil formation region 10C is formed in the shape of a rectangle.

In the first electrode formation region 10A, the external connection electrode (first external connection electrode) 4B of the first electrode 4 is disposed, and in the second electrode formation region 10B, the external connection electrode (second external connection electrode) 5B of the second electrode 5 is disposed. The first external connection electrode 4B is rectangular in plan view, and covers the entire region of the first electrode formation region 10A. The second external connection electrode 5B is rectangular in plan view, and covers the entire region of the second electrode formation region 10B.

In the substrate 2, a coil formation trench 11 is formed by digging down, in the coil formation region 10C, to a predetermined depth from the element formation surface 2_a_. The coil formation trench 11 is formed, in plan view, in the shape of a spiral. In the preferred embodiment, the coil formation trench 11 is formed, in plan view, in the shape of a quadrilateral spiral, and has a plurality of rectilinear portions parallel to the side surfaces 2*c* of the substrate 2. The cross section (cross section in a direction perpendicular to a direction in which the coil formation trench 11 is extended in the spiral direction) of the coil formation trench 11 is formed in the shape of a rectangle which is long in the direction of the thickness of the substrate 2. For example, the width of the coil formation trench 11 may be 1 μm or more and 3 μm or less. For example, the depth of the coil formation trench 11 may be 10 μm or more and 82 μm or less. The depth of the coil formation trench 11 is preferably 10 μm or more so that the internal resistance of the coil 3 formed within the coil formation trench 11 is decreased.

As shown in FIG. 36, the coil formation trench 11 is formed with a first trench part 11*a* that is formed in the insulating film 7 and a second trench part 11*b* that is formed in the substrate main body 6 and that communicates with the first trench part 11*a*. On the inner surface of the coil formation trench 11 (the second trench part 11*b*) in the substrate main body 6, an insulating film 12 formed with an oxide film or the like is formed. In the preferred embodiment, the insulating film 12 is formed with a thermal oxide film ($SiO_2$), and when the thermal oxide film is formed on the inner surface of the coil formation trench 11, the surrounding wall (the side wall and the bottom wall) of the coil formation trench 11 (the second trench part 11*b*) in the substrate main body 6 is thermally oxidized into an insulator portion (thermal oxide film) 30 having insulation. In the preferred embodiment, an example is described where the entire wall sandwiched by the coil formation trench 11 (the second trench part 11*b*) in the shape of a spiral in the substrate main body 6 is a thermal oxide film.

On the surface of the insulating film 12 within the coil formation trench 11 (the second trench part 11*b*) and on the inner surface of the coil formation trench 11 (the first trench part 11*a*) in the insulating film 7, a barrier metal film 13 is formed. The barrier metal film 13 is formed of, for example, TiN. The thickness of the barrier metal film 13 is about 400 to 500 angstroms. Within the coil formation trench 11, a conductive member 51 is embedded while being in contact with the barrier metal film 13. In the preferred embodiment, the conductive member 51 is formed of tungsten (W). The coil 3 is formed with the conductive member 51 embedded within the coil formation trench 11. Hence, the coil 3 is formed, in plan view, in the shape of a spiral (in the shape of a quadrilateral spiral) of the same pattern as the coil formation trench 11. Specifically, the coil 3 includes a plurality of plate-shaped parts parallel to the side surfaces 2*c* of the substrate 2.

On the element formation surface 2*a* (the surface of the insulating film 7) of the substrate 2, an insulating film 8 is formed so as to coat the element formation surface 2*a* and the conductive member 51 (the coil 3). The insulating film 8 is formed, in plan view, in the shape of a rectangle matching with the element formation surface 2*a*. The insulating film 8 is formed with, for example, a USG (Undoped Silicate Glass) film. In the insulating film 8, a first contact hole 14 (see FIGS. 34 and 37) that exposes one end portion (outer peripheral side end portion) of the coil 3 and a second contact hole 15 (see FIGS. 34 and 35) that exposes the other end portion (inner peripheral side end portion) of the coil 3 are formed. As described above, in the side surfaces 2*c* of the substrate 2 and the outer peripheral surface of the insulating film 8, the passivation film 9 formed with a nitride film or the like is formed.

On the surface of the insulating film 8, the first electrode 4 and the second electrode 5 are formed. The first electrode 4 includes a first electrode film 4A that is formed on the surface of the insulating film 8 and a first external connection electrode 4B that is bonded to the first electrode film 4A. As shown in FIG. 34, the first electrode film 4A includes a drawing electrode 4Aa that is connected to one end portion of the coil 3 and a first pad 4Ab that is formed integrally with the drawing electrode 4Aa. The first pad 4Ab is formed to be rectangular at one end portion of the element formation surface 2*a*. The first external connection electrode 4B is connected to the first pad 4Ab. As shown in FIGS. 34 and 37, the drawing electrode 4Aa enters the first contact hole 14 from the surface of the insulating film 8, and is connected to one end portion of the coil 3 within the first contact hole 14. The drawing electrode 4Aa is formed straight along a straight line that passes above one end portion of the coil 3 to reach the first pad 4Ab.

By extending one end portion of the coil formation trench 11 to a position below the first pad 4Ab, one end portion of the coil 3 may be located in a position below the first pad 4Ab. In this way, since the first contact hole 14 can be formed in a position below the first pad 4Ab, one end portion of the coil 3 can be connected to the first pad 4Ab. In this case, since the first electrode film 4A can be formed with only the first pad 4Ab, the drawing electrode 4Aa is not needed.

The second electrode 5 includes a second electrode film 5A that is formed on the surface of the insulating film 8 and a second external connection electrode 5B that is bonded to the second electrode film 5A. As shown in FIG. 34, the second electrode film 5A includes a drawing electrode 5Aa that is connected to the other end portion of the coil 3 and a second pad 5Ab that is formed integrally with the drawing electrode 5Aa. The second pad 5Ab is formed to be rectangular at the other end portion of the element formation surface 2*a*. The second external connection electrode 5B is connected to the second pad 5Ab. As shown in FIGS. 34 and 35, the drawing electrode 5Aa enters the second contact hole 15 from the surface of the insulating film 8, and is connected to the other end portion of the coil 3 within the second contact hole 15. The drawing electrode 5Aa is formed straight along a straight line that passes above the other end portion of the coil 3 to reach the second pad 5Ab. In the preferred embodiment, as the electrode films 4A and 5A, Al films are used.

The first electrode film 4A and the second electrode film 5A are covered by a passivation film 16 formed with a nitride film (SiN) etc., and furthermore, on the passivation film 16, a resin film 17 such as polyimide is formed. In the passivation film 16 and the resin film 17, two cutout portions 18 and 19 are formed that respectively expose a region other than an edge portion on the inner side of the surface of the first pad 4Ab of the first electrode film 4A and a region other than an edge portion on the inner side of the surface of the second pad 5Ab of the second electrode film 5A. In other words, the passivation film 16 and the resin film 17 are formed, in plan view, in a region corresponding to the coil formation region 10C of the element formation surface 2*a*, and cover the insulating film 8, the edge portion on the inner side of the surface of the first pad 4Ab, and the edge portion on the inner side of the surface of the second pad 5Ab.

The first external connection electrode 4B is filled in the cutout portion 18, and the second external connection electrode 5B is filled in the cutout portion 19. The first external connection electrode 4B and the second external connection electrode 5B are formed so as to protrude from the resin film 17, and include a drawing portion 20 that is drawn inwardly of the substrate 2 along the surface of the resin film 17. In the preferred embodiment, the first external connection electrode 4B is formed so as to cover not only the surface of the first electrode film 4A (the first pad 4Ab) and the insulating film 8 exposed within the cutout portion 18 but also the upper end surface of the passivation film 9 on the side of one end portion of the substrate 2. The three side surfaces other than the side surface on the inner side of the first external connection electrode 4B are formed so as to be flush with the surface of the passivation film 9 covering the peripheral surface of the insulating film 8 on the side of one end portion of the substrate 2.

Likewise, the second external connection electrode 5B is formed so as to cover not only the surface of the second electrode film 5A (the pad 5Ab) and the insulating film 8 exposed within the cutout portion 19 but also the upper end surface of the passivation film 9 on the side of the other end portion of the substrate 2. The three side surfaces other than the side surface on the inner side of the second external connection electrode 5B are formed so as to be flush with the surface of the passivation film 9 covering the peripheral surface of the insulating film 8 on the side of the other end portion of the substrate 2. The external connection electrodes 4B and 5B may be formed with a Ni/Pd/Au laminated film having a Ni film in contact with the electrode films 4A and 5A, a Pd film formed thereon, and an Au film formed thereon. The laminated film described above can be formed by a plating method.

The passivation film 16 and the resin film 17 coat, from the surface, the coil 3, the insulating film 8, the first electrode film 4A, and the second electrode film 5A in the coil formation region 10C of the element formation surface 2*a*, and function as a protective film to protect them. On the other hand, the passivation film 9 formed on the side surfaces 2*c* of the substrate 2 and the outer peripheral surface of the insulating film 8 function as a protective film to protect the side surfaces 2*c* of the substrate 2 and the outer peripheral surface of the insulating film 8.

Figure 40:
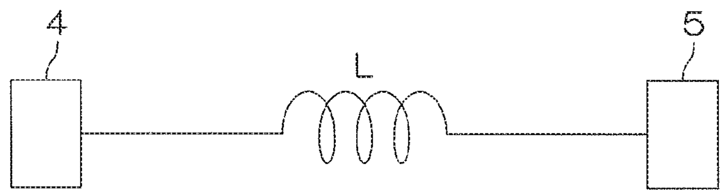
FIG. 40 is an electrical circuit diagram showing an electrical structure within the chip inductor.

FIG. 40 is an electrical circuit diagram showing an electrical structure within the chip inductor. One end of the coil 3 (represented by a symbol L in FIG. 40) is connected to the first electrode 4, and the other end of the coil 3 is connected to the second electrode 5. In this way, the chip inductor functions as an inductor having a predetermined inductance.

As a parameter indicating the performance (quality) of the coil, the Q (Quality Factor) value of the coil is present. As the Q value is increased, its loss is decreased, and an excellent characteristic is provided as a high-frequency inductance.

The Q value of the coil 3 is represented by formula (1) below.

$$Q=2\pi fL/R \quad (1)$$

In formula (1) above, f represents the frequency of a current flowing through the coil, L represents the inductance of the coil 3, and R represents the internal resistance of the coil 3.

In the arrangement of the first preferred embodiment of the second invention, in the substrate 2, the coil formation trench 11 obtained by digging down from the element formation surface 2*a* is formed, in plan view, in the shape of a spiral, the conductive member 51 is embedded within the coil formation trench 11 and thus the coil 3 is formed. Hence, it is possible to increase the cross-sectional area of the coil 3 (the cross-sectional area of the coil 3 perpendicular to the direction in which the coil 3 is extended in the spiral direction), and thus it is possible to decrease the internal resistance (R in formula (1) above) of the coil 3. In this way, since the Q value of the coil 3 can be increased, it is possible to provide a high performance chip inductor.

The coil formation trench 11 is formed in the substrate 2, the conductive member 51 is embedded within the coil formation trench 11 and thus it is possible to form the coil 3, with the result that the coil 3 is easily manufactured. In this way, it is possible to provide a chip inductor that is easily manufactured.

Figure 41:
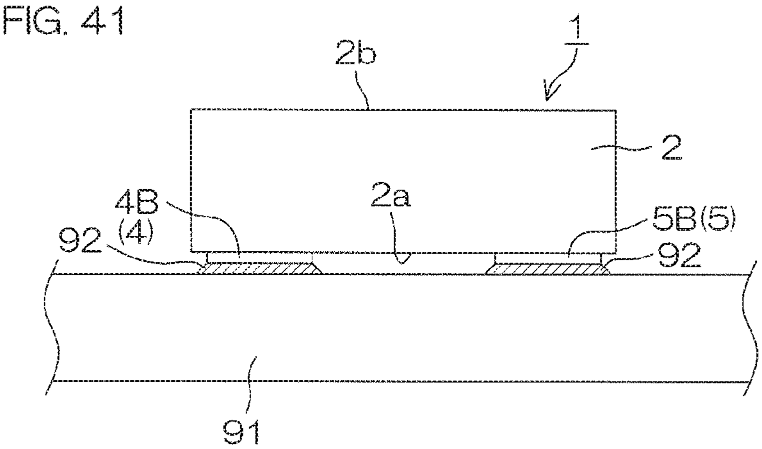
FIG. 41 is a cross-sectional view showing the arrangement of a circuit assembly in which the chip inductor is flip-chip connected on the mounting substrate.

Furthermore, on the element formation surface 2*a*, which is one surface of the substrate 2, both the external connection electrodes 4B and 5B of the first electrode 4 and the second electrode 5 are formed. Hence, as shown in FIG. 41, the element formation surface 2*a* is made to face a mounting substrate 91, the external connection electrodes 4B and 5B are bonded on the mounting substrate 91 by a solder 92 and thus it is possible to form a circuit assembly in which the chip inductor 1 is surface-mounted on the mounting substrate 91. In other words, it is possible to provide a flip-chip connection-type chip inductor 1, and it is possible to connect the chip inductor 1 to the mounting substrate 91 by a face-down bonding in which the element formation surface 2*a* is made to face the mounting substrate 91 and wireless bonding. In this way, it is possible to decrease the occupied space of the chip inductor 1 on the mounting substrate 91. In particular, it is possible to realize a low profile chip inductor 1 on the mounting substrate 91. In this way, it is possible to effectively utilize the space within the housing of a small-sized electronic device or the like and to contribute to high-density mounting and miniaturization.

FIGS. 42A to 42L are cross-sectional views for illustrating an example of the manufacturing step of the chip inductor, and show cut surfaces corresponding to FIG. 35. FIGS. 43A to 43E are partially enlarged cross-sectional views showing the details of the manufacturing step of a coil, and show cut surfaces corresponding to FIG. 36.

Figure 42A:
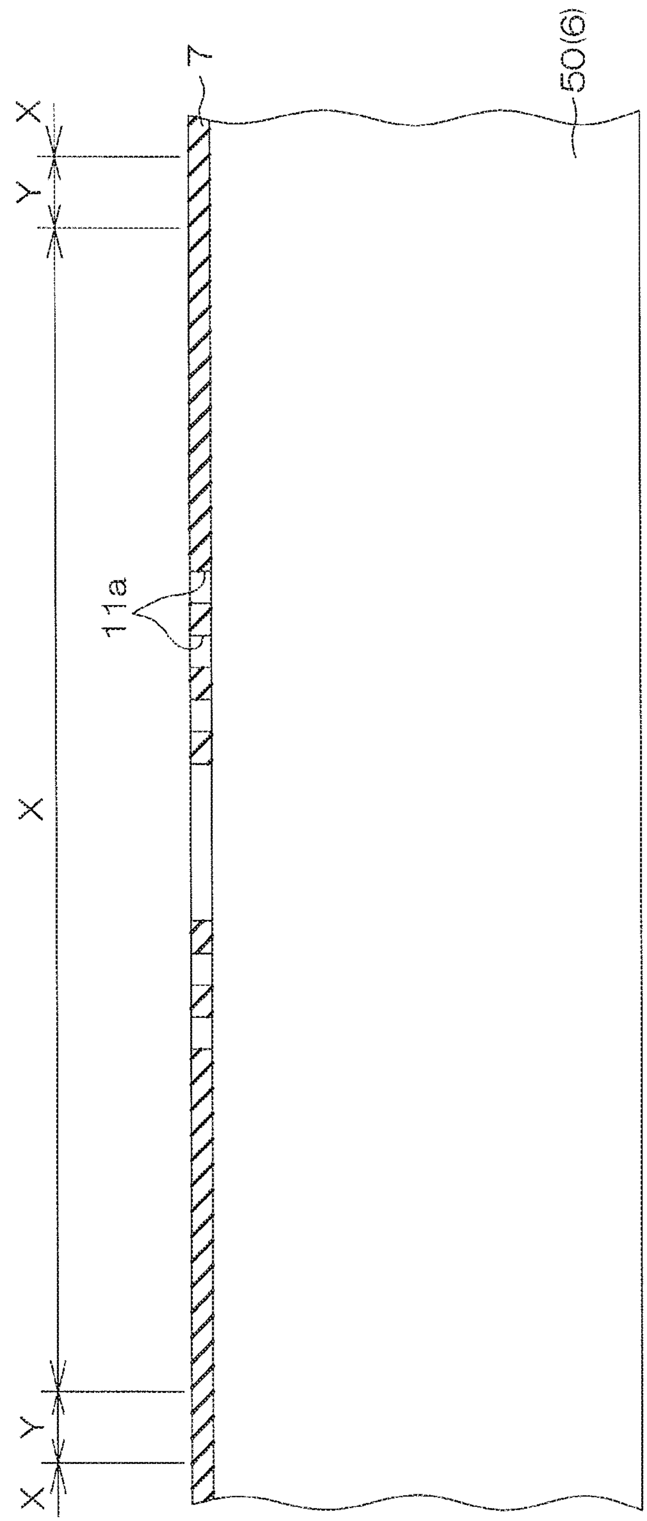
FIG. 42A is a cross-sectional view for illustrating an example of the manufacturing step of the chip inductor.

As shown in FIG. 42A, an original substrate (base substrate) 50 that is an original of the substrate main body 6 is prepared. On the surface of the original substrate 50, the insulating film 7 such as a thermal oxide film or a CVD oxide film is formed. In the preferred embodiment, the insulating film 7 is a thermal oxide film. The surface of the insulating film 7 corresponds to the element formation surface 2*a* of the substrate 2.

Figure 44:
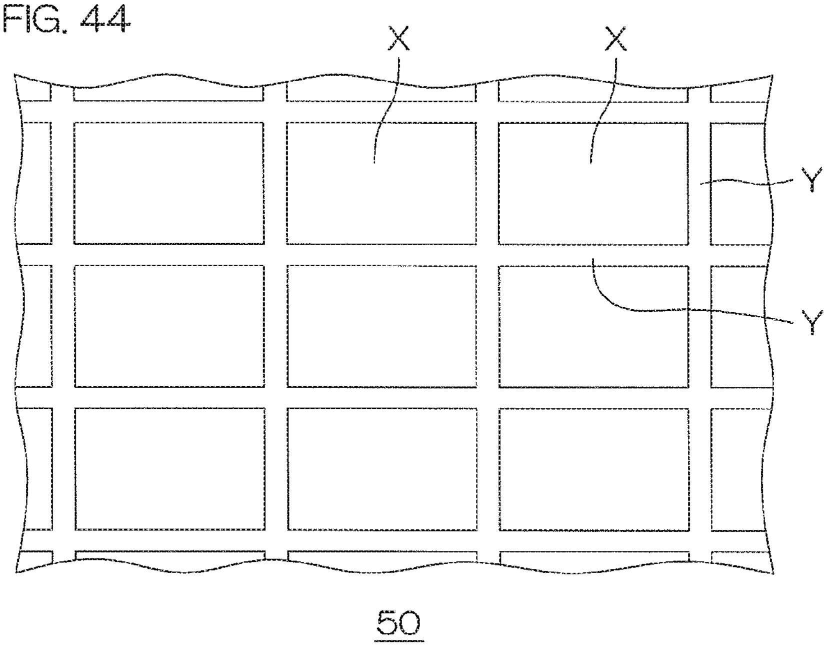
FIG. 44 is a plan view of an original substrate that is an original of a substrate main body of the chip inductor, and shows an enlarged view of a region.

FIG. 44 is a schematic plan view of part of the original substrate 50 in which the insulating film 7 is formed on the surface. As shown in FIG. 44, in the element formation surface 2*a*, chip inductor regions X corresponding to a plurality of chip inductors 1 are disposed in a matrix. Between the chip inductor regions X adjacent to each other, a boundary region Y is provided. The boundary region Y is a region in the shape of a band having a substantially constant width, extends in two directions perpendicular to each other and is formed in a lattice shape. After necessary steps are performed on the original substrate 50 in which the insulating film 7 is formed on the surface, the original substrate 50 is separated along the boundary region Y, and thus it is possible to obtain a plurality of chip inductors 1.

Figure 42B:
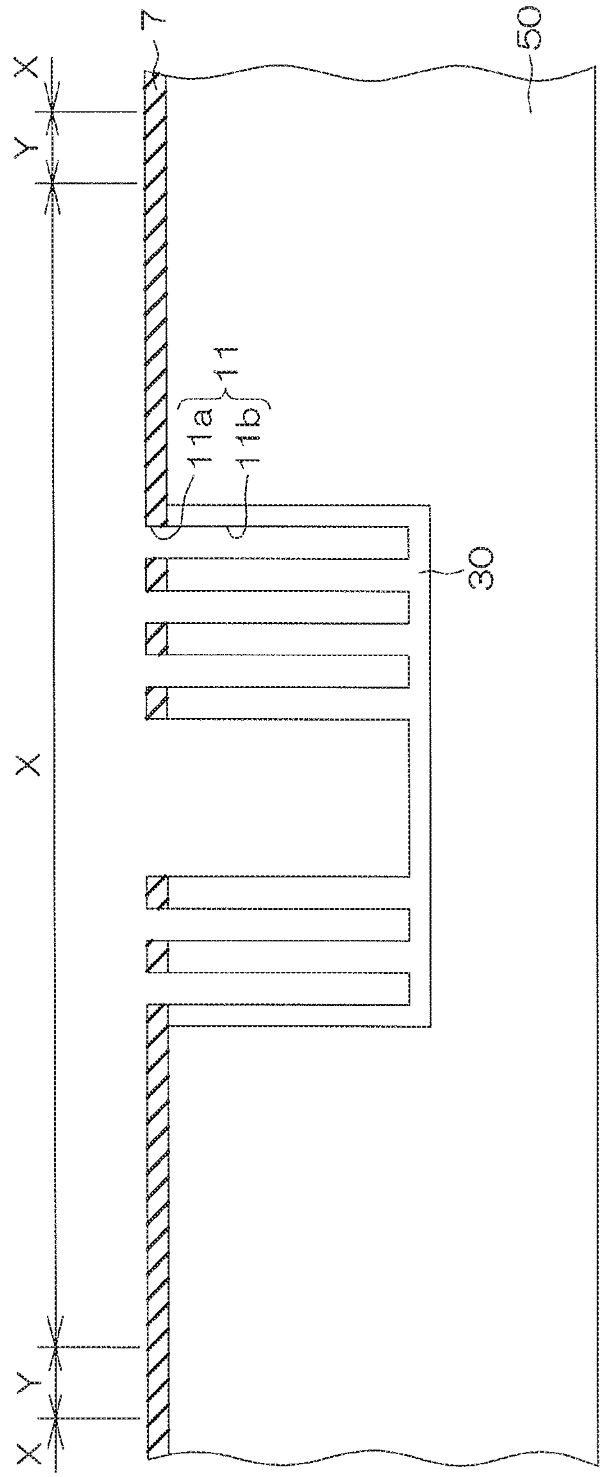
FIG. 42B is a cross-sectional view showing the step subsequent to FIG. 42A.
Figure 43A:
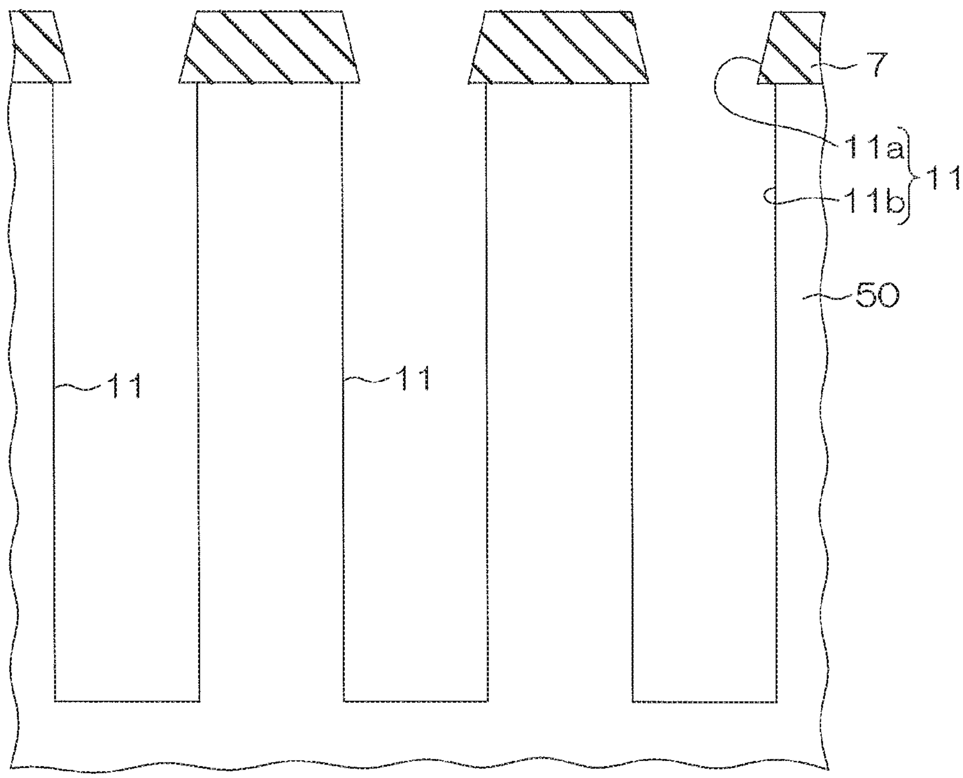
FIG. 43A is a partially enlarged cross-sectional view showing the details of the manufacturing step of a coil.

The steps performed on the original substrate 50 in which the insulating film 7 is formed on the surface are as follows. First, as shown in FIG. 42A, by photolithography and etching, a part of the insulating film 7 that corresponds to a region to form the coil formation trench 11 is removed. In this way, in the insulating film 7, a first trench part 11*a* is formed. Then, a hard mask formed with the insulating film 7 is used, and thus the original substrate 50 is etched. In this way, as shown in FIGS. 42B and 43A, a second trench part 11*b* is formed in the original substrate 50. In this way, in the insulating film 7 and the original substrate 50, the coil formation trench 11 formed with the first trench part 11*a* and the second trench part 11*b* is formed. The coil formation trench 11 may be formed with, for example, a so-called BOSCH process. The BOSCH process is a process that is used to make a hollow part in a MEMS (Micro Electro Mechanical System).

Figure 43B:
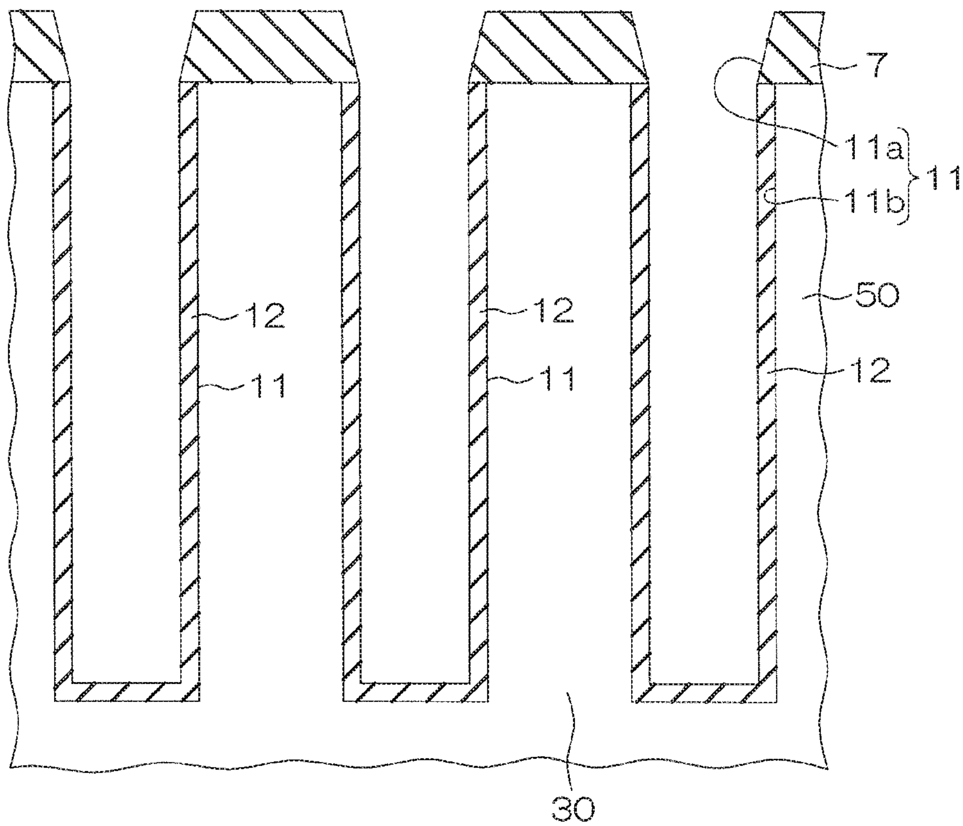
FIG. 43B is a partially enlarged cross-sectional view showing the step subsequent to FIG. 43A.

Then, as shown in FIGS. 42B and 43B, on the inner surface of the coil formation trench 11, the insulating film (thermal oxide film) 12 is formed by a thermal oxidization method. Here, the surrounding wall (the side wall and the bottom wall) of the coil formation trench 11 (the second trench part 11*b*) in the original substrate 50 is thermally oxidized into an insulator portion (thermal oxide film) 30 having insulation. In FIG. 42B, the insulating film 12 is omitted but the insulator portion 30 is shown. In the preferred embodiment, the entire wall sandwiched by the coil formation trench 11 (the second trench part 11*b*) in the shape of a spiral in the original substrate 50 is formed into the thermal oxide film.

Figure 42C:
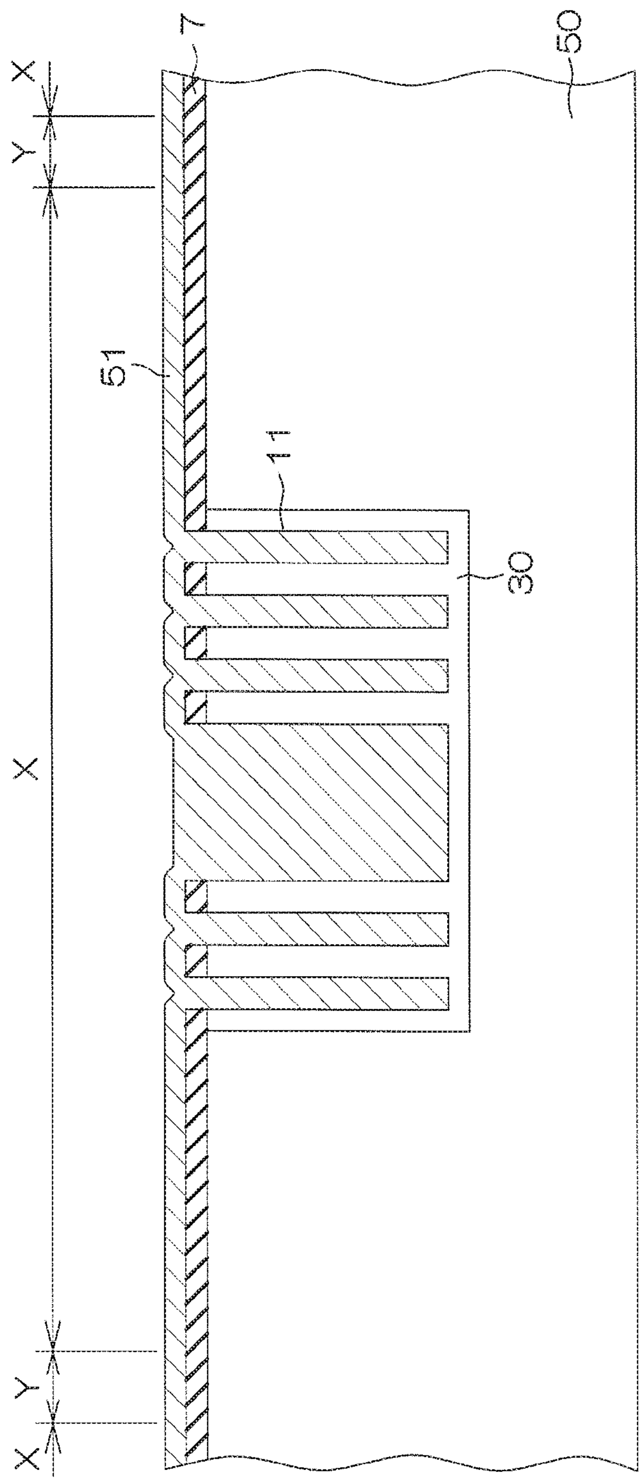
FIG. 42C is a cross-sectional view showing the step subsequent to FIG. 42B.
Figure 43C:
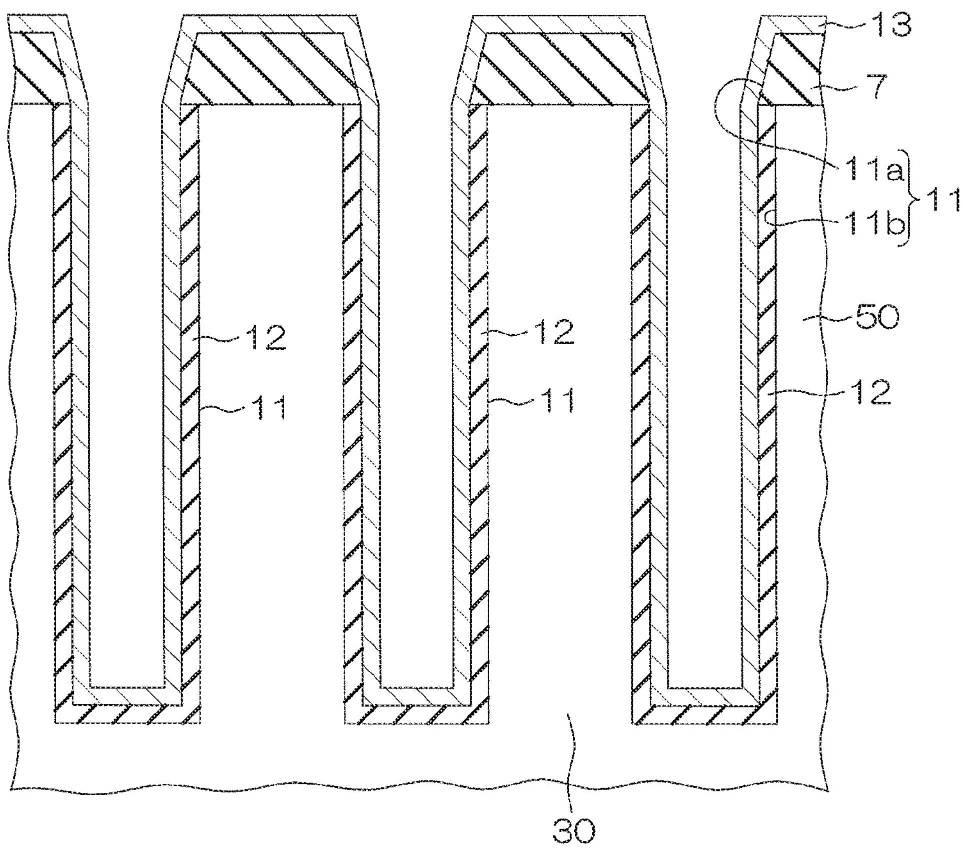
FIG. 43C is a partially enlarged cross-sectional view showing the step subsequent to FIG. 43B.
Figure 43D:
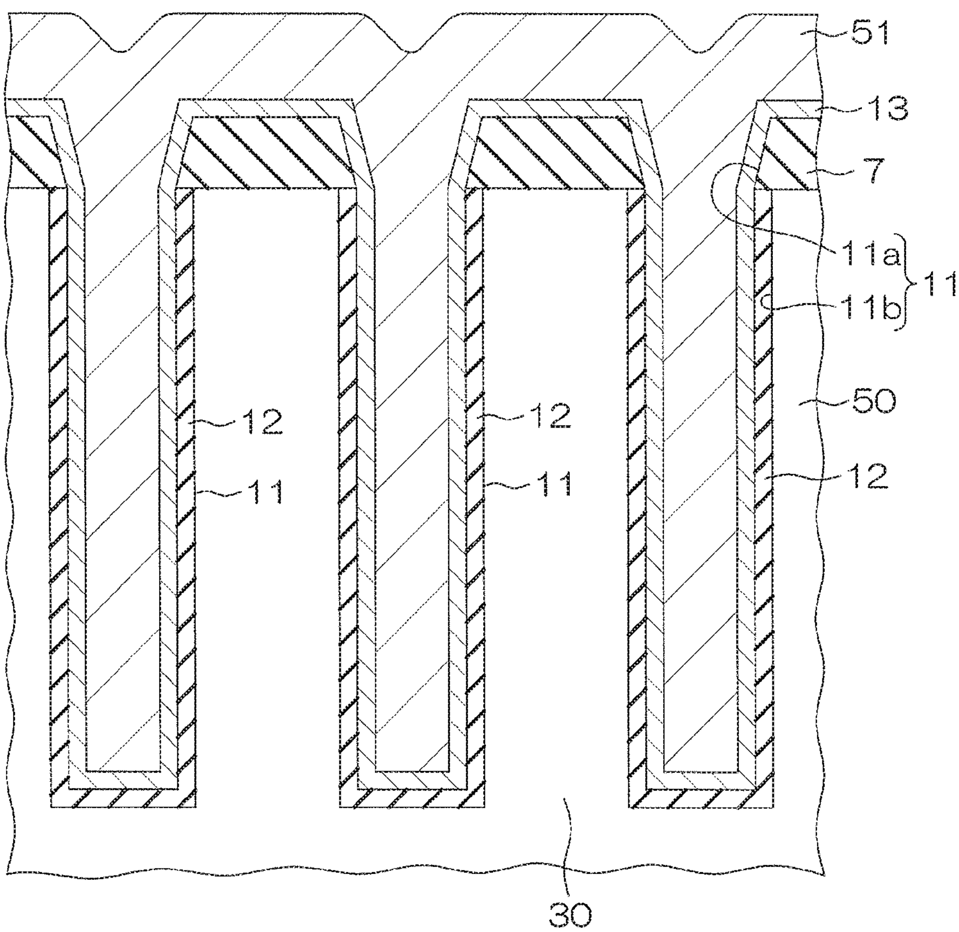
FIG. 43D is a partially enlarged cross-sectional view showing the step subsequent to FIG. 43C.

Then, for example, by a sputtering method, the barrier metal film 13 made of TiN is formed on the element formation surface 2*a* including the interior of the coil formation trench 11. In this way, then, as shown in FIG. 43C, the barrier metal film 13 is formed on the surfaces of the insulating film 12 and the insulating film 7 within the coil formation trench 11, and the surface of the insulating film 7 outside the coil formation trench 11. Thereafter, annealing processing is performed. Thereafter, as shown in FIGS. 42C and 43D, for example, by a CVD method, on the element formation surface 2*a* including the interior of the coil formation trench 11, the conductive member 51 formed of tungsten (W) is deposited.

Figure 42D:
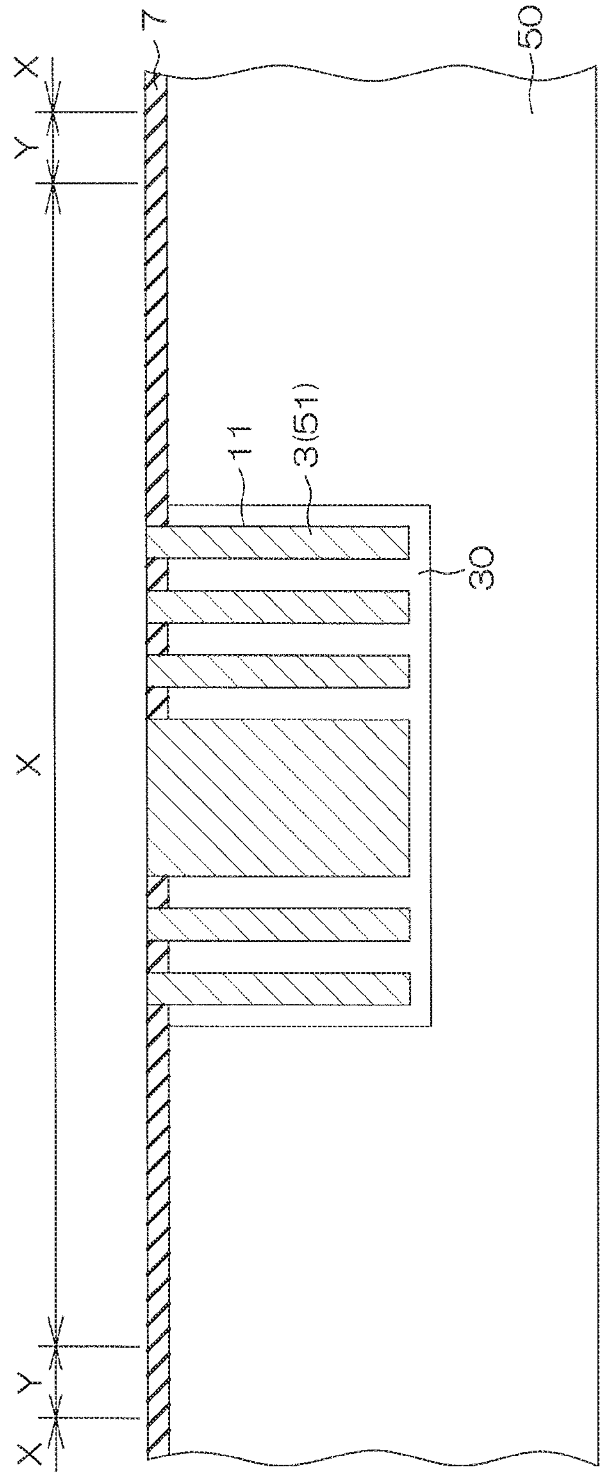
FIG. 42D is a cross-sectional view showing the step subsequent to FIG. 42C.
Figure 43E:
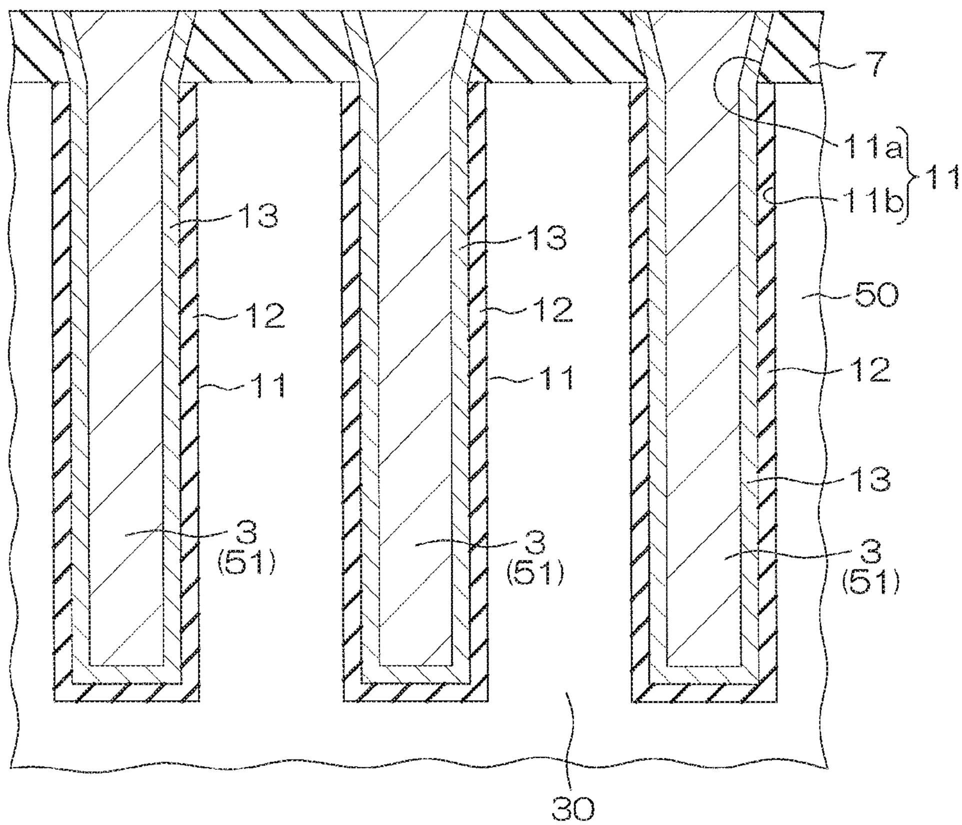
FIG. 43E is a partially enlarged cross-sectional view showing the step subsequent to FIG. 43D.

Then, for example, by an etch back method, overall etching is performed on the conductive member 51 from its surface. The overall etching is continued until the surface of the conductive member 51 is flush with the surface of the insulating film 7. In this way, as shown in FIGS. 42D and 43E, the conductive member 51 is embedded within the coil formation trench 11 while in contact with the barrier metal film 13. By the conductive member 51 embedded within the coil formation trench 11, the coil 3 in the shape of a spiral when seen in plan view is formed.

Figure 42E:
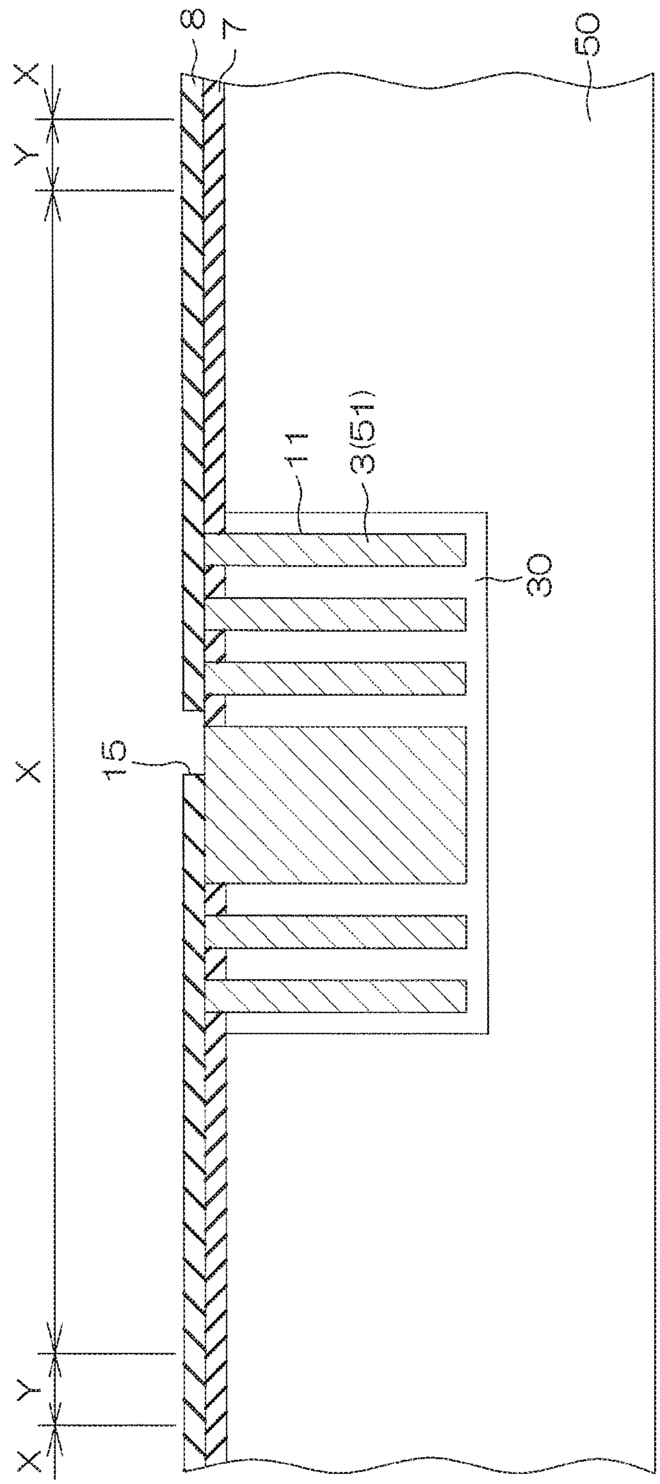
FIG. 42E is a cross-sectional view showing the step subsequent to FIG. 42D.

Then, as shown in FIG. 42E, on the insulating film 7, the insulating film 8 formed with a USG (Undoped Silicate Glass) film or the like is formed so as to coat the insulating film 7 (the element formation surface 2*a*) and the coil 3. The insulating film 8 is formed by, for example, a CVD method. Thereafter, by photolithography and etching, in regions of the insulating film 8 corresponding to one end portion and the other end portion of the coil 3, the first contact hole 14 (see FIG. 37) and the second contact hole 15 (see FIG. 42E) penetrating the insulating film 8 are respectively formed.

Figure 42F:
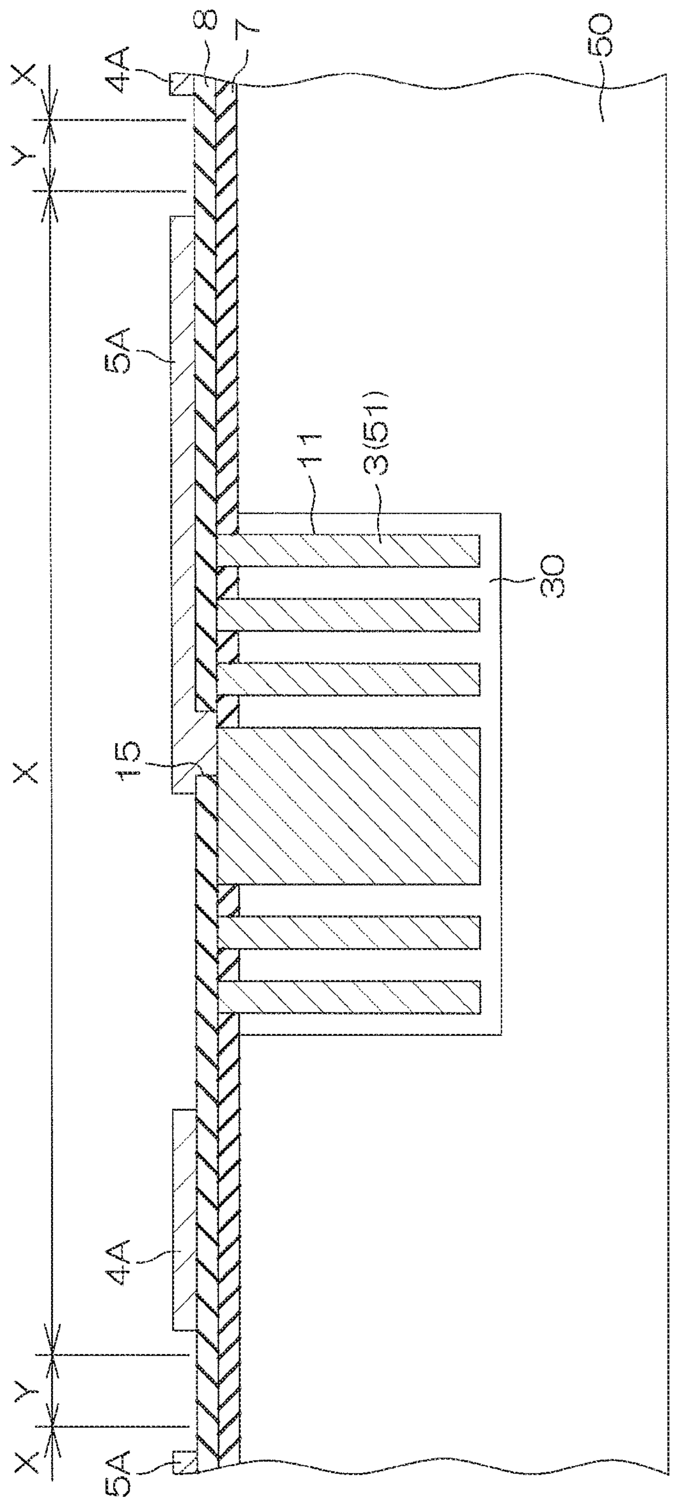
FIG. 42F is a cross-sectional view showing the step subsequent to FIG. 42E.

Then, for example, by sputtering, on the insulating film 8 including the interiors of the contact holes 14 and 15, an electrode film forming the first electrode 4 and the second electrode 5 is formed. In the preferred embodiment, the electrode film made of Al is formed. Thereafter, by photolithography and etching, the electrode film is patterned, and thus as shown in FIG. 42F, the electrode film is separated into the first electrode film 4A and the second electrode film 5A.

Figure 42G:
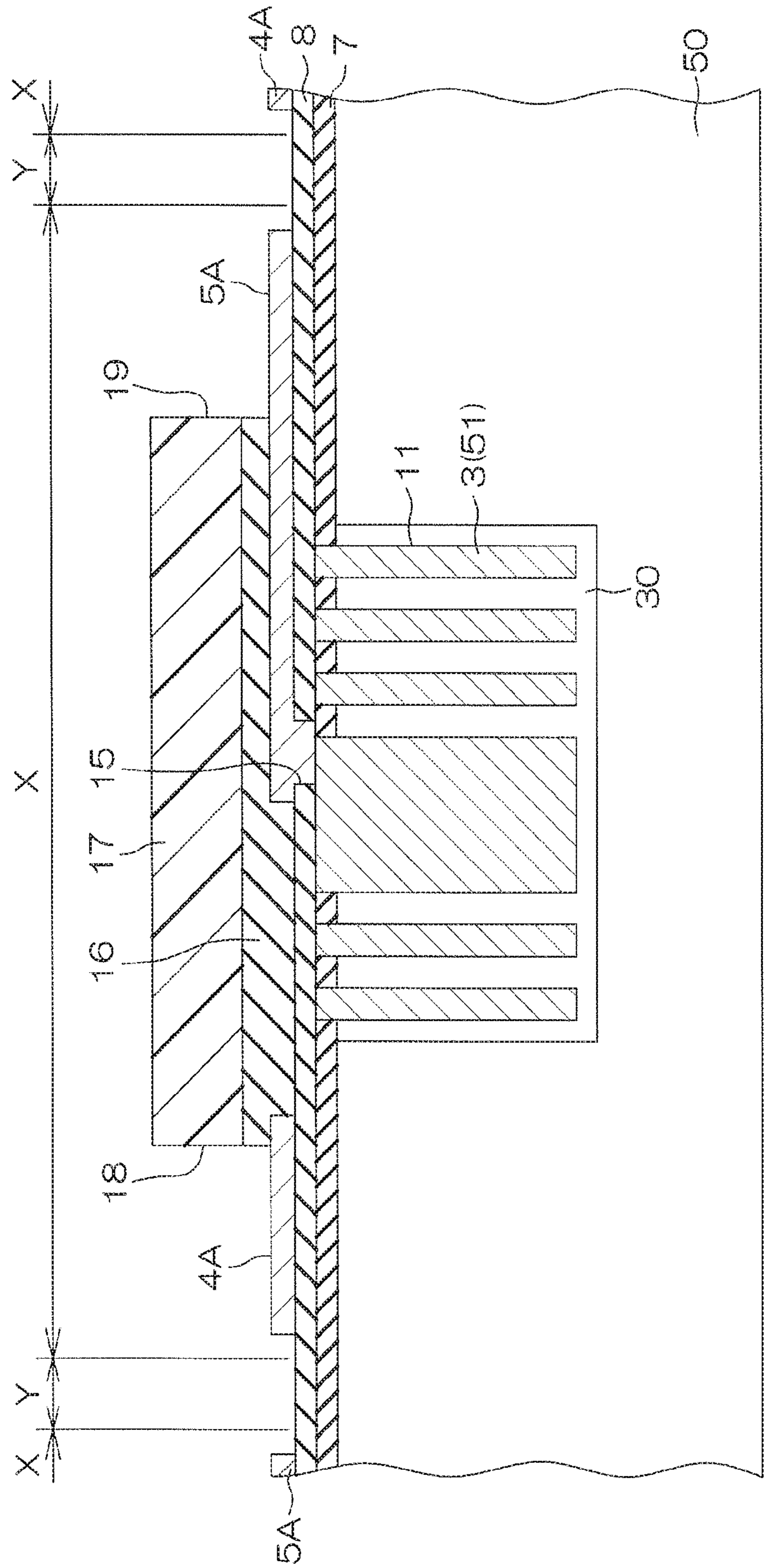
FIG. 42G is a cross-sectional view showing the step subsequent to FIG. 42F.

Then, as shown in FIG. 42G, for example, by a CVD method, the passivation film 16 such as a nitride film is formed, and furthermore, polyimide is applied to form the resin film 17. For example, polyimide to which photosensitivity is added is applied, and the polyimide is developed after exposure with a pattern corresponding to the cutout portions 18 and 19. In this way, the resin film 17 having a cutout portion corresponding to the cutout portions 18 and 19 is formed. Thereafter, as necessary, heat treatment for curing the resin film is performed. Then, by dry etching using the resin film 17 as a mask, the cutout portions 18 and 19 are formed in the passivation film 16.

Figure 42H:
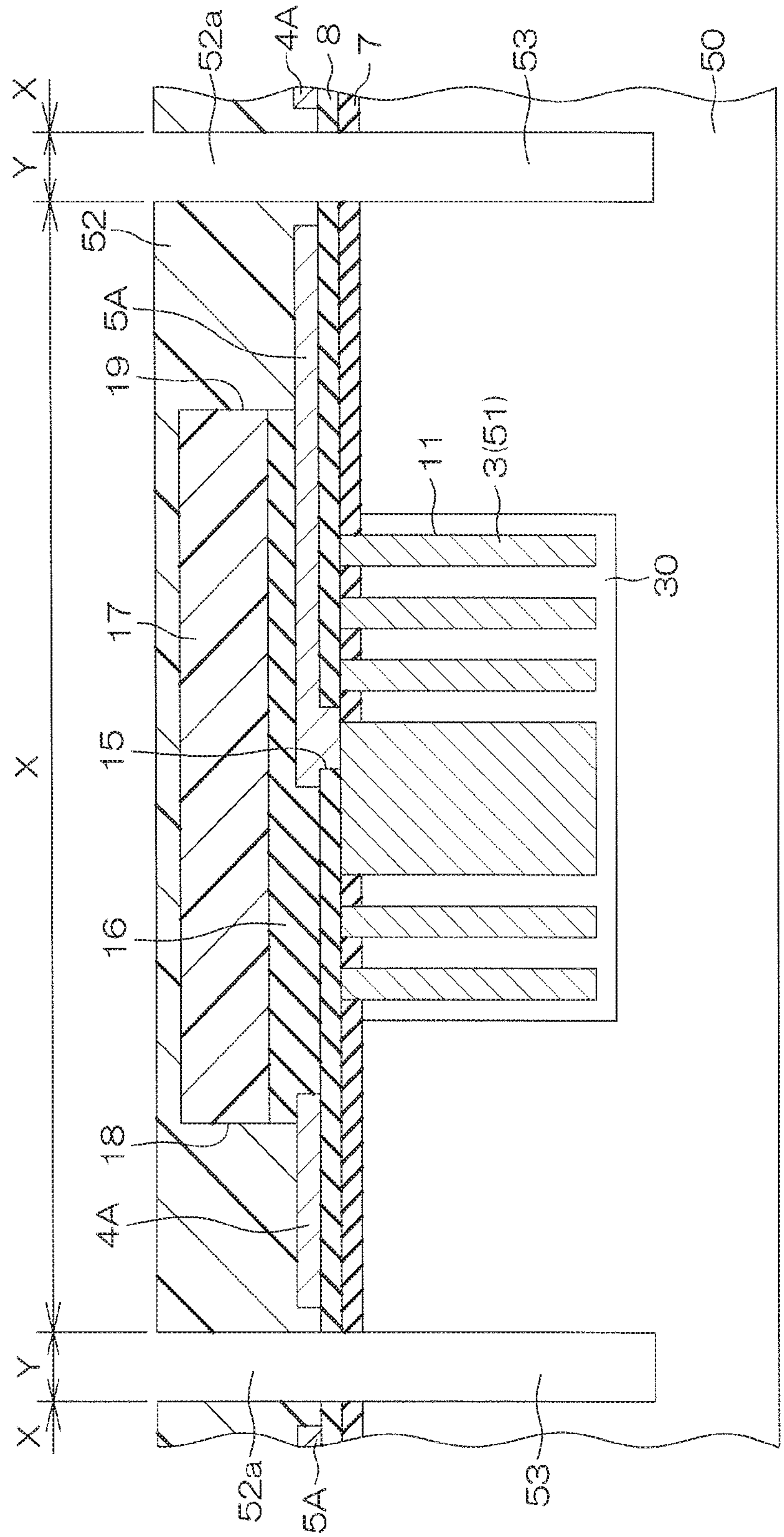
FIG. 42H is a cross-sectional view showing the step subsequent to FIG. 42G.

Then, as shown in FIG. 42H, a resist mask 52 having an opening 52*a* in a lattice shape matching with the boundary region Y (see FIG. 44) is formed. Plasma etching is performed via the resist mask 52, and thus as shown in FIG. 42H, the original substrate 50, the insulating film 7, and the insulating film 8 are etched from the surface of the insulating film 8 to a predetermined depth. In this way, along the boundary region Y, a groove (scribe groove) 53 for cutting is formed.

Figure 42I:
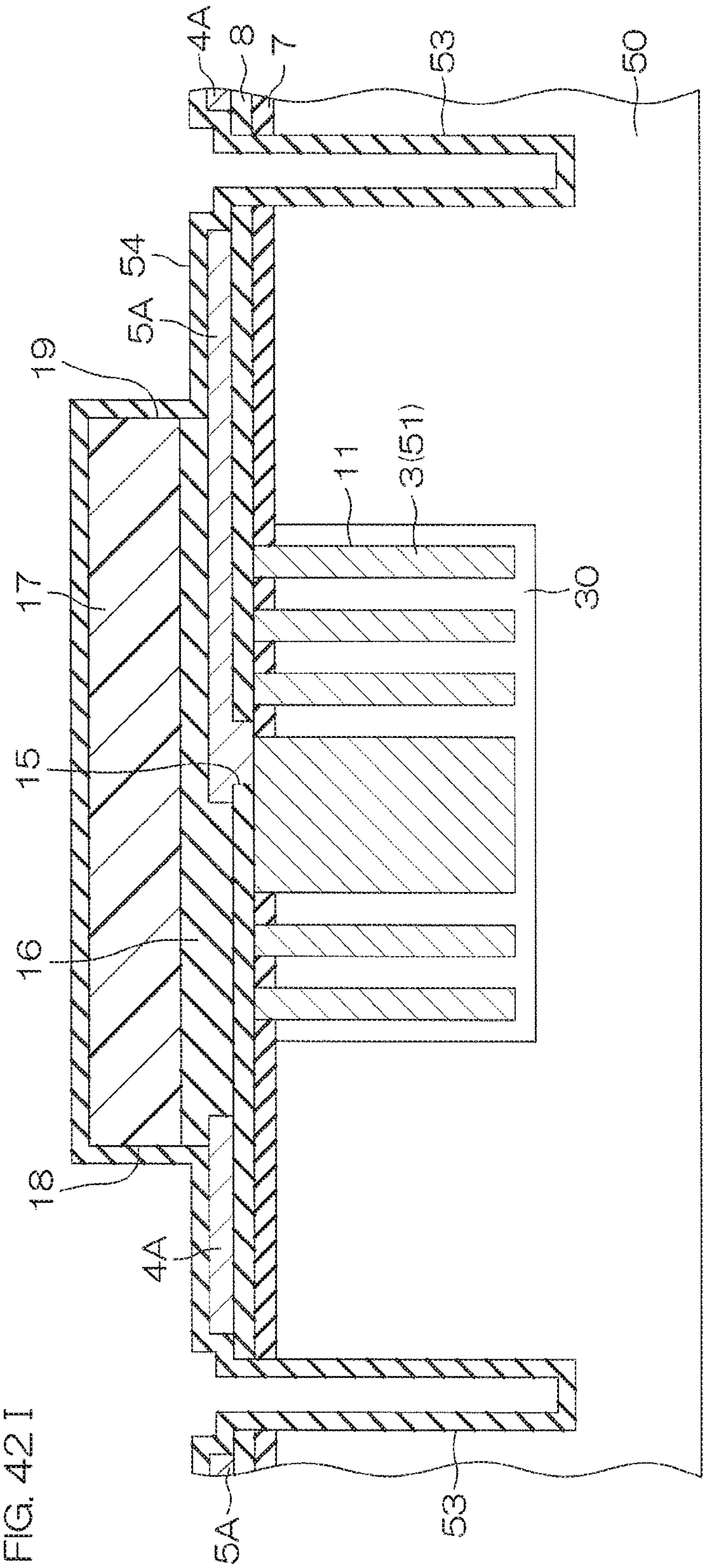
FIG. 42I is a cross-sectional view showing the step subsequent to FIG. 42H.

Then, the resist mask 52 is peeled off. Thereafter, as shown in FIG. 42I, for example, by a CVD method, an insulating film 54 formed with a nitride film etc., serving as the material for the passivation film 9 is formed over the entire region of the surface of the original substrate 50. Here, the insulating film 54 is also formed over the entire region of the inner surface (the side wall surface and the bottom wall surface) of the groove 53.

Figure 42J:
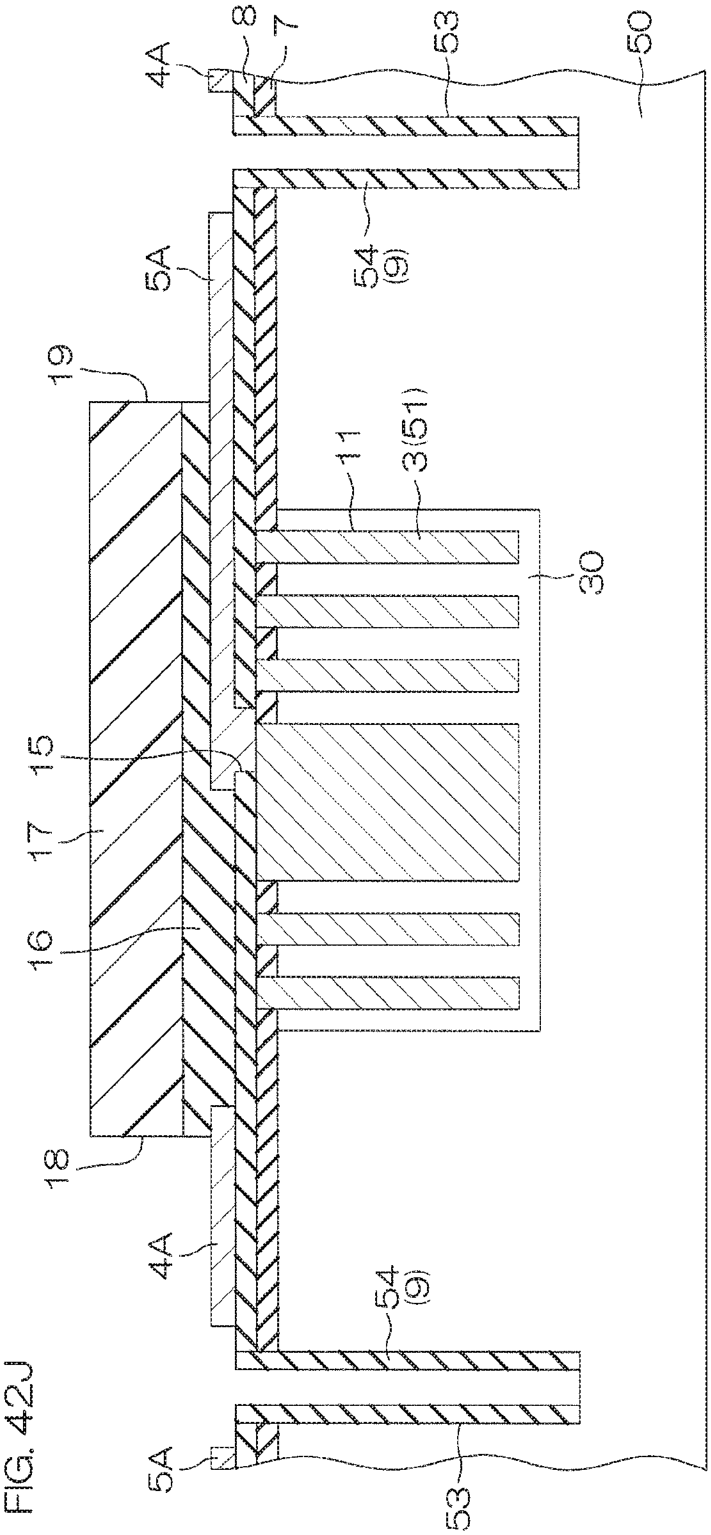
FIG. 42J is a cross-sectional view showing the step subsequent to FIG. 42I.

Then, as shown in FIG. 42J, the insulating film 54 is selectively etched. Specifically, a part of the insulating film 54 other than the insulating film 54 (the passivation film 9) on the side wall surface of the groove 53 is removed. In this way, a part of the electrode films 4A and 5A that is not covered by the passivation film 16 and the resin film 17 is exposed. The insulating film 54 on the bottom surface of the groove 53 is removed.

Figure 42K:
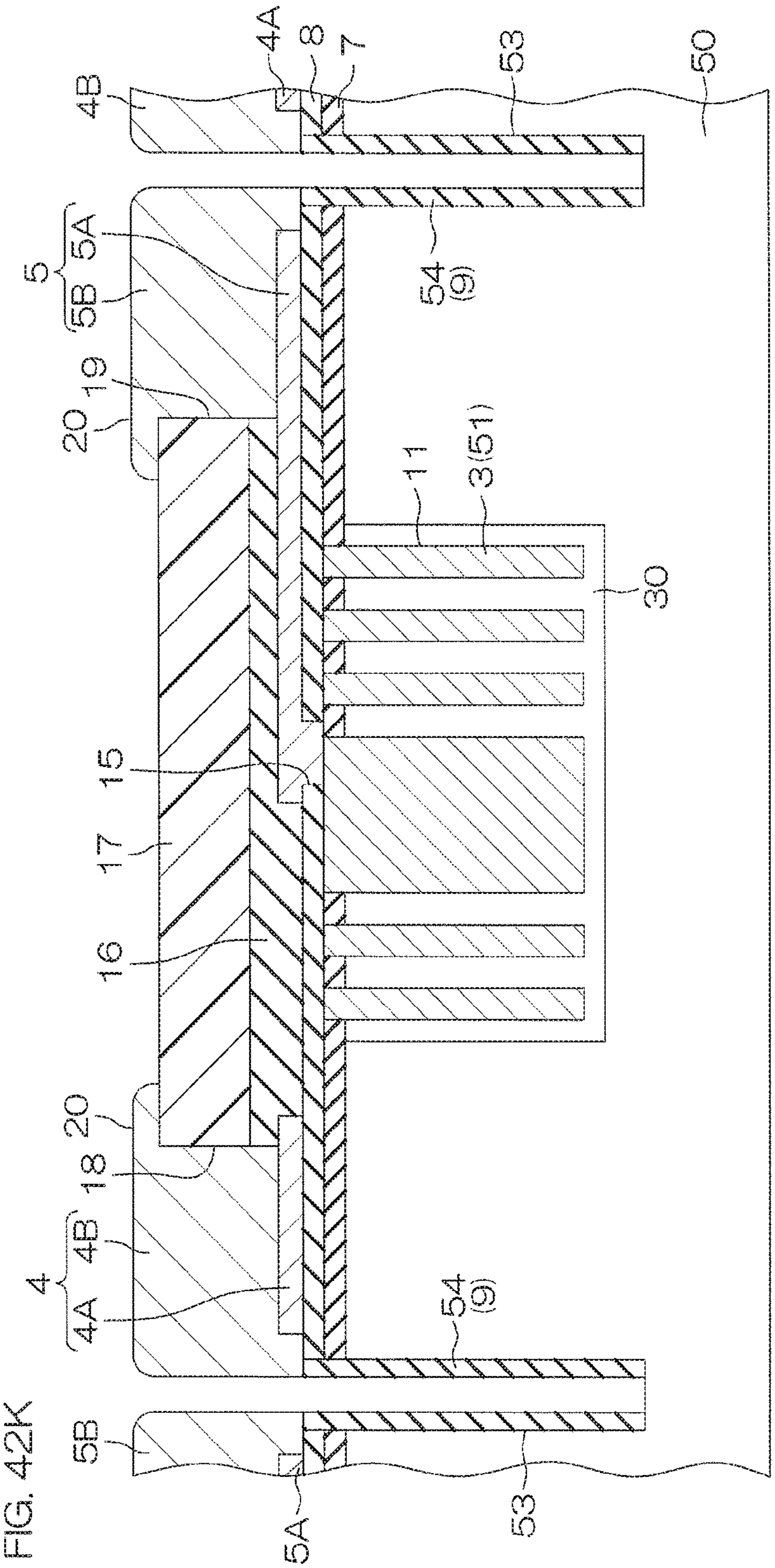
FIG. 42K is a cross-sectional view showing the step subsequent to FIG. 42J.

Then, as shown in FIG. 42K, on the first electrode film 4A (the first pad 4Ab) and the second electrode film 5A (the second pad 5Ab) exposed from the cutout portions 18 and 19, for example, by plating (preferably, electroless plating), plating growth is performed in the following order: for example, Ni, Pd, and Au. In this way, the first external connection electrode 4B and the second external connection electrode 5B are formed.

Figure 42L:
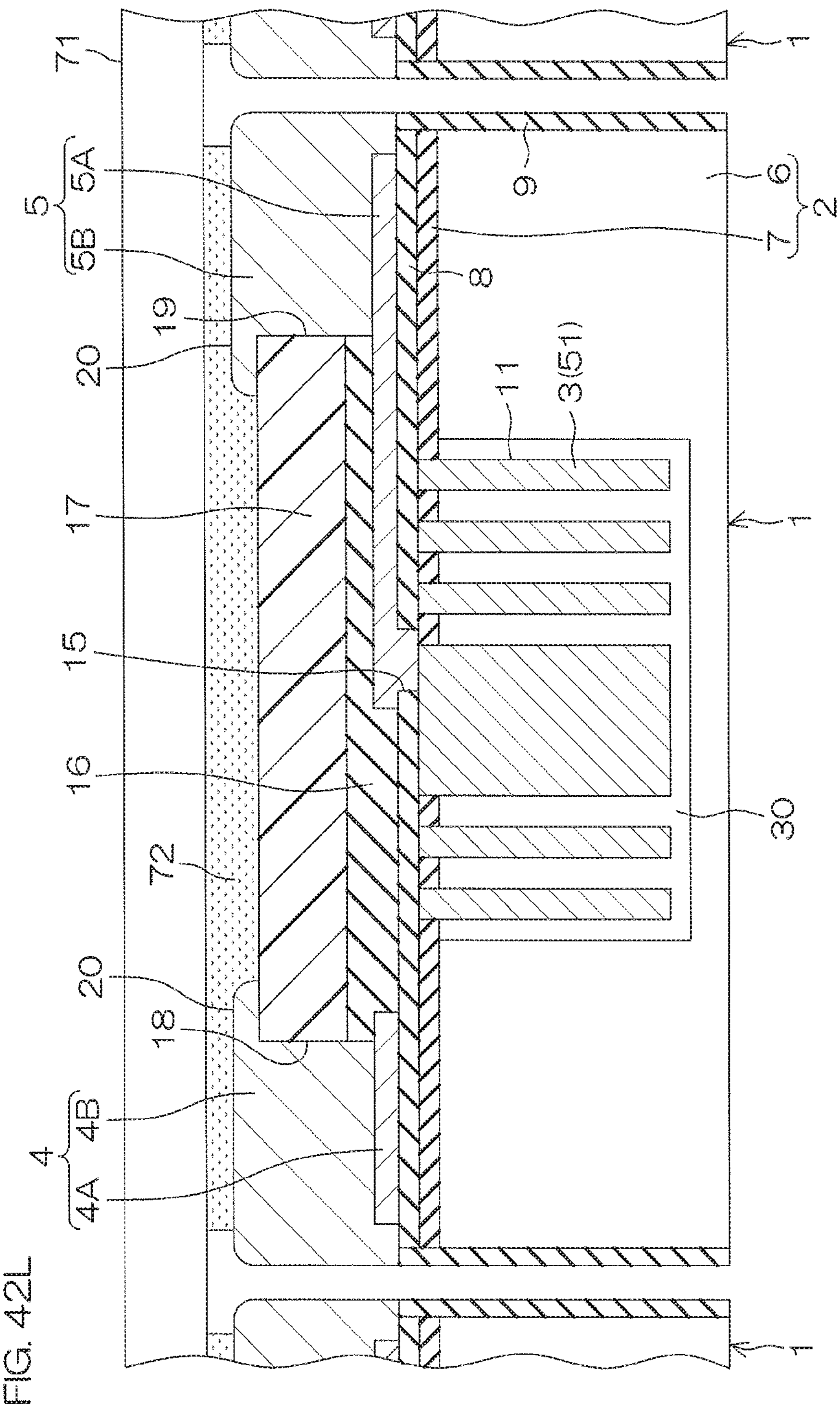
FIG. 42L is a cross-sectional view showing the step subsequent to FIG. 42K.

Thereafter, by a DBG (Dicing Before Grinding) method, a plurality of chip inductor regions X are divided into pieces. Specifically, as shown in FIG. 42L, first, on the side of the surface of the original substrate 50 (the side of the external connection electrode), a supporting tape 71 having an adhesive surface 72 is adhered. Then, the original substrate 50 is polished from the rear surface to the bottom surface of the groove 53. In this way, the chip inductor regions X are separated into individual chip inductors 1.

FIGS. 45A to 45D are cross-sectional views schematically showing the recovery step of the chip inductor 1 after the step of FIG. 42L.

Figure 45A:
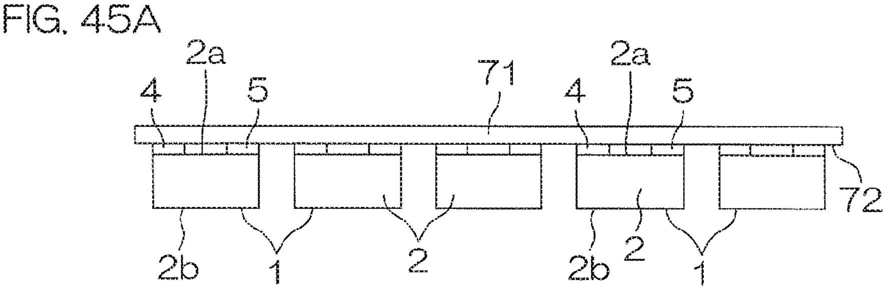
FIG. 45A is a cross-sectional view schematically showing the recovery step of the chip inductor after the step of FIG. 42L.
Figure 45B:
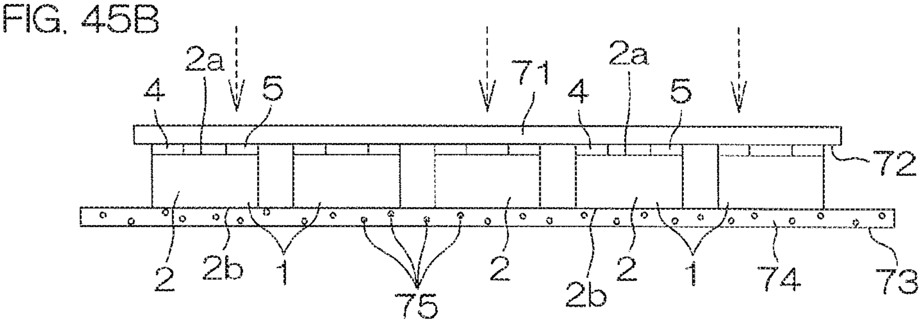
FIG. 45B is a cross-sectional view showing the step subsequent to FIG. 45A.

FIG. 45A shows a state where the separated chip inductors 1 are held by the supporting tape 71. In this state, as shown in FIG. 45B, a thermally foaming sheet 73 is adhered to the rear surface 2*b* of each of the chip inductors 1. The thermally foaming sheet 73 includes a sheet main body 74 in the shape of a sheet and a large number of foaming particles 75 kneaded into the sheet main body 74.

Figure 45C:
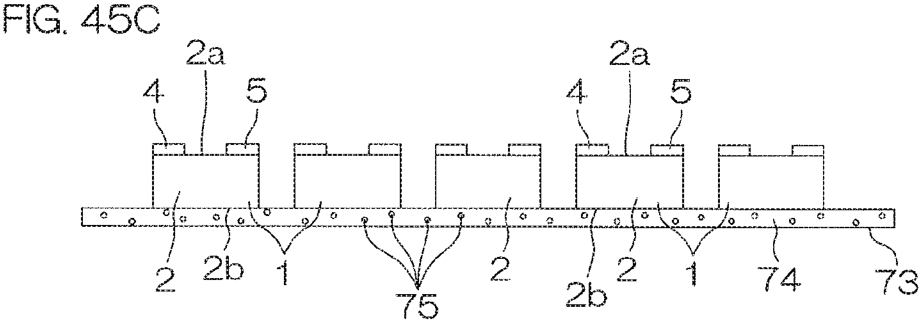
FIG. 45C is a cross-sectional view showing the step subsequent to FIG. 45B.

The adhesive force of the sheet main body 74 is greater than that of the adhesive surface 72 of the supporting tape 71. Hence, after the thermally foaming sheet 73 is adhered to the rear surface 2*b* of each of the chip inductors 1, as shown in FIG. 45C, the supporting tape 71 is peeled off from each chip inductor 1, and the chip inductor 1 is transferred to the thermally foaming sheet 73. Here, since the adhesive property of the adhesive surface 72 is lowered by the application of ultraviolet rays to the supporting tape 71 (see dotted arrows in FIG. 45B), the supporting tape 71 is easily peeled off from each chip inductor 1.

Figure 45D:
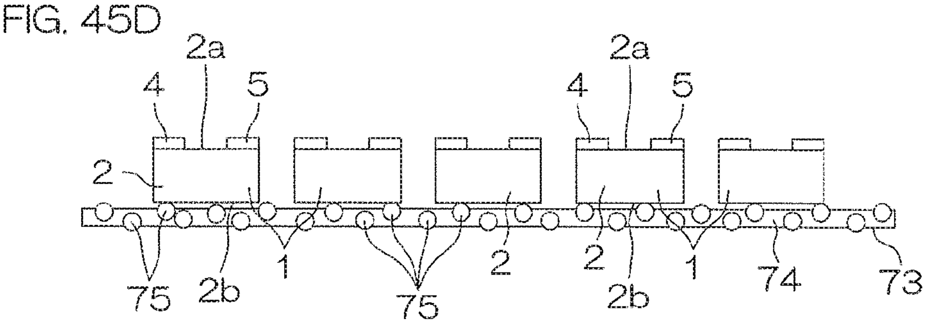
FIG. 45D is a cross-sectional view showing the step subsequent to FIG. 45C.

Then, the thermally foaming sheet 73 is heated. In this way, as shown in FIG. 45D, in the thermally foaming sheet 73, the foaming particles 75 within the sheet main body 74 are foamed and are expanded out of the surface of the sheet main body 74. Consequently, the contact area between the thermally foaming sheet 73 and the rear surface 2*b* of each chip inductor 1 is decreased, and thus all the chip inductors 1 are naturally peeled off from the thermally foaming sheet 73. The chip inductors 1 recovered in this way are mounted on the mounting substrate 91 (see FIG. 41), and are stored in a storage space formed by an embossed carrier tape (not shown). In this case, as compared with a case where the chip inductors 1 are peeled off from the supporting tape 71 or the thermally foaming sheet 73 one by one, it is possible to reduce the processing time. As a matter of course, with a plurality of chip inductors 1 held by the supporting tape 71 (see FIG. 45A), without use of the thermally foaming sheet 73, the chip inductors 1 may be directly peeled off from the supporting tape 71 by a predetermined number of pieces.

Figure 46A:
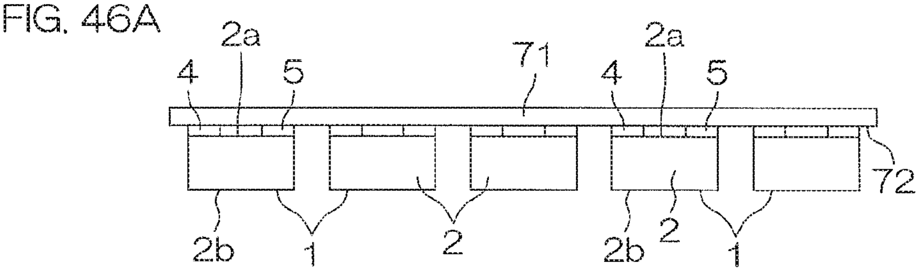
FIG. 46A is a cross-sectional view schematically showing another example of the recovery step of the chip inductor after the step of FIG. 42L.
Figure 46B:
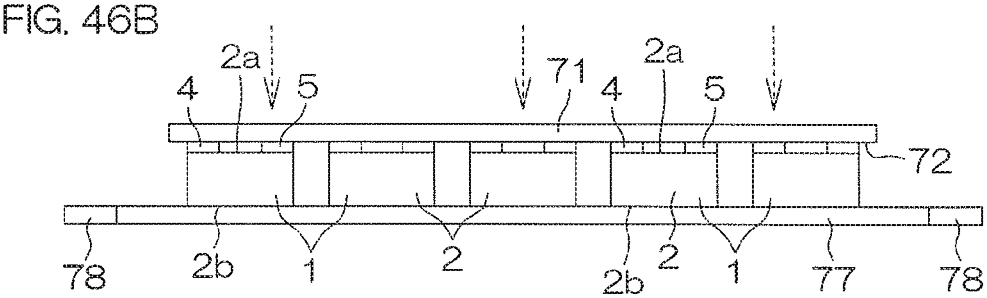
FIG. 46B is a cross-sectional view showing the step subsequent to FIG. 46A.
Figure 46C:
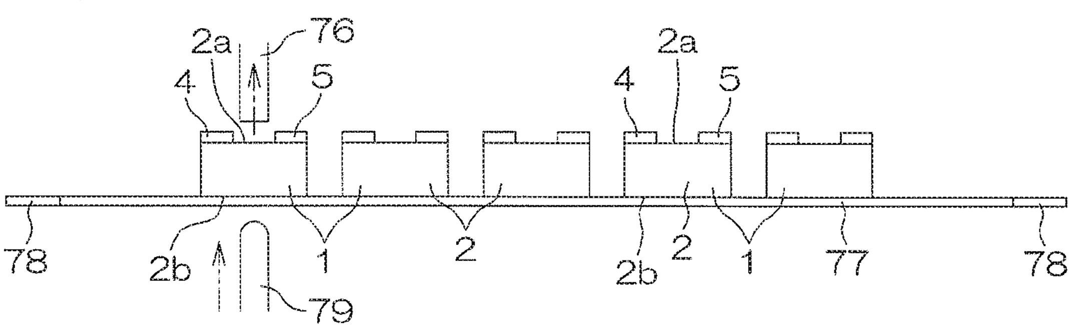
FIG. 46C is a cross-sectional view showing the step subsequent to FIG. 46B.

FIGS. 46A to 46C are schematic cross-sectional views showing another example of the recovery step of the chip inductor after the step of FIG. 42L.

As with FIG. 45A, FIG. 46A shows a state where a plurality of chip inductors 1 separated into pieces are held by the supporting tape 71. In this state, as shown in FIG. 46B, a transfer tape 77 is adhered to the rear surface 2*b* of each chip inductor 1. The transfer tape 77 has an adhesive force greater than that of the adhesive surface 72 of the supporting tape 71. Hence, as shown in FIG. 46C, after the transfer tape 77 is adhered to each chip inductor 1, the supporting tape 71 is peeled off from each chip inductor 1. Here, as described previously, ultraviolet rays (see dotted arrows in FIG. 46B) may be applied to the supporting tape 71 so that the adhesive property of the adhesive surface 72 is lowered.

The frames 78 of the recovery device (not shown) are adhered to both ends of the transfer tape 77. The frames 78 on both sides can be moved either in a direction in which they approach each other or in a direction in which they are separated. After the supporting tape 71 is peeled off from each chip inductor 1, the frames 78 on both sides are moved in the direction in which they are separated, and thus the transfer tape 77 is extended so as to become thin. In this way, the adhesive force of the transfer tape 77 is lowered, and thus each chip inductor 1 is easily peeled off from the transfer tape 77. When in this state, the suction nozzle 76 of the conveying device (not shown) is directed to the side of the element formation surface 2*a* of the chip inductor 1, the chip inductor 1 is peeled off from the transfer tape 77 by the adhesive force produced by the conveying device and is sucked by the suction nozzle 76. Here, the chip inductor 1 is pushed up by a projection 79 shown in FIG. 46C from the side opposite to the suction nozzle 76 through the transfer tape 77 to the side of the suction nozzle 76, and thus the chip inductor 1 can be smoothly peeled off from the transfer tape 77. The chip inductor 1 recovered in this way is conveyed by the conveying device while being sucked by the anchor portion 76.

Figure 47A:
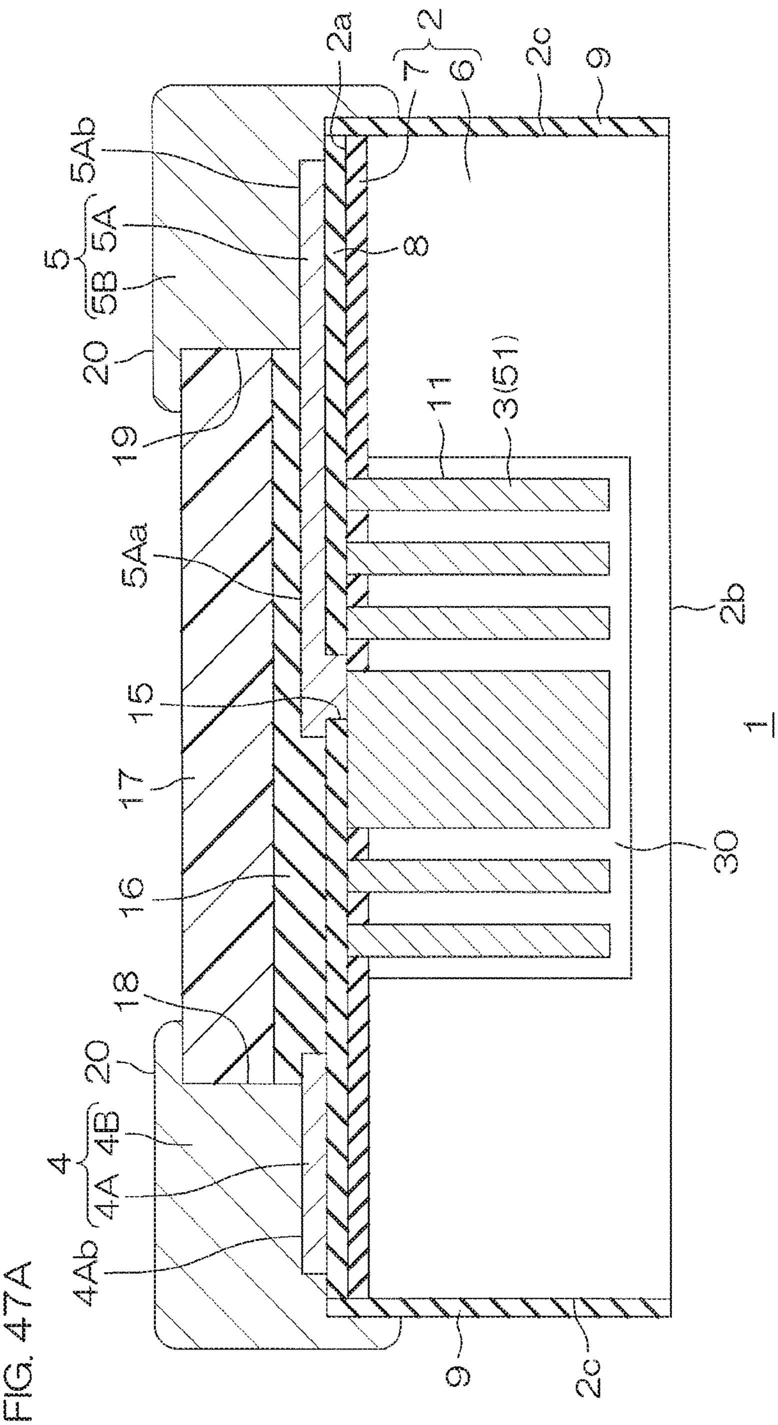
FIG. 47A is a cross-sectional view showing a modification example of an external connection electrode, and shows a cut surface corresponding to FIG. 35.
Figure 47B:
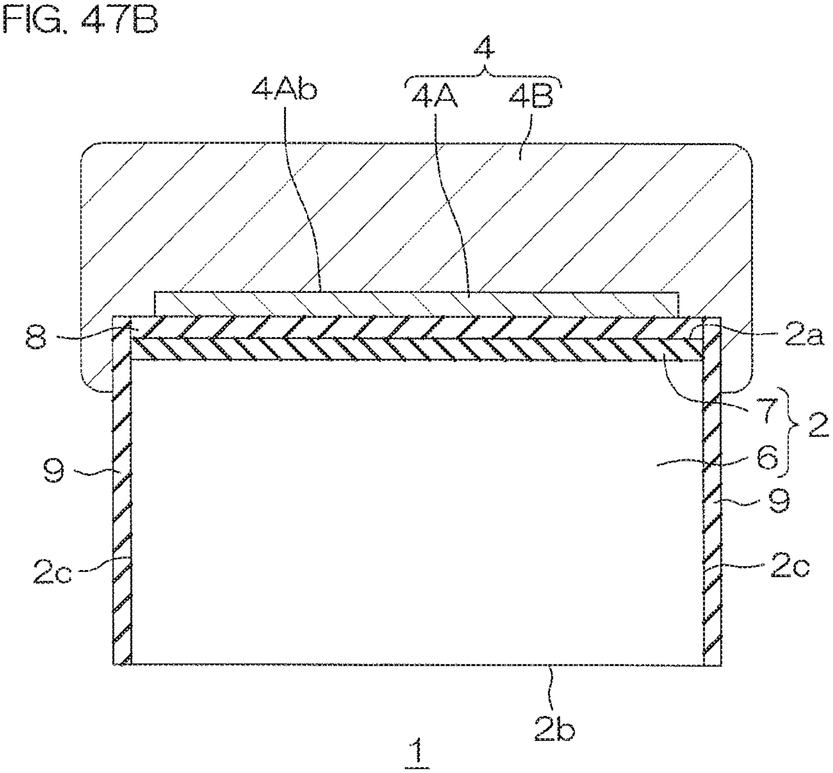
FIG. 47B is a cross-sectional view showing the modification example of the external connection electrode, and shows a cut surface corresponding to FIG. 38.

FIGS. 47A and 47B are cross-sectional views showing a modification example of the external connection electrode of the chip inductor 1. FIG. 47A shows a cut surface corresponding to FIG. 35, and FIG. 47B shows a cut surface corresponding to FIG. 38. In FIGS. 47A and 47B, the portions corresponding to the portions of FIGS. 35 and 38 described previously are provided with the same symbols of FIGS. 35 and 38.

The first external connection electrode 4B is filled in one cutout portion 18 in the passivation film 16 and the resin film 17, and the second external connection electrode 5B is filled in the other cutout portion 19.

The first external connection electrode 4B is formed so as to cover the upper portion of the passivation film 9 on the side of one end portion of the substrate 2 and to straddle, from the peripheral portion of the surface of the insulating film 8, the surface of the passivation film 9 covering the three side surfaces 2*c* on the side of one end portion of the substrate 2. In other words, the first external connection electrode 4B is formed so as to cover not only the surface of the first electrode film 4A (the pad 4Ab) and the insulating film 8 exposed within the cutout portion 18 but also the passivation film 9 on the three side surfaces 2*c* of the substrate 2.

Likewise, the second external connection electrode 5B is formed so as to cover the upper portion of the passivation film 9 on the side of the other end portion of the substrate 2 and to straddle, from the peripheral portion of the surface of the insulating film 8, the surface of the passivation film 9 covering the three side surfaces 2*c* on the side of the other end portion of the substrate 2. In other words, the second external connection electrode 5B is formed so as to cover not only the surface of the second electrode film 5A (the pad 5Ab) and the insulating film 8 exposed within the cutout portion 19 but also the passivation film 9 on the three side surfaces 2*c* on the side of the other end portion of the substrate 2.

As described above, in the chip inductor 1, the first external connection electrode 4B is formed so as to cover the three side surfaces 2*c* on the side of one end portion of the substrate 2, and the second external connection electrode 5B is formed so as to cover the three side surfaces 2*c* on the side of the other end portion of the substrate 2. In other words, the external connection electrodes 4B and 5B are formed not only on the element formation surface 2*a* on the substrate 2 but also on the side surfaces 2*c* of the substrate 2. In this way, in the form shown in FIG. 41 described previously, when the external connection electrodes 4B and 5B of the chip inductor 1 are soldered to the mounting substrate, it is possible to increase the bonding area between the external connection electrodes 4B and 5B, and the mounting substrate. Consequently, it is possible to enhance the bonding strength of the external connection electrodes 4B and 5B on the mounting substrate.

Figure 48B:
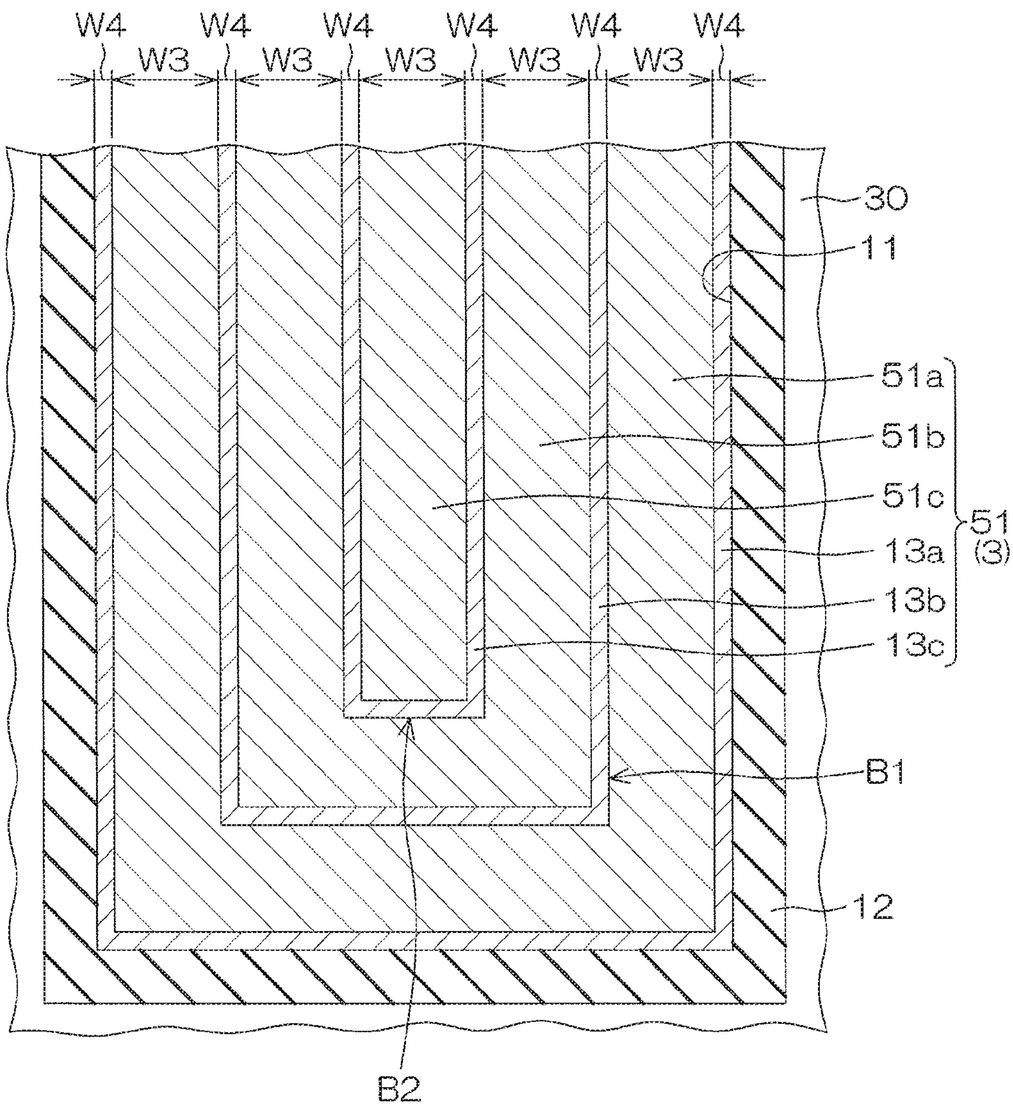
FIG. 48B is a partially enlarged cross-sectional view of FIG. 48A.

FIG. 48A is a diagram showing a modification example of the conductive member embedded within the coil formation trench 11, and is a partially enlarged cross-sectional view corresponding to FIG. 36. FIG. 48B is a partially enlarged cross-sectional view of FIG. 48A.

As shown in FIG. 48A, the width W2 of the coil formation trench 11 may be, for example, 10 μm or less, and more specifically, may be 3 μm or more and 9 μm or less. The depth D of the coil formation trench 11 may be, for example, 10 μm or more, and more specifically, may be 30 μm or more and 80 μm or less.

As shown in FIG. 48A, within the coil formation trench 11, the conductive member 51 is embedded. The conductive member 51 includes first, second, and third conductor layers 51*a*, 51*b* and 51*c*. The first and second conductor layers 51*a* and 51*b* are partitioned by a crystal boundary portion B1. The second and third conductor layers 51*b* and 51*c* are partitioned by a crystal boundary portion B2.

Although in the preferred embodiment, an example where the conductive member 51 is partitioned by the two crystal boundary portions B1 and B2 into the three conductor layers (the first to third conductor layers 51*a* to 51*c*) will be described, the conductive member 51 may be partitioned by one crystal boundary portion into two conductor layers. The conductive member 51 may be partitioned by three or more crystal boundary portions into four or more conductor layers.

As shown in FIGS. 48A and 48B, the conductive member 51 further includes a first seed layer 13*a* that intervenes between the coil formation trench 11 and the first conductor layer 51*a*, a second seed layer 13*b* that intervenes between the first and second conductor layers 51*a* and 51*b* and a third seed layer 13*c* that intervenes between the second and third conductor layers 51*b* and 51*c*.

In a modification example of the conductive member, the crystal boundary portion B1 is defined by the second seed layer 13*b* intervening between the first and second conductor layers 51*a* and 51*b*. The crystal boundary portion B2 is defined by the third seed layer 13*c* intervening between the second and third conductor layers 51*b* and 51*c*. In other words, the crystal boundary portion B1 includes the crystal boundary surface formed by bringing the first and second conductor layers 51*a* and 51*b* into contact with the second seed layer 13*b*. The crystal boundary portion B2 includes the crystal boundary surface formed by bringing the second and third conductor layers 51*b* and 51*c* into contact with the third seed layer 13*c*.

The first seed layer 13*a* is formed such that the front surface and the rear surface (the surface on the side of the substrate 2) are along the inner surface (the side portion and the bottom portion) of the coil formation trench 11. More specifically, the first seed layer 13*a* is formed such that within the coil formation trench 11, the front surface and the rear surface (the surface on the side of the substrate 2) are along the surface of the insulating film 12 and the surface of the insulating film 7. On the first seed layer 13*a*, the first conductor layer 51*a* is formed.

The first conductor layer 51*a* is formed such that the front surface and the rear surface (the surface on the side of the substrate 2) are along the surface of the first seed layer 13*a*. On the first conductor layer 51*a*, the second seed layer 13*b* is formed. The second seed layer 13*b* is formed such that the front surface and the rear surface (the surface on the side of the substrate 2) are along the surface of the first conductor layer 51*a*. In other words, the second seed layer 13*b* is formed along the inner surface (the side portion and the bottom portion) of the coil formation trench 11 in the shape of the letter U in cross section, and partitions the first conductor layer 51*a* into a concave shape in cross section. On the second seed layer 13*b*, the second conductor layer 51*b* is formed.

The second conductor layer 51*b* is formed such that the front surface and the rear surface (the surface on the side of the substrate 2) are along the surface of the second seed layer 13*b*. On the second conductor layer 51*b*, the third seed layer 13*c* is formed. The third seed layer 13*c* is formed such that the front surface and the rear surface (the surface on the side of the substrate 2) are along the surface of the second conductor layer 51*b*. In other words, the third seed layer 13*c* is formed along the side portion and the bottom portion of the coil formation trench 11 in the shape of the letter U in cross section, and partitions the second conductor layer 51*b* into a concave shape in cross section. On the third seed layer 13*c*, the third conductor layer 51*c* is formed. The third conductor layer 51*c* is formed such that the groove in the recess shape in cross section partitioned by the third seed layer 13*c* is refilled therein.

The first to third conductor layers 51*a* to 51*c* and the first to third seed layers 13*a* to 13*c* are formed of different conductive materials. The first to third conductor layers 51*a* to 51*c* are formed of, for example, tungsten (W) or aluminum (Al). On the other hand, the first to third seed layers 13*a* to 13*c* are formed of, for example, titanium nitride (TiN).

Each thickness W3 of the first to third conductor layers 51*a* to 51*c* is, for example, 1 μm or less, and more specifically is 0.1 to 0.6 μm. Each thickness W4 of the first to third seed layers 13*a* to 13*c* is, for example, 500 angstroms or less, and more specifically is 300 to 500 angstroms.

Figure 49A:
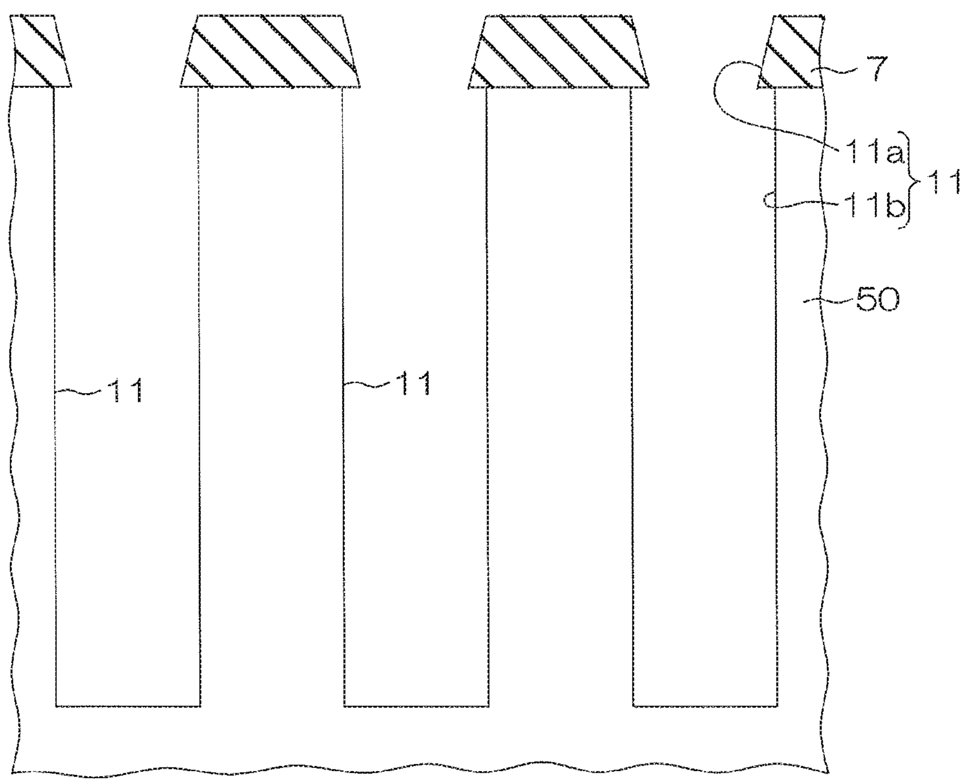
FIG. 49A is a partially enlarged cross-sectional view showing a step of embedding the conductive member of FIG. 48A into the coil formation trench.

FIGS. 49A to 49K are partially enlarged cross-sectional views showing a step of embedding the conductive member 51 of FIG. 48A in the coil formation trench 11, and show cut surfaces corresponding to FIG. 36A. FIG. 49A shows a state where the step of FIG. 42A described previously has been performed, and FIG. 49B shows a state where the step of FIG. 42B described previously has been performed.

Figure 49B:
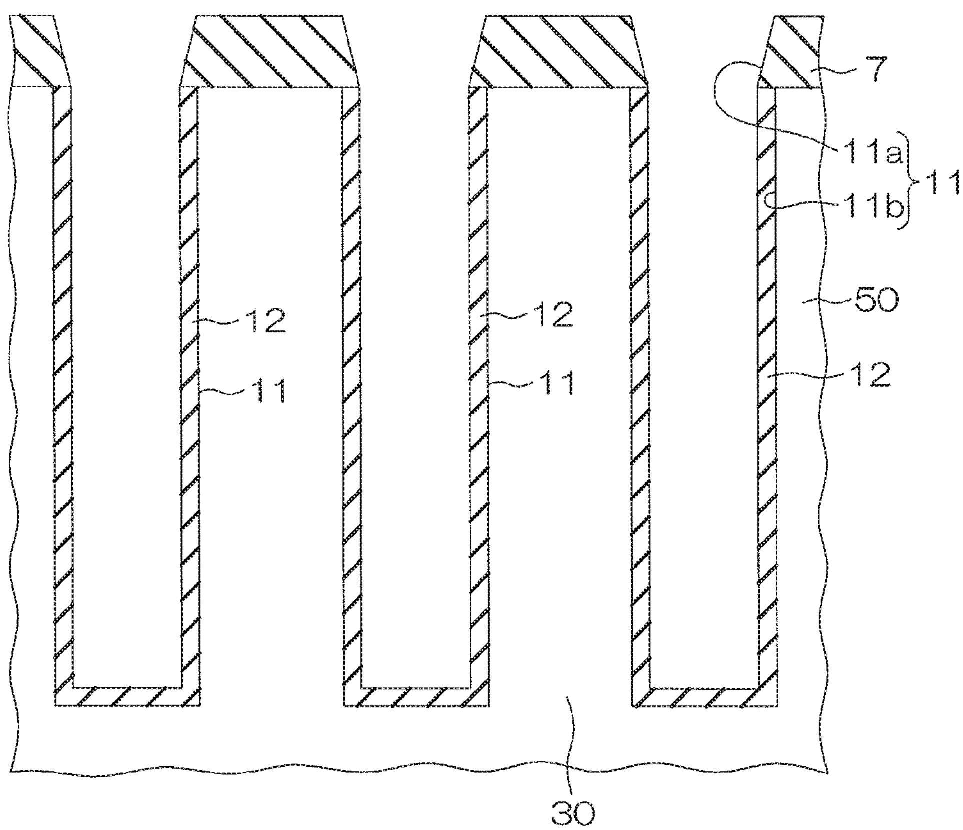
FIG. 49B is a partially enlarged cross-sectional view showing the step subsequent to FIG. 49A.
Figure 49C:
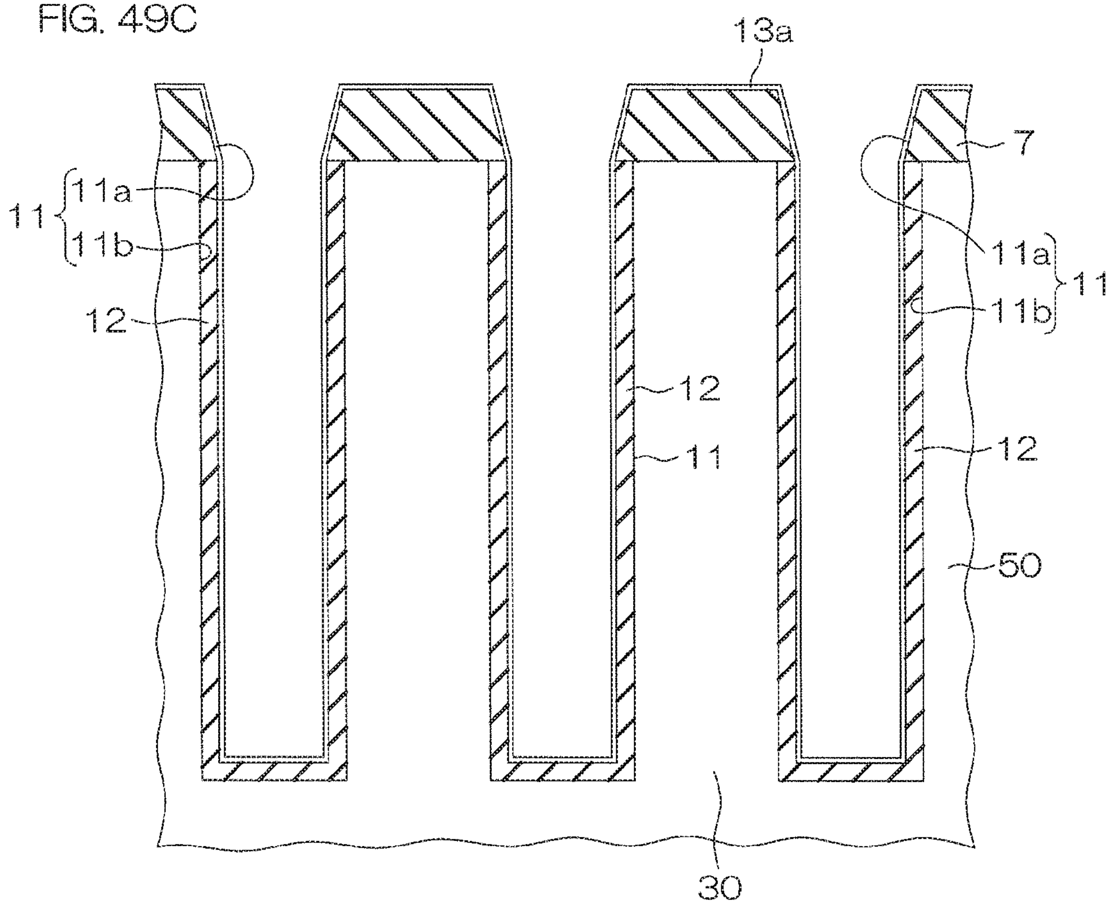
FIG. 49C is a partially enlarged cross-sectional view showing the step subsequent to FIG. 49B.

After the step of FIG. 49B (FIG. 42B), in order for the conductive member 51 to be embedded in the coil formation trench 11, first, as shown in FIG. 49C, by a CVD method or a LTS (Long Throw Sputtering) method, the first seed layer 13*a* made of titanium nitride is formed so as to cover the surface of the original substrate 50. More specifically, the first seed layer 13*a* is formed such that the front surface and the rear surface (the surface on the side of the original substrate 50) are along the inner surface (the side portion and the bottom portion) of the coil formation trench 11 and the surface of the insulating film 7. The first seed layer 13*a* is formed such that its thickness is, for example, 300 to 500 angstroms (in this step, 400 angstroms).

Figure 49D:
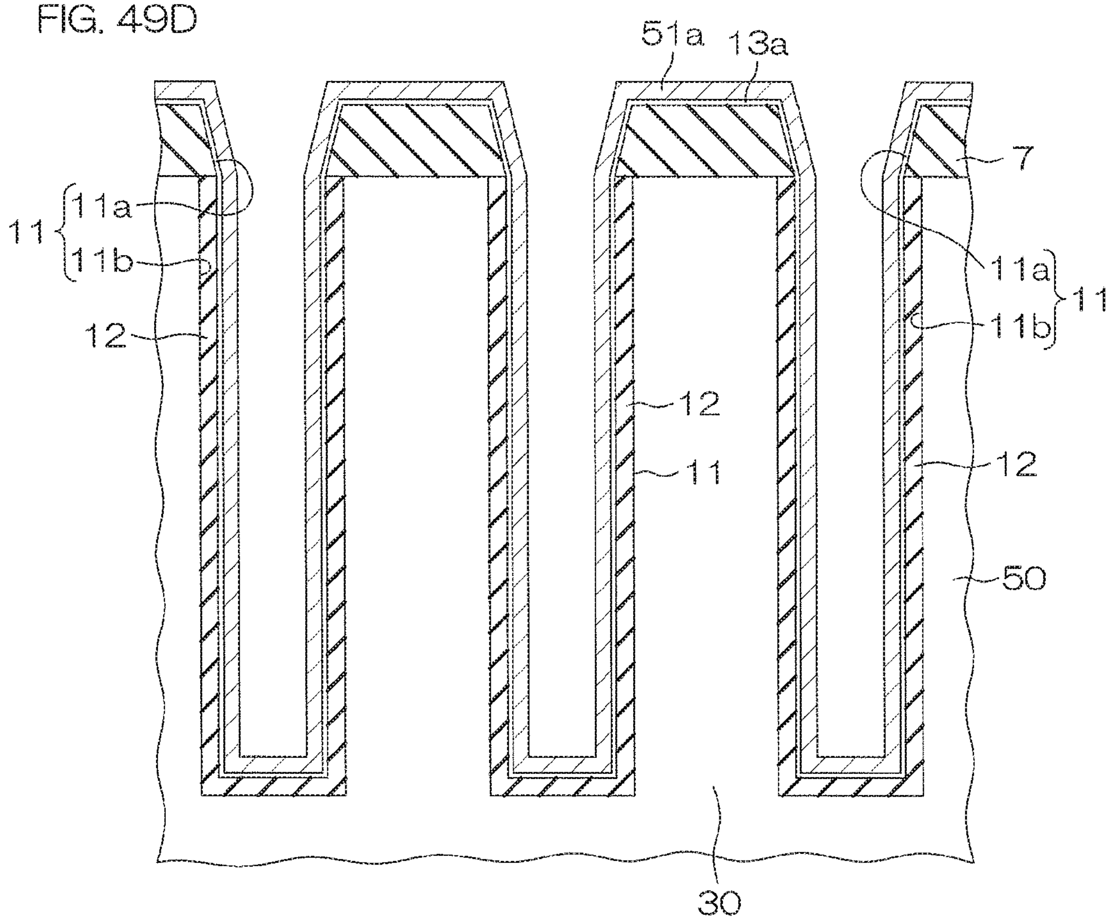
FIG. 49D is a partially enlarged cross-sectional view showing the step subsequent to FIG. 49C.

Then, as shown in FIG. 49D, by a CVD method in which the temperature conditions are 1000° C. or less (in this step, about 800° C.), the first conductor layer 51*a* made of tungsten is formed so as to cover the surface of the original substrate 50. More specifically, the first conductor layer 51*a* is formed such that the front surface and the rear surface (the surface on the side of the original substrate 50) are along the surface of the first seed layer 13*a*. The first conductor layer 51*a* is formed such that its thickness is, for example, 1 μm or less (in this step, 0.6 μm).

Figure 49E:
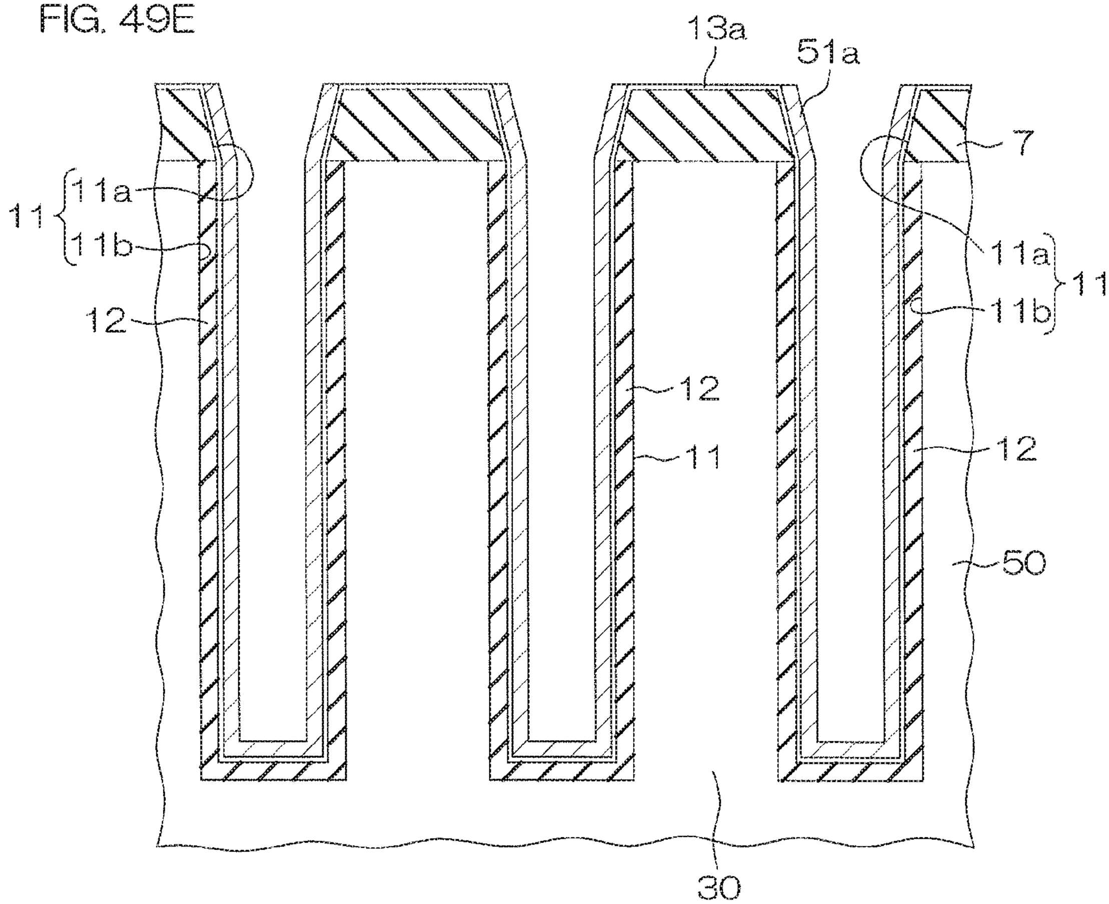
FIG. 49E is a partially enlarged cross-sectional view showing the step subsequent to FIG. 49D.

Then, as shown in FIG. 49E, by etch back, a unnecessary part of the first conductor layer 51*a* formed in a region outside the coil formation trench 11 (the first trench part 11*a* and the second trench part 11*b*) is removed. In this way, the first conductor layer 51*a* is embedded in the coil formation trench 11. The first seed layer 13*a* is exposed on the insulating film 7 outside the coil formation trench 11.

Figure 49F:
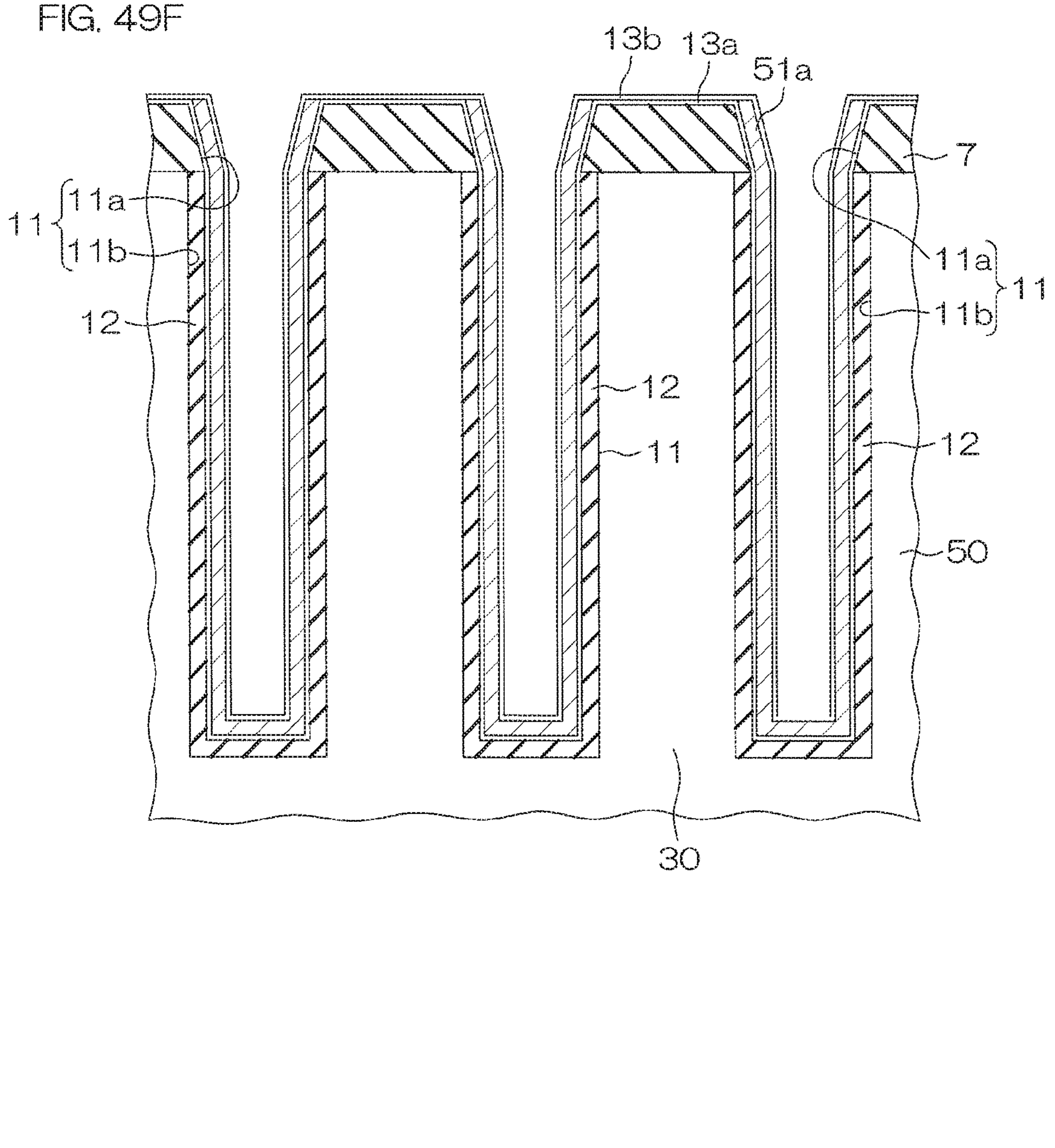
FIG. 49F is a partially enlarged cross-sectional view showing the step subsequent to FIG. 49E.

Then, as shown in FIG. 49F, by a CVD method or a LTS method, the second seed layer 13*b* made of titanium nitride is formed so as to cover the surface of the original substrate 50. More specifically, the second seed layer 13*b* is formed such that the front surface and the rear surface (the surface on the side of the original substrate 50) are along the surface of the first conductor layer 51*a* and the surface of the first seed layer 13*a* formed on the insulating film 7. The second seed layer 13*b* is formed such that its thickness is, for example, 300 to 500 angstroms (in this step, 400 angstroms).

Figure 49G:
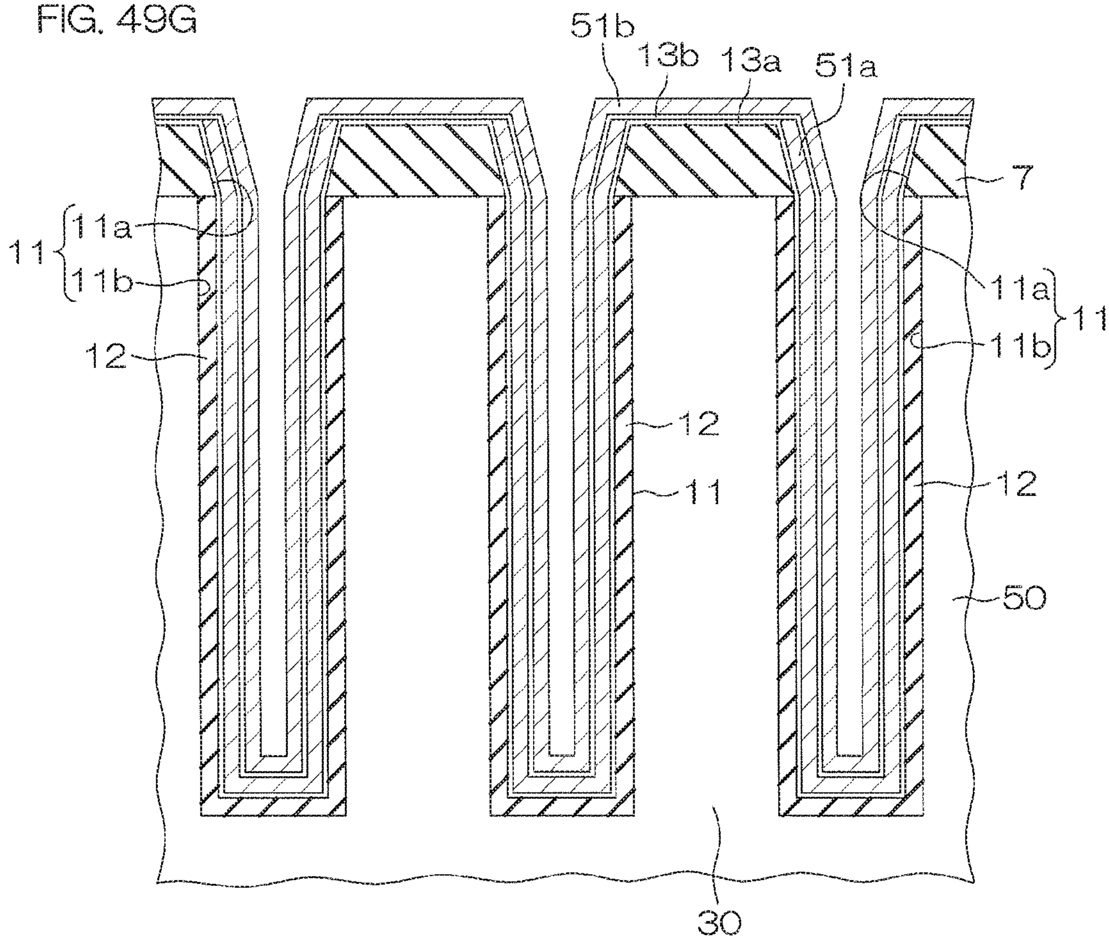
FIG. 49G is a partially enlarged cross-sectional view showing the step subsequent to FIG. 49F.

Then, as shown in FIG. 49G, by a CVD method in which the temperature conditions are 1000° C. or less (in this step, about 800° C.), the second conductor layer 51*b* made of tungsten is formed so as to cover the surface of the original substrate 50. More specifically, the second conductor layer 51*b* is formed such that the front surface and the rear surface (the surface on the side of the original substrate 50) are along the surface of the second seed layer 13*b*. The second conductor layer 51*b* is formed such that its thickness is, for example, 1 μm or less (in this step, 0.6 μm).

Figure 49H:
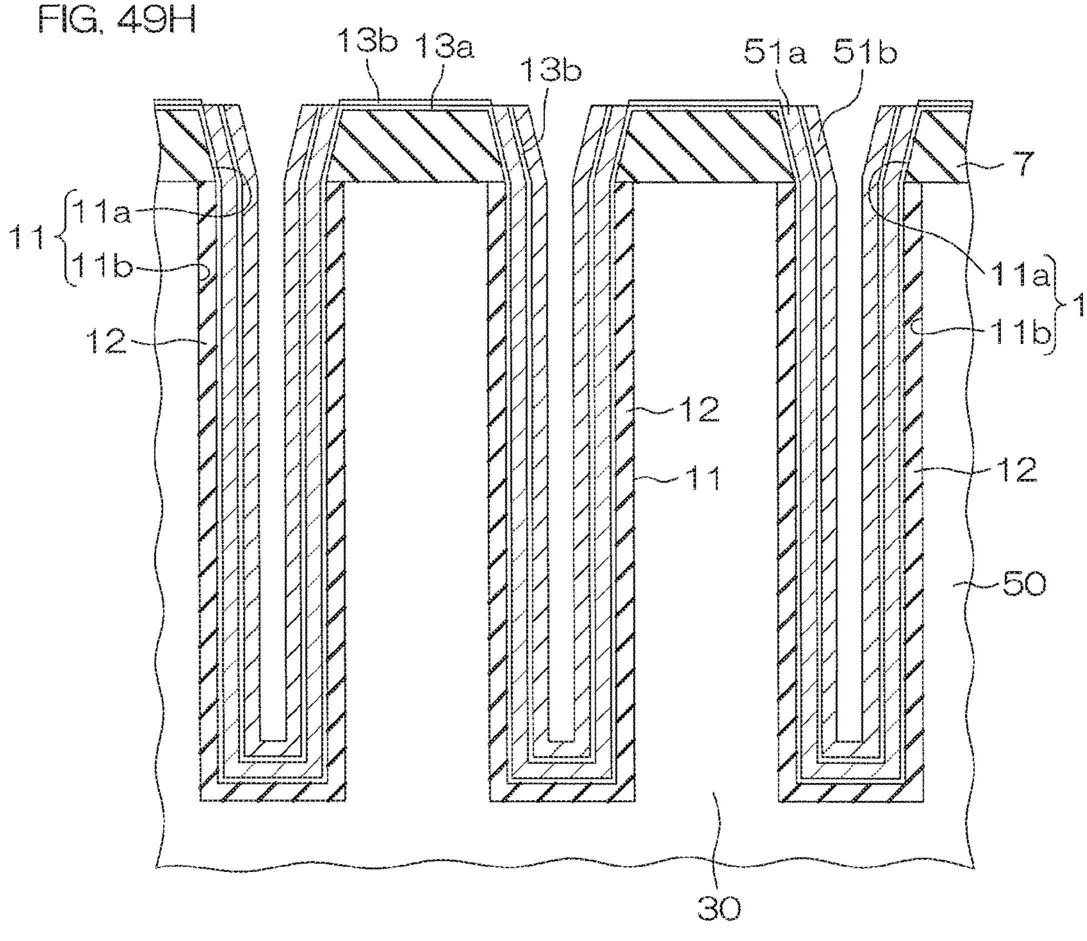
FIG. 49H is a partially enlarged cross-sectional view showing the step subsequent to FIG. 49G.
Figure 49:
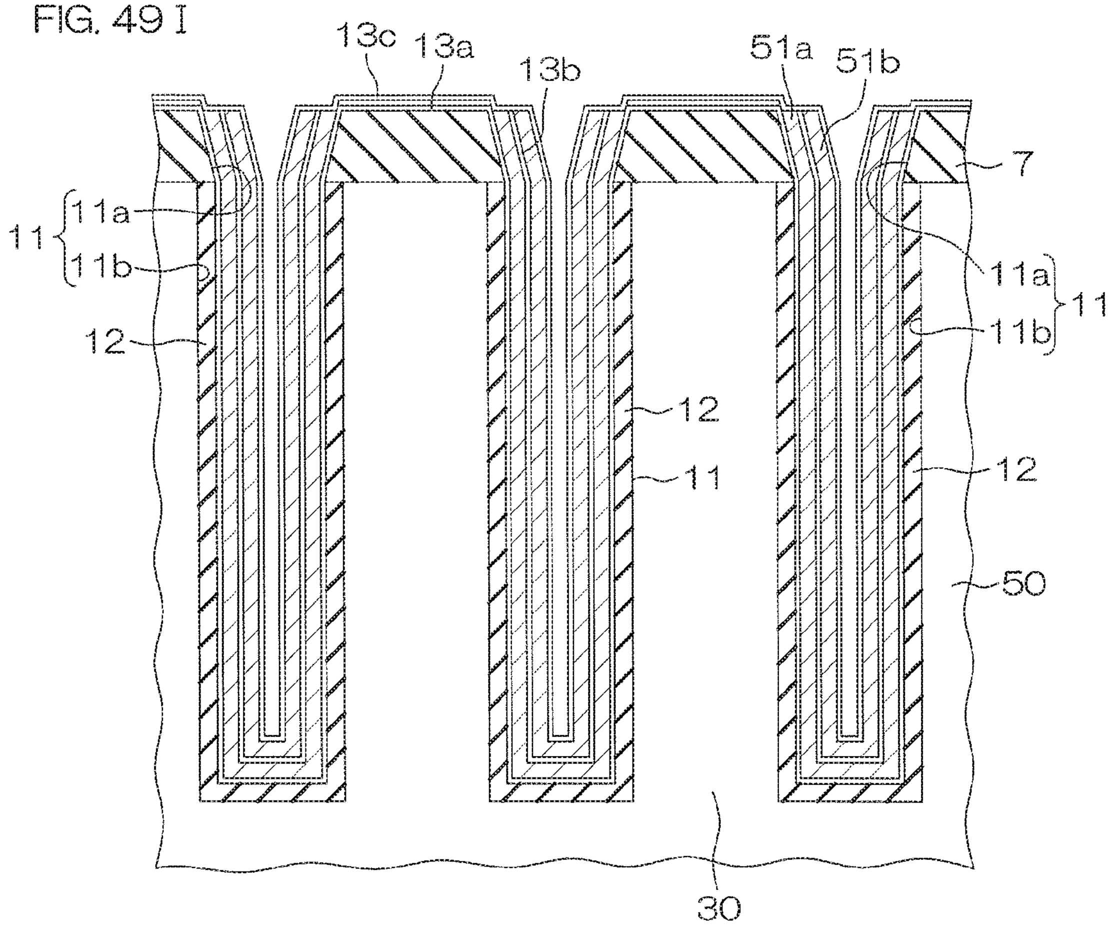
FIG. 49I is a partially enlarged cross-sectional view showing the step subsequent to FIG. 49H.
FIG. 49J is a partially enlarged cross-sectional view showing the step subsequent to FIG. 49I.
FIG. 49K is a partially enlarged cross-sectional view showing the step subsequent to FIG. 49J.

Then, as shown in FIG. 49H, by etch back, a unnecessary part of the second conductor layer 51*b* formed in the region outside the coil formation trench 11 (the first trench part 11*a* and the second trench part 11*b*) is removed. In this way, the second conductor layer 51*b* is embedded in the coil formation trench 11. On the insulating film 7 outside the coil formation trench 11, laminated members of the first seed layer 13*a* and the second seed layer 13*b* are left.

Then, as shown in FIG. 49I, by a CVD method or a LTS method, the third seed layer 13*c* made of titanium nitride is formed so as to cover the surface of the original substrate 50. More specifically, the third seed layer 13*c* is formed such that the front surface and the rear surface (the surface on the side of the original substrate 50) are along the surface of the second conductor layer 51*b* exposed from the coil formation trench 11 and the surface of the second seed layer 13*b* formed on the insulating film 7. The third seed layer 13*c* is formed such that its thickness is, for example, 300 to 500 angstroms (in this step, 400 angstroms).

Figure 49J:
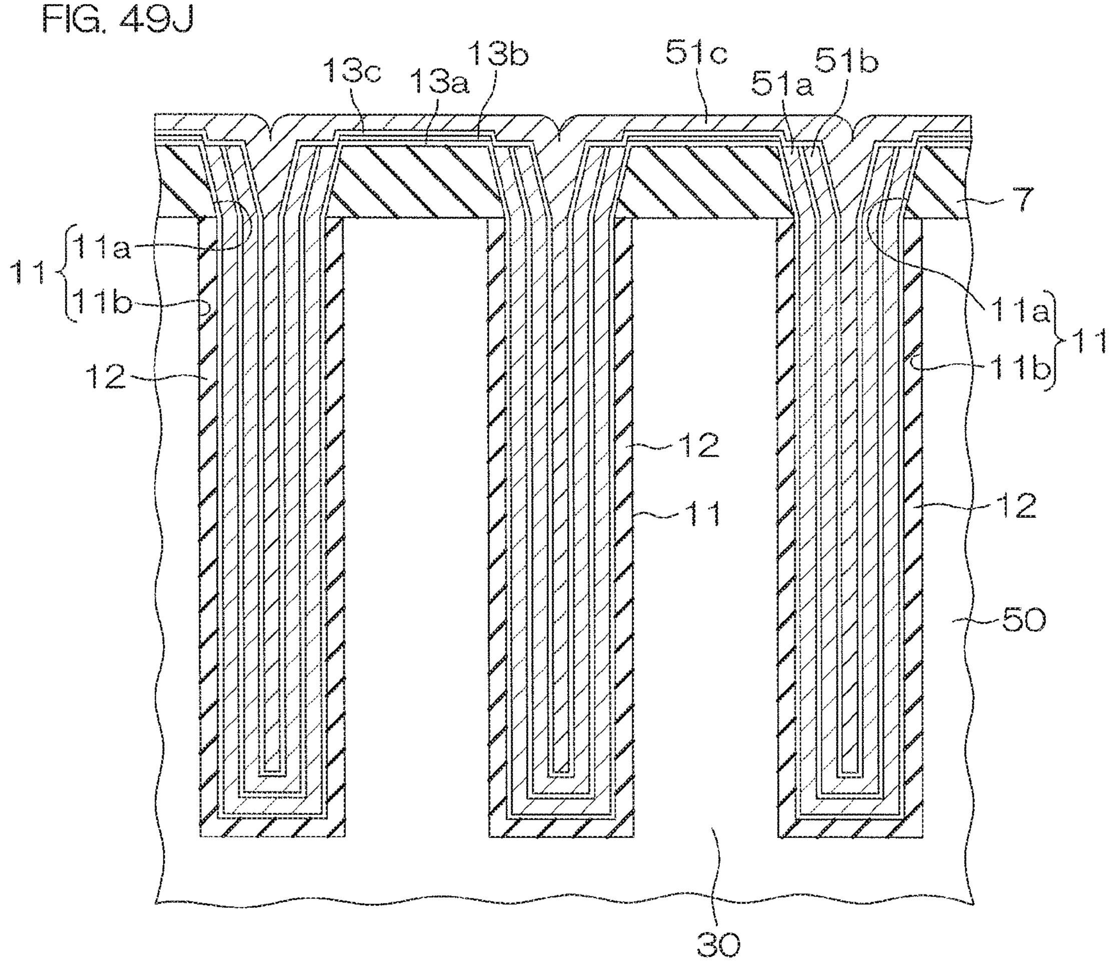

Then, as shown in FIG. 49J, by a CVD method in which the temperature conditions are 1000° C. or less (in this step, about 800° C.), the third conductor layer 51*c* made of tungsten is formed so as to cover the surface of the original substrate 50. More specifically, the third conductor layer 51*c* is formed such that the groove in a concave shape in cross section partitioned by the third seed layer 13*c* is refilled therein. The third conductor layer 51*c* is formed such that its thickness is, for example, 1 μm or less (in this step, 0.6 μm).

Figure 49K:
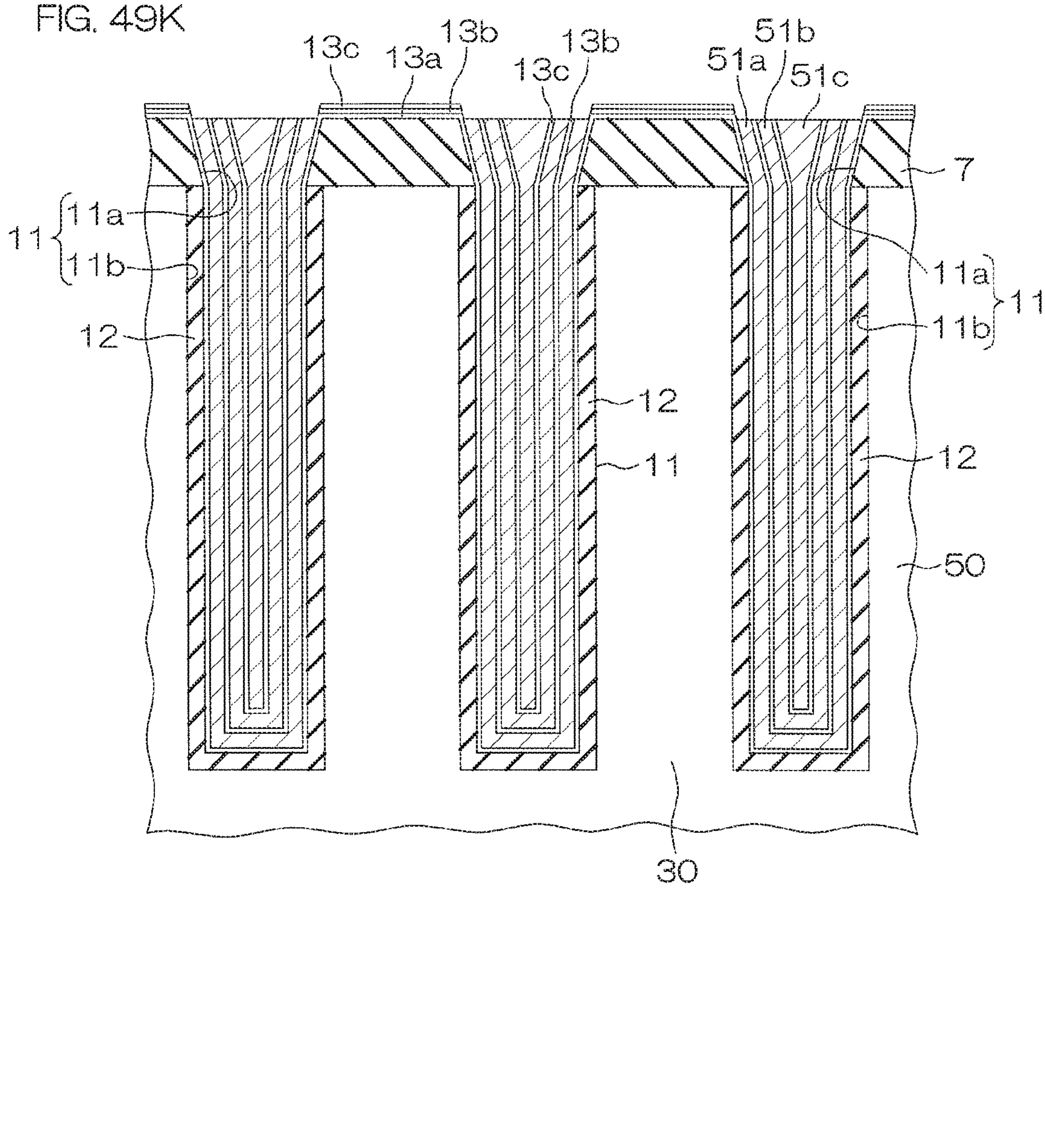

Then, as shown in FIG. 49K, by etch back, a unnecessary part of the third conductor layer 51*c* formed in the region outside the coil formation trench 11 (the first trench part 11*a* and the second trench part 11*b*) is removed. In this way, the third conductor layer 51*c* is embedded in the coil formation trench 11. On the insulating film 7 outside the coil formation trench 11, a laminated member of the first to third seed layers 13*a*, 13*b*, and 13*c* made of titanium nitride is left.

Thereafter, for example, by etching, the laminated member of the first to third seed layers 13*a*, 13*b*, and 13*c* formed on the insulating film 7 is removed, and as shown in FIG. 42C, it is possible to obtain the arrangement in which the conductive member 51 is embedded in the coil formation trench 11.

It is considered that as in the first preferred embodiment of the second invention described above, for example, by a CVD method in which the temperature conditions are 1000° C. or less, in one step, tungsten is embedded in the coil formation trench 11 to form the conductive member 51. In this case, the surface of the original substrate 50 is covered with a relatively thick conductor film. The original substrate 50 is cooled after the conductive member 51 is embedded in the coil formation trench 11.

However, the conductor film (the conductive member 51) has a thermal expansion rate different from that of the original substrate 50, and the cooling rate of the conductor film (the conductive member 51) is higher than that of the original substrate 50. Hence, at the time of cooling, such a stress that the original substrate 50 is warped may be produced by the volume shrinkage of the relatively thick conductor film. The warp of the original substrate 50 refers to a state where a difference in height (for example, about 3 mm) is produced between the center portion and the edge portion of the original substrate 50. Each occurrence of the warp of the original substrate 50 described above may cause a suction/adherence failure or the like when a suction device which sucks the main surface (for example, the rear surface) of the original substrate 50 to convey the original substrate 50 is used or when as shown in FIG. 42L described previously, the supporting tape 71 is adhered to the original substrate 50 etc. The occurrence of a suction/adherence failure or the like lowers the yield.

By contrast, by the method shown in FIGS. 49A to 49K, after the formation of the coil formation trench 11 in the original substrate 50, the conductor layers (the first to third conductor layers 51*a*, 51*b*, and 51*c*) are embedded several times. Hence, the stress that is originally to be received by the original substrate 50 in one step is divided into a plurality of times.

Each thickness of the first to third conductor layers 51*a*, 51*b*, and 51*c* is small as compared with the case where in one step, the conductive member 51 is embedded in the coil formation trench 11. The first to third conductor layers 51*a*, 51*b*, and 51*c* formed on the original substrate 50 outside the coil formation trench 11 and more specifically on the insulating film 7 outside the coil formation trench 11 are removed each time. Hence, on the original substrate 50 outside the coil formation trench 11, the thickness of the first to third conductor layers 51*a*, 51*b*, and 51*c* is not increased. In this way, it is possible to reduce the individual stress applied by the first to third conductor layers 51*a*, 51*b*, and 51*c* to the original substrate 50.

Furthermore, according to the method shown in FIGS. 49A to 49K, by a CVD method in which the temperature conditions are 1000° C. or less (in the modification example, about 800° C.), the first to third conductor layers 51*a*, 51*b*, and 51*c* made of tungsten are formed such that the individual thickness is 1 μm or less (in the modification example, 0.6 μm). Each stress of the first to third conductor layers 51*a*, 51*b*, and 51*c* is increased as each thickness of the first to third conductor layers 51*a*, 51*b*, and 51*c* is increased (for example, thickness >1 μm). Hence, the first to third conductor layers 51*a*, 51*b*, and 51*c* are formed to have a thickness of 1 μm or less, and thus it is possible to effectively reduce each stress of the first to third conductor layers 51*a*, 51*b* and 51*c*.

In this way, it is possible to effectively reduce the occurrence of the warp of the original substrate 50. Consequently, it is possible to effectively reduce the occurrence of a suction/adherence failure or the like such as when a suction device which sucks and processes the original substrate 50 is used or when as shown in FIG. 42L described previously, the supporting tape 71 is adhered, with the result that it is possible to enhance the yield of the chip inductor 1.

Since in the method shown in FIGS. 49A to 49K, it is possible to effectively reduce the occurrence of the warp of the original substrate 50, it is possible to effectively enhance the film formation property of the first electrode 4, the second electrode 5, the insulating film 7, the insulating film 8, the passivation film 16, and the resin film 17. In other words, it is possible to effectively reduce the film formation failure or the like of the first electrode 4, the second electrode 5, the insulating film 7, the insulating film 8, the passivation film 16 and the resin film 17. It is also possible to effectively enhance the embedding of the conductive member 51 in the coil formation trench 11.

In the method shown in FIGS. 49A to 49K, on the first to third seed layers 13*a* to 13*c*, the first to third conductor layers 51*a* to 51*c* are formed. Hence, the first to third conductor layers 51*a* to 51*c* can be satisfactorily embedded within the coil formation trench 11.

Figure 50A:
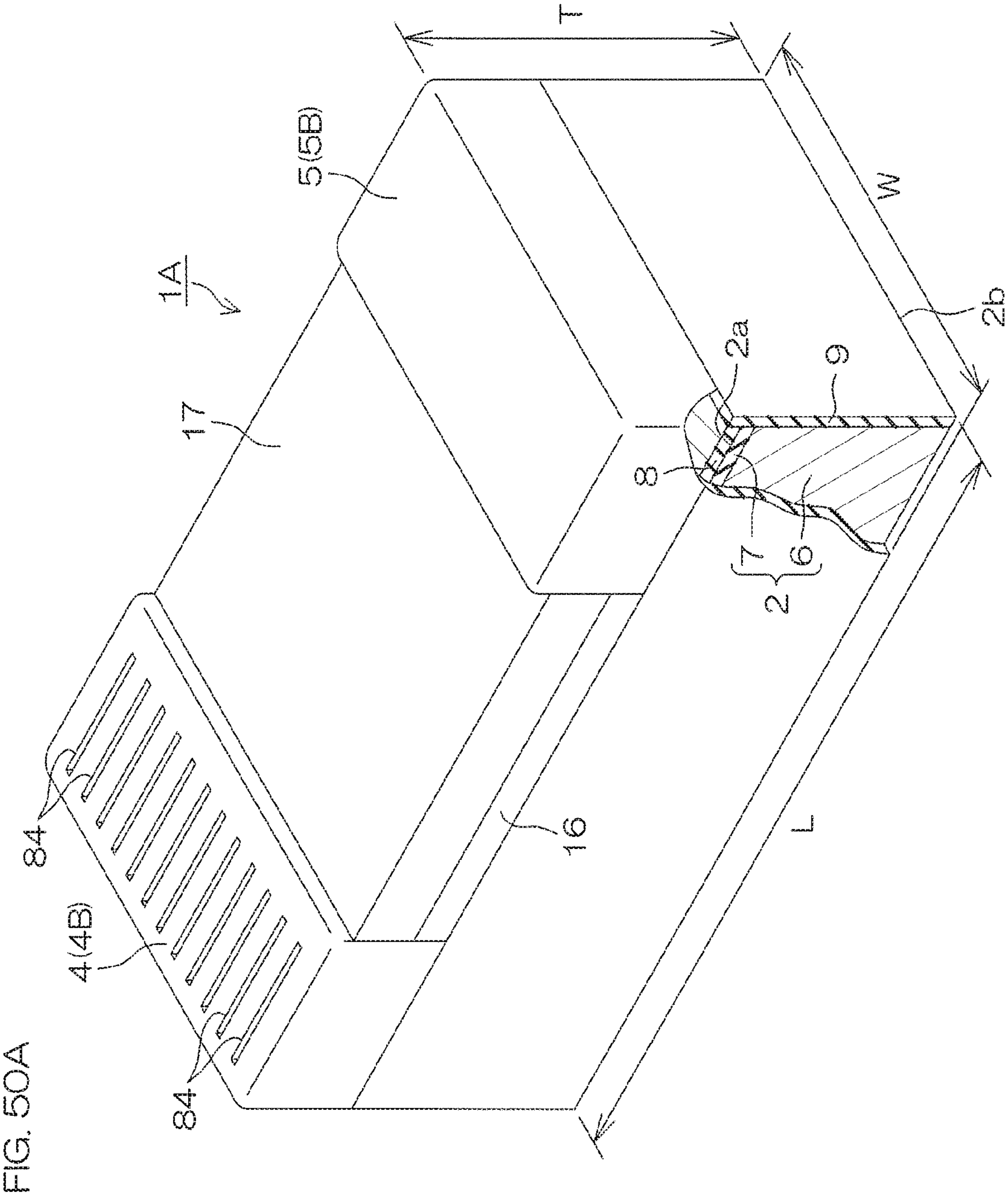
FIG. 50A is a partially cut perspective view of a chip inductor (chip inductor according to a preferred embodiment of a third invention) according to the second preferred embodiment of the second invention.
Figure 50B:
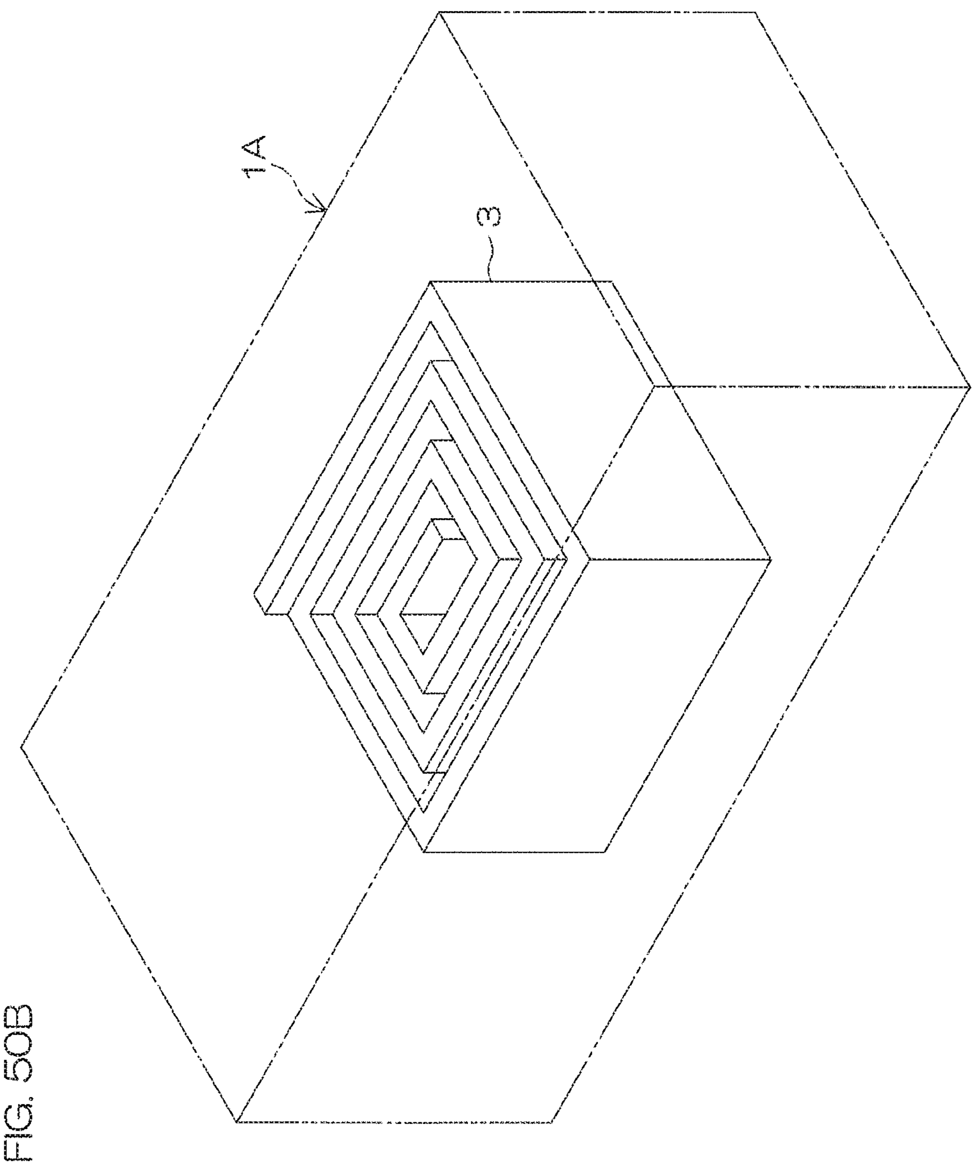
FIG. 50B is a perspective view showing a coil formed within the chip inductor.

FIG. 50A is a partially cut perspective view of a chip inductor (chip inductor according to a preferred embodiment of the third invention) according to the second preferred embodiment of the second invention. FIG. 50B is a perspective view showing a coil formed within the chip inductor.

The chip inductor 1A is a minute chip part and is formed in the shape of a rectangular parallelepiped. The planar shape of the chip inductor 1A may be rectangular, the length L in the longitudinal direction may be about 0.4 mm and the length W in the lateral direction may be about 0.2 mm. The thickness T of the entire chip inductor 1A may be about 0.15 mm.

The chip inductor 1A includes a substrate 2, a coil 3 that is formed within the substrate 2, a first electrode 4 that is connected to one end portion of the coil 3 and a second electrode 5 that is connected to the other end portion of the coil 3.

Figure 51A:
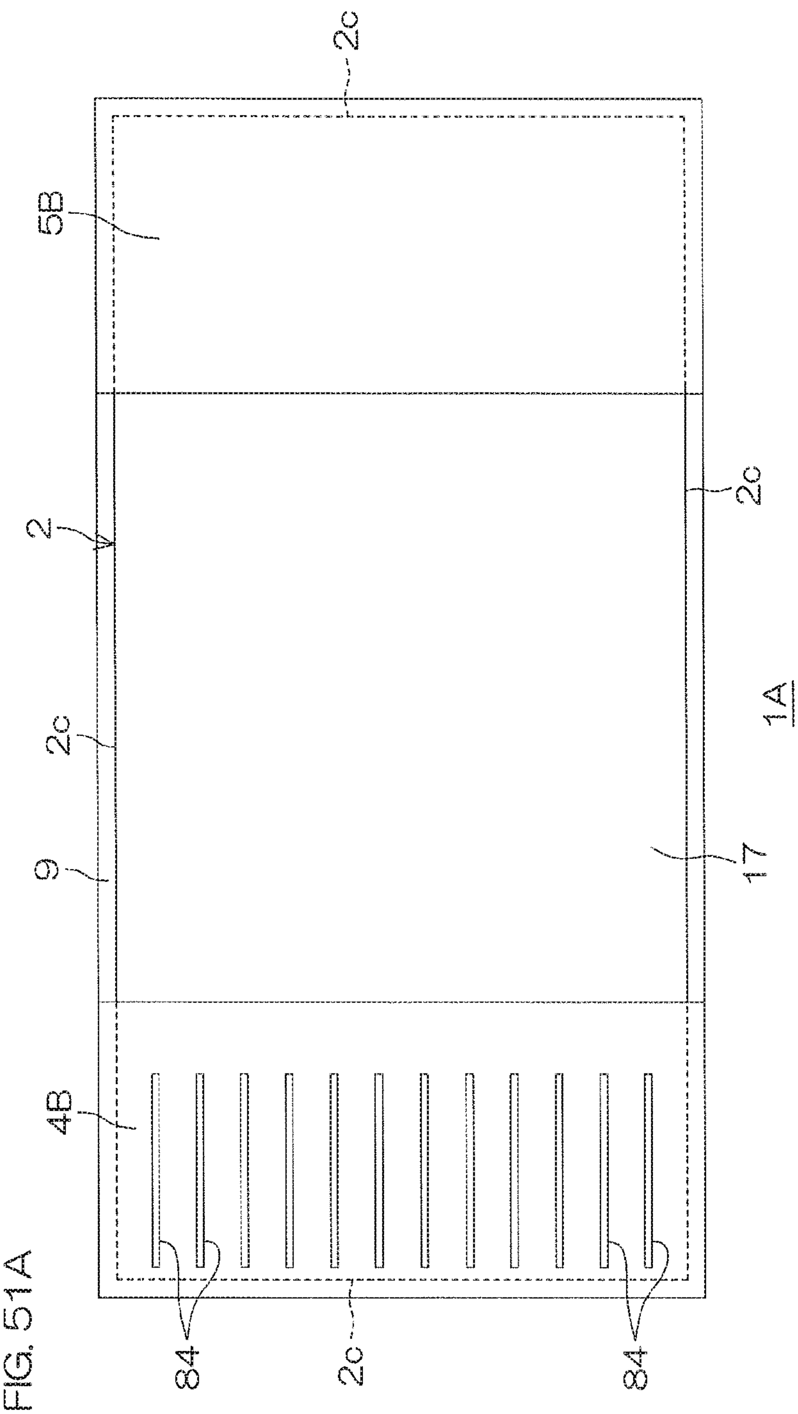
FIG. 51A is a plan view showing the appearance of the chip inductor when seen from the side of the electrode.
Figure 51B:
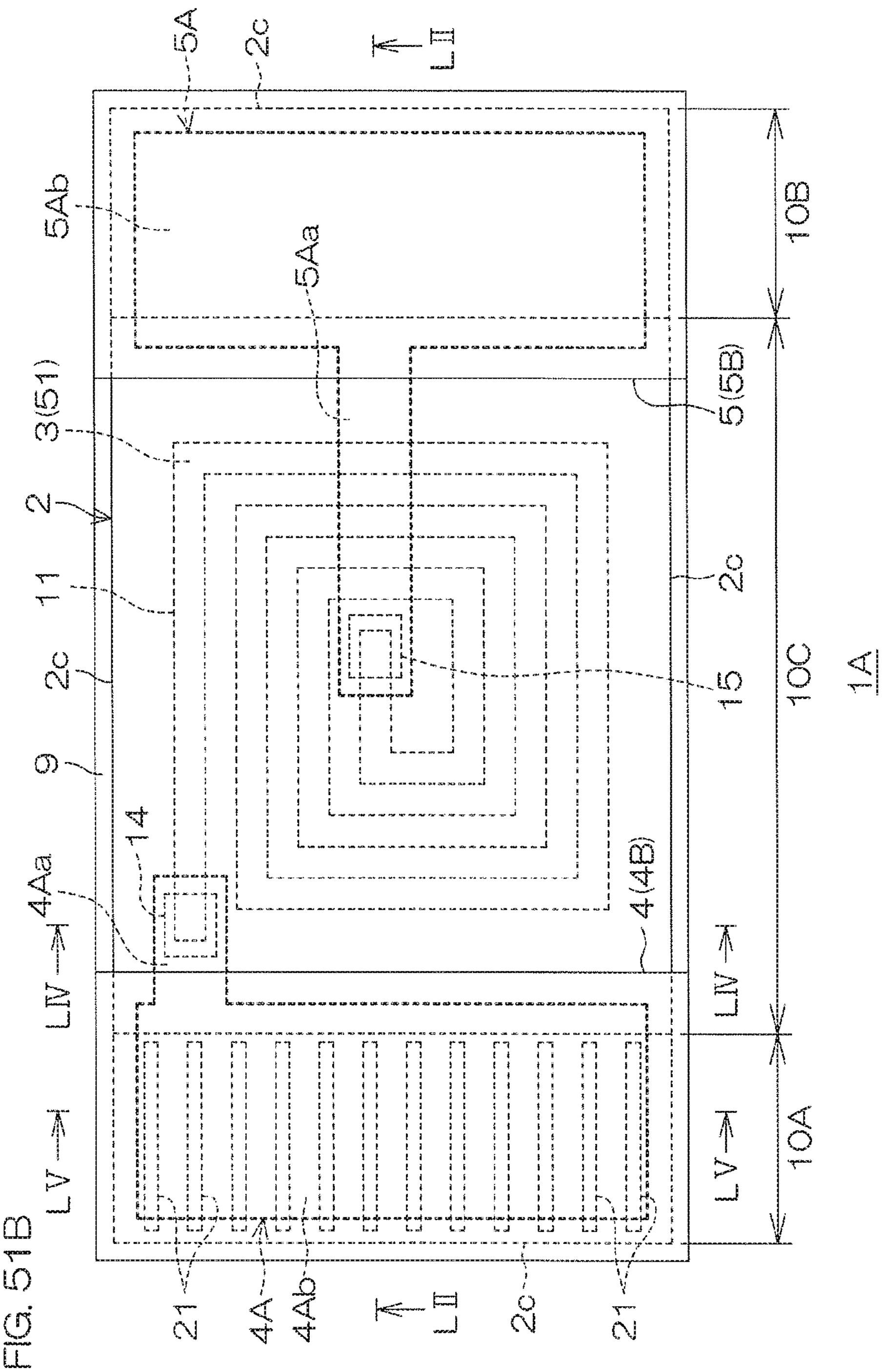
FIG. 51B is a plan view showing the internal structure of the chip inductor.
Figure 53:
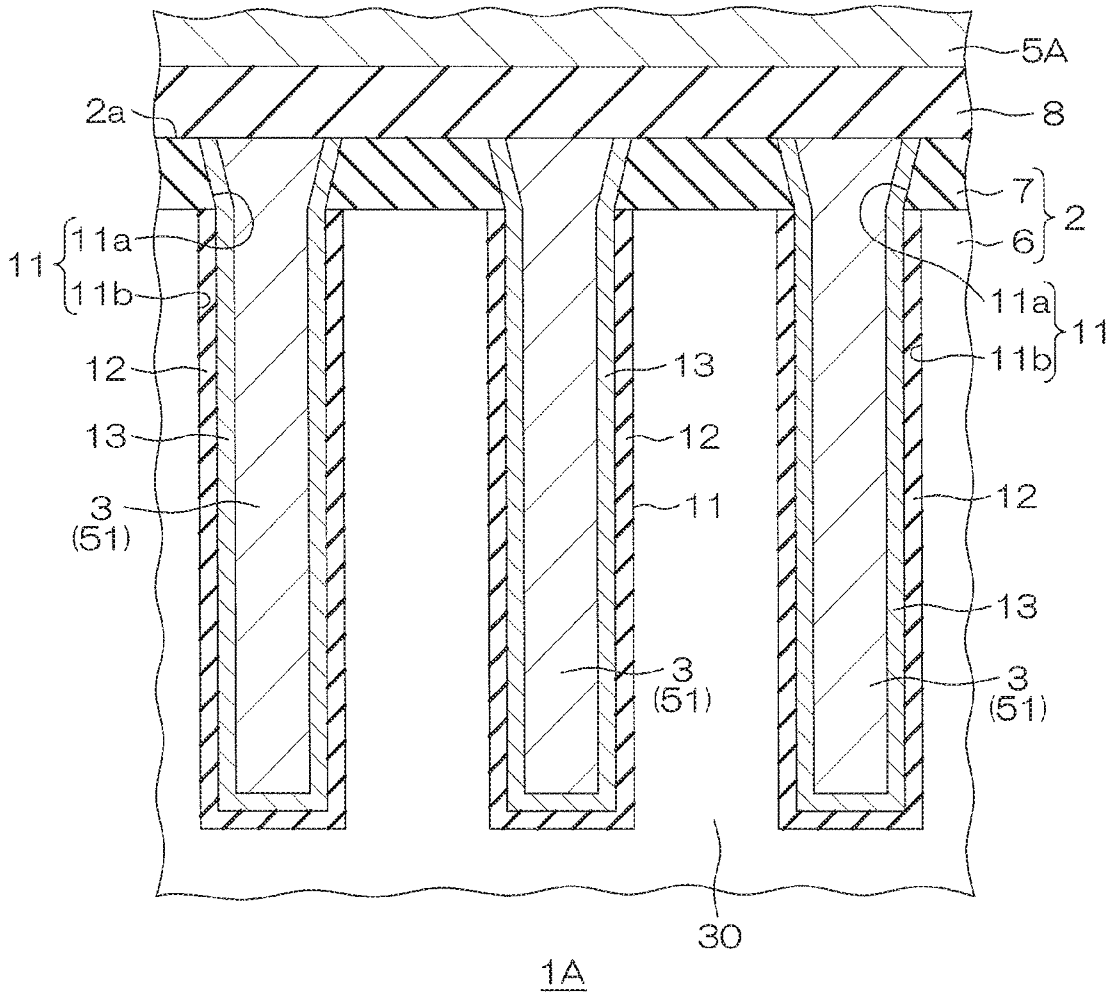
FIG. 53 is a partially enlarged cross-sectional view of FIG. 52.
Figure 54:
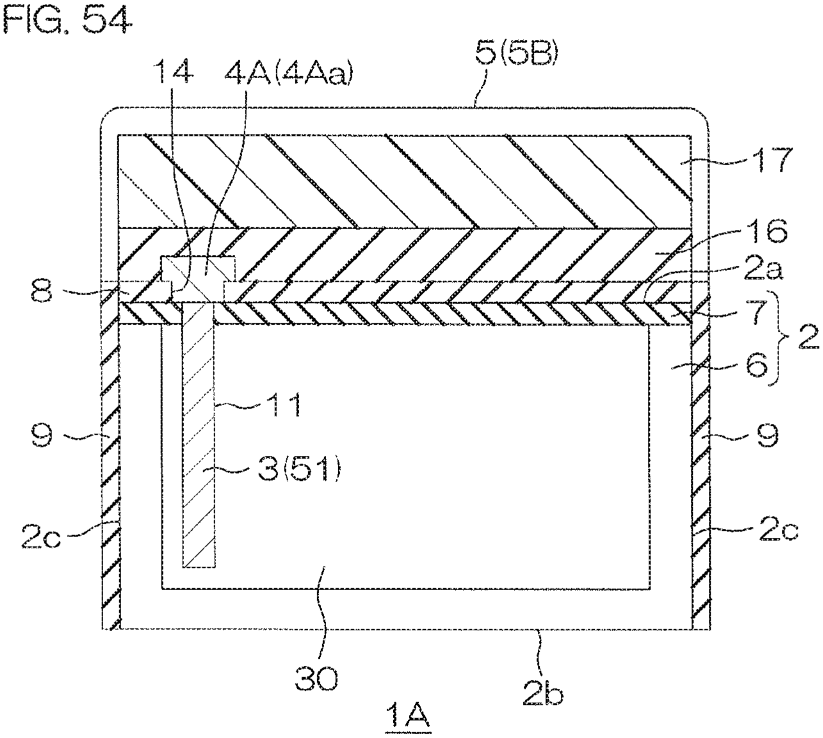
FIG. 54 is a cross-sectional view taken along line LIV-LIV in FIG. 51B.
Figure 56:
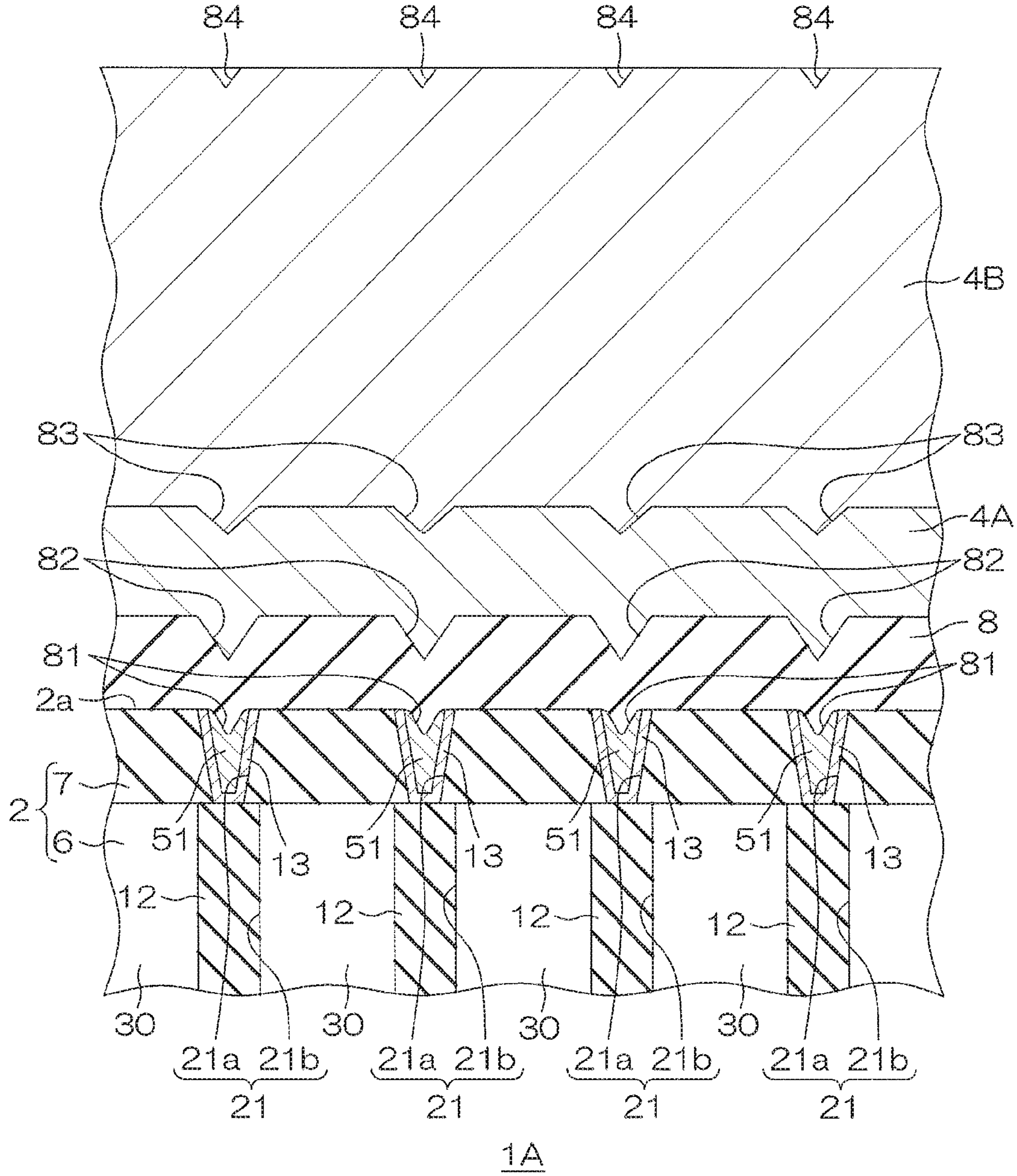
FIG. 56 is a partially enlarged cross-sectional view of FIG. 55.
Figure 57:
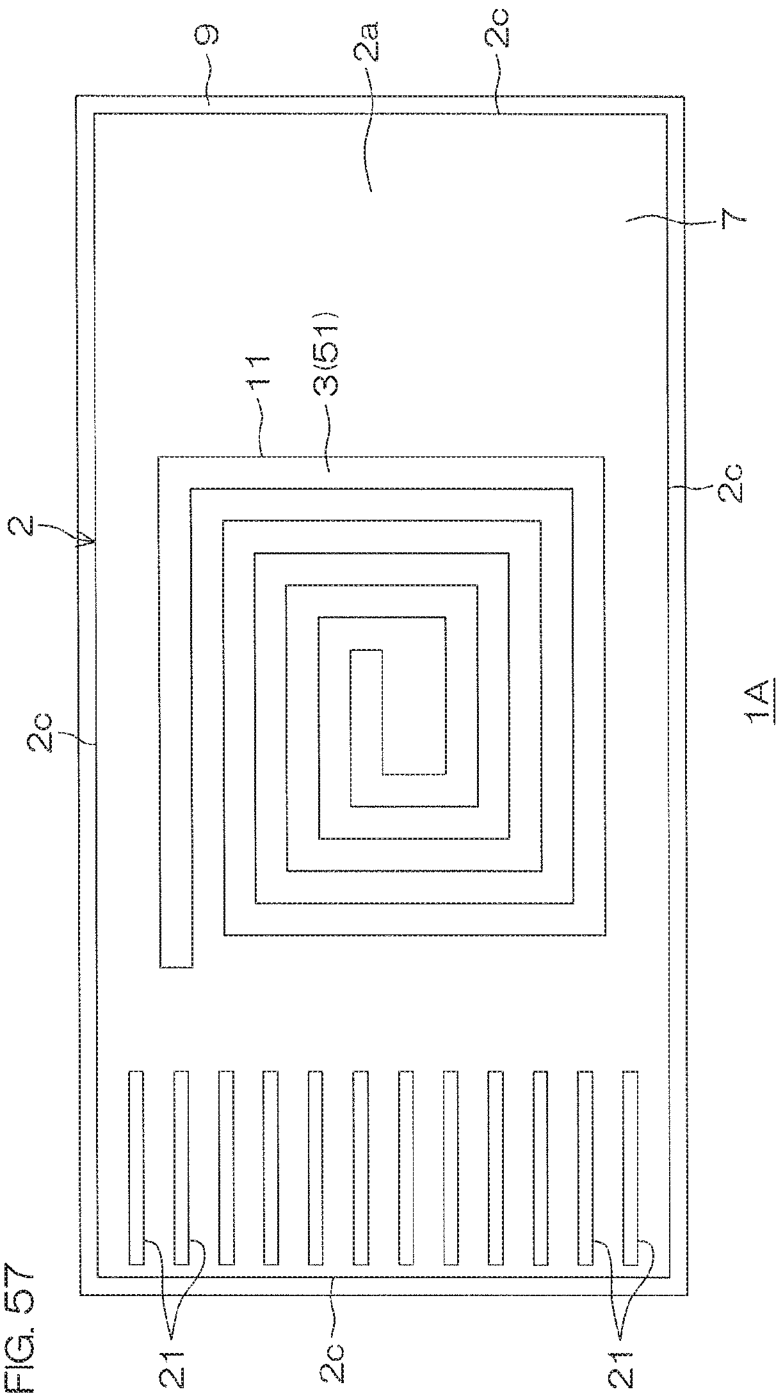
FIG. 57 is a plan view showing a structure of the surface of a substrate by removing a structure formed on the surface of the substrate.

FIG. 51A is a plan view showing the appearance of the chip inductor when seen from the side of the electrode, FIG. 51B is a plan view showing the internal structure of the chip inductor, FIG. 52 is a cross-sectional view taken along line LII-LII in FIG. 51B, FIG. 53 is a partially enlarged cross-sectional view of FIG. 52, FIG. 54 is a cross-sectional view taken along line LIV-LIV in FIG. 51B and FIG. 55 is a cross-sectional view taken along line LV-LV in FIG. 51B. FIG. 56 is a partially enlarged cross-sectional view of FIG. 55. FIG. 57 is a plan view showing a structure of the surface of a substrate by removing an arrangement formed on the surface of the substrate.

The substrate 2 is formed in the shape of a rectangular parallelepiped, and includes a pair of main surfaces 2*a* and 2*b* and four side surfaces 2*c*. One (the main surface 2*a* on the upper surface side in FIG. 50A) of the pair of main surfaces 2*a* and 2*b* is an element formation surface. In the following description, the main surface 2*a* is referred to as an "element formation surface 2*a*," and the main surface 2*b* on the side opposite to the element formation surface 2*a* is referred to as a "rear surface 2*b*." In the preferred embodiment, the substrate 2 is formed with a substrate main body 6 and an insulating film 7 formed on the surface thereof, and the surface of the insulating film 7 on the side opposite to the side of the substrate main body 6 is the element formation surface 2*a*. The element formation surface 2*a* is formed in the shape of a rectangle in plan view when seen in a normal direction perpendicular to the element formation surface 2*a*. The surface (element formation surface 2*a*) of the substrate 2 is covered by an insulating film 8. The four side surfaces 2*c* of the substrate 2 and the outer peripheral surface of the insulating film 8 are covered by a passivation film 9 such as a nitride film.

With reference to FIG. 51B, in the element formation surface 2*a*, a first electrode formation region 10A for the formation of the first electrode 4 is provided at one end portion thereof, and a second electrode formation region 10B for the formation of the second electrode 5 is provided at the other end portion. These regions 10A and 10B are rectangular in plan view. In the element formation surface 2*a* between the first electrode formation region 10A and the second electrode formation region 10B, a coil formation region 10C is provided. In the preferred embodiment, the coil formation region 10C is formed in the shape of a rectangle.

In the first electrode formation region 10A, the external connection electrode (first external connection electrode) 4B of the first electrode 4 is disposed, and in the second electrode formation region 10B, the external connection electrode (second external connection electrode) 5B of the second electrode 5 is disposed. The first external connection electrode 4B is rectangular in plan view, and covers the entire region of the first electrode formation region 10A. The second external connection electrode 5B is rectangular in plan view, and covers the entire region of the second electrode formation region 10B.

In the surface of one (in the preferred embodiment, the first external connection electrode 4B) of the first external connection electrode 4B and the second external connection electrode 5B, a plurality of concave portions 84 are formed. The plurality of concave portions 84 are formed, in plan view, in the shape of a straight line extending in the longitudinal direction of the substrate 2, and are formed at an interval in the lateral direction of the substrate 2. The cross-sectional shape of the concave portion 84 is the shape of the letter V. In the surface of the other external connection electrode (in the preferred embodiment, the second external connection electrode 5B), the concave portions 84 are not formed.

In the substrate 2, a coil formation trench 11 is formed by digging down, in the coil formation region 10C, to a predetermined depth from the element formation surface 2*a*. The coil formation trench 11 is formed, in plan view, in the shape of a spiral. In the preferred embodiment, the coil formation trench 11 is formed, in plan view, in the shape of a quadrilateral spiral, and has a plurality of rectilinear portions parallel to the side surfaces 2*c* of the substrate 2. The cross section (cross section in a direction perpendicular to a direction in which the coil formation trench 11 is extended in the spiral direction) of the coil formation trench 11 is formed in the shape of a rectangle which is long in the direction of the thickness of the substrate 2. For example, the width of the coil formation trench 11 may be 1 μm or more and 3 μm or less. For example, the depth of the coil formation trench 11 may be 10 μm or more and 82 μm or less. The depth of the coil formation trench 11 is preferably 10 μm or more so that the internal resistance of the coil 3 formed within the coil formation trench 11 is decreased.

Furthermore, in a region (the first electrode formation region 10A) of the element formation surface 2*a* opposite the first external connection electrode 4B, in the substrate 2, a plurality of electrode-side trenches (concave portion formation trenches) 21 are formed by digging down from the element formation surface 2*a* to a predetermined depth. The plurality of electrode-side trenches 21 are formed in positions opposite the plurality of concave portions 84. Hence, the plurality of electrode-side trenches 21 are formed, in plan view, in the shape of a straight line extending in the longitudinal direction of the substrate 2, and are formed at an interval in the lateral direction of the substrate 2. The cross section of the electrode-side trench 21 is the shape of a rectangle that is long in the direction of the thickness of the substrate 2. In the preferred embodiment, the width of the electrode-side trench 21 is narrower than that of the coil formation trench 11. The depth of the electrode-side trench 21 may be the same as that of the coil formation trench 11 or may be shallower that of the coil formation trench 11. In the preferred embodiment, the depth of the electrode-side trench 21 is the same as that of the coil formation trench 11.

As shown in FIG. 53, the coil formation trench 11 is formed with a first trench part 11*a* that is formed in the insulating film 7 and a second trench part 11*b* that is formed in the substrate main body 6 and that communicates with the first trench part 11*a*. On the inner surface of the coil formation trench 11 (the second trench part 11*b*) in the substrate main body 6, an insulating film 12 formed with an oxide film or the like is formed. On the surface of the insulating film 12 within the coil formation trench 11 (the second trench part 11*b*) and on the inner surface of the coil formation trench 11 (the first trench part 11*a*) in the insulating film 7, a barrier metal film 13 is formed. The barrier metal film 13 is formed of, for example, TiN. The thickness of the barrier metal film 13 is about 400 to 500 angstroms.

Within the coil formation trench 11, a conductive member 51 is embedded while being in contact with the barrier metal film 13. In the preferred embodiment, the conductive member 51 is formed of tungsten (W). The coil 3 is formed with the conductive member 51 embedded within the coil formation trench 11. Hence, the coil 3 is formed, in plan view, in the shape of a spiral (in the shape of a quadrilateral spiral) of the same pattern as the coil formation trench 11. Specifically, the coil 3 includes a plurality of plate-shaped parts parallel to the side surfaces 2*c* of the substrate 2.

As shown in FIG. 56, the electrode-side trench 21 is formed with a first trench part 21*a* that is formed in the insulating film 7 and a second trench part 21*b* that is formed in the substrate main body 6 and that communicates with the first trench part 21*a*. On the inner surface of the electrode-side trenches 21 (the second trench part 21*b*) in the substrate main body 6, an insulating film 12 formed with an oxide film or the like is formed. In the preferred embodiment, the insulating film 12 formed on the inner surface of the electrode-side trenches 21 (the second trench part 21*b*) in the substrate main body 6 fills within the second trench part 21*b*.

On the inner surface of each electrode-side trench 21 (the first trench part 21*a*) in the insulating film 7, the barrier metal film 13 is formed. Within the electrode-side trench 21 (the first trench part 21*a*) in the insulating film 7, the conductive member 51 is embedded while being in contact with the barrier metal film 13. In the surface of the conductive member 51 within the electrode-side trench 21, a concave portion (first underlying concave portion) 81 is formed. In other words, in a region of the element formation surface 2*a* opposite the first external connection electrode 4B, a plurality of concave portion 81 are formed. The plurality of concave portions 81 are formed in positions opposite the plurality of concave portions 84 of the first external connection electrode 4B. Hence, the plurality of concave portions 81 are formed, in plan view, in the shape of a straight line extending in the longitudinal direction of the substrate 2, and are formed at an interval in the lateral direction of the substrate 2. The cross-sectional shape of the concave portion 81 is the shape of the letter V. As will be described later, the concave portions 81 are formed due to the electrode-side trenches 21 formed in the substrate 2.

In the preferred embodiment, the insulating film 12 formed on the inner surfaces of the coil formation trench 11 and the electrode-side trench 21 is formed with a thermal oxide film ($SiO_2$). When the thermal oxide film is formed on the inner surface of the trenches 11 and 21, the surrounding wall (the side wall and the bottom wall) of the trenches 11 and 21 in the substrate main body 6 is thermally oxidized into an insulator portion (thermal oxide film) 30 having insulation. In the preferred embodiment, an example is described where the entire wall sandwiched by the coil formation trench 11 (the second trench part 11*b*) in the shape of a spiral in the substrate main body 6 and the entire wall between the adjacent two electrode-side trenches 21 (the second trench parts 21*b*) are thermal oxide films.

On the element formation surface 2*a* (the surface of the insulating film 7) of the substrate 2, the insulating film 8 is formed so as to coat the element formation surface 2*a* and the conductive member 51. The insulating film 8 is formed, in plan view, in the shape of a rectangle matching with the element formation surface 2*a*. The insulating film 8 is formed with, for example, a USG (Undoped Silicate Glass) film. In the insulating film 8, a first contact hole 14 (see FIGS. 51B and 54) that exposes one end portion (outer peripheral side end portion) of the coil 3 and a second contact hole 15 (see FIGS. 51B and 52) that exposes the other end portion (inner peripheral side end portion) of the coil 3 are formed.

Furthermore, in the surface of the insulating film 8, as shown in FIGS. 55 and 56, in a region opposite the first external connection electrode 4B, a plurality of concave portions (second underlying concave portions) 82 are formed. The plurality of concave portions 82 are formed in positions opposite the plurality of concave portions 84 (concave portions 81). Hence, the concave portions 82 are formed, in plan view, in the shape of a straight line extending in the longitudinal direction of the substrate 2, and are formed at an interval in the lateral direction of the substrate 2. The cross-sectional shape of the concave portion 82 is the shape of the letter V. As will be described later, the concave portions 82 are formed due to the concave portion 81 in the surface (the element formation surface 2*a*) of the substrate 2, which is its underlying layer. As described previously, in the side surfaces 2*c* of the substrate 2 and the outer peripheral surface of the insulating film 8, the passivation film 9 formed with a nitride film or the like is formed.

On the surface of the insulating film 8, the first electrode 4 and the second electrode 5 are formed. The first electrode 4 includes a first electrode film 4A that is formed on the surface of the insulating film 8 and a first external connection electrode 4B that is bonded to the first electrode film 4A. As shown in FIG. 51B, the first electrode film 4A includes a drawing electrode 4Aa that is connected to one end portion of the coil 3 and a first pad 4Ab that is formed integrally with the drawing electrode 4Aa. The first pad 4Ab is formed to be rectangular at one end portion of the element formation surface 2*a*. The first external connection electrode 4B is connected to the first pad 4Ab. As shown in FIGS. 51B and 54, the drawing electrode 4Aa enters the first contact hole 14 from the surface of the insulating film 8, and is connected to one end portion of the coil 3 within the first contact hole 14. The drawing electrode 4Aa is formed straight along a straight line that passes above one end portion of the coil 3 to reach the first pad 4Ab.

By extending one end portion of the coil formation trench 11 to a position below the first pad 4Ab, one end portion of the coil 3 may be located in a position below the first pad 4Ab. In this way, since the first contact hole 14 can be formed in a position below the first pad 4Ab, one end portion of the coil 3 can be connected to the first pad 4Ab. In this case, since the first electrode film 4A can be formed with only the first pad 4Ab, the drawing electrode 4Aa is not needed.

In the surface of the first pad 4Ab, as shown in FIGS. 55 and 56, a plurality of concave portions (third underlying concave portions) 83 are formed. The plurality of concave portions 83 are formed in positions opposite the concave portions 84 (the concave portions 82). Hence, the plurality of concave portions 83 are formed, in plan view, in the shape of a straight line extending in the longitudinal direction of the substrate 2, and are formed at an interval in the lateral direction of the substrate 2. The cross-sectional shape of the concave portion 83 is the shape of the letter V. The concave portions 83 are formed due to the concave portion 82 in the surface of the insulating film 8, which is its underlying layer.

The second electrode 5 includes a second electrode film 5A that is formed on the surface of the insulating film 8 and a second external connection electrode 5B that is bonded to the second electrode film 5A. As shown in FIG. 51B, the second electrode film 5A includes a drawing electrode 5Aa that is connected to the other end portion of the coil 3 and a second pad 5Ab that is formed integrally with the drawing electrode 5Aa. The second pad 5Ab is formed to be rectangular at the other end portion of the element formation surface 2*a*. The second external connection electrode 5B is connected to the second pad 5Ab. As shown in FIGS. 51B and 52, the drawing electrode 5Aa enters the second contact hole 15 from the surface of the insulating film 8, and is connected to the other end portion of the coil 3 within the second contact hole 15. The drawing electrode 5Aa is formed straight along a straight line that passes above the other end portion of the coil 3 to reach the second pad 5Ab. In the preferred embodiment, as the electrode films 4A and 5A, Al films are used.

The first electrode film 4A and the second electrode film 5A are covered by a passivation film 16 formed with a nitride film or the like, and furthermore, on the passivation film 16, a resin film 17 such as polyimide is formed. In the passivation film 16 and the resin film 17, two cutout portions 18 and 19 are formed that respectively expose a region other than an edge portion on the inner side of the surface of the first pad 4Ab of the first electrode film 4A and a region other than an edge portion on the inner side of the surface of the second pad 5Ab of the second electrode film 5A. In other words, the passivation film 16 and the resin film 17 are formed, in plan view, in a region corresponding to the coil formation region 10C of the element formation surface 2*a*, and cover the insulating film 8, the edge portion on the inner side of the surface of the first pad 4Ab, and the edge portion on the inner side of the surface of the second pad 5Ab.

The first external connection electrode 4B fills the cutout portion 18, and the second external connection electrode 5B fills the cutout portion 19. The first external connection electrode 4B and the second external connection electrode 5B are formed so as to protrude from the resin film 17, and include a drawing portion 20 that is drawn inwardly of the substrate 2 along the surface of the resin film 17. In the preferred embodiment, the first external connection electrode 4B is formed so as to cover not only the surface of the first electrode film 4A (the first pad 4Ab) and the insulating film 8 exposed within the cutout portion 18 but also the upper end surface of the passivation film 9 on the side of one end portion of the substrate 2. The three side surfaces other than the side surface on the inner side of the first external connection electrode 4B are formed so as to be flush with the surface of the passivation film 9 covering the peripheral surface of the insulating film 8 on the side of one end portion of the substrate 2.

Likewise, the second external connection electrode 5B is formed so as to cover not only the surface of the second electrode film 5A (the pad 5Ab) and the insulating film 8 exposed within the cutout portion 19 but also the upper end surface of the passivation film 9 on the side of the other end portion of the substrate 2. The three side surfaces other than the side surface on the inner side of the second external connection electrode 5B are formed so as to be flush with the surface of the passivation film 9 covering the peripheral surface of the insulating film 8 on the side of the other end portion of the substrate 2. The external connection electrodes 4B and 5B may be formed with, for example, a Ni/Pd/Au laminated film having a Ni film in contact with the electrode films 4A and 5A, a Pd film formed thereon and an Au film formed thereon. The laminated film described above can be formed by a plating method.

With reference to FIGS. 50A, 51A, 55 and 56, as described previously, in the surface of the first external connection electrode 4B, a plurality of concave portions 84 are formed. The concave portions 84 are formed due to the concave portions 83 in the surface of the first pad 4Ab, which is its underlying layer. Since the concave portions 83 are formed due to the concave portions 82, which is its underlying layer, and the concave portions 82 are formed due to the concave portions 81, which is its underlying layer, the concave portions 84 are formed due to the concave portions 81. As will be described later, the concave portions 81 are formed due to the electrode-side trenches 21. Hence, the concave portions 84 in the first external connection electrode 4B are formed due to the electrode-side trenches 21.

The passivation film 16 and the resin film 17 coat, from the surface, the coil 3, the insulating film 8, the first electrode film 4A, and the second electrode film 5A in the coil formation region 10C of the element formation surface 2*a*, and function as a protective film to protect them. On the other hand, the passivation film 9 formed on the side surfaces 2*c* of the substrate 2 and the outer peripheral surface of the insulating film 8 function as a protective film to protect the side surfaces 2*c* of the substrate 2 and the outer peripheral surface of the insulating film 8.

Figure 58:
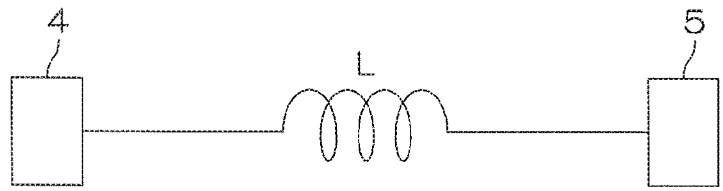
FIG. 58 is an electrical circuit diagram showing an electrical structure within the chip inductor.

FIG. 58 is an electrical circuit diagram showing an electrical structure within the chip inductor 1A. One end of the coil 3 (represented by a symbol L in FIG. 58) is connected to the first electrode 4, and the other end of the coil 3 is connected to the second electrode. In this way, the chip inductor functions as an inductor having a predetermined inductance.

As a parameter indicating the performance (quality) of the coil, the Q (Quality Factor) value of the coil is present. As the Q value is increased, its loss is decreased, and an excellent characteristic is provided as a high-frequency inductance.

The Q value of the coil 3 is represented by formula (2) below.

$$Q=2\pi fL/R \tag{2}$$

In the formula (2) above, f represents the frequency of a current flowing through the coil, L represents the inductance of the coil 3 and R represents the internal resistance of the coil 3.

In the arrangement of the second preferred embodiment of the second invention (a preferred embodiment of the third invention), in the substrate 2, the coil formation trench 11 obtained by digging down from the element formation surface 2*a* is formed, in plan view, in the shape of a spiral, the conductive member 51 is embedded within the coil formation trench 11 and thus the coil 3 is formed. Hence, it is possible to increase the cross-sectional area of the coil 3 (the cross-sectional area of the coil 3 perpendicular to the direction in which the coil 3 is extended in the spiral direction), and thus it is possible to decrease the internal resistance (R in the formula (2) above) of the coil 3. In this way, since the Q value of the coil 3 can be increased, it is possible to provide a high performance chip inductor.

The coil formation trench 11 is formed in the substrate 2, the conductive member 51 is embedded within the coil formation trench 11 and thus it is possible to form the coil 3, with the result that the coil 3 is easily manufactured. In this way, it is possible to provide a chip transformer that is easily manufactured.

When image inspection is performed on the chip inductor 1A, light from a light source is applied to the surfaces of the first electrode 4 and the second electrode 5, and images of the surfaces are imaged with a camera. In the second preferred embodiment of the second invention, in only the surface of any one (in the preferred embodiment, the first external connection electrode 4B) of the first external connection electrode 4B of the first electrode 4 and the second external connection electrode 5B of the second electrode 5, a plurality of concave portions 84 are formed. Since in the surface of the first external connection electrode 4B, the concave portions 84 are formed, the light incident on the surface of the first external connection electrode 4B is diffusely reflected off the concave portions 84. By contrast, since the concave portion is not formed on the surface of the second external connection electrode 5B, the light incident on the surface of the second external connection electrode 5B is unlikely to be diffusely reflected off. Hence, a large difference is produced between image information (for example, brightness information) on the first external connection electrode 4B and image information on the first external connection electrode 4B obtained with the camera. In this way, based on the image information obtained with the camera, it is possible to clearly identify the first electrode 4 and the second electrode 5. In other words, in the second preferred embodiment of the second invention, at the time of the image inspection, it is possible to determine the polarity direction of the chip inductor 1A without forming a mark indicating the polarity direction on the outer surface of the substrate 2.

Figure 59:
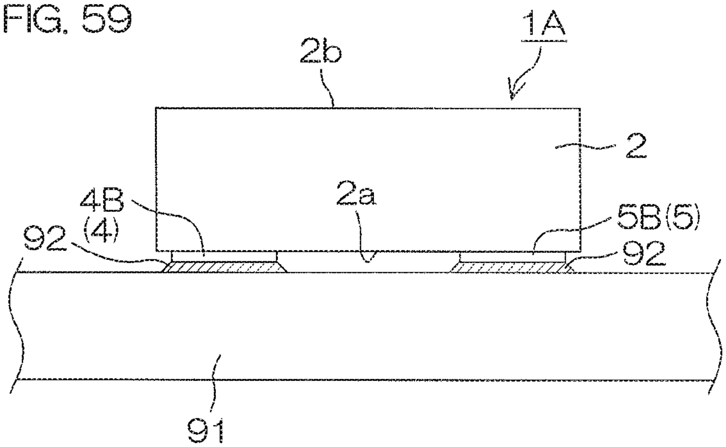
FIG. 59 is a cross-sectional view showing the arrangement of a circuit assembly in which the chip inductor is flip-chip connected on the mounting substrate.

Furthermore, on the element formation surface 2*a*, which is one surface of the substrate 2, both the external connection electrodes 4B and 5B of the first electrode 4 and the second electrode 5 are formed. Hence, as shown in FIG. 59, the element formation surface 2*a* is made to face a mounting substrate 91, the external connection electrodes 4B and 5B are bonded on the mounting substrate 91 by a solder 92 and thus it is possible to form a circuit assembly in which the chip inductor 1A is surface-mounted on the mounting substrate 91. In other words, it is possible to provide a flip-chip connection-type chip inductor 1A, and it is possible to connect the chip inductor 1A to the mounting substrate 91 by a face-down bonding in which the element formation surface 2*a* is made to face the mounting substrate 91 and wireless bonding. In this way, it is possible to decrease the occupied space of the chip inductor 1A on the mounting substrate 91. In particular, it is possible to realize a low profile chip inductor 1A on the mounting substrate 91. In this way, it is possible to effectively utilize the space within the housing of a small-sized electronic device or the like and to contribute to high-density mounting and miniaturization.

FIGS. 60A to 60L are cross-sectional views for illustrating an example of the manufacturing step of the chip inductor 1A, and show cut surfaces corresponding to FIG. 52. FIGS. 61A to 61E are partially enlarged cross-sectional views showing the details of the manufacturing step of a coil, and show cut surfaces corresponding to FIG. 53. FIGS. 62A to 62F are enlarged cross-sectional views showing the details of the manufacturing step of the concave portion of the first electrode and show cut surfaces corresponding to FIG. 56.

Figure 60A:
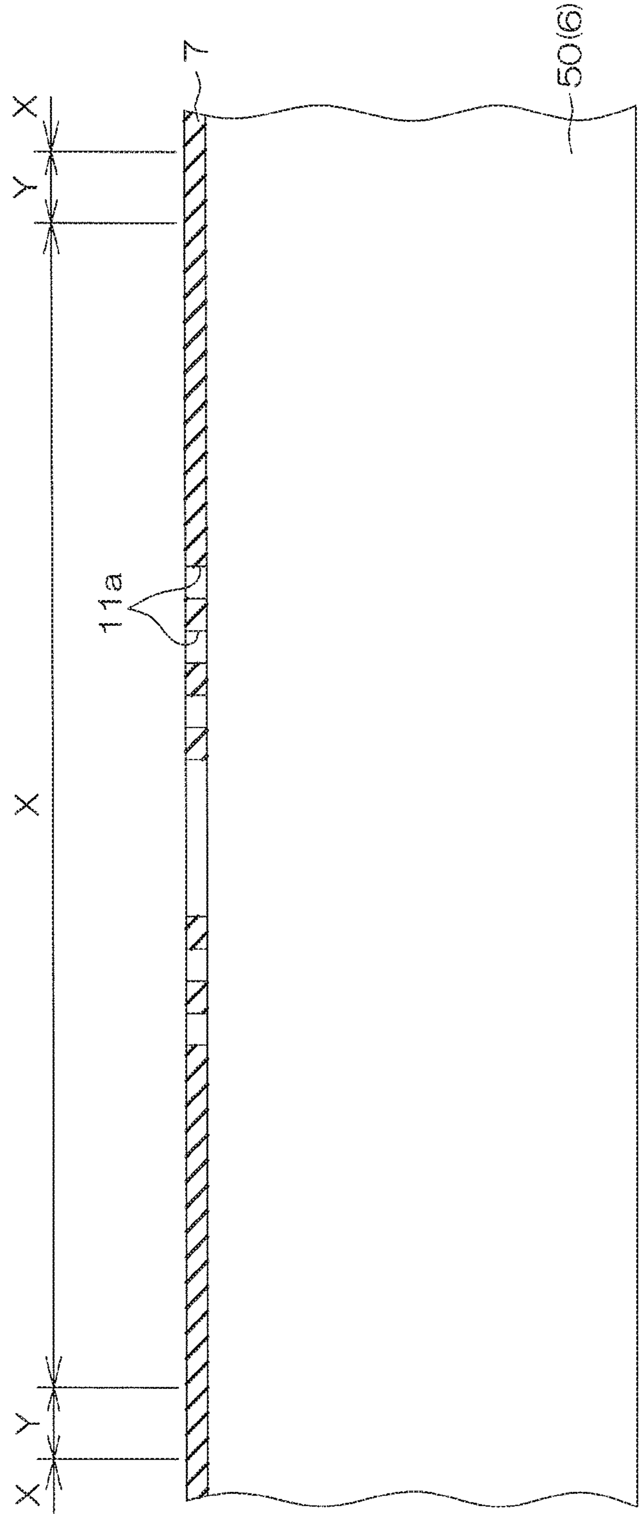
FIG. 60A is a cross-sectional view for illustrating an example of the manufacturing step of the chip inductor.

As shown in FIG. 60A, an original substrate 50 that is an original of the substrate main body 6 is prepared. On the surface of the original substrate 50, the insulating film 7 such as a thermal oxide film or a CVD oxide film is formed. In the preferred embodiment, the insulating film 7 is a thermal oxide film. The surface of the insulating film 7 corresponds to the element formation surface 2*a* of the substrate 2.

FIG. 63 is a schematic plan view of part of the original substrate 50 in which the insulating film 7 is formed on the surface. As shown in FIG. 63, in the element formation surface 2*a*, chip inductor regions X corresponding to a plurality of chip inductors 1A are disposed in a matrix. Between the chip inductor regions X adjacent to each other, a boundary region Y is provided. The boundary region Y is a region in the shape of a band having a substantially constant width, extends in two directions perpendicular to each other and is formed in a lattice shape. After necessary steps are performed on the original substrate 50 in which the insulating film 7 is formed on the surface, the original substrate 50 is separated along the boundary region Y, and thus it is possible to obtain a plurality of chip inductors 1A.

Figure 60B:
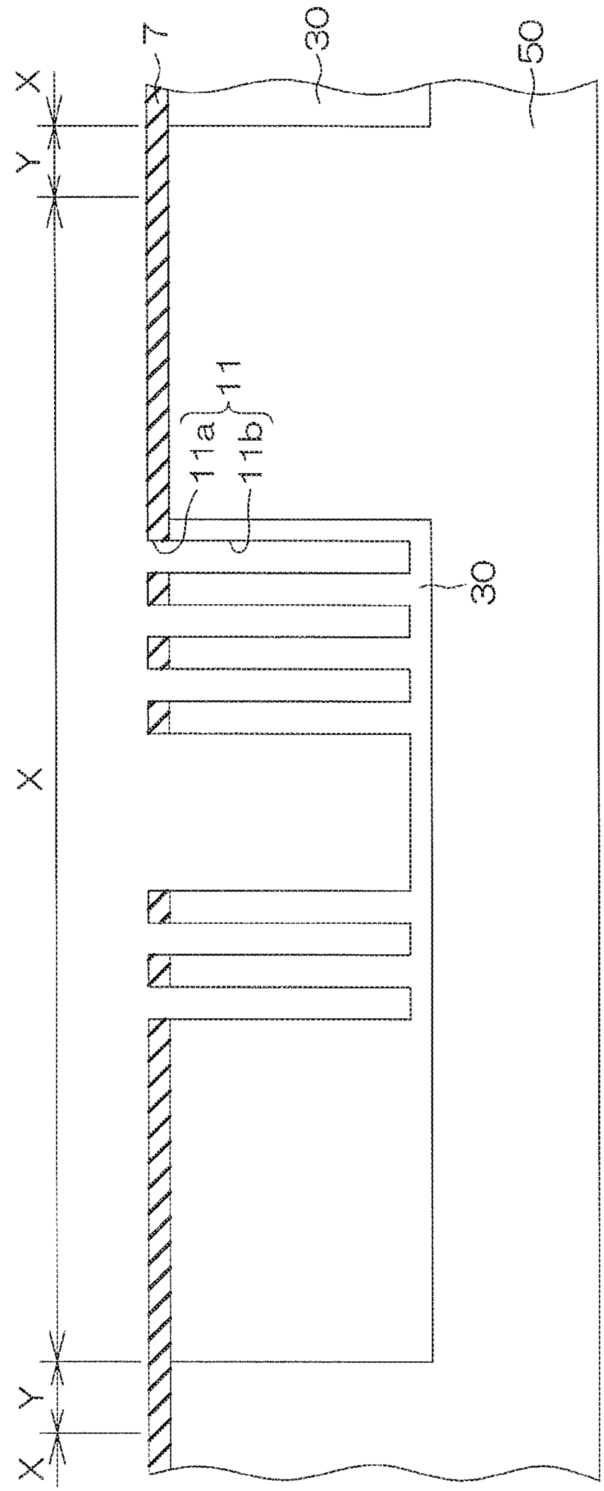
FIG. 60B is a cross-sectional view showing the step subsequent to FIG. 60A.
Figure 61A:
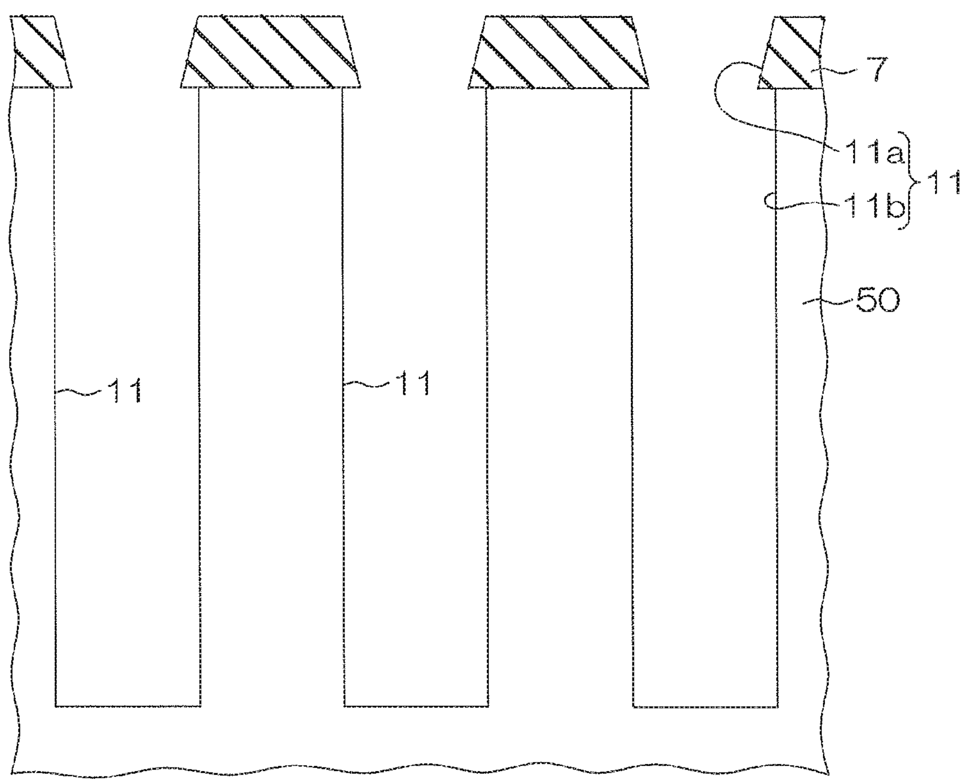

The steps performed on the original substrate 50 in which the insulating film 7 is formed on the surface are as follows. First, as shown in FIGS. 60A, 61A, and 62A, by photolithography and etching, a part of the insulating film 7 that corresponds to a region in which the coil formation trench 11 needs to be formed and a part of the insulating film 7 corresponding to the electrode-side trenches 21 are removed. In this way, in the insulating film 7, the first trench part 11 *a* of the coil formation trench 11 and the first trench part 21*a* of the electrode-side trenches 21 are formed. Then, a hard mask formed with the insulating film 7 is used, and thus the original substrate 50 is etched. In this way, as shown in FIGS. 60B, 61A, and 62A, the second trench part 11*b* of the coil formation trench 11 and the second trench part 21*b* of the electrode-side trench 21 are formed in the original substrate 50. In this way, in the insulating film 7 and the original substrate 50, the coil formation trench 11 and the electrode-side trench 21 are formed. The coil formation trench 11 and the electrode-side trench 21 may be formed with, for example, a so-called BOSCH process. The BOSCH process is a process that is generally used to make a hollow part in a MEMS (Micro Electro Mechanical System).

Figure 61B:
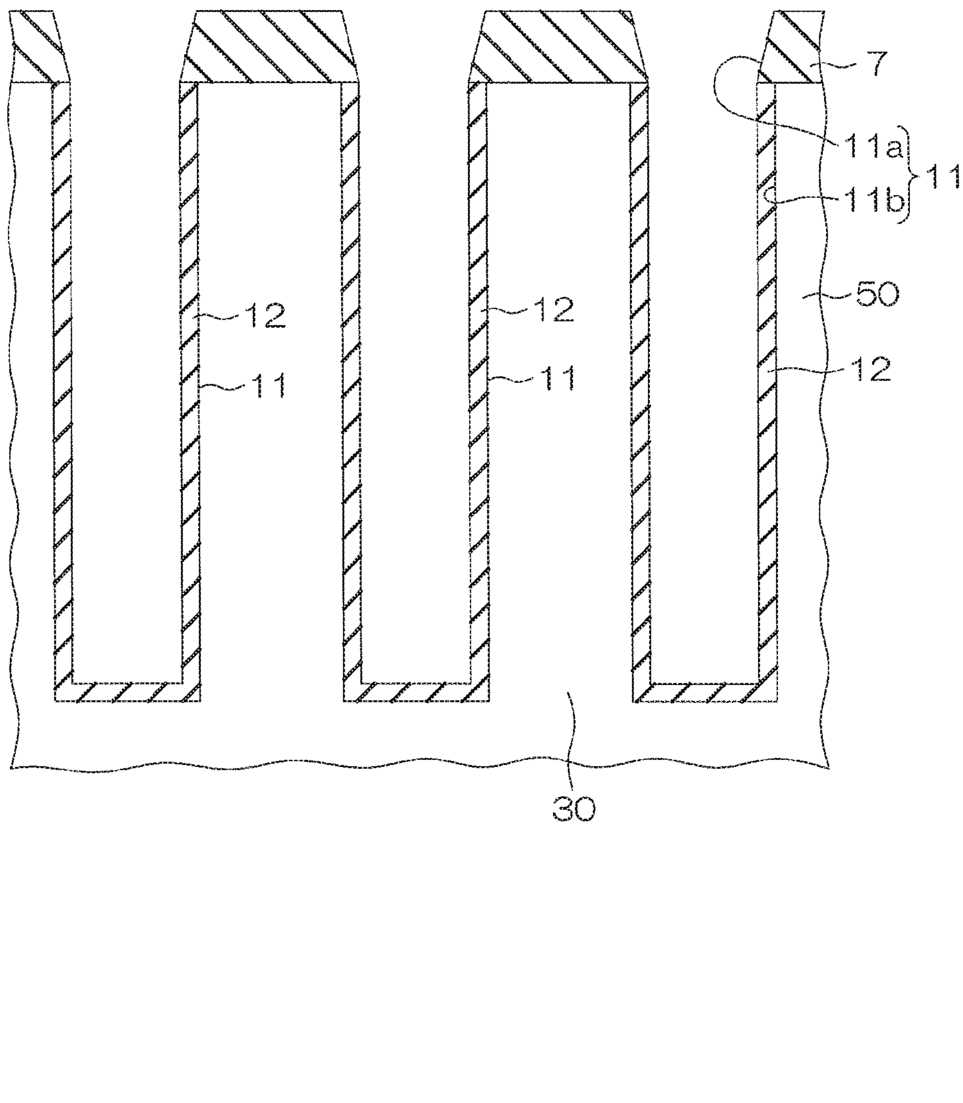

Then, as shown in FIGS. 61B and 62B, on the inner surface of the coil formation trench 11 and the electrode-side trench 21, the insulating film (thermal oxide film) 12 is formed by a thermal oxidization method. Here, the surrounding wall (the side wall and the bottom wall) of the trenches 11 and 21 (the second trench parts 11*b* and 21*b*) in the original substrate 50 is thermally oxidized into an insulator portion (thermal oxide film) 30 having insulation. In FIG. 60B, the insulating film 12 is omitted but the insulator portion 30 is shown. In the preferred embodiment, the entire wall sandwiched by the coil formation trench 11 (the second trench part 11*b*) in the shape of a spiral in the original substrate 50 and the entire wall between the two adjacent electrode-side trenches 21 (the second trench parts 21*b*) are formed into the thermal oxide film. The insulating film 12 formed on the inner surface of the electrode-side trench 21 (the second trench part 21*b*) fills the electrode-side trench 21.

Figure 61C:
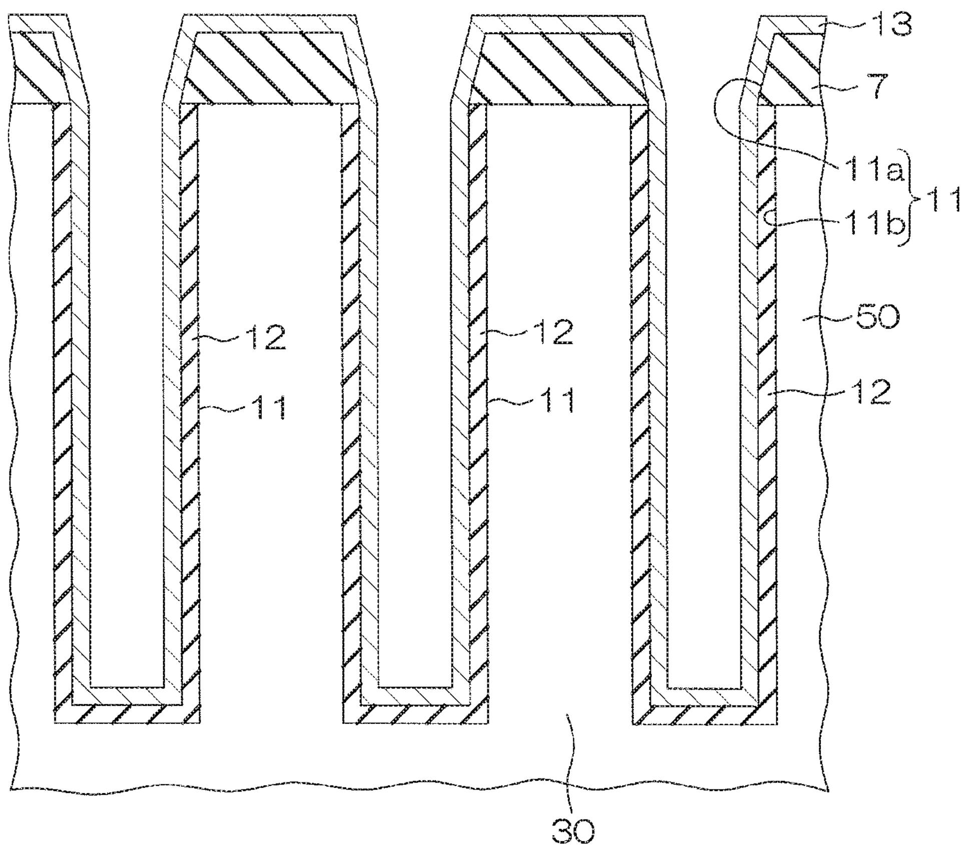

Then, for example, by a sputtering method, the barrier metal film 13 made of TiN is formed on the element formation surface 2*a* including the interiors of the trenches 11 and 21. In this way, then, as shown in FIG. 61C, the barrier metal film 13 is formed on the surfaces of the insulating film 12 and the insulating film 7 within the coil formation trench 11 and the surface of the insulating film 7 outside the coil formation trench 11. As shown in FIG. 62C, the barrier metal film 13 is formed on the surfaces of the insulating film 12 and the insulating film 7 within the electrode-side trench 21 and the surface of the insulating film 7 outside the electrode-side trench 21. Thereafter, annealing processing is performed.

Figure 60C:
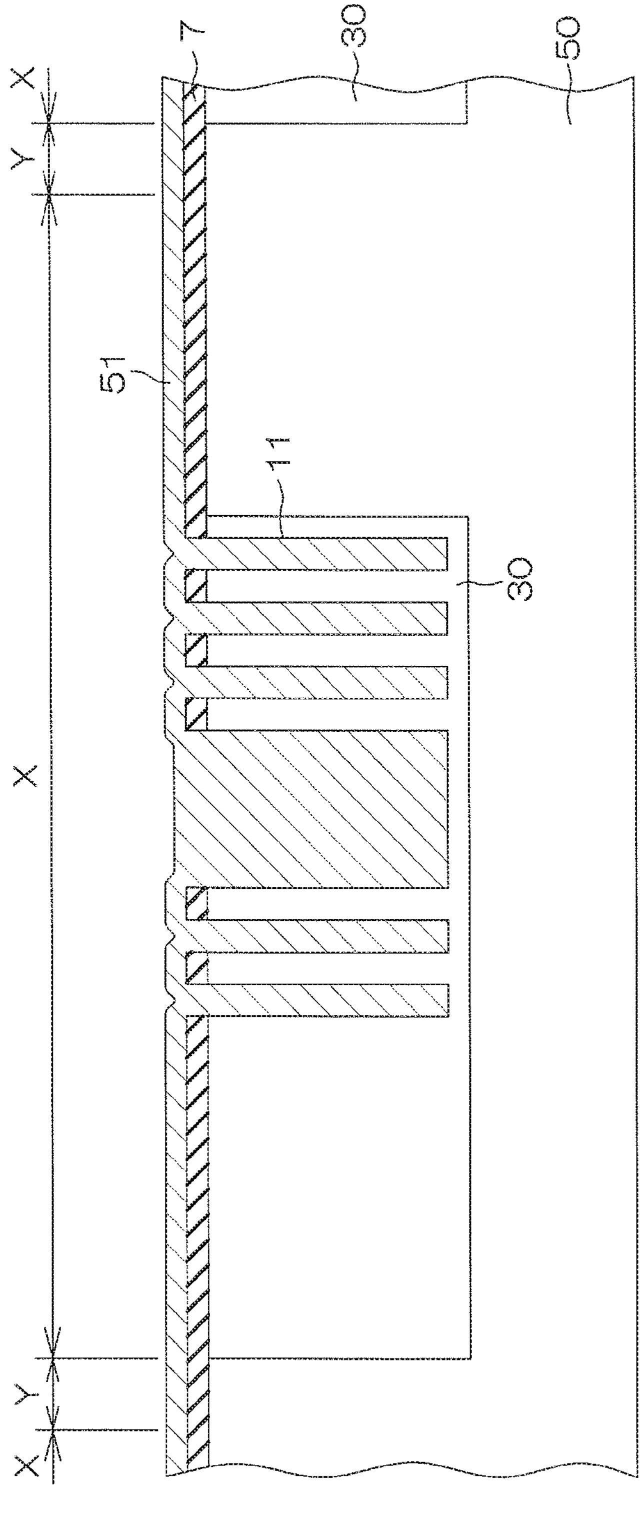
FIG. 60C is a cross-sectional view showing the step subsequent to FIG. 60B.
Figure 61D:
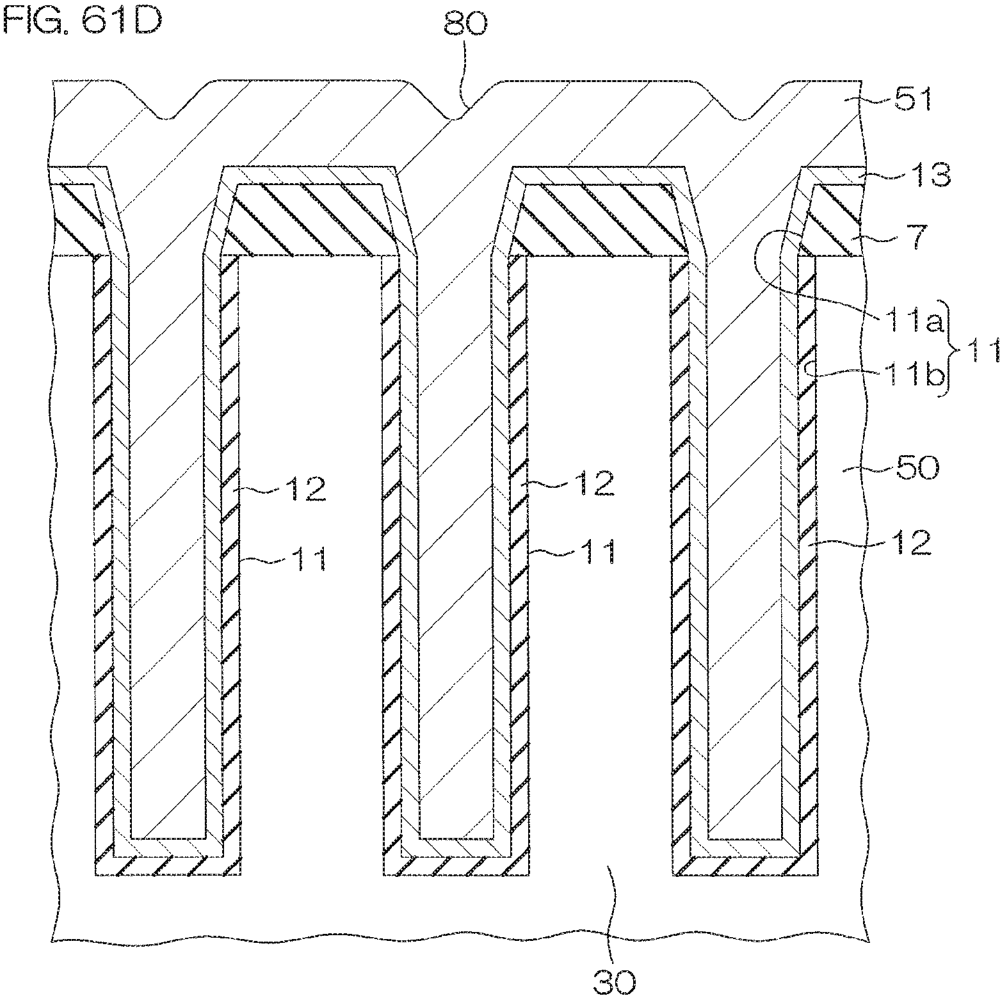

Then, as shown in FIGS. 60C, 61D, and 62D, for example, by a CVD method, on the element formation surface 2*a* including the interiors of the trenches 11 and 21, the conductive member 51 formed of tungsten (W) is deposited. Since on the entire surface of the element formation surface 2*a* including the interiors of the trenches 11 and 21, the conductive member 51 is deposited at the same rate, in the surface of the conductive member 51, concave portions 80 are formed in positions opposite the trenches 11 and 21.

Figure 60D:
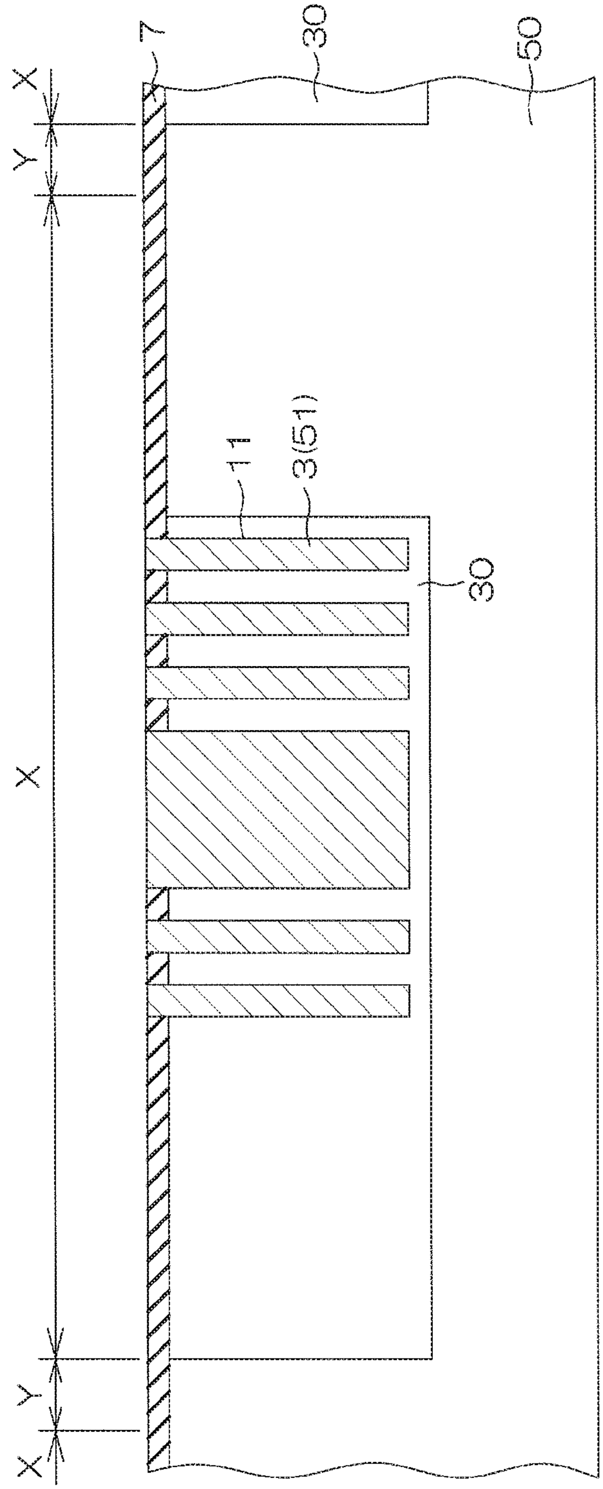
FIG. 60D is a cross-sectional view showing the step subsequent to FIG. 60C.
Figure 61E:
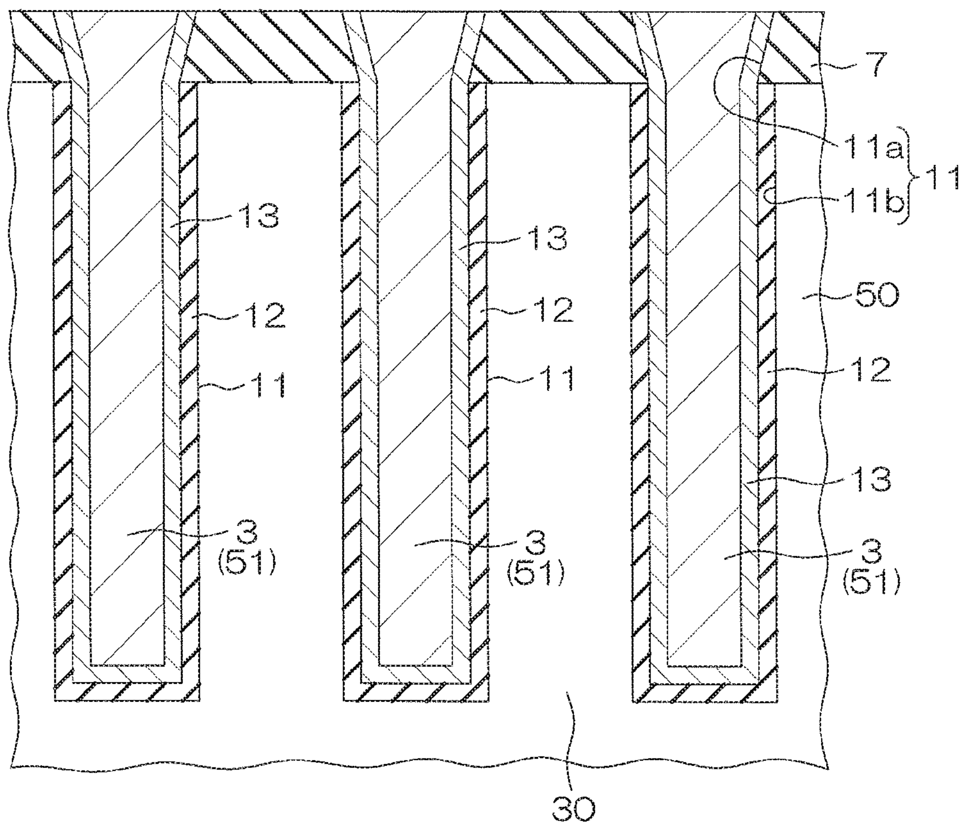

Then, for example, by an etch back method, overall etching is performed on the conductive member 51 from its surface. The overall etching is continued until the surface of the conductive member 51 is flush with the surface of the insulating film 7. In this way, as shown in FIGS. 60D, 61E, and 62E, the conductive member 51 is embedded within the coil formation trench 11 and the electrode-side trench 21 while in contact with the barrier metal film 13. By the conductive member 51 embedded within the coil formation trench 11, the coil 3 in the shape of a spiral when seen in plan view is formed. Since the conductive member 51 is etched from the entire surface thereof at the same rate, on the surface of the conductive member 51 after the etching, the concave portions 81 are formed in positions opposite the concave portions 80 before the etching. However, although for ease of description, the concave portions 81 are shown in FIG. 62E, the concave portions are omitted in FIG. 61E.

Figure 60E:
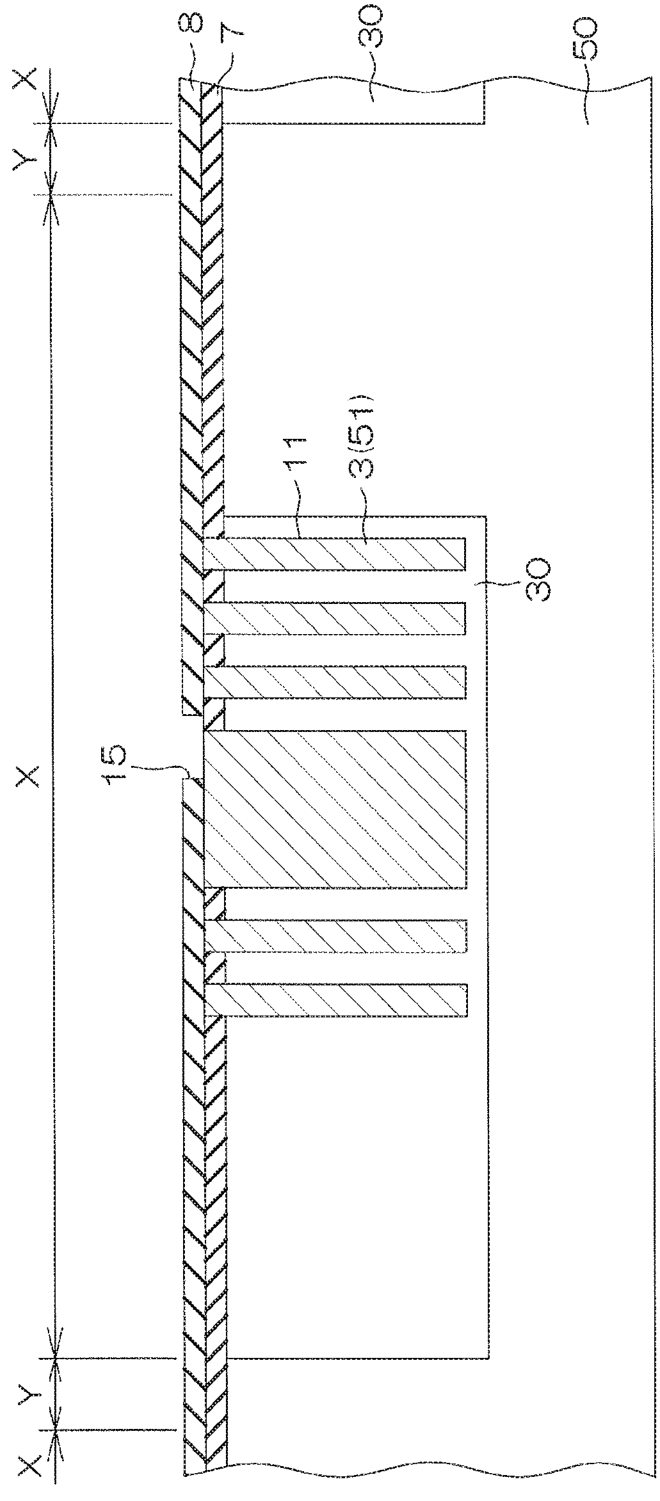
FIG. 60E is a cross-sectional view showing the step subsequent to FIG. 60D.

Then, as shown in FIGS. 60E and 62F, on the insulating film 7, the insulating film 8 formed with a USG (Undoped Silicate Glass) film or the like is formed so as to coat the insulating film 7 (the element formation surface 2*a*) and the conductive member 51. The insulating film 8 is formed by, for example, a CVD method. In the surface of the insulating film 8 formed as described above, as shown in FIG. 62F, in positions opposite the concave portions 81, the concave portions 82 are formed. Thereafter, by photolithography and etching, in regions of the insulating film 8 corresponding to one end portion and the other end portion of the coil 3, the first contact hole 14 (see FIG. 54) and the second contact hole 15 (see FIG. 60E) penetrating the insulating film 8 are respectively formed.

Figure 60F:
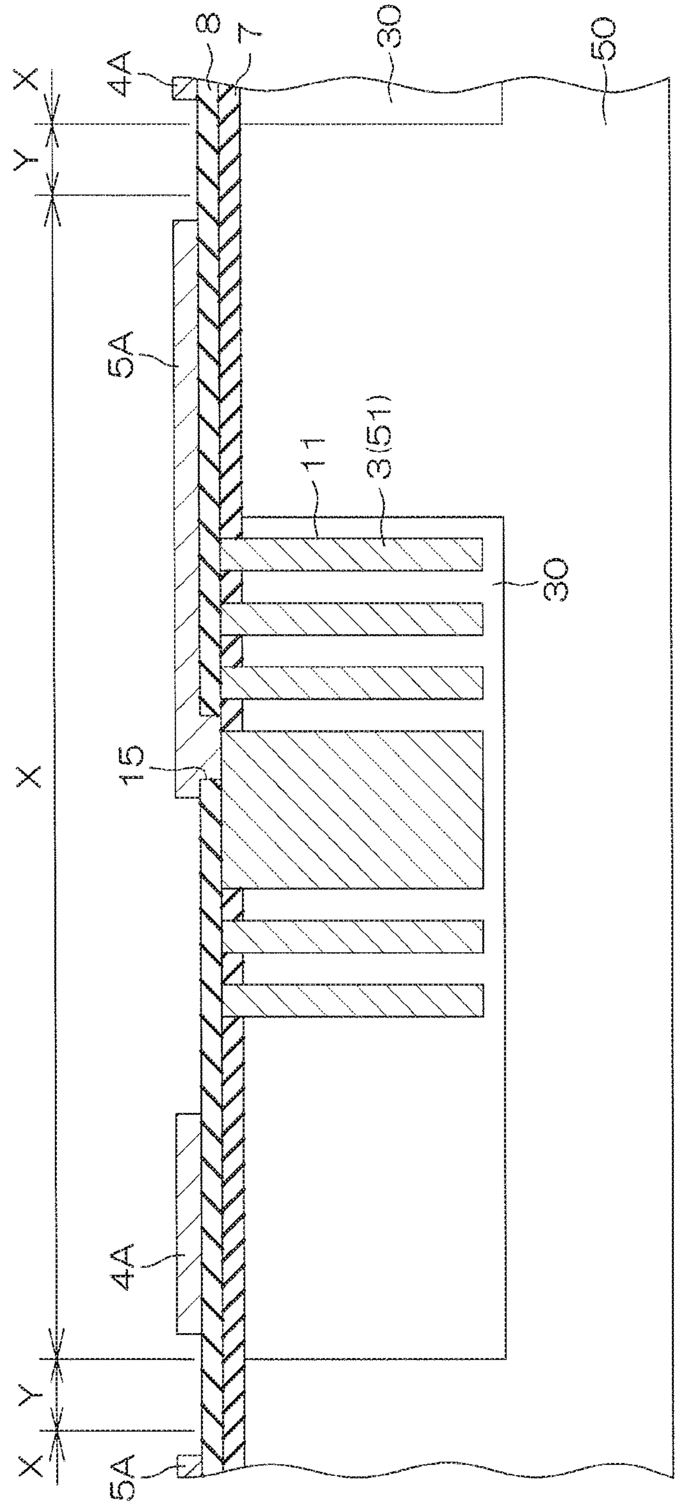
FIG. 60F is a cross-sectional view showing the step subsequent to FIG. 60E.

Then, for example, by sputtering, on the insulating film 8 including the interiors of the contact holes 14 and 15, an electrode film forming the first electrode 4 and the second electrode 5 is formed. In the preferred embodiment, the electrode film made of Al is formed. Thereafter, by photolithography and etching, the electrode film is patterned, and thus as shown in FIGS. 60F and 62F, the electrode film is separated into the first electrode film 4A and the second electrode film 5A. In the surface of the first electrode film 4A formed as described above, as shown in FIG. 62F, in positions opposite the concave portions 82, the concave portions 83 are formed.

Figure 60G:
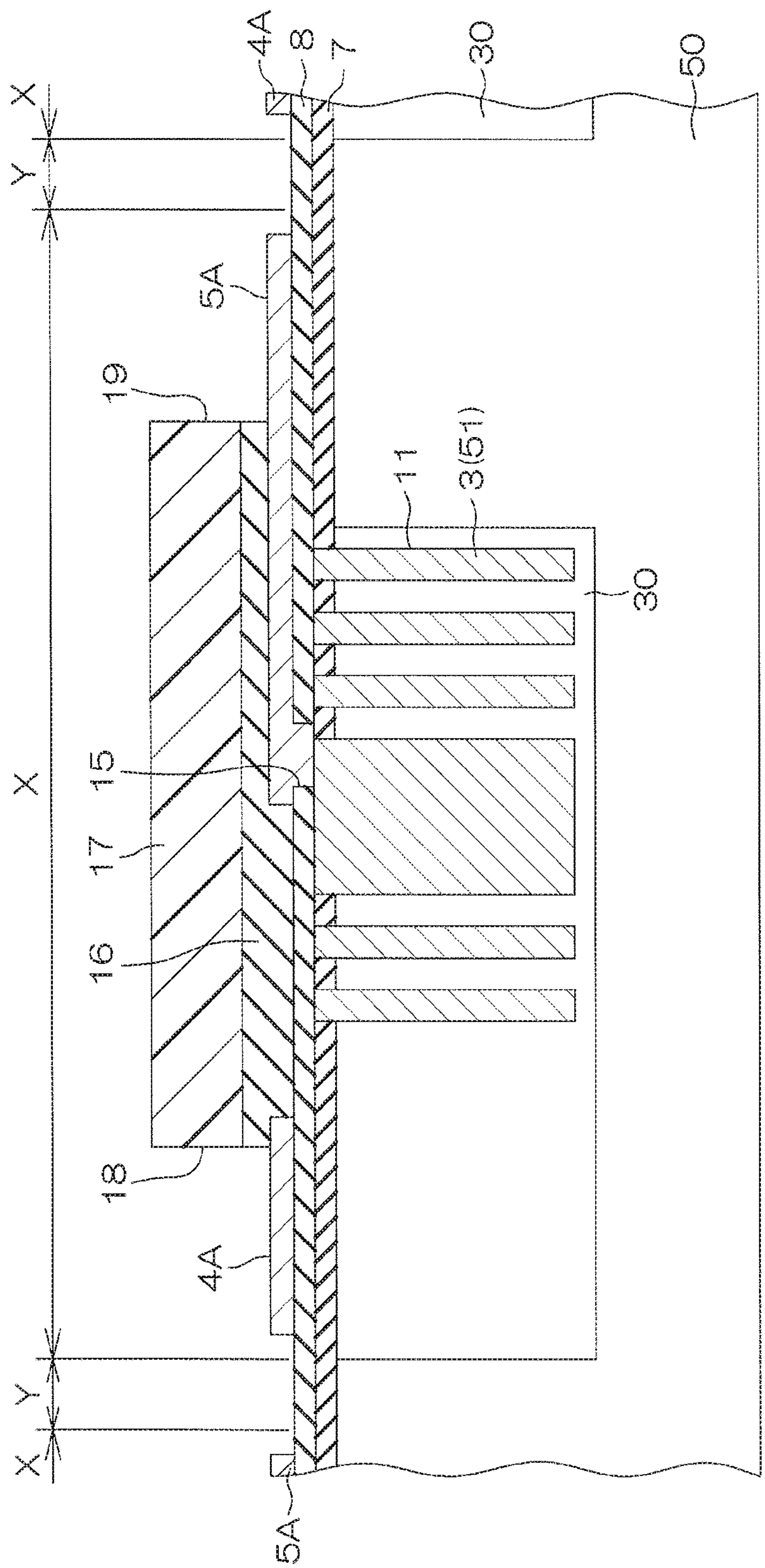
FIG. 60G is a cross-sectional view showing the step subsequent to FIG. 60F.

Then, as shown in FIG. 60G, for example, by a CVD method, the passivation film 16 such as a nitride film is formed, and furthermore, polyimide is applied to form the resin film 17. For example, polyimide to which photosensitivity is added is applied, and the polyimide is developed after exposure with a pattern corresponding to the cutout portions 18 and 19. In this way, the resin film 17 having a cutout portion corresponding to the cutout portions 18 and 19 is formed. Thereafter, as necessary, heat treatment for curing the resin film is performed. Then, by dry etching using the resin film 17 as a mask, the cutout portions 18 and 19 are formed in the passivation film 16.

Figure 60H:
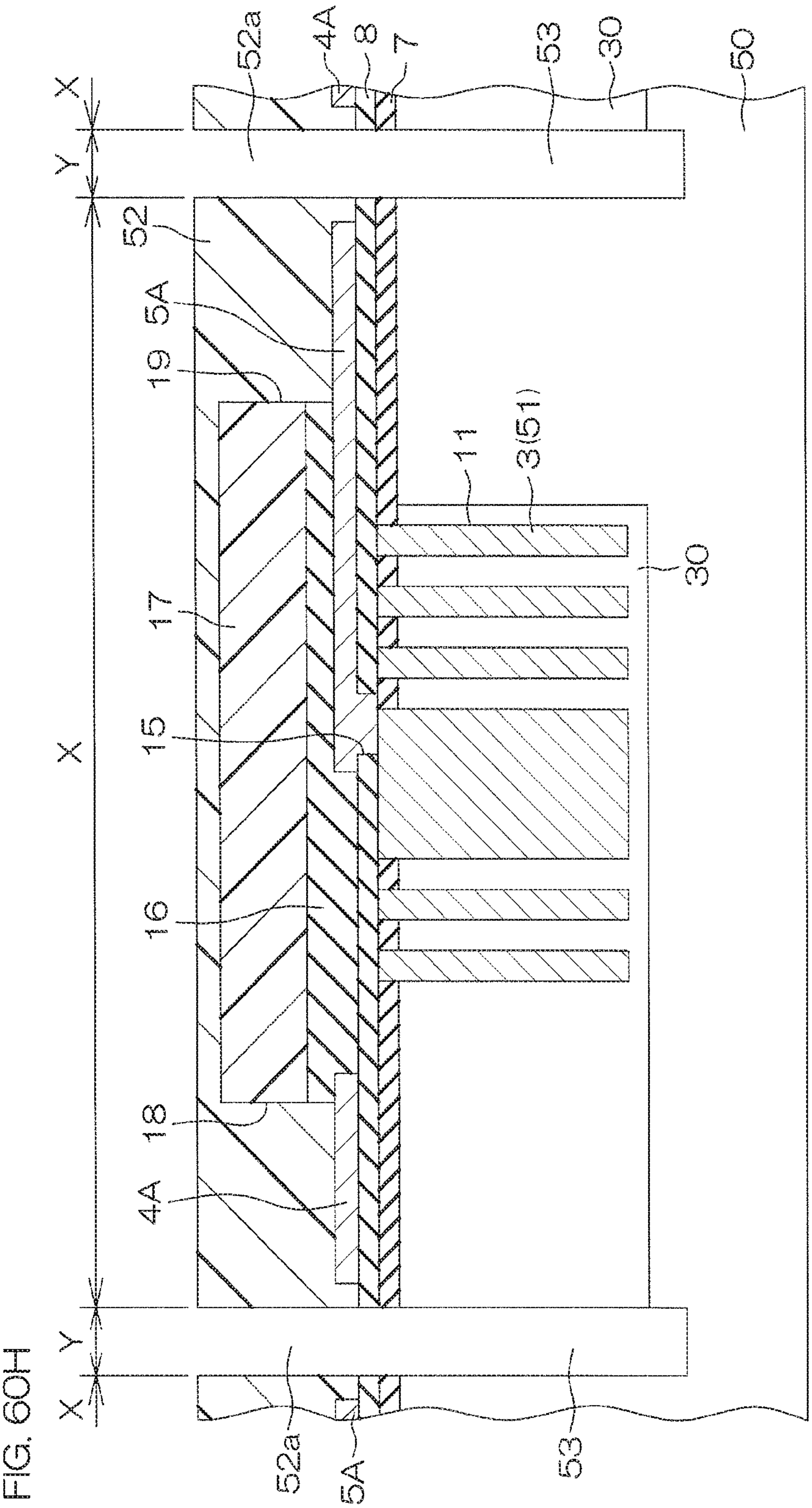

Then, as shown in FIG. 60H, a resist mask 52 having an opening 52*a* in a lattice shape matching with the boundary region Y (see FIG. 63) is formed. Plasma etching is performed via the resist mask 52, and thus as shown in FIG. 60H, the original substrate 50, the insulating film 7, and the insulating film 8 are etched from the surface of the insulating film 8 to a predetermined depth. In this way, along the boundary region Y, a groove (scribe groove) 53 for cutting is formed.

Figure 60I:
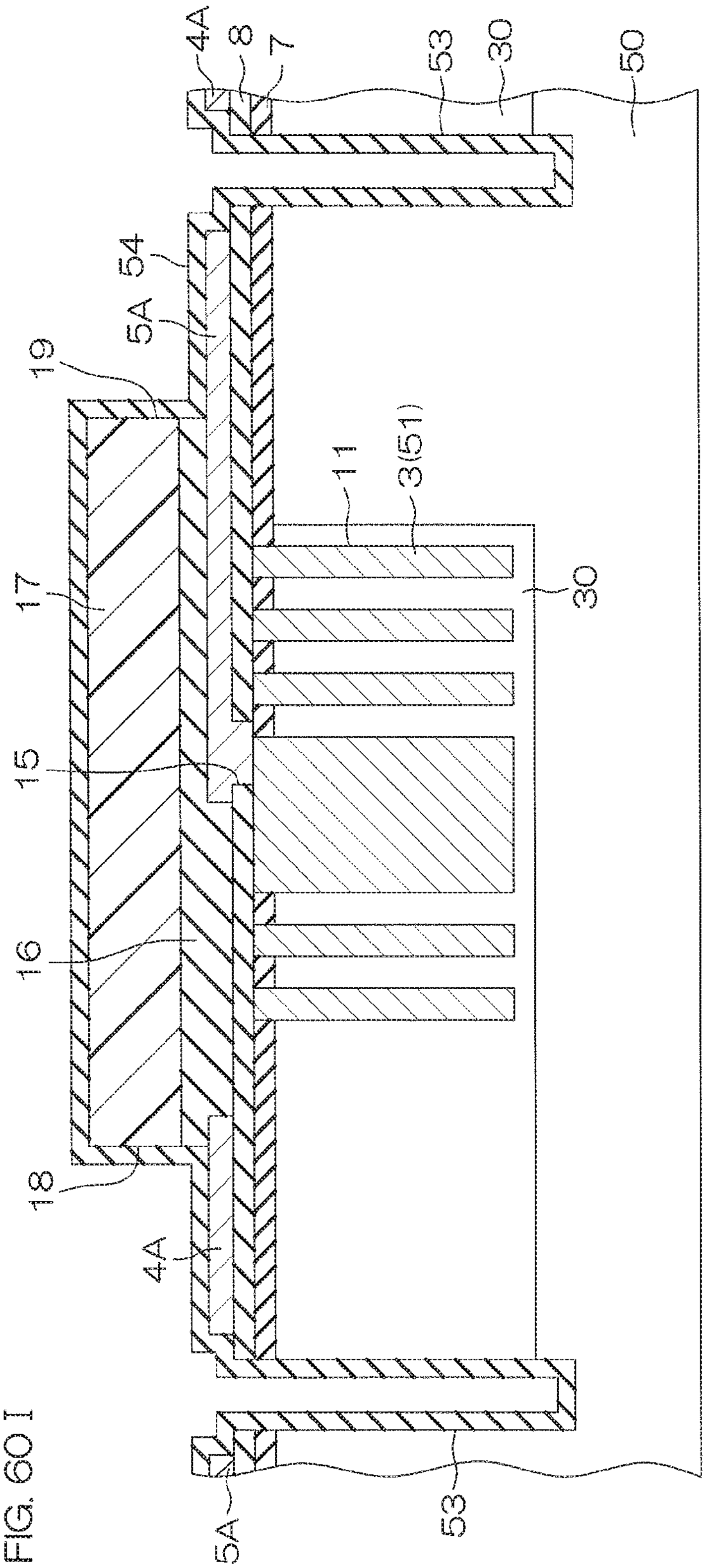

Then, the resist mask 52 is peeled off. Thereafter, as shown in FIG. 60I, for example, by a CVD method, an insulating film 54 such as a nitride film serving as the material of the passivation film 9 is formed over the entire region of the surface of the original substrate 50. Here, the insulating film 54 is also formed over the entire region of the inner surface (the side wall surface and the bottom wall surface) of the groove 53.

Figure 60J:
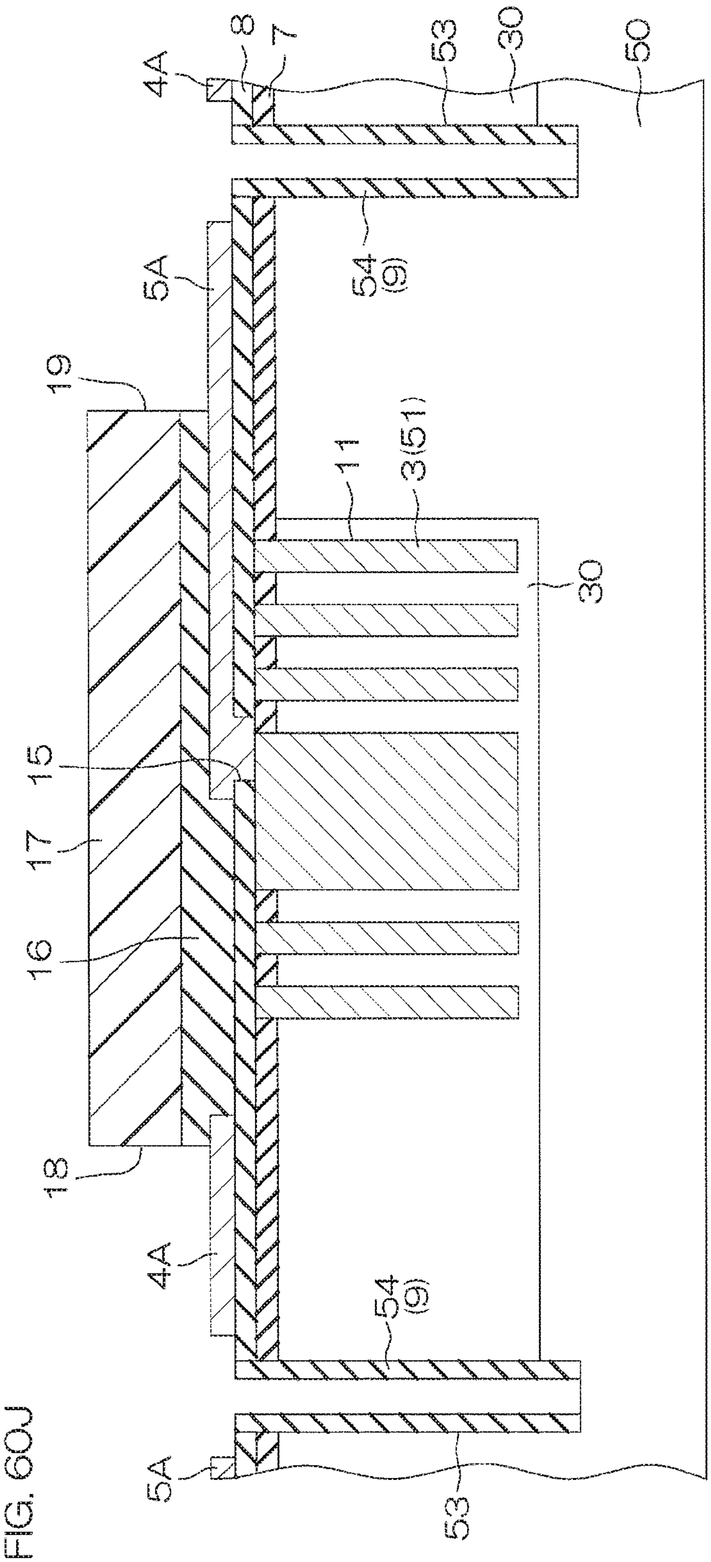

Then, as shown in FIG. 60J, the insulating film 54 is selectively etched. Specifically, a part of the insulating film 54 other than the insulating film 54 (the passivation film 9) on the side wall surface of the groove 53 is removed. In this way, a part of the electrode films 4A and 5A that is not covered by the passivation film 16 and the resin film 17 is exposed. The insulating film 54 on the bottom surface of the groove 53 is removed.

Figure 60K:
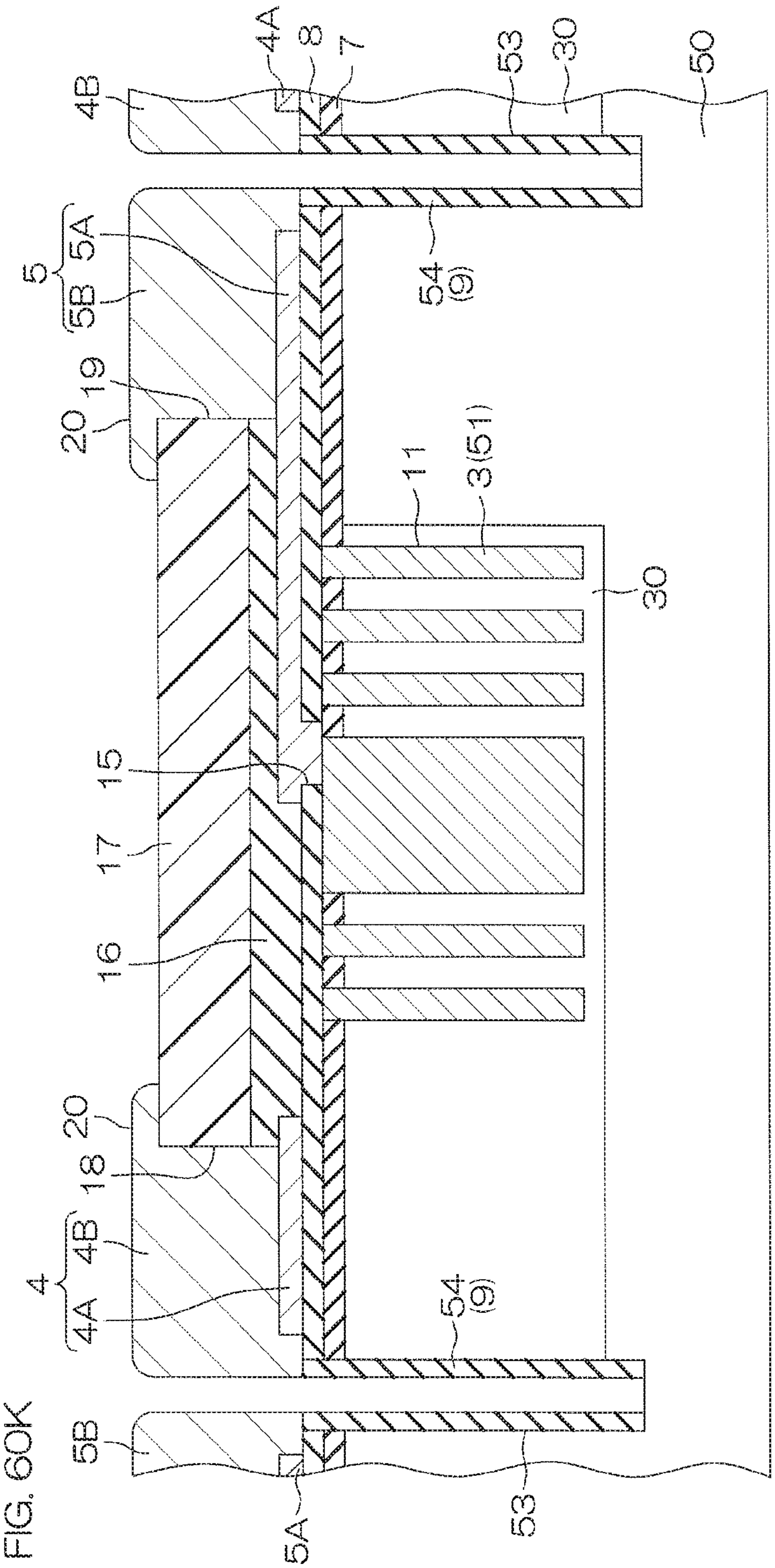

Then, as shown in FIGS. 60K and 62F, on the first electrode film 4A (the first pad 4Ab) and the second electrode film 5A (the second pad 5Ab) exposed from the cutout portions 18 and 19, for example, by plating (preferably, electroless plating), plating growth is performed in the following order: for example, Ni, Pd, and Au. In this way, the first external connection electrode 4B and the second external connection electrode 5B are formed. In the surface of the first external connection electrode 4B formed as described above, as shown in FIG. 62F, in positions opposite the concave portions 83, the concave portions 84 are formed.

Figure 60L:
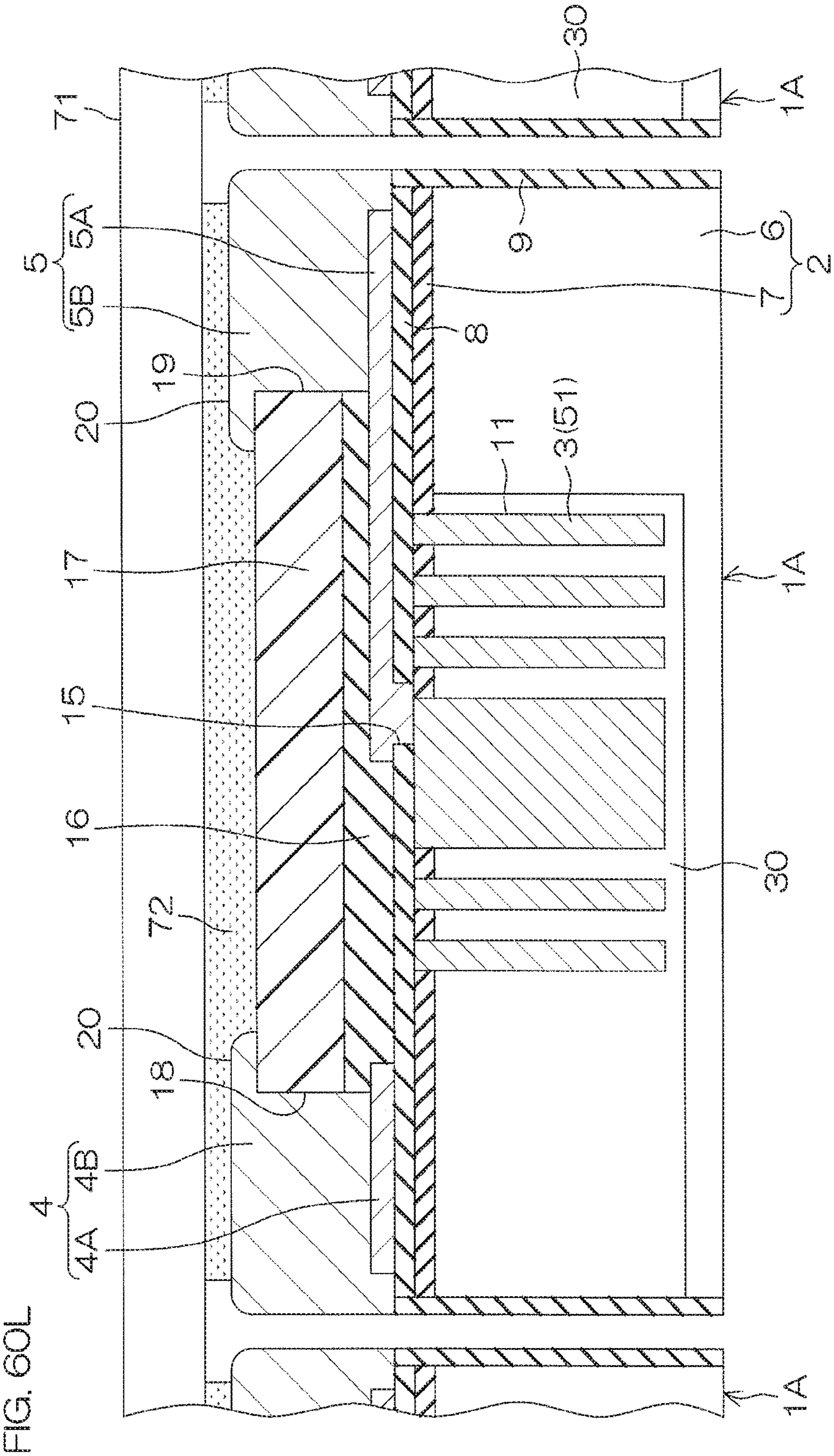

Thereafter, by a DBG (Dicing Before Grinding) method, a plurality of chip inductor regions X are divided into pieces. Specifically, as shown in FIG. 60L, first, on the side of the surface of the original substrate 50 (the side of the external connection electrode), a supporting tape 71 having an adhesive surface 72 is adhered. Then, the original substrate 50 is polished from the rear surface to the bottom surface of the groove 53. In this way, the plurality of chip inductor regions X are separated into individual chip inductors 1A. Thereafter, on a plurality of chip inductors 1A, the recovery step shown in FIGS. 45A to 45D and the recovery step shown in FIGS. 46A to 46C described in the first preferred embodiment of the second invention may be performed.

Even in the second preferred embodiment of the second invention (a preferred embodiment of the third invention), the structure of the conductive member 51 embedded within the coil formation trench 11 may be the structure shown in FIGS. 48A and 48B described as the modification example of the conductive member 51 of the first preferred embodiment of the second invention.

FIG. 64A is a partially cut perspective view of a chip inductor according to the third preferred embodiment of the second invention, and FIG. 64B is a perspective view showing a coil formed within the chip inductor.

The chip inductor 1B is a minute chip part and is formed in the shape of a rectangular parallelepiped. The planar shape of the chip inductor 1B may be rectangular, the length L in the longitudinal direction may be about 0.4 mm and the length W in the lateral direction may be about 0.2 mm. The thickness T of the entire chip inductor 1B may be about 0.15 mm.

The chip inductor 1B includes a substrate 2, a coil 3 that is formed within the substrate 2, a first electrode 4 that is connected to one end portion of the coil 3, and a second electrode 5 that is connected to the other end portion of the coil 3.

FIG. 65A is a plan view showing the appearance of the chip inductor when seen from the side of the electrode, FIG. 65B is a plan view showing the internal structure of the chip inductor, FIG. 66 is a cross-sectional view taken along line LXVI-LXVI in FIG. 65B, FIG. 67 is a partially enlarged cross-sectional view of FIG. 66, FIG. 68 is a cross-sectional view taken along line LXVIII-LXVIII in FIG. 65B, FIG. 69 is a cross-sectional view taken along line LXIX-LXIX in FIG. 65B, FIG. 70 is a partially enlarged cross-sectional view of FIG. 69, FIG. 71 is a cross-sectional view taken along line LXXI-LXXI in FIG. 65B, and FIG. 72 is a plan view showing a structure of the surface of a substrate by removing an arrangement formed on the surface of the substrate.

The substrate 2 is formed in the shape of a rectangular parallelepiped, and includes a pair of main surfaces 2*a* and 2*b* and four side surfaces 2*c*. One (the main surface 2*a* on the upper surface side in FIG. 64A) of the pair of main surfaces 2*a* and 2*b* is an element formation surface. In the following description, the main surface 2*a* is referred to as an "element formation surface 2*a*," and the main surface 2*b* on the side opposite to the element formation surface 2*a* is referred to as a "rear surface 2*b*." In the preferred embodiment, the substrate 2 is formed with a substrate main body 6 and an insulating film 7 formed on the surface thereof, and the surface of the insulating film 7 on the side opposite to the side of the substrate main body 6 is the element formation surface 2*a*. The element formation surface 2*a* is formed in the shape of a rectangle in plan view when seen in a normal direction perpendicular to the element formation surface 2*a*. The surface (element formation surface 2*a*) of the substrate 2 is covered by an insulating film 8. The four side surfaces 2*c* of the substrate 2 and the outer peripheral surface of the insulating film 8 are covered by a passivation film 9 such as a nitride film.

With reference to FIG. 65B, in the element formation surface 2*a*, a first electrode formation region 10A for the formation of the first electrode 4 is provided at one end portion thereof, and a second electrode formation region 10B for the formation of the second electrode 5 is provided at the other end portion. These regions 10A and 10B are rectangular in plan view. In the element formation surface 2*a* between the first electrode formation region 10A and the second electrode formation region 10B, a coil formation region 10C is provided. In the preferred embodiment, the coil formation region 10C is formed in the shape of a rectangle.

In the first electrode formation region 10A, the external connection electrode (first external connection electrode) 4B of the first electrode 4 is disposed, and in the second electrode formation region 10B, the external connection electrode (second external connection electrode) 5B of the second electrode 5 is disposed. The first external connection electrode 4B is rectangular in plan view, and covers the entire region of the first electrode formation region 10A. The second external connection electrode 5B is rectangular in plan view, and covers the entire region of the second electrode formation region 10B.

In the surface of the first external connection electrode 4B, a plurality of first concave portions 84A are formed, and in the surface of the second external connection electrode 4B, a plurality of second concave portions 84B are formed. The first concave portions 84A are formed, in plan view, in the shape of a straight line extending in the longitudinal direction of the substrate 2, and are formed at an interval in the lateral direction of the substrate 2. Likewise, the plurality of second concave portions 84 are formed, in plan view, in the shape of a straight line extending in the longitudinal direction of the substrate 2, and are formed at an interval in the lateral direction of the substrate 2. The cross-sectional shape of the concave portions 84A and 84B is the shape of the letter V. The first concave portions 84A are formed in the same method as the concave portions 84 in the second preferred embodiment described previously. The second concave portions 84B are formed in the same method as the first concave portions 84A.

In the substrate 2, a coil formation trench 11 is formed by digging down, in the coil formation region 10C, to a predetermined depth from the element formation surface 2*a*. The coil formation trench 11 is formed, in plan view, in the shape of a spiral. In the preferred embodiment, the coil formation trench 11 is formed, in plan view, in the shape of a quadrilateral spiral, and has a plurality of rectilinear portions parallel to the side surfaces 2*c* of the substrate 2. The cross section (cross section in a direction perpendicular to a direction in which the coil formation trench 11 is extended in the spiral direction) of the coil formation trench 11 is formed in the shape of a rectangle which is long in the direction of the thickness of the substrate 2. For example, the width of the coil formation trench 11 may be 1 μm or more and 3 μm or less. For example, the depth of the coil formation trench 11 may be 10 μm or more and 82 μm or less. The depth of the coil formation trench 11 is preferably 10 μm or more so that the internal resistance of the coil 3 formed within the coil formation trench 11 is decreased.

Furthermore, in a region (the first electrode formation region 10A) of the element formation surface 2*a* opposite the first external connection electrode 4B, in the substrate 2, a plurality of first electrode-side trenches 21A are formed by digging down from the element formation surface 2*a* to a predetermined depth. The plurality of first electrode-side trenches 21A are formed in positions opposite the plurality of first concave portions 84A. Hence, the first electrode-side trenches 21A are formed, in plan view, in the shape of a straight line extending in the longitudinal direction of the substrate 2, and are formed at an interval in the lateral direction of the substrate 2.

Likewise, in a region (the second electrode formation region 10B) of the element formation surface 2*a* opposite the second external connection electrode 5B, in the substrate 2, a plurality of second electrode-side trenches 21B are formed by digging down from the element formation surface 2*a* to a predetermined depth. The plurality of second electrode-side trenches 21B are formed in positions opposite the plurality of second concave portions 84B. Hence, the plurality of second electrode-side trenches 21B are formed, in plan view, in the shape of a straight line extending in the longitudinal direction of the substrate 2, and are formed at an interval in the lateral direction of the substrate 2.

The cross sections of the electrode-side trenches 21A and 21B are the shape of a rectangle that is long in the direction of the thickness of the substrate 2. In the preferred embodiment, the width of the electrode-side trenches 21A and 21B is narrower than that of the coil formation trench 11. The depth of the electrode-side trenches 21A and 21B may be the same as that of the coil formation trench 11 or may be shallower than that of the coil formation trench 11. In the preferred embodiment, the depth of the electrode-side trenches 21A and 21B is the same as that of the coil formation trench 11.

As shown in FIG. 67, the coil formation trench 11 is formed with a first trench part 11*a* that is formed in the insulating film 7 and a second trench part 11*b* that is formed in the substrate main body 6 and that communicates with the first trench part 11*a*. On the inner surface of the coil formation trench 11 (the second trench part 11*b*) in the substrate main body 6, an insulating film 12 formed with an oxide film or the like is formed. On the surface of the insulating film 12 within the coil formation trench 11 (the second trench part 11*b*) and on the inner surface of the coil formation trench 11 (the first trench part 11*a*) in the insulating film 7, a barrier metal film 13 is formed. The barrier metal film 13 is formed of, for example, TiN. The thickness of the barrier metal film 13 is about 400 to 500 angstroms.

Within the coil formation trench 11, a conductive member 51 is embedded while being in contact with the barrier metal film 13. In the preferred embodiment, the conductive member 51 is formed of tungsten (W). The coil 3 is formed with the conductive member 51 embedded within the coil formation trench 11. Hence, the coil 3 is formed, in plan view, in the shape of a spiral (in the shape of a quadrilateral spiral) of the same pattern as the coil formation trench 11. Specifically, the coil 3 includes a plurality of plate-shaped parts parallel to the side surfaces 2*c* of the substrate 2.

As shown in FIGS. 69, 70, and 71, the electrode-side trenches 21A and 21B are formed with first trench parts 21Aa and 21Ba that are formed in the insulating film 7 and second trench parts 21Ab and 21Bb that are formed in the substrate main body 6 and that communicate with the first trench parts 21Aa and 21Ba. On the inner surface of the electrode-side trenches 21A and 21B (the second trench parts 21Ab and 21Bb) in the substrate main body 6, an insulating film 12 formed with an oxide film or the like is formed. In the preferred embodiment, the insulating film 12 formed on the inner surface of the electrode-side trenches 21A and 21B (the second trench parts 21Ab and 21Bb) in the substrate main body 6 fills the second trench parts 21Ab and 21Bb.

On the inner surface of the first electrode-side trench 21A (the first trench part 21Aa) in the insulating film 7, the barrier metal film 13 is formed. Within the first electrode-side trench 21A (the first trench part 21Aa) in the insulating film 7, the conductive member 51 is embedded while being in contact with the barrier metal film 13. In the surface of the conductive member 51 within the first electrode-side trench 21A, first concave portions 81A are formed. In other words, in a region of the element formation surface 2*a* opposite the first external connection electrode 4B, a plurality of first concave portions 81A are formed. The plurality of first concave portions 81A are formed in positions of the first external connection electrode 4B opposite the first concave portions 84A. Hence, the plurality of first concave portions 81A are formed, in plan view, in the shape of a straight line extending in the longitudinal direction of the substrate 2, and are formed at an interval in the lateral direction of the substrate 2. The cross-sectional shape of the first concave portion 81A is the shape of the letter V. The plurality of first concave portions 81A are formed due to the plurality of first electrode-side trenches 21A formed in the substrate 2.

Likewise, on the inner surface of the second electrode-side trench 21B (the first trench part 21Ba) in the insulating film 7, the barrier metal film (not shown) is formed. Within the second electrode-side trench 21B (the first trench part 21Ba) in the insulating film 7, the conductive member 51 is embedded while being in contact with the barrier metal film. In the surface of the conductive member 51 within the second electrode-side trench 21B, second concave portions 81B are formed. In other words, in a region of the element formation surface 2*a* opposite the second external connection electrode 5B, a plurality of second concave portions 81B are formed. The plurality of second concave portions 81B are formed in positions opposite the plurality of second concave portions 84B of the second external connection electrode 5B. Hence, the plurality of second concave portions 81B are formed, in plan view, in the shape of a straight line extending in the longitudinal direction of the substrate 2, and are formed at an interval in the lateral direction of the substrate 2. The cross-sectional shape of the second concave portion 81B is the shape of the letter V. The plurality of second concave portions 81B are formed due to the plurality of second electrode-side trenches 21B formed in the substrate 2.

In the preferred embodiment, the insulating film 12 formed on the inner surfaces of the coil formation trench 11 and the electrode-side trenches 21A and 21B is formed with a thermal oxide film ($SiO_2$). When the thermal oxide film is formed on the inner surface of these trenches 11, 21A, and 21B, the surrounding wall (the side wall and the bottom wall) of the trenches 11, 21A, and 21B in the substrate main body 6 is thermally oxidized into an insulator portion (thermal oxide film) 30 having insulation. In the preferred embodiment, an example is described where the entire wall sandwiched by the coil formation trench 11 (the second trench part 11*b*) in the shape of a spiral in the substrate main body 6, the entire wall between the adjacent two first electrode-side trenches 21A (the second trench parts 21Ab), and the entire wall between the adjacent two second electrode-side trenches 21B (the second trench parts 21Bb) are thermal oxide films.

On the element formation surface 2*a* (the surface of the insulating film 7) of the substrate 2, the insulating film 8 is formed so as to coat the element formation surface 2*a* and the conductive member 51. The insulating film 8 is formed, in plan view, in the shape of a rectangle matching with the element formation surface 2*a*. The insulating film 8 is formed with, for example, a USG (Undoped Silicate Glass) film. In the insulating film 8, a first contact hole 14 (see FIGS. 65B and 68) that exposes one end portion (outer peripheral side end portion) of the coil 3 and a second contact hole 15 (see FIGS. 65B and 66) that exposes the other end portion (inner peripheral side end portion) of the coil 3 are formed.

Furthermore, in the surface of the insulating film 8, as shown in FIGS. 69 and 70, in a region opposite the first external connection electrode 4B, a plurality of first concave portions 82A are formed. The plurality of first concave portions 82A are formed in positions opposite the first concave portions 84A (the first concave portions 81A) of the first external connection electrode 4B. Hence, the plurality of first concave portions 82A are formed, in plan view, in the shape of a straight line extending in the longitudinal direction of the substrate 2, and are formed at an interval in the lateral direction of the substrate 2. The cross-sectional shape of the first concave portion 82A is the shape of the letter V. The first concave portions 82A are formed due to the first concave portions 81A in the surface (the element formation surface 2*a*) of the substrate 2, which is its underlying layer.

Likewise, in the surface of the insulating film 8, as shown in FIG. 71, in a region opposite the second external connection electrode 5B, a plurality of second concave portions 82B are formed. The plurality of second concave portions 82B are formed in positions opposite the second concave portions 84B (the second concave portions 81B) of the second external connection electrode 5B. Hence, the plurality of second concave portions 82B are formed, in plan view, in the shape of a straight line extending in the longitudinal direction of the substrate 2, and are formed at an interval in the lateral direction of the substrate 2. The cross-sectional shape of the second concave portion 82B is the shape of the letter V. The second concave portions 82B are formed due to the second concave portions 81B in the surface (the element formation surface 2*a*) of the substrate 2, which is its underlying layer. As described previously, on the side surfaces 2*c* of the substrate 2 and the outer peripheral surface of the insulating film 8, a passivation film 9 such as a nitride film is formed.

On the surface of the insulating film 8, the first electrode 4 and the second electrode 5 are formed. The first electrode 4 includes a first electrode film 4A that is formed on the surface of the insulating film 8 and a first external connection electrode 4B that is bonded to the first electrode film 4A. As shown in FIG. 65B, the first electrode film 4A includes a drawing electrode 4Aa that is connected to one end portion of the coil 3 and a first pad 4Ab that is formed integrally with the drawing electrode 4Aa. The first pad 4Ab is formed to be rectangular at one end portion of the element formation surface 2*a*. The first external connection electrode 4B is connected to the first pad 4Ab. As shown in FIGS. 65B and 68, the drawing electrode 4Aa enters the first contact hole 14 from the surface of the insulating film 8, and is connected to one end portion of the coil 3 within the first contact hole 14. The drawing electrode 4Aa is formed straight along a straight line that passes above one end portion of the coil 3 to reach the first pad 4Ab.

By extending one end portion of the coil formation trench 11 to a position below the first pad 4Ab, one end portion of the coil 3 may be disposed in a position below the first pad 4Ab. In this way, since the first contact hole 14 can be formed in a position below the first pad 4Ab, one end portion of the coil 3 can be connected to the first pad 4Ab. In this case, since the first electrode film 4A can be formed with only the first pad 4Ab, the drawing electrode 4Aa is not needed.

The second electrode 5 includes a second electrode film 5A that is formed on the surface of the insulating film 8 and a second external connection electrode 5B that is bonded to the second electrode film 5A. As shown in FIG. 65B, the second electrode film 5A includes a drawing electrode 5Aa that is connected to the other end portion of the coil 3 and a second pad 5Ab that is formed integrally with the drawing electrode 5Aa. The second pad 5Ab is formed to be rectangular at the other end portion of the element formation surface 2*a*. The second external connection electrode 5B is connected to the second pad 5Ab. As shown in FIGS. 65B and 66, the drawing electrode 5Aa enters the second contact hole 15 from the surface of the insulating film 8, and is connected to the other end portion of the coil 3 within the second contact hole 15. The drawing electrode 5Aa is formed straight along a straight line that passes above the other end portion of the coil 3 to reach the second pad 5Ab. In the preferred embodiment, as the electrode films 4A and 5A, Al films are used.

In the surface of the first pad 4Ab of the first electrode film 4A, as shown in FIGS. 69 and 70, a plurality of first concave portions 83A are formed. The plurality of first concave portions 83A are formed in positions opposite the first concave portions 84A (the first concave portions 82A) of the first external connection electrode 4B. Hence, the plurality of first concave portions 83A are formed, in plan view, in the shape of a straight line extending in the longitudinal direction of the substrate 2, and are formed at an interval in the lateral direction of the substrate 2. The cross-sectional shape of the first concave portion 83A is the shape of the letter V. The first concave portions 83A are formed due to the first concave portions 82A in the surface of the insulating film 8, which is its underlying layer.

Likewise, in the surface of the second pad 5Ab of the second electrode film 5A, as shown in FIG. 71, a plurality of second concave portions 83B are formed. The plurality of second concave portions 83B are formed in positions opposite the second concave portions 84B (the second concave portions 82B) of the second external connection electrode 5B. Hence, the plurality of second concave portions 83B are formed, in plan view, in the shape of a straight line extending in the longitudinal direction of the substrate 2, and are formed at an interval in the lateral direction of the substrate 2. The cross-sectional shape of the second concave portion 83B is the shape of the letter V. The second concave portions 83B are formed due to the second concave portions 82B in the surface of the insulating film 8, which is its underlying layer.

The first electrode film 4A and the second electrode film 5A are covered by a passivation film 16 formed with, for example, a nitride film, and furthermore, on the passivation film 16, a resin film 17 such as polyimide is formed. In the passivation film 16 and the resin film 17, two cutout portions 18 and 19 are formed that respectively expose a region other than an edge portion on the inner side of the surface of the first pad 4Ab of the first electrode film 4A and a region other than an edge portion on the inner side of the surface of the second pad 5Ab of the second electrode film 5A. In other words, the passivation film 16 and the resin film 17 are formed, in plan view, in a region corresponding to the coil formation region 10C of the element formation surface 2*a*, and cover the insulating film 8, the edge portion on the inner side of the surface of the first pad 4Ab, and the edge portion on the inner side of the surface of the second pad 5Ab.

The first external connection electrode 4B fills the cutout portion 18, and the second external connection electrode 5B fills the cutout portion 19. The first external connection electrode 4B and the second external connection electrode 5B are formed so as to protrude from the resin film 17, and include a drawing portion 20 that is drawn inwardly of the substrate 2 along the surface of the resin film 17. In the preferred embodiment, the first external connection electrode 4B is formed so as to cover not only the surface of the first electrode film 4A (the pad 4Ab) and the insulating film 8 exposed within the cutout portion 18 but also the upper end surface of the passivation film 9 on the side of one end portion of the substrate 2. The three side surfaces other than the side surface on the inner side of the first external connection electrode 4B are formed so as to be flush with the surface of the passivation film 9 covering the peripheral surface of the insulating film 8 on the side of one end portion of the substrate 2.

Likewise, the second external connection electrode 5B is formed so as to cover not only the surfaces of the second electrode film 5A (the pad 5Ab) and the insulating film 8 exposed within the cutout portion 19 but also the upper end surface of the passivation film 9 on the side of the other end portion of the substrate 2. The three side surfaces other than the side surface on the inner side of the second external connection electrode 5B are formed so as to be flush with the surface of the passivation film 9 covering the peripheral surface of the insulating film 8 on the side of the other end portion of the substrate 2. The external connection electrodes 4B and 5B may be formed with, for example, a Ni/Pd/Au laminated film having a Ni film in contact with the electrode films 4A and 5A, a Pd film formed thereon, and an Au film formed thereon. The laminated film described above can be formed by a plating method.

With reference to FIGS. 64A, 65A, 69, 70, and 71, as described previously, in the surface of the first external connection electrode 4B, a plurality of first concave portions 84A are formed, and in the surface of the second external connection electrode 5B, a plurality of second concave portions 84B are formed. The first concave portions 84A are formed due to the first concave portions 83A in the surface of the first pad 4Ab, which is its underlying layer. Since the first concave portions 83A are formed due to the first concave portions 82A, which is its underlying layer, and the first concave portions 82A are formed due to the first concave portions 81A, which is its underlying layer, the first concave portions 84A are formed due to the first concave portions 81A. As described in the second preferred embodiment of the second invention, the first concave portions 81A (the concave portion 81 in the second preferred embodiment) are formed due to the first electrode-side trenches 21A (the electrode-side trenches 21 in the second preferred embodiment). Hence, the first concave portions 84A in the first external connection electrode 4B are formed due to the first electrode-side trenches 21A.

The second concave portions 84B are formed due to the second concave portions 83B in the surface of the second pad 5Ab, which is its underlying layer. Since the second concave portions 83B are formed due to the second concave portions 82B, and the second concave portions 82B are formed due to the second concave portions 81B, the second concave portions 84B are formed due to the second concave portions 81B. As the first concave portions 81A are formed due to the first electrode-side trenches 21A, the second concave portions 81B are formed due to the second electrode-side trenches 21B. Hence, the second concave portions 84B in the second external connection electrode 5B are formed due to the second electrode-side trenches 21B.

The passivation film 16 and the resin film 17 coat, from the surface, the coil 3, the insulating film 8, the first electrode film 4A, and the second electrode film 5A in the coil formation region 10C of the element formation surface 2*a*, and function as a protective film to protect them. On the other hand, the passivation film 9 formed on the side surfaces 2*c* of the substrate 2 and the outer peripheral surface of the insulating film 8 function as a protective film to protect the side surfaces 2*c* of the substrate 2 and the outer peripheral surface of the insulating film 8.

The chip inductor 1B of the third preferred embodiment of the second invention can be manufactured substantially in the same manufacturing method as in the second preferred embodiment of the second invention. The third preferred embodiment of the second invention only differs in the manufacturing step from the second preferred embodiment of the second invention in that in the formation of the coil formation trench 11, not only the first electrode-side trenches 21A but also the second electrode-side trenches 21B are formed, and thus its description will be omitted.

FIG. 73 is an electrical circuit diagram showing an electrical structure within the chip inductor 1B. One end of the coil 3 (represented by a symbol L in FIG. 73) is connected to the first electrode 4, and the other end of the coil 3 is connected to the second electrode. In this way, the chip inductor functions as an inductor having a predetermined inductance.

As a parameter indicating the performance (quality) of the coil, the Q (Quality Factor) value of the coil is present. As the Q value is increased, its loss is decreased, and an excellent characteristic is provided as a high-frequency inductance.

The Q value of the coil 3 is represented by formula (3) below.

$$Q=2\pi fL/R \tag{3}$$

In the formula (3) above, f represents the frequency of a current flowing through the coil, L represents the inductance of the coil 3, and R represents the internal resistance of the coil 3.

In the arrangement of the third preferred embodiment of the second invention, in the substrate 2, the coil formation trench 11 obtained by digging down from the element formation surface 2*a* is formed, in plan view, in the shape of a spiral, the conductive member 51 is embedded within the coil formation trench 11 and thus the coil 3 is formed. Hence, it is possible to increase the cross-sectional area of the coil 3 (the cross-sectional area of the coil 3 perpendicular to the direction in which the coil 3 is extended in the spiral direction), and thus it is possible to decrease the internal resistance (R in the formula (3) above) of the coil 3. In this way, since the Q value of the coil 3 can be increased, it is possible to provide a high-performance chip inductor.

The coil formation trench 11 is formed in the substrate 2, the conductive member 51 is embedded within the coil formation trench 11 and thus it is possible to form the coil 3, with the result that the coil 3 is easily manufactured. In this way, it is possible to provide a chip transformer that is easily manufactured.

In the third preferred embodiment of the second invention, in the region (the first electrode formation region 10A) opposite the first external connection electrode 4B of the element formation surface 2*a*, a plurality of first electrode-side trenches 21A are formed, and in the region (the second electrode formation region 10B) opposite the second external connection electrode 5B of the element formation surface 2*a*, a plurality of second electrode-side trenches 21B are formed. The wall between the adjacent first electrode-side trenches 21A and the wall between the adjacent second electrode-side trenches 21B in the substrate main body 6 are formed in the insulator portion 30 having insulation. The insulating film 12 substantially fills the entire region within the electrode-side trenches 21A and 21B. In this way, substantially the entire region immediately below the pad 4Ab of the first electrode 4 and the pad 5Ab of the second electrode 5 in the substrate main body 6 is formed in the insulator portion 30. Hence, it is possible to reduce the parasitic capacitance between the substrate main body 6 and the first electrode 4 and the second electrode 5 opposite each other through the insulating film 7 as compared with the case where a main body substrate (semiconductor substrate) having no insulator portion is used.

Furthermore, on the element formation surface 2*a*, which is one surface of the substrate 2, both the external connection electrodes 4B and 5B of the first electrode 4 and the second electrode 5 are formed. Hence, as shown in FIG. 74, the element formation surface 2*a* is made to face a mounting substrate 91, the external connection electrodes 4B and 5B are bonded on the mounting substrate 91 by a solder 92 and thus it is possible to form a circuit assembly in which the chip inductor 1B is surface-mounted on the mounting substrate 91. In other words, it is possible to provide a flip-chip connection-type chip inductor 1B, and it is possible to connect the chip inductor 1B to the mounting substrate 91 by a face-down bonding in which the element formation surface 2*a* is made to face the mounting substrate 91 and wireless bonding. In this way, it is possible to decrease the occupied space of the chip inductor 1B on the mounting substrate 91. In particular, it is possible to realize a low profile chip inductor 1 on the mounting substrate 91. In this way, it is possible to effectively utilize the space within the housing of a small-sized electronic device or the like and to contribute to high-density mounting and miniaturization.

FIGS. 75A and 75B are cross-sectional views showing a modification example of the external connection electrode for the chip inductors 1A and 1B of the second preferred embodiment (a preferred embodiment of the third invention) and the third preferred embodiment of the second invention. FIG. 75A shows a cut surface corresponding to FIG. 52 (FIG. 66), and FIG. 75B shows a cut surface corresponding to FIG. 55 (FIG. 69). In FIGS. 75A and 75B, the portions corresponding to the portions of FIGS. 52 (66) and 55 (69) described previously are provided with the same symbols of FIGS. 52 (66) and 55 (69).

The first external connection electrode 4B fills one cutout portion 18 in the passivation film 16 and the resin film 17, and the second external connection electrode 5B fills the other cutout portion 19.

The first external connection electrode 4B is formed so as to cover the upper portion of the passivation film 9 on the side of one end portion of the substrate 2 and to straddle, from the peripheral portion of the surface of the insulating film 8, the surface of the passivation film 9 covering the three side surfaces 2*c* on the side of one end portion of the substrate 2. In other words, the first external connection electrode 4B is formed so as to cover not only the surface of the first electrode film 4A (the pad 4Ab) and the insulating film 8 exposed within the cutout portion 18 but also the passivation film 9 on the three side surfaces 2*c* of the substrate 2.

Likewise, the second external connection electrode 5B is formed so as to cover the upper portion of the passivation film 9 on the side of the other end portion of the substrate 2 and to straddle, from the peripheral portion of the surface of the insulating film 8, the surface of the passivation film 9 covering the three side surfaces 2*c* on the side of the other end portion of the substrate 2. In other words, the second external connection electrode 5B is formed so as to cover not only the surface of the second electrode film 5A (the pad 5Ab) and the insulating film 8 exposed within the cutout portion 19 but also the passivation film 9 on the three side surfaces 2*c* on the side of the other end portion of the substrate 2.

As described above, in the chip inductors 1A and 1B, the first external connection electrode 4B is formed so as to cover the three side surfaces 2*c* on the side of one end portion of the substrate 2, and the second external connection electrode 5B is formed so as to cover the three side surfaces 2*c* on the side of the other end portion of the substrate 2. In other words, the external connection electrodes 4B and 5B are formed not only on the element formation surface 2*a* on the substrate 2 but also on the side surfaces 2*c* of the substrate 2. In this way, in the form shown in FIG. 59 or FIG. 74 described previously, when the external connection electrodes 4B and 5B of the chip inductors 1A and 1B are soldered to the mounting substrate, it is possible to increase the bonding area between the external connection electrodes 4B and 5B and the mounting substrate. Consequently, it is possible to enhance the bonding strength of the external connection electrodes 4B and 5B on the mounting substrate.

Even in the third preferred embodiment of the second invention, the structure of the conductive member 51 embedded within the coil formation trench 11 may be the structure shown in FIGS. 48A and 48B described as the modification example of the conductive member 51 of the first preferred embodiment of the second invention.

FIG. 76A is a partially cut perspective view of a chip inductor according to a fourth preferred embodiment of the second invention, and FIG. 76B is a perspective view showing a coil formed within the chip inductor.

The chip inductor 1C is a minute chip part and is formed in the shape of a rectangular parallelepiped. The planar shape of the chip inductor 1C may be rectangular, the length L in the longitudinal direction may be about 0.4 mm and the length W in the lateral direction may be about 0.2 mm. The thickness T of the entire chip inductor 1C may be about 0.15 mm.

The chip inductor 1C includes a substrate 2, a coil 3 that is formed within the substrate 2, a first electrode 4 that is connected to one end portion of the coil 3 and a second electrode 5 that is connected to the other end portion of the coil 3.

FIG. 77 is a plan view of the chip inductor, FIG. 78 is a cross-sectional view taken along line LXXVIII-LXXVIII in FIG. 77, FIG. 79 is a partially enlarged cross-sectional view of FIG. 78, FIG. 80 is a cross-sectional view taken along line LXXX-LXXX in FIG. 77, FIG. 81 is a cross-sectional view taken along line LXXXI-LXXXI in FIG. 77 and FIG. 82 is a plan view showing a structure of the surface of a substrate by removing an arrangement formed on the surface of the substrate.

The substrate 2 is formed in the shape of a rectangular parallelepiped, and includes a pair of main surfaces 2*a* and 2*b* and four side surfaces 2*c*. One (the main surface 2*a* on the upper surface side in FIG. 76A) of the pair of main surfaces 2*a* and 2*b* is an element formation surface. In the following description, the main surface 2*a* is referred to as an "element formation surface 2*a*," and the main surface 2*b* on the side opposite to the element formation surface 2*a* is referred to as a "rear surface 2*b*." In the preferred embodiment, the substrate 2 is formed with a substrate main body 6 and an insulating film 7 formed on the surface thereof, and the surface of the insulating film 7 on the side opposite to the side of the substrate main body 6 is the element formation surface 2*a*. The element formation surface 2*a* is formed in the shape of a rectangle in plan view when seen in a normal direction perpendicular to the element formation surface 2*a*. The surface (element formation surface 2*a*) of the substrate 2 is covered by an insulating film 32. The four side surfaces 2*c* of the substrate 2 and the outer peripheral surface of the insulating film 32 are covered by a passivation film 9 such as a nitride film.

With reference to FIG. 77, in the element formation surface 2*a*, a first electrode formation region 10A for the formation of the first electrode 4 is provided at one end portion thereof, and a second electrode formation region 10B for the formation of the second electrode 5 is provided at the other end portion. These regions 10A and 10B are rectangular in plan view. In the element formation surface 2*a* between the first electrode formation region 10A and the second electrode formation region 10B, a coil formation region 10C is provided. In the preferred embodiment, the coil formation region 10C is formed in the shape of a rectangle.

In the first electrode formation region 10A, the external connection electrode (first external connection electrode) 4B of the first electrode 4 is disposed, and in the second electrode formation region 10B, the external connection electrode (second external connection electrode) 5B of the second electrode 5 is disposed. The first external connection electrode 4B is rectangular in plan view, and covers the entire region of the first electrode formation region 10A. The second external connection electrode 5B is rectangular in plan view, and covers the entire region of the second electrode formation region 10B.

In the substrate 2, a coil formation trench 11 is formed by digging down, in the coil formation region 10C, to a predetermined depth from the element formation surface 2*a*. The coil formation trench 11 is formed, in plan view, in the shape of a spiral. In the preferred embodiment, the coil formation trench 11 is formed, in plan view, in the shape of a quadrilateral spiral, and has a plurality of rectilinear portions parallel to the side surfaces 2*c* of the substrate 2. The cross section (cross section in a direction perpendicular to a direction in which the coil formation trench 11 is extended in the spiral direction) of the coil formation trench 11 is formed in the shape of a rectangle which is long in the direction of the thickness of the substrate 2. For example, the width of the coil formation trench 11 may be 1 μm or more and 3 μm or less. For example, the depth of the coil formation trench 11 may be 10 μm or more and 82 μm or less. The depth of the coil formation trench 11 is preferably 10 μm or more so that the internal resistance of the coil 3 formed within the coil formation trench 11 is decreased.

As shown in FIG. 79, the coil formation trench 11 is formed with a first trench part 11*a* that is formed in the insulating film 7 and a second trench part 11*b* that is formed in the substrate main body 6 and that communicates with the first trench part 11*a*. On the inner surface of the coil formation trench 11 (the second trench part 11*b*) in the substrate main body 6, an insulating film 12 formed with an oxide film or the like is formed. In the preferred embodiment, the insulating film 12 is formed with a thermal oxide film ($SiO_2$), and when the thermal oxide film is formed on the inner surface of the coil formation trench 11, the surrounding wall (the side wall and the bottom wall) of the coil formation trench 11 (the second trench part 11*b*) in the substrate main body 6 is thermally oxidized into an insulator portion (thermal oxide film) 30 having insulation. In the preferred embodiment, an example is described where the entire wall sandwiched by the coil formation trench 11 (the second trench part 11*b*) in the shape of a spiral in the substrate main body 6 is a thermal oxide film.

On the surface of the insulating film 12 within the coil formation trench 11 (the second trench part 11*b*) and on the inner surface of the coil formation trench 11 (the first trench part 11*a*) in the insulating film 7, a barrier metal film 13 is formed. The barrier metal film 13 is formed of, for example, TiN. The thickness of the barrier metal film 13 is about 400 to 500 angstroms. Within the coil formation trench 11, a conductive member 51 is embedded while being in contact with the barrier metal film 13. In the preferred embodiment, the conductive member 51 is formed of tungsten (W). The coil 3 is formed with the conductive member 51 embedded within the coil formation trench 11. Hence, the coil 3 is formed, in plan view, in the shape of a spiral (in the shape of a quadrilateral spiral) of the same pattern as the coil formation trench 11. Specifically, the coil 3 includes a plurality of plate-shaped parts parallel to the side surfaces 2*c* of the substrate 2.

On the element formation surface 2*a* (the surface of the insulating film 7) of the substrate 2, a wiring 31 in the shape of a spiral in plan view that is formed so as to extend along the coil 3 and cover the coil 3 is formed. The width of the wiring 31 is greater than that of the coil 3, and both side portions thereof are extended outward as compared with both sides of the coil 3. The wiring 31 is in contact with the upper end portion of the coil 3. The wiring 31 is formed of, for example, Al.

On the element formation surface 2*a* of the substrate 2, an insulating film 32 is formed so as to coat the element formation surface 2*a* and the wiring 31. The insulating film 32 is formed, in plan view, in the shape of a rectangle matching with the element formation surface 2*a*. The insulating film 32 is formed with, for example, a USG (Undoped Silicate Glass) film. In the insulating film 32, a first contact hole 14 (see FIGS. 77 and 80) that exposes one end portion (outer peripheral side end portion) of the wiring 31 and a second contact hole 15 (see FIGS. 77 and 78) that exposes the other end portion (inner peripheral side end portion) of the wiring 31 are formed. As described above, in the side surfaces 2*c* of the substrate 2 and the outer peripheral surface of the insulating film 32, the passivation film 9 formed with a nitride film or the like is formed.

On the surface of the insulating film 32, the first electrode 4 and the second electrode 5 are formed. The first electrode 4 includes a first electrode film 4A that is formed on the surface of the insulating film 32 and a first external connection electrode 4B that is bonded to the first electrode film 4A. As shown in FIG. 77, the first electrode film 4A includes a drawing electrode 4Aa that is connected to one end portion of the wiring 31 and a first pad 4Ab that is formed integrally with the drawing electrode 4Aa. The first pad 4Ab is formed to be rectangular at one end portion of the element formation surface 2*a*. The first external connection electrode 4B is connected to the first pad 4Ab. As shown in FIGS. 77 and 80, the drawing electrode 4Aa enters the first contact hole 14 from the surface of the insulating film 32, and is connected to one end portion of the wiring 31 within the first contact hole 14. The drawing electrode 5Aa is formed straight along a straight line that passes above one end portion of the wiring 31 to reach the first pad 4Ab.

By extending one end portion of the coil formation trench 11 to a position below the first pad 4Ab, one end portion of the coil 3 (the wiring 31) may be disposed in a position below the first pad 4Ab. In this way, since the first contact hole 14 can be formed in a position below the first pad 4Ab, one end portion of the coil 3 (the wiring 31) can be connected to the first pad 4Ab. In this case, since the first electrode film 4A can be formed with only the first pad 4Ab, the drawing electrode 4Aa is not needed.

The second electrode 5 includes a second electrode film 5A that is formed on the surface of the insulating film 32 and a second external connection electrode 5B that is bonded to the second electrode film 5A. As shown in FIG. 77, the second electrode film 5A includes a drawing electrode 5Aa that is connected to the other end portion of the wiring 31 and a second pad 5Ab that is formed integrally with the drawing electrode 5Aa. The second pad 5Ab is formed to be rectangular at the other end portion of the element formation surface 2*a*. The second external connection electrode 5B is connected to the second pad 5Ab. As shown in FIGS. 77 and 78, the drawing electrode 5Aa enters the second contact hole 15 from the surface of the insulating film 32, and is connected to the other end portion of the wiring 31 within the second contact hole 15. The drawing electrode 5Aa is formed straight along a straight line that passes above the other end portion of the wiring 31 to reach the second pad 5Ab. In the preferred embodiment, as the electrode films 4A and 5A, Al films are used.

The first electrode film 4A and the second electrode film 5A are covered by a passivation film 16 formed with, for example, a nitride film (SiN), and furthermore, on the passivation film 16, a resin film 17 such as polyimide is formed. In the passivation film 16 and the resin film 17, two cutout portions 18 and 19 are formed that respectively expose a region other than an edge portion on the inner side of the surface of the first pad 4Ab of the first electrode film 4A and a region other than an edge portion on the inner side of the surface of the second pad 5Ab of the second electrode film 5A. In other words, the passivation film 16 and the resin film 17 are formed, in plan view, in a region corresponding to the coil formation region 10C of the element formation surface 2*a*, and cover the insulating film 32, the edge portion on the inner side of the surface of the first pad 4Ab, and the edge portion on the inner side of the surface of the second pad 5Ab.

The first external connection electrode 4B fills the cutout portion 18, and the second external connection electrode 5B fills the cutout portion 19. The first external connection electrode 4B and the second external connection electrode 5B are formed so as to protrude from the resin film 17, and include a drawing portion 20 that is drawn inwardly of the substrate 2 along the surface of the resin film 17. In the preferred embodiment, the first external connection electrode 4B is formed so as to cover not only the surface of the first electrode film 4A (the pad 4Ab) and the insulating film 32 exposed within the cutout portion 18 but also the upper end surface of the passivation film 9 on the side of one end portion of the substrate 2. The three side surfaces other than the side surface on the inner side of the first external connection electrode 4B are formed so as to be flush with the surface of the passivation film 9 covering the peripheral surface of the insulating film 32 on the side of one end portion of the substrate 2.

Likewise, the second external connection electrode 5B is formed so as to cover not only the surface of the second electrode film 5A (the pad 5Ab) and the insulating film 32 exposed within the cutout portion 19 but also the upper end surface of the passivation film 9 on the side of the other end portion of the substrate 2. The three side surfaces other than the side surface on the inner side of the second external connection electrode 5B are formed so as to be flush with the surface of the passivation film 9 covering the peripheral surface of the insulating film 32 on the side of the other end portion of the substrate 2. The external connection electrodes 4B and 5B may be, for example, formed with a Ni/Pd/Au laminated film having a Ni film in contact with the electrode films 4A and 5A, a Pd film formed thereon, and an Au film formed thereon. The laminated film described above can be formed by a plating method.

The passivation film 16 and the resin film 17 coat, from the surface, the coil 3, the insulating film 32, the first electrode film 4A, and the second electrode film 5A in the coil formation region 10C of the element formation surface 2*a*, and function as a protective film to protect them. On the other hand, the passivation film 9 formed on the side surfaces 2*c* of the substrate 2 and the outer peripheral surface of the insulating film 32 function as a protective film to protect the side surfaces 2*c* of the substrate 2 and the outer peripheral surface of the insulating film 32.

FIG. 83 is an electrical circuit diagram showing an electrical structure within the chip inductor 1C. One end of the coil 3 (represented by a symbol L in FIG. 83) is connected to the first electrode 4, and the other end of the coil 3 is connected to the second electrode. In this way, the chip inductor functions as an inductor having a predetermined inductance.

As a parameter indicating the performance (quality) of the coil, the Q (Quality Factor) value of the coil is present. As the Q value is increased, its loss is decreased, and an excellent characteristic is provided as a high-frequency inductance.

The Q value of the coil 3 is represented by formula (4) below.

$$Q=2\pi fL/R \tag{4}$$

In the formula (4) above, f represents the frequency of a current flowing through the coil, L represents the inductance of the coil 3, and R represents the internal resistance of the coil 3.

In the arrangement of the fourth preferred embodiment of the second invention, in the substrate 2, the coil formation trench 11 obtained by digging down from the element formation surface 2*a* is formed, in plan view, in the shape of a spiral, the conductive member 51 is embedded within the coil formation trench 11 and thus the coil 3 is formed. Hence, it is possible to increase the cross-sectional area of the coil 3 (the cross-sectional area of the coil 3 perpendicular to the direction in which the coil 3 is extended in the spiral direction), and thus it is possible to decrease the internal resistance (R in the formula (4) above) of the coil 3. In this way, since the Q value of the coil 3 can be increased, it is possible to provide a high-performance chip inductor.

The coil formation trench 11 is formed in the substrate 2, the conductive member 51 is embedded within the coil formation trench 11 and thus it is possible to form the coil 3, with the result that the coil 3 is easily manufactured. In this way, it is possible to provide a chip transformer that is easily manufactured.

In the fourth preferred embodiment of the second invention, the chip inductor 1C is formed on the element formation surface 2 along the coil 3, and includes the wiring 31 in contact with the upper end portion of the coil 3. Hence, even when an area is produced where the conductive member 51 is unsatisfactorily embedded within the coil formation trench 11, it is possible to compensate for the area with the wiring 31. In this way, even when the conductive member 51 is unsatisfactorily embedded within the coil formation trench 11, and thus a break is produced halfway along the coil 3, the break can be connected by the wiring 31.

Furthermore, on the element formation surface 2*a*, which is one surface of the substrate 2, both the external connection electrodes 4B and 5B of the first electrode 4 and the second electrode 5 are formed. Hence, as shown in FIG. 84, the element formation surface 2*a* is made to face a mounting substrate 91, the external connection electrodes 4B and 5B are bonded on the mounting substrate 91 by a solder 92 and thus it is possible to form a circuit assembly in which the chip inductor 1C is surface-mounted on the mounting substrate 91. In other words, it is possible to provide a flip-chip connection-type chip inductor 1C, and it is possible to connect the chip inductor 1C to the mounting substrate 91 by a face-down bonding in which the element formation surface 2*a* is made to face the mounting substrate 91 and wireless bonding. In this way, it is possible to decrease the occupied space of the chip inductor 1C on the mounting substrate 91. In particular, it is possible to realize a low profile chip inductor 1C on the mounting substrate 91. In this way, it is possible to effectively utilize the space within the housing of a small-sized electronic device or the like and to contribute to high-density mounting and miniaturization.

FIGS. 85A to 85M are cross-sectional views for illustrating an example of the manufacturing step of the chip inductor 1C, and show cut surfaces corresponding to FIG. 78. FIGS. 86A to 86F are partially enlarged cross-sectional views showing the details of the manufacturing step of a coil, and show cut surfaces corresponding to FIG. 79.

As shown in FIG. 85A, first, an original substrate 50 that is an original of the substrate main body 6 is prepared. On the surface of the original substrate 50, the insulating film 7 such as a thermal oxide film or a CVD oxide film is formed. In the preferred embodiment, the insulating film 7 is a thermal oxide film. The surface of the insulating film 7 corresponds to the element formation surface 2*a* of the substrate 2.

FIG. 87 is a schematic plan view of part of the original substrate 50 in which the insulating film 7 is formed on the surface. As shown in FIG. 87, in the element formation surface 2*a*, chip inductor regions X corresponding to a plurality of chip inductors 1C are disposed in a matrix. Between the chip inductor regions X adjacent to each other, a boundary region Y is provided. The boundary region Y is a region in the shape of a band having a substantially constant width, extends in two directions perpendicular to each other and is formed in a lattice shape. After necessary steps are performed on the original substrate 50 in which the insulating film 7 is formed on the surface, the original substrate 50 is separated along the boundary region Y, and thus it is possible to obtain a plurality of chip inductors 1C.

The steps performed on the original substrate 50 in which the insulating film 7 is formed on the surface are as follows. First, by photolithography and etching, a part of the insulating film 7 that corresponds to a region in which the coil formation trench 11 needs to be formed is removed. In this way, in the insulating film 7, the first trench part 11*a* is formed. Then, a hard mask formed with the insulating film 7 is used, and thus the original substrate 50 is etched. In this way, as shown in FIGS. 85B and 86A, the second trench part 11*b* is formed in the original substrate 50. In this way, in the insulating film 7 and the original substrate 50, the coil formation trench 11 formed with the first trench part 11*a* and the second trench part 11*b* is formed. The coil formation trench 11 may be formed by, for example, a so-called BOSCH process. The BOSCH process is a process that is generally used to make a hollow part in a MEMS (Micro Electro Mechanical System).

Then, as shown in FIGS. 85B and 86B, on the inner surface of the coil formation trench 11, the insulating film (thermal oxide film) 12 is formed by a thermal oxidization method. Here, the surrounding wall (the side wall and the bottom wall) of the coil formation trench 11 (the second trench part 11*b*) in the original substrate 50 is thermally oxidized into an insulator portion (thermal oxide film) 30 having insulation. In FIG. 85B, the insulating film 12 is omitted but the insulator portion 30 is shown. In the preferred embodiment, the entire wall sandwiched by the coil formation trench 11 (the second trench part 11*b*) in the shape of a spiral in the original substrate 50 is formed into the thermal oxide film.

Then, for example, by a sputtering method, the barrier metal film 13 made of TiN is formed on the element formation surface 2*a* including the interior of the coil formation trench 11. In this way, then, as shown in FIG. 86C, the barrier metal film 13 is formed on the surfaces of the insulating film 12 and the insulating film 7 within the coil formation trench 11 and the surface of the insulating film 7 outside the coil formation trench 11. Thereafter, annealing processing is performed. Thereafter, as shown in FIGS. 85C and 86D, for example, by a CVD method, on the element formation surface 2*a* including the interior of the coil formation trench 11, the conductive member 51 formed of tungsten (W) is deposited.

Then, for example, by an etch back method, overall etching is performed on the conductive member 51 from its surface. The overall etching is continued until the surface of the conductive member 51 is flush with the surface of the insulating film 7. In this way, as shown in FIGS. 85D and 86E, the conductive member 51 is embedded within the coil formation trench 11 while in contact with the barrier metal film 13. By the conductive member 51 embedded within the coil formation trench 11, the coil 3 in the shape of a spiral when seen in plan view is formed.

Then, for example, by sputtering, on the insulating film 7 (the element formation surface 2*a*), a wiring film for the formation of the wiring 31 is formed. In the preferred embodiment, the wiring film made of Al is formed. Thereafter, by photolithography and etching, the wiring film is patterned, and thus as shown in FIGS. 85E and 86F, the wiring 31 is formed on the coil 3. The wiring 31 is formed, in plan view, in the shape of a spiral of substantially the same pattern as the coil 3 and is in contact with the upper end portion of the coil 3.

Then, as shown in FIG. 85F, on the element formation surface 2*a*, the insulating film 32 formed with a USG (Undoped Silicate Glass) film or the like is formed so as to coat the element formation surface 2*a* and the wiring 31. The insulating film 32 is formed by, for example, a CVD method. Thereafter, by photolithography and etching, in regions of the insulating film 32 corresponding to one end portion and the other end portion of the wiring 31, the first contact hole 14 (see FIG. 80) and the second contact hole 15 (see FIG. 85F) penetrating the insulating film 32 are respectively formed.

Then, for example, by sputtering, on the insulating film 32 including the interiors of the contact holes 14 and 15, an electrode film forming the first electrode 4 and the second electrode 5 is formed. In the preferred embodiment, the electrode film made of Al is formed. Thereafter, by photolithography and etching, the electrode film is patterned, and thus as shown in FIG. 85G, the electrode film is separated into the first electrode film 4A and the second electrode film 5A.

Then, as shown in FIG. 85H, for example, by a CVD method, the passivation film 16 such as a nitride film is formed, and furthermore, polyimide is applied to form the resin film 17. For example, polyimide to which photosensitivity is added is applied, and the polyimide is developed after exposure with a pattern corresponding to the cutout portions 18 and 19. In this way, the resin film 17 having a cutout portion corresponding to the cutout portions 18 and 19 is formed. Thereafter, as necessary, heat treatment for curing the resin film is performed. Then, by dry etching using the resin film 17 as a mask, the cutout portions 18 and 19 are formed in the passivation film 16.

Then, as shown in FIG. 85I, a resist mask 52 having an opening 52*a* in a lattice shape matching with the boundary region Y (see FIG. 87) is formed. Plasma etching is performed via the resist mask 52, and thus as shown in FIG. 85I, the original substrate 50, the insulating film 7, and the insulating film 32 are etched from the surface of the insulating film 32 to a predetermined depth. In this way, along the boundary region Y, a groove (scribe groove) 53 for cutting is formed.

Then, the resist mask 52 is peeled off. Thereafter, as shown in FIG. 85J, for example, by a CVD method, an insulating film 54 formed with a nitride film or the like serving as the material of the passivation film 9 is formed over the entire region of the surface of the original substrate 50. Here, the insulating film 54 is also formed over the entire region of the inner surface (the side wall surface and the bottom wall surface) of the groove 53.

Then, as shown in FIG. 85K, the insulating film 54 is selectively etched. Specifically, a part of the insulating film 54 other than the insulating film 54 (the passivation film 9) on the side wall surface of the groove 53 is removed. In this way, a part of the electrode films 4A and 5A that is not covered by the passivation film 16 and the resin film 17 is exposed. The insulating film 54 on the bottom surface of the groove 53 is removed.

Then, as shown in FIG. 85L, on the first electrode film 4A (the first pad 4Ab) and the second electrode film 5A (the second pad 5Ab) exposed from the cutout portions 18 and 19, for example, by plating (preferably, electroless plating), plating growth is performed in the following order: for example, Ni, Pd and Au. In this way, the first external connection electrode 4B and the second external connection electrode 5B are formed.

Thereafter, by a DBG (Dicing Before Grinding) method, a plurality of chip inductor regions X are divided into pieces. Specifically, as shown in FIG. 85M, first, on the side of the surface of the original substrate 50 (the side of the external connection electrode), a supporting tape 71 having an adhesive surface 72 is adhered. Then, the original substrate 50 is polished from the rear surface to the bottom surface of the groove 53. In this way, the plurality of chip inductor regions X are separated into individual chip inductors 1C. Thereafter, on a plurality of chip inductors 1C, the recovery step shown in FIGS. 45A to 45D or the recovery step shown in FIGS. 46A to 46C described in the first preferred embodiment of the second invention may be performed.

FIGS. 88A and 88B are cross-sectional views showing a modification example of the external connection electrode for the chip inductor 1C of the fourth preferred embodiment of the second invention. FIG. 88A shows a cut surface corresponding to FIG. 78, and FIG. 88B shows a cut surface corresponding to FIG. 81. In FIGS. 88A and 88B, the portions corresponding to the portions of FIGS. 78 and 81 described previously are provided with the same symbols of FIGS. 78 and 81.

The first external connection electrode 4B fills one cutout portion 18 in the passivation film 16 and the resin film 17, and the second external connection electrode 5B fills the other cutout portion 19.

The first external connection electrode 4B is formed so as to cover the upper portion of the passivation film 9 on the side of one end portion of the substrate 2 and to straddle, from the peripheral portion of the surface of the insulating film 32, the surface of the passivation film 9 covering the three side surfaces 2*c* on the side of one end portion of the substrate 2. In other words, the first external connection electrode 4B is formed so as to cover not only the surface of the first electrode film 4A (the pad 4Ab) and the insulating film 32 exposed within the cutout portion 18 but also the passivation film 9 on the three side surfaces 2*c* of the substrate 2.

Likewise, the second external connection electrode 5B is formed so as to cover the upper portion of the passivation film 9 on the side of the other end portion of the substrate 2 and to straddle, from the peripheral portion of the surface of the insulating film 32, the surface of the passivation film 9 covering the three side surfaces 2*c* on the side of the other end portion of the substrate 2. In other words, the second external connection electrode 5B is formed so as to cover not only the surfaces of the second electrode film 5A (the pad 5Ab) and the insulating film 32 exposed within the cutout portion 19 but also the passivation film 9 on the three side surfaces 2*c* on the side of the other end portion of the substrate 2.

As described above, in the chip inductor 1C, the first external connection electrode 4B is formed so as to cover the three side surfaces 2*c* on the side of one end portion of the substrate 2, and the second external connection electrode 5B is formed so as to cover the three side surfaces 2*c* on the side of the other end portion of the substrate 2. In other words, the external connection electrodes 4B and 5B are formed not only on the element formation surface 2*a* on the substrate 2 but also on the side surfaces 2*c* of the substrate 2. In this way, in the form shown in FIG. 84 described previously, when the external connection electrodes 4B and 5*b* of the chip inductor 1C are soldered to the mounting substrate, it is possible to increase the bonding area between the external connection electrodes 4B, and 5B and the mounting substrate. Consequently, it is possible to enhance the bonding strength of the external connection electrodes 4B and 5B on the mounting substrate.

Even in the fourth preferred embodiment of the second invention, as in the second preferred embodiment of the second invention, in the step of forming the coil formation trench 11, the electrode-side trench (concave portion formation trench) 21 may be formed in only one of the first and second electrode formation regions 10A and 10B. Thus, in any one of the first electrode 4 (the first external connection electrode 4B) and the second electrode 5 (the second external connection electrode 5B), the concave portions 84 can be formed on the surface. In this way, it is possible to easily determine the polarity direction of the chip inductor.

Even in the fourth preferred embodiment of the second invention, as in the third preferred embodiment of the second invention, in the step of forming the coil formation trench 11, the first and second electrode-side trenches 21A and 21B may be formed in the first and second electrode formation regions 10A and 10B. Thus, substantially the entire region of the part of the substrate 2 opposite the first electrode 4 and the part of the substrate 2 opposite the second electrode 5 can be formed into an insulator portion having insulation. In this way, it is possible to reduce the parasitic capacitance formed between the substrate main body 6 and the first electrode 4, and the second electrode 5 opposite each other through the insulating film 7 as compared with the case where a main body substrate (semiconductor substrate) having no insulator portion is used.

Even in the fourth preferred embodiment of the second invention, the structure of the conductive member 51 embedded within the coil formation trench 11 may be the structure shown in FIGS. 48A and 48B described as the modification example of the conductive member 51 of the first preferred embodiment of the second invention.

Although the first to fourth preferred embodiments of the second invention and a preferred embodiment of the third invention are described above, the second invention and the third invention can be carried out with still other preferred embodiments. For example, although in the preferred embodiments described above, the coil 3 is formed with one coil formed in the shape of a spiral in plan view, the coil 3 may be formed with a plurality of coils parallel to each other (parallel coils). In this case, one end portion of the plurality of parallel coils is connected to the first electrode, and the other end portion of the plurality of parallel coils is connected to the second electrode.

FIG. 89 shows a chip inductor 1D that is formed with two coils 3A and 3B parallel to each other. In FIG. 89, portions corresponding to the portions of FIG. 34 described previously are provided with the same symbols of FIG. 34.

In the chip inductor 1D, in the substrate 2, two coil formation trenches 11A and 11B parallel to each other are formed in the shape of a spiral. The coils 3A and 3B are formed with the conductive members 51 embedded in the coil formation trenches 11A and 11B. One end portion of the two coils 3A and 3B is connected to the first electrode film 4A of the first electrode 4, and the other end portion of the coils 3A and 3B is connected to the second electrode film 5A of the second electrode 5.

FIG. 90 is an electrical circuit diagram showing an electrical structure within the chip inductor 1D. In FIG. 90, one coil 3A is represented by L1, and the other coil 3B is represented by L2. One ends of the two coils 3A and 3B are connected together to the first electrode 4, and the other ends of the two coils 3A and 3B are connected together to the second electrode 5. In other words, between the first electrode 4 and the second electrode, the two coils 3A and 3B are connected in parallel. In this way, they collectively function as one inductor.

When it is assumed that the inductance of the one coil 3A is L1 and the inductance of the other coil 3B is L2, the inductance L of the coil 3 is represented by formula (5) below.

$$L=(L1\times L2)/(L1+L2) \tag{5}$$

The Q value of the coil 3 is represented by formula (6) below.

$$Q=2\pi fL/R \tag{6}$$

In the formula (6) above, f represents the frequency of a current flowing through the coil, L represents the inductance of the coil 3, and R represents the internal resistance of the coil 3.

In the chip inductor 1D, as compared with a case where the coil 3 is formed with one coil, as the number of windings is reduced, the inductance L is reduced because the two coils are connected in parallel. However, since the internal resistance R is also reduced, it is possible to obtain a satisfactory Q value.

Although in the first to fourth preferred embodiments of the second invention and a preferred embodiment of the third invention described previously, the coil 3 (the coil formation trench 11) is formed, in plan view, in the shape of a quadrilateral spiral, as shown in FIG. 91, the coil 3 (the coil formation trench 11) may be formed, in plan view, in the shape of a circular spiral. As shown in FIG. 92, the coil 3 (the coil formation trench 11) may be formed in the shape of a polygonal spiral other than a quadrilateral such as an octagonal spiral in plan view.

The substrate 2 may be formed with a substrate made of a material having insulation.

[3] Fourth Invention

An object of the fourth invention is to provide a high performance chip transformer and a circuit assembly that includes it.

Another object of the fourth invention is to provide a method of manufacturing a high performance chip transformer.

The fourth invention has the following features.

C1. A chip transformer including: a substrate that has an element formation surface; a primary coil formation trench and a secondary coil formation trench that are formed in the substrate by digging down from the element formation surface and that are formed in the shape of a spiral in plan view when seen in a normal direction perpendicular to the element formation surface; a primary coil that is formed with a conductive member embedded within the primary coil formation trench; and a secondary coil that is formed with a conductive member embedded within the secondary coil formation trench.

Since in this arrangement, it is possible to increase the cross-sectional area of the primary coil (cross-sectional area perpendicular to a direction in which the primary coil is extended in the spiral direction), it is possible to decrease the internal resistance of the primary coil. Likewise, since it is possible to increase the cross-sectional area of the secondary coil (cross-sectional area perpendicular to a direction in which the secondary coil is extended in the spiral direction), it is possible to decrease the internal resistance of the secondary coil. In this way, it is possible to increase the Q (Quality Factor) value of the primary coil and the secondary coil, with the result that it is possible to provide a high performance chip transformer.

In the substrate, the primary coil formation trench and the secondary coil formation trench are formed, the conductive member is embedded within each of the coil formation trenches and thus it is possible to form the primary coil and the secondary coil, with the result that it is easy to manufacture the primary coil and the secondary coil. In this way, it is possible to provide a chip transformer that is easily manufactured.

C2. The chip transformer described in "C1" further including: a first electrode and a second electrode which are disposed on the element formation surface and to which one end portion and the other end portion of the primary coil are electrically connected; and a third electrode and a fourth electrode which are disposed on the element formation surface and to which one end portion and the other end portion of the secondary coil are electrically connected.

C3. A chip transformer described in "C1" or "C2," where in the element formation surface, a primary side formation region and a secondary side formation region are provided and arrayed in one direction along the surface thereof, in the primary side formation region, the primary coil formation trench is formed and in the secondary formation region, the secondary coil formation trench is formed.

C4. A chip transformer described in "C3," where the primary side formation region and the secondary side formation region are formed, in plan view, in the shape of a rectangle which is long in one direction, at one end portion of the primary side formation region, the first electrode is disposed, at the other end portion, the second electrode is disposed, at one end portion of the secondary side formation region, the third electrode is disposed, and at the other end portion, the fourth electrode is disposed.

C5. A chip transformer described in "C1" or "C2," where the primary coil formation trench and the secondary coil formation trench are disposed, in plan view, such that in a gap of the one coil formation trench, the other coil formation trench is disposed. In this arrangement, the primary coil and the secondary coil can be disposed close to each other, and thus it is possible to provide a higher performance chip transformer.

C6. A chip transformer described in "C5," where the element formation surface is formed, in plan view, in the shape of a rectangle, in a region between both side portions of the element formation surface, the primary coil formation trench and the secondary coil formation trench are formed, on the side of one end portion in one side portion of the element formation surface, the first electrode is disposed, on the side of the other end portion in the one side portion, the second electrode is disposed, on the side of one end portion in the other side portion of the element formation surface, the third electrode is disposed, and on the side of the other end portion in the other side portion, the fourth electrode is disposed.

C7. A chip transformer described in any one of "C2" to "C6" further including: an insulating film that is formed so as to cover the primary coil and the secondary coil on the element formation surface, that respectively includes a first contact hole and a second contact hole in regions corresponding to one end portion and the other end portion of the primary coil and that respectively includes a third contact hole and a fourth contact hole in regions corresponding to one end portion and the other end portion of the secondary coil, where the first electrode, the second electrode, the third electrode and the fourth electrode are formed on the insulating film, the first electrode is connected via the first contact hole to one end portion of the primary coil, the second electrode is connected via the second contact hole to the other end portion of the primary coil, the third electrode is connected via the third contact hole to one end portion of the secondary coil, and the fourth electrode is connected via the fourth contact hole to the other end portion of the secondary coil.

C8. A chip transformer described in any one of "C2" to "C7," where a plurality of concave portions are formed in only the surface of any one of a primary side electrode pair formed with the first electrode and the second electrode and a secondary side electrode pair formed with the third electrode and the fourth electrode.

When image inspection is performed on the chip transformer, light from a light source is applied to the surfaces of the individual electrodes, and images of the surfaces are imaged with a camera. In this arrangement, although a plurality of concave portions are formed in the surface of one of the primary side electrode pair and the secondary side electrode pair, a plurality of concave portions are not formed in the surface of the other electrode pair. The light incident on the surface of the electrode pair where concave portions are formed is diffusely reflected off the concave portions. On the other hand, the light incident on the surface of the electrode pair where concave portions are not formed are unlikely to be diffusely reflected off. Hence, a large difference is produced between image information (for example, brightness information) on the primary side electrode pair and image information on the secondary side electrode pair obtained with the camera. In this way, based on the image information obtained with the camera, it is possible to clearly identify the primary side electrode pair and the secondary side electrode pair. In other words, in this arrangement, at the time of the image inspection, it is possible to easily determine the primary side electrode pair and the secondary side electrode pair.

C9. A chip transformer described in "C8," where a first underlying concave portion is formed, in plan view, in the element formation surface of the substrate in the same position as the position in which the concave portion is formed.

In this arrangement, the first underlying concave portion is formed in the element formation surface of the substrate, and thus the concave portion can be formed in the surface of any one of the primary side electrode pair and the secondary side electrode pair formed on the element formation surface. In other words, the first underlying concave portion is formed in the element formation surface of the substrate, and thus the concave portion can be formed in the surface of any one of the primary side electrode pair and the secondary side electrode pair without adding a step separately forming the concave portion in the surface of any one of the primary side electrode pair and the secondary side electrode pair.

C10. A chip transformer described in "C9" further including an insulating film formed between the element formation surface and the first to fourth electrodes, where a second underlying concave portion is formed, in plan view, in the surface of the insulating film in the same position as the position in which the first underlying concave portion is formed.

In this arrangement, the first underlying concave portion is formed in the element formation surface of the substrate, and thus in the surface of the insulating film formed on the element formation surface, the second underlying concave portion can be formed. The second underlying concave portion is formed in the surface of the insulating film, and thus the concave portion can be formed in the surface of any one of the primary side electrode pair and the secondary side electrode pair formed on the insulating film.

C11. A chip transformer described in "C9" or "C10," where the plurality of concave portions are formed, per electrode in which the plurality of concave portions are formed, in plan view, in the shape of a straight line extending in one direction, are disposed at an interval in a direction perpendicular to the one direction and includes, in plan view, in the same positions as the positions in which the concave portions are formed on the element formation surface, by digging down from the element formation surface, a plurality of concave portion formation trenches formed in the substrate and conductive members embedded within the concave formation trenches, and in the surface of the conductive member within the concave formation trenches, the first underlying concave portion is formed.

In this arrangement, the plurality of concave formation trenches are formed in the substrate, and the conductive member is embedded within the concave formation trenches, with the result that it is possible to form the first underlying concave portion.

C12. A chip transformer described in "C11," where the plurality of concave formation trenches are formed in the same step as the coil formation trenches. In this arrangement, since the concave formation trenches can be formed in the same step as the coil formation trenches, it is possible to reduce the number of manufacturing steps.

C13. The chip transformer described in any one of "C1" to "C12," where a depth of the coil formation trench is 10 μm or more. In this arrangement, it is possible to increase the cross-sectional areas of the primary coil and the secondary coil, and thus it is possible to decrease the internal resistance of the primary coil and the secondary coil. In this way, it is possible to increase the Q value of the primary coil and the secondary coil.

C14. The chip transformer described in any one of "C1" to "C12," where a depth of the coil formation trench is 10 μm or more and 82 μm or less.

C15. The chip transformer described in any one of "C1" to "C14," where a width of the coil formation trench is 1 μm or more and 3 μm or less.

C16. A circuit assembly including: a mounting substrate; and the chip transformer described in any one of "C1" to "C15" mounted in the mounting substrate. In this arrangement, it is possible to provide a circuit assembly using a high performance chip inductor.

C17. The circuit assembly described in "C16," where the chip transformer is connected to the mounting substrate by wireless bonding. In this arrangement, it is possible to decrease the occupied space of the chip transformer on the mounting substrate, and thus it is possible to contribute to the high-density mounting of electronic parts.

C18. A method of manufacturing a chip transformer, the method including: a first step of forming, in a substrate having an element formation surface, by digging down from the element formation surface, a primary coil formation trench and a secondary coil formation trench in the shape of a spiral in plan view when seen in a normal direction perpendicular to the element formation surface; and a second step of embedding a conductive member within the primary coil formation trench and the secondary coil formation trench to form a primary coil within the primary coil formation trench and a secondary coil within the secondary coil formation trench.

In the manufacturing method of the present invention, within the primary coil formation trench and secondary coil formation trench formed in the substrate, the primary coil and the secondary coil can be respectively formed. Hence, it is possible to provide a chip transformer having the same effects as described in "C1" described previously.

C19. The method of manufacturing a chip transformer described in "C18," the method further including: a third step of forming an insulating layer on the element formation surface so as to coat the primary coil and the secondary coil; a fourth step of forming, in the insulating layer, a first contact hole that exposes one end portion of the primary coil, a second contact hole that exposes the other end portion of the primary coil, a third contact hole that exposes one end portion of the secondary coil, and a fourth contact hole that exposes the other end portion of the secondary coil; and a fifth step of forming, on the insulating film, a first electrode that is in contact with the one end portion of the primary coil via the first contact hole, a second electrode that is in contact with the other end portion of the primary coil via the second contact hole, a third electrode that is in contact with the one end portion of the secondary coil via the third contact hole, and a fourth electrode that is in contact with the other end portion of the secondary coil via the fourth contact hole.

In this manufacturing method, it is possible to form, on the insulating film formed on the element formation surface, the first electrode to which the one end portion of the primary coil is connected, the second electrode to which the other end portion of the primary coil is connected, the third electrode to which the one end portion of the secondary coil is connected, and the fourth electrode to which the other end portion of the secondary coil is connected.

Preferred embodiments of the fourth invention will be described in detail with reference to FIGS. 93A to 144F. The symbols in FIGS. 93A to 144F are not related to the symbols in FIGS. 1 to 92 used in the description of the first to third inventions discussed previously.

FIG. 93A is a partially cut perspective view of a chip transformer according to a first preferred embodiment of the fourth invention, and FIG. 93B is a perspective view showing the primary coil and the secondary coil formed within the chip transformer.

The chip transformer 1 is a minute chip part and is formed in the shape of a rectangular parallelepiped. The planar shape of the chip transformer 1 may be rectangular, the length L of one of adjacent two sides may be about 0.4 mm, and the length W of the other side may be about 0.4 mm. The thickness T of the entire chip transformer 1 may be about 0.15 mm.

The chip transformer 1 includes a substrate 2, a primary coil 3A and a secondary coil 3B that are formed within the substrate 2, a first electrode 41 that is connected to one end portion of the primary coil 3A, a second electrode 42 that is connected to the other end portion of the primary coil 3A, a third electrode 43 that is connected to one end portion of the secondary coil 3B, and a fourth electrode 44 that is connected to the other end of the secondary coil 3B. The number of windings of the primary coil 3A differs from the number of windings of the secondary coil 3B. Although in the preferred embodiment, an example where the number of windings of the primary coil 3A is greater than the number of windings of the secondary coil 3B is described, the number of windings of the secondary coil 3B may be greater than the number of windings of the primary coil 3A.

FIG. 94 is a plan view of the chip transformer, FIG. 95A is a cross-sectional view taken along line XCVA-XCVA in FIG. 94, FIG. 95B is a partially enlarged cross-sectional view of FIG. 95A. FIG. 96A is a cross-sectional view taken along line XCVIA-XCVIA in FIG. 94, and FIG. 96B is a partially enlarged cross-sectional view of FIG. 96A. FIG. 97 is a cross-sectional view taken along line XCVII-XCVII in FIG. 94, and FIG. 98 is a cross-sectional view taken along line XCVIII-XCVIII in FIG. 94. FIG. 99 is a plan view showing a structure of the surface of a substrate by removing an arrangement formed on the surface of the substrate.

In the following description, the "front" refers to the lower side of the plane of FIG. 94, the "back" refers to the upper side of the plane of FIG. 94, the "left" refers to the left side of the plane of FIG. 94, and the "right" refers to the right side of the plane of FIG. 94.

The substrate 2 is formed in the shape of a rectangular parallelepiped, and includes a pair of main surfaces 2*a* and 2*b* and four side surfaces 2*c*. One (the main surface 2*a* on the upper surface side in FIG. 93A) of the pair of main surfaces 2*a* and 2*b* is an element formation surface. In the following description, the main surface 2*a* is referred to as an "element formation surface 2*a*," and the main surface 2*b* on the side opposite to the element formation surface 2*a* is referred to as a "rear surface 2*b*." In the preferred embodiment, the substrate 2 is formed with a substrate main body 6 and an insulating film 7 formed on the surface thereof, and the surface of the insulating film 7 on the side opposite to the side of the substrate main body 6 is the element formation surface 2*a*. In the preferred embodiment (the same is true in the other preferred embodiments of the fourth invention), the substrate main body 6 is formed with a silicon substrate, and the insulating film 7 is formed with a thermal oxide film ($SiO_2$). The element formation surface 2*a* is formed in the shape of a rectangle in plan view when seen in a normal direction perpendicular to the element formation surface 2*a*. The surface (element formation surface 2*a*) of the substrate 2 is covered by an insulating film 8. The four side surfaces 2*c* of the substrate 2 and the outer peripheral surface of the insulating film 8 are covered by a passivation film 9 such as a nitride film.

With reference to FIGS. 94 and 99, in the front half of the element formation surface 2*a*, a primary side formation region 45 for the formation of the primary side circuit of the transformer is provided, and in the back half, a secondary side formation region 46 for the formation of the secondary side circuit of the transformer is provided. Each of the regions 45 and 46 is formed, in plan view, in the shape of a rectangle which is long in a left/right direction. In one end portion (left side end portion) of the primary side formation region 45, a first electrode formation region 45A is provided, and in the other end portion (right side end portion), a second electrode formation region 45B is provided. In one end portion (left side end portion) of the secondary side formation region 46, a third electrode formation region 46A is provided, and in the other end portion (right side end portion), a fourth electrode formation region 46B is provided.

In the first electrode formation region 45A, the external connection electrode (first external connection electrode) 41B of the first electrode 41 is disposed, and in the second electrode formation region 45B, the external connection electrode (second external connection electrode) 42B of the second electrode 42 is disposed. The first external connection electrode 41B is rectangular in plan view, and covers the region of the first electrode formation region 45A other than an edge portion on the side of the third electrode formation region 46A. The second external connection electrode 42B is rectangular in plan view, and covers the region of the second electrode formation region 45B other than an edge portion on the side of the fourth electrode formation region 46B. On the element formation surface 2*a* between the external connection electrodes 41B and 42B, a primary coil formation region 45C is provided. In the preferred embodiment, the primary coil formation region 45C is formed in the shape of a rectangle.

In the third electrode formation region 46A, the external connection electrode (third external connection electrode) 43B of the third electrode 43 is disposed, and in the fourth electrode formation region 46B, the external connection electrode (fourth external connection electrode) 44B of the fourth electrode 44 is disposed. The third external connection electrode 43B is rectangular in plan view, and covers the region of the third electrode formation region 46A other than an edge portion on the side of the first electrode formation region 45A. The fourth external connection electrode 44B is rectangular in plan view, and covers the region of the fourth electrode formation region 46B other than an edge portion on the side of the second electrode formation region 45B. On the element formation surface 2 *a* between the external connection electrodes 43B and 44B, a secondary coil formation region 46C is provided. In the preferred embodiment, the secondary coil formation region 46C is formed in the shape of a rectangle.

With reference to FIGS. 94, 95A, 95B, 97 and 99, in the substrate 2, the coil formation trench 11A is formed by digging down, in the primary coil formation region 45C, to a predetermined depth from the element formation surface 2*a*. The primary coil formation trench 11A is formed, in plan view, in the shape of a spiral. In the preferred embodiment, the primary coil formation trench 11A is formed, in plan view, in the shape of a quadrilateral spiral, and has a plurality of rectilinear portions parallel to the side surfaces 2*c* of the substrate 2.

The cross section (cross section in a direction perpendicular to a direction in which the primary coil formation trench 11A is extended in the spiral direction) of the primary coil formation trench 11A is formed in the shape of a rectangle which is long in the direction of the thickness of the substrate 2. For example, the width of the primary coil formation trench 11A may be 1 μm or more and 3 μm or less. For example, the depth of the primary coil formation trench 11A may be 10 μm or more and 82 μm or less. The depth of the primary coil formation trench 11A is preferably 10 μm or more so that the internal resistance of the primary coil 3A formed within the primary coil formation trench 11A is decreased.

As shown in FIG. 95B, the primary coil formation trench 11A is formed with a first trench part 11Aa that is formed in the insulating film 7 and a second trench part 11Ab that is formed in the substrate main body 6 and that communicates with the first trench part 11Aa. On the inner surface of the primary coil formation trench 11A (the second trench part 11Ab) in the substrate main body 6, an insulating film 12 formed with an oxide film or the like is formed. In the preferred embodiment, the insulating film 12 is formed with a thermal oxide film ($SiO_2$), and when the thermal oxide film is formed on the inner surface of the primary coil formation trench 11A, the surrounding wall (the side wall and the bottom wall) of the primary coil formation trench 11A (the second trench part 11Ab) in the substrate main body 6 is thermally oxidized into an insulator portion (thermal oxide film) 30 having insulation. In the preferred embodiment, an example is described where the entire wall sandwiched by the primary coil formation trench 11A (the second trench part 11Ab) in the shape of a spiral in the substrate main body 6 is a thermal oxide film.

On the surface of the insulating film 12 within the primary coil formation trench 11A (the second trench part 11Ab) and on the inner surface of the primary coil formation trench 11A (the first trench part 11Aa) in the insulating film 7, a barrier metal film 13 is formed. The barrier metal film 13 is formed of, for example, TiN. The thickness of the barrier metal film 13 is about 400 to 500 angstroms. Within the primary coil formation trench 11A, a conductive member 51 is embedded while being in contact with the barrier metal film 13. In the preferred embodiment, the conductive member 51 is formed of tungsten (W). The primary coil 3A is formed with the conductive member 51 embedded within the primary coil formation trench 11A. Hence, the primary coil 3A is formed, in plan view, in the shape of a spiral (in the shape of a quadrilateral spiral) of the same pattern as the primary coil formation trench 11A. Specifically, the primary coil 3A includes a plurality of plate-shaped parts parallel to the side surfaces 2*c* of the substrate 2.

With reference to FIGS. 94, 96A, 96B, 97 and 99, in the substrate 2, the secondary coil formation trench 11B is formed by digging down, in the secondary coil formation region 46C, to a predetermined depth from the element formation surface 2*a*. The secondary coil formation trench 11B is formed, in plan view, in the shape of a spiral. In the preferred embodiment, the secondary coil formation trench 11B is formed, in plan view, in the shape of a quadrilateral spiral, and has a plurality of rectilinear portions parallel to the side surfaces 2*c* of the substrate 2. The number of windings of the secondary coil formation trench 11B is less than the number of windings of the primary coil formation trench 11A.

The cross section (cross section in a direction perpendicular to a direction in which the secondary coil formation trench 11B is extended in the spiral direction) of the secondary coil formation trench 11B is formed in the shape of a rectangle which is long in the direction of the thickness of the substrate 2. For example, the width of the secondary coil formation trench 11B may be 1 μm or more and 3 μm or less. For example, the depth of the secondary coil formation trench 11B may be 10 μm or more and 82 μm or less. The depth of the secondary coil formation trench 11B is preferably 10 μm or more so that the internal resistance of the secondary coil 3B formed within the secondary coil formation trench 11B is decreased.

As shown in FIG. 96B, the secondary coil formation trench 11B is formed with a first trench part 11Ba that is formed in the insulating film 7 and a second trench part 11Bb that is formed in the substrate main body 6 and that communicates with the first trench part 11Ba. On the inner surface of the secondary coil formation trench 11B (the second trench part 11Bb) in the substrate main body 6, an insulating film 12 formed with an oxide film or the like is formed. In the preferred embodiment, the insulating film 12 is formed with a thermal oxide film ($SiO_2$), and when the thermal oxide film is formed on the inner surface of the secondary coil formation trench 11B, the surrounding wall (the side wall and the bottom wall) of the secondary coil formation trench 11B (the second trench part 11Bb) in the substrate main body 6 is thermally oxidized into an insulator portion (thermal oxide film) 30 having insulation. In the preferred embodiment, an example is described where the entire wall sandwiched by the secondary coil formation trench 11B (the second trench part 11Bb) in the shape of a spiral in the substrate main body 6 is a thermal oxide film.

On the surface of the insulating film 12 within the secondary coil formation trench 11B (the second trench part 11Bb) and on the inner surface of the secondary coil formation trench 11B (the first trench part 11Ba) in the insulating film 7, a barrier metal film 13 is formed. The barrier metal film 13 is formed of, for example, TiN. The thickness of the barrier metal film 13 is about 400 to 500 angstroms. Within the secondary coil formation trench 11B, a conductive member 51 is embedded while being in contact with the barrier metal film 13. In the preferred embodiment, the conductive member 51 is formed of tungsten (W). The secondary coil 3B is formed with the conductive member 51 embedded within the secondary coil formation trench 11B. Hence, the secondary coil 3B is formed, in plan view, in the shape of a spiral (in the shape of a quadrilateral spiral) of the same pattern as the secondary coil formation trench 11B. Specifically, the secondary coil 3B includes a plurality of plate-shaped parts parallel to the side surfaces 2*c* of the substrate 2. Hence, the number of windings of the secondary coil 3B is less than the number of windings of the primary coil 3A.

On the element formation surface 2*a* (the surface of the insulating film 7) of the substrate 2, an insulating film 8 is formed so as to coat the element formation surface 2*a* and the conductive member 51 (the coils 3A and 3B). The insulating film 8 is formed, in plan view, in the shape of a rectangle matching with the element formation surface 2*a*. The insulating film 8 is formed with, for example, a USG (Undoped Silicate Glass) film. In the insulating film 8, a first contact hole 14A (see FIGS. 94 and 97) that exposes one end portion (outer peripheral side end portion) of the primary coil 3A and a second contact hole 15A (see FIGS. 94 and 95A) that exposes the other end portion (inner peripheral side end portion) of the primary coil 3A are formed. Furthermore, in the insulating film 8, a third contact hole 14B (see FIGS. 94 and 97) that exposes one end portion (outer peripheral side end portion) of the secondary coil 3B and a fourth contact hole 15B (see FIGS. 94 and 96A) that exposes the other end portion (inner peripheral side end portion) of the secondary coil 3B are formed. As described above, in the side surfaces 2*c* of the substrate 2 and the outer peripheral surface of the insulating film 8, the passivation film 9 formed with a nitride film or the like is formed.

On the surface of the insulating film 8, the first electrode 41, the second electrode 42, the third electrode 43, and the fourth electrode 44 are formed. With reference to FIGS. 94, 95A, and 97, the first electrode 41 includes a first electrode film 41A that is formed on the surface of the insulating film 8 and a first external connection electrode 41B that is bonded to the first electrode film 41A. As shown in FIG. 94, the first electrode film 41A includes a drawing electrode 41Aa that is connected to one end portion of the primary coil 3A and a first pad 41Ab that is formed integrally with the drawing electrode 41Aa. The first pad 41Ab is formed to be rectangular at one end portion of the primary side formation region 45 of the element formation surface 2*a*. The first external connection electrode 41B is connected to the first pad 41Ab. As shown in FIGS. 94 and 97, the drawing electrode 41Aa enters the first contact hole 14A from the surface of the insulating film 8, and is connected to one end portion of the primary coil 3A within the first contact hole 14A. The drawing electrode 41Aa is formed straight along a straight line that passes above one end portion of the primary coil 3A to reach the first pad 41Ab.

By extending one end portion of the primary coil formation trench 11A to a position below the first pad 41Ab, one end portion of the primary coil 3A may be disposed in a position below the first pad 41Ab. In this way, since the first contact hole 14A can be formed in a position below the first pad 41Ab, one end portion of the primary coil 3A can be connected to the first pad 41Ab. In this case, since the first electrode film 41A can be formed with only the first pad 41Ab, the drawing electrode 41Aa is not needed.

The second electrode 42 includes a second electrode film 42A that is formed on the surface of the insulating film 8 and a second external connection electrode 42B that is bonded to the second electrode film 42A. As shown in FIG. 94, the second electrode film 42A includes a drawing electrode 42Aa that is connected to the other end portion of the primary coil 3A and a second pad 42Ab that is formed integrally with the drawing electrode 42Aa. The second pad 42Ab is formed to be rectangular at the other end portion of the primary side formation region 45 of the element formation surface 2*a*. The second external connection electrode 42B is connected to the second pad 42Ab. As shown in FIGS. 94 and 95A, the drawing electrode 42Aa enters the second contact hole 15A from the surface of the insulating film 8, and is connected to the other end portion of the primary coil 3A within the second contact hole 15A. The drawing electrode 42Aa is formed straight along a straight line that passes above the other end portion of the primary coil 3A to reach the second pad 42Ab.

With reference to FIGS. 94, 96A and 97, the third electrode 43 includes a third electrode film 43A that is formed on the surface of the insulating film 8 and a third external connection electrode 43B that is bonded to the third electrode film 43A. As shown in FIG. 94, the third electrode film 43A includes a drawing electrode 43Aa that is connected to one end portion of the secondary coil 3B and a third pad 43Ab that is formed integrally with the drawing electrode 43Aa. The third pad 43Ab is formed to be rectangular at one end portion of the secondary side formation region 46 of the element formation surface 2*a*. The third external connection electrode 43B is connected to the third pad 43Ab. As shown in FIGS. 94 and 97, the drawing electrode 43Aa enters the third contact hole 14B from the surface of the insulating film 8, and is connected to one end portion of the secondary coil 3B within the third contact hole 14B. The drawing electrode 43Aa is formed straight along a straight line that passes above one end portion of the secondary coil 3B to reach the third pad 43Ab.

By extending one end portion of the secondary coil formation trench 11B to a position below the third pad 43Ab, one end portion of the secondary coil 3B may be disposed in a position below the third pad 43Ab. In this way, since the third contact hole 14B can be formed in a position below the third pad 43Ab, one end portion of the secondary coil 3B can be connected to the third pad 43Ab. In this case, since the third electrode film 43A can be formed with only the third pad 43Ab, the drawing electrode 43Aa is not needed.

The fourth electrode 44 includes a fourth electrode film 44A that is formed on the surface of the insulating film 8 and a fourth external connection electrode 44B that is bonded to the fourth electrode film 44A. As shown in FIG. 94, the fourth electrode film 44A includes a drawing electrode 44Aa that is connected to the other end portion of the secondary coil 3B and a fourth pad 44Ab that is formed integrally with the drawing electrode 44Aa. The fourth pad 44Ab is formed to be rectangular at the other end portion of the secondary side formation region 46 of the element formation surface 2*a*. The second external connection electrode 42B is connected to the second pad 42Ab. As shown in FIGS. 94 and 96A, the drawing electrode 44Aa enters the fourth contact hole 15B from the surface of the insulating film 8, and is connected to the other end portion of the secondary coil 3B within the fourth contact hole 15B. The drawing electrode 44Aa is formed straight along a straight line that passes above the other end portion of the secondary coil 3B to reach the fourth pad 44Ab. In the preferred embodiment, as the electrode films 41A to 44A, Al films are used.

The first to fourth electrode films 41A to 44A are covered by a passivation film 16 formed with, for example, a nitride film (SiN), and furthermore, on the passivation film 16, a resin film 17 such as polyimide is formed. In the passivation film 16 and the resin film 17, in plan view, in regions corresponding to the vicinity of the first pad 41Ab, the vicinity of the second pad 42Ab, the vicinity of the third pad 43Ab, and the vicinity of the fourth pad 44Ab, first, second, third, and fourth cutout portions 18A, 19A, 18B, and 19B (see FIGS. 94, 95A, 96A, and 98) are respectively formed.

A region of the surface of the first pad 41Ab other than an edge portion on the side of the second pad 42Ab is exposed by the first cutout portion 18A. A region of the surface of the second pad 42Ab other than an edge portion on the side of the first pad 41Ab is exposed by the second cutout portion 19A. A region of the surface of the third pad 43Ab other than an edge portion on the side of the fourth pad 44Ab is exposed by the third cutout portion 18B. A region of the surface of the fourth pad 44Ab other than an edge portion on the side of the third pad 43Ab is exposed by the fourth cutout portion 19B. In other words, the passivation film 16 and the resin film 17 are formed, in plan view, in the primary coil formation region 45C and the secondary coil formation region 46C, and further in the region between the first pad 41Ab and the third pad 43Ab and the region between the second pad 42Ab and the fourth pad 44Ab, each which is the boundary portion region between the primary side formation region 45 and the secondary side formation region 46.

The first, second, third, and fourth external connection electrodes 41B, 42B, 43B, and 44B fill the first, second, third, and fourth cutout portions 18A, 19A, 18B, and 19B. The first external connection electrode 41B and the second external connection electrode 42B are formed so as to protrude from the resin film 17, and include a drawing portion 20 that is drawn to the side of the other external connection electrode along the surface of the resin film 17. Likewise, the third external connection electrode 43B and the fourth external connection electrode 44B are formed so as to protrude from the resin film 17, and include the drawing portion 20 that is drawn to the side of the other external connection electrode along the surface of the resin film 17.

In the preferred embodiment, the first external connection electrode 41B is formed so as to cover not only the surface of the first electrode film 41A (the pad 41Ab) and the insulating film 8 exposed within the first cutout portion 18A but also the upper end surface of the passivation film 9 on the side of one end portion of the primary side formation region 45. The two side surfaces other than the two side surfaces on the inner side of the first external connection electrode 41B are formed so as to be flush with the surface of the passivation film 9 covering the peripheral surface of the insulating film 8 on the side of one end portion of the primary side formation region 45.

The second external connection electrode 42B is formed so as to cover not only the surface of the second electrode film 42A (the pad 42Ab) and the insulating film 8 exposed within the second cutout portion 19A but also the upper end surface of the passivation film 9 on the side of the other end portion of the primary side formation region 45. The two side surfaces other than the two side surfaces on the inner side of the second external connection electrode 42B are formed so as to be flush with the surface of the passivation film 9 covering the peripheral surface of the insulating film 8 on the side of the other end portion of the primary side formation region 45.

The third external connection electrode 43B is formed so as to cover not only the surface of the third electrode film 43A (the pad 43Ab) and the insulating film 8 exposed within the third cutout portion 18B but also the upper end surface of the passivation film 9 on the side of the one end portion of the secondary side formation region 46. The two side surfaces other than the two side surfaces on the inner side of the third external connection electrode 43B are formed so as to be flush with the surface of the passivation film 9 covering the peripheral surface of the insulating film 8 on the side of the one end portion of the secondary side formation region 46.

The fourth external connection electrode 44B is formed so as to cover not only the surface of the fourth electrode film 44A (the pad 44Ab) and the insulating film 8 exposed within the fourth cutout portion 19B but also the upper end surface of the passivation film 9 on the side of the other end portion of the secondary side formation region 46. The two side surfaces other than the two side surfaces on the inner side of the fourth external connection electrode 44B are formed so as to be flush with the surface of the passivation film 9 covering the peripheral surface of the insulating film 8 on the side of the other end portion of the secondary side formation region 46. The external connection electrodes 41B, 42B, 43B, and 44B may be formed with a Ni/Pd/Au laminated film having a Ni film in contact with the electrode films 41A, 42A, 43A, and 44A, a Pd film formed thereon, and an Au film formed thereon. The laminated film described above can be formed by a plating method.

The passivation film 16 and the resin film 17 coat, from the surface, the coils 3A and 3B, the insulating film 8, the electrode films 41A to 44A in the coil formation region 45C and 46C on the element formation surface 2*a*, a region between the first external connection electrode 41B and the third external connection electrode 43B and a region between the second external connection electrode 42B and the fourth external connection electrode 44B, and function as a protective film to protect them. On the other hand, the passivation film 9 formed on the side surfaces 2*c* of the substrate 2 and the outer peripheral surface of the insulating film 8 functions as a protective film to protect the side surfaces 2*c* of the substrate 2 and the outer peripheral surface of the insulating film 8.

FIG. 100 is an electrical circuit diagram showing an electrical structure within the chip transformer. One end of the primary coil 3A (represented by a symbol L1 in FIG. 100) is connected to the first electrode 41, and the other end of the primary coil 3A is connected to the second electrode 42. One end of the secondary coil 3B (represented by a symbol L2 in FIG. 100) is connected to the third electrode 43, and the other end of the secondary coil 3B is connected to the fourth electrode 44. In this way, it functions as a transformer.

As a parameter indicating the performance (quality) of the transformer, the Q (Quality Factor) value of the coil is present. As the Q value of the coil is increased, its loss is decreased, and the coil has an excellent characteristic as a high-frequency inductance.

The Q value of the coils 3A and 3B is represented by formula (7) below.

$$Q=2\pi fL/R \tag{7}$$

In the formula (7) above, f represents the frequency of a current flowing through the coil, L represents the inductance of the coils 3A and 3B, and R represents the internal resistance of the coils 3A and 3B.

In the arrangement of the first preferred embodiment of the fourth invention, in the substrate 2, the primary coil formation trench 11A and the secondary coil formation trench 11B obtained by digging down from the element formation surface 2*a* are formed, in plan view, in the shape of a spiral. The conductive member 51 is embedded within the primary coil formation trench 11A and thus the primary coil 3A is formed, and the conductive member 51 is embedded within the secondary coil formation trench 11B and thus the secondary coil 3B is formed. Hence, it is possible to increase the cross-sectional area of the coils 3A and 3B (the cross-sectional area of the coils 3A and 3B perpendicular to the direction in which the coils 3A and 3B are extended in the spiral direction), and thus it is possible to decrease the internal resistance (R in the formula (7) above) of the coils 3A and 3B. In this way, since the Q value of the coils 3A and 3B can be increased, it is possible to provide a high performance chip transformer.

The coil formation trenches 11A and 11B are formed in the substrate 2, the conductive member 51 is embedded within the coil formation trenches 11A and 11B and thus it is possible to form the coils 3A and 3B, with the result that the coils 3A and 3B are easily manufactured. In this way, it is possible to provide a chip transformer that is easily manufactured.

Furthermore, on the element formation surface 2*a*, which is one surface of the substrate 2, the external connection electrodes 41B to 44B of the first to fourth electrodes 41 to 44 are formed. Hence, as shown in FIG. 101, the element formation surface 2*a* is made to face a mounting substrate 91, the external connection electrodes 41B to 44B are bonded on the mounting substrate 91 by a solder 92 and thus it is possible to form a circuit assembly in which the chip transformer 1 is surface-mounted on the mounting substrate 91. In other words, it is possible to provide a flip-chip connection-type chip transformer 1, and it is possible to connect the chip transformer 1 to the mounting substrate 91 by a face-down bonding in which the element formation surface 2*a* is made to face the mounting substrate 91 and wireless bonding. In this way, it is possible to decrease the occupied space of the chip transformer 1 on the mounting substrate 91. In particular, it is possible to realize a low profile chip transformer 1 on the mounting substrate 91. In this way, it is possible to effectively utilize the space within the housing of a small-sized electronic device or the like and to contribute to high-density mounting and miniaturization.

FIGS. 102A to 102L are cross-sectional views for illustrating an example of the manufacturing step of the chip transformer, and show cut surfaces corresponding to FIG. 95A. FIGS. 103A to 103E are partially enlarged cross-sectional views showing the details of the manufacturing step of a coil, and show cut surfaces corresponding to FIG. 95B. FIGS. 104A to 104L are cross-sectional views for illustrating an example of the manufacturing step of the chip transformer, and show cut surfaces corresponding to FIG. 96A.

As shown in FIGS. 102A and 104A, an original substrate 50 that is an original of the substrate main body 6 is prepared. On the surface of the original substrate 50, the insulating film 7 such as a thermal oxide film or a CVD oxide film is formed. In the preferred embodiment, the insulating film 7 is a thermal oxide film. The surface of the insulating film 7 corresponds to the element formation surface 2*a* of the substrate 2.

FIG. 105 is a schematic plan view of part of the original substrate 50 in which the insulating film 7 is formed on the surface. As shown in FIG. 105, in the element formation surface 2*a*, chip transformer regions X corresponding to a plurality of chip transformers 1 are disposed in a matrix. Between the chip transformer regions X adjacent to each other, a boundary region Y is provided. The boundary region Y is a region in the shape of a band having a substantially constant width, extends in two directions perpendicular to each other and is formed in a lattice shape. After necessary steps are performed on the original substrate 50 in which the insulating film 7 is formed on the surface, the original substrate 50 is separated along the boundary region Y, and thus it is possible to obtain a plurality of chip transformers 1.

The steps performed on the original substrate 50 in which the insulating film 7 is formed on the surface are as follows. First, as shown in FIGS. 102A and 104A, by photolithography and etching, a part of the insulating film 7 that corresponds to a region in which the coil formation trench 11A and the secondary coil formation trench 11B need to be formed is removed. In this way, in the insulating film 7, the first trench part 11Aa of the primary coil formation trench 11A and the first trench part 11Ba of the secondary coil formation trench 11B are formed. Then, a hard mask formed with the insulating film 7 is used, and thus the original substrate 50 is etched. In this way, as shown in FIGS. 102B, 103A, and 104B, the second trench part 11Ab of the primary coil formation trench 11A and the second trench part 11Bb of the secondary coil formation trench 11B are formed in the original substrate 50. In this way, in the insulating film 7 and the original substrate 50, the primary coil formation trench 11A and the secondary coil trench 11B are formed. The coil formation trenches 11A and 11B may be formed by, for example, a so-called BOSCH process. The BOSCH process is a process that is generally used to make a hollow part in a MEMS (Micro Electro Mechanical System).

Then, as shown in FIGS. 102B, 103B, and 104B, on the inner surface of the coil formation trenches 11A and 11B, the insulating film (thermal oxide film) 12 is formed by a thermal oxidization method. Here, the surrounding wall (the side wall and the bottom wall) of the primary coil formation trench 11A (the second trench part 11Ab) in the original substrate 50 is thermally oxidized into an insulator portion (thermal oxide film) 30 having insulation. Likewise, the surrounding wall (the side wall and the bottom wall) of the secondary coil formation trench 11B (the second trench part 11Bb) in the substrate main body 6 is thermally oxidized into an insulator portion (thermal oxide film) 30 having insulation. In FIGS. 102B and 104B, the insulating film 12 is omitted but the insulator portion 30 is shown. In the preferred embodiment, the entire wall sandwiched by the primary coil formation trenches 11A (the second trench parts 11Ab) in the shape of a spiral and the entire wall sandwiched by the secondary coil formation trenches 11B (the second trench parts 11Bb) in the shape of a spiral in the substrate main body 6 are formed into the thermal oxide film.

Then, for example, by a sputtering method, the barrier metal film 13 made of TiN is formed on the element formation surface 2*a* including the interiors of the trenches 11A and 11B. In this way, as shown in FIG. 103C, the barrier metal film 13 made of TiN is formed on the surfaces of the insulating film 12 and the insulating film 7 within the primary coil formation trench 11 and the surface of the insulating film 7 outside the primary coil formation trench 11A. Likewise, the barrier metal film made of TiN is formed on the surfaces of the insulating film 12 and the insulating film 7 within the secondary coil formation trench 11B and the surface of the insulating film 7 outside the secondary coil formation trench 11B. Thereafter, annealing processing is performed.

Thereafter, as shown in FIGS. 102C, 103D, and 104C, for example, by a CVD method, on the element formation surface 2*a* including the interiors of the coil formation trenches 11A and 11B, the conductive member 51 formed of tungsten (W) is deposited.

Then, for example, by an etch back method, overall etching is performed on the conductive member 51 from its surface. The overall etching is continued until the surface of the conductive member 51 is flush with the surface of the insulating film 7. In this way, as shown in FIGS. 102D, 103E, and 104D, the conductive member 51 is embedded within the coil formation trenches 11A and 11B while in contact with the barrier metal film 13. By the conductive member 51 embedded within the primary coil formation trench 11A, the primary coil 3A in the shape of a spiral when seen in plan view is formed, and by the conductive member 51 embedded within the secondary coil formation trench 11B, the secondary coil 3B in the shape of a spiral when seen in plan view is formed.

Then, as shown in FIGS. 102E and 104E, on the insulating film 7, the insulating film 8 formed with a USG (Undoped Silicate Glass) film or the like is formed so as to coat the insulating film 7 (the element formation surface 2*a*) and the coils 3A and 3B. The insulating film 8 is formed by, for example, a CVD method. Thereafter, by photolithography and etching, in regions of the insulating film 8 corresponding to one end portion and the other end portion of the primary coil 3A, the first contact hole 14A (see FIG. 97) and the second contact hole 15A (see FIG. 102E) penetrating the insulating film 8 are respectively formed. Likewise, in regions of the insulating film 8 corresponding to one end portion and the other end portion of the secondary coil 3B, the third contact hole 14B (see FIG. 97) and the fourth contact hole 15B (see FIG. 104E) penetrating the insulating film 8 are respectively formed.

Then, for example, by sputtering, on the insulating film 8 including the interiors of the contact holes 14A, 15A, 14B, and 15B, an electrode film forming the first to fourth electrodes 41 to 44 is formed. In the preferred embodiment, the electrode film made of Al is formed. Thereafter, by photolithography and etching, the electrode film is patterned, and thus as shown in FIGS. 102F and 104F, the electrode film is separated into the first electrode film 41A, the second electrode film 42A, the third electrode film 43A, and the fourth electrode film 44A.

Then, as shown in FIGS. 102G and 104G, for example, by a CVD method, the passivation film 16 such as a nitride film is formed, and furthermore, polyimide is applied to form the resin film 17. For example, polyimide to which photosensitivity is added is applied, and the polyimide is developed after exposure with a pattern corresponding to the first to fourth cutout portions 18A, 19A, 18B, and 19B. In this way, the resin film 17 having a cutout portion corresponding to the first to fourth cutout portions 18A, 19A, 18B, and 19B is formed. Thereafter, as necessary, heat treatment for curing the resin film is performed. Then, by dry etching using the resin film 17 as a mask, the first to fourth cutout portions 18A, 19A, 18B, and 19B are formed in the passivation film 16.

Then, as shown in FIGS. 102H and 104H, a resist mask 52 having an opening 52*a* in a lattice shape matching with the boundary region Y (see FIG. 105) is formed. Plasma etching is performed via the resist mask 52, and thus as shown in FIGS. 102H and 104H, the original substrate 50, the insulating film 7, and the insulating film 8 are etched from the surface of the insulating film 8 to a predetermined depth. In this way, along the boundary region Y, a groove (scribe groove) 53 for cutting is formed.

Then, the resist mask 52 is peeled off. Thereafter, as shown in FIGS. 102I and 104I, for example, by a CVD method, an insulating film 54 such as a nitride film serving as the material of the passivation film 9 is formed over the entire region of the surface of the original substrate 50. Here, the insulating film 54 is also formed over the entire region of the inner surface (the side wall surface and the bottom wall surface) of the groove 53.

Then, as shown in FIGS. 102J and 104J, the insulating film 54 is selectively etched. Specifically, a part of the insulating film 54 other than the insulating film 54 (the passivation film 9) on the side wall surface of the groove 53 is removed. In this way, a part of the electrode films 41A to 44A that is not covered by the passivation film 16 and the resin film 17 is exposed. The insulating film 54 on the bottom surface of the groove 53 is removed.

Then, as shown in FIGS. 102K and 104K, on the first to fourth electrode films 41A to 44A exposed from the first to fourth cutout portions 18A, 19A, 18B, and 19B, for example, by plating (preferably, electroless plating), plating growth is performed in the following order: for example, Ni, Pd, and Au. In this way, the first to fourth external connection electrodes 41B to 44B are formed.

Thereafter, by a DBG (Dicing Before Grinding) method, a plurality of chip transformer regions X are divided into pieces. Specifically, as shown in FIGS. 102L and 104L, first, on the side of the surface of the original substrate 50 (the side of the external connection electrode), a supporting tape 71 having an adhesive surface 72 is adhered. Then, the original substrate 50 is polished from the rear surface to the bottom surface of the groove 53. In this way, the chip transformer regions X are separated into individual chip transformers 1. Thereafter, on a plurality of chip transformers 1, the recovery step shown in FIGS. 45A to 45D or the recovery step shown in FIGS. 46A to 46C described in the first preferred embodiment of the second invention may be performed.

FIG. 106A is a partially cut perspective view of a chip transformer according to a second preferred embodiment of the fourth invention, and FIG. 106B is a perspective view showing a primary coil and a secondary coil formed within the chip transformer.

The chip transformer 1A is a minute chip part and is formed in the shape of a rectangular parallelepiped. The planar shape of the chip transformer 1A may be rectangular, the length L of one of adjacent two sides may be about 0.4 mm, and the length W of the other side may be about 0.4 mm. The thickness T of the entire chip transformer 1 may be about 0.15 mm.

The chip transformer 1A includes a substrate 2, a primary coil 3A and a secondary coil 3B that are formed within the substrate 2, a first electrode 41 that is connected to one end portion of the primary coil 3A, a second electrode 42 that is connected to the other end portion of the primary coil 3A, a third electrode 43 that is connected to one end portion of the secondary coil 3B, and a fourth electrode 44 that is connected to the other end of the secondary coil 3B. The number of windings of the primary coil 3A differs from the number of windings of the secondary coil 3B. Although in the preferred embodiment, an example where the number of windings of the primary coil 3A is greater than the number of windings of the secondary coil 3B is described, the number of windings of the secondary coil 3B may be greater than the number of windings of the primary coil 3A.

The chip transformer 1A in the second preferred embodiment of the fourth invention differs from the chip transformer 1 in the first preferred embodiment of the fourth invention in that in the surface of an electrode pair (the first electrode 41 and the second electrode 42) on the primary side, a plurality of concave portions 84A and 84B are respectively formed. In the surface of an electrode pair (the third electrode 43 and the fourth electrode 44) on the secondary side, the concave portions 84A and 84B are not formed.

FIG. 107A is a plan view showing the appearance of the chip transformer when seen from the side of the electrode, and FIG. 107B is a plan view showing the internal structure of the chip transformer. FIG. 108A is a cross-sectional view taken along line CVIIIA-CVIIIA in FIG. 107B, and FIG. 108B is a partially enlarged cross-sectional view of FIG. 108A. FIG. 109A is a cross-sectional view taken along line CIXA-CIXA in FIG. 107B, and FIG. 109B is a partially enlarged cross-sectional view of FIG. 109A. FIG. 110 is a cross-sectional view taken along line CX-CX in FIG. 107B. FIG. 111 is a cross-sectional view taken along line CXI-CXI in FIG. 107B, and FIG. 112 is a partially enlarged cross-sectional view of FIG. 111. FIG. 113 is a cross-sectional view taken along line CXIII-CXIII in FIG. 107B, and FIG. 114 is a plan view showing a structure of the surface of a substrate by removing an arrangement formed on the surface of the substrate.

In the following description, the "front" refers to the lower side of the plane of FIG. 107B, the "back" refers to the upper side of the plane of FIG. 107B, the "left" refers to the left side of the plane of FIG. 107B, and the "right" refers to the right side of the plane of FIG. 107B.

The substrate 2 is formed in the shape of a rectangular parallelepiped, and includes a pair of main surfaces 2*a* and 2*b* and four side surfaces 2*c*. One (the main surface 2*a* on the upper surface side in FIG. 106A) of the pair of main surfaces 2*a* and 2*b* is an element formation surface. In the following description, the main surface 2*a* is referred to as an "element formation surface 2*a*," and the main surface 2*b* on the side opposite to the element formation surface 2*a* is referred to as a "rear surface 2*b*." In the preferred embodiment, the substrate 2 is formed with a substrate main body 6 and an insulating film 7 formed on the surface thereof, and the surface of the insulating film 7 on the side opposite to the side of the substrate main body 6 is the element formation surface 2*a*. In the preferred embodiment, the substrate main body 6 is formed with a silicon substrate, and the insulating film 7 is formed with a thermal oxide film ($SiO_2$). The element formation surface 2*a* is formed in the shape of a rectangle in plan view when seen in a normal direction perpendicular to the element formation surface 2*a*. The surface (element formation surface 2*a*) of the substrate 2 is covered by an insulating film 8. The four side surfaces 2*c* of the substrate 2 and the outer peripheral surface of the insulating film 8 are covered by a passivation film 9 such as a nitride film.

With reference to FIGS. 107B and 114, in the front half of the element formation surface 2*a*, a primary side formation region 45 for the formation of the primary side circuit of the transformer is provided, and in the back half, a secondary side formation region 46 for the formation of the secondary side circuit of the transformer is provided. Each of the regions 45 and 46 is formed, in plan view, in the shape of a rectangle which is long in a left/right direction. In one end portion (left side end portion) of the primary side formation region 45, a first electrode formation region 45A is provided, and in the other end portion (right side end portion), a second electrode formation region 45B is provided. In one end portion (left side end portion) of the secondary side formation region 46, a third electrode formation region 46A is provided, and in the other end portion (right side end portion), a fourth electrode formation region 46B is provided.

In the first electrode formation region 45A, the external connection electrode (first external connection electrode) 41B of the first electrode 41 is disposed, and in the second electrode formation region 45B, the external connection electrode (second external connection electrode) 42B of the second electrode 42 is disposed. The first external connection electrode 41B is rectangular in plan view, and covers the region of the first electrode formation region 45A other than an edge portion on the side of the third electrode formation region 46A. The second external connection electrode 42B is rectangular in plan view, and covers the region of the second electrode formation region 45B other than an edge portion on the side of the fourth electrode formation region 46B. On the element formation surface 2*a* between the external connection electrodes 41B and 42B, a primary coil formation region 45C is provided. In the preferred embodiment, the primary coil formation region 45C is formed in the shape of a rectangle.

In the third electrode formation region 46A, the external connection electrode (third external connection electrode) 43B of the third electrode 43 is disposed, and in the fourth electrode formation region 46B, the external connection electrode (fourth external connection electrode) 44B of the fourth electrode 44 is disposed. The third external connection electrode 43B is rectangular in plan view, and covers the region of the third electrode formation region 46A other than an edge portion on the side of the first electrode formation region 45A. The fourth external connection electrode 44B is rectangular in plan view, and covers the region of the fourth electrode formation region 46B other than an edge portion on the side of the second electrode formation region 45B. On the element formation surface 2*a* between the external connection electrodes 43B and 44B, a secondary coil formation region 46C is provided. In the preferred embodiment, the secondary coil formation region 46C is formed in the shape of a rectangle.

In the surface of the first external connection electrode 41B and the surface of the second external connection electrode 42B, a plurality of first concave portions 84A and a plurality of second concave portions 84B are respectively formed. The plurality of first concave portions 84A are formed, in plan view, in the shape of a straight line extending in the longitudinal direction of the primary side formation region 45, and are formed at an interval in the lateral direction of the primary side formation region 45. Likewise, the plurality of second concave portions 84B are formed, in plan view, in the shape of a straight line extending in the longitudinal direction of the primary side formation region 45, and are formed at an interval in the lateral direction of the primary side formation region 45. The cross-sectional shape of the concave portions 84A and 84B is the shape of the letter V. In the surfaces of the third external connection electrode 43B and the fourth external connection electrode 44B, the concave portions 84A and 84B are not formed.

With reference to FIGS. 107B, 108A, 108B, and 110 to 114, in the substrate 2 the primary coil formation trench 11A is formed by digging down, in the primary coil formation region 45C, to a predetermined depth from the element formation surface 2*a*. The primary coil formation trench 11A is formed, in plan view, in the shape of a spiral. In the preferred embodiment, the primary coil formation trench 11A is formed, in plan view, in the shape of a quadrilateral spiral, and has a plurality of rectilinear portions parallel to the side surfaces 2*c* of the substrate 2.

The cross section (cross section in a direction perpendicular to a direction in which the primary coil formation trench 11A is extended in the spiral direction) of the primary coil formation trench 11A is formed in the shape of a rectangle which is long in the direction of the thickness of the substrate 2. For example, the width of the primary coil formation trench 11A may be 1 μm or more and 3 μm or less. For example, the depth of the primary coil formation trench 11A may be 10 μm or more and 82 μm or less. The depth of the primary coil formation trench 11A is preferably 10 μm or more so that the internal resistance of the primary coil 3A formed within the primary coil formation trench 11A is decreased.

Furthermore, in a region opposite the first external connection electrode 41B within the first electrode formation region 45A, in the substrate 2, a plurality of first electrode-side trenches (concave portion formation trenches) 21A are formed by digging down from the element formation surface 2*a* to a predetermined depth. The plurality of first electrode-side trenches 21A are formed in positions opposite the plurality of first concave portions 84A. Hence, the plurality of first electrode-side trenches 21A are formed, in plan view, in the shape of a straight line extending in the longitudinal direction of the primary side formation region 45, and are formed at an interval in the lateral direction of the primary side formation region 45.

Likewise, in a region opposite the second external connection electrode 42B within the second electrode formation region 45B, in the substrate 2, a plurality of second electrode-side trenches (concave portion formation trenches) 21B are formed by digging down from the element formation surface 2*a* to a predetermined depth. The plurality of second electrode-side trenches 21B are formed in positions opposite the plurality of second concave portions 84B. Hence, the plurality of second electrode-side trenches 21B are formed, in plan view, in the shape of a straight line extending in the longitudinal direction of the primary side formation region 45, and are formed at an interval in the lateral direction of the primary side formation region 45.

The cross sections of the electrode-side trenches 21A and 21B are the shape of a rectangle that is long in the direction of the thickness of the substrate 2. In the preferred embodiment, the width of the electrode-side trenches 21A and 21B is narrower than that of the primary coil formation trench 11A. The depth of the electrode-side trenches 21A and 21B may be the same as that of the primary coil formation trench 11A or may be shallower than that of the primary coil formation trench 11A. In the preferred embodiment, the depth of the electrode-side trenches 21A and 21B is the same as that of the primary coil formation trench 11A.

As shown in FIG. 108B, the primary coil formation trench 11A is formed with a first trench part 11Aa that is formed in the insulating film 7 and a second trench part 11Ab that is formed in the substrate main body 6 and that communicates with the first trench part 11Aa. On the inner surface of the primary coil formation trench 11A (the second trench part 11Ab) in the substrate main body 6, an insulating film 12 formed with an oxide film or the like is formed. On the surface of the insulating film 12 within the primary coil formation trench 11A (the second trench part 11Ab) and on the inner surface of the primary coil formation trench 11A (the first trench part 11Aa) in the insulating film 7, a barrier metal film 13 is formed. The barrier metal film 13 is formed of, for example, TiN. The thickness of the barrier metal film 13 is about 400 to 500 angstroms.

Within the primary coil formation trench 11A, a conductive member 51 is embedded while being in contact with the barrier metal film 13. In the preferred embodiment, the conductive member 51 is formed of tungsten (W). The primary coil 3A is formed with the conductive member 51 embedded within the primary coil formation trench 11A. Hence, the primary coil 3A is formed, in plan view, in the shape of a spiral (in the shape of a quadrilateral spiral) of the same pattern as the primary coil formation trench 11A. Specifically, the primary coil 3A includes a plurality of plate-shaped parts parallel to the side surfaces 2*c* of the substrate 2.

As shown in FIGS. 111, 112, and 113, the electrode-side trenches 21A and 21B are formed with first trench parts 21Aa and 21Ba that are formed in the insulating film 7 and second trench parts 21Ab and 21Bb that are formed in the substrate main body 6 and that communicate with the first trench parts 21Aa and 21Ba. On the inner surface of the electrode-side trenches 21A and 21B (the second trench parts 21Ab and 21Bb) in the substrate main body 6, an insulating film 12 formed with an oxide film or the like is formed. In the preferred embodiment, the insulating film 12 formed on the inner surface of the electrode-side trenches 21A and 21B (the second trench parts 21Ab and 21Bb) in the substrate main body 6 fills the second trench parts 21Ab and 21Bb.

On the inner surface of the first electrode-side trench 21A (the first trench part 21Aa) in the insulating film 7, the barrier metal film 13 is formed. Within the first electrode-side trench 21A (the first trench part 21Aa) in the insulating film 7, the conductive member 51 is embedded while being in contact with the barrier metal film 13. In the surface of the conductive member 51 within the first electrode-side trench 21A, first concave portions 81A (first underlying concave portions) are formed. In other words, in a region of the element formation surface 2*a* opposite the first external connection electrode 41B, a plurality of first concave portions 81A are formed. The plurality of first concave portions 81A are formed in positions opposite the first concave portions 84A of the first external connection electrode 41B. Hence, the plurality of first concave portions 81A are formed, in plan view, in the shape of a straight line extending in the longitudinal direction of the primary side formation region 45, and are formed at an interval in the lateral direction of the primary side formation region 45. The cross-sectional shape of the first concave portion 81A is the shape of the letter V. The plurality of first concave portions 81A are formed due to the first electrode-side trenches 21A formed in the substrate 2.

Likewise, on the inner surface of the second electrode-side trench 21B (the first trench part 21Ba) in the insulating film 7, the barrier metal film (not shown) is formed. Within the second electrode-side trench 21B (the first trench part 21Ba) in the insulating film 7, the conductive member (not shown) is embedded while being in contact with the barrier metal film. In the surface of the conductive member within the second electrode-side trench 21B, second concave portions 81B (first underlying concave portions) are formed. In other words, in a region of the element formation surface 2*a* opposite the second external connection electrode 42B, a plurality of second concave portions 81B are formed. The plurality of second concave portions 81B are formed in positions opposite the second concave portions 84B of the second external connection electrode 42B. Hence, the plurality of second concave portions 81B are formed, in plan view, in the shape of a straight line extending in the longitudinal direction of the primary side formation region 45, and are formed at an interval in the lateral direction of the primary side formation region 45. The cross-sectional shape of the second concave portion 81B is the shape of the letter V. The plurality of second concave portions 81B are formed due to the plurality of second electrode-side trenches 21B formed in the substrate 2.

In the preferred embodiment, the insulating film 12 formed on the inner surfaces of the primary coil formation trench 11A and the electrode-side trenches 21A and 21B is formed with a thermal oxide film ($SiO_2$). When the thermal oxide film is formed on the inner surface of the trenches 11A, 21A, and 21B, the surrounding wall (the side wall and the bottom wall) of the trenches 11A, 21A, and 21B in the substrate main body 6 is thermally oxidized into an insulator portion (thermal oxide film) 30 having insulation. In the preferred embodiment, an example is described where the entire wall sandwiched by the primary coil formation trenches 11A (the second trench part 11Ab) in the shape of a spiral in the substrate main body 6, the entire wall between the adjacent two first electrode-side trenches 21A (the second trench parts 21Ab), and the entire wall between the adjacent two second electrode-side trenches 21B (the second trench parts 21Bb) are thermal oxide films.

With reference to FIGS. 107B, 109A, 109B, and 110, in the substrate 2, the secondary coil formation trench 11B is formed by digging down, in the secondary coil formation region 46C, to a predetermined depth from the element formation surface 2*a*. The secondary coil formation trench 11B is formed, in plan view, in the shape of a spiral. In the preferred embodiment, the secondary coil formation trench 11B is formed, in plan view, in the shape of a quadrilateral spiral, and has a plurality of rectilinear portions parallel to the side surfaces 2*c* of the substrate 2. The number of windings of the secondary coil formation trench 11B is less than the number of windings of the primary coil formation trench 11A.

The cross section (cross section in a direction perpendicular to a direction in which the secondary coil formation trench 11B is extended in the spiral direction) of the secondary coil formation trench 11B is formed in the shape of a rectangle which is long in the direction of the thickness of the substrate 2. For example, the width of the secondary coil formation trench 11B may be 1 μm or more and 3 μm or less. For example, the depth of the secondary coil formation trench 11B may be 10 μm or more and 82 μm or less. The depth of the secondary coil formation trench 11B is preferably 10 μm or more so that the internal resistance of the secondary coil 3B formed within the secondary coil formation trench 11B is decreased.

As shown in FIG. 109B, the secondary coil formation trench 11B is formed with a first trench part 11Ba that is formed in the insulating film 7 and a second trench part 11Bb that is formed in the substrate main body 6 and that communicates with the first trench part 11Ba. On the inner surface of the secondary coil formation trench 11B (the second trench part 11Bb) in the substrate main body 6, an insulating film 12 formed with an oxide film or the like is formed. In the preferred embodiment, the insulating film 12 is formed with a thermal oxide film ($SiO_2$), and when the thermal oxide film is formed on the inner surface of the secondary coil formation trench 11B, the surrounding wall (the side wall and the bottom wall) of the secondary coil formation trench 11B (the second trench part 11Bb) in the substrate main body 6 is thermally oxidized into an insulator portion (thermal oxide film) 30 having insulation. In the preferred embodiment, an example is described where the entire wall sandwiched by the secondary coil formation trenches 11B (the second trench parts 11Bb) in the shape of a spiral in the substrate main body 6 is a thermal oxide film.

On the surface of the insulating film 12 within the secondary coil formation trench 11B (the second trench part 11Bb) and on the inner surface of the secondary coil formation trench 11B (the first trench part 11Ba) in the insulating film 7, a barrier metal film 13 is formed. The barrier metal film 13 is formed of, for example, TiN. The thickness of the barrier metal film 13 is about 400 to 500 angstroms. Within the secondary coil formation trench 11B, a conductive member 51 is embedded while being in contact with the barrier metal film 13. In the preferred embodiment, the conductive member 51 is formed of tungsten (W). The secondary coil 3B is formed with the conductive member 51 embedded within the secondary coil formation trench 11B. Hence, the secondary coil 3B is formed, in plan view, in the shape of a spiral (in the shape of a quadrilateral spiral) of the same pattern as the secondary coil formation trench 11B. Specifically, the secondary coil 3B includes a plurality of plate-shaped parts parallel to the side surfaces 2*c* of the substrate 2. Hence, the number of windings of the secondary coil 3B is less than the number of windings of the primary coil 3A.

On the element formation surface 2*a* (the surface of the insulating film 7) of the substrate 2, an insulating film 8 is formed so as to coat the element formation surface 2*a* and the conductive member 51. The insulating film 8 is formed, in plan view, in the shape of a rectangle matching with the element formation surface 2*a*. The insulating film 8 is formed with, for example, a USG (Undoped Silicate Glass) film. In the insulating film 8, a first contact hole 14A (see FIGS. 107B and 110) that exposes one end portion (outer peripheral side end portion) of the primary coil 3A and a second contact hole 15A (see FIGS. 107B and 108A) that exposes the other end portion (inner peripheral side end portion) of the primary coil 3A are formed. Furthermore, in the insulating film 8, a third contact hole 14B (see FIGS. 107B and 110) that exposes one end portion (outer peripheral side end portion) of the secondary coil 3B and a fourth contact hole 15B (see FIGS. 107B and 109A) that exposes the other end portion (inner peripheral side end portion) of the secondary coil 3B are formed.

Furthermore, in the surface of the insulating film 8, as shown in FIGS. 111 and 112, in the first electrode formation region 45A, a plurality of first concave portions 82A (second underlying concave portions) are formed. The plurality of first concave portions 82A are formed in positions opposite the first concave portions 84A (the first concave portions 81A) of the first external connection electrode 41B. Hence, the plurality of first concave portions 82A are formed, in plan view, in the shape of a straight line extending in the longitudinal direction of the primary side formation region 45, and are formed at an interval in the lateral direction of the primary side formation region 45. The cross-sectional shape of the first concave portion 82A is the shape of the letter V. The first concave portions 82A are formed due to the first concave portion 81A in the surface (the element formation surface 2*a*) of the substrate 2, which is its underlying layer.

Likewise, in the surface of the insulating film 8, as shown in FIG. 113, in the second electrode formation region 45B, a plurality of second concave portions 82B (second underlying concave portions) are formed. The second concave portions 82B are formed in positions opposite the second concave portions 84B (the second concave portions 81B) of the second external connection electrode 42B. Hence, the plurality of second concave portions 82B are formed, in plan view, in the shape of a straight line extending in the longitudinal direction of the primary side formation region 45, and are formed at an interval in the lateral direction of the primary side formation region 45. The cross-sectional shape of the second concave portion 82B is the shape of the letter V. The second concave portions 82B are formed due to the second concave portion 81B in the surface (the element formation surface 2*a*) of the substrate 2, which is its underlying layer. As described previously, in the side surfaces 2*c* of the substrate 2 and the outer peripheral surface of the insulating film 8, the passivation film 9 formed with a nitride film or the like is formed.

On the surface of the insulating film 8, the first electrode 41, the second electrode 42, the third electrode 43, and the fourth electrode 44 are formed. With reference to FIGS. 107B, 108A, and 110, the first electrode 41 includes a first electrode film 41A that is formed on the surface of the insulating film 8 and a first external connection electrode 41B that is bonded to the first electrode film 41A. As shown in FIG. 107B, the first electrode film 41A includes a drawing electrode 41Aa that is connected to one end portion of the primary coil 3A and a first pad 41Ab that is formed integrally with the drawing electrode 41Aa. The first pad 41Ab is formed to be rectangular at one end portion of the primary side formation region 45 of the element formation surface 2*a*. The first external connection electrode 41B is connected to the first pad 41Ab. As shown in FIGS. 107B and 110, the drawing electrode 41Aa enters the first contact hole 14A from the surface of the insulating film 8, and is connected to one end portion of the primary coil 3A within the first contact hole 14A. The drawing electrode 41Aa is formed straight along a straight line that passes above one end portion of the primary coil 3A to reach the first pad 41Ab.

By extending one end portion of the primary coil formation trench 11A to a position below the first pad 41Ab, one end portion of the primary coil 3A may be disposed in a position below the first pad 41Ab. In this way, since the first contact hole 14A can be formed in a position below the first pad 41Ab, one end portion of the primary coil 3A can be connected to the first pad 41Ab. In this case, since the first electrode film 41A can be formed with only the first pad 41Ab, the drawing electrode 41Aa is not needed.

The second electrode 42 includes a second electrode film 42A that is formed on the surface of the insulating film 8 and a second external connection electrode 42B that is bonded to the second electrode film 42A. As shown in FIG. 107B, the second electrode film 42A includes a drawing electrode 42Aa that is connected to the other end portion of the primary coil 3A and a second pad 42Ab that is formed integrally with the drawing electrode 42Aa. The second pad 42Ab is formed to be rectangular at the other end portion of the primary side formation region 45 of the element formation surface 2*a*. The second external connection electrode 42B is connected to the second pad 42Ab. As shown in FIGS. 107B and 108A, the drawing electrode 42Aa enters the second contact hole 15A from the surface of the insulating film 8, and is connected to the other end portion of the primary coil 3A within the second contact hole 15A. The drawing electrode 42Aa is formed straight along a straight line that passes above the other end portion of the primary coil 3A to reach the second pad 42Ab.

With reference to FIGS. 107B, 109A, and 110, the third electrode 43 includes a third electrode film 43A that is formed on the surface of the insulating film 8 and a third external connection electrode 43B that is bonded to the third electrode film 43A. As shown in FIG. 107B, the third electrode film 43A includes a drawing electrode 43Aa that is connected to one end portion of the secondary coil 3B and a third pad 43Ab that is formed integrally with the drawing electrode 43Aa. The third pad 43Ab is formed to be rectangular at one end portion of the secondary side formation region 46 of the element formation surface 2*a*. The third external connection electrode 43B is connected to the third pad 43Ab. As shown in FIGS. 107B and 110, the drawing electrode 43Aa enters the third contact hole 14B from the surface of the insulating film 8, and is connected to one end portion of the secondary coil 3B within the third contact hole 14B. The drawing electrode 43Aa is formed straight along a straight line that passes above one end portion of the secondary coil 3B to reach the third pad 43Ab.

By extending one end portion of the secondary coil formation trench 11B to a position below the third pad 43Ab, one end portion of the secondary coil 3B may be disposed in a position below the third pad 43Ab. In this way, since the third contact hole 14B can be formed in a position below the third pad 43Ab, one end portion of the secondary coil 3B can be connected to the third pad 43Ab. In this case, since the third electrode film 43A can be formed with only the third pad 43Ab, the drawing electrode 43Aa is not needed.

The fourth electrode 44 includes a fourth electrode film 44A that is formed on the surface of the insulating film 8 and a fourth external connection electrode 44B that is bonded to the fourth electrode film 44A. As shown in FIG. 107B, the fourth electrode film 44A includes a drawing electrode 44Aa that is connected to the other end portion of the secondary coil 3B and a fourth pad 44Ab that is formed integrally with the drawing electrode 44Aa. The fourth pad 44Ab is formed to be rectangular at the other end portion of the secondary side formation region 46 of the element formation surface 2*a*. The second external connection electrode 42B is connected to the second pad 42Ab. As shown in FIGS. 107B and 109A, the drawing electrode 44Aa enters the fourth contact hole 15B from the surface of the insulating film 8, and is connected to the other end portion of the secondary coil 3B within the fourth contact hole 15B. The drawing electrode 44Aa is formed straight along a straight line that passes above the other end portion of the secondary coil 3B to reach the fourth pad 44Ab. In the preferred embodiment, as the electrode films 41A to 44A, Al films are used.

In the surface of the first pad 41Ab of the first electrode film 41A, as shown in FIGS. 111 and 112, a plurality of first concave portions 83A (third underlying concave portions) are formed. The plurality of first concave portions 83A are formed in positions opposite the first concave portions 84A (the first concave portions 82A) of the first external connection electrode 41B. Hence, the first concave portions 83A are formed, in plan view, in the shape of a straight line extending in the longitudinal direction of the primary side formation region 45, and are formed at an interval in the lateral direction of the primary side formation region 45. The cross-sectional shape of the first concave portion 83A is the shape of the letter V. The first concave portions 83A are formed due to the first concave portion 82A in the surface of the insulating film 8, which is its underlying layer.

Likewise, in the surface of the second pad 42Ab of the second electrode film 42A, as shown in FIG. 113, a plurality of second concave portions 83B (third underlying concave portions) are formed. The plurality of second concave portions 83B are formed in positions opposite the second concave portions 84B (the second concave portions 82B) of the second external connection electrode 42B. Hence, the second concave portions 83B are formed, in plan view, in the shape of a straight line extending in the longitudinal direction of the primary side formation region 45, and are formed at an interval in the lateral direction of the primary side formation region 45. The cross-sectional shape of the second concave portion 83B is the shape of the letter V. The second concave portions 83B are formed due to the second concave portion 82B in the surface of the insulating film 8, which is its underlying layer.

The first to fourth electrode films 41A to 44A are covered by a passivation film 16 formed with, for example, a nitride film (SiN), and furthermore, on the passivation film 16, a resin film 17 such as polyimide is formed. In the passivation film 16 and the resin film 17, in plan view, in regions corresponding to the vicinity of the first pad 41Ab, the vicinity of the second pad 42Ab, the vicinity of the third pad 43Ab, and the vicinity of the fourth pad 44Ab, first, second, third, and fourth cutout portions 18A, 19A, 18B, and 19B (see FIGS. 108A, 109A, 111, and 113) are respectively formed.

A region of the surface of the first pad 41Ab other than an edge portion on the side of the second pad 42Ab is exposed by the first cutout portion 18A. A region of the surface of the second pad 42Ab other than an edge portion on the side of the first pad 41Ab is exposed by the second cutout portion 19A. A region of the surface of the third pad 43Ab other than an edge portion on the side of the fourth pad 44Ab is exposed by the third cutout portion 18B. A region of the surface of the fourth pad 44Ab other than an edge portion on the side of the third pad 43Ab is exposed by the fourth cutout portion 19B. In other words, the passivation film 16 and the resin film 17 are formed, in plan view, in the primary coil formation region 45C and the secondary coil formation region 46C, and further in the region between the first pad 41Ab and the third pad 43Ab and the region between the second pad 42Ab and the fourth pad 44Ab, each which is the boundary portion region between the primary side formation region 45 and the secondary side formation region 46.

The first, second, third, and fourth external connection electrodes 41B, 42B, 43B, and 44B fill the first, second, third, and fourth cutout portions 18A, 19A, 18B, and 19B. The first external connection electrode 41B and the second external connection electrode 42B are formed so as to protrude from the resin film 17, and include a drawing portion 20 that is drawn to the side of the other external connection electrode along the surface of the resin film 17. Likewise, the third external connection electrode 43B and the fourth external connection electrode 44B are formed so as to protrude from the resin film 17, and include the drawing portion 20 that is drawn to the side of the other external connection electrode along the surface of the resin film 17.

In the preferred embodiment, the first external connection electrode 41B is formed so as to cover not only the surface of the first electrode film 41A (the pad 41Ab) and the insulating film 8 exposed within the first cutout portion 18A but also the upper end surface of the passivation film 9 on the side of one end portion of the primary side formation region 45. The two side surfaces other than the two side surfaces on the inner side of the first external connection electrode 41B are formed so as to be flush with the surface of the passivation film 9 covering the peripheral surface of the insulating film 8 on the side of one end portion of the primary side formation region 45.

The second external connection electrode 42B is formed so as to cover not only the surface of the second electrode film 42A (the pad 42Ab) and the insulating film 8 exposed within the second cutout portion 19A but also the upper end surface of the passivation film 9 on the side of the other end portion of the primary side formation region 45. The two side surfaces other than the two side surfaces on the inner side of the second external connection electrode 42B are formed so as to be flush with the surface of the passivation film 9 covering the peripheral surface of the insulating film 8 on the side of the other end portion of the primary side formation region 45.

The third external connection electrode 43B is formed so as to cover not only the surface of the third electrode film 43A (the pad 43Ab) and the insulating film 8 exposed within the third cutout portion 18B but also the upper end surface of the passivation film 9 on the side of the one end portion of the secondary side formation region 46. The two side surfaces other than the two side surfaces on the inner side of the third external connection electrode 43B are formed so as to be flush with the surface of the passivation film 9 covering the peripheral surface of the insulating film 8 on the side of the one end portion of the secondary side formation region 46.

The fourth external connection electrode 44B is formed so as to cover not only the surface of the fourth electrode film 44A (the pad 44Ab) and the insulating film 8 exposed within the fourth cutout portion 19B but also the upper end surface of the passivation film 9 on the side of the other end portion of the secondary side formation region 46. The two side surfaces other than the two side surfaces on the inner side of the fourth external connection electrode 44B are formed so as to be flush with the surface of the passivation film 9 covering the peripheral surface of the insulating film 8 on the side of the other end portion of the secondary side formation region 46. The external connection electrodes 41B, 42B, 43B, and 44B may be formed with, for example, a Ni/Pd/Au laminated film having a Ni film in contact with the electrode films 41A, 42A, 43A, and 44A, a Pd film formed thereon, and an Au film formed thereon. The laminated film described above can be formed by a plating method.

As described previously, in the surface of the first external connection electrode 41B, a plurality of first concave portions 84A are formed, and in the surface of the second external connection electrode 42B, a plurality of second concave portions 84B are formed. The first concave portions 84A are formed due to the first concave portions 83A in the surface of the first pad 41Ab, which is its underlying layer. Since the first concave portions 83A are formed due to the first concave portions 82A, which is its underlying layer, and the first concave portions 82A are formed due to the first concave portions 81A, which is its underlying layer, the first concave portions 84A are formed due to the first concave portions 81A. As described later, the first concave portions 81A are formed due to the first electrode-side trenches 21A.

Hence, the first concave portions 84A in the first external connection electrode 41B are formed due to the first electrode-side trenches 21A.

The second concave portions 84B are formed due to the second concave portions 83B in the surface of the second pad 42Ab, which is its underlying layer. Since the second concave portions 83B are formed due to the second concave portions 82B, and the second concave portions 82B are formed due to the second concave portions 81B, the second concave portions 84B are formed due to the second concave portions 81B. As the first concave portions 81A are formed due to the first electrode-side trenches 21A, the second concave portions 81B are formed due to the second electrode-side trenches 21B. Hence, the second concave portions 84B in the second external connection electrode 42B are formed due to the second electrode-side trenches 21B.

The passivation film 16 and the resin film 17 coat, from the surface, the coils 3A and 3B, the insulating film 8, the electrode films 41A to 44A in the coil formation regions 45C and 46C of the element formation surface 2*a*, in a region between the first external connection electrode 41B and the third external connection electrode 43B, and a region between the second external connection electrode 42B and the fourth external connection electrode 44B, and function as a protective film to protect them. On the other hand, the passivation film 9 formed on the side surfaces 2*c* of the substrate 2 and the outer peripheral surface of the insulating film 8 function as a protective film to protect the side surfaces 2*c* of the substrate 2 and the outer peripheral surface of the insulating film 8.

FIG. 115 is an electrical circuit diagram showing an electrical structure within the chip transformer. One end of the primary coil 3A (represented by a symbol L1 in FIG. 115) is connected to the first electrode 41, and the other end of the primary coil 3A is connected to the second electrode 42. One end of the secondary coil 3B (represented by a symbol L2 in FIG. 115) is connected to the third electrode 43, and the other end of the secondary coil 3B is connected to the fourth electrode 44. In this way, it functions as a transformer.

As a parameter indicating the performance (quality) of the transformer, the Q (Quality Factor) value of the coil is present. As the Q value of the coil is increased, its loss is decreased, and the coil has an excellent characteristic as a high-frequency inductance.

The Q value of the coils 3A and 3B is represented by formula (8) below.

$$Q=2\pi fL/R \quad (8)$$

In the formula (8) above, f represents the frequency of a current flowing through the coil, L represents the inductance of the coils 3A and 3B and R represents the internal resistance of the coils 3A and 3B.

In the arrangement of the second preferred embodiment of the fourth invention, in the substrate 2, the primary coil formation trench 11A and the secondary coil formation trench 11B obtained by digging down from the element formation surface 2*a* are formed, in plan view, in the shape of a spiral. The conductive member 51 is embedded within the primary coil formation trench 11A and thus the primary coil 3A is formed, and the conductive member 51 is embedded within the secondary coil formation trench 11B and thus the secondary coil 3B is formed. Hence, it is possible to increase the cross-sectional area of the coils 3A and 3B (the cross-sectional area of the coils 3A and 3B perpendicular to the direction in which the coils 3A and 3B are extended in the spiral direction), and thus it is possible to decrease the internal resistance (R in the formula (8) above) of the coils 3A and 3B. In this way, since the Q value of the coils 3A and 3B can be increased, it is possible to provide a high performance chip transformer.

The coil formation trenches 11A and 11B are formed in the substrate 2, the conductive member 51 is embedded within the coil formation trenches 11A and 11B and thus it is possible to form the coils 3A and 3B, with the result that the coils 3A and 3B are easily manufactured. In this way, it is possible to provide a chip transformer that is easily manufactured.

When image inspection is performed on the chip transformer 1A, light from a light source is applied to the surfaces of the electrodes 41 to 44, and images of the surfaces are imaged with a camera. In the second preferred embodiment of the fourth invention, in the surfaces of the first external connection electrode 41B and the second external connection electrode 42B on the primary side, a plurality of concave portions 84A and 84B are formed but in the surfaces of the third external connection electrode 43B and the fourth external connection electrode 44B on the secondary side, a plurality of concave portions 84A and 84B are not formed. Since in the surfaces of the external connection electrodes 41B and 42B on the primary side, the concave portions 84A and 84B are formed, the light incident on the surfaces of the external connection electrodes 41B and 42B is diffusely reflected off the concave portions 84A and 84B. By contrast, since the concave portions are not formed in the surfaces of the external connection electrodes 43B and 44B on the secondary side, the light incident on the surface of the external connection electrodes 43B and 44B is unlikely to be diffusely reflected off.

Hence, a large difference is produced between image information (for example, brightness information) on the external connection electrodes 41B and 42B on the primary side and image information on the external connection electrodes 43B and 44B on the secondary side obtained with the camera. In this way, based on the image information obtained with the camera, it is possible to clearly identify the primary side electrode pairs 41 and 42 and the secondary side electrode pairs 43 and 44. In other words, in the second preferred embodiment of the fourth invention, at the time of the image inspection, it is possible to easily determine the primary side electrode pairs 41 and 42 and the secondary side electrode pairs 43 and 44.

Furthermore, on the element formation surface 2*a*, which is one surface of the substrate 2, the external connection electrodes 41B to 44B of the first to fourth electrodes 41 to 44 are formed. Hence, as shown in FIG. 116, the element formation surface 2*a* is made to face a mounting substrate 91, the external connection electrodes 41B to 44B are bonded on the mounting substrate 91 by a solder 92 and thus it is possible to form a circuit assembly in which the chip transformer 1A is surface-mounted on the mounting substrate 91. In other words, it is possible to provide a flip-chip connection-type chip transformer 1A, and it is possible to connect the chip transformer 1A to the mounting substrate 91 by a face-down bonding in which the element formation surface 2*a* is made to face the mounting substrate 91 and wireless bonding. In this way, it is possible to decrease the occupied space of the chip transformer 1A on the mounting substrate 91. In particular, it is possible to realize a low profile chip transformer 1A on the mounting substrate 91. In this way, it is possible to effectively utilize the space within the housing of a small-sized electronic device or the like and to contribute to high-density mounting and miniaturization.

With reference to FIGS. 102A to 102L, 103A to 103E, 104A to 104L, and 117A to 117F, a method of manufacturing the chip transformer 1A will be described. Here, FIGS. 102A to 102L used in the first preferred embodiment of the fourth invention are used as process charts corresponding to the cut surface of FIG. 108A, FIGS. 103A to 103E used in the first preferred embodiment of the fourth invention are used as process charts corresponding to the cut surface of FIG. 108B and FIGS. 104A to 104L used in the first preferred embodiment of the fourth invention are used as process charts corresponding to the cut surface of FIG. 109A. However, although FIGS. 102B to 102L do not show the insulator portions 30 formed on the surrounding wall of the electrode-side trenches 21A and 21B, in the second preferred embodiment of the fourth invention, the insulator portions 30 are represented by a symbol 30 in FIG. 108A. FIGS. 117A to 117F are enlarged cross-sectional views showing the details of the manufacturing step of the first concave portion, and show cut surfaces corresponding to FIG. 112.

As shown in FIGS. 102A and 104A, an original substrate 50 that is an original of the substrate main body 6 is prepared. On the surface of the original substrate 50, the insulating film 7 such as a thermal oxide film or a CVD oxide film is formed. In the preferred embodiment, the insulating film 7 is a thermal oxide film. The surface of the insulating film 7 corresponds to the element formation surface 2*a* of the substrate 2.

FIG. 105 is a schematic plan view of part of the original substrate 50 in which the insulating film 7 is formed on the surface. As shown in FIG. 105, in the element formation surface 2*a*, chip transformer regions X corresponding to a plurality of chip transformers 1A are disposed in a matrix. Between the chip transformer regions X adjacent to each other, a boundary region Y is provided. The boundary region Y is a region in the shape of a band having a substantially constant width, extends in two directions perpendicular to each other and is formed in a lattice shape. After necessary steps are performed on the original substrate 50 in which the insulating film 7 is formed on the surface, the original substrate 50 is separated along the boundary region Y, and thus it is possible to obtain a plurality of chip transformers 1A.

The steps performed on the original substrate 50 in which the insulating film 7 is formed on the surface are as follows. First, as shown in FIGS. 102A, 104A, and 117A, by photolithography and etching, a part of the insulating film 7 that corresponds to a region in which the coil formation trench 11A and the secondary coil formation trench 11B, the primary electrode-side trench 21A, and the secondary electrode-side trench 21B need to be formed is removed. In this way, in the insulating film 7, the first trench part 11Aa of the primary coil formation trench 11A, the first trench part 11Ba of the secondary coil formation trench 11B, the first trench part 21Aa of the first electrode-side trench 21A and the first trench part 21Ba (not shown) of the second electrode-side trench 21B (not shown) are formed.

Then, a hard mask formed with the insulating film 7 is used, and thus the original substrate 50 is etched. In this way, as shown in FIGS. 102B, 103A, 104B, and 117A, the second trench part 11Ab of the primary coil formation trench 11A, the second trench part 11Bb of the secondary coil formation trench 11B, the second trench part 21Ab of the first electrode-side trench 21A, and the second trench part 21Bb (not shown) of the second electrode-side trench 21B (not shown) are formed in the original substrate 50. In this way, in the insulating film 7 and the original substrate 50, the primary coil formation trench 11A, the secondary coil formation trench 11B, the first electrode-side trench 21A, and the second electrode-side trench 21B are formed. The coil formation trenches 11A and 11B and electrode-side trenches 21A and 21B may be formed with, for example, a so-called BOSCH process. The BOSCH process is a process that is generally used to make a hollow part in a MEMS (Micro Electro Mechanical System).

Then, as shown in FIGS. 102B, 103B, 104B and 117B, on the inner surface of the coil formation trenches 11A and 11B and the electrode-side trenches 21A and 21B, the insulating film (thermal oxide film) 12 is formed by a thermal oxidization method. Here, the surrounding wall (the side wall and the bottom wall) of the trenches 11A, 11B, 21A, and 21B (the second trench parts 11Ab, 11Bb, 21Ab, and 21Bb) in the original substrate 50 is thermally oxidized into an insulator portion (thermal oxide film) 30 having insulation. In the preferred embodiment, the entire wall sandwiched by the primary coil formation trench 11A (the second trench part 11Ab) in the shape of a spiral and the entire wall sandwiched by the secondary coil formation trench 11B (the second trench part 11Bb) in the shape of a spiral in the substrate main body 6 are formed into the thermal oxide film. In the preferred embodiment, the entire wall between the adjacent two first electrode-side trenches 21A (the second trench parts 21Ab) and the entire wall between the adjacent two second electrode-side trenches 21B (the second trench parts 21Bb) are formed into the thermal oxide films. The insulating film 12 formed on the inner surface of the electrode-side trenches 21A and 21B (the second trench parts 21Ab and 21Bb) fills the electrode-side trenches 21A and 21B.

Then, for example, by a sputtering method, the barrier metal film 13 made of TiN is formed on the element formation surface 2*a* including the interiors of the trenches 11A, 11B, 21A, and 21B. In this way, as shown in FIG. 103C, the barrier metal film 13 made of TiN is formed on the surfaces of the insulating film 12 and the insulating film 7 within the primary coil formation trench 11A and the surface of the insulating film 7 outside the primary coil formation trench 11A. Likewise, the barrier metal film 13 made of TiN is formed on the surfaces of the insulating film 12 and the insulating film 7 within the secondary coil formation trench 11B and the surface of the insulating film 7 outside the secondary coil formation trench 11B. Moreover, as shown in FIG. 117C, the barrier metal film 13 is formed on the surfaces of the insulating film 12 and the insulating film 7 within the first electrode-side trench 21A and the surface of the insulating film 7 outside the first electrode-side trench 21A. Likewise, the barrier metal film 13 is formed on the surfaces of the insulating film 12 and the insulating film 7 within the second electrode-side trench 21B and the surface of the insulating film 7 outside the second electrode-side trench 21B. Thereafter, annealing processing is performed.

Thereafter, as shown in FIGS. 102C, 103D, 104C, and 117D, for example, by a CVD method, on the element formation surface 2*a* including the interiors of the trenches 11A, 11B, 21A, and 21B, the conductive member 51 formed of tungsten (W) is deposited. Since on the entire surface of the element formation surface 2*a* including the interiors of the trenches 11A, 11B, 21A, and 21B, the conductive member 51 is deposited at the same rate, in the surface of the conductive member 51, concave portions 80 (see FIG. 117D) are formed in positions opposite the trenches 11A, 11B, 21A, and 21B.

Then, for example, by an etch back method, overall etching is performed on the conductive member 51 from its surface. The overall etching is continued until the surface of the conductive member 51 is flush with the surface of the insulating film 7. In this way, as shown in FIGS. 102D, 103E, 104D, and 117E, the conductive member 51 is embedded within the trenches 11A, 11B, 21A, and 21B while in contact with the barrier metal film 13. By the conductive member 51 embedded within the primary coil formation trench 11A, the primary coil 3A in the shape of a spiral when seen in plan view is formed, and by the conductive member 51 embedded within the secondary coil formation trench 11B, the secondary coil 3B in the shape of a spiral when seen in plan view is formed.

Since the conductive member 51 is etched from the entire surface thereof at the same rate, on the surface of the conductive member 51 after the etching, the concave portions 81 are formed in positions opposite the concave portions 80 before the etching. However, although for ease of description, the concave portions 81 are shown in FIG. 117E, the concave portions are omitted in FIG. 103E. In the following description, the concave portion 81 formed in the conductive member 51 within the first electrode-side trench 21A is referred to as a "first concave portion 81A," and the concave portion 81 formed in the conductive member 51 within the second electrode-side trench 21B is referred to as a "second concave portion 81B."

Then, as shown in FIGS. 102E, 104E, and 117F, on the insulating film 7, the insulating film 8 formed with a USG (Undoped Silicate Glass) film or the like is formed so as to coat the insulating film 7 (the element formation surface 2*a*) and the conductive member 51. The insulating film 8 is formed by, for example, a CVD method. In the surface of the insulating film 8 formed as described above, as shown in FIG. 117F, in positions opposite the first concave portions 81A, the first concave portions 82A are formed. Although not shown in FIG. 117F, in positions opposite the second concave portions 81B, the second concave portions 82B are formed. Thereafter, by photolithography and etching, in regions of the insulating film 8 corresponding to one end portion and the other end portion of the primary coil 3A, the first contact hole 14A (see FIG. 110) and the second contact hole 15A (see FIG. 102E) penetrating the insulating film 8 are respectively formed. Likewise, in regions of the insulating film 8 corresponding to one end portion and the other end portion of the secondary coil 3B, the third contact hole 14B (see FIG. 110) and the fourth contact hole 15B (see FIG. 104E) penetrating the insulating film 8 are respectively formed.

Then, for example, by sputtering, on the insulating film 8 including the interiors of the contact holes 14A, 15A, 14B, and 15B, an electrode film forming the first to fourth electrodes 41 to 44 is formed. In the preferred embodiment, the electrode film made of Al is formed. Thereafter, by photolithography and etching, the electrode film is patterned, and thus as shown in FIGS. 102F, 104F, and 117F, the electrode film is separated into the first electrode film 41A, the second electrode film 42A, the third electrode film 43A, and the fourth electrode film 44A. In the surface of the first electrode film 41A formed as described above, as shown in FIG. 117F, the first concave portions 83A are formed in positions opposite the first concave portions 82A. Although not shown in FIG. 117F, the second concave portions 83B are formed in positions opposite the second concave portions 82B.

Then, as shown in FIGS. 102G and 104G, for example, by a CVD method, the passivation film 16 such as a nitride film is formed, and furthermore, polyimide is applied to form the resin film 17. For example, polyimide to which photosensitivity is added is applied, and the polyimide is developed after exposure with a pattern corresponding to the first to fourth cutout portions 18A, 19A, 18B, and 19B. In this way, the resin film 17 having a cutout portion corresponding to the first to fourth cutout portions 18A, 19A, 18B, and 19B is formed. Thereafter, as necessary, heat treatment for curing the resin film is performed. Then, by dry etching using the resin film 17 as a mask, the first to fourth cutout portions 18A, 19A, 18B, and 19B are formed in the passivation film 16.

Then, as shown in FIGS. 102H and 104H, a resist mask 52 having an opening 52*a* in a lattice shape matching with the boundary region Y (see FIG. 105) is formed. Plasma etching is performed via the resist mask 52, and thus as shown in FIGS. 102H and 104H, the original substrate 50, the insulating film 7, and the insulating film 8 are etched from the surface of the insulating film 8 to a predetermined depth. In this way, along the boundary region Y, a groove (scribe groove) 53 for cutting is formed.

Then, the resist mask 52 is peeled off. Thereafter, as shown in FIGS. 102I and 104I, for example, by a CVD method, an insulating film 54 such as a nitride film serving as the material of the passivation film 9 is formed over the entire region of the surface of the original substrate 50. Here, the insulating film 54 is also formed over the entire region of the inner surface (the side wall surface and the bottom wall surface) of the groove 53.

Then, as shown in FIGS. 102J and 104J, the insulating film 54 is selectively etched. Specifically, a part of the insulating film 54 other than the insulating film 54 on the side wall surface of the groove 53 (the passivation film 9) is removed. In this way, a part of the electrode films 41A to 44A that is not covered by the passivation film 16 and the resin film 17 is exposed. The insulating film 54 on the bottom surface of the groove 53 is removed.

Then, as shown in FIGS. 102K, 104K, and 117F, on the first to fourth electrode films 41A to 44A exposed from the first to fourth cutout portions 18A, 19A, 18B, and 19B, for example, by plating (preferably, electroless plating), plating growth is performed in the following order: for example, Ni, Pd, and Au. In this way, the first to fourth external connection electrodes 41B to 44B are formed. In the surface of the first external connection electrode 41B formed as described above, as shown in FIG. 117F, the first concave portions 84A are formed in positions opposite the first concave portions 83A. Although not shown in FIG. 117F, in the surface of the second external connection electrode 42B, the second concave portions 84B are formed in positions opposite the second concave portions 83B.

Thereafter, by a DBG (Dicing Before Grinding) method, a plurality of chip transformer regions X are divided into pieces. Specifically, as shown in FIGS. 102L and 104L, first, on the side of the surface of the original substrate 50 (the side of the external connection electrode), a supporting tape 71 having an adhesive surface 72 is adhered. Then, the original substrate 50 is polished from the rear surface to the bottom surface of the groove 53. In this way, the plurality of chip transformer regions X are separated into individual chip transformers 1. Thereafter, on a plurality of chip transformers 1A, the recovery step shown in FIGS. 45A to 45D or the recovery step shown in FIGS. 46A to 46C described in the first preferred embodiment of the second invention may be performed.

FIG. 118 is a partially cut perspective view of a chip transformer according to a third preferred embodiment of the fourth invention, and FIG. 119 is a plan view of a chip transformer. FIG. 120 is a cross-sectional view taken along line CXX-CXX in FIG. 119, and FIG. 121 is a partially enlarged cross-sectional view of FIG. 120. FIG. 122 is a cross-sectional view taken along line CXXII-CXXII in FIG. 119, FIG. 123 is a cross-sectional view taken along line CXXIII-CXXIII in FIG. 119, FIG. 124 is a cross-sectional view taken along line CXXIV-CXXIV in FIG. 119, FIG. 125 is a cross-sectional view taken along line CXXV-CXXV in FIG. 119 and FIG. 126 is a plan view showing a structure of the surface of a substrate by removing an arrangement formed on the surface of the substrate.

The chip transformer 1B is a minute chip part and is formed in the shape of a rectangular parallelepiped. The planar shape of the chip transformer 1B may be rectangular, the length L in the longitudinal direction may be about 0.4 mm and the length W in the lateral direction may be about 0.2 mm. The thickness T of the entire chip transformer 1 may be about 0.15 mm.

The chip transformer 1B includes a substrate 2, a primary coil 3A and a secondary coil 3B that are formed within the substrate 2, a first electrode 41 that is connected to one end portion of the primary coil 3A, a second electrode 42 that is connected to the other end portion of the primary coil 3A, a third electrode 43 that is connected to one end portion of the secondary coil 3B, and a fourth electrode 44 that is connected to the other end of the secondary coil 3B. The number of windings of the primary coil 3A differs from the number of windings of the secondary coil 3B. Although in the preferred embodiment, an example where the number of windings of the secondary coil 3B is greater than the number of windings of the primary coil 3A is described, the number of windings of the primary coil 3A may be greater than the number of windings of the secondary coil 3B.

In the following description, the "front" refers to the lower side of the plane of FIG. 119, the "back" refers to the upper side of the plane of FIG. 119, the "left" refers to the left side of the plane of FIG. 119, and the "right" refers to the right side of the plane of FIG. 119.

The substrate 2 is formed in the shape of a rectangular parallelepiped, and includes a pair of main surfaces 2*a* and 2*b* and four side surfaces 2*c*. One (the main surface 2*a* on the upper surface side in FIG. 118) of the pair of main surfaces 2*a* and 2*b* is an element formation surface. In the following description, the main surface 2*a* is referred to as an "element formation surface 2*a*," and the main surface 2*b* on the side opposite to the element formation surface 2*a* is referred to as a "rear surface 2*b*." In the preferred embodiment, the substrate 2 is formed with a substrate main body 6 and an insulating film 7 formed on the surface thereof, and the surface of the insulating film 7 on the side opposite to the side of the substrate main body 6 is the element formation surface 2*a*. In the preferred embodiment, the substrate main body 6 is formed with a silicon substrate, and the insulating film 7 is formed with a thermal oxide film ($SiO_2$). The element formation surface 2*a* is formed in the shape of a rectangle in plan view when seen in a normal direction perpendicular to the element formation surface 2*a*. The surface (element formation surface 2*a*) of the substrate 2 is covered by an insulating film 8. The four side surfaces 2*c* of the substrate 2 and the outer peripheral surface of the insulating film 8 are covered by a passivation film 9 such as a nitride film.

With reference to FIGS. 119 and 126, in the element formation surface 2*a*, in the left side portion thereof, a primary side electrode pair formation region 47 for the formation of primary side electrode pairs 41 and 42 is provided, and in the right side portion thereof, a secondary side electrode pair formation region 48 for the formation of secondary side electrode pairs 43 and 44 is provided. These regions 47 and 48 are formed, in plan view, in the shape of a rectangle which is long in a front/back direction. On the element formation surface 2*a* between the primary side electrode pair formation region 47 and the secondary side electrode pair formation region 48, a coil formation region 49 is provided. In the preferred embodiment, the coil formation region 49 is formed in the shape of a rectangle.

In the back half of the primary side electrode pair formation region 47, a first electrode formation region 47A is provided, and in the front half, a second electrode formation region 47B is provided. In the back half of the secondary side electrode pair formation region 48, a third electrode formation region 48A is provided, and in the front half, a fourth electrode formation region 48B is provided.

In the first electrode formation region 47A, the external connection electrode (the first external connection electrode) 41B of the first electrode 41 is disposed, and in the second electrode formation region 47B, the external connection electrode (the second external connection electrode) 42B of the second electrode 42 is disposed. The first external connection electrode 41B is formed, in plan view, in the shape of a rectangle, and covers a region of the first electrode formation region 47A other than an edge portion on the side of the second electrode formation region 47B. The second external connection electrode 42B is formed, in plan view, in the shape of a rectangle, and covers a region of the second electrode formation region 47B other than an edge portion on the side of the first electrode formation region 47A.

In the third electrode formation region 48A, the external connection electrode (the third external connection electrode) 43B of the third electrode 43 is disposed, and in the fourth electrode formation region 48B, the external connection electrode (the fourth external connection electrode) 44B of the fourth electrode 44 is disposed. The third external connection electrode 43B is formed, in plan view, in the shape of a rectangle, and covers a region of the third electrode formation region 48A other than an edge portion on the side of the fourth electrode formation region 48B. The fourth external connection electrode 44B is formed, in plan view, in the shape of a rectangle, and covers a region of the fourth electrode formation region 48A other than an edge portion on the side of the third electrode formation region 48A.

With reference to FIGS. 119 to 124 and 126, in the substrate 2, the primary coil formation trench 11A and the secondary coil formation trench 11B are formed in the coil formation region 49, by digging down, to a predetermined depth from the element formation surface 2*a*. Each of the coil formation trenches 11A and 11B is formed, in plan view, in the shape of a spiral. The primary coil formation trench 11A and the secondary coil formation trench 11B are disposed, in plan view, such that in a gap of one trench, the other trench is disposed. However, since in the preferred embodiment, the number of windings of the secondary coil formation trench 11B is greater than the number of windings of the primary coil formation trench 11A, in a part of the gap on the inner peripheral side of the secondary coil formation trench 11B, the primary coil formation trench 11A is not disposed. In other words, the primary coil formation trench 11A and the secondary coil formation trench 11B are disposed, in plan view, except the part of the inner peripheral side of the secondary coil formation trench 11B, such that they are alternately arrayed from the inner peripheral side to the outer peripheral side. Hence, the primary coil formation trench 11A and the secondary coil formation trench 11B are disposed so as not to intersect each other. In the preferred embodiment, the coil formation trenches 11A and 11B are formed, in plan view, in the shape of a quadrilateral spiral, and have a plurality of rectilinear portions parallel to the side surfaces 2*c* of the substrate 2.

The cross section (cross section in a direction perpendicular to a direction in which the coil formation trenches 11A and 11B are extended in the spiral direction) of the coil formation trenches 11A and 11B is formed in the shape of a rectangle which is long in the direction of the thickness of the substrate 2. For example, the width of the coil formation trenches 11A and 11B may be 1 μm or more and 3 μm or less. For example, the depth of the coil formation trenches 11A and 11B may be 10 μm or more and 82 μm or less. The depth of the coil formation trenches 11A and 11B is preferably 10 μm or more so that the internal resistance of the coils 3A and 3B formed within the coil formation trenches 11A and 11B is decreased.

As shown in FIG. 121, the primary coil formation trench 11A is formed with a first trench part 11Aa that is formed in the insulating film 7 and a second trench part 11Ab that is formed in the substrate main body 6 and that communicates with the first trench part 11Aa. Likewise, the secondary coil formation trench 11B is formed with a first trench part 11Ba that is formed in the insulating film 7 and a second trench part 11Bb that is formed in the substrate main body 6 and that communicates with the first trench part 11Ba.

On the inner surface of the coil formation trenches 11A and 11B (the second trench parts 11Ab and 11Bb) in the substrate main body 6, an insulating film 12 formed with an oxide film or the like is formed. In the preferred embodiment, the insulating film 12 is formed with a thermal oxide film ($SiO_2$), and when the thermal oxide film is formed on the inner surface of the coil formation trenches 11A and 11B, the surrounding wall (the side wall and the bottom wall) of the coil formation trenches 11A and 11B (the second trench parts 11Ab and 11Bb) in the substrate main body 6 is thermally oxidized into an insulator portion (thermal oxide film) 30 having insulation. In the preferred embodiment, an example is described where the entire wall sandwiched by the coil formation trenches 11A and 11B (the second trench parts 11Ab and 11Bb) in the substrate main body 6 is a thermal oxide film.

On the surface of the insulating film 12 within the coil formation trenches 11A and 11B (the second trench parts 11Ab and 11Bb) and on the inner surface of the coil formation trenches 11A and 11B (the first trench parts 11Aa and 11Ba) in the insulating film 7, a barrier metal film 13 is formed. The barrier metal film 13 is formed of, for example, TiN. The thickness of the barrier metal film 13 is about 400 to 500 angstroms. Within the coil formation trenches 11A and 11B, a conductive member 51 is embedded while being in contact with the barrier metal film 13. In the preferred embodiment, the conductive member 51 is formed of tungsten (W).

The primary coil 3A is formed with the conductive member 51 embedded within the primary coil formation trench 11A. Hence, the primary coil 3A is formed, in plan view, in the shape of a spiral (in the shape of a quadrilateral spiral) of the same pattern as the primary coil formation trench 11A. Specifically, the primary coil 3A includes a plurality of plate-shaped parts parallel to the side surfaces 2*c* of the substrate 2. The secondary coil 3B is formed with the conductive member 51 embedded within the secondary coil formation trench 11B. Hence, the secondary coil 3B is formed, in plan view, in the shape of a spiral (in the shape of a quadrilateral spiral) of the same pattern as the secondary coil formation trench 11B. Specifically, the secondary coil 3B includes a plurality of plate-shaped parts parallel to the side surfaces 2*c* of the substrate 2. Hence, the number of windings of the secondary coil 3B is greater than the number of windings of the primary coil 3A.

On the element formation surface 2*a* (the surface of the insulating film 7) of the substrate 2, an insulating film 8 is formed so as to coat the element formation surface 2*a* and the conductive member 51 (the coils 3A and 3B). The insulating film 8 is formed, in plan view, in the shape of a rectangle matching with the element formation surface 2*a*. The insulating film 8 is formed with, for example, a USG (Undoped Silicate Glass) film. In the insulating film 8, a first contact hole 14A (see FIGS. 119 and 123) that exposes the outer peripheral side end portion of the primary coil 3A and a second contact hole 15A (see FIGS. 119 and 120) that exposes the inner peripheral side end portion of the primary coil 3A are formed. Furthermore, in the insulating film 8, a third contact hole 14B (see FIGS. 119 and 122) that exposes the inner peripheral side end portion of the secondary coil 3B and a fourth contact hole 15B (see FIGS. 119 and 124) that exposes the outer peripheral side end portion of the secondary coil 3B are formed. As described above, in the side surfaces 2*c* of the substrate 2 and the outer peripheral surface of the insulating film 8, the passivation film 9 formed with a nitride film or the like is formed.

On the surface of the insulating film 8, the first electrode 41, the second electrode 42, the third electrode 43, and the fourth electrode 44 are formed. With reference to FIGS. 119, 122, 123, and 125, the first electrode 41 includes a first electrode film 41A that is formed on the surface of the insulating film 8 and a first external connection electrode 41B that is bonded to the first electrode film 41A. As shown in FIG. 119, the first electrode film 41A includes a drawing electrode 41Aa that is connected to the outer peripheral side end portion of the primary coil 3A and a first pad 41Ab that is formed integrally with the drawing electrode 41Aa. The first pad 41Ab is formed to be rectangular at a corner portion of the element formation surface 2*a* on the side of the first electrode formation region 47A. The first external connection electrode 41B is connected to the first pad 41Ab. As shown in FIGS. 119 and 123, the drawing electrode 41Aa enters the first contact hole 14A from the surface of the insulating film 8, and is connected to the outer peripheral side end portion of the primary coil 3A within the first contact hole 14A. The drawing electrode 41Aa is formed straight along a straight line that passes above one end portion of the primary coil 3A to reach the first pad 41Ab.

By extending the outer peripheral side end portion of the primary coil formation trench 11A to a position below the first pad 41Ab, the outer peripheral side end portion of the primary coil 3A may be disposed in a position below the first pad 41Ab. In this way, since the first contact hole 14A can be formed in a position below the first pad 41Ab, one end portion of the primary coil 3A can be connected to the first pad 41Ab. In this case, since the first electrode film 41A can be formed with only the first pad 41Ab, the drawing electrode 41Aa is not needed.

The second electrode 42 includes a second electrode film 42A that is formed on the surface of the insulating film 8 and a second external connection electrode 42B that is bonded to the second electrode film 42A. As shown in FIG. 119, the second electrode film 42A includes a drawing electrode 42Aa that is connected to the inner peripheral side end portion of the primary coil 3A and a second pad 42Ab that is formed integrally with the drawing electrode 42Aa. The second pad 42Ab is formed to be rectangular at the corner portion of the element formation surface 2*a* on the side of the second electrode formation region 47B. The second external connection electrode 42B is connected to the second pad 42Ab. As shown in FIGS. 119 and 120, the drawing electrode 42Aa enters the second contact hole 15A from the surface of the insulating film 8, and is connected to the inner peripheral side end portion of the primary coil 3A within the second contact hole 15A. The drawing electrode 42Aa is formed straight along a straight line that passes above the inner peripheral side end portion of the primary coil 3A to reach the second pad 42Ab.

With reference to FIGS. 119, 122, and 124, the third electrode 43 includes a third electrode film 43A that is formed on the surface of the insulating film 8 and a third external connection electrode 43B that is bonded to the third electrode film 43A. As shown in FIG. 119, the third electrode film 43A includes a drawing electrode 43Aa that is connected to the inner peripheral side end portion of the secondary coil 3B and a third pad 43Ab that is formed integrally with the drawing electrode 43Aa. The third pad 43Ab is formed to be rectangular at the corner portion of the element formation surface 2*a* on the side of the third electrode formation region 48A. The third external connection electrode 43B is connected to the third pad 43Ab. As shown in FIGS. 119 and 122, the drawing electrode 43Aa enters the third contact hole 14B from the surface of the insulating film 8, and is connected to the inner peripheral side end portion of the secondary coil 3B within the third contact hole 14B. The drawing electrode 43Aa is formed straight along a straight line that passes above the inner peripheral side end portion of the secondary coil 3B to reach the third pad 43Ab.

The fourth electrode 44 includes a fourth electrode film 44A that is formed on the surface of the insulating film 8 and a fourth external connection electrode 44B that is bonded to the fourth electrode film 44A. As shown in FIG. 119, the fourth electrode film 44A includes a drawing electrode 44Aa that is connected to the outer peripheral side end portion of the secondary coil 3B and a fourth pad 44Ab that is formed integrally with the drawing electrode 44Aa. The fourth pad 44Ab is formed to be rectangular at the corner portion of the element formation surface 2*a* on the side of the fourth electrode formation region 48B. The second external connection electrode 42B is connected to the second pad 42Ab. As shown in FIGS. 119 and 124, the drawing electrode 44Aa enters the fourth contact hole 15B from the surface of the insulating film 8, and is connected to the outer peripheral side end portion of the secondary coil 3B within the fourth contact hole 15B. The drawing electrode 44Aa is formed straight along a straight line that passes above the outer peripheral side end portion of the secondary coil 3B to reach the fourth pad 44Ab. In the preferred embodiment, as the electrode films 41A to 44A, Al films are used.

By extending the outer peripheral side end portion of the secondary coil formation trench 11B to a position below the fourth pad 44Ab, the outer peripheral side end portion of the secondary coil 3B may be disposed in a position below the fourth pad 44Ab. In this way, since the fourth contact hole 15B can be formed in a position below the fourth pad 44Ab, the outer peripheral side end portion of the secondary coil 3B can be connected to the fourth pad 44Ab. In this case, since the fourth electrode film 44A can be formed with only the fourth pad 44Ab, the drawing electrode 44Aa is not needed.

The first to fourth electrode films 41A to 44A are covered by a passivation film 16 formed with a nitride film (SiN), and furthermore, on the passivation film 16, a resin film 17 such as polyimide is formed. In the passivation film 16 and the resin film 17, in plan view, in regions corresponding to the vicinity of the first pad 41Ab, the vicinity of the second pad 42Ab, the vicinity of the third pad 43Ab, and the vicinity of the fourth pad 44Ab, first, second, third, and fourth cutout portions 18A, 19A, 18B, and 19B (see FIGS. 120, 122, and 125) are respectively formed.

A region of the surface of the first pad 41Ab other than an edge portion on the side of the third pad 43Ab is exposed by the first cutout portion 18A. A region of the surface of the second pad 42Ab other than an edge portion on the side of the fourth pad 44Ab is exposed by the second cutout portion 19A. A region of the surface of the third pad 43Ab other than an edge portion on the side of the first pad 41Ab is exposed by the third cutout portion 18B. A region of the surface of the fourth pad 44Ab other than an edge portion on the side of the second pad 42Ab is exposed by the fourth cutout portion 19B. In other words, the passivation film 16 and the resin film 17 are formed, in plan view, in the coil formation region 49, the boundary portion region between the first electrode formation region 47A and the second electrode formation region 47B, and the boundary portion region between the third electrode formation region 48A and the fourth electrode formation region 48B.

The first, second, third, and fourth external connection electrodes 41B, 42B, 43B, and 44B fill the first, second, third, and fourth cutout portions 18A, 19A, 18B, and 19B respectively. The first external connection electrode 41B and the third external connection electrode 43B are formed so as to protrude from the resin film 17, and include a drawing portion 20 that is drawn to the side of the other external connection electrode along the surface of the resin film 17. Likewise, the second external connection electrode 42B and the fourth external connection electrode 44B are formed so as to protrude from the resin film 17, and include the drawing portion 20 that is drawn to the side of the other external connection electrode along the surface of the resin film 17.

In the preferred embodiment, the first external connection electrode 41B is formed so as to cover not only the surface of the first electrode film 41A (the pad 41Ab) and the insulating film 8 exposed within the first cutout portion 18A but also the upper end surface of the passivation film 9 on the corner portion on the side of the first pad 41Ab of the element formation surface 2*a*. The two side surfaces other than the two side surfaces on the inner side of the first external connection electrode 41B are formed so as to be flush with the surface of the passivation film 9 covering the peripheral surface of the insulating film 8 on the corner portion of the element formation surface 2*a* on the side of the first pad 41Ab.

The second external connection electrode 42B is formed so as to cover not only the surface of the second electrode film 42A (the pad 42Ab) and the insulating film 8 exposed within the second cutout portion 19A but also the upper end surface of the passivation film 9 on the corner portion of the element formation surface 2*a* on the side of the second pad 42Ab. The two side surfaces other than the two side surfaces on the inner side of the second external connection electrode 42B are formed so as to be flush with the surface of the passivation film 9 covering the peripheral surface of the insulating film 8 on the corner portion of the element formation surface 2*a* on the side of the second pad 42Ab.

The third external connection electrode 43B is formed so as to cover not only the surface of the third electrode film 43A (the pad 43Ab) and the insulating film 8 exposed within the third cutout portion 18B but also the upper end surface of the passivation film 9 on the corner portion of the element formation surface 2*a* on the side of the third pad 43Ab. The two side surfaces other than the two side surfaces on the inner side of the third external connection electrode 43B are formed so as to be flush with the surface of the passivation film 9 covering the peripheral surface of the insulating film 8 on the corner portion of the element formation surface 2$a$ on the side of the third pad 43Ab.

The fourth external connection electrode 44B is formed so as to cover not only the surface of the fourth electrode film 44A (the pad 44Ab) and the insulating film 8 exposed within the fourth cutout portion 19B but also the upper end surface of the passivation film 9 on the corner portion of the element formation surface 2$a$ on the side of the fourth pad 44Ab. The two side surfaces other than the two side surfaces on the inner side of the fourth external connection electrode 44B are formed so as to be flush with the surface of the passivation film 9 covering the peripheral surface of the insulating film 8 on the corner portion of the element formation surface 2$a$ on the side of the fourth pad 44Ab. The external connection electrodes 41B, 42B, 43B, and 44B may be formed with, for example, a Ni/Pd/Au laminated film having a Ni film in contact with the electrode films 41A, 42A, 43A, and 44A, a Pd film formed thereon, and an Au film formed thereon. The laminated film described above can be formed by a plating method.

The passivation film 16 and the resin film 17 coat, from the surface, the coils 3A and 3B, the insulating film 8, and the electrode films 41A to 44A in the coil formation region 49 on the element formation surface 2$a$, a region between the first external connection electrode 41B and the second external connection electrode 42B, and a region between the third external connection electrode 43B and the fourth external connection electrode 44B, and function as a protective film to protect them. On the other hand, the passivation film 9 formed on the side surfaces 2$c$ of the substrate 2 and the outer peripheral surface of the insulating film 8 functions as a protective film to protect the side surfaces 2$c$ of the substrate 2 and the outer peripheral surface of the insulating film 8.

FIG. 127 is an electrical circuit diagram showing an electrical structure within the chip transformer. One end of the primary coil 3A (represented by a symbol L1 in FIG. 127) is connected to the first electrode 41, and the other end of the primary coil 3A is connected to the second electrode 42. One end of the secondary coil 3B (represented by a symbol L2 in FIG. 127) is connected to the third electrode 43, and the other end of the secondary coil 3B is connected to the fourth electrode 44. In this way, it functions as a transformer.

As a parameter indicating the performance (quality) of the transformer, the Q (Quality Factor) value of the coil is present. As the Q value of the coil is increased, its loss is decreased, and the coil has an excellent characteristic as a high-frequency inductance.

The Q value of the coils 3A and 3B is represented by formula (9) below.

$$Q=2\pi fL/R \tag{9}$$

In the formula (9) above, f represents the frequency of a current flowing through the coil, L represents the inductance of the coils 3A and 3B and R represents the internal resistance of the coils 3A and 3B.

In the arrangement of the third preferred embodiment of the fourth invention, in the substrate 2, the primary coil formation trench 11A and the secondary coil formation trench 11B obtained by digging down from the element formation surface 2$a$ are formed, in plan view, in the shape of a spiral. The conductive member 51 is embedded within the primary coil formation trench 11A and thus the primary coil 3A is formed, and the conductive member 51 is embedded within the secondary coil formation trench 11B and thus the secondary coil 3B is formed. Hence, it is possible to increase the cross-sectional area of the coils 3A and 3B (the cross-sectional area of the coils 3A and 3B perpendicular to the direction in which the coils 3A and 3B are extended in the spiral direction), and thus it is possible to decrease the internal resistance (R in the formula (9) above) of the coils 3A and 3B. In this way, since the Q value of the coils 3A and 3B can be increased, it is possible to provide a high performance chip transformer.

In the third preferred embodiment of the fourth invention, as compared with the first preferred embodiment of the fourth invention, the primary coil 3A and the secondary coil 3B can be disposed close to each other, and thus it is possible to provide a higher performance chip transformer.

The coil formation trenches 11A and 11B are formed in the substrate 2, the conductive member 51 is embedded within the coil formation trenches 11A and 11B and thus it is possible to form the coils 3A and 3B, with the result that the coils 3A and 3B are easily manufactured. In this way, it is possible to provide a chip transformer that is easily manufactured.

Furthermore, on the element formation surface 2$a$, which is one surface of the substrate 2, the external connection electrodes 41B to 44B of the first to fourth electrodes 41 to 44 are formed. Hence, as shown in FIG. 128, the element formation surface 2$a$ is made to face a mounting substrate 91, the external connection electrodes 41B to 44B are bonded on the mounting substrate 91 by a solder 92 and thus it is possible to form a circuit assembly in which the chip transformer 1B is surface-mounted on the mounting substrate 91. In other words, it is possible to provide a flip-chip connection-type chip transformer 1B, and it is possible to connect the chip transformer 1B to the mounting substrate 91 by a face-down bonding in which the element formation surface 2$a$ is made to face the mounting substrate 91 and wireless bonding. In this way, it is possible to decrease the occupied space of the chip transformer 1B on the mounting substrate 91. In particular, it is possible to realize a low profile chip transformer 1B on the mounting substrate 91. In this way, it is possible to effectively utilize the space within the housing of a small-sized electronic device or the like and to contribute to high-density mounting and miniaturization.

FIGS. 129A to 129L are cross-sectional views for illustrating an example of the manufacturing step of the chip transformer, and show cut surfaces corresponding to FIG. 120. FIGS. 130A to 130E are partially enlarged cross-sectional views showing the details of the manufacturing step of a coil, and show cut surfaces corresponding to FIG. 121.

First, as shown in FIG. 129A, an original substrate 50 that is an original of the substrate main body 6 is prepared. On the surface of the original substrate 50, the insulating film 7 such as a thermal oxide film or a CVD oxide film is formed. In the preferred embodiment, the insulating film 7 is a thermal oxide film. The surface of the insulating film 7 corresponds to the element formation surface 2$a$ of the substrate 2.

FIG. 131 is a schematic plan view of part of the original substrate 50 in which the insulating film 7 is formed on the surface. As shown in FIG. 131, in the element formation surface 2$a$, chip transformer regions X corresponding to a plurality of chip transformers 1B are disposed in a matrix. Between the chip transformer regions X adjacent to each other, a boundary region Y is provided. The boundary region Y is a region in the shape of a band having a substantially constant width, extends in two directions perpendicular to each other and is formed in a lattice shape. After necessary steps are performed on the original substrate 50 in which the insulating film 7 is formed on the surface, the original substrate 50 is separated along the boundary region Y, and thus it is possible to obtain a plurality of chip transformers 1B.

The steps performed on the original substrate 50 in which the insulating film 7 is formed on the surface are as follows. First, as shown in FIGS. 129A and 130A, by photolithography and etching, a part of the insulating film 7 that corresponds to a region in which the coil formation trench 11A and the secondary coil formation trench 11B need to be formed is removed. In this way, in the insulating film 7, the first trench part 11Aa of the primary coil formation trench 11A and the first trench part 11Ba of the secondary coil formation trench 11B are formed. Then, a hard mask formed with the insulating film 7 is used, and thus the original substrate 50 is etched. In this way, as shown in FIGS. 129B and 130A, the second trench part 11Ab of the primary coil formation trench 11A and the second trench part 11Bb of the secondary coil formation trench 11B are formed in the original substrate 50. In this way, in the insulating film 7 and the original substrate 50, the primary coil formation trench 11A and the secondary coil trench 11B are formed. The coil formation trenches 11A and 11B may be formed by, for example, a so-called BOSCH process. The BOSCH process is a process that is generally used to make a hollow part in a MEMS (Micro Electro Mechanical System).

Then, as shown in FIGS. 129B and 130B, on the inner surface of the coil formation trenches 11A and 11B, the insulating film (thermal oxide film) 12 is formed by a thermal oxidization method. Here, the surrounding wall (the side wall and the bottom wall) of the coil formation trenches 11A and 11B (the second trench parts 11Ab and 11Bb) in the original substrate 50 is thermally oxidized into an insulator portion (thermal oxide film) 30 having insulation. In FIG. 129B, the insulating film 12 is omitted but the insulator portion 30 is shown. In the preferred embodiment, the entire wall sandwiched by the coil formation trenches 11A and 12A (the second trench parts 11Ab and 11Bb) in the substrate main body 6 are formed into the thermal oxide film.

Then, for example, by a sputtering method, the barrier metal film 13 made of TiN is formed on the element formation surface 2*a* including the interiors of the trenches 11A and 11B. In this way, as shown in FIG. 130C, the barrier metal film 13 made of TiN is formed on the surfaces of the insulating film 12 and the insulating film 7 within the coil formation trenches 11A and 11B and the surface of the insulating film 7 outside the coil formation trenches 11A and 11B. Thereafter, annealing processing is performed.

Thereafter, as shown in FIGS. 129C and 130D, for example, by a CVD method, on the element formation surface 2*a* including the interiors of the coil formation trenches 11A and 11B, the conductive member 51 formed of tungsten (W) is deposited.

Then, for example, by an etch back method, overall etching is performed on the conductive member 51 from its surface. The overall etching is continued until the surface of the conductive member 51 is flush with the surface of the insulating film 7. In this way, as shown in FIGS. 129D and 130E, the conductive member 51 is embedded within the coil formation trenches 11A and 11B while in contact with the barrier metal film 13. By the conductive member 51 embedded within the primary coil formation trench 11A, the primary coil 3A in the shape of a spiral when seen in plan view is formed, and by the conductive member 51 embedded within the secondary coil formation trench 11B, the secondary coil 3B in the shape of a spiral when seen in plan view is formed.

Then, as shown in FIG. 129E, on the insulating film 7, the insulating film 8 formed with a USG (Undoped Silicate Glass) film or the like is formed so as to coat the insulating film 7 (the element formation surface 2*a*) and the coils 3A and 3B. The insulating film 8 is formed by, for example, a CVD method. Thereafter, by photolithography and etching, in regions of the insulating film 8 corresponding to the outer peripheral side end portion and the inner peripheral side end portion of the primary coil 3A, the first contact hole 14A (see FIG. 123) and the second contact hole 15A (see FIG. 129E) penetrating the insulating film 8 are respectively formed. Likewise, in regions of the insulating film 8 corresponding to the inner peripheral side end portion and the outer peripheral side end portion of the secondary coil 3B, the third contact hole 14B (see FIG. 122) and the fourth contact hole 15B (see FIG. 124) penetrating the insulating film 8 are respectively formed.

Then, for example, by sputtering, on the insulating film 8 including the interiors of the contact holes 14A, 15A, 14B, and 15B, an electrode film forming the first to fourth electrodes 41 to 44 is formed. In the preferred embodiment, the electrode film made of Al is formed. Thereafter, by photolithography and etching, the electrode film is patterned, and thus as shown in FIG. 129F, the electrode film is separated into the first electrode film 41A, the second electrode film 42A, the third electrode film 43A, and the fourth electrode film 44A.

Then, as shown in FIG. 129G, for example, by a CVD method, the passivation film 16 such as a nitride film is formed, and furthermore, polyimide is applied to form the resin film 17. For example, polyimide to which photosensitivity is added is applied, and the polyimide is developed after exposure with a pattern corresponding to the first to fourth cutout portions 18A, 19A, 18B, and 19B. In this way, the resin film 17 having a cutout portion corresponding to the first to fourth cutout portions 18A, 19A, 18B, and 19B is formed. Thereafter, as necessary, heat treatment for curing the resin film is performed. Then, by dry etching using the resin film 17 as a mask, the first to fourth cutout portions 18A, 19A, 18B, and 19B are formed in the passivation film 16.

Then, as shown in FIG. 129H, a resist mask 52 having an opening 52*a* in a lattice shape matching with the boundary region Y (see FIG. 131) is formed. Plasma etching is performed via the resist mask 52, and thus as shown in FIG. 129H, the original substrate 50, the insulating film 7, and the insulating film 8 are etched from the surface of the insulating film 8 to a predetermined depth. In this way, along the boundary region Y, a groove (scribe groove) 53 for cutting is formed.

Then, the resist mask 52 is peeled off. Thereafter, as shown in FIGS. 129I, for example, by a CVD method, an insulating film 54 such as a nitride film serving as the material of the passivation film 9 is formed over the entire region of the surface of the original substrate 50. Here, the insulating film 54 is also formed over the entire region of the inner surface (the side wall surface and the bottom wall surface) of the groove 53.

Then, as shown in FIG. 129J, the insulating film 54 is selectively etched. Specifically, a part of the insulating film 54 other than the insulating film 54 on the side wall surface of the groove 53 (the passivation film 9) is removed. In this way, a part of the electrode films 41A to 44A that is not covered by the passivation film 16 and the resin film 17 is exposed. The insulating film 54 on the bottom surface of the groove 53 is removed.

Then, as shown in FIG. 129K, on the first to fourth electrode films 41A to 44A exposed from the first to fourth cutout portions 18A, 19A, 18B, and 19B, for example, by plating (preferably, electroless plating), plating growth is performed in the following order: for example, Ni, Pd, and Au. In this way, the first to fourth external connection electrodes 41B to 44B are formed.

Thereafter, by a DBG (Dicing Before Grinding) method, a plurality of chip transformer regions X are divided into pieces. Specifically, as shown in FIG. 129L, first, on the side of the surface of the original substrate 50 (the side of the external connection electrode), a supporting tape 71 having an adhesive surface 72 is adhered. Then, the original substrate 50 is polished from the rear surface to the bottom surface of the groove 53. In this way, the plurality of chip transformer regions X are separated into individual chip transformers 1B. Thereafter, on a plurality of chip transformers 1B, the recovery step shown in FIGS. 45A to 45D or the recovery step shown in FIGS. 46A to 46C described in the first preferred embodiment of the second invention may be performed.

FIG. 132 is a partially cut perspective view of a chip transformer according to a fourth preferred embodiment of the fourth invention, FIG. 133A is a plan view showing the appearance of the chip transformer when seen from the side of the electrode and FIG. 133B is a plan view showing the internal structure of the chip transformer. FIG. 134 is a cross-sectional view taken along line CXXXIV-CXXXIV in FIG. 133B, and FIG. 135 is a partially enlarged cross-sectional view of FIG. 134. FIG. 136 is a cross-sectional view taken along line CXXXVI-CXXXVI in FIG. 133B, FIG. 137 is a cross-sectional view taken along line CXXXVII-CXXXVII in FIG. 133B and FIG. 138 is a cross-sectional view taken along line CXXXVIII-CXXXVIII in FIG. 133B. FIG. 139 is a cross-sectional view taken along line CXXXIX-CXXXIX in FIG. 133B, and FIG. 140 is a partially enlarged cross-sectional view of FIG. 139. FIG. 141 is a plan view showing a structure of the surface of a substrate by removing an arrangement formed on the surface of the substrate.

The chip transformer 1C is a minute chip part and is formed in the shape of a rectangular parallelepiped. The planar shape of the chip transformer 1B may be rectangular, the length L in the longitudinal direction may be about 0.4 mm and the length W in the lateral direction may be about 0.2 mm. The thickness T of the entire chip transformer 1 may be about 0.15 mm.

The chip transformer 1B includes a substrate 2, a primary coil 3A and a secondary coil 3B that are formed within the substrate 2, a first electrode 41 that is connected to one end portion of the primary coil 3A, a second electrode 42 that is connected to the other end portion of the primary coil 3A, a third electrode 43 that is connected to one end portion of the secondary coil 3B, and a fourth electrode 44 that is connected to the other end of the secondary coil 3B. The number of windings of the primary coil 3A differs from the number of windings of the secondary coil 3B. Although in the preferred embodiment, an example where the number of windings of the secondary coil 3B is greater than the number of windings of the primary coil 3A is described, the number of windings of the primary coil 3A may be greater than the number of windings of the secondary coil 3B.

The chip transformer 1C in the fourth preferred embodiment of the fourth invention differs from the chip transformer 1B in the third preferred embodiment of the fourth invention in that in the surface of a primary side electrode pair (the first electrode 41 and the second electrode 42), a plurality of concave portions 84A and 84B are respectively formed. In the surface of a secondary side electrode pair (the third electrode 43 and the fourth electrode 44), the concave portions 84A and 84B are not formed.

In the following description, the "front" refers to the lower side of the plane of FIG. 133B, the "back" refers to the upper side of the plane of FIG. 133B, the "left" refers to the left side of the plane of FIG. 133B and the "right" refers to the right side of the plane of FIG. 133B.

The substrate 2 is formed in the shape of a rectangular parallelepiped, and includes a pair of main surfaces 2*a* and 2*b* and four side surfaces 2*c*. One (the main surface 2*a* on the upper surface side in FIG. 132) of the pair of main surfaces 2*a* and 2*b* is an element formation surface. In the following description, the main surface 2*a* is referred to as an "element formation surface 2*a*," and the main surface 2*b* on the side opposite to the element formation surface 2*a* is referred to as a "rear surface 2*b*." In the preferred embodiment, the substrate 2 is formed with a substrate main body 6 and an insulating film 7 formed on the surface thereof, and the surface of the insulating film 7 on the side opposite to the side of the substrate main body 6 is the element formation surface 2*a*. In the preferred embodiment, the substrate main body 6 is formed with a silicon substrate, and the insulating film 7 is formed with a thermal oxide film ($SiO_2$). The element formation surface 2*a* is formed in the shape of a rectangle in plan view when seen in a normal direction perpendicular to the element formation surface 2*a*. The surface (element formation surface 2*a*) of the substrate 2 is covered by an insulating film 8. The four side surfaces 2*c* of the substrate 2 and the outer peripheral surface of the insulating film 8 are covered by a passivation film 9 such as a nitride film.

With reference to FIGS. 133B and 141, in the element formation surface 2*a*, in the left side portion thereof, a primary side electrode pair formation region 47 for the formation of primary side electrode pairs 41 and 42 is provided, and in the right side portion thereof, a secondary side electrode pair formation region 48 for the formation of secondary side electrode pairs 43 and 44 is provided. These regions 47 and 48 are formed, in plan view, in the shape of a rectangle which is long in a frontward/backward direction. On the element formation surface 2*a* between the primary side electrode pair formation region 47 and the secondary side electrode pair formation region 48, a coil formation region 49 is provided. In the preferred embodiment, the coil formation region 49 is formed in the shape of a rectangle.

In the back half of the primary side electrode pair formation region 47, a first electrode formation region 47A is provided, and in the front half, a second electrode formation region 47B is provided. In the back half of the secondary side electrode pair formation region 48, a third electrode formation region 48A is provided, and in the front half, a fourth electrode formation region 48B is provided.

In the first electrode formation region 47A, the external connection electrode (the first external connection electrode) 41B of the first electrode 41 is disposed, and in the second electrode formation region 47B, the external connection electrode (the second external connection electrode) 42B of the second electrode 42 is disposed. The first external connection electrode 41B is formed, in plan view, in the shape of a rectangle, and covers a region of the first electrode formation region 47A other than an edge portion on the side of the second electrode formation region 47B. The second external connection electrode 42B is formed, in plan view, in the shape of a rectangle, and covers a region of the second electrode formation region 47B other than an edge portion on the side of the first electrode formation region 47A.

In the third electrode formation region 48A, the external connection electrode (the third external connection electrode) 43B of the third electrode 43 is disposed, and in the fourth electrode formation region 48B, the external connection electrode (the fourth external connection electrode) 44B of the fourth electrode 44 is disposed. The third external connection electrode 43B is formed, in plan view, in the shape of a rectangle, and covers a region of the third electrode formation region 48A other than an edge portion on the side of the fourth electrode formation region 48B. The fourth external connection electrode 44B is formed, in plan view, in the shape of a rectangle, and covers a region of the fourth electrode formation region 48B other than an edge portion on the side of the third electrode formation region 48A.

In the surface of the first external connection electrode 41B and the surface of the second external connection electrode 42B, a plurality of first concave portions 84A and a plurality of second concave portions 84B are respectively formed. The plurality of first concave portions 84A are formed, in plan view, in the shape of a straight line extending in the longitudinal direction of the substrate 2, and are formed at an interval in the lateral direction of the substrate 2. Likewise, The plurality of second concave portions 84B are formed, in plan view, in the shape of a straight line extending in the longitudinal direction of the substrate 2, and are formed at an interval in the lateral direction of the substrate 2. The cross-sectional shape of the concave portions 84A and 84B is the shape of the letter V. In the surfaces of the third external connection electrode 43B and the fourth external connection electrode 44B, the concave portions 84A and 84B are not formed.

With reference to FIGS. 133B to 138 and 141, in the substrate 2, the primary coil formation trench 11A and the secondary coil formation trench 11B are formed by digging down, in the coil formation region 49, to a predetermined depth from the element formation surface 2*a*. Each of the coil formation trenches 11A and 11B is formed, in plan view, in the shape of a spiral. The primary coil formation trench 11A and the secondary coil formation trench 11B are disposed, in plan view, such that in a gap of one trench, the other trench is disposed. However, since in the preferred embodiment, the number of windings of the secondary coil formation trench 11B is greater than the number of windings of the primary coil formation trench 11A, in a part of the gap on the inner peripheral side of the secondary coil formation trench 11B, the primary coil formation trench 11A is not disposed. In other words, the primary coil formation trench 11A and the secondary coil formation trench 11B are disposed, in plan view, except the part of the inner peripheral side of the secondary coil formation trench 11B, such that they are alternately arrayed from the inner peripheral side to the outer peripheral side. Hence, the primary coil formation trench 11A and the secondary coil formation trench 11B are disposed so as not to intersect each other. In the preferred embodiment, the coil formation trenches 11A and 11B are formed, in plan view, in the shape of a quadrilateral spiral, and have a plurality of rectilinear portions parallel to the side surfaces 2*c* of the substrate 2. The cross section (cross section in a direction perpendicular to a direction in which the coil formation trenches 11A and 11B are extended in the spiral direction) of the coil formation trenches 11A and 11B is formed in the shape of a rectangle which is long in the direction of the thickness of the substrate 2. For example, the width of the coil formation trenches 11A and 11B may be 1 μm or more and 3 μm or less. For example, the depth of the coil formation trenches 11A and 11B may be 10 μm or more and 82 μm or less. The depth of the coil formation trenches 11A and 11B is preferably 10 μm or more so that the internal resistance of the coils 3A and 3B formed within the coil formation trenches 11A and 11B is decreased.

Furthermore, in a region opposite the first external connection electrode 41B within the first electrode formation region 47A, in the substrate 2, a plurality of first electrode-side trenches (concave portion formation trenches) 21A are formed by digging down from the element formation surface 2*a* to a predetermined depth. The plurality of first electrode-side trenches 21A are formed in positions opposite the plurality of first concave portions 84A. Hence, the plurality of first electrode-side trenches 21A are formed, in plan view, in the shape of a straight line extending in the longitudinal direction of the substrate 2, and are formed at an interval in the lateral direction of the substrate 2.

Likewise, in a region opposite the second external connection electrode 42B within the second electrode formation region 47B, in the substrate 2, a plurality of second electrode-side trenches (concave portion formation trenches) 21B are formed by digging down from the element formation surface 2*a* to a predetermined depth. The plurality of second electrode-side trenches 21B are formed in positions opposite the plurality of second concave portions 84B. Hence, the plurality of second electrode-side trenches 21B are formed, in plan view, in the shape of a straight line extending in the longitudinal direction of the substrate 2, and are formed at an interval in the lateral direction of the substrate 2.

The cross sections of the electrode-side trenches 21A and 21B are the shape of a rectangle that is long in the direction of the thickness of the substrate 2. In the preferred embodiment, the width of the electrode-side trenches 21A and 21B is narrower than that of the coil formation trenches 11A and 11B. The depth of the electrode-side trenches 21A and 21B may be the same as that of the coil formation trenches 11A and 11B or may be shallower than that of the coil formation trenches 11A and 11B. In the preferred embodiment, the depth of the electrode-side trenches 21A and 21B is the same as that of the coil formation trenches 11A and 11B.

As shown in FIG. 135, the primary coil formation trench 11A is formed with a first trench part 11Aa that is formed in the insulating film 7 and a second trench part 11Ab that is formed in the substrate main body 6 and that communicates with the first trench part 11Aa. Likewise, the secondary coil formation trench 11B is formed with a first trench part 11Ba that is formed in the insulating film 7 and a second trench part 11Bb that is formed in the substrate main body 6 and that communicates with the first trench part 11Ba.

On the inner surface of the coil formation trenches 11A and 11B (the second trench parts 11Ab and 11Bb) in the substrate main body 6, an insulating film 12 formed with an oxide film or the like is formed. On the surface of the insulating film 12 within the coil formation trenches 11A and 11B (the second trench parts 11Ab and 11Bb) and on the inner surface of the coil formation trenches 11A and 11B (the first trench parts 11Aa and 11Ba) in the insulating film 7, a barrier metal film 13 is formed. The barrier metal film 13 is formed of, for example, TiN. The thickness of the barrier metal film 13 is about 400 to 500 angstroms. Within the coil formation trenches 11A and 11B, a conductive member 51 is embedded while being in contact with the barrier metal film 13. In the preferred embodiment, the conductive member 51 is formed of tungsten (W).

The primary coil 3A is formed with the conductive member 51 embedded within the primary coil formation trench 11A. Hence, the primary coil 3A is formed, in plan view, in the shape of a spiral (in the shape of a quadrilateral spiral) of the same pattern as the primary coil formation trench 11A. Specifically, the primary coil 3A includes a plurality of plate-shaped parts parallel to the side surfaces 2*c* of the substrate 2. The secondary coil 3B is formed with the conductive member 51 embedded within the secondary coil formation trench 11B. Hence, the secondary coil 3B is formed, in plan view, in the shape of a spiral (in the shape of a quadrilateral spiral) of the same pattern as the secondary coil formation trench 11B. Specifically, the secondary coil 3B includes a plurality of plate-shaped parts parallel to the side surfaces 2*c* of the substrate 2. Hence, the number of windings of the secondary coil 3B is greater than the number of windings of the primary coil 3A.

As shown in FIGS. 139 and 140, the electrode-side trenches 21A and 21B are formed with first trench parts 21Aa and 21Ba that are formed in the insulating film 7 and second trench parts 21Ab and 21Bb that are formed in the substrate main body 6 and that communicate with the first trench parts 21Aa and 21Ba. On the inner surface of the electrode-side trenches 21A and 21B (the second trench parts 21Ab and 21Bb) in the substrate main body 6, an insulating film 12 formed with an oxide film or the like is formed. In the preferred embodiment, the insulating film 12 formed on the inner surface of the electrode-side trenches 21A and 21B (the second trench parts 21Ab and 21Bb) in the substrate main body 6 fills within the second trench parts 21Ab and 21Bb.

On the inner surface of the first electrode-side trench 21A (the first trench part 21Aa) in the insulating film 7, the barrier metal film 13 is formed. Within the first electrode-side trench 21A (the first trench part 21Aa) in the insulating film 7, the conductive member 51 is embedded while being in contact with the barrier metal film 13. In the surface of the conductive member 51 within the first electrode-side trench 21A, first concave portions 81A (first underlying concave portions) are formed. In other words, in a region of the element formation surface 2*a* opposite the first external connection electrode 41B, a plurality of first concave portions 81A are formed. The plurality of first concave portions 81A are formed in positions opposite the first concave portions 84A of the first external connection electrode 41B. Hence, the plurality of first concave portions 81A are formed, in plan view, in the shape of a straight line extending in the longitudinal direction of the substrate 2 and are formed at an interval in the lateral direction of the substrate 2. The cross-sectional shape of the first concave portion 81A is the shape of the letter V. The plurality of first concave portions 81A are formed due to the first electrode-side trenches 21A formed in the substrate 2.

Likewise, on the inner surface of the second electrode-side trench 21B (the first trench part 21Ba) in the insulating film 7, the barrier metal film (not shown) is formed. Within the second electrode-side trench 21B (the first trench part 21Ba) in the insulating film 7, the conductive member (not shown) is embedded while being in contact with the barrier metal film. In the surface of the conductive member within the second electrode-side trench 21B, second concave portions 81B (first underlying concave portions) are formed. In other words, in a region of the element formation surface 2*a* opposite the second external connection electrode 42B, a plurality of second concave portions 81B are formed. The second concave portions 81B are formed in positions opposite the plurality of second concave portions 84B of the second external connection electrode 42B. Hence, the plurality of second concave portions 81B are formed, in plan view, in the shape of a straight line extending in the longitudinal direction of the substrate 2, and are formed at an interval in the lateral direction of the substrate 2. The cross-sectional shape of the second concave portion 81B is the shape of the letter V. The second concave portions 81B are formed due to the plurality of second electrode-side trenches 21B formed in the substrate 2.

In the preferred embodiment, the insulating film 12 formed on the inner surfaces of the coil formation trenches 11A and 11B and the electrode-side trenches 21A and 21B is formed with a thermal oxide film ($SiO_2$). When the thermal oxide film is formed on the inner surface of the trenches 11A, 11B, 21A, and 21B, the surrounding wall (the side wall and the bottom wall) of the trenches 11A, 11B, 21A, and 21B in the substrate main body 6 is thermally oxidized into an insulator portion (thermal oxide film) 30 having insulation. In the preferred embodiment, an example is described where the entire wall sandwiched by the coil formation trenches 11A and 11B (the second trench parts 11Ab and 11Bb) in the substrate main body 6, the entire wall between the adjacent two first electrode-side trenches 21A (the second trench parts 21Ab), and the entire wall between the adjacent two second electrode-side trenches 21B (the second trench parts 21Bb) are thermal oxide films.

On the element formation surface 2*a* (the surface of the insulating film 7) of the substrate 2, an insulating film 8 is formed so as to coat the element formation surface 2*a* and the conductive member 51. The insulating film 8 is formed, in plan view, in the shape of a rectangle matching with the element formation surface 2*a*. The insulating film 8 is formed with, for example, a USG (Undoped Silicate Glass) film. In the insulating film 8, a first contact hole 14A (see FIGS. 133B and 137) that exposes the outer peripheral side end portion of the primary coil 3A and a second contact hole 15A (see FIGS. 133B and 134) that exposes the inner peripheral side end portion of the primary coil 3A are formed. Furthermore, in the insulating film 8, a third contact hole 14B (see FIGS. 133B and 136) that exposes the inner peripheral side end portion of the secondary coil 3B and a fourth contact hole 15B (see FIGS. 133B and 138) that exposes the outer peripheral side end portion of the secondary coil 3B are formed.

Furthermore, in the surface of the insulating film 8, as shown in FIGS. 139 and 140, in the first electrode formation region 47A, a plurality of first concave portions 82A (second underlying concave portions) are formed. The plurality of first concave portions 82A are formed in positions opposite the first concave portions 84A (the first concave portions 81A) of the first external connection electrode 41B. Hence, the plurality of first concave portions 82A are formed, in plan view, in the shape of a straight line extending in the longitudinal direction of the substrate 2, and are formed at an interval in the lateral direction of the substrate 2. The cross-sectional shape of the first concave portion 82A is the shape of the letter V. The first concave portions 82A are formed due to the first concave portion 81A in the surface (the element formation surface 2*a*) of the substrate 2, which is its underlying layer.

Likewise, in the surface of the insulating film 8, as shown in FIG. 139, in the second electrode formation region 47B, a plurality of second concave portions 82B (second underlying concave portions) are formed. The plurality of second concave portions 82B are formed in positions opposite the second concave portions 84B (the second concave portions 81B) of the second external connection electrode 42B. Hence, the plurality of second concave portions 82B are formed, in plan view, in the shape of a straight line extending in the longitudinal direction of the substrate 2, and are formed at an interval in the lateral direction of the substrate 2. The cross-sectional shape of the second concave portion 82B is the shape of the letter V. The second concave portions 82B are formed due to the second concave portion 81B in the surface (the element formation surface 2*a*) of the substrate 2, which is its underlying layer. As described previously, in the side surfaces 2*c* of the substrate 2 and the outer peripheral surface of the insulating film 8, the passivation film 9 formed with a nitride film or the like is formed.

On the surface of the insulating film 8, the first electrode 41, the second electrode 42, the third electrode 43 and the fourth electrode 44 are formed. The first electrode 41 includes a first electrode film 41A that is formed on the surface of the insulating film 8 and a first external connection electrode 41B that is bonded to the first electrode film 41A. As shown in FIG. 133B, the first electrode film 41A includes a drawing electrode 41Aa that is connected to the outer peripheral side end portion of the primary coil 3A and a first pad 41Ab that is formed integrally with the drawing electrode 41Aa. The first pad 41Ab is formed to be rectangular at the corner portion of the element formation surface 2*a* on the side of the first electrode formation region 47A. The first external connection electrode 41B is connected to the first pad 41Ab. As shown in FIGS. 133B and 137, the drawing electrode 41Aa enters the first contact hole 14A from the surface of the insulating film 8, and is connected to the outer peripheral side end portion of the primary coil 3A within the first contact hole 14A. The drawing electrode 41Aa is formed straight along a straight line that passes above one end portion of the primary coil 3A to reach the first pad 41Ab.

By extending the outer peripheral side end portion of the primary coil formation trench 11A to a position below the first pad 41Ab, the outer peripheral side end portion of the primary coil 3A may be disposed in a position below the first pad 41Ab. In this way, since the first contact hole 14A can be formed in a position below the first pad 41Ab, one end portion of the primary coil 3A can be connected to the first pad 41Ab. In this case, since the first electrode film 41A can be formed with only the first pad 41Ab, the drawing electrode 41Aa is not needed.

The second electrode 42 includes a second electrode film 42A that is formed on the surface of the insulating film 8 and a second external connection electrode 42B that is bonded to the second electrode film 42A. As shown in FIG. 133B, the second electrode film 42A includes a drawing electrode 42Aa that is connected to the inner peripheral side end portion of the primary coil 3A and a second pad 42Ab that is formed integrally with the drawing electrode 42Aa. The second pad 42Ab is formed to be rectangular at the corner portion of the element formation surface 2*a* on the side of the second electrode formation region 47B. The second external connection electrode 42B is connected to the second pad 42Ab. As shown in FIGS. 133B and 134, the drawing electrode 42Aa enters the second contact hole 15A from the surface of the insulating film 8, and is connected to the inner peripheral side end portion of the primary coil 3A within the second contact hole 15A. The drawing electrode 42Aa is formed straight along a straight line that passes above the inner peripheral side end portion of the primary coil 3A to reach the second pad 42Ab.

The third electrode 43 includes a third electrode film 43A that is formed on the surface of the insulating film 8 and a third external connection electrode 43B that is bonded to the third electrode film 43A. As shown in FIG. 133B, the third electrode film 43A includes a drawing electrode 43Aa that is connected to the inner peripheral side end portion of the secondary coil 3B and a third pad 43Ab that is formed integrally with the drawing electrode 43Aa. The third pad 43Ab is formed to be rectangular at the corner portion of the element formation surface 2*a* on the side of the third electrode formation region 48A. The third external connection electrode 43B is connected to the third pad 43Ab. As shown in FIGS. 133B and 136, the drawing electrode 43Aa enters the third contact hole 14B from the surface of the insulating film 8, and is connected to the inner peripheral side end portion of the secondary coil 3B within the third contact hole 14B. The drawing electrode 43Aa is formed straight along a straight line that passes above the inner peripheral side end portion of the secondary coil 3B to reach the third pad 43Ab.

The fourth electrode 44 includes a fourth electrode film 44A that is formed on the surface of the insulating film 8 and a fourth external connection electrode 44B that is bonded to the fourth electrode film 44A. As shown in FIG. 133B, the fourth electrode film 44A includes a drawing electrode 44Aa that is connected to the outer peripheral side end portion of the secondary coil 3B and a fourth pad 44Ab that is formed integrally with the drawing electrode 44Aa. The fourth pad 44Ab is formed to be rectangular at the corner portion of the element formation surface 2*a* on the side of the fourth electrode formation region 48B. The second external connection electrode 42B is connected to the second pad 42Ab. As shown in FIGS. 133B and 138, the drawing electrode 44Aa enters the fourth contact hole 15B from the surface of the insulating film 8, and is connected to the outer peripheral side end portion of the secondary coil 3B within the fourth contact hole 15B. The drawing electrode 44Aa is formed straight along a straight line that passes above the outer peripheral side end portion of the secondary coil 3B to reach the fourth pad 44Ab. In the preferred embodiment, as the electrode films 41A to 44A, Al films are used.

By extending the outer peripheral side end portion of the secondary coil formation trench 11B to a position below the fourth pad 44Ab, the outer peripheral side end portion of the secondary coil 3B may be disposed in a position below the fourth pad 44Ab. In this way, since the fourth contact hole 15B can be formed in a position below the fourth pad 44Ab, the outer peripheral side end portion of the secondary coil 3B can be connected to the fourth pad 44Ab. In this case, since the fourth electrode film 44A can be formed with only the fourth pad 44Ab, the drawing electrode 44Aa is not needed.

In the surface of the first pad 41Ab of the first electrode film 41A, as shown in FIGS. 139 and 140, a plurality of first concave portions 83A (third underlying concave portions) are formed. The plurality of first concave portions 83A are formed in positions opposite the first concave portions 84A (the first concave portions 82A) of the first external connection electrode 41B. Hence, the plurality of first concave portions 83A are formed, in plan view, in the shape of a straight line extending in the longitudinal direction of the substrate 2, and are formed at an interval in the lateral direction of the substrate 2. The cross-sectional shape of the first concave portion 83A is the shape of the letter V. The first concave portions 83A are formed due to the first concave portion 82A in the surface of the insulating film 8, which is its underlying layer.

Likewise, in the surface of the second pad 42Ab of the second electrode film 42A, as shown in FIG. 139, a plurality of second concave portions 83B (third underlying concave portions) are formed. The plurality of second concave portions 83B are formed in positions opposite the second concave portions 84B (the second concave portions 82B) of the second external connection electrode 42B. Hence, the plurality of second concave portions 83B are formed, in plan view, in the shape of a straight line extending in the longitudinal direction of the substrate 2, and are formed at an interval in the lateral direction of the substrate 2. The cross-sectional shape of the second concave portion 83B is the shape of the letter V. The second concave portions 83B are formed due to the second concave portion 82B in the surface of the insulating film 8, which is its underlying layer.

For example, the first to fourth electrode films 41A to 44A are covered by a passivation film 16 formed with a nitride film (SiN), and furthermore, on the passivation film 16, a resin film 17 such as polyimide is formed. In the passivation film 16 and the resin film 17, in plan view, in regions corresponding to the vicinity of the first pad 41Ab, the vicinity of the second pad 42Ab, the vicinity of the third pad 43Ab, and the vicinity of the fourth pad 44Ab, first, second, third, and fourth cutout portions 18A, 19A, 18B, and 19B (see FIGS. 134, 136 and 139) are respectively formed.

A region of the surface of the first pad 41Ab other than an edge portion on the side of the third pad 43Ab is exposed by the first cutout portion 18A. A region of the surface of the second pad 42Ab other than an edge portion on the side of the fourth pad 44Ab is exposed by the second cutout portion 19A. A region of the surface of the third pad 43Ab other than an edge portion on the side of the first pad 41Ab is exposed by the third cutout portion 18B. A region of the surface of the fourth pad 44Ab other than an edge portion on the side of the second pad 42Ab is exposed by the fourth cutout portion 19B. In other words, the passivation film 16 and the resin film 17 are formed, in plan view, in the coil formation region 49, the boundary portion region between the first electrode formation region 47A and the second electrode formation region 47B, and the boundary portion region between the third electrode formation region 48A and the fourth electrode formation region 48B.

The first, second, third, and fourth external connection electrodes 41B, 42B, 43B, and 44B fill the first, second, third, and fourth cutout portions 18A, 19A, 18B, and 19B respectively. The first external connection electrode 41B and the third external connection electrode 43B are formed so as to protrude from the resin film 17, and include a drawing portion 20 that is drawn to the side of the other external connection electrode along the surface of the resin film 17. Likewise, the second external connection electrode 42B and the fourth external connection electrode 44B are formed so as to protrude from the resin film 17, and include the drawing portion 20 that is drawn to the side of the other external connection electrode along the surface of the resin film 17.

In the preferred embodiment, the first external connection electrode 41B is formed so as to cover not only the surfaces of the first electrode film 41A (the pad 41Ab) and the insulating film 8 exposed within the first cutout portion 18A but also the upper end surface of the passivation film 9 on the corner portion of the element formation surface 2*a* on the side of the first pad 41Ab. The two side surfaces other than the two side surfaces on the inner side of the first external connection electrode 41B are formed so as to be flush with the surface of the passivation film 9 covering the peripheral surface of the insulating film 8 on the corner portion of the element formation surface 2*a* on the side of the first pad 41Ab.

The second external connection electrode 42B is formed so as to cover not only the surfaces of the second electrode film 42A (the pad 42Ab) and the insulating film 8 exposed within the second cutout portion 19A but also the upper end surface of the passivation film 9 on the corner portion of the element formation surface 2*a* on the side of the second pad 42Ab. The two side surfaces other than the two side surfaces on the inner side of the second external connection electrode 42B are formed so as to be flush with the surface of the passivation film 9 covering the peripheral surface of the insulating film 8 on the corner portion of the element formation surface 2*a* on the side of the second pad 42Ab.

The third external connection electrode 43B is formed so as to cover not only the surfaces of the third electrode film 43A (the pad 43Ab) and the insulating film 8 exposed within the third cutout portion 18B but also the upper end surface of the passivation film 9 on the corner portion of the element formation surface 2*a* on the side of the third pad 43Ab. The two side surfaces other than the two side surfaces on the inner side of the third external connection electrode 43B are formed so as to be flush with the surface of the passivation film 9 covering the peripheral surface of the insulating film 8 on the corner portion of the element formation surface 2*a* on the side of the third pad 43Ab.

The fourth external connection electrode 44B is formed so as to cover not only the surfaces of the fourth electrode film 44A (the pad 44Ab) and the insulating film 8 exposed within the fourth cutout portion 19B but also the upper end surface of the passivation film 9 on the corner portion of the element formation surface 2*a* on the side of the fourth pad 44Ab. The two side surfaces other than the two side surfaces on the inner side of the fourth external connection electrode 44B are formed so as to be flush with the surface of the passivation film 9 covering the peripheral surface of the insulating film 8 on the corner portion of the element formation surface 2*a* on the side of the third pad 43Ab. The external connection electrodes 41B, 42B, 43B, and 44B may be formed with, for example, a Ni/Pd/Au laminated film having a Ni film in contact with the electrode films 41A, 42A, 43A, and 44A, a Pd film formed thereon, and an Au film formed thereon. The laminated film described above can be formed by a plating method.

As described previously, in the surface of the first external connection electrode 41B, a plurality of first concave portions 84A are formed, and in the surface of the second external connection electrode 42B, a plurality of second concave portions 84B are formed. The first concave portions 84A are formed due to the first concave portions 83A in the surface of the first pad 41Ab, which is its underlying layer. Since the first concave portions 83A are formed due to the first concave portions 82A, which is its underlying layer, and the first concave portions 82A are formed due to the first concave portions 81A, which is its underlying layer, the first concave portions 84A are formed due to the first concave portions 81A. As described later, the first concave portions 81A are formed due to the first electrode-side trenches 21A. Hence, the first concave portions 84A in the first external connection electrode 41B are formed due to the first electrode-side trenches 21A.

The second concave portions 84B are formed due to the second concave portions 83B in the surface of the second pad 42Ab, which is its underlying layer. Since the second concave portions 83B are formed due to the second concave portions 82B, and the second concave portions 82B are formed due to the second concave portions 81B, the second concave portions 84B are formed due to the second concave portions 81B. As the first concave portions 81A are formed due to the first electrode-side trenches 21A, the second concave portions 81B are formed due to the second electrode-side trenches 21B. Hence, the second concave portions 84B in the second external connection electrode 42B are formed due to the second electrode-side trenches 21B.

The passivation film 16 and the resin film 17 coat, from the surface, the coils 3A and 3B, the insulating film 8, the electrode films 41A to 44A in the coil formation region 49 on the element formation surface 2*a*, a region between the first external connection electrode 41B and the second external connection electrode 42B, and a region between the third external connection electrode 43B and the fourth external connection electrode 44B, and function as a protective film to protect them. On the other hand, the passivation film 9 formed on the side surfaces 2*c* of the substrate 2 and the outer peripheral surface of the insulating film 8 function as a protective film to protect the side surfaces 2*c* of the substrate 2 and the outer peripheral surface of the insulating film 8.

FIG. 142 is an electrical circuit diagram showing an electrical structure within the chip transformer. One end of the primary coil 3A (represented by a symbol L1 in FIG. 142) is connected to the first electrode 41, and the other end of the primary coil 3A is connected to the second electrode 42. One end of the secondary coil 3B (represented by a symbol L2 in FIG. 142) is connected to the third electrode 43, and the other end of the secondary coil 3B is connected to the fourth electrode 44. In this way, it functions as a transformer.

As a parameter indicating the performance (quality) of the transformer, the Q (Quality Factor) value of the coil is present. As the Q value of the coil is increased, its loss is decreased, and the coil has an excellent characteristic as a high-frequency inductance.

The Q value of the coils 3A and 3B is represented by the formula (10) below.

$$Q=2\pi fL/R \quad (10)$$

In the formula (10) above, f represents the frequency of a current flowing through the coil, L represents the inductance of the coils 3A and 3B and R represents the internal resistance of the coils 3A and 3B.

In the arrangement of the fourth preferred embodiment of the fourth invention, in the substrate 2, the primary coil formation trench 11A and the secondary coil formation trench 11B obtained by digging down from the element formation surface 2*a* are formed, in plan view, in the shape of a spiral. The conductive member 51 is embedded within the primary coil formation trench 11A and thus the primary coil 3A is formed, and the conductive member 51 is embedded within the secondary coil formation trench 11B and thus the secondary coil 3B is formed. Hence, it is possible to increase the cross-sectional area of the coils 3A and 3B (the cross-sectional area of the coils 3A and 3B perpendicular to the direction in which the coils 3A and 3B are extended in the spiral direction), and thus it is possible to decrease the internal resistance (R in the formula (10) above) of the coils 3A and 3B. In this way, since the Q value of the coils 3A and 3B can be increased, it is possible to provide a high performance chip transformer.

In the fourth preferred embodiment of the fourth invention, as compared with the first preferred embodiment of the fourth invention, the primary coil 3A and the secondary coil 3B can be disposed close to each other, and thus it is possible to provide a higher performance chip transformer.

The coil formation trenches 11A and 11B are formed in the substrate 2, the conductive member 51 is embedded within the coil formation trenches 11A and 11B and thus it is possible to form the coils 3A and 3B, with the result that the coils 3A and 3B are easily manufactured. In this way, it is possible to provide a chip transformer that is easily manufactured.

In the fourth preferred embodiment of the fourth invention, as compared with the third preferred embodiment of the fourth invention, the primary coil 3A and the secondary coil 3B can be disposed close to each other, and thus it is possible to provide a higher performance chip transformer.

When image inspection is performed on the chip transformer 1C, light from a light source is applied to the surfaces of the electrodes 41 to 44, and images of the surfaces are imaged with a camera. In the preferred embodiment, in the surfaces of the first external connection electrode 41B and the second external connection electrode 42B on the primary side, a plurality of concave portions 84A and 84B are formed but in the surfaces of the third external connection electrode 43B and the fourth external connection electrode 44B on the secondary side, a plurality of concave portions 84A and 84B are not formed. Since in the surfaces of the external connection electrodes 41B and 42B on the primary side, the concave portions 84A and 84B are formed, the light incident on the surfaces of the external connection electrodes 41B and 42B is diffusely reflected off the concave portions 84A and 84B. By contrast, since the concave portions are not formed in the surfaces of the external connection electrodes 43B and 44B on the secondary side, the light incident on the surface of the external connection electrodes 43B and 44B is unlikely to be diffusely reflected off.

Hence, a large difference is produced between image information (for example, brightness information) on the external connection electrodes 41B and 42B on the primary side and image information on the external connection electrodes 43B and 44B on the secondary side obtained with the camera. In this way, based on the image information obtained with the camera, it is possible to clearly identify the primary side electrode pairs 41 and 42 and the secondary side electrode pairs 43 and 44. In other words, in the preferred embodiment, at the time of the image inspection, it is possible to easily determine the primary side electrode pairs 41 and 42 and the secondary side electrode pairs 43 and 44.

Furthermore, on the element formation surface 2*a*, which is one surface of the substrate 2, the external connection electrodes 41B to 44B of the first to fourth electrodes 41 to 44 are formed. Hence, as shown in FIG. 143, the element formation surface 2*a* is made to face a mounting substrate 91, the external connection electrodes 41B to 44B are bonded on the mounting substrate 91 by a solder 92 and thus it is possible to form a circuit assembly in which the chip transformer 1C is surface-mounted on the mounting substrate 91. In other words, it is possible to provide a flip-chip connection-type chip transformer 1C, and it is possible to connect the chip transformer 1A to the mounting substrate 91 by a face-down bonding in which the element formation surface 2*a* is made to face the mounting substrate 91 and wireless bonding. In this way, it is possible to decrease the occupied space of the chip transformer 1C on the mounting substrate 91. In particular, it is possible to realize a low profile chip transformer 1C on the mounting substrate 91. In this way, it is possible to effectively utilize the space within the housing of a small-sized electronic device or the like and to contribute to high-density mounting and miniaturization.

With reference to FIGS. 129A to 129L, 130A to 130E and 144A to 144F, a method of manufacturing the chip transformer 1C will be described. Here, FIGS. 129A to 129L used in the third preferred embodiment of the fourth invention are used as process charts corresponding to the cut surface of FIG. 134, and FIGS. 130A to 130E used in the third preferred embodiment of the fourth invention are used as process charts corresponding to the cut surface of FIG. 135. However, although FIGS. 129B to 129L do not show the insulator portions 30 formed on the surrounding wall of the electrode-side trenches 21A and 21B, in the fourth preferred embodiment of the fourth invention, the insulator portions 30 are represented by a symbol 30 in FIG. 134. FIGS. 144A to 144F are enlarged cross-sectional views showing the details of the manufacturing step of the first concave portion, and show cut surfaces corresponding to FIG. 140.

As shown in FIG. 129A, an original substrate 50 that is an original of the substrate main body 6 is prepared. On the surface of the original substrate 50, the insulating film 7 such as a thermal oxide film or a CVD oxide film is formed. In the preferred embodiment, the insulating film 7 is a thermal oxide film. The surface of the insulating film 7 corresponds to the element formation surface 2*a* of the substrate 2.

FIG. 131 is a schematic plan view of part of the original substrate 50 in which the insulating film 7 is formed on the surface. As shown in FIG. 131, in the element formation surface 2*a*, chip transformer regions X corresponding to a plurality of chip transformers 1C are disposed in a matrix. Between the chip transformer regions X adjacent to each other, a boundary region Y is provided. The boundary region Y is a region in the shape of a band having a substantially constant width, extends in two directions perpendicular to each other and is formed in a lattice shape. After necessary steps are performed on the original substrate 50 in which the insulating film 7 is formed on the surface, the original substrate 50 is separated along the boundary region Y, and thus it is possible to obtain a plurality of chip transformers 1C.

The steps performed on the original substrate 50 in which the insulating film 7 is formed on the surface are as follows. First, as shown in FIGS. 129A, 130A, and 144A, by photolithography and etching, a part of the insulating film 7 that corresponds to a region in which the coil formation trench 11A, the secondary coil formation trench 11B, the first electrode-side trench 21A, and the second electrode-side trench 21B need to be formed is removed. In this way, in the insulating film 7, the first trench part 11Aa of the primary coil formation trench 11A, the first trench part 11Ba of the secondary coil formation trench 11B, the first trench part 21Aa of the first electrode-side trench 21A, and the first trench part 21Ba (not shown) of the second electrode-side trench 21B (not shown) are formed.

Then, a hard mask formed with the insulating film 7 is used, and thus the original substrate 50 is etched. In this way, as shown in FIGS. 129B, 130A, and 144A, the second trench part 11Ab of the primary coil formation trench 11A, the second trench part 11Bb of the secondary coil formation trench 11B, the second trench part 21Ab of the first electrode-side trench 21A, and the second trench part 21Bb (not shown) of the second electrode-side trench 21B (not shown) are formed in the original substrate 50. In this way, in the insulating film 7 and the original substrate 50, the primary coil formation trench 11A, the secondary coil formation trench 11B, the first electrode-side trench 21A, and the second electrode-side trench 21B are formed. The coil formation trenches 11A and 11B and electrode-side trenches 21A and 21B may be formed by, for example, a so-called BOSCH process. The BOSCH process is a process that is used to make a hollow part in a MEMS (Micro Electro Mechanical System).

Then, as shown in FIGS. 129B, 130B, and 144B, on the inner surface of the coil formation trenches 11A and 11B and the electrode-side trenches 21A and 21B, the insulating film (thermal oxide film) 12 is formed by a thermal oxidization method. Here, the surrounding wall (the side wall and the bottom wall) of the trenches 11A, 11B, 21A, and 21B (the second trench parts 11Ab, 11Bb, 21Ab, and 21Bb) in the original substrate 50 is thermally oxidized into an insulator portion (thermal oxide film) 30 having insulation. In the preferred embodiment, the entire wall sandwiched by the coil formation trenches 11A and 12A (the second trench parts 11Ab and 11Bb) in the substrate main body 6 is formed into the thermal oxide film. In the preferred embodiment, the entire wall between the adjacent two first electrode-side trenches 21A (the second trench parts 21Ab) and the entire wall between the adjacent two second electrode-side trenches 21B (the second trench parts 21Bb) are formed into the thermal oxide films. The insulating film 12 formed on the inner surface of the electrode-side trenches 21A and 21B (the second trench parts 21Ab and 21Bb) fills the electrode-side trenches 21A and 21B.

Then, for example, by a sputtering method, the barrier metal film 13 made of TiN is formed on the element formation surface 2*a* including the interiors of the trenches 11A, 11B, 21A, and 21B. In this way, as shown in FIG. 130C, the barrier metal film 13 made of TiN is formed on the surfaces of the insulating film 12 and the insulating film 7 within the coil formation trenches 11A and 11B and the surface of the insulating film 7 outside the coil formation trenches 11A and 11B. Moreover, as shown in FIG. 144C, the barrier metal film 13 is formed on the surfaces of the insulating film 12 and the insulating film 7 within the primary coil formation trench 21A and the surface of the insulating film 7 outside the primary coil formation trench 21A. Likewise, the barrier metal film is formed on the surfaces of the insulating film 12 and the insulating film 7 within the second coil formation trench 21B and the surface of the insulating film 7 outside the second coil formation trench 21B. Thereafter, annealing processing is performed.

Thereafter, as shown in FIGS. 129C, 130D, and 144D, for example, by a CVD method, on the element formation surface 2*a* including the interiors of the trenches 11A, 11B, 21A, and 21B, the conductive member 51 formed of tungsten (W) is deposited. Since on the entire surface of the element formation surface 2*a* including the interiors of the trenches 11A, 11B, 21A, and 21B, the conductive member 51 is deposited at the same rate, in the surface of the conductive member 51, concave portions 80 (see FIG. 144D) are formed in positions opposite the trenches 11A, 11B, 21A, and 21B.

Then, for example, by an etch back method, overall etching is performed on the conductive member 51 from its surface. The overall etching is continued until the surface of the conductive member 51 is flush with the surface of the insulating film 7. In this way, as shown in FIGS. 129D, 130E, and 144E, the conductive member 51 is embedded within the trenches 11A, 11B, 21A, and 21B while in contact with the barrier metal film 13. By the conductive member 51 embedded within the primary coil formation trench 11A, the primary coil 3A in the shape of a spiral when seen in plan view is formed, and by the conductive member 51 embedded within the secondary coil formation trench 11B, the secondary coil 3B in the shape of a spiral when seen in plan view is formed.

Since the conductive member 51 is etched from the entire surface thereof at the same rate, on the surface of the conductive member 51 after the etching, the concave portions 81 are formed in positions opposite the concave portions 80 before the etching. However, although for ease of description, the concave portions 81 are shown in FIG. 144E, the concave portions are omitted in FIG. 130E. In the following description, the concave portion 81 formed in the conductive member 51 within the first electrode-side trench 21A is referred to as a "first concave portion 81A," and the concave portion 81 formed in the conductive member 51 within the second electrode-side trench 21B is referred to as a "second concave portion 81B."

Then, as shown in FIGS. 129E and 144F, on the insulating film 7, the insulating film 8 formed with a USG (Undoped Silicate Glass) film or the like is formed so as to coat the insulating film 7 (the element formation surface 2*a*) and the conductive member 51. The insulating film 8 is formed by, for example, a CVD method. In the surface of the insulating film 8 formed as described above, as shown in FIG. 144F, in positions opposite the first concave portions 81A, the first concave portions 82A are formed. Although not shown in FIG. 144F, in positions opposite the second concave portions 81B, the second concave portions 82B are formed. Thereafter, by photolithography and etching, in region parts of the insulating film 8 corresponding to the outer peripheral side end portion and the inner peripheral side end portion of the primary coil 3A, the first contact hole 14A (see FIG. 137) and the second contact hole 15A (see FIG. 129E) penetrating the insulating film 8 are respectively formed. Likewise, in region parts of the insulating film 8 corresponding to the inner peripheral side end portion and outer peripheral side end portion of the secondary coil 3B, the third contact hole 14B (see FIG. 136) and the fourth contact hole 15B (see FIG. 138) penetrating the insulating film 8 are respectively formed.

Then, for example, by sputtering, on the insulating film 8 including the interiors of the contact holes 14A, 15A, 14B, and 15B, an electrode film forming the first to fourth electrodes 41 to 44 is formed. In the preferred embodiment, the electrode film made of Al is formed. Thereafter, by photolithography and etching, the electrode film is patterned, and thus as shown in FIGS. 129F and 144F, the electrode film is separated into the first electrode film 41A, the second electrode film 42A, the third electrode film 43A, and the fourth electrode film 44A. In the surface of the first electrode film 41A formed as described above, as shown in FIG. 144F, the first concave portions 83A are formed in positions opposite the first concave portions 82A. Although not shown in FIG. 144F, the second concave portions 83B are formed in positions opposite the second concave portions 82B.

Then, as shown in FIG. 129G, for example, by a CVD method, the passivation film 16 such as a nitride film is formed, and furthermore, polyimide is applied to form the resin film 17. For example, polyimide to which photosensitivity is added is applied, and the polyimide is developed after exposure with a pattern corresponding to the first to fourth cutout portions 18A, 19A, 18B, and 19B. In this way, the resin film 17 having a cutout portion corresponding to the first to fourth cutout portions 18A, 19A, 18B, and 19B is formed. Thereafter, as necessary, heat treatment for curing the resin film is performed. Then, by dry etching using the resin film 17 as a mask, the first to fourth cutout portions 18A, 19A, 18B, and 19B are formed in the passivation film 16.

Then, as shown in FIG. 129H, a resist mask 52 having an opening 52*a* in a lattice shape matching with the boundary region Y (see FIG. 131) is formed. Plasma etching is performed via the resist mask 52, and thus as shown in FIG. 129H, the original substrate 50, the insulating film 7, and the insulating film 8 are etched from the surface of the insulating film 8 to a predetermined depth. In this way, along the boundary region Y, a groove (scribe groove) 53 for cutting is formed.

Then, the resist mask 52 is peeled off. Thereafter, as shown in FIG. 129I, for example, by a CVD method, an insulating film 54 formed of a nitride film or the like serving as the material of the passivation film 9 is formed over the entire region of the surface of the original substrate 50. Here, the insulating film 54 is also formed over the entire region of the inner surface (the side wall surface and the bottom wall surface) of the groove 53.

Then, as shown in FIG. 129J, the insulating film 54 is selectively etched. Specifically, a part of the insulating film 54 other than the insulating film 54 (the passivation film 9) on the side wall surface of the groove 53 is removed. In this way, a part of the electrode films 41A to 44A that is not covered by the passivation film 16 and the resin film 17 is exposed. The insulating film 54 on the bottom surface of the groove 53 is removed.

Then, as shown in FIGS. 129K and 144F, on the first to fourth electrode films 41A to 44A exposed from the first to fourth cutout portions 18A, 19A, 18B, and 19B, for example, by plating (preferably, electroless plating), plating growth is performed in the following order: for example, Ni, Pd, and Au. In this way, the first to fourth external connection electrodes 41B to 44B are formed. In the surface of the first external connection electrode 41B formed as described above, as shown in FIG. 144F, the first concave portions 84A are formed in positions opposite the first concave portions 83A. Although not shown in FIG. 144F, in the surface of the second external connection electrode 42B, the second concave portions 84B are formed in positions opposite the second concave portions 83B.

Thereafter, by a DBG (Dicing Before Grinding) method, a plurality of chip transformer regions X are divided into pieces. Specifically, as shown in FIG. 129L, first, on the side of the surface of the original substrate 50 (the side of the external connection electrode), a supporting tape 71 having an adhesive surface 72 is adhered. Then, the original substrate 50 is polished from the rear surface to the bottom surface of the groove 53. In this way, the plurality of chip transformer regions X are separated into individual chip transformers 1C. Thereafter, on a plurality of chip transformers 1C, the recovery step shown in FIGS. 45A to 45D or the recovery step shown in FIGS. 46A to 46C described in the first preferred embodiment of the second invention may be performed.

Although in the first to fourth preferred embodiments of the fourth invention described previously, the coils 3A and 3B (the coil formation trenches 11A and 11B) are formed, in plan view, in the shape of a quadrilateral spiral, the coils 3A and 3B (the coil formation trenches 11A and 11B) may be formed, in plan view, in the shape of a circular spiral. The coils 3A and 3B (the coil formation trenches 11A and 11B) may be formed, in plan view, in the shape of a polygonal spiral other than a quadrilateral, such as an octagonal spiral.

The substrate 2 may be a substrate made of a material having insulation.

[4] Fifth Invention

An object of the fifth invention is to provide a chip capacitor that is highly increased in capacity and that is decreased in size and a circuit assembly that includes it.

Another object of the fifth invention is to provide a method of manufacturing a chip capacitor that is highly increased in capacity and that is decreased in size.

The fifth invention has the following features.

D1. A chip capacitor including: a substrate that has an element formation surface; a first internal electrode formation trench that is formed in the substrate by digging down from the element formation surface; a second internal electrode formation trench that is formed in the substrate by digging down from the element formation surface and that is disposed, in plan view when seen in a normal direction perpendicular to the element formation surface, at an interval from and parallel to the first internal electrode formation trench; a first internal electrode that is formed with a conductive member embedded within the first internal electrode formation trench; and a second internal electrode that is formed with a conductive member embedded within the second internal electrode formation trench.

In this arrangement, it is possible to form a capacitor element with the first internal electrode, the second internal electrode, and a wall therebetween on the substrate. In this arrangement, the first internal electrode and the second internal electrode can also be opposite each other in a direction perpendicular to the direction of the thickness of the substrate. Hence, it is possible to increase the area of a facing surface of the first internal electrode and the second internal electrode without increasing the area of the surface of the substrate. In this way, it is possible to provide a chip capacitor that is highly increased in capacity and that is decreased in size.

In the substrate, the first internal electrode formation trench and the second internal electrode formation trench are formed, the conductive member is embedded within each of the internal electrode formation trenches and thus it is possible to form the first internal electrode and the second internal electrode, with the result that it is easy to manufacture the first internal electrode and the second internal electrode. In this way, it is possible to provide a chip capacitor that is easily manufactured.

D2. The chip capacitor described in "D1" further including: a first external electrode which is disposed on the element formation surface and to which the first internal electrode is electrically connected; and a second external electrode which is disposed on the element formation surface and to which the second internal electrode is electrically connected. In this arrangement, it is possible to obtain a chip capacitor in which a capacitor element is connected between the first external electrode and the second external electrode.

D3. The chip capacitor described in "D2" where the element formation surface is formed, in plan view, in the shape of a rectangle, each of the first internal electrode formation trench and the second internal electrode formation trench extends along a first direction parallel to a predetermined side of the element formation surface, the first external electrode is disposed on one end portion of the element formation surface in the first direction and the second external electrode is disposed on the other end portion of the element formation surface in the first direction.

D4. The chip capacitor described in "D3" where the first internal electrode formation trench includes a plurality of first internal electrode formation trenches that are disposed at an interval from both in a direction along the element formation surface and in a second direction perpendicular to the first direction, the second internal electrode formation trench includes a plurality of second internal electrode formation trenches that are disposed at an interval in the second direction and the first internal electrode formation trenches and the second internal electrode formation trenches are disposed so as to be alternately aligned in the second direction.

In this arrangement, it is possible to form, within the substrate, the plurality of first internal electrodes extending in the first direction and the plurality of second internal electrodes extending in the first direction and disposed alternately with the first internal electrodes in the second direction. In this way, it is possible to form a plurality of capacitor elements within the substrate, and it is possible to connect the plurality of capacitor elements in parallel between the first external electrode and the second external electrodes, with the result that it is possible to further increase the capacity.

D5. The chip capacitor described in any one of "D2" to "D4" further including: an insulating film that is formed on the element formation surface so as to cover the first internal electrode and the second internal electrode and that includes a first contact hole which exposes a part of the first internal electrode and a second contact hole which exposes a part of the second internal electrode, where the first external electrode and the second external electrode are formed on the insulating film, the first external electrode is connected via the first contact hole to the first internal electrode and the second external electrode is connected via the second contact hole to the second internal electrode.

D6. The chip capacitor described in any one of "D1" to "D5" where a depth of the first internal electrode formation trench and the second internal electrode formation trench is 10 μm or more. In this arrangement, it is possible to increase the area of the facing surface of the first internal electrode and the second internal electrode, and thus it is possible to further increase the capacity.

D7. The chip capacitor described in any one of "D1" to "D5" where a depth of the first internal electrode formation trench and the second internal electrode formation trench is 10 μm or more and 82 μm or less.

D8. The chip capacitor described in any one of "D1" to "D7" where a width of the internal electrode formation trench is 1 μm or more and 3 μm or less.

D9. The chip capacitor described in any one of "D1" to "D8" where the conductive member is formed of tungsten.

D10. A circuit assembly including: a mounting substrate; and the chip capacitor described in any one of "D1" to "D9" mounted on the mounting substrate. In this arrangement, it is possible to provide a circuit assembly using a chip capacitor that is highly increased in capacity and that is decreased in size.

D11. The circuit assembly described in "D10," where the chip capacitor is connected to the mounting substrate by wireless bonding. In this arrangement, it is possible to decrease the occupied space of the chip capacitor on the mounting substrate, and thus it is possible to contribute to the high-density mounting of electronic parts.

D12. A method of manufacturing a chip capacitor, the method including: a first step of forming, in a substrate having an element formation surface, a first internal electrode formation trench and a second internal electrode formation trench that is disposed, in plan view when seen in a normal direction perpendicular to the element formation surface, at an interval from and parallel to the first internal electrode formation trench by digging down from the element formation surface; and a second step of embedding a conductive member within the first electrode formation trench and second internal electrode formation trench to form a first internal electrode within the first internal electrode formation trench and a second internal electrode within the second internal electrode formation trench.

In the manufacturing method, the conductive member is embedded within the first internal electrode formation trench and the second internal electrode formation trench formed in the substrate, and thus it is possible to form the first internal electrode and the second internal electrode. Hence, it is possible to provide a chip capacitor having the same effects as described in "D1" described above.

D13. The method of manufacturing a chip capacitor described in "D12," the method further including: a third step of forming an insulating layer on the element formation surface so as to coat the first internal electrode and the second internal electrode; a fourth step of forming, in the insulating layer, a first contact hole that exposes a part of the first internal electrode and a second contact hole that exposes a part of the second internal electrode; and a fifth step of forming, on the insulating film, a first external electrode in contact with the first internal electrode via the first contact hole and a second external electrode in contact with the second internal electrode via the second contact hole.

In the manufacturing method, it is possible to form, on the insulating film formed on the element formation surface, the first external electrode to which the first internal electrode is connected and the second external electrode to which the second internal electrode is connected.

Preferred embodiments of the fifth invention will be described in detail with reference to FIGS. 145 to 160B. The symbols in FIGS. 145 to 160B are not related to the symbols in FIGS. 1 to 144F used in the description of the first to fourth inventions discussed previously.

FIG. 145 is a partially cut perspective view of a chip capacitor according to a preferred embodiment of the invention, and FIG. 146 is a plan view of the chip capacitor. FIG. 147 is a cross-sectional view taken along line CXLVII-CXLVII in FIG. 146, FIG. 148 is a cross-sectional view taken along line CXLVIII-CXLVIII in FIG. 146 and FIG. 149 is a partially enlarged cross-sectional view of FIG. 148. FIG. 150 is a cross-sectional view taken along line CL-CL in FIG. 146, and FIG. 15I is a cross-sectional view taken along line CLI-CLI in FIG. 146. FIG. 152 is a plan view showing a structure of the surface of a substrate by removing an arrangement formed on the surface of the substrate.

With reference to FIG. 145, the chip capacitor 1 is a minute chip part and is formed in the shape of a rectangular parallelepiped. The planar shape of the chip capacitor 1 may be rectangular, the length L in the longitudinal direction may be about 0.4 mm and the length W in the lateral direction may be about 0.2 mm. The thickness T of the entire chip capacitor 1 may be about 0.15 mm.

The chip capacitor 1 includes a substrate 2, a plurality of capacitor elements C1 to C7 (see FIG. 152) that are formed on the substrate 2, a first electrode (first external electrode) 4 that is connected together to one side of electrodes of the respective capacitor elements C1 to C7 and a second electrode (second external electrode) 5 that is connected together to the other side of electrode of the respective capacitor elements C1 to C7.

The substrate 2 is formed in the shape of a rectangular parallelepiped, and includes a pair of main surfaces 2*a* and 2*b* and four side surfaces 2*c*. One (the main surface 2*a* on the upper surface side in FIG. 145) of the pair of main surfaces 2*a* and 2*b* is an element formation surface. In the following description, the main surface 2*a* is referred to as an "element formation surface 2*a*," and the main surface 2*b* on the side opposite to the element formation surface 2*a* is referred to as a "rear surface 2*b*." In the preferred embodiment, the substrate 2 is formed with a substrate main body 6 and an insulating film 7 formed on the surface thereof, and the surface of the insulating film 7 on the side opposite to the side of the substrate main body 6 is the element formation surface 2*a*. In the preferred embodiment, the substrate main body 6 is formed with a silicon substrate, and the insulating film 7 is formed with a thermal oxide film ($SiO_2$). The element formation surface 2*a* is formed in the shape of a rectangle in plan view when seen in a normal direction perpendicular to the element formation surface 2*a*. The surface (element formation surface 2*a*) of the substrate 2 is covered by an insulating film 8. The four side surfaces 2*c* of the substrate 2 and the outer peripheral surface of the insulating film 8 are covered by a passivation film 9 such as a nitride film.

With reference to FIG. 146, in the element formation surface 2*a*, a first electrode formation region 10A for the formation of the first electrode 4 is provided at one end portion thereof, and a second electrode formation region 10B for the formation of the second electrode 5 is provided at the other end portion. These regions 10A and 10B are rectangular in plan view. In the first electrode formation region 10A, the external connection electrode (first external connection electrode) 4B of the first electrode 4 is disposed, and in the second electrode formation region 10B, the external connection electrode (second external connection electrode) 5B of the second electrode 5 is disposed. The first external connection electrode 4B is rectangular in plan view, and covers the entire region of the first electrode formation region 10A. The second external connection electrode 5B is rectangular in plan view, and covers the entire region of the second electrode formation region 10B. In the element formation surface 2*a* between the first external connection electrode 4B and the second external connection electrode 5B, a capacitor formation region 10C for the formation of the main parts of the capacitor elements C1 to C7 is provided.

With reference to FIGS. 146 to 152, in the substrate 2, a plurality of first internal electrode formation trenches 111A and a plurality of second internal electrode formation trenches 111B are formed by digging down from the element formation surface 2*a* to a predetermined depth. The internal electrode formation trenches 111A and 111B extend along the longitudinal direction of the element formation surface 2*a*. The internal electrode formation trenches 111A and 111B extend at a fixed interval and are parallel to each other in the lateral direction of the substrate 2. Hence, the plurality of internal electrode formation trenches 111A and 111B are formed, in plan view, in the shape of a stripe. In the preferred embodiment, the internal electrode formation trenches 111A and 111B extend from the interior of the first electrode formation region 10A through the capacitor formation region 10C to the interior of the second electrode formation region 10B. Hence, in plan view, one end portions of the internal electrode formation trenches 111A and 111B are within the first electrode formation region 10A, and the other end portions thereof are within the second electrode formation region 10B.

The cross section of each of the internal electrode formation trenches 111A and 111B is formed in the shape of a rectangle which is long in the direction of the thickness of the substrate 2. A plurality of first internal electrode formation trenches 111A and a plurality of second internal electrode formation trenches 111B are disposed such that the first internal electrode formation trenches 111A and the second internal electrode formation trenched 111B are alternately aligned in the lateral direction of the substrate 2. For example, the width of each of the internal electrode formation trenches 111A and 111B may be 1 μm or more and 3 μm or less. For example, the depth of each of the internal electrode formation trenches 111A and 111B may be 10 μm or more and 82 μm or less.

As shown in FIG. 149, the internal electrode formation trenches 111A and 111B are formed with first trench parts 111Aa and 111Ba that are formed in the insulating film 7 and second trench parts 111Ab and 111Bb that are formed in the substrate main body 6 and that communicate with the first trench parts 111Ab and 111Bb. On the inner surface of the internal electrode formation trenches 111A and 111B (the second trench parts 111Ab and 111Bb) in the substrate main body 6, an insulating film 12 formed with an oxide film or the like is formed. In the preferred embodiment, the insulating film 12 is formed with a thermal oxide film ($SiO_2$), and when the thermal oxide film is formed on the inner surface of the internal electrode formation trenches 111A and 111B, the surrounding wall (the side wall and the bottom wall) of the internal electrode formation trenches 111A and 111B (the second trench parts 111Ab and 111Bb) in the substrate main body 6 is thermally oxidized into an insulator portion (thermal oxide film) 30 having insulation. In the preferred embodiment, an example is described where the entire wall between the first internal electrode formation trench 111A (the second trench part 111Ab) and the second internal electrode formation trench 111B (the second part 111Bb) adjacent to each other is formed into a thermal oxide film.

On the surface of the insulating film 12 within the internal electrode formation trenches 111A and 111B (the second trench parts 111Ab and 111Bb) and on the inner surface of the internal electrode formation trenches 111A and 111B (the first trench parts 111Aa and 111Ba) in the insulating film 7, a barrier metal film 13 is formed. The barrier metal film 13 is formed of, for example, TiN. The thickness of the barrier metal film 13 is about 400 to 500 angstroms. Within each of the internal electrode formation trenches 111A and 111B, a conductive member 51 is embedded while being in contact with the barrier metal film 13. In the preferred embodiment, the conductive member 51 is formed of tungsten (W).

The first internal electrode 103A is formed with the conductive member 51 embedded within the first internal electrode formation trench 111A, and the second internal electrode 103B is formed with the conductive member 51 embedded within the second internal electrode formation trench 111B. In this way, a plurality of first internal electrodes 103A and second internal electrodes 103B are formed within the substrate 2. The internal electrodes 103A and 103B are formed in the shape of a rectangle which is long in the longitudinal direction of the substrate 2 when seen in the lateral direction of the substrate 2. In other words, the internal electrodes 103A and 103B are formed in the shape of a flat plate having a surface parallel to the two side surfaces 2*c* opposite each other in the lateral direction of the substrate 2.

In particular, with reference to FIG. 152, the plurality of first internal electrodes 103A and the second internal electrodes 103B are disposed so as to be alternately aligned in the lateral direction of the substrate 2. Hence, the first internal electrode 103A and the second internal electrode 103B adjacent to each other have facing surfaces opposite each other in the lateral direction of the substrate 2. The wall (the insulator portion 30) of the substrate 2 sandwiched by the facing surfaces of the first internal electrode 103A and the second internal electrode 103B adjacent to each other forms a capacitance film (dielectric film) 35. A pair of the first internal electrode 103A and the second internal electrode 103B adjacent to each other and the capacitance film 35 therebetween form one capacitor element. In the preferred embodiment, since four first internal electrodes 103A and four second internal electrodes 103B are provided, there are 7 pairs of the first internal electrodes 103A and the second internal electrodes 103B adjacent to each other. Hence, 7 capacitor elements C1 to C7 are formed on the substrate 2. One or more of the first internal electrodes 103A and one or more of the second internal electrodes 103B (the first internal electrode formation trenches 111A and the second internal electrode formation trenches 111B) are preferably provided.

On the element formation surface 2*a* (the surface of the insulating film 7) of the substrate 2, an insulating film 8 is formed so as to coat the element formation surface 2*a* and the conductive member 51 (the internal electrodes 103A and 103B). The insulating film 8 is formed, in plan view, in the shape of a rectangle matching with the element formation surface 2*a*. The insulating film 8 is formed with, for example, a USG (Undoped Silicate Glass) film. In the insulating film 8, on the side of one end portion of the substrate 2, a first contact hole 114 (see FIGS. 146, 147, 148, and 149) that exposes an end portion corresponding to the first internal electrode 103A is formed. In the insulating film 8, on the side of the other end portion of the substrate 2, a second contact hole 115 (see FIGS. 146 and 150) that exposes an end portion corresponding to the second internal electrode 103B is formed. As described previously, in the side surfaces 2*c* of the substrate 2 and the outer peripheral surface of the insulating film 8, the passivation film 9 formed with a nitride film or the like is formed.

On the surface of the insulating film 8, the first electrode 4 and the second electrode 5 are formed. The first electrode 4 includes a first electrode film (first pad) 4A that is formed on the surface of the insulating film 8 and a first external connection electrode 4B that is bonded to the first electrode film 4A. As shown in FIG. 146, the first electrode film 4A is formed to be rectangular at one end portion of the element formation surface 2*a*. In plan view, the inner side edge portion (the side edge portion on the side of the second electrode 5) of the first electrode film 4A protrudes to the inner side (the side of the second electrode 5) as compared with the inner side edge of the first electrode formation region 10A. The first external connection electrode 4B is connected to the first electrode film 4A. As shown in FIGS. 146, 147, 148, and 149, the first electrode film 4A enters the first contact hole 114 from the surface of the insulating film 8, and is connected to an end portion (an end portion on the side of the first electrode 4) of the first internal electrode 103A within the first contact hole 114.

The second electrode 5 includes a second electrode film (second pad) 5A that is formed on the surface of the insulating film 8 and a second external connection electrode 5B that is bonded to the second electrode film 5A. As shown in FIG. 146, the second electrode film 5A is formed to be rectangular at the other end portion of the element formation surface 2*a*. In plan view, the inner side edge portion (the side edge portion on the side of the first electrode 4) of the second electrode film 5A protrudes to the inner side (the side of the first electrode 4) as compared with the inner side edge of the second electrode formation region 10B. The second external connection electrode 5B is connected to the second electrode film 5A. As shown in FIGS. 146 and 150, the second electrode film 5A enters the second contact hole 115 from the surface of the insulating film 8, and is connected to an end portion (an end portion on the side of the second electrode 5) of the second internal electrode 103B within the second contact hole 115. In the preferred embodiment, as the electrode films 4A and 5A, Al films are used.

The first electrode film 4A and the second electrode film 5A are covered by a passivation film 16 formed with, for example, a nitride film (SiN), and furthermore, on the passivation film 16, a resin film 17 such as polyimide is formed. In the passivation film 16 and the resin film 17, two cutout portions 18 and 19 are formed that respectively expose a region other than an edge portion on the inner side of the surface of the first electrode film 4A and a region other than an edge portion on the inner side of the surface of the second electrode film 5A. In other words, the passivation film 16 and the resin film 17 are formed, in plan view, in the capacitor formation region 10C on the element formation surface 2*a*, and cover the insulating film 8, the edge portion on the inner side of the surface of the first electrode film 4A, and the edge portion on the inner side of the surface of the second electrode film 5A.

The first external connection electrode 4B fills the cutout portion 18 on one side, and the second external connection electrode 5B fills the cutout portion 19 on the other side. The first external connection electrode 4B and the second external connection electrode 5B are formed so as to protrude from the resin film 17, and include a drawing portion 20 that is drawn inwardly of the substrate 2 along the surface of the resin film 17. In the preferred embodiment, the first external connection electrode 4B is formed so as to cover not only the surface of the first electrode film 4A and the insulating film 8 exposed within the cutout portion 18 but also the upper end surface of the passivation film 9 on the side of one end portion of the substrate 2. The three side surfaces other than the side surface on the inner side of the first external connection electrode 4B are formed so as to be flush with the surface of the passivation film 9 covering the peripheral surface of the insulating film 8 on the side of one end portion of the substrate 2.

Likewise, the second external connection electrode 5B is formed so as to cover not only the surface of the second electrode film 5A and the insulating film 8 exposed within the cutout portion 19 but also the upper end surface of the passivation film 9 on the side of the other end portion of the substrate 2. The three side surfaces other than the side surface on the inner side of the second external connection electrode 5B are formed so as to be flush with the surface of the passivation film 9 covering the peripheral surface of the insulating film 8 on the side of the other end portion of the substrate 2. The external connection electrodes 4B and 5B may be formed with, for example, a Ni/Pd/Au laminated film having a Ni film in contact with the electrode films 4A and 5A, a Pd film formed thereon, and an Au film formed thereon. The laminated film described above can be formed by a plating method.

The passivation film 16 and the resin film 17 coat, from the surface, the internal electrodes 103A and 103B, the insulating film 8, the first electrode film 4A and the second electrode film 5A in the capacitor formation region 10C, and function as a protective film to protect them. On the other hand, the passivation film 9 formed on the side surfaces 2*c* of the substrate 2 and the outer peripheral surface of the insulating film 8 functions as a protective film to protect the side surfaces 2*c* of the substrate 2 and the outer peripheral surface of the insulating film 8.

FIG. 153 is an electrical circuit diagram showing an electrical structure within the chip capacitor. A plurality of capacitor elements C1 to C7 are connected in parallel between the first electrode 4 and the second electrode 5. In this way, the chip capacitor functions as a capacitor having a predetermined capacitance.

In the chip capacitor disclosed in Japanese Patent Application Publication No. 2013-168633, in order to increase the capacitance, it is necessary to increase the area of a facing surface of the lower electrode and the upper electrode. Hence, the area of the surface of a substrate needs to be increased, with the result that it is difficult to reduce its size.

In the arrangement of the preferred embodiment of the fifth invention, in the substrate 2, the first internal electrode formation trench 111A and the second internal electrode formation trench 111B are formed by digging down from the element formation surface 2*a* to a predetermined depth. The first internal electrode formation trench 111A and the second internal electrode formation trench 111B extend parallel to each other in the longitudinal direction of the substrate 2. The conductive member 51 is embedded within the first internal electrode formation trench 111A and the second internal electrode formation trench 111B, and thus the first internal electrode 103A is formed within the first internal electrode formation trench 111A, and the second internal electrode 103B is formed within the second internal electrode formation trench 111B. The capacitor element is formed with the first internal electrode 103A, the second internal electrode 103B, and the wall therebetween in the substrate 2.

In the arrangement of the preferred embodiment of the fifth invention, the first internal electrode 103A and the second internal electrode 103B can be made to face each other in a direction perpendicular to the direction of the thickness of the substrate 2. Hence, it is possible to increase the area of the facing surface of the first internal electrode 103A and the second internal electrode 103B without increasing the area of the surface of the substrate 2. In this way, it is possible to provide a chip capacitor that is decreased in size and that is highly increased in capacity.

In the arrangement of the preferred embodiment of the fifth invention, a plurality of first internal electrode formation trenches 111A and a plurality of second internal electrode formation trenches 111B are formed in the substrate 2. The plurality of first internal electrode formation trenches 111A and the plurality of second internal electrode formation trenches 111B are disposed so as to be alternately aligned. Hence, a plurality of first internal electrodes 103A and a plurality of second internal electrodes 103B can be disposed so as to be alternately aligned. In this way, it is possible to form a plurality of capacitor elements C1 to C7 within the substrate 2, with the result that it is possible to further increase the capacitance.

The first internal electrode formation trenches 111A and the second internal electrode formation trenches 111B are formed in the substrate 2, the conductive member 51 is embedded within the internal electrode formation trenches 111A and 111B and thus the first internal electrode 103A and the second internal electrode 103B can be formed, with the result that it is easy to manufacture the first internal electrode 103A and the second internal electrode 103B. In this way, it is possible to provide a chip capacitor that is easily manufactured.

Furthermore, on the element formation surface 2*a*, which is one surface of the substrate 2, both the external connection electrodes 4B and 5B of the first electrode 4 and the second electrode 5 are formed. Hence, as shown in FIG. 154, the element formation surface 2*a* is made to face a mounting substrate 91, the external connection electrodes 4B and 5B are bonded on the mounting substrate 91 by a solder 92 and thus it is possible to form a circuit assembly in which the chip capacitor 1 is surface-mounted on the mounting substrate 91. In other words, it is possible to provide a flip-chip connection-type chip capacitor 1, and it is possible to connect the chip capacitor 1 to the mounting substrate 91 by a face-down bonding in which the element formation surface 2*a* is made to face the mounting substrate 91 and wireless bonding. In this way, it is possible to decrease the occupied space of the chip capacitor 1 on the mounting substrate 91. In particular, it is possible to realize a low profile chip capacitor 1 on the mounting substrate 91. In this way, it is possible to effectively utilize the space within the housing of a small-sized electronic device or the like and to contribute to high-density mounting and miniaturization.

FIGS. 155A to 155L are cross-sectional views for illustrating an example of the manufacturing step of the chip capacitor, and show a cut surface corresponding to FIG. 147. FIGS. 156A to 156L are cross-sectional views for illustrating an example of the manufacturing step of the chip capacitor, and show a cut surface corresponding to FIG. 148. FIGS. 157A to 157E are partially enlarged cross-sectional views showing the details of the manufacturing step of the first internal electrode and the second internal electrode, and show a cut surface corresponding to FIG. 149.

As shown in FIGS. 155A, 156A, and 157A, an original substrate 50 that is an original of the substrate main body 6 is prepared. On the surface of the original substrate 50, the insulating film 7 such as a thermal oxide film or a CVD oxide film is formed. In the preferred embodiment, the insulating film 7 is a thermal oxide film. The surface of the insulating film 7 corresponds to the element formation surface 2*a* of the substrate 2.

FIG. 158 is a schematic plan view of part of the original substrate 50 in which the insulating film 7 is formed on the surface. As shown in FIG. 158, in the element formation surface 2*a*, chip capacitor regions X corresponding to a plurality of chip capacitors 1 are disposed in a matrix. Between the chip capacitor regions X adjacent to each other, a boundary region Y is provided. The boundary region Y is a region in the shape of a band having a substantially constant width, extends in two directions perpendicular to each other and is formed in a lattice shape. After necessary steps are performed on the original substrate 50 in which the insulating film 7 is formed on the surface, the original substrate 50 is separated along the boundary region Y, and thus it is possible to obtain a plurality of chip capacitors 1.

The steps performed on the original substrate 50 in which the insulating film 7 is formed on the surface are as follows. First, as shown in FIGS. 155A and 156A, by photolithography and etching, a part of the insulating film 7 that corresponds to a region in which the first and second internal electrode formation trenches 111A and 111B need to be formed is removed. In this way, in the insulating film 7, the first trench parts 111Aa and 111Ba of the first and second internal electrode formation trenches 111A and 111B are formed. Then, a hard mask formed with the insulating film 7 is used, and thus the original substrate 50 is etched. In this way, as shown in FIGS. 155B, 156B, and 157A, the second trench parts 111Ab and 111Bb of the first and second internal electrode formation trenches 111A and 111B are formed in the original substrate 50. In this way, in the insulating film 7 and the original substrate 50, the first and second internal electrode formation trenches 111A and 111B are formed. The internal electrode formation trenches 111A and 111B may be formed by, for example, a so-called BOSCH process. The BOSCH process is a process that is generally used to make a hollow part in a MEMS (Micro Electro Mechanical System).

Then, as shown in FIGS. 155B, 156B, and 157B, on the inner surface of the internal electrode formation trenches 111A and 111B, the insulating film (thermal oxide film) 12 is formed by a thermal oxidization method. Here, the surrounding wall (the side wall and the bottom wall) of the internal electrode formation trenches 111A and 111B (the second trench parts 111Ab and 111Bb) in the original substrate 50 is thermally oxidized into an insulator portion (thermal oxide film) 30 having insulation. In FIGS. 155B and 156B, the insulating film 12 is omitted but the insulator portion 30 is shown. In the preferred embodiment, in the original substrate 50, the entire wall sandwiched by the first internal electrode formation trench 111A (the second trench part 111Ab) and the second internal electrode formation trench 111B (the second trench part 111Bb) adjacent to each other is formed into the thermal oxide film.

Then, for example, by a sputtering method, the barrier metal film 13 made of TiN is formed on the element formation surface 2*a* including the interiors of the internal electrode formation trenches 111A and 111B. In this way, as shown in FIG. 157C, the barrier metal film 13 made of TiN is formed on the surfaces of the insulating film 12 and the insulating film 7 within the internal electrode formation trenches 111A and 111B and the surface of the insulating film 7 outside the internal electrode formation trenches 111A and 111B. Thereafter, annealing processing is performed. Thereafter, as shown in FIGS. 155C, 156C, and 157D, for example, by a CVD method, on the element formation surface 2*a* including the interiors of the internal electrode formation trenches 111A and 111B, the conductive member 51 formed of tungsten (W) is deposited.

Then, for example, by an etch back method, overall etching is performed on the conductive member 51 from its surface. The overall etching is continued until the surface of the conductive member 51 is flush with the surface of the insulating film 7. In this way, as shown in FIGS. 155D, 156D and 157E, the conductive member 51 is embedded within the internal electrode formation trenches 111A and 111B while in contact with the barrier metal film 13. By the conductive member 51 embedded within the first internal electrode formation trench 111A, the first internal electrode 103A is formed. By the conductive member 51 embedded within the second internal electrode formation trench 111B, the second internal electrode 103B is formed.

Then, as shown in FIGS. 155E and 156E, on the insulating film 7, the insulating film 8 formed with a USG (Undoped Silicate Glass) film or the like is formed so as to coat the insulating film 7 (the element formation surface 2*a*) and the conductive member 51 (the internal electrodes 103A and 103B). The insulating film 8 is formed by, for example, a CVD method. Thereafter, by photolithography and etching, in a region of the insulating film 8 corresponding to an end portion on the side of one end portion of the substrate 2 of the first internal electrode 103A and a region of the insulating film 8 corresponding to an end portion on the side of the other end portion of the substrate 2 of the second internal electrode 103B, the first contact hole 114 (see FIGS. 155E and 156E) and the second contact hole 115 (see FIG. 150) penetrating the insulating film 8 are respectively formed.

Then, for example, by sputtering, on the insulating film 8 including the interiors of the contact holes 114 and 115, an electrode film forming the first electrode film 4A and the second electrode film 5A is formed. In the preferred embodiment, the electrode film made of Al is formed. Thereafter, by photolithography and etching, the electrode film is patterned, and thus as shown in FIGS. 155F and 156F, the electrode film is separated into the first electrode film 4A and the second electrode film 5A.

Then, as shown in FIGS. 155G and 156G, for example, by a CVD method, the passivation film 16 such as a nitride film is formed, and furthermore, polyimide is applied to form the resin film 17. For example, polyimide to which photosensitivity is added is applied, and the polyimide is developed after exposure with a pattern corresponding to the cutout portions 18 and 19. In this way, the resin film 17 having a cutout portion corresponding to the cutout portions 18 and 19B is formed. Thereafter, as necessary, heat treatment for curing the resin film is performed. Then, by dry etching using the resin film 17 as a mask, the cutout portions 18 and 19 are formed in the passivation film 16.

Then, as shown in FIGS. 155H and 156H, a resist mask 52 having an opening 52*a* in a lattice shape matching with the boundary region Y (see FIG. 158) is formed. Plasma etching is performed via the resist mask 52, and thus the original substrate 50, the insulating film 7, and the insulating film 8 are etched from the surface of the insulating film 8 to a predetermined depth. In this way, along the boundary region Y, a groove (scribe groove) 53 for cutting is formed.

Then, the resist mask 52 is peeled off. Thereafter, as shown in FIGS. 155I and 156I, for example, by a CVD method, an insulating film 54 such as a nitride film serving as the material of the passivation film 9 is formed over the entire region of the surface of the original substrate 50. Here, the insulating film 54 is also formed over the entire region of the inner surface (the side wall surface and the bottom wall surface) of the groove 53.

Then, as shown in FIGS. 155J and 156J, the insulating film 54 is selectively etched. Specifically, a part of the insulating film 54 other than the insulating film 54 on the side wall surface of the groove 53 (the passivation film 9) is removed. In this way, a part of the electrode films 4A and 5A that is not covered by the passivation film 16 and the resin film 17 is exposed. The insulating film 54 on the bottom surface of the groove 53 is removed.

Then, as shown in FIGS. 155K and 156K, on the first and second electrode films 4A and 5A exposed from the cutout portions 18 and 19, for example, by plating (preferably, electroless plating), plating growth is performed in the following order: for example, Ni, Pd, and Au. In this way, the first and second external connection electrodes 4B and 5B are formed.

Thereafter, by a DBG (Dicing Before Grinding) method, a plurality of chip capacitor regions X are divided into pieces. Specifically, as shown in FIGS. 155L and 156L, first, on the side of the surface of the original substrate 50 (the side of the external connection electrode), a supporting tape 71 having an adhesive surface 72 is adhered. Then, the original substrate 50 is polished from the rear surface to the bottom surface of the groove 53. In this way, the plurality of chip capacitor regions X are separated into individual chip capacitors 1. Thereafter, on a plurality of chip capacitors 1, the recovery step shown in FIGS. 45A to 45D or the recovery step shown in FIGS. 46A to 46C described in the first preferred embodiment of the second invention may be performed.

FIGS. 159A and 159B are cross-sectional views showing a modification example of an external connection electrode in the chip capacitor 1 of the preferred embodiment of the fifth invention described previously. FIG. 159A shows a cut surface corresponding to FIG. 147, and FIG. 159B shows a cut surface corresponding to FIG. 148. In FIGS. 159A and 159B, portions corresponding to the portions of FIGS. 147 and 148 described previously are provided with the same symbols of FIGS. 147 and 148.

The first external connection electrode 4B fills one cutout portion 18 in the passivation film 16 and the resin film 17, and the second external connection electrode 5B fills the other cutout portion 19.

The first external connection electrode 4B is formed so as to cover the upper portion of the passivation film 9 on the side of one end portion of the substrate 2 and to straddle, from the peripheral portion of the surface of the insulating film 8, the surface of the passivation film 9 covering the three side surfaces 2*c* on the side of one end portion of the substrate 2. In other words, the first external connection electrode 4B is formed so as to cover not only the surfaces of the first electrode film 4A and the insulating film 8 exposed within the cutout portion 18 but also the passivation film 9 on the three side surfaces 2*c* of the substrate 2.

Likewise, the second external connection electrode 5B is formed so as to cover the upper portion of the passivation film 9 on the side of the other end portion of the substrate 2 and to straddle, from the peripheral portion of the surface of the insulating film 8, the surface of the passivation film 9 covering the three side surfaces 2*c* on the side of the other end portion of the substrate 2. In other words, the second external connection electrode 5B is formed so as to cover not only the surfaces of the second electrode film 5A and the insulating film 8 exposed within the cutout portion 19 but also the passivation film 9 on the three side surfaces 2*c* on the side of the other end portion of the substrate 2.

As described above, in the chip capacitor 1, the first external connection electrode 4B is formed so as to cover the three side surfaces 2*c* on the side of one end portion of the substrate 2, and the second external connection electrode 5B is formed so as to cover the three side surfaces 2*c* on the side of the other end portion of the substrate 2. In other words, the external connection electrodes 4B and 5B are formed not only on the element formation surface 2*a* on the substrate 2 but also on the side surfaces 2*c* of the substrate 2. In this way, in the form shown in FIG. 154 described previously, when the external connection electrodes 4B and 5B of the chip capacitor 1 are soldered to the mounting substrate, it is possible to increase the bonding area between the external connection electrodes 4B and 5B and the mounting substrate. Consequently, it is possible to enhance the bonding strength of the external connection electrodes 4B and 5B on the mounting substrate.

FIG. 160A is a diagram showing a modification example of a conductive member embedded within each of the internal electrode formation trenches 111A and 111B, and is a partially enlarged cross-sectional view corresponding to FIG. 149. FIG. 160B is a partially enlarged cross-sectional view of FIG. 160A.

As shown in FIG. 160A, the width W2 of each of the internal electrode formation trenches 111A and 111B may be, for example, 10 μm or less, and more specifically, may be 3 μm or more and 9 μm or less. The depth D of each of the internal electrode formation trenches 111A and 111B may be, for example, 10 μm or more, and more specifically, may be 30 μm or more and 80 μm or less.

In the modification example, as shown in FIGS. 160A and 160B, within each of the internal electrode formation trenches 111A and 111B, as in the same arrangement as the modification example of the conductive member 51 in the first preferred embodiment of the second invention described previously, the conductive member 51 is embedded (also see FIGS. 48A and 48B). Since the internal electrode formation trenches 111A and 111B have the same arrangement, in FIG. 160B, symbols in the arrangement on the side of the second internal electrode formation trench 111B corresponding to the arrangement on the side of the first internal electrode formation trench 111A are parenthesized.

Although in the preferred embodiment of the fifth invention described previously, the substrate 2 is formed with the substrate main body 6 and the insulating film 7 formed on the surface of the substrate main body, the substrate 2 may be formed of a material having insulation.

[5] Sixth Invention

An object of the sixth invention is to provide an LC composite element chip including an inductor and a capacitor and a circuit assembly that includes it.

Another object of the sixth invention is to provide a method of manufacturing an LC composite element chip including an inductor and a capacitor.

The sixth invention has the following features.

E1. An LC composite element chip including: a substrate that has an element formation surface including a capacitor formation region and an inductor formation region; a first internal electrode formation trench that is formed in the substrate by digging down from the element formation surface in the capacitor formation region; a second internal electrode formation trench that is formed in the substrate by digging down from the element formation surface in the capacitor formation region and that is disposed, in plan view when seen in a normal direction perpendicular to the element formation surface, at an interval from and parallel to the first internal electrode formation trench; a coil formation trench that is formed in the substrate by digging down from the element formation surface in the inductor formation region and that is formed, in plan view, in the shape of a spiral; a first internal electrode that is formed with a conductive member embedded within the first internal electrode formation trench; a second internal electrode that is formed with a conductive member embedded within the second internal electrode formation trench; and a coil formed with a conductive member embedded within the coil formation trench.

In this arrangement, a capacitor element is formed with the first internal electrode, the second internal electrode, and a wall therebetween on the substrate. Hence, it is possible to form a coil and a capacitor element within the substrate, and thus it is possible to obtain an LC composite element chip including an inductor and a capacitor.

In this arrangement, the first internal electrode and the second internal electrode can also be opposite each other in a direction perpendicular to the direction of the thickness of the substrate. Hence, it is possible to increase the area of a facing surface of the first internal electrode and the second internal electrode without increasing the area of the capacitor formation region on the surface of the substrate. Since in this arrangement, it is possible to increase the cross-sectional area of the coil (cross-sectional area perpendicular to a direction in which the coil is extended in the spiral direction), it is possible to decrease the internal resistance of the coil. In this way, it is possible to increase the Q value of the coil. Hence, in this arrangement, it is possible to provide an LC composite element chip that is highly increased in capacity, that has a high performance inductor and that is decreased in size.

In the substrate, the first internal electrode formation trench, the second internal electrode formation trench, and the coil formation trench are formed, the conductive member is embedded within these trenches and thus it is possible to form the first internal electrode, the second internal electrode, and the coil, with the result that it is easy to manufacture the capacitor element and the coil. In this way, it is possible to provide an LC composite element chip that is easily manufactured.

E2. The LC composite element chip described in "E1" further including: a common external electrode which is disposed on the element formation surface and to which any one of the first internal electrode and the second internal electrode and one end portion of the coil are electrically connected; an internal electrode-connection external electrode which is disposed on the element formation surface and to which the other of the first internal electrode and the second internal electrode is electrically connected; and a coil-connection external electrode which is disposed on the element formation surface and to which the other end portion of the coil is electrically connected.

In this arrangement, it is possible to obtain an LC composite element chip in which the capacitor element is connected between the internal electrode-connection external electrode and the common external electrode and in which the coil is connected between the common external electrode and the coil-connection external electrode.

E3. The LC composite element chip described in "E2," where the element formation surface is formed, in plan view, in the shape of a rectangle, the capacitor formation region and the inductor formation region are provided on the element formation surface so as to be aligned in a first direction parallel to a predetermined side of the element formation surface, the first internal electrode formation trench and the second internal electrode formation trench extend along the first direction within the capacitor formation region, the internal electrode-connection external electrode is disposed on an end portion on the opposite side to the side of the inductor formation region among both end portions of the capacitor formation region in the first direction, the common external electrode is disposed on a region straddling the capacitor formation region and the inductor formation region and the coil-connection external electrode is disposed on the end portion on the opposite side to the side of the capacitor formation region among both end portions of the inductor formation region in the first direction.

E4. The LC composite element chip described in "E3," where the first internal electrode formation trench includes a plurality of first internal electrode formation trenches disposed at an interval from both in a direction along the element formation surface and in a second direction perpendicular to the first direction, the second internal electrode formation trench includes a plurality of second internal electrode formation trenches disposed at an interval in the second direction and the plurality of first internal electrode formation trenches and the plurality of second internal electrode formation trenches are disposed so as to be alternately aligned in the second direction.

In this arrangement, it is possible to form, within the substrate, a plurality of first internal electrodes extending in the first direction and a plurality of second internal electrodes extending in the first direction and disposed alternately with the first internal electrodes in the second direction. In this way, a plurality of capacitor elements can be formed within the substrate, and the plurality of capacitor elements can be connected in parallel between the internal electrode-connection external electrode and the common external electrode, with the result that it is possible to further increase the capacity of the capacitor.

E5. The LC composite element chip described in “E2,” where the element formation surface is formed, in plan view, in the shape of a rectangle, the capacitor formation region and the inductor formation region are provided on the element formation surface so as to be aligned in a first direction parallel to a predetermined side of the element formation surface, the first internal electrode formation trench and the second internal electrode formation trench extend, within the capacitor formation region, both in a direction along the element formation surface and along a second direction perpendicular to the first direction, the common external electrode is disposed on one end portion among both end portions of the element formation surface in the second direction, the internal electrode-connection external electrode is disposed on a region on the side of the capacitor formation region in the other end portion of the element formation surface in the second direction and the coil-connection external electrode is disposed on a region on the side of the inductor formation region in the other end portion of the element formation surface in the second direction.

E6. The LC composite element chip described in “E5,” where the first internal electrode formation trench includes a plurality of first internal electrode formation trenches disposed at an interval in the first direction, the second internal electrode formation trench includes a plurality of second internal electrode formation trenches disposed at an interval in the first direction and the plurality of first internal electrode formation trenches and the plurality of second internal electrode formation trenches are disposed so as to be alternately aligned in the first direction.

In this arrangement, it is possible to form, within the substrate, a plurality of first internal electrodes extending in the second direction and a plurality of second internal electrodes extending in the second direction and disposed alternately with the first internal electrodes in the first direction. In this way, a plurality of capacitor elements can be formed within the substrate, and the plurality of capacitor elements can be connected in parallel between the common external electrode and the internal electrode-connection external electrode, with the result that it is possible to further increase the capacity of the capacitor.

E7. The LC composite element chip described in any one of “E2” to “E6,” further including an insulating film which is formed on the element formation surface so as to cover the first internal electrode, the second internal electrode and the coil, the insulating film including a first contact hole which exposes part of the first internal electrode, a second contact hole which exposes part of the second internal electrode, a third contact hole which exposes one end portion of the coil, and a fourth contact hole which exposes the other end portion of the coil, where on the insulating film, the common external electrode, the internal electrode-connection external electrode, and the coil-connection external electrode are formed, the common external electrode is connected via any one of the first contact hole and the second contact hole to one internal electrode exposed from the one contact hole of the first internal electrode and the second internal electrode and is also connected via the third contact hole to one end portion of the coil, the internal electrode-connection external electrode is connected via the other of the first contact hole and the second contact hole to the other internal electrode exposed from the other contact hole of the first internal electrode and the second internal electrode and the coil-connection external electrode is connected via the fourth contact hole to the other end portion of the coil.

E8. The LC composite element chip described in any one of “E1” to “E7” where a depth of the first internal electrode formation trench, the second internal electrode formation trench, and the coil formation trench is 10 μm or more. In this arrangement, it is possible to increase the area of the facing surface of the first internal electrode and the second internal electrode, and thus it is possible to further increase the capacity of capacitor. Since in this arrangement, it is possible to increase the cross-sectional area of the coil, it is possible to decrease the internal resistance of the coil. In this way, it is possible to increase the Q value of the coil.

E9. The LC composite element chip described in any one of “E1” to “E7” where a depth of the first internal electrode formation trench, the second internal electrode formation trench, and the coil formation trench is 10 μm or more and 82 μm or less.

E10. The LC composite element chip described in any one of “E1” to “E9” where a width of the first internal electrode formation trench, the second internal electrode formation trench, and the coil formation trench is 1 μm or more and 3 μm or less.

E11. The LC composite element chip described in any one of “E1” to “E10” where the conductive member is formed of tungsten.

E12. A circuit assembly including: a mounting substrate; and the LC composite element chip described in any one of “E1” to “E11” mounted on the mounting substrate. In this arrangement, it is possible to provide a circuit assembly using an LC composite element chip that includes an inductor and a capacitor.

E13. The circuit assembly described in “E12,” where the LC composite element chip is connected to the mounting substrate by wireless bonding. In this arrangement, it is possible to decrease the occupied space of the LC composite element chip on the mounting substrate, and thus it is possible to contribute to the high-density mounting of electronic parts.

E14. A method of manufacturing an LC composite element chip, the method including: a first step of preparing a substrate having an element formation surface including a capacitor formation region and an inductor formation region; a second step of forming, in the capacitor formation region, in the substrate, a first internal electrode formation trench and a second internal electrode formation trench that is disposed, in plan view when seen in a normal direction perpendicular to the element formation surface, at an interval from and parallel to the first internal electrode formation trench by digging down from the element formation surface and forming, in the inductor formation region, a coil formation trench in the shape of a spiral in plan view by digging down from the element formation surface; and a third step of embedding a conductive member within the first electrode formation trench, the first internal electrode formation trench, and the coil formation trench to form a first internal electrode, a second internal electrode, and a coil within the first electrode formation trench, the first internal electrode formation trench, and the coil formation trench, respectively.

In the manufacturing method, the conductive member is embedded within the first internal electrode formation trench, the second internal electrode formation trench, and the coil formation trench formed in the substrate, and thus it is possible to form the first internal electrode, the second internal electrode, and the coil. Hence, it is possible to provide an LC composite element chip having the same effects as described in “E1” described previously.

E15. The method of manufacturing an LC composite element chip described in “E14,” the method further including: a fourth step of forming an insulating layer on the element formation surface so as to coat the first internal electrode, the second internal electrode, and the coil; a fifth step of forming, in the insulating layer, a first contact hole which exposes part of the first internal electrode, a second contact hole which exposes part of the second internal electrode, a third contact hole which exposes one end portion of the coil, and a fourth contact hole which exposes the other end portion of the coil; a sixth step of forming, on the insulating film, a common external electrode that makes contact with, via one of the first contact hole and the second contact hole, one internal electrode exposed from the one contact hole of the first internal electrode and the second internal electrode and that makes contact with, via the third contact hole, one end portion of the coil, an internal electrode-connection external electrode that makes contact with, via the other of the first contact hole and the second contact hole, the other internal electrode exposed from the other contact hole of the first internal electrode and the second internal electrode, and a coil-connection external electrode that makes contact with, via the fourth contact hole, the other end portion of the coil.

In the manufacturing method, it is possible to form, on the insulating film formed on the element formation surface, the common external electrode to which any one of the first internal electrode and the second internal electrode and one end portion of the coil are connected, the internal electrode-connection external electrode which the other of the first internal electrode and the second internal electrode is connected and the coil-connection external electrode to which the other end portion of the coil is connected.

Preferred embodiments of the sixth invention will be described in detail with reference to FIGS. 161 to 198. The symbols in FIGS. 161 to 198 are not related to the symbols in FIGS. 1 to 160B used in the description of the first to fifth inventions discussed previously.

FIG. 161 is a partially cut perspective view of an LC composite element chip according to a first preferred embodiment of the sixth invention.

The LC composite element chip 1 is a minute chip part and is formed in the shape of a rectangular parallelepiped. The planar shape of the LC composite element chip 1 may be rectangular, the length L in the longitudinal direction may be about 0.8 mm and the length W in the lateral direction may be about 0.2 mm. The thickness T of the entire LC composite element chip 1 may be about 0.15 mm.

The LC composite element chip 1 includes a substrate 2, a plurality of capacitor elements C1 to C7 (see FIG. 169) that are formed on the substrate 2, a coil 3 that is formed within the substrate 2, a first electrode (first external electrode) 61 that is connected together to one electrode of each of the capacitor elements C1 to C7, a second electrode (second external electrode) 62 that is connected together to the other electrode of each of the capacitor elements C1 to C7 and that is connected to one end portion of the coil 3, and a third electrode (third external electrode) 63 that is connected to the other end portion of the coil 3.

FIG. 162 is a plan view of the LC composite element chip. FIG. 163A is a cross-sectional view taken along line CLXIIIA-CLXIIIA in FIG. 162, and FIG. 163B is a partially enlarged cross-sectional view of FIG. 163A. FIG. 164A is a cross-sectional view taken along line CLXIVA-CLXIVA in FIG. 162, and FIG. 164B is a partially enlarged cross-sectional view of FIG. 164A. FIG. 165 is a cross-sectional view taken along line CLXV-CLXV in FIG. 162, FIG. 166 is a cross-sectional view taken along line CLXVI-CLXVI in FIG. 162, FIG. 167 is a cross-sectional view taken along line CLXVII-CLXVII in FIG. 162 and FIG. 168 is a cross-sectional view taken along line CLXVIII-CLXVIII in FIG. 162. FIG. 169 is a plan view showing a structure of the surface of a substrate by removing an arrangement formed on the surface of the substrate.

In the following description, the "front" refers to the lower side of the plane of FIG. 162, the "back" refers to the upper side of the plane of FIG. 162, the "left" refers to the left side of the plane of FIG. 162 and the "right" refers to the right side of the plane of FIG. 162.

The substrate 2 is formed in the shape of a rectangular parallelepiped, and includes a pair of main surfaces 2*a* and 2*b* and four side surfaces 2*c*. One (the main surface 2*a* on the upper surface side in FIG. 161) of the pair of main surfaces 2*a* and 2*b* is an element formation surface. In the following description, the main surface 2*a* is referred to as an "element formation surface 2*a*," and the main surface 2*b* on the side opposite to the element formation surface 2*a* is referred to as a "rear surface 2*b*." In the preferred embodiment, the substrate 2 is formed with a substrate main body 6 and an insulating film 7 formed on the surface thereof, and the surface of the insulating film 7 on the side opposite to the side of the substrate main body 6 is the element formation surface 2*a*. In the preferred embodiment (the same is true for the other preferred embodiments of the sixth invention), the substrate main body 6 is formed with a silicon substrate, and the insulating film 7 is formed with a thermal oxide film ($SiO_2$). The element formation surface 2*a* is formed in the shape of a rectangle which is long in a left/right direction in plan view when seen in a normal direction perpendicular to the element formation surface 2*a*. The surface (element formation surface 2*a*) of the substrate 2 is covered by an insulating film 8. The four side surfaces 2*c* of the substrate 2 and the outer peripheral surface of the insulating film 8 are covered by a passivation film 9 such as a nitride film.

With reference to FIGS. 162 and 169, in the element formation surface 2*a*, in the left half portion thereof, a capacitor formation region E1 for the formation of a capacitor is provided, and in the right half portion thereof, an inductor formation region E2 for the formation of an inductor is provided. These regions E1 and E2 are formed, in plan view, in the shape of a rectangle which is long in a left/right direction. In the left end portion (the left end portion of the capacitor formation region E1) of the element formation surface 2*a*, a first electrode formation region 201 is provided, in the left/right center portion (the region straddling the capacitor formation region E1 and the inductor formation region E2) of the element formation surface 2*a*, a second electrode formation region 202 is provided and in the right end portion (the right end portion of the inductor formation region E2) of the element formation surface 2*a*, a third electrode formation region 203 is provided. These electrode formation regions 201, 202 and 203 are formed, in plan view, in the shape of a rectangle.

In the first electrode formation region 201, the external connection electrode (the first external connection electrode) 61B of a first electrode 61 is disposed, in the second electrode formation region 202, the external connection electrode (the second external connection electrode) 62B of a second electrode 62 is disposed and in the third electrode formation region 203, the external connection electrode (the third external connection electrode) 63B of a third electrode 63 is disposed. The first external connection electrode 61B is formed, in plan view, in the shape of a rectangle, and covers the entire region of the first electrode formation region 201. The second external connection electrode 62B is formed, in plan view, in the shape of a rectangle, and covers the entire region of the second electrode formation region 202. The third external connection electrode 63B is formed, in plan view, in the shape of a rectangle, and covers the entire region of the third electrode formation region 203. On the element formation surface 2*a* between the first external connection electrode 61B and the second external connection electrode 62B, a capacitor formation region 204 for the formation of the main parts of the capacitor elements C1 to C7 is provided. On the element formation surface 2*a* between the second external connection electrode 62B and the third external connection electrode 63B, a coil formation region 205 for the formation of the coil 3 is provided. In the preferred embodiment, the capacitor formation region 204 and the coil formation region 205 are formed in the shape of a rectangle.

With reference to FIGS. 162, 163A, 164A, 164B, 165, 166, and 169, in the capacitor formation region E1, in the substrate 2, a plurality of first internal electrode formation trenches 111A and a plurality of second internal electrode formation trenches 111B are formed by digging down from the element formation surface 2*a* to a predetermined depth. The internal electrode formation trenches 111A and 111B extend along the longitudinal direction (the left/right direction) of the element formation surface 2*a*. The internal electrode formation trenches 111A and 111B extend at a fixed interval from and parallel to each other in the lateral direction (the frontward/backward direction) of the substrate 2. Hence, the plurality of internal electrode formation trenches 111A and 111B are formed, in plan view, in the shape of a stripe. In the preferred embodiment, the internal electrode formation trenches 111A and 111B extend from the interior of the first electrode formation region 201 through the capacitor formation region 204 to the interior of the second electrode formation region 202. Hence, in plan view, one end portions of the internal electrode formation trenches 111A and 111B are within the first electrode formation region 201, and the other end portions thereof are within the second electrode formation region 202.

The cross section of each of the internal electrode formation trenches 111A and 111B is formed in the shape of a rectangle which is long in the direction of the thickness of the substrate 2. A plurality of first internal electrode formation trenches 111A and a second internal electrode formation trenches 111B are disposed such that the first internal electrode formation trenches 111A and the second internal electrode formation trenched 111B are alternately aligned in the lateral direction of the substrate 2. For example, the width of each of the internal electrode formation trenches 111A and 111B may be 1 μm or more and 3 μm or less. For example, the depth of each of the internal electrode formation trenches 111A and 111B may be 10 μm or more and 82 μm or less.

As shown in FIG. 164B, the internal electrode formation trenches 111A and 111B are formed with first trench parts 111Aa and 111Ba that are formed in the insulating film 7 and second trench parts 111Ab and 111Bb that are formed in the substrate main body 6 and that communicate with the first trench parts 111Aa and 111Ba. On the inner surface of the internal electrode formation trenches 111A and 111B (the second trench parts 111Ab and 111Bb) in the substrate main body 6, an insulating film 12 formed with an oxide film or the like is formed. In the preferred embodiment, the insulating film 12 is formed with a thermal oxide film ($SiO_2$), and when the thermal oxide film is formed on the inner surface of the internal electrode formation trenches 111A and 111B, the surrounding wall (the side wall and the bottom wall) of the internal electrode formation trenches 111A and 111B (the second trench parts 111Ab and 111Bb) in the substrate main body 6 is thermally oxidized into an insulator portion (thermal oxide film) 30 having insulation. In the preferred embodiment, an example is described where the entire wall between the first internal electrode formation trench 111A (the second trench part 111Ab) and the second internal electrode formation trench 111B (the second part 111Bb) adjacent to each other is formed into a thermal oxide film.

On the surface of the insulating film 12 within the internal electrode formation trenches 111A and 111B (the second trench parts 111Ab and 111Bb) and on the inner surface of the internal electrode formation trenches 111A and 111B (the first trench parts 111Aa and 111Ba) in the insulating film 7, a barrier metal film 13 is formed. The barrier metal film 13 is formed of, for example, TiN. The thickness of the barrier metal film 13 is about 400 to 500 angstroms. Within each of the internal electrode formation trenches 111A and 111B, a conductive member 51 is embedded while being in contact with the barrier metal film 13. In the preferred embodiment, the conductive member 51 is formed of tungsten (W).

The first internal electrode 103A is formed with the conductive member 51 embedded within the first internal electrode formation trench 111A, and the second internal electrode 103B is formed with the conductive member 51 embedded within the second internal electrode formation trench 111B. In this way, a plurality of first internal electrodes 103A and second internal electrodes 103B are formed within the substrate 2. These internal electrodes 103A and 103B are formed in the shape of a rectangle which is long in the longitudinal direction of the substrate 2 when seen in the lateral direction of the substrate 2. In other words, these internal electrodes 103A and 103B are formed in the shape of a flat plate having a surface parallel to the two side surfaces 2*c* opposite each other in the lateral direction of the substrate 2.

In particular, with reference to FIG. 169, the plurality of first internal electrodes 103A and the second internal electrodes 103B are disposed so as to be alternately aligned in the lateral direction of the substrate 2. Hence, the first internal electrode 103A and the second internal electrode 103B adjacent to each other have facing surfaces opposite each other in the lateral direction of the substrate 2. The wall (the insulator portion 30) of the substrate 2 sandwiched by the facing surfaces of the first internal electrode 103A and the second internal electrode 103B adjacent to each other forms a capacitance film (dielectric film) 35. A pair of the first internal electrode 103A and the second internal electrode 103A adjacent to each other and the capacitance film 35 therebetween form one capacitor element. In the preferred embodiment, since four first internal electrodes 103A and four second internal electrodes 103B are provided, there are 7 pairs of the first internal electrodes 103A and the second internal electrodes 103B adjacent to each other. Hence, 7 capacitor elements C1 to C7 are formed on the substrate 2. One or more of the first internal electrodes 103A and one or more of the second internal electrodes 103B are preferably provided.

With reference to FIGS. 162, 163A, 163B, 167, and 169, in the coil formation region 205 within the inductor formation region E2, in the substrate 2, the coil formation trench 11 is formed by digging down from the element formation surface 2*a* to a predetermined depth. The coil formation trench 11 is formed, in plan view, in the shape of a spiral. In the preferred embodiment, the coil formation trench 11 is formed, in plan view, in the shape of a quadrilateral spiral, and has a plurality of rectilinear portions parallel to the side surfaces 2*c* of the substrate 2. The cross section (cross section in a direction perpendicular to a direction in which the coil formation trench 11 is extended in the spiral direction) of the coil formation trench 11 is formed in the shape of a rectangle which is long in the direction of the thickness of the substrate 2. For example, the width of the coil formation trench 11 may be 1 μm or more and 3 μm or less. For example, the depth of the coil formation trench 11 may be 10 μm or more and 82 μm or less. The depth of the coil formation trench 11 is preferably 10 μm or more so that the internal resistance of the coil 3 formed within the coil formation trench 11 is decreased.

As shown in FIG. 163B, the coil formation trench 11 is formed with a first trench part 11*a* that is formed in the insulating film 7 and a second trench part 11*b* that is formed in the substrate main body 6 and that communicates with the first trench part 11*a*. On the inner surface of the coil formation trench 11 (the second trench part 11*b*) in the substrate main body 6, an insulating film 12 formed with an oxide film or the like is formed. In the preferred embodiment, the insulating film 12 is formed with a thermal oxide film ($SiO_2$), and when the thermal oxide film is formed on the inner surface of the coil formation trench 11, the surrounding wall (the side wall and the bottom wall) of the coil formation trench 11 (the second trench part 11*b*) in the substrate main body 6 is thermally oxidized into an insulator portion (thermal oxide film) 30 having insulation. In the preferred embodiment, an example is described where the entire wall sandwiched by the coil formation trenches 11 (the second trench part 11*b*) in the shape of a spiral in the substrate main body 6 is a thermal oxide film.

On the surface of the insulating film 12 within the coil formation trench 11 (the second trench part 11*b*) and on the inner surface of the coil formation trench 11 (the first trench part 11*a*) in the insulating film 7, a barrier metal film 13 is formed. The barrier metal film 13 is formed of, for example, TiN. The thickness of the barrier metal film 13 is about 400 to 500 angstroms. Within the coil formation trench 11, a conductive member 51 is embedded while being in contact with the barrier metal film 13. In the preferred embodiment, the conductive member 51 is formed of tungsten (W). The coil 3 is formed with the conductive member 51 embedded within the coil formation trench 11. Hence, the coil 3 is formed, in plan view, in the shape of a spiral (in the shape of a quadrilateral spiral) of the same pattern as the coil formation trench 11. Specifically, the coil 3 includes a plurality of plate-shaped parts parallel to the side surfaces 2*c* of the substrate 2.

On the element formation surface 2*a* (the surface of the insulating film 7) of the substrate 2, an insulating film 8 is formed so as to coat the element formation surface 2*a* and the conductive member 51 (the internal electrodes 103A and 103B and the coil 3). The insulating film 8 is formed, in plan view, in the shape of a rectangle matching with the element formation surface 2*a*. The insulating film 8 is formed with, for example, a USG (Undoped Silicate Glass) film. In the insulating film 8, on the side of one end portion (the side of the left end portion) of the capacitor formation region E1, a first contact hole 114 (see FIGS. 162, 163A, 164A, and 164B) that exposes an end portion corresponding to the first internal electrode 103A is formed. In the insulating film 8, on the side of the other end portion (the side of the right end portion) of the capacitor formation region E1, a second contact hole 115 (see FIGS. 162 and 165) that exposes an end portion corresponding to the second internal electrode 103B is formed. In the insulating film 8, within the coil formation region 205, a third contact hole 14 (see FIGS. 162 and 167) that exposes an end portion (outer peripheral side end portion) of the coil 3 and a fourth contact hole 15 (see FIGS. 162 and 163A) that exposes the other end portion (inner peripheral side end portion) of the coil 3 are formed. As described previously, in the side surfaces 2*c* of the substrate 2 and the outer peripheral surface of the insulating film 8, the passivation film 9 formed with a nitride film or the like is formed.

On the surface of the insulating film 8, the first electrode 61, the second electrode 62, and the third electrode 63 are formed. The first electrode 61 includes a first electrode film (first pad) 61A that is formed on the surface of the insulating film 8 and a first external connection electrode 61B that is bonded to the first electrode film 61A. As shown in FIG. 162, the first electrode film 61A is formed in the shape of a rectangle at one end portion (the left end portion) of the element formation surface 2*a*. In plan view, the side edge portion of the first electrode film 61A on the side of the second electrode 62 protrudes to the side of the second electrode 62 as compared with the side edge of the first electrode formation region 201 on the side of the second electrode 62. The first external connection electrode 61B is connected to the first electrode film 61A. As shown in FIGS. 162, 163A, 164A, and 164B, the first electrode film 61A enters the first contact hole 114 from the surface of the insulating film 8, and is connected to the end portion (the end portion on the side of the first electrode 61) of the first internal electrode 103A within the first contact hole 114.

The second electrode 62 includes a second electrode film 62A that is formed on the surface of the insulating film and a second external connection electrode 62B that is bonded to the second electrode film 62A. As shown in FIG. 162, the second electrode film 62A includes a drawing electrode 62Aa that is connected to one end portion (the outer peripheral side end portion) of the coil 3 and a second pad 62Ab that is formed integrally with the drawing electrode 62Aa and that is connected to the end portion of the second internal electrode 103B. The second pad 62Ab is formed in the shape of a rectangle in the center portion in the longitudinal direction of the element formation surface 2*a*. The second pad 62Ab straddles the capacitor formation region E1 and the inductor formation region E2. In plan view, the side edge portion of the second pad 62Ab on the side of the first electrode 61 protrudes to the side of the first electrode 61 as compared with the side edge of the second electrode formation region 202 on the side of the first electrode 61. On the other hand, the side edge portion of the second pad 62Ab on the side of the third electrode 63 protrudes to the side of the third electrode 63 as compared with the side edge of the second electrode formation region 202 on the side of the third electrode 63. The second external connection electrode 62B is connected to the pad 62Ab. As shown in FIGS. 162 and 165, the second pad 62Ab enters the second contact hole 115 from the surface of the insulating film 8, and is connected to the end portion (the end portion on the side of the second electrode 62) of the second internal electrode 103B within the second contact hole 115.

As shown in FIGS. 162 and 167, the drawing electrode 62Aa enters the third contact hole 14 from the surface of the insulating film 8, and is connected to one end portion of the coil 3 within the third contact hole 14. The drawing electrode 62Aa is formed straight along a straight line that passes above one end portion of the coil 3 to reach the second pad 62Ab. By extending one end portion of the coil formation trench 11 to a position below the first pad 61Ab, one end portion of the coil 3 may be disposed in a position below the second pad 62Ab. In this way, since the third contact hole 14 can be formed in a position below the second pad 62Ab, one end portion of the coil 3 can be connected to the second pad 62Ab. In this case, since the second electrode film 62A can be formed with only the second pad 62Ab, the drawing electrode 62Aa is not needed.

The third electrode 63 includes a third electrode film 63A that is formed on the surface of the insulating film and a third external connection electrode 63B that is bonded to the third electrode film 63A. As shown in FIG. 162, the third electrode film 63A includes a drawing electrode 63Aa that is connected to the other end portion (the inner peripheral side end portion) of the coil 3 and a third pad 63Ab that is formed integrally with the drawing electrode 63Aa. The third pad 63Ab is formed in the shape of a rectangle at the other end portion (the right end portion) of the element formation surface 2*a*. In plan view, the side edge portion of the third pad 63Ab on the side of the second electrode 62 protrudes to the side of the second electrode 62 as compared with the side edge of the third electrode formation region 203 on the side of the second electrode 62. The third external connection electrode 63B is connected to the third pad 63Ab. As shown in FIGS. 162 and 163A, the drawing electrode 63Aa enters the fourth contact hole 15 from the surface of the insulating film 8, and is connected to the other end portion of the coil 3 within the fourth contact hole 15. The drawing electrode 63Aa is formed straight along a straight line that passes above the other end portion of the coil 3 to reach the third pad 63Ab. In the preferred embodiment, as the electrode films 61A, 62A, and 63A, an Al film is used.

The first electrode film 61A, the second electrode film 62A, and the third electrode film 63A are covered by a passivation film 16 formed with, for example, a nitride film (SiN), and furthermore, on the passivation film 16, a resin film 17 such as polyimide is formed. In the passivation film 16 and the resin film 17, a first cutout portion 211 is formed that exposes a region other than an edge portion on the side of the second electrode 62 on the surface of the first electrode film 61A. In the passivation film 16 and the resin film 17, a second cutout portion 212 is formed that exposes a region other than an edge portion on the side of the first electrode 61 on the surface of the second pad 62Ab and an edge portion on the side of the third electrode 63. Furthermore, in the passivation film 16 and the resin film 17, a third cutout portion 213 is formed that exposes a region other than an edge portion on the side of the second electrode 62 on the surface of the third pad 63Ab. In other words, the passivation film 16 and the resin film 17 are formed, in plan view, in the capacitor formation region 204 and the coil formation region 205 on the element formation surface 2*a*.

The first external connection electrode 61B fills the first cutout portion 211. The second external connection electrode 62B fills the second cutout portion 212. The third external connection electrode 63B fills the third cutout portion 213. The first external connection electrode 61B is formed so as to protrude from the resin film 17, and includes a drawing portion 20 that is drawn out along the surface of the resin film 17 to the side of the second electrode 62. The second external connection electrode 62B is formed so as to protrude from the resin film 17, and includes a drawing portion 20 that is drawn out along the surface of the resin film 17 to the side of the first electrode 61 and the side of the third electrode 63. The third external connection electrode 63B is formed so as to protrude from the resin film 17, and includes a drawing portion 20 that is drawn out along the surface of the resin film 17 to the side of the second electrode 62.

In the first preferred embodiment of the sixth invention, the first external connection electrode 61B is formed so as to cover not only the surfaces of the first electrode film 61A and the insulating film 8 exposed within the first cutout portion 211 but also the upper end surface of the passivation film 9 on the side of one end portion of the substrate 2. The three side surfaces other than the side surface on the inner side of the first external connection electrode 61B are formed so as to be flush with the surface of the passivation film 9 covering the peripheral surface of the insulating film 8 on the side of one end portion of the substrate 2.

The second external connection electrode 62B is formed so as to cover not only the surface of the second electrode film 62A and the insulating film 8 exposed within the second cutout portion 212 but also the upper end surface of the passivation film 9 in the center portion in the longitudinal direction of the substrate 2. The two side surfaces other than the side surface opposite the first electrode 61 and the side surface opposite the third electrode 63 in the second external connection electrode 62B are formed so as to be flush with the surface of the passivation film 9 covering the peripheral surface of the insulating film 8 in the center portion in the longitudinal direction of the substrate 2.

The third external connection electrode 63B is formed so as to cover not only the surface of the third electrode film 63A and the insulating film 8 exposed within the third cutout portion 213 but also the upper end surface of the passivation film 9 on the side of the other end portion of the substrate 2. The three side surfaces other than the side surface on the inner side of the third external connection electrode 63B are formed so as to be flush with the surface of the passivation film 9 covering the peripheral surface of the insulating film 8 on the side of the other end portion of the substrate 2. The external connection electrodes 61B, 62B, and 63B may be formed with, for example, a Ni/Pd/Au laminated film having a Ni film in contact with the electrode films 61A, 62A, and 63A, a Pd film formed thereon, and an Au film formed thereon. The laminated film described above can be formed by a plating method.

The passivation film 16 and the resin film 17 coat, from the surface, the internal electrodes 103A and 103B, the coil 3, the insulating film 8, the first electrode film 61A, the second electrode film 62A, and the third electrode film 63A in the capacitor formation region 204 and the coil formation region 205, and function as a protective film to protect them. On the other hand, the passivation film 9 formed on the side surfaces 2*c* of the substrate 2 and the outer peripheral surface of the insulating film 8 functions as a protective film to protect the side surfaces 2*c* of the substrate 2 and the outer peripheral surface of the insulating film 8.

FIG. 170 is an electrical circuit diagram showing an electrical structure within the LC composite element chip. A plurality of capacitor elements C1 to C7 are connected in parallel between the first electrode 61 and the second electrode 62. The coil 3 (represented by a symbol L in FIG. 170) is connected between the second electrode 62 and the third electrode 63. In this way, the LC composite element chip functions as an LC composite element including a capacitor having a predetermined capacitance and an inductor having a predetermined inductance.

In the LC composite element chip disclosed in Japanese Patent Application Publication No. 2013-168633, in order to increase the capacitance, it is necessary to increase the area of a facing surface of the lower electrode and the upper electrode. Hence, the area of the surface of a substrate needs to be increased, with the result that it is difficult to reduce its size.

In the arrangement of the first preferred embodiment of the sixth invention, in the capacitor formation region E1 in the substrate 2, the first internal electrode formation trench 111A and the second internal electrode formation trench 111B are formed by digging down from the element formation surface 2*a* to a predetermined depth. The first internal electrode formation trench 111A and the second internal electrode formation trench 111B extend parallel to each other in the longitudinal direction of the substrate 2. The conductive member 51 is embedded within the first internal electrode formation trench 111A and the second internal electrode formation trench 111B, and thus the first internal electrode 103A is formed within the first internal electrode formation trench 111A, and the second internal electrode 103B is formed within the second internal electrode formation trench 111B. The capacitor element is formed with the first internal electrode 103A, the second internal electrode 103B, and the wall therebetween in the substrate 2.

In the arrangement of the first preferred embodiment of the sixth invention, the first internal electrode 103A and the second internal electrode 103B can be made to face each other in a direction perpendicular to the direction of the thickness of the substrate 2. Hence, it is possible to increase the area of the facing surface of the first internal electrode 103A and the second internal electrode 103B without increasing the area of the surface of the substrate 2 (the area of the capacitor formation region E1). In this way, it is possible to increase the capacitance of the capacitor.

In the arrangement of the first preferred embodiment of the sixth invention, a plurality of first internal electrode formation trenches 111A and a plurality of second internal electrode formation trenches 111B are formed in the substrate 2. The plurality of first internal electrode formation trenches 111A and the plurality of second internal electrode formation trenches 111B are disposed so as to be alternately aligned. Hence, a plurality of first internal electrodes 103A and a plurality of second internal electrodes 103B can be disposed so as to be alternately aligned. In this way, it is possible to form a plurality of capacitor elements C1 to C7 within the substrate 2, with the result that it is possible to further increase the capacitance of the capacitor.

As a parameter indicating the performance (quality) of the coil, the Q (Quality Factor) value of the coil is present. As the Q value is increased, its loss is decreased, and an excellent characteristic is provided as a high-frequency inductance.

The Q value of the coil 3 is represented by the formula (11) below.

$$Q=2\pi fL/R \tag{11}$$

In the formula (11) above, f represents the frequency of a current flowing through the coil, L represents the inductance of the coil 3 and R represents the internal resistance of the coil 3.

In the arrangement of the first preferred embodiment of the sixth invention, in the inductor formation region E2, in the substrate 2, the coil formation trench 11 is formed by digging down from the element formation surface 2*a*. The conductive member 51 is embedded within the coil formation trench 11 and thus the coil 3 is formed. Hence, it is possible to increase the cross-sectional area of the coil 3 (the cross-sectional area of the coil 3 perpendicular to the direction in which the coil 3 is extended in the spiral direction), and thus it is possible to decrease the internal resistance (R in the formula (11) above) of the coil 3. In this way, since the Q value of the coil 3 can be increased, it is possible to provide a high performance inductor.

In the first preferred embodiment of the sixth invention, the first internal electrode formation trench 111A, the second internal electrode formation trench 111B, and the coil formation trench 11 are formed in the substrate 2, and the conductive member 51 is embedded within these trenches 111A, 111B, and 11, with the result that it is possible to form the first internal electrode 103A, the second internal electrode 103B, and the coil 3. In this way, since the capacitor and the inductor can be manufactured in the same manufacturing step, it is possible to provide an LC composite element chip that is easily manufactured.

Furthermore, on the element formation surface 2*a*, which is one surface of the substrate 2, the external connection electrodes 61B, 62B, and 63B of the first electrode 61, the second electrode 62 and the third electrode 63 are formed. Hence, as shown in FIG. 171, the element formation surface 2*a* is made to face a mounting substrate 91, the external connection electrodes 61B, 62B, and 63B are bonded on the mounting substrate 91 by a solder 92 and thus it is possible to form a circuit assembly in which the LC composite element chip 1 is surface-mounted on the mounting substrate 91. In other words, it is possible to provide a flip-chip connection-type LC composite element chip 1, and it is possible to connect the LC composite element chip 1 to the mounting substrate 91 by a face-down bonding in which the element formation surface 2*a* is made to face the mounting substrate 91 and wireless bonding. In this way, it is possible to decrease the occupied space of the LC composite element chip 1 on the mounting substrate 91. In particular, it is possible to realize a low profile LC composite element chip 1 on the mounting substrate 91. In this way, it is possible to effectively utilize the space within the housing of a small-sized electronic device or the like and to contribute to high-density mounting and miniaturization.

FIGS. 172A to 172L are cross-sectional views for illustrating an example of the manufacturing step of the LC composite element chip, and show a cut surface corresponding to FIG. 163A. FIGS. 173A to 173L are cross-sectional views for illustrating an example of the manufacturing step of the LC composite element chip, and show a cut surface corresponding to FIG. 164A. FIGS. 174A to 174E are partially enlarged cross-sectional views showing the details of the manufacturing step of the first internal electrode and the second internal electrode, and show a cut surface corresponding to FIG. 164B.

As shown in FIGS. 172A, 173A, and 174A, an original substrate 50 that is an original of the substrate main body 6 is prepared. On the surface of the original substrate 50, the insulating film 7 such as a thermal oxide film or a CVD oxide film is formed. In the preferred embodiment, the insulating film 7 is a thermal oxide film. The surface of the insulating film 7 corresponds to the element formation surface 2*a* of the substrate 2.

FIG. 175 is a schematic plan view of part of the original substrate 50 in which the insulating film 7 is formed on the surface. As shown in FIG. 175, in the element formation surface 2*a*, LC composite element chip regions X corresponding to a plurality of LC composite element chips 1 are disposed in a matrix. Between the LC composite element chip regions X adjacent to each other, a boundary region Y is provided. The boundary region Y is a region in the shape of a band having a substantially constant width, extends in two directions perpendicular to each other and is formed in a lattice shape. After necessary steps are performed on the original substrate 50 in which the insulating film 7 is formed on the surface, the original substrate 50 is separated along the boundary region Y, and thus it is possible to obtain a plurality of LC composite element chips 1.

The steps performed on the original substrate 50 in which the insulating film 7 is formed on the surface are as follows. First, as shown in FIGS. 172A and 173A, by photolithography and etching, parts of the insulating film 7 that correspond to a region in which the first and second internal electrode formation trenches 111A and 111B need to be formed and a region in which the coil formation trench 11 needs to be formed are removed. In this way, in the insulating film 7, the first trench parts 111Aa and 111Ba of the first and second internal electrode formation trenches 111A and 111B and the first trench part 11*a* of the coil formation trench 11 are formed.

Then, a hard mask formed with the insulating film 7 is used, and thus the original substrate 50 is etched. In this way, as shown in FIGS. 172B, 173B, and 174A, the second trench parts 111Ab and 111Bb of the first and second internal electrode formation trenches 111A and 111B and the second trench part 11*b* of the coil formation trench 11 are formed in the original substrate 50. In this way, in the insulating film 7 and the original substrate 50, the first and second internal electrode formation trenches 111A and 111B and the coil formation trench 11 are formed. The trenches 11, 111A, and 111B may be formed with, for example, a so-called BOSCH process. The BOSCH process is a process that is generally used to make a hollow part in a MEMS (Micro Electro Mechanical System).

Then, on the inner surface of the trenches 11, 111A and 111B, the insulating film (thermal oxide film) 12 is formed by a thermal oxidization method. FIG. 174B shows a state where the insulating film (thermal oxide film) 12 is formed on the inner surface of the internal electrode formation trenches 111A and 111B. On the inner surface of the coil formation trench 11, as in FIG. 174B, the insulating film 12 (see FIG. 163B) is also formed. Here, the surrounding wall (the side wall and the bottom wall) of the internal electrode formation trenches 111A and 111B (the second trench parts 111Ab and 111Bb) in the original substrate 50 is thermally oxidized into an insulator portion (thermal oxide film) 30 having insulation. In FIGS. 172B and 173B, the insulating film 12 is omitted but the insulator portion 30 is shown. In the preferred embodiment, in the original substrate 50, the entire wall sandwiched by the first internal electrode formation trench 111A (the second trench part 111Ab) and the second internal electrode formation trench 111B (the second trench part 111Bb) adjacent to each other is formed into the thermal oxide film. In the preferred embodiment, the entire wall sandwiched by the coil formation trenches 11 (the second trench part 11*b*) in the shape of a spiral in the original substrate 50 is formed into the thermal oxide film.

Then, for example, by a sputtering method, the barrier metal film 13 made of TiN is formed on the element formation surface 2*a* including the interiors of the trenches 11, 111A, and 111B. In this way, as shown in FIG. 174C, the barrier metal film 13 made of TiN is formed on the surfaces of the insulating film 12 and the insulating film 7 within the internal electrode formation trenches 111A and 111B and the surface of the insulating film 7 outside the internal electrode formation trenches 111A and 111B. In this way, the barrier metal film 13 is formed on the surfaces of the insulating film 12 and the insulating film 7 within the coil formation trench 11 and the surface of the insulating film 7 outside the coil formation trench 11. Thereafter, annealing processing is performed. Thereafter, as shown in FIGS. 172C, 173C, and 174D, for example, by a CVD method, on the element formation surface 2*a* including the interiors of the trenches 11, 111A, and 111B, the conductive member 51 formed of tungsten (W) is deposited.

Then, for example, by an etch back method, overall etching is performed on the conductive member 51 from its surface. The overall etching is continued until the surface of the conductive member 51 is flush with the surface of the insulating film 7. In this way, as shown in FIGS. 172D, 173D and 174E, the conductive member 51 is embedded within the trenches 11, 111A and 111B while in contact with the barrier metal film 13. By the conductive member 51 embedded within the first internal electrode formation trench 111A, the first internal electrode 103A is formed. By the conductive member 51 embedded within the second internal electrode formation trench 111B, the second internal electrode 103B is formed. By the conductive member 51 embedded within the coil formation trench 11, the coil 3 in plan view in the shape of a spiral is formed.

Then, as shown in FIGS. 172E and 173E, on the insulating film 7, the insulating film 8 formed with a USG (Undoped Silicate Glass) film or the like is formed so as to coat the insulating film 7 (the element formation surface 2*a*) and the conductive member 51 (the coil 3 and the internal electrodes 103A and 103B). The insulating film 8 is formed by, for example, a CVD method. Thereafter, by photolithography and etching, in regions of the insulating film 8 corresponding to an end portion of the first internal electrode 103A on the side of one end portion of the substrate 2, an end portion of the second internal electrode 103B on the side of the other end portion of the substrate 2, one end portion (the outer peripheral side end portion) of the coil 3, and the other end portion (the inner peripheral side end portion) of the coil 3, the first contact hole 114 (see FIGS. 172E and 173E), the second contact hole 115 (see FIG. 165), the third contact hole 14 (see FIG. 167) and the fourth contact hole 15 (see FIG. 172E) penetrating the insulating film 8 are respectively formed.

Then, for example, by sputtering, on the insulating film 8 including the interiors of the contact holes 114, 115, 14, and 15, an electrode film forming the first electrode film 61A, the second electrode film 62A, and the third electrode film 63A is formed. In the preferred embodiment, the electrode film made of Al is formed. Thereafter, by photolithography and etching, the electrode film is patterned, and thus as shown in FIGS. 172F and 173F, the electrode film is separated into the first electrode film 61A, the second electrode film 62A, and the third electrode film 63A.

Then, as shown in FIGS. 172G and 173G, for example, by a CVD method, the passivation film 16 such as a nitride film is formed, and furthermore, polyimide is applied to form the resin film 17. For example, polyimide to which photosensitivity is added is applied, and the polyimide is developed after exposure with a pattern corresponding to the cutout portions 211, 212, and 213. In this way, the resin film 17 having a cutout portion corresponding to the cutout portions 211, 212, and 213 is formed. Thereafter, as necessary, heat treatment for curing the resin film is performed. Then, by dry etching using the resin film 17 as a mask, the cutout portions 211, 212, and 213 are formed in the passivation film 16.

Then, as shown in FIGS. 172H and 173H, a resist mask 52 having an opening 52*a* in a lattice shape matching with the boundary region Y (see FIG. 175) is formed. Plasma etching is performed via the resist mask 52, and thus the original substrate 50, the insulating film 7, and the insulating film 8 are etched from the surface of the insulating film 8 to a predetermined depth. In this way, along the boundary region Y, a groove (scribe groove) 53 for cutting is formed.

Then, the resist mask 52 is peeled off. Thereafter, as shown in FIGS. 172I and 173I, for example, by a CVD method, an insulating film 54 formed of a nitride film or the like serving as the material of the passivation film 9 is formed over the entire region of the surface of the original substrate 50. Here, the insulating film 54 is also formed over the entire region of the inner surface (the side wall surface and the bottom wall surface) of the groove 53.

Then, as shown in FIGS. 172I and 173I, the insulating film 54 is selectively etched. Specifically, a part of the insulating film 54 other than the insulating film 54 on the side wall surface of the groove 53 (the passivation film 9) is removed. In this way, a part of the electrode films 61A, 62A, and 63A that is not covered by the passivation film 16 and the resin film 17 is exposed. The insulating film 54 on the bottom surface of the groove 53 is removed.

Then, as shown in FIGS. 172K and 173K, on the first electrode film 61A, the second electrode film 62A, and the third electrode film 63A exposed from the cutout portions 211, 212, and 213, for example, by plating (preferably, electroless plating), plating growth is performed in the following order: for example, Ni, Pd, and Au. In this way, the first external connection electrode film 61B, the second external connection electrode film 62B and the third external connection electrode film 63B are formed.

Thereafter, by a DBG (Dicing Before Grinding) method, a plurality of LC composite element chip regions X are divided into pieces. Specifically, as shown in FIGS. 172L and 173L, first, on the side of the surface of the original substrate 50 (the side of the external connection electrode), a supporting tape 71 having an adhesive surface 72 is adhered. Then, the original substrate 50 is polished from the rear surface to the bottom surface of the groove 53. In this way, the plurality of LC composite element chip regions X are separated into individual LC composite element chips 1. Thereafter, on a plurality of LC composite element chips, the recovery step shown in FIGS. 45A to 45D or the recovery step shown in FIGS. 46A to 46C described in the first preferred embodiment of the second invention may be performed.

FIG. 176A is a diagram showing a modification example of the conductive member embedded within the coil formation trench 11, and is a partially enlarged cross-sectional view corresponding to FIG. 163B. FIG. 176B is a partially enlarged cross-sectional view of FIG. 176A.

As shown in FIG. 176A, the width W2 of the coil formation trench 11 may be, for example, 10 μm or less, and more specifically, may be 3 μm or more and 9 μm or less. The depth D of the coil formation trench 11 may be, for example, 10 μm or more, and more specifically, may be 30 μm or more and 80 μm or less.

In the modification example, as shown in FIGS. 176A and 176B, within the coil formation trench 11, as in the same arrangement as the modification example of the conductive member 51 in the first preferred embodiment of the second invention described previously, the conductive member 51 is embedded (also see FIGS. 48A and 48B).

FIG. 177A is a diagram showing a modification example of a conductive member embedded within each of the internal electrode formation trenches 111A and 111B, and is a partially enlarged cross-sectional view corresponding to FIG. 164B. FIG. 177B is a partially enlarged cross-sectional view of FIG. 177A.

As shown in FIG. 177A, the width W2 of each of the internal electrode formation trenches 111A and 111B may be, for example, 10 μm or less, and more specifically, may be 3 μm or more and 9 μm or less. The depth D of each of the internal electrode formation trenches 111A and 111B may be, for example, 10 μm or more, and more specifically, may be 30 μm or more and 80 μm or less.

In the modification example, as shown in FIGS. 177A and 177B, within each of the internal electrode formation trenches 111A and 111B, as in the same arrangement as the modification example of the conductive member 51 in the first preferred embodiment of the second invention described previously, the conductive member 51 is embedded (also see FIGS. 48A and 48B). Since the internal electrode formation trenches 111A and 111B have the same arrangement, in FIG. 177B, symbols in the arrangement on the side of the second internal electrode formation trench 111B corresponding to the arrangement on the side of the first internal electrode formation trench 111A are parenthesized.

FIG. 178 is a partially cut perspective view of an LC composite element chip according to a second preferred embodiment of the sixth invention.

The LC composite element chip 1A is a minute chip part and is formed in the shape of a rectangular parallelepiped. The planar shape of the LC composite element chip 1A may be rectangular, the length L of one of adjacent two sides may be about 0.4 mm, and the length W of the other side may be about 0.4 mm. The thickness T of the entire LC composite element chip 1A may be about 0.15 mm.

The LC composite element chip 1A includes a substrate 2, a plurality of capacitor elements C1 to C7 (see FIG. 186) that are formed on the substrate 2, a coil 3 that is formed within the substrate 2, a first electrode (first external electrode) 61 that is connected together to one electrode of each of the capacitor elements C1 to C7 and is also connected to one end portion of the coil 3, a second electrode (second external electrode) 62 that is connected together to the other electrode of each of the capacitor elements C1 to C7, and a third electrode (third external electrode) 63 that is connected to the other end portion of the coil 3.

FIG. 179 is a plan view of the LC composite element chip. FIG. 180 is a cross-sectional view taken along line CLXXX-CLXXX in FIG. 179. FIG. 181A is a cross-sectional view taken along line CLXXXIA-CLXXXIA in FIG. 179, and FIG. 181B is a partially enlarged cross-sectional view of FIG. 181A. FIG. 182A is a cross-sectional view taken along line CLXXXIIA-CLXXXIIA in FIG. 179, and FIG. 182B is a partially enlarged cross-sectional view of FIG. 182A. FIG. 183 is a cross-sectional view taken along line CLXXXIII-CLXXXIII in FIG. 179, FIG. 184 is a cross-sectional view taken along line CLXXXIV-CLXXXIV in FIG. 179 and FIG. 185 is a cross-sectional view taken along line CLXXXV-CLXXXV in FIG. 179. FIG. 186 is a plan view showing an arrangement of the surface of a substrate by removing a structure formed on the surface of the substrate.

In the following description, the "front" refers to the lower side of the plane of FIG. 179, the "back" refers to the upper side of the plane of FIG. 179, the "left" refers to the left side of the plane of FIG. 179 and the "right" refers to the right side of the plane of FIG. 179.

The substrate 2 is formed in the shape of a rectangular parallelepiped, and includes a pair of main surfaces 2*a* and 2*b* and four side surfaces 2*c*. One (the main surface 2*a* on the upper surface side in FIG. 178) of the pair of main surfaces 2*a* and 2*b* is an element formation surface. In the following description, the main surface 2*a* is referred to as an "element formation surface 2*a*," and the main surface 2*b* on the side opposite to the element formation surface 2*a* is referred to as a "rear surface 2*b*." In the preferred embodiment, the substrate 2 is formed with a substrate main body 6 and an insulating film 7 formed on the surface thereof, and the surface of the insulating film 7 on the side opposite to the side of the substrate main body 6 is the element formation surface 2*a*. The element formation surface 2*a* is formed in the shape of a rectangle in plan view when seen in a normal direction perpendicular to the element formation surface 2*a*. The surface (element formation surface 2*a*) of the substrate 2 is covered by an insulating film 8. The four side surfaces 2*c* of the substrate 2 and the outer peripheral surface of the insulating film 8 are covered by a passivation film 9 such as a nitride film.

With reference to FIGS. 179 and 186, in the element formation surface 2*a*, in the front half portion thereof, a capacitor formation region E1 for the formation of a capacitor is provided, and in the back half portion thereof, an inductor formation region E2 for the formation of an inductor is provided. These regions E1 and E2 are formed, in plan view, in the shape of a rectangle which is long in a left/right direction. In the left side portion (the region including the left end portion of the capacitor formation region E1 and the left end portion of the inductor formation region E2) of the element formation surface 2*a*, the first electrode formation region 201 is provided, in the right end portion of the capacitor formation region E1, the second electrode formation region 202 is formed and in the right end portion of the inductor formation region E2, the third electrode formation region 203 is provided. These electrode formation regions 201, 202, and 203 are formed, in plan view, in the shape of a rectangle.

In the first electrode formation region 201, the external connection electrode (the first external connection electrode) 61B of a first electrode 61 is disposed, in the second electrode formation region 202, the external connection electrode (the second external connection electrode) 62B of a second electrode 62 is disposed and in the third electrode formation region 203, the external connection electrode (the second external connection electrode) 63B of a third electrode 63 is disposed. The first external connection electrode 61B is formed, in plan view, in the shape of a rectangle, and covers the entire region of the first electrode formation region 201. The second external connection electrode 62B is formed, in plan view, in the shape of a rectangle, and covers a region of the second electrode formation region 202 other than an edge portion on the side of the third electrode formation region 203. The third external connection electrode 63B is formed, in plan view, in the shape of a rectangle, and covers a region of the third electrode formation region 203 other than an edge portion on the side of the second electrode formation region 202.

On the element formation surface 2*a* between the first external connection electrode 61B and the second external connection electrode 62B in the capacitor formation region E1, a capacitor formation region 204 for the formation of the main parts of the capacitor elements C1 to C7 is provided. On the element formation surface 2*a* between the first external connection electrode 61B and the third external connection electrode 63B in the inductor formation region E2, a coil formation region 205 for the formation of the coil 3 is provided. In the preferred embodiment, the capacitor formation region 204 and the coil formation region 205 are formed in the shape of a rectangle.

With reference to FIGS. 179, 180, 182A, 182B, and 183 to 186, in the capacitor formation region E1, in the substrate 2, a plurality of first internal electrode formation trenches 111A and a plurality of second internal electrode formation trenches 111B are formed by digging down from the element formation surface 2*a* to a predetermined depth. The internal electrode formation trenches 111A and 111B extend along the longitudinal direction (the left/right direction) of the capacitor formation region E1. The internal electrode formation trenches 111A and 111B extend at a fixed interval from and parallel to each other in the lateral direction (the frontward/backward direction) of the capacitor formation region E1. Hence, the plurality of internal electrode formation trenches 111A and 111B are formed, in plan view, in the shape of a stripe. In the preferred embodiment, the internal electrode formation trenches 111A and 111B extend from the interior of the first electrode formation region 201 through the capacitor formation region 204 to the interior of the second electrode formation region 202. Hence, in plan view, one end portions of the internal electrode formation trenches 111A and 111B are within the first electrode formation region 201, and the other end portions thereof are within the second electrode formation region 202.

The cross section of each of the internal electrode formation trenches 111A and 111B is formed in the shape of a rectangle which is long in the direction of the thickness of the substrate 2. A plurality of first internal electrode formation trenches 111A and second internal electrode formation trenches 111B are disposed such that the first internal electrode formation trenches 111A and the second internal electrode formation trenched 111B are alternately aligned in the lateral direction of the capacitor formation region E1. For example, the width of each of the internal electrode formation trenches 111A and 111B may be 1 μm or more and 3 μm or less. For example, the depth of each of the internal electrode formation trenches 111A and 111B may be 10 μm or more and 82 μm or less.

As shown in FIG. 182B, the internal electrode formation trenches 111A and 111B are formed with first trench parts 111Aa and 111Ba that are formed in the insulating film 7 and second trench parts 111Ab and 111Bb that are formed in the substrate main body 6 and that communicate with the first trench parts 111Ab and 111Bb. On the inner surface of the internal electrode formation trenches 111A and 111B (the second trench parts 111Ab and 111Bb) in the substrate main body 6, an insulating film 12 formed with an oxide film or the like is formed. In the preferred embodiment, the insulating film 12 is formed with a thermal oxide film ($SiO_2$), and when the thermal oxide film is formed on the inner surface of the internal electrode formation trenches 111A and 111B, the surrounding wall (the side wall and the bottom wall) of the internal electrode formation trenches 111A and 111B (the second trench parts 111Ab and 111Bb) in the substrate main body 6 is thermally oxidized into an insulator portion (thermal oxide film) 30 having insulation. In the preferred embodiment, an example is described where in the substrate main body 6, the entire wall between the first internal electrode formation trench 111A (the second trench part 111Ab) and the second internal electrode formation trench 111B (the second trench part 111Bb) is formed into a thermal oxide film.

On the surface of the insulating film 12 within the internal electrode formation trenches 111A and 111B (the second trench parts 111Ab and 111Bb) and on the inner surface of the internal electrode formation trenches 111A and 111B (the first trench parts 111Aa and 111Ba) in the insulating film 7, a barrier metal film 13 is formed. The barrier metal film 13 is formed of, for example, TiN. The thickness of the barrier metal film 13 is about 400 to 500 angstroms. Within each of the internal electrode formation trenches 111A and 111B, a conductive member 51 is embedded while being in contact with the barrier metal film 13. In the preferred embodiment, the conductive member 51 is formed of tungsten (W).

The first internal electrode 103A is formed with the conductive member 51 embedded within the first internal electrode formation trench 111A, and the second internal electrode 103B is formed with the conductive member 51 embedded within the second internal electrode formation trench 111B. In this way, a plurality of first internal electrodes 103A and second internal electrodes 103B are formed within the substrate 2. These internal electrodes 103A and 103B are formed in the shape of a rectangle which is long in the left/right direction of the substrate 2 when seen in the frontward/backward direction of the substrate 2. In other words, the internal electrodes 103A and 103B are formed in the shape of a flat plate having a surface parallel to the two side surfaces 2*c* opposite each other in the frontward/backward direction of the substrate 2.

In particular, with reference to FIG. 186, the plurality of first internal electrodes 103A and the second internal electrodes 103B are disposed so as to be alternately aligned in the lateral direction of the capacitor formation region E1. Hence, the first internal electrode 103A and the second internal electrode 103B adjacent to each other have facing surfaces opposite each other in the lateral direction of the capacitor formation region E1. The wall (the insulator portion 30) of the substrate 2 sandwiched by the facing surfaces of the first internal electrode 103A and the second internal electrode 103B adjacent to each other forms a capacitance film (dielectric film) 35. A pair of the first internal electrode 103A and the second internal electrode 103A adjacent to each other and the capacitance film 31 therebetween form one capacitor element. In the preferred embodiment, since four first internal electrodes 103A and four second internal electrodes 103B are provided, there are 7 pairs of the first internal electrodes 103A and the second internal electrodes 103B adjacent to each other. Hence, 7 capacitor elements C1 to C7 are formed on the substrate 2. One or more of the first internal electrodes 103A and one or more of the second internal electrodes 103B are preferably provided.

With reference to FIGS. 179, 181A, 181B, 183, 184 and 186, in the coil formation region 205 within the inductor formation region E2, in the substrate 2, the coil formation trench 11 is formed by digging down from the element formation surface 2*a* to a predetermined depth. The coil formation trench 11 is formed, in plan view, in the shape of a spiral. In the preferred embodiment, the coil formation trench 11 is formed, in plan view, in the shape of a quadrilateral spiral, and has a plurality of rectilinear portions parallel to the side surfaces 2*c* of the substrate 2. The cross section (cross section in a direction perpendicular to a direction in which the coil formation trench 11 is extended in the spiral direction) of the coil formation trench 11 is formed in the shape of a rectangle which is long in the direction of the thickness of the substrate 2. For example, the width of the coil formation trench 11 may be 1 μm or more and 3 μm or less. For example, the depth of the coil formation trench 11 may be 10 μm or more and 82 μm or less. The depth of the coil formation trench 11 is preferably 10 μm or more so that the internal resistance of the coil 3 formed within the coil formation trench 11 is decreased.

As shown in FIG. 181B, the coil formation trench 11 is formed with a first trench part 11*a* that is formed in the insulating film 7 and a second trench part 11*b* that is formed in the substrate main body 6 and that communicates with the first trench part 11*a*. On the inner surface of the coil formation trench 11 (the second trench part 11*b*) in the substrate main body 6, an insulating film 12 formed with an oxide film or the like is formed. In the preferred embodiment, the insulating film 12 is formed with a thermal oxide film ($SiO_2$), and when the thermal oxide film is formed on the inner surface of the coil formation trench 11, the surrounding wall (the side wall and the bottom wall) of the coil formation trench 11 (the second trench part 11*b*) in the substrate main body 6 is thermally oxidized into an insulator portion (thermal oxide film) 30 having insulation. In the preferred embodiment, an example is described where the entire wall sandwiched by the coil formation trenches 11 (the second trench part 11*b*) in the shape of a spiral in the substrate main body 6 is a thermal oxide film.

On the surface of the insulating film 12 within the coil formation trench 11 (the second trench part 11*b*) and on the inner surface of the coil formation trench 11 (the first trench part 11*a*) in the insulating film 7, a barrier metal film 13 is formed. The barrier metal film 13 is formed of, for example, TiN. The thickness of the barrier metal film 13 is about 400 to 500 angstroms. Within the coil formation trench 11, a conductive member 51 is embedded while being in contact with the barrier metal film 13. In the preferred embodiment, the conductive member 51 is formed of tungsten (W). The coil 3 is formed with the conductive member 51 embedded within the coil formation trench 11. Hence, the coil 3 is formed, in plan view, in the shape of a spiral (in the shape of a quadrilateral spiral) of the same pattern as the coil formation trench 11. Specifically, the coil 3 includes a plurality of plate-shaped parts parallel to the side surfaces 2*c* of the substrate 2.

On the element formation surface 2*a* (the surface of the insulating film 7) of the substrate 2, an insulating film 8 is formed so as to coat the element formation surface 2*a* and the conductive member 51 (the internal electrodes 103A and 103B and the coil 3). The insulating film 8 is formed, in plan view, in the shape of a rectangle matching with the element formation surface 2*a*. The insulating film 8 is formed with, for example, a USG (Undoped Silicate Glass) film. In the insulating film 8, on the side of one end portion (the side of the left end portion) of the capacitor formation region E1, a first contact hole 114 (see FIGS. 179, 180, 182A, and 182B) that exposes an end portion corresponding to the first internal electrode 103A is formed. In the insulating film 8, on the side of the other end portion (the side of the right end portion) of the capacitor formation region E1, a second contact hole 115 (see FIGS. 179 and 185) that exposes an end portion corresponding to the second internal electrode 103B is formed. In the insulating film 8, within the coil formation region 205, a third contact hole 14 (see FIGS. 179 and 183) that exposes an end portion (outer peripheral side end portion) of the coil 3 and a fourth contact hole 15 (see FIGS. 179 and 184) that exposes the other end portion (inner peripheral side end portion) of the coil 3 are formed. As described previously, in the side surfaces 2*c* of the substrate 2 and the outer peripheral surface of the insulating film 8, the passivation film 9 formed with a nitride film or the like is formed.

On the surface of the insulating film 8, the first electrode 61, the second electrode 62, and the third electrode 63 are formed. The first electrode 61 includes a first electrode film 61A that is formed on the surface of the insulating film 8 and a first external connection electrode 61B that is bonded to the first electrode film 61A. As shown in FIG. 179, the first electrode film 61A includes a drawing electrode 61Aa that is connected to one end portion (the outer peripheral side end portion) of the coil 3 and a first pad 61Ab that is formed integrally with the drawing electrode 61Aa. In the left side portion of the element formation surface 2*a*, the first pad 61Ab is formed to straddle the capacitor formation region E1 and the inductor formation region E2. The first pad 61Ab is formed, in plan view, in the shape of a rectangle which is long in the frontward/backward direction.

The side edge portion of the first pad 61Ab on the side of the second and third electrodes 62 and 63 protrudes, in plan view, to the side of the second and third electrodes 62 and 63 as compared with the side edge of the first electrode formation region 201 on the side of the second and third electrodes 62 and 63. The first external connection electrode 61B is connected to the first pad 61Ab. As shown in FIGS. 179, 180, 182A, and 182B, the first pad 61Ab enters the first contact hole 114 from the surface of the insulating film 8, and is connected to the end portion (the end portion on the side of the first electrode 61) of the first internal electrode 103A within the first contact hole 114.

As shown in FIGS. 179 and 183, the drawing electrode 61Aa enters the third contact hole 14 from the surface of the insulating film 8, and is connected to one end portion of the coil 3 within the third contact hole 14. The drawing electrode 61Aa is formed straight along a straight line that passes above one end portion of the coil 3 to reach the first pad 61Ab. By extending one end portion of the coil formation trench 11 to a position below the first pad 61Ab, one end portion of the coil 3 may be disposed in a position below the first pad 61Ab. In this way, since the third contact hole 14 can be formed in a position below the first pad 61Ab, one end portion of the coil 3 can be connected to the first pad 61Ab. In this case, since the first electrode film 61A can be formed with only the first pad 61Ab, the drawing electrode 61Aa is not needed.

The second electrode 62 includes a second electrode film (second pad) 62A that is formed on the surface of the insulating film 8 and a second external connection electrode 62B that is bonded to the second electrode film 62A. As shown in FIG. 179, the second electrode film 62A is formed in the shape of a rectangle at the right end portion of the capacitor formation region E1. In plan view, the side edge portion of the second electrode film 62A on the side of the first electrode 61 protrudes to the side of the first electrode 61 as compared with the side edge of the second electrode formation region 202 on the side of the first electrode 61. The second external connection electrode 62B is connected to the second electrode film 62A. As shown in FIGS. 179 and 185, the second electrode film 62A enters the second contact hole 115 from the surface of the insulating film 8, and is connected to an end portion (an end portion on the side of the second electrode 62) of the second internal electrode 103B within the second contact hole 115.

The third electrode 63 includes a third electrode film 63A that is formed on the surface of the insulating film and a third external connection electrode 63B that is bonded to the third electrode film 63A. As shown in FIG. 179, the third electrode film 63A includes a drawing electrode 63Aa that is connected to the other end portion (the inner peripheral side end portion) of the coil 3 and a third pad 63Ab that is formed integrally with the drawing electrode 63Aa. The third pad 63Ab is formed in the shape of a rectangle at the right end portion of the inductor formation region E2. In plan view, the side edge portion of the third pad 63Ab on the side of the first electrode 61 protrudes to the side of the first electrode 61 as compared with the side edge of the third electrode formation region 203 on the side of the first electrode 61. The third external connection electrode 63B is connected to the third pad 63Ab. As shown in FIGS. 179 and 184, the drawing electrode 63Aa enters the fourth contact hole 15 from the surface of the insulating film 8, and is connected to the other end portion of the coil 3 within the fourth contact hole 15. The drawing electrode 63Aa is formed straight along a straight line that passes above the other end portion of the coil 3 to reach the third pad 63Ab. In the preferred embodiment, as the electrode films 61A, 62A, and 63A, an Al film is used.

The first electrode film 61A, the second electrode film 62A, and the third electrode film 63A are covered by a passivation film 16 formed with a nitride film (SiN), and furthermore, on the passivation film 16, a resin film 17 such as polyimide is formed. In the passivation film 16 and the resin film 17, in plan view, in the vicinity of the first pad 6 lAb, in the vicinity of the second electrode film (the second pad) 62A, and in the third pad 63Ab, the first, second, and third cutout portions 211, 212, and 213 (see FIGS. 180, 181A, and 185) are respectively formed.

A region of the surface of the first pad 61Ab other than an edge portion on the side of the second and third electrodes 62 and 63 is exposed by the first cutout portion 211. A region of the surface of the second electrode film (second pad) 62A other than an edge portion on the side of the first electrode 61 is exposed by the second cutout portion 212. A region of the surface of the third pad 63Ab other than an edge portion on the side of the first electrode 61 is exposed by the third cutout portion 213. In other words, the passivation film 16 and the resin film 17 are formed, in plan view, not only in the capacitor formation region 204 and the coil formation region 205 of the element formation surface 2*a* but also in the boundary portion region between the capacitor formation region E1 and the inductor formation region E2, between the second electrode film 62A and the third pad 63Ab.

The first external connection electrode 61B fills the first cutout portion 211. The second external connection electrode 62B fills the second cutout portion 212. The third external connection electrode 63B fills the third cutout portion 213. The first external connection electrode 61B is formed so as to protrude from the resin film 17, and includes a drawing portion 20 that is drawn out along the surface of the resin film 17 to the side of the second and third electrodes 62 and 63. The second external connection electrode 62B is formed so as to protrude from the resin film 17, and includes a drawing portion 20 that is drawn out along the surface of the resin film 17 to the side of the first electrode 61. The third external connection electrode 63B is formed so as to protrude from the resin film 17, and includes a drawing portion 20 that is drawn out along the surface of the resin film 17 to the side of the first electrode 61.

In the second preferred embodiment of the sixth invention, the first external connection electrode 61B is formed so as to cover not only the surface of the first electrode film 61A (pad 61Ab) and the insulating film 8 exposed within the first cutout portion 211 but also the upper end surface of the passivation film 9 on the side of the left end portion of the substrate 2. The three side surfaces other than the side surface on the inner side of the first external connection electrode 61B are formed so as to be flush with the surface of the passivation film 9 covering the peripheral surface of the insulating film 8 on the side of the left end portion of the substrate 2.

The second external connection electrode 62B is formed so as to cover not only the surface of the second electrode film 62A and the insulating film 8 exposed within the second cutout portion 212 but also the upper end surface of the passivation film 9 on the right end side of the capacitor formation region E1. The two side surfaces other than the side surface opposite the first electrode 61 and the side surface opposite the third electrode 63 in the second external connection electrode 62B are formed so as to be flush with the surface of the passivation film 9 covering the peripheral surface of the insulating film 8 on the right end side of the capacitor formation region E1.

The third external connection electrode 63B is formed so as to cover not only the surface of the third electrode film 63A (pad 63Ab) and the insulating film 8 exposed within the third cutout portion 213 but also the upper end surface of the passivation film 9 on the side of the right end portion of the inductor formation region E2. The two side surfaces other than the side surface opposite the first electrode and the side surface opposite the second electrode 62 in the third external connection electrode 63B are formed so as to be flush with the surface of the passivation film 9 covering the peripheral surface of the insulating film 8 on the right end side of the inductor formation region E2. The external connection electrodes 61B, 62B, and 63B may be formed with a Ni/Pd/Au laminated film having a Ni in contact with the electrode films 61A, 62A, and 63A, a Pd film formed thereon, and an Au film formed thereon. The laminated film described above can be formed by a plating method.

The passivation film 16 and the resin film 17 coat, from the surface, the internal electrodes 103A and 103B, the coil 3, the insulating film 8, the first electrode film 61A, the second electrode film 62A, and the third electrode film 63A in the capacitor formation region 204, the coil formation region 205, and the region between the second external connection electrode 62B and the third external connection electrode 63B, and function as a protective film to protect them. On the other hand, the passivation film 9 formed on the side surfaces 2*c* of the substrate 2 and the outer peripheral surface of the insulating film 8 functions as a protective film to protect the side surfaces 2*c* of the substrate 2 and the outer peripheral surface of the insulating film 8.

FIG. 187 is an electrical circuit diagram showing an electrical structure within the LC composite element chip. A plurality of capacitor elements C1 to C7 are connected in parallel between the first electrode 61 and the second electrode 62. The coil 3 (represented by a symbol L in FIG. 187) is connected between the first electrode 61 and the third electrode 63. In this way, the LC composite element chip functions as an LC composite element including a capacitor having a predetermined capacitance and an inductor having a predetermined inductance.

In the LC composite element chip disclosed in Japanese Patent Application Publication No. 2013-168633, in order to increase the capacitance, it is necessary to increase the area of a facing surface of the lower electrode and the upper electrode. Hence, the area of the surface of a substrate needs to be increased, with the result that it is difficult to reduce its size.

In the arrangement of the second preferred embodiment of the sixth invention, in the capacitor formation region E1 in the substrate 2, the first internal electrode formation trench 111A and the second internal electrode formation trench 111B are formed by digging down from the element formation surface 2*a* to a predetermined depth. The first internal electrode formation trench 111A and the second internal electrode formation trench 111B extend parallel to each other in the longitudinal direction of the capacitor formation region E1. The conductive member 51 is embedded within the first internal electrode formation trench 111A and the second internal electrode formation trench 111B, and thus the first internal electrode 103A is formed within the first internal electrode formation trench 111A, and the second internal electrode 103B is formed within the second internal electrode formation trench 111B. The capacitor element is formed with the first internal electrode 103A, the second internal electrode 103B, and the wall therebetween in the substrate 2.

In the arrangement of the second preferred embodiment of the sixth invention, the first internal electrode 103A and the second internal electrode 103B can be made to face each other in a direction perpendicular to the direction of the thickness of the substrate 2. Hence, it is possible to increase the area of the facing surface of the first internal electrode 103A and the second internal electrode 103B without increasing the area of the surface of the substrate 2 (the area of the capacitor formation region E1). In this way, it is possible to increase the capacitance of the capacitor.

In the arrangement of the second preferred embodiment of the sixth invention, a plurality of first internal electrode formation trenches 111A and a plurality of second internal electrode formation trenches 111B are formed in the substrate 2. The plurality of first internal electrode formation trenches 111A and the plurality of second internal electrode formation trenches 111B are disposed so as to be alternately aligned. Hence, a plurality of first internal electrodes 103A and a plurality of second internal electrodes 103B can be disposed so as to be alternately aligned. In this way, it is possible to form a plurality of capacitor elements C1 to C7 within the substrate 2, with the result that it is possible to further increase the capacitance of the capacitor.

As a parameter indicating the performance (quality) of the coil, the Q (Quality Factor) value of the coil is present. As the Q value is increased, its loss is decreased, and an excellent characteristic is provided as a high-frequency inductance.

The Q value of the coil 3 is represented by the formula (12) below.

$$Q=2\pi fL/R \tag{12}$$

In the formula (12) above, f represents the frequency of a current flowing through the coil, L represents the inductance of the coil 3 and R represents the internal resistance of the coil 3.

In the arrangement of the second preferred embodiment of the sixth invention, in the inductor formation region E2, in the substrate 2, the coil formation trench 11 is formed by digging down from the element formation surface 2*a*. The conductive member 51 is embedded within the coil formation trench 11 and thus the coil 3 is formed. Hence, it is possible to increase the cross-sectional area of the coil 3 (the cross-sectional area of the coil 3 perpendicular to the direction in which the coil 3 is extended in the spiral direction), and thus it is possible to decrease the internal resistance (R in the formula (12) above) of the coil 3. In this way, since the Q value of the coil 3 can be increased, it is possible to provide a high performance inductor.

In the second preferred embodiment of the sixth invention, the first internal electrode formation trench 111A, the second internal electrode formation trench 111B, and the coil formation trench 11 are formed in the substrate 2, and the conductive member 51 is embedded within these trenches 111A, 111B and 11, with the result that it is possible to form the first internal electrode 103A, the second internal electrode 103B and the coil 3. In this way, since the capacitor and the inductor can be manufactured in the same manufacturing step, it is possible to provide an LC composite element chip that is easily manufactured.

Furthermore, on the element formation surface 2*a*, which is one surface of the substrate 2, the external connection electrodes 61B, 62B, and 63B of the first electrode 61, the second electrode 62, and the third electrode 63 are formed.

Hence, as shown in FIG. 188, the element formation surface 2*a* is made to face a mounting substrate 91, the external connection electrodes 61B, 62B, and 63B are bonded on the mounting substrate 91 by a solder 92 and thus it is possible to form a circuit assembly in which the LC composite element chip 1A is surface-mounted on the mounting substrate 91. In other words, it is possible to provide a flip-chip connection-type LC composite element chip 1A, and it is possible to connect the LC composite element chip 1A to the mounting substrate 91 by a face-down bonding in which the element formation surface 2*a* is made to face the mounting substrate 91 and wireless bonding. In this way, it is possible to decrease the occupied space of the LC composite element chip 1A on the mounting substrate 91. In particular, it is possible to realize a low profile LC composite element chip 1A on the mounting substrate 91. In this way, it is possible to effectively utilize the space within the housing of a small-sized electronic device or the like and to contribute to high-density mounting and miniaturization.

FIGS. 189A to 189L are cross-sectional views for illustrating an example of the manufacturing step of the LC composite element chip, and show a cut surface corresponding to FIG. 180. FIGS. 190A to 190L are cross-sectional views for illustrating an example of the manufacturing step of the LC composite element chip, and show a cut surface corresponding to FIG. 181A. FIGS. 191A to 191L are cross-sectional views for illustrating an example of the manufacturing step of the LC composite element chip, and show a cut surface corresponding to FIG. 182A. FIGS. 192A to 192E are partially enlarged cross-sectional views showing the details of the manufacturing step of the first internal electrode and the second internal electrode, and show a cut surface corresponding to FIG. 182B.

As shown in FIGS. 189A, 190A, and 191A, an original substrate 50 that is an original of the substrate main body 6 is prepared. On the surface of the original substrate 50, the insulating film 7 such as a thermal oxide film or a CVD oxide film is formed. In the preferred embodiment, the insulating film 7 is a thermal oxide film. The surface of the insulating film 7 corresponds to the element formation surface 2*a* of the substrate 2.

FIG. 175 is a schematic plan view of part of the original substrate 50 in which the insulating film 7 is formed on the surface. As shown in FIG. 175, in the element formation surface 2*a*, LC composite element chip regions X corresponding to a plurality of LC composite element chips 1A are disposed in a matrix. Between the LC composite element chip regions X adjacent to each other, a boundary region Y is provided. The boundary region Y is a region in the shape of a band having a substantially constant width, extends in two directions perpendicular to each other and is formed in a lattice shape. After necessary steps are performed on the original substrate 50 in which the insulating film 7 is formed on the surface, the original substrate 50 is separated along the boundary region Y, and thus it is possible to obtain a plurality of LC composite element chips 1A.

The steps performed on the original substrate 50 in which the insulating film 7 is formed on the surface are as follows. First, as shown in FIGS. 189A, 190A, and 191A, by photolithography and etching, parts of the insulating film 7 that correspond to a region in which the first and second internal electrode formation trenches 111A and 111B need to be formed and a region in which the coil formation trench 11 needs to be formed are removed. In this way, in the insulating film 7, the first trench parts 111Aa and 111Ba of the first and second internal electrode formation trenches 111A and 111B and the first trench part 11*a* of the coil formation trench 11 are formed.

Then, a hard mask formed with the insulating film 7 is used, and thus the original substrate 50 is etched. In this way, as shown in FIGS. 189B, 190B, 191B, and 192A, the second trench parts 111Ab and 111Bb of the first and second internal electrode formation trenches 111A and 111B and the second trench part 11*b* of the coil formation trench 11 are formed in the original substrate 50. In this way, in the insulating film 7 and the original substrate 50, the first and second internal electrode formation trenches 111A and 111B and the coil formation trench 11 are formed. The trenches 11, 111A, and 111B may be formed by, for example, a so-called BOSCH process. The BOSCH process is a process that is generally used to make a hollow part in a MEMS (Micro Electro Mechanical System).

Then, on the inner surface of the trenches 11, 111A and 111B, the insulating film (thermal oxide film) 12 is formed by a thermal oxidization method. FIG. 192B shows a state where the insulating film (thermal oxide film) 12 is formed on the inner surface of the internal electrode formation trenches 111A and 111B. On the inner surface of the coil formation trench 11, as in FIG. 192B, the insulating film 12 (see FIG. 181B) is also formed. Here, the surrounding wall (the side wall and the bottom wall) of the internal electrode formation trenches 111A and 111B (the second trench parts 111Ab and 111Bb) in the original substrate 50 is thermally oxidized into an insulator portion (thermal oxide film) 30 having insulation. Likewise, the surrounding wall (the side wall and the bottom wall) of the coil formation trench 11 (the second trench part 11*b*) in the original substrate 50 is thermally oxidized into an insulator portion (thermal oxide film) 30 having insulation. In FIGS. 189B, 190B, and 191B, the insulating film 12 is omitted but the insulator portion 30 is shown. In the preferred embodiment, in the original substrate 50, the entire wall sandwiched by the first internal electrode formation trench 111A (the second trench part 111Ab) and the second internal electrode formation trench 111B (the second trench part 111Bb) adjacent to each other is formed into the thermal oxide film. In the preferred embodiment, the entire wall sandwiched by the coil formation trench 11 (the second trench part 11*b*) in the shape of a spiral in the original substrate 50 is formed into the thermal oxide film.

Then, for example, by a sputtering method, the barrier metal film 13 made of TiN is formed on the element formation surface 2*a* including the interiors of the trenches 11, 111A, and 111B. In this way, as shown in FIG. 192C, the barrier metal film 13 made of TiN is formed on the surfaces of the insulating film 12 and the insulating film 7 within the internal electrode formation trenches 111A and 111B and the surface of the insulating film 7 outside the internal electrode formation trenches 111A and 111B. In this way, the barrier metal film 13 is formed on the surfaces of the insulating film 12 and the insulating film 7 within the coil formation trench 11 and the surface of the insulating film 7 outside the coil formation trench 11. Thereafter, annealing processing is performed. Thereafter, as shown in FIGS. 189C, 190C, 191C, and 192D, for example, by a CVD method, on the element formation surface 2*a* including the interiors of the trenches 11, 111A, and 111B, the conductive member 51 formed of tungsten (W) is deposited.

Then, for example, by an etch back method, overall etching is performed on the conductive member 51 from its surface. The overall etching is continued until the surface of the conductive member 51 is flush with the surface of the insulating film 7. In this way, as shown in FIGS. 189D, 190D, 191D, and 192E, the conductive member 51 is embedded within the trenches 11, 111A, and 111B while in contact with the barrier metal film 13. By the conductive member 51 embedded within the first internal electrode formation trench 111A, the first internal electrode 103A is formed. By the conductive member 51 embedded within the second internal electrode formation trench 111B, the second internal electrode 103B is formed. By the conductive member 51 embedded within the coil formation trench 11, the coil 3 in plan view in the shape of a spiral is formed.

Then, as shown in FIGS. 189E, 190E, and 191E, on the insulating film 7, the insulating film 8 formed with a USG (Undoped Silicate Glass) film or the like is formed so as to coat the insulating film 7 (the element formation surface 2*a*) and the conductive member 51 (the coil 3 and the internal electrodes 103A and 103B). The insulating film 8 is formed by, for example, a CVD method. Thereafter, by photolithography and etching, in regions of the insulating film 8 corresponding to an end portion of the first internal electrode 103A on the side of one end portion of the substrate 2, an end portion of the second internal electrode 103B on the side of the other end portion of the substrate 2, one end portion (the outer peripheral side end portion) of the coil 3, and the other end portion (the inner peripheral side end portion) of the coil 3, the first contact hole 114 (see FIGS. 189E and 191E), the second contact hole 115 (see FIG. 185), the third contact hole 14 (see FIG. 183), and the fourth contact hole 15 (see FIG. 190E) penetrating the insulating film 8 are respectively formed.

Then, for example, by sputtering, on the insulating film 8 including the interiors of the contact holes 114, 115, 14, and 15, an electrode film forming the first electrode film 61A, the second electrode film 62A, and the third electrode film 63A is formed. In the preferred embodiment, the electrode film made of Al is formed. Thereafter, by photolithography and etching, the electrode film is patterned, and thus as shown in FIGS. 189F, 190F, and 191F, the electrode film is separated into the first electrode film 61A, the second electrode film 62A, and the third electrode film 63A.

Then, as shown in FIGS. 189G, 190G, and 191G, for example, by a CVD method, the passivation film 16 such as a nitride film is formed, and furthermore, polyimide is applied to form the resin film 17. For example, polyimide to which photosensitivity is added is applied, and the polyimide is developed after exposure with a pattern corresponding to the cutout portions 211, 212, and 213. In this way, the resin film 17 having a cutout portion corresponding to the cutout portions 211, 212, and 213 is formed. Thereafter, as necessary, heat treatment for curing the resin film is performed. Then, by dry etching using the resin film 17 as a mask, the cutout portions 211, 212, and 213 are formed in the passivation film 16.

Then, as shown in FIGS. 189H, 190H, and 191H, a resist mask 52 having an opening 52*a* in a lattice shape matching with the boundary region Y (see FIG. 175) is formed. Plasma etching is performed via the resist mask 52, and thus the original substrate 50, the insulating film 7, and the insulating film 8 are etched from the surface of the insulating film 8 to a predetermined depth. In this way, along the boundary region Y, a groove (scribe groove) 53 for cutting is formed.

Then, the resist mask 52 is peeled off. Thereafter, as shown in FIGS. 189I, 190I, and 191I, for example, by a CVD method, an insulating film 54 formed of a nitride film or the like serving as the material of the passivation film 9 is formed over the entire region of the surface of the original substrate 50. Here, the insulating film 54 is also formed over the entire region of the inner surface (the side wall surface and the bottom wall surface) of the groove 53.

Then, as shown in FIGS. 189J, 190J, and 191J, the insulating film 54 is selectively etched. Specifically, a part of the insulating film 54 other than the insulating film 54 on the side wall surface of the groove 53 (the passivation film 9) is removed. In this way, a part of the electrode films 61A, 62A, and 63A that is not covered by the passivation film 16 and the resin film 17 is exposed. The insulating film 54 on the bottom surface of the groove 53 is removed.

Then, as shown in FIGS. 189K, 190K, and 191K, on the first electrode film 61A, the second electrode film 62A, and the third electrode film 63A exposed from the cutout portions 211, 212, and 213, for example, by plating (preferably, electroless plating), plating growth is performed in the following order: for example, Ni, Pd, and Au. In this way, the first electrode film 61B, the second electrode film 62B and the third electrode film 63B are formed.

Thereafter, by a DBG (Dicing Before Grinding) method, a plurality of LC composite element chip regions X are divided into pieces. Specifically, as shown in FIGS. 189L, 190L, and 191L, first, on the side of the surface of the original substrate 50 (the side of the external connection electrode), a supporting tape 71 having an adhesive surface 72 is adhered. Then, the original substrate 50 is polished from the rear surface to the bottom surface of the groove 53. In this way, the plurality of LC composite element chip regions X are separated into individual LC composite element chips 1A. Thereafter, on a plurality of LC composite element chips 1A, the recovery step shown in FIGS. 45A to 45D or the recovery step shown in FIGS. 46A to 46C described in the first preferred embodiment of the second invention may be performed.

FIG. 193A is a diagram showing a modification example of the conductive member embedded within the coil formation trench 11, and is a partially enlarged cross-sectional view corresponding to FIG. 181B. FIG. 193B is a partially enlarged cross-sectional view of FIG. 193A.

As shown in FIG. 193A, the width W2 of the coil formation trench 11 may be, for example, 10 μm or less, and more specifically, may be 3 μm or more and 9 μm or less. The depth D of the coil formation trench 11 may be, for example, 10 μm or more, and more specifically, may be 30 μm or more and 80 μm or less.

In the modification example, as shown in FIGS. 193A and 193B, within the coil formation trench 11, as in the same arrangement as the modification example of the conductive member 51 in the first preferred embodiment of the second invention described previously, the conductive member 51 is embedded (also see FIGS. 48A and 48B).

FIG. 194A is a diagram showing a modification example of a conductive member embedded within each of the internal electrode formation trenches 111A and 111B, and is a partially enlarged cross-sectional view corresponding to FIG. 182B. FIG. 194B is a partially enlarged cross-sectional view of FIG. 194A.

As shown in FIG. 194A, the width W2 of each of the internal electrode formation trenches 111A and 111B may be, for example, 10 μm or less, and more specifically, may be 3 μm or more and 9 μm or less. The depth D of each of the internal electrode formation trenches 111A and 111B may be, for example, 10 μm or more, and more specifically, may be 30 μm or more and 80 μm or less.

In the modification example, as shown in FIGS. 194A and 194B, within each of the internal electrode formation trenches 111A and 111B, as in the same arrangement as the modification example of the conductive member 51 in the first preferred embodiment of the second invention described previously, the conductive member 51 is embedded (also see FIGS. 48A and 48B). Since the internal electrode formation trenches 111A and 111B have the same arrangement, in FIG. 194B, symbols in the arrangement on the side of the second internal electrode formation trench 11B corresponding to the arrangement on the side of the first internal electrode formation trench 111A are parenthesized.

FIG. 195 is a partially cut perspective view of an LC composite element chip according to a third preferred embodiment of the sixth invention. FIG. 196 is a plan view of the LC composite element chip. In FIGS. 195 and 196, portions corresponding to the portions of FIGS. 178 and 179 described previously are provided with the same symbols.

In the LC composite element chip 1B, two LC composite element portions having the same arrangement as the LC composite element chip 1A in the second preferred embodiment of the sixth invention described previously are aligned in the left/right direction and integrated, and the third electrode 63 of the LC composite element portion (hereinafter referred to as a "first LC composite element portion 221") on the left side and the first electrode 61 of the LC composite element portion (hereinafter referred to as a "second LC composite element portion 222") on the right side are common (integrated).

The LC composite element chip 1B includes a first external electrode 231 that is formed with the first electrode 61 of the first LC composite element portion 221, a second external electrode 232 that is formed with the second electrode 62 of the first LC composite element portion 221, a third external electrode 233 in which the third electrode 63 of the first LC composite element portion 221 and the first electrode 61 of the second LC composite element portion 222 are integrated, a fourth external electrode 234 that is formed with the second electrode 62 of the second LC composite element portion 222 and a fifth external electrode 235 that is formed with the third electrode 63 of the second LC composite element portion 222.

The arrangement of each of the first LC composite element portion 221 and the second LC composite element portion 222 is the same as that of the LC composite element chip 1A in the second preferred embodiment described previously except that the third electrode 63 of the first LC composite element portion 221 and the first electrode 61 of the second LC composite element portion 222 are integrated.

FIG. 197 is an electrical circuit diagram showing an electrical structure within the LC composite element chip. Between the first external electrode 231 and the second external electrode 232, a plurality of capacitor elements C1 to C7 formed in the first LC composite element portion 221 are connected in parallel. Between the third external electrode 233 and the fourth external electrode 234, a plurality of capacitor elements C1 to C7 formed in the second LC composite element portion 222 are connected in parallel. Between the first external electrode 231 and the third external electrode 233, a coil 3 (represented by a symbol L in FIG. 197) formed in the first LC composite element portion 221 is connected. Between the third external electrode 233 and the fifth external electrode 235, the coil 3 (represented by the symbol L in FIG. 197) formed in the second LC composite element portion 222 is connected. In this way, the LC composite element chip functions as an LC composite element including two capacitors and two inductors.

Although the first, second, and third preferred embodiments of the sixth invention have been described above, the sixth invention can be carried out with still another embodiment. Although in the first to third preferred embodiments of the sixth invention, the coil 3 is formed with one coil that is formed, in plan view, in the shape of a spiral, the coil 3 may be formed with a plurality of coils parallel to each other (parallel coils).

An example where the coil 3 is formed with two parallel coils is shown in FIG. 198. In the substrate 2, two coil formation trenches 11A and 11B parallel to each other are formed, in plan view, in the shape of a spiral. The two coils 3A and 3B are formed with conductive members 51 embedded in these coil formation trenches 11A and 11B. The two coils 3A and 3B form the coil 3. When the coil 3 is applied to the first preferred embodiment, one end portion of the two coils 3A and 3B is connected to the second electrode film 62A of the second electrode 62, and the other end portion of the two coils 3A and 3B is connected to the third electrode film 63A of the third electrode 63. When such coil 3 is applied to the second preferred embodiment, one end portion of the two coils 3A and 3B is connected to the first electrode film 61A of the first electrode 61, and the other end portion of the two coils 3A and 3B is connected to the third electrode film 63A of the third electrode 63.

Although in the first to third preferred embodiments of the sixth invention described previously, the coil 3 (the coil formation trench 11) is formed, in plan view, in the shape of a quadrilateral spiral, the coil 3 (the coil formation trench 11) may be formed, in plan view, in the shape of a circular spiral, as the coil 3 shown in FIG. 91. The coil 3 (the coil formation trench 11) may be formed, in plan view, in the shape of a polygonal spiral in plan view, such as an octagonal spiral, other than a quadrilateral, as the coil 3 shown in FIG. 92 described previously.

Although in the first to third preferred embodiments of the sixth invention described previously, the substrate 2 is formed with the substrate main body 6 and the insulating film 7 formed on the surface of the substrate main body, the substrate 2 may be a substrate formed of a material having insulation.

[6] Seventh Invention

In the modification examples (see FIGS. 48A and 48B) of the conductive member 51 in the first to fourth preferred embodiments of the second invention, the modification examples (see FIGS. 160A and 160B) of the conductive member 51 in the preferred embodiment of the fifth invention, and the modification examples (see FIGS. 176A, 176B, 177A, 177B, 193A, 193B, 194A, and 194B) of the conductive member 51 in the first and second preferred embodiments of the sixth invention, the arrangements where the conductive member 51 including the first to third seed layers 13*a* to 13*c* are described. However, in the conductive member 51, each of the first to third seed layers 13*a* to 13*c* may not always be visually recognized with an electron microscope or the like. Such an arrangement is shown in FIG. 199.

FIG. 199 is a partially enlarged cross-sectional view showing an arrangement when the first to third seed layers cannot be visually recognized in the conductive member shown in FIG. 48A. Although the arrangement shown in FIG. 199 corresponds to FIG. 48A according to the modification example in the first preferred embodiment of the second invention described previously, as a matter of course, it can also be applied to the arrangements according to the modification examples of the other conductive members 51.

The conductive member 51 includes first to third conductor layers 51*a* to 51*c* and the first to third seed layers 13*a* to 13*c*. However, as shown in FIG. 199, between the coil formation trench 11 and the first conductor layer 51*a*, between the first and second conductor layers 51*a* and 51*b*, and between the second and third conductor layers 51*b* and 51*c*, the first to third seed layers 13*a* to 13*c* cannot be visually recognized.

This is because since, for example, the thickness W4 (300 to 500 angstroms) of the first to third seed layers 13*a* to 13*c* is much smaller than the thickness W3 (0.1 to 0.6 μm) of the first to third conductor layers 51*a* to 51*c*, in the manufacturing step, the first to third seed layers 13*a* to 13*c* are taken in (embedded in) the first to third conductor layers 51*a* to 51*c*.

In such a case, it can be assumed that a crystal boundary portion B1 is formed by bringing the first and second conductor layers 51*a* and 51*b* into contact with each other. In other words, the crystal boundary portion B1 includes a crystal boundary surface formed by bringing the first and second conductor layers 51*a* and 51*b* into contact with each other. On the other hand, it can be assumed that a crystal boundary portion B2 is formed by bringing the second and third conductor layers 51*b* and 51*c* into contact with each other. In other words, the crystal boundary portion B2 includes a crystal boundary surface formed by bringing the second and third conductor layers 51*b* and 51*c* into contact with each other.

Although FIG. 199 shows an example of the conductive member 51 where all the first to third seed layers 13*a* to 13*c* are embedded in the first to third conductor layers 51*a* to 51*c*, part of the first to third seed layers 13*a* to 13*c* may be embedded.

In this case, the crystal boundary portion B1 may be defined by a crystal boundary surface formed by bringing the first and second conductor layers 51*a* and 51*b* into contact with each other and/or a crystal boundary surface formed by bringing the second seed layer 13*b* into contact with the first and second conductor layers 51*a* and 51*b*. On the other hand, the crystal boundary portion B2 may be defined by a crystal boundary surface formed by bringing the second and third conductor layers 51*b* and 51*c* into contact with each other and/or a crystal boundary surface formed by bringing the third seed layer 13*c* into contact with the second and third conductor layers 51*b* and 51*c*.

Although in FIG. 199, the arrangement in which the conductive member 51 includes the first to third seed layers 13*a* to 13*c* is described, the conductive member 51 may not include the first to third seed layers 13*a* to 13*c*. In this case, the crystal boundary portion B1 is defined by a crystal boundary surface formed by bringing the first and second conductor layers 51*a* and 51*b* into contact with each other. On the other hand, the crystal boundary portion B2 is defined by a crystal boundary surface formed by bringing the second and third conductor layers 51*b* and 51*c* into contact with each other.

Hence, the following features may be extracted. That is, a chip inductor 1 (chip part) is provided which includes the substrate 2 having the coil formation trench 11 (trench) and the conductive member 51 embedded in the coil formation trench 11 (trench), and in which the conductive member 51 includes a plurality of conductor layers partitioned by a crystal boundary surface formed along the inner surface of the coil formation trench 11 (trench) and in which the crystal boundary surface is formed by bringing conductor layers (the first conductor layer 51*a* and the second conductor layer 51*b* or the first and second conductor layers 51*a* and 51*b* and the second seed layer 13*b*) adjacent to each other and formed of the same or different conductive materials into contact with each other.

The following seventh invention can be extracted from the modification examples (see FIGS. 48A and 48B) of the conductive member 51 in the first to fourth preferred embodiments of the second invention, the modification examples (see FIGS. 160A and 160B) of the conductive member 51 in the preferred embodiment of the fifth invention, the modification examples (see FIGS. 176A, 176B, 177A, 177B, 193A, 193B, 194A, and 194B) of the conductive member 51 in the first and second preferred embodiments of the sixth invention and the arrangement shown in FIG. 199.

F1. A method of manufacturing a chip part, the method including: a step of forming a trench in an element formation region set on a base substrate; a step of embedding the trench in a conductive member; and a step of separating the element formation region from the base substrate to separate the element formation region into pieces, where the step of embedding the conductive member includes: a step of depositing a first conductive material to form a first conductor layer along the inner surface of the trench and the surface of the base substrate; a step of removing the first conductor layer formed outside the trench; a step of depositing a second conductive material to form a second conductor layer along the surface of the first conductor layer formed inside the trench and the surface of the base substrate; and a step of removing the second conductor layer formed outside the trench.

As an example of another method of forming the trench in the base substrate to embed the conductive member in the trench, there is a method of embedding the conductive member in the trench under a high-temperature atmosphere at one step. In this case, the surface of the base substrate is covered by a relatively thick conductor film. After the conductive member is embedded in the trench, the base substrate is cooled.

However, the conductive member (conductor film) has a different thermal expansion rate from that of the base substrate, and the cooling rate of the conductive member (conductor film) is higher than that of the base substrate. Hence, at the time of cooling, such a stress that the base substrate is warped may be produced by the volume shrinkage of the relatively thick conductor film formed on the surface of the base substrate. The warp of the base substrate refers to a state where a difference in height is produced between the center portion and the peripheral edge portion of the base substrate. The occurrence of the warp of the base substrate described above may cause a suction failure or the like such as when a suction device which sucks the main surface (for example, the surface where no element is formed) of the base substrate to convey the base substrate is used. The occurrence of a suction failure or the like causes the yield to be lowered.

By contrast, in the manufacturing method of "F1," after the trench is formed in the base substrate, the conductor layers (the first conductor layer and the second conductor layer) are embedded a plurality of times. Hence, the stress that needs to be originally received by the base substrate at one step is divided into multiple times.

Moreover, the thickness of each of the first and second conductor layers is small as compared with the case where the conductive member is embedded in the trench at one step. Since the first and second conductor layers formed on the base substrate outside the trench are removed each time, on the base substrate outside the trench, the thickness of the conductor layer is prevented from being increased. In this way, it is possible to reduce the stress placed by the first and second conductor layers on the base substrate, and thus it is possible to reduce the occurrence of the warp of the base substrate. Consequently, it is possible to reduce the occurrence of a suction failure or the like such as when a suction device which sucks and processes the base substrate is used, and thus it is possible to enhance the yield of the chip parts.

F2. The method of manufacturing a chip part described in "F1," where by a CVD (Chemical Vapor Deposition) method in which the temperature condition is 1000° C. or less, the first conductor layer is formed, and by a CVD method in which the temperature condition is 1000° C. or less, the second conductor layer is formed.

F3. The method of manufacturing a chip part described in "F1" or "F2," where the step of embedding the conductive member includes a step of depositing titanium nitride along the surface of the first conductor layer to form the seed layer after the step of removing the first conductor layer but before the step of forming the second conductor layer.

In this method, since the second conductor layer can be formed on the seed layer, it is possible to satisfactorily embed the second conductor layer in the trench.

F4. The method of manufacturing a chip part described in any one of "F1" to "F3," where the first conductor layer having a thickness of 1 μm or less is formed, and the second conductor layer having a thickness of 1 μm or less is formed.

The stress caused by the volume shrinkage of the first and second conductor layers becomes remarkable as the thickness of the first and second conductor layers is increased. Hence, in this method in which the first and second conductor layers are formed to have a thickness of 1 μm or less, it is possible to effectively reduce the stress caused by the volume shrinkage of the first and second conductor layers. In this way, it is possible to effectively reduce the occurrence of the warp of the base substrate.

F5. The method of manufacturing a chip part described in any one of "F1" to "F4," the method further including: a step of depositing tungsten to form the first conductor layer; and a step of depositing tungsten to form the second conductor layer.

F6. The method of manufacturing a chip part described in any one of "F1" to "F5," where the step of forming the trench includes a step of forming a coil formation trench in the shape of a spiral in plan view when the surface of the base substrate is seen in a normal direction, and the step of embedding the conductive member includes a step of embedding the conductive member in the coil formation trench to form the coil.

In this method, the coil formation trench is formed in the base substrate, the conductive member is embedded within the coil formation trench and thus it is possible to form the coil. Hence, it is easy to manufacture a chip part including a coil. It is possible to provide a chip part including a coil with high yield.

F7. The method of manufacturing a chip part described in any one of "F1" to "F6," where the step of forming the trench includes a step of forming a plurality of capacitance formation trenches such that, in plan view when the surface of the base substrate is seen in a normal direction, the side portions thereof are opposite each other through the base substrate, and the step of embedding the conductive member includes a step of embedding the conductive member in the plurality of capacitance formation trenches to form a capacitance.

In this method, the capacitance formation trenches are formed in the base substrate, the conductive member is embedded within the capacitance formation trenches and thus a capacitance can be formed. Hence, it is easy to manufacture a chip part including a capacitance. It is possible to provide a chip part including a capacitance with high yield.

In the method of manufacturing a chip part, it is possible to manufacture a chip part which includes a substrate having a trench and a conductive member embedded in the trench and in which the conductive member is formed with a plurality of conductor layers partitioned by a crystal boundary portion formed along the inner surface of the trench.

F8. A chip part which includes a substrate having a trench and a conductive member embedded in the trench and in which the conductive member is formed with a plurality of conductor layers partitioned by a crystal boundary portion formed along the inner surface of the trench.

F9. The chip part described in "F8," where the crystal boundary portion is formed, in cross section, along the side portion and the bottom portion of the trench, and the conductive member includes a conductor layer partitioned by the crystal boundary portion in a concave shape in cross section.

F10. The chip part described in "F8" or "F9," where the crystal boundary portion includes a conductive material different from the conductor layer.

F11. The chip part described in "F10," where the crystal boundary portion includes a seed layer formed of titanium nitride.

F12. The chip part described in "F11," where the seed layer has a thickness of 500 angstroms or less.

F13. The chip part described in "F8" or "F9," where the crystal boundary portion includes a crystal boundary surface formed by bringing the conductor layers adjacent to each other into contact.

F14. The chip part described in any one of "F8" to "F13," where the conductor layer has a thickness of 1 μm or less.

F15. The chip part described in any one of "F8" to "F14," where the conductor layer is formed of tungsten.

F16. The chip part described in any one of "F8" to "F15," where a width of the trench is 10 μm or less, and a depth thereof from the surface of the substrate is 10 μm or more.

F17. The chip part described in any one of "F8" to "F16," where the trench includes a coil formation trench that is formed in the shape of a spiral in plan view when the surface of the substrate is seen in a normal direction, and the coil is formed with the conductive member embedded in the coil formation trench.

F18. The chip part described in any one of "F8" to "F17," where the trench includes a plurality of capacitance formation trenches which are formed such that, in plan view when the surface of the substrate is seen in a normal direction, the side portions of the trench are opposite each other through the substrate, and a capacitance is formed with the conductive member embedded in the trench.

F19. A circuit assembly including a mounting substrate and the chip part mounted on the mounting substrate described in any one of "F8" to "F18."

F20. The circuit assembly described in "F19," where the chip part is connected to the mounting substrate by wireless bonding.

F21. A chip part including a substrate having a trench and a conductive member embedded in the trench, where the conductive member includes a plurality of conductor layers partitioned by a crystal boundary surface formed along the inner surface of the trench, and the crystal boundary surface is formed by bringing the conductor layers adjacent to each other and formed of the same or different conductive materials into contact.

[7] Eighth Invention

An object of the eighth invention is to provide a chip capacitor having an equivalent series resistance and a Q value excellent on frequency characteristics.

The eighth invention has the following features.

G1. A chip capacitor including: a substrate; a first electrode that is formed on the substrate; a dielectric film that is formed on the first electrode; and a capacitor element having a second electrode formed on the dielectric film, where a specific resistance of the substrate is 1.0 Ω·cm or less.

In this arrangement, in the chip capacitor, an equivalent series resistance (ESR) of 1.0Ω or less can be realized on frequency characteristics when a current having a frequency of 1 MHz or more and 10 GHz or less is input between the first electrode and the second electrode.

Furthermore, when the specific resistance of the substrate is $1.0\times10^{-1}$ Ω·cm or less, an equivalent series resistance of 0.2Ω or less can be realized on frequency characteristics when a current having a frequency of 1 MHz or more and 10 GHz or less is input between the first electrode and the second electrode.

The equivalent series resistance is defined as a resistance component when the impedance component of the chip capacitor is equivalently represented by a series circuit including a resistance component and a reactance component. The value of the equivalent series resistance of an ideal chip capacitor is zero. In other words, as the value of the equivalent series resistance approaches zero, the chip capacitor approaches the ideal chip capacitor. Hence, in this arrangement, since an equivalent series resistance of 1.0Ω or less can be realized, it is possible to effectively reduce the degradation of the chip capacitor caused by abnormal transmission of a parasitic capacitance and a parasitic resistance and abnormal heat generation or the like.

In the chip capacitor, a Q value (Quality Factor) of 10 or more and $1.0\times10^{6}$ or less on frequency characteristics when a current having a frequency of 1 MHz or more and 10 GHz or less is input between the first electrode and the second electrode.

The Q value of the chip capacitor is represented by a formula of Q value=1/(ω×C×ESR) using a frequency w, the capacitance component C of the capacitor element, and an equivalent series resistance (ESR). The Q value is a parameter indicating the performance (quality) of the chip capacitor, and when the Q value is increased, its loss is decreased, and an excellent characteristic is provided as a high-frequency chip capacitor. Hence, in this arrangement, since a Q value of 10 or more and $1.0\times10^{6}$ or less can be realized, it is possible to provide a high-frequency chip capacitor having excellent characteristics.

As described above, the substrate having a relatively low specific resistance ρ is adopted, and thus it is possible to reduce the value of the equivalent series resistance of the chip capacitor. It is also possible to enhance the Q value by the effect of reducing the value of the equivalent series resistance.

G2. The chip capacitor described in "G1," where on frequency characteristics when a current having a frequency of 10 GHz or less is input between the first electrode and the second electrode, the value of the equivalent series resistance is 1.0Ω or less.

G3. The chip capacitor described in "G1" or "G2," where on frequency characteristics when a current having a frequency of 10 GHz or less is input between the first electrode and the second electrode, the Q value (Quality Factor) is 10 or more.

G4. A chip capacitor including: a substrate; a first electrode that is formed on the substrate; a dielectric film that is formed on the first electrode; and a capacitor element having a second electrode formed on the dielectric film, where on frequency characteristics when a current having a frequency of 1 MHz or more is input between the first electrode and the second electrode, the value of an equivalent series resistance is 1.0Ω or less.

G5. The chip capacitor described in "G4," where on frequency characteristics when a current having a frequency of 1 MHz or more is input between the first electrode and the second electrode, a Q value (Quality Factor) is $1.0\times10^{6}$ or less.

G6. A chip capacitor including: a substrate; a first electrode that is formed on the substrate; a dielectric film that is formed on the first electrode; and a capacitor element having a second electrode formed on the dielectric film, where on frequency characteristics when a current having a frequency of 1 MHz or more and 10 GHz or less is input between the first electrode and the second electrode, a Q value (Quality Factor) is 10 or more and $1.0\times10^{6}$ or less.

G7. The chip capacitor described in "G6," where on frequency characteristics when a current having a frequency of 1 MHz or more and 10 GHz or less is input between the first electrode and the second electrode, the value of an equivalent series resistance is 1.0Ω or less.

G8. The chip capacitor described in any one of "G4" to "G7," where a specific resistance of the substrate is 1.0Ω·cm or less.

The specific resistance of the substrate of any one of them may be $1.0\times10^{-1}$ Ω·cm or less. In this arrangement, an equivalent series resistance of 0.2Ω or less can be realized on frequency characteristics when a current having a frequency of 1 MHz or more and 10 GHz or less is input between the first electrode and the second electrode.

G9. The chip capacitor described in any one of "G1" to "G8," where the second electrode is divided into a plurality of second electrode parts set so as to form a geometric progression, and the first electrode and the second electrode are opposite each other to have a facing area set so as to form a geometric progression.

G10. The chip capacitor described in any one of "G1" to "G9" further including: a first external electrode that is electrically connected to the first electrode and that has a surface exposed to the uppermost surface of the substrate; and a second external electrode that is electrically connected to the second electrode and that has a surface exposed to the uppermost surface of the substrate.

G11. The chip capacitor described in "G10," where the surface of the first external electrode includes a convex portion formation portion in which a plurality of convex portions having a predetermined pattern protruding upward are formed, and the convex portion formation portion includes a pattern in which the plurality of convex portions are arrayed in a matrix in a row direction and a column direction perpendicular to each other.

G12. The chip capacitor described in "G10," where the surface of the first external electrode includes a convex portion formation portion in which a plurality of convex portions having a predetermined pattern protruding upward are formed, and the convex portion formation portion includes a pattern in which the plurality of convex portions are arrayed in a staggered shape by shifting, in a row direction and a column direction perpendicular to each other, the position of the row direction every other row.

When image inspection is performed on the chip capacitor, light from a light source is applied to the surfaces of individual electrodes, and images of the surfaces are imaged with a camera. Since in this arrangement, a plurality of convex portions are formed in the surface of the first external electrode, the light incident on the surface of the first external electrode is diffusely reflected off the plurality of convex portions. In this way, based on the image information obtained with the camera, it is possible to clearly identify the first external electrode. Consequently, it is possible to easily determine the direction in which the first external electrode is formed and the front and rear of the chip capacitor. Even when instead of a plurality of convex portions, a plurality of concave portions are formed, the same effects can be achieved. In the second external electrode, the same convex portions or concave portions may be formed. In this case, it is possible to satisfactorily determine the front and rear of the chip capacitor.

G13. The chip capacitor described in any one of "G10" to "G12," where the first external electrode includes an edge portion that is formed integrally with the surface and the side surfaces so as to cover an edge portion of the surface of the substrate, and the second external electrode includes an edge portion that is formed integrally with the surface and the side surfaces so as to cover the edge portion of the substrate.

In this arrangement, when the first and second external electrodes of the chip capacitor are soldered to the mounting substrate, the bonding area between the first and second external electrodes and the mounting substrate can be enlarged. Consequently, it is possible to enhance the bonding strength of the first and second external electrodes on the mounting substrate.

G14. The chip capacitor described in any one of "G1" to "G13," where the surface of the substrate is formed in the shape of a rectangle whose corner portions are rounded. In this arrangement, it is possible to reduce the crack of the corner portion in the manufacturing step and at the time of mounting.

G15. A circuit assembly including: a mounting substrate; and the chip capacitor described in any one of "G1" to "G14" mounted on the mounting substrate.

G16. The circuit assembly described in "G15," where the chip capacitor is connected to the mounting substrate by wireless bonding.

Preferred embodiments of the eighth invention will be described in detail with reference to FIGS. 200 to 213. The symbols in FIGS. 200 to 213 are not related to the symbols in FIGS. 1 to 199 used in the description of the first to seventh inventions discussed previously.

FIG. 200 is a schematic perspective view of a chip capacitor 1 according to a preferred embodiment of the present invention.

The chip capacitor 1 is a minute chip part and includes a substrate 2 that forms a main body portion. The substrate 2 is formed substantially in the shape of a rectangular parallelepiped having one end portion and the other end portion. In the planar shape of the substrate 2, the length L of a long side 3 along the longitudinal direction is 0.3 to 0.6 mm, and the length D of a short side 4 along the lateral direction is 0.15 to 0.3 mm. The thickness T of the substrate 2 is, for example, 0.1 mm. In other words, as the substrate 2, a so-called 0603 (0.6 mm×0.3 mm) chip, 0402 (0.4 mm×0.2 mm), 03015 (0.3 mm×0.15 mm) chip or the like is applied.

Each of the corner portions 5 of the substrate 2 may be formed in a round shape by being chamfered in plan view. In the round shape, it is possible to reduce the crack of the corner portion 5 in the manufacturing step and at the time of mounting. In the inner portion of the surface of the substrate 2, a capacitor is formed. In the following description, the surface on the side where the capacitor is formed is referred to as an element formation surface 6, and the surface on the opposite side is referred to as a rear surface 7.

On the side of one end portion and on the side of the other end portion of the element formation surface 6 of the substrate 2, a first external electrode 8 and a second external electrode 9 are formed. The first external electrode 8 and the second external electrode 9 are formed at an interval from each other so as to sandwich an element region 10 where the capacitor is formed from the side of one end portion and the side of the other end portion of the element formation surface 6. The first external electrode 8 and the second external electrode 9 are formed, in plan view, substantially in the shape of a rectangle along the short side 4 of the substrate 2. On the other hand, the element region 10 is formed, in plan view, substantially in the shape of a quadrangle between the first external electrode 8 and the second external electrode 9.

FIG. 201 is a schematic plan view of the chip capacitor 1 shown in FIG. 200. FIG. 202 is a cross-sectional view taken along line CCII-CCII in FIG. 201.

As shown in FIGS. 201 and 202, on the element formation surface 6 of the substrate 2, within the element region 10, a capacitor element C0 including a first electrode film 11, a dielectric film 12 formed on the first electrode film 11 and a second electrode film 13 formed on the dielectric film 12 is formed. The capacitor element C0 is an element component that forms the capacitor and that is connected to the first external electrode 8 and the second external electrode 9. In FIG. 201, for ease of convenience, the first electrode film 11 is represented by broken lines and the second electrode film 13 is represented by solid lines.

As shown in FIG. 202, an insulating film 14 is formed over the entire region of the element formation surface 6 of the substrate 2. On the surface of the insulating film 14, the first electrode film 11 is formed. The first electrode film 11 includes a first capacitor electrode region 15 that functions, in the element region 10, as an electrode of the capacitor element C0 and a first pad region 16 that is connected to the first external electrode 8. The first capacitor electrode region 15 is formed substantially over the entire region of the element region 10. On the other hand, the first pad region 16 is formed to extend, from the first capacitor electrode region 15, to a region immediately below the first external electrode 8, and is connected to the first external electrode 8. In other words, the first capacitor electrode region 15 is electrically connected via the first pad region 16 to the first external electrode 8.

The dielectric film 12 is formed over the entire region of the first capacitor electrode region 15 (the element region 10) so as to cover the first electrode film 11 (the first capacitor electrode region 15). In the preferred embodiment, the dielectric film 12 further covers the insulating film 14 outside the element region 10. The insulating film 12 may be, for example, an oxide film ($SiO_2$ film) or a nitride film (SiN film). The dielectric film 12 may be an ONO film that includes an oxide film ($SiO_2$ film)/a nitride film (SiN film)/an oxide film ($SiO_2$ film) formed in this order.

The second electrode film 13 includes a second capacitor electrode region 17 that functions, in the element region 10, as an electrode of the capacitor element C0 and a second pad region 18 that is connected to the second external electrode 9. The second capacitor electrode region 17 is formed substantially over the entire region of the element region 10. On the other hand, the second pad region 18 is formed to extend, from the second capacitor electrode region 17, to a region immediately below the second external electrode 9, and is connected to the second external electrode 9. In other words, the second capacitor electrode region 17 is electrically connected via the second pad region 18 to the second external electrode 9.

The first electrode film 11 and the second electrode film 13 are covered by, for example, a passivation film 19 such as a nitride film. Furthermore, on the passivation film 19, a resin film 20 such as polyimide is formed.

In the passivation film 19 and the resin film 20, a cutout portion 21 is formed that exposes a region other than an edge portion on the inner side of the surface of the first pad region 16 of the first electrode film 11. The first external electrode 8 fills the cutout portion 21. In the passivation film 19 and the resin film 20, a cutout portion 22 is formed that exposes a region other than an edge portion on the inner side of the surface of the second pad region 18 of the second electrode film 13. The second external electrode 9 fills the cutout portion 22.

The first external electrode 8 and the second external electrode 9 are formed so as to protrude from the resin film 20. The first external electrode 8 and the second external electrode 9 may be formed with, for example, a Ni/Pd/Au laminated film having a Ni film in contact with the first electrode film 11 and the second electrode film 13, a Pd film formed thereon, and an Au film formed thereon.

The passivation film 19 and the resin film 20 coat, from the surface, the insulating film 14, the first electrode film 11, the dielectric film 12, and the second electrode film 13 in the element formation surface 6, and function as a protective film to protect them. On the other hand, the passivation film 19 formed on the outer peripheral surface of the side surfaces of the substrate 2 and outer peripheral surface of the insulating film 14 functions as a protective film to protect the side surfaces of the substrate 2 and the outer peripheral surface of the insulating film 14.

FIG. 203 is an equivalent circuit diagram of the chip capacitor 1 shown in FIG. 200.

As shown in FIG. 203, between the first external electrode 8 and the second external electrode 9, a first line 25 having a resistance component $R_{sub}$ of the substrate 2 and a second line 26 having a capacitance component C of the capacitor element C0 are connected in parallel.

The first line 25 includes resistance components $R_{m1}$ and $R_{m2}$ and parasitic capacitances $C_{p1}$ and $C_{p2}$ that are connected in series to the resistance component $R_{sub}$ of the substrate 2. The resistance component $R_{m1}$ is the resistance component of the first electrode film 11, and the resistance component $R_{m2}$ is the resistance component of the second electrode film 13 (also see FIG. 202). On the other hand, the parasitic capacitance $C_{p1}$ is a capacitance component formed by the first electrode film 11 opposite the substrate 2 through the insulating film 14, and the parasitic capacitance $C_{p2}$ is a capacitance component formed by the second electrode film 13 opposite the substrate 2 through the dielectric film 12 and the insulating film 14 (also see FIG. 202).

The second line 26 includes resistance components $R_{m3}$ and $R_{m4}$ that are connected in series to the capacitance component C of the capacitor element C0. The resistance component $R_{m3}$ is the resistance component of the first electrode film 11, and the resistance component $R_{m4}$ is the resistance component of the second electrode film 13 (also see FIG. 202).

FIG. 204 is a table showing the specifications of evaluation elements 1 to 6 of the chip capacitor 1 shown in FIG. 200.

In the preferred embodiment, in order to check the frequency characteristics of the chip capacitor 1, the six evaluation elements 1 to 6 are prepared. Each of the evaluation elements 1 to 6 has a different value on the specific resistance ρ (Ω·cm) of the substrate 2. In other words, each of the evaluation elements 1 to 6 has a different resistance component $R_{sub}$ (also see FIG. 203).

The specific resistance ρ of the substrate 2 in the evaluation element 1 is $1.0\times10^{-3}$ Ω·cm. The specific resistance ρ of the substrate 2 in the evaluation element 2 is $1.5\times10^{-2}$ Ω·cm. The specific resistance ρ of the substrate 2 in the evaluation element 3 is $1.0\times10^{-1}$ Ω·cm. The specific resistance ρ of the substrate 2 in the evaluation element 4 is 1.0 Ω·cm. The specific resistance ρ of the substrate 2 in the evaluation element 5 is $3.0\times10$ Ω·cm. The specific resistance ρ of the substrate 2 in the evaluation element 6 is $1.0\times10^{3}$ Ω·cm. The capacitance component C of each of the evaluation elements 1 to 6 is 3 pF.

FIG. 205 is a graph showing the frequency characteristics of the evaluation elements 1 to 6 shown in FIG. 204, and is a graph showing the specific resistance ρ versus the equivalent series resistance (ESR) (Ω) of the substrate 2. In FIG. 205, the horizontal axis represents the specific resistance ρ of the substrate 2, and the vertical axis represents the value of the equivalent series resistance.

The equivalent series resistance is defined as a resistance component when the impedance component of the chip capacitor 1 is equivalently represented by a serial circuit including a resistance component and a reactance component. The value of the equivalent series resistance of an ideal chip capacitor is zero. In other words, as the value of the equivalent series resistance approaches zero, the chip capacitor approaches the ideal chip capacitor.

In the graph of FIG. 205, bent lines 30A to 30E are shown. The bent lines 30A to 30E represent the measurement values of the equivalent series resistance. More specifically, the bent line 30A is a bent line that is obtained by connecting the values of the equivalent series resistance obtained when a current having 1 MHz is passed between the first external electrode 8 and the second external electrode 9 in each of the evaluation elements 1 to 6. The bent line 30B is a bent line that is obtained by connecting the values of the equivalent series resistance obtained when a current having 10 MHz is passed between the first external electrode 8 and the second external electrode 9 in each of the evaluation elements 1 to 6. The bent line 30C is a bent line that is obtained by connecting the values of the equivalent series resistance obtained when a current having 100 MHz is passed between the first external electrode 8 and the second external electrode 9 in each of the evaluation elements 1 to 6. The bent line 30D is a bent line that is obtained by connecting the values of the equivalent series resistance obtained when a current having 1 GHz is passed between the first external electrode 8 and the second external electrode 9 in each of the evaluation elements 1 to 6. The bent line 30E is a bent line that is obtained by connecting the values of the equivalent series resistance obtained when a current having 10 GHz is passed between the first external electrode 8 and the second external electrode 9 in each of the evaluation elements 1 to 6.

As is understood from the graph of FIG. 205, the value of the equivalent series resistance differs depending on the specific resistance ρ of the substrate and the frequency input. When the specific resistance ρ of the substrate is a relatively high value (for example, the specific resistance is 1.0 Ω·cm or more), the value of the equivalent series resistance tends to be high. On the other hand, when the specific resistance ρ of the substrate is a relatively low value (for example, the specific resistance is 1.0 Ω·cm or less), the value of the equivalent series resistance tends to be low. Hence, it is found that the specific resistance p of the substrate 2 is lowered, and thus it is possible to achieve a satisfactory equivalent series resistance.

More specifically, when the specific resistance ρ of the substrate 2 is 1.0 Ω·cm or less, and a current having a frequency of 1 MHz or more and 10 GHz or less is input between the first electrode 11 and the second electrode 13, it is possible to achieve an equivalent series resistance of 1.0Ω or less.

Furthermore, when the specific resistance ρ of the substrate 2 is $1.0\times10^{-1}$ Ω·cm or less, and a current having a frequency of 1 MHz or more and 10 GHz or less is input between the first electrode 11 and the second electrode 13, it is possible to achieve an equivalent series resistance of 0.2Ω or less.

FIG. 206 is a graph showing the frequency characteristics of the evaluation elements 1 to 6 shown in FIG. 204, and is a graph showing the specific resistance ρ versus the Q value (Quality Factor) of the substrate 2. In FIG. 206, the horizontal axis represents the specific resistance ρ of the substrate 2, and the vertical axis represents the Q value.

The Q value of the chip capacitor 1 is represented by the formula (13) below using a frequency ω, the capacitance component C of the capacitor element C0, and an equivalent series resistance (ESR).

$$Q\text{ value}=1/(\omega\times C\times \text{ESR}) \qquad (13)$$

The Q value is a parameter indicating the performance (quality) of the chip capacitor, and when the Q value is increased, its loss is decreased, and an excellent characteristic is provided as a high-frequency chip capacitor.

In the graph of FIG. 206, bent lines 31A to 31E are shown. The bent lines 31A to 31E represent the measurement values of the Q value. More specifically, the bent line 31A is a bent line that is obtained by connecting the Q values obtained when a current having 1 MHz is passed between the first external electrode 8 and the second external electrode 9 in each of the evaluation elements 1 to 6. The bent line 31B is a bent line that is obtained by connecting the Q values obtained when a current having 10 MHz is passed between the first external electrode 8 and the second external electrode 9 in each of the evaluation elements 1 to 6. The bent line 31C is a bent line that is obtained by connecting the Q values obtained when a current having 100 MHz is passed between the first external electrode 8 and the second external electrode 9 in each of the evaluation elements 1 to 6. The bent line 31D is a bent line that is obtained by connecting the Q values obtained when a current having 1 GHz is passed between the first external electrode 8 and the second external electrode 9 in each of the evaluation elements 1 to 6. The bent line 31E is a bent line that is obtained by connecting the Q values obtained when a current having 10 GHz is passed between the first external electrode 8 and the second external electrode 9 in each of the evaluation elements 1 to 6.

As is understood from the formula (13) above, the Q value is inversely proportional to the frequency ω. In other words, as the value of the frequency ω is increased, the Q value is lowered whereas as the value of the frequency ω is decreased, the Q value is increased. The Q value is inversely proportional to the capacitance component C of the capacitor element C0. In other words, as the capacitance component C is increased to 10 times, 100 times, . . . , the Q value is decreased to 1/10, 1/100, . . . whereas as the capacitance component C is decreased to 0.1 times, 0.01 times, . . . , the Q value is increased to 10 times, 100 times, . . . .

Furthermore, the Q value is also inversely proportional to the value of the equivalent series resistance (ESR) of the chip capacitor 1. In other words, as the value of the equivalent series resistance (ESR) is increased, the Q value is lowered whereas the value of the equivalent series resistance (ESR) is decreased, the Q value is increased. It is understood from FIG. 205 that in a region where the specific resistance ρ of the substrate 2 whose equivalent series resistance is 1.0Ω, or less, a satisfactory Q value can be obtained.

In the graph of FIG. 206, when the specific resistance ρ of the substrate 2 is 1.0 Ω·cm or less, and a current having a frequency of 10 GHz or less is input between the first electrode film 11 and the second electrode film 13, it is possible to achieve a Q value of 10 or more. When the specific resistance ρ of the substrate 2 is 1.0 Ω·cm or less, and a current having a frequency of 1 MHz or more is input between the first electrode film 11 and the second electrode film 13, it is possible to achieve a Q value of $1.0\times10^{6}$ or less.

Furthermore, in the bent line 31A (the frequency is 1 MHz), when the specific resistance ρ of the substrate 2 is $1.0\times10^{-1}$ Ω·cm or less, it is possible to achieve a Q value of $1.0\times10^{5}$ or more and $1.0\times10^{6}$ or less.

In the bent line 31B (the frequency is 10 MHz), when the specific resistance ρ of the substrate 2 is $1.0\times10^{-1}$ Ω·cm or less, it is possible to achieve a Q value of $1.0\times10^{4}$ or more and $1.0\times10^{5}$ or less.

In the bent line 31C (the frequency is 100 MHz), when the specific resistance ρ of the substrate 2 is $1.0\times10^{-1}$ Ω·cm or less, it is possible to achieve a Q value of $1.0\times10^{3}$ or more and $1.0\times10^{4}$ or less.

In the bent line 31D (the frequency is 1 GHz), when the specific resistance ρ of the substrate 2 is $1.0\times10^{-1}$ Ω·cm or less, it is possible to achieve a Q value $1.0\times10^{2}$ or more and $1.0\times10^{3}$ or less.

In the bent line 31E (the frequency is 10 GHz), when the specific resistance ρ of the substrate 2 is $1.0\times10^{-1}$ Ω·cm or less, it is possible to achieve a Q value of 10 or more and $1.0\times10^{2}$ or less.

As described above, in the chip capacitor 1, the specific resistance ρ of the substrate 2 is decreased, and thus it is possible to reduce the value of the equivalent series resistance. It is also possible to enhance the Q value by the effect of reducing the value of the equivalent series resistance.

That is, in the chip capacitor 1 in which the specific resistance ρ of the substrate 2 is 1.0 Ω·cm or less, on frequency characteristics when a current having a frequency of 1 MHz or more and 10 GHz or less is input between the first electrode film 11 and the second electrode 13, it is possible to realize a value of the equivalent series resistance of 1.0Ω or less. Furthermore, in the chip capacitor 1 in which the specific resistance ρ of the substrate 2 is $1.0\times10^{-1}$ Ω·cm or less, on frequency characteristics when a current having a frequency 1 MHz or more and 10 GHz or less is input between the first electrode film 11 and the second electrode 13, it is possible to realize a value of the equivalent series resistance of 0.2Ω or less.

Hence, the value of the equivalent series resistance of the chip capacitor 1 can be made to approach the ideal value (=0). In this way, it is possible to effectively reduce the degradation of the chip capacitor 1 caused by abnormal transmission of a parasitic capacitance and a parasitic resistance and abnormal heat generation or the like.

In the chip capacitor 1 in which the specific resistance ρ of the substrate 2 is 1.0 Ω·cm or less ($1.0\times10^{-1}$ Ω·cm or less), on frequency characteristics when a current having a frequency of 1 MHz or more and 10 GHz or less is input between the first electrode film 11 and the second electrode 13, it is possible to realize a Q value of 10 or more and $1.0\times10^6$ or less. Hence, it is possible to provide a high-frequency chip capacitor having excellent characteristics.

A method of manufacturing the chip capacitor 1 will then be described.

FIGS. 207A to 207I are cross-sectional views for illustrating an example of the manufacturing step of the chip capacitor 1 shown in FIG. 200.

As shown in FIG. 207A, a base substrate 41 that is an original of the substrate 2 is prepared. On the surface of the base substrate 41, the insulating film 14 such as a thermal oxide film or a CVD (Chemical Vapor Deposition) oxide film is formed. The surface of the base substrate 41 corresponds to the element formation surface 6 of the substrate 2, and the rear surface of the base substrate 41 corresponds to the rear surface 7 of the substrate 2.

FIG. 208 is a schematic plan view of part of the base substrate 41 in which the insulating film 14 is formed on the surface. As shown in FIG. 208, in the surface of the base substrate 41, capacitor regions X corresponding to a plurality of chip capacitors 1 are disposed in a matrix. Between the capacitor regions X adjacent to each other, a boundary region Y is provided. The boundary region Y is a region in the shape of a band having a substantially constant width, extends in two directions perpendicular to each other and is formed in a lattice shape. After necessary steps are performed on the base substrate 41 in which the insulating film 14 is formed on the surface, the base substrate 41 is separated along the boundary region Y, and thus it is possible to obtain a plurality of chip capacitors 1.

Then, as shown in FIG. 207B, for example, by a sputtering method, the first electrode film 11 formed with an aluminum film is formed over the entire surface of the insulating film 14. Then, on the surface of the first electrode film 11, a resist pattern corresponding to the final shape of the first electrode film 11 is formed by photolithography. The resist pattern is used as a mask, and thus the first electrode film 11 is etched. The etching of the first electrode film 11 may be performed by reactive ion etching.

Then, as shown in FIG. 207C, for example, by a CVD method, the dielectric film 12 in which an oxide film ($SiO_2$ film)/a nitride film (SiN film)/an oxide film ($SiO_2$ film) are formed in this order and which is formed with an ONO film is formed on the insulating film 14 so as to cover the first electrode film 11. Instead of the ONO film, the dielectric film 12 formed with a $SiO_2$ film or a SiN film may be formed.

Then, as shown in FIG. 207D, on the dielectric film 12, for example, by a sputtering method, the second electrode film 13 formed with an aluminum film is formed. Then, on the surface of the second electrode film 13, a resist pattern corresponding to the final shape of the second electrode film 13 is formed by photolithography. The resist pattern is used as a mask, and thus the second electrode film 13 is etched. The etching of the second electrode film 13 may be performed by reactive ion etching. In this way, on the substrate 2, the capacitor element C0 is formed.

Then, as shown in FIG. 207E, for example, by a CVD method, the passivation film 19 such as a nitride film is formed, and furthermore, polyimide to which photosensitivity is provided is applied to form the resin film 20. Then, the resin film 20 is exposed and developed with a pattern corresponding to the cutout portions 21 and 22. Thereafter, as necessary, heat treatment for curing the resin film 20 is performed. Then, the passivation film 19 exposed from the resin film 20 by dry etching using the resin film 20 as a mask is removed. In this way, the cutout portions 21 and 22 are formed in the passivation film 19 and the resin film 20.

Then, as shown in FIG. 207F, a resist mask 42 having an opening in a lattice shape matching with the boundary region Y (see FIG. 208) is formed. Then, plasma etching is performed via the resist mask 42. In this way, a groove 43 (scribe groove) for cutting that penetrates the resin film 20, the passivation film 19, the dielectric film 12 and the insulating film 14 in this order and that extends from the surface of the base substrate 41 to a predetermined depth is formed. The groove 43 for cutting is formed along the boundary region Y (also see FIG. 208).

Then, as shown in FIG. 207G, the resist mask 42 is peeled off. Then, for example, by a CVD method, an insulating film 44 formed of a nitride film or the like serving as the material of the passivation film 19 is formed over the entire region of the surface of the base substrate 41. Here, the insulating film 44 is also formed over the entire region of the inner surface (the side portion and the bottom portion) of the groove 43 for cutting. Then, the insulating film 44 is selectively etched. Specifically, a part of the insulating film 44 other than the insulating film 44 (the passivation film 19) on the side portion of the groove 43 for cutting is removed. In this way, a part of the first electrode film 11 and the second electrode film 13 that is not covered by the passivation film 19 and the resin film 20 is exposed. The insulating film 44 on the bottom portion of the groove 43 for cutting is removed.

Then, as shown in FIG. 207H, on the first electrode film 11 (the first pad region 16) and the second electrode film 13 (the second pad region 18) exposed from the cutout portions 21 and 22, for example, by plating (preferably, electroless plating), plating growth is performed in the following order: for example, Ni, Pd, and Au. In this way, the first external electrode 8 and the second external electrode 9 are formed.

Then, as shown in FIG. 207I, by a DBG (Dicing Before Grinding) method, a plurality of capacitor regions X are divided into pieces. Specifically, first, on the side of the surface of the base substrate 41 (the side of the first external electrode 8 and the second external electrode 9), a supporting tape 46 having an adhesive surface 45 is adhered. Then, the base substrate 41 is polished from the rear surface 7 to the bottom portion of the groove 43 for cutting. In this way, the plurality of capacitor regions X are separated into individual chip capacitors 1.

FIGS. 209A to 209D are cross-sectional views schematically showing the recovery step of the chip capacitor 1 after the step of FIG. 207I.

FIG. 209A shows a state where the separated plurality of chip capacitors 1 are held by the supporting tape 46. In this state, as shown in FIG. 209B, a thermally foaming sheet 47 is adhered to the rear surface 7 of each of the chip capacitor 1. The thermally foaming sheet 47 includes a sheet main body 48 in the shape of a sheet and a large number of foaming particles 49 kneaded into the sheet main body 48.

The adhesive force of the sheet main body 48 is greater than that of the adhesive surface 45 of the supporting tape 46. Hence, after the thermally foaming sheet 47 is adhered to the rear surface 7 of each of the chip capacitors 1, as shown in FIG. 209C, the supporting tape 46 is peeled off from each chip capacitor 1, and the chip capacitor 1 is transferred to the thermally foaming sheet 47. Here, since the adhesive property of the adhesive surface 45 is lowered by the application of ultraviolet rays to the supporting tape 46 (see dotted arrows in FIG. 209B), the supporting tape 46 is easily peeled off from each chip capacitor 1.

Then, the thermally foaming sheet 47 is heated. In this way, as shown in FIG. 209D, in the thermally foaming sheet 47, the foaming particles 49 within the sheet main body 48 are foamed and are expanded out of the surface of the sheet main body 48. Consequently, the contact area between the thermally foaming sheet 47 and the rear surface 7 of each chip capacitor 1 is decreased, and thus all the chip capacitors 1 are naturally peeled off from the thermally foaming sheet 47. The chip capacitors 1 recovered in this way are mounted on the mounting substrate 61 (see FIG. 211, which will be described later), and are stored in a storage space formed by an embossed carrier tape (not shown). In this case, as compared with a case where the chip capacitors 1 are peeled off from the supporting tape 46 or the thermally foaming sheet 47 one by one, it is possible to reduce the processing time. As a matter of course, with a plurality of chip capacitors 1 held by the supporting tape 46 (see FIG. 209A), without use of the thermally foaming sheet 47, the chip capacitors 1 may be directly peeled off from the supporting tape 46 by a predetermined number of pieces.

FIGS. 210A to 210C are schematically cross-sectional views showing another example of the recovery step of the chip capacitor 1 after the step of FIG. 207I.

As with FIG. 209A, FIG. 210A shows a state where a plurality of chip capacitors 1 separated are held by the supporting tape 46. In this state, as shown in FIG. 210B, a transfer tape 50 is adhered to the rear surface 7 of each chip capacitor 1. The transfer tape 50 has an adhesive force greater than that of the adhesive surface 45 of the supporting tape 46. Hence, as shown in FIG. 210C, after the transfer tape 50 is adhered to each chip capacitor 1, the supporting tape 46 is peeled off from each chip capacitor 1. Here, as described previously, ultraviolet rays (see dotted arrows in FIG. 210B) may be applied to the supporting tape 46 so that the adhesive property of the adhesive surface 45 is lowered.

The frames 51 of the recovery device (not shown) are adhered to both ends of the transfer tape 50. The frames on both sides can be moved either in a direction in which they approach each other or in a direction in which they are separated. After the supporting tape 46 is peeled off from each chip capacitor 1, the frames 51 on both sides are moved in the direction in which they are separated, and thus the transfer tape 50 is extended so as to become thin. In this way, the adhesive force of the transfer tape 50 is lowered, and thus each chip capacitor 1 is easily peeled off from the transfer tape 50. When in this state, the suction nozzle 52 of the conveying device (not shown) is directed to the side of the element formation surface 6 of the chip capacitor 1, the chip capacitor 1 is peeled off from the transfer tape 50 by the adhesive force produced by the conveying device and is sucked by the suction nozzle 52. Here, the chip capacitor 1 is pushed up by a projection 53 shown in FIG. 210C from the side opposite to the suction nozzle 52 through the transfer tape 50 to the side of the suction nozzle 52, and thus the chip capacitor 1 can be smoothly peeled off from the transfer tape 50. The chip capacitor 1 recovered in this way is conveyed by the conveying device while being sucked by the suction nozzle 52.

The chip capacitor 1 conveyed as described above may be thereafter mounted on the mounting substrate 61.

FIG. 211 is a cross-sectional view showing the arrangement of a circuit assembly 60 in which the chip capacitor 1 shown in FIG. 200 is flip-chip connected on the mounting substrate 61.

As shown in FIG. 211, on the element formation surface 6, which is one surface of the substrate 2, the first external electrode 8 and the second external electrode 9 are formed. Hence, the element formation surface 6 is made to face a mounting substrate 61, the first external electrode 8 and the second external electrode 9 are bonded on the mounting substrate 61 by a solder 62 and thus it is possible to form a circuit assembly 60 in which the chip capacitor 1 is surface-mounted on the mounting substrate 61.

In other words, it is possible to provide a flip-chip connection-type chip capacitor 1, and it is possible to connect the chip capacitor 1 to the mounting substrate 61 by a face-down bonding in which the element formation surface 6 is made to face the mounting substrate 61 and wireless bonding. In this way, it is possible to decrease the occupied space of the chip capacitor 1 on the mounting substrate 61. In particular, it is possible to realize a low profile chip capacitor 1 on the mounting substrate 61. In this way, it is possible to effectively utilize the space within the housing of a small-sized electronic device or the like and to contribute to high-density mounting and miniaturization.

Although the preferred embodiments of the eighth invention have been described above, the eighth invention can be carried out with still another embodiment.

For example, although in the preferred embodiment of the eighth invention described above, the example where the chip capacitor 1 (the evaluation elements 1 to 6) has a capacitance component C of 3 pF is described, there is no restriction on this example. Hence, a chip capacitor 1 having a capacitance component C of 3 pF or less or a chip capacitor 1 having a capacitance component C of 3 pF or more may be formed.

In the preferred embodiment of the eighth invention described previously, the arrangement shown in FIG. 212 may be adopted. FIG. 212 is a schematic cross-sectional view of a chip capacitor 71 according to a first modification example.

The chip capacitor 71 shown in FIG. 212 differs from the chip capacitor 1 described above in that the insulating film 14 is not formed. The other arrangements are the same as those of the chip capacitor 1. In FIG. 212, portions corresponding to the portions shown in FIGS. 200 to 211 described previously are provided with the same symbols, and their description will be omitted.

In the chip capacitor 71, the specific resistance ρ of the substrate 2 is preferably $2.0\times10^{-2}$ Ω·cm or less. In the chip capacitor 71, the first electrode film 11 is prevented from being opposite the substrate 2 through the insulating film 14, the parasitic capacitance $C_{p1}$ can be substantially zero (also see FIG. 203). On the other hand, since the second electrode film 13 is opposite the substrate 2 through only the insulating film 12 in a region immediately below the second external electrode 9, the value of the parasitic capacitance $C_{p2}$ is increased as compared with the case where the insulating film 14 is interposed (also see FIG. 203).

In the chip capacitor 71, the step (see FIG. 207A) of forming the insulating film 14 can be omitted, and thus it is possible to simplify the manufacturing step. In the chip capacitor 71, the same effects as in the chip capacitor 1 described previously can be provided.

In the preferred embodiment of the eighth invention described previously, the arrangement shown in FIG. 213 may be adopted. FIG. 213 is a schematic cross-sectional view of a chip capacitor 72 according to a second modification example.

The chip capacitor 72 shown in FIG. 213 differs from the chip capacitor 1 described above in that the first electrode film 11 includes an extension portion 73 which extends from the first capacitor electrode region 15 to a region immediately below the second external electrode 9. The other arrangements are the same as those of the chip capacitor 1 described previously. In FIG. 213, portions corresponding to the portions shown in FIGS. 200 to 212 described previously are provided with the same symbols, and their description will be omitted.

As shown in FIG. 213, in the region immediately below the second external electrode 9, the extension portion 73 of the first electrode film 11 is opposite the second electrode film 13 (the second pad region 18) through the dielectric film 12. In this way, it is possible to increase the facing area of the first electrode film 11 and the second electrode film 13, and thus it is possible to increase the capacitance component C of the capacitor element C0.

In the preferred embodiment of the eighth invention, the arrangement shown in FIG. 214 may be adopted. FIG. 214 is a schematic plan view of a chip capacitor 74 according to a third modification example.

The chip capacitor 74 differs from the chip capacitor 1 described above in that instead of the second electrode film 13, a second electrode film 75 is included. The other arrangements are the same as those of the chip capacitor 1 described previously. In FIG. 214, portions corresponding to the portions shown in FIGS. 200 to 213 described previously are provided with the same symbols, and their description will be omitted. In FIG. 214, the first electrode film 11 is indicated by broken lines, and the second electrode film 75 is hatched.

The second electrode film 75 includes a second pad region 76 to which the second external electrode 9 is connected, a second capacitor electrode region 77 that is electrically connected to the second pad region 76 and a plurality of fuses 78 for connecting the second pad region 76 and the second capacitor electrode region 77.

The second capacitor electrode region 77 is divided (separated) into a plurality of second electrode film parts 79 to 86. Each of the second electrode film parts 79 to 86 is formed in the shape of a rectangle, and extends from the fuse 78 toward the first external electrode 8 in the shape of a band. The plurality of second electrode film parts 79 to 86 are opposite the first electrode film 11 through the dielectric film 12 in a plurality of types of facing areas.

The facing areas of the second electrode film parts 79 to 86 to the first electrode film 11 are set so as to form a geometric progression. More specifically, the facing areas of the second electrode film parts 79 to 86 to the first electrode film 11 are set in the preferred embodiment such that 1:2:4:8:16:32:64:64. A plurality of capacitor elements C1 to C8 are defined by the first electrode film 11, the dielectric film 12, and the second electrode film parts 79 to 86.

As a matter of course, the facing areas of the second electrode film parts 79 to 86 to the first electrode film 11 may be a geometric progression with a geometric ratio of 2 or more. The second capacitor electrode region 77 may be divided into a larger number of electrode film parts than the second electrode film parts 79 to 86. The geometric ratio of the second electrode film parts 79 to 86 can be changed by adjusting the length of the second electrode film parts 79 to 86 in the longitudinal direction along the long side 3 of the substrate 2 and the length (width) of the second electrode film parts 79 to 86 in the longitudinal direction along the short side 4 of the substrate 2.

The plurality of second electrode film parts 79 to 86 are formed integrally with one or more fuses 78, and are electrically connected to the second external electrode 9 via the fuses 78 and the second pad region 76. With respect to the connection of the second electrode film parts 79 to 86 and the second pad region 76, it is unnecessary to use all the fuses 78, and some of the fuses 78 may not be used.

The fuse 78 is formed along one long side (the long side on the side of the element region 10) of the second pad region 76. More specifically, the fuse 78 includes a first wide portion 87 for the connection of the second pad region 76, a second wide portion 88 for the connection of the second electrode film parts 79 to 86, and a narrow portion 89 for the connection between the first wide portion 87 and the second wide portion 88. The narrow portion 89 is configured to be able to be cut (blown) by laser light. In this way, the unnecessary part of the second electrode film parts 79 to 86 is cut by the fuse 87, and thus it is possible to electrically separate it from the first external electrode 8 and the second external electrode 9. In a region immediately below the fuse 78, the first electrode film 11 is not formed. In this way, it is possible to prevent the first electrode film 11 from being damaged at the time of cutting (blowing) by the fuse 78.

In order to manufacture the chip capacitor 74, for example, in the step of FIG. 207D, an aluminum film is formed on the insulating film 14 by a sputtering method. Then, a resist mask corresponding to the final shape of the second electrode film 75 is formed on the aluminum film. By etching via the resist mask, the second electrode film 75 including the second pad region 76, the second capacitor electrode region 77, and the plurality of fuses 78 is formed.

Then, for example, in the step of FIG. 207E, after the formation of the passivation film 19, an opening for exposing the two films of the first electrode film 11 and the second electrode film 75 to the passivation film 9 is formed before the formation of the resin film 20. Then, inspection probes are pressed onto the first electrode film 11 and the second electrode film 75 which are exposed, and thus the total capacitance value of the plurality of capacitor elements C1 to C8 is measured. Based on the measured total capacitance value, according to the target capacitance value of the chip capacitor 74, the capacitor elements C1 to C8 to be separated, that is, the fuses to be blown are selected.

Then, over the entire surface of the base substrate 41, a cover film formed with, for example, a nitride film is formed. The formation of the cover film may be performed by a plasma CVD method. The cover film is formed on the dielectric film 12 so as to cover the first electrode film 11 and the second electrode film 75.

In this state, laser trimming for blowing the fuse 78 is performed. That is, laser light is applied to the fuses 78 selected according to the result of the measurement of the total capacitance value of the capacitor elements C1 to C8, and thus the narrow portion 89 of the fuses 78 is blown. In this way, the corresponding capacitor elements C1 to C8 are separated from the second pad region 76. When the laser light is applied to the fuse 78, the energy of the laser light is stored in the vicinity of the fuse 78 by the function of the cover film, and thus the fuse 78 is blown. Thereafter, as necessary, the thickness of the passivation film 19 is increased so as to block the opening by a CVD method.

In the chip capacitor 74, the total capacitance value of the capacitor elements C1 to C8 is measured, and thereafter one or more fuses 78 appropriately selected from the fuses 78 according to the desired capacitance value is blown by laser light, with the result that it is possible to perform adjustment (laser trimming) with the desired capacitance value. In particular, when the capacitance value of the capacitor elements C1 to C8 is set so as to form a geometric progression with a geometric ratio of 2, it is possible to perform fine adjustment so as to adjust the target capacitance value with accuracy corresponding to the capacitance value of the capacitor element C1, which has the minimum capacitance value (the first term value of the geometric progression).

As a matter of course, instead of the second electrode film 75, the first electrode film 11 may have a plurality of electrode film parts (a plurality of first electrode film parts). In addition to the second electrode film 75, the first electrode film 11 may have a plurality of electrode film parts (a plurality of first electrode film parts). In this case, the electrode film parts of the first electrode film 11 and the second electrode film 75 have equal areas, and thus the facing area of the first electrode film 11 and the second electrode film 75 may be set to form a geometric progression.

In the preferred embodiment of the eighth invention described previously, the arrangement shown in FIG. 215 may be adopted. FIG. 215 is a schematic perspective view of a chip capacitor 90 according to a fourth modification example. The chip capacitor 90 differs from the chip capacitor 1 described above in that the first external electrode 8 includes an edge portion 91 and that the second external electrode 9 includes an edge portion 92. The other arrangements are the same as those of the chip capacitor 1 described previously. In FIG. 215, portions corresponding to the portions shown in FIGS. 200 to 214 described previously are provided with the same symbols, and their description will be omitted.

As shown in FIG. 215, the first external electrode 8 is formed so as to cover the upper portion of the passivation film 19 (also see FIG. 202) on the side of one end portion of the substrate 2 and to straddle, from the peripheral edge portion of the surface of the insulating film 14, the surface of the passivation film 19 covering the three side surfaces on the side of one end portion of the substrate 2. That is, the first external electrode 8 includes the edge portion 91 that also covers the passivation film 19 on the three side surfaces of the substrate 2.

Likewise, the second external electrode 9 is formed so as to cover the upper portion of the passivation film 19 (also see FIG. 202) on the side of the other end portion of the substrate 2 and to straddle, from the peripheral edge portion of the surface of the insulating film 14, the surface of the passivation film 19 covering the three side surfaces on the side of the other end portion of the substrate 2. That is, the second external electrode 9 includes the edge portion 92 that also covers the passivation film 19 on the three side surfaces of on the side of the other end portion of the substrate 2.

As described above, the first external electrode 8 is formed so as to include the edge portion 91 covering the three side surfaces on the side of one end portion of the substrate 2, and the second external electrode 9 is formed so as to include the edge portion 92 covering the three side surfaces on the side of the other end portion of the substrate 2. That is, the external electrode is formed not only on the element formation surface 6 on the substrate 2 but also on the side surfaces of the substrate 2.

The first external electrode 8 can be formed as follows: In the step of FIG. 207E, the passivation film 19 and the resin film 20 are removed so as to expose not only the first pad region 16 and the second pad region 18 but also the peripheral edge portion of the first electrode film 11 and the second electrode film 13 (the peripheral edge portion of the chip capacitor 90 on the side of the element formation surface 6), and thereafter in the step of FIG. 207H, the conditions of the plating growth of Ni, Pd, and Au are changed.

In this way, when the first external electrode 8 and the second external electrode 9 of the chip capacitor 90 are soldered on the mounting substrate 61, it is possible to enlarge the bonding area between the first external electrode 8 and the second external electrode 9 and the mounting substrate 61 (also see FIG. 211). Consequently, it is possible to enhance the bonding strength of the first external electrode 8 and the second external electrode 9 on the mounting substrate 61.

In the preferred embodiment of the eighth invention described previously, the arrangement shown in FIG. 216 may be adopted. FIG. 216 is a schematic perspective view of a chip capacitor 93 according to a fifth modification example. The chip capacitor 93 differs from the chip capacitor 1 described above in that on the surface of the first external electrode 8, in plan view when seen in a normal direction perpendicular to the element formation surface 6, a flat portion 94 and a convex portion formation portion 95 are formed. The other arrangements are the same as those of the chip capacitor 1. In FIG. 216, portions corresponding to the portions shown in FIGS. 200 to 215 described previously are provided with the same symbols, and their description will be omitted.

As shown in FIG. 216, the flat portion 94 is a part where the surface of the first external electrode 8 is formed to be flat, and the convex portion formation portion 95 is a part where a plurality of convex portions 96 are formed.

The flat portion 94 is formed on each of the inner portions of the first external electrode 8, and is formed, in plan view, substantially in the shape of a rectangle so as to extend in the longitudinal direction of the long side of the first external electrode 8. The flat portion 94 has a pair of long sides and a pair of short sides that form the four sides in plan view, and has a larger surface area than that of each of the convex portions 96. Although the surface area of the flat portion 94 is changed as necessary according to the size of the chip capacitor 93, preferably, the length of the long side of the flat portion 94 is at least 60 μm or more, and the length of the short side is at least 40 μm or more. In the chip capacitor 93, when an electrical test is performed on the capacitor element C0 (C1 to C8), the tip end of the probe can be brought into contact with the flat portion 94. In this way, it is possible to effectively reduce a measurement error caused by bringing parts other than the tip end of the probe into contact with the convex portion 96.

The convex portion formation portion 95 is formed so as to surround the flat portion 94. In the convex portion formation portion 95, a plurality of convex portions 96 may be formed in a pattern in which the convex portions 96 are arrayed in a matrix in a row direction and a column direction perpendicular to each other. The plurality of convex portions 96 may include a pattern in which the convex portions 96 are arrayed in a staggered shape by shifting, in a row direction and a column direction perpendicular to each other, the position of the row direction every other row. Preferably, each convex portion 96 is formed, in plan view, in the shape of, for example, a rectangle, and its size (the area in plan view) is, for example, 5 μm×5 μm to 20 μm×20 μm. As a matter of course, each convex portion 96 is not limited to the shape of a rectangle in plan view, and its shape may be changed as necessary as long as its area falls within the range described above.

In these convex portions 96, for example, in the step of FIG. 207E described previously, after the formation of the passivation film 19 or when the passivation film 19 is etched via the resin film 20, by utilizing the passivation film 19, a convex pattern corresponding to the convex portions 96 is preferably formed in the surface of the first pad region 16. Thereafter, in the step (plating film formation) of FIG. 207H, the convex portions 96 are inevitably formed in the surface of the first external electrode 8.

When image inspection is performed on the chip capacitor 93, light from a light source is applied to the surfaces of individual electrodes, and images of the surfaces are imaged with a camera. Since in this arrangement, a plurality of convex portions 96 are formed in the surface of the first external electrode 8, the light incident on the surface of the first external electrode 8 is diffusely reflected off the plurality of convex portions 96. In this way, based on the image information obtained with the camera, it is possible to clearly identify the first external electrode 8. Consequently, it is possible to easily determine the direction in which the first external electrode 8 is formed and the front and rear of the chip capacitor 93.

Even when instead of a plurality of convex portions 96, a plurality of concave portions are formed, the same effects can be achieved. In the second external electrode 9, the same convex portions 96 or concave portions may be formed. In this case, it is possible to satisfactorily determine the front and rear of the chip capacitor 93.

In the preferred embodiment of the eighth invention described previously, the substrate 2 may be an insulting substrate formed of a material having insulation or may be a semiconductor substrate such as a silicon substrate.

While preferred embodiments of the present invention have been described above, it is to be understood that variations and modifications will be apparent to those skilled in the art without departing the scope and sprit of the present invention. The scope of the present invention, therefore, is to be determined solely by the following claims.

What is claimed is:

1. A chip transformer including:

a substrate that has an element formation surface;

a thermal oxide film formed in the substrate;

a primary coil formation trench and a secondary coil formation trench that are formed in the thermal oxide film by digging down from the element formation surface and that are formed in the shape of a spiral in a plan view when seen in a normal direction perpendicular to the element formation surface;

a primary coil that is formed with a first conductive member embedded within the primary coil formation trench;

a secondary coil that is formed with a second conductive member embedded within the secondary coil formation trench;

a first insulating film formed on an upper surface of the substrate;

a second insulating film formed on an upper surface of the first insulating film; and a first electrode and a second electrode disposed on the element formation surface, one end portion of the primary coil connected to the first electrode and an opposite end portion of the primary coil connected to the second electrode, wherein the primary coil and the secondary coil are formed to penetrate and pass through the first insulating film, wherein the first electrode penetrates and passes through the second insulating film to contact the one end portion of the primary coil, wherein the second electrode penetrates and passes through the second insulating film to contact the opposite end portion of the primary coil, and wherein side surfaces and a bottom surface of the primary coil and the secondary coil are surrounded by the thermal oxide film.

2. The chip transformer described in claim 1 further including:

a first electrode and a second electrode which are disposed on the element formation surface, one end portion of the primary coil connected to the first electrode and an opposite end portion of the primary coil connected to the second electrode; and a third electrode and a fourth electrode which are disposed on the element formation surface, one end portion of the secondary coil connected to the third electrode and an opposite end portion of the secondary coil connected to the fourth electrode.

3. A chip transformer described in claim 2 further including:

an insulating film that is formed so as to cover the primary coil and the secondary coil on the element formation surface, that respectively includes a first contact hole and a second contact hole in regions corresponding to the one end portion and the opposite end portion of the primary coil and that respectively includes a third contact hole and a fourth contact hole in regions corresponding to the one end portion and the opposite end portion of the secondary coil, wherein the first electrode, the second electrode, the third electrode and the fourth electrode are formed on the insulating film, the first electrode is connected via the first contact hole to the one end portion of the primary coil, the second electrode is connected via the second contact hole to the opposite end portion of the primary coil, the third electrode is connected via the third contact hole to the one end portion of the secondary coil, and the fourth electrode is connected via the fourth contact hole to the opposite end portion of the secondary coil.

4. A chip transformer described in claim 2, further comprising a plurality of concave portions formed in only a surface of any one of a primary side electrode pair, comprising the first electrode and the second electrode, and a secondary side electrode pair, comprising the third electrode and the fourth electrode.

5. A chip transformer described in claim 4, wherein a first underlying concave portion is formed, in the plan view, in the element formation surface of the substrate in a same position, in a depth direction, as a position in which one of the plurality of concave portions is formed.

6. A chip transformer described in claim 5 further including an insulating film formed between the element formation surface and the first to fourth electrodes, wherein a second underlying concave portion is formed, in the plan view, in a surface of the insulating film in the same position, in the depth direction, as the position in which the first underlying concave portion is formed.

7. A chip transformer described in claim 5, wherein the plurality of concave portions are formed, in the plan view, in the shape of a straight line extending in the one direction at an interval in a direction perpendicular to the one direction and positioned, in the plan view, in the same positions as the positions in which the concave portions are formed on the element formation surface, the plurality of concave portions comprise:

a plurality of concave portion formation trenches formed in the element formation surface; and conductive members, including the first and second conductive members, embedded within the concave formation trenches, and the first underlying concave portion is located in a surface of one of the conductive members within one of the concave formation trenches.

8. A chip transformer described in claim 7, wherein the plurality of concave formation trenches are formed in a same trench formation processing step as the coil formation trenches.

9. A chip transformer described in claim 1, wherein in the element formation surface, a primary side formation region and a secondary side formation region are provided and arrayed in one direction along the element formation surface, the primary coil formation trench is located in the primary side formation region, and the secondary coil formation trench is located in the secondary formation region.

10. A chip transformer described in claim 9, wherein the primary side formation region and the secondary side formation region are formed, in a plan view, in a shape of a rectangle having a longer side in the one direction than in a second direction perpendicular to the one direction, the first electrode is disposed at one end portion of the primary side formation region, the second electrode is disposed at another end portion of the primary side formation region opposite the one end portion of the primary side formation region, the third electrode is disposed at one end portion of the secondary side formation region, and the fourth electrode is disposed at another end portion of the secondary side formation region opposite the one end portion of the secondary side formation region.

11. A chip transformer described in claim 1, wherein the primary coil formation trench and the secondary coil formation trench are disposed such that, in a plan view, one of the primary and secondary coil formation trenches is disposed within a gap between adjacent arms of the other of the primary and secondary coil formation trenches.

12. A chip transformer described in claim 11, wherein the element formation surface is formed, in a plan view, in a shape of a rectangle, the primary coil formation trench and the secondary coil formation trench are formed in a region between two sides of the element formation surface, the first electrode is disposed at one end of a first side, among the two sides, of the element formation surface, the second electrode is disposed at another end of the first side of the element formation surface, the third electrode is disposed at one end of a second side, among the two sides, of the element formation surface, and the fourth electrode is disposed at another end of the second side of the element formation surface.

13. The chip transformer described in claim 1, wherein a depth of the coil formation trench is 10 μm or more.

14. The chip transformer described in claim 1, wherein a depth of the coil formation trench is 10 μm or more and 82 μm or less.

15. The chip transformer described in claim 1, wherein a width of the coil formation trench is 1 μm or more and 3 μm or less.

16. A circuit assembly including:

a mounting substrate; and the chip transformer of claim 1 mounted on the mounting substrate.

17. The circuit assembly described in claim 16, wherein the chip transformer is connected to the mounting substrate by wireless bonding.

18. The chip transformer of claim 1, further comprising a barrier metal film covering sides of the primary coil formation trench, the first conductive member is surrounded, at a base of the primary coil formation trench and sides of the primary coil formation trench, by the barrier metal film.

19. The chip transformer of claim 2, further comprising:

a resin film extending between the first and second electrodes and between the third and fourth electrodes, the resin film covering an upper surface of the primary coil and the secondary coil, wherein each of the first, second, third, and fourth electrodes contacts a side surface of the resin film and covers a portion of an upper surface of the resin film.

20. The chip transformer of claim 1, wherein the primary coil has more turns than the secondary coil.

21. A chip transformer including:

a substrate that has an element formation surface;

a thermal oxide film formed in the substrate;

a primary coil formation trench and a secondary coil formation trench that are formed in the thermal oxide film by digging down from the element formation surface and that are formed in the shape of a spiral in a plan view when seen in a normal direction perpendicular to the element formation surface;

a primary coil that is formed with a first conductive member embedded within the primary coil formation trench;

a secondary coil that is formed with a second conductive member embedded within the secondary coil formation trench; and a first insulating film formed on an upper surface of the substrate, wherein the primary coil and the secondary coil are formed to penetrate and pass through the first insulating film, wherein, as seen from a side cross-sectional view, each turn of the primary coil has a constant width in a first vertical region in which the primary coil is surrounded by the thermal oxide film, and each turn of the primary coil widens, in a vertical direction from a rear surface of the substrate toward the upper surface of the substrate, in a second vertical region in which the primary coil is surrounded by the thermal oxide film, and wherein side surfaces and a bottom surface of the primary coil and the secondary coil are surrounded by the thermal oxide film.

* * * * *